US011728910B2

(12) United States Patent
Cella et al.

(10) Patent No.: US 11,728,910 B2
(45) Date of Patent: Aug. 15, 2023

(54) METHODS AND SYSTEMS FOR DETECTION IN AN INDUSTRIAL INTERNET OF THINGS DATA COLLECTION ENVIRONMENT WITH EXPERT SYSTEMS TO PREDICT FAILURES AND SYSTEM STATE FOR SLOW ROTATING COMPONENTS

(71) Applicant: Strong Force IoT Portfolio 2016, LLC, Santa Monica, CA (US)

(72) Inventors: Charles Howard Cella, Pembroke, MA (US); Gerald William Duffy, Jr., Philadelphia, PA (US); Jeffrey P. McGuckin, Philadelphia, PA (US); Mehul Desai, Oak Brook, IL (US)

(73) Assignee: Strong Force IoT Portfolio 2016, LLC, Fort Lauderdale, FL (US)

( * ) Notice: Subject to any disclaimer, the term of this patent is extended or adjusted under 35 U.S.C. 154(b) by 819 days.

(21) Appl. No.: 16/151,177

(22) Filed: Oct. 3, 2018

(65) Prior Publication Data

US 2019/0033848 A1 Jan. 31, 2019

Related U.S. Application Data

(63) Continuation of application No. 16/143,298, filed on Sep. 26, 2018, now abandoned, which is a (Continued)

(51) Int. Cl.

*G05B 19/418* (2006.01)
*H04B 17/29* (2015.01)

(Continued)

(52) U.S. Cl.

CPC ......... *H04B 17/29* (2015.01); *B62D 15/0215* (2013.01); *G01M 13/028* (2013.01);

(Continued)

(58) Field of Classification Search

CPC .............. G05B 13/028; G05B 19/4183; G05B 19/4184; G05B 23/0221; G05B 23/0229; G05B 23/0264

See application file for complete search history.

(56) References Cited

U.S. PATENT DOCUMENTS 3,706,982 A 12/1972 Gehman
3,714,822 A 2/1973 Lutz (Continued)

FOREIGN PATENT DOCUMENTS

CN 1319967 A 10/2001
CN 1716827 A 1/2006

(Continued)

OTHER PUBLICATIONS

PCT/US17/31721, "International Application Serial No. PCT/US17/31721, International Search Report and Written Opinion dated Sep. 11, 2017", 23 pages.

(Continued)

*Primary Examiner* — Aditya S Bhat

(74) *Attorney, Agent, or Firm* — GTC Law Group PC & Affiliates

(57) ABSTRACT

Methods and systems for a monitoring system for data collection in an industrial environment including a data collector communicatively coupled to a plurality of input channels connected to data collection points related to machine components, wherein at least one of the plurality of input channels is connected to a data collection point on a rotating machine component; a data acquisition circuit structured to interpret a plurality of detection values from the collected data, each of the plurality of detection values corresponding to at least one of the plurality of input channels; and an expert system analysis circuit structured to analyze the collected data, wherein the expert system analysis circuit determines a failure state for the rotating machine (Continued)

component based on analysis of the plurality of detection values, wherein upon determining the failure state the expert system analysis circuit provides the failure state to a data storage.

22 Claims, 184 Drawing Sheets

Related U.S. Application Data continuation of application No. PCT/US2018/045036, filed on Aug. 2, 2018, and a continuation of application No. 15/973,406, filed on May 7, 2018, application No. PCT/US2018/045036 is a continuation of application No. 15/973,406, filed on May 7, 2018, which is a continuation-in-part of application No. PCT/US2017/031721, filed on May 9, 2017.

(60) Provisional application No. 62/583,487, filed on Nov. 8, 2017, provisional application No. 62/562,487, filed on Sep. 24, 2017, provisional application No. 62/540,557, filed on Aug. 2, 2017, provisional application No. 62/540,513, filed on Aug. 2, 2017, provisional application No. 62/427,141, filed on Nov. 28, 2016, provisional application No. 62/412,843, filed on Oct. 26, 2016, provisional application No. 62/350,672, filed on Jun. 15, 2016, provisional application No. 62/333,589, filed on May 9, 2016.

(51) Int. Cl.

| | |
|---|---|
| ***H04L 67/12*** | (2022.01) |
| ***G06N 20/00*** | (2019.01) |
| ***H04L 1/00*** | (2006.01) |
| ***G06N 3/084*** | (2023.01) |
| ***G06N 3/088*** | (2023.01) |
| ***G06N 3/006*** | (2023.01) |
| ***H04B 17/345*** | (2015.01) |
| ***H04W 4/38*** | (2018.01) |
| ***H04W 4/70*** | (2018.01) |
| ***G06Q 30/02*** | (2023.01) |
| ***G06Q 30/06*** | (2023.01) |
| ***G01M 13/045*** | (2019.01) |
| ***G01M 13/028*** | (2019.01) |
| ***H04L 1/1867*** | (2023.01) |
| ***G06Q 10/0639*** | (2023.01) |
| ***G06Q 10/04*** | (2023.01) |
| ***H04B 17/23*** | (2015.01) |
| ***H03M 1/12*** | (2006.01) |
| ***G16Z 99/00*** | (2019.01) |
| ***H02M 1/12*** | (2006.01) |
| ***G06F 18/21*** | (2023.01) |
| ***G06N 3/044*** | (2023.01) |
| ***G06N 3/045*** | (2023.01) |
| ***G06N 3/047*** | (2023.01) |
| ***G06N 7/01*** | (2023.01) |
| ***G06V 10/778*** | (2022.01) |
| ***G06V 10/82*** | (2022.01) |
| ***B62D 15/02*** | (2006.01) |
| ***G01M 13/04*** | (2019.01) |
| ***G06Q 50/00*** | (2012.01) |
| ***G05B 23/02*** | (2006.01) |
| ***G05B 13/02*** | (2006.01) |
| ***H04L 67/1097*** | (2022.01) |
| ***H04B 17/318*** | (2015.01) |
| ***G06N 3/02*** | (2006.01) |
| ***G06N 5/046*** | (2023.01) |
| ***H04B 17/309*** | (2015.01) |
| ***H04L 1/18*** | (2023.01) |
| *G06N 3/126* | (2023.01) |
| *G05B 19/042* | (2006.01) |
| *H04B 17/40* | (2015.01) |
| *H04L 67/306* | (2022.01) |
| *B62D 5/04* | (2006.01) |
| *G06F 17/18* | (2006.01) |
| *G06F 18/25* | (2023.01) |
| *H04L 5/00* | (2006.01) |

(52) U.S. Cl.

CPC .......... *G01M 13/04* (2013.01); *G01M 13/045* (2013.01); *G05B 13/028* (2013.01); *G05B 19/4183* (2013.01); *G05B 19/4184* (2013.01); *G05B 19/4185* (2013.01); *G05B 19/41845* (2013.01); *G05B 19/41865* (2013.01); *G05B 19/41875* (2013.01); *G05B 23/024* (2013.01); *G05B 23/0221* (2013.01); *G05B 23/0229* (2013.01); *G05B 23/0264* (2013.01); *G05B 23/0283* (2013.01); *G05B 23/0286* (2013.01); *G05B 23/0289* (2013.01); *G05B 23/0291* (2013.01); *G05B 23/0294* (2013.01); *G05B 23/0297* (2013.01); *G06F 18/2178* (2023.01); *G06N 3/006* (2013.01); *G06N 3/02* (2013.01); *G06N 3/044* (2023.01); *G06N 3/045* (2023.01); *G06N 3/047* (2023.01); *G06N 3/084* (2013.01); *G06N 3/088* (2013.01); *G06N 5/046* (2013.01); *G06N 7/01* (2023.01); *G06N 20/00* (2019.01); *G06Q 10/04* (2013.01); *G06Q 10/0639* (2013.01); *G06Q 30/02* (2013.01); *G06Q 30/0278* (2013.01); *G06Q 30/06* (2013.01); *G06Q 50/00* (2013.01); *G06V 10/7784* (2022.01); *G06V 10/82* (2022.01); *G16Z 99/00* (2019.02); *H02M 1/12* (2013.01); *H03M 1/12* (2013.01); *H04B 17/23* (2015.01); *H04B 17/309* (2015.01); *H04B 17/318* (2015.01); *H04B 17/345* (2015.01); *H04L 1/0002* (2013.01); *H04L 1/0041* (2013.01); *H04L 1/18* (2013.01); *H04L 1/1874* (2013.01); *H04L 67/1097* (2013.01); *H04L 67/12* (2013.01); *H04W 4/38* (2018.02); *H04W 4/70* (2018.02); *B62D 5/0463* (2013.01); *G05B 19/042* (2013.01); *G05B 23/02* (2013.01); *G05B 23/0208* (2013.01); *G05B 2219/32287* (2013.01); *G05B 2219/35001* (2013.01); *G05B 2219/37337* (2013.01); *G05B 2219/37351* (2013.01); *G05B 2219/37434* (2013.01); *G05B 2219/37537* (2013.01); *G05B 2219/40115* (2013.01); *G05B 2219/45004* (2013.01); *G05B 2219/45129* (2013.01); *G06F 17/18* (2013.01); *G06F 18/21* (2023.01); *G06F 18/217* (2023.01); *G06F 18/25* (2023.01); *G06N 3/126* (2013.01); *H04B 17/40* (2015.01); *H04L 1/0009* (2013.01); *H04L 5/0064* (2013.01); *H04L 67/306* (2013.01); *Y02P 80/10* (2015.11); *Y02P 90/02* (2015.11); *Y02P 90/80* (2015.11); *Y04S 50/00* (2013.01); *Y04S 50/12* (2013.01); *Y10S 707/99939* (2013.01)

(56) References Cited

U.S. PATENT DOCUMENTS 3,731,526 A 5/1973 Games
3,758,764 A 9/1973 Harner

(56) References Cited

U.S. PATENT DOCUMENTS

| | | | |
|---|---|---|---|
| 4,060,716 | A | 11/1977 | Pekrul et al. |
| 4,074,142 | A | 2/1978 | Jackson |
| 4,620,304 | A | 10/1986 | Faran et al. |
| 4,665,398 | A | 5/1987 | Lynch et al. |
| 4,740,736 | A | 4/1988 | Sidman et al. |
| 4,852,083 | A | 7/1989 | Niehaus et al. |
| 4,881,071 | A | 11/1989 | Monterosso et al. |
| 4,945,540 | A | 7/1990 | Kaneko |
| 4,980,844 | A | 12/1990 | Demjanenko et al. |
| 4,991,429 | A | 2/1991 | Stacey et al. |
| 5,045,851 | A | 9/1991 | Davis, III et al. |
| 5,123,011 | A | 6/1992 | Hein et al. |
| 5,155,802 | A | 10/1992 | Mueller et al. |
| 5,157,629 | A | 10/1992 | Sato et al. |
| 5,182,760 | A | 1/1993 | Montgomery |
| 5,276,620 | A | 1/1994 | Bottesch |
| 5,311,562 | A | 5/1994 | Palusamy et al. |
| 5,386,373 | A | 1/1995 | Keeler et al. |
| 5,407,265 | A | 4/1995 | Hamidieh et al. |
| 5,455,778 | A | 10/1995 | Ide et al. |
| 5,465,162 | A | 11/1995 | Nishii et al. |
| 5,469,150 | A | 11/1995 | Sitte |
| 5,541,914 | A | 7/1996 | Krishnamoorthy et al. |
| 5,543,245 | A | 8/1996 | Andrieu et al. |
| 5,548,584 | A | 8/1996 | Beck et al. |
| 5,548,597 | A | 8/1996 | Kayama et al. |
| 5,566,092 | A | 10/1996 | Wang et al. |
| 5,629,870 | A | 5/1997 | Farag et al. |
| 5,650,951 | A | 7/1997 | Staver |
| 5,663,894 | A | 9/1997 | Seth et al. |
| 5,701,394 | A | 12/1997 | Arita et al. |
| 5,710,723 | A | 1/1998 | Hoth et al. |
| 5,715,821 | A | 2/1998 | Faupel |
| 5,724,475 | A | 3/1998 | Kirsten |
| 5,788,789 | A | 8/1998 | Cooper |
| 5,794,224 | A | 8/1998 | Yufik |
| 5,809,490 | A | 9/1998 | Guiver et al. |
| 5,825,646 | A | 10/1998 | Keeler et al. |
| 5,842,034 | A | 11/1998 | Bolstad et al. |
| 5,852,793 | A | 12/1998 | Board et al. |
| 5,864,773 | A | 1/1999 | Barna et al. |
| 5,874,790 | A | 2/1999 | Macks |
| 5,884,224 | A | 3/1999 | Mcnabb et al. |
| 5,917,352 | A | 6/1999 | Dunlap et al. |
| 5,917,428 | A | 6/1999 | Discenzo et al. |
| 5,924,499 | A | 7/1999 | Birchak et al. |
| 5,941,305 | A | 8/1999 | Thrasher et al. |
| 5,991,308 | A | 11/1999 | Fuhrmann et al. |
| 6,003,030 | A | 12/1999 | Kenner et al. |
| 6,034,662 | A | 3/2000 | Kim |
| 6,078,847 | A | 6/2000 | Eidson et al. |
| 6,084,911 | A | 7/2000 | Ishikawa |
| 6,111,333 | A | 8/2000 | Takahashi et al. |
| 6,141,355 | A | 10/2000 | Palmer et al. |
| 6,184,713 | B1 | 2/2001 | Agrawal et al. |
| 6,198,246 | B1 | 3/2001 | Yutkowitz |
| 6,222,456 | B1 | 4/2001 | Tice |
| 6,298,308 | B1 | 10/2001 | Reid et al. |
| 6,298,454 | B1 | 10/2001 | Schleiss et al. |
| 6,301,572 | B1 | 10/2001 | Harrison |
| 6,330,525 | B1 | 12/2001 | Hays et al. |
| 6,344,747 | B1 | 2/2002 | Lunghofer et al. |
| 6,385,513 | B1 | 5/2002 | Murray et al. |
| 6,388,597 | B1 | 5/2002 | Maezawa et al. |
| 6,421,341 | B1 | 7/2002 | Han et al. |
| 6,426,602 | B1 | 7/2002 | Mccann et al. |
| 6,434,512 | B1 | 8/2002 | Discenzo |
| 6,446,058 | B1 | 9/2002 | Brown |
| 6,448,758 | B1 | 9/2002 | Krahn et al. |
| 6,484,109 | B1 | 11/2002 | Lofall |
| 6,502,042 | B1 | 12/2002 | Eid et al. |
| 6,502,125 | B1 | 12/2002 | Kenner et al. |
| 6,554,978 | B1 | 4/2003 | Vandenborre |
| 6,581,048 | B1 | 6/2003 | Werbos |
| 6,628,567 | B1 | 9/2003 | Prosser et al. |
| 6,633,782 | B1 | 10/2003 | Schleiss et al. |
| 6,678,268 | B1 | 1/2004 | Francis et al. |
| 6,694,049 | B1 | 2/2004 | Woodall |
| 6,735,579 | B1 | 5/2004 | Woodall |
| 6,737,958 | B1 | 5/2004 | Satyanarayana |
| 6,789,030 | B1 | 9/2004 | Coyle et al. |
| 6,795,794 | B2 | 9/2004 | Anastasio et al. |
| 6,853,920 | B2 | 2/2005 | Hsiung et al. |
| 6,856,600 | B1 | 2/2005 | Russell et al. |
| 6,865,509 | B1 | 3/2005 | Hsiung et al. |
| 6,970,758 | B1 | 11/2005 | Shi et al. |
| 6,977,889 | B1 | 12/2005 | Kawaguchi et al. |
| 6,977,890 | B2 | 12/2005 | Oohashi et al. |
| 6,982,974 | B1 | 1/2006 | Saleh et al. |
| 7,027,981 | B2 | 4/2006 | Bizjak |
| 7,043,728 | B1 | 5/2006 | Galpin |
| 7,058,712 | B1 | 6/2006 | Vasko et al. |
| 7,072,295 | B1 | 7/2006 | Benson et al. |
| 7,135,888 | B1 | 11/2006 | Hutton et al. |
| 7,142,990 | B2 | 11/2006 | Bouse et al. |
| 7,174,176 | B1 | 2/2007 | Liu |
| 7,206,646 | B2 | 4/2007 | Blevins et al. |
| 7,218,974 | B2 | 5/2007 | Rumi et al. |
| 7,225,037 | B2 | 5/2007 | Shani |
| 7,228,241 | B1 | 6/2007 | Butas et al. |
| 7,249,284 | B2 | 7/2007 | Shah et al. |
| 7,304,587 | B2 | 12/2007 | Boaz |
| 7,525,360 | B1 | 4/2009 | Wang et al. |
| 7,539,549 | B1 | 5/2009 | Discenzo et al. |
| 7,557,702 | B2 | 7/2009 | Eryurek et al. |
| 7,581,434 | B1 | 9/2009 | Discenzo et al. |
| 7,591,183 | B2 | 9/2009 | King |
| 7,596,803 | B1 | 9/2009 | Barto et al. |
| 7,657,333 | B2 | 2/2010 | Bradford et al. |
| 7,710,153 | B1 | 5/2010 | Masleid et al. |
| 7,836,168 | B1 | 11/2010 | Vasko et al. |
| 7,896,012 | B1 * | 3/2011 | Lee ........................ A47L 23/02 134/137 |
| 8,044,793 | B2 | 10/2011 | Eryurek et al. |
| 8,057,646 | B2 | 11/2011 | Hinatsu et al. |
| 8,060,017 | B2 | 11/2011 | Schlicht et al. |
| 8,102,188 | B1 | 1/2012 | Chan et al. |
| 8,200,775 | B2 | 6/2012 | Moore |
| 8,229,682 | B2 | 7/2012 | El-refaie et al. |
| 8,352,149 | B2 | 1/2013 | Meacham |
| 8,506,656 | B1 | 8/2013 | Turocy |
| 8,571,904 | B2 | 10/2013 | Guru et al. |
| 8,615,374 | B1 | 12/2013 | Discenzo |
| 8,682,930 | B2 | 3/2014 | Das et al. |
| 8,700,360 | B2 | 4/2014 | Garimella et al. |
| 8,713,476 | B2 | 4/2014 | Martyn |
| 8,761,911 | B1 | 6/2014 | Chapman et al. |
| 8,766,925 | B2 | 7/2014 | Perlin et al. |
| 8,799,800 | B2 | 8/2014 | Hood et al. |
| 8,874,283 | B1 | 10/2014 | Cavote |
| 8,924,033 | B2 | 12/2014 | Goutard et al. |
| 8,977,578 | B1 | 3/2015 | Cruz-Albrecht et al. |
| 9,092,593 | B2 | 7/2015 | Nasle |
| 9,104,189 | B2 | 8/2015 | Berges Gonzalez et al. |
| 9,104,271 | B1 | 8/2015 | Adams et al. |
| 9,225,783 | B2 | 12/2015 | Stephanson |
| 9,314,190 | B1 | 4/2016 | Giuffrida et al. |
| 9,403,279 | B2 | 8/2016 | Smith et al. |
| 9,418,339 | B1 | 8/2016 | Leonard et al. |
| 9,432,298 | B1 | 8/2016 | Smith |
| 9,435,684 | B2 | 9/2016 | Baldwin |
| 9,518,459 | B1 | 12/2016 | Bermudez et al. |
| 9,557,438 | B2 | 1/2017 | Wessling et al. |
| 9,567,099 | B2 | 2/2017 | Poux et al. |
| 9,596,298 | B1 | 3/2017 | Bekiroglu et al. |
| 9,604,649 | B1 | 3/2017 | Pastor et al. |
| 9,617,914 | B2 | 4/2017 | Minto et al. |
| 9,619,999 | B2 | 4/2017 | Stephanson |
| 9,621,173 | B1 | 4/2017 | Xiu |
| 9,645,575 | B2 | 5/2017 | Watson |
| 9,696,198 | B2 | 7/2017 | Turner et al. |
| 9,721,210 | B1 | 8/2017 | Brown |
| 9,729,639 | B2 | 8/2017 | Sustaeta et al. |
| 9,755,984 | B1 | 9/2017 | Feroz et al. |

(56) References Cited

U.S. PATENT DOCUMENTS 9,759,213 B2 9/2017 Bassett et al.
9,760,174 B1 9/2017 Letendre
9,800,646 B1 10/2017 Stamatakis et al.
9,804,588 B2 10/2017 Blevins et al.
9,824,311 B1 11/2017 Cruz-Albrecht et al.
9,843,536 B2 12/2017 Miller
9,846,752 B2 12/2017 Nasle
9,874,923 B1 1/2018 Brown et al.
9,912,733 B2 3/2018 T et al.
9,916,702 B2 3/2018 Rudenko et al.
9,976,986 B2 5/2018 Wayman et al.
9,979,664 B2 5/2018 Ho et al.
9,992,088 B1 6/2018 Ho et al.
10,045,373 B2 8/2018 Wang et al.
10,073,447 B2 9/2018 Uchida et al.
10,097,403 B2 10/2018 Anand et al.
10,120,374 B2 11/2018 Hosek et al.
10,168,248 B1 1/2019 Morey et al.
10,268,191 B1 4/2019 Lockwood et al.
10,338,553 B2 7/2019 Cella et al.
10,378,994 B2 8/2019 Raman et al.
10,382,556 B2 8/2019 Ferre et al.
10,394,210 B2 8/2019 Cella et al.
10,401,846 B2 9/2019 Chen et al.
10,409,926 B2 9/2019 Mehta et al.
10,476,985 B1 11/2019 Spina et al.
10,545,472 B2 1/2020 Cella et al.
10,545,473 B2 1/2020 Cella et al.
10,545,474 B2 1/2020 Cella et al.
10,560,388 B2 2/2020 Ho et al.
10,564,638 B1 2/2020 Lockwood et al.
10,678,225 B2 6/2020 Kidd et al.
10,706,693 B1 7/2020 Castillo Canales et al.
10,732,582 B2 8/2020 Weast et al.
10,739,746 B2 8/2020 Aparicio Ojea et al.
10,807,804 B2 10/2020 Kulick et al.
10,831,093 B1 11/2020 Lablans
10,983,507 B2 4/2021 Cella et al.
11,029,680 B2 6/2021 Cella et al.
11,327,475 B2 5/2022 Cella et al.
2001/0015918 A1 8/2001 Bhatnagar
2001/0035912 A1 11/2001 Cooper et al.
2002/0002414 A1 1/2002 Hsiung et al.
2002/0004694 A1 1/2002 McLeod et al.
2002/0013664 A1 1/2002 Strackeljan et al.
2002/0018545 A1 2/2002 Crichlow
2002/0032544 A1 3/2002 Reid et al.
2002/0075883 A1 6/2002 Dell et al.
2002/0077711 A1 6/2002 Belvins et al.
2002/0084815 A1 7/2002 Murphy et al.
2002/0109568 A1 8/2002 Wohlfarth
2002/0129661 A1 9/2002 Clarke et al.
2002/0152037 A1 10/2002 Sunshine et al.
2002/0174708 A1 11/2002 Mattes
2002/0177878 A1 11/2002 Poore et al.
2002/0178277 A1 11/2002 Laksono
2002/0181799 A1 12/2002 Matsugu et al.
2003/0028268 A1 2/2003 Eryurek et al.
2003/0054960 A1 3/2003 Bedard
2003/0061004 A1 3/2003 Discenzo
2003/0069648 A1 4/2003 Douglas et al.
2003/0070059 A1 4/2003 Dally et al.
2003/0083756 A1 5/2003 Hsiung et al.
2003/0088529 A1 5/2003 Klinker et al.
2003/0094992 A1 5/2003 Geysen
2003/0101575 A1 6/2003 Green et al.
2003/0118081 A1 6/2003 Philips et al.
2003/0137648 A1 7/2003 Van et al.
2003/0147351 A1 8/2003 Greenlee
2003/0149456 A1 8/2003 Rottenberg et al.
2003/0151397 A1 8/2003 Murphy et al.
2003/0158795 A1 8/2003 Markham et al.
2003/0165398 A1 9/2003 Waldo et al.
2003/0174681 A1 9/2003 Gilberton et al.
2003/0189163 A1 10/2003 Ueyama et al.
2003/0200022 A1 10/2003 Streichsbier et al.
2003/0229471 A1 12/2003 Guralnik et al.
2004/0019461 A1 1/2004 Bouse et al.
2004/0024568 A1 2/2004 Eryurek et al.
2004/0044744 A1 3/2004 Grosner et al.
2004/0068416 A1 4/2004 Solomon
2004/0093516 A1 5/2004 Hornbeek et al.
2004/0102924 A1 5/2004 Jarrell et al.
2004/0109065 A1 6/2004 Tokunaga
2004/0120359 A1 6/2004 Frenzel et al.
2004/0138832 A1 7/2004 Judd
2004/0165783 A1 8/2004 Reynolds et al.
2004/0172147 A1 9/2004 Dillon
2004/0186927 A1 9/2004 Eryurek et al.
2004/0194557 A1 10/2004 Nagase
2004/0205097 A1 10/2004 Toumazou et al.
2004/0259563 A1 12/2004 Morton et al.
2004/0267395 A1 12/2004 Discenzo et al.
2005/0007249 A1 1/2005 Eryurek et al.
2005/0010462 A1 1/2005 Dausch et al.
2005/0010958 A1 1/2005 Rakib et al.
2005/0011266 A1 1/2005 Robinson et al.
2005/0011278 A1 1/2005 Brown et al.
2005/0090756 A1 4/2005 Wolf et al.
2005/0100172 A1 5/2005 Schliep et al.
2005/0132808 A1 6/2005 Brown et al.
2005/0162258 A1 7/2005 King
2005/0165581 A1 7/2005 Roba et al.
2005/0200497 A1 9/2005 Smithson et al.
2005/0204820 A1 9/2005 Treiber et al.
2005/0240289 A1 10/2005 Hoyte et al.
2005/0246140 A1 11/2005 Oconnor et al.
2006/0006997 A1 1/2006 Rose-Pehrsson et al.
2006/0010230 A1 1/2006 Karklins et al.
2006/0020202 A1 1/2006 Mathew et al.
2006/0026164 A1 2/2006 Jung et al.
2006/0028993 A1 2/2006 Yang et al.
2006/0034569 A1 2/2006 Shih et al.
2006/0056372 A1 3/2006 Karaoguz et al.
2006/0069689 A1 3/2006 Karklins et al.
2006/0073013 A1 4/2006 Emigholz et al.
2006/0129340 A1 6/2006 Straznicky
2006/0150738 A1 7/2006 Leigh
2006/0152636 A1 7/2006 Matsukawa et al.
2006/0155900 A1 7/2006 Sagues et al.
2006/0167638 A1 7/2006 Murphy et al.
2006/0178762 A1 8/2006 Wroblewski et al.
2006/0223634 A1 10/2006 Feldman et al.
2006/0224254 A1 10/2006 Rumi et al.
2006/0224545 A1 10/2006 Keith
2006/0229739 A1 10/2006 Morikawa
2006/0241907 A1 10/2006 Armstrong et al.
2006/0250959 A1 11/2006 Porat
2006/0259163 A1 11/2006 Hsiung et al.
2006/0271617 A1 11/2006 Hughes et al.
2006/0271677 A1 11/2006 Mercier
2006/0272859 A1* 12/2006 Pastusek .................. E21B 1/08 175/40
2006/0274153 A1 12/2006 Levien et al.
2006/0279279 A1 12/2006 Foley
2007/0025382 A1 2/2007 Jones et al.
2007/0034019 A1 2/2007 Doihara et al.
2007/0047444 A1 3/2007 Leroy et al.
2007/0056379 A1 3/2007 Nassar et al.
2007/0067678 A1 3/2007 Hosek et al.
2007/0078802 A1 4/2007 Bestgen et al.
2007/0111661 A1 5/2007 Bargroff et al.
2007/0118286 A1 5/2007 Wang et al.
2007/0135984 A1 6/2007 Breed et al.
2007/0204023 A1 8/2007 Ohta
2007/0207752 A1 9/2007 Behzad
2007/0208483 A1 9/2007 Rabin
2007/0260656 A1 11/2007 Wiig
2007/0270671 A1 11/2007 Gal
2007/0277613 A1 12/2007 Iwatsubo et al.
2007/0280332 A1 12/2007 Srikanteswara et al.
2007/0296368 A1 12/2007 Woodland et al.
2008/0049747 A1 2/2008 McNaughton et al.
2008/0065331 A1 3/2008 Pastusek et al.

(56) References Cited

U.S. PATENT DOCUMENTS

2008/0079029 A1 4/2008 Williams
2008/0101683 A1 5/2008 Zombo et al.
2008/0112140 A1 5/2008 Wong
2008/0141072 A1 6/2008 Kalgren et al.
2008/0156094 A1 7/2008 Holmes et al.
2008/0162302 A1 7/2008 Sundaresan et al.
2008/0169914 A1 7/2008 Albertson et al.
2008/0170853 A1 7/2008 Rakib et al.
2008/0194975 A1 8/2008 Macquarrie et al.
2008/0209046 A1 8/2008 Karkanias et al.
2008/0224845 A1 9/2008 Bires
2008/0234964 A1* 9/2008 Miyasaka ............ F16C 19/527 702/113
2008/0243342 A1 10/2008 Breed
2008/0252481 A1 10/2008 Vacar et al.
2008/0262759 A1 10/2008 Bosl et al.
2008/0278197 A1 11/2008 Murotake
2008/0288321 A1 11/2008 Dillon et al.
2008/0319279 A1 12/2008 Ramsay et al.
2008/0320182 A1 12/2008 Rugo et al.
2009/0003599 A1 1/2009 Hart et al.
2009/0031419 A1 1/2009 Laksono
2009/0055126 A1 2/2009 Yanovich et al.
2009/0061775 A1 3/2009 Warren et al.
2009/0063026 A1 3/2009 Laubender
2009/0063739 A1 3/2009 Weddle
2009/0064250 A1 3/2009 Nakata
2009/0066505 A1 3/2009 Jensen et al.
2009/0071264 A1 3/2009 Wray
2009/0083019 A1 3/2009 Nasle
2009/0084657 A1 4/2009 Brandt et al.
2009/0089682 A1 4/2009 Baier et al.
2009/0093975 A1* 4/2009 Judd ..................... G01H 13/00 702/56
2009/0135761 A1 5/2009 Khandekar et al.
2009/0147673 A1 6/2009 Niigata
2009/0171950 A1 7/2009 Lunenfeld
2009/0194274 A1 8/2009 Del et al.
2009/0204232 A1 8/2009 Guru et al.
2009/0204234 A1 8/2009 Sustaeta et al.
2009/0204237 A1 8/2009 Sustaeta et al.
2009/0204245 A1 8/2009 Sustaeta et al.
2009/0204267 A1 8/2009 Sustaeta et al.
2009/0210081 A1 8/2009 Sustaeta et al.
2009/0222541 A1 9/2009 Monga et al.
2009/0222921 A1 9/2009 Mukhopadhyay et al.
2009/0228224 A1 9/2009 Spanier et al.
2009/0243732 A1 10/2009 Tarng et al.
2009/0256734 A1 10/2009 Wu
2009/0256817 A1 10/2009 Perlin et al.
2009/0303197 A1 12/2009 Bonczek et al.
2010/0027426 A1 2/2010 Nair et al.
2010/0030521 A1 2/2010 Akhrarov et al.
2010/0060296 A1 3/2010 Jiang et al.
2010/0064026 A1 3/2010 Brown et al.
2010/0082126 A1 4/2010 Matsushita
2010/0094981 A1 4/2010 Cordray et al.
2010/0101860 A1 4/2010 Wassermann et al.
2010/0114514 A1 5/2010 Wang et al.
2010/0114806 A1 5/2010 Harrison et al.
2010/0138026 A1 6/2010 Sugishima et al.
2010/0148940 A1 6/2010 Gelvin et al.
2010/0149007 A1 6/2010 Zushi et al.
2010/0156632 A1 6/2010 Hyland et al.
2010/0169030 A1 7/2010 Parlos
2010/0212422 A1 8/2010 Allen et al.
2010/0216523 A1 8/2010 Sebastiano et al.
2010/0241601 A1 9/2010 Carson et al.
2010/0241891 A1 9/2010 Beasley
2010/0245105 A1 9/2010 Smith
2010/0249976 A1 9/2010 Aharoni et al.
2010/0256795 A1 10/2010 McLaughlin et al.
2010/0262398 A1 10/2010 Baek et al.
2010/0262401 A1 10/2010 Sterzing et al.
2010/0268470 A1 10/2010 Kamal et al.
2010/0271199 A1 10/2010 Belov et al.
2010/0278086 A1 11/2010 Pochiraju et al.
2010/0280343 A1 11/2010 Huiku
2010/0313311 A1 12/2010 Spizig et al.
2010/0316232 A1 12/2010 Acero et al.
2010/0318641 A1 12/2010 Bullard et al.
2011/0019693 A1 1/2011 Fu et al.
2011/0055087 A1 3/2011 Chen-Ritzo et al.
2011/0061015 A1 3/2011 Drees et al.
2011/0071794 A1 3/2011 Bronczyk et al.
2011/0071963 A1 3/2011 Piovesan et al.
2011/0078089 A1 3/2011 Hamm et al.
2011/0078222 A1 3/2011 Wegener
2011/0092164 A1 4/2011 Spanhake
2011/0125921 A1 5/2011 Karenos et al.
2011/0126047 A1 5/2011 Anderson et al.
2011/0157077 A1 6/2011 Martin et al.
2011/0178737 A1 7/2011 Hudson et al.
2011/0181437 A1 7/2011 Gershinsky et al.
2011/0184547 A1 7/2011 Loutfi
2011/0185366 A1 7/2011 Klingenberg et al.
2011/0208361 A1 8/2011 Hildebrand et al.
2011/0282508 A1 11/2011 Goutard et al.
2011/0288796 A1 11/2011 Peczalski et al.
2012/0013497 A1 1/2012 Katsuki et al.
2012/0025526 A1 2/2012 Luo et al.
2012/0028577 A1 2/2012 Rodriguez et al.
2012/0065901 A1 3/2012 Bechhoefer et al.
2012/0072136 A1 3/2012 Hedin
2012/0095574 A1 4/2012 Greenlee
2012/0101912 A1 4/2012 Sen et al.
2012/0109851 A1 5/2012 Sanders
2012/0111978 A1 5/2012 Murphy et al.
2012/0130659 A1 5/2012 Chaves
2012/0166363 A1 6/2012 He et al.
2012/0197596 A1 8/2012 Comi
2012/0219089 A1 8/2012 Murakami et al.
2012/0232847 A1 9/2012 Horton et al.
2012/0239317 A1 9/2012 Lin
2012/0245436 A1 9/2012 Rutkove et al.
2012/0246055 A1 9/2012 Schlifstein et al.
2012/0254803 A1 10/2012 Grist et al.
2012/0265359 A1 10/2012 Das et al.
2012/0284291 A1 11/2012 Brown et al.
2012/0296899 A1 11/2012 Adams
2012/0303625 A1 11/2012 Ciodaru et al.
2012/0323741 A1 12/2012 Rangachari et al.
2012/0330495 A1 12/2012 Geib et al.
2013/0003238 A1 1/2013 Bush et al.
2013/0027015 A1 1/2013 Park
2013/0027561 A1 1/2013 Lee et al.
2013/0054175 A1 2/2013 Saloio et al.
2013/0060524 A1 3/2013 Liao
2013/0115535 A1 5/2013 Delfino et al.
2013/0117438 A1 5/2013 Gupta et al.
2013/0124719 A1 5/2013 Espinosa
2013/0163619 A1 6/2013 Stephanson
2013/0164092 A1 6/2013 Kondo
2013/0179124 A1 7/2013 Patel et al.
2013/0184927 A1 7/2013 Daniel et al.
2013/0184928 A1 7/2013 Kerkhof et al.
2013/0211555 A1 8/2013 Lawson et al.
2013/0211559 A1 8/2013 Lawson et al.
2013/0212613 A1 8/2013 Velasco et al.
2013/0217598 A1 8/2013 Ludwig et al.
2013/0218451 A1 8/2013 Kamada
2013/0218493 A1 8/2013 Weddle et al.
2013/0218521 A1 8/2013 Weddle et al.
2013/0227181 A1 8/2013 Martin et al.
2013/0243963 A1 9/2013 Rina et al.
2013/0245795 A1 9/2013 McGreevy et al.
2013/0282149 A1 10/2013 Kuntagod et al.
2013/0297377 A1 11/2013 Easo et al.
2013/0311832 A1 11/2013 Lad, et al.
2013/0313827 A1 11/2013 Lovmand et al.
2013/0326053 A1 12/2013 Bauer et al.
2014/0012791 A1 1/2014 Grichnik et al.
2014/0018999 A1 1/2014 Adams et al.
2014/0024516 A1 1/2014 Kusumoto et al.

(56) References Cited

U.S. PATENT DOCUMENTS

2014/0032605 A1 1/2014 Aydin et al.
2014/0046614 A1* 2/2014 Pettersson ........... G01M 13/021 702/113
2014/0047064 A1 2/2014 Maturana et al.
2014/0067289 A1 3/2014 Baldwin
2014/0074433 A1 3/2014 Crepet
2014/0079248 A1 3/2014 Short et al.
2014/0097691 A1 4/2014 Jackson et al.
2014/0100738 A1 4/2014 Itatsu et al.
2014/0100912 A1 4/2014 Bursey
2014/0120972 A1 5/2014 Hartman
2014/0143579 A1 5/2014 Grokop et al.
2014/0155751 A1 6/2014 Banjanin et al.
2014/0161135 A1 6/2014 Acharya et al.
2014/0167810 A1 6/2014 Neti et al.
2014/0176203 A1 6/2014 Matheny et al.
2014/0188434 A1 7/2014 Steinbrecher et al.
2014/0198615 A1 7/2014 Ray
2014/0201571 A1 7/2014 Hosek et al.
2014/0210473 A1 7/2014 Campbell et al.
2014/0222971 A1 8/2014 Cooper et al.
2014/0232534 A1 8/2014 Birnbaum et al.
2014/0251688 A1 9/2014 Turner et al.
2014/0251836 A1 9/2014 Feeney
2014/0262392 A1 9/2014 Petrossians et al.
2014/0271449 A1 9/2014 McAlister et al.
2014/0278312 A1 9/2014 Blevins et al.
2014/0279574 A1 9/2014 Gettings et al.
2014/0280678 A1 9/2014 Blevins et al.
2014/0282257 A1 9/2014 Nixon et al.
2014/0288876 A1 9/2014 Donaldson
2014/0304201 A1 10/2014 Hyldgaard et al.
2014/0309821 A1 10/2014 Poux et al.
2014/0313303 A1 10/2014 Davis et al.
2014/0314099 A1 10/2014 Dress
2014/0324367 A1 10/2014 Garvey et al.
2014/0324389 A1 10/2014 Baldwin et al.
2014/0336791 A1 11/2014 Asenjo et al.
2014/0336878 A1 11/2014 Yanai et al.
2014/0337277 A1 11/2014 Asenjo et al.
2014/0352444 A1 12/2014 Nicq
2014/0354284 A1 12/2014 Pai et al.
2014/0376405 A1 12/2014 Erickson et al.
2014/0378810 A1 12/2014 Davis et al.
2014/0379102 A1 12/2014 Tian et al.
2015/0016185 A1 1/2015 King Liu et al.
2015/0020088 A1 1/2015 Velasco et al.
2015/0029864 A1 1/2015 Raileanu et al.
2015/0040051 A1 2/2015 Fuhrmann, Jr. et al.
2015/0046127 A1 2/2015 Chen et al.
2015/0046697 A1 2/2015 Galpin et al.
2015/0055633 A1 2/2015 Wu et al.
2015/0059442 A1 3/2015 Liljenberg et al.
2015/0067119 A1 3/2015 Estevez et al.
2015/0070145 A1 3/2015 Mar et al.
2015/0080044 A1 3/2015 McHenry et al.
2015/0097707 A1 4/2015 Nelson, Jr. et al.
2015/0112488 A1 4/2015 Hoehn et al.
2015/0120230 A1 4/2015 Banhegyesi
2015/0121468 A1 4/2015 Park et al.
2015/0134954 A1 5/2015 Walley et al.
2015/0142384 A1 5/2015 Chao et al.
2015/0151960 A1 6/2015 Mc Cleland et al.
2015/0153757 A1 6/2015 Meagher
2015/0154136 A1 6/2015 Markovic et al.
2015/0180760 A1 6/2015 Rickard
2015/0180986 A1 6/2015 Bisdikian et al.
2015/0185716 A1 7/2015 Wichmann et al.
2015/0186483 A1 7/2015 Tappan et al.
2015/0192439 A1 7/2015 Mihelich et al.
2015/0223731 A1 8/2015 Sahin
2015/0229530 A1 8/2015 Silvers
2015/0233731 A1 8/2015 Torpy et al.
2015/0237563 A1 8/2015 Maric et al.
2015/0248375 A1 9/2015 Houel et al.
2015/0249806 A1 9/2015 Gabel
2015/0271106 A1 9/2015 Walker et al.
2015/0277399 A1 10/2015 Maturana et al.
2015/0277406 A1 10/2015 Maturana et al.
2015/0278839 A1 10/2015 Hansen
2015/0288257 A1 10/2015 Cooper et al.
2015/0302664 A1 10/2015 Miller
2015/0317197 A1 11/2015 Blair
2015/0323510 A1 11/2015 Huynh et al.
2015/0323936 A1 11/2015 Junk
2015/0330640 A1 11/2015 Stork Genannt Wersborg
2015/0330950 A1 11/2015 Bechhoefer
2015/0331805 A1 11/2015 Daga et al.
2015/0331928 A1 11/2015 Ghaemi
2015/0351084 A1 12/2015 Werb
2015/0354607 A1 12/2015 Avni
2015/0355245 A1 12/2015 Ordanis
2015/0357948 A1 12/2015 Goldstein
2015/0379510 A1 12/2015 Smith
2016/0007102 A1 1/2016 Raza et al.
2016/0011692 A1 1/2016 Heim et al.
2016/0026172 A1 1/2016 Steele et al.
2016/0026173 A1 1/2016 Willis et al.
2016/0026729 A1 1/2016 Gil et al.
2016/0028605 A1 1/2016 Gil et al.
2016/0047204 A1 2/2016 Donderici et al.
2016/0048110 A1 2/2016 Hilemon et al.
2016/0048399 A1 2/2016 Shaw
2016/0054284 A1 2/2016 Washburn
2016/0054951 A1 2/2016 Mathur et al.
2016/0078695 A1 3/2016 Mcclintic et al.
2016/0091398 A1 3/2016 Pluemer
2016/0097674 A1 4/2016 Zusman
2016/0098647 A1 4/2016 Nixon et al.
2016/0104330 A1 4/2016 Rudenko et al.
2016/0130928 A1 5/2016 Torrione
2016/0135109 A1 5/2016 Hampel et al.
2016/0138492 A1 5/2016 Levy et al.
2016/0142160 A1 5/2016 Walker et al.
2016/0142868 A1 5/2016 Kulkarni et al.
2016/0143541 A1 5/2016 He et al.
2016/0147204 A1 5/2016 Wichmann et al.
2016/0153806 A1 6/2016 Ciasulli et al.
2016/0161028 A1 6/2016 Arai et al.
2016/0163186 A1 6/2016 Davidson et al.
2016/0171846 A1 6/2016 Brav et al.
2016/0182309 A1 6/2016 Maturana et al.
2016/0187864 A1 6/2016 Choe et al.
2016/0196124 A1 7/2016 Vedula et al.
2016/0196375 A1 7/2016 Nasle
2016/0196758 A1 7/2016 Causevic et al.
2016/0209831 A1 7/2016 Pal
2016/0210834 A1 7/2016 Dayal
2016/0215614 A1 7/2016 Song et al.
2016/0217384 A1 7/2016 Leonard et al.
2016/0219024 A1 7/2016 Verzun et al.
2016/0219348 A1 7/2016 Formo et al.
2016/0245027 A1 8/2016 Gumus et al.
2016/0245686 A1* 8/2016 Pal ........................ G01H 1/003
2016/0255420 A1 9/2016 Mccleland et al.
2016/0256063 A1 9/2016 Friedman et al.
2016/0258836 A1 9/2016 Raman et al.
2016/0262687 A1 9/2016 Vaidyanathan et al.
2016/0273354 A1 9/2016 Chen et al.
2016/0275376 A1 9/2016 Kant
2016/0275414 A1 9/2016 Towal
2016/0282820 A1 9/2016 Perez et al.
2016/0282872 A1 9/2016 Ahmed et al.
2016/0285840 A1 9/2016 Smith et al.
2016/0301991 A1 10/2016 Loychik et al.
2016/0302019 A1 10/2016 Smith et al.
2016/0305236 A1 10/2016 Forsberg et al.
2016/0310062 A1 10/2016 Larson
2016/0328979 A1 11/2016 Postrel
2016/0330137 A1 11/2016 Avci
2016/0334306 A1 11/2016 Chiu et al.
2016/0337127 A1 11/2016 Schultz et al.
2016/0350671 A1 12/2016 Morris, II et al.
2016/0356125 A1 12/2016 Bello et al.

(56) References Cited

U.S. PATENT DOCUMENTS

2016/0359680 A1 12/2016 Parandehgheibi et al.
2016/0378076 A1 12/2016 Hill et al.
2016/0378086 A1 12/2016 Plymill et al.
2016/0379282 A1 12/2016 Hill et al.
2017/0003677 A1 1/2017 Hsu et al.
2017/0004697 A1 1/2017 Boerhout
2017/0006135 A1 1/2017 Siebel et al.
2017/0012861 A1 1/2017 Blumenthal et al.
2017/0012868 A1 1/2017 Ho et al.
2017/0012884 A1 1/2017 Ho et al.
2017/0012885 A1 1/2017 Ho
2017/0012905 A1 1/2017 Ho et al.
2017/0030349 A1 2/2017 Bassett et al.
2017/0031348 A1 2/2017 Willis et al.
2017/0032281 A1 2/2017 Hsu
2017/0037691 A1 2/2017 Savage et al.
2017/0037721 A1 2/2017 Lovorn et al.
2017/0046458 A1 2/2017 Meagher et al.
2017/0053461 A1 2/2017 Pal et al.
2017/0068782 A1 3/2017 Pillai et al.
2017/0070842 A1 3/2017 Kulp et al.
2017/0074715 A1 3/2017 Bartos et al.
2017/0075320 A1 3/2017 Day et al.
2017/0075552 A1 3/2017 Berenbaum et al.
2017/0082101 A1 3/2017 Urdaneta et al.
2017/0096889 A1 4/2017 Blanckaert et al.
2017/0097615 A1 4/2017 Mazur et al.
2017/0097617 A1 4/2017 Tegnell et al.
2017/0102678 A1 4/2017 Nixon et al.
2017/0102693 A1 4/2017 Kidd et al.
2017/0104736 A1 4/2017 Seul et al.
2017/0114626 A1 4/2017 Bardapurkar et al.
2017/0124487 A1 5/2017 Szeto et al.
2017/0130700 A1 5/2017 Sakaguchi et al.
2017/0132910 A1 5/2017 Chen et al.
2017/0147674 A1 5/2017 Procops et al.
2017/0149605 A1 5/2017 Strasser
2017/0152729 A1 6/2017 Gleitman et al.
2017/0163436 A1 6/2017 Mclaughlin et al.
2017/0173458 A1 6/2017 Billington et al.
2017/0175645 A1 6/2017 Devarakonda et al.
2017/0176033 A1 6/2017 Tan et al.
2017/0180221 A1 6/2017 Appel et al.
2017/0200092 A1 7/2017 Kisilev
2017/0205451 A1 7/2017 Moinuddin
2017/0206464 A1* 7/2017 Clayton ................ G06N 3/044
2017/0207926 A1 7/2017 Gil et al.
2017/0215261 A1 7/2017 Potucek et al.
2017/0222999 A1 8/2017 Banga et al.
2017/0223046 A1 8/2017 Singh
2017/0238072 A1 8/2017 Mackie et al.
2017/0239594 A1 8/2017 Bowers et al.
2017/0242509 A1 8/2017 Wingate
2017/0249282 A1 8/2017 Novet
2017/0257653 A1 9/2017 FarrÉ Guiu et al.
2017/0284186 A1 10/2017 Samuel et al.
2017/0284902 A1 10/2017 Nolan et al.
2017/0300753 A1 10/2017 Billi et al.
2017/0307466 A1 10/2017 Brennan, Jr. et al.
2017/0310338 A1 10/2017 Hori
2017/0310747 A1 10/2017 Cohn et al.
2017/0312614 A1 11/2017 Tran et al.
2017/0329307 A1 11/2017 Castillo-effen et al.
2017/0331577 A1 11/2017 Parkvall et al.
2017/0331670 A1 11/2017 Parkvall et al.
2017/0332049 A1 11/2017 Zhang
2017/0336447 A1 11/2017 Valenti et al.
2017/0338835 A1 11/2017 Priller et al.
2017/0339022 A1 11/2017 Hegde et al.
2017/0352010 A1 12/2017 Son et al.
2017/0353537 A1 12/2017 Crabtree et al.
2017/0371311 A1 12/2017 Aparicio Ojea et al.
2017/0372534 A1 12/2017 Steketee et al.
2018/0007055 A1 1/2018 Infante-Lopez et al.
2018/0007131 A1 1/2018 Cohn et al.
2018/0023986 A1 1/2018 Kruusmaa et al.
2018/0034694 A1 2/2018 Farnham
2018/0035134 A1 2/2018 Pang et al.
2018/0035195 A1 2/2018 Bjelosevic et al.
2018/0052428 A1 2/2018 Abramov
2018/0054490 A1 2/2018 Wadhwa et al.
2018/0059685 A1 3/2018 Baroudi et al.
2018/0062553 A1 3/2018 Van et al.
2018/0066658 A1 3/2018 Philippe
2018/0082501 A1 3/2018 Kochhar et al.
2018/0091516 A1 3/2018 Nixon et al.
2018/0095455 A1 4/2018 Silva et al.
2018/0096243 A1 4/2018 Patil et al.
2018/0124547 A1 5/2018 Patil
2018/0135401 A1 5/2018 Dykstra et al.
2018/0142905 A1 5/2018 Plourde et al.
2018/0183874 A1 6/2018 Cook
2018/0188704 A1 7/2018 Cella et al.
2018/0188714 A1 7/2018 Cella et al.
2018/0189684 A1 7/2018 Vasvani
2018/0191867 A1 7/2018 Siebel et al.
2018/0203442 A1 7/2018 Kotlyarov
2018/0210425 A1 7/2018 Cella et al.
2018/0247515 A1 8/2018 Brady et al.
2018/0255381 A1 9/2018 Cella et al.
2018/0278489 A1 9/2018 Frackelton et al.
2018/0279952 A1 10/2018 Orron et al.
2018/0281191 A1 10/2018 Sinyavskiy et al.
2018/0282633 A1 10/2018 Van De Cotte et al.
2018/0284093 A1 10/2018 Brown et al.
2018/0284741 A1 10/2018 Cella et al.
2018/0288158 A1 10/2018 Nolan et al.
2018/0292811 A1 10/2018 Baseman et al.
2018/0300610 A1 10/2018 Pye et al.
2018/0349508 A1 12/2018 Bequet et al.
2018/0364785 A1 12/2018 Hu et al.
2018/0375743 A1 12/2018 Lee et al.
2019/0020741 A1 1/2019 Knaappila
2019/0021039 A1 1/2019 Sudarsan et al.
2019/0024495 A1 1/2019 Wise et al.
2019/0025805 A1 1/2019 Cella et al.
2019/0025806 A1 1/2019 Cella et al.
2019/0025812 A1 1/2019 Cella et al.
2019/0025813 A1 1/2019 Cella et al.
2019/0033845 A1 1/2019 Cella et al.
2019/0033846 A1 1/2019 Cella et al.
2019/0033847 A1 1/2019 Cella et al.
2019/0033850 A1 1/2019 B R et al.
2019/0036946 A1 1/2019 Ruvio et al.
2019/0041840 A1 2/2019 Cella et al.
2019/0056107 A1 2/2019 Desai et al.
2019/0098377 A1 3/2019 Kallus et al.
2019/0137987 A1 5/2019 Cella et al.
2019/0137988 A1 5/2019 Cella et al.
2019/0140906 A1 5/2019 Furuichi et al.
2019/0170718 A1 6/2019 Miresmailli et al.
2019/0171187 A1 6/2019 Cella et al.
2019/0174207 A1 6/2019 Cella et al.
2019/0203653 A1 7/2019 Bryan et al.
2019/0204818 A1 7/2019 Ogata et al.
2019/0304037 A1 10/2019 Kawano et al.
2019/0324431 A1 10/2019 Cella et al.
2019/0326906 A1 10/2019 Camacho Cardenas et al.
2019/0339688 A1 11/2019 Cella et al.
2019/0349426 A1 11/2019 Smith et al.
2019/0354096 A1 11/2019 Pal
2020/0004561 A1 1/2020 Kottler et al.
2020/0034538 A1 1/2020 Woodward et al.
2020/0034638 A1 1/2020 Brewington et al.
2020/0045146 A1 2/2020 Ito
2020/0067789 A1 2/2020 Khuti et al.
2020/0103894 A1 4/2020 Cella et al.
2020/0133257 A1 4/2020 Cella et al.
2020/0150643 A1 5/2020 Cella et al.
2020/0150644 A1 5/2020 Cella et al.
2020/0150645 A1 5/2020 Cella et al.
2020/0201292 A1 6/2020 Cella et al.
2020/0244297 A1 7/2020 Zalewski et al.
2020/0284092 A1 9/2020 Arkenstedt et al.

(56) References Cited

U.S. PATENT DOCUMENTS

| | | | |
|---|---|---|---|
| 2020/0301408 | A1 | 9/2020 | Elbsat et al. |
| 2020/0304376 | A1 | 9/2020 | Finkler et al. |
| 2020/0311559 | A1 | 10/2020 | Chattopadhyay et al. |
| 2020/0359233 | A1 | 11/2020 | Pergal |
| 2020/0387136 | A1 | 12/2020 | Pöschmann et al. |
| 2020/0410590 | A1 | 12/2020 | Regmi et al. |
| 2021/0085861 | A1 | 3/2021 | Patel et al. |
| 2021/0096551 | A1 | 4/2021 | Sayyarrodsari et al. |
| 2021/0199534 | A1 | 7/2021 | Bidwell et al. |

FOREIGN PATENT DOCUMENTS

| | | | |
|---|---|---|---|
| CN | 2751314 | Y | 1/2006 |
| CN | 201138454 | Y | 10/2008 |
| CN | 101694577 | A | 4/2010 |
| CN | 201945429 | U | 8/2011 |
| CN | 102445604 | A | 5/2012 |
| CN | 202583862 | U | 12/2012 |
| CN | 102298364 | B | 3/2013 |
| CN | 103164516 | A | 6/2013 |
| CN | 103220552 | A | 7/2013 |
| CN | 203202640 | U | 9/2013 |
| CN | 204178215 | U | 2/2015 |
| CN | 104579552 | A | 4/2015 |
| CN | 102762156 | B | 6/2015 |
| CN | 205301926 | U | 6/2016 |
| CN | 106855492 | A | 6/2017 |
| DE | 29806131 | U1 | 7/1998 |
| EP | 0897111 | A2 | 2/1999 |
| EP | 1248216 | A1 | 10/2002 |
| EP | 2983056 | A1 | 2/2016 |
| JP | S5913084 | U | 1/1984 |
| JP | 2001133364 | A | 5/2001 |
| JP | 2002155985 | A | 5/2002 |
| JP | 2005346463 | A | 12/2005 |
| JP | 2006302293 | A | 11/2006 |
| JP | 2008232934 | A | 10/2008 |
| JP | 2014170552 | A | 9/2014 |
| JP | 2014203274 | A | 10/2014 |
| KR | 20090103188 | A | 10/2009 |
| KR | 20110009615 | A | 1/2011 |
| KR | 20120111514 | A | 10/2012 |
| WO | 9412917 | A1 | 6/1994 |
| WO | 03090091 | A1 | 10/2003 |
| WO | 2006014479 | A2 | 2/2006 |
| WO | 2010138831 | A2 | 12/2010 |
| WO | 2013123445 | A1 | 8/2013 |
| WO | 2016068929 | A1 | 5/2016 |
| WO | 2016137848 | A1 | 9/2016 |
| WO | 2016182964 | A1 | 11/2016 |
| WO | 2016187112 | A1 | 11/2016 |
| WO | 2017098193 | A1 | 6/2017 |
| WO | 2017136489 | A1 | 8/2017 |
| WO | 2017196821 | A1 | 11/2017 |
| WO | 2017198327 | A1 | 11/2017 |
| WO | 2017196821 | A4 | 12/2017 |
| WO | 2018142598 | A1 | 8/2018 |
| WO | 2019028269 | A2 | 2/2019 |
| WO | 2019094721 | A2 | 5/2019 |
| WO | 2019094729 | A1 | 5/2019 |
| WO | 2019094721 | A3 | 6/2019 |

OTHER PUBLICATIONS

PCT/US18/45036, "International Application Serial No. PCT/US18/45036, International Search Report and Written Opinion dated Mar. 21, 2019", Strong Force IoT Portfolio 2016, LLC, 186 pages.

PCT/US18/45036, "International Application Serial No. PCT/US18/45036, Invitation to Pay Additional Fees and, Where Applicable, Protest Fee dated Jan. 14, 2019", Strong Force IOT Portfolio 2016, LLC, 7 pages.

PCT/US18/60034, "International Application Serial No. PCT/US18/60034, International Search Report and Written Opinion dated May 16, 2019", Strong Force IoT Portfolio 2016, LLC, 23 pages.

PCT/US18/60034, "International Application Serial No. PCT/US18/60034, Invitation to Pay Additional Fees and, Where Applicable, Protest Fee dated Mar. 26, 2019", Strong Force IoT Portfolio 2016, LLC, 7 pages.

PCT/US18/60043, "International Application Serial No. PCT/US18/60043, Invitation to Pay Additional Fees and, Where Applicable, Protest Fee dated Feb. 13, 2019", Strong Force IoT Portfolio 2016, LLC, 7 pages.

PCT/US2018/060043, "International Application Serial No. PCT/US2018/060043, International Search Report and Written Opinion dated Apr. 2, 2019", Strong Force IoT Portfolio 2016, LLC, 29 pages.

Reinhardt, "Designing Sensor Networks for Smart Spaces, Unified Interfacing and Energy-Efficient Communication Between Wireless Sensor and Actuator Nodes", Vom Fachbereich Elektrotechnik und Informationstechnik der Technischen Universitat Darmstadt, 2011, 165 pages.

Ferry, et al., "Towards a Big Data Platform for Managing Machine Generated Data in the Cloud", 2017 IEEE 15th International Conference on Industrial Informatics (INDIN), Emden, 2017, pp. 263-270.

Goundar, et al., Abstract of: "Real Time Condition Monitoring System for Industrial Motors", 2nd Asia-Pacific World Congress on Computer Science and Engineering (APWC on CSE), https://ieeexplore.ieee.org/document/7476232 (accessed Apr. 24, 2020), 2015, 1 page.

Goundar, et al., "Real Time Condition Monitoring System for Industrial Motors", 2nd Asia-Pacific World Congress on Computer Science and Engineering (APWC on CSE), 2015, 9 pages.

PCT/US18/45036, "International Application Serial No. PCT/US18/45036, International Preliminary Report on Patentability dated Feb. 13, 2020", Strong Force IoT Portfolio 2016, LLC, 164 pages.

PCT/US18/60034, "International Application Serial No. PCT/US18/60034, International Preliminary Report on Patentability dated May 22, 2020", Strong Force IoT Portfolio 2016, LLC, 17 pages.

PCT/US18/60043, "International Application Serial No. PCT/US18/60043, International Preliminary Report on Patentability dated May 22, 2020", Strong Force IoT Portfolio 2016, LLC, 23 pages.

Rodrigues, et al., "RELOAD/CoAP Architecture with Resource Aggregation/Disaggregation Service", IEEE 27th Annual International Symposium on Personal, Indoor, and Mobile Radio Communications (PIMRC), Workshop: From M2M Communications to Internet of Things, 2016, 6 pages.

"Maxim High-Current, 25Q, SPDT, CMOS Analog Switches", 2007, 12 pages.

18840994.0, , "European Application Serial No. 18840994.0 , Extended European Search Report dated Mar. 29, 2021", Strong Force IoT Portfolio 2016, LLC, 13 pages.

Abb, "Symphony Plus Condition Monitoring", 2014, 8 pages.

Al-Karaki, Jamal N. et al., "Routing Techniques in Wireless Sensor Networks: A Survey", downloaded from the internet "file:///C:/Users/olopez/Documents/e-Red 20Folder/16060107/Karaki.pdf", 2004, pp. 6-28.

Azad, A.K.M. et al., "Energy-Balanced Transmission Policies for Wireless Sensor Networks", IEEE Transactions on Mobile Computing vol. 10, Issue 7, 2011, pp. 927-940.

Bal, Mert , "An Industrial Wireless Sensor Networks Framework for Production Monitoring", IEEE, 2014, 6 pages.

Behere, Sagar , "A Generic Framework for Robot Motor Planning and Control", Master's Thesis in Computer Science, at the Systems, Control and Robotics Master's Program Royal Institute of Technology, 2010, 71 pages.

Borge, S.B. et al., "Multiple Mobile Nodes for Efficient Data Collection from Clusters in Wireless Sensor Network", 2014 IEEE Global Conference on Wireless Computing and Networking, pp. 153-156.

Bouchoucha, Taha et al., "Distributed Estimation Based on Observations Prediction in Wireless Sensor Networks", IEEE Signal Processing Letters, vol. 22, No. 10, 2015, pp. 1530-1533.

(56) References Cited

OTHER PUBLICATIONS

Carey, W.M. et al., "Abstract of Carey", IEEE Xplore_Search_Results, 1977, 1 page.
Carey, W.M. et al., "The Acoustic Background Noise of an Operating Liquid Metal Fast Breeder Reactor", EBR-II, 1977, ICASSP 77, IEEE International Conference on Acoustics, Speech, and Signal Processing, vol. 2, 1977, pp. 393-396.
Chaudhary, Sumit et al., "Energy Efficient Techniques for Data aggregation and collection in WSN", International Journal of Computer Science, Engineering and Applications (IJCSEA) vol. 2, No. 4, 11 pages.
Chudasama, Shaktising R. et al., "Packet size optimization in wireless sensor network using cross-layer design approach", 2014 International Conference on Advances in Computing, Communications and Informatics (ICACCI), Delhi, India,, doi: 10.1109/ICACCI.2014.6968357., 2014, pp. 2506-2511.
Dagar, Mousam et al., "Data Aggregation in Wireless Sensor Network: A Survey", International Journal of Information and Computation Technology. ISSN 0974-2239 vol. 3, No. 3, 2013, pp. 167-174.
Dang, Quoc Khanh et al., "Sensor Saturation Compensated Smoothing Algorithm for Inertial Sensor Based Motion Tracking", Sensors 2014, 14, 2014, pp. 8167-8188.
Dasarathy, Belur V. , "Industrial Applications of Multi-Sensor Multi-Source Information Fusion", IEEE, 2000, 7 pages.
Di Maio, Francesco et al., "Fault Detection in Nuclear Power Plants Components by a Combination of Statistical Methods", IEEE Transactions on Reliability, vol. 62, No. 4, 2013, pp. 833-845.
Dimakis, Alexandras G. et al., "Network Coding for Distributed Storage System", IEEE Transactions on Information Theory, vol. 56, No. 9, 2010, 13 pages.
Farnahm, Tim , "Proactive wireless sensor network for industrial IoT", 2017 IEEE International Conference on Communications (ICC), 2017, 6 pages.
Geeta, D.D et al., "Fault tolerance in wireless sensor network using hand-off and dynamic power adjustment approach", Journal of Network and Computer Applications 36, 2013, pp. 1174-1185.
Gelenbe, E. , "Users and Services in Intelligent Networks", IEE Proc. Intell. Transp. Syst., vol. 153, No. 3, 2006, pp. 213-220.
Gelenbe, Erol et al., Abstract of "Adaptive QoS routing for significant events in wireless sensor networks" from the 2008 5th IEEE International Conference on Mobile Ad Hoc and Sensor Systems; Sep. 29- Oct. 2, 2008, https://ieeexplore.ieee.org/document/4660035, Oct. 28, 2008, 1 page.
Gelenbe, Erol et al., "Adaptive QoS Routing for Significant Events in Wireless Sensor Networks", 2008 5th IEEE International Conference on Mobile Ad Hoc and Sensor Systems, Atlanta, GA,, Oct. 28, 2008, pp. 410-415.
Google, , "Google Search History", Jul. 13, 2021, 1 page.
Google, , "Google Search History", Jul. 12, 2021, 1 page.
Google, , "Google Search History", Jul. 21, 2021, 1 page.
Han, Hong-Gui et al., "A soft computing method to predict sludge volume index based on a recurrent self-organizing neural network", Applied Soft Computing, vol. 38, Jan. 2016, pp. 477-486.
IEEE, , "IEEE Xplore Search Results", Jul. 10, 2021, 1 page.
Kalore, Sushil Vilas et al., "A Review on Efficient Routing Techniques in Wireless Sensor Networks", 2015 International Conference on Advances in Computer Engineering and Applications (ICECEA) IMS Engineering College, Ghaziabad, India, 2015, 5 pages.
Kim, Hyung-Won et al., "Low Power Routing and Channel Allocation of Wireless Video Sensor Networks Using Wireless Link Utilization", Ad Hoc & Sensor Wireless Networks, vol. 30, 2016, pp. 83-112.
Koushanfar, Farinza et al., "Fault Tolerance Techniques for Wireless Ad Hoc Sensor Networks", IEEE, 2002, 6 pages.
Kreibich, Ondrej et al., "Quality-Based Multiple-Sensor Fusion in an Industrial Wireless Sensor Network for MCM", Sep. 2014, IEEE Transaction on Industrial Electronics, vol. 61, No. 9,, 2014, pp. 4903-4911.
Lee, Jay et al., "Industrial Big Data Analytics and Cyber-Physical Systems for Future Maintenance & Service Innovation", Procedia CIRP 38, 2015, pp. 3-7.
Lincoln, Adrian , "What is operating deflection shape (ODS) analysis", Prosig Noise & Vibration Blog, https://blog.prosig.com/2014/09/01 /what-is-operating-deflection-shape-ods-analysis/, Sep. 1, 2014, 2 pages.
Linnenberg, Tobias et al., "A market-based multi-agent-system for decentralized power and grid control", Sep. 1, 2011, IEEE, 2011, pp. 1-8.
Mulder, Jacob et al., "Mobile Sensor Networks for Inspection Tasks in Harsh Industrial Environments", 2010, pp. 1599-1618.
Ngai, Edith C. et al., "Information-Aware Traffic Reduction for Wireless Sensor Networks", 2009 IEEE 34th Conference on Local Computer Networks (LCN 2009), Zurich, Switzerland, 2009, pp. 451-458.
Niazi, Muaz A. et al., "A Novel Agent-Based Simulation Framework for Sensing in Complex Adaptive Environments", Feb. 2011, IEEE Sensors Journal, vol. 11, No. 2, 2011, pp. 404-412.
Orfanus, Dalimir et al., "An Approach for Systematic Design of Emergent Self-Organization in Wireless Sensor Networks", 2009 IEEE, 2009 Computation World: Future Computing, Service Computation, Cognitive, Adaptive, Content, Patterns, 2009, pp. 92-98.
Pereira, Luiz Arthur Malta et al., "A New Alternative Real-Time Method to Monitoring Dough Behavior During Processing Using Wireless Sensor", International Journal of Food Engineering, vol. 9, Issue 4, 2013, pp. 505-509.
Prandi, Luciano et al., "A Low-Power 3-Axis Digital-Output MEMS Gyroscope with Single Drive and Multiplexed Angular Rate Readout", ISSCC 2011 / Session 6 / Sensors & Energy Harvesting, 2011, 3 pages.
Raghunandan, G.H. et al., "A Comparative Analysis of Routing Techniques for Wireless Sensor Networks", Proceedings of the National Conference on Innovations in Emerging Technology-2011 Kongu Engineering College, Perundurai, Erode, Tamilnadu, India. 17 & 18, 2011, pp. 17-22.
Rimell, Andrew N. et al., "Variation between manufacturers' declared vibration emission values and those measured under simulated workplace conditions for a range of hand-held power tools typically found in the construction industry", International Journal of Industrial Ergonomics 38, 2008, pp. 661-675.
Roselin, J. et al., "Energy Balanced Dynamic Deployment Optimization to Enhance Reliable Lifetime of Wireless Sensor Network International Journal of Engineering and Technology (IJET)", vol. 5 No. 4, 2013, 11 pages.
Saavedra, PN et al., "Vibration analysis of rotors for the identification of shaft misalignment Part 2: experimental validation", Instn Meeh. Engrs vol. 218 Part C: J. Mechanical Engineering Science, 2004, 13 pages.
Soleimani, Maliheh et al., "Abstractof Soleimani Reference", 2016, 1 page.
Soleimani, Maliheh et al., "RF Channel Modelling and Multi-Hop Routing for Wireless Sensor Networks Located on Oil Rigs", IET Wireless Sensor Systems, vol. 6, Issue 5, 2016, pp. 173-179.
Sorensen, Jens , "Sigma-Delta Conversion Used for Motor Control", Analog Devices technical articl, 2015, 6 pages.
Wang, Jie-Sheng et al., "SOM Neural Network Fault Diagnosis Method of Polymerization Kettle Equipment Optimized by Improved PSO Algorithm", The Scientific World Journal, 2012, 12 pages.
Wikipedia Entry, , "Petroleum Product", (snapshot taken of Jan. 21, 2016 entry taken using Wayback machine; web.archive.org/web/20160121063510/https://en.wikipedia.org/wiki/Petroleum_product), 2016, 3 pages.
Burkle, Axel , et al., "Towards Autonomous Micro UAV Swarms", J Intell Robot Syst, 2011, 15 pages.
Chang, Yongping , et al., "ICA-ANN Method in Fault Diagnosis of Rotating Machinery", 2012 IEEE, Published in 2016 IEEE Congress on Evolutionary Computation (CEC), 2012, pp. 236-240.
Saldivar, Alfredo Alan Flores, et al., Abstract of "Self-Organizing Tool for Smart Design With Predictive Customer Needs and Wants to Realize Industry 4.0", IEEE Congress on Evolutionary Computation (CEC), pp. 5317-5324, Jul. 24-29, 2016, 1 page.

(56) References Cited

OTHER PUBLICATIONS

Saldivar, Alfredo Alan Flores, et al., "Self-Organizing Tool for Smart Design With Predictive Customer Needs and Wants to Realize Industry 4.0", IEEE Congress on Evolutionary Computation (CEC), 2016, pp. 5317-5324.
Somasundara, A.A., et al., "Mobile element scheduling for efficient data collection in wireless sensor networks with dynamic deadlines", 25th IEEE International Real-Time Systems Symposium, 2004, pp. 296-305.
Zhang, Yingfeng , et al., "Agent and Cyber-Physical System Based Self-Organizing and Self-Adaptive Intelligent Shopfloor", IEEE Transactions on Industrial Informatics, vol. 13, No. 2, Apr. 2017, pp. 737-747.
Allen, Will, et al., "Flexible High-Speed Load Shedding Using a Crosspoint Switch", 2006 Power Systems Conference: Advanced Metering, Protection, Control, Communication, and Distributed Resources, IEEE, Mar. 2006, pp. 14-17.
Niyato, Dusit, et al., "Smart Data Pricing Models for the Internet of Things: A Bundling Strategy Approach", IEEE Network, 2016, pp. 18-25.
Salahshoor, Karim, et al., Fault Detection and Diagnosis of an Industrial Steam Turbine Using a Distributed Configuration of Adaptive Neuro-Fuzzy Inference Systems, Feb. 4, 2011, pp. 1280-1293.
Shah, Mohak, "Big Data and the Internet of Things", Arxiv ID: 1503.07092v1 [cs.CY] ,https://doi.org/10.48550/arXiv.1503.07092., Mar. 24, 2015, pp. 1-33.
Xuelei, Zhao, et al., "Load Torque Observer for Cutting Motor of Roadheader Based on PLL", Third Inti Conf, on Measuring Tech, and Mechatronics Automation, 2011, pp. 476-479.
Le, Duc-Hung et al., "Managing On-Demand Sensing Resources in IoT Cloud Systems", 2016 IEEE International Conference on Mobile Services, 2016, pp. 65-72.
Marcu, Teodor, et al., "Miscellaneous Neural Networks Applied To Fault Detection and Isolation of An Evaporation Station", IFAC Fault Detection, Supervision and Safety for Technical Processes, Budapest, Hungary, pp. 359-364.
Henriquez, Patricia, et al., "Review of Automatic Fault Diagnosis Systems Using Audio and Vibration Signals", IEEE Transactions on Systems, Man, and Cybernetics, vol. 44, No. 5, 2014, pp. 642-652.

* cited by examiner

METHODS AND SYSTEMS FOR DETECTION IN AN INDUSTRIAL INTERNET OF THINGS DATA COLLECTION ENVIRONMENT WITH EXPERT SYSTEMS TO PREDICT FAILURES AND SYSTEM STATE FOR SLOW ROTATING COMPONENTS

CROSS-REFERENCE TO RELATED APPLICATIONS

This application claims the benefit of, and is a continuation of, U.S. Non-Provisional patent application Ser. No. 16/143,298, filed Sep. 26, 2018, entitled METHODS AND SYSTEMS FOR DEFECTION IN AN INDUSTRIAL INTERNET OF THINGS DATA COLLECTION ENVIRONMENT WITH ADJUSTMENT OF DEFECTION PARAMETERS FOR CONTINUOUS VIBRATION DATA.

U.S. Ser. No. 16/143,298 claims the benefit of, and is a continuation of, U.S. Non-Provisional patent application Ser. No. 15/973,406, filed May 7, 2018, entitled METHODS AND SYSTEMS FOR DETECTION IN AN INDUSTRIAL INTERNET OF THINGS DATA COLLECTION ENVIRONMENT WITH LARGE DATA SETS.

U.S. Ser. No. 15/973,406 is a bypass continuation-in-part of International Application Number PCT/US17/31721, filed May 9, 2017, entitled METHODS AND SYSTEM FOR THE INDUSTRIAL INTERNET OF THINGS, published on Nov. 16, 2017, as WO 2017/196821, which claims priority to: U.S. Provisional Patent Application Ser. No. 62/333,589, filed May 9, 2016, entitled STRONG FORCE INDUSTRIAL IOT MATRIX; U.S. Provisional Patent Application Ser. No. 62/350,672, filed Jun. 15, 2016, entitled STRATEGY FOR HIGH SAMPLING RATE DIGITAL RECORDING OF MEASUREMENT WAVEFORM DATA AS PART OF AN AUTOMATED SEQUENTIAL LIST THAT STREAMS LONG-DURATION AND GAP-FREE WAVEFORM DATA TO STORAGE FOR MORE FLEXIBLE POST-PROCESSING; U.S. Provisional Patent Application Ser. No. 62/412,843, filed Oct. 26, 2016, entitled METHODS AND SYSTEMS FOR THE INDUSTRIAL INTERNET OF THINGS; and U.S. Provisional Patent Application Ser. No. 62/427,141, filed Nov. 28, 2016, entitled METHODS AND SYSTEMS FOR THE INDUSTRIAL INTERNET OF THINGS.

U.S. Ser. No. 15/973,406 also claims priority to: U.S. Provisional Patent Application Ser. No. 62/540,557, filed Aug. 2, 2017, entitled SMART HEATING SYSTEMS IN AN INDUSTRIAL INTERNET OF THINGS; U.S. Provisional Patent Application Ser. No. 62/562,487, filed Sep. 24, 2017, entitled METHODS AND SYSTEMS FOR THE INDUSTRIAL INTERNET OF THINGS; and U.S. Provisional Patent Application Ser. No. 62/583,487, filed Nov. 8, 2017, entitled METHODS AND SYSTEMS FOR THE INDUSTRIAL INTERNET OF THINGS.

U.S. Ser. No. 16/143,298 claims the benefit of, and is a bypass continuation of, International Application Number PCT/US18/45036, filed Aug. 2, 2018, entitled METHODS AND SYSTEMS FOR DETECTION IN AN INDUSTRIAL INTERNET OF THINGS DATA COLLECTION ENVIRONMENT WITH LARGE DATA SETS.

International Application Number PCT/US18/45036 claims the benefit of, and is a continuation of, U.S. Non-Provisional patent application Ser. No. 15/973,406, filed May 7, 2018, entitled METHODS AND SYSTEMS FOR DETECTION IN AN INDUSTRIAL INTERNET OF THINGS DATA COLLECTION ENVIRONMENT WITH LARGE DATA SETS.

International Application Number PCT/US18/45036 claims priority to: U.S. Provisional Patent Application Ser. No. 62/540,557, filed Aug. 2, 2017, entitled SMART HEATING SYSTEMS IN AN INDUSTRIAL INTERNET OF THINGS; U.S. Provisional Patent Application Ser. No. 62/540,513, filed Aug. 2, 2017, entitled SYSTEMS AND METHODS FOR SMART HEATING SYSTEM THAT PRODUCES AND USES HYDROGEN FUEL; U.S. Provisional Patent Application Ser. No. 62/562,487, filed Sep. 24, 2017, entitled METHODS AND SYSTEMS FOR THE INDUSTRIAL INTERNET OF THINGS; and U.S. Provisional Patent Application Ser. No. 62/583,487, filed Nov. 8, 2017, entitled METHODS AND SYSTEMS FOR THE INDUSTRIAL INTERNET OF THINGS.

U.S. Ser. No. 16/143,298 claims priority to U.S. Provisional Patent Application Ser. No. 62/583,487, filed Nov. 8, 2017, entitled METHODS AND SYSTEMS FOR THE INDUSTRIAL INTERNET OF THINGS.

All of the foregoing applications are hereby incorporated by reference as if fully set forth herein in their entirety.

BACKGROUND

1. Field

The present disclosure relates to methods and systems for data collection in industrial environments, as well as methods and systems for leveraging collected data for monitoring, remote control, autonomous action, and other activities in industrial environments.

2. Description of the Related Art

Heavy industrial environments, such as environments for large scale manufacturing (such as manufacturing of aircraft, ships, trucks, automobiles, and large industrial machines), energy production environments (such as oil and gas plants, renewable energy environments, and others), energy extraction environments (such as mining, drilling, and the like), construction environments (such as for construction of large buildings), and others, involve highly complex machines, devices and systems and highly complex workflows, in which operators must account for a host of parameters, metrics, and the like in order to optimize design, development, deployment, and operation of different technologies in order to improve overall results. Historically, data has been collected in heavy industrial environments by human beings using dedicated data collectors, often recording batches of specific sensor data on media, such as tape or a hard drive, for later analysis. Batches of data have historically been returned to a central office for analysis, such as undertaking signal processing or other analysis on the data collected by various sensors, after which analysis can be used as a basis for diagnosing problems in an environment and/or suggesting ways to improve operations. This work has historically taken place on a time scale of weeks or months, and has been directed to limited data sets.

The emergence of the Internet of Things (IoT) has made it possible to connect continuously to, and among, a much wider range of devices. Most such devices are consumer devices, such as lights, thermostats, and the like. More complex industrial environments remain more difficult, as the range of available data is often limited, and the complexity of dealing with data from multiple sensors makes it much more difficult to produce "smart" solutions that are effective for the industrial sector. A need exists for improved methods and systems for data collection in industrial environments, as well as for improved methods and systems for using collected data to provide improved monitoring, control, intelligent diagnosis of problems and intelligent optimization of operations in various heavy industrial environments.

Industrial system in various environments have a number of challenges to utilizing data from a multiplicity of sensors. Many industrial systems have a wide range of computing resources and network capabilities at a location at a given time, for example as parts of the system are upgraded or replaced on varying time scales, as mobile equipment enters or leaves a location, and due to the capital costs and risks of upgrading equipment. Additionally, many industrial systems are positioned in challenging environments, where network connectivity can be variable, where a number of noise sources such as vibrational noise and electro-magnetic (EM) noise sources can be significant in varied locations, and with portions of the system having high pressure, high noise, high temperature, and corrosive materials. Many industrial processes are subject to high variability in process operating parameters and non-linear responses to off-nominal operations. Accordingly, sensing requirements for industrial processes can vary with time, operating stages of a process, age and degradation of equipment, and operating conditions. Previously known industrial processes suffer from sensing configurations that are conservative, detecting many parameters that are not needed during most operations of the industrial system, or that accept risk in the process, and do not detect parameters that are only occasionally utilized in characterizing the system. Further, previously known industrial systems are not flexible to configuring sensed parameters rapidly and in real-time, and in managing system variance such as intermittent network availability. Industrial systems often use similar components across systems such as pumps, mixers, tanks, and fans. However, previously known industrial systems do not have a mechanism to leverage data from similar components that may be used in a different type of process, and/or that may be unavailable due to competitive concerns. Additionally, previously known industrial systems do not integrate data from offset systems into the sensor plan and execution in real time.

SUMMARY

In an aspect, systems for monitoring data collection in an industrial environment may include a data collector communicatively coupled to a plurality of input channels connected to data collection points related to machine components, wherein at least one of the plurality of input channels is connected to a data collection point on a rotating machine component; a data acquisition circuit structured to interpret a plurality of detection values from the collected data, each of the plurality of detection values corresponding to at least one of the plurality of input channels; and an expert system analysis circuit structured to analyze the collected data, wherein the expert system analysis circuit determines a failure state for the rotating machine component based on analysis of the plurality of detection values, wherein upon determining the failure state the expert system analysis circuit provides the failure state to a data storage. In embodiments, the rotating machine component may be a slowly rotating machine component. The slowly rotating machine component may be rotating at less than 1000 RPM. The slowly rotating machine component may have a slow RPM setting and a high RPM setting. The high RPM setting may be less than 40 times the slow RPM setting. One of the plurality of input channels may be connected to a tri-axial sensor connected to multiple input channels for monitoring different positions on the slowly rotating machine component. The data analysis circuit may analyze a first and a second of the plurality of input channels for a relative phase determination, and wherein the expert system analysis circuit further determines the failure state in response to the relative phase determination. The plurality of input channels may be connected to a tri-axial sensor connected to multiple input channels for monitoring different positions on the rotating machine component. The data analysis circuit may analyze a first and a second of the plurality of input channels for a relative phase determination from which the data analysis circuit detects an anomalous condition for the rotating machine component. The data analysis circuit may further include a pattern recognition circuit structured to analyze the plurality of detection values with at least one of a neural net or an expert system for controlling data collection bands. The data acquisition circuit may include at least one delta-sigma analog-to-digital converter that is configured to increase input oversampling rates.

In an aspect, a computer-implemented method for data collection in an industrial environment may include collecting data from a plurality of input channels communicatively coupled to a data collector connected to data collection points related to machine components, wherein at least one of the plurality of input channels is connected to a data collection point on a rotating machine component; interpreting a plurality of detection values from the collected data, each of the plurality of detection values corresponding to at least one of the plurality of input channels; and operating an expert system to analyze the collected data, and to determine a failure state for the rotating machine component based on the plurality of detection values, and providing the failure state to a data storage. In embodiments, the rotating machine component may be a slowly rotating machine component. One of the plurality of input channels may be connected to a tri-axial sensor connected to multiple input channels for monitoring different positions on the slowly rotating machine component. The method may further include analyzing a first and a second of the plurality of input channels for a relative phase determination and detecting the failure state for the rotating machine component in response to the relative phase determination. The method may further include operating the expert system to analyze the plurality of detection values, and to control data collection bands of the plurality of detection values.

In an aspect, an apparatus for monitoring data collection in an industrial environment, may include a data collector communicatively coupled to a plurality of input channels connected to data collection points related to machine components, wherein at least one of the plurality of input channels is connected to a data collection point on a rotating machine component; a data acquisition circuit structured to interpret a plurality of detection values from the collected data, each of the plurality of detection values corresponding to at least one of the plurality of input channels; and an expert system analysis circuit structured to analyze the collected data, and to determine one of a failure state or an anomalous condition for the rotating machine component based on the analysis of the collected data, and to communicate the one of the failure state or the anomalous condition to a data storage. In embodiments, the rotating machine component may be a slowly rotating machine component. The slowly rotating machine component may be rotating at less than 1000 RPM. The slowly rotating machine component may have a slow RPM setting and a high RPM setting.

Methods and systems are provided herein for data collection in industrial environments, as well as for improved methods and systems for using collected data to provide improved monitoring, control, and intelligent diagnosis of problems and intelligent optimization of operations in various heavy industrial environments. These methods and systems include methods, systems, components, devices, workflows, services, processes, and the like that are deployed in various configurations and locations, such as: (a) at the "edge" of the Internet of Things, such as in the local environment of a heavy industrial machine; (b) in data transport networks that move data between local environments of heavy industrial machines and other environments, such as of other machines or of remote controllers, such as enterprises that own or operate the machines or the facilities in which the machines are operated; and (c) in locations where facilities are deployed to control machines or their environments, such as cloud-computing environments and on-premises computing environments of enterprises that own or control heavy industrial environments or the machines, devices or systems deployed in them. These methods and systems include a range of ways for providing improved data include a range of methods and systems for providing improved data collection, as well as methods and systems for deploying increased intelligence at the edge, in the network, and in the cloud or premises of the controller of an industrial environment.

Methods and systems are disclosed herein for continuous ultrasonic monitoring, including providing continuous ultrasonic monitoring of rotating elements and bearings of an energy production facility; for cloud-based systems including machine pattern recognition based on the fusion of remote, analog industrial sensors or machine pattern analysis of state information from multiple analog industrial sensors to provide anticipated state information for an industrial system; for on-device sensor fusion and data storage for industrial IoT devices, including on-device sensor fusion and data storage for an Industrial IoT device, where data from multiple sensors are multiplexed at the device for storage of a fused data stream; and for self-organizing systems including a self-organizing data marketplace for industrial IoT data, including a self-organizing data marketplace for industrial IoT data, where available data elements are organized in the marketplace for consumption by consumers based on training a self-organizing facility with a training set and feedback from measures of marketplace success, for self-organizing data pools, including self-organization of data pools based on utilization and/or yield metrics, including utilization and/or yield metrics that are tracked for a plurality of data pools, a self-organized swarm of industrial data collectors, including a self-organizing swarm of industrial data collectors that organize among themselves to optimize data collection based on the capabilities and conditions of the members of the swarm, a self-organizing collector, including a self-organizing, multi-sensor data collector that can optimize data collection, power and/or yield based on conditions in its environment, a self-organizing storage for a multi-sensor data collector, including self-organizing storage for a multi-sensor data collector for industrial sensor data, a self-organizing network coding for a multi-sensor data network, including self-organizing network coding for a data network that transports data from multiple sensors in an industrial data collection environment.

Methods and systems are disclosed herein for training artificial intelligence ("AI") models based on industry-specific feedback, including training an AI model based on industry-specific feedback that reflects a measure of utilization, yield, or impact, where the AI model operates on sensor data from an industrial environment; for an industrial IoT distributed ledger, including a distributed ledger supporting the tracking of transactions executed in an automated data marketplace for industrial IoT data; for a network-sensitive collector, including a network condition-sensitive, self-organizing, multi-sensor data collector that can optimize based on bandwidth, quality of service, pricing, and/or other network conditions; for a remotely organized universal data collector that can power up and down sensor interfaces based on need and/or conditions identified in an industrial data collection environment; and for a haptic or multi-sensory user interface, including a wearable haptic or multi-sensory user interface for an industrial sensor data collector, with vibration, heat, electrical, and/or sound outputs.

Methods and systems are disclosed herein for a presentation layer for augmented reality and virtual reality (AR/VR) industrial glasses, where heat map elements are presented based on patterns and/or parameters in collected data; and for condition-sensitive, self-organized tuning of AR/VR interfaces based on feedback metrics and/or training in industrial environments.

In embodiments, a system for data collection, processing, and utilization of signals from at least a first element in a first machine in an industrial environment includes a platform including a computing environment connected to a local data collection system having at least a first sensor signal and a second sensor signal obtained from at least the first machine in the industrial environment. The system includes a first sensor in the local data collection system configured to be connected to the first machine and a second sensor in the local data collection system. The system further includes a crosspoint switch in the local data collection system having multiple inputs and multiple outputs including a first input connected to the first sensor and a second input connected to the second sensor. Throughout the present disclosure, wherever a crosspoint switch, multiplexer (MUX) device, or other multiple-input multiple-output data collection or communication device is described, any multi-sensor acquisition device is also contemplated herein. In certain embodiments, a multi-sensor acquisition device includes one or more channels configured for, or compatible with, an analog sensor input. The multiple outputs include a first output and second output configured to be switchable between a condition in which the first output is configured to switch between delivery of the first sensor signal and the second sensor signal and a condition in which there is simultaneous delivery of the first sensor signal from the first output and the second sensor signal from the second output. Each of multiple inputs is configured to be individually assigned to any of the multiple outputs, or combined in any subsets of the inputs to the outputs. Unassigned outputs are configured to be switched off, for example by producing a high-impedance state.

In embodiments, the first sensor signal and the second sensor signal are continuous vibration data about the industrial environment. In embodiments, the second sensor in the local data collection system is configured to be connected to the first machine. In embodiments, the second sensor in the local data collection system is configured to be connected to a second machine in the industrial environment. In embodiments, the computing environment of the platform is configured to compare relative phases of the first and second sensor signals. In embodiments, the first sensor is a single-axis sensor and the second sensor is a three-axis sensor. In embodiments, at least one of the multiple inputs of the crosspoint switch includes internet protocol, front-end signal conditioning, for improved signal-to-noise ratio. In embodiments, the crosspoint switch includes a third input that is configured with a continuously monitored alarm having a pre-determined trigger condition when the third input is unassigned to or undetected at any of the multiple outputs.

In embodiments, the local data collection system includes multiple multiplexing units and multiple data acquisition units receiving multiple data streams from multiple machines in the industrial environment. In embodiments, the local data collection system includes distributed complex programmable hardware device ("CPLD") chips each dedicated to a data bus for logic control of the multiple multiplexing units and the multiple data acquisition units that receive the multiple data streams from the multiple machines in the industrial environment. In embodiments, the local data collection system is configured to provide high-amperage input capability using solid state relays. In embodiments, the local data collection system is configured to power-down at least one of an analog sensor channel and a component board.

In embodiments, the local data collection system includes a phase-lock loop band-pass tracking filter configured to obtain slow-speed revolutions per minute ("RPMs") and phase information. In embodiments, the local data collection system is configured to digitally derive phase using on-board timers relative to at least one trigger channel and at least one of the multiple inputs. In embodiments, the local data collection system includes a peak-detector configured to autoscale using a separate analog-to-digital converter for peak detection. In embodiments, the local data collection system is configured to route at least one trigger channel that is raw and buffered into at least one of the multiple inputs. In embodiments, the local data collection system includes at least one delta-sigma analog-to-digital converter that is configured to increase input oversampling rates to reduce sampling rate outputs and to minimize anti-aliasing filter requirements. In embodiments, the distributed CPLD chips each dedicated to the data bus for logic control of the multiple multiplexing units and the multiple data acquisition units includes as high-frequency crystal clock reference configured to be divided by at least one of the distributed CPLD chips for at least one delta-sigma analog-to-digital converter to achieve lower sampling rates without digital resampling.

In embodiments, the local data collection system is configured to obtain long blocks of data at a single relatively high-sampling rate as opposed to multiple sets of data taken at different sampling rates. In embodiments, the single relatively high-sampling rate corresponds to a maximum frequency of about forty kilohertz. In embodiments, the long blocks of data are for a duration that is in excess of one minute. In embodiments, the local data collection system includes multiple data acquisition units each having an onboard card set configured to store calibration information and maintenance history of a data acquisition unit in which the onboard card set is located. In embodiments, the local data collection system is configured to plan data acquisition routes based on hierarchical templates.

In embodiments, the local data collection system is configured to manage data collection bands. In embodiments, the data collection bands define a specific frequency band and at least one of a group of spectral peaks, a true-peak level, a crest factor derived from a time waveform, and an overall waveform derived from a vibration envelope. In embodiments, the local data collection system includes a neural net expert system using intelligent management of the data collection bands. In embodiments, the local data collection system is configured to create data acquisition routes based on hierarchical templates that each include the data collection bands related to machines associated with the data acquisition routes. In embodiments, at least one of the hierarchical templates is associated with multiple interconnected elements of the first machine. In embodiments, at least one of the hierarchical templates is associated with similar elements associated with at least the first machine and a second machine. In embodiments, at least one of the hierarchical templates is associated with at least the first machine being proximate in location to a second machine.

In embodiments, the local data collection system includes a graphical user interface ("GUI") system configured to manage the data collection bands. In embodiments, the GUI system includes an expert system diagnostic tool. In embodiments, the platform includes cloud-based, machine pattern analysis of state information from multiple sensors to provide anticipated state information for the industrial environment. In embodiments, the platform is configured to provide self-organization of data pools based on at least one of the utilization metrics and yield metrics. In embodiments, the platform includes a self-organized swarm of industrial data collectors. In embodiments, the local data collection system includes a wearable haptic user interface for an industrial sensor data collector with at least one of vibration, heat, electrical, and sound outputs.

In embodiments, multiple inputs of the crosspoint switch include a third input connected to the second sensor and a fourth input connected to the second sensor. The first sensor signal is from a single-axis sensor at an unchanging location associated with the first machine. In embodiments, the second sensor is a three-axis sensor. In embodiments, the local data collection system is configured to record gap-free digital waveform data simultaneously from at least the first input, the second input, the third input, and the fourth input. In embodiments, the platform is configured to determine a change in relative phase based on the simultaneously recorded gap-free digital waveform data. In embodiments, the second sensor is configured to be movable to a plurality of positions associated with the first machine while obtaining the simultaneously recorded gap-free digital waveform data. In embodiments, multiple outputs of the crosspoint switch include a third output and fourth output. The second, third, and fourth outputs are assigned together to a sequence of tri-axial sensors each located at different positions associated with the machine. In embodiments, the platform is configured to determine an operating deflection shape based on the change in relative phase and the simultaneously recorded gap-free digital waveform data.

In embodiments, the unchanging location is a position associated with the rotating shaft of the first machine. In embodiments, tri-axial sensors in the sequence of the tri-axial sensors are each located at different positions on the first machine but are each associated with different bearings in the machine. In embodiments, tri-axial sensors in the sequence of the tri-axial sensors are each located at similar positions associated with similar bearings but are each associated with different machines. In embodiments, the local data collection system is configured to obtain the simultaneously recorded gap-free digital waveform data from the first machine while the first machine and a second machine are both in operation. In embodiments, the local data collection system is configured to characterize a contribution from the first machine and the second machine in the simultaneously recorded gap-free digital waveform data from the first machine. In embodiments, the simultaneously recorded gap-free digital waveform data has a duration that is in excess of one minute.

In embodiments, a method of monitoring a machine having at least one shaft supported by a set of bearings includes monitoring a first data channel assigned to a single-axis sensor at an unchanging location associated with the machine. The method includes monitoring second, third, and fourth data channels each assigned to an axis of a three-axis sensor. The method includes recording gap-free digital waveform data simultaneously from all of the data channels while the machine is in operation and determining a change in relative phase based on the digital waveform data.

In embodiments, the tri-axial sensor is located at a plurality of positions associated with the machine while obtaining the digital waveform. In embodiments, the second, third, and fourth channels are assigned together to a sequence of tri-axial sensors each located at different positions associated with the machine. In embodiments, the data is received from all of the sensors simultaneously. In embodiments, the method includes determining an operating deflection shape based on the change in relative phase information and the waveform data. In embodiments, the unchanging location is a position associated with the shaft of the machine. In embodiments, the tri-axial sensors in the sequence of the tri-axial sensors are each located at different positions and are each associated with different bearings in the machine. In embodiments, the unchanging location is a position associated with the shaft of the machine. The tri-axial sensors in the sequence of the tri-axial sensors are each located at different positions and are each associated with different bearings that support the shaft in the machine.

In embodiments, the method includes monitoring the first data channel assigned to the single-axis sensor at an unchanging location located on a second machine. The method includes monitoring the second, the third, and the fourth data channels, each assigned to the axis of a three-axis sensor that is located at the position associated with the second machine. The method also includes recording gap-free digital waveform data simultaneously from all of the data channels from the second machine while both of the machines are in operation. In embodiments, the method includes characterizing the contribution from each of the machines in the gap-free digital waveform data simultaneously from the second machine.

In embodiments, a method for data collection, processing, and utilization of signals with a platform monitoring at least a first element in a first machine in an industrial environment includes obtaining, automatically with a computing environment, at least a first sensor signal and a second sensor signal with a local data collection system that monitors at least the first machine. The method includes connecting a first input of a crosspoint switch of the local data collection system to a first sensor and a second input of the crosspoint switch to a second sensor in the local data collection system. The method includes switching between a condition in which a first output of the crosspoint switch alternates between delivery of at least the first sensor signal and the second sensor signal and a condition in which there is simultaneous delivery of the first sensor signal from the first output and the second sensor signal from a second output of the crosspoint switch. The method also includes switching off unassigned outputs of the crosspoint switch into a high-impedance state.

In embodiments, the first sensor signal and the second sensor signal are continuous vibration data from the industrial environment. In embodiments, the second sensor in the local data collection system is connected to the first machine. In embodiments, the second sensor in the local data collection system is connected to a second machine in the industrial environment. In embodiments, the method includes comparing, automatically with the computing environment, relative phases of the first and second sensor signals. In embodiments, the first sensor is a single-axis sensor and the second sensor is a three-axis sensor. In embodiments, at least the first input of the crosspoint switch includes internet protocol front-end signal conditioning for improved signal-to-noise ratio.

In embodiments, the method includes continuously monitoring at least a third input of the crosspoint switch with an alarm having a pre-determined trigger condition when the third input is unassigned to any of multiple outputs on the crosspoint switch. In embodiments, the local data collection system includes multiple multiplexing units and multiple data acquisition units receiving multiple data streams from multiple machines in the industrial environment. In embodiments, the local data collection system includes distributed CPLD chips each dedicated to a data bus for logic control of the multiple multiplexing units and the multiple data acquisition units that receive the multiple data streams from the multiple machines in the industrial environment. In embodiments, the local data collection system provides high-amperage input capability using solid state relays.

In embodiments, the method includes powering down at least one of an analog sensor channel and a component board of the local data collection system. In embodiments, the local data collection system includes an external voltage reference for an A/D zero reference that is independent of the voltage of the first sensor and the second sensor. In embodiments, the local data collection system includes a phase-lock loop band-pass tracking filter that obtains slow-speed RPMs and phase information. In embodiments, the method includes digitally deriving phase using on-board timers relative to at least one trigger channel and at least one of multiple inputs on the crosspoint switch.

In embodiments, the method includes auto-scaling with a peak-detector using a separate analog-to-digital converter for peak detection. In embodiments, the method includes routing at least one trigger channel that is raw and buffered into at least one of multiple inputs on the crosspoint switch. In embodiments, the method includes increasing input oversampling rates with at least one delta-sigma analog-to-digital converter to reduce sampling rate outputs and to minimize anti-aliasing filter requirements. In embodiments, the distributed CPLD chips are each dedicated to the data bus for logic control of the multiple multiplexing units and the multiple data acquisition units and each include a high-frequency crystal clock reference divided by at least one of the distributed CPLD chips for at least one delta-sigma analog-to-digital converter to achieve lower sampling rates without digital resampling. In embodiments, the method includes obtaining long blocks of data at a single relatively high-sampling rate with the local data collection system as opposed to multiple sets of data taken at different sampling rates. In embodiments, the single relatively high-sampling rate corresponds to a maximum frequency of about forty kilohertz. In embodiments, the long blocks of data are for a duration that is in excess of one minute. In embodiments, the local data collection system includes multiple data acquisition units and each data acquisition unit has an onboard card set that stores calibration information and maintenance history of a data acquisition unit in which the onboard card set is located.

In embodiments, the method includes planning data acquisition routes based on hierarchical templates associated with at least the first element in the first machine in the industrial environment. In embodiments, the local data collection system manages data collection bands that define a specific frequency band and at least one of a group of spectral peaks, a true-peak level, a crest factor derived from a time waveform, and an overall waveform derived from a vibration envelope. In embodiments, the local data collection system includes a neural net expert system using intelligent management of the data collection bands. In embodiments, the local data collection system creates data acquisition routes based on hierarchical templates that each include the data collection bands related to machines associated with the data acquisition routes. In embodiments, at least one of the hierarchical templates is associated with multiple interconnected elements of the first machine. In embodiments, at least one of the hierarchical templates is associated with similar elements associated with at least the first machine and a second machine. In embodiments, at least one of the hierarchical templates is associated with at least the first machine being proximate in location to a second machine.

In embodiments, the method includes controlling a GUI system of the local data collection system to manage the data collection bands. The GUI system includes an expert system diagnostic tool. In embodiments, the computing environment of the platform includes cloud-based, machine pattern analysis of state information from multiple sensors to provide anticipated state information for the industrial environment. In embodiments, the computing environment of the platform provides self-organization of data pools based on at least one of the utilization metrics and yield metrics. In embodiments, the computing environment of the platform includes a self-organized swarm of industrial data collectors. In embodiments, each of multiple inputs of the crosspoint switch is individually assignable to any of multiple outputs of the crosspoint switch.

Methods and systems described herein for industrial machine sensor data streaming, collection, processing, and storage may be configured to operate and integrate with existing data collection, processing and storage systems and may include a method for capturing a plurality of streams of sensed data from sensors deployed to monitor aspects of an industrial machine associated with at least one moving part of the machine; at least one of the streams contains a plurality of frequencies of data. The method may include identifying a subset of data in at least one of the plurality of streams that corresponds to data representing at least one predefined frequency. The at least one predefined frequency is represented by a set of data collected from alternate sensors deployed to monitor aspects of the industrial machine associated with the at least one moving part of the machine. The method may further include processing the identified data with a data processing facility that processes the identified data with an algorithm configured to be applied to the set of data collected from alternate sensors. Lastly, the method may include storing the at least one of the streams of data, the identified subset of data, and a result of processing the identified data in an electronic data set.

Methods and systems described herein for industrial machine sensor data streaming, collection, processing, and storage may be configured to operate and integrate with existing data collection, processing, and storage systems and may include a method for applying data captured from sensors deployed to monitor aspects of an industrial machine associated with at least one moving part of the machine. The data is captured with predefined lines of resolution covering a predefined frequency range and is sent to a frequency matching facility that identifies a subset of data streamed from other sensors deployed to monitor aspects of the industrial machine associated with at least one moving part of the machine. The streamed data includes a plurality of lines of resolution and frequency ranges. The subset of data identified corresponds to the lines of resolution and predefined frequency range. This method may include storing the subset of data in an electronic data record in a format that corresponds to a format of the data captured with predefined lines of resolution and signaling to a data processing facility the presence of the stored subset of data. This method may, optionally, include processing the subset of data with at least one set of algorithms, models and pattern recognizers that corresponds to algorithms, models and pattern recognizers associated with processing the data captured with predefined lines of resolution covering a predefined frequency range.

Methods and systems described herein for industrial machine sensor data streaming, collection, processing, and storage may be configured to operate and integrate with existing data collection, processing and storage systems and may include a method for identifying a subset of streamed sensor data, the sensor data captured from sensors deployed to monitor aspects of an industrial machine associated with at least one moving part of the machine, the subset of streamed sensor data at predefined lines of resolution for a predefined frequency range, and establishing a first logical route for communicating electronically between a first computing facility performing the identifying and a second computing facility, wherein identified subset of the streamed sensor data is communicated exclusively over the established first logical route when communicating the subset of streamed sensor data from the first facility to the second facility. This method may further include establishing a second logical route for communicating electronically between the first computing facility and the second computing facility for at least one portion of the streamed sensor data that is not the identified subset. Additionally, this method may further include establishing a third logical route for communicating electronically between the first computing facility and the second computing facility for at least one portion of the streamed sensor data that includes the identified subset and at least one other portion of the data not represented by the identified subset.

Methods and systems described herein for industrial machine sensor data streaming, collection, processing, and storage may be configured to operate and integrate with existing data collection, processing and storage systems and may include a first data sensing and processing system that captures first data from a first set of sensors deployed to monitor aspects of an industrial machine associated with at least one moving part of the machine, the first data covering a set of lines of resolution and a frequency range. This system may include a second data sensing and processing system that captures and streams a second set of data from a second set of sensors deployed to monitor aspects of the industrial machine associated with at least one moving part of the machine, the second data covering a plurality of lines of resolution that includes the set of lines of resolution and a plurality of frequencies that includes the frequency range. The system may enable selecting a portion of the second data that corresponds to the set of lines of resolution and the frequency range of the first data, and processing the selected portion of the second data with the first data sensing and processing system.

Methods and systems described herein for industrial machine sensor data streaming, collection, processing, and storage may be configured to operate and integrate with existing data collection, processing and storage systems and may include a method for automatically processing a portion of a stream of sensed data. The sensed data is received from a first set of sensors deployed to monitor aspects of an industrial machine associated with at least one moving part of the machine. The sensed data is in response to an electronic data structure that facilitates extracting a subset of the stream of sensed data that corresponds to a set of sensed data received from a second set of sensors deployed to monitor the aspects of the industrial machine associated with the at least one moving part of the machine. The set of sensed data is constrained to a frequency range. The stream of sensed data includes a range of frequencies that exceeds the frequency range of the set of sensed data, the processing comprising executing an algorithm on a portion of the stream of sensed data that is constrained to the frequency range of the set of sensed data, the algorithm configured to process the set of sensed data.

Methods and systems described herein for industrial machine sensor data streaming, collection, processing, and storage may be configured to operate and integrate with existing data collection, processing and storage systems and may include a method for receiving first data from sensors deployed to monitor aspects of an industrial machine associated with at least one moving part of the machine. This method may further include detecting at least one of a frequency range and lines of resolution represented by the first data; receiving a stream of data from sensors deployed to monitor the aspects of the industrial machine associated with the at least one moving part of the machine. The stream of data includes: (1) a plurality of frequency ranges and a plurality of lines of resolution that exceeds the frequency range and the lines of resolution represented by the first data; (2) a set of data extracted from the stream of data that corresponds to at least one of the frequency range and the lines of resolution represented by the first data; and (3) the extracted set of data which is processed with a data processing algorithm that is configured to process data within the frequency range and within the lines of resolution of the first data.

BRIEF DESCRIPTION OF THE FIGURES

FIGS. 219-221 are diagrammatic views depicting a burner design contemplated for use with a smart cooking system in accordance with yet another example of the present teachings.

FIG. 222 and FIG. 224 are diagrammatic views depicting a burner design contemplated for use with a smart cooking system in accordance with an additional example of the present teachings.

FIG. 223 is a cross-sectional view of a burner design contemplated for use with a smart cooking system.

FIG. 225 is a flowchart depicting a method associated with a smart kitchen including a smart cooktop and an exhaust fan that may be automatically turned on as water in a pot may begin to boil in accordance with the present teachings.

FIG. 226 is an embodiment method and system related to renewable energy sources for hydrogen production, storage, distribution and use are depicted in accordance with the present teachings in accordance with the present teachings.

FIG. 227 is an alternate embodiment method and system related to renewable energy sources in accordance with the present teachings.

FIG. 228 is an alternate embodiment method and system related to renewable energy sources in accordance with the present teachings.

FIG. 229 depicts environments and manufacturing uses of hydrogen production. storage, distribution and use systems.

FIG. 230 is a diagrammatic view that depicts embodiments of a data monitoring device in accordance with the present disclosure.

DETAILED DESCRIPTION

Figure 1:
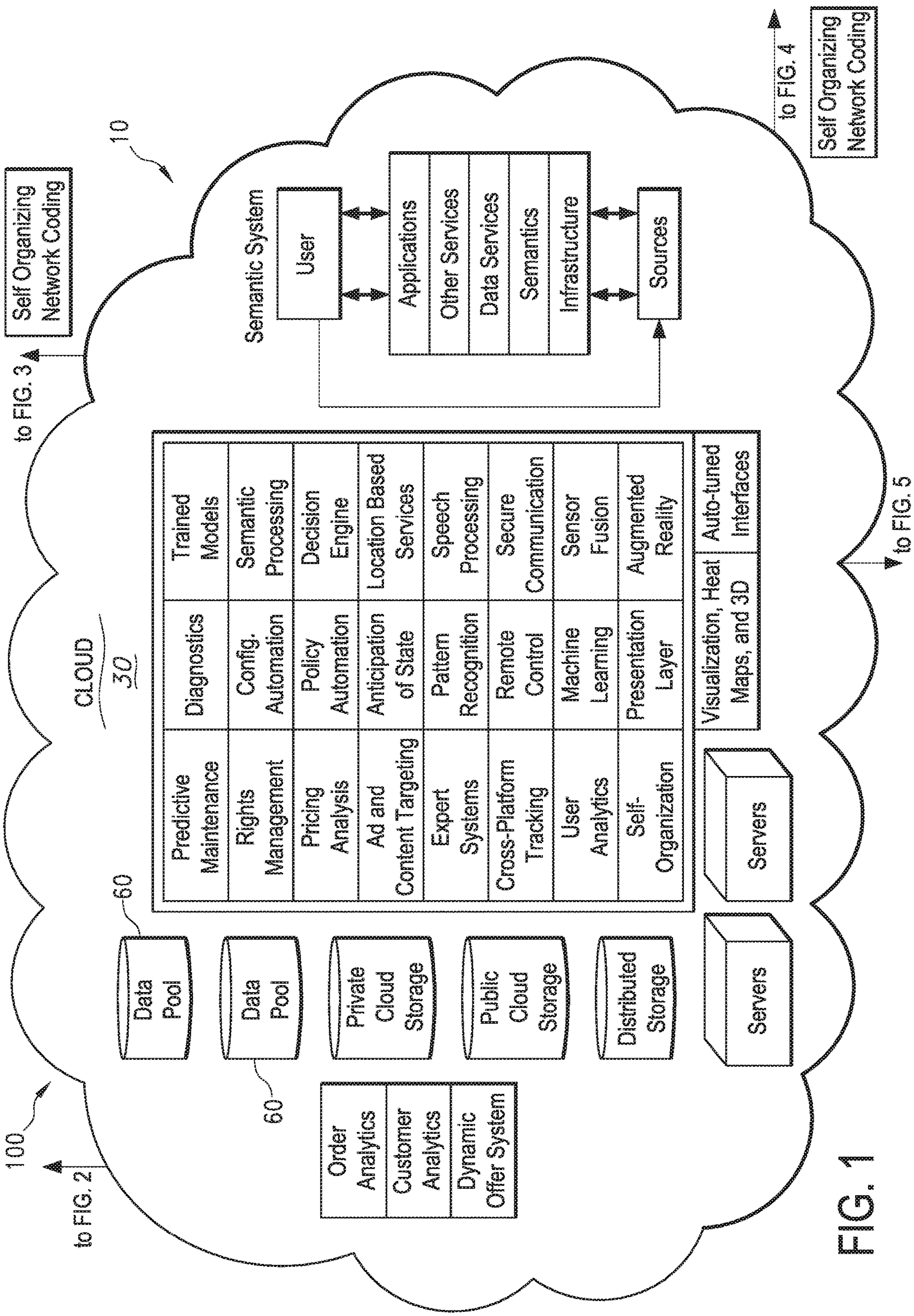
FIG. 1 through FIG. 5 are diagrammatic views that each depicts portions of an overall view of an industrial Internet of Things (IoT) data collection, monitoring and control system in accordance with the present disclosure.

Detailed embodiments of the present disclosure are disclosed herein; however, it is to be understood that the disclosed embodiments are merely exemplary of the disclosure, which may be embodied in various forms. Therefore, specific structural and functional details disclosed herein are not to be interpreted as limiting, but merely as a basis for the claims and as a representative basis for teaching one skilled in the art to variously employ the present disclosure in virtually any appropriately detailed structure.

Methods and systems described herein for industrial machine sensor data streaming, collection, processing, and storage may be configured to operate with existing data collection, processing, and storage systems while preserving access to existing format/frequency range/resolution compatible data. While the industrial machine sensor data streaming facilities described herein may collect a greater volume of data (e.g., longer duration of data collection) from sensors at a wider range of frequencies and with greater resolution than existing data collection systems, methods and systems may be employed to provide access to data from the stream of data that represents one or more ranges of frequency and/or one or more lines of resolution that are purposely compatible with existing systems. Further, a portion of the streamed data may be identified, extracted, stored, and/or forwarded to existing data processing systems to facilitate operation of existing data processing systems that substantively matches operation of existing data processing systems using existing collection-based data. In this way, a newly deployed system for sensing aspects of industrial machines, such as aspects of moving parts of industrial machines, may facilitate continued use of existing sensed data processing facilities, algorithms, models, pattern recognizers, user interfaces, and the like.

Through identification of existing frequency ranges, formats, and/or resolution, such as by accessing a data structure that defines these aspects of existing data, higher resolution streamed data may be configured to represent a specific frequency, frequency range, format, and/or resolution. This configured streamed data can be stored in a data structure that is compatible with existing sensed data structures so that existing processing systems and facilities can access and process the data substantially as if it were the existing data. One approach to adapting streamed data for compatibility with existing sensed data may include aligning the streamed data with existing data so that portions of the streamed data that align with the existing data can be extracted, stored, and made available for processing with existing data processing methods. Alternatively, data processing methods may be configured to process portions of the streamed data that correspond, such as through alignment, to the existing data, with methods that implement functions substantially similar to the methods used to process existing data, such as methods that process data that contain a particular frequency range or a particular resolution and the like.

Methods used to process existing data may be associated with certain characteristics of sensed data, such as certain frequency ranges, sources of data, and the like. As an example, methods for processing bearing sensing information for a moving part of an industrial machine may be capable of processing data from bearing sensors that fall into a particular frequency range. This method can thusly be at least partially identifiable by these characteristics of the data being processed. Therefore, given a set of conditions, such as moving device being sensed, industrial machine type, frequency of data being sensed, and the like, a data processing system may select an appropriate method. Also, given such a set of conditions, an industrial machine data sensing and processing facility may configure elements, such as data filters, routers, processors, and the like, to handle data meeting the conditions.

Figure 2:
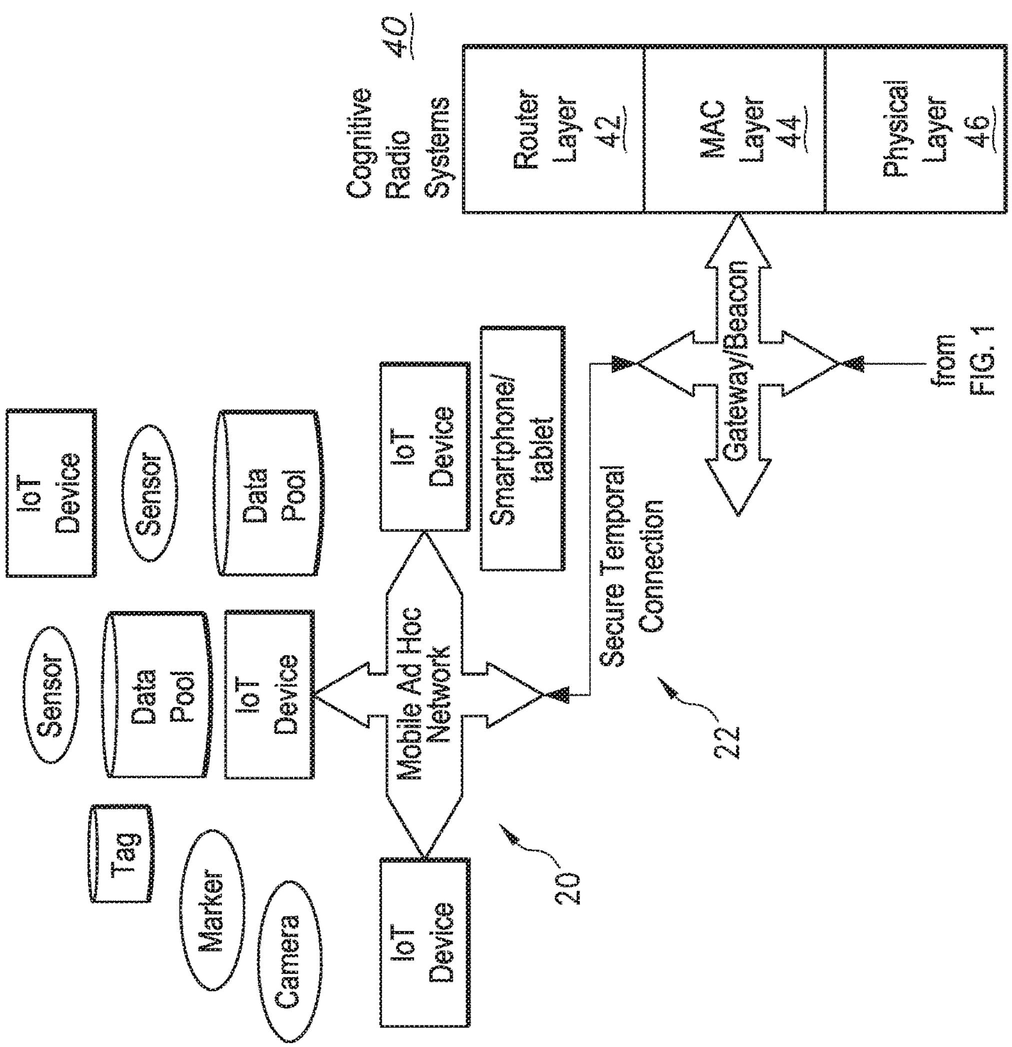

FIGS. 1 through 5 depict portions of an overall view of an industrial Internet of Things (IoT) data collection, monitoring and control system 10. FIG. 2 depicts a mobile ad hoc network ("MANET") 20, which may form a secure, temporal network connection 22 (sometimes connected and sometimes isolated), with a cloud 30 or other remote networking system, so that network functions may occur over the MANET 20 within the environment, without the need for external networks, but at other times information can be sent to and from a central location. This allows the industrial environment to use the benefits of networking and control technologies, while also providing security, such as preventing cyber-attacks. The MANET 20 may use cognitive radio technologies 40, including those that form up an equivalent to the IP protocol, such as router 42, MAC 44, and physical layer technologies 46. In certain embodiments, the system depicted in FIGS. 1 through 5 provides network-sensitive or network-aware transport of data over the network to and from a data collection device or a heavy industrial machine.

Figure 3:
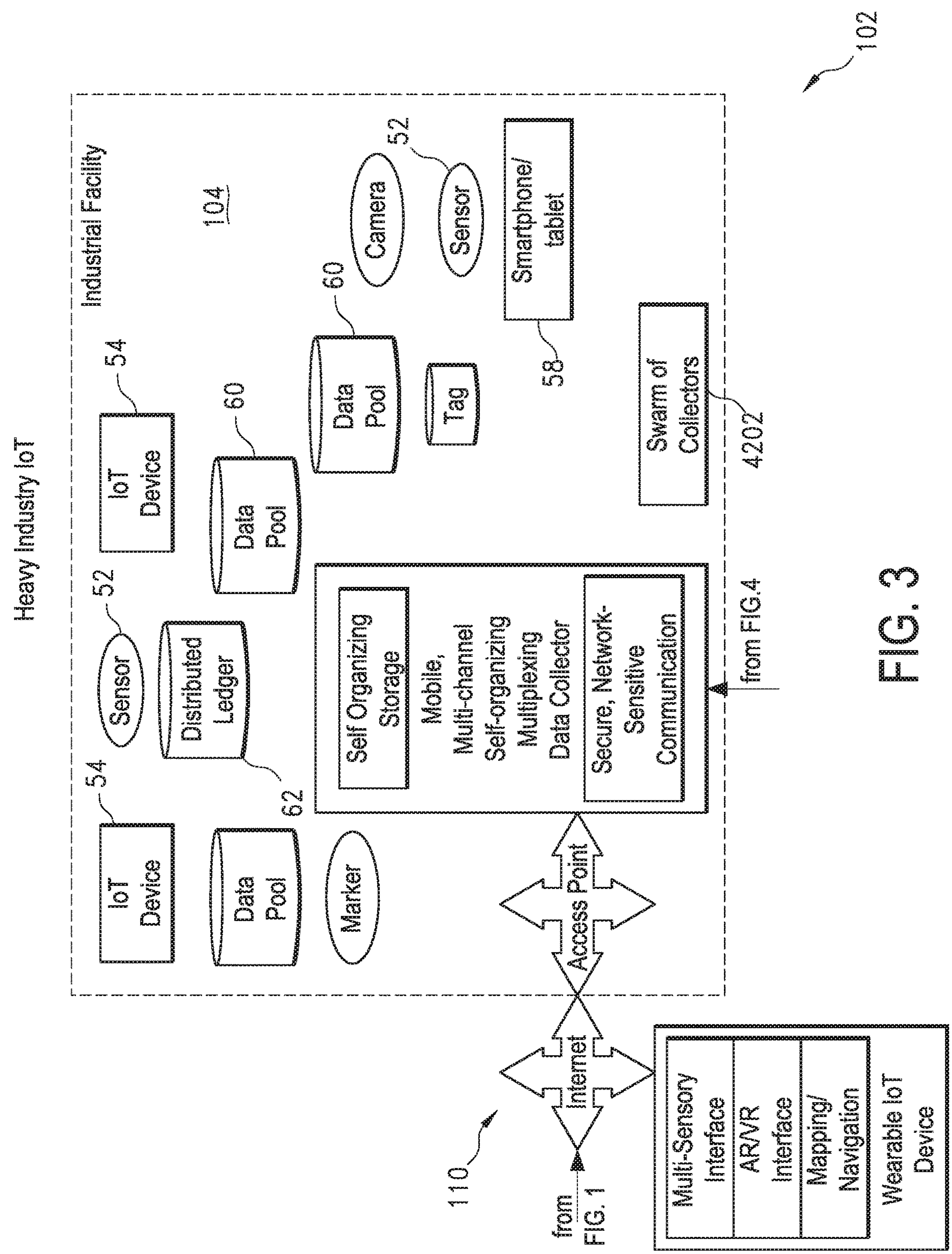
Figure 4:
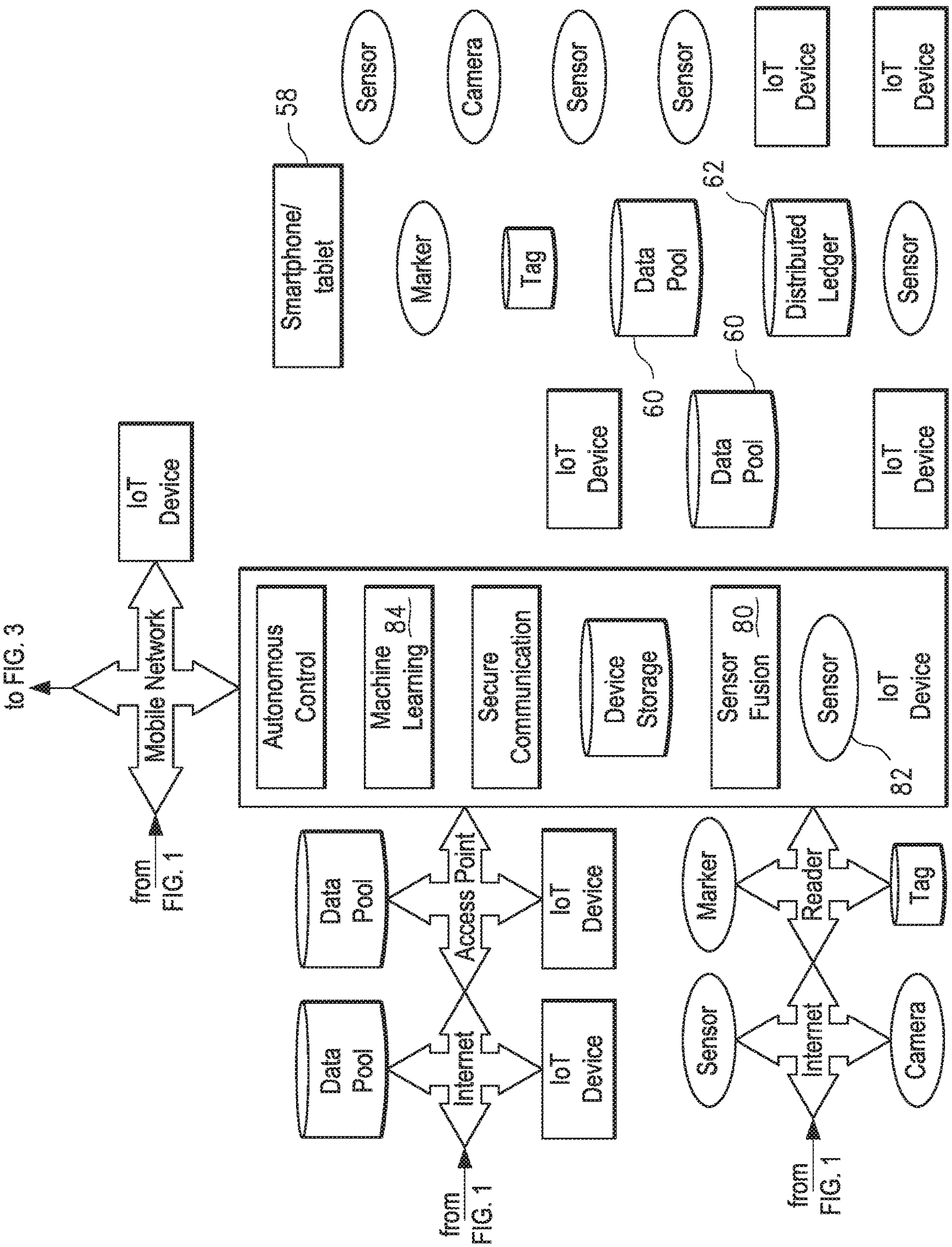

FIGS. 3-4 depict intelligent data collection technologies deployed locally, at the edge of an IoT deployment, where heavy industrial machines are located. This includes various sensors 52, IoT devices 54, data storage capabilities (e.g., data pools 60, or distributed ledger 62) (including intelligent, self-organizing storage), sensor fusion (including self-organizing sensor fusion), and the like. Interfaces for data collection, including multi-sensory interfaces, tablets, smartphones 58, and the like are shown. FIG. 3 also shows data pools 60 that may collect data published by machines or sensors that detect conditions of machines, such as for later consumption by local or remote intelligence. A distributed ledger system 62 may distribute storage across the local storage of various elements of the environment, or more broadly throughout the system. FIG. 4 also shows on-device sensor fusion 80, such as for storing on a device data from multiple analog sensors 82, which may be analyzed locally or in the cloud, such as by machine learning 84, including by training a machine based on initial models created by humans that are augmented by providing feedback (such as based on measures of success) when operating the methods and systems disclosed herein.

FIG. 1 depicts a server based portion of an industrial IoT system that may be deployed in the cloud or on an enterprise owner's or operator's premises. The server portion includes network coding (including self-organizing network coding and/or automated configuration) that may configure a network coding model based on feedback measures, network conditions, or the like, for highly efficient transport of large amounts of data across the network to and from data collection systems and the cloud. Network coding may provide a wide range of capabilities for intelligence, analytics, remote control, remote operation, remote optimization, various storage configurations and the like, as depicted in FIG. 1. The various storage configurations may include distributed ledger storage for supporting transactional data or other elements of the system.

Figure 5:
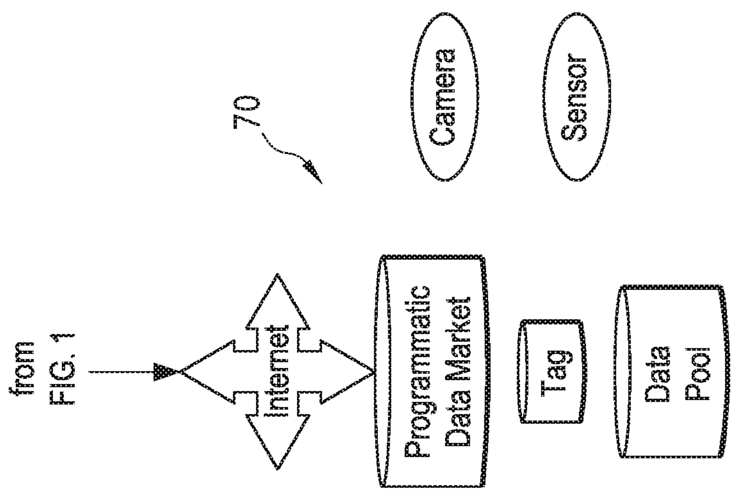

FIG. 5 depicts a programmatic data marketplace 70, which may be a self-organizing marketplace, such as for making available data that is collected in industrial environments, such as from data collectors, data pools, distributed ledgers, and other elements disclosed herein. Additional detail on the various components and sub-components of FIGS. 1 through 5 is provided throughout this disclosure.

Figure 6:
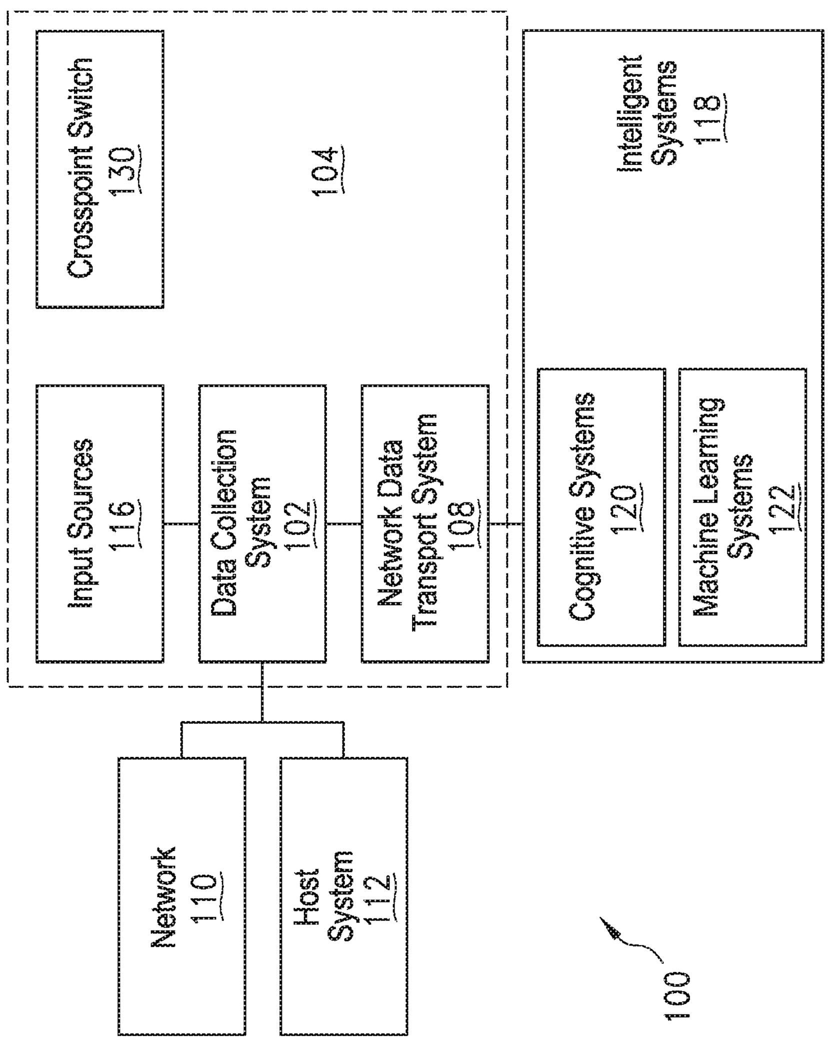
FIG. 6 is a diagrammatic view of a platform including a local data collection system disposed in an industrial environment for collecting data from or about the elements of the environment, such as machines, components, systems, subsystems, ambient conditions, states, workflows, processes, and other elements in accordance with the present disclosure.

With reference to FIG. 6, an embodiment of platform 100 may include a local data collection system 102, which may be disposed in an environment 104, such as an industrial environment similar to that shown in FIG. 3, for collecting data from or about the elements of the environment, such as machines, components, systems, sub-systems, ambient conditions, states, workflows, processes, and other elements. The platform 100 may connect to or include portions of the industrial IoT data collection, monitoring and control system 10 depicted in FIGS. 1-5. The platform 100 may include a network data transport system 108, such as for transporting data to and from the local data collection system 102 over a network 110, such as to a host processing system 112, such as one that is disposed in a cloud computing environment or on the premises of an enterprise, or that consists of distributed components that interact with each other to process data collected by the local data collection system 102. The host processing system 112, referred to for convenience in some cases as the host system 112, may include various systems, components, methods, processes, facilities, and the like for enabling automated, or automation-assisted processing of the data, such as for monitoring one or more environments 104 or networks 110 or for remotely controlling one or more elements in a local environment 104 or in a network 110. The platform 100 may include one or more local autonomous systems, such as for enabling autonomous behavior, such as reflecting artificial, or machine-based intelligence or such as enabling automated action based on the applications of a set of rules or models upon input data from the local data collection system 102 or from one or more input sources 116, which may comprise information feeds and inputs from a wide array of sources, including those in the local environment 104, in a network 110, in the host system 112, or in one or more external systems, databases, or the like. The platform 100 may include one or more intelligent systems 118, which may be disposed in, integrated with, or acting as inputs to one or more components of the platform 100. Details of these and other components of the platform 100 are provided throughout this disclosure.

Intelligent systems 118 may include cognitive systems 120, such as enabling a degree of cognitive behavior as a result of the coordination of processing elements, such as mesh, peer-to-peer, ring, serial, and other architectures, where one or more node elements is coordinated with other node elements to provide collective, coordinated behavior to assist in processing, communication, data collection, or the like. The MANET 20 depicted in FIG. 2 may also use cognitive radio technologies, including those that form up an equivalent to the IP protocol, such as router 42, MAC 44, and physical layer technologies 46. In one example, the cognitive system technology stack can include examples disclosed in U.S. Pat. No. 8,060,017 to Schlicht et al., issued 15 Nov. 2011 and hereby incorporated by reference as if fully set forth herein.

Intelligent systems may include machine learning systems 122, such as for learning on one or more data sets. The one or more data sets may include information collected using local data collection systems 102 or other information from input sources 116, such as to recognize states, objects, events, patterns, conditions, or the like that may, in turn, be used for processing by the host system 112 as inputs to components of the platform 100 and portions of the industrial IoT data collection, monitoring and control system 10, or the like. Learning may be human-supervised or fully-automated, such as using one or more input sources 116 to provide a data set, along with information about the item to be learned. Machine learning may use one or more models, rules, semantic understandings, workflows, or other structured or semi-structured understanding of the world, such as for automated optimization of control of a system or process based on feedback or feed forward to an operating model for the system or process. One such machine learning technique for semantic and contextual understandings, workflows, or other structured or semi-structured understandings is disclosed in U.S. Pat. No. 8,200,775 to Moore, issued 12 Jun. 2012, and hereby incorporated by reference as if fully set forth herein. Machine learning may be used to improve the foregoing, such as by adjusting one or more weights, structures, rules, or the like (such as changing a function within a model) based on feedback (such as regarding the success of a model in a given situation) or based on iteration (such as in a recursive process). Where sufficient understanding of the underlying structure or behavior of a system is not known, insufficient data is not available, or in other cases where preferred for various reasons, machine learning may also be undertaken in the absence of an underlying model; that is, input sources may be weighted, structured, or the like within a machine learning facility without regard to any a priori understanding of structure, and outcomes (such as those based on measures of success at accomplishing various desired objectives) can be serially fed to the machine learning system to allow it to learn how to achieve the targeted objectives. For example, the system may learn to recognize faults, to recognize patterns, to develop models or functions, to develop rules, to optimize performance, to minimize failure rates, to optimize profits, to optimize resource utilization, to optimize flow (such as flow of traffic), or to optimize many other parameters that may be relevant to successful outcomes (such as outcomes in a wide range of environments). Machine learning may use genetic programming techniques, such as promoting or demoting one or more input sources, structures, data types, objects, weights, nodes, links, or other factors based on feedback (such that successful elements emerge over a series of generations). For example, alternative available sensor inputs for a data collection system 102 may be arranged in alternative configurations and permutations, such that the system may, using generic programming techniques over a series of data collection events, determine what permutations provide successful outcomes based on various conditions (such as conditions of components of the platform 100, conditions of the network 110, conditions of a data collection system 102, conditions of an environment 104), or the like. In embodiments, local machine learning may turn on or off one or more sensors in a multi-sensor data collector 102 in permutations over time, while tracking success outcomes such as contributing to success in predicting a failure, contributing to a performance indicator (such as efficiency, effectiveness, return on investment, yield, or the like), contributing to optimization of one or more parameters, identification of a pattern (such as relating to a threat, a failure mode, a success mode, or the like) or the like. For example, a system may learn what sets of sensors should be turned on or off under given conditions to achieve the highest value utilization of a data collector 102. In embodiments, similar techniques may be used to handle optimization of transport of data in the platform 100 (such as in the network 110) by using generic programming or other machine learning techniques to learn to configure network elements (such as configuring network transport paths, configuring network coding types and architectures, configuring network security elements), and the like.

In embodiments, the local data collection system 102 may include a high-performance, multi-sensor data collector having a number of novel features for collection and processing of analog and other sensor data. In embodiments, a local data collection system 102 may be deployed to the industrial facilities depicted in FIG. 3. A local data collection system 102 may also be deployed monitor other machines such as the machine 2300 in FIG. 9 and FIG. 10, the machines 2400, 2600, 2800, 2950, 3000 depicted in FIG. 12, and the machines 3202, 3204 depicted in FIG. 13. The data collection system 102 may have on-board intelligent systems 118 (such as for learning to optimize the configuration and operation of the data collector, such as configuring permutations and combinations of sensors based on contexts and conditions). In one example, the data collection system 102 includes a crosspoint switch 130 or other analog switch. Automated, intelligent configuration of the local data collection system 102 may be based on a variety of types of information, such as information from various input sources, including those based on available power, power requirements of sensors, the value of the data collected (such as based on feedback information from other elements of the platform 100), the relative value of information (such as values based on the availability of other sources of the same or similar information), power availability (such as for powering sensors), network conditions, ambient conditions, operating states, operating contexts, operating events, and many others.

Figure 7:
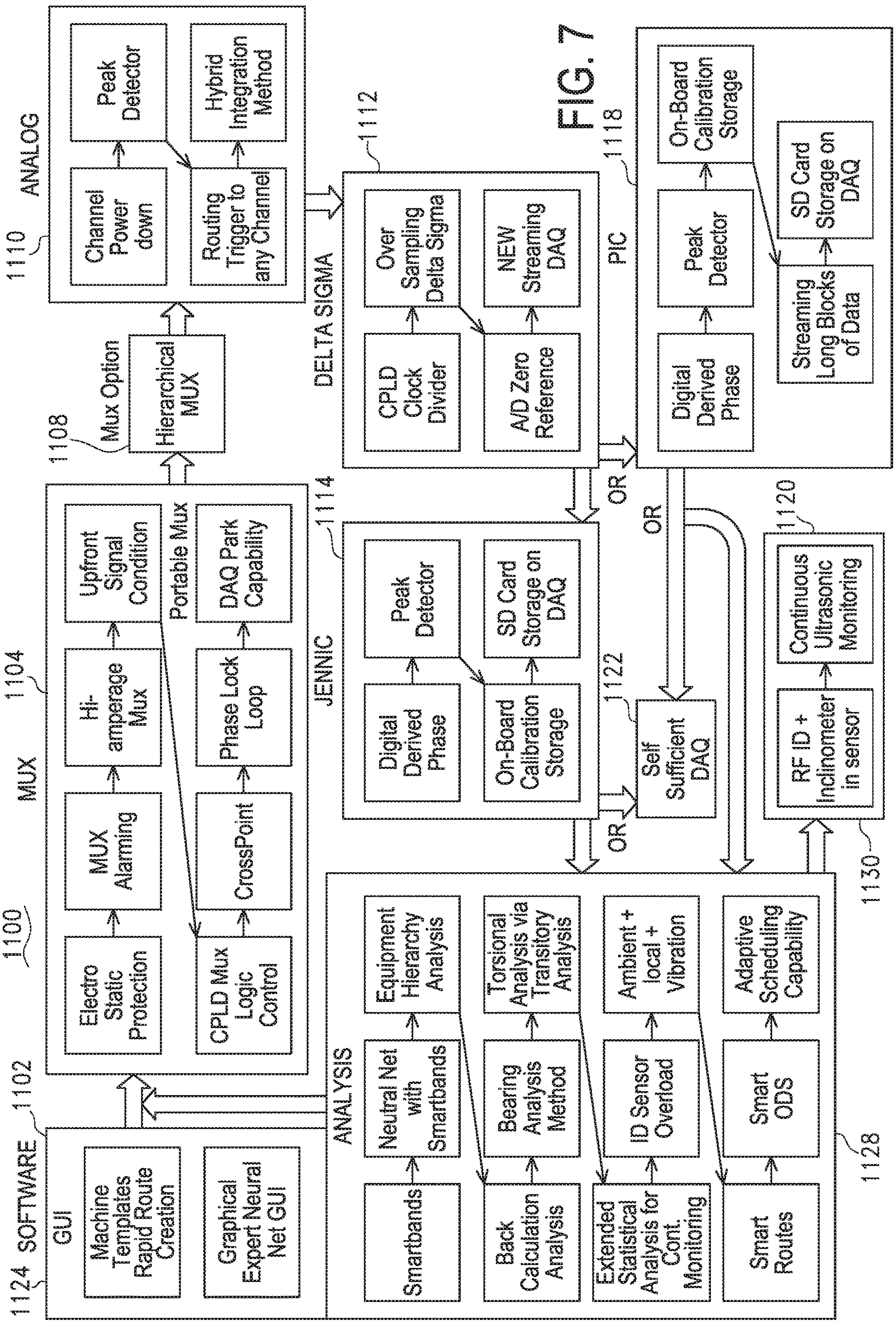
FIG. 7 is a diagrammatic view that depicts elements of an industrial data collection system for collecting analog sensor data in an industrial environment in accordance with the present disclosure.

FIG. 7 shows elements and sub-components of a data collection and analysis system 1100 for sensor data (such as analog sensor data) collected in industrial environments. As depicted in FIG. 7, embodiments of the methods and systems disclosed herein may include hardware that has several different modules starting with the multiplexer ("MUX") main board 1104. In embodiments, there may be a MUX option board 1108. The MUX 114 main board is where the sensors connect to the system. These connections are on top to enable ease of installation. Then there are numerous settings on the underside of this board as well as on the Mux option board 1108, which attaches to the MUX main board 1104 via two headers one at either end of the board. In embodiments, the Mux option board has the male headers, which mesh together with the female header on the main Mux board. This enables them to be stacked on top of each other taking up less real estate.

In embodiments, the main Mux board and/or the MUX option board then connects to the mother (e.g., with 4 simultaneous channels) and daughter (e.g., with 4 additional channels for 8 total channels) analog boards 1110 via cables where some of the signal conditioning (such as hardware integration) occurs. The signals then move from the analog boards 1110 to an anti-aliasing board (not shown) where some of the potential aliasing is removed. The rest of the aliasing removal is done on the delta sigma board 1112. The delta sigma board 1112 provides more aliasing protection along with other conditioning and digitizing of the signal. Next, the data moves to the Jennic™ board 1114 for more digitizing as well as communication to a computer via USB or Ethernet. In embodiments, the Jennic™ board 1114 may be replaced with a pic board 1118 for more advanced and efficient data collection as well as communication. Once the data moves to the computer software 1102, the computer software 1102 can manipulate the data to show trending, spectra, waveform, statistics, and analytics.

In embodiments, the system is meant to take in all types of data from volts to 4-20 mA signals. In embodiments, open formats of data storage and communication may be used. In some instances, certain portions of the system may be proprietary especially some of research and data associated with the analytics and reporting. In embodiments, smart band analysis is a way to break data down into easily analyzed parts that can be combined with other smart bands to make new more simplified yet sophisticated analytics. In embodiments, this unique information is taken and graphics are used to depict the conditions because picture depictions are more helpful to the user. In embodiments, complicated programs and user interfaces are simplified so that any user can manipulate the data like an expert.

In embodiments, the system in essence, works in a big loop. The system starts in software with a general user interface ("GUI") 1124. In embodiments, rapid route creation may take advantage of hierarchical templates. In embodiments, a GUI is created so any general user can populate the information itself with simple templates. Once the templates are created the user can copy and paste whatever the user needs. In addition, users can develop their own templates for future ease of use and to institutionalize the knowledge. When the user has entered all of the user's information and connected all of the user's sensors, the user can then start the system acquiring data.

Embodiments of the methods and systems disclosed herein may include unique electrostatic protection for trigger and vibration inputs. In many critical industrial environments where large electrostatic forces, which can harm electrical equipment, may build up, for example rotating machinery or low-speed balancing using large belts, proper transducer and trigger input protection is required. In embodiments, a low-cost but efficient method is described for such protection without the need for external supplemental devices.

Typically, vibration data collectors are not designed to handle large input voltages due to the expense and the fact that, more often than not, it is not needed. A need exists for these data collectors to acquire many varied types of RPM data as technology improves and monitoring costs plummet. In embodiments, a method is using the already established OptoMOS™ technology which permits the switching up front of high voltage signals rather than using more conventional reed-relay approaches. Many historic concerns regarding non-linear zero crossing or other non-linear solid-state behaviors have been eliminated with regard to the passing through of weakly buffered analog signals. In addition, in embodiments, printed circuit board routing topologies place all of the individual channel input circuitry as close to the input connector as possible. In embodiments, a unique electrostatic protection for trigger and vibration inputs may be placed upfront on the Mux and DAQ hardware in order to dissipate the built up electric charge as the signal passed from the sensor to the hardware. In embodiments, the Mux and analog board may support high-amperage input using a design topology comprising wider traces and solid state relays for upfront circuitry.

In some systems multiplexers are afterthoughts and the quality of the signal coming from the multiplexer is not considered. As a result of a poor quality multiplexer, the quality of the signal can drop as much as 30 dB or more. Thus, substantial signal quality may be lost using a 24-bit DAQ that has a signal to noise ratio of 110 dB and if the signal to noise ratio drops to 80 dB in the Mux, it may not be much better than a 16-bit system from 20 years ago. In embodiments of this system, an important part at the front of the Mux is upfront signal conditioning on Mux for improved signal-to-noise ratio. Embodiments may perform signal conditioning (such as range/gain control, integration, filtering, etc.) on vibration as well as other signal inputs up front before Mux switching to achieve the highest signal-to-noise ratio.

In embodiments, in addition to providing a better signal, the multiplexer may provide a continuous monitor alarming feature. Truly continuous systems monitor every sensor all the time but tend to be expensive. Typical multiplexer systems only monitor a set number of channels at one time and switch from bank to bank of a larger set of sensors. As a result, the sensors not being currently collected are not being monitored; if a level increases the user may never know. In embodiments, a multiplexer may have a continuous monitor alarming feature by placing circuitry on the multiplexer that can measure input channel levels against known alarm conditions even when the data acquisition ("DAQ") is not monitoring the input. In embodiments, continuous monitoring Mux bypass offers a mechanism whereby channels not being currently sampled by the Mux system may be continuously monitored for significant alarm conditions via a number of trigger conditions using filtered peak-hold circuits or functionally similar that are in turn passed on to the monitoring system in an expedient manner using hardware interrupts or other means. This, in essence, makes the system continuously monitoring, although without the ability to instantly capture data on the problem like a true continuous system. In embodiments, coupling this capability to alarm with adaptive scheduling techniques for continuous monitoring and the continuous monitoring system's software adapting and adjusting the data collection sequence based on statistics, analytics, data alarms and dynamic analysis may allow the system to quickly collect dynamic spectral data on the alarming sensor very soon after the alarm sounds.

Another restriction of typical multiplexers is that they may have a limited number of channels. In embodiments, use of distributed complex programmable logic device ("CPLD") chips with dedicated bus for logic control of multiple Mux and data acquisition sections enables a CPLD to control multiple mux and DAQs so that there is no limit to the number of channels a system can handle Interfacing to multiple types of predictive maintenance and vibration transducers requires a great deal of switching. This includes AC/DC coupling, 4-20 interfacing, integrated electronic piezoelectric transducer, channel power-down (for conserving op-amp power), single-ended or differential grounding options, and so on. Also required is the control of digital pots for range and gain control, switches for hardware integration, AA filtering and triggering. This logic can be performed by a series of CPLD chips strategically located for the tasks they control. A single giant CPLD requires long circuit routes with a great deal of density at the single giant CPLD. In embodiments, distributed CPLDs not only address these concerns but offer a great deal of flexibility. A bus is created where each CPLD that has a fixed assignment has its own unique device address. In embodiments, multiplexers and DAQs can stack together offering additional input and output channels to the system. For multiple boards (e.g., for multiple Mux boards), jumpers are provided for setting multiple addresses. In another example, three bits permit up to 8 boards that are jumper configurable. In embodiments, a bus protocol is defined such that each CPLD on the bus can either be addressed individually or as a group.

Typical multiplexers may be limited to collecting only sensors in the same bank. For detailed analysis, this may be limiting as there is tremendous value in being able to simultaneously review data from sensors on the same machine. Current systems using conventional fixed bank multiplexers can only compare a limited number of channels (based on the number of channels per bank) that were assigned to a particular group at the time of installation. The only way to provide some flexibility is to either overlap channels or incorporate lots of redundancy in the system both of which can add considerable expense (in some cases an exponential increase in cost versus flexibility). The simplest Mux design selects one of many inputs and routes it into a single output line. A banked design would consist of a group of these simple building blocks, each handling a fixed group of inputs and routing to its respective output. Typically, the inputs are not overlapping so that the input of one Mux grouping cannot be routed into another. Unlike conventional Mux chips which typically switch a fixed group or banks of a fixed selection of channels into a single output (e.g., in groups of 2, 4, 8, etc.), a cross point Mux allows the user to assign any input to any output. Previously, crosspoint multiplexers were used for specialized purposes such as RGB digital video applications and were as a practical matter too noisy for analog applications such as vibration analysis; however more recent advances in the technology now make it feasible. Another advantage of the crosspoint Mux is the ability to disable outputs by putting them into a high impedance state. This is ideal for an output bus so that multiple Mux cards may be stacked, and their output buses joined together without the need for bus switches.

In embodiments, this may be addressed by use of an analog crosspoint switch for collecting variable groups of vibration input channels and providing a matrix circuit so the system may access any set of eight channels from the total number of input sensors.

In embodiments, the ability to control multiple multiplexers with use of distributed CPLD chips with dedicated bus for logic control of multiple Mux and data acquisition sections is enhanced with a hierarchical multiplexer which allows for multiple DAQ to collect data from multiple multiplexers. A hierarchical Mux may allow modularly output of more channels, such as 16, 24 or more to multiple of eight channel card sets. In embodiments, this allows for faster data collection as well as more channels of simultaneous data collection for more complex analysis. In embodiments, the Mux may be configured slightly to make it portable and use data acquisition parking features, which turns SV3X DAQ into a protected system embodiment.

In embodiments, once the signals leave the multiplexer and hierarchical Mux they move to the analog board where there are other enhancements. In embodiments, power saving techniques may be used such as: power-down of analog channels when not in use; powering down of component boards; power-down of analog signal processing op-amps for non-selected channels; powering down channels on the mother and the daughter analog boards. The ability to power down component boards and other hardware by the low-level firmware for the DAQ system makes high-level application control with respect to power-saving capabilities relatively easy. Explicit control of the hardware is always possible but not required by default. In embodiments, this power saving benefit may be of value to a protected system, especially if it is battery operated or solar powered.

In embodiments, in order to maximize the signal to noise ratio and provide the best data, a peak-detector for auto-scaling routed into a separate A/D will provide the system the highest peak in each set of data so it can rapidly scale the data to that peak. For vibration analysis purposes, the built-in A/D convertors in many microprocessors may be inadequate with regards to number of bits, number of channels or sampling frequency versus not slowing the microprocessor down significantly. Despite these limitations, it is useful to use them for purposes of auto-scaling. In embodiments, a separate A/D may be used that has reduced functionality and is cheaper. For each channel of input, after the signal is buffered (usually with the appropriate coupling: AC or DC) but before it is signal conditioned, the signal is fed directly into the microprocessor or low-cost AID. Unlike the conditioned signal for which range, gain and filter switches are thrown, no switches are varied. This permits the simultaneous sampling of the auto-scaling data while the input data is signal conditioned, fed into a more robust external AID, and directed into on-board memory using direct memory access (DMA) methods where memory is accessed without requiring a CPU. This significantly simplifies the auto-scaling process by not having to throw switches and then allow for settling time, which greatly slows down the auto-scaling process. Furthermore, the data may be collected simultaneously, which assures the best signal-to-noise ratio. The reduced number of bits and other features is usually more than adequate for auto-scaling purposes. In embodiments, improved integration using both analog and digital methods create an innovative hybrid integration which also improves or maintains the highest possible signal to noise ratio.

In embodiments, a section of the analog board may allow routing of a trigger channel, either raw or buffered, into other analog channels. This may allow a user to route the trigger to any of the channels for analysis and trouble shooting. Systems may have trigger channels for the purposes of determining relative phase between various input data sets or for acquiring significant data without the needless repetition of unwanted input. In embodiments, digitally controlled relays may be used to switch either the raw or buffered trigger signal into one of the input channels. It may be desirable to examine the quality of the triggering pulse because it may be corrupted for a variety of reasons including inadequate placement of the trigger sensor, wiring issues, faulty setup issues such as a dirty piece of reflective tape if using an optical sensor, and so on. The ability to look at either the raw or buffered signal may offer an excellent diagnostic or debugging vehicle. It also can offer some improved phase analysis capability by making use of the recorded data signal for various signal processing techniques such as variable speed filtering algorithms.

In embodiments, once the signals leave the analog board, the signals move into the delta-sigma board where precise voltage reference for AID zero reference offers more accurate direct current sensor data. The delta sigma's high speeds also provide for using higher input oversampling for delta-sigma A/D for lower sampling rate outputs to minimize antialiasing filter requirements. Lower oversampling rates can be used for higher sampling rates. For example, a $3^{rd}$ order AA filter set for the lowest sampling requirement for 256 Hz (Fmax of 100 Hz) is then adequate for Fmax ranges of 200 and 500 Hz. Another higher-cutoff AA filter can then be used for Fmax ranges from 1 kHz and higher (with a secondary filter kicking in at 2.56× the highest sampling rate of 128 kHz). In embodiments, a CPLD may be used as a clock-divider for a delta-sigma A/D to achieve lower sampling rates without the need for digital resampling. In embodiments, a high-frequency crystal reference can be divided down to lower frequencies by employing a CPLD as a programmable clock divider. The accuracy of the divided down lower frequencies is even more accurate than the original source relative to their longer time periods. This also minimizes or removes the need for resampling processing by the delta-sigma A/D.

In embodiments, the data then moves from the delta-sigma board to the Jennic™ board where phase relative to input and trigger channels using on-board timers may be digitally derived. In embodiments, the Jennic™ board also has the ability to store calibration data and system maintenance repair history data in an on-board card set. In embodiments, the Jennic™ board will enable acquiring long blocks of data at high-sampling rate as opposed to multiple sets of data taken at different sampling rates so it can stream data and acquire long blocks of data for advanced analysis in the future.

In embodiments, after the signal moves through the Jennic™ board it may then be transmitted to the computer. In embodiments, the computer software will be used to add intelligence to the system starting with an expert system GUI. The GUI will offer a graphical expert system with simplified user interface for defining smart bands and diagnoses which facilitate anyone to develop complex analytics. In embodiments, this user interface may revolve around smart bands, which are a simplified approach to complex yet flexible analytics for the general user. In embodiments, the smart bands may pair with a self-learning neural network for an even more advanced analytical approach. In embodiments, this system may use the machine's hierarchy for additional analytical insight. One critical part of predictive maintenance is the ability to learn from known information during repairs or inspections. In embodiments, graphical approaches for back calculations may improve the smart bands and correlations based on a known fault or problem.

In embodiments, there is a smart route which adapts which sensors it collects simultaneously in order to gain additional correlative intelligence. In embodiments, smart operational data store ("ODS") allows the system to elect to gather data to perform operational deflection shape analysis in order to further examine the machinery condition. In embodiments, adaptive scheduling techniques allow the system to change the scheduled data collected for full spectral analysis across a number (e.g., eight), of correlative channels. In embodiments, the system may provide data to enable extended statistics capabilities for continuous monitoring as well as ambient local vibration for analysis that combines ambient temperature and local temperature and vibration levels changes for identifying machinery issues.

In embodiments, a data acquisition device may be controlled by a personal computer (PC) to implement the desired data acquisition commands. In embodiments, the DAQ box may be self-sufficient. and can acquire, process, analyze and monitor independent of external PC control. Embodiments may include secure digital (SD) card storage. In embodiments, significant additional storage capability may be provided by utilizing an SD card. This may prove critical for monitoring applications where critical data may be stored permanently. Also, if a power failure should occur, the most recent data may be stored despite the fact that it was not off-loaded to another system.

A current trend has been to make DAQ systems as communicative as possible with the outside world usually in the form of networks including wireless. In the past it was common to use a dedicated bus to control a DAQ system with either a microprocessor or microcontroller/microprocessor paired with a PC. In embodiments, a DAQ system may comprise one or more microprocessor/microcontrollers, specialized microcontrollers/microprocessors, or dedicated processors focused primarily on the communication aspects with the outside world. These include USB, Ethernet and wireless with the ability to provide an IP address or addresses in order to host a webpage. All communications with the outside world are then accomplished using a simple text based menu. The usual array of commands (in practice more than a hundred) such as InitializeCard, AcquireData, StopAcquisition, RetrieveCalibration Info, and so on, would be provided.

In embodiments, intense signal processing activities including resampling, weighting, filtering, and spectrum processing may be performed by dedicated processors such as field-programmable gate array ("FPGAs"), digital signal processor ("DSP"), microprocessors, micro-controllers, or a combination thereof. In embodiments, this subsystem may communicate via a specialized hardware bus with the communication processing section. It will be facilitated with dual-port memory, semaphore logic, and so on. This embodiment will not only provide a marked improvement in efficiency but can significantly improve the processing capability, including the streaming of the data as well other high-end analytical techniques. This negates the need for constantly interrupting the main processes which include the control of the signal conditioning circuits, triggering, raw data acquisition using the A/D, directing the A/D output to the appropriate on-board memory and processing that data.

Embodiments may include sensor overload identification. A need exists for monitoring systems to identify when the sensor is overloading. There may be situations involving high-frequency inputs that will saturate a standard 100 mv/g sensor (which is most commonly used in the industry) and having the ability to sense the overload improves data quality for better analysis. A monitoring system may identify when their system is overloading, but in embodiments, the system may look at the voltage of the sensor to determine if the overload is from the sensor, enabling the user to get another sensor better suited to the situation, or gather the data again.

Embodiments may include radio frequency identification ("RFID") and an inclinometer or accelerometer on a sensor so the sensor can indicate what machine/bearing it is attached to and what direction such that the software can automatically store the data without the user input. In embodiments, users could put the system on any machine or machines and the system would automatically set itself up and be ready for data collection in seconds.

Embodiments may include ultrasonic online monitoring by placing ultrasonic sensors inside transformers, motor control centers, breakers and the like and monitoring, via a sound spectrum, continuously looking for patterns that identify arcing, corona and other electrical issues indicating a break down or issue. Embodiments may include providing continuous ultrasonic monitoring of rotating elements and bearings of an energy production facility. In embodiments, an analysis engine may be used in ultrasonic online monitoring as well as identifying other faults by combining the ultrasonic data with other parameters such as vibration, temperature, pressure, heat flux, magnetic fields, electrical fields, currents, voltage, capacitance, inductance, and combinations (e.g., simple ratios) of the same, among many others.

Embodiments of the methods and systems disclosed herein may include use of an analog crosspoint switch for collecting variable groups of vibration input channels. For vibration analysis, it is useful to obtain multiple channels simultaneously from vibration transducers mounted on different parts of a machine (or machines) in multiple directions. By obtaining the readings at the same time, for example, the relative phases of the inputs may be compared for the purpose of diagnosing various mechanical faults. Other types of cross channel analyses such as cross-correlation, transfer functions, Operating Deflection Shape ("ODS") may also be performed.

Embodiments of the methods and systems disclosed herein may include precise voltage reference for A/D zero reference. Some A/D chips provide their own internal zero voltage reference to be used as a mid-scale value for external signal conditioning circuitry to ensure that both the AID and external op-amps use the same reference. Although this sounds reasonable in principle, there are practical complications. In many cases these references are inherently based on a supply voltage using a resistor-divider. For many current systems, especially those whose power is derived from a PC via USB or similar bus, this provides for an unreliable reference, as the supply voltage will often vary quite significantly with load. This is especially true for delta-sigma A/D chips which necessitate increased signal processing. Although the offsets may drift together with load, a problem arises if one wants to calibrate the readings digitally. It is typical to modify the voltage offset expressed as counts coming from the A/D digitally to compensate for the DC drift. However, for this case, if the proper calibration offset is determined for one set of loading conditions, they will not apply for other conditions. An absolute DC offset expressed in counts will no longer be applicable. As a result, it becomes necessary to calibrate for all loading conditions which becomes complex, unreliable, and ultimately unmanageable. In embodiments, an external voltage reference is used which is simply independent of the supply voltage to use as the zero offset.

In embodiments, the system provides a phase-lock-loop band pass tracking filter method for obtaining slow-speed RPMs and phase for balancing purposes to remotely balance slow speed machinery, such as in paper mills, as well as offering additional analysis from its data. For balancing purposes, it is sometimes necessary to balance at very slow speeds. A typical tracking filter may be constructed based on a phase-lock loop or PLL design; however, stability and speed range are overriding concerns. In embodiments, a number of digitally controlled switches are used for selecting the appropriate RC and damping constants. The switching can be done all automatically after measuring the frequency of the incoming tach signal. Embodiments of the methods and systems disclosed herein may include digital derivation of phase relative to input and trigger channels using on-board timers. In embodiments, digital phase derivation uses digital timers to ascertain an exact delay from a trigger event to the precise start of data acquisition. This delay, or offset, then, is further refined using interpolation methods to obtain an even more precise offset which is then applied to the analytically determined phase of the acquired data such that the phase is "in essence" an absolute phase with precise mechanical meaning useful for among other things, one-shot balancing, alignment analysis, and so on.

Embodiments of the methods and systems disclosed herein may include signal processing firmware/hardware. In embodiments, long blocks of data may be acquired at high-sampling rate as opposed to multiple sets of data taken at different sampling rates. Typically, in modern route collection for vibration analysis, it is customary to collect data at a fixed sampling rate with a specified data length. The sampling rate and data length may vary from route point to point based on the specific mechanical analysis requirements at hand. For example, a motor may require a relatively low sampling rate with high resolution to distinguish running speed harmonics from line frequency harmonics. The practical trade-off here though is that it takes more collection time to achieve this improved resolution. In contrast, some high-speed compressors or gear sets require much higher sampling rates to measure the amplitudes of relatively higher frequency data although the precise resolution may not be as necessary. Ideally, however, it would be better to collect a very long sample length of data at a very high-sampling rate. When digital acquisition devices were first popularized in the early 1980's, the A/D sampling, digital storage, and computational abilities were not close to what they are today, so compromises were made between the time required for data collection and the desired resolution and accuracy. It was because of this limitation that some analysts in the field even refused to give up their analog tape recording systems, which did not suffer as much from these same digitizing drawbacks. A few hybrid systems were employed that would digitize the play back of the recorded analog data at multiple sampling rates and lengths desired, though these systems were admittedly less automated. The more common approach, as mentioned earlier, is to balance data collection time with analysis capability and digitally acquire the data blocks at multiple sampling rates and sampling lengths and digitally store these blocks separately. In embodiments, a long data length of data can be collected at the highest practical sampling rate (e.g., 102.4 kHz; corresponding to a 40 kHz Fmax) and stored. This long block of data can be acquired in the same amount of time as the shorter length of the lower sampling rates utilized by a priori methods so that there is no effective delay added to the sampling at the measurement point, always a concern in route collection. In embodiments, analog tape recording of data is digitally simulated with such a precision that it can be in effect considered continuous or "analog" for many purposes, including for purposes of embodiments of the present disclosure, except where context indicates otherwise.

Embodiments of the methods and systems disclosed herein may include storage of calibration data and maintenance history on-board card sets. Many data acquisition devices which rely on interfacing to a PC to function store their calibration coefficients on the PC. This is especially true for complex data acquisition devices whose signal paths are many and therefore whose calibration tables can be quite large. In embodiments, calibration coefficients are stored in flash memory which will remember this data or any other significant information for that matter, for all practical purposes, permanently. This information may include nameplate information such as serial numbers of individual components, firmware or software version numbers, maintenance history, and the calibration tables. In embodiments, no matter which computer the box is ultimately connected to, the DAQ box remains calibrated and continues to hold all of this critical information. The PC or external device may poll for this information at any time for implantation or information exchange purposes.

Embodiments of the methods and systems disclosed herein may include rapid route creation taking advantage of hierarchical templates. In the field of vibration monitoring, as well as parametric monitoring in general, it is necessary to establish in a database or functional equivalent the existence of data monitoring points. These points are associated a variety of attributes including the following categories: transducer attributes, data collection settings, machinery parameters and operating parameters. The transducer attributes would include probe type, probe mounting type and probe mounting direction or axis orientation. Data collection attributes associated with the measurement would involve a sampling rate, data length, integrated electronic piezoelectric probe power and coupling requirements, hardware integration requirements, 4-20 or voltage interfacing, range and gain settings (if applicable), filter requirements, and so on. Machinery parametric requirements relative to the specific point would include such items as operating speed, bearing type, bearing parametric data which for a rolling element bearing includes the pitch diameter, number of balls, inner race, and outer-race diameters. For a tilting pad bearing, this would include the number of pads and so on. For measurement points on a piece of equipment such as a gearbox, needed parameters would include, for example, the number of gear teeth on each of the gears. For induction motors, it would include the number of rotor bars and poles; for compressors, the number of blades and/or vanes; for fans, the number of blades. For belt/pulley systems, the number of belts as well as the relevant belt-passing frequencies may be calculated from the dimensions of the pulleys and pulley center-to-center distance. For measurements near couplings, the coupling type and number of teeth in a geared coupling may be necessary, and so on. Operating parametric data would include operating load, which may be expressed in megawatts, flow (either air or fluid), percentage, horsepower, feet-per-minute, and so on. Operating temperatures both ambient and operational, pressures, humidity, and so on, may also be relevant. As can be seen, the setup information required for an individual measurement point can be quite large. It is also crucial to performing any legitimate analysis of the data. Machinery, equipment, and bearing specific information are essential for identifying fault frequencies as well as anticipating the various kinds of specific faults to be expected. The transducer attributes as well as data collection parameters are vital for properly interpreting the data along with providing limits for the type of analytical techniques suitable. The traditional means of entering this data has been manual and quite tedious, usually at the lowest hierarchical level (for example, at the bearing level with regards to machinery parameters), and at the transducer level for data collection setup information. It cannot be stressed enough, however, the importance of the hierarchical relationships necessary to organize data—both for analytical and interpretive purposes as well as the storage and movement of data. Here, we are focusing primarily on the storage and movement of data. By its nature, the aforementioned setup information is extremely redundant at the level of the lowest hierarchies; however, because of its strong hierarchical nature, it can be stored quite efficiently in that form. In embodiments, hierarchical nature can be utilized when copying data in the form of templates. As an example, hierarchical storage structure suitable for many purposes is defined from general to specific of company, plant or site, unit or process, machine, equipment, shaft element, bearing, and transducer. It is much easier to copy data associated with a particular machine, piece of equipment, shaft element or bearing than it is to copy only at the lowest transducer level. In embodiments, the system not only stores data in this hierarchical fashion, but robustly supports the rapid copying of data using these hierarchical templates. Similarity of elements at specific hierarchical levels lends itself to effective data storage in hierarchical format. For example, so many machines have common elements such as motors, gearboxes, compressors, belts, fans, and so on. More specifically, many motors can be easily classified as induction, DC, fixed or variable speed. Many gearboxes can be grouped into commonly occurring groupings such as input/output, input pinion/intermediate pinion/output pinion, 4-posters, and so on. Within a plant or company, there are many similar types of equipment purchased and standardized on for both cost and maintenance reasons. This results in an enormous overlapping of similar types of equipment and, as a result, offers a great opportunity for taking advantage of a hierarchical template approach.

Embodiments of the methods and systems disclosed herein may include smart bands. Smart bands refer to any processed signal characteristics derived from any dynamic input or group of inputs for the purposes of analyzing the data and achieving the correct diagnoses. Furthermore, smart bands may even include mini or relatively simple diagnoses for the purposes of achieving a more robust and complex one. Historically, in the field of mechanical vibration analysis, Alarm Bands have been used to define spectral frequency bands of interest for the purposes of analyzing and/or trending significant vibration patterns. The Alarm Band typically consists of a spectral (amplitude plotted against frequency) region defined between a low and high frequency border. The amplitude between these borders is summed in the same manner for which an overall amplitude is calculated. A Smart Band is more flexible in that it not only refers to a specific frequency band but can also refer to a group of spectral peaks such as the harmonics of a single peak, a true-peak level or crest factor derived from a time waveform, an overall derived from a vibration envelope spectrum or other specialized signal analysis technique or a logical combination (AND, OR, XOR, etc.) of these signal attributes. In addition, a myriad assortment of other parametric data, including system load, motor voltage and phase information, bearing temperature, flow rates, and the like, can likewise be used as the basis for forming additional smart bands. In embodiments, Smart Band symptoms may be used as building blocks for an expert system whose engine would utilize these inputs to derive diagnoses. Some of these mini-diagnoses may then in turn be used as Smart-Band symptoms (smart bands can include even diagnoses) for more generalized diagnoses.

Embodiments of the methods and systems disclosed herein may include a neural net expert system using smart bands. Typical vibration analysis engines are rule-based (i.e., they use a list of expert rules which, when met, trigger specific diagnoses). In contrast, a neural approach utilizes the weighted triggering of multiple input stimuli into smaller analytical engines or neurons which in turn feed a simplified weighted output to other neurons. The output of these neurons can be also classified as smart bands which in turn feed other neurons. This produces a more layered approach to expert diagnosing as opposed to the one-shot approach of a rule-based system. In embodiments, the expert system utilizes this neural approach using smart bands; however, it does not preclude rule-based diagnoses being reclassified as smart bands as further stimuli to be utilized by the expert system. From this point-of-view, it can be overviewed as a hybrid approach, although at the highest level it is essentially neural.

Embodiments of the methods and systems disclosed herein may include use of database hierarchy in analysis smart band symptoms and diagnoses may be assigned to various hierarchical database levels. For example, a smart band may be called "Looseness" at the bearing level, trigger "Looseness" at the equipment level, and trigger "Looseness" at the machine level. Another example would be having a smart band diagnosis called "Horizontal Plane Phase Flip" across a coupling and generate a smart band diagnosis of "Vertical Coupling Misalignment" at the machine level.

Embodiments of the methods and systems disclosed herein may include expert system GUIs. In embodiments, the system undertakes a graphical approach to defining smart bands and diagnoses for the expert system. The entry of symptoms, rules, or more generally smart bands for creating a particular machine diagnosis, may be tedious and time consuming. One means of making the process more expedient and efficient is to provide a graphical means by use of wiring. The proposed graphical interface consists of four major components: a symptom parts bin, diagnoses bin, tools bin, and graphical wiring area ("GWA"). In embodiments, a symptom parts bin includes various spectral, waveform, envelope and any type of signal processing characteristic or grouping of characteristics such as a spectral peak, spectral harmonic, waveform true-peak, waveform crest-factor, spectral alarm band, and so on. Each part may be assigned additional properties. For example, a spectral peak part may be assigned a frequency or order (multiple) of running speed. Some parts may be pre-defined or user defined such as a 1×, 2×, 3× running speed, 1×, 2×, 3× gear mesh, 1×, 2×, 3× blade pass, number of motor rotor bars x running speed, and so on.

In embodiments, the diagnoses bin includes various pre-defined as well as user-defined diagnoses such as misalignment, imbalance, looseness, bearing faults, and so on. Like parts, diagnoses may also be used as parts for the purposes of building more complex diagnoses. In embodiments, the tools bin includes logical operations such as AND, OR, XOR, etc. or other ways of combining the various parts listed above such as Find Max, Find Min, Interpolate, Average, other Statistical Operations, etc. In embodiments, a graphical wiring area includes parts from the parts bin or diagnoses from the diagnoses bin and may be combined using tools to create diagnoses. The various parts, tools and diagnoses will be represented with icons which are simply graphically wired together in the desired manner.

Embodiments of the methods and systems disclosed herein may include a graphical approach for back-calculation definition. In embodiments, the expert system also provides the opportunity for the system to learn. If one already knows that a unique set of stimuli or smart bands corresponds to a specific fault or diagnosis, then it is possible to back-calculate a set of coefficients that when applied to a future set of similar stimuli would arrive at the same diagnosis. In embodiments, if there are multiple sets of data, a best-fit approach may be used. Unlike the smart band GUI, this embodiment will self-generate a wiring diagram. In embodiments, the user may tailor the back-propagation approach settings and use a database browser to match specific sets of data with the desired diagnoses. In embodiments, the desired diagnoses may be created or custom tailored with a smart band GUI. In embodiments, after that, a user may press the GENERATE button and a dynamic wiring of the symptom-to-diagnosis may appear on the screen as it works through the algorithms to achieve the best fit. In embodiments, when complete, a variety of statistics are presented which detail how well the mapping process proceeded. In some cases, no mapping may be achieved if, for example, the input data was all zero or the wrong data (mistakenly assigned) and so on. Embodiments of the methods and systems disclosed herein may include bearing analysis methods. In embodiments, bearing analysis methods may be used in conjunction with a computer aided design ("CAD"), predictive deconvolution, minimum variance distortionless response ("MVDR") and spectrum sum-of-harmonics.

In recent years, there has been a strong drive to save power which has resulted in an influx of variable frequency drives and variable speed machinery. In embodiments, a bearing analysis method is provided. In embodiments, torsional vibration detection and analysis is provided utilizing transitory signal analysis to provide an advanced torsional vibration analysis for a more comprehensive way to diagnose machinery where torsional forces are relevant (such as machinery with rotating components). Due primarily to the decrease in cost of motor speed control systems, as well as the increased cost and consciousness of energy-usage, it has become more economically justifiable to take advantage of the potentially vast energy savings of load control. Unfortunately, one frequently overlooked design aspect of this issue is that of vibration. When a machine is designed to run at only one speed, it is far easier to design the physical structure accordingly so as to avoid mechanical resonances both structural and torsional, each of which can dramatically shorten the mechanical health of a machine. This would include such structural characteristics as the types of materials to use, their weight, stiffening member requirements and placement, bearing types, bearing location, base support constraints, etc. Even with machines running at one speed, designing a structure so as to minimize vibration can prove a daunting task, potentially requiring computer modeling, finite-element analysis, and field testing. By throwing variable speeds into the mix, in many cases, it becomes impossible to design for all desirable speeds. The problem then becomes one of minimization, e.g., by speed avoidance. This is why many modern motor controllers are typically programmed to skip or quickly pass through specific speed ranges or bands. Embodiments may include identifying speed ranges in a vibration monitoring system. Non-torsional, structural resonances are typically fairly easy to detect using conventional vibration analysis techniques. However, this is not the case for torsion. One special area of current interest is the increased incidence of torsional resonance problems, apparently due to the increased torsional stresses of speed change as well as the operation of equipment at torsional resonance speeds. Unlike non-torsional structural resonances which generally manifest their effect with dramatically increased casing or external vibration, torsional resonances generally show no such effect. In the case of a shaft torsional resonance, the twisting motion induced by the resonance may only be discernible by looking for speed and/or phase changes. The current standard methodology for analyzing torsional vibration involves the use of specialized instrumentation. Methods and systems disclosed herein allow analysis of torsional vibration without such specialized instrumentation. This may consist of shutting the machine down and employing the use of strain gauges and/or other special fixturing such as speed encoder plates and/or gears. Friction wheels are another alternative, but they typically require manual implementation and a specialized analyst. In general, these techniques can be prohibitively expensive and/or inconvenient. An increasing prevalence of continuous vibration monitoring systems due to decreasing costs and increasing convenience (e.g., remote access) exists. In embodiments, there is an ability to discern torsional speed and/or phase variations with just the vibration signal. In embodiments, transient analysis techniques may be utilized to distinguish torsionally induced vibrations from mere speed changes due to process control. In embodiments, factors for discernment might focus on one or more of the following aspects: the rate of speed change due to variable speed motor control would be relatively slow, sustained and deliberate; torsional speed changes would tend to be short, impulsive and not sustained; torsional speed changes would tend to be oscillatory, most likely decaying exponentially, process speed changes would not; and smaller speed changes associated with torsion relative to the shaft's rotational speed which suggest that monitoring phase behavior would show the quick or transient speed bursts in contrast to the slow phase changes historically associated with ramping a machine's speed up or down (as typified with Bode or Nyquist plots).

Embodiments of the methods and systems disclosed herein may include improved integration using both analog and digital methods. When a signal is digitally integrated using software, essentially the spectral low-end frequency data has its amplitude multiplied by a function which quickly blows up as it approaches zero and creates what is known in the industry as a "ski-slope" effect. The amplitude of the ski-slope is essentially the noise floor of the instrument. The simple remedy for this is the traditional hardware integrator, which can perform at signal-to-noise ratios much greater than that of an already digitized signal. It can also limit the amplification factor to a reasonable level so that multiplication by very large numbers is essentially prohibited. However, at high frequencies where the frequency becomes large, the original amplitude which may be well above the noise floor is multiplied by a very small number (1/f) that plunges it well below the noise floor. The hardware integrator has a fixed noise floor that although low floor does not scale down with the now lower amplitude high-frequency data. In contrast, the same digital multiplication of a digitized high-frequency signal also scales down the noise floor proportionally. In embodiments, hardware integration may be used below the point of unity gain where (at a value usually determined by units and/or desired signal to noise ratio based on gain) and software integration may be used above the value of unity gain to produce an ideal result. In embodiments, this integration is performed in the frequency domain. In embodiments, the resulting hybrid data can then be transformed back into a waveform which should be far superior in signal-to-noise ratio when compared to either hardware integrated or software integrated data. In embodiments, the strengths of hardware integration are used in conjunction with those of digital software integration to achieve the maximum signal-to-noise ratio. In embodiments, the first order gradual hardware integrator high pass filter along with curve fitting allow some relatively low frequency data to get through while reducing or eliminating the noise, allowing very useful analytical data that steep filters kill to be salvaged.

Embodiments of the methods and systems disclosed herein may include adaptive scheduling techniques for continuous monitoring. Continuous monitoring is often performed with an up-front Mux whose purpose it is to select a few channels of data among many to feed the hardware signal processing, A/D, and processing components of a DAQ system. This is done primarily out of practical cost considerations. The tradeoff is that all of the points are not monitored continuously (although they may be monitored to a lesser extent via alternative hardware methods). In embodiments, multiple scheduling levels are provided. In embodiments, at the lowest level, which is continuous for the most part, all of the measurement points will be cycled through in round-robin fashion. For example, if it takes 30 seconds to acquire and process a measurement point and there are 30 points, then each point is serviced once every 15 minutes; however, if a point should alarm by whatever criteria the user selects, its priority level can be increased so that it is serviced more often. As there can be multiple grades of severity for each alarm, so can there me multiple levels of priority with regards to monitoring. In embodiments, more severe alarms will be monitored more frequently. In embodiments, a number of additional high-level signal processing techniques can be applied at less frequent intervals. Embodiments may take advantage of the increased processing power of a PC and the PC can temporarily suspend the round-robin route collection (with its multiple tiers of collection) process and stream the required amount of data for a point of its choosing. Embodiments may include various advanced processing techniques such as envelope processing, wavelet analysis, as well as many other signal processing techniques. In embodiments, after acquisition of this data, the DAQ card set will continue with its route at the point it was interrupted. In embodiments, various PC scheduled data acquisitions will follow their own schedules which will be less frequency than the DAQ card route. They may be set up hourly, daily, by number of route cycles (for example, once every 10 cycles) and also increased scheduling-wise based on their alarm severity priority or type of measurement (e.g., motors may be monitored differently than fans).

Embodiments of the methods and systems disclosed herein may include data acquisition parking features. In embodiments, a data acquisition box used for route collection, real time analysis and in general as an acquisition instrument can be detached from its PC (tablet or otherwise) and powered by an external power supply or suitable battery. In embodiments, the data collector still retains continuous monitoring capability and its on-board firmware can implement dedicated monitoring functions for an extended period of time or can be controlled remotely for further analysis. Embodiments of the methods and systems disclosed herein may include extended statistical capabilities for continuous monitoring.

Embodiments of the methods and systems disclosed herein may include ambient sensing plus local sensing plus vibration for analysis. In embodiments, ambient environmental temperature and pressure, sensed temperature and pressure may be combined with long/medium term vibration analysis for prediction of any of a range of conditions or characteristics. Variants may add infrared sensing, infrared thermography, ultrasound, and many other types of sensors and input types in combination with vibration or with each other. Embodiments of the methods and systems disclosed herein may include a smart route. In embodiments, the continuous monitoring system's software will adapt/adjust the data collection sequence based on statistics, analytics, data alarms and dynamic analysis. Typically, the route is set based on the channels the sensors are attached to. In embodiments, with the crosspoint switch, the Mux can combine any input Mux channels to the (e.g., eight) output channels. In embodiments, as channels go into alarm or the system identifies key deviations, it will pause the normal route set in the software to gather specific simultaneous data, from the channels sharing key statistical changes, for more advanced analysis. Embodiments include conducting a smart OD S or smart transfer function.

Embodiments of the methods and systems disclosed herein may include smart ODS and one or more transfer functions. In embodiments, due to a system's multiplexer and crosspoint switch, an ODS, a transfer function, or other special tests on all the vibration sensors attached to a machine/structure can be performed and show exactly how the machine's points are moving in relationship to each other. In embodiments, 40-50 kHz and longer data lengths (e.g., at least one minute) may be streamed, which may reveal different information than what a normal ODS or transfer function will show. In embodiments, the system will be able to determine, based on the data/statistics/analytics to use, the smart route feature that breaks from the standard route and conducts an ODS across a machine, structure or multiple machines and structures that might show a correlation because the conditions/data directs it. In embodiments, for the transfer functions there may be an impact hammer used on one channel and then compared against other vibration sensors on the machine. In embodiments, the system may use the condition changes such as load, speed, temperature or other changes in the machine or system to conduct the transfer function. In embodiments, different transfer functions may be compared to each other over time. In embodiments, difference transfer functions may be strung together like a movie that may show how the machinery fault changes, such as a bearing that could show how it moves through the four stages of bearing failure and so on. Embodiments of the methods and systems disclosed herein may include a hierarchical Mux.

Figure 8:
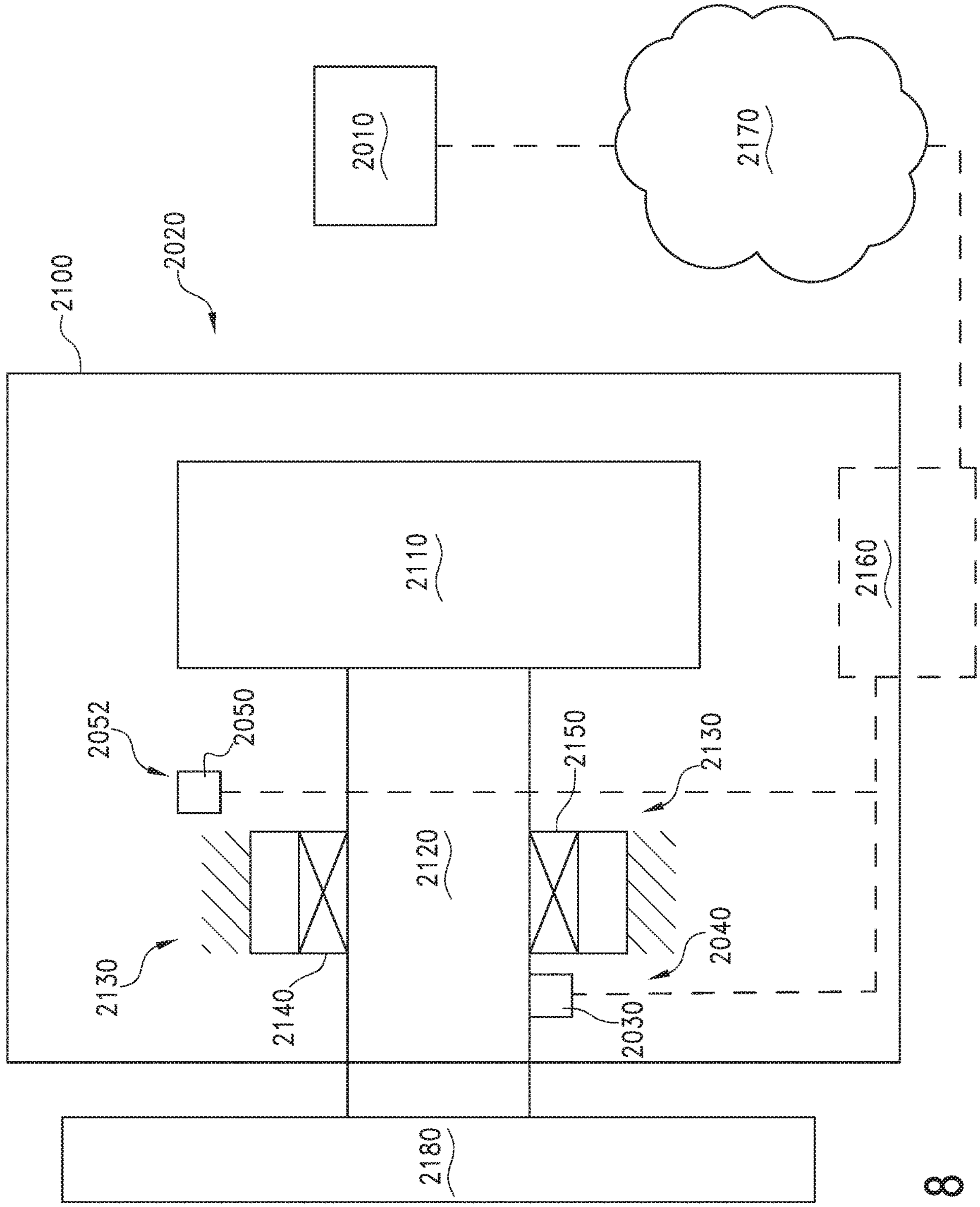
FIG. 8 is a diagrammatic view of a rotating or oscillating machine having a data acquisition module that is configured to collect waveform data in accordance with the present disclosure.

With reference to FIG. 8, the present disclosure generally includes digitally collecting or streaming waveform data 2010 from a machine 2020 whose operational speed can vary from relatively slow rotational or oscillational speeds to much higher speeds in different situations. The waveform data 2010, at least on one machine, may include data from a single axis sensor 2030 mounted at an unchanging reference location 2040 and from a three-axis sensor 2050 mounted at changing locations (or located at multiple locations), including location 2052. In embodiments, the waveform data 2010 can be vibration data obtained simultaneously from each sensor 2030, 2050 in a gap-free format for a duration of multiple minutes with maximum resolvable frequencies sufficiently large to capture periodic and transient impact events. By way of this example, the waveform data 2010 can include vibration data that can be used to create an operational deflecting shape. It can also be used, as needed, to diagnose vibrations from which a machine repair solution can be prescribed.

In embodiments, the machine 2020 can further include a housing 2100 that can contain a drive motor 2110 that can drive a shaft 2120. The shaft 2120 can be supported for rotation or oscillation by a set of bearings 2130, such as including a first bearing 2140 and a second bearing 2150. A data collection module 2160 can connect to (or be resident on) the machine 2020. In one example, the data collection module 2160 can be located and accessible through a cloud network facility 2170, can collect the waveform data 2010 from the machine 2020, and deliver the waveform data 2010 to a remote location. A working end 2180 of the drive shaft 2120 of the machine 2020 can drive a windmill, a fan, a pump, a drill, a gear system, a drive system, or other working element, as the techniques described herein can apply to a wide range of machines, equipment, tools, or the like that include rotating or oscillating elements. In other instances, a generator can be substituted for the motor 2110, and the working end of the drive shaft 2120 can direct rotational energy to the generator to generate power, rather than consume it.

In embodiments, the waveform data 2010 can be obtained using a predetermined route format based on the layout of the machine 2020. The waveform data 2010 may include data from the single axis sensor 2030 and the three-axis sensor 2050. The single-axis sensor 2030 can serve as a reference probe with its one channel of data and can be fixed at the unchanging location 2040 on the machine under survey. The three-axis sensor 2050 can serve as a tri-axial probe (e.g., three orthogonal axes) with its three channels of data and can be moved along a predetermined diagnostic route format from one test point to the next test point. In one example, both sensors 2030, 2050 can be mounted manually to the machine 2020 and can connect to a separate portable computer in certain service examples. The reference probe can remain at one location while the user can move the tri-axial vibration probe along the predetermined route, such as from bearing-to-bearing on a machine. In this example, the user is instructed to locate the sensors at the predetermined locations to complete the survey (or portion thereof) of the machine.

Figure 9:
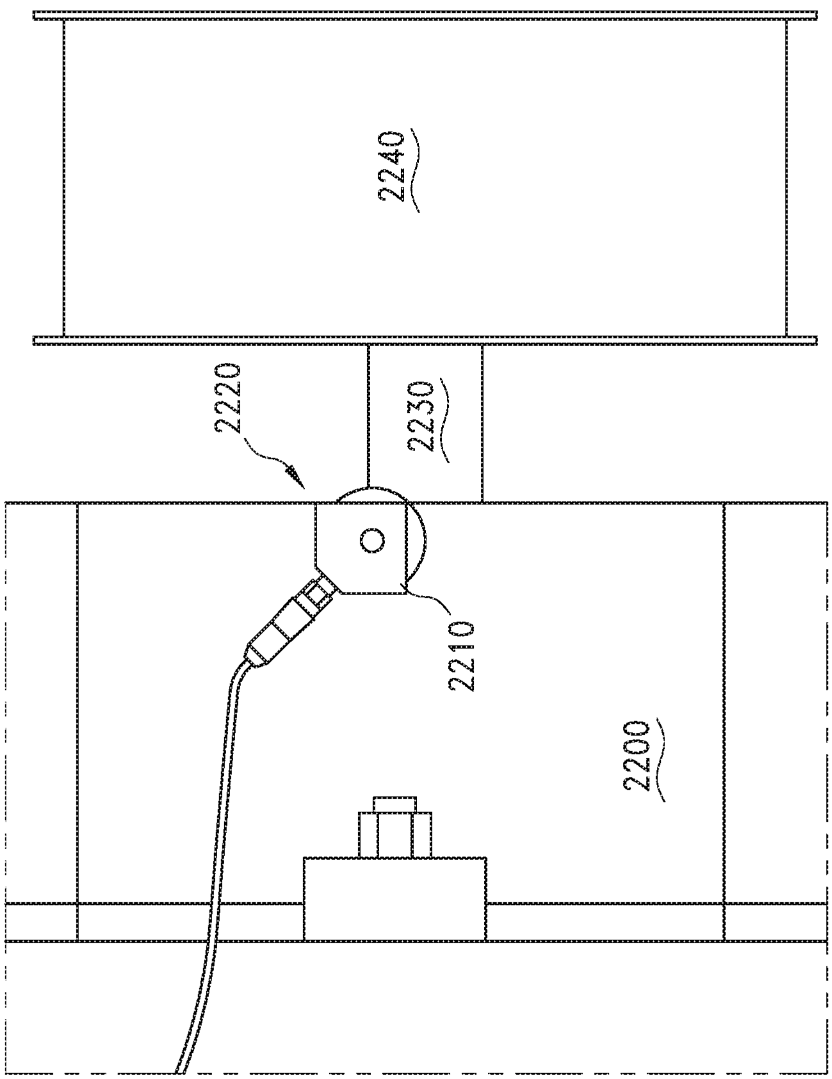
FIG. 9 is a diagrammatic view of an exemplary tri-axial sensor mounted to a motor bearing of an exemplary rotating machine in accordance with the present disclosure.
Figure 10:
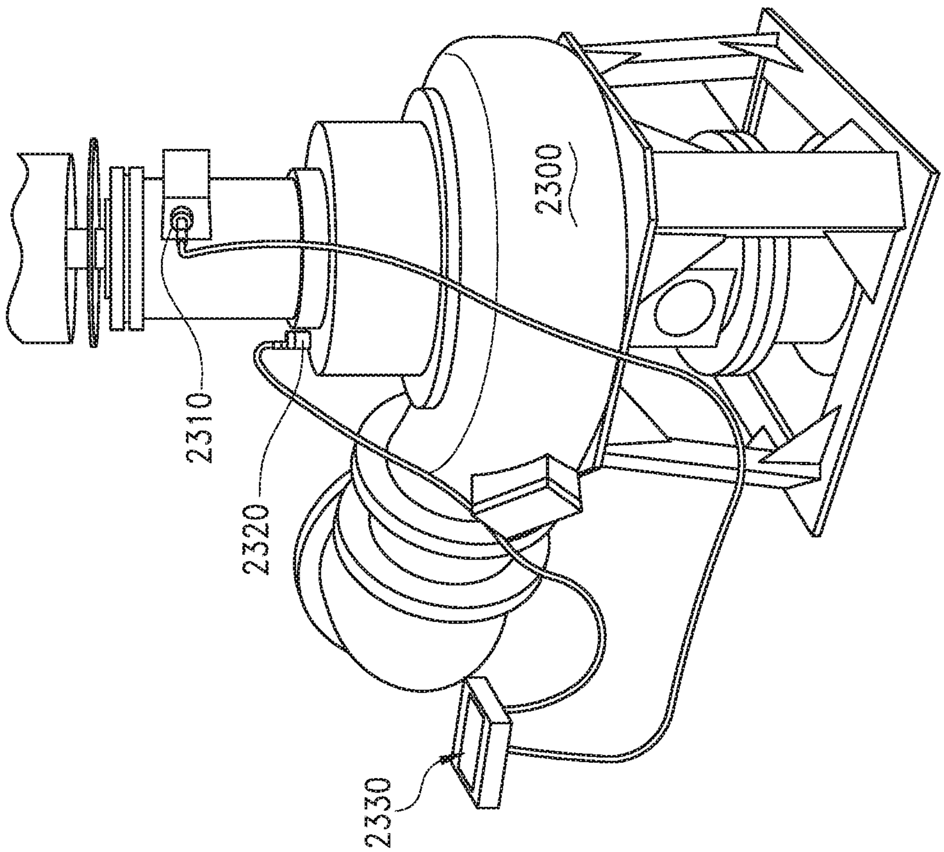
FIG. 10 and FIG. 11 are diagrammatic views of an exemplary tri-axial sensor and a single-axis sensor mounted to an exemplary rotating machine in accordance with the present disclosure.
Figure 11:
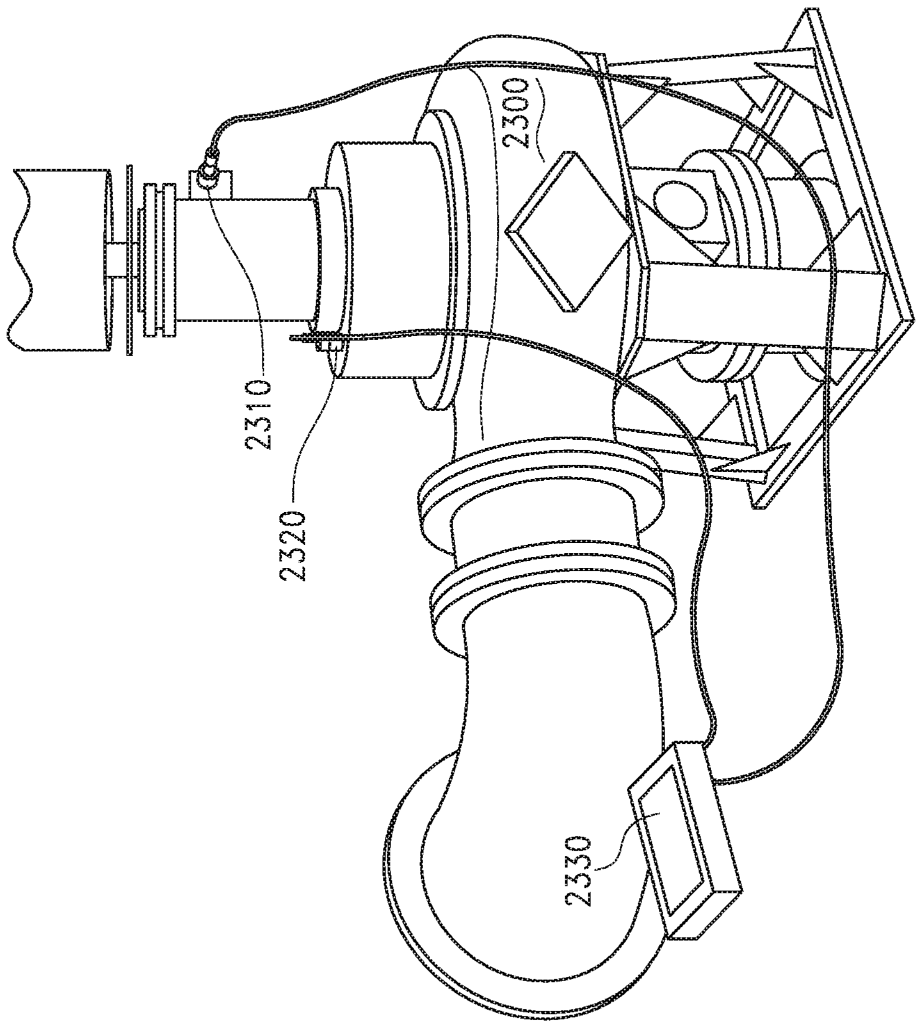

With reference to FIG. 9, a portion of an exemplary machine 2200 is shown having a tri-axial sensor 2210 mounted to a location 2220 associated with a motor bearing of the machine 2200 with an output shaft 2230 and output member 2240 in accordance with the present disclosure. With reference to FIG. 10, an exemplary machine 2300 is shown having a tri-axial sensor 2310 and a single-axis vibration sensor 2320 serving as the reference sensor that is attached on the machine 2300 at an unchanging location for the duration of the vibration survey in accordance with the present disclosure. The tri-axial sensor 2310 and the single-axis vibration sensor 2320 can be connected to a data collection system 2330.

In further examples, the sensors and data acquisition modules and equipment can be integral to, or resident on, the rotating machine. By way of these examples, the machine can contain many single axis sensors and many tri-axial sensors at predetermined locations. The sensors can be originally installed equipment and provided by the original equipment manufacturer or installed at a different time in a retrofit application. The data collection module 2160, or the like, can select and use one single axis sensor and obtain data from it exclusively during the collection of waveform data 2010 while moving to each of the tri-axial sensors. The data collection module 2160 can be resident on the machine 2020 and/or connect via the cloud network facility 2170.

With reference to FIG. 8, the various embodiments include collecting the waveform data 2010 by digitally recording locally, or streaming over, the cloud network facility 2170. The waveform data 2010 can be collected so as to be gap-five with no interruptions and, in some respects, can be similar to an analog recording of waveform data. The waveform data 2010 from all of the channels can be collected for one to two minutes depending on the rotating or oscillating speed of the machine being monitored. In embodiments, the data sampling rate can be at a relatively high-sampling rate relative to the operating frequency of the machine 2020.

In embodiments, a second reference sensor can be used, and a fifth channel of data can be collected. As such, the single-axis sensor can be the first channel and tri-axial vibration can occupy the second, the third, and the fourth data channels. This second reference sensor, like the first, can be a single axis sensor, such as an accelerometer. In embodiments, the second reference sensor, like the first reference sensor, can remain in the same location on the machine for the entire vibration survey on that machine. The location of the first reference sensor (i.e., the single axis sensor) may be different than the location of the second reference sensors (i.e., another single axis sensor). In certain examples, the second reference sensor can be used when the machine has two shafts with different operating speeds, with the two reference sensors being located on the two different shafts. In accordance with this example, further single-axis reference sensors can be employed at additional but different unchanging locations associated with the rotating machine.

In embodiments, the waveform data can be transmitted electronically in a gap-free free format at a significantly high rate of sampling for a relatively longer period of time. In one example, the period of time is 60 seconds to 120 seconds. In another example, the rate of sampling is 100 kHz with a maximum resolvable frequency (Fmax) of 40 kHz. It will be appreciated in light of this disclosure that the waveform data can be shown to approximate more closely some of the wealth of data available from previous instances of analog recording of waveform data.

In embodiments, sampling, band selection, and filtering techniques can permit one or more portions of a long stream of data (i.e., one to two minutes in duration) to be under sampled or over sampled to realize varying effective sampling rates. To this end, interpolation and decimation can be used to further realize varying effective sampling rates. For example, oversampling may be applied to frequency bands that are proximal to rotational or oscillational operating speeds of the sampled machine, or to harmonics thereof, as vibration effects may tend to be more pronounced at those frequencies across the operating range of the machine. In embodiments, the digitally-sampled data set can be decimated to produce a lower sampling rate. It will be appreciated in light of the disclosure that decimate in this context can be the opposite of interpolate. In embodiments, decimating the data set can include first applying a low-pass filter to the digitally-sampled data set and then undersampling the data set.

In one example, a sample waveform at 100 Hz can be undersampled at every tenth point of the digital waveform to produce an effective sampling rate of 10 Hz, but the remaining nine points of that portion of the waveform are effectively discarded and not included in the modeling of the sample waveform. Moreover, this type of bare undersampling can create ghost frequencies due to the undersampling rate (i.e., 10 Hz) relative to the 100 Hz sample waveform.

Most hardware for analog-to-digital conversions uses a sample-and-hold circuit that can charge up a capacitor for a given amount of time such that an average value of the waveform is determined over a specific change in time. It will be appreciated in light of the disclosure that the value of the waveform over the specific change in time is not linear but more similar to a cardinal sinusoidal ("sinc") function; therefore, it can be shown that more emphasis can be placed on the waveform data at the center of the sampling interval with exponential decay of the cardinal sinusoidal signal occurring from its center.

By way of the above example, the sample waveform at 100 Hz can be hardware-sampled at 10 Hz and therefore each sampling point is averaged over 100 milliseconds (e.g., a signal sampled at 100 Hz can have each point averaged over 10 milliseconds). In contrast to the effective discarding of nine out of the ten data points of the sampled waveform as discussed above, the present disclosure can include weighing adjacent data. The adjacent data can refer to the sample points that were previously discarded and the one remaining point that was retained. In one example, a low pass filter can average the adjacent sample data linearly, i.e., determining the sum of every ten points and then dividing that sum by ten. In a further example, the adjacent data can be weighted with a sinc function. The process of weighting the original waveform with the sinc function can be referred to as an impulse function, or can be referred to in the time domain as a convolution.

The present disclosure can be applicable to not only digitizing a waveform signal based on a detected voltage, but can also be applicable to digitizing waveform signals based on current waveforms, vibration waveforms, and image processing signals including video signal rasterization. In one example, the resizing of a window on a computer screen can be decimated, albeit in at least two directions. In these further examples, it will be appreciated that undersampling by itself can be shown to be insufficient. To that end, oversampling or upsampling by itself can similarly be shown to be insufficient, such that interpolation can be used like decimation but in lieu of only undersampling by itself.

It will be appreciated in light of the disclosure that interpolation in this context can refer to first applying a low pass filter to the digitally-sampled waveform data and then upsampling the waveform data. It will be appreciated in light of the disclosure that real-world examples can often require the use of use non-integer factors for decimation or interpolation, or both. To that end, the present disclosure includes interpolating and decimating sequentially in order to realize a non-integer factor rate for interpolating and decimating. In one example, interpolating and decimating sequentially can define applying a low-pass filter to the sample waveform, then interpolating the waveform after the low-pass filter, and then decimating the waveform after the interpolation. In embodiments, the vibration data can be looped to purposely emulate conventional tape recorder loops, with digital filtering techniques used with the effective splice to facilitate longer analyses. It will be appreciated in light of the disclosure that the above techniques do not preclude waveform, spectrum, and other types of analyses to be processed and displayed with a GUI of the user at the time of collection. It will be appreciated in light of the disclosure that newer systems can permit this functionality to be performed in parallel to the high-performance collection of the raw waveform data.

With respect to time of collection issues, it will be appreciated that older systems using the compromised approach of improving data resolution, by collecting at different sampling rates and data lengths, do not in fact save as much time as expected. To that end, every time the data acquisition hardware is stopped and started, latency issues can be created, especially when there is hardware auto-scaling performed. The same can be true with respect to data retrieval of the route information (i.e., test locations) that is often in a database format and can be exceedingly slow. The storage of the raw data in bursts to disk (whether solid state or otherwise) can also be undesirably slow.

In contrast, the many embodiments include digitally streaming the waveform data 2010, as disclosed herein, and also enjoying the benefit of needing to load the route parameter information while setting the data acquisition hardware only once. Because the waveform data 2010 is streamed to only one file, there is no need to open and close files, or switch between loading and writing operations with the storage medium. It can be shown that the collection and storage of the waveform data 2010, as described herein, can be shown to produce relatively more meaningful data in significantly less time than the traditional batch data acquisition approach. An example of this includes an electric motor about which waveform data can be collected with a data length of 4K points (i.e., 4,096) for sufficiently high resolution in order to, among other things, distinguish electrical sideband frequencies. For fans or blowers, a reduced resolution of 1K (i.e., 1,024) can be used. In certain instances, 1K can be the minimum waveform data length requirement. The sampling rate can be 1,280 Hz and that equates to an Fmax of 500 Hz. It will be appreciated in light of the disclosure that oversampling by an industry standard factor of 2.56 can satisfy the necessary two-times (2×) oversampling for the Nyquist Criterion with some additional leeway that can accommodate anti-aliasing filter-rolloff. The time to acquire this waveform data would be 1,024 points at 1,280 hertz, which are 800 milliseconds.

To improve accuracy, the waveform data can be averaged. Eight averages can be used with, for example, fifty percent overlap. This would extend the time from 800 milliseconds to 3.6 seconds, which is equal to 800 msec×8 averages×0.5 (overlap ratio)+0.5×800 msec (non-overlapped head and tail ends). After collection at Fmax=500 Hz waveform data, a higher sampling rate can be used. In one example, ten times (10×) the previous sampling rate can be used and Fmax=10 kHz. By way of this example, eight averages can be used with fifty percent (50%) overlap to collect waveform data at this higher rate that can amount to a collection time of 360 msec or 0.36 seconds. It will be appreciated in light of the disclosure that it can be necessary to read the hardware collection parameters for the higher sampling rate from the route list, as well as permit hardware auto-scaling, or the resetting of other necessary hardware collection parameters, or both. To that end, a few seconds of latency can be added to accommodate the changes in sampling rate. In other instances, introducing latency can accommodate hardware autoscaling and changes to hardware collection parameters that can be required when using the lower sampling rate disclosed herein. In addition to accommodating the change in sampling rate, additional time is needed for reading the route point information from the database (i.e., where to monitor and where to monitor next), displaying the route information, and processing the waveform data. Moreover, display of the waveform data and/or associated spectra can also consume significant time. In light of the above, 15 seconds to 20 seconds can elapse while obtaining waveform data at each measurement point.

In further examples, additional sampling rates can be added but this can make the total amount time for the vibration survey even longer because time adds up from changeover time from one sampling rate to another and from the time to obtain additional data at different sampling rate. In one example, a lower sampling rate is used, such as a sampling rate of 128 Hz where Fmax=50 Hz. By way of this example, the vibration survey would, therefore, require an additional 36 seconds for the first set of averaged data at this sampling rate, in addition to others mentioned above, and consequently the total time spent at each measurement point increases even more dramatically. Further embodiments include using similar digital streaming of gap free waveform data as disclosed herein for use with wind turbines and other machines that can have relatively slow speed rotating or oscillating systems. In many examples, the waveform data collected can include long samples of data at a relatively high-sampling rate. In one example, the sampling rate can be 100 kHz and the sampling duration can be for two minutes on all of the channels being recorded. In many examples, one channel can be for the single axis reference sensor and three more data channels can be for the tri-axial three channel sensor. It will be appreciated in light of the disclosure that the long data length can be shown to facilitate detection of extremely low frequency phenomena. The long data length can also be shown to accommodate the inherent speed variability in wind turbine operations. Additionally, the long data length can further be shown to provide the opportunity for using numerous averages such as those discussed herein, to achieve very high spectral resolution, and to make feasible tape loops for certain spectral analyses. Many multiple advanced analytical techniques can now become available because such techniques can use the available long uninterrupted length of waveform data in accordance with the present disclosure.

It will also be appreciated in light of the disclosure that the simultaneous collection of waveform data from multiple channels can facilitate performing transfer functions between multiple channels. Moreover, the simultaneous collection of waveform data from multiple channels facilitates establishing phase relationships across the machine so that more sophisticated correlations can be utilized by relying on the fact that the waveforms from each of the channels are collected simultaneously. In other examples, more channels in the data collection can be used to reduce the time it takes to complete the overall vibration survey by allowing for simultaneous acquisition of waveform data from multiple sensors that otherwise would have to be acquired, in a subsequent fashion, moving sensor to sensor in the vibration survey.

The present disclosure includes the use of at least one of the single-axis reference probe on one of the channels to allow for acquisition of relative phase comparisons between channels. The reference probe can be an accelerometer or other type of transducer that is not moved and, therefore, fixed at an unchanging location during the vibration survey of one machine. Multiple reference probes can each be deployed as at suitable locations fixed in place (i.e., at unchanging locations) throughout the acquisition of vibration data during the vibration survey. In certain examples, up to seven reference probes can be deployed depending on the capacity of the data collection module 2160 or the like. Using transfer functions or similar techniques, the relative phases of all channels may be compared with one another at all selected frequencies. By keeping the one or more reference probes fixed at their unchanging locations while moving or monitoring the other tri-axial vibration sensors, it can be shown that the entire machine can be mapped with regard to amplitude and relative phase. This can be shown to be true even when there are more measurement points than channels of data collection. With this information, an operating deflection shape can be created that can show dynamic movements of the machine in 3 D, which can provide an invaluable diagnostic tool. In embodiments, the one or more reference probes can provide relative phase, rather than absolute phase. It will be appreciated in light of the disclosure that relative phase may not be as valuable absolute phase for some purposes, but the relative phase the information can still be shown to be very useful.

In embodiments, the sampling rates used during the vibration survey can be digitally synchronized to predetermined operational frequencies that can relate to pertinent parameters of the machine such as rotating or oscillating speed. Doing this, permits extracting even more information using synchronized averaging techniques. It will be appreciated in light of the disclosure that this can be done without the use of a key phasor or a reference pulse from a rotating shaft, which is usually not available for route collected data. As such, non-synchronous signals can be removed from a complex signal without the need to deploy synchronous averaging using the key phasor. This can be shown to be very powerful when analyzing a particular pinion in a gearbox or generally applied to any component within a complicated mechanical mechanism. In many instances, the key phasor or the reference pulse is rarely available with route collected data, but the techniques disclosed herein can overcome this absence. In embodiments, there can be multiple shafts running at different speeds within the machine being analyzed. In certain instances, there can be a single-axis reference probe for each shaft. In other instances, it is possible to relate the phase of one shaft to another shaft using only one single axis reference probe on one shaft at its unchanging location. In embodiments, variable speed equipment can be more readily analyzed with relatively longer duration of data relative to single speed equipment. The vibration survey can be conducted at several machine speeds within the same contiguous set of vibration data using the same techniques disclosed herein. These techniques can also permit the study of the change of the relationship between vibration and the change of the rate of speed that was not available before.

In embodiments, there are numerous analytical techniques that can emerge from because raw waveform data can be captured in a gap-free digital format as disclosed herein. The gap-free digital format can facilitate many paths to analyze the waveform data in many ways after the fact to identify specific problems. The vibration data collected in accordance with the techniques disclosed herein can provide the analysis of transient, semi-periodic and very low frequency phenomena. The waveform data acquired in accordance with the present disclosure can contain relatively longer streams of raw gap-free waveform data that can be conveniently played back as needed, and on which many and varied sophisticated analytical techniques can be performed. A large number of such techniques can provide for various forms of filtering to extract low amplitude modulations from transient impact data that can be included in the relatively longer stream of raw gap-free waveform data. It will be appreciated in light of the disclosure that in past data collection practices, these types of phenomena were typically lost by the averaging process of the spectral processing algorithms because the goal of the previous data acquisition module was purely periodic signals; or these phenomena were lost to file size reduction methodologies due to the fact that much of the content from an original raw signal was typically discarded knowing it would not be used.

In embodiments, there is a method of monitoring vibration of a machine having at least one shaft supported by a set of bearings. The method includes monitoring a first data channel assigned to a single-axis sensor at an unchanging location associated with the machine. The method also includes monitoring a second, third, and fourth data channel assigned to a three-axis sensor. The method further includes recording gap-free digital waveform data simultaneously from all of the data channels while the machine is in operation; and determining a change in relative phase based on the digital waveform data. The method also includes the tri-axial sensor being located at a plurality of positions associated with the machine while obtaining the digital waveform. In embodiments, the second, third, and fourth channels are assigned together to a sequence of tri-axial sensors each located at different positions associated with the machine. In embodiments, the data is received from all of the sensors on all of their channels simultaneously.

The method also includes determining an operating deflection shape based on the change in relative phase information and the waveform data. In embodiments, the unchanging location of the reference sensor is a position associated with a shaft of the machine. In embodiments, the tri-axial sensors in the sequence of the tri-axial sensors are each located at different positions and are each associated with different bearings in the machine. In embodiments, the unchanging location is a position associated with a shaft of the machine and, wherein, the tri-axial sensors in the sequence of the tri-axial sensors are each located at different positions and are each associated with different bearings that support the shaft in the machine. The various embodiments include methods of sequentially monitoring vibration or similar process parameters and signals of a rotating or oscillating machine or analogous process machinery from a number of channels simultaneously, which can be known as an ensemble. In various examples, the ensemble can include one to eight channels. In further examples, an ensemble can represent a logical measurement grouping on the equipment being monitored whether those measurement locations are temporary for measurement, supplied by the original equipment manufacturer, retrofit at a later date, or one or more combinations thereof.

In one example, an ensemble can monitor bearing vibration in a single direction. In a further example, an ensemble can monitor three different directions (e.g., orthogonal directions) using a tri-axial sensor. In yet further examples, an ensemble can monitor four or more channels where the first channel can monitor a single axis vibration sensor, and the second, the third, and the fourth channels can monitor each of the three directions of the tri-axial sensor. In other examples, the ensemble can be fixed to a group of adjacent bearings on the same piece of equipment or an associated shaft. The various embodiments provide methods that include strategies for collecting waveform data from various ensembles deployed in vibration studies or the like in a relatively more efficient manner. The methods also include simultaneously monitoring of a reference channel assigned to an unchanging reference location associated with the ensemble monitoring the machine. The cooperation with the reference channel can be shown to support a more complete correlation of the collected waveforms from the ensembles. The reference sensor on the reference channel can be a single axis vibration sensor, or a phase reference sensor that can be triggered by a reference location on a rotating shaft or the like. As disclosed herein, the methods can further include recording gap-free digital waveform data simultaneously from all of the channels of each ensemble at a relatively high rate of sampling so as to include all frequencies deemed necessary for the proper analysis of the machinery being monitored while it is in operation. The data from the ensembles can be streamed gap-free to a storage medium for subsequent processing that can be connected to a cloud network facility, a local data link, Bluetooth™ connectivity, cellular data connectivity, or the like.

In embodiments, the methods disclosed herein include strategies for collecting data from the various ensembles including digital signal processing techniques that can be subsequently applied to data from the ensembles to emphasize or better isolate specific frequencies or waveform phenomena. This can be in contrast with current methods that collect multiple sets of data at different sampling rates, or with different hardware filtering configurations including integration, that provide relatively less post-processing flexibility because of the commitment to these same (known as a priori hardware configurations). These same hardware configurations can also be shown to increase time of the vibration survey due to the latency delays associated with configuring the hardware for each independent test. In embodiments, the methods for collecting data from various ensembles include data marker technology that can be used for classifying sections of streamed data as homogenous and belonging to a specific ensemble. In one example, a classification can be defined as operating speed. In doing so, a multitude of ensembles can be created from what conventional systems would collect as only one. The many embodiments include post-processing analytic techniques for comparing the relative phases of all the frequencies of interest not only between each channel of the collected ensemble but also between all of the channels of all of the ensembles being monitored, when applicable.

Figure 12:
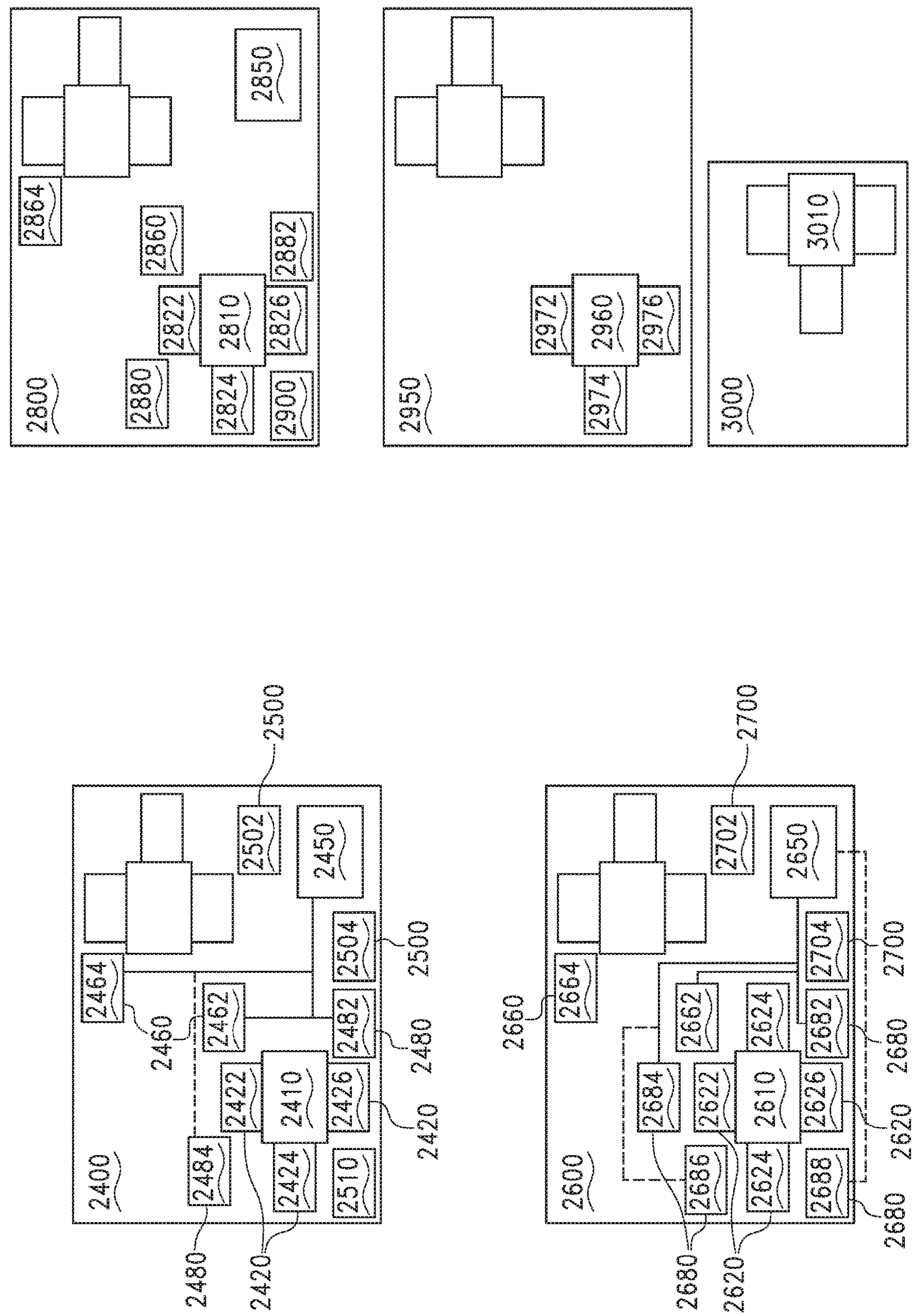
FIG. 12 is a diagrammatic view of multiple machines under survey with ensembles of sensors in accordance with the present disclosure.

With reference to FIG. 12, the many embodiments include a first machine 2400 having rotating or oscillating components 2410, or both, each supported by a set of bearings 2420 including a bearing pack 2422, a bearing pack 2424, a bearing pack 2426, and more as needed. The first machine 2400 can be monitored by a first sensor ensemble 2450. The first ensemble 2450 can be configured to receive signals from sensors originally installed (or added later) on the first machine 2400. The sensors on the machine 2400 can include single-axis sensors 2460, such as a single-axis sensor 2462, a single-axis sensor 2464, and more as needed. In many examples, the single axis-sensors 2460 can be positioned in the machine 2400 at locations that allow for the sensing of one of the rotating or oscillating components 2410 of the machine 2400.

The machine 2400 can also have tri-axial (e.g., orthogonal axes) sensors 2480, such as a tri-axial sensor 2482, a tri-axial sensor 2484, and more as needed. In many examples, the tri-axial sensors 2480 can be positioned in the machine 2400 at locations that allow for the sensing of one of each of the bearing packs in the sets of bearings 2420 that is associated with the rotating or oscillating components of the machine 2400. The machine 2400 can also have temperature sensors 2500, such as a temperature sensor 2502, a temperature sensor 2504, and more as needed. The machine 2400 can also have a tachometer sensor 2510 or more as needed that each detail the RPMs of one of its rotating components. By way of the above example, the first sensor ensemble 2450 can survey the above sensors associated with the first machine 2400. To that end, the first ensemble 2450 can be configured to receive eight channels. In other examples, the first sensor ensemble 2450 can be configured to have more than eight channels, or less than eight channels as needed. In this example, the eight channels include two channels that can each monitor a single-axis reference sensor signal and three channels that can monitor a tri-axial sensor signal. The remaining three channels can monitor two temperature signals and a signal from a tachometer. In one example, the first ensemble 2450 can monitor the single-axis sensor 2462, the single-axis sensor 2464, the tri-axial sensor 2482, the temperature sensor 2502, the temperature sensor 2504, and the tachometer sensor 2510 in accordance with the present disclosure. During a vibration survey on the machine 2400, the first ensemble 2450 can first monitor the tri-axial sensor 2482 and then move next to the tri-axial sensor 2484.

After monitoring the tri-axial sensor 2484, the first ensemble 2450 can monitor additional tri-axial sensors on the machine 2400 as needed and that are part of the predetermined route list associated with the vibration survey of the machine 2400, in accordance with the present disclosure. During this vibration survey, the first ensemble 2450 can continually monitor the single-axis sensor 2462, the single-axis sensor 2464, the two temperature sensors 2502, 2504, and the tachometer sensor 2510 while the first ensemble 2450 can serially monitor the multiple tri-axial sensors 2480 in the pre-determined route plan for this vibration survey.

With reference to FIG. 12, the many embodiments include a second machine 2600 having rotating or oscillating components 2610, or both, each supported by a set of bearings 2620 including a bearing pack 2622, a bearing pack 2624, a bearing pack 2626, and more as needed. The second machine 2600 can be monitored by a second sensor ensemble 2650. The second ensemble 2650 can be configured to receive signals from sensors originally installed (or added later) on the second machine 2600. The sensors on the machine 2600 can include single-axis sensors 2660, such as a single-axis sensor 2662, a single-axis sensor 2664, and more as needed. In many examples, the single axis-sensors 2660 can be positioned in the machine 2600 at locations that allow for the sensing of one of the rotating or oscillating components 2610 of the machine 2600.

The machine 2600 can also have tri-axial (e.g., orthogonal axes) sensors 2680, such as a tri-axial sensor 2682, a tri-axial sensor 2684, a tri-axial sensor 2686, a tri-axial sensor 2688, and more as needed. In many examples, the tri-axial sensors 2680 can be positioned in the machine 2600 at locations that allow for the sensing of one of each of the bearing packs in the sets of bearings 2620 that is associated with the rotating or oscillating components of the machine 2600. The machine 2600 can also have temperature sensors 2700, such as a temperature sensor 2702, a temperature sensor 2704, and more as needed. The machine 2600 can also have a tachometer sensor 2710 or more as needed that each detail the RPMs of one of its rotating components.

By way of the above example, the second sensor ensemble 2650 can survey the above sensors associated with the second machine 2600. To that end, the second ensemble 2650 can be configured to receive eight channels. In other examples, the second sensor ensemble 2650 can be configured to have more than eight channels or less than eight channels as needed. In this example, the eight channels include one channel that can monitor a single-axis reference sensor signal and six channels that can monitor two tri-axial sensor signals. The remaining channel can monitor a temperature signal. In one example, the second ensemble 2650 can monitor the single axis sensor 2662, the tri-axial sensor 2682, the tri-axial sensor 2684, and the temperature sensor 2702. During a vibration survey on the machine 2600 in accordance with the present disclosure, the second ensemble 2650 can first monitor the tri-axial sensor 2682 simultaneously with the tri-axial sensor 2684 and then move onto the tri-axial sensor 2686 simultaneously with the tri-axial sensor 2688.

After monitoring the tri-axial sensors 2680, the second ensemble 2650 can monitor additional tri-axial sensors (in simultaneous pairs) on the machine 2600 as needed and that are part of the predetermined route list associated with the vibration survey of the machine 2600 in accordance with the present disclosure. During this vibration survey, the second ensemble 2650 can continually monitor the single-axis sensor 2662 at its unchanging location and the temperature sensor 2702 while the second ensemble 2650 can serially monitor the multiple tri-axial sensors in the pre-determined route plan for this vibration survey.

With continuing reference to FIG. 12, the many embodiments include a third machine 2800 having rotating or oscillating components 2810, or both, each supported by a set of bearings 2820 including a bearing pack 2822, a bearing pack 2824, a bearing pack 2826, and more as needed. The third machine 2800 can be monitored by a third sensor ensemble 2850. The third ensemble 2850 can be configured with a single-axis sensor 2860, and two tri-axial (e.g., orthogonal axes) sensors 2880, 2882. In many examples, the single axis-sensor 2860 can be secured by the user on the machine 2800 at a location that allows for the sensing of one of the rotating or oscillating components of the machine 2800. The tri-axial sensors 2880, 2882 can be also be located on the machine 2800 by the user at locations that allow for the sensing of one of each of the bearings in the sets of bearings that each associated with the rotating or oscillating components of the machine 2800. The third ensemble 2850 can also include a temperature sensor 2900. The third ensemble 2850 and its sensors can be moved to other machines unlike the first and second ensembles 2450, 2650.

The many embodiments also include a fourth machine 2950 having rotating or oscillating components 2960, or both, each supported by a set of bearings 2970 including a bearing pack 2972, a bearing pack 2974, a bearing pack 2976, and more as needed. The fourth machine 2950 can be also monitored by the third sensor ensemble 2850 when the user moves it to the fourth machine 2950. The many embodiments also include a fifth machine 3000 having rotating or oscillating components 3010, or both. The fifth machine 3000 may not be explicitly monitored by any sensor or any sensor ensembles in operation but it can create vibrations or other impulse energy of sufficient magnitude to be recorded in the data associated with any one of the machines 2400, 2600, 2800, 2950 under a vibration survey.

The many embodiments include monitoring the first sensor ensemble 2450 on the first machine 2400 through the predetermined route as disclosed herein. The many embodiments also include monitoring the second sensor ensemble 2650 on the second machine 2600 through the predetermined route. The locations of machine 2400 being close to machine 2600 can be included in the contextual metadata of both vibration surveys. The third ensemble 2850 can be moved between machine 2800, machine 2950, and other suitable machines. The machine 3000 has no sensors onboard as configured, but could be monitored as needed by the third sensor ensemble 2850. The machine 3000 and its operational characteristics can be recorded in the metadata in relation to the vibration surveys on the other machines to note its contribution due to its proximity.

The many embodiments include hybrid database adaptation for harmonizing relational metadata and streaming raw data formats. Unlike older systems that utilized traditional database structure for associating nameplate and operational parameters (sometimes deemed metadata) with individual data measurements that are discrete and relatively simple, it will be appreciated in light of the disclosure that more modern systems can collect relatively larger quantities of raw streaming data with higher sampling rates and greater resolutions. At the same time, it will also be appreciated in light of the disclosure that the network of metadata with which to link and obtain this raw data or correlate with this raw data, or both, is expanding at ever-increasing rates.

In one example, a single overall vibration level can be collected as part of a route or prescribed list of measurement points. This data collected can then be associated with database measurement location information for a point located on a surface of a bearing housing on a specific piece of the machine adjacent to a coupling in a vertical direction. Machinery analysis parameters relevant to the proper analysis can be associated with the point located on the surface. Examples of machinery analysis parameters relevant to the proper analysis can include a running speed of a shaft passing through the measurement point on the surface. Further examples of machinery analysis parameters relevant to the proper analysis can include one of, or a combination of: running speeds of all component shafts for that piece of equipment and/or machine, bearing types being analyzed such as sleeve or rolling element bearings, the number of gear teeth on gears should there be a gearbox, the number of poles in a motor, slip and line frequency of a motor, roller bearing element dimensions, number of fan blades, or the like. Examples of machinery analysis parameters relevant to the proper analysis can further include machine operating conditions such as the load on the machines and whether load is expressed in percentage, wattage, air flow, head pressure, horsepower, and the like. Further examples of machinery analysis parameters include information relevant to adjacent machines that might influence the data obtained during the vibration study.

It will be appreciated in light of the disclosure that the vast array of equipment and machinery types can support many different classifications, each of which can be analyzed in distinctly different ways. For example, some machines, like screw compressors and hammer mills, can be shown to run much noisier and can be expected to vibrate significantly more than other machines. Machines known to vibrate more significantly can be shown to require a change in vibration levels that can be considered acceptable relative to quieter machines.

The present disclosure further includes hierarchical relationships found in the vibrational data collected that can be used to support proper analysis of the data. One example of the hierarchical data includes the interconnection of mechanical componentry such as a bearing being measured in a vibration survey and the relationship between that bearing, including how that bearing connects to a particular shaft on which is mounted a specific pinion within a particular gearbox, and the relationship between the shaft, the pinion, and the gearbox. The hierarchical data can further include in what particular spot within a machinery gear train that the bearing being monitored is located relative to other components in the machine. The hierarchical data can also detail whether the bearing being measured in a machine is in close proximity to another machine whose vibrations may affect what is being measured in the machine that is the subject of the vibration study.

The analysis of the vibration data from the bearing or other components related to one another in the hierarchical data can use table lookups, searches for correlations between frequency patterns derived from the raw data, and specific frequencies from the metadata of the machine. In some embodiments, the above can be stored in and retrieved from a relational database. In embodiments, National Instrument's Technical Data Management Solution (TDMS) file format can be used. The TDMS file format can be optimized for streaming various types of measurement data (i.e., binary digital samples of waveforms), as well as also being able to handle hierarchical metadata.

The many embodiments include a hybrid relational metadata-binary storage approach (HRM-BSA). The HRM-BSA can include a structured query language (SQL) based relational database engine. The structured query language based relational database engine can also include a raw data engine that can be optimized for throughput and storage density for data that is flat and relatively structureless. It will be appreciated in light of the disclosure that benefits can be shown in the cooperation between the hierarchical metadata and the SQL relational database engine. In one example, marker technologies and pointer sign-posts can be used to make correlations between the raw database engine and the SQL relational database engine. Three examples of correlations between the raw database engine and the SQL relational database engine linkages include: (1) pointers from the SQL database to the raw data; (2) pointers from the ancillary metadata tables or similar grouping of the raw data to the SQL database; and (3) independent storage tables outside the domain of either the SQL database or raw data technologies.

Figure 13:
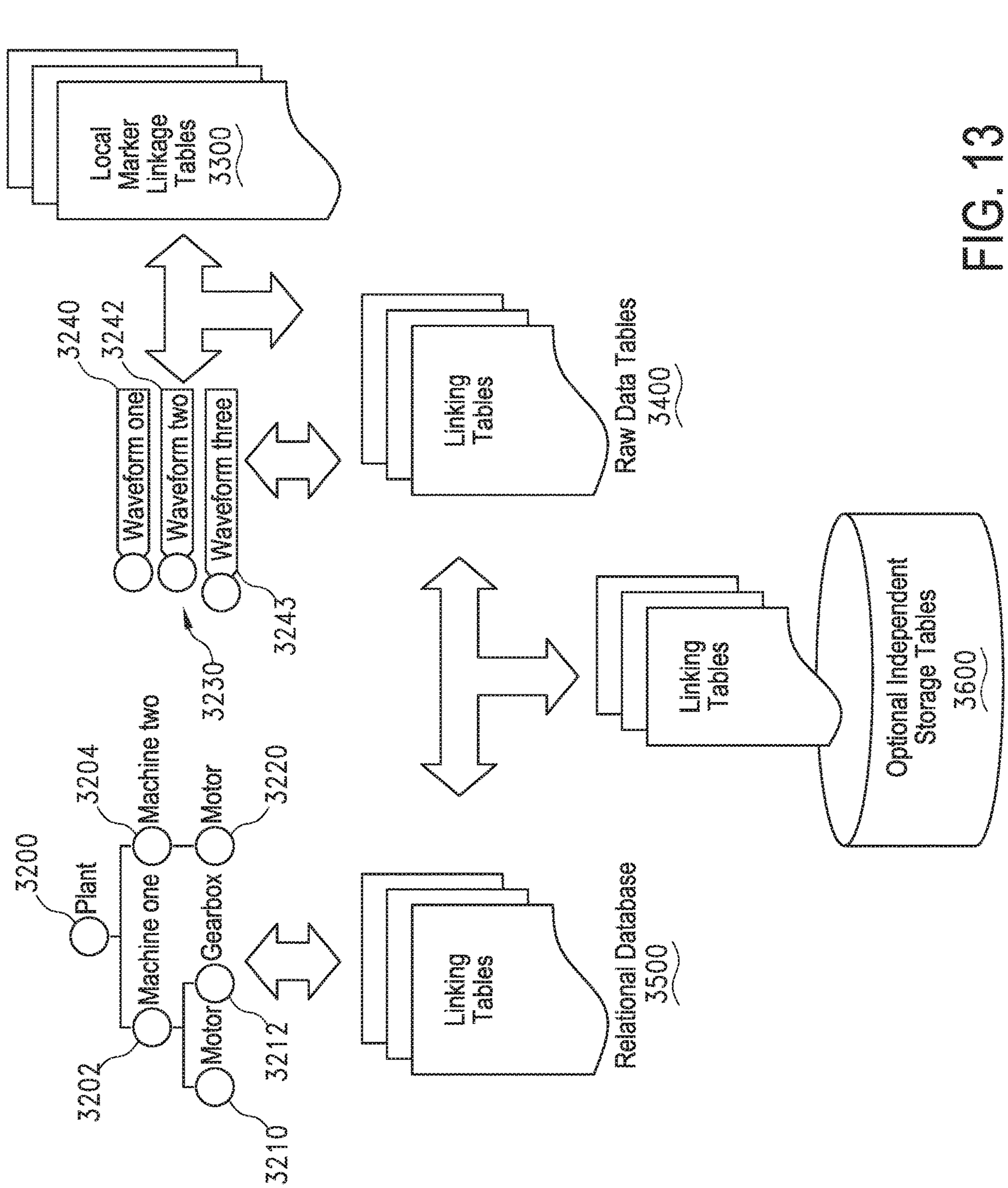
FIG. 13 is a diagrammatic view of hybrid relational metadata and a binary storage approach in accordance with the present disclosure.

With reference to FIG. 13, the present disclosure can include pointers for Group 1 and Group 2 that can include associated filenames, path information, table names, database key fields as employed with existing SQL database technologies that can be used to associate a specific database segments or locations, asset properties to specific measurement raw data streams, records with associated time/date stamps, or associated metadata such as operating parameters, panel conditions, and the like. By way of this example, a plant 3200 can include machine one 3202, machine two 3204, and many others in the plant 3200. The machine one 3202 can include a gearbox 3210, a motor 3212, and other elements. The machine two 3204 can include a motor 3220, and other elements. Many waveforms 3230 including waveform 3240, waveform 3242, waveform 3244, and additional waveforms as needed can be acquired from the machines 3202, 3204 in the plant 3200. The waveforms 3230 can be associated with the local marker linking tables 3300 and the linking raw data tables 3400. The machines 3202, 3204 and their elements can be associated with linking tables having relational databases 3500. The linking tables raw data tables 3400 and the linking tables having relational databases 3500 can be associated with the linking tables with optional independent storage tables 3600.

The present disclosure can include markers that can be applied to a time mark or a sample length within the raw waveform data. The markers generally fall into two categories: preset or dynamic. The preset markers can correlate to preset or existing operating conditions (e.g., load, head pressure, air flow cubic feet per minute, ambient temperature, RPMs, and the like). These preset markers can be fed into the data acquisition system directly. In certain instances, the preset markers can be collected on data channels in parallel with the waveform data (e.g., waveforms for vibration, current, voltage, etc.). Alternatively, the values for the preset markers can be entered manually.

For dynamic markers such as trending data, it can be important to compare similar data like comparing vibration amplitudes and patterns with a repeatable set of operating parameters. One example of the present disclosure includes one of the parallel channel inputs being a key phasor trigger pulse from an operating shaft that can provide RPM information at the instantaneous time of collection. In this example of dynamic markers, sections of collected waveform data can be marked with appropriate speeds or speed ranges.

The present disclosure can also include dynamic markers that can correlate to data that can be derived from post processing and analytics performed on the sample waveform. In further embodiments, the dynamic markers can also correlate to post-collection derived parameters including RPMs, as well as other operationally derived metrics such as alarm conditions like a maximum RPM. In certain examples, many modern pieces of equipment that are candidates for a vibration survey with the portable data collection systems described herein do not include tachometer information. This can be true because it is not always practical or cost-justifiable to add a tachometer even though the measurement of RPM can be of primary importance for the vibration survey and analysis. It will be appreciated that for fixed speed machinery obtaining an accurate RPM measurement can be less important especially when the approximate speed of the machine can be ascertained before-hand; however, variable-speed drives are becoming more and more prevalent. It will also be appreciated in light of the disclosure that various signal processing techniques can permit the derivation of RPM from the raw data without the need for a dedicated tachometer signal.

In many embodiments, the RPM information can be used to mark segments of the raw waveform data over its collection history. Further embodiments include techniques for collecting instrument data following a prescribed route of a vibration study. The dynamic markers can enable analysis and trending software to utilize multiple segments of the collection interval indicated by the markers (e.g., two minutes) as multiple historical collection ensembles, rather than just one as done in previous systems where route collection systems would historically store data for only one RPM setting. This could, in turn, be extended to any other operational parameter such as load setting, ambient temperature, and the like, as previously described. The dynamic markers, however, that can be placed in a type of index file pointing to the raw data stream can classify portions of the stream in homogenous entities that can be more readily compared to previously collected portions of the raw data stream The many embodiments include the hybrid relational metadata-binary storage approach that can use the best of pre-existing technologies for both relational and raw data streams. In embodiments, the hybrid relational metadata-binary storage approach can marry them together with a variety of marker linkages. The marker linkages can permit rapid searches through the relational metadata and can allow for more efficient analyses of the raw data using conventional SQL techniques with pre-existing technology. This can be shown to permit utilization of many of the capabilities, linkages, compatibilities, and extensions that conventional database technologies do not provide.

The marker linkages can also permit rapid and efficient storage of the raw data using conventional binary storage and data compression techniques. This can be shown to permit utilization of many of the capabilities, linkages, compatibilities, and extensions that conventional raw data technologies provide such as TDMS (National Instruments), UFF (Universal File Format such as UFF58), and the like. The marker linkages can further permit using the marker technology links where a vastly richer set of data from the ensembles can be amassed in the same collection time as more conventional systems. The richer set of data from the ensembles can store data snapshots associated with predetermined collection criterion and the proposed system can derive multiple snapshots from the collected data streams utilizing the marker technology. In doing so, it can be shown that a relatively richer analysis of the collected data can be achieved. One such benefit can include more trending points of vibration at a specific frequency or order of running speed versus RPM, load, operating temperature, flow rates, and the like, which can be collected for a similar time relative to what is spent collecting data with a conventional system.

In embodiments, the platform 100 may include the local data collection system 102 deployed in the environment 104 to monitor signals from machines, elements of the machines and the environment of the machines including heavy duty machines deployed at a local job site or at distributed job sites under common control. The heavy-duty machines may include earthmoving equipment, heavy duty on-road industrial vehicles, heavy duty off-road industrial vehicles, industrial machines deployed in various settings such as turbines, turbomachinery, generators, pumps, pulley systems, manifold and valve systems, and the like. In embodiments, heavy industrial machinery may also include earth-moving equipment, earth-compacting equipment, hauling equipment, hoisting equipment, conveying equipment, aggregate production equipment, equipment used in concrete construction, and piledriving equipment. In examples, earth moving equipment may include excavators, backhoes, loaders, bulldozers, skid steer loaders, trenchers, motor graders, motor scrapers, crawler loaders, and wheeled loading shovels. In examples, construction vehicles may include dumpers, tankers, tippers, and trailers. In examples, material handling equipment may include cranes, conveyors, forklift, and hoists. In examples, construction equipment may include tunnel and handling equipment, road rollers, concrete mixers, hot mix plants, road making machines (compactors), stone crashers, pavers, slurry seal machines, spraying and plastering machines, and heavy-duty pumps. Further examples of heavy industrial equipment may include different systems such as implement traction, structure, power train, control, and information. Heavy industrial equipment may include many different powertrains and combinations thereof to provide power for locomotion and to also provide power to accessories and onboard functionality. In each of these examples, the platform 100 may deploy the local data collection system 102 into the environment 104 in which these machines, motors, pumps, and the like, operate and directly connected integrated into each of the machines, motors, pumps, and the like.

In embodiments, the platform 100 may include the local data collection system 102 deployed in the environment 104 to monitor signals from machines in operation and machines in being constructed such as turbine and generator sets like Siemens™ SGT6-5000F™ gas turbine, an SST-900™ steam turbine, an SGen6-1000A™ generator, and an SGen6-100A™ generator, and the like. In embodiments, the local data collection system 102 may be deployed to monitor steam turbines as they rotate in the currents caused by hot water vapor that may be directed through the turbine but otherwise generated from a different source such as from gas-fired burners, nuclear cores, molten salt loops and the like. In these systems, the local data collection system 102 may monitor the turbines and the water or other fluids in a closed loop cycle in which water condenses and is then heated until it evaporates again. The local data collection system 102 may monitor the steam turbines separately from the fuel source deployed to heat the water to steam. In examples, working temperatures of steam turbines may be between 500 and 650° C. In many embodiments, an array of steam turbines may be arranged and configured for high, medium, and low pressure, so they may optimally convert the respective steam pressure into rotational movement.

The local data collection system 102 may also be deployed in a gas turbines arrangement and therefore not only monitor the turbine in operation but also monitor the hot combustion gases feed into the turbine that may be in excess of 1,500° C. Because these gases are much hotter than those in steam turbines, the blades may be cooled with air that may flow out of small openings to create a protective film or boundary layer between the exhaust gases and the blades. This temperature profile may be monitored by the local data collection system 102. Gas turbine engines, unlike typical steam turbines, include a compressor, a combustion chamber, and a turbine all of which are journaled for rotation with a rotating shaft. The construction and operation of each of these components may be monitored by the local data collection system 102.

In embodiments, the platform 100 may include the local data collection system 102 deployed in the environment 104 to monitor signals from water turbines serving as rotary engines that may harvest energy from moving water and are used for electric power generation. The type of water turbine or hydro-power selected for a project may be based on the height of standing water, often referred to as head, and the flow (or volume of water) at the site. In this example, a generator may be placed at the top of a shaft that connects to the water turbine. As the turbine catches the naturally moving water in its blade and rotates, the turbine sends rotational power to the generator to generate electrical energy. In doing so, the platform 100 may monitor signals from the generators, the turbines, the local water system, flow controls such as dam windows and sluices. Moreover, the platform 100 may monitor local conditions on the electric grid including load, predicted demand, frequency response, and the like, and include such information in the monitoring and control deployed by platform 100 in these hydroelectric settings.

In embodiments, the platform 100 may include the local data collection system 102 deployed in the environment 104 to monitor signals from energy production environments, such as thermal, nuclear, geothermal, chemical, biomass, carbon-based fuels, hybrid-renewable energy plants, and the like. Many of these plants may use multiple forms of energy harvesting equipment like wind turbines, hydro turbines, and steam turbines powered by heat from nuclear, gas-fired, solar, and molten salt heat sources. In embodiments, elements in such systems may include transmission lines, heat exchangers, desulphurization scrubbers, pumps, coolers, recuperators, chillers, and the like. In embodiments, certain implementations of turbomachinery, turbines, scroll compressors, and the like may be configured in arrayed control so as to monitor large facilities creating electricity for consumption, providing refrigeration, creating steam for local manufacture and heating, and the like, and that arrayed control platforms may be provided by the provider of the industrial equipment such as Honeywell and their Experion™ PKS platform. In embodiments, the platform 100 may specifically communicate with and integrate the local manufacturer-specific controls and may allow equipment from one manufacturer to communicate with other equipment. Moreover, the platform 100 provides allows for the local data collection system 102 to collect information across systems from many different manufacturers. In embodiments, the platform 100 may include the local data collection system 102 deployed in the environment 104 to monitor signals from marine industrial equipment, marine diesel engines, shipbuilding, oil and gas plants, refineries, petrochemical plant, ballast water treatment solutions, marine pumps and turbines, and the like.

In embodiments, the platform 100 may include the local data collection system 102 deployed in the environment 104 to monitor signals from heavy industrial equipment and processes including monitoring one or more sensors. By way of this example, sensors may be devices that may be used to detect or respond to some type of input from a physical environment, such as an electrical, heat, or optical signal. In embodiments, the local data collection system 102 may include multiple sensors such as, without limitation, a temperature sensor, a pressure sensor, a torque sensor, a flow sensor, a heat sensor, a smoke sensor, an arc sensor, a radiation sensor, a position sensor, an acceleration sensor, a strain sensor, a pressure cycle sensor, a pressure sensor, an air temperature sensor, and the like. The torque sensor may encompass a magnetic twist angle sensor. In one example, the torque and speed sensors in the local data collection system 102 may be similar to those discussed in U.S. Pat. No. 8,352,149 to Meachem, issued 8 Jan. 2013 and hereby incorporated by reference as if fully set forth herein. In embodiments, one or more sensors may be provided such as a tactile sensor, a biosensor, a chemical sensor, an image sensor, a humidity sensor, an inertial sensor, and the like.

In embodiments, the platform 100 may include the local data collection system 102 deployed in the environment 104 to monitor signals from sensors that may provide signals for fault detection including excessive vibration, incorrect material, incorrect material properties, trueness to the proper size, trueness to the proper shape, proper weight, trueness to balance. Additional fault sensors include those for inventory control and for inspections such as to confirm that parts are packaged to plan, parts are to tolerance in a plan, occurrence of packaging damage or stress, and sensors that may indicate the occurrence of shock or damage in transit. Additional fault sensors may include detection of the lack of lubrication, over lubrication, the need for cleaning of the sensor detection window, the need for maintenance due to low lubrication, the need for maintenance due to blocking or reduced flow in a lubrication region, and the like.

In embodiments, the platform 100 may include the local data collection system 102 deployed in the environment 104 that includes aircraft operations and manufacture including monitoring signals from sensors for specialized applications such as sensors used in an aircraft's Attitude and Heading Reference System (AHRS), such as gyroscopes, accelerometers, and magnetometers. In embodiments, the platform 100 may include the local data collection system 102 deployed in the environment 104 to monitor signals from image sensors such as semiconductor charge coupled devices (CCDs), active pixel sensors, in complementary metal-oxide-semiconductor (CMOS) or N-type metal-oxide-semiconductor (NMOS, Live MOS) technologies. In embodiments, the platform 100 may include the local data collection system 102 deployed in the environment 104 to monitor signals from sensors such as an infrared (IR) sensor, an ultraviolet (UV) sensor, a touch sensor, a proximity sensor, and the like. In embodiments, the platform 100 may include the local data collection system 102 deployed in the environment 104 to monitor signals from sensors configured for optical character recognition (OCR), reading barcodes, detecting surface acoustic waves, detecting transponders, communicating with home automation systems, medical diagnostics, health monitoring, and the like.

In embodiments, the platform 100 may include the local data collection system 102 deployed in the environment 104 to monitor signals from sensors such as a Micro-Electro-Mechanical Systems (MEMS) sensor, such as ST Microelectronic's™ LSM303AH smart MEMS sensor, which may include an ultra-low-power high-performance system-in-package featuring a 3D digital linear acceleration sensor and a 3D digital magnetic sensor.

In embodiments, the platform 100 may include the local data collection system 102 deployed in the environment 104 to monitor signals from additional large machines such as turbines, windmills, industrial vehicles, robots, and the like. These large mechanical machines include multiple components and elements providing multiple subsystems on each machine. To that end, the platform 100 may include the local data collection system 102 deployed in the environment 104 to monitor signals from individual elements such as axles, bearings, belts, buckets, gears, shafts, gear boxes, cams, carriages, camshafts, clutches, brakes, drums, dynamos, feeds, flywheels, gaskets, pumps, jaws, robotic arms, seals, sockets, sleeves, valves, wheels, actuators, motors, servomotor, and the like. Many of the machines and their elements may include servomotors. The local data collection system 102 may monitor the motor, the rotary encoder, and the potentiometer of the servomechanism to provide three-dimensional detail of position, placement, and progress of industrial processes.

In embodiments, the platform 100 may include the local data collection system 102 deployed in the environment 104 to monitor signals from gear drives, powertrains, transfer cases, multispeed axles, transmissions, direct drives, chain drives, belt-drives, shaft-drives, magnetic drives, and similar meshing mechanical drives. In embodiments, the platform 100 may include the local data collection system 102 deployed in the environment 104 to monitor signals from fault conditions of industrial machines that may include overheating, noise, grinding gears, locked gears, excessive vibration, wobbling, under-inflation, over-inflation, and the like. Operation faults, maintenance indicators, and interactions from other machines may cause maintenance or operational issues may occur during operation, during installation, and during maintenance. The faults may occur in the mechanisms of the industrial machines but may also occur in infrastructure that supports the machine such as its wiring and local installation platforms. In embodiments, the large industrial machines may face different types of fault conditions such as overheating, noise, grinding gears, excessive vibration of machine parts, fan vibration problems, problems with large industrial machines rotating parts.

In embodiments, the platform 100 may include the local data collection system 102 deployed in the environment 104 to monitor signals from industrial machinery including failures that may be caused by premature bearing failure that may occur due to contamination or loss of bearing lubricant. In another example, a mechanical defect such as misalignment of bearings may occur. Many factors may contribute to the failure such as metal fatigue, therefore, the local data collection system 102 may monitor cycles and local stresses. By way of this example, the platform 100 may monitor the incorrect operation of machine parts, lack of maintenance and servicing of parts, corrosion of vital machine parts, such as couplings or gearboxes, misalignment of machine parts, and the like. Though the fault occurrences cannot be completely stopped, many industrial breakdowns may be mitigated to reduce operational and financial losses. The platform 100 provides real-time monitoring and predictive maintenance in many industrial environments wherein it has been shown to present a cost-savings over regularly-scheduled maintenance processes that replace parts according to a rigid expiration of time and not actual load and wear and tear on the element or machine. To that end, the platform 10 may provide reminders of, or perform some, preventive measures such as adhering to operating manual and mode instructions for machines, proper lubrication, and maintenance of machine parts, minimizing or eliminating overrun of machines beyond their defined capacities, replacement of worn but still functional parts as needed, properly training the personnel for machine use, and the like.

In embodiments, the platform 100 may include the local data collection system 102 deployed in the environment 104 to monitor multiple signals that may be carried by a plurality of physical, electronic, and symbolic formats or signals. The platform 100 may employ signal processing including a plurality of mathematical, statistical, computational, heuristic, and linguistic representations and processing of signals and a plurality of operations needed for extraction of useful information from signal processing operations such as techniques for representation, modeling, analysis, synthesis, sensing, acquisition, and extraction of information from signals. In examples, signal processing may be performed using a plurality of techniques, including but not limited to transformations, spectral estimations, statistical operations, probabilistic and stochastic operations, numerical theory analysis, data mining, and the like. The processing of various types of signals forms the basis of many electrical or computational process. As a result, signal processing applies to almost all disciplines and applications in the industrial environment such as audio and video processing, image processing, wireless communications, process control, industrial automation, financial systems, feature extraction, quality improvements such as noise reduction, image enhancement, and the like. Signal processing for images may include pattern recognition for manufacturing inspections, quality inspection, and automated operational inspection and maintenance. The platform 100 may employ many pattern recognition techniques including those that may classify input data into classes based on key features with the objective of recognizing patterns or regularities in data. The platform 100 may also implement pattern recognition processes with machine learning operations and may be used in applications such as computer vision, speech and text processing, radar processing, handwriting recognition, CAD systems, and the like. The platform 100 may employ supervised classification and unsupervised classification. The supervised learning classification algorithms may be based to create classifiers for image or pattern recognition, based on training data obtained from different object classes. The unsupervised learning classification algorithms may operate by finding hidden structures in unlabeled data using advanced analysis techniques such as segmentation and clustering. For example, some of the analysis techniques used in unsupervised learning may include K-means clustering, Gaussian mixture models, Hidden Markov models, and the like. The algorithms used in supervised and unsupervised learning methods of pattern recognition enable the use of pattern recognition in various high precision applications. The platform 100 may use pattern recognition in face detection related applications such as security systems, tracking, sports related applications, fingerprint analysis, medical and forensic applications, navigation and guidance systems, vehicle tracking, public infrastructure systems such as transport systems, license plate monitoring, and the like.

In embodiments, the platform 100 may include the local data collection system 102 deployed in the environment 104 using machine learning to enable derivation-based learning outcomes from computers without the need to program them. The platform 100 may, therefore, learn from and make decisions on a set of data, by making data-driven predictions and adapting according to the set of data. In embodiments, machine learning may involve performing a plurality of machine learning tasks by machine learning systems, such as supervised learning, unsupervised learning, and reinforcement learning. Supervised learning may include presenting a set of example inputs and desired outputs to the machine learning systems. Unsupervised learning may include the learning algorithm itself structuring its input by methods such as pattern detection and/or feature learning. Reinforcement learning may include the machine learning systems performing in a dynamic environment and then providing feedback about correct and incorrect decisions. In examples, machine learning may include a plurality of other tasks based on an output of the machine learning system. In examples, the tasks may also be classified as machine learning problems such as classification, regression, clustering, density estimation, dimensionality reduction, anomaly detection, and the like. In examples, machine learning may include a plurality of mathematical and statistical techniques. In examples, the many types of machine learning algorithms may include decision tree based learning, association rule learning, deep learning, artificial neural networks, genetic learning algorithms, inductive logic programming, support vector machines (SVMs), Bayesian network, reinforcement learning, representation learning, rule-based machine learning, sparse dictionary learning, similarity and metric learning, learning classifier systems (LCS), logistic regression, random forest, K-Means, gradient boost and adaboost, K-nearest neighbors (KNN), a priori algorithms, and the like. In embodiments, certain machine learning algorithms may be used (such as genetic algorithms defined for solving both constrained and unconstrained optimization problems that may be based on natural selection, the process that drives biological evolution). By way of this example, genetic algorithms may be deployed to solve a variety of optimization problems that are not well suited for standard optimization algorithms, including problems in which the objective functions are discontinuous, not differentiable, stochastic, or highly nonlinear. In an example, the genetic algorithm may be used to address problems of mixed integer programming, where some components restricted to being integer-valued. Genetic algorithms and machine learning techniques and systems may be used in computational intelligence systems, computer vision, Natural Language Processing (NLP), recommender systems, reinforcement learning, building graphical models, and the like. By way of this example, the machine learning systems may be used to perform intelligent computing based control and be responsive to tasks in a wide variety of systems (such as interactive websites and portals, brain-machine interfaces, online security and fraud detection systems, medical applications such as diagnosis and therapy assistance systems, classification of DNA sequences, and the like). In examples, machine learning systems may be used in advanced computing applications (such as online advertising, natural language processing, robotics, search engines, software engineering, speech and handwriting recognition, pattern matching, game playing, computational anatomy, bioinformatics systems and the like). In an example, machine learning may also be used in financial and marketing systems (such as for user behavior analytics, online advertising, economic estimations, financial market analysis, and the like).

Additional details are provided below in connection with the methods, systems, devices, and components depicted in connection with FIGS. 1 through 6. In embodiments, methods and systems are disclosed herein for cloud-based, machine pattern recognition based on fusion of remote, analog industrial sensors. For example, data streams from vibration, pressure, temperature, accelerometer, magnetic, electrical field, and other analog sensors may be multiplexed or otherwise fused, relayed over a network, and fed into a cloud-based machine learning facility, which may employ one or more models relating to an operating characteristic of an industrial machine, an industrial process, or a component or element thereof. A model may be created by a human who has experience with the industrial environment and may be associated with a training data set (such as models created by human analysis or machine analysis of data that is collected by the sensors in the environment, or sensors in other similar environments. The learning machine may then operate on other data, initially using a set of rules or elements of a model, such as to provide a variety of outputs, such as classification of data into types, recognition of certain patterns (such as those indicating the presence of faults, orthoses indicating operating conditions, such as fuel efficiency, energy production, or the like). The machine learning facility may take feedback, such as one or more inputs or measures of success, such that it may train, or improve, its initial model (such as improvements by adjusting weights, rules, parameters, or the like, based on the feedback). For example, a model of fuel consumption by an industrial machine may include physical model parameters that characterize weights, motion, resistance, momentum, inertia, acceleration, and other factors that indicate consumption, and chemical model parameters (such as those that predict energy produced and/or consumed e.g., such as through combustion, through chemical reactions in battery charging and discharging, and the like). The model may be refined by feeding in data from sensors disposed in the environment of a machine, in the machine, and the like, as well as data indicating actual fuel consumption, so that the machine can provide increasingly accurate, sensor-based, estimates of fuel consumption and can also provide output that indicate what changes can be made to increase fuel consumption (such as changing operation parameters of the machine or changing other elements of the environment, such as the ambient temperature, the operation of a nearby machine, or the like). For example, if a resonance effect between two machines is adversely affecting one of them, the model may account for this and automatically provide an output that results in changing the operation of one of the machines (such as to reduce the resonance, to increase fuel efficiency of one or both machines). By continuously adjusting parameters to cause outputs to match actual conditions, the machine learning facility may self-organize to provide a highly accurate model of the conditions of an environment (such as for predicting faults, optimizing operational parameters, and the like). This may be used to increase fuel efficiency, to reduce wear, to increase output, to increase operating life, to avoid fault conditions, and for many other purposes.

Figure 14:
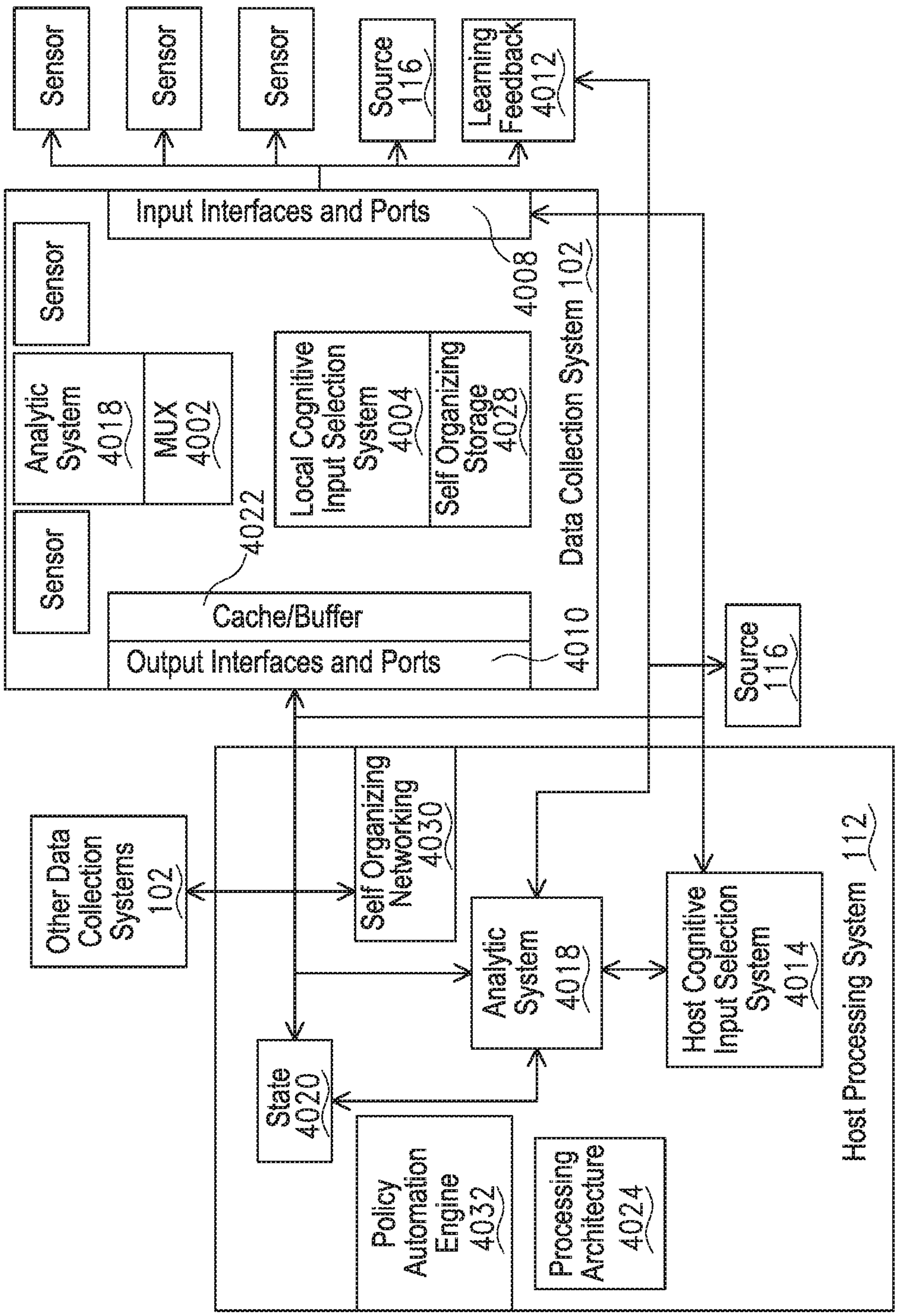
FIG. 14 is a diagrammatic view of components and interactions of a data collection architecture involving application of cognitive and machine learning systems to data collection and processing in accordance with the present disclosure.

FIG. 14 illustrates components and interactions of a data collection architecture involving the application of cognitive and machine learning systems to data collection and processing. Referring to FIG. 14, a data collection system 102 may be disposed in an environment (such as an industrial environment where one or more complex systems, such as electro-mechanical systems and machines are manufactured, assembled, or operated). The data collection system 102 may include onboard sensors and may take input, such as through one or more input interfaces or ports 4008, from one or more sensors (such as analog or digital sensors of any type disclosed herein) and from one or more input sources 116 (such as sources that may be available through Wi-Fi, Bluetooth, NFC, or other local network connections or over the Internet). Sensors may be combined and multiplexed (such as with one or more multiplexers 4002). Data may be cached or buffered in a cache/buffer 4022 and made available to external systems, such as a remote host processing system 112 as described elsewhere in this disclosure (which may include an extensive processing architecture 4024, including any of the elements described in connection with other embodiments described throughout this disclosure and in the Figure), though one or more output interfaces and ports 4010 (which may in embodiments be separate from or the same as the input interfaces and ports 4008). The data collection system 102 may be configured to take input from a host processing system 112, such as input from an analytic system 4018, which may operate on data from the data collection system 102 and data from other input sources 116 to provide analytic results, which in turn may be provided as a learning feedback input 4012 to the data collection system, such as to assist in configuration and operation of the data collection system 102.

Combination of inputs (including selection of what sensors or input sources to turn "on" or "off") may be performed under the control of machine-based intelligence, such as using a local cognitive input selection system 4004, an optionally remote cognitive input selection system 4114, or a combination of the two. The cognitive input selection systems 4004, 4014 may use intelligence and machine learning capabilities described elsewhere in this disclosure, such as using detected conditions (such as conditions informed by the input sources 116 or sensors), state information (including state information determined by a machine state recognition system 4020 that may determine a state), such as relating to an operational state, an environmental state, a state within a known process or workflow, a state involving a fault or diagnostic condition, or many others. This may include optimization of input selection and configuration based on learning feedback from the learning feedback system 4012, which may include providing training data (such as from the host processing system 112 or from other data collection systems 102 either directly or from the host 112) and may include providing feedback metrics, such as success metrics calculated within the analytic system 4018 of the host processing system 112. For example, if a data stream consisting of a particular combination of sensors and inputs yields positive results in a given set of conditions (such as providing improved pattern recognition, improved prediction, improved diagnosis, improved yield, improved return on investment, improved efficiency, or the like), then metrics relating to such results from the analytic system 4018 can be provided via the learning feedback system 4012 to the cognitive input selection systems 4004, 4014 to help configure future data collection to select that combination in those conditions (allowing other input sources to be de-selected, such as by powering down the other sensors). In embodiments, selection and de-selection of sensor combinations, under control of one or more of the cognitive input selection systems 4004, may occur with automated variation, such as using genetic programming techniques, based on learning feedback 4012, such as from the analytic system 4018, effective combinations for a given state or set of conditions are promoted, and less effective combinations are demoted, resulting in progressive optimization and adaptation of the local data collection system to each unique environment. Thus, an automatically adapting, multi-sensor data collection system is provided, where cognitive input selection is used (with feedback) to improve the effectiveness, efficiency, or other performance parameters of the data collection system within its particular environment. Performance parameters may relate to overall system metrics (such as financial yields, process optimization results, energy production or usage, and the like), analytic metrics (such as success in recognizing patterns, making predictions, classifying data, or the like), and local system metrics (such as bandwidth utilization, storage utilization, power consumption, and the like). In embodiments, the analytic system 4018, the state system 4020 and the cognitive input selection system 4114 of a host may take data from multiple data collection systems 102, such that optimization (including of input selection) may be undertaken through coordinated operation of multiple systems 102. For example, the cognitive input selection system 4114 may understand that if one data collection system 102 is already collecting vibration data for an X-axis, the X-axis vibration sensor for the other data collection system might be turned off, in favor of getting Y-axis data from the other data collector 102. Thus, through coordinated collection by the host cognitive input selection system 4114, the activity of multiple collectors 102, across a host of different sensors, can provide for a rich data set for the host processing system 112, without wasting energy, bandwidth, storage space, or the like. As noted above, optimization may be based on overall system success metrics, analytic success metrics, and local system metrics, or a combination of the above.

Methods and systems are disclosed herein for cloud-based, machine pattern analysis of state information from multiple industrial sensors to provide anticipated state information for an industrial system. In embodiments, machine learning may take advantage of a state machine, such as tracking states of multiple analog and/or digital sensors, feeding the states into a pattern analysis facility, and determining anticipated states of the industrial system based on historical data about sequences of state information. For example, where a temperature state of an industrial machine exceeds a certain threshold and is followed by a fault condition, such as breaking down of a set of bearings, that temperature state may be tracked by a pattern recognizer, which may produce an output data structure indicating an anticipated bearing fault state (whenever an input state of a high temperature is recognized). A wide range of measurement values and anticipated states may be managed by a state machine, relating to temperature, pressure, vibration, acceleration, momentum, inertia, friction, heat, heat flux, galvanic states, magnetic field states, electrical field states, capacitance states, charge and discharge states, motion, position, and many others. States may comprise combined states, where a data structure includes a series of states, each of which is represented by a place in a byte-like data structure. For example, an industrial machine may be characterized by a genetic structure, such as one that provides pressure, temperature, vibration, and acoustic data, the measurement of which takes one place in the data structure, so that the combined state can be operated on as a byte-like structure, such as a structure for compactly characterizing the current combined state of the machine or environment, or compactly characterizing the anticipated state. This byte-like structure can be used by a state machine for machine learning, such as pattern recognition that operates on the structure to determine patterns that reflect combined effects of multiple conditions. A wide variety of such structure can be tracked and used, such as in machine learning, representing various combinations, of various length, of the different elements that can be sensed in an industrial environment. In embodiments, byte-like structures can be used in a genetic programming technique, such as by substituting different types of data, or data from varying sources, and tracking outcomes over time, so that one or more favorable structures emerges based on the success of those structures when used in real world situations, such as indicating successful predictions of anticipated states, or achievement of success operational outcomes, such as increased efficiency, successful routing of information, achieving increased profits, or the like. That is, by varying what data types and sources are used in byte-like structures that are used for machine optimization over time, a genetic programming-based machine learning facility can “evolve” a set of data structures, consisting of a favorable mix of data types (e.g., pressure, temperature, and vibration), from a favorable mix of data sources (e.g., temperature is derived from sensor X, while vibration comes from sensor Y), for a given purpose. Different desired outcomes may result in different data structures that are best adapted to support effective achievement of those outcomes over time with application of machine learning and promotion of structures with favorable results for the desired outcome in question by genetic programming. The promoted data structures may provide compact, efficient data for various activities as described throughout this disclosure, including being stored in data pools (which may be optimized by storing favorable data structures that provide the best operational results for a given environment), being presented in data marketplaces (such as being presented as the most effective structures for a given purpose), and the like.

In embodiments, a platform is provided having cloud-based, machine pattern analysis of state information from multiple analog industrial sensors to provide anticipated state information for an industrial system. In embodiments, the host processing system 112, such as disposed in the cloud, may include the state system 4020, which may be used to infer or calculate a current state or to determine an anticipated future state relating to the data collection system 102 or some aspect of the environment in which the data collection system 102 is disposed, such as the state of a machine, a component, a workflow, a process, an event (e.g., whether the event has occurred), an object, a person, a condition, a function, or the like Maintaining state information allows the host processing system 112 to undertake analysis, such as in one or more analytic systems 4018, to determine contextual information, to apply semantic and conditional logic, and perform many other functions as enabled by the processing architecture 4024 described throughout this disclosure.

In embodiments, a platform is provided having cloud-based policy automation engine for IoT, with creation, deployment, and management of IoT devices. In embodiments, the platform 100 includes (or is integrated with, or included in) the host processing system 112, such as on a cloud platform, a policy automation engine 4032 for automating creation, deployment, and management of policies to IoT devices. Polices, which may include access policies, network usage policies, storage usage policies, bandwidth usage policies, device connection policies, security policies, rule-based policies, role-based polices, and others, may be required to govern the use of IoT devices. For example, as IoT devices may have many different network and data communications to other devices, policies may be needed to indicate to what devices a given device can connect, what data can be passed on, and what data can be received. As billions of devices with countless potential connections are expected to be deployed in the near future, it becomes impossible for humans to configure policies for IoT devices on a connection-by-connection basis. Accordingly, an intelligent policy automation engine 4032 may include cognitive features for creating, configuring, and managing policies. The policy automation engine 4032 may consume information about possible policies, such as from a policy database or library, which may include one or more public sources of available policies. These may be written in one or more conventional policy languages or scripts. The policy automation engine 4032 may apply the policies according to one or more models, such as based on the characteristics of a given device, machine, or environment. For example, a large machine, such as a machine for power generation, may include a policy that only a verifiably local controller can change certain parameters of the power generation, thereby avoiding a remote "takeover" by a hacker. This may be accomplished in turn by automatically finding and applying security policies that bar connection of the control infrastructure of the machine to the Internet, by requiring access authentication, or the like. The policy automation engine 4032 may include cognitive features, such as varying the application of policies, the configuration of policies, and the like (such as features based on state information from the state system 4020). The policy automation engine 4032 may take feedback, as from the learning feedback system 4012, such as based on one or more analytic results from the analytic system 4018, such as based on overall system results (such as the extent of security breaches, policy violations, and the like), local results, and analytic results. By variation and selection based on such feedback, the policy automation engine 4032 can, over time, learn to automatically create, deploy, configure, and manage policies across very large numbers of devices, such as managing policies for configuration of connections among IoT devices.

Methods and systems are disclosed herein for on-device sensor fusion and data storage for industrial IoT devices, including on-device sensor fusion and data storage for an industrial IoT device, where data from multiple sensors is multiplexed at the device for storage of a fused data stream. For example, pressure and temperature data may be multiplexed into a data stream that combines pressure and temperature in a time series, such as in a byte-like structure (where time, pressure, and temperature are bytes in a data structure, so that pressure and temperature remain linked in time, without requiring separate processing of the streams by outside systems), or by adding, dividing, multiplying, subtracting, or the like, such that the fused data can be stored on the device. Any of the sensor data types described throughout this disclosure can be fused in this manner and stored in a local data pool, in storage, or on an IoT device, such as a data collector, a component of a machine, or the like.

In embodiments, a platform is provided having on-device sensor fusion and data storage for industrial IoT devices. In embodiments, a cognitive system is used for a self-organizing storage system 4028 for the data collection system 102. Sensor data, and in particular analog sensor data, can consume large amounts of storage capacity, in particular where a data collector 102 has multiple sensor inputs onboard or from the local environment. Simply storing all the data indefinitely is not typically a favorable option, and even transmitting all of the data may strain bandwidth limitations, exceed bandwidth permissions (such as exceeding cellular data plan capacity), or the like. Accordingly, storage strategies are needed. These typically include capturing only portions of the data (such as snapshots), storing data for limited time periods, storing portions of the data (such as intermediate or abstracted forms), and the like. With many possible selections among these and other options, determining the correct storage strategy may be highly complex. In embodiments, the self-organizing storage system 4028 may use a cognitive system, based on learning feedback 4012, and use various metrics from the analytic system 4018 or other system of the host cognitive input selection system 4114, such as overall system metrics, analytic metrics, and local performance indicators. The self-organizing storage system 4028 may automatically vary storage parameters, such as storage locations (including local storage on the data collection system 102, storage on nearby data collection systems 102 (such as using peer-to-peer organization) and remote storage, such as network-based storage), storage amounts, storage duration, type of data stored (including individual sensors or input sources 116, as well as various combined or multiplexed data, such as selected under the cognitive input selection systems 4004, 4014), storage type (such as using RAM, Flash, or other short-term memory versus available hard drive space), storage organization (such as in raw form, in hierarchies, and the like), and others. Variation of the parameters may be undertaken with feedback, so that over time the data collection system 102 adapts its storage of data to optimize itself to the conditions of its environment, such as a particular industrial environment, in a way that results in its storing the data that is needed in the right amounts and of the right type for availability to users.

In embodiments, the local cognitive input selection system 4004 may organize fusion of data for various onboard sensors, external sensors (such as in the local environment) and other input sources 116 to the local collection system 102 into one or more fused data streams, such as using the multiplexer 4002 to create various signals that represent combinations, permutations, mixes, layers, abstractions, data-metadata combinations, and the like of the source analog and/or digital data that is handled by the data collection system 102. The selection of a particular fusion of sensors may be determined locally by the cognitive input selection system 4004, such as based on learning feedback from the learning feedback system 4012, such as various overall system, analytic system and local system results and metrics. In embodiments, the system may learn to fuse particular combinations and permutations of sensors, such as in order to best achieve correct anticipation of state, as indicated by feedback of the analytic system 4018 regarding its ability to predict future states, such as the various states handled by the state system 4020. For example, the input selection system 4004 may indicate selection of a sub-set of sensors among a larger set of available sensors, and the inputs from the selected sensors may be combined, such as by placing input from each of them into a byte of a defined, multi-bit data structure (such as a combination by taking a signal from each at a given sampling rate or time and placing the result into the byte structure, then collecting and processing the bytes over time), by multiplexing in the multiplexer 4002, such as a combination by additive mixing of continuous signals, and the like. Any of a wide range of signal processing and data processing techniques for combination and fusing may be used, including convolutional techniques, coercion techniques, transformation techniques, and the like. The particular fusion in question may be adapted to a given situation by cognitive learning, such as by having the cognitive input selection system 4004 learn, based on feedback 4012 from results (such as feedback conveyed by the analytic system 4018), such that the local data collection system 102 executes context-adaptive sensor fusion.

In embodiments, the analytic system 4018 may apply to any of a wide range of analytic techniques, including statistical and econometric techniques (such as linear regression analysis, use similarity matrices, heat map based techniques, and the like), reasoning techniques (such as Bayesian reasoning, rule-based reasoning, inductive reasoning, and the like), iterative techniques (such as feedback, recursion, feed-forward and other techniques), signal processing techniques (such as Fourier and other transforms), pattern recognition techniques (such as Kalman and other filtering techniques), search techniques, probabilistic techniques (such as random walks, random forest algorithms, and the like), simulation techniques (such as random walks, random forest algorithms, linear optimization and the like), and others. This may include computation of various statistics or measures. In embodiments, the analytic system 4018 may be disposed, at least in part, on a data collection system 102, such that a local analytic system can calculate one or more measures, such as measures relating to any of the items noted throughout this disclosure. For example, measures of efficiency, power utilization, storage utilization, redundancy, entropy, and other factors may be calculated onboard, so that the data collection 102 can enable various cognitive and learning functions noted throughout this disclosure without dependence on a remote (e.g., cloud-based) analytic system.

In embodiments, the host processing system 112, a data collection system 102, or both, may include, connect to, or integrate with, a self-organizing networking system 4020, which may comprise a cognitive system for providing machine-based, intelligent or organization of network utilization for transport of data in a data collection system, such as for handling analog and other sensor data, or other source data, such as among one or more local data collection systems 102 and a host system 112. This may include organizing network utilization for source data delivered to data collection systems, for feedback data, such as analytic data provided to or via a learning feedback system 4012, data for supporting a marketplace (such as described in connection with other embodiments), and output data provided via output interfaces and ports 4010 from one or more data collection systems 102.

Methods and systems are disclosed herein for a self-organizing data marketplace for industrial IoT data, including where available data elements are organized in the marketplace for consumption by consumers based on training a self-organizing facility with a training set and feedback from measures of marketplace success. A marketplace may be set up initially to make available data collected from one or more industrial environments, such as presenting data by type, by source, by environment, by machine, by one or more patterns, or the like (such as in a menu or hierarchy). The marketplace may vary the data collected, the organization of the data, the presentation of the data (including pushing the data to external sites, providing links, configuring APIs by which the data may be accessed, and the like), the pricing of the data, or the like, such as under machine learning, which may vary different parameters of any of the foregoing. The machine learning facility may manage all of these parameters by self-organization, such as by varying parameters over time (including by varying elements of the data types presented), the data sourced used to obtain each type of data, the data structures presented (such as byte-like structures, fused or multiplexed structures (such as representing multiple sensor types), and statistical structures (such as representing various mathematical products of sensor information), among others), the pricing for the data, where the data is presented, how the data is presented (such as by APIs, by links, by push messaging, and the like), how the data is stored, how the data is obtained, and the like. As parameters are varied, feedback may be obtained as to measures of success, such as number of views, yield (e.g., price paid) per access, total yield, per unit profit, aggregate profit, and many others, and the self-organizing machine learning facility may promote configurations that improve measures of success and demote configurations that do not, so that, over time, the marketplace is progressively configured to present favorable combinations of data types (e.g., those that provide robust prediction of anticipated states of particular industrial environments of a given type), from favorable sources (e.g., those that are reliable, accurate and low priced), with effective pricing (e.g., pricing that tends to provide high aggregate profit from the marketplace). The marketplace may include spiders, web crawlers, and the like to seek input data sources, such as finding data pools, connected IoT devices, and the like that publish potentially relevant data. These may be trained by human users and improved by machine learning in a manner similar to that described elsewhere in this disclosure.

Figure 15:
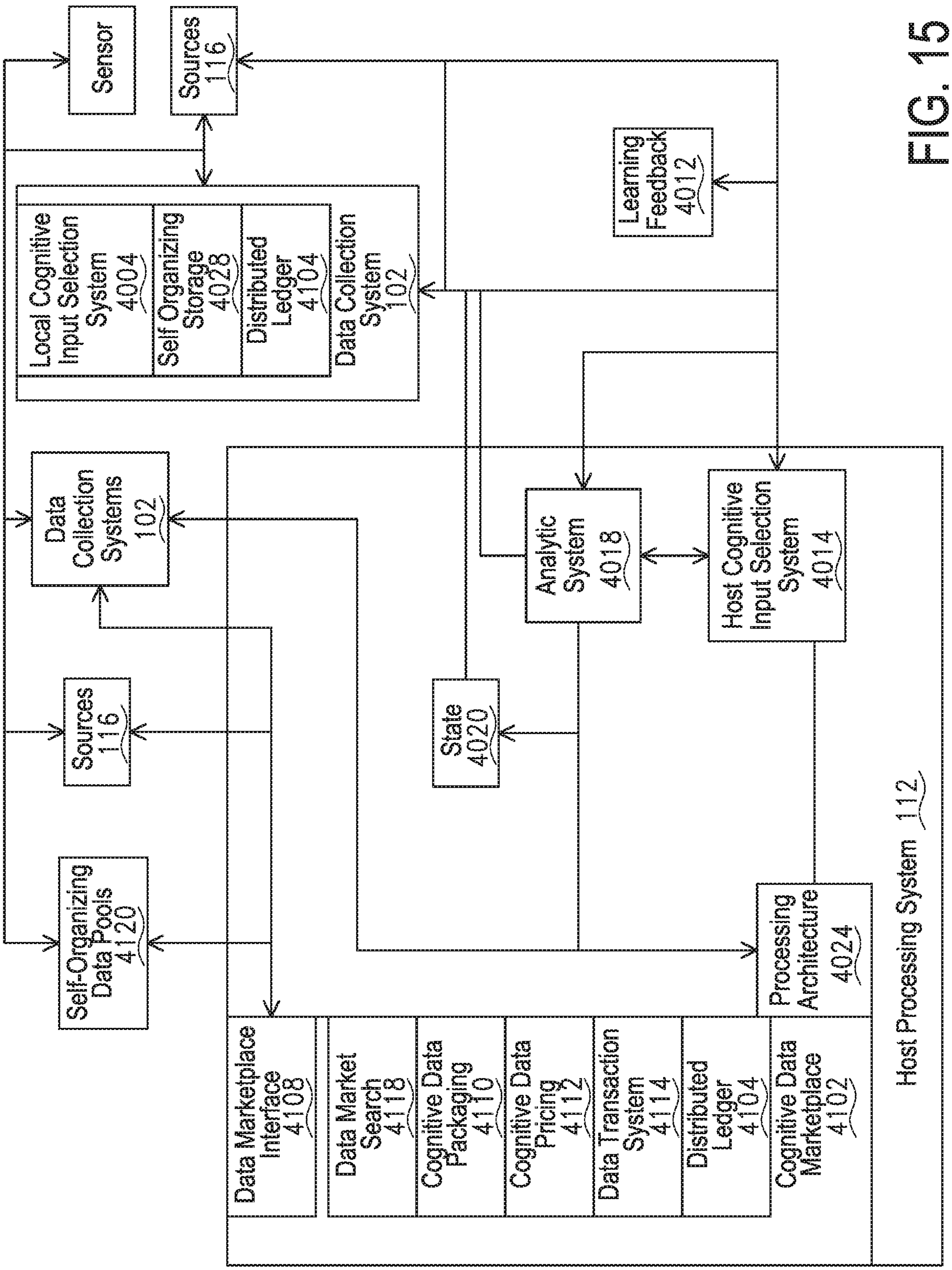
FIG. 15 is a diagrammatic view of components and interactions of a data collection architecture involving application of a platform having a cognitive data marketplace in accordance with the present disclosure.
Figure 16:
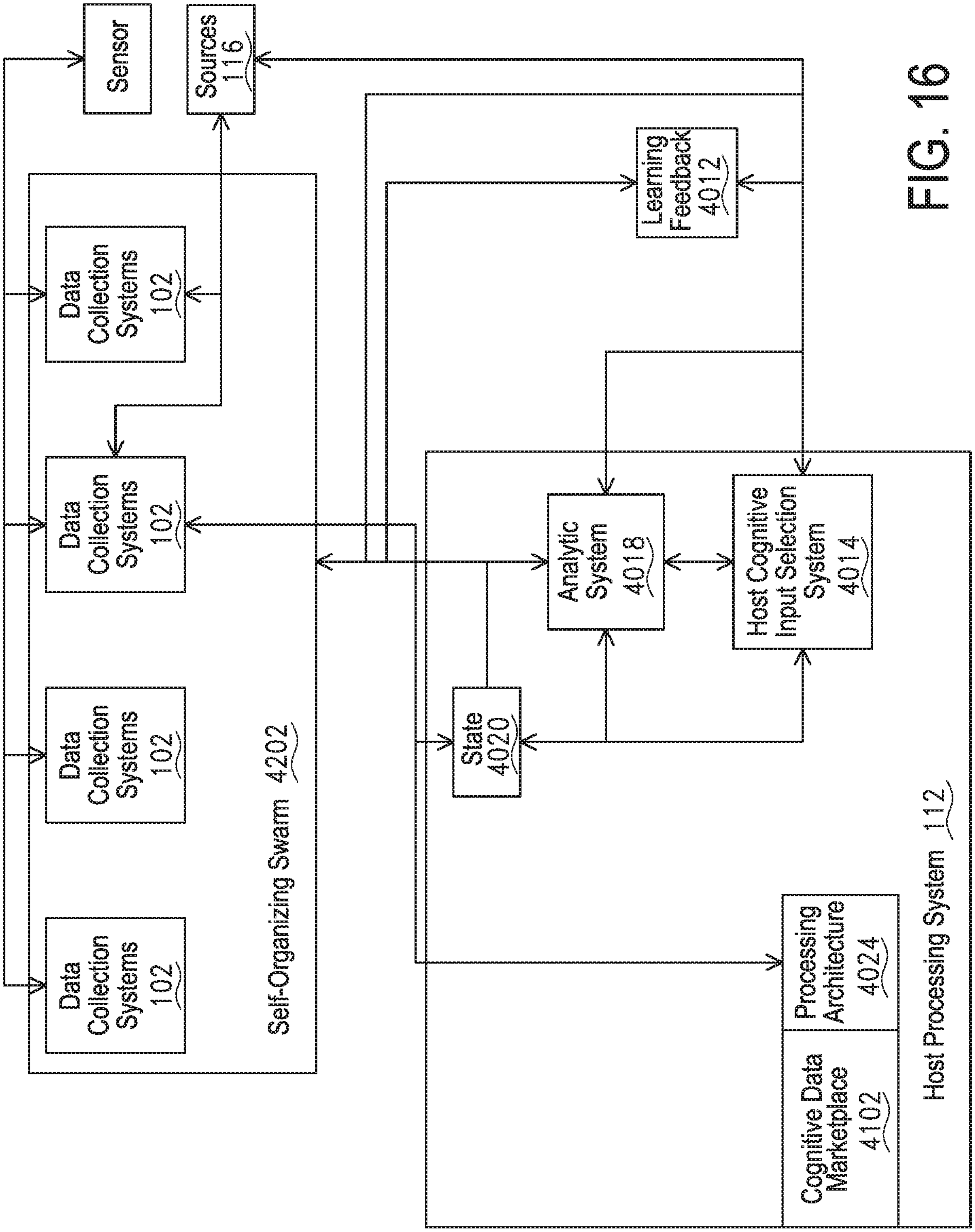
FIG. 16 is a diagrammatic view of components and interactions of a data collection architecture involving application of a self-organizing swarm of data collectors in accordance with the present disclosure.
Figure 17:
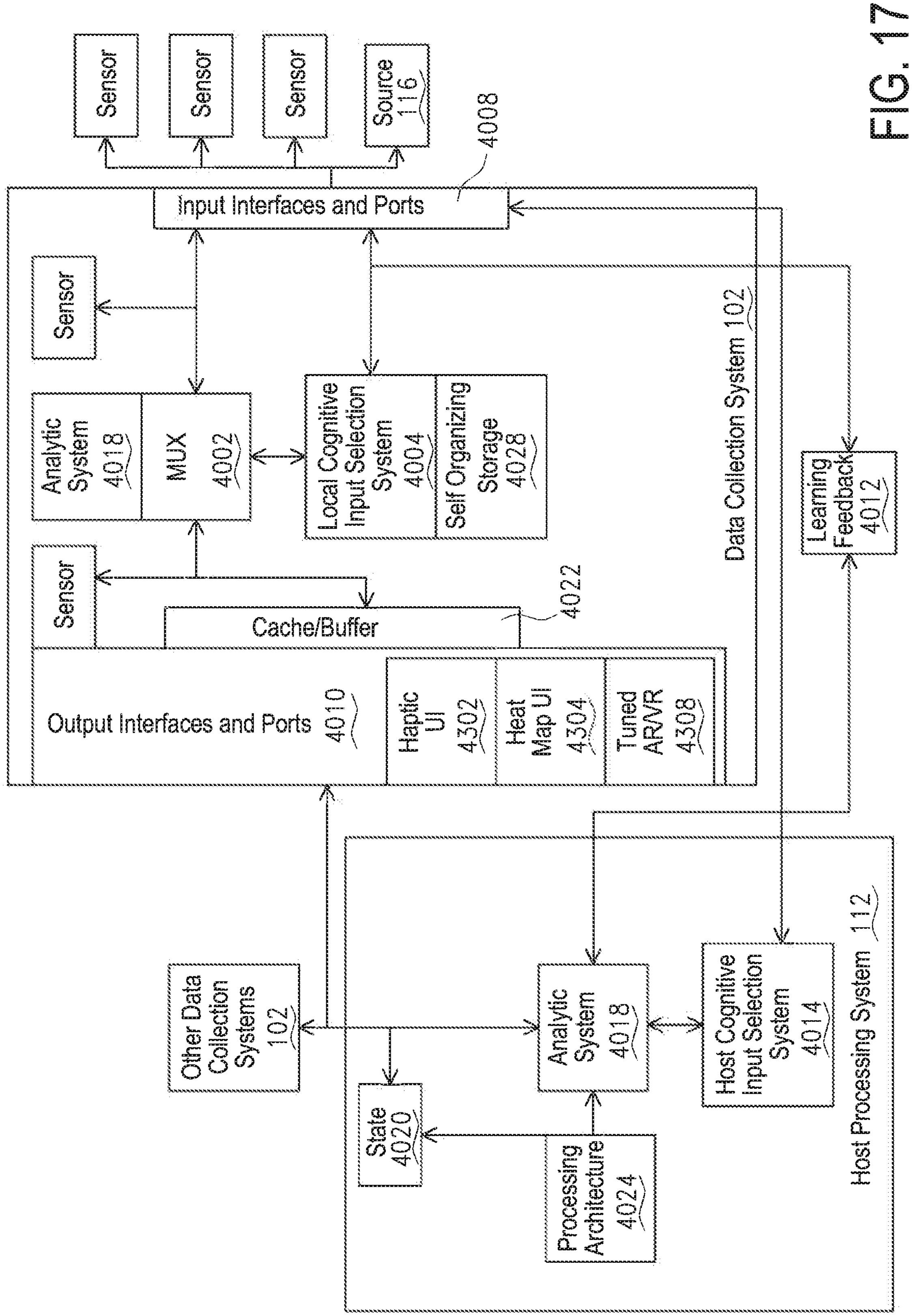
FIG. 17 is a diagrammatic view of components and interactions of a data collection architecture involving application of a haptic user interface in accordance with the present disclosure.

In embodiments, a platform is provided having a self-organizing data marketplace for industrial IoT data. Referring to FIG. 15, in embodiments, a platform is provided having a cognitive data marketplace 4102, referred to in some cases as a self-organizing data marketplace, for data collected by one or more data collection systems 102 or for data from other sensors or input sources 116 that are located in various data collection environments, such as industrial environments. In addition to data collection systems 102, this may include data collected, handled or exchanged by IoT devices, such as cameras, monitors, embedded sensors, mobile devices, diagnostic devices and systems, instrumentation systems, telematics systems, and the like, such as for monitoring various parameters and features of machines, devices, components, parts, operations, functions, conditions, states, events, workflows and other elements (collectively encompassed by the term "states") of such environments. Data may also include metadata about any of the foregoing, such as describing data, indicating provenance, indicating elements relating to identity, access, roles, and permissions, providing summaries or abstractions of data, or otherwise augmenting one or more items of data to enable further processing, such as for extraction, transforming, loading, and processing data. Such data (such term including metadata except where context indicates otherwise) may be highly valuable to third parties, either as an individual element (such as the instance where data about the state of an environment can be used as a condition within a process) or in the aggregate (such as the instance where collected data, optionally over many systems and devices in different environments can be used to develop models of behavior, to train learning systems, or the like). As billions of IoT devices are deployed, with countless connections, the amount of available data will proliferate. To enable access and utilization of data, the cognitive data marketplace 4102 enables various components, features, services, and processes for enabling users to supply, find, consume, and transact in packages of data, such as batches of data, streams of data (including event streams), data from various data pools 4120, and the like. In embodiments, the cognitive data marketplace 4102 may be included in, connected to, or integrated with, one or more other components of a host processing architecture 4024 of a host processing system 112, such as a cloud-based system, as well as to various sensors, input sources 115, data collection systems 102 and the like. The cognitive data marketplace 4102 may include marketplace interfaces 4108, which may include one or more supplier interfaces by which data suppliers may make data available and one more consumer interfaces by which data may be found and acquired. The consumer interface may include an interface to a data market search system 4118, which may include features that enable a user to indicate what types of data a user wishes to obtain, such as by entering keywords in a natural language search interface that characterize data or metadata. The search interface can use various search and filtering techniques, including keyword matching, collaborative filtering (such as using known preferences or characteristics of the consumer to match to similar consumers and the past outcomes of those other consumers), ranking techniques (such as ranking based on success of past outcomes according to various metrics, such as those described in connection with other embodiments in this disclosure). In embodiments, a supply interface may allow an owner or supplier of data to supply the data in one or more packages to and through the cognitive data marketplace 4102, such as packaging batches of data, streams of data, or the like. The supplier may pre-package data, such as by providing data from a single input source 116, a single sensor, and the like, or by providing combinations, permutations, and the like (such as multiplexed analog data, mixed bytes of data from multiple sources, results of extraction, loading and transformation, results of convolution, and the like), as well as by providing metadata with respect to any of the foregoing. Packaging may include pricing, such as on a per-batch basis, on a streaming basis (such as subscription to an event feed or other feed or stream), on a per item basis, on a revenue share basis, or other basis. For data involving pricing, a data transaction system 4114 may track orders, delivery, and utilization, including fulfillment of orders. The transaction system 4114 may include rich transaction features, including digital rights management, such as by managing cryptographic keys that govern access control to purchased data, that govern usage (such as allowing data to be used for a limited time, in a limited domain, by a limited set of users or roles, or for a limited purpose). The transaction system 4114 may manage payments, such as by processing credit cards, wire transfers, debits, and other forms of consideration.

In embodiments, a cognitive data packaging system 4012 of the marketplace 4102 may use machine-based intelligence to package data, such as by automatically configuring packages of data in batches, streams, pools, or the like. In embodiments, packaging may be according to one or more rules, models, or parameters, such as by packaging or aggregating data that is likely to supplement or complement an existing model. For example, operating data from a group of similar machines (such as one or more industrial machines noted throughout this disclosure) may be aggregated together, such as based on metadata indicating the type of data or by recognizing features or characteristics in the data stream that indicate the nature of the data. In embodiments, packaging may occur using machine learning and cognitive capabilities, such as by learning what combinations, permutations, mixes, layers, and the like of input sources 116, sensors, information from data pools 4120 and information from data collection systems 102 are likely to satisfy user requirements or result in measures of success. Learning may be based on learning feedback 4012, such as learning based on measures determined in an analytic system 4018, such as system performance measures, data collection measures, analytic measures, and the like. In embodiments, success measures may be correlated to marketplace success measures, such as viewing of packages, engagement with packages, purchase or licensing of packages, payments made for packages, and the like. Such measures may be calculated in an analytic system 4018, including associating particular feedback measures with search terms and other inputs, so that the cognitive packaging system 4110 can find and configure packages that are designed to provide increased value to consumers and increased returns for data suppliers. In embodiments, the cognitive data packaging system 4110 can automatically vary packaging, such as using different combinations, permutations, mixes, and the like, and varying weights applied to given input sources, sensors, data pools and the like, using learning feedback 4012 to promote favorable packages and de-emphasize less favorable packages. This may occur using genetic programming and similar techniques that compare outcomes for different packages. Feedback may include state information from the state system 4020 (such as about various operating states, and the like), as well as about marketplace conditions and states, such as pricing and availability information for other data sources. Thus, an adaptive cognitive data packaging system 4110 is provided that automatically adapts to conditions to provide favorable packages of data for the marketplace 4102.

In embodiments, a cognitive data pricing system 4112 may be provided to set pricing for data packages. In embodiments, the data pricing system 4112 may use a set of rules, models, or the like, such as setting pricing based on supply conditions, demand conditions, pricing of various available sources, and the like. For example, pricing for a package may be configured to be set based on the sum of the prices of constituent elements (such as input sources, sensor data, or the like), or to be set based on a rule-based discount to the sum of prices for constituent elements, or the like. Rules and conditional logic may be applied, such as rules that factor in cost factors (such as bandwidth and network usage, peak demand factors, scarcity factors, and the like), rules that factor in utilization parameters (such as the purpose, domain, user, role, duration, or the like for a package) and many others. In embodiments, the cognitive data pricing system 4112 may include fully cognitive, intelligent features, such as using genetic programming including automatically varying pricing and tracking feedback on outcomes. Outcomes on which tracking feedback may be based include various financial yield metrics, utilization metrics and the like that may be provided by calculating metrics in an analytic system 4018 on data from the data transaction system 4114.

Methods and systems are disclosed herein for self-organizing data pools which may include self-organization of data pools based on utilization and/or yield metrics, including utilization and/or yield metrics that are tracked for a plurality of data pools. The data pools may initially comprise unstructured or loosely structured pools of data that contain data from industrial environments, such as sensor data from or about industrial machines or components. For example, a data pool might take streams of data from various machines or components in an environment, such as turbines, compressors, batteries, reactors, engines, motors, vehicles, pumps, rotors, axles, bearings, valves, and many others, with the data streams containing analog and/or digital sensor data (of a wide range of types), data published about operating conditions, diagnostic and fault data, identifying data for machines or components, asset tracking data, and many other types of data. Each stream may have an identifier in the pool, such as indicating its source, and optionally its type. The data pool may be accessed by external systems, such as through one or more interfaces or APIs (e.g., RESTful APIs), or by data integration elements (such as gateways, brokers, bridges, connectors, or the like), and the data pool may use similar capabilities to get access to available data streams. A data pool may be managed by a self-organizing machine learning facility, which may configure the data pool, such as by managing what sources are used for the pool, managing what streams are available, and managing APIs or other connections into and out of the data pool. The self-organization may take feedback such as based on measures of success that may include measures of utilization and yield. The measures of utilization and yield that may include may account for the cost of acquiring and/or storing data, as well as the benefits of the pool, measured either by profit or by other measures that may include user indications of usefulness, and the like. For example, a self-organizing data pool might recognize that chemical and radiation data for an energy production environment are regularly accessed and extracted, while vibration and temperature data have not been used, in which case the data pool might automatically reorganize, such as by ceasing storage of vibration and/or temperature data, or by obtaining better sources of such data. This automated reorganization can also apply to data structures, such as promoting different data types, different data sources, different data structures, and the like, through progressive iteration and feedback.

In embodiments, a platform is provided having self-organization of data pools based on utilization and/or yield metrics. In embodiments, the data pools 4020 may be self-organizing data pools 4020, such as being organized by cognitive capabilities as described throughout this disclosure. The data pools 4020 may self-organize in response to learning feedback 4012, such as based on feedback of measures and results, including calculated in an analytic system 4018. Organization may include determining what data or packages of data to store in a pool (such as representing particular combinations, permutations, aggregations, and the like), the structure of such data (such as in flat, hierarchical, linked, or other structures), the duration of storage, the nature of storage media (such as hard disks, flash memory, SSDs, network-based storage, or the like), the arrangement of storage bits, and other parameters. The content and nature of storage may be varied, such that a data pool 4020 may learn and adapt, such as based on states of the host system 112, one or more data collection systems 102, storage environment parameters (such as capacity, cost, and performance factors), data collection environment parameters, marketplace parameters, and many others. In embodiments, pools 4020 may learn and adapt, such as by variation of the above and other parameters in response to yield metrics (such as return on investment, optimization of power utilization, optimization of revenue, and the like).

Methods and systems are disclosed herein for training AI models based on industry-specific feedback, including training an AI model based on industry-specific feedback that reflects a measure of utilization, yield, or impact, and where the AI model operates on sensor data from an industrial environment. As noted above, these models may include operating models for industrial environments, machines, workflows, models for anticipating states, models for predicting fault and optimizing maintenance, models for self-organizing storage (on devices, in data pools and/or in the cloud), models for optimizing data transport (such as for optimizing network coding, network-condition-sensitive routing, and the like), models for optimizing data marketplaces, and many others.

In embodiments, a platform is provided having training AI models based on industry-specific feedback. In embodiments, the various embodiments of cognitive systems disclosed herein may take inputs and feedback from industry-specific and domain-specific sources 116 (such as relating to optimization of specific machines, devices, components, processes, and the like). Thus, learning and adaptation of storage organization, network usage, combination of sensor and input data, data pooling, data packaging, data pricing, and other features (such as for a marketplace 4102 or for other purposes of the host processing system 112) may be configured by learning on the domain-specific feedback measures of a given environment or application, such as an application involving IoT devices (such as an industrial environment). This may include optimization of efficiency (such as in electrical, electromechanical, magnetic, physical, thermodynamic, chemical and other processes and systems), optimization of outputs (such as for production of energy, materials, products, services and other outputs), prediction, avoidance and mitigation of faults (such as in the aforementioned systems and processes), optimization of performance measures (such as returns on investment, yields, profits, margins, revenues and the like), reduction of costs (including labor costs, bandwidth costs, data costs, material input costs, licensing costs, and many others), optimization of benefits (such as relating to safety, satisfaction, health), optimization of work flows (such as optimizing time and resource allocation to processes), and others.

Methods and systems are disclosed herein for a self-organized swarm of industrial data collectors, including a self-organizing swarm of industrial data collectors that organize among themselves to optimize data collection based on the capabilities and conditions of the members of the swarm. Each member of the swarm may be configured with intelligence, and the ability to coordinate with other members. For example, a member of the swarm may track information about what data other members are handling, so that data collection activities, data storage, data processing, and data publishing can be allocated intelligently across the swarm, taking into account conditions of the environment, capabilities of the members of the swarm, operating parameters, rules (such as from a rules engine that governs the operation of the swarm), and current conditions of the members. For example, among four collectors, one that has relatively low current power levels (such as a low battery), might be temporarily allocated the role of publishing data, because it may receive a dose of power from a reader or interrogation device (such as an RFID reader) when it needs to publish the data. A second collector with good power levels and robust processing capability might be assigned more complex functions, such as processing data, fusing data, organizing the rest of the swarm (including self-organization under machine learning, such that the swarm is optimized over time, including by adjusting operating parameters, rules, and the like based on feedback), and the like. A third collector in the swarm with robust storage capabilities might be assigned the task of collecting and storing a category of data, such as vibration sensor data, that consumes considerable bandwidth. A fourth collector in the swarm, such as one with lower storage capabilities, might be assigned the role of collecting data that can usually be discarded, such as data on current diagnostic conditions, where only data on faults needs to be maintained and passed along. Members of a swarm may connect by peer-to-peer relationships by using a member as a "master" or "hub," or by having them connect in a series or ring, where each member passes along data (including commands) to the next, and is aware of the nature of the capabilities and commands that are suitable for the preceding and/or next member. The swarm may be used for allocation of storage across it (such as using memory of each memory as an aggregate data store. In these examples, the aggregate data store may support a distributed ledger, which may store transaction data, such as for transactions involving data collected by the swarm, transactions occurring in the industrial environment, or the like. In embodiments, the transaction data may also include data used to manage the swarm, the environment, or a machine or components thereof. The swarm may self-organize, either by machine learning capability disposed on one or more members of the swarm, or based on instructions from an external machine learning facility, which may optimize storage, data collection, data processing, data presentation, data transport, and other functions based on managing parameters that are relevant to each. The machine learning facility may start with an initial configuration and vary parameters of the swarm relevant to any of the foregoing (also including varying the membership of the swarm), such as iterating based on feedback to the machine learning facility regarding measures of success (such as utilization measures, efficiency measures, measures of success in prediction or anticipation of states, productivity measures, yield measures, profit measures, and others). Over time, the swarm may be optimized to a favorable configuration to achieve the desired measure of success for an owner, operator, or host of an industrial environment or a machine, component, or process thereof.

The swarm 4202 may be organized based on a hierarchical organization (such as where a master data collector 102 organizes and directs activities of one or more subservient data collectors 102), a collaborative organization (such as where decision-making for the organization of the swarm 4202 is distributed among the data collectors 102 (such as using various models for decision-making, such as voting systems, points systems, least-cost routing systems, prioritization systems, and the like), and the like.) In embodiments, one or more of the data collectors 102 may have mobility capabilities, such as in cases where a data collector is disposed on or in a mobile robot, drone, mobile submersible, or the like, so that organization may include the location and positioning of the data collectors 102. Data collection systems 102 may communicate with each other and with the host processing system 112, including sharing an aggregate allocated storage space involving storage on or accessible to one or more of the collectors (which in embodiment may be treated as a unified storage space even if physically distributed, such as using virtualization capabilities). Organization may be automated based on one or more rules, models, conditions, processes, or the like (such as embodied or executed by conditional logic), and organization may be governed by policies, such as handled by the policy engine. Rules may be based on industry, application- and domain-specific objects, classes, events, workflows, processes, and systems, such as by setting up the swarm 4202 to collect selected types of data at designated places and times, such as coordinated with the foregoing. For example, the swarm 4202 may assign data collectors 102 to serially collect diagnostic, sensor, instrumentation and/or telematic data from each of a series of machines that execute an industrial process (such as a robotic manufacturing process), such as at the time and location of the input to and output from each of those machines. In embodiments, self-organization may be cognitive, such as where the swarm varies one or more collection parameters and adapts the selection of parameters, weights applied to the parameters, or the like, over time. In examples, this may be in response to learning and feedback, such as from the learning feedback system 4012 that may be based on various feedback measures that may be determined by applying the analytic system 4018 (which in embodiments may reside on the swarm 4202, the host processing system 112, or a combination thereof) to data handled by the swarm 4202 or to other elements of the various embodiments disclosed herein (including marketplace elements and others). Thus, the swarm 4202 may display adaptive behavior, such as adapting to the current state 4020 or an anticipated state of its environment (accounting for marketplace behavior), behavior of various objects (such as IoT devices, machines, components, and systems), processes (including events, states, workflows, and the like), and other factors at a given time. Parameters that may be varied in a process of variation (such as in a neural net, self-organizing map, or the like), selection, promotion, or the like (such as those enabled by genetic programming or other AI-based techniques). Parameters that may be managed, varied, selected and adapted by cognitive, machine learning may include storage parameters (location, type, duration, amount, structure and the like across the swarm 4202), network parameters (such as how the swarm 4202 is organized, such as in mesh, peer-to-peer, ring, serial, hierarchical and other network configurations as well as bandwidth utilization, data routing, network protocol selection, network coding type, and other networking parameters), security parameters (such as settings for various security applications and services), location and positioning parameters (such as routing movement of mobile data collectors 102 to locations, positioning and orienting collectors 102 and the like relative to points of data acquisition, relative to each other, and relative to locations where network availability may be favorable, among others), input selection parameters (such as input selection among sensors, input sources 116 and the like for each collector 102 and for the aggregate collection), data combination parameters (such as those for sensor fusion, input combination, multiplexing, mixing, layering, convolution, and other combinations), power parameters (such as parameters based on power levels and power availability for one or more collectors 102 or other objects, devices, or the like), states (including anticipated states and conditions of the swarm 4202, individual collection systems 102, the host processing system 112 or one or more objects in an environment), events, and many others. Feedback may be based on any of the kinds of feedback described herein, such that over time the swarm may adapt to its current and anticipated situation to achieve a wide range of desired objectives.

Methods and systems are disclosed herein for an industrial IoT distributed ledger, including a distributed ledger supporting the tracking of transactions executed in an automated data marketplace for industrial IoT data. A distributed ledger may distribute storage across devices, using a secure protocol, such as those used for cryptocurrencies (such as the Blockchain™ protocol used to support the Bitcoin™ currency). A ledger or similar transaction record, which may comprise a structure where each successive member of a chain stores data for previous transactions, and a competition can be established to determine which of alternative data stored data structures is “best” (such as being most complete), can be stored across data collectors, industrial machines or components, data pools, data marketplaces, cloud computing elements, servers, and/or on the IT infrastructure of an enterprise (such as an owner, operator or host of an industrial environment or of the systems disclosed herein). The ledger or transaction may be optimized by machine learning, such as to provide storage efficiency, security, redundancy, or the like.

In embodiments, the cognitive data marketplace 4102 may use a secure architecture for tracking and resolving transactions, such as a distributed ledger 4104, wherein transactions in data packages are tracked in a chained, distributed data structure, such as a Blockchain™, allowing forensic analysis and validation where individual devices store a portion of the ledger representing transactions in data packages. The distributed ledger 4104 may be distributed to IoT devices, to data pools 4020, to data collection systems 102, and the like, so that transaction information can be verified without reliance on a single, central repository of information. The transaction system 4114 may be configured to store data in the distributed ledger 4104 and to retrieve data from it (and from constituent devices) in order to resolve transactions. Thus, a distributed ledger 4104 for handling transactions in data, such as for packages of IoT data, is provided. In embodiments, the self-organizing storage system 4028 may be used for optimizing storage of distributed ledger data, as well as for organizing storage of packages of data, such as IoT data, that can be presented in the marketplace 4102.

Methods and systems are disclosed herein for a network-sensitive collector, including a network condition-sensitive, self-organizing, multi-sensor data collector that can optimize based on bandwidth, quality of service, pricing and/or other network conditions. Network sensitivity can include awareness of the price of data transport (such as allowing the system to pull or push data during off-peak periods or within the available parameters of paid data plans), the quality of the network (such as to avoid periods where errors are likely), the quality of environmental conditions (such as delaying transmission until signal quality is good, such as when a collector emerges from a shielded environment, avoiding wasting use of power when seeking a signal when shielded, such as by large metal structures typically of industrial environments), and the like.

Methods and systems are disclosed herein for a remotely organized universal data collector that can power up and down sensor interfaces based on need and/or conditions identified in an industrial data collection environment. For example, interfaces can recognize what sensors are available and interfaces and/or processors can be turned on to take input from such sensors, including hardware interfaces that allow the sensors to plug in to the data collector, wireless data interfaces (such as where the collector can ping the sensor, optionally providing some power via an interrogation signal), and software interfaces (such as for handling particular types of data). Thus, a collector that is capable of handling various kinds of data can be configured to adapt to the particular use in a given environment. In embodiments, configuration may be automatic or under machine learning, which may improve configuration by optimizing parameters based on feedback measures over time.

Methods and systems are disclosed herein for self-organizing storage for a multi-sensor data collector, including self-organizing storage for a multi-sensor data collector for industrial sensor data. Self-organizing storage may allocate storage based on application of machine learning, which may improve storage configuration based on feedback measure over time. Storage may be optimized by configuring what data types are used (e.g., byte-like structures, structures representing fused data from multiple sensors, structures representing statistics or measures calculated by applying mathematical functions on data, and the like), by configuring compression, by configuring data storage duration, by configuring write strategies (such as by striping data across multiple storage devices, using protocols where one device stores instructions for other devices in a chain, and the like), and by configuring storage hierarchies, such as by providing pre-calculated intermediate statistics to facilitate more rapid access to frequently accessed data items. Thus, highly intelligent storage systems may be configured and optimized, based on feedback, over time.

Methods and systems are disclosed herein for self-organizing network coding for a multi-sensor data network, including self-organizing network coding for a data network that transports data from multiple sensors in an industrial data collection environment. Network coding, including random linear network coding, can enable highly efficient and reliable transport of large amounts of data over various kinds of networks. Different network coding configurations can be selected, based on machine learning, to optimize network coding and other network transport characteristics based on network conditions, environmental conditions, and other factors, such as the nature of the data being transported, environmental conditions, operating conditions, and the like (including by training a network coding selection model over time based on feedback of measures of success, such as any of the measures described herein).

In embodiments, a platform is provided having a self-organizing network coding for multi-sensor data network. A cognitive system may vary one or more parameters for networking, such as network type selection (e.g., selecting among available local, cellular, satellite, Wi-Fi, Bluetooth™, NFC, Zigbee® and other networks), network selection (such as selecting a specific network, such as one that is known to have desired security features), network coding selection (such as selecting a type of network coding for efficient transport[such as random linear network coding, fixed coding, and others]), network timing selection (such as configuring delivery based on network pricing conditions, traffic and the like), network feature selection (such as selecting cognitive features, security features, and the like), network conditions (such as network quality based on current environmental or operation conditions), network feature selection (such as enabling available authentication, permission and similar systems), network protocol selection (such as among HTTP, IP, TCP/IP, cellular, satellite, serial, packet, streaming, and many other protocols), and others. Given bandwidth constraints, price variations, sensitivity to environmental factors, security concerns, and the like, selecting the optimal network configuration can be highly complex and situation dependent. The self-organizing networking system 4030 may vary combinations and permutations of these parameters while taking input from a learning feedback system 4012 such as using information from the analytic system 4018 about various measures of outcomes. In the many examples, outcomes may include overall system measures, analytic success measures, and local performance indicators. In embodiments, input from a learning feedback system 4012 may include information from various sensors and input sources 116, information from the state system 4020 about states (such as events, environmental conditions, operating conditions, and many others, or other information) or taking other inputs. By variation and selection of alternative configurations of networking parameters in different states, the self-organizing networking system may find configurations that are well-adapted to the environment that is being monitored or controlled by the host system 112, such as the instance where one or more data collection systems 102 are located and that are well-adapted to emerging network conditions. Thus, a self-organizing, network-condition-adaptive data collection system is provided.

Figure 42:
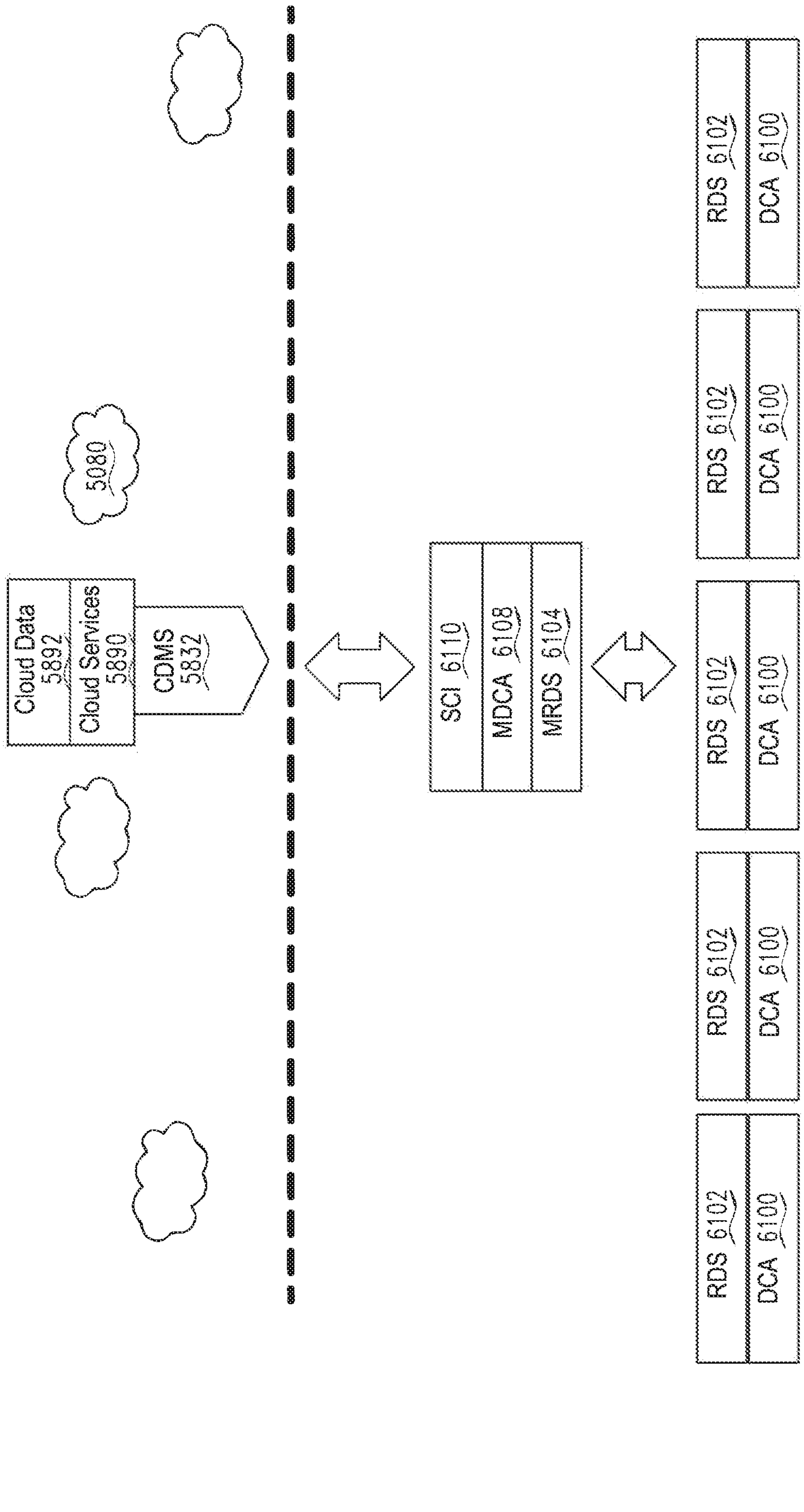
Figure 43:
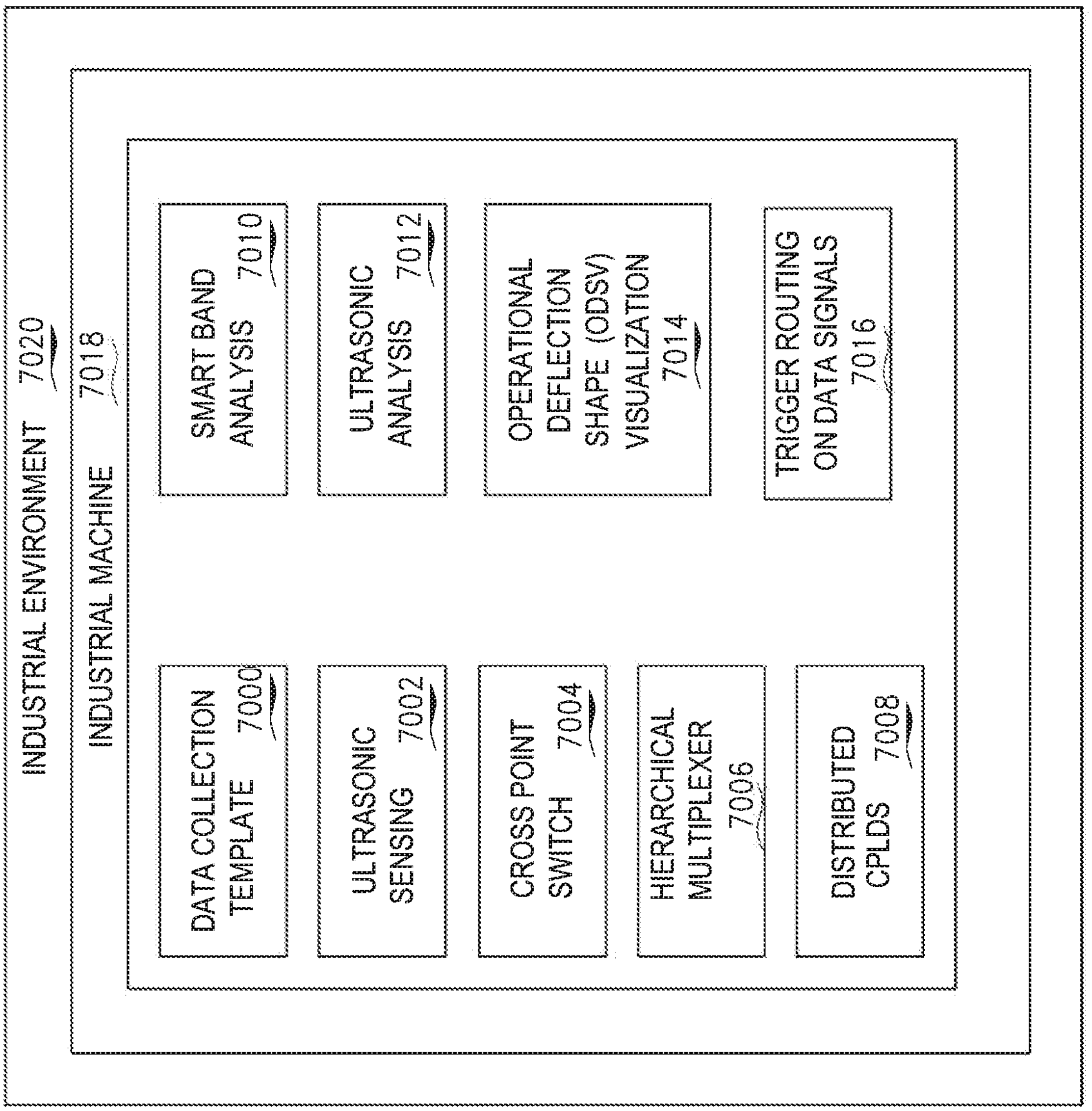
FIG. 43 through FIG. 49 are diagrammatic views of components and interactions of a data collection architecture involving data channel methods and systems for data collection of industrial machines in accordance with the present disclosure.

Referring to FIG. 42, a data collection system 102 may have one or more output interfaces and/or ports 4010. These may include network ports and connections, application programming interfaces, and the like. Methods and systems are disclosed herein for a haptic or multi-sensory user interface, including a wearable haptic or multi-sensory user interface for an industrial sensor data collector, with vibration, heat, electrical, and/or sound outputs. For example, an interface may, based on a data structure configured to support the interface, be set up to provide a user with input or feedback, such as based on data from sensors in the environment. For example, if a fault condition based on a vibration data (such as resulting from a bearing being worn down, an axle being misaligned, or a resonance condition between machines) is detected, it can be presented in a haptic interface by vibration of an interface, such as shaking a wrist-worn device. Similarly, thermal data indicating overheating could be presented by warming or cooling a wearable device, such as while a worker is working on a machine and cannot necessarily look at a user interface. Similarly, electrical or magnetic data may be presented by a buzzing, and the like, such as to indicate presence of an open electrical connection or wire, etc. That is, a multi-sensory interface can intuitively help a user (such as a user with a wearable device) get a quick indication of what is going on in an environment, with the wearable interface having various modes of interaction that do not require a user to have eyes on a graphical UI, which may be difficult or impossible in many industrial environments where a user needs to keep an eye on the environment.

In embodiments, a platform is provided having a wearable haptic user interface for an industrial sensor data collector, with vibration, heat, electrical, and/or sound outputs. In embodiments, a haptic user interface 4302 is provided as an output for a data collection system 102, such as a system for handling and providing information for vibration, heat, electrical, and/or sound outputs, such as to one or more components of the data collection system 102 or to another system, such as a wearable device, mobile phone, or the like. A data collection system 102 may be provided in a form factor suitable for delivering haptic input to a user, such as vibration, warming or cooling, buzzing, or the like, such as input disposed in headgear, an armband, a wristband or watch, a belt, an item of clothing, a uniform, or the like. In such cases, data collection systems 102 may be integrated with gear, uniforms, equipment, or the like worn by users, such as individuals responsible for operating or monitoring an industrial environment. In embodiments, signals from various sensors or input sources (or selective combinations, permutations, mixes, and the like, as managed by one or more of the cognitive input selection systems 4004, 4014) may trigger haptic feedback. For example, if a nearby industrial machine is overheating, the haptic interface may alert a user by warming up, or by sending a signal to another device (such as a mobile phone) to warm up. If a system is experiencing unusual vibrations, the haptic interface may vibrate. Thus, through various forms of haptic input, a data collection system 102 may inform users of the need to attend to one or more devices, machines, or other factors (such as those in an industrial environment) without requiring them to read messages or divert their visual attention away from the task at hand. The haptic interface, and selection of what outputs should be provided, may be considered in the cognitive input selection systems 4004, 4014. For example, user behavior (such as responses to inputs) may be monitored and analyzed in an analytic system 4018, and feedback may be provided through the learning feedback system 4012, so that signals may be provided based on the right collection or package of sensors and inputs, at the right time and in the right manner, to optimize the effectiveness of the haptic system 4202. This may include rule-based or model-based feedback (such as providing outputs that correspond in some logical fashion to the source data that is being conveyed). In embodiments, a cognitive haptic system may be provided, where selection of inputs or triggers for haptic feedback, selection of outputs, timing, intensity levels, durations, and other parameters (or weights applied to them) may be varied in a process of variation, promotion, and selection (such as using genetic programming) with feedback based on real world responses to feedback in actual situations or based on results of simulation and testing of user behavior. Thus, an adaptive haptic interface for a data collection system 102 is provided, which may learn and adapt feedback to satisfy requirements and to optimize the impact on user behavior, such as for overall system outcomes, data collection outcomes, analytic outcomes, and the like.

Methods and systems are disclosed herein for a presentation layer for AR/VR industrial glasses, where heat map elements are presented based on patterns and/or parameters in collected data. Methods and systems are disclosed herein for condition-sensitive, self-organized tuning of AR/VR interfaces based on feedback metrics and/or training in industrial environments. In embodiments, any of the data, measures, and the like described throughout this disclosure can be presented by visual elements, overlays, and the like for presentation in the AR/VR interfaces, such as in industrial glasses, on AR/VR interfaces on smart phones or tablets, on AR/VR interfaces on data collectors (which may be embodied in smart phones or tablets), on displays located on machines or components, and/or on displays located in industrial environments.

In embodiments, a platform is provided having heat maps displaying collected data for AR/VR. In embodiments, a platform is provided having heat maps 4204 displaying collected data from a data collection system 102 for providing input to an AR/VR interface 4208. In embodiments, the heat map interface 4304 is provided as an output for a data collection system 102, such as for handling and providing information for visualization of various sensor data and other data (such as map data, analog sensor data, and other data), such as to one or more components of the data collection system 102 or to another system, such as a mobile device, tablet, dashboard, computer, AR/VR device, or the like. A data collection system 102 may be provided in a form factor suitable for delivering visual input to a user, such as the presentation of a map that includes indicators of levels of analog and digital sensor data (such as data indicating levels of rotation, vibration, heating or cooling, pressure, and many other conditions). In such cases, data collection systems 102 may be integrated with equipment, or the like that are used by individuals responsible for operating or monitoring an industrial environment. In embodiments, signals from various sensors or input sources (or selective combinations, permutations, mixes, and the like, as managed by one or more of the cognitive input selection systems 4004, 4014) may provide input data to a heat map. Coordinates may include real world location coordinates (such as geo-location or location on a map of an environment), as well as other coordinates, such as time-based coordinates, frequency-based coordinates, or other coordinates that allow for representation of analog sensor signals, digital signals, input source information, and various combinations, in a map-based visualization, such that colors may represent varying levels of input along the relevant dimensions. For example, if a nearby industrial machine is overheating, the heat map interface may alert a user by showing a machine in bright red. If a system is experiencing unusual vibrations, the heat map interface may show a different color for a visual element for the machine, or it may cause an icon or display element representing the machine to vibrate in the interface, calling attention to the element. Clicking, touching, or otherwise interacting with the map can allow a user to drill down and see underlying sensor or input data that is used as an input to the heat map display. Thus, through various forms of display, a data collection system 102 may inform users of the need to attend to one or more devices, machines, or other factors, such as those in an industrial environment, without requiring them to read text-based messages or input. The heat map interface, and selection of what outputs should be provided, may be considered in the cognitive input selection systems 4004, 4014. For example, user behavior (such as responses to inputs or displays) may be monitored and analyzed in an analytic system 4018, and feedback may be provided through the learning feedback system 4012, so that signals may be provided based on the right collection or package of sensors and inputs, at the right time and in the right manner, to optimize the effectiveness of the heat map UI 4304. This may include rule-based or model-based feedback (such as feedback providing outputs that correspond in some logical fashion to the source data that is being conveyed). In embodiments, a cognitive heat map system may be provided, where selection of inputs or triggers for heat map displays, selection of outputs, colors, visual representation elements, timing, intensity levels, durations and other parameters (or weights applied to them) may be varied in a process of variation, promotion and selection (such as selection using genetic programming) with feedback based on real world responses to feedback in actual situations or based on results of simulation and testing of user behavior. Thus, an adaptive heat map interface for a data collection system 102, or data collected thereby 102, or data handled by a host processing system 112, is provided, which may learn and adapt feedback to satisfy requirements and to optimize the impact on user behavior and reaction, such as for overall system outcomes, data collection outcomes, analytic outcomes, and the like.

In embodiments, a platform is provided having automatically tuned AR/VR visualization of data collected by a data collector. In embodiments, a platform is provided having an automatically tuned AR/VR visualization system 4308 for visualization of data collected by a data collection system 102, such as the case where the data collection system 102 has an AR/VR interface 4208 or provides input to an AR/VR interface 4308 (such as a mobile phone positioned in a virtual reality or AR headset, a set of AR glasses, or the like). In embodiments, the AR/VR system 4308 is provided as an output interface of a data collection system 102, such as a system for handling and providing information for visualization of various sensor data and other data (such as map data, analog sensor data, and other data), such as to one or more components of the data collection system 102 or to another system, such as a mobile device, tablet, dashboard, computer, AR/VR device, or the like. A data collection system 102 may be provided in a form factor suitable for delivering AR or VR visual, auditory, or other sensory input to a user, such as by presenting one or more displays such as 3D-realistic visualizations, objects, maps, camera overlays, or other overlay elements, maps and the like that include or correspond to indicators of levels of analog and digital sensor data (such as data indicating levels of rotation, vibration, heating or cooling, pressure and many other conditions, to input sources 116, or the like). In such cases, data collection systems 102 may be integrated with equipment, or the like that are used by individuals responsible for operating or monitoring an industrial environment.

In embodiments, signals from various sensors or input sources (or selective combinations, permutations, mixes, and the like as managed by one or more of the cognitive input selection systems 4004, 4014) may provide input data to populate, configure, modify, or otherwise determine the AR/VR element. Visual elements may include a wide range of icons, map elements, menu elements, sliders, toggles, colors, shapes, sizes, and the like, for representation of analog sensor signals, digital signals, input source information, and various combinations. In many examples, colors, shapes, and sizes of visual overlay elements may represent varying levels of input along the relevant dimensions for a sensor or combination of sensors. In further examples, if a nearby industrial machine is overheating, an AR element may alert a user by showing an icon representing that type of machine in flashing red color in a portion of the display of a pair of AR glasses. If a system is experiencing unusual vibrations, a virtual reality interface showing visualization of the components of the machine (such as an overlay of a camera view of the machine with 3D visualization elements) may show a vibrating component in a highlighted color, with motion, or the like, to ensure the component stands out in a virtual reality environment being used to help a user monitor or service the machine. Clicking, touching, moving eyes toward, or otherwise interacting with a visual element in an AR/VR interface may allow a user to drilldown and see underlying sensor or input data that is used as an input to the display. Thus, through various forms of display, a data collection system 102 may inform users of the need to attend to one or more devices, machines, or other factors (such as in an industrial environment), without requiring them to read text-based messages or input or divert attention from the applicable environment (whether it is a real environment with AR features or a virtual environment, such as for simulation, training, or the like).

The AR/VR output interface 4208, and selection and configuration of what outputs or displays should be provided, may be handled in the cognitive input selection systems 4004, 4014. For example, user behavior (such as responses to inputs or displays) may be monitored and analyzed in an analytic system 4018, and feedback may be provided through the learning feedback system 4012, so that AR/VR display signals may be provided based on the right collection or package of sensors and inputs, at the right time and in the right manner, to optimize the effectiveness of the AR/VR UI 4308. This may include rule-based or model-based feedback (such as providing outputs that correspond in some logical fashion to the source data that is being conveyed). In embodiments, a cognitively tuned AR/VR interface control system 4308 may be provided, where selection of inputs or triggers for AR/VR display elements, selection of outputs (such as colors, visual representation elements, timing, intensity levels, durations and other parameters [or weights applied to them]) and other parameters of a VR/AR environment may be varied in a process of variation, promotion and selection (such as the use of genetic programming) with feedback based on real world responses in actual situations or based on results of simulation and testing of user behavior. Thus, an adaptive, tuned AR/VR interface for a data collection system 102, or data collected thereby 102, or data handled by a host processing system 112, is provided, which may learn and adapt feedback to satisfy requirements and to optimize the impact on user behavior and reaction, such as for overall system outcomes, data collection outcomes, analytic outcomes, and the like.

As noted above, methods and systems are disclosed herein for continuous ultrasonic monitoring, including providing continuous ultrasonic monitoring of rotating elements and bearings of an energy production facility. Embodiments include using continuous ultrasonic monitoring of an industrial environment as a source for a cloud-deployed pattern recognizer Embodiments include using continuous ultrasonic monitoring to provide updated state information to a state machine that is used as an input to a cloud-deployed pattern recognizer Embodiments include making available continuous ultrasonic monitoring information to a user based on a policy declared in a policy engine. Embodiments include storing continuous ultrasonic monitoring data with other data in a fused data structure on an industrial sensor device. Embodiments include making a stream of continuous ultrasonic monitoring data from an industrial environment available as a service from a data marketplace. Embodiments include feeding a stream of continuous ultrasonic monitoring data into a self-organizing data pool. Embodiments include training a machine learning model to monitor a continuous ultrasonic monitoring data stream where the model is based on a training set created from human analysis of such a data stream, and is improved based on data collected on performance in an industrial environment.

Embodiments include a swarm of data collectors that include at least one data collector for continuous ultrasonic monitoring of an industrial environment and at least one other type of data collector. Embodiments include using a distributed ledger to store time-series data from continuous ultrasonic monitoring across multiple devices. Embodiments include collecting a stream of continuous ultrasonic data in a self-organizing data collector, a network-sensitive data collector, a remotely organized data collector, a data collector having self-organized storage and the like. Embodiments include using self-organizing network coding to transport a stream of ultrasonic data collected from an industrial environment. Embodiments include conveying an indicator of a parameter of a continuously collected ultrasonic data stream via an interface where the interface is one of a sensory interface of a wearable device, a heat map visual interface of a wearable device, an interface that operates with self-organized tuning of the interface layer, and the like.

As noted above, methods and systems are disclosed herein for cloud-based, machine pattern recognition based on fusion of remote analog industrial sensors. Embodiments include taking input from a plurality of analog sensors disposed in an industrial environment, multiplexing the sensors into a multiplexed data stream, feeding the data stream into a cloud-deployed machine learning facility, and training a model of the machine learning facility to recognize a defined pattern associated with the industrial environment. Embodiments include using a cloud-based pattern recognizer on input states from a state machine that characterizes states of an industrial environment. Embodiments include deploying policies by a policy engine that govern what data can be used by what users and for what purpose in cloud-based, machine learning. Embodiments include using a cloud-based platform to identify patterns in data across a plurality of data pools that contain data published from industrial sensors. Embodiments include training a model to identify preferred sensor sets to diagnose a condition of an industrial environment, where a training set is created by a human user and the model is improved based on feedback from data collected about conditions in an industrial environment.

Embodiments include a swarm of data collectors that is governed by a policy that is automatically propagated through the swarm. Embodiments include using a distributed ledger to store sensor fusion information across multiple devices. Embodiments include feeding input from a set of data collectors into a cloud-based pattern recognizer that uses data from multiple sensors for an industrial environment. The data collectors may be self-organizing data collectors, network-sensitive data collectors, remotely organized data collectors, a set of data collectors having self-organized storage, and the like. Embodiments include a system for data collection in an industrial environment with self-organizing network coding for data transport of data fused from multiple sensors in the environment. Embodiments include conveying information formed by fusing inputs from multiple sensors in an industrial data collection system in an interface such as a multi-sensory interface, a heat map interface, an interface that operates with self-organized tuning of the interface layer, and the like.

As noted above, methods and systems are disclosed herein for cloud-based, machine pattern analysis of state information from multiple analog industrial sensors to provide anticipated state information for an industrial system. Embodiments include using a policy engine to determine what state information can be used for cloud-based machine analysis. Embodiments include feeding inputs from multiple devices that have fused and on-device storage of multiple sensor streams into a cloud-based pattern recognizer to determine an anticipated state of an industrial environment. Embodiments include making an output, such as anticipated state information, from a cloud-based machine pattern recognizer that analyzes fused data from remote, analog industrial sensors available as a data service in a data marketplace. Embodiments include using a cloud-based pattern recognizer to determine an anticipated state of an industrial environment based on data collected from data pools that contain streams of information from machines in the environment. Embodiments include training a model to identify preferred state information to diagnose a condition of an industrial environment, where a training set is created by a human user and the model is improved based on feedback from data collected about conditions in an industrial environment. Embodiments include a swarm of data collectors that feeds a state machine that maintains current state information for an industrial environment. Embodiments include using a distributed ledger to store historical state information for fused sensor states a self-organizing data collector that feeds a state machine that maintains current state information for an industrial environment. Embodiments include a data collector that feeds a state machine that maintains current state information for an industrial environment where the data collector may be a network sensitive data collector, a remotely organized data collector, a data collector with self-organized storage, and the like. Embodiments include a system for data collection in an industrial environment with self-organizing network coding for data transport and maintains anticipated state information for the environment. Embodiments include conveying anticipated state information determined by machine learning in an industrial data collection system in an interface where the interface may be one or more of a multisensory interface, a heat map interface an interface that operates with self-organized tuning of the interface layer, and the like.

As noted above, methods and systems are disclosed herein for a cloud-based policy automation engine for IoT, with creation, deployment, and management of IoT devices, including a cloud-based policy automation engine for IoT, enabling creation, deployment and management of policies that apply to IoT devices. Policies can relate to data usage to an on-device storage system that stores fused data from multiple industrial sensors, or what data can be provided to whom in a self-organizing marketplace for IoT sensor data. Policies can govern how a self-organizing swarm or data collector should be organized for a particular industrial environment, how a network-sensitive data collector should use network bandwidth for a particular industrial environment, how a remotely organized data collector should collect, and make available, data relating to a specified industrial environment, or how a data collector should self-organize storage for a particular industrial environment. Policies can be deployed across a set of self-organizing pools of data that contain data streamed from industrial sensing devices to govern use of data from the pools or stored on a device that governs use of storage capabilities of the device for a distributed ledger. Embodiments include training a model to determine what policies should be deployed in an industrial data collection system. Embodiments include a system for data collection in an industrial environment with a policy engine for deploying policy within the system and, optionally, self-organizing network coding for data transport, wherein in certain embodiments, a policy applies to how data will be presented in a multi-sensory interface, a heat map visual interface, or in an interface that operates with self-organized tuning of the interface layer.

As noted above, methods and systems are disclosed herein for on-device sensor fusion and data storage for industrial IoT devices, such as an industrial data collector, including self-organizing, remotely organized, or network-sensitive industrial data collectors, where data from multiple sensors is multiplexed at the device for storage of a fused data stream. Embodiments include a self-organizing marketplace that presents fused sensor data that is extracted from on-device storage of IoT devices. Embodiments include streaming fused sensor information from multiple industrial sensors and from an on-device data storage facility to a data pool. Embodiments include training a model to determine what data should be stored on a device in a data collection environment. Embodiments include a self-organizing swarm of industrial data collectors that organize among themselves to optimize data collection, where at least some of the data collectors have on-device storage of fused data from multiple sensors. Embodiments include storing distributed ledger information with fused sensor information on an industrial IoT device. Embodiments include a system for data collection with on-device sensor fusion, such as of industrial sensor data and, optionally, self-organizing network coding for data transport, where data structures are stored to support alternative, multi-sensory modes of presentation, visual heat map modes of presentation, and/or an interface that operates with self-organized tuning of the interface layer.

As noted above, methods and systems are disclosed herein for a self-organizing data marketplace for industrial IoT data, where available data elements are organized in the marketplace for consumption by consumers based on training a self-organizing facility with a training set and feedback from measures of marketplace success. Embodiments include organizing a set of data pools in a self-organizing data marketplace based on utilization metrics for the data pools. Embodiments include training a model to determine pricing for data in a data marketplace. The data marketplace is fed with data streams from a self-organizing swarm of industrial data collectors, a set of industrial data collectors that have self-organizing storage, or self-organizing, network-sensitive, or remotely organized industrial data collectors. Embodiments include using a distributed ledger to store transactional data for a self-organizing marketplace for industrial IoT data. Embodiments include using self-organizing network coding for data transport to a marketplace for sensor data collected in industrial environments. Embodiments include providing a library of data structures suitable for presenting data in alternative, multi-sensory interface modes in a data marketplace, in heat map visualization, and/or in interfaces that operate with self-organized tuning of the interface layer.

As noted above, methods and systems are disclosed herein for self-organizing data pools such as those that self-organize based on utilization and/or yield metrics that may be tracked for a plurality of data pools. In embodiments, the pools contain data from self-organizing data collectors. Embodiments include training a model to present the most valuable data in a data marketplace, where training is based on industry-specific measures of success. Embodiments include populating a set of self-organizing data pools with data from a self-organizing swarm of data collectors. Embodiments include using a distributed ledger to store transactional information for data that is deployed in data pools, where the distributed ledger is distributed across the data pools. Embodiments include populating a set of self-organizing data pools with data from a set of network-sensitive or remotely organized data collectors or a set of data collectors having self-organizing storage. Embodiments include a system for data collection in an industrial environment with self-organizing pools for data storage and self-organizing network coding for data transport, such as a system that includes a source data structure for supporting data presentation in a multi-sensory interface, in a heat map interface, and/or in an interface that operates with self-organized tuning of the interface layer.

As noted above, methods and systems are disclosed herein for training AI models based on industry-specific feedback, such as that reflects a measure of utilization, yield, or impact, where the AI model operates on sensor data from an industrial environment. Embodiments include training a swarm of data collectors, or data collectors, such as remotely organized, self-organizing, or network-sensitive data collectors, based on industry-specific feedback or network and industrial conditions in an industrial environment, such as to configure storage. Embodiments include training an AI model to identify and use available storage locations in an industrial environment for storing distributed ledger information. Embodiments include training a remote organizer for a remotely organized data collector based on industry-specific feedback measures. Embodiments include a system for data collection in an industrial environment with cloud-based training of a network coding model for organizing network coding for data transport or a facility that manages presentation of data in a multi-sensory interface, in a heat map interface, and/or in an interface that operates with self-organized tuning of the interface layer.

As noted above, methods and systems are disclosed herein for a self-organized swarm of industrial data collectors that organize among themselves to optimize data collection based on the capabilities and conditions of the members of the swarm. Embodiments include deploying distributed ledger data structures across a swarm of data. Data collectors may be network-sensitive data collectors configured for remote organization or have self-organizing storage. Systems for data collection in an industrial environment with a swarm can include a self-organizing network coding for data transport. Systems include swarms that relay information for use in a multi-sensory interface, in a heat map interface, and/or in an interface that operates with self-organized tuning of the interface layer.

As noted above, methods and systems are disclosed herein for an industrial IoT distributed ledger, including a distributed ledger supporting the tracking of transactions executed in an automated data marketplace for industrial IoT data. Embodiments include a self-organizing data collector that is configured to distribute collected information to a distributed ledger. Embodiments include a network-sensitive data collector that is configured to distribute collected information to a distributed ledger based on network conditions. Embodiments include a remotely organized data collector that is configured to distribute collected information to a distributed ledger based on intelligent, remote management of the distribution. Embodiments include a data collector with self-organizing local storage that is configured to distribute collected information to a distributed ledger. Embodiments include a system for data collection in an industrial environment using a distributed ledger for data storage and self-organizing network coding for data transport, wherein data storage is of a data structure supporting a haptic interface for data presentation, a heat map interface for data presentation, and/or an interface that operates with self-organized tuning of the interface layer.

As noted above, methods and systems are disclosed herein for a self-organizing collector, including a self-organizing, multi-sensor data collector that can optimize data collection, power and/or yield based on conditions in its environment, and is optionally responsive to remote organization Embodiments include a self-organizing data collector that organizes at least in part based on network conditions. Embodiments include a self-organizing data collector with self-organizing storage for data collected in an industrial data collection environment. Embodiments include a system for data collection in an industrial environment with self-organizing data collection and self-organizing network coding for data transport. Embodiments include a system for data collection in an industrial environment with a self-organizing data collector that feeds a data structure supporting a haptic or multi-sensory wearable interface for data presentation, a heat map interface for data presentation, and/or an interface that operates with self-organized tuning of the interface layer.

As noted above, methods and systems are disclosed herein for a network-sensitive collector, including a network condition-sensitive, self-organizing, multi-sensor data collector that can optimize based on bandwidth, quality of service, pricing, and/or other network conditions. Embodiments include a remotely organized, network condition-sensitive universal data collector that can power up and down sensor interfaces based on need and/or conditions identified in an industrial data collection environment, including network conditions. Embodiments include a network-condition sensitive data collector with self-organizing storage for data collected in an industrial data collection environment. Embodiments include a network-condition sensitive data collector with self-organizing network coding for data transport in an industrial data collection environment. Embodiments include a system for data collection in an industrial environment with a network-sensitive data collector that relays a data structure supporting a haptic wearable interface for data presentation, a heat map interface for data presentation, and/or an interface that operates with self-organized tuning of the interface layer.

As noted above, methods and systems are disclosed herein for a remotely organized universal data collector that can power up and down sensor interfaces based on need and/or conditions identified in an industrial data collection environment. Embodiments include a remotely organized universal data collector with self-organizing storage for data collected in an industrial data collection environment. Embodiments include a system for data collection in an industrial environment with remote control of data collection and self-organizing network coding for data transport. Embodiments include a remotely organized data collector for storing sensor data and delivering instructions for use of the data in a haptic or multi-sensory wearable interface, in a heat map visual interface, and/or in an interface that operates with self-organized tuning of the interface layer.

As noted above, methods and systems are disclosed herein for self-organizing storage for a multi-sensor data collector, including self-organizing storage for a multi-sensor data collector for industrial sensor data. Embodiments include a system for data collection in an industrial environment with self-organizing data storage and self-organizing network coding for data transport. Embodiments include a data collector with self-organizing storage for storing sensor data and instructions for translating the data for use in a haptic wearable interface, in a heat map presentation interface, and/or in an interface that operates with self-organized tuning of the interface layer.

As noted above, methods and systems are disclosed herein for self-organizing network coding for a multi-sensor data network, including self-organizing network coding for a data network that transports data from multiple sensors in an industrial data collection environment. The system includes a data structure supporting a haptic wearable interface for data presentation, a heat map interface for data presentation, and/or self-organized tuning of an interface layer for data presentation.

As noted above, methods and systems are disclosed herein for a haptic or multi-sensory user interface, including a wearable haptic or multi-sensory user interface for an industrial sensor data collector, with vibration, heat, electrical, and/or sound outputs. Embodiments include a wearable haptic user interface for conveying industrial state information from a data collector, with vibration, heat, electrical, and/or sound outputs. The wearable also has a visual presentation layer for presenting a heat map that indicates a parameter of the data. Embodiments include condition-sensitive, self-organized tuning of AR/VR interfaces and multi-sensory interfaces based on feedback metrics and/or training in industrial environments.

As noted above, methods and systems are disclosed herein for a presentation layer for AR/VR industrial glasses, where heat map elements are presented based on patterns and/or parameters in collected data. Embodiments include condition-sensitive, self-organized tuning of a heat map AR/VR interface based on feedback metrics and/or training in industrial environments. As noted above, methods and systems are disclosed herein for condition-sensitive, self-organized tuning of AR/VR interfaces based on feedback metrics and/or training in industrial environments.

The following illustrative clauses describe certain embodiments of the present disclosure. The data collection system mentioned in the following disclosure may be a local data collection system 102, a host processing system 112 (e.g., using a cloud platform), or a combination of a local system and a host system. In embodiments, a data collection system or data collection and processing system is provided having the use of an analog crosspoint switch for collecting data having variable groups of analog sensor inputs and, in some embodiments, having IP front-end-end signal conditioning on a multiplexer for improved signal-to-noise ratio, multiplexer continuous monitoring alarming features, the use of distributed CPLD chips with a dedicated bus for logic control of multiple MUX and data acquisition sections, high-amperage input capability using solid state relays and design topology, power-down capability of at least one of an analog sensor channel and of a component board, unique electrostatic protection for trigger and vibration inputs, and/or precise voltage reference for A/D zero reference.

In embodiments, a data collection and processing system is provided having the use of an analog crosspoint switch for collecting data having variable groups of analog sensor inputs and having a phase-lock loop band-pass tracking filter for obtaining slow-speed RPMs and phase information, digital derivation of phase relative to input and trigger channels using on-board timers, a peak-detector for auto-scaling that is routed into a separate analog-to-digital converter for peak detection, the routing of a trigger channel that is either raw or buffered into other analog channels, the use of higher input oversampling for delta-sigma A/D for lower sampling rate outputs to minimize AA filter requirements, and/or the use of a CPLD as a clock-divider for a delta-sigma analog-to-digital converter to achieve lower sampling rates without the need for digital resampling.

In embodiments, a data collection and processing system is provided having the use of an analog crosspoint switch for collecting data having variable groups of analog sensor inputs and having long blocks of data at a high-sampling rate, as opposed to multiple sets of data taken at different sampling rates, storage of calibration data with a maintenance history on-board card set, a rapid route creation capability using hierarchical templates, intelligent management of data collection bands, and/or a neural net expert system using intelligent management of data collection bands.

In embodiments, a data collection and processing system is provided having the use of an analog crosspoint switch for collecting data having variable groups of analog sensor inputs and having use of a database hierarchy in sensor data analysis, an expert system GUI graphical approach to defining intelligent data collection bands and diagnoses for the expert system, a graphical approach for back-calculation definition, proposed bearing analysis methods, torsional vibration detection/analysis utilizing transitory signal analysis, and/or improved integration using both analog and digital methods.

In embodiments, a data collection and processing system is provided having the use of an analog crosspoint switch for collecting data having variable groups of analog sensor inputs and having adaptive scheduling techniques for continuous monitoring of analog data in a local environment, data acquisition parking features, a self-sufficient data acquisition box, SD card storage, extended onboard statistical capabilities for continuous monitoring, the use of ambient, local and vibration noise for prediction, smart route changes based on incoming data or alarms to enable simultaneous dynamic data for analysis or correlation, smart ODS and transfer functions, a hierarchical multiplexer, identification of sensor overload, and/or RF identification and an inclinometer.

In embodiments, a data collection and processing system is provided having the use of an analog crosspoint switch for collecting data having variable groups of analog sensor inputs and having continuous ultrasonic monitoring, cloud-based, machine pattern recognition based on the fusion of remote, analog industrial sensors, cloud-based, machine pattern analysis of state information from multiple analog industrial sensors to provide anticipated state information for an industrial system, cloud-based policy automation engine for IoT, with creation, deployment, and management of IoT devices, on-device sensor fusion and data storage for industrial IoT devices, a self-organizing data marketplace for industrial IoT data, self-organization of data pools based on utilization and/or yield metrics, training AI models based on industry-specific feedback, a self-organized swarm of industrial data collectors, an IoT distributed ledger, a self-organizing collector, a network-sensitive collector, a remotely organized collector, a self-organizing storage for a multi-sensor data collector, a self-organizing network coding for multi-sensor data network, a wearable haptic user interface for an industrial sensor data collector, with vibration, heat, electrical, and/or sound outputs, heat maps displaying collected data for AR/VR, and/or automatically tuned AR/VR visualization of data collected by a data collector.

In embodiments, a data collection and processing system is provided having IP front-end signal conditioning on a multiplexer for improved signal-to-noise ratio. In embodiments, a data collection and processing system is provided having IP front-end signal conditioning on a multiplexer for improved signal-to-noise ratio and having at least one of: multiplexer continuous monitoring alarming features; IP front-end signal conditioning on a multiplexer for improved signal-to-noise ratio; the use of distributed CPLD chips with dedicated bus for logic control of multiple MUX and data acquisition sections. In embodiments, a data collection and processing system is provided having IP front-end signal conditioning on a multiplexer for improved signal-to-noise ratio and having at least one of: high-amperage input capability using solid state relays and design topology; power-down capability of at least one analog sensor channel and of a component board; unique electrostatic protection for trigger and vibration inputs; precise voltage reference for A/D zero reference; and a phase-lock loop band-pass tracking filter for obtaining slow-speed RPMs and phase information. In embodiments, a data collection and processing system is provided having IP front-end signal conditioning on a multiplexer for improved signal-to-noise ratio and having at least one of: digital derivation of phase relative to input and trigger channels using on-board timers; a peak-detector for auto-scaling that is routed into a separate analog-to-digital converter for peak detection; routing of a trigger channel that is either raw or buffered into other analog channels; the use of higher input oversampling for delta-sigma A/D for lower sampling rate outputs to minimize AA filter requirements; and the use of a CPLD as a clock-divider for a delta-sigma analog-to-digital converter to achieve lower sampling rates without the need for digital resampling. In embodiments, a data collection and processing system is provided having IP front-end signal conditioning on a multiplexer for improved signal-to-noise ratio and having at least one of: long blocks of data at a high-sampling rate as opposed to multiple sets of data taken at different sampling rates; storage of calibration data with a maintenance history on-board card set; a rapid route creation capability using hierarchical templates; intelligent management of data collection bands; and a neural net expert system using intelligent management of data collection bands. In embodiments, a data collection and processing system is provided having IP front-end signal conditioning on a multiplexer for improved signal-to-noise ratio and having at least one of: use of a database hierarchy in sensor data analysis; an expert system GUI graphical approach to defining intelligent data collection bands and diagnoses for the expert system; and a graphical approach for back-calculation definition. In embodiments, a data collection and processing system is provided having IP front-end signal conditioning on a multiplexer for improved signal-to-noise ratio and having at least one of: proposed bearing analysis methods; torsional vibration detection/analysis utilizing transitory signal; improved integration using both analog and digital methods;

adaptive scheduling techniques for continuous monitoring of analog data in a local environment; data acquisition parking features; a self-sufficient data acquisition box; and SD card storage. In embodiments, a data collection and processing system is provided having IP front-end signal conditioning on a multiplexer for improved signal-to-noise ratio and having at least one of: extended onboard statistical capabilities for continuous monitoring; the use of ambient, local, and vibration noise for prediction; smart route changes based on incoming data or alarms to enable simultaneous dynamic data for analysis or correlation; smart ODS and transfer functions; and a hierarchical multiplexer. In embodiments, a data collection and processing system is provided having IP front-end signal conditioning on a multiplexer for improved signal-to-noise ratio and having at least one of: identification of sensor overload; RF identification and an inclinometer; continuous ultrasonic monitoring; machine pattern recognition based on the fusion of remote, analog industrial sensors; and cloud-based, machine pattern analysis of state information from multiple analog industrial sensors to provide anticipated state information for an industrial system. In embodiments, a data collection and processing system is provided having IP front-end signal conditioning on a multiplexer for improved signal-to-noise ratio and having at least one of: cloud-based policy automation engine for IoT, with creation, deployment, and management of IoT devices; on-device sensor fusion and data storage for industrial IoT devices; a self-organizing data marketplace for industrial IoT data; and self-organization of data pools based on utilization and/or yield metrics. In embodiments, a data collection and processing system is provided having IP front-end signal conditioning on a multiplexer for improved signal-to-noise ratio and having at least one of: training AI models based on industry-specific feedback; a self-organized swarm of industrial data collectors; an IoT distributed ledger; a self-organizing collector; and a network-sensitive collector. In embodiments, a data collection and processing system is provided having IP front-end signal conditioning on a multiplexer for improved signal-to-noise ratio and having at least one of: a remotely organized collector; a self-organizing storage for a multi-sensor data collector; a self-organizing network coding for multi-sensor data network; a wearable haptic user interface for an industrial sensor data collector, with vibration, heat, electrical, and/or sound outputs; heat maps displaying collected data for AR/VR; and automatically tuned AR/VR visualization of data collected by a data collector.

In embodiments, a data collection and processing system is provided having multiplexer continuous monitoring alarming features. In embodiments, a data collection and processing system is provided having multiplexer continuous monitoring alarming features and having at least one of: the use of distributed CPLD chips with dedicated bus for logic control of multiple MUX and data acquisition sections; high-amperage input capability using solid state relays and design topology; power-down capability of at least one of an analog sensor channel and/or of a component board; unique electrostatic protection for trigger and vibration inputs; and precise voltage reference for A/D zero reference. In embodiments, a data collection and processing system is provided having multiplexer continuous monitoring alarming features and having at least one of: a phase-lock loop band-pass tracking filter for obtaining slow-speed RPMs and phase information; digital derivation of phase relative to input and trigger channels using on-board timers; a peak-detector for auto-scaling that is routed into a separate analog-to-digital converter for peak detection; and routing of a trigger channel that is either raw or buffered into other analog channels. In embodiments, a data collection and processing system is provided having multiplexer continuous monitoring alarming features and having at least one of: the use of higher input oversampling for delta-sigma A/D for lower sampling rate outputs to minimize AA filter requirements; the use of a CPLD as a clock-divider for a delta-sigma analog-to-digital converter to achieve lower sampling rates without the need for digital resampling; long blocks of data at a high-sampling rate as opposed to multiple sets of data taken at different sampling rates; storage of calibration data with a maintenance history on-board card set; and a rapid route creation capability using hierarchical templates. In embodiments, a data collection and processing system is provided having multiplexer continuous monitoring alarming features and having at least one of: intelligent management of data collection bands; a neural net expert system using intelligent management of data collection bands; use of a database hierarchy in sensor data analysis; and an expert system GUI graphical approach to defining intelligent data collection bands and diagnoses for the expert system. In embodiments, a data collection and processing system is provided having multiplexer continuous monitoring alarming features and having at least one of: a graphical approach for back-calculation definition; proposed bearing analysis methods; torsional vibration detection/analysis utilizing transitory signal analysis; and improved integration using both analog and digital methods. In embodiments, a data collection and processing system is provided having multiplexer continuous monitoring alarming features and having at least one of adaptive scheduling techniques for continuous monitoring of analog data in a local environment; data acquisition parking features; a self-sufficient data acquisition box; and SD card storage. In embodiments, a data collection and processing system is provided having multiplexer continuous monitoring alarming features and having at least one of: extended onboard statistical capabilities for continuous monitoring; the use of ambient, local and vibration noise for prediction; smart route changes based on incoming data or alarms to enable simultaneous dynamic data for analysis or correlation; and smart ODS and transfer functions. In embodiments, a data collection and processing system is provided having multiplexer continuous monitoring alarming features and having at least one of: a hierarchical multiplexer; identification of sensor overload; RF identification, and an inclinometer; cloud-based, machine pattern recognition based on the fusion of remote, analog industrial sensors; and machine pattern analysis of state information from multiple analog industrial sensors to provide anticipated state information for an industrial system. In embodiments, a data collection and processing system is provided having multiplexer continuous monitoring alarming features and having at least one of: cloud-based policy automation engine for IoT, with creation, deployment, and management of IoT devices; on-device sensor fusion and data storage for industrial IoT devices; a self-organizing data marketplace for industrial IoT data; self-organization of data pools based on utilization and/or yield metrics; and training AI models based on industry-specific feedback. In embodiments, a data collection and processing system is provided having multiplexer continuous monitoring alarming features and having at least one of: a self-organized swarm of industrial data collectors; an IoT distributed ledger; a self-organizing collector; a network-sensitive collector; and a remotely organized collector. In embodiments, a data collection and processing system is provided having multiplexer continuous monitoring alarming features and having at least one of:

a self-organizing storage for a multi-sensor data collector; and a self-organizing network coding for multi-sensor data network. In embodiments, a data collection and processing system is provided having multiplexer continuous monitoring alarming features and having at least one of: a wearable haptic user interface for an industrial sensor data collector, with vibration, heat, electrical, and/or sound outputs; heat maps displaying collected data for AR/VR; and automatically tuned AR/VR visualization of data collected by a data collector.

In embodiments, a data collection and processing system is provided having the use of distributed CPLD chips with dedicated bus for logic control of multiple MUX and data acquisition sections. In embodiments, a data collection and processing system is provided having the use of distributed CPLD chips with dedicated bus for logic control of multiple MUX and data acquisition sections and having high-amperage input capability using solid state relays and design topology. In embodiments, a data collection and processing system is provided having the use of distributed CPLD chips with dedicated bus for logic control of multiple MUX and data acquisition sections and having power-down capability of at least one of an analog sensor channel and of a component board. In embodiments, a data collection and processing system is provided having the use of distributed CPLD chips with dedicated bus for logic control of multiple MUX and data acquisition sections and having unique electrostatic protection for trigger and vibration inputs. In embodiments, a data collection and processing system is provided having the use of distributed CPLD chips with dedicated bus for logic control of multiple MUX and data acquisition sections and having precise voltage reference for A/D zero reference. In embodiments, a data collection and processing system is provided having the use of distributed CPLD chips with dedicated bus for logic control of multiple MUX and data acquisition sections and having a phase-lock loop band-pass tracking filter for obtaining slow-speed RPMs and phase information. In embodiments, a data collection and processing system is provided having the use of distributed CPLD chips with dedicated bus for logic control of multiple MUX and data acquisition sections and having digital derivation of phase relative to input and trigger channels using on-board timers. In embodiments, a data collection and processing system is provided having the use of distributed CPLD chips with dedicated bus for logic control of multiple MUX and data acquisition sections and having a peak-detector for auto-scaling that is routed into a separate analog-to-digital converter for peak detection. In embodiments, a data collection and processing system is provided having the use of distributed CPLD chips with dedicated bus for logic control of multiple MUX and data acquisition sections and having routing of a trigger channel that is either raw or buffered into other analog channels. In embodiments, a data collection and processing system is provided having the use of distributed CPLD chips with dedicated bus for logic control of multiple MUX and data acquisition sections and having the use of higher input oversampling for delta-sigma. A/D for lower sampling rate outputs to minimize AA filter requirements. In embodiments, a data collection and processing system is provided having the use of distributed CPLD chips with dedicated bus for logic control of multiple MUX and data acquisition sections and having the use of a CPLD as a clock-divider for a delta-sigma analog-to-digital converter to achieve lower sampling rates without the need for digital resampling. In embodiments, a data collection and processing system is provided having the use of distributed CPLD chips with dedicated bus for logic control of multiple MUX and data acquisition sections and having long blocks of data at a high-sampling rate as opposed to multiple sets of data taken at different sampling rates. In embodiments, a data collection and processing system is provided having the use of distributed CPLD chips with dedicated bus for logic control of multiple MUX and data acquisition sections and having storage of calibration data with a maintenance history on-board card set. In embodiments, a data collection and processing system is provided having the use of distributed CPLD chips with dedicated bus for logic control of multiple MUX and data acquisition sections and having a rapid route creation capability using hierarchical templates. In embodiments, a data collection and processing system is provided having the use of distributed CPLD chips with dedicated bus for logic control of multiple MUX and data acquisition sections and having intelligent management of data collection bands. In embodiments, a data collection and processing system is provided having the use of distributed CPLD chips with dedicated bus for logic control of multiple MUX and data acquisition sections and having a neural net expert system using intelligent management of data collection bands. In embodiments, a data collection and processing system is provided having the use of distributed CPLD chips with dedicated bus for logic control of multiple MUX and data acquisition sections and having use of a database hierarchy in sensor data analysis. In embodiments, a data collection and processing system is provided having the use of distributed CPLD chips with dedicated bus for logic control of multiple MUX and data acquisition sections and having an expert system GUI graphical approach to defining intelligent data collection bands and diagnoses for the expert system. In embodiments, a data collection and processing system is provided having the use of distributed CPLD chips with dedicated bus for logic control of multiple MUX and data acquisition sections and having a graphical approach for back-calculation definition. In embodiments, a data collection and processing system is provided having the use of distributed CPLD chips with dedicated bus for logic control of multiple MUX and data acquisition sections and having proposed bearing analysis methods. In embodiments, a data collection and processing system is provided having the use of distributed CPLD chips with dedicated bus for logic control of multiple MUX and data acquisition sections and having torsional vibration detection/analysis utilizing transitory signal analysis. In embodiments, a data collection and processing system is provided having the use of distributed CPLD chips with dedicated bus for logic control of multiple MUX and data acquisition sections and having improved integration using both analog and digital methods. In embodiments, a data collection and processing system is provided having the use of distributed CPLD chips with dedicated bus for logic control of multiple MUX and data acquisition sections and having adaptive scheduling techniques for continuous monitoring of analog data in a local environment. In embodiments, a data collection and processing system is provided having the use of distributed CPLD chips with dedicated bus for logic control of multiple MUX and data acquisition sections and having data acquisition parking features. In embodiments, a data collection and processing system is provided having the use of distributed CPLD chips with dedicated bus for logic control of multiple MUX and data acquisition sections and having a self-sufficient data acquisition box. In embodiments, a data collection and processing system is provided having the use of distributed CPLD chips with dedicated bus for logic control of multiple MUX and data acquisition sections and having SD card storage. In embodiments, a data collection and processing system is provided having the use of distributed CPLD chips with dedicated bus for logic control of multiple MUX and data acquisition sections and having extended onboard statistical capabilities for continuous monitoring. In embodiments, a data collection and processing system is provided having the use of distributed CPLD chips with dedicated bus for logic control of multiple MUX and data acquisition sections and having the use of ambient, local and vibration noise for prediction. In embodiments, a data collection and processing system is provided having the use of distributed CPLD chips with dedicated bus for logic control of multiple MUX and data acquisition sections and having smart route changes based on incoming data or alarms to enable simultaneous dynamic data for analysis or correlation. In embodiments, a data collection and processing system is provided having the use of distributed CPLD chips with dedicated bus for logic control of multiple MUX and data acquisition sections and having smart ODS and transfer functions. In embodiments, a data collection and processing system is provided having the use of distributed CPLD chips with dedicated bus for logic control of multiple MUX and data acquisition sections and having a hierarchical multiplexer. In embodiments, a data collection and processing system is provided having the use of distributed CPLD chips with dedicated bus for logic control of multiple MUX and data acquisition sections and having identification of sensor overload. In embodiments, a data collection and processing system is provided having the use of distributed CPLD chips with dedicated bus for logic control of multiple MUX and data acquisition sections and having RF identification and an inclinometer. In embodiments, a data collection and processing system is provided having the use of distributed CPLD chips with dedicated bus for logic control of multiple MUX and data acquisition sections and having continuous ultrasonic monitoring. In embodiments, a data collection and processing system is provided having the use of distributed CPLD chips with dedicated bus for logic control of multiple MUX and data acquisition sections and having cloud-based, machine pattern recognition based on fusion of remote, analog industrial sensors. In embodiments, a data collection and processing system is provided having the use of distributed CPLD chips with dedicated bus for logic control of multiple MUX and data acquisition sections and having cloud-based, machine pattern analysis of state information from multiple analog industrial sensors to provide anticipated state information for an industrial system. In embodiments, a data collection and processing system is provided having the use of distributed CPLD chips with dedicated bus for logic control of multiple MUX and data acquisition sections and having cloud-based policy automation engine for IoT, with creation, deployment, and management of IoT devices. In embodiments, a data collection and processing system is provided having the use of distributed CPLD chips with dedicated bus for logic control of multiple MUX and data acquisition sections and having on-device sensor fusion and data storage for industrial IoT devices. In embodiments, a data collection and processing system is provided having the use of distributed CPLD chips with dedicated bus for logic control of multiple MUX and data acquisition sections and having a self-organizing data marketplace for industrial IoT data. In embodiments, a data collection and processing system is provided having the use of distributed CPLD chips with dedicated bus for logic control of multiple MUX and data acquisition sections and having self-organization of data pools based on utilization and/or yield metrics. In embodiments, a data collection and processing system is provided having the use of distributed CPLD chips with dedicated bus for logic control of multiple MUX and data acquisition sections and having training AI models based on industry-specific feedback. In embodiments, a data collection and processing system is provided having the use of distributed CPLD chips with dedicated bus for logic control of multiple MUX and data acquisition sections and having a self-organized swarm of industrial data collectors. In embodiments, a data collection and processing system is provided having the use of distributed CPLD chips with dedicated bus for logic control of multiple MUX and data acquisition sections and having an IoT distributed ledger. In embodiments, a data collection and processing system is provided having the use of distributed CPLD chips with dedicated bus for logic control of multiple MUX and data acquisition sections and having a self-organizing collector. In embodiments, a data collection and processing system is provided having the use of distributed CPLD chips with dedicated bus for logic control of multiple MUX and data acquisition sections and having a network-sensitive collector. In embodiments, a data collection and processing system is provided having the use of distributed CPLD chips with dedicated bus for logic control of multiple MUX and data acquisition sections and having a remotely organized collector. In embodiments, a data collection and processing system is provided having the use of distributed CPLD chips with dedicated bus for logic control of multiple MUX and data acquisition sections and having a self-organizing storage for a multi-sensor data collector. In embodiments, a data collection and processing system is provided having the use of distributed CPLD chips with dedicated bus for logic control of multiple MUX and data acquisition sections and having a self-organizing network coding for multi-sensor data network. In embodiments, a data collection and processing system is provided having the use of distributed CPLD chips with dedicated bus for logic control of multiple MUX and data acquisition sections and having a wearable haptic user interface for an industrial sensor data collector, with vibration, heat, electrical, and/or sound outputs. In embodiments, a data collection and processing system is provided having the use of distributed CPLD chips with dedicated bus for logic control of multiple MUX and data acquisition sections and having heat maps displaying collected data for AR/VR. In embodiments, a data collection and processing system is provided having the use of distributed CPLD chips with dedicated bus for logic control of multiple MUX and data acquisition sections and having automatically tuned AR/VR visualization of data collected by a data collector.

In embodiments, a data collection and processing system is provided having one or more of high-amperage input capability using solid state relays and design topology, power-down capability of at least one of an analog sensor channel and of a component board, unique electrostatic protection for trigger and vibration inputs, precise voltage reference for A/D zero reference, a phase-lock loop band-pass tracking filter for obtaining slow-speed RPMs and phase information, digital derivation of phase relative to input and trigger channels using on-board timers, a peak-detector for auto-scaling that is routed into a separate analog-to-digital converter for peak detection, routing of a trigger channel that is either raw or buffered into other analog channels, the use of higher input oversampling for delta-sigma A/D for lower sampling rate outputs to minimize anti-aliasing (AA) filter requirements, the use of a CPLD as a clock-divider for a delta-sigma analog-to-digital converter to achieve lower sampling rates without the need for digital resampling, long blocks of data at a high-sampling rate as opposed to multiple sets of data taken at different sampling rates, storage of calibration data with a maintenance history on-board card set, a rapid route creation capability using hierarchical templates, intelligent management of data collection bands, a neural net expert system using intelligent management of data collection bands, use of a database hierarchy in sensor data analysis, an expert system GUI graphical approach to defining intelligent data collection bands and diagnoses for the expert system, a graphical approach for back-calculation definition, proposed bearing analysis methods, torsional vibration detection/analysis utilizing transitory signal analysis, improved integration using both analog and digital methods, adaptive scheduling techniques for continuous monitoring of analog data in a local environment, data acquisition parking features, a self-sufficient data acquisition box, SD card storage, extended onboard statistical capabilities for continuous monitoring, the use of ambient, local, and vibration noise for prediction, smart route changes based on incoming data or alarms to enable simultaneous dynamic data for analysis or correlation, smart ODS and transfer functions, a hierarchical multiplexer, identification of sensor overload, RF identification and an inclinometer, continuous ultrasonic monitoring, cloud-based, machine pattern recognition based on fusion of remote, analog industrial sensors, cloud-based, machine pattern analysis of state information from multiple analog industrial sensors to provide anticipated state information for an industrial system, cloud-based policy automation engine for IoT, with creation, deployment, and management of IoT devices, on-device sensor fusion and data storage for industrial IoT devices, a self-organizing data marketplace for industrial IoT data, self-organization of data pools based on utilization and/or yield metrics, training AI models based on industry-specific feedback, a self-organized swarm of industrial data collectors, an IoT distributed ledger, a self-organizing collector, a network-sensitive collector, a remotely organized collector, a self-organizing storage for a multi-sensor data collector, a self-organizing network coding for multi-sensor data network, a wearable haptic user interface for an industrial sensor data collector, with vibration, heat, electrical, and/or sound outputs, heat maps displaying collected data for AR/VR, or automatically tuned AR/VR visualization of data collected by a data collector.

In embodiments, a platform is provided having one or more of cloud-based, machine pattern recognition based on fusion of remote, analog industrial sensors, cloud-based, machine pattern analysis of state information from multiple analog industrial sensors to provide anticipated state information for an industrial system, a cloud-based policy automation engine for IoT, with creation, deployment, and management of IoT devices, on-device sensor fusion and data storage for industrial IoT devices, a self-organizing data marketplace for industrial IoT data, self-organization of data pools based on utilization and/or yield metrics, training AI models based on industry-specific feedback, a self-organized swarm of industrial data collectors, an IoT distributed ledger, a self-organizing collector, a network-sensitive collector, a remotely organized collector, a self-organizing storage for a multi-sensor data collector, a self-organizing network coding for multi-sensor data network, a wearable haptic user interface for an industrial sensor data collector, with vibration, heat, electrical, and/or sound outputs, heat maps displaying collected data for AR/VR, or automatically tuned AR/VR visualization of data collected by a data collector.

Figure 18:
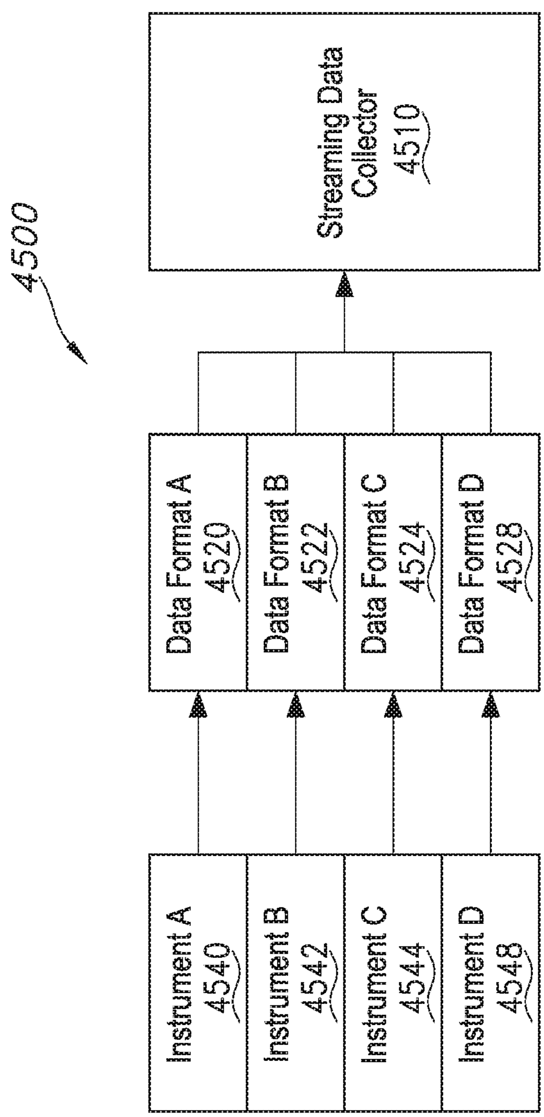
FIG. 18 is a diagrammatic view of a multi-format streaming data collection system in accordance with the present disclosure.

With regard to FIG. 18, a range of existing data sensing and processing systems with industrial sensing, processing, and storage systems 4500 include a streaming data collector 4510 that may be configured to accept data in a range of formats as described herein. In embodiments, the range of formats can include a data format A 4520, a data format B 4522, a data format C 4524, and a data format D 4528 that may be sourced from a range of sensors. Moreover, the range of sensors can include an instrument A 4540, an instrument B 4542, an instrument C 4544, and an instrument D 4548. The streaming data collector 4510 may be configured with processing capabilities that enable access to the individual formats while leveraging the streaming, routing, self-organizing storage, and other capabilities described herein.

Figure 19:
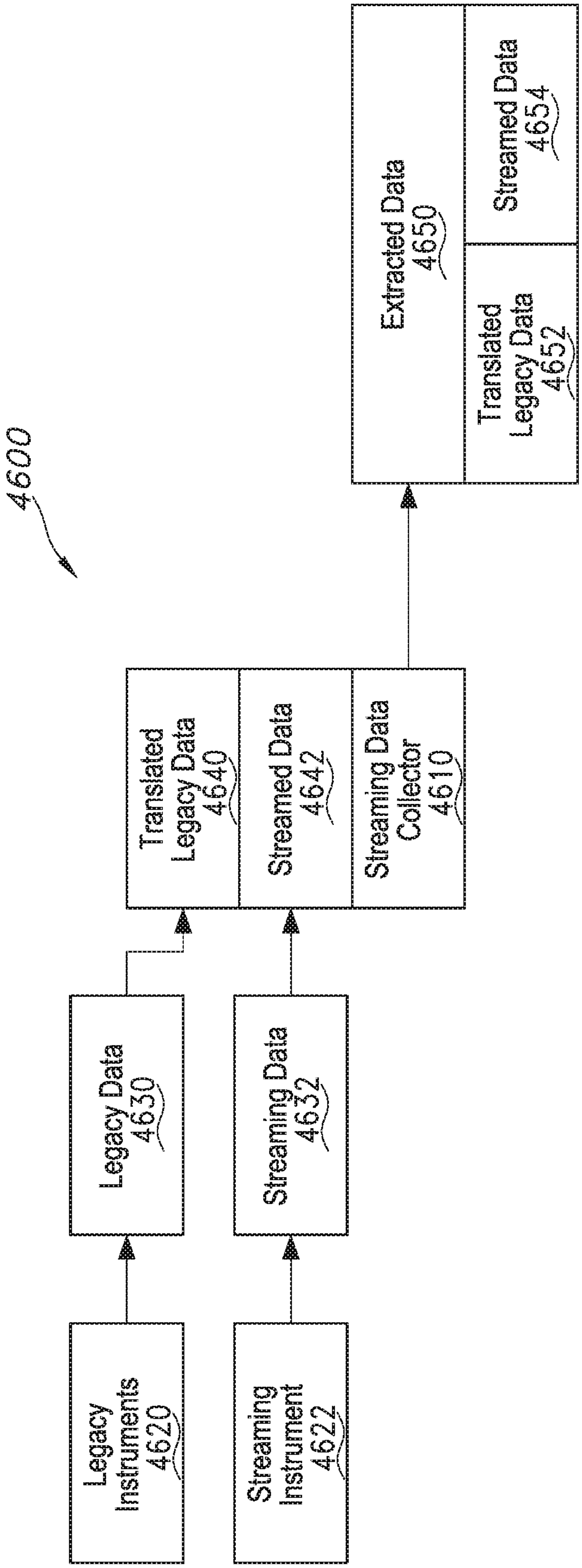
FIG. 19 is a diagrammatic view of combining legacy and streaming data collection and storage in accordance with the present disclosure.

FIG. 19 depicts methods and systems 4600 for industrial machine sensor data streaming collection, processing, and storage that facilitate use of a streaming data collector 4610 to collect and obtain data from legacy instruments 4620 and streaming instruments 4622. Legacy instruments 4620 and their data methodologies may capture and provide data that is limited in scope, due to the legacy systems and acquisition procedures, such as existing data methodologies described above herein, to a particular range of frequencies and the like. The streaming data collector 4610 may be configured to capture streaming instrument data 4632 as well as legacy instrument data 4630. The streaming data collector 4610 may also be configured to capture current streaming instruments 4620 and legacy instruments 4622 and sensors using current and legacy data methodologies. These embodiments may be useful in transition applications from the legacy instruments and processing to the streaming instruments and processing that may be current or desired instruments or methodologies. In embodiments, the streaming data collector 4610 may be configured to process the legacy instrument data 4630 so that it can be stored compatibly with the streamed instrument data 4632. The streaming data collector 4610 may process or parse the streamed instrument data 4632 based on the legacy instrument data 4630 to produce at least one extraction of the streamed data 4642 that is compatible with the legacy instrument data 4630 that can be processed into translated legacy data 4640. In embodiments, extracted data 4650 that can include extracted portions of translated legacy data 4652 and streamed data 4654 may be stored in a format that facilitates access and processing by legacy instrument data processing and further processing that can emulate legacy instrument data processing methods, and the like. In embodiments, the portions of the translated legacy data 4652 may also be stored in a format that facilitates processing with different methods that can take advantage of the greater frequencies, resolution, and volume of data possible with a streaming instrument.

Figure 20:
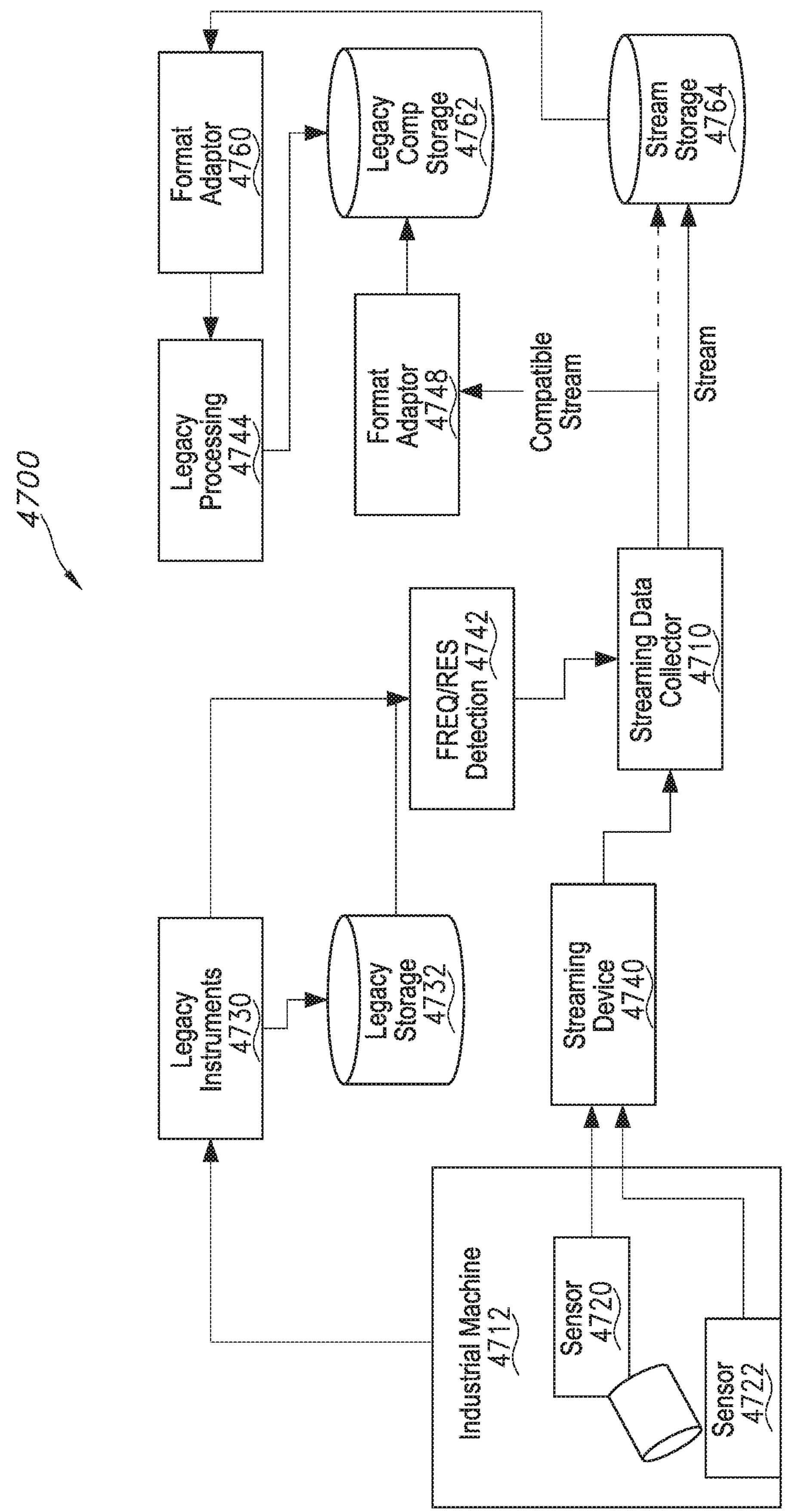
FIG. 20 is a diagrammatic view of industrial machine sensing using both legacy and updated streamed sensor data processing in accordance with the present disclosure.

FIG. 20 depicts alternate embodiments descriptive of methods and systems 4700 for industrial machine sensor data streaming, collection, processing, and storage that facilitate integration of legacy instruments and processing. In embodiments, a streaming data collector 4710 may be connected with an industrial machine 4712 and may include a plurality of sensors, such as streaming sensors 4720 and 4722 that may be configured to sense aspects of the industrial machine 4712 associated with at least one moving part of the machine 4712. The sensors 4720 and 4722 (or more) may communicate with one or more streaming devices 4740 that may facilitate streaming data from one or more of the sensors to the streaming data collector 4710. In embodiments, the industrial machine 4712 may also interface with or include one or more legacy instruments 4730 that may capture data associated with one or more moving parts of the industrial machine 4712 and store that data into a legacy data storage facility 4732.

In embodiments, a frequency and/or resolution detection facility 4742 may be configured to facilitate detecting information about legacy instrument sourced data, such as a frequency range of the data or a resolution of the data, and the like. The detection facility 4742 may operate on data directly from the legacy instruments 4730 or from data stored in a legacy storage facility 4732. The detection facility 4742 may communicate information detected about the legacy instruments 4730, its sourced data, and its stored data 4732, or the like to the streaming data collector 4710. Alternatively, the detection facility 4742 may access information, such as information about frequency ranges, resolution, and the like that characterizes the sourced data from the legacy instrument 4730 and/or may be accessed from a portion of the legacy storage facility 4732.

In embodiments, the streaming data collector 4710 may be configured with one or more automatic processors, algorithms, and/or other data methodologies to match up information captured by the one or more legacy instruments 4730 with a portion of data being provided by the one or more streaming devices 4740 from the one or more industrial machines 4712. Data from streaming devices 4740 may include a wider range of frequencies and resolutions than the sourced data of legacy instruments 4730 and, therefore, filtering and other such functions can be implemented to extract data from the streaming devices 4740 that corresponds to the sourced data of the legacy instruments 4730 in aspects such as frequency range, resolution, and the like. In embodiments, the configured streaming data collector 4710 may produce a plurality of streams of data, including a stream of data that may correspond to the stream of data from the streaming device 4740 and a separate stream of data that is compatible, in some aspects, with the legacy instrument sourced data and the infrastructure to ingest and automatically process it. Alternatively, the streaming data collector 4710 may output data in modes other than as a stream, such as batches, aggregations, summaries, and the like.

Configured streaming data collector 4710 may communicate with a stream storage facility 4764 for storing at least one of the data outputs from the streaming device 4710 and data extracted therefrom that may be compatible, in some aspects, with the sourced data of the legacy instruments 4730. A legacy compatible output of the configured streaming data collector 4710 may also be provided to a format adaptor facility 4748, 4760 that may configure, adapt, reformat, and make other adjustments to the legacy compatible data so that it can be stored in a legacy compatible storage facility 4762 so that legacy processing facilities 4744 may execute data processing methods on data in the legacy compatible storage facility 4762 and the like that are configured to process the sourced data of the legacy instruments 4730. In embodiments in which legacy compatible data is stored in the stream storage facility 4764, legacy processing facility 4744 may also automatically process this data after optionally being processed by format adaptor 4760. By arranging the data collection, streaming, processing, formatting, and storage elements to provide data in a format that is fully compatible with legacy instrument sourced data, transition from a legacy system can be simplified, and the sourced data from legacy instruments can be easily compared to newly acquired data (with more content) without losing the legacy value of the sourced data from the legacy instruments 4730.

Figure 21:
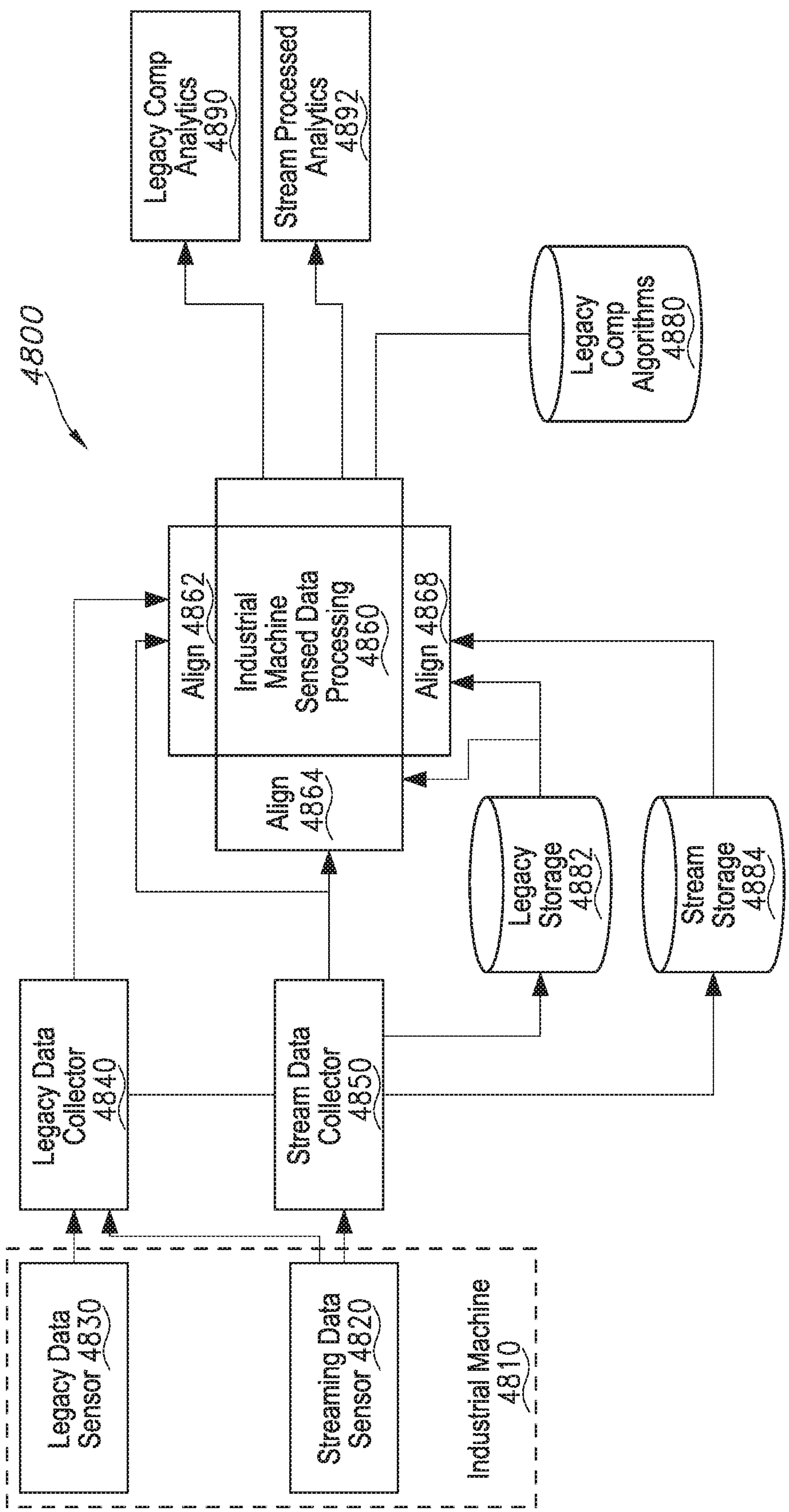
FIG. 21 is a diagrammatic view of an industrial machine sensed data processing system that facilitates portal algorithm use and alignment of legacy and streamed sensor data in accordance with the present disclosure.

FIG. 21 depicts alternate embodiments of the methods and systems 4800 described herein for industrial machine sensor data streaming, collection, processing, and storage that may be compatible with legacy instrument data collection and processing. In embodiments, processing industrial machine sensed data may be accomplished in a variety of ways including aligning legacy and streaming sources of data, such as by aligning stored legacy and streaming data; aligning stored legacy data with a stream of sensed data; and aligning legacy and streamed data as it is being collected. In embodiments, an industrial machine 4810 may include, communicate with, or be integrated with one or more stream data sensors 4820 that may sense aspects of the industrial machine 4810 such as aspects of one or more moving parts of the machine. The industrial machine 4810 may also communicate with, include, or be integrated with one or more legacy data sensors 4830 that may sense similar aspects of the industrial machine 4810. In embodiments, the one or more legacy data sensors 4830 may provide sensed data to one or more legacy data collectors 4840. The stream data sensors 4820 may produce an output that encompasses all aspects of (i.e., a richer signal) and is compatible with sensed data from the legacy data sensors 4830. The stream data sensors 4820 may provide compatible data to the legacy data collector 4840. By mimicking the legacy data sensors 4830 or their data streams, the stream data sensors 4820 may replace (or serve as suitable duplicate for) one or more legacy data sensors, such as during an upgrade of the sensing and processing system of an industrial machine. Frequency range, resolution, and the like may be mimicked by the stream data so as to ensure that all forms of legacy data are captured or can be derived from the stream data. In embodiments, format conversion, if needed, can also be performed by the stream data sensors 4820. The stream data sensors 4820 may also produce an alternate data stream that is suitable for collection by the stream data collector 4850. In embodiments, such an alternate data stream may be a superset of the legacy data sensor data in at least one or more of: frequency range, resolution, duration of sensing the data, and the like.

In embodiments, an industrial machine sensed data processing facility 4860 may execute a wide range of sensed data processing methods, some of which may be compatible with the data from legacy data sensors 4830 and may produce outputs that may meet legacy sensed data processing requirements. To facilitate use of a wide range of data processing capabilities of processing facility 4860, legacy and stream data may need to be aligned so that a compatible portion of stream data may be extracted for processing with legacy compatible methods and the like. In embodiments, FIG. 21 depicts three different techniques for aligning stream data to legacy data. A first alignment methodology 4862 includes aligning legacy data output by the legacy data collector 4840 with stream data output by the stream data collector 4850. As data is provided by the legacy data collector 4840, aspects of the data may be detected, such as resolution, frequency, duration, and the like, and may be used as control for a processing method that identifies portions of a stream of data from the stream data collector 4850 that are purposely compatible with the legacy data. The processing facility 4860 may apply one or more legacy compatible methods on the identified portions of the stream data to extract data that can be easily compared to or referenced against the legacy data.

In embodiments, a second alignment methodology 4864 may involve aligning streaming data with data from a legacy storage facility 4882. In embodiments, a third alignment methodology 4868 may involve aligning stored stream data from a stream storage facility 4884 with legacy data from the legacy data storage facility 4882. In each of the methodologies 4862, 4864, 4868, alignment data may be determined by processing the legacy data to detect aspects such as resolution, duration, frequency range, and the like. Alternatively, alignment may be performed by an alignment facility, such as facilities using methodologies 4862, 4864, 4868 that may receive or may be configured with legacy data descriptive information such as legacy frequency range, duration, resolution, and the like.

In embodiments, an industrial machine sensing data processing facility 4860 may have access to legacy compatible methods and algorithms that may be stored in a legacy data methodology storage facility 4880. These methodologies, algorithms, or other data in the legacy algorithm storage facility 4880 may also be a source of alignment information that could be communicated by the industrial machine sensed data processing facility 4860 to the various alignment facilities having methodologies 4862, 4864, 4868. By having access to legacy compatible algorithms and methodologies, the data processing facility 4860 may facilitate processing legacy data, streamed data that is compatible with legacy data, or portions of streamed data that represent the legacy data to produce legacy compatible analytics.

In embodiments, the data processing facility 4860 may execute a wide range of other sensed data processing methods, such as wavelet derivations and the like, to produce streamed data analytics 4892. In embodiments, the streaming data collector 102, 4510, 4610, 4710 (FIGS. 3, 6, 18, 19, 20) or data processing facility 4860 may include portable algorithms, methodologies, and inputs that may be defined and extracted from data streams. In many examples, a user or enterprise may already have existing and effective methods related to analyzing specific pieces of machinery and assets. These existing methods could be imported into the configured streaming data collector 102, 4510, 4610, 4710 or the data processing facility 4860 as portable algorithms or methodologies. Data processing, such as described herein for the configured streaming data collector 102, 4510, 4610, 4710 may also match an algorithm or methodology to a situation, then extract data from a stream to match to the data methodology from the legacy acquisition or legacy acquisition techniques. In embodiments, the streaming data collector 102, 4510, 4610, 4710 may be compatible with many types of systems and may be compatible with systems having varying degrees of criticality.

Exemplary industrial machine deployments of the methods and systems described herein are now described. An industrial machine may be a gas compressor. In an example, a gas compressor may operate an oil pump on a very large turbo machine, such as a very large turbo machine that includes 10,000 HP motors. The oil pump may be a highly critical system as its failure could cause an entire plant to shut down. The gas compressor in this example may run four stages at a very high frequency, such as 36,000 RPM, and may include tilt pad bearings that ride on an oil film. The oil pump in this example may have roller bearings, such that if an anticipated failure is not being picked up by a user, the oil pump may stop running, and the entire turbo machine would fail. Continuing with this example, the streaming data collector 102, 4510, 4610, 4710 may collect data related to vibrations, such as casing vibration and proximity probe vibration. Other bearings industrial machine examples may include generators, power plants, boiler feed pumps, fans, forced draft fans, induced draft fans, and the like. The streaming data collector 102, 4510, 4610, 4710 for a bearings system used in the industrial gas industry may support predictive analysis on the motors, such as that performed by model-based expert systems—for example, using voltage, current, and vibration as analysis metrics.

Another exemplary industrial machine deployment may be a motor and the streaming data collector 102, 4510, 4610, 4710 that may assist in the analysis of a motor by collecting voltage and current data on the motor, for example.

Yet another exemplary industrial machine deployment may include oil quality sensing. An industrial machine may conduct oil analysis, and the streaming data collector 102, 4510, 4610, 4710 may assist in searching for fragments of metal in oil, for example.

The methods and systems described herein may also be used in combination with model-based systems. Model-based systems may integrate with proximity probes. Proximity probes may be used to sense problems with machinery and shut machinery down due to sensed problems. A model-based system integrated with proximity probes may measure a peak waveform and send a signal that shuts down machinery based on the peak waveform measurement.

Enterprises that operate industrial machines may operate in many diverse industries. These industries may include industries that operate manufacturing lines, provide computing infrastructure, support financial services, provide HVAC equipment, and the like. These industries may be highly sensitive to lost operating time and the cost incurred due to lost operating time. HVAC equipment enterprises in particular may be concerned with data related to ultrasound, vibration, IR, and the like, and may get much more information about machine performance related to these metrics using the methods and systems of industrial machine sensed data streaming collection than from legacy systems.

Methods and systems described herein for industrial machine sensor data streaming, collection, processing, and storage may be configured to operate and integrate with existing data collection, processing and storage systems and may include a method for capturing a plurality of streams of sensed data from sensors deployed to monitor aspects of an industrial machine associated with at least one moving part of the machine; at least one of the streams containing a plurality of frequencies of data. The method may include identifying a subset of data in at least one of the multiple streams that corresponds to data representing at least one predefined frequency. The at least one predefined frequency is represented by a set of data collected from alternate sensors deployed to monitor aspects of the industrial machine associated with the at least one moving part of the machine. The method may further include processing the identified data with a data processing facility that processes the identified data with data methodologies configured to be applied to the set of data collected from alternate sensors. Lastly, the method may include storing the at least one of the streams of data, the identified subset of data, and a result of processing the identified data in an electronic data set.

The methods and systems may include a method for applying data captured from sensors deployed to monitor aspects of an industrial machine associated with at least one moving part of the machine, the data captured with predefined lines of resolution covering a predefined frequency range, to a frequency matching facility that identifies a subset of data streamed from other sensors deployed to monitor aspects of the industrial machine associated with at least one moving part of the machine, the streamed data comprising a plurality of lines of resolution and frequency ranges, the subset of data identified corresponding to the lines of resolution and predefined frequency range. This method may include storing the subset of data in an electronic data record in a format that corresponds to a format of the data captured with predefined lines of resolution, and signaling to a data processing facility the presence of the stored subset of data. This method may optionally include processing the subset of data with at least one of algorithms, methodologies, models, and pattern recognizers that corresponds to algorithms, methodologies, models, and pattern recognizers associated with processing the data captured with predefined lines of resolution covering a predefined frequency range.

The methods and systems may include a method for identifying a subset of streamed sensor data. The sensor data is captured from sensors deployed to monitor aspects of an industrial machine associated with at least one moving part of the machine. The subset of streamed sensor data is at predefined lines of resolution for a predefined frequency range. The method includes establishing a first logical route for communicating electronically between a first computing facility performing the identifying and a second computing facility. The identified subset of the streamed sensor data is communicated exclusively over the established first logical route when communicating the subset of streamed sensor data from the first facility to the second facility. This method may further include establishing a second logical route for communicating electronically between the first computing facility and the second computing facility for at least one portion of the streamed sensor data that is not the identified subset. This method may further include establishing a third logical route for communicating electronically between the first computing facility and the second computing facility for at least one portion of the streamed sensor data that includes the identified subset and at least one other portion of the data not represented by the identified subset.

The methods and systems may include a first data sensing and processing system that captures first data from a first set of sensors deployed to monitor aspects of an industrial machine associated with at least one moving part of the machine, the first data covering a set of lines of resolution and a frequency range. This system may include a second data sensing and processing system that captures and streams a second set of data from a second set of sensors deployed to monitor aspects of the industrial machine associated with at least one moving part of the machine, the second data covering a plurality of lines of resolution that includes the set of lines of resolution and a plurality of frequencies that includes the frequency range. The system may enable: (1) selecting a portion of the second data that corresponds to the set of lines of resolution and the frequency range of the first data; and (2) processing the selected portion of the second data with the first data sensing and processing system.

The methods and systems may include a method for automatically processing a portion of a stream of sensed data. The sensed data received from a first set of sensors deployed to monitor aspects of an industrial machine associated with at least one moving part of the machine in response to an electronic data structure that facilitates extracting a subset of the stream of sensed data that corresponds to a set of sensed data received from a second set of sensors deployed to monitor the aspects of the industrial machine associated with the at least one moving part of the machine. The set of sensed data is constrained to a frequency range. The stream of sensed data includes a range of frequencies that exceeds the frequency range of the set of sensed data. The processing comprises executing data methodologies on a portion of the stream of sensed data that is constrained to the frequency range of the set of sensed data. The data methodologies are configured to process the set of sensed data.

The methods and systems may include a method for receiving first data from sensors deployed to monitor aspects of an industrial machine associated with at least one moving part of the machine. This method may further include: (1) detecting at least one of a frequency range and lines of resolution represented by the first data, and (2) receiving a stream of data from sensors deployed to monitor the aspects of the industrial machine associated with the at least one moving part of the machine. The stream of data includes: a plurality of frequency ranges and a plurality of lines of resolution that exceeds the frequency range and the lines of resolution represented by the first data; extracting a set of data from the stream of data that corresponds to at least one of the frequency range and the lines of resolution represented by the first data; and processing the extracted set of data with a data processing method that is configured to process data within the frequency range and within the lines of resolution of the first data.

Figure 22:
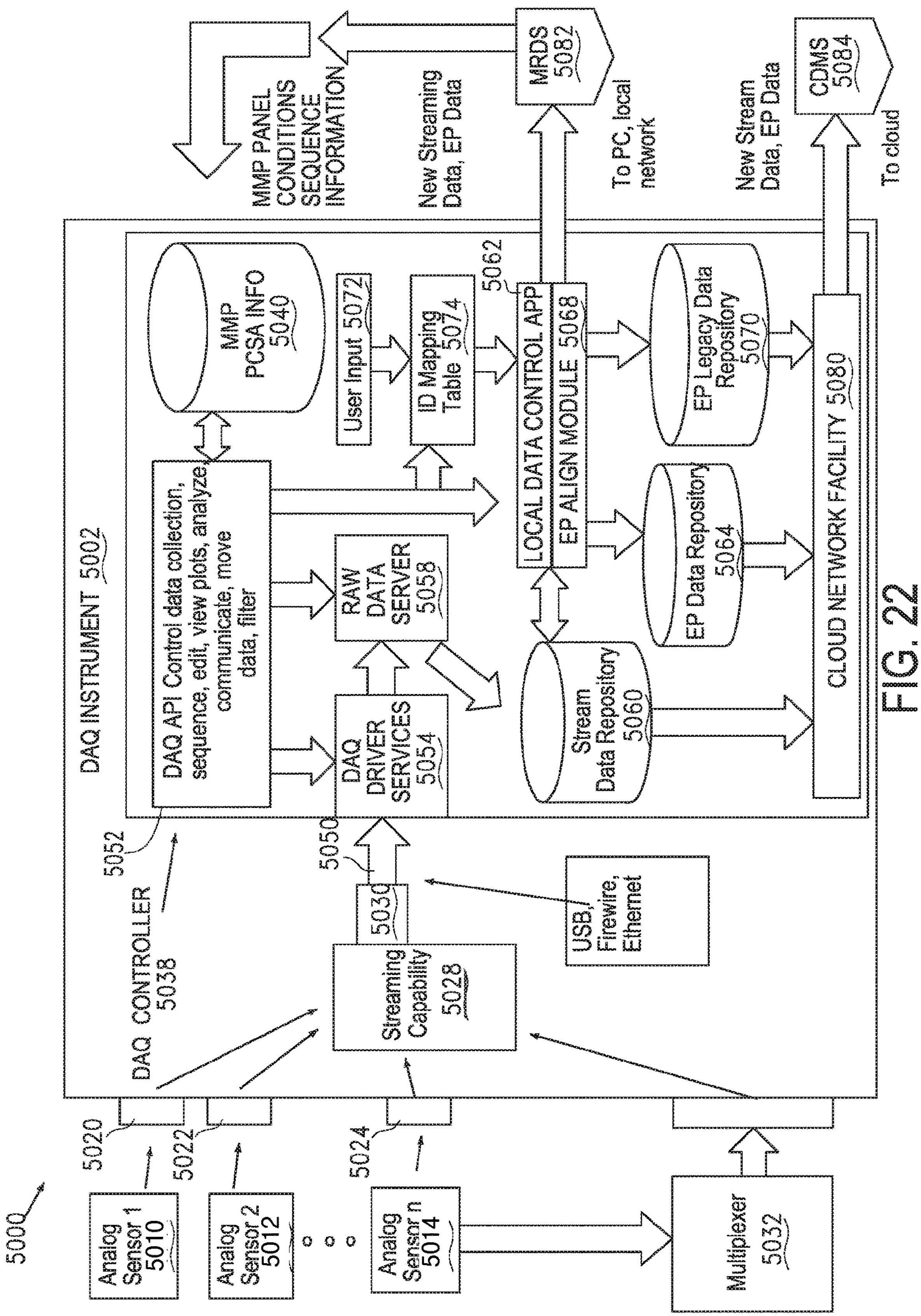
FIG. 22 is a diagrammatic view of components and interactions of a data collection architecture involving a streaming data acquisition instrument receiving analog sensor signals from an industrial environment connected to a cloud network facility in accordance with the present disclosure.

The methods and systems disclosed herein may include, connect to, or be integrated with a data acquisition instrument and in the many embodiments, FIG. 22 shows methods and systems 5000 that includes a data acquisition (DAQ) streaming instrument 5002 also known as an SDAQ. In embodiments, output from sensors 5010, 5012, 5014 may be of various types including vibration, temperature, pressure, ultrasound and so on. In my many examples, one of the sensors may be used. In further examples, many of the sensors may be used and their signals may be used individually or in predetermined combinations and/or at predetermined intervals, circumstances, setups, and the like.

In embodiments, the output signals from the sensors 5010, 5012, 5014 may be fed into instrument inputs 5020, 5022, 5024 of the DAQ instrument 5002 and may be configured with additional streaming capabilities 5028. By way of these many examples, the output signals from the sensors 5010, 5012, 5014, or more as applicable, may be conditioned as an analog signal before digitization with respect to at least scaling and filtering. The signals may then be digitized by an analog-to-digital converter 5030. The signals received from all relevant channels (i.e., one or more channels are switched on manually, by alarm, by route, and the like) may be simultaneously sampled at a predetermined rate sufficient to perform the maximum desired frequency analysis that may be adjusted and readjusted as needed or otherwise held constant to ensure compatibility or conformance with other relevant datasets. In embodiments, the signals are sampled for a relatively long time and gap-free as one continuous stream so as to enable further post-processing at lower sampling rates with sufficient individual sampling.

In embodiments, data may be streamed from a collection of points and then the next set of data may be collected from additional points according to a prescribed sequence, route, path, or the like. In many examples, the sensors 5010, 5012, 5014 or more may be moved to the next location according to the prescribed sequence, route, pre-arranged configurations, or the like. In certain examples, not all of the sensor 5010, 5012, 5014 may move and therefore some may remain fixed in place and used for detection of reference phase or the like.

In embodiments, a multiplex (mux) 5032 may be used to switch to the next collection of points, to a mixture of the two methods or collection patterns that may be combined, other predetermined routes, and the like. The multiplexer 5032 may be stackable so as to be laddered and effectively accept more channels than the DAQ instrument 5002 provides. In examples, the DAQ instrument 5002 may provide eight channels while the multiplexer 5032 may be stacked to supply 32 channels. Further variations are possible with one more multiplexers. In embodiments, the multiplexer 5032 may be fed into the DAQ instrument 5002 through an instrument input 5034. In embodiments, the DAQ instrument 5002 may include a controller 5038 that may take the form of an onboard controller, a PC, other connected devices, network based services, and combinations thereof.

In embodiments, the sequence and panel conditions used to govern the data collection process may be obtained from the multimedia probe (MMP) and probe control, sequence and analytical (PCSA) information store 5040. In embodiments, the information store 5040 may be onboard the DAQ instrument 5002. In embodiments, contents of the information store 5040 may be obtained through a cloud network facility, from other DAQ instruments, from other connected devices, from the machine being sensed, other relevant sources, and combinations thereof. In embodiments, the information store 5040 may include such items as the hierarchical structural relationships of the machine, e.g., a machine contains predetermined pieces of equipment, each of which may contain one or more shafts and each of those shafts may have multiple associated bearings. Each of those types of bearings may be monitored by specific types of transducers or probes, according to one or more specific prescribed sequences (paths, routes, and the like) and with one or more specific panel conditions that may be set on the one or more DAQ instruments 5002. By way of this example, the panel conditions may include hardware specific switch settings or other collection parameters. In many examples, collection parameters include but are not limited to a sampling rate, AC/DC coupling, voltage range and gain, integration, high and low pass filtering, anti-aliasing filtering, ICP™ transducers and other integrated-circuit piezoelectric transducers, 4-20 mA loop sensors, and the like. In embodiments, the information store 5040 may also include machinery specific features that may be important for proper analysis such as gear teeth for a gear, number blades in a pump impeller, number of motor rotor bars, bearing specific parameters necessary for calculating bearing frequencies, revolution per minutes information of all rotating elements and multiples of those RPM ranges, and the like. Information in the information store may also be used to extract stream data 5050 for permanent storage.

Based on directions from the DAQ API software 5052, digitized waveforms may be uploaded using DAQ driver services 5054 of a driver onboard the DAQ instrument 5002. In embodiments, data may then be fed into a raw data server 5058 which may store the stream data 5050 in a stream data repository 5060. In embodiments, this data storage area is typically meant for storage until the data is copied off of the DAQ instrument 5002 and verified. The DAQ API 5052 may also direct the local data control application 5062 to extract and process the recently obtained stream data 5050 and convert it to the same or lower sampling rates of sufficient length to effect one or more desired resolutions. By way of these examples, this data may be converted to spectra, averaged, and processed in a variety of ways and stored, at least temporarily, as extracted/processed (EP) data 5064. It will be appreciated in light of the disclosure that legacy data may require its own sampling rates and resolution to ensure compatibility and often this sampling rate may not be integer proportional to the acquired sampling rate. It will also be appreciated in light of the disclosure that this may be especially relevant for order-sampled data whose sampling frequency is related directly to an external frequency (typically the running speed of the machine or its local componentry) rather than the more-standard sampling rates employed by the internal crystals, clock functions, or the like of the DAQ instrument (e.g., values of Fmax of 100, 200, 500, 1K, 2K, 5K, 10K, 20K, and so on).

In embodiments, the extract/process (EP) align module 5068 of the local data control application 5062 may be able to fractionally adjust the sampling rates to these non-integer ratio rates satisfying an important requirement for making data compatible with legacy systems. In embodiments, fractional rates may also be converted to integer ratio rates more readily because the length of the data to be processed may be adjustable. It will be appreciated in light of the disclosure that if the data was not streamed and just stored as spectra with the standard or predetermined Fmax, it may be impossible in certain situations to convert it retroactively and accurately to the order-sampled data. It will also be appreciated in light of the disclosure that internal identification issues may also need to be reconciled. In many examples, stream data may be converted to the proper sampling rate and resolution as described and stored (albeit temporarily) in an EP legacy data repository 5070 to ensure compatibility with legacy data.

To support legacy data identification issues, a user input module 5072 is shown in many embodiments should there be no automated process (whether partially or wholly) for identification translation. In such examples, one or more legacy systems (i.e., pre-existing data acquisition) may be characterized in that the data to be imported is in a fully standardized format such as a Mimosa™ format, and other similar formats. Moreover, sufficient indentation of the legacy data and/or the one or more machines from which the legacy data was produced may be required in the completion of an identification mapping table 5074 to associate and link a portion of the legacy data to a portion of the newly acquired streamed data 5050. In many examples, the end user and/or legacy vendor may be able to supply sufficient information to complete at least a portion of a functioning identification (ID) mapping table 5074 and therefore may provide the necessary database schema for the raw data of the legacy system to be used for comparison, analysis, and manipulation of newly streamed data 5050.

In embodiments, the local data control application 5062 may also direct streaming data as well as extracted/processed (EP) data to a cloud network facility 5080 via wired or wireless transmission. From the cloud network facility 5080 other devices may access, receive, and maintain data including the data from a master raw data server (MRDS) 5082. The movement, distribution, storage, and retrieval of data remote to the DAQ instrument 5002 may be coordinated by the cloud data management services ("CDMS") 5084.

Figure 23:
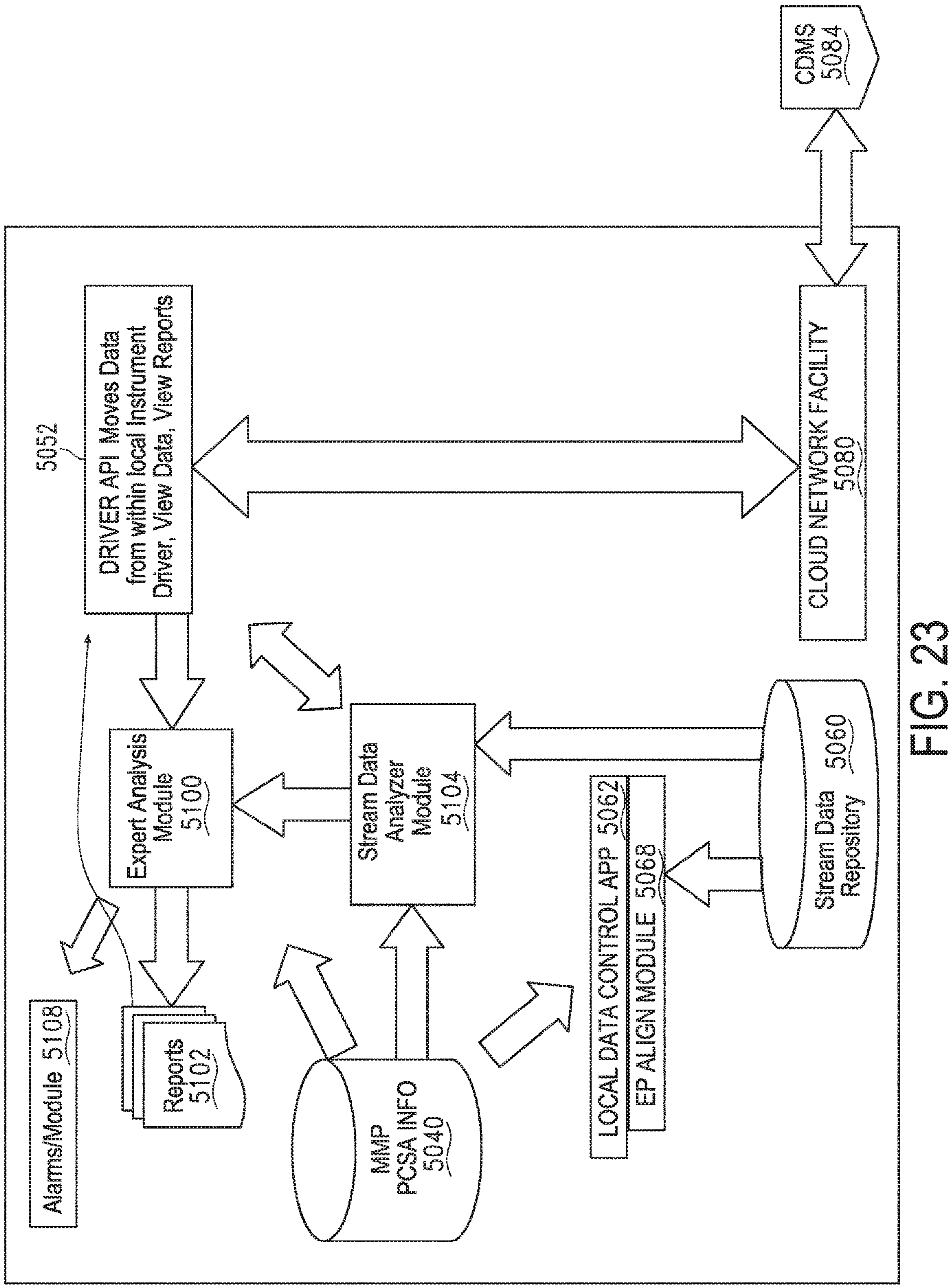
FIG. 23 is a diagrammatic view of components and interactions of a data collection architecture involving a streaming data acquisition instrument having an alarms module, expert analysis module, and a driver API to facilitate communication with a cloud network facility in accordance with the present disclosure.

FIG. 23 shows additional methods and systems that include the DAQ instrument 5002 accessing related cloud based services. In embodiments, the DAQ API 5052 may control the data collection process as well as its sequence. By way of these examples, the DAQ API 5052 may provide the capability for editing processes, viewing plots of the data, controlling the processing of that data, viewing the output data in all its myriad forms, analyzing this data including expert analysis, and communicating with external devices via the local data control application 5062 and with the CDMS 5084 via the cloud network facility 5080. In embodiments, the DAQ API 5052 may also govern the movement of data, its filtering, as well as many other housekeeping functions.

In embodiments, an expert analysis module 5100 may generate reports 5102 that may use machine or measurement point specific information from the information store 5040 to analyze the stream data 5050 using a stream data analyzer module 5104 and the local data control application 5062 with the extract/process ("EP") align module 5068. In embodiments, the expert analysis module 5100 may generate new alarms or ingest alarm settings into an alarms module 5108 that is relevant to the stream data 5050. In embodiments, the stream data analyzer module 5104 may provide a manual or automated mechanism for extracting meaningful information from the stream data 5050 in a variety of plotting and report formats. In embodiments, a supervisory control of the expert analysis module 5100 is provided by the DAQ API 5052. In further examples, the expert analysis module 5100 may be supplied (wholly or partially) via the cloud network facility 5080. In many examples, the expert analysis module 5100 via the cloud may be used rather than a locally-deployed expert analysis module 5100 for various reasons such as using the most up-to-date software version, more processing capability, a bigger volume of historical data to reference, and so on. In many examples, it may be important that the expert analysis module 5100 be available when an internet connection cannot be established so having this redundancy may be crucial for seamless and time efficient operation. Toward that end, many of the modular software applications and databases available to the DAQ instrument 5002 where applicable may be implemented with system component redundancy to provide operational robustness to provide connectivity to cloud services when needed but also operate successfully in isolated scenarios where connectivity is not available and sometime not available purposefully to increase security and the like.

In embodiments, the DAQ instrument acquisition may require a real time operating system ("RTOS") for the hardware especially for streamed gap-free data that is acquired by a PC. In some instances, the requirement for a RTOS may result in (or may require) expensive custom hardware and software capable of running such a system. In many embodiments, such expensive custom hardware and software may be avoided and an RTOS may be effectively and sufficiently implemented using a standard Windows™ operating systems or similar environments including the system interrupts in the procedural flow of a dedicated application included in such operating systems.

Figure 24:
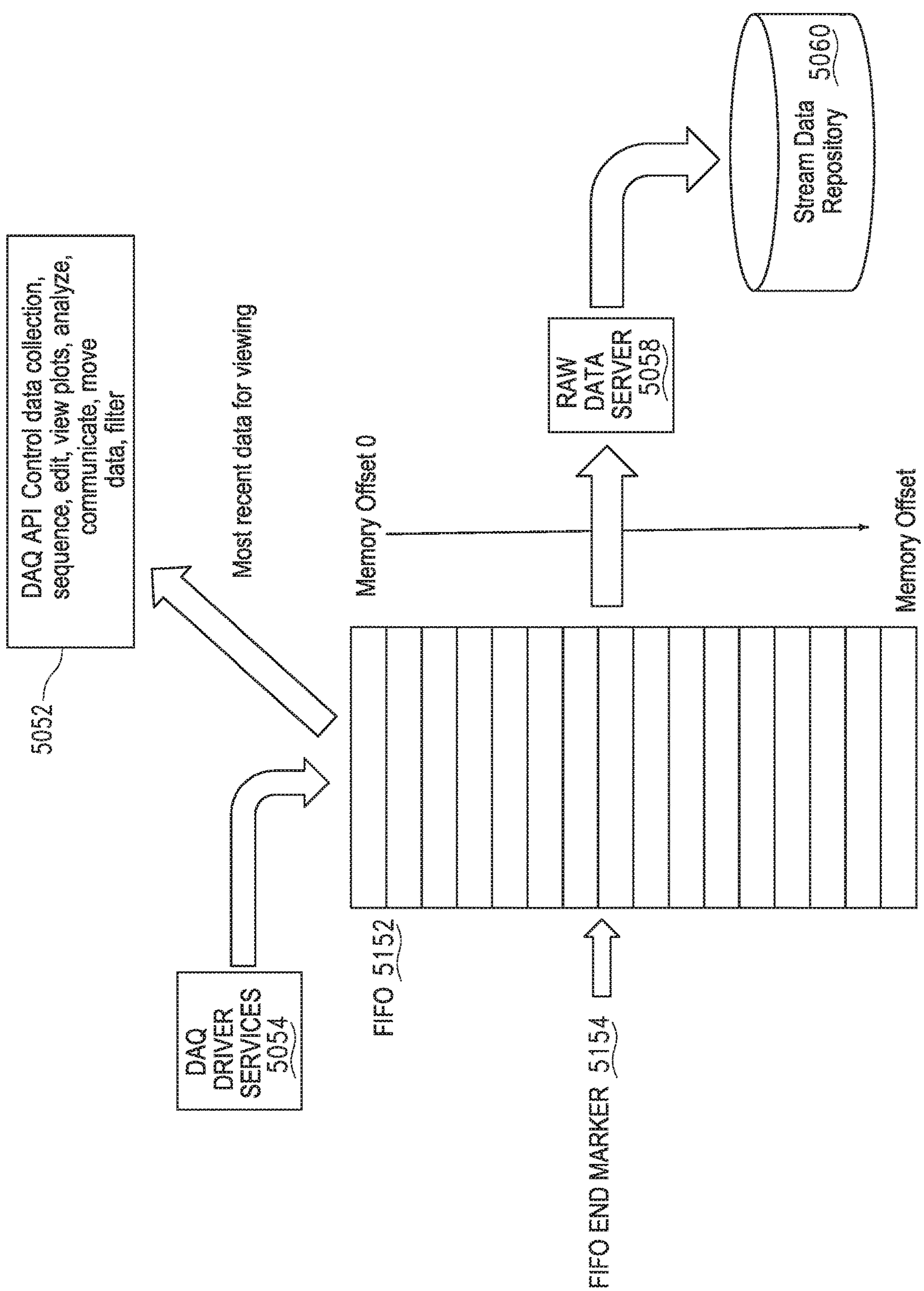
FIG. 24 is a diagrammatic view of components and interactions of a data collection architecture involving a streaming data acquisition instrument and first in, first out memory architecture to provide a real time operating system in accordance with the present disclosure.

The methods and systems disclosed herein may include, connect to, or be integrated with one or more DAQ instruments and in the many embodiments, FIG. 24 shows methods and systems 5150 that include the DAQ instrument 5002 (also known as a streaming DAQ or an SDAQ). In embodiments, the DAQ instrument 5002 may effectively and sufficiently implement an RTOS using standard windows operating system (or other similar personal computing systems) that may include a software driver configured with a First In, First Out (FIFO) memory area 5152. The FIFO memory area 5152 may be maintained and hold information for a sufficient amount of time to handle a worst-case interrupt that it may face from the local operating system to effectively provide the RTOS. In many examples, configurations on a local personal computer or connected device may be maintained to minimize operating system interrupts. To support this, the configurations may be maintained, controlled, or adjusted to eliminate (or be isolated from) any exposure to extreme environments where operating system interrupts may become an issue. In embodiments, the DAQ instrument 5002 may produce a notification, alarm, message, or the like to notify a user when any gap errors are detected. In these many examples, such errors may be shown to be rare and even if they occur, the data may be adjusted knowing when they occurred should such a situation arise.

In embodiments, the DAQ instrument 5002 may maintain a sufficiently large FIFO memory area 5152 that may buffer the incoming data so as to be not affected by operating system interrupts when acquiring data. It will be appreciated in light of the disclosure that the predetermined size of the FIFO memory area 5152 may be based on operating system interrupts that may include Windows system and application functions such as the writing of data to Disk or SSD, plotting, GUI interactions and standard Windows tasks, low-level driver tasks such as servicing the DAQ hardware and retrieving the data in bursts, and the like.

In embodiments, the computer, controller, connected device or the like that may be included in the DAQ instrument 5002 may be configured to acquire data from the one or more hardware devices over a USB port, firewire, ethernet, or the like. In embodiments, the DAQ driver services 5054 may be configured to have data delivered to it periodically so as to facilitate providing a channel specific FIFO memory buffer that may be configured to not miss data, i.e., it is gap-free. In embodiments, the DAQ driver services 5054 may be configured so as to maintain an even larger (than the device) channel specific FIFO area 5152 that it fills with new data obtained from the device. In embodiments, the DAQ driver services 5054 may be configured to employ a further process in that the raw data server 5058 may take data from the FIFO 5110 and may write it as a contiguous stream to non-volatile storage areas such as the stream data repository 5060 that may be configured as one or more disk drives, SSDs, or the like. In embodiments, the FIFO 5110 may be configured to include a starting and stopping marker or pointer to mark where the latest most current stream was written. By way of these examples, a FIFO end marker 5114 may be configured to mark the end of the most current data until it reaches the end of the spooler and then wraps around constantly cycling around. In these examples, there is always one megabyte (or other configured capacities) of the most current data available in the FIFO 5110 once the spooler fills up. It will be appreciated in light of the disclosure that further configurations of the FIFO memory area may be employed. In embodiments, the DAQ driver services 5054 may be configured to use the DAQ API 5052 to pipe the most recent data to a high-level application for processing, graphing and analysis purposes. In some examples, it is not required that this data be gap-free but even in these instances, it is helpful to identify and mark the gaps in the data. Moreover, these data updates may be configured to be frequent enough so that the user would perceive the data as live. In the many embodiments, the raw data is flushed to non-volatile storage without a gap at least for the prescribed amount of time and examples of the prescribed amount of time may be about thirty seconds to over four hours. It will be appreciated in light of the disclosure that many pieces of equipment and their components may contribute to the relative needed duration of the stream of gap-free data and those durations may be over four hours when relatively low speeds are present in large numbers, when non-periodic transient activity is occurring on a relatively long time frame, when duty cycle only permits operation in relevant ranges for restricted durations and the like.

With reference to FIG. 23, the stream data analyzer module 5104 may provide for the manual or extraction of information from the data stream in a variety of plotting and report formats. In embodiments, resampling, filtering (including anti-aliasing), transfer functions, spectrum analysis, enveloping, averaging, peak detection functionality, as well as a host of other signal processing tools, may be available for the analyst to analyze the stream data and to generate a very large array of snapshots. It will be appreciated in light of the disclosure that much larger arrays of snapshots are created than ever would have been possible by scheduling the collection of snapshots beforehand, i.e., during the initial data acquisition for the measurement point in question.

Figure 25:
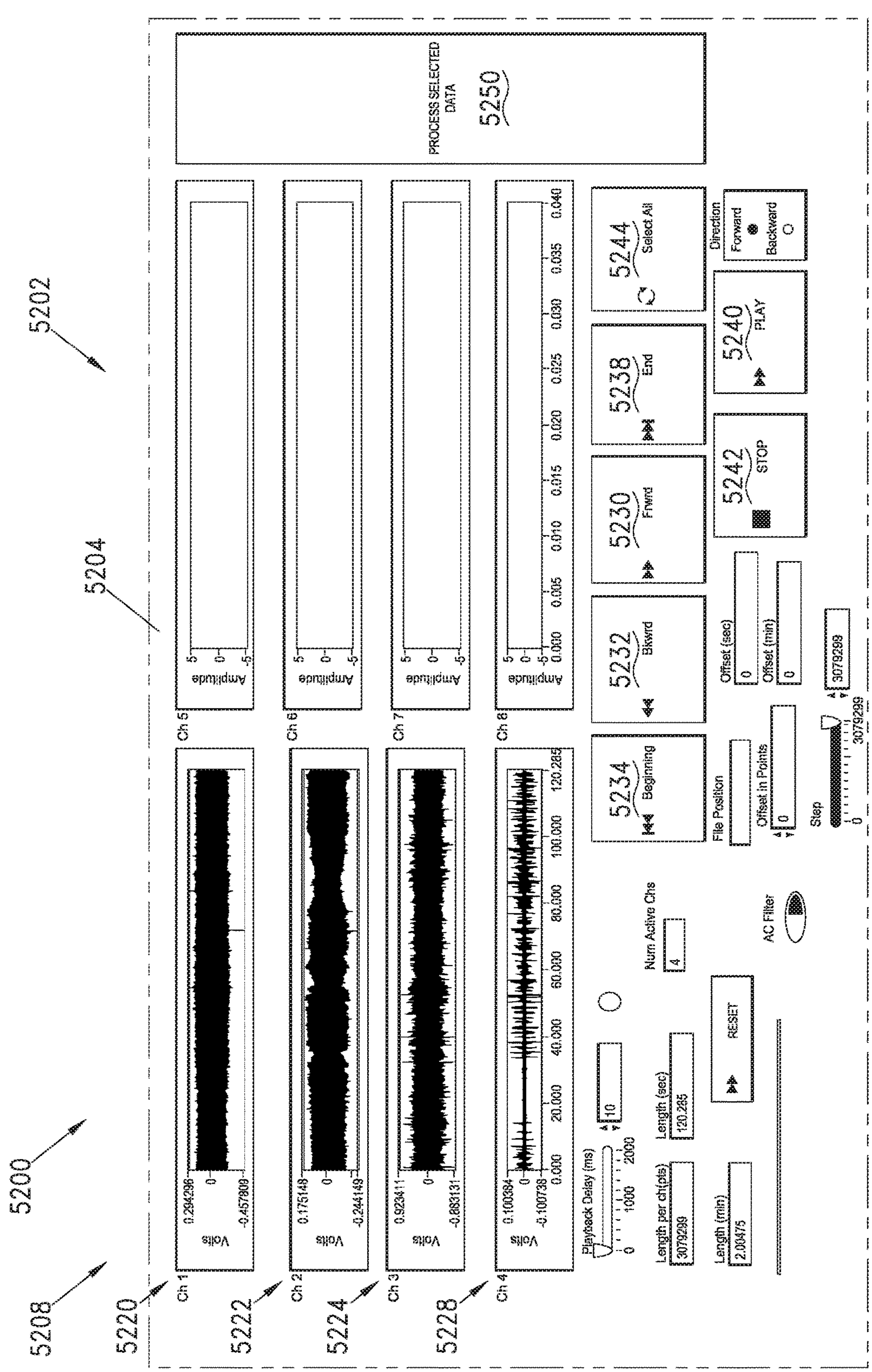
FIG. 25 through FIG. 30 are diagrammatic views of screens showing four analog sensor signals, transfer functions between the signals, analysis of each signal, and operating controls to move and edit throughout the streaming signals obtained from the sensors in accordance with the present disclosure.

FIG. 25 depicts a display 5200 whose viewable content 5202 may be accessed locally or remotely, wholly or partially. In many embodiments, the display 5200 may be part of the DAQ instrument 5002, may be part of the PC or connected device 5038 that may be part of the DAQ instrument 5002, or its viewable content 5202 may be viewable from associated network connected displays. In further examples, the viewable content 5202 of the display 5200 or portions thereof may be ported to one or more relevant network addresses. In the many embodiments, the viewable content 5202 may include a screen 5204 that shows, for example, an approximately two-minute data stream 5208 may be collected at a sampling rate of 25.6 kHz for four channels 5220, 5222, 5224, 5228, simultaneously. By way of these examples and in these configurations, the length of the data may be approximately 3.1 megabytes. It will be appreciated in light of the disclosure that the data stream (including each of its four channels or as many as applicable) may be replayed in some aspects like a magnetic tape recording (e.g. a reel-to-reel or a cassette) with all of the controls normally associated with playback such as forward 5230, fast forward, backward 5232, fast rewind, step back, step forward, advance to time point, retreat to time point, beginning 5234, end, 5238, play 5240, stop 5242, and the like. Additionally, the playback of the data stream may further be configured to set a width of the data stream to be shown as a contiguous subset of the entire stream. In the example with a two-minute data stream, the entire two minutes may be selected by the "select all" button 5244, or some subset thereof may be selected with the controls on the screen 5204 or that may be placed on the screen 5204 by configuring the display 5200 and the DAQ instrument 5002. In this example, the "process selected data" button 5250 on the screen 5204 may be selected to commit to a selection of the data stream.

Figure 26:
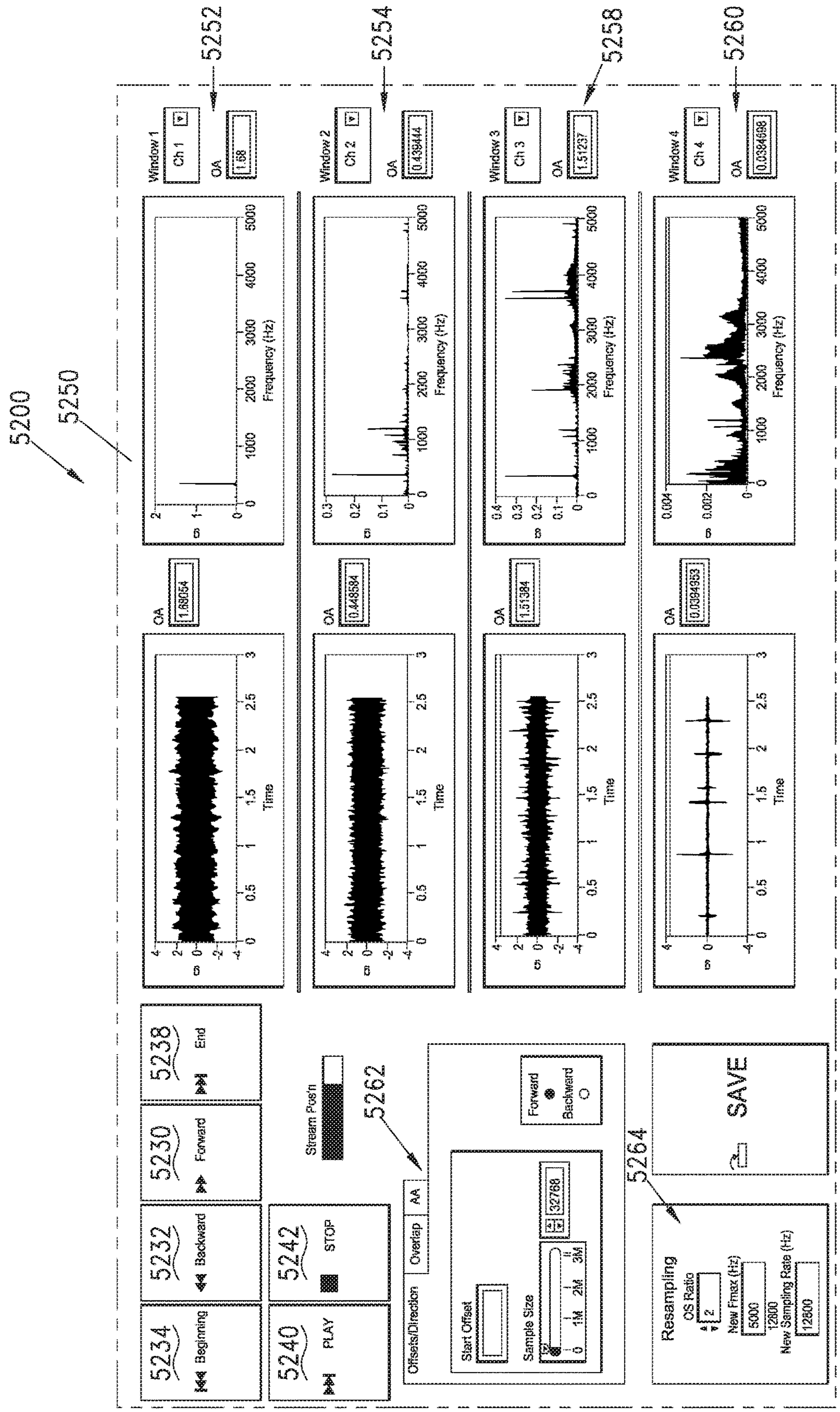

FIG. 26 depicts the many embodiments that include a screen 5250 on the display 5200 that shows results of selecting all of the data for this example. In embodiments, the screen 5250 in FIG. 26 may provide the same or similar playback capabilities as what is depicted on the screen 5204 shown in FIG. 25 but also includes resampling capabilities, waveform displays, and spectrum displays. In light of the disclosure, it will be appreciated that this functionality may permit the user to choose in many situations any Fmax less than that supported by the original streaming sampling rate. In embodiments, any section of any size may be selected and further processing, analytics, and tools for viewing and dissecting the data may be provided. In embodiments, the screen 5250 may include four windows 5252, 5254, 5258, 5260 that show the stream data from the four channels 5220, 5222, 5224, 5228 of FIG. 25. In embodiments, the screen 5250 may also include offset and overlap controls 5262, resampling controls 5264, and other similar controls.

Figure 27:
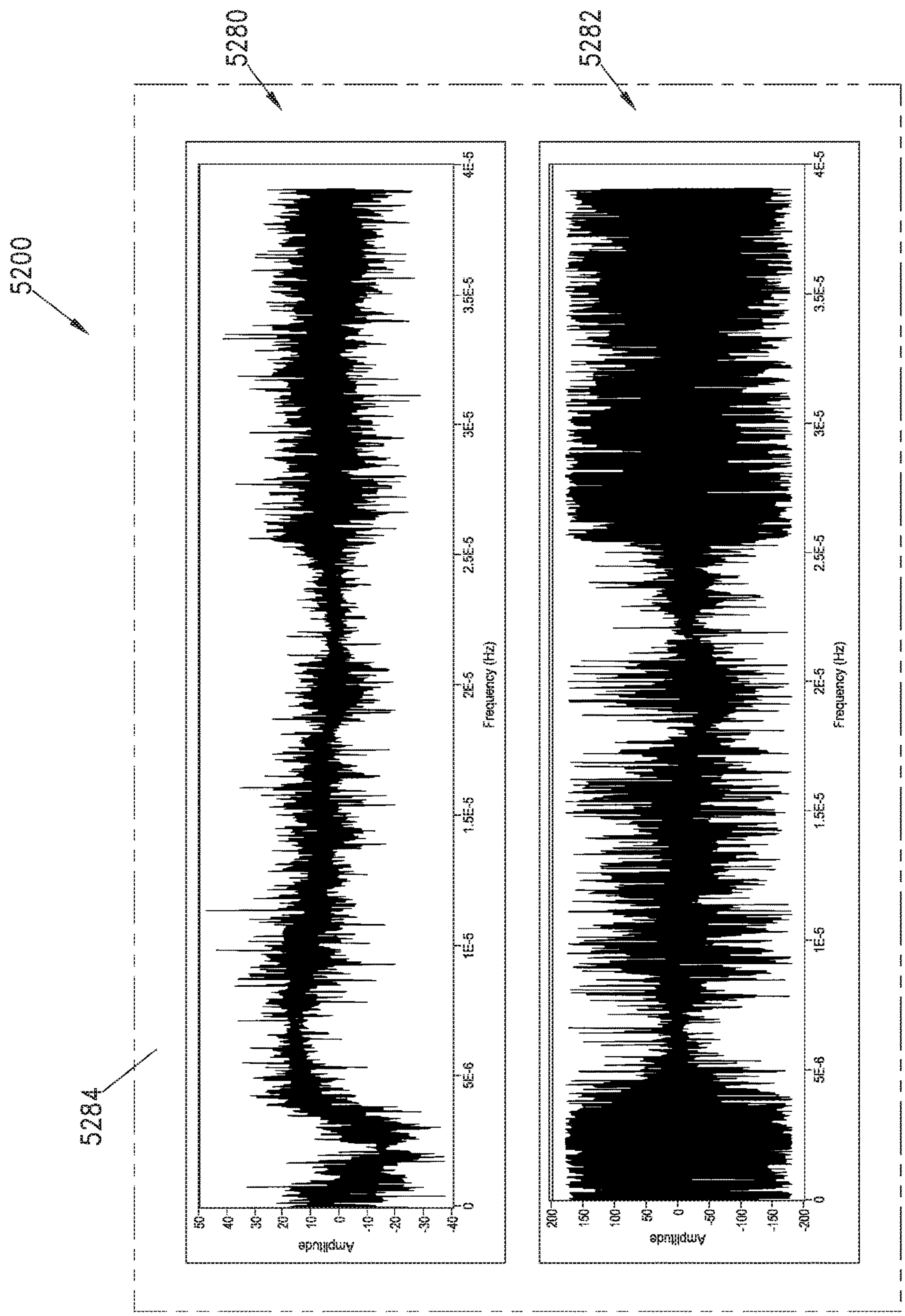

In many examples, any one of many transfer functions may be established between any two channels, such as the two channels 5280, 5282 that may be shown on a screen 5284, shown on the display 5200, as depicted in FIG. 27. The selection of the two channels 5280, 5282 on the screen 5284 may permit the user to depict the output of the transfer function on any of the screens including screen 5284 and screen 5204.

Figure 28:
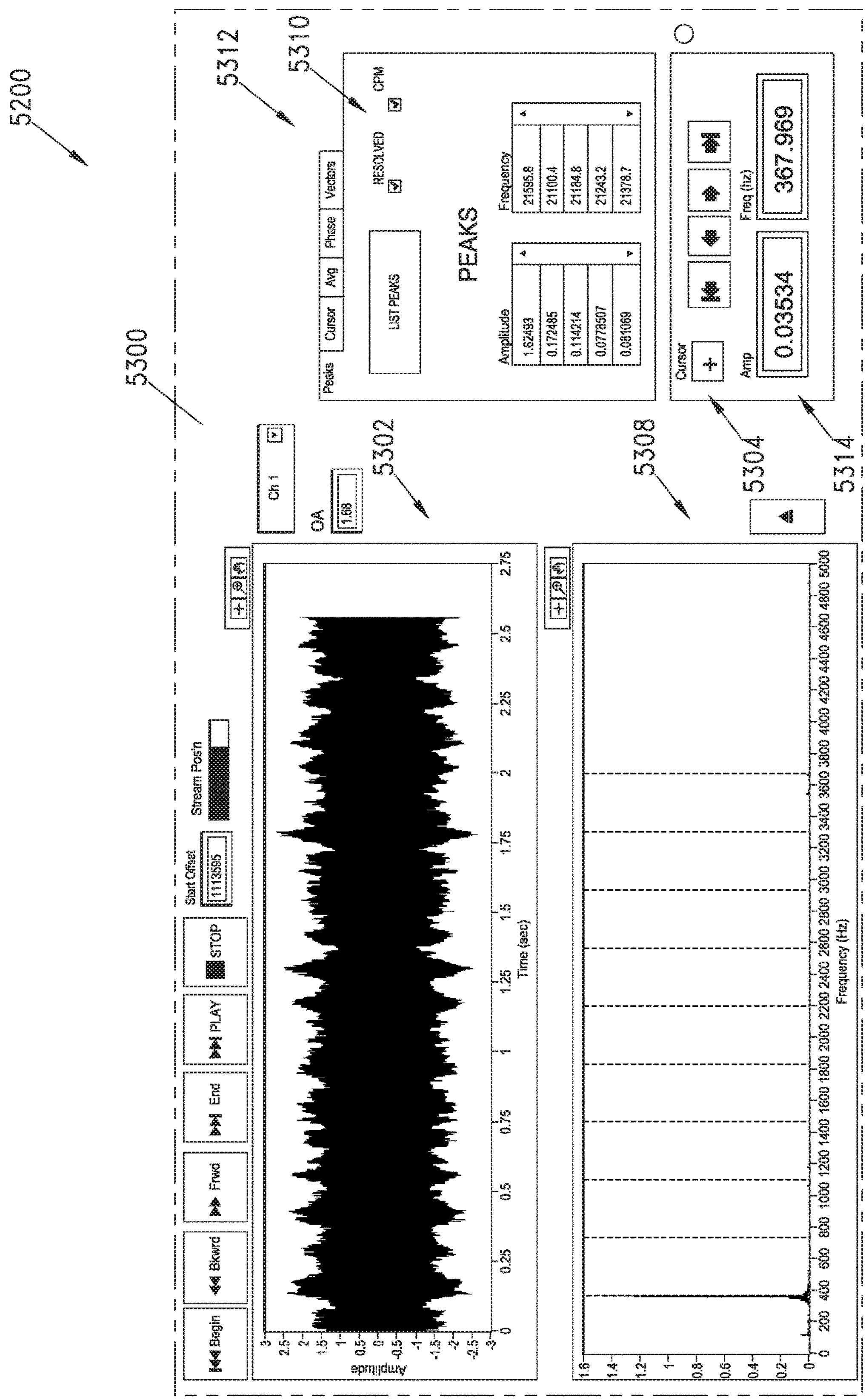

In embodiments, FIG. 28 shows a high-resolution spectrum screen 5300 on the display 5200 with a waveform view 5302, full cursor control 5304 and a peak extraction view 5308. In these examples, the peak extraction view 5308 may be configured with a resolved configuration 5310 that may be configured to provide enhanced amplitude and frequency accuracy and may use spectral sideband energy distribution. The peak extraction view 5308 may also be configured with averaging 5312, phase and cursor vector information 5314, and the like.

Figure 29:
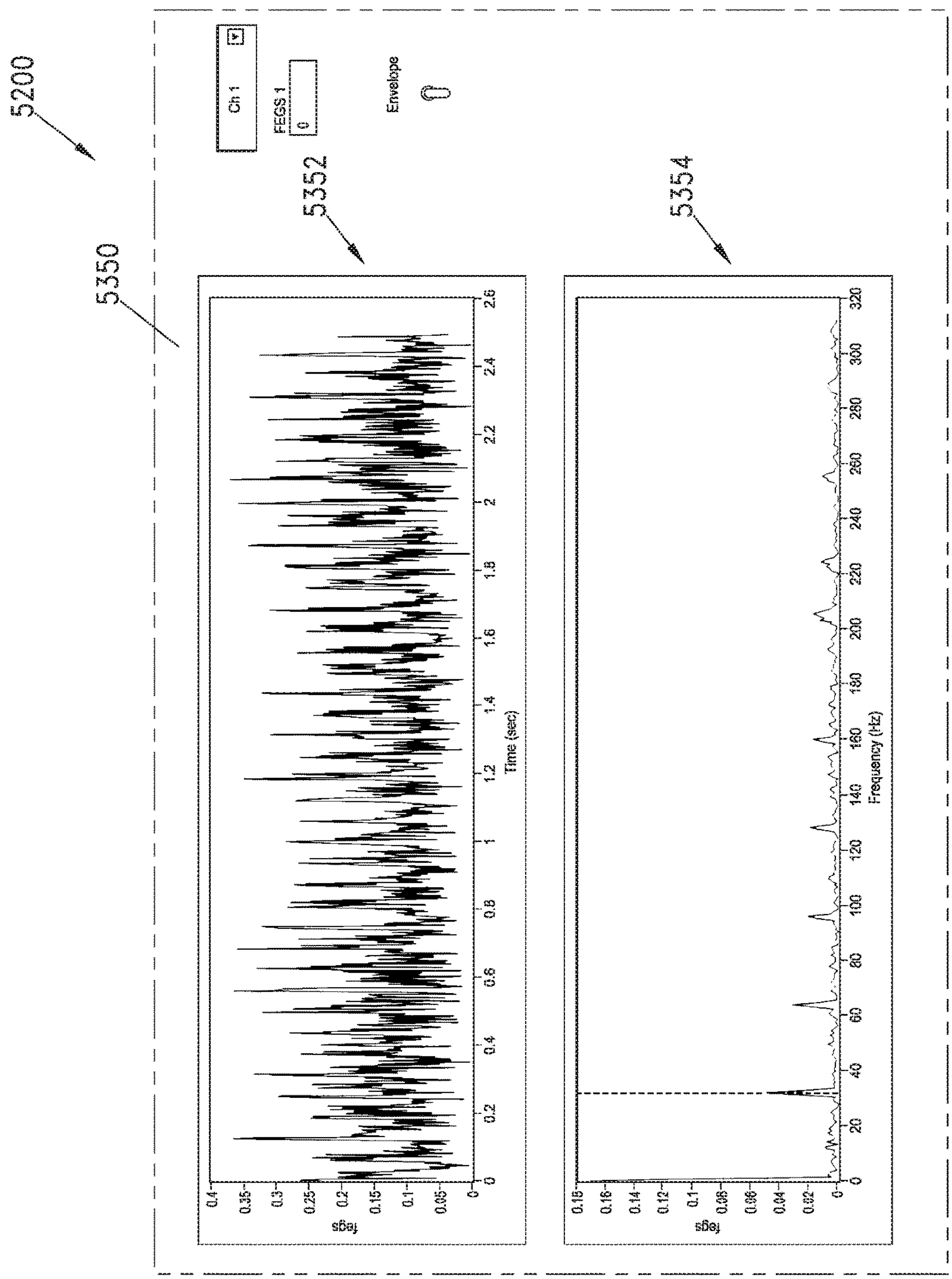
Figure 30:
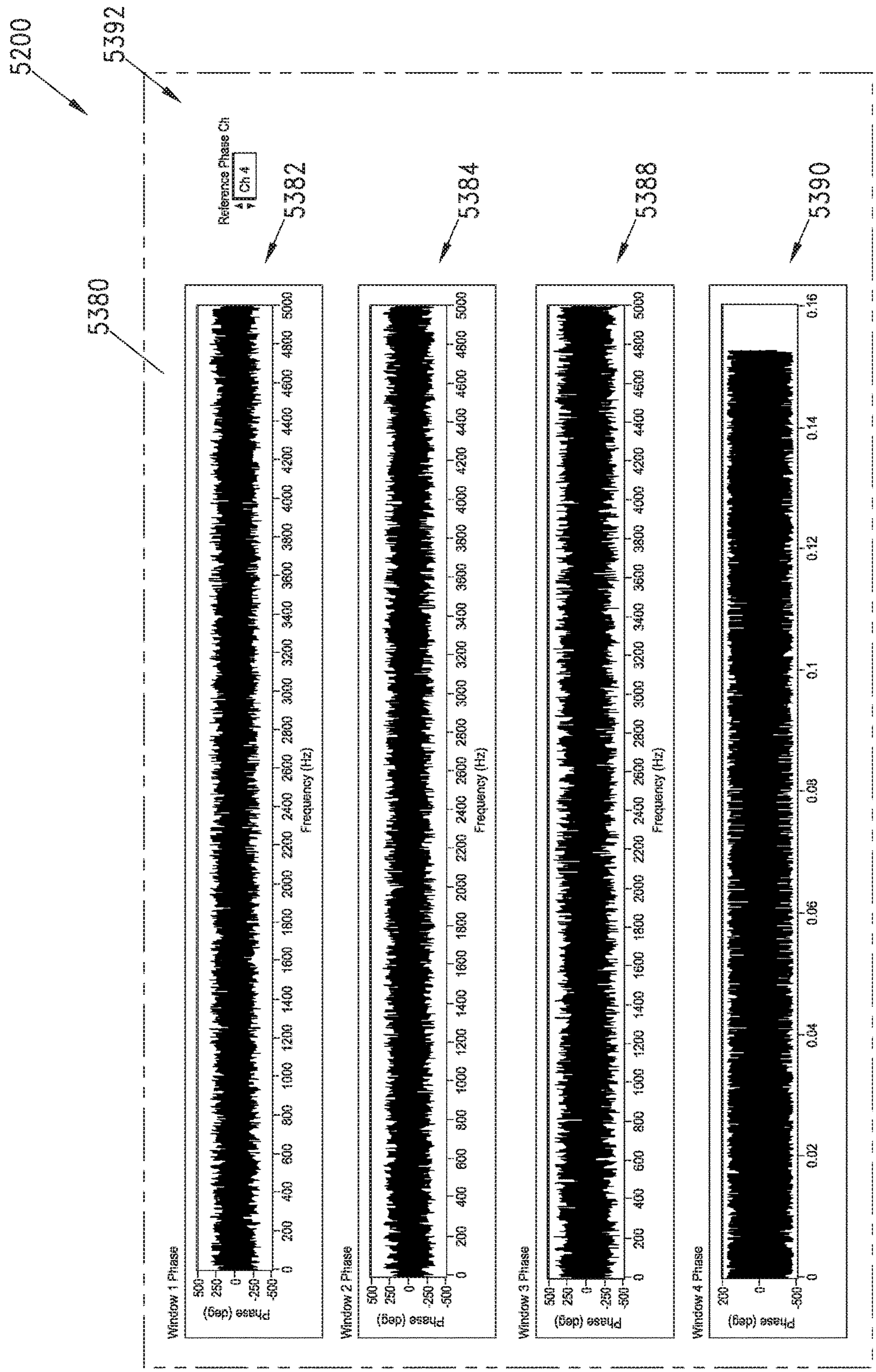

In embodiments, FIG. 29 shows an enveloping screen 5350 on the display 5200 with a waveform view 5352, and a spectral format view 5354. The views 5352, 5354 on the enveloping screen 5350 may display modulation from the signal in both waveform and spectral formats. In embodiments, FIG. 30 shows a relative phase screen 5380 on the display 5200 with four phase views 5382, 5384, 5388, 5390. The four phase views 5382, 5384, 5388, 5390 relate to the on spectrum the enveloping screen 5350 that may display modulation from the signal in waveform format in view 5352 and spectral format in view 5354. In embodiments, the reference channel control 5392 may be selected to use channel four as a reference channel to determine relative phase between each of the channels.

It will be appreciated in light of the disclosure that the sampling rates of vibration data of up to 100 kHz (or higher in some scenarios) may be utilized for non-vibration sensors as well. In doing so, it will further be appreciated in light of the disclosure that stream data in such durations at these sampling rates may uncover new patterns to be analyzed due in no small part that many of these types of sensors have not been utilized in this manner. It will also be appreciated in light of the disclosure that different sensors used in machinery condition monitoring may provide measurements more akin to static levels rather than fast-acting dynamic signals. In some cases, faster response time transducers may have to be used prior to achieving the faster sampling rates.

In many embodiments, sensors may have a relatively static output such as temperature, pressure, or flow but may still be analyzed with the dynamic signal processing system and methodologies as disclosed herein. It will be appreciated in light of the disclosure that the time scale, in many examples, may be slowed down. In many examples, a collection of temperature readings collected approximately every minute for over two weeks may be analyzed for their variation solely or in collaboration or in fusion with other relevant sensors. By way of these examples, the direct current level or average level may be omitted from all the readings (e.g., by subtraction) and the resulting delta measurements may be processed (e.g., through a Fourier transform). From these examples, resulting spectral lines may correlate to specific machinery behavior or other symptoms present in industrial system processes. In further examples, other techniques include enveloping that may look for modulation, wavelets that may look for spectral patterns that last only for a short time (e.g., bursts), cross-channel analysis to look for correlations with other sensors including vibration, and the like.

Figure 31:
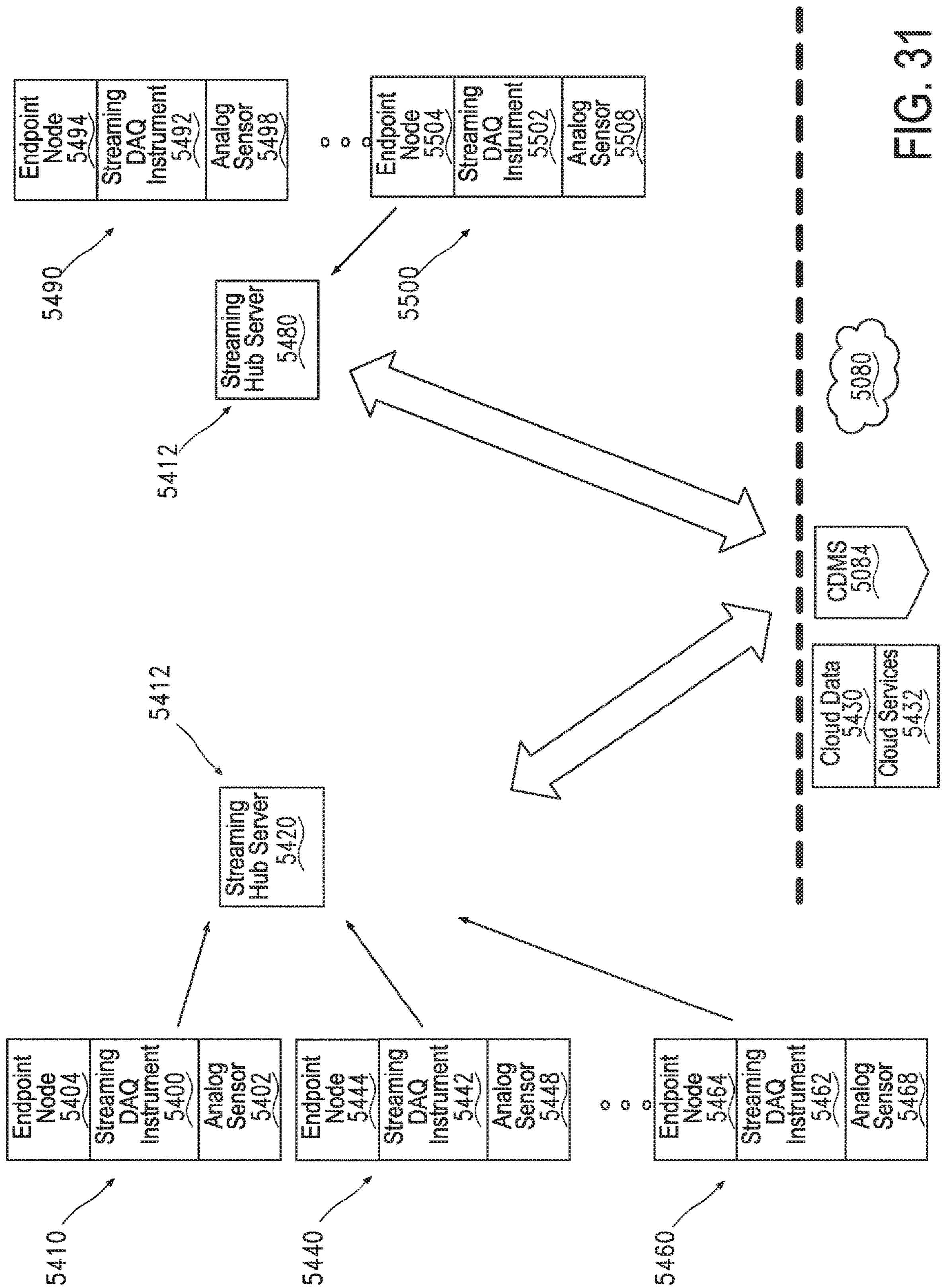
FIG. 31 is a diagrammatic view of components and interactions of a data collection architecture involving a multiple streaming data acquisition instrument receiving analog sensor signals and digitizing those signals to be obtained by a streaming hub server in accordance with the present disclosure.

FIG. 31 shows a DAQ instrument 5400 that may be integrated with one or more analog sensors 5402 and endpoint nodes 5404 to provide a streaming sensor 5410 or smart sensors that may take in analog signals and then process and digitize them, and then transmit them to one or more external monitoring systems 5412 in the many embodiments that may be connected to, interfacing with, or integrated with the methods and systems disclosed herein. The monitoring system 5412 may include a streaming hub server 5420 that may communicate with the CDMS 5084. In embodiments, the CDMS 5084 may contact, use, and integrate with cloud data 5430 and cloud services 5432 that may be accessible through one or more cloud network facilities 5080. In embodiments, the streaming hub server 5420 may connect with another streaming sensor 5440 that may include a DAQ instrument 5442, an endpoint node 5444, and the one or more analog sensors such as analog sensor 5448. The steaming hub server 5420 may connect with other streaming sensors such as the streaming sensor 5460 that may include a DAQ instrument 5462, an endpoint node 5464, and the one or more analog sensors such as analog sensor 5468.

In embodiments, there may be additional streaming hub servers such as the steaming hub server 5480 that may connect with other streaming sensors such as the streaming sensor 5490 that may include a DAQ instrument 5492, an endpoint node 5494, and the one or more analog sensors such as analog sensor 5498. In embodiments, the streaming hub server 5480 may also connect with other streaming sensors such as the streaming sensor 5500 that may include a DAQ instrument 5502, an endpoint node 5504, and the one or more analog sensors such as analog sensor 5508. In embodiments, the transmission may include averaged overall levels and in other examples may include dynamic signal sampled at a prescribed and/or fixed rate. In embodiments, the streaming sensors 5410, 5440, 5460, 5490, and 5500 may be configured to acquire analog signals and then apply signal conditioning to those analog signals including coupling, averaging, integrating, differentiating, scaling, filtering of various kinds, and the like. The streaming sensors 5410, 5440, 5460, 5490, and 5500 may be configured to digitize the analog signals at an acceptable rate and resolution (number of bits) and to process further the digitized signal when required. The streaming sensors 5410, 5440, 5460, 5490, and 5500 may be configured to transmit the digitized signals at pre-determined, adjustable, and re-adjustable rates. In embodiments, the streaming sensors 5410, 5440, 5460, 5490, and 5500 are configured to acquire, digitize, process, and transmit data at a sufficient effective rate so that a relatively consistent stream of data may be maintained for a suitable amount of time so that a large number of effective analyses may be shown to be possible. In the many embodiments, there would be no gaps in the data stream and the length of data should be relatively long, ideally for an unlimited amount of time, although practical considerations typically require ending the stream. It will be appreciated in light of the disclosure that this long duration data stream with effectively no gap in the stream is in contrast to the more commonly used burst collection where data is collected for a relatively short period of time (i.e., a short burst of collection), followed by a pause, and then perhaps another burst collection and so on. In the commonly used collections of data collected over noncontiguous bursts, data would be collected at a slow rate for low frequency analysis and high frequency for high frequency analysis. In many embodiments of the present disclosure, in contrast, the streaming data is being collected (i) once, (ii) at the highest useful and possible sampling rate, and (iii) for a long enough time that low frequency analysis may be performed as well as high frequency. To facilitate the collection of the streaming data, enough storage memory must be available on the one or more streaming sensors such as the streaming sensors 5410, 5440, 5460, 5490, 5500 so that new data may be off-loaded externally to another system before the memory overflows. In embodiments, data in this memory would be stored into and accessed from "First-In, First-Out" ("FIFO") mode. In these examples, the memory with a FIFO area may be a dual port so that the sensor controller may write to one part of it while the external system reads from a different part. In embodiments, data flow traffic may be managed by semaphore logic.

It will be appreciated in light of the disclosure that vibration transducers that are larger in mass will have a lower linear frequency response range because the natural resonance of the probe is inversely related to the square root of the mass and will be lowered. Toward that end, a resonant response is inherently non-linear and so a transducer with a lower natural frequency will have a narrower linear passband frequency response. It will also be appreciated in light of the disclosure that above the natural frequency the amplitude response of the sensor will taper off to negligible levels rendering it even more unusable. With that in mind, high frequency accelerometers, for this reason, tend to be quite small in mass, to the order of half of a gram. It will also be appreciated in light of the disclosure that adding the required signal processing and digitizing electronics required for streaming may, in certain situations, render the sensors incapable in many instances of measuring high-frequency activity.

In embodiments, streaming hubs such as the streaming hubs 5420, 5480 may effectively move the electronics required for streaming to an external hub via cable. It will be appreciated in light of the disclosure that the streaming hubs may be located virtually next to the streaming sensors or up to a distance supported by the electronic driving capability of the hub. In instances where an internet cache protocol ("ICP") is used, the distance supported by the electronic driving capability of the hub would be anywhere from 100 to 1000 feet (30.5 to 305 meters) based on desired frequency response, cable capacitance, and the like. In embodiments, the streaming hubs may be positioned in a location convenient for receiving power as well as connecting to a network (be it LAN or WAN). In embodiments, other power options would include solar, thermal as well as energy harvesting. Transfer between the streaming sensors and any external systems may be wireless or wired and may include such standard communication technologies as 802.11 and 900 MHz wireless systems, Ethernet, USB, firewire and so on.

Figure 32:
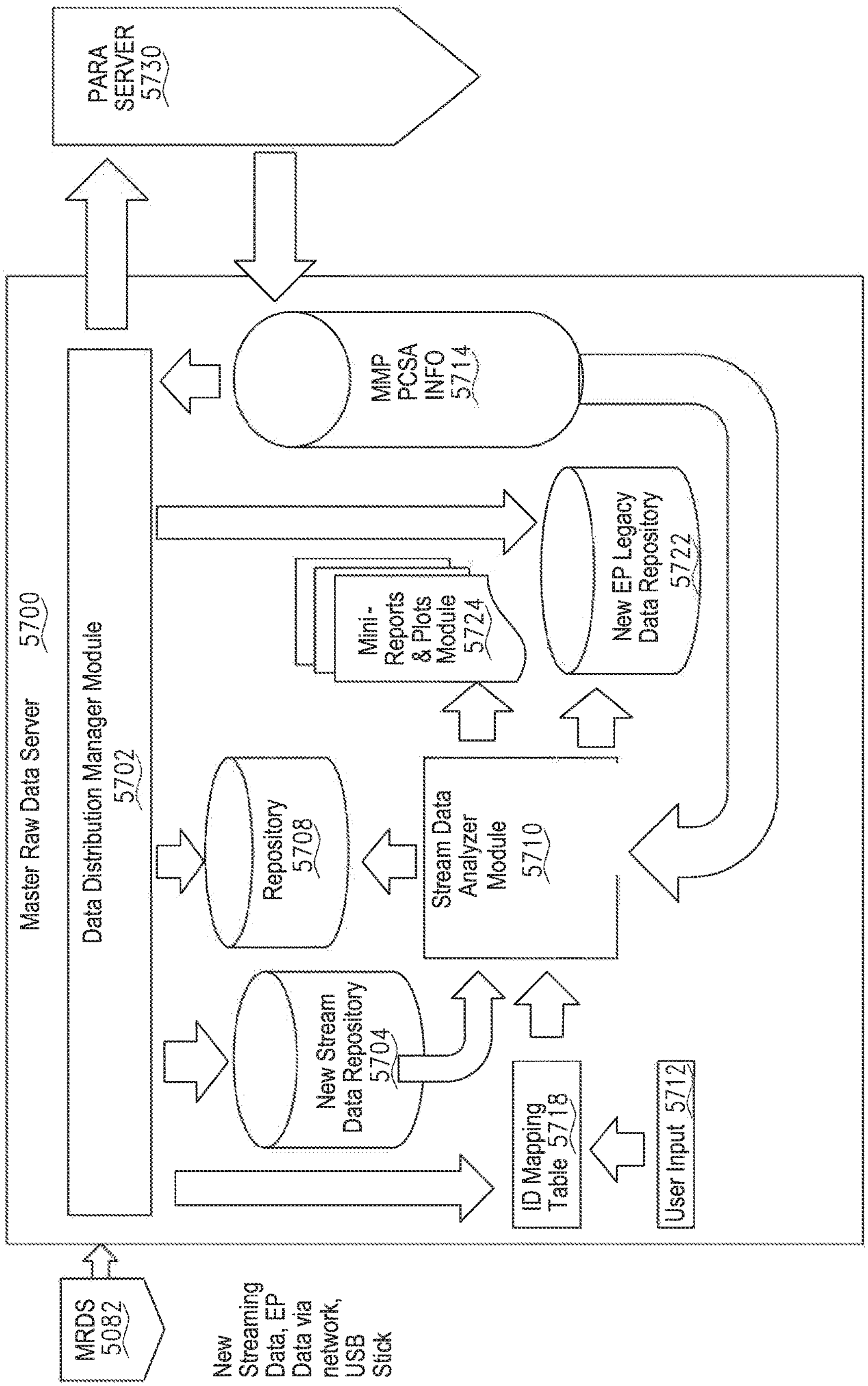
FIG. 32 is a diagrammatic view of components and interactions of a data collection architecture involving a master raw data server that processes new streaming data and data already extracted and processed in accordance with the present disclosure.
Figure 33:
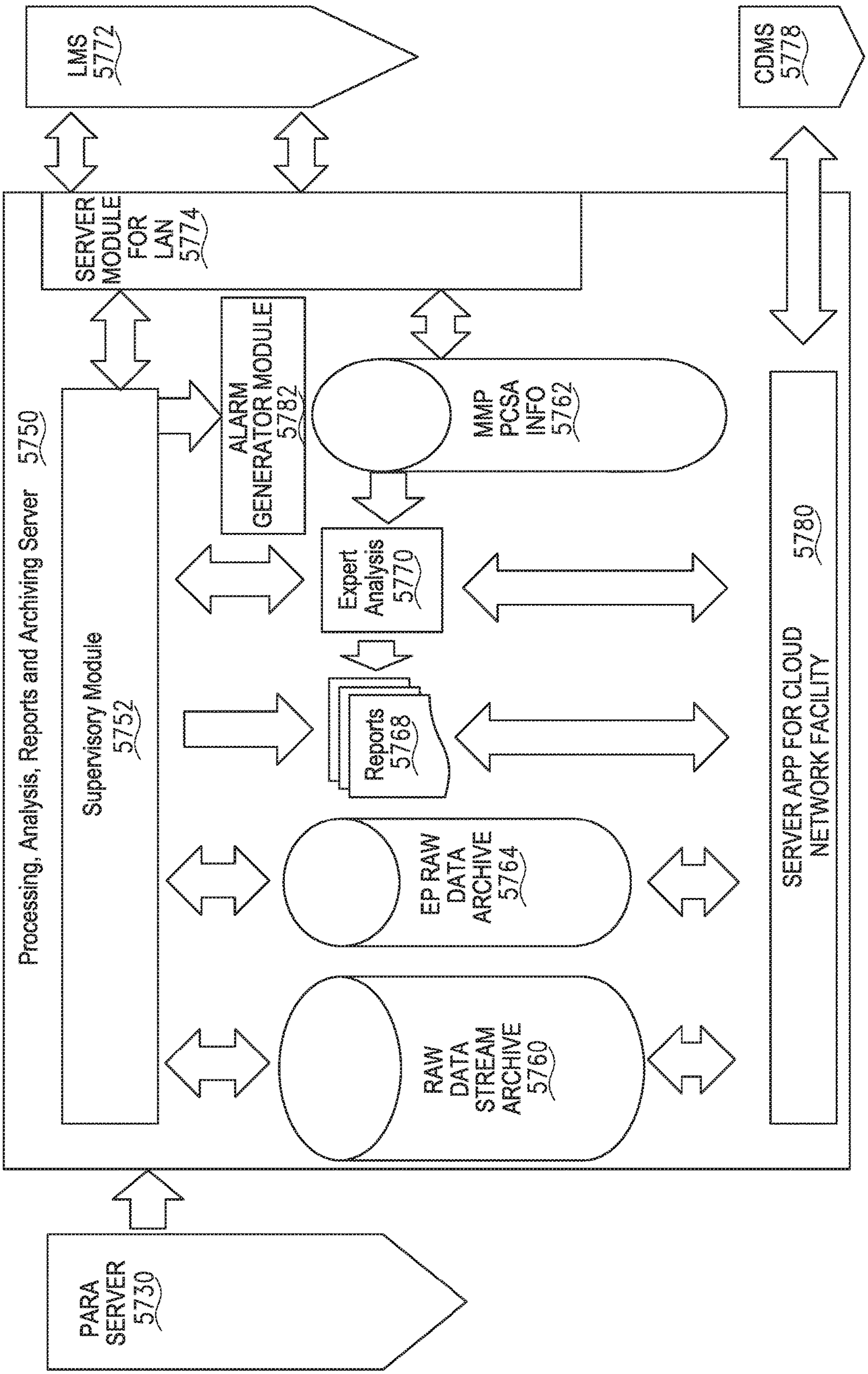
FIG. 33, FIG. 34, and FIG. 35 are diagrammatic views of components and interactions of a data collection architecture involving a processing, analysis, report, and archiving server that processes new streaming data and data already extracted and processed in accordance with the present disclosure.
Figure 41:
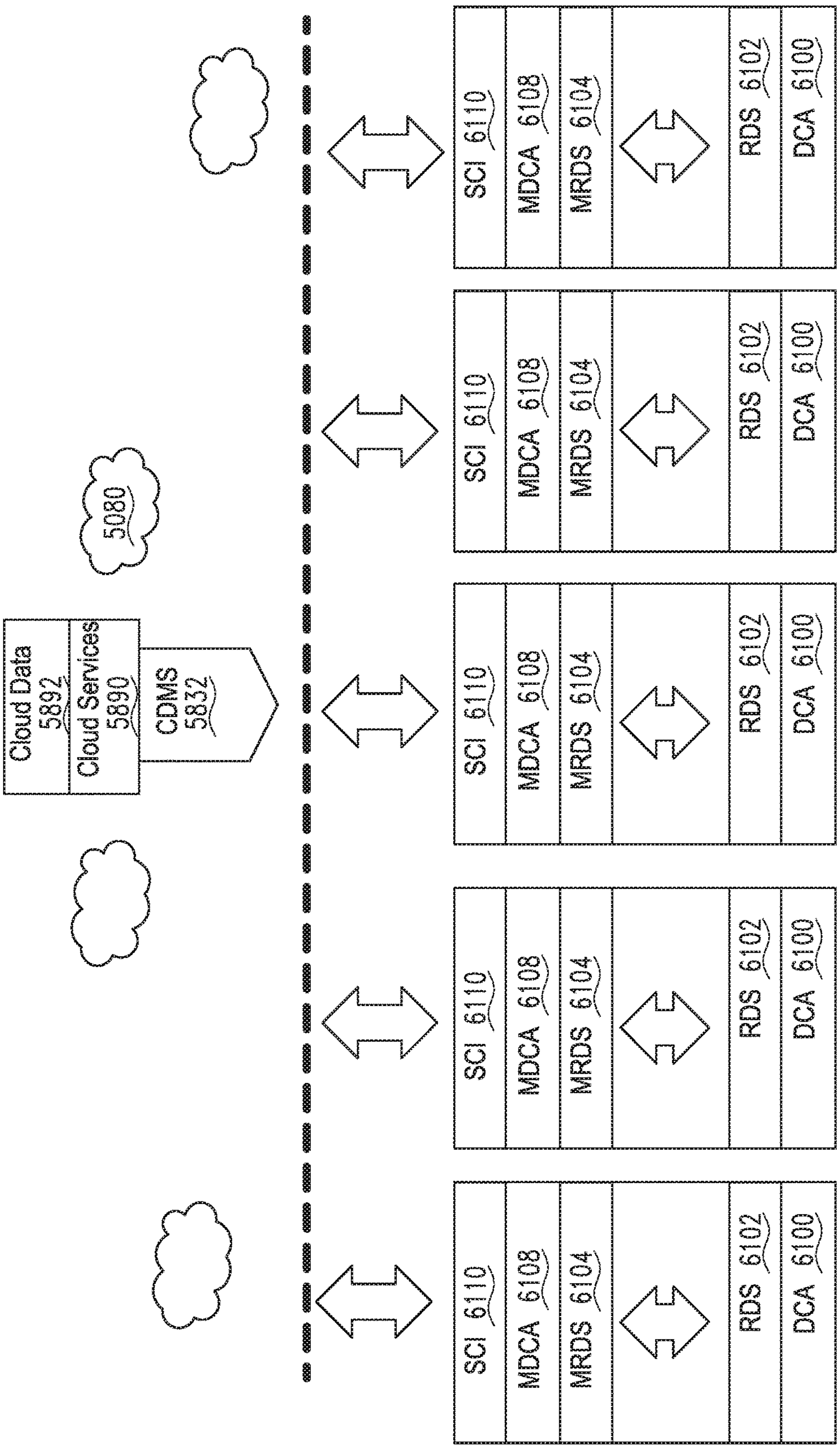

With reference to FIG. 22, the many examples of the DAQ instrument 5002 include embodiments where data that may be uploaded from the local data control application 5062 to the master raw data server ("MRDS") 5082. In embodiments, information in the multimedia probe ("MMP") and probe control, sequence and analytical ("PCSA") information store 5040 may also be downloaded from the MRDS 5082 down to the DAQ instrument 5002. Further details of the MRDS 5082 are shown in FIG. 32 including embodiments where data may be transferred to the MRDS 5082 from the DAQ instrument 5002 via a wired or wireless network, or through connection to one or more portable media, drive, other network connections, or the like. In embodiments, the DAQ instrument 5002 may be configured to be portable and may be carried on one or more predetermined routes to assess predefined points of measurement. In these many examples, the operating system that may be included in the MRDS 5082 may be Windows™, Linux™ or MacOS™ operating systems, or other similar operating systems. Further, in these arrangements, the operating system, modules for the operating system, and other needed libraries, data storage, and the like may be accessible wholly or partially through access to the cloud network facility 5080. In embodiments, the MRDS 5082 may reside directly on the DAQ instrument 5002, especially in on-line system examples. In embodiments, the DAQ instrument 5002 may be linked on an intra-network in a facility but may otherwise be behind a firewall. In further examples, the DAQ instrument 5002 may be linked to the cloud network facility 5080. In the various embodiments, one of the computers or mobile computing devices may be effectively designated the MRDS 5082 to which all of the other computing devices may feed it data such as one of the MRDS 6104, as depicted in FIGS. 41 and 42. In the many examples where the DAQ instrument 5002 may be deployed and configured to receive stream data in a swarm environment, one or more of the DAQ instruments 5002 may be effectively designated the MRDS 5082 to which all of the other computing devices may feed it data. In the many examples where the DAQ instrument 5002 may be deployed and configured to receive stream data in an environment where the methods and systems disclosed herein are intelligently assigning, controlling, adjusting, and re-adjusting data pools, computing resources, network bandwidth for local data collection, and the like, one or more of the DAQ instruments 5002 may be effectively designated the MRDS 5082 to which all of the other computing devices may feed it data.

With further reference to FIG. 32, new raw streaming data, data that have been through extract, process, and align processes (EP data), and the like may be uploaded to one or more master raw data servers as needed or as scaled in various environments. In embodiments, a master raw data server ("MRDS") 5700 may connect to and receive data from other master raw data servers such as the MRDS 5082. The MRDS 5700 may include a data distribution manager module 5702. In embodiments, the new raw streaming data may be stored in the new stream data repository 5704. In many instances, like raw data streams stored on the DAQ instrument 5002, the new stream data repository 5704 and new extract and process data repository 5708 may be similarly configured as a temporary storage area.

In embodiments, the MRDS 5700 may include a stream data analyzer module with an extract and process alignment module 5710. The analyzer module 5710 may be shown to be a more robust data analyzer and extractor than may be typically found on portable streaming DAQ instruments although it may be deployed on the DAQ instrument 5002 as well. In embodiments, the analyzer module 5710 takes streaming data and instantiates it at a specific sampling rate and resolution similar to the local data control module 5062 on the DAQ instrument 5002. The specific sampling rate and resolution of the analyzer module 5710 may be based on either user input 5712 or automated extractions from a multimedia probe ("MMP") and the probe control, sequence and analytical ("PCSA") information store 5714 and/or an identification mapping table 5718, which may require the user input 5712 if there is incomplete information regarding various forms of legacy data similar to as was detailed with the DAQ instrument 5002. In embodiments, legacy data may be processed with the analyzer module 5710 and may be stored in one or more temporary holding areas such as a new legacy data repository 5720. One or more temporary areas may be configured to hold data until it is copied to an archive and verified. The analyzer 5710 module may also facilitate in-depth analysis by providing many varying types of signal processing tools including but not limited to filtering, Fourier transforms, weighting, resampling, envelope demodulation, wavelets, two-channel analysis, and the like. From this analysis, many different types of plots and mini-reports may be generated from a reports and plots module 5724. In embodiments, data is sent to the processing, analysis, reports, and archiving ("PARA") server 5730 upon user initiation or in an automated fashion especially for on-line systems.

Figure 34:
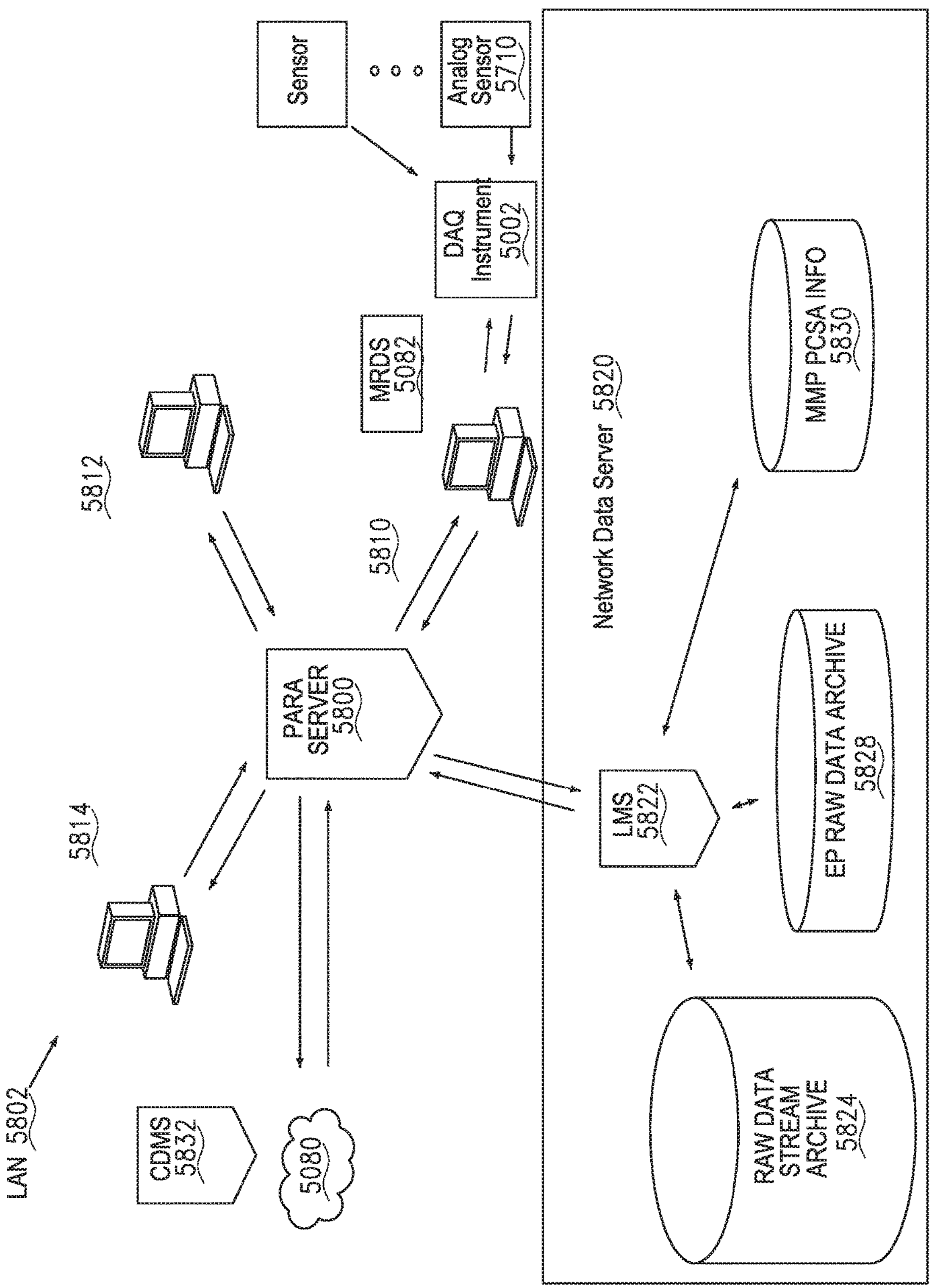

In embodiments, a PARA server 5750 may connect to and receive data from other PARA servers such as the PARA server 5730. With reference to FIG. 34, the PARA server 5730 may provide data to a supervisory module 5752 on the PARA server 5750 that may be configured to provide at least one of processing, analysis, reporting, archiving, supervisory, and similar functionalities. The supervisory module 5752 may also contain extract, process align functionality and the like. In embodiments, incoming streaming data may first be stored in a raw data stream archive 5760 after being properly validated. Based on the analytical requirements derived from a multimedia probe ("MMP") and probe control, sequence and analytical ("PCSA") information store 5762 as well as user settings, data may be extracted, analyzed, and stored in an extract and process ("EP") raw data archive 5764. In embodiments, various reports from a reports module 5768 are generated from the supervisory module 5752. The various reports from the reports module 5768 include trend plots of various smart bands, overalls along with statistical patterns, and the like. In embodiments, the reports module 5768 may also be configured to compare incoming data to historical data. By way of these examples, the reports module 5768 may search for and analyze adverse trends, sudden changes, machinery defect patterns, and the like. In embodiments, the PARA server 5750 may include an expert analysis module 5770 from which reports are generated and analysis may be conducted. Upon completion, archived data may be fed to a local master server ("LMS") 5772 via a server module 5774 that may connect to the local area network. In embodiments, archived data may also be fed to the LMS 5772 via a cloud data management server ("CDMS") 5778 through a server module for a cloud network facility 5080. In embodiments, the supervisory module 5752 on the PARA server 5750 may be configured to provide at least one of processing, analysis, reporting, archiving, supervisory, and similar functionalities from which alarms may be generated, rated, stored, modified, reassigned, and the like with an alarm generator module 5782.

FIG. 34 depicts various embodiments that include a PARA server 5800 and its connection to LAN 5802. In embodiments, one or more DAQ instruments such as the DAQ instrument 5002 may receive and process analog data from one or more analog sensors 5710 that may be fed into the DAQ instrument 5002. As discussed herein, the DAQ instrument 5002 may create a digital stream of data based on the ingested analog data from the one or more analog sensors. The digital stream from the DAQ instrument 5002 may be uploaded to the MRDS 5082 and from there, it may be sent to the PARA server 5800 where multiple terminals, such as terminal 5810 5812, 5814, may each interface with it or the MRDS 5082 and view the data and/or analysis reports. In embodiments, the PARA server 5800 may communicate with a network data server 5820 that may include a LMS 5822. In these examples, the LMS 5822 may be configured as an optional storage area for archived data. The LMS 5822 may also be configured as an external driver that may be connected to a PC or other computing device that may run the LMS 5822; or the LMS 5822 may be directly run by the PARA server 5800 where the LMS 5822 may be configured to operate and coexist with the PARA server 5800. The LMS 5822 may connect with a raw data stream archive 5824, an extract and process ("EP") raw data archive 5828, and a MMP and probe control, sequence and analytical ("PCSA") information store 5830. In embodiments, a CDMS 5832 may also connect to the LAN 5802 and may also support the archiving of data.

Figure 35:
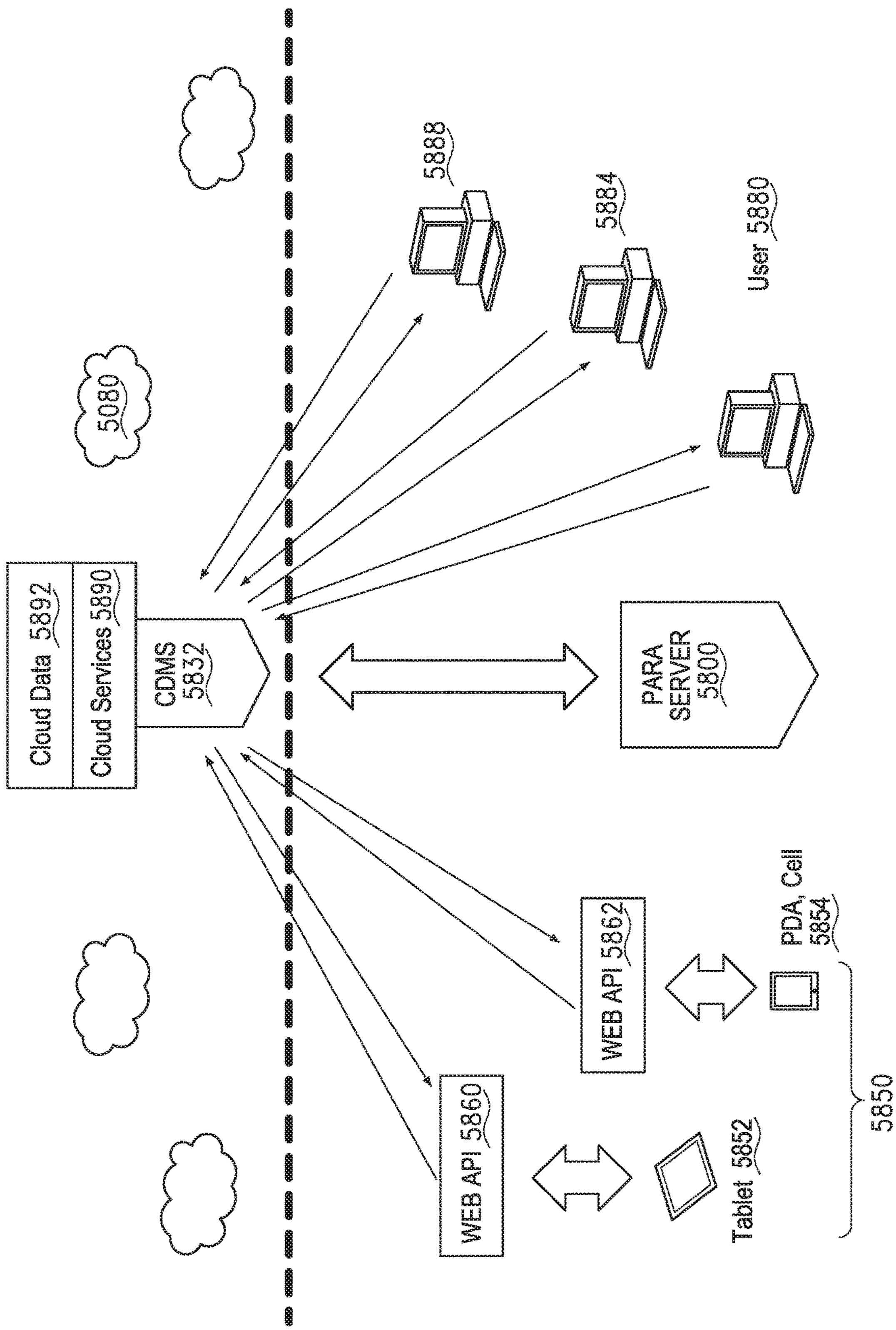

In embodiments, portable connected devices 5850 such as a tablet 5852 and a smart phone 5854 may connect the CDMS 5832 using web APIs 5860 and 5862, respectively, as depicted in FIG. 35. The APIs 5860, 5862 may be configured to execute in a browser and may permit access via a cloud network facility 5870 of all (or some of) the functions previously discussed as accessible through the PARA Server 5800. In embodiments, computing devices of a user 5880 such as computing devices 5882, 5884, 5888 may also access the cloud network facility 5870 via a browser or other connection in order to receive the same functionality. In embodiments, thin-client apps which do not require any other device drivers and may be facilitated by web services supported by cloud services 5890 and cloud data 5892. In many examples, the thin-client apps may be developed and reconfigured using, for example, the visual high-level LabVIEW™ programming language with NXG™ Web-based virtual interface subroutines. In embodiments, thin client apps may provide high-level graphing functions such as those supported by LabVIEW™ tools. In embodiments, the LabVIEW™ tools may generate JSCRIPT™ code and JAVA™ code that may be edited post-compilation. The NXG™ tools may generate Web VI's that may not require any specialized driver and only some RESTful™ services which may be readily installed from any browser. It will be appreciated in light of the disclosure that because various applications may be run inside a browser, the applications may be run on any operating system, such as Windows™, Linux™, and Android™ operating systems especially for personal devices, mobile devices, portable connected devices, and the like.

Figure 36:
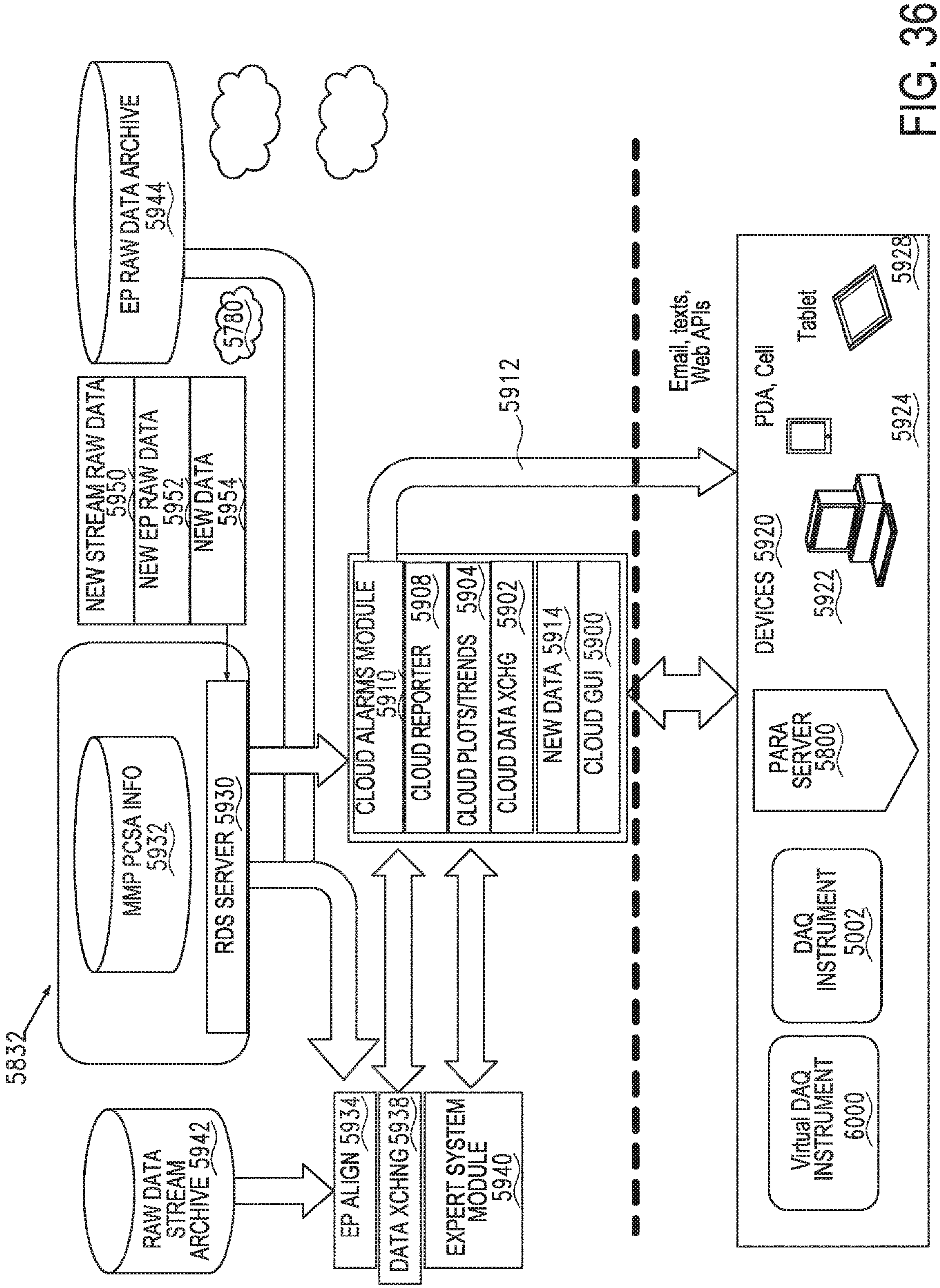
FIG. 36 is a diagrammatic view of components and interactions of a data collection architecture involving a relation database server and data archives and their connectivity with a cloud network facility in accordance with the present disclosure.

In embodiments, the CDMS 5832 is depicted in greater detail in FIG. 36. In embodiments, the CDMS 5832 may provide all of the data storage and services that the PARA Server 5800 (FIG. 34) may provide. In contrast, all of the API's may be web API's which may run in a browser and all other apps may run on the PARA Server 5800 or the DAQ instrument 5002 which may typically be Windows™, Linux™ or other similar operating systems. In embodiments, the CDMS 5832 includes at least one of or combinations of the following functions: the CDMS 5832 may include a cloud GUI 5900 that may be configured to provide access to all data plots including trend, waveform, spectra, envelope, transfer function, logs of measurement events, analysis including expert, utilities, and the like. In embodiments, the CDMS 5832 may include a cloud data exchange 5902 configured to facilitate the transfer of data to and from the cloud network facility 5870. In embodiments, the CDMS 5832 may include a cloud plots/trends module 5904 that may be configured to show all plots via web apps including trend, waveform, spectra, envelope, transfer function, and the like. In embodiments, the CDMS 5832 may include a cloud reporter 5908 that may be configured to provide all analysis reports, logs, expert analysis, trend plots, statistical information, and the like. In embodiments, the CDMS 5832 may include a cloud alarm module 5910. Alarms from the cloud alarm module 5910 may be generated and may be sent to various devices 5920 via email, texts, or other messaging mechanisms. From the various modules, data may be stored in new data 5914. The various devices 5920 may include a terminal 5922, portable connected device 5924, or a tablet 5928. The alarms from the cloud alarm module are designed to be interactive so that the end user may acknowledge alarms in order to avoid receiving redundant alarms and also to see significant context-sensitive data from the alarm points that may include spectra, waveform statistical info, and the like.

In embodiments, a relational database server ("RDS") 5930 may be used to access all of the information from a MMP and PCSA information store 5932. As with the PARA server 5800 (FIG. 36), information from the information store 5932 may be used with an EP and align module 5934, a data exchange 5938 and the expert system 5940. In embodiments, a raw data stream archive 5942 and extract and process raw data archive 5944 may also be used by the EP align 5934, the data exchange 5938 and the expert system 5940 as with the PARA server 5800. In embodiments, new stream raw data 5950, new extract and process raw data 5952, and new data 5954 (essentially all other raw data such as overalls, smart bands, stats, and data from the information store 5932) are directed by the CDMS 5832.

In embodiments, the streaming data may be linked with the RDS 5930 and the MMP and PCSA information store 5932 using a technical data management streaming ("TDMS") file format. In embodiments, the information store 5932 may include tables for recording at least portions of all measurement events. By way of these examples, a measurement event may be any single data capture, a stream, a snapshot, an averaged level, or an overall level. Each of the measurement events in addition to point identification information may also have a date and time stamp. In embodiments, a link may be made between the streaming data, the measurement event, and the tables in the information store 5932 using the TDMS format. By way of these examples, the link may be created by storing unique measurement point identification codes with a file structure having the TDMS format by including and assigning TDMS properties. In embodiments, a file with the TDMS format may allow for three levels of hierarchy. By way of these examples, the three levels of hierarchy may be root, group, and channel. It will be appreciated in light of the disclosure that the Mimosa™ database schema may be, in theory, unlimited With that said, there are advantages to limited TDMS hierarchies. In the many examples, the following properties may be proposed for adding to the TDMS Stream structure while using a Mimosa Compatible database schema.

Root Level: Global ID 1: Text String (This could be a unique ID obtained from the web); Global ID 2: Text String (This could be an additional ID obtained from the web); Company Name: Text String; Company ID: Text String; Company Segment ID: 4-byte Integer; Company Segment ID: 4-byte Integer; Site Name: Text String; Site Segment ID: 4-byte Integer; Site Asset ID: 4-byte Integer; Route Name: Text String; Version Number: Text String Group Level: Section 1 Name: Text String; Section 1 Segment ID: 4-byte Integer; Section 1 Asset ID: 4-byte Integer; Section 2 Name: Text String; Section 2 Segment ID: 4-byte Integer; Section 2 Asset ID: 4-byte Integer; Machine Name: Text String; Machine Segment ID: 4-byte Integer; Machine Asset ID: 4-byte Integer; Equipment Name: Text String; Equipment Segment ID: 4-byte Integer; Equipment Asset ID: 4-byte Integer; Shaft Name: Text String; Shaft Segment ID: 4-byte Integer; Shaft Asset ID: 4-byte Integer; Bearing Name: Text String; Bearing Segment ID: 4-byte Integer; Bearing Asset ID: 4-byte Integer; Probe Name: Text String; Probe Segment ID: 4-byte Integer; Probe Asset ID: 4-byte Integer Channel Level: Channel #: 4-byte Integer; Direction: 4-byte Integer (in certain examples may be text); Data Type: 4-byte Integer; Reserved Name 1: Text String; Reserved Segment ID 1: 4-byte Integer; Reserved Name 2: Text String; Reserved Segment ID 2: 4-byte Integer; Reserved Name 3: Text String; Reserved Segment ID 3: 4-byte Integer In embodiments, the file with the TDMS format may automatically use property or asset information and may make an index file out of the specific property and asset information to facilitate database searches, may offer a compromise for storing voluminous streams of data because it may be optimized for storing binary streams of data but may also include some minimal database structure making many standard SQL operations feasible, but the TDMS format and functionality discussed herein may not be as efficient as a full-fledged SQL relational database. The TDMS format, however, may take advantage of both worlds in that it may balance between the class or format of writing and storing large streams of binary data efficiently and the class or format of a fully relational database, which facilitates searching, sorting and data retrieval. In embodiments, an optimum solution may be found in that metadata required for analytical purposes and extracting prescribed lists with panel conditions for stream collection may be stored in the RDS 5930 by establishing a link between the two database methodologies. By way of these examples, relatively large analog data streams may be stored predominantly as binary storage in the raw data stream archive 5942 for rapid stream loading but with inherent relational SQL type hooks, formats, conventions, or the like. The files with the TDMS format may also be configured to incorporate DIAdem™ reporting capability of LabVIEW™ software in order to provide a further mechanism to conveniently and rapidly facilitate accessing the analog or the streaming data.

Figure 37:
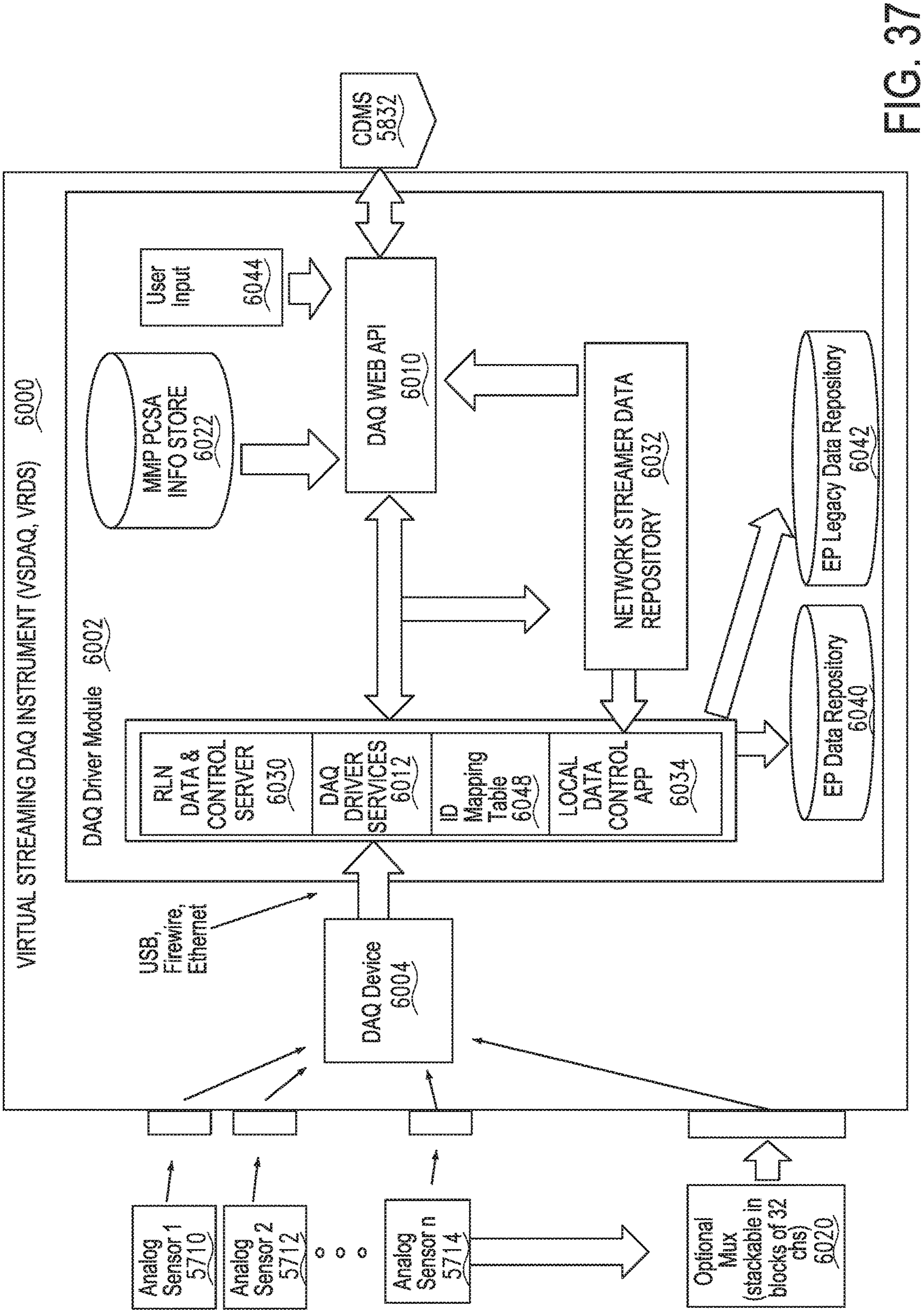
FIG. 37 through FIG. 42 are diagrammatic views of components and interactions of a data collection architecture involving a virtual streaming data acquisition instrument receiving analog sensor signals from an industrial environment connected to a cloud network facility in accordance with the present disclosure.

The methods and systems disclosed herein may include, connect to, or be integrated with a virtual data acquisition instrument and in the many embodiments, FIG. 37 shows methods and systems that include a virtual streaming DAQ instrument 6000 also known as a virtual DAQ instrument, a VRDS, or a VSDAQ. In contrast to the DAQ instrument 5002 (FIG. 22), the virtual DAQ instrument 6000 may be configured so to only include one native application. In the many examples, the one permitted and one native application may be the DAQ driver module 6002 that may manage all communications with the DAQ Device 6004 which may include streaming capabilities. In embodiments, other applications, if any, may be configured as thin client web applications such as RESTful™ web services. The one native application, or other applications or services, may be accessible through the DAQ Web API 6010. The DAQ Web API 6010 may run in or be accessible through various web browsers.

In embodiments, storage of streaming data, as well as the extraction and processing of streaming data into extract and process data, may be handled primarily by the DAQ driver services 6012 under the direction of the DAQ Web API 6010. In embodiments, the output from sensors of various types including vibration, temperature, pressure, ultrasound and so on may be fed into the instrument inputs of the DAQ device 6004. In embodiments, the signals from the output sensors may be signal conditioned with respect to scaling and filtering and digitized with an analog to a digital converter. In embodiments, the signals from the output sensors may be signals from all relevant channels simultaneously sampled at a rate sufficient to perform the maximum desired frequency analysis. In embodiments, the signals from the output sensors may be sampled for a relatively long time, gap-free, as one continuous stream so as to enable a wide array of further post-processing at lower sampling rates with sufficient samples. In further examples, streaming frequency may be adjusted (and readjusted) to record streaming data at non-evenly spaced recording. For temperature data, pressure data, and other similar data that may be relatively slow, varying delta times between samples may further improve quality of the data. By way of the above examples, data may be streamed from a collection of points and then the next set of data may be collected from additional points according to a prescribed sequence, route, path, or the like. In the many examples, the portable sensors may be moved to the next location according to the prescribed sequence but not necessarily all of them as some may be used for reference phase or otherwise. In further examples, a multiplexer 6020 may be used to switch to the next collection of points or a mixture of the two methods may be combined.

In embodiments, the sequence and panel conditions that may be used to govern the data collection process using the virtual DAQ instrument 6000 may be obtained from the MMP PCSA information store 6022. The MMP PCSA information store 6022 may include such items as the hierarchical structural relationships of the machine, i.e., a machine contains pieces of equipment in which each piece of equipment contains shafts and each shaft is associated with bearings, which may be monitored by specific types of transducers or probes according to a specific prescribed sequence (routes, path, etc.) with specific panel conditions. By way of these examples, the panel conditions may include hardware specific switch settings or other collection parameters such as sampling rate, AC/DC coupling, voltage range and gain, integration, high and low pass filtering, anti-aliasing filtering, ICP™ transducers and other integrated-circuit piezoelectric transducers, 4-20 mA loop sensors, and the like. The information store 6022 includes other information that may be stored in what would be machinery specific features that would be important for proper analysis including the number of gear teeth for a gear, the number of blades in a pump impeller, the number of motor rotor bars, bearing specific parameters necessary for calculating bearing frequencies, 1× rotating speed (RPMs) of all rotating elements, and the like.

Upon direction of the DAQ Web API 6010 software, digitized waveforms may be uploaded using the DAQ driver services 6012 of the virtual DAQ instrument 6000. In embodiments, data may then be fed into an RLN data and control server 6030 that may store the stream data into a network stream data repository 6032. Unlike the DAQ instrument 5002, the server 6030 may run from within the DAQ driver module 6002. It will be appreciated in light of the disclosure that a separate application may require drivers for running in the native operating system and for this instrument only the instrument driver may run natively. In many examples, all other applications may be configured to be browser based. As such, a relevant network variable may be very similar to a LabVIEW™ shared or network stream variable which may be designed to be accessed over one or more networks or via web applications.

In embodiments, the DAQ web API 6010 may also direct the local data control application 6034 to extract and process the recently obtained streaming data and, in turn, convert it to the same or lower sampling rates of sufficient length to provide the desired resolution. This data may be converted to spectra, then averaged and processed in a variety of ways and stored as EP data, such as on an EP data repository 6040. The EP data repository 6040 may, in certain embodiments, only be meant for temporary storage. It will be appreciated in light of the disclosure that legacy data may require its own sampling rates and resolution and often this sampling rate may not be integer proportional to the acquired sampling rate especially for order-sampled data whose sampling frequency is related directly to an external frequency. The external frequency may typically be the running speed of the machine or its internal componentry, rather than the more-standard sampling rates produced by the internal crystals, clock functions, and the like of the (e.g., values of Fmax of 100, 200, 500, 1K, 2K, 5K, 10K, 20K and so on) of the DAQ instrument 5002, 6000. In embodiments, the EP align component of the local data control application 6034 is able to fractionally adjust the sampling rate to the non-integer ratio rates that may be more applicable to legacy data sets and therefore drive compatibility with legacy systems. In embodiments, the fractional rates may be converted to integer ratio rates more readily because the length of the data to be processed (or at least that portion of the greater stream of data) is adjustable because of the depth and content of the original acquired streaming data by the DAQ instrument 5002, 6000. It will be appreciated in light of the disclosure that if the data was not streamed and just stored as traditional snap-shots of spectra with the standard values of Fmax, it may very well be impossible to retroactively and accurately convert the acquired data to the order-sampled data. In embodiments, the stream data may be converted, especially for legacy data purposes, to the proper sampling rate and resolution as described and stored in the EP legacy data repository 6042. To support legacy data identification scenarios, a user input 6044 may be included if there is no automated process for identification translation. In embodiments, one such automated process for identification translation may include importation of data from a legacy system that may contain a fully standardized format such as the *Mimosa*™ format and sufficient identification information to complete an ID Mapping Table 6048. In further examples, the end user, a legacy data vendor, a legacy data storage facility, or the like may be able to supply enough info to complete (or sufficiently complete) relevant portions of the ID Mapping Table 6048 to provide, in turn, the database schema for the raw data of the legacy system so it may be readily ingested, saved, and used for analytics in the current systems disclosed herein.

Figure 38:
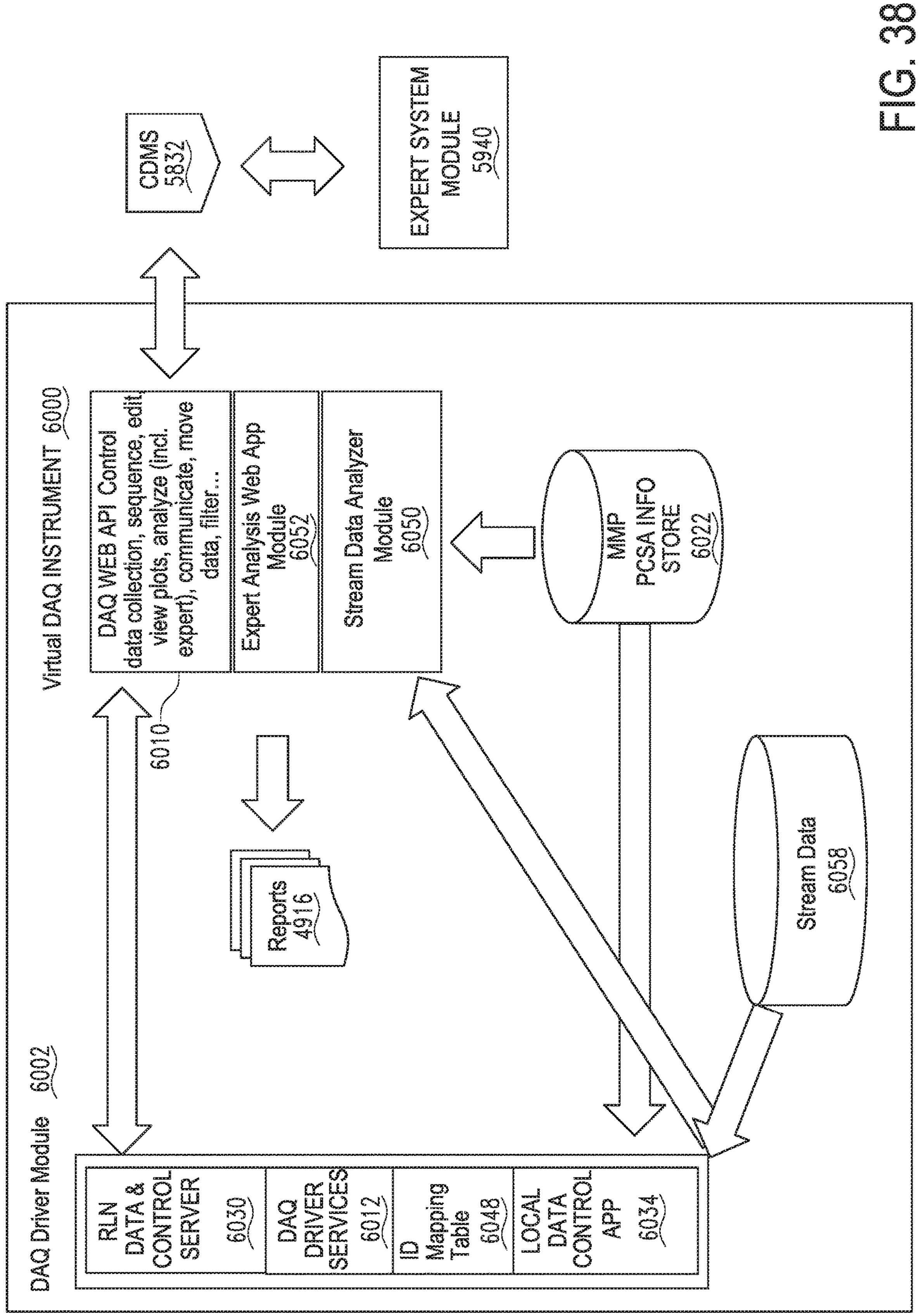

FIG. 38 depicts further embodiments and details of the virtual DAQ Instrument 6000. In these examples, the DAQ Web API 6010 may control the data collection process as well as its sequence. The DAQ Web API 6010 may provide the capability for editing this process, viewing plots of the data, controlling the processing of that data and viewing the output in all its myriad forms, analyzing the data, including the expert analysis, communicating with external devices via the DAQ driver module 6002, as well as communicating with and transferring both streaming data and EP data to one or more cloud network facilities 5080 whenever possible. In embodiments, the virtual DAQ instrument itself and the DAQ Web API 6010 may run independently of access to cloud network facilities 5080 when local demands may require or simply as a result of there being no outside connectivity such use throughout a proprietary industrial setting that prevents such signals. In embodiments, the DAQ Web API 6010 may also govern the movement of data, its filtering, as well as many other housekeeping functions.

The virtual DAQ Instrument 6000 may also include an expert analysis module 6052. In embodiments, the expert analysis module 6052 may be a web application or other suitable module that may generate reports 6054 that may use machine or measurement point specific information from the MMP PCSA information store 6022 to analyze stream data 6058 using the stream data analyzer module 6050. In embodiments, supervisory control of the module 6052 may be provided by the DAQ Web API 6010. In embodiments, the expert analysis may also be supplied (or supplemented) via the expert system module 5940 that may be resident on one or more cloud network facilities that are accessible via the CDMS 5832. In many examples, expert analysis via the cloud may be preferred over local systems such as expert analysis module 6052 for various reasons, such as the availability and use of the most up-to-date software version, more processing capability, a bigger volume of historical data to reference and the like. It will be appreciated in light of the disclosure that it may be important to offer expert analysis when an internet connection cannot be established so as to provide a redundancy, when needed, for seamless and time efficient operation. In embodiments, this redundancy may be extended to all of the discussed modular software applications and databases where applicable so each module discussed herein may be configured to provide redundancy to continue operation in the absence of an internet connection.

Figure 39:
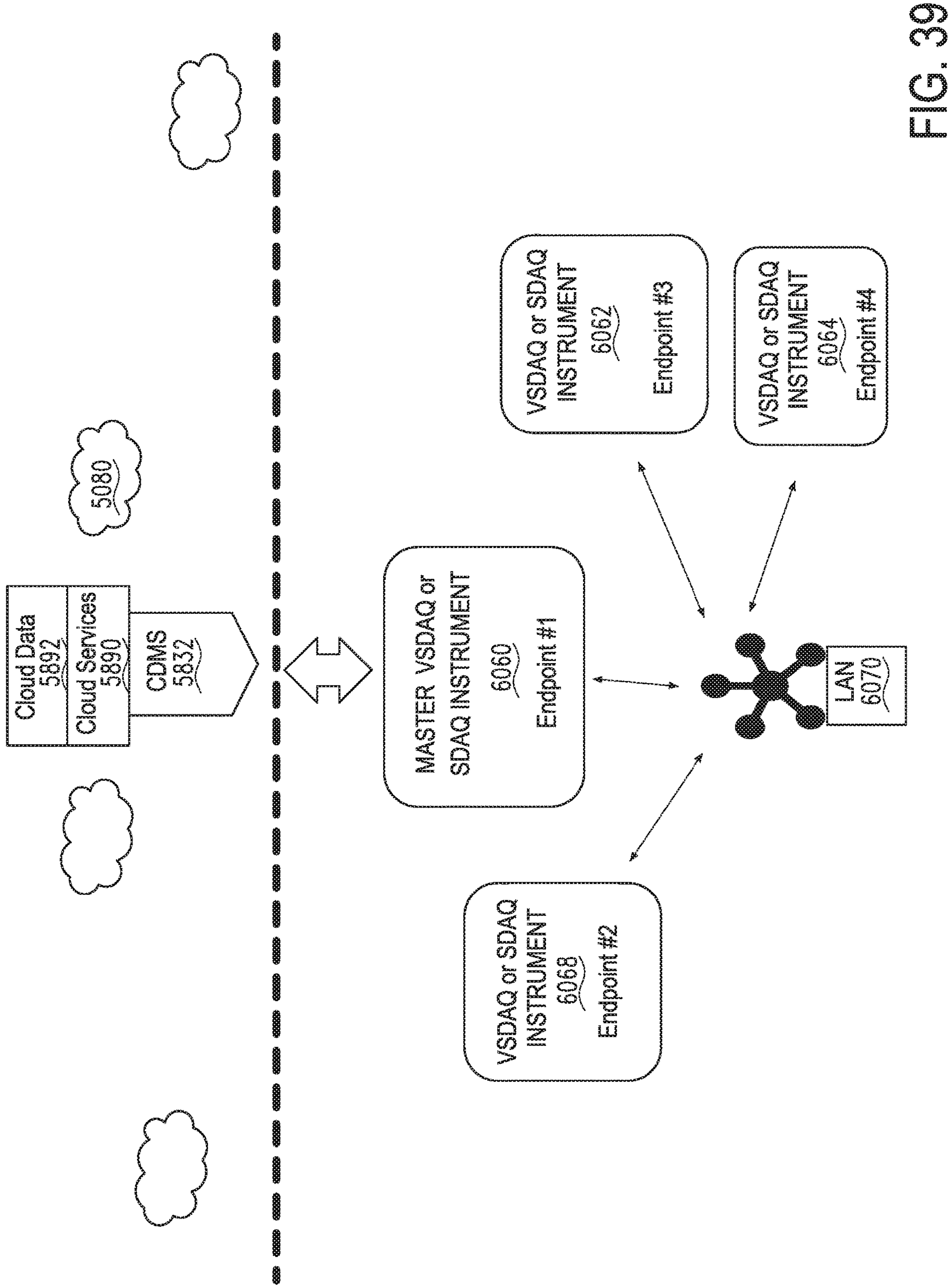

FIG. 39 depicts further embodiments and details of many virtual DAQ instruments existing in an online system and connecting through network endpoints through a central DAQ instrument to one or more cloud network facilities. In embodiments, a master DAQ instrument with network endpoint 6060 is provided along with additional DAQ instruments such as a DAQ instrument with network endpoint 6062, a DAQ instrument with network endpoint 6064, and a DAQ instrument with network endpoint 6068. The master DAQ instrument with network endpoint 6060 may connect with the other DAQ instruments with network endpoints 6062, 6064, 6068 over LAN 6070. It will be appreciated that each of the instruments 6060, 6062, 6064, 6068 may include personal computer, a connected device, or the like that include Windows™, Linux™, or other suitable operating systems to facilitate ease of connection of devices utilizing many wired and wireless network options such as Ethernet, wireless 802.11g, 900 MHz wireless (e.g., for better penetration of walls, enclosures and other structural barriers commonly encountered in an industrial setting), as well as a myriad of other things permitted by the use of off-the-shelf communication hardware when needed.

Figure 40:
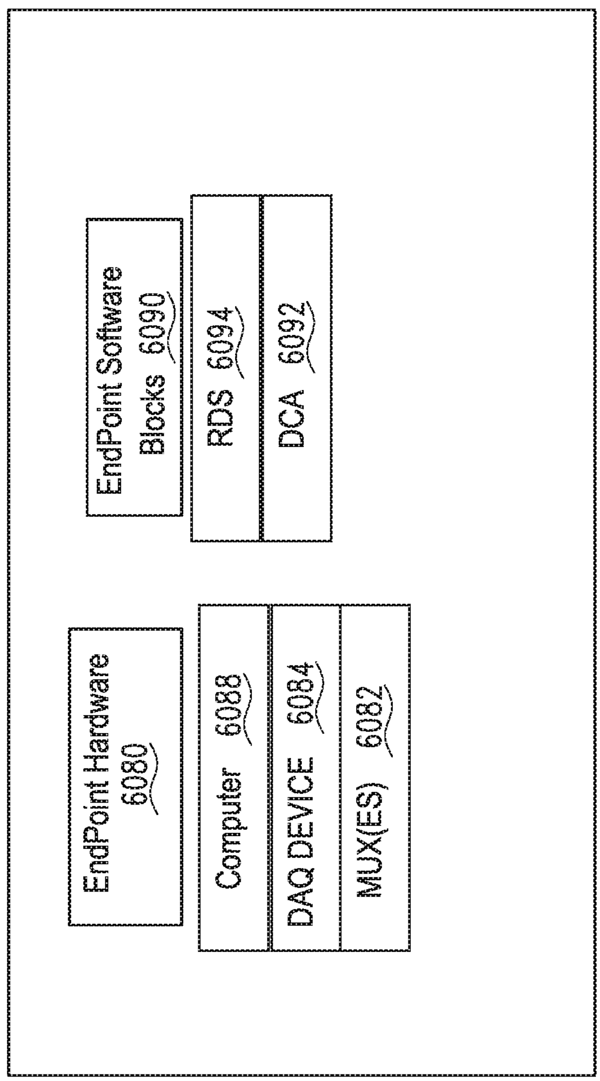

FIG. 40 depicts further embodiments and details of many functional components of an endpoint that may be used in the various settings, environments, and network connectivity settings. The endpoint includes endpoint hardware modules 6080. In embodiments, the endpoint hardware modules 6080 may include one or more multiplexers 6082, a DAQ instrument 6084, as well as a computer 6088, computing device, PC, or the like that may include the multiplexers, DAQ instruments, and computers, connected devices and the like, as disclosed herein. The endpoint software modules 6090 include a data collector application (DCA) 6092 and a raw data server (RDS) 6094. In embodiments, DCA 6092 may be similar to the DAQ API 5052 (FIG. 22) and may be configured to be responsible for obtaining stream data from the DAQ device 6084 and storing it locally according to a prescribed sequence or upon user directives. In the many examples, the prescribed sequence or user directives may be a LabVIEW™ software app that may control and read data from the DAQ instruments. For cloud based online systems, the stored data in many embodiments may be network accessible. In many examples, LabVIEW™ tools may be used to accomplish this with a shared variable or network stream (or subsets of shared variables). Shared variables and the affiliated network streams may be network objects that may be optimized for sharing data over the network. In many embodiments, the DCA 6092 may be configured with a graphic user interface that may be configured to collect data as efficiently and fast as possible and push it to the shared variable and its affiliated network stream. In embodiments, the endpoint raw data server 6094 may be configured to read raw data from the single-process shared variable and may place it with a master network stream. In embodiments, a raw stream of data from portable systems may be stored locally and temporarily until the raw stream of data is pushed to the MRDS 5082 (FIG. 22). It will be appreciated in light of the disclosure that on-line system instruments on a network can be termed endpoints whether local or remote or associated with a local area network or a wide area network. For portable data collector applications that may or may not be wirelessly connected to one or more cloud network facilities, the endpoint term may be omitted as described so as to detail an instrument that may not require network connectivity.

FIG. 41 depicts further embodiments and details of multiple endpoints with their respective software blocks with at least one of the devices configured as master blocks. Each of the blocks may include a data collector application ("DCA") 7000 and a raw data server ("RDS") 7002. In embodiments, each of the blocks may also include a master raw data server module ("MRDS") 7004, a master data collection and analysis module ("MDCA") 7008, and a supervisory and control interface module ("SCI") 7010. The MRDS 7004 may be configured to read network stream data (at a minimum) from the other endpoints and may forward it up to one or more cloud network facilities via the CDMS 5832 including the cloud services 5890 and the cloud data 5892. In embodiments, the CDMS 5832 may be configured to store the data and to provide web, data, and processing services. In these examples, this may be implemented with a LabVIEW™ application that may be configured to read data from the network streams or share variables from all of the local endpoints, write them to the local host PC, local computing device, connected device, or the like, as both a network stream and file with TDMS™ formatting. In embodiments, the CDMS 5832 may also be configured to then post this data to the appropriate buckets using the LabVIEW or similar software that may be supported by S3™ web service from the Amazon Web Services ("AWS™") on the Amazon™ web server, or the like and may effectively serve as a back-end server. In the many examples, different criteria may be enabled or may be set up for when to post data, create or adjust schedules, create or adjust event triggering including a new data event, create a buffer full message, create or more alarms messages, and the like.

In embodiments, the MDCA 7008 may be configured to provide automated as well as user-directed analyses of the raw data that may include tracking and annotating specific occurrence and in doing so, noting where reports may be generated and alarms may be noted. In embodiments, the SCI 7010 may be an application configured to provide remote control of the system from the cloud as well as the ability to generate status and alarms. In embodiments, the SCI 7010 may be configured to connect to, interface with, or be integrated into a supervisory control and data acquisition ("SCADA") control system. In embodiments, the SCI 7010 may be configured as a LabVIEW™ application that may provide remote control and status alerts that may be provided to any remote device that may connect to one or more of the cloud network facilities 5870.

In embodiments, the equipment that is being monitored may include RFID tags that may provide vital machinery analysis background information. The RFID tags may be associated with the entire machine or associated with the individual componentry and may be substituted when certain parts of the machine are replaced, repaired, or rebuilt. The RFID tags may provide permanent information relevant to the lifetime of the unit or may also be re-flashed to update with at least a portion of new information. In many embodiments, the DAQ instruments 5002 disclosed herein may interrogate the one or more RFID chips to learn of the machine, its componentry, its service history, and the hierarchical structure of how everything is connected including drive diagrams, wire diagrams, and hydraulic layouts. In embodiments, some of the information that may be retrieved from the RFID tags includes manufacturer, machinery type, model, serial number, model number, manufacturing date, installation date, lots numbers, and the like. By way of these examples, machinery type may include the use of a Mimosa™ format table including information about one or more of the following motors, gearboxes, fans, and compressors. The machinery type may also include the number of bearings, their type, their positioning, and their identification numbers. The information relevant to one or more fans includes fan type, number of blades, number of vanes, and number of belts. It will be appreciated in light of the disclosure that other machines and their componentry may be similarly arranged hierarchically with relevant information all of which may be available through interrogation of one or more RFID chips associated with the one or more machines.

In embodiments, data collection in an industrial environment may include routing analog signals from a plurality of sources, such as analog sensors, to a plurality of analog signal processing circuits. Routing of analog signals may be accomplished by an analog crosspoint switch that may route any of a plurality of analog input signals to any of a plurality of outputs, such as to analog and/or digital outputs. Routing of inputs to outputs in an analog signal crosspoint switch in an industrial environment may be configurable, such as by an electronic signal to which a switch portion of the analog crosspoint switch is responsive.

In embodiments, the analog crosspoint switch may receive analog signals from a plurality of analog signal sources in the industrial environment. Analog signal sources may include sensors that produce an analog signal. Sensors that produce an analog signal that may be switched by the analog crosspoint switch may include sensors that detect a condition and convert it to an analog signal that may be representative of the condition, such as converting a condition to a corresponding voltage. Exemplary conditions that may be represented by a variable voltage may include temperature, friction, sound, light, torque, revolutions-per-minute, mechanical resistance, pressure, flow rate, and the like, including any of the conditions represented by inputs sources and sensors disclosed throughout this disclosure and the documents incorporated herein by reference. Other forms of analog signal may include electrical signals, such as variable voltage, variable current, variable resistance, and the like.

In embodiments, the analog crosspoint switch may preserve one or more aspects of an analog signal being input to it in an industrial environment. Analog circuits integrated into the switch may provide buffered outputs. The analog circuits of the analog crosspoint switch may follow an input signal, such as an input voltage to produce a buffered representation on an output. This may alternatively be accomplished by relays (mechanical, solid state, and the like) that allow an analog voltage or current present on an input to propagate to a selected output of the analog switch.

In embodiments, an analog crosspoint switch in an industrial environment may be configured to switch any of a plurality of analog inputs to any of a plurality of analog outputs. An example embodiment includes a MIMO, multiplexed configuration. An analog crosspoint switch may be dynamically configurable so that changes to the configuration causes a change in the mapping of inputs to outputs. A configuration change may apply to one or more mappings so that a change in mapping may result in one or more of the outputs being mapped to different input than before the configuration change.

In embodiments, the analog crosspoint switch may have more inputs than outputs, so that only a subset of inputs can be routed to outputs concurrently. In other embodiments, the analog crosspoint switch may have more outputs than inputs, so that either a single input may be made available currently on multiple outputs, or at least one output may not be mapped to any input.

In embodiments, an analog crosspoint switch in an industrial environment may be configured to switch any of a plurality of analog inputs to any of a plurality of digital outputs. To accomplish conversion from analog inputs to digital outputs, an analog-to-digital converter circuit may be configured on each input, each output, or at intermediate points between the input(s) and output(s) of the analog crosspoint switch. Benefits of including digitization of analog signals in an analog crosspoint switch that may be located close to analog signal sources may include reducing signal transport costs and complexity that digital signal communication has over analog, reducing energy consumption, facilitating detection and regulation of aberrant conditions before they propagate throughout an industrial environment, and the like. Capturing analog signals close to their source may also facilitate improved signal routing management that is more tolerant of real world effects such as requiring that multiple signals be routed simultaneously. In this example, a portion of the signals can be captured (and stored) locally while another portion can be transferred through the data collection network. Once the data collection network has available bandwidth, the locally stored signals can be delivered, such as with a time stamp indicating the time at which the data was collected. This technique may be useful for applications that have concurrent demand for data collection channels that exceed the number of channels available. Sampling control may also be based on an indication of data worth sampling. As an example, a signal source, such as a sensor in an industrial environment may provide a data valid signal that transmits an indication of when data from the sensor is available.

In embodiments, mapping inputs of the analog crosspoint switch to outputs may be based on a signal route plan for a portion of the industrial environment that may be presented to the crosspoint switch. The signal route plan may be used in a method of data collection in the industrial environment that may include routing a plurality of analog signals along a plurality of analog signal paths. The method may include connecting the plurality of analog signals individually to inputs of the analog crosspoint switch that may be configured with a route plan. The crosspoint switch may, responsively to the configured route plan, route a portion of the plurality of analog signals to a portion of the plurality of analog signal paths.

In embodiments, the analog crosspoint switch may include at least one high current output drive circuit that may be suitable for routing the analog signal along a path that requires high current. In embodiments, the analog crosspoint switch may include at least one voltage-limited input that may facilitate protecting the analog crosspoint switch from damage due to excessive analog input signal voltage. In embodiments, the analog crosspoint switch may include at least one current limited input that may facilitate protecting the analog crosspoint switch from damage due to excessive analog input current. The analog crosspoint switch may comprise a plurality of interconnected relays that may facilitate routing the input(s) to the output(s) with little or no substantive signal loss.

In embodiments, an analog crosspoint switch may include processing functionality, such as signal processing and the like (e.g., a programmed processor, special purpose processor, a digital signal processor, and the like) that may detect one or more analog input signal conditions. In response to such detection, one or more actions may be performed, such as setting an alarm, sending an alarm signal to another device in the industrial environment, changing the crosspoint switch configuration, disabling one or more outputs, powering on or off a portion of the switch, changing a state of an output, such as a general purpose digital or analog output, and the like. In embodiments, the switch may be configured to process inputs for producing a signal on one or more of the outputs. The inputs to use, processing algorithm for the inputs, condition for producing the signal, output to use, and the like may be configured in a data collection template.

In embodiments, an analog crosspoint switch may comprise greater than 32 inputs and greater than 32 outputs. A plurality of analog crosspoint switches may be configured so that even though each switch offers fewer than 32 inputs and 32 outputs it may be configured to facilitate switching any of 32 inputs to any of 32 outputs spread across the plurality of crosspoint switches.

In embodiments, an analog crosspoint switch suitable for use in an industrial environment may comprise four or fewer inputs and four or fewer outputs. Each output may be configurable to produce an analog output that corresponds to the mapped analog input or it may be configured to produce a digital representation of the corresponding mapped input.

In embodiments, an analog crosspoint switch for use in an industrial environment may be configured with circuits that facilitate replicating at least a portion of attributes of the input signal, such as current, voltage range, offset, frequency, duty cycle, ramp rate, and the like while buffering (e.g., isolating) the input signal from the output signal. Alternatively, an analog crosspoint switch may be configured with unbuffered inputs/outputs, thereby effectively producing a bi-directional based crosspoint switch).

In embodiments, an analog crosspoint switch for use in an industrial environment may include protected inputs that may be protected from damaging conditions, such as through use of signal conditioning circuits. Protected inputs may prevent damage to the switch and to downstream devices to which the switch outputs connect. As an example, inputs to such an analog crosspoint switch may include voltage clipping circuits that prevent a voltage of an input signal from exceeding an input protection threshold. An active voltage adjustment circuit may scale an input signal by reducing it uniformly so that a maximum voltage present on the input does not exceed a safe threshold value. As another example, inputs to such an analog crosspoint switch may include current shunting circuits that cause current beyond a maximum input protection current threshold to be diverted through protection circuits rather than enter the switch. Analog switch inputs may be protected from electrostatic discharge and/or lightning strikes. Other signal conditioning functions that may be applied to inputs to an analog crosspoint switch may include voltage scaling circuitry that attempts to facilitate distinguishing between valid input signals and low voltage noise that may be present on the input. However, in embodiments, inputs to the analog crosspoint switch may be unbuffered and/or unprotected to make the least impact on the signal. Signals such as alarm signals, or signals that cannot readily tolerate protection schemes, such as those schemes described above herein may be connected to unbuffered inputs of the analog crosspoint switch.

In embodiments, an analog crosspoint switch may be configured with circuitry, logic, and/or processing elements that may facilitate input signal alarm monitoring. Such an analog crosspoint switch may detect inputs meeting alarm conditions and in response thereto, switch inputs, switch mapping of inputs to outputs, disable inputs, disable outputs, issue an alarm signal, activate/deactivate a general-purpose output, or the like.

In embodiments, a system for collecting data in an industrial environment may include an analog crosspoint switch that may be adapted to selectively power up or down portions of the analog crosspoint switch or circuitry associated with the analog crosspoint switch, such as input protection devices, input conditioning devices, switch control devices and the like. Portions of the analog crosspoint switch that may be powered on/off may include outputs, inputs, sections of the switch and the like. In an example, an analog crosspoint switch may include a modular structure that may separate portions of the switch into independently powered sections. Based on conditions, such as an input signal meeting a criterion or a configuration value being presented to the analog crosspoint switch, one or more modular sections may be powered on/off.

In embodiments, a system for collecting data in an industrial environment may include an analog crosspoint switch that may be adapted to perform signal processing including, without limitation, providing a voltage reference for detecting an input crossing the voltage reference (e.g., zero volts for detecting zero-crossing signals), a phase-lock loop to facilitate capturing slow frequency signals (e.g., low-speed revolution-per-minute signals and detecting their corresponding phase), deriving input signal phase relative to other inputs, deriving input signal phase relative to a reference (e.g., a reference clock), deriving input signal phase relative to detected alarm input conditions and the like. Other signal processing functions of such an analog crosspoint switch may include oversampling of inputs for delta-sigma A/D, to produce lower sampling rate outputs, to minimize AA filter requirements and the like. Such an analog crosspoint switch may support long block sampling at a constant sampling rate even as inputs are switched, which may facilitate input signal rate independence and reduce complexity of sampling scheme(s). A constant sampling rate may be selected from a plurality of rates that may be produced by a circuit, such as a clock divider circuit that may make available a plurality of components of a reference clock.

In embodiments, a system for collecting data in an industrial environment may include an analog crosspoint switch that may be adapted to support implementing data collection/data routing templates in the industrial environment. The analog crosspoint switch may implement a data collection/data routing template based on conditions in the industrial environment that it may detect or derive, such as an input signal meeting one or more criteria (e.g., transition of a signal from a first condition to a second, lack of transition of an input signal within a predefined time interface (e.g., inactive input) and the like).

In embodiments, a system for collecting data in an industrial environment may include an analog crosspoint switch that may be adapted to be configured from a portion of a data collection template. Configuration may be done automatically (without needing human intervention to perform a configuration action or change in configuration), such as based on a time parameter in the template and the like. Configuration may be done remotely, e.g., by sending a signal from a remote location that is detectable by a switch configuration feature of the analog crosspoint switch. Configuration may be done dynamically, such as based on a condition that is detectable by a configuration feature of the analog crosspoint switch (e.g., a timer, an input condition, an output condition, and the like). In embodiments, information for configuring an analog crosspoint switch may be provided in a stream, as a set of control lines, as a data file, as an indexed data set, and the like. In embodiments, configuration information in a data collection template for the switch may include a list of each input and a corresponding output, a list of each output function (active, inactive, analog, digital and the like), a condition for updating the configuration (e.g., an input signal meeting a condition, a trigger signal, a time (relative to another time/event/state, or absolute), a duration of the configuration, and the like. In embodiments, configuration of the switch may be input signal protocol aware so that switching from a first input to a second input for a given output may occur based on the protocol. In an example, a configuration change may be initiated with the switch to switch from a first video signal to a second video signal. The configuration circuitry may detect the protocol of the input signal and switch to the second video signal during a synchronization phase of the video signal, such as during horizontal or vertical refresh. In other examples, switching may occur when one or more of the inputs are at zero volts. This may occur for a sinusoidal signal that transitions from below zero volts to above zero volts.

In embodiments, a system for collecting data in an industrial environment may include an analog crosspoint switch that may be adapted to provide digital outputs by converting analog signals input to the switch into digital outputs. Converting may occur after switching the analog inputs based on a data collection template and the like. In embodiments, a portion of the switch outputs may be digital and a portion may be analog. Each output, or groups thereof, may be configurable as analog or digital, such as based on analog crosspoint switch output configuration information included in or derived from a data collection template. Circuitry in the analog crosspoint switch may sense an input signal voltage range and intelligently configure an analog-to-digital conversion function accordingly. As an example, a first input may have a voltage range of 12 volts and a second input may have a voltage range of 24 volts. Analog-to-digital converter circuits for these inputs may be adjusted so that the full range of the digital value (e.g., 256 levels for an 8-bit signal) will map substantially linearly to 12 volts for the first input and 24 volts for the second input.

In embodiments, an analog crosspoint switch may automatically configure input circuitry based on characteristics of a connected analog signal. Examples of circuitry configuration may include setting a maximum voltage, a threshold based on a sensed maximum threshold, a voltage range above and/or below a ground reference, an offset reference, and the like. The analog crosspoint switch may also adapt inputs to support voltage signals, current signals, and the like. The analog crosspoint switch may detect a protocol of an input signal, such as a video signal protocol, audio signal protocol, digital signal protocol, protocol based on input signal frequency characteristics, and the like. Other aspects of inputs of the analog crosspoint switch that may be adapted based on the incoming signal may include a duration of sampling of the signal, and comparator or differential type signals, and the like.

In embodiments, an analog crosspoint switch may be configured with functionality to counteract input signal drift and/or leakage that may occur when an analog signal is passed through it over a long period of time without changing value (e.g., a constant voltage). Techniques may include voltage boost, current injection, periodic zero referencing (e.g., temporarily connecting the input to a reference signal, such as ground, applying a high resistance pathway to the ground reference, and the like).

In embodiments, a system for data collection in an industrial environment may include an analog crosspoint switch deployed in an assembly line comprising conveyers and/or lifters. A power roller conveyor system includes many rollers that deliver product along a path. There may be many points along the path that may be monitored for proper operation of the rollers, load being placed on the rollers, accumulation of products, and the like. A power roller conveyor system may also facilitate moving product through longer distances and therefore may have a large number of products in transport at once. A system for data collection in such an assembly environment may include sensors that detect a wide range of conditions as well as at a large number of positions along the transport path. As a product progresses down the path, some sensors may be active and others, such as those that the product has passed may be inactive. A data collection system may use an analog crosspoint switch to select only those sensors that are currently or anticipated to be active by switching from inputs that connect to inactive sensors to those that connect to active sensors and thereby provide the most useful sensor signals to data detection and/or collection and/or processing facilities. In embodiments, the analog crosspoint switch may be configured by a conveyor control system that monitors product activity and instructs the analog crosspoint switch to direct different inputs to specific outputs based on a control program or data collection template associated with the assembly environment.

In embodiments, a system for data collection in an industrial environment may include an analog crosspoint switch deployed in a factory comprising use of fans as industrial components. In embodiments, fans in a factory setting may provide a range of functions including drying, exhaust management, clean air flow and the like. In an installation of a large number of fans, monitoring fan rotational speed, torque, and the like may be beneficial to detect an early indication of a potential problem with air flow being produced by the fans. However, concurrently monitoring each of these elements for a large number of fans may be inefficient. Therefore, sensors, such as tachometers, torque meters, and the like may be disposed at each fan and their analog output signal(s) may be provided to an analog crosspoint switch. With a limited number of outputs, or at least a limited number of systems that can process the sensor data, the analog crosspoint switch may be used to select among the many sensors and pass along a subset of the available sensor signals to data collection, monitoring, and processing systems. In an example, sensor signals from sensors disposed at a group of fans may be selected to be switched onto crosspoint switch outputs. Upon satisfactory collection and/or processing of the sensor signals for this group of fans, the analog crosspoint switch may be reconfigured to switch signals from another group of fans to be processed.

In embodiments, a system for data collection in an industrial environment may include an analog crosspoint switch deployed as an industrial component in a turbine-based power system. Monitoring for vibration in turbine systems, such as hydro-power systems, has been demonstrated to provide advantages in reduction in down time. However, with a large number of areas to monitor for vibration, particularly for on-line vibration monitoring, including relative shaft vibration, bearings absolute vibration, turbine cover vibration, thrust bearing axial vibration, stator core vibrations, stator bar vibrations, stator end winding vibrations, and the like, it may be beneficial to select among this list over time, such as taking samples from sensors for each of these types of vibration a few at a time. A data collection system that includes an analog crosspoint switch may provide this capability by connecting each vibration sensor to separate inputs of the analog crosspoint switch and configuring the switch to output a subset of its inputs. A vibration data processing system, such as a computer, may determine which sensors to pass through the analog crosspoint switch and configure an algorithm to perform the vibration analysis accordingly. As an example, sensors for capturing turbine cover vibration may be selected in the analog crosspoint switch to be passed on to a system that is configured with an algorithm to determine turbine cover vibration from the sensor signals. Upon completion of determining turbine cover vibration, the crosspoint switch may be configured to pass along thrust bearing axial vibration sensor signals and a corresponding vibration analysis algorithm may be applied to the data. In this way, each type of vibration may be analyzed by a single processing system that works cooperatively with an analog crosspoint switch to pass specific sensor signals for processing.

Figure 44:
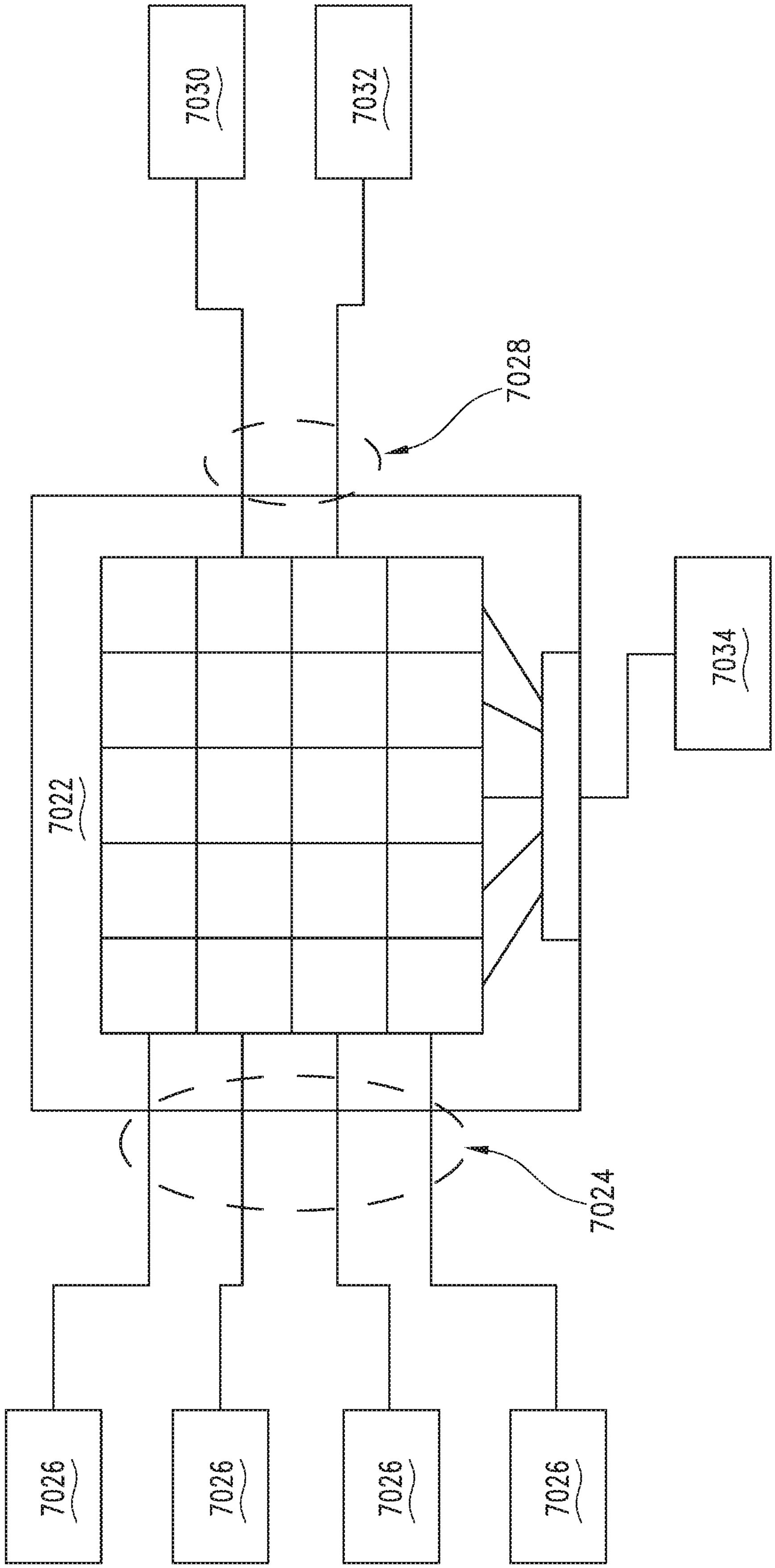

Referring to FIG. 44, an analog crosspoint switch for collecting data in an industrial environment is depicted. The analog crosspoint switch 7022 may have a plurality of inputs 7024 that connect to sensors 7026 in the industrial environment. The analog crosspoint switch 7022 may also comprise a plurality of outputs 7028 that connect to data collection infrastructure, such as analog-to-digital converters 7030, analog comparators 7032, and the like. The analog crosspoint switch 7022 may facilitate connecting one or more inputs 7024 to one or more outputs 7028 by interpreting a switch control value that may be provided to it by a controller 7034 and the like.

An example system for data collection in an industrial environment comprising includes analog signal sources that each connect to at least one input of an analog crosspoint switch including a plurality of inputs and a plurality of outputs; where the analog crosspoint switch is configurable to switch a portion of the input signal sources to a plurality of the outputs.

2. In certain embodiments, the analog crosspoint switch further includes an analog-to-digital converter that converts a portion of analog signals input to the crosspoint switch into representative digital signals; a portion of the outputs including analog outputs and a portion of the outputs comprises digital outputs; and/or where the analog crosspoint switch is adapted to detect one or more analog input signal conditions. Any one or more of the example embodiments include the analog input signal conditions including a voltage range of the signal, and where the analog crosspoint switch responsively adjusts input circuitry to comply with detected voltage range.

An example system of data collection in an industrial environment includes a number of industrial sensors that produce analog signals representative of a condition of an industrial machine in the environment being sensed by the number of industrial sensors, a crosspoint switch that receives the analog signals and routes the analog signals to separate analog outputs of the crosspoint switch based on a signal route plan presented to the crosspoint switch. In certain embodiments, the analog crosspoint switch further includes an analog-to-digital converter that converts a portion of analog signals input to the crosspoint switch into representative digital signals; where a portion of the outputs include analog outputs and a portion of the outputs include digital outputs; where the analog crosspoint switch is adapted to detect one or more analog input signal conditions; where the one or more analog input signal conditions include a voltage range of the signal, and/or where the analog crosspoint switch responsively adjusts input circuitry to comply with detected voltage range.

An example method of data collection in an industrial environment includes routing a number of analog signals along a plurality of analog signal paths by connecting the plurality of analog signals individually to inputs of an analog crosspoint switch, configuring the analog crosspoint switch with data routing information from a data collection template for the industrial environment routing, and routing with the configured analog crosspoint switch a portion of the number of analog signals to a portion the plurality of analog signal paths. In certain further embodiments, at least one output of the analog crosspoint switch includes a high current driver circuit; at least one input of the analog crosspoint switch includes a voltage limiting circuit; and/or at least one input of the analog crosspoint switch includes a current limiting circuit. In certain further embodiments, the analog crosspoint switch includes a number of interconnected relays that facilitate connecting any of a number of inputs to any of a plurality of outputs; the analog crosspoint switch further including an analog-to-digital converter that converts a portion of analog signals input to the crosspoint switch into a representative digital signal; the analog crosspoint switch further including signal processing functionality to detect one or more analog input signal conditions, and in response thereto, to perform an action (e.g., set an alarm, change switch configuration, disable one or more outputs, power off a portion of the switch, change a state of a general purpose (digital/analog) output, etc.); where a portion of the outputs are analog outputs and a portion of the outputs are digital outputs; where the analog crosspoint switch is adapted to detect one or more analog input signal conditions; where the analog crosspoint switch is adapted to take one or more actions in response to detecting the one or more analog input signal conditions, the one more actions including setting an alarm, sending an alarm signal, changing a configuration of the analog crosspoint switch, disabling an output, powering off a portion of the analog crosspoint switch, powering on a portion of the analog crosspoint switch, and/or controlling a general purpose output of the analog crosspoint switch.

An example system includes a power roller of a conveyor, including any of the described operations of an analog crosspoint switch. Without limitation, further example embodiments includes sensing conditions of the power roller by the sensors to determine a rate of rotation of the power roller, a load being transported by the power roller, power being consumed by the power roller, and/or a rate of acceleration of the power roller. An example system includes a fan in a factory setting, including any of the described operations of an analog crosspoint switch. Without limitation, certain further embodiments include sensors disposed to sense conditions of the fan, including a fan blade tip speed, torque, back pressure, RPMs, and/or a volume of air per unit time displaced by the fan. An example system includes a turbine in a power generation environment, including any of the described operations of an analog crosspoint switch. Without limitation, certain further embodiments include a number of sensors disposed to sense conditions of the turbine, where the sensed conditions include a relative shaft vibration, an absolute vibration of bearings, a turbine cover vibration, a thrust bearing axial vibration, vibrations of stators or stator cores, vibrations of stator bars, and/or vibrations of stator end windings In embodiments, methods and systems of data collection in an industrial environment may include a plurality of industrial condition sensing and acquisition modules that may include at least one programmable logic component per module that may control a portion of the sensing and acquisition functionality of its module. The programmable logic components on each of the modules may be interconnected by a dedicated logic bus that may include data and control channels. The dedicated logic bus may extend logically and/or physically to other programmable logic components on other sensing and acquisition modules. In embodiments, the programmable logic components may be programmed via the dedicated interconnection bus, via a dedicated programming portion of the dedicated interconnection bus, via a program that is passed between programmable logic components, sensing and acquisition modules, or whole systems. A programmable logic component for use in an industrial environment data sensing and acquisition system may be a Complex Programmable Logic Device, an Application-Specific Integrated Circuit, microcontrollers, and combinations thereof.

A programmable logic component in an industrial data collection environment may perform control functions associated with data collection. Control examples include power control of analog channels, sensors, analog receivers, analog switches, portions of logic modules (e.g., a logic board, system, and the like) on which the programmable logic component is disposed, self-power-up/down, self-sleep/wake up, and the like. Control functions, such as these and others, may be performed in coordination with control and operational functions of other programmable logic components, such as other components on a single data collection module and components on other such modules. Other functions that a programmable logic component may provide may include generation of a voltage reference, such as a precise voltage reference for input signal condition detection. A programmable logic component may generate, set, reset, adjust, calibrate, or otherwise determine the voltage of the reference, its tolerance, and the like. Other functions of a programmable logic component may include enabling a digital phase lock loop to facilitate tracking slowly transitioning input signals, and further to facilitate detecting the phase of such signals. Relative phase detection may also be implemented, including phase relative to trigger signals, other analog inputs, on-board references (e.g., on-board timers), and the like. A programmable logic component may be programmed to perform input signal peak voltage detection and control input signal circuitry, such as to implement auto-scaling of the input to an operating voltage range of the input. Other functions that may be programmed into a programmable logic component may include determining an appropriate sampling frequency for sampling inputs independently of their operating frequencies. A programmable logic component may be programmed to detect a maximum frequency among a plurality of input signals and set a sampling frequency for each of the input signals that is greater than the detected maximum frequency.

A programmable logic component may be programmed to configure and control data routing components, such as multiplexers, crosspoint switches, analog-to-digital converters, and the like, to implement a data collection template for the industrial environment. A data collection template may be included in a program for a programmable logic component. Alternatively, an algorithm that interprets a data collection template to configure and control data routing resources in the industrial environment may be included in the program.

In embodiments, one or more programmable logic components in an industrial environment may be programmed to perform smart-band signal analysis and testing. Results of such analysis and testing may include triggering smart band data collection actions, that may include reconfiguring one or more data routing resources in the industrial environment. A programmable logic component may be configured to perform a portion of smart band analysis, such as collection and validation of signal activity from one or more sensors that may be local to the programmable logic component. Smart band signal analysis results from a plurality of programmable logic components may be further processed by other programmable logic components, servers, machine learning systems, and the like to determine compliance with a smart band.

In embodiments, one or more programmable logic components in an industrial environment may be programmed to control data routing resources and sensors for outcomes, such as reducing power consumption (e.g., powering on/off resources as needed), implementing security in the industrial environment by managing user authentication, and the like. In embodiments, certain data routing resources, such as multiplexers and the like, may be configured to support certain input signal types. A programmable logic component may configure the resources based on the type of signals to be routed to the resources. In embodiments, the programmable logic component may facilitate coordination of sensor and data routing resource signal type matching by indicating to a configurable sensor a protocol or signal type to present to the routing resource. A programmable logic component may facilitate detecting a protocol of a signal being input to a data routing resource, such as an analog crosspoint switch and the like. Based on the detected protocol, the programmable logic component may configure routing resources to facilitate support and efficient processing of the protocol. In an example, a programmable logic component configured data collection module in an industrial environment may implement an intelligent sensor interface specification, such as IEEE 1451.2 intelligent sensor interface specification.

In embodiments, distributing programmable logic components across a plurality of data sensing, collection, and/or routing modules in an industrial environment may facilitate greater functionality and local inter-operational control. In an example, modules may perform operational functions independently based on a program installed in one or more programmable logic components associated with each module. Two modules may be constructed with substantially identical physical components, but may perform different functions in the industrial environment based on the program(s) loaded into programmable logic component(s) on the modules. In this way, even if one module were to experience a fault, or be powered down, other modules may continue to perform their functions due at least in part to each having its own programmable logic component(s). In embodiments, configuring a plurality of programmable logic components distributed across a plurality of data collection modules in an industrial environment may facilitate scalability in terms of conditions in the environment that may be sensed, the number of data routing options for routing sensed data throughout the industrial environment, the types of conditions that may be sensed, the computing capability in the environment, and the like.

In embodiments, a programmable logic controller-configured data collection and routing system may facilitate validation of external systems for use as storage nodes, such as for a distributed ledger, and the like. A programmable logic component may be programmed to perform validation of a protocol for communicating with such an external system, such as an external storage node.

In embodiments, programming of programmable logic components, such as CPLDs and the like may be performed to accommodate a range of data sensing, collection and configuration differences. In embodiments, reprogramming may be performed on one or more components when adding and/or removing sensors, when changing sensor types, when changing sensor configurations or settings, when changing data storage configurations, when embedding data collection template(s) into device programs, when adding and/or removing data collection modules (e.g., scaling a system), when a lower cost device is used that may limit functionality or resources over a higher cost device, and the like. A programmable logic component may be programmed to propagate programs for other programmable components via a dedicated programmable logic device programming channel, via a daisy chain programming architecture, via a mesh of programmable logic components, via a hub-and-spoke architecture of interconnected components, via a ring configuration (e.g., using a communication token, and the like).

Figure 45:
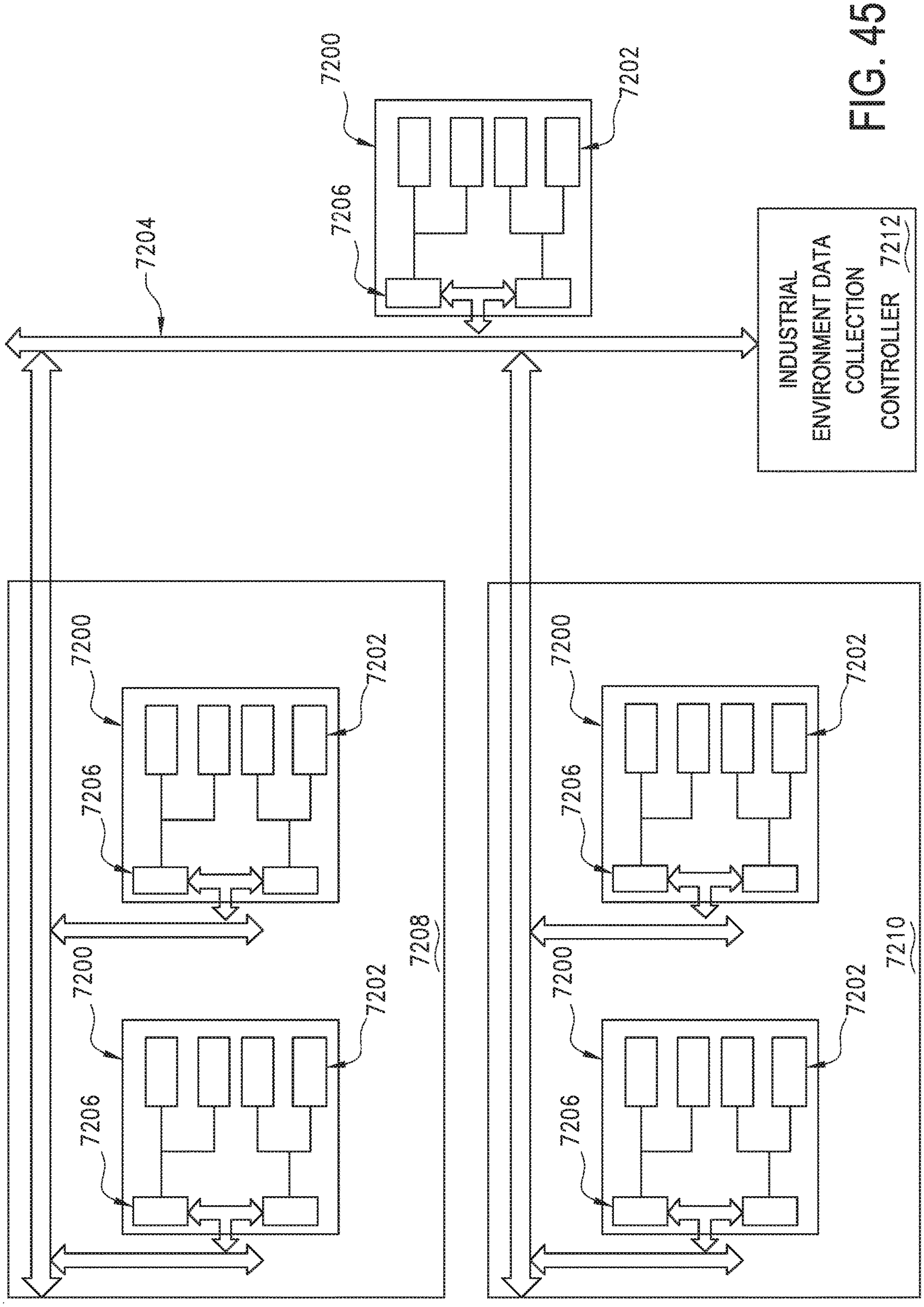

Referring to FIG. 45, an exemplary embodiment of a system for data collection in an industrial environment comprising distributed CPLDs interconnected by a bus for control and/or programming thereof is depicted. An exemplary data collection module 7200 may comprise one or more CPLDs 7206 for controlling one or more data collection system resources, such as sensors 7202 and the like. Other data collection resources that a CPLD may control may include crosspoint switches, multiplexers, data converters, and the like. CPLDs on a module may be interconnected by a bus, such as a dedicated logic bus 7204 that may extend beyond a data collection module to CPLDs on other data collection modules. Data collection modules, such as module 7200 may be configured in the environment, such as on an industrial machine 7208 (e.g., an impulse gas turbine) and/or 7210 (e.g., a co-generation system), and the like. Control and/or configuration of the CPLDs may be handled by a controller 7212 in the environment. Data collection and routing resources and interconnection (not shown) may also be configured within and among data collection modules 7200 as well as between and among industrial machines 7208 and 7210, and/or with external systems, such as Internet portals, data analysis servers, and the like to facilitate data collection, routing, storage, analysis, and the like.

An example system for data collection in an industrial environment includes a number of industrial condition sensing and acquisition modules, with a programmable logic component disposed on each of the modules, where the programmable logic component controls a portion of the sensing and acquisition functional of the corresponding module. The system includes communication bus that is dedicated to interconnecting the at least one programmable logic component disposed on at least one of the plurality of modules, wherein the communication bus extends to other programmable logic components on other sensing and acquisition modules.

In certain further embodiments, a system includes the programmable logic component programmed via the communication bus, the communication bus including a portion dedicated to programming of the programmable logic components, controlling a portion of the sensing and acquisition functionality of a module by a power control function such as: controlling power of a sensor, a multiplexer, a portion of the module, and/or controlling a sleep mode of the programmable logic component; controlling a portion of the sensing and acquisition functionality of a module by providing a voltage reference to a sensor and/or an analog-to-digital converter disposed on the module, by detecting a relative the phase of at least two analog signals derived from at least two sensors disposed on the module; by controlling sampling of data provided by at least one sensor disposed on the module; by detecting a peak voltage of a signal provided by a sensor disposed on the module; and/or by configuring at least one multiplexer disposed on the module by specifying to the multiplexer a mapping of at least one input and one output. In certain embodiments, the communication bus extends to other programmable logic components on other condition sensing and/or acquisition modules. In certain embodiments, a module may be an industrial environment condition sensing module. In certain embodiments, a module control program includes an algorithm for implementing an intelligent sensor interface communication protocol, such as an IEEE1451.2 compatible intelligent sensor interface communication protocol. In certain embodiments, a programmable logic component includes configuring the programmable logic component and/or the sensing or acquisition module to implement a smart band data collection template. Example and non-limiting programmable logic components include field programmable gate arrays, complex programmable logic devices, and/or microcontrollers.

Exemplary deployment environments may include environments with trigger signal channel limitations, such as existing data collection systems that do not have separate trigger support for transporting an additional trigger signal to a module with sufficient computing sophistication to perform trigger detection. Another exemplary deployment may include systems that require at least some autonomous control for performing data collection.

In embodiments, a system for data collection in an industrial environment may include an analog switch that switches between a first input, such as a trigger input and a second input, such as a data input based on a condition of the first input. A trigger input may be monitored by a portion of the analog switch to detect a change in the signal, such as from a lower voltage to a higher voltage relative to a reference or trigger threshold voltage. In embodiments, a device that may receive the switched signal from the analog switch may monitor the trigger signal for a condition that indicates a condition for switching from the trigger input to the data input. When a condition of the trigger input is detected, the analog switch may be reconfigured, to direct the data input to the same output that was propagating the trigger output.

In embodiments, a system for data collection in an industrial environment may include an analog switch that directs a first input to an output of the analog switch until such time as the output of the analog switch indicates that a second input should be directed to the output of the analog switch. The output of the analog switch may propagate a trigger signal to the output. In response to the trigger signal propagating through the switch transitioning from a first condition (e.g., a first voltage below a trigger threshold voltage value) to a second condition (e.g., a second voltage above the trigger threshold voltage value), the switch may stop propagating the trigger signal and instead propagate another input signal to the output. In embodiments, the trigger signal and the other data signal may be related, such as the trigger signal may indicate a presence of an object being placed on a conveyer and the data signal represents a strain placed on the conveyer.

In embodiments, to facilitate timely detection of the trigger condition, a rate of sampling of the output of the analog switch may be adjustable, so that, for example, the rate of sampling is higher while the trigger signal is propagated and lower when the data signal is propagated. Alternatively, a rate of sampling may be fixed for either the trigger or the data signal. In embodiments, the rate of sampling may be based on a predefined time from trigger occurrence to trigger detection and may be faster than a minimum sample rate to capture the data signal.

In embodiments, routing a plurality of hierarchically organized triggers onto another analog channel may facilitate implementing a hierarchical data collection triggering structure in an industrial environment. A data collection template to implement a hierarchical trigger signal architecture may include signal switch configuration and function data that may facilitate a signal switch facility, such as an analog crosspoint switch or multiplexer to output a first input trigger in a hierarchy, and based on the first trigger condition being detected, output a second input trigger in the hierarchy on the same output as the first input trigger by changing an internal mapping of inputs to outputs. Upon detection of the second input trigger condition, the output may be switched to a data signal, such as data from a sensor in an industrial environment.

In embodiments, upon detection of a trigger condition, in addition to switching from the trigger signal to a data signal, an alarm may be generated and optionally propagated to a higher functioning device/module. In addition to switching to a data signal, upon detection of a state of the trigger, sensors that otherwise may be disabled or powered down may be energized/activated to begin to produce data for the newly selected data signal. Activating might alternatively include sending a reset or refresh signal to the sensor(s).

In embodiments, a system for data collection in an industrial environment may include a system for routing a trigger signal onto a data signal path in association with a gearbox of an industrial vehicle. Combining a trigger signal onto a signal path that is also used for a data signal may be useful in gearbox applications by reducing the number of signal lines that need to be routed, while enabling advanced functions, such as data collection based on pressure changes in the hydraulic fluid and the like. As an example, a sensor may be configured to detect a pressure difference in the hydraulic fluid that exceeds a certain threshold as may occur when the hydraulic fluid flow is directed back into the impeller to give higher torque at low speeds. The output of such a sensor may be configured as a trigger for collecting data about the gearbox when operating at low speeds. In an example, a data collection system for an industrial environment may have a multiplexer or switch that facilitates routing either a trigger or a data channel over a single signal path. Detecting the trigger signal from the pressure sensor may result in a different signal being routed through the same line that the trigger signal was routed by switching a set of controls. A multiplexer may, for example, output the trigger signal until the trigger signal is detected as indicating that the output should be changed to the data signal. As a result of detecting the high-pressure condition, a data collection activity may be activated so that data can be collected using the same line that was recently used by the trigger signal.

In embodiments, a system for data collection in an industrial environment may include a system for routing a trigger signal onto a data signal path in association with a vehicle suspension for truck and car operation. Vehicle suspension, particularly active suspension may include sensors for detecting road events, suspension conditions, and vehicle data, such as speed, steering, and the like. These conditions may not always need to be detected, except, for example, upon detection of a trigger condition. Therefore, combining the trigger condition signal and at least one data signal on a single physical signal routing path could be implemented. Doing so may reduce costs due to fewer physical connections required in such a data collection system. In an example, a sensor may be configured to detect a condition, such as a pot hole, to which the suspension must react. Data from the suspension may be routed along the same signal routing path as this road condition trigger signal so that upon detection of the pot hole, data may be collected that may facilitate determining aspects of the suspension's reaction to the pot hole.

In embodiments, a system for data collection in an industrial environment may include a system for routing a trigger signal onto a data signal path in association with a turbine for power generation in a power station. A turbine used for power generation may be retrofitted with a data collection system that optimizes existing data signal lines to implement greater data collection functions. One such approach involves routing new sources of data over existing lines. While multiplexing signals generally satisfies this need, combining a trigger signal with a data signal via a multiplexer or the like can further improve data collection. In an example, a first sensor may include a thermal threshold sensor that may measure the temperature of an aspect of a power generation turbine. Upon detection of that trigger (e.g., by the temperature rising above the thermal threshold), a data collection system controller may send a different data collection signal over the same line that was used to detect the trigger condition. This may be accomplished by a controller or the like sensing the trigger signal change condition and then signaling to the multiplexer to switch from the trigger signal to a data signal to be output on the same line as the trigger signal for data collection. In this example, when a turbine is detected as having a portion that exceeds its safe thermal threshold, a secondary safety signal may be routed over the trigger signal path and monitored for additional safety conditions, such as overheating and the like.

Figure 46:
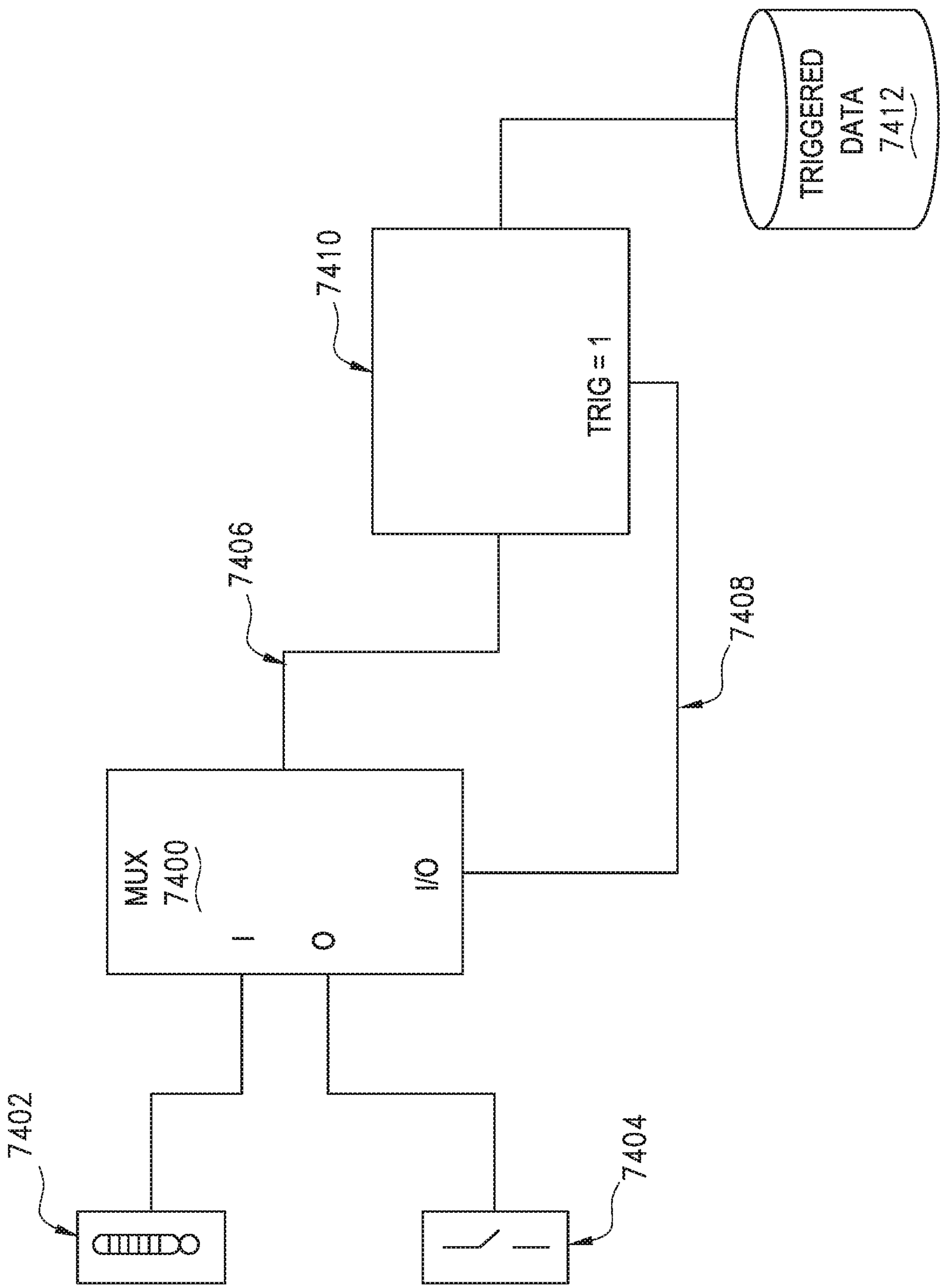

Referring to FIG. 46, an embodiment of routing a trigger signal over a data signal path in a data collection system in an industrial environment is depicted. Signal multiplexer 7400 may receive a trigger signal on a first input from a sensor or other trigger source 7404 and a data signal on a second input from a sensor for detecting a temperature associated with an industrial machine in the environment 7402. The multiplexer 7400 may be configured to output the trigger signal onto an output signal path 7406. A data collection module 7410 may process the signal on the data path 7406 looking for a change in the signal indicative of a trigger condition provided from the trigger sensor 7404 through the multiplexer 7400. Upon detection, a control output 7408 may be changed and thereby control the multiplexer 7400 to start outputting data from the temperature probe 7402 by switching an internal switch or the like that may control one or more of the inputs that may be routed to the output 7406. Data collection facility 7410 may activate a data collection template in response to the detected trigger that may include switching the multiplexer and collecting data into triggered data storage 7412. Upon completion of the data collection activity, multiplexer control signal 7408 may revert to its initial condition so that trigger sensor 7404 may be monitored again.

An example system for data collection in an industrial environment includes an analog switch that directs a first input to an output of the analog switch until such time as the output of the analog switch indicates that a second input should be directed to the output of the analog switch. In certain further embodiments, the example system includes: where the output of the analog switch indicated that the second input should be directed to the output based on the output transitioning from a pending condition to a triggered condition; wherein the triggered condition includes detecting the output presenting a voltage above a trigger voltage value; routing a number of signals with the analog switch from inputs on the analog switch to outputs on the analog switch in response to the output of the analog switch indicating that the second input should be directed to the output; sampling the output of the analog switch at a rate that exceeds a rate of transition for a number of signals input to the analog switch; and/or generating an alarm signal when the output of the analog switch indicates that a second input should be directed to the output of the analog switch.

An example system for data collection in an industrial environment includes an analog switch that switches between a first input and a second input based on a condition of the first input. In certain further embodiments, the condition of the first input comprises the first input presenting a triggered condition, and/or the triggered condition includes detecting the first input presenting a voltage above a trigger voltage value. In certain embodiments, the analog switch includes routing a plurality of signals with the analog from inputs on the analog switch to outputs on the analog switch based on the condition of the first input, sampling an input of the analog switch at a rate that exceeds a rate of transition for a plurality of signals input to the analog switch, and/or generating an alarm signal based on the condition of the first input.

An example system for data collection in an industrial environment includes a trigger signal and at least one data signal that share a common output of a signal multiplexer, and upon detection of a predefined state of the trigger signal, the common output is configured to propagate the at least one data signal through the signal multiplexer. In certain further embodiments, the signal multiplexer is an analog multiplexer, the predefined state of the trigger signal is detected on the common output, detection of the predefined state of the trigger signal includes detecting the common output presenting a voltage above a trigger voltage value, the multiplexer includes routing a plurality of signals with the multiplexer from inputs on the multiplexer to outputs on the multiplexer in response to detection of the predefined state of the trigger signal, the multiplexer includes sampling the output of the multiplexer at a rate that exceeds a rate of transition for a plurality of signals input to the multiplexer, the multiplexer includes generating an alarm in response to detection of the predefined state of the trigger signal, and/or the multiplexer includes activating at least one sensor to produce the at least one data signal. Without limitation, example systems include: monitoring a gearbox of an industrial vehicle by directing a trigger signal representing a condition of the gearbox to an output of the analog switch until such time as the output of the analog switch indicates that a second input representing a condition of the gearbox related to the trigger signal should be directed to the output of the analog switch; monitoring a suspension system of an industrial vehicle by directing a trigger signal representing a condition of the suspension to an output of the analog switch until such time as the output of the analog switch indicates that a second input representing a condition of the suspension related to the trigger signal should be directed to the output of the analog switch; and/or monitoring a power generation turbine by directing a trigger signal representing a condition of the power generation turbine to an output of the analog switch until such time as the output of the analog switch indicates that a second input representing a condition of the power generation turbine related to the trigger signal should be directed to the output of the analog switch.

In embodiments, a system for data collection in an industrial environment may include a data collection system that monitors at least one signal for a set of collection band parameters and upon detection of a parameter from the set of collection band parameters in the signal, configures collection of data from a set of sensors based on the detected parameter. The set of selected sensors, the signal, and the set of collection band parameters may be part of a smart bands data collection template that may be used by the system when collecting data in an industrial environment. A motivation for preparing a smart-bands data collection template may include monitoring a set of conditions of an industrial machine to facilitate improved operation, reduce down time, preventive maintenance, failure prevention, and the like. Based on analysis of data about the industrial machine, such as those conditions that may be detected by the set of sensors, an action may be taken, such as notifying a user of a change in the condition, adjusting operating parameters, scheduling preventive maintenance, triggering data collection from additional sets of sensors, and the like. An example of data that may indicate a need for some action may include changes that may be detectable through trends present in the data from the set of sensors. Another example is trends of analysis values derived from the set of sensors.

In embodiments, the set of collection band parameters may include values received from a sensor that is configured to sense a condition of the industrial machine (e.g., bearing vibration). However, a set of collection band parameters may instead be a trend of data received from the sensor (e.g., a trend of bearing vibration across a plurality of vibration measurements by a bearing vibration sensor). In embodiments, a set of collection band parameters may be a composite of data and/or trends of data from a plurality of sensors (e.g., a trend of data from on-axis and off-axis vibration sensors). In embodiments, when a data value derived from one or more sensors as described herein is sufficiently close to a value of data in the set of collection band parameters, the data collection activity from the set of sensors may be triggered. Alternatively, a data collection activity from the set of sensors may be triggered when a data value derived from the one or more sensors (e.g., trends and the like) falls outside of a set of collection band parameters. In an example, a set of data collection band parameters for a motor may be a range of rotational speeds from 95% to 105% of a select operational rotational speed. So long as a trend of rotational speed of the motor stays within this range, a data collection activity may be deferred. However, when the trend reaches or exceeds this range, then a data collection activity, such as one defined by a smart bands data collection template may be triggered.

In embodiments, triggering a data collection activity, such as one defined by a smart bands data collection template, may result in a change to a data collection system for an industrial environment that may impact aspects of the system such as data sensing, switching, routing, storage allocation, storage configuration, and the like. This change to the data collection system may occur in near real time to the detection of the condition; however, it may be scheduled to occur in the future. It may also be coordinated with other data collection activities so that active data collection activities, such as a data collection activity for a different smart bands data collection template, can complete prior to the system being reconfigured to meet the smart bands data collection template that is triggered by the sensed condition meeting the smart bands data collection trigger.

In embodiments, processing of data from sensors may be cumulative over time, over a set of sensors, across machines in an industrial environment, and the like. While a sensed value of a condition may be sufficient to trigger a smart bands data collection template activity, data may need to be collected and processed over time from a plurality of sensors to generate a data value that may be compared to a set of data collection band parameters for conditionally triggering the data collection activity. Using data from multiple sensors and/or processing data, such as to generate a trend of data values and the like may facilitate preventing inconsequential instances of a sensed data value being outside of an acceptable range from causing unwarranted smart bands data collection activity. In an example, if a vibration from a bearing is detected outside of an acceptable range infrequently, then trending for this value over time may be useful to detect if the frequency is increasing, decreasing, or staying substantially constant or within a range of values. If the frequency of such a value is found to be increasing, then such a trend is indicative of changes occurring in operation of the industrial machine as experienced by the bearing. An acceptable range of values of this trended vibration value may be established as a set of data collection band parameters against which vibration data for the bearing will be monitored. When the trended vibration value is outside of this range of acceptable values, a smart bands data collection activity may be activated.

In embodiments, a system for data collection in an industrial environment that supports smart band data collection templates may be configured with data processing capability at a point of sensing of one or more conditions that may trigger a smart bands data collection template data collection activity, such as: by use of an intelligent sensor that may include data processing capabilities; by use of a programmable logic component that interfaces with a sensor and processes data from the sensor; by use of a computer processor, such as a microprocessor and the like disposed proximal to the sensor; and the like. In embodiments, processing of data collected from one or more sensors for detecting a smart bands template data collection activity may be performed by remote processors, servers, and the like that may have access to data from a plurality of sensors, sensor modules, industrial machines, industrial environments, and the like.

In embodiments, a system for data collection in an industrial environment may include a data collection system that monitors an industrial environment for a set of parameters, and upon detection of at least one parameter, configures the collection of data from a set of sensors and causes a data storage controller to adapt a configuration of data storage facilities to support collection of data from the set of sensors based on the detected parameter. The methods and systems described herein for conditionally changing a configuration of a data collection system in an industrial environment to implement a smart bands data collection template may further include changes to data storage architectures. As an example, a data storage facility may be disposed on a data collection module that may include one or more sensors for monitoring conditions in an industrial environment. This local data storage facility may typically be configured for rapid movement of sensed data from the module to a next level sensing or processing module or server. When a smart bands data collection condition is detected, sensor data from a plurality of sensors may need to be captured concurrently. To accommodate this concurrent collection, the local memory may be reconfigured to capture data from each of the plurality of sensors in a coordinated manner, such as repeatedly sampling each of the sensors synchronously, or with a known offset, and the like, to build up a set of sensed data that may be much larger than would typically be captured and moved through the local memory. A storage control facility for controlling the local storage may monitor the movement of sensor data into and out of the local data storage, thereby ensuring safe movement of data from the plurality of sensors to the local data storage and on to a destination, such as a server, networked storage facility, and the like. The local data storage facility may be configured so that data from the set of sensors associated with a smart bands data collection template are securely stored and readily accessible as a set of smart band data to facilitate processing the smart band-specific data. As an example, local storage may comprise non-volatile memory (NVM). To prepare for data collection in response to a smart band data collection template being triggered, portions of the NVM may be erased to prepare the NVM to receive data as indicated in the template.

In embodiments, multiple sensors may be arranged into a set of sensors for condition-specific monitoring. Each set, which may be a logical set of sensors, may be selected to provide information about elements in an industrial environment that may provide insight into potential problems, root causes of problems, and the like. Each set may be associated with a condition that may be monitored for compliance with an acceptable range of values. The set of sensors may be based on a machine architecture, hierarchy of components, or a hierarchy of data that contributes to a finding about a machine that may usefully be applied to maintaining or improving performance in the industrial environment. Smart band sensor sets may be configured based on expert system analysis of complex conditions, such as machine failures and the like. Smart band sensor sets may be arranged to facilitate knowledge gathering independent of a particular failure mode or history. Smart band sensor sets may be arranged to test a suggested smart band data collection template prior to implementing it as part of an industrial machine operations program. Gathering and processing data from sets of sensors may facilitate determining which sensors contribute meaningful data to the set, and those sensors that do not contribute can be removed from the set. Smart band sensor sets may be adjusted based on external data, such as industry studies that indicate the types of sensor data that is most helpful to reduce failures in an industrial environment.

In embodiments, a system for data collection in an industrial environment may include a data collection system that monitors at least one signal for compliance to a set of collection band conditions and upon detection of a lack of compliance, configures the collection of data from a predetermined set of sensors associated with the monitored signal. Upon detection of a lack of compliance, a collection band template associated with the monitored signal may be accessed, and resources identified in the template may be configured to perform the data collection. In embodiments, the template may identify sensors to activate, data from the sensors to collect, duration of collection or quantity of data to be collected, destination (e.g., memory structure) to store the collected data, and the like. In embodiments, a smart band method for data collection in an industrial environment may include periodic collection of data from one or more sensors configured to sense a condition of an industrial machine in the environment. The collected data may be checked against a set of criteria that define an acceptable range of the condition. Upon validation that the collected data is either approaching one end of the acceptable limit or is beyond the acceptable range of the condition, data collection may commence from a smart-band group of sensors associated with the sensed condition based on a smart-band collection protocol configured as a data collection template. In embodiments, an acceptable range of the condition is based on a history of applied analytics of the condition. In embodiments, upon validation of the acceptable range being exceeded, data storage resources of a module in which the sensed condition is detected may be configured to facilitate capturing data from the smart band group of sensors.

In embodiments, monitoring a condition to trigger a smart band data collection template data collection action may be: in response to: a regulation, such as a safety regulation; in response to an upcoming activity, such as a portion of the industrial environment being shut down for preventive maintenance; in response to sensor data missing from routine data collection activities; and the like. In embodiments, in response to a faulty sensor or sensor data missing from a smart band template data collection activity, one or more alternate sensors may be temporarily included in the set of sensors so as to provide data that may effectively substitute for the missing data in data processing algorithms.

In embodiments, smart band data collection templates may be configured for detecting and gathering data for smart band analysis covering vibration spectra, such as vibration envelope and current signature for spectral regions or peaks that may be combinations of absolute frequency or factors of machine related parameters, vibration time waveforms for time-domain derived calculations including, without limitation: RMS overall, peak overall, true peak, crest factor, and the like; vibration vectors, spectral energy humps in various regions (e.g., low-frequency region, high frequency region, low orders, and the like); pressure-volume analysis and the like.

In embodiments, a system for data collection that applies smart band data collection templates may be applied to an industrial environment, such as ball screw actuators in an automated production environment. Smart band analysis may be applied to ball screw actuators in industrial environments such as precision manufacturing or positioning applications (e.g., semiconductor photolithography machines, and the like). As a typical primary objective of using a ball screw is for precise positioning, detection of variation in the positioning mechanism can help avoid costly defective production runs. Smart bands triggering and data collection may help in such applications by detecting, through smart band analysis, potential variations in the positioning mechanism such as in the ball screw mechanism, a worm drive, a linear motor, and the like. In an example, data related to a ball screw positioning system may be collected with a system for data collection in an industrial environment as described herein. A plurality of sensors may be configured to collect data such as screw torque, screw direction, screw speed, screw step, screw home detection, and the like. Some portion of this data may be processed by a smart bands data analysis facility to determine if variances, such as trends in screw speed as a function of torque, approach or exceed an acceptable threshold. Upon such a determination, a data collection template for the ball screw production system may be activated to configure the data sensing, routing, and collection resources of the data collection system to perform data collection to facilitate further analysis. The smart band data collection template facilitates rapid collection of data from other sensors than screw speed and torque, such as position, direction, acceleration, and the like by routing data from corresponding sensors over one or more signal paths to a data collector. The duration and order of collection of the data from these sources may be specified in the smart bands data collection template so that data required for further analysis is effectively captured.

In embodiments, a system for data collection that applies smart band data collection templates to configure and utilize data collection and routing infrastructure may be applied to ventilation systems in mining environments. Ventilation provides a crucial role in mining safety. Early detection of potential problems with ventilation equipment can be aided by applying a smart bands approach to data collection in such an environment. Sensors may be disposed for collecting information about ventilation operation, quality, and performance throughout a mining operation. At each ventilation device, ventilation-related elements, such as fans, motors, belts, filters, temperature gauges, voltage, current, air quality, poison detection, and the like may be configured with a corresponding sensor. While variation in any one element (e.g., air volume per minute, and the like) may not be indicative of a problem, smart band analysis may be applied to detect trends over time that may be suggestive of potential problems with ventilation equipment. To perform smart bands analysis, data from a plurality of sensors may be required to form a basis for analysis. By implementing data collection systems for ventilation stations, data from a ventilation system may be captured. In an example, a smart band analysis may be indicated for a ventilation station. In response to this indication, a data collection system may be configured to collect data by routing data from sensors disposed at the ventilation station to a central monitoring facility that may gather and analyze data from several ventilation stations.

In embodiments, a system for data collection that applies smart band data collection templates to configure and utilize data collection and routing infrastructure may be applied to drivetrain data collection and analysis in mining environments. A drivetrain, such as a drivetrain for a mining vehicle, may include a range of elements that could benefit from use of the methods and systems of data collection in an industrial environment as described herein. In particular, smart band-based data collection may be used to collect data from heavy duty mining vehicle drivetrains under certain conditions that may be detectable by smart bands analysis. A smart bands-based data collection template may be used by a drivetrain data collection and routing system to configure sensors, data paths, and data collection resources to perform data collection under certain circumstances, such as those that may indicate an unacceptable trend of drivetrain performance. A data collection system for an industrial drivetrain may include sensing aspects of a non-steering axle, a planetary steering axle, driveshafts, (e.g., main and wing shafts), transmissions, (e.g., standard, torque converters, long drop), and the like. A range of data related to these operational parts may be collected. However, data for support and structural members that support the drivetrain may also need to be collected for thorough smart band analysis. Therefore, collection across this wide range of drivetrain-related components may be triggered based on a smart band analysis determination of a need for this data. In an example, a smart band analysis may indicate potential slippage between a main and wing driveshaft that may represented by an increasing trend in response delay time of the wing drive shaft to main drive shaft operation. In response to this increasing trend, data collection modules disposed throughout the mining vehicle's drive train may be configured to route data from local sensors to be collected and analyzed by data collectors. Mining vehicle drivetrain smart based data collection may include a range of templates based on which type of trend is detected. If a trend related to a steering axle is detected, a data collection template to be implemented may be different in sensor content, duration, and the like than for a trend related to power demand for a normalized payload. Each template could configure data sensing, routing, and collection resources throughout the vehicle drive train accordingly.

Figure 47:
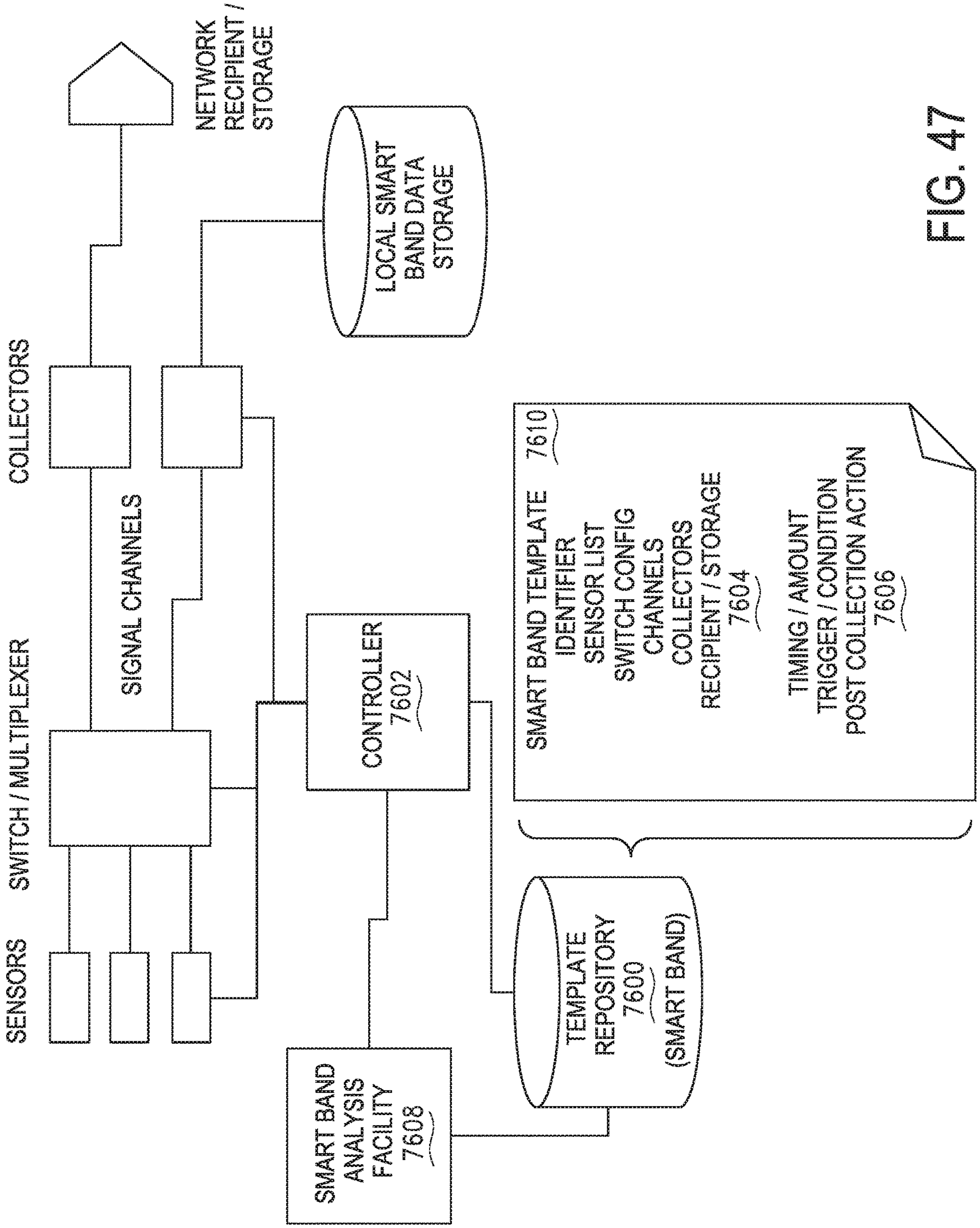

Referring to FIG. 47, a system for data collection in an industrial environment that facilitates data collection for smart band analysis is depicted. A system for data collection in an industrial environment may include a smart band analysis data collection template repository 7600 in which smart band templates 7610 for data collection system configuration and collection of data may be stored and accessed by a data collection controller 7602. The templates 7610 may include data collection system configuration 7604 and operation information 7606 that may identify sensors, collectors, signal paths, and information for initiation and coordination of collection, and the like. A controller 7602 may receive an indication, such as a command from a smart band analysis facility 7608 to select and implement a specific smart band template 7610. The controller 7602 may access the template 7610 and configure the data collection system resources based on the information in that template. In embodiments, the template may identify: specific sensors; a multiplexer/switch configuration, data collection trigger/initiation signals and/or conditions, time duration and/or amount of data for collection; destination of collected data; intermediate processing, if any; and any other useful information, (e.g., instance identifier, and the like). The controller 7602 may configure and operate the data collection system to perform the collection for the smart band template and optionally return the system configuration to a previous configuration.

An example system for data collection in an industrial environment includes a data collection system that monitors at least one signal for a set of collection band parameters and, upon detection of a parameter from the set of collection band parameters, configures portions of the system and performs collection of data from a set of sensors based on the detected parameter. In certain further embodiments, the signal includes an output of a sensor that senses a condition in the industrial environment, where the set of collection band parameters comprises values derivable from the signal that are beyond an acceptable range of values derivable from the signal; where the at least one signal includes an output of a sensor that senses a condition in the industrial environment; wherein configuring portions of the system includes configuring a storage facility to accept data collected from the set of sensors; where configuring portions of the system includes configuring a data routing portion includes at least one of: an analog crosspoint switch, a hierarchical multiplexer, an analog-to-digital converter, an intelligent sensor, and/or a programmable logic component; wherein detection of a parameter from the set of collection band parameters comprises detecting a trend value for the signal being beyond an acceptable range of trend values; and/or where configuring portions of the system includes implementing a smart band data collection template associated with the detected parameter. In certain embodiments, a data collection system monitors a signal for data values within a set of acceptable data values that represent acceptable collection band conditions for the signal and, upon detection of a data value for the at least one signal outside of the set of acceptable data values, triggers a data collection activity that causes collecting data from a predetermined set of sensors associated with the monitored signal. In certain further embodiment, a data collection system includes the signal including an output of a sensor that senses a condition in the industrial environment; where the set of acceptable data value includes values derivable from the signal that are within an acceptable range of values derivable from the signal; configuring a storage facility of the system to facilitate collecting data from the predetermined set of sensors in response to the detection of a data value outside of the set of acceptable data values; configuring a data routing portion of the system including an analog crosspoint switch, a hierarchical multiplexer, an analog-to-digital converter, an intelligent sensor, and/or a programmable logic component in response to detecting a data value outside of the set of acceptable data values; where detection of a data value for the signal outside of the set of acceptable data values includes detecting a trend value for the signal being beyond an acceptable range of trend values; and/or where the data collection activity is defined by a smart band data collection template associated with the detected parameter.

An example method for data collection in an industrial environment comprising includes an operation to collect data from sensor(s) configured to sense a condition of an industrial machine in the environment; an operation to check the collected data against a set of criteria that define an acceptable range of the condition; and in response to the collected data violating the acceptable range of the condition, an operation to collect data from a smart-band group of sensors associated with the sensed condition based on a smart-band collection protocol configured as a smart band data collection template. In certain further embodiments, a method includes where violating the acceptable range of the condition includes a trend of the data from the sensor(s) approaching a maximum value of the acceptable range; where the smart-band group of sensors is defined by the smart band data collection template; where the smart band data collection template includes a list of sensors to activate, data from the sensors to collect, duration of collection of data from the sensors, and/or a destination location for storing the collected data; where collecting data from a smart-band group of sensors includes configuring at least one data routing resource of the industrial environment that facilitates routing data from the smart band group of sensors to a plurality of data collectors; and/or where the set of criteria includes a range of trend values derived by processing the data from sensor(s).

Without limitation, an example system monitors a ball screw actuator in an automated production environment, and monitors at least one signal from the ball screw actuator for a set of collection band parameters and, upon detection of a parameter from the set of collection band parameters, configures portions of the system and performs collection of data from a set of sensors disposed to monitor conditions of the ball screw actuator based on the detected parameter; another example system monitors a ventilation system in a mining environment, and monitors at least one signal from the ventilation system for a set of collection band parameters and, upon detection of a parameter from the set of collection band parameters, configures portions of the system and performs collection of data from a set of sensors disposed to monitor conditions of the ventilation system based on the detected parameter; an example system monitors a drivetrain of a mining vehicle, and monitors at least one signal from the drive train for a set of collection band parameters and, upon detection of a parameter from the set of collection band parameters, configures portions of the system and performs collection of data from a set of sensors disposed to monitor conditions of the drivetrain based on the detected parameter.

In embodiments, a system for data collection in an industrial environment may automatically configure local and remote data collection resources and may perform data collection from a plurality of system sensors that are identified as part of a group of sensors that produce data that is required to perform operational deflection shape rendering. In embodiments, the system sensors are distributed throughout structural portions of an industrial machine in the industrial environment. In embodiments, the system sensors sense a range of system conditions including vibration, rotation, balance, friction, and the like. In embodiments, automatically configuring is in response to a condition in the environment being detected outside of an acceptable range of condition values. In embodiments, a sensor in the identified group of system sensors senses the condition.

In embodiments, a system for data collection in an industrial environment may configure a data collection plan, such as a template, to collect data from a plurality of system sensors distributed throughout a machine to facilitate automatically producing an operational deflection shape visualization ("ODSV") based on machine structural information and a data set used to produce an ODSV of the machine.

In embodiments, a system for data collection in an industrial environment may configure a data collection template for collecting data in an industrial environment by identifying sensors disposed for sensing conditions of preselected structural members of an industrial machine in the environment based on an ODSV of the industrial machine. In embodiments, the template may include an order and timing of data collection from the identified sensors.

In embodiments, methods and systems for data collection in an industrial environment may include a method of establishing an acceptable range of sensor values for a plurality of industrial machine condition sensors by validating an operational deflection shape visualization of structural elements of the machine as exhibiting deflection within an acceptable range, wherein data from the plurality of sensors used in the validated ODSV define the acceptable range of sensor values.

In embodiments, a system for data collection in an industrial environment may include a plurality of data sources, such as sensors, that may be grouped for coordinated data collection to provide data required to produce an ODSV. Information regarding the sensors to group, data collection coordination requirements, and the like may be retrieved from an ODSV data collection template. Coordinated data collection may include concurrent data collection. To facilitate concurrent data collection from a portion of the group of sensors, sensor routing resources of the system for data collection may be configured, such as by configuring a data multiplexer to route data from the portion of the group of sensors to which it connects to data collectors. In embodiments, each such source that connects an input of the multiplexer may be routed within the multiplexer to separate outputs so that data from all of the connected sources may be routed on to data collection elements of the industrial environment. In embodiments, the multiplexer may include data storage capabilities that may facilitate sharing a common output for at least a portion of the inputs. In embodiments, a multiplexer may include data storage capabilities and data bus-enabled outputs so that data for each source may be captured in a memory and transmitted over a data bus, such as a data bus that is common to the outputs of the multiplexer. In embodiments, sensors may be smart sensors that may include data storage capabilities and may send data from the data storage to the multiplexer in a coordinated manner that supports use of a common output of the multiplexer and/or use of a common data bus.

In embodiments, a system for data collection in an industrial environment may comprise templates for configuring the data collection system to collect data from a plurality of sensors to perform ODSV for a plurality of deflection shapes. Individual templates may be configured for visualization of looseness, soft joints, bending, twisting, and the like. Individual deflection shape data collection templates may be configured for different portions of a machine in an industrial environment.

In embodiments, a system for data collection in an industrial environment may facilitate operational deflection shape visualization that may include visualization of locations of sensors that contributed data to the visualization. In the visualization, each sensor that contributed data to generate the visualization may be indicated by a visual element. The visual element may facilitate user access to information about the sensor, such as location, type, representative data contributed, path of data from the sensor to a data collector, a deflection shape template identifier, a configuration of a switch or multiplexer through which the data is routed, and the like. The visual element may be determined by associating sensor identification information received from a sensor with information, such as a sensor map, that correlates sensor identification information with physical location in the environment. The information may appear in the visualization in response to the visual element representing the sensor being selected, such as by a user positioning a cursor on the sensor visual element.

In embodiments, ODSV may benefit from data satisfying a phase relationship requirement. A data collection system in the environment may be configured to facilitate collecting data that complies with the phase relationship requirement. Alternatively, the data collection system may be configured to collect data from a plurality of sensors that contains data that satisfies the phase relationship requirements but may also include data that does not. A post processing operation that may access phase detection data may select a subset of the collected data.

In embodiments, a system for data collection in an industrial environment may include a multiplexer receiving data from a plurality of sensors and multiplexing the received data for delivery to a data collector. The data collector may process the data to facilitate ODSV. ODSV may require data from several different sensors, and may benefit from using a reference signal, such as data from a sensor, when processing data from the different sensors. The multiplexer may be configured to provide data from the different sensors, such as by switching among its inputs over time so that data from each sensor may be received by the data collector. However, the multiplexer may include a plurality of outputs so that at least a portion of the inputs may be routed to least two of the plurality of outputs. Therefore, in embodiments, a multiple output multiplexer may be configured to facilitate data collection that may be suitable for ODSV by routing a reference signal from one of its inputs (e.g., data from an accelerometer) to one of its outputs and multiplexing data from a plurality of its outputs onto one or more of its outputs while maintaining the reference signal output routing. A data collector may collect the data from the reference output and use that to align the multiplexed data from the other sensors.

In embodiments, a system for data collection in an industrial environment may facilitate ODSV through coordinated data collection related to conveyors for mining applications. Mining operations may rely on conveyor systems to move material, supplies, and equipment into and out of a mine. Mining operations may typically operate around the clock; therefore, conveyor downtime may have a substantive impact on productivity and costs. Advanced analysis of conveyor and related systems that focuses on secondary affects that may be challenging to detect merely through point observation may be more readily detected via ODSV. Capturing operational data related to vibration, stresses, and the like can facilitate ODSV. However, coordination of data capture provides more reliable results. Therefore, a data collection system that may have sensors dispersed throughout a conveyor system can be configured to facilitate such coordinated data collection. In an example, capture of data affecting structural components of a conveyor, such as; landing points and the horizontal members that connect them and support the conveyer between landing points; conveyer segment handoff points; motor mounts; mounts of conveyer rollers and the like may need to be coordinated with data related to conveyor dynamic loading, drive systems, motors, gates, and the like. A system for data collection in an industrial environment, such as a mining environment may include data sensing and collection modules placed throughout the conveyor at locations such as segment handoff points, drive systems, and the like. Each module may be configured by one or more controllers, such as programmable logic controllers, that may be connected through a physical or logical (e.g., wireless) communication bus that aids in performing coordinated data collection. To facilitate coordination, a reference signal, such as a trigger and the like, may be communicated among the modules for use when collecting data. In embodiments, data collection and storage may be performed at each module so as to reduce the need for real-time transfer of sensed data throughout the mining environment. Transfer of data from the modules to an ODSV processing facility may be performed after collection, or as communication bandwidth between the modules and the processing facility allows. ODSV can provide insight into conditions in the conveyer, such as deflection of structural members that may, over time cause premature failure. Coordinated data collection with a data collection system for use in an industrial environment, such as mining, can enable ODSV that may reduce operating costs by reducing downtime due to unexpected component failure.

In embodiments, a system for data collection in an industrial environment may facilitate operational deflection shape visualization through coordinated data collection related to fans for mining applications. Fans provide a crucial function in mining operations of moving air throughout a mine to provide ventilation, equipment cooling, combustion exhaust evacuation, and the like. Ensuring reliable and often continuous operation of fans may be critical for miner safety and cost-effective operations. Dozens or hundreds of fans may be used in large mining operations. Fans, such as fans for ventilation management may include circuit, booster, and auxiliary types. High capacity auxiliary fans may operate at high speeds, over 2500 RPMs. Performing ODSV may reveal important reliability information about fans deployed in a mining environment. Collecting the range of data needed for ODSV of mining fans may be performed by a system for collecting data in industrial environments as described herein. In embodiments, sensing elements, such as intelligent sensing and data collection modules may be deployed with fans and/or fan subsystems. These modules may exchange collection control information (e.g., over a dedicated control bus and the like) so that data collection may be coordinated in time and phase to facilitate ODSV.

A large auxiliary fan for use in mining may be constructed for transportability into and through the mine and therefore may include a fan body, intake and outlet ports, dilution valves, protection cage, electrical enclosure, wheels, access panels, and other structural and/or operational elements. The ODSV of such an auxiliary fan may require collection of data from many different elements. A system for data collection may be configured to sense and collect data that may be combined with structural engineering data to facilitate ODSV for this type of industrial fan.

Figure 48:
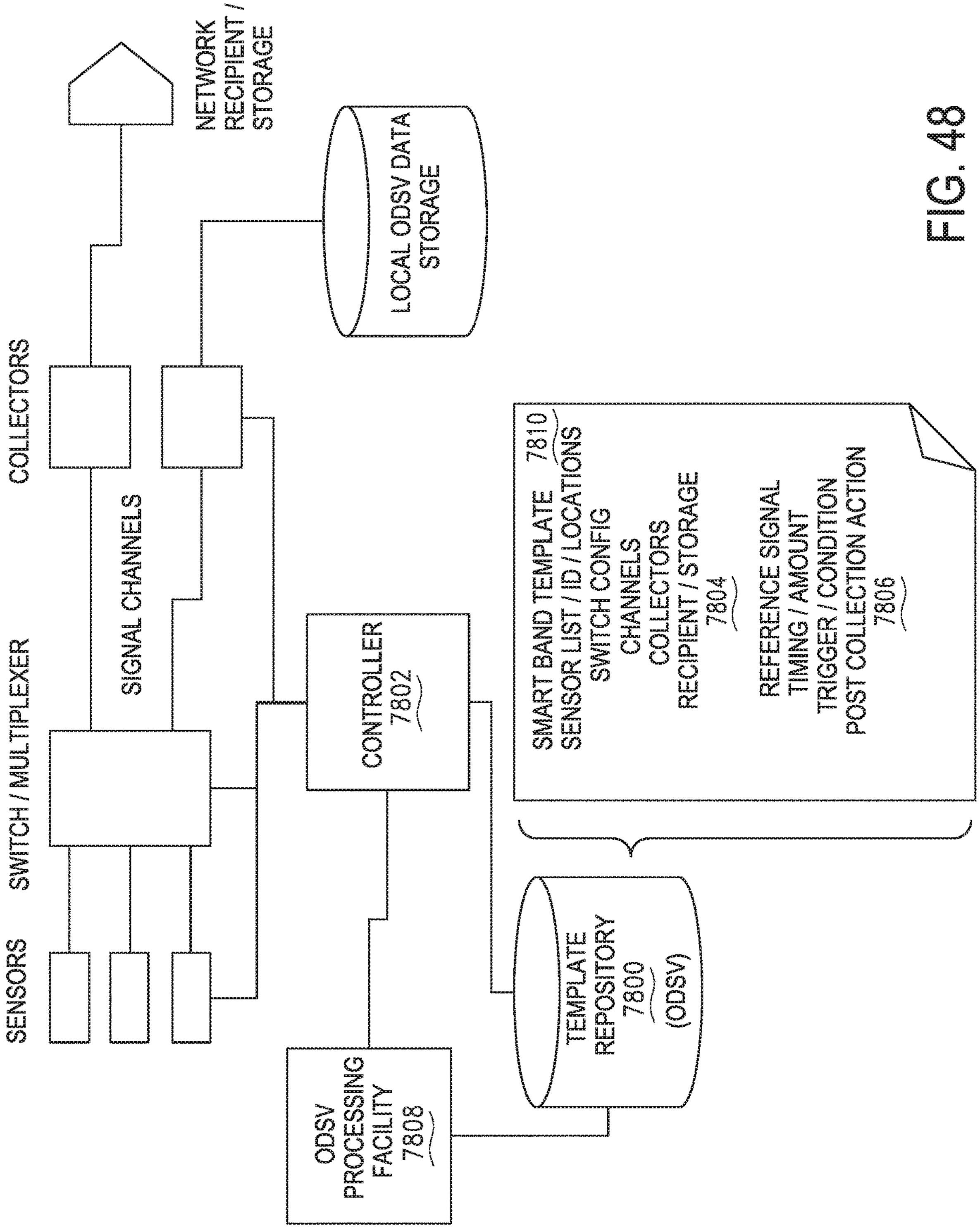

Referring to FIG. 48, an embodiment of a system for data collection in an industrial environment that performs coordinated data collection suitable for ODSV is depicted. A system for data collection in an industrial environment may include a ODSV data collection template repository 7800 in which ODSV templates 7810 for data collection system configuration and collection of data may be stored and accessed by a system for data collection controller 7802. The templates 7810 may include data collection system configuration 7804 and operation information 7806 that may identify sensors, collectors, signal paths, reference signal information, information for initiation and coordination of collection, and the like. A controller 7802 may receive an indication, such as a command from a ODSV analysis facility 7808 to select and implement a specific ODSV template 7810. The controller 7802 may access the template 7810 and configure the data collection system resources based on the information in that template. In embodiments, the template may identify specific sensors, multiplexer/switch configuration, reference signals for coordinating data collection, data collection trigger/initiation signals and/or conditions, time duration, and/or amount of data for collection, destination of collected data, intermediate processing, if any, and any other useful information (e.g., instance identifier, and the like). The controller 7802 may configure and operate the data collection system to perform the collection for the ODSV template and optionally return the system configuration to a previous configuration.

An example method of data collection for performing ODSV in an industrial environment includes automatically configuring local and remote data collection resources and collecting data from a number of sensors using the configured resources, where the number of sensors include a group of sensors that produce data that is required to perform the ODSV. In certain further embodiments, an example method further includes where the sensors are distributed throughout structural portions of an industrial machine in the industrial environment; where the sensors sense a range of system conditions including vibration, rotation, balance, and/or friction; where the automatically configuring is in response to a condition in the environment being detected outside of an acceptable range of condition values; where the condition is sensed by a sensor in a group of system sensors; where automatically configuring includes configuring a signal switching resource to concurrently connect a portion of the group of sensors to data collection resources; and/or where the signal switching resource is configured to maintain a connection between a reference sensor and the data collection resources throughout a period of collecting data from the sensors to perform ODSV.

An example method of data collection in an industrial environment includes configuring a data collection plan to collect data from a number of system sensors distributed throughout a machine in the industrial environment, the plan based on machine structural information and an indication of data needed to produce an ODS V of the machine; configuring data sensing, routing and collection resources in the environment based on the data collection plan; and collecting data based on the data collection plan. In certain further embodiments, an example method further includes: producing the ODSV; where the configuring data sensing, routing, and collection resources is in response to a condition in the environment being detected outside of an acceptable range of condition values; where the condition is sensed by a sensor identified in the data collection plan; where configuring resources includes configuring a signal switching resource to concurrently connect the plurality of system sensors to data collection resources; and/or where the signal switching resource is configured to maintain a connection between a reference sensor and the data collection resources throughout a period of collecting data from the sensors to perform ODSV.

An example system for data collection in an industrial environment includes: a number of sensors disposed throughout the environment; multiplexer that connects signals from the plurality of sensors to data collection resources; and a processor for processing data collected from the number of sensors in response to the data collection template, where the processing results in an ODSV of a portion of a machine disposed in the environment. In certain further embodiments, an example system includes: where the ODSV collection template further identifies a condition in the environment on which performing data collection from the identified sensors is dependent; where the condition is sensed by a sensor identified in the ODSV data collection template; where the data collection template specified inputs of the multiplexer to concurrently connect to data collection resources; where the multiplexer is configured to maintain a connection between a reference sensor and the data collection resources throughout a period of collecting data from the sensors to perform ODSV; where the ODSV data collection template specifies data collection requirements for performing ODSV for looseness, soft joints, bending, and/or twisting of a portion of a machine in the industrial environment; and/or where the ODSV collection template specifies an order and timing of data collection from a plurality of identified sensors.

An example method of monitoring a mining conveyer for performing ODSV of the conveyer includes automatically configuring local and remote data collection resources and collecting data from a number of sensors disposed to sense the mining conveyor using the configured resources, wherein the plurality of sensors comprise a group of sensors that produce data that is required to perform the operational deflection shape visualization of a portion of the conveyor. An example method of monitoring a mining fan for performing ODSV of the fan includes automatically configuring local and remote data collection resources collecting data from a number of sensors disposed to sense the fan using the configured resources, and where the number of sensors include a group of sensors that produce data that is sufficient or required to perform ODSV of a portion of the fan.

In embodiments, a system for data collection in an industrial environment may include a hierarchical multiplexer that facilitates successive multiplexing of input data channels according to a configurable hierarchy, such as a user configurable hierarchy. The system for data collection in an industrial environment may include the hierarchical multiplexer that facilitates successive multiplexing of a plurality of input data channels according to a configurable hierarchy. The hierarchy may be automatically configured by a controller based on an operational parameter in the industrial environment, such as a parameter of a machine in the industrial environment.

In embodiments, a system for data collection in an industrial environment may include a plurality of sensors that may output data at different rates. The system may also include a multiplexer module that receives sensor outputs from a first portion of the plurality of sensors with similar output rates into separate inputs of a first hierarchical multiplexer of the multiplexer module. The first hierarchical multiplexer of the multiplexer module may provide at least one multiplexed output of a portion of its inputs to a second hierarchical multiplexer that receives sensor outputs from a second portion of the plurality of sensors with similar output rates and that provides at least one multiplexed output of a portion of its inputs. In embodiments, the output rates of the first set of sensors may be slower than the output rates of the second set of sensors. In embodiments, data collection rate requirements of the first set of sensors may be lower than the data collection rate requirements of the second set of sensors. In embodiments, the first hierarchical multiplexer output is a time-multiplexed combination of a portion of its inputs. In embodiments, the second hierarchical multiplexer receives sensor signals with output rates that are similar to a rate of output of the first multiplexer, wherein the first multiplexer produces time-based multiplexing of the portion of its plurality of inputs.

In embodiments, a system for data collection in an industrial environment may include a hierarchical multiplexer that is dynamically configured based on a data acquisition template. The hierarchical multiplexer may include a plurality of inputs and a plurality of outputs, wherein any input can be directed to any output in response to sensor output collection requirements of the template, and wherein a subset of the inputs can be multiplexed at a first switching rate and output to at least one of the plurality of outputs.

In embodiments, a system for data collection in an industrial environment may include a plurality of sensors for sensing conditions of a machine in the environment, a hierarchical multiplexer, a plurality of analog-to-digital converters (ADCs), a processor, local storage, and an external interface. The system may use the processor to access a data acquisition template of parameters for data collection from a portion of the plurality of sensors, configure the hierarchical multiplexer, the ADCs and the local storage to facilitate data collection based on the defined parameters, and execute the data collection with the configured elements including storing a set of data collected from a portion of the plurality of sensors into the local storage. In embodiments, the ADCs convert analog sensor data into a digital form that is compatible with the hierarchical multiplexer. In embodiments, the processor monitors at least one signal generated by the sensors for a trigger condition and, upon detection of the trigger condition, responds by at least one of communicating an alert over the external interface and performing data acquisition according to a template that corresponds to the trigger condition.

In embodiments, a system for data collection in an industrial environment may include a hierarchical multiplexer that may be configurable based on a data collection template of the environment. The multiplexer may support receiving a large number of data signals (e.g., from sensors in the environment) simultaneously. In embodiments, all sensors for a portion of an industrial machine in the environment may be individually connected to inputs of a first stage of the multiplexer. The first stage of the multiplexer may provide a plurality of outputs that may feed into a second multiplexer stage. The second stage multiplexer may provide multiple outputs that feed into a third stage, and so on. Data collection templates for the environment may be configured for certain data collection sets, such as a set to determine temperature throughout a machine or a set to determine vibration throughout a machine, and the like. Each template may identify a plurality of sensors in the environment from which data is to be collected, such as during a data collection event. When a template is presented to the hierarchical multiplexer, mapping of inputs to outputs for each multiplexing stage may be configured so that the required data is available at output(s) of a final multiplexing hierarchical stage for data collection. In an example, a data collection template to collect a set of data to determine temperature throughout a machine in the environment may identify many temperature sensors. The first stage multiplexer may respond to the template by selecting all of the available inputs that connect to temperature sensors. The data from these sensors maybe multiplexed onto multiple inputs of a second stage sensor that may perform time-based multiplexing to produce a time-multiplexed output(s) of temperature data from a portion of the sensors. These outputs may be gathered by a data collector and de-multiplexed into individual sensor temperature readings.

In embodiments, time-sensitive signals, such as triggers and the like, may connect to inputs that directly connect to a final multiplexer stage, thereby reducing any potential delay caused by routing through multiple multiplexing stages.

In embodiments, a hierarchical multiplexer in a system for data collection in an industrial environment may comprise an array of relays, a programmable logic component, such as a CPLD, a field programmable gate array (FPGA), and the like.

In embodiments, a system for data collection in an industrial environment that may include a hierarchical multiplexer for routing sensor outputs onto signal paths may be used with explosive systems in mining applications. Blast initiating and electronic blasting systems may be configured to provide computer assisted blasting systems. Ensuring that blasting occurs safely may involve effective sensing and analysis of a range of conditions. A system for data collection in an industrial environment may be deployed to sense and collect data associated with explosive systems, such as explosive systems used for mining A data collection system can use a hierarchical multiplexer to capture data from explosive system installations automatically by aligning, for example, a deployment of the explosive system including its layout plans, integration, interconnectivity, cascading plan, and the like with the hierarchical multiplexer. An explosive system may be deployed with a form of hierarchy that starts with a primary initiator and follows detonation connections through successive layers of electronic blast control to sequenced detonation. Data collected from each of these layers of blast systems configuration may be associated with stages of a hierarchical multiplexer so that data collected from bulk explosive detonation can be captured in a hierarchy that corresponds to its blast control hierarchy.

In embodiments, a system for data collection in an industrial environment that may include a hierarchical multiplexer for routing sensor outputs onto signal paths may be used with refinery blowers in oil and gas pipeline applications. Refinery blower applications include fired heater combustion air preheat systems and the like. Forced draft blowers may include a range of moving and moveable parts that may benefit from condition sensing and monitoring. Sensing may include detecting conditions of: couplings (e.g., temperature, rotational rate, and the like); motors (vibration, temperature, RPMs, torque, power usage, and the like); louver mechanics (actuators, louvers, and the like); and plenums (flow rate, blockage, back pressure, and the like). A system for data collection in an industrial environment that uses a hierarchical multiplexer for routing signals from sensors and the like to data collectors may be configured to collect data from a refinery blower. In an example, a plurality of sensors may be deployed to sense air flow into, throughout, and out of a forced draft blower used in a refinery application, such as to preheat combustion air. Sensors may be grouped based on a frequency of a signal produced by sensors. Sensors that detect louver position and control may produce data at a lower rate than sensors that detect blower RPMs. Therefore, louver position and control sensor signals can be applied to a lower stage in a multiplexer hierarchy than the blower RPM sensors because data from louvers change less often than data from RPM sensors. A data collection system could switch among a plurality of louver sensors and still capture enough information to properly detect louver position. However, properly detecting blower RPM data may require greater bandwidth of connection between the blower RPM sensor and a data collector. A hierarchical multiplexer may enable capturing blower RPM data at a rate that is required for proper detection (perhaps by outputting the RPM sensor data for long durations of time), while switching among several louver sensor inputs and directing them onto (or through) an output that is different than the blower RPM output. Alternatively, the louver inputs may be time-multiplexed with the blower RPM data onto a single output that can be de-multiplexed by a data collector that is configured to determine when blower RPM data is being output and when louver position data is being output.

In embodiments, a system for data collection in an industrial environment that may include a hierarchical multiplexer for routing sensor outputs onto signal paths may be used with pipeline-related compressors (e.g., reciprocating) in oil and gas pipeline applications. A typical use of a reciprocating compressor for pipeline application is production of compressed air for pipeline testing. A system for data collection in an industrial environment may apply a hierarchical multiplexer while collecting data from a pipeline testing-based reciprocating compressor. Data from sensors deployed along a portion of a pipeline being tested may be input to the lowest stage of the hierarchical multiplexer because these sensors may be periodically sampled prior to and during testing. However, the rate of sampling may be low relative to sensors that detect compressor operation, such as parts of the compressor that operate at higher frequencies, such as the reciprocating linkage, motor, and the like. The sensors that provide data at frequencies that enable reproduction of the detected motion may be input to higher stages in the hierarchical multiplexer. Time multiplexing among the pipeline sensors may provide for coverage of a large number of sensors while capturing events such as seal leakage and the like. However, time multiplexing among reciprocating linkage sensors may require output signal bandwidth that may exceed the bandwidth available for routing data from the multiplexer to a data collector. Therefore, in embodiments, a plurality of pipeline sensors may be time-multiplexed onto a single multiplexer output and a compressor sensor detecting rapidly moving parts, such as the compressor motor, may be routed to separate outputs of the multiplexer.

Figure 49:
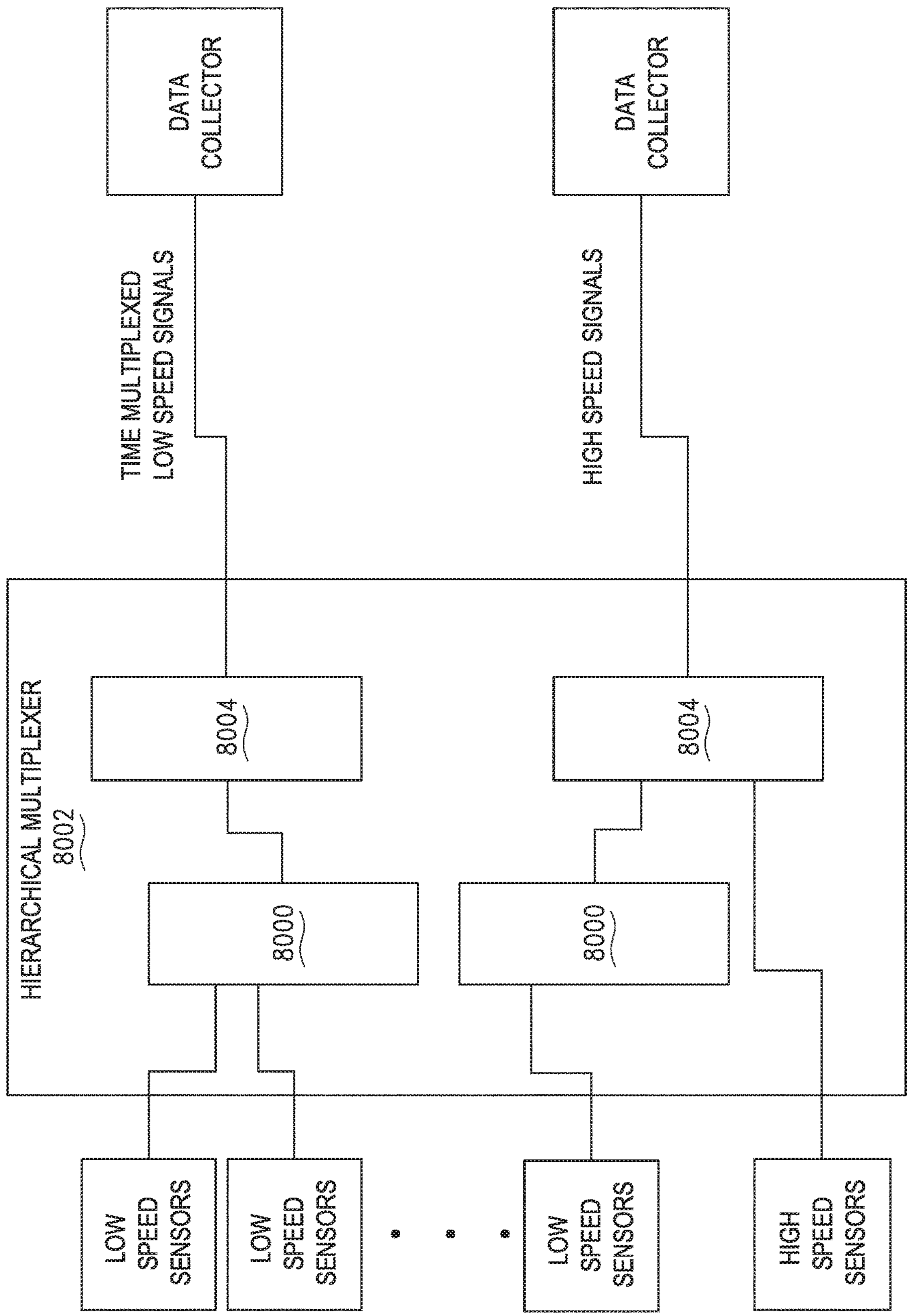

Referring to FIG. 49, a system for data collection in an industrial environment that uses a hierarchical multiplexer for routing sensor signals to data collectors is depicted. Outputs from a plurality of sensors, such as sensors that monitor conditions that change with relatively low frequency (e.g., blower louver position sensors) may be input to a lowest hierarchical stage 8000 of a hierarchical multiplexer 8002 and routed to successively higher stages in the multiplexer, ultimately being output from the multiplexer, perhaps as a time-multiplexed signal comprising time-specific samples of each of the plurality of low frequency sensors. Outputs from a second plurality of sensors, such as sensors that monitor motor operation that may run at more than 1000 RPMs may be input to a higher hierarchical stage 8004 of the hierarchical multiplexer and routed to outputs that support the required bandwidth An example system for data collection in an industrial environment includes a controller for controlling data collection resources in the industrial environment and a hierarchical multiplexer that facilitates successive multiplexing of a number of input data channels according to a configurable hierarchy, wherein the hierarchy is automatically configured by the controller based on an operational parameter of a machine in the industrial environment. In certain further embodiments, an example system includes: where the operational parameter of the machine is identified in a data collection template; where the hierarchy is automatically configured in response to smart band data collection activation further including an analog-to-digital converter disposed between a source of the input data channels and the hierarchical multiplexer; and/or where the operational parameter of the machine comprises a trigger condition of at least one of the data channels. Another example system for data collection in an industrial environment includes a plurality of sensors and a multiplexer module that receives sensor outputs from a first portion of the sensors with similar output rates into separate inputs of a first hierarchical multiplexer that provides at least one multiplexed output of a portion of its inputs to a second hierarchical multiplexer, the second hierarchical multiplexer receiving sensor outputs from a second portion of the sensors and providing at least one multiplexed output of a portion of its inputs. In certain further embodiments, an example system includes: where the second portion of the sensors output data at rates that are higher than the output rates of the first portion of the sensors; where the first portion and the second portion of the sensors output data at different rates; where the first hierarchical multiplexer output is a time-multiplexed combination of a portion of its inputs; where the second multiplexer receives sensor signals with output rates that are similar to a rate of output of the first multiplexer; and/or where the first multiplexer produces time-based multiplexing of the portion of its inputs.

An example system for data collection in an industrial environment includes a number of sensors for sensing conditions of a machine in the environment a hierarchical multiplexer, a number of analog-to-digital converters, a controller, local storage, an external interface, where the system includes using the controller to access a data acquisition template that defines parameters for data collection from a portion of the sensors, to configure the hierarchical multiplexer, the ADCs, and the local storage to facilitate data collection based on the defined parameters, and to execute the data collection with the configured elements including storing a set of data collected from a portion of the sensors into the local storage. In certain further embodiments, an example system includes: where the ADCs convert analog sensor data into a digital form that is compatible with the hierarchical multiplexer; where the processor monitors at least one signal generated by the sensors for a trigger condition and, upon detection of the trigger condition, responds by communicating an alert over the external interface and/or performing data acquisition according to a template that corresponds to the trigger condition; where the hierarchical multiplexer performs successive multiplexing of data received from the sensors according to a configurable hierarchy; where the hierarchy is automatically configured by the controller based on an operational parameter of a machine in the industrial environment; where the operational parameter of the machine is identified in a data collection template; where the hierarchy is automatically configured in response to smart band data collection activation; the system further including an ADC disposed between a source of the input data channels and the hierarchical multiplexer; where the operational parameter of the machine includes a trigger condition of at least one of the data channels; where the hierarchical multiplexer performs successive multiplexing of data received from the plurality of sensors according to a configurable hierarchy; and/or where the hierarchy is automatically configured by a controller based on a detected parameter of an industrial environment. Without limitation, n example system is configured for monitoring a mining explosive system, and includes a controller for controlling data collection resources associated with the explosive system, and a hierarchical multiplexer that facilitates successive multiplexing of a number of input data channels according to a configurable hierarchy, where the hierarchy is automatically configured by the controller based on a configuration of the explosive system. Without limitation, an example system is configured for monitoring a refinery blower in an oil and gas pipeline applications, and includes a controller for controlling data collection resources associated with the refinery blower, and a hierarchical multiplexer that facilitates successive multiplexing of a number of input data channels according to a configurable hierarchy, where the hierarchy is automatically configured by the controller based on a configuration of the refinery blower. Without limitation, an example system is configured for monitoring a reciprocating compressor in an oil and gas pipeline applications comprising, and includes controller for controlling data collection resources associated with the reciprocating compressor, and a hierarchical multiplexer that facilitates successive multiplexing of a number of input data channels according to a configurable hierarchy, where the hierarchy is automatically configured by the controller based on a configuration of the reciprocating compressor.

Figure 50:
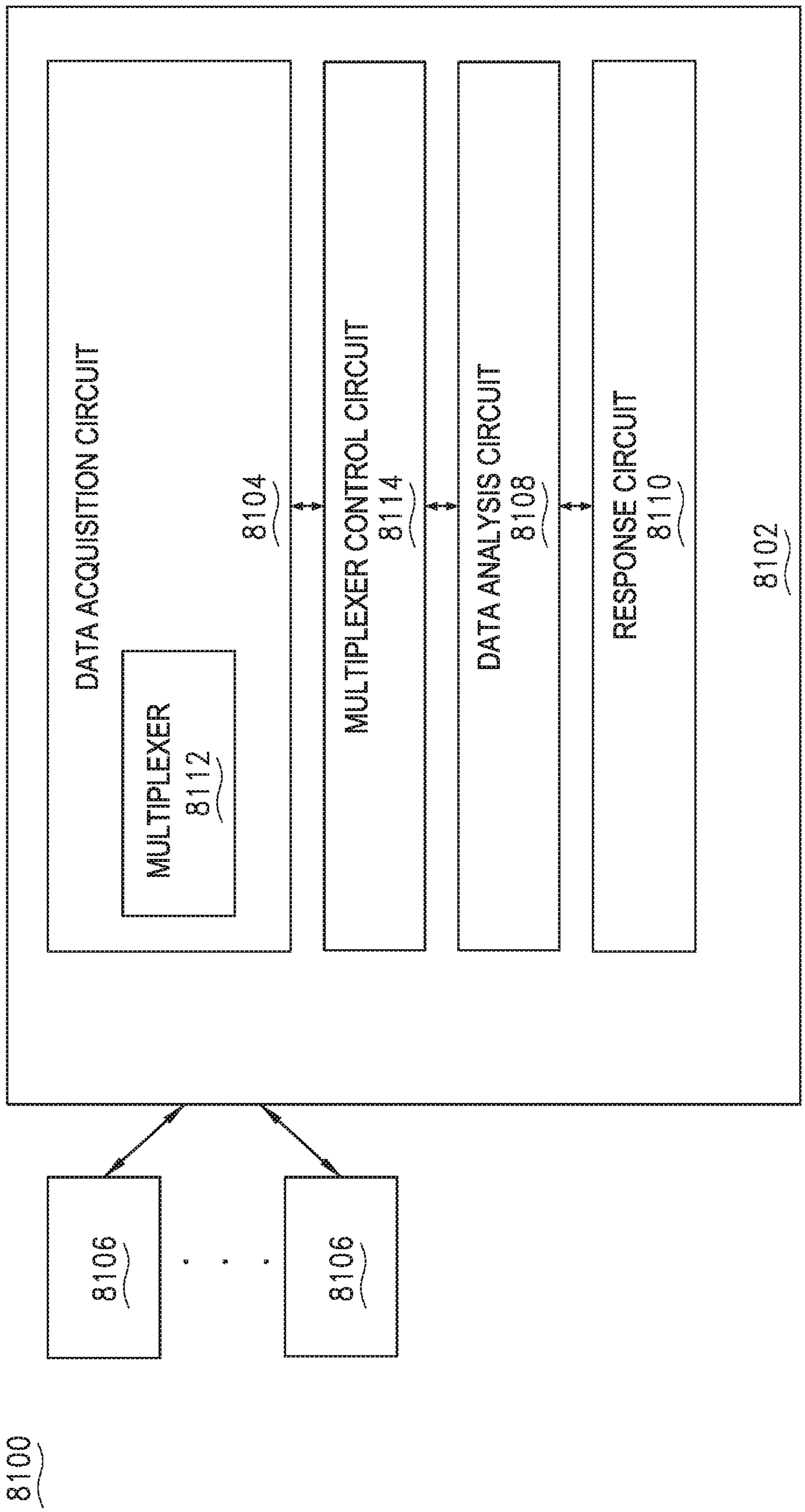
FIG. 50 is a diagrammatic view that depicts embodiments of a data monitoring device in accordance with the present disclosure.

In embodiments, information about the health or other status or state information of or regarding a component or piece of industrial equipment may be obtained by monitoring the condition of various components throughout a process. Monitoring may include monitoring the amplitude of a sensor signal measuring attributes such as temperature, humidity, acceleration, displacement, and the like. An embodiment of a data monitoring device 8100 is shown in FIG. 50 and may include a plurality of sensors 8106 communicatively coupled to a controller 8102. The controller 8102 may include a data acquisition circuit 8104, a data analysis circuit 8108, a MUX control circuit 8114, and a response circuit 8110. The data acquisition circuit 8104 may include a MUX 8112 where the inputs correspond to a subset of the detection values. The MUX control circuit 8114 may be structured to provide adaptive scheduling of the logical control of the MUX and the correspondence of MUX input and detected values based on a subset of the plurality of detection values and/or a command from the response circuit 8110 and/or the output of the data analysis circuit 8104. The data analysis circuit 8108 may comprise one or more of a peak detection circuit, a phase differential circuit, a PLL circuit, a bandpass filter circuit, a frequency transformation circuit, a frequency analysis circuit, a torsional analysis circuit, a bearing analysis circuit, an overload detection circuit, a sensor fault detection circuit, a vibrational resonance circuit for the identification of unfavorable interaction among machines or components, a distortion identification circuit for the identification of unfavorable distortions such as deflections shapes upon operation, overloading of weight, excessive forces, stress and strain-based effects, and the like. The data analysis circuit 8108 may output a component health status as a result of the analysis.

The data analysis circuit 8108 may determine a state, condition, or status of a component, part, sub-system, or the like of a machine, device, system or item of equipment (collectively referred to herein as a component health status) based on a maximum value of a MUX output for a given input or a rate of change of the value of a MUX output for a given input. The data analysis circuit 8108 may determine a component health status based on a time integration of the value of a MUX for a given input. The data analysis circuit 8108 may determine a component health status based on phase differential of MUX output relative to an on-board time or another sensor. The data analysis circuit 8108 may determine a component health status based on a relationship of value, phase, phase differential, and rate of change for MUX outputs corresponding to one or more input detection values. The data analysis circuit 8108 may determine a component health status based on process stage or component specification or component anticipated state.

The multiplexer control circuit 8114 may adapt the scheduling of the logical control of the multiplexer based on a component health status, an anticipated component health status, the type of component, the type of equipment being measured, an anticipated state of the equipment, a process stage (different parameters/sensor values) may be important at different stages in a process. The multiplexer control circuit 8114 may adapt the scheduling of the logical control of the multiplexer based on a sequence selected by a user or a remote monitoring application, or on the basis of a user request for a specific value. The multiplexer control circuit 8114 may adapt the scheduling of the logical control of the multiplexer based on the basis of a storage profile or plan (such as based on type and availability of storage elements and parameters as described elsewhere in this disclosure and in the documents incorporated herein by reference), network conditions or availability (also as described elsewhere in this disclosure and in the documents incorporated herein by reference), or value or cost of component or equipment.

The plurality of sensors 8106 may be wired to ports on the data acquisition circuit 8104. The plurality of sensors 8106 may be wirelessly connected to the data acquisition circuit 8104. The data acquisition circuit 8104 may be able to access detection values corresponding to the output of at least one of the plurality of sensors 8106 where the sensors 8106 may be capturing data on different operational aspects of a piece of equipment or an operating component.

The selection of the plurality of sensors 8106 for a data monitoring device 8100 designed for a specific component or piece of equipment may depend on a variety of considerations such as accessibility for installing new sensors, incorporation of sensors in the initial design, anticipated operational and failure conditions, resolution desired at various positions in a process or plant, reliability of the sensors, and the like. The impact of a failure, time response of a failure (e.g., warning time and/or off-nominal modes occurring before failure), likelihood of failure, and/or sensitivity required, and/or difficulty to detect failure conditions may drive the extent to which a component or piece of equipment is monitored with more sensors, and/or higher capability sensors being dedicated to systems where unexpected or undetected failure would be costly or have severe consequences.

Depending on the type of equipment, the component being measured, the environment in which the equipment is operating, and the like, sensors 8106 may comprise one or more of, without limitation, a vibration sensor, a thermometer, a hygrometer, a voltage sensor and/or a current sensor (for the component and/or other sensors measuring the component), an accelerometer, a velocity detector, a light or electromagnetic sensor (e.g., determining temperature, composition, and/or spectral analysis, and/or object position or movement), an image sensor, a structured light sensor, a laser-based image sensor, a thermal imager, an acoustic wave sensor, a displacement sensor, a turbidity meter, a viscosity meter, an axial load sensor, a radial load sensor, a tri-axial sensor, an accelerometer, a speedometer, a tachometer, a fluid pressure meter, an air flow meter, a horsepower meter, a flow rate meter, a fluid particle detector, an optical (laser) particle counter, an ultrasonic sensor, an acoustical sensor, a heat flux sensor, a galvanic sensor, a magnetometer, a pH sensor, and the like, including, without limitation, any of the sensors described throughout this disclosure and the documents incorporated by reference.

The sensors 8106 may provide a stream of data over time that has a phase component, such as relating to acceleration or vibration, allowing for the evaluation of phase or frequency analysis of different operational aspects of a piece of equipment or an operating component. The sensors 8106 may provide a stream of data that is not conventionally phase-based, such as temperature, humidity, load, and the like. The sensors 8106 may provide a continuous or near continuous stream of data over time, periodic readings, event-driven readings, and/or readings according to a selected interval or schedule.

The sensors 8106 may monitor components such as bearings, sets of bearings, motors, driveshafts, pistons, pumps, conveyors, vibrating conveyors, compressors, drills, and the like in vehicles, oil and gas equipment in the field, in assembly line components, and the like.

Figure 51:
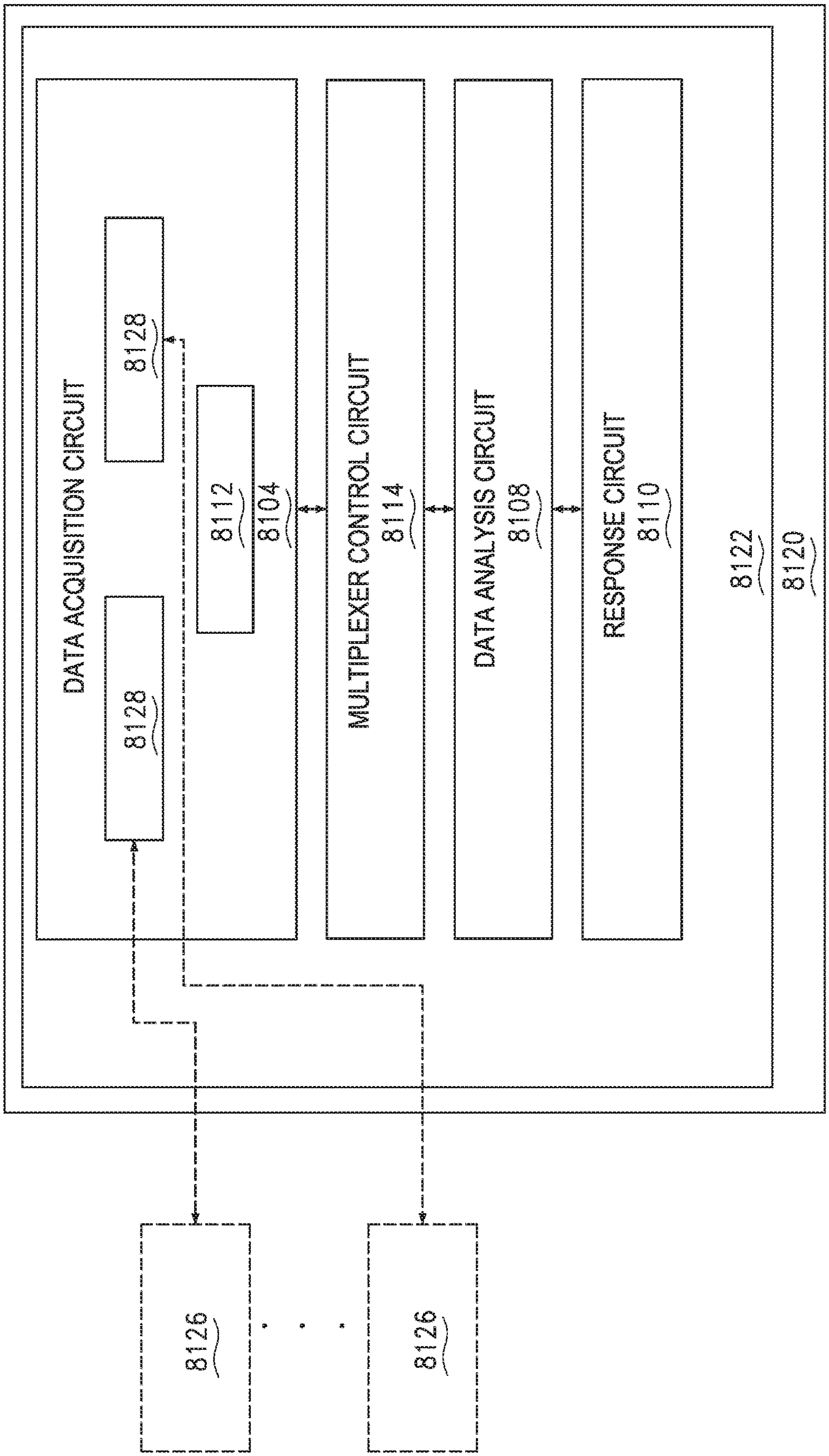
FIG. 51 and FIG. 52 are diagrammatic views that depict embodiments of a data monitoring device in accordance with the present disclosure.
Figure 52:
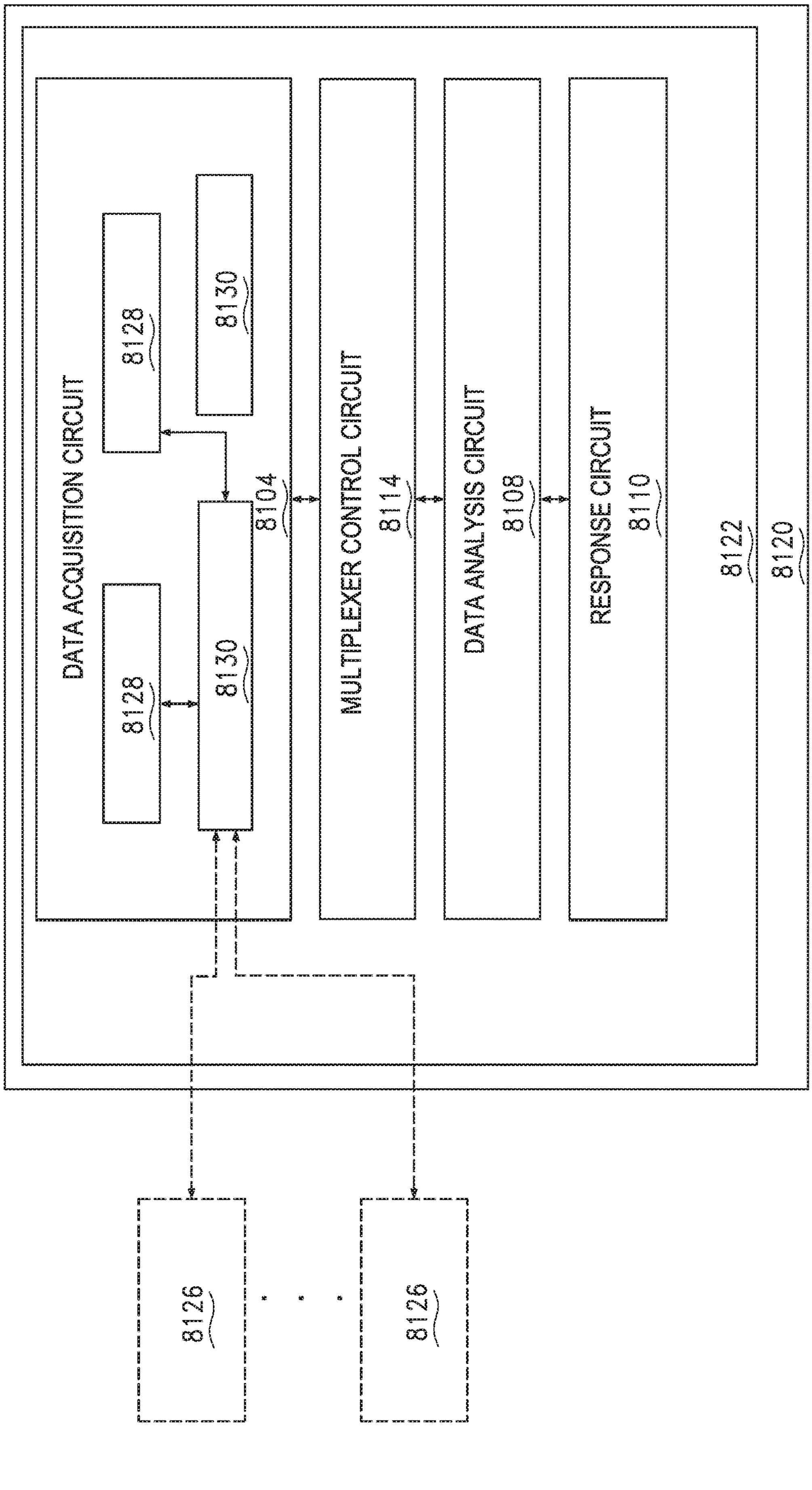

In embodiments, as illustrated in FIG. 50, the sensors 8106 may be part of the data monitoring device 8100, referred to herein in some cases as a data collector, which in some cases may comprise a mobile or portable data collector. In embodiments, as illustrated in FIGS. 51 and 52, one or more external sensors 8126, which are not explicitly part of a monitoring device 8120 but rather are new, previously attached to or integrated into the equipment or component, may be opportunistically connected to, or accessed by the monitoring device 8120. The monitoring device 8120 may include a controller 8122. The controller 8122 may include a data acquisition circuit 8104, a data analysis circuit 8108, a MUX control circuit 8114, and a response circuit 8110. The data acquisition circuit 8104 may comprise a MUX 8112 where the inputs correspond to a subset of the detection values. The MUX control circuit 8114 may be structured to provide the logical control of the MUX and the correspondence of MUX input and detected values based on a subset of the plurality of detection values and/or a command from the response circuit 8110 and/or the output of the data analysis circuit 8108. The data analysis circuit 8108 may comprise one or more of a peak detection circuit, a phase differential circuit, a PLL circuit, a bandpass filter circuit, a frequency transformation circuit, a frequency analysis circuit, a torsional analysis circuit, a bearing analysis circuit, an overload detection circuit, vibrational resonance circuit for the identification of unfavorable interaction among machines or components, a distortion identification circuit for the identification of unfavorable distortions such as deflections shapes upon operation, stress and strain-based effects, and the like.

The one or more external sensors 8126 may be directly connected to the one or more input ports 8128 on the data acquisition circuit 8104 of the controller 8122 or may be accessed by the data acquisition circuit 8104 wirelessly, such as by a reader, interrogator, or other wireless connection, such as over a short-distance wireless protocol. In embodiments, as shown in FIG. 52, a data acquisition circuit 8104 may further comprise a wireless communication circuit 8130. The data acquisition circuit 8104 may use the wireless communication circuit 8130 to access detection values corresponding to the one or more external sensors 8126 wirelessly or via a separate source or some combination of these methods.

Figure 53:
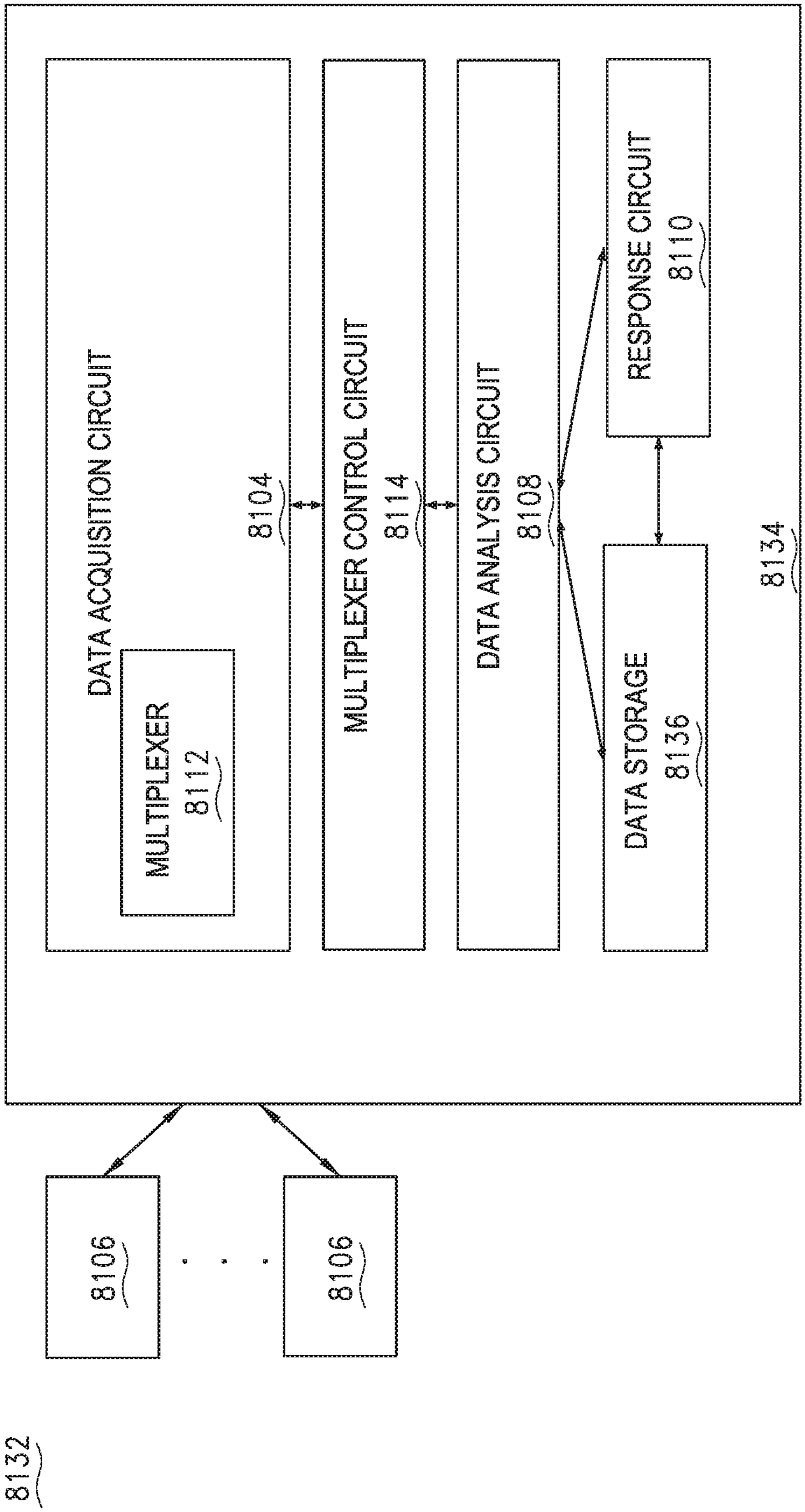
FIG. 53 is a diagrammatic view that depicts embodiments of a data monitoring device in accordance with the present disclosure.

In embodiments, as illustrated in FIG. 53, the controller 8134 may further comprise a data storage circuit 8136. The data storage circuit 8136 may be structured to store one or more of sensor specifications, component specifications, anticipated state information, detected values, multiplexer output, component models, and the like. The data storage circuit 8136 may provide specifications and anticipated state information to the data analysis circuit 8108.

In embodiments, the response circuit 8110 may initiate a variety of actions based on the sensor status provided by the data analysis circuit 8108. The response circuit 8110 may adjust a sensor scaling value (e.g., from 100 mV/gram to 10 mV/gram). The response circuit 8110 may select an alternate sensor from a plurality available. The response circuit 8110 may acquire data from a plurality of sensors of different ranges. The response circuit 8110 may recommend an alternate sensor. The response circuit 8110 may issue an alarm or an alert.

In embodiments, the response circuit 8110 may cause the data acquisition circuit 8104 to enable or disable the processing of detection values corresponding to certain sensors based on the component status. This may include switching to sensors having different response rates, sensitivity, ranges, and the like; accessing new sensors or types of sensors, accessing data from multiple sensors, and the like. Switching may be undertaken based on a model, a set of rules, or the like. In embodiments, switching may be under control of a machine learning system, such that switching is controlled based on one or more metrics of success, combined with input data, over a set of trials, which may occur under supervision of a human supervisor or under control of an automated system. Switching may involve switching from one input port to another (such as to switch from one sensor to another). Switching may involve altering the multiplexing of data, such as combining different streams under different circumstances. Switching may involve activating a system to obtain additional data, such as moving a mobile system (such as a robotic or drone system), to a location where different or additional data is available, such as positioning an image sensor for a different view or positioning a sonar sensor for a different direction of collection, or to a location where different sensors can be accessed, such as moving a collector to connect up to a sensor at a location in an environment by a wired or wireless connection. This switching may be implemented by directing changes to the multiplexer (MUX) control circuit 8114.

In embodiments, the response circuit 8110 may make recommendations for the replacement of certain sensors in the future with sensors having different response rates, sensitivity, ranges, and the like. The response circuit 8110 may recommend design alterations for future embodiments of the component, the piece of equipment, the operating conditions, the process, and the like.

In embodiments, the response circuit 8110 may recommend maintenance at an upcoming process stop or initiate a maintenance call where the maintenance may include the replacement of the sensor with the same or an alternate type of sensor having a different response rate, sensitivity, range, and the like. In embodiments, the response circuit 8110 may implement or recommend process changes—for example to lower the utilization of a component that is near a maintenance interval, operating off-nominally, or failed for purpose but is still at least partially operational, to change the operating speed of a component (such as to put it in a lower-demand mode), to initiate amelioration of an issue (such as to signal for additional lubrication of a roller bearing set, or to signal for an alignment process for a system that is out of balance), and the like.

In embodiments, the data analysis circuit 8108 and/or the response circuit 8110 may periodically store certain detection values and/or the output of the multiplexers and/or the data corresponding to the logic control of the MUX in the data storage circuit 8136 to enable the tracking of component performance over time. In embodiments, based on sensor status, as described elsewhere herein, recently measured sensor data and related operating conditions such as RPMs, component loads, temperatures, pressures, vibrations, or other sensor data of the types described throughout this disclosure in the data storage circuit 8136 enable the backing out of overloaded/failed sensor data. The signal evaluation circuit 8108 may store data at a higher data rate for greater granularity in future processing, the ability to reprocess at different sampling rates, and/or to enable diagnosing or post-processing of system information where operational data of interest is flagged, and the like.

In embodiments, as shown in FIGS. 54, 55, 56, and 57, a data monitoring system 8138 may include at least one data monitoring device 8140. The at least one data monitoring device 8140 may include sensors 8106 and a controller 8142 comprising a data acquisition circuit 8104, a data analysis circuit 8108, a data storage circuit 8136, and a communication circuit 8146 to allow data and analysis to be transmitted to a monitoring application 8150 on a remote server 8148. The signal evaluation circuit 8108 may include at least an overload detection circuit (e.g., reference FIGS. 101 and 102) and/or a sensor fault detection circuit (e.g., reference FIGS. 101 and 102). The signal evaluation circuit 8108 may periodically share data with the communication circuit 8146 for transmittal to the remote server 8148 to enable the tracking of component and equipment performance over time and under varying conditions by a monitoring application 8150. Based on the sensor status, the signal evaluation circuit 8108 and/or response circuit 8110 may share data with the communication circuit 8146 for transmittal to the remote server 8148 based on the fit of data relative to one or more criteria. Data may include recent sensor data and additional data such as RPMs, component loads, temperatures, pressures, vibrations, and the like for transmittal. The signal evaluation circuit 8108 may share data at a higher data rate for transmittal to enable greater granularity in processing on the remote server.

Figure 54:
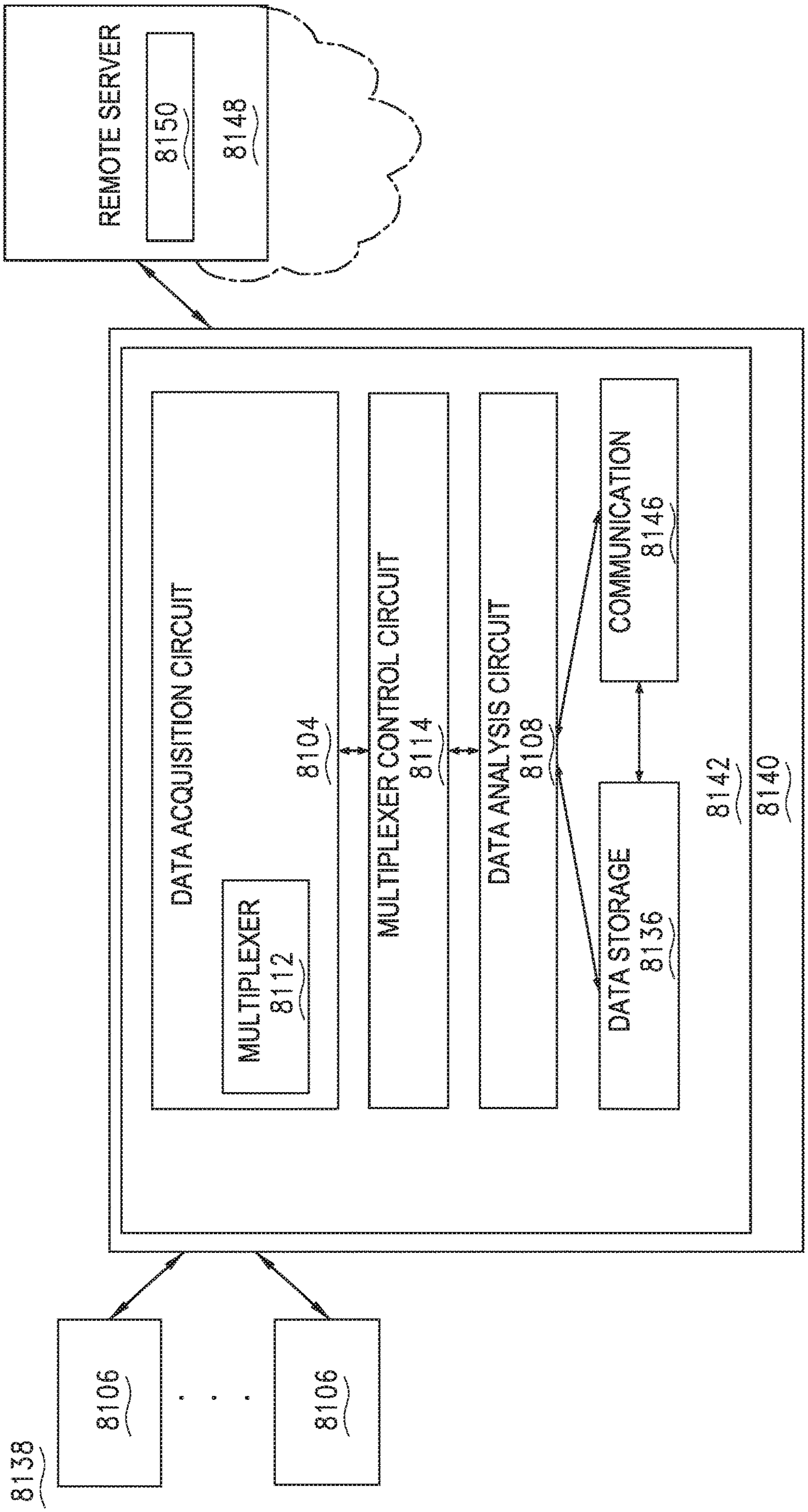
FIGS. 54 and 55 are diagrammatic views that depict an embodiment of a system for data collection in accordance with the present disclosure.
Figure 55:
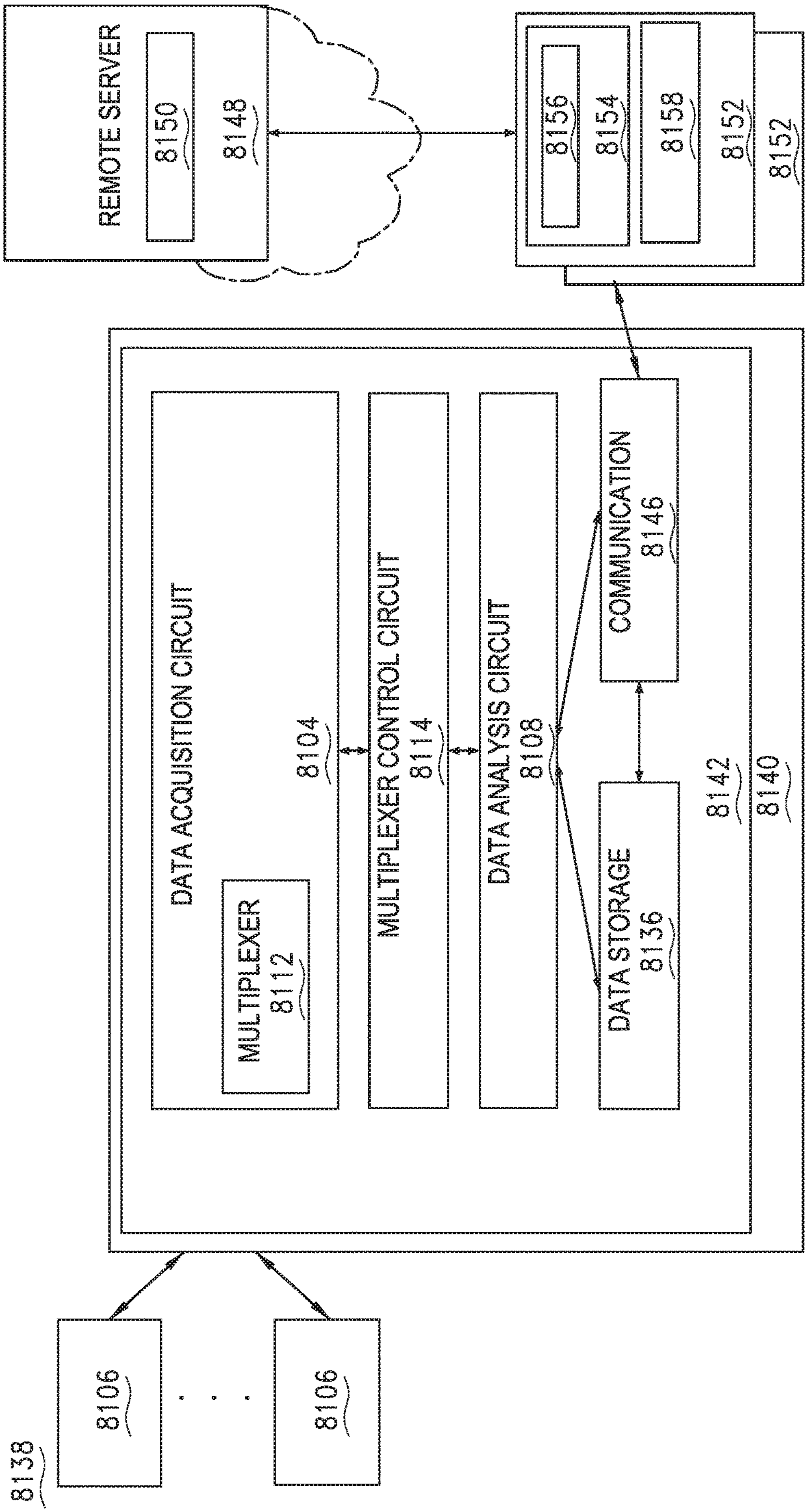

In embodiments, as shown in FIG. 54, the communication circuit 8146 may communicate data directly to a remote server 8148. In embodiments, as shown in FIG. 55, the communication circuit 8146 may communicate data to an intermediate computer 8152 which may include a processor 8154 running an operating system 8156 and a data storage circuit 8158.

Figure 56:
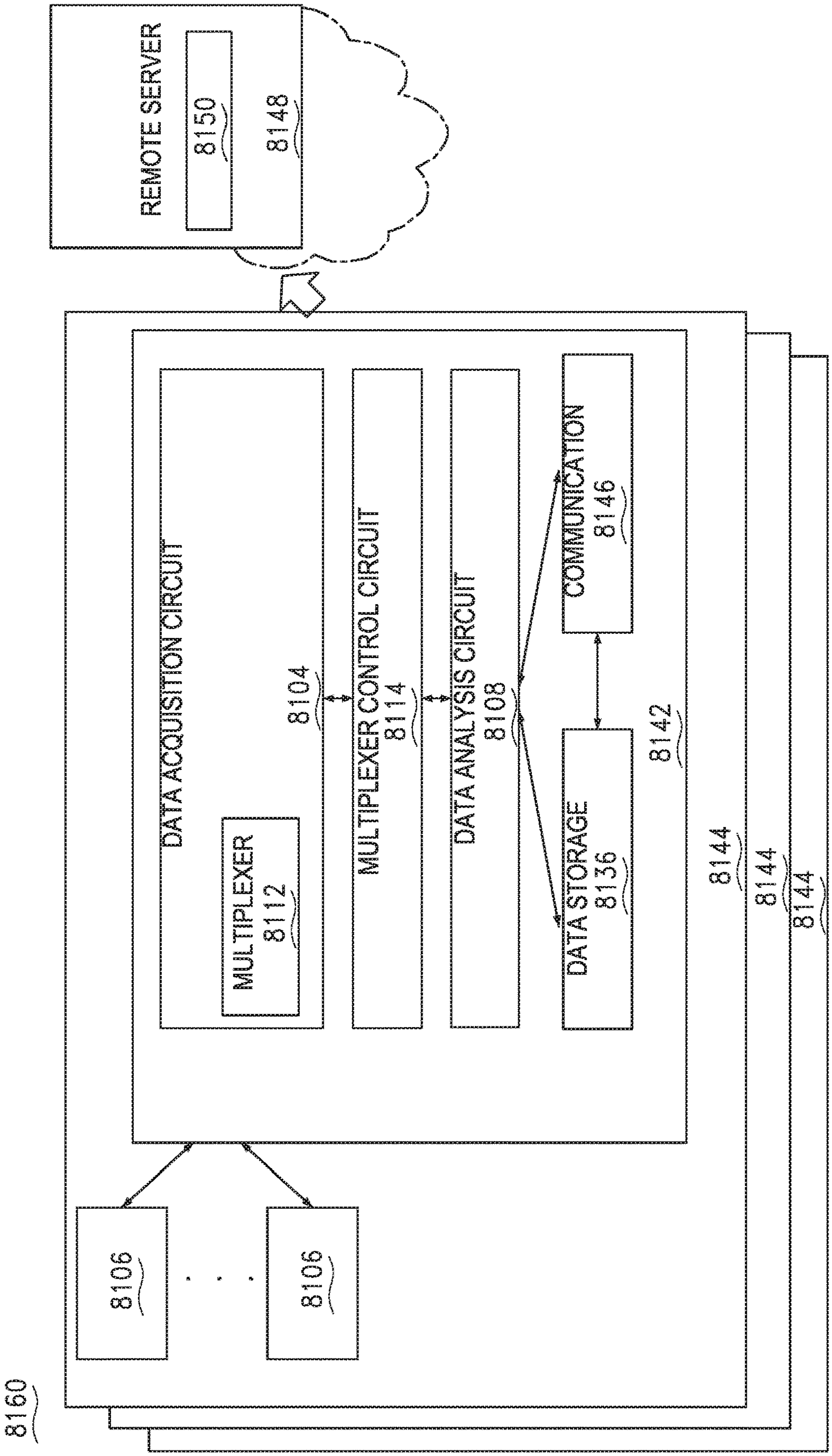
FIGS. 56 and 57 are diagrammatic views that depict an embodiment of a system for data collection comprising a plurality of data monitoring devices in accordance with the present disclosure.
Figure 57:
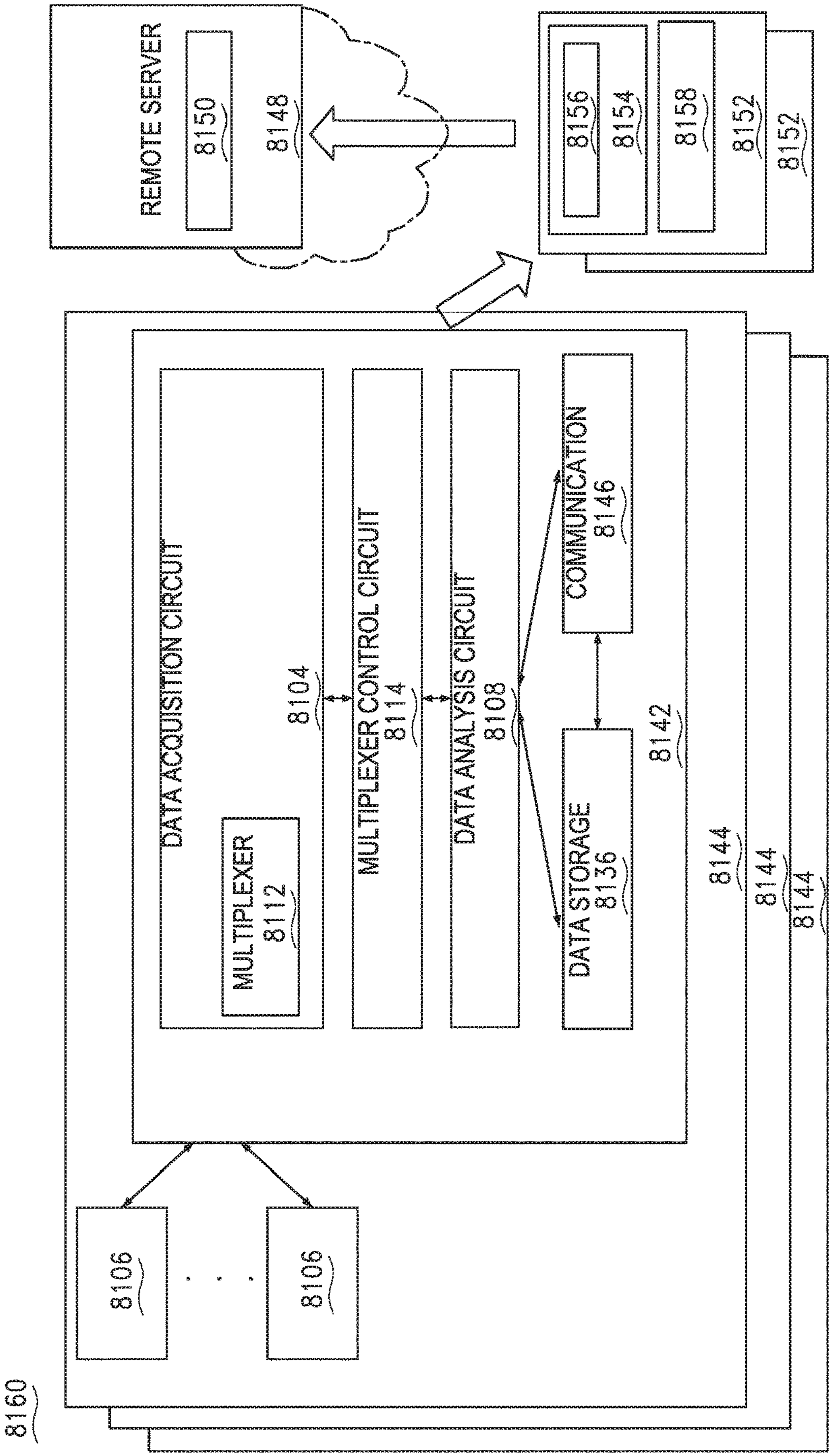

In embodiments as illustrated in FIGS. 56 and 57, a data collection system 8160 may have a plurality of monitoring devices 8144 collecting data on multiple components in a single piece of equipment, collecting data on the same component across a plurality of pieces of equipment, (both the same and different types of equipment) in the same facility, as well as collecting data from monitoring devices in multiple facilities. A monitoring application 8150 on a remote server 8148 may receive and store one or more of detection values, timing signals, and data coming from a plurality of the various monitoring devices 8144.

In embodiments, as shown in FIG. 56, the communication circuit 8146 may communicate data directly to a remote server 8148. In embodiments, as shown in FIG. 57, the communication circuit 8146 may communicate data to an intermediate computer 8152 which may include a processor 8154 running an operating system 8156 and a data storage circuit 8158. There may be an individual intermediate computer 8152 associated with each monitoring device 8140 or an individual intermediate computer 8152 may be associated with a plurality of monitoring devices 8144 where the intermediate computer 8152 may collect data from a plurality of data monitoring devices and send the cumulative data to the remote server 8148. Communication to the remote server 8148 may be streaming, batch (e.g., when a connection is available), or opportunistic.

The monitoring application 8150 may select subsets of the detection values to be jointly analyzed. Subsets for analysis may be selected based on a single type of sensor, component, or a single type of equipment in which a component is operating. Subsets for analysis may be selected or grouped based on common operating conditions such as size of load, operational condition (e.g., intermittent or continuous), operating speed or tachometer output, common ambient environmental conditions such as humidity, temperature, air or fluid particulate, and the like. Subsets for analysis may be selected based on the effects of other nearby equipment such as nearby machines rotating at similar frequencies, nearby equipment producing electromagnetic fields, nearby equipment producing heat, nearby equipment inducing movement or vibration, nearby equipment emitting vapors, chemicals or particulates, or other potentially interfering or intervening effects.

In embodiments, the monitoring application 8150 may analyze the selected subset. In an example, data from a single sensor may be analyzed over different time periods such as one operating cycle, several operating cycles, a month, a year, the life of the component, or the like. Data from multiple sensors of a common type measuring a common component type may also be analyzed over different time periods. Trends in the data such as changing rates of change associated with start-up or different points in the process may be identified. Correlation of trends and values for different sensors may be analyzed to identify those parameters whose short-term analysis might provide the best prediction regarding expected sensor performance. This information may be transmitted back to the monitoring device to update sensor models, sensor selection, sensor range, sensor scaling, sensor sampling frequency, types of data collected, and the like, and be analyzed locally or to influence the design of future monitoring devices.

In embodiments, the monitoring application 8150 may have access to equipment specifications, equipment geometry, component specifications, component materials, anticipated state information for a plurality of sensors, operational history, historical detection values, sensor life models, and the like for use analyzing the selected subset using rule-based or model-based analysis. The monitoring application 8150 may provide recommendations regarding sensor selection, additional data to collect, data to store with sensor data, and the like. The monitoring application 8150 may provide recommendations regarding scheduling repairs and/or maintenance. The monitoring application 8150 may provide recommendations regarding replacing a sensor. The replacement sensor may match the sensor being replaced or the replacement sensor may have a different range, sensitivity, sampling frequency, and the like.

In embodiments, the monitoring application 8150 may include a remote learning circuit structured to analyze sensor status data (e.g., sensor overload or sensor failure) together with data from other sensors, failure data on components being monitored, equipment being monitored, output being produced, and the like. The remote learning system may identify correlations between sensor overload and data from other sensors.

An example monitoring system for data collection in an industrial environment includes a data acquisition circuit that interprets a number of detection values, each of the detection values corresponding to input received from at least one of a number of input sensors, a MUX having inputs corresponding to a subset of the detection values, a MUX control circuit that interprets a subset of the number of detection values and provides the logical control of the MUX and the correspondence of MUX input and detected values as a result, where the logic control of the MUX includes adaptive scheduling of the select lines, a data analysis circuit that receives an output from the MUX and data corresponding to the logic control of the MUX resulting in a component health status, an analysis response circuit that performs an operation in response to the component health status, where the number of sensors includes at least two sensors such as a temperature sensor, a load sensor, a vibration sensor, an acoustic wave sensor, a heat flux sensor, an infrared sensor, an accelerometer, a tri-axial vibration sensor, and/or a tachometer. In certain further embodiments, an example system includes: where at least one of the number of detection values may correspond to a fusion of two or more input sensors representing a virtual sensor; where the system further includes a data storage circuit that stores at least one of component specifications and anticipated component state information and buffers a subset of the number of detection values for a predetermined length of time; where the system further includes a data storage circuit that stores at least one of a component specification and anticipated component state information and buffers the output of the MUX and data corresponding to the logic control of the MUX for a predetermined length of time; where the data analysis circuit includes a peak detection circuit, a phase detection circuit, a bandpass filter circuit, a frequency transformation circuit, a frequency analysis circuit, a PLL circuit, a torsional analysis circuit, and/or a bearing analysis circuit; where operation further includes storing additional data in the data storage circuit; where the operation includes at least one of enabling or disabling one or more portions of the MUX circuit; and/or where the operation includes causing the MUX control circuit to alter the logical control of the MUX and the correspondence of MUX input and detected values. In certain embodiments, the system includes at least two multiplexers; control of the correspondence of the multiplexer input and the detected values further includes controlling the connection of the output of a first multiplexer to an input of a second multiplexer; control of the correspondence of the multiplexer input and the detected values further comprises powering down at least a portion of one of the at least two multiplexers; and/or control of the correspondence of MUX input and detected values includes adaptive scheduling of the select lines. In certain embodiments, a data response circuit analyzes the stream of data from one or both MUXes, and recommends an action in response to the analysis.

An example testing system includes the testing system in communication with a number of analog and digital input sensors, a monitoring device including a data acquisition circuit that interprets a number of detection values, each of the number of detection values corresponding to at least one of the input sensors, a MUX having inputs corresponding to a subset of the detection values, a MUX control circuit that interprets a subset of the number of detection values and provides the logical control of the MUX and control of the correspondence of MUX input and detected values as a result, where the logic control of the MUX includes adaptive scheduling of the select lines, and a user interface enabled to accept scheduling input for select lines and display output of MUX and select line data.

Figure 58:
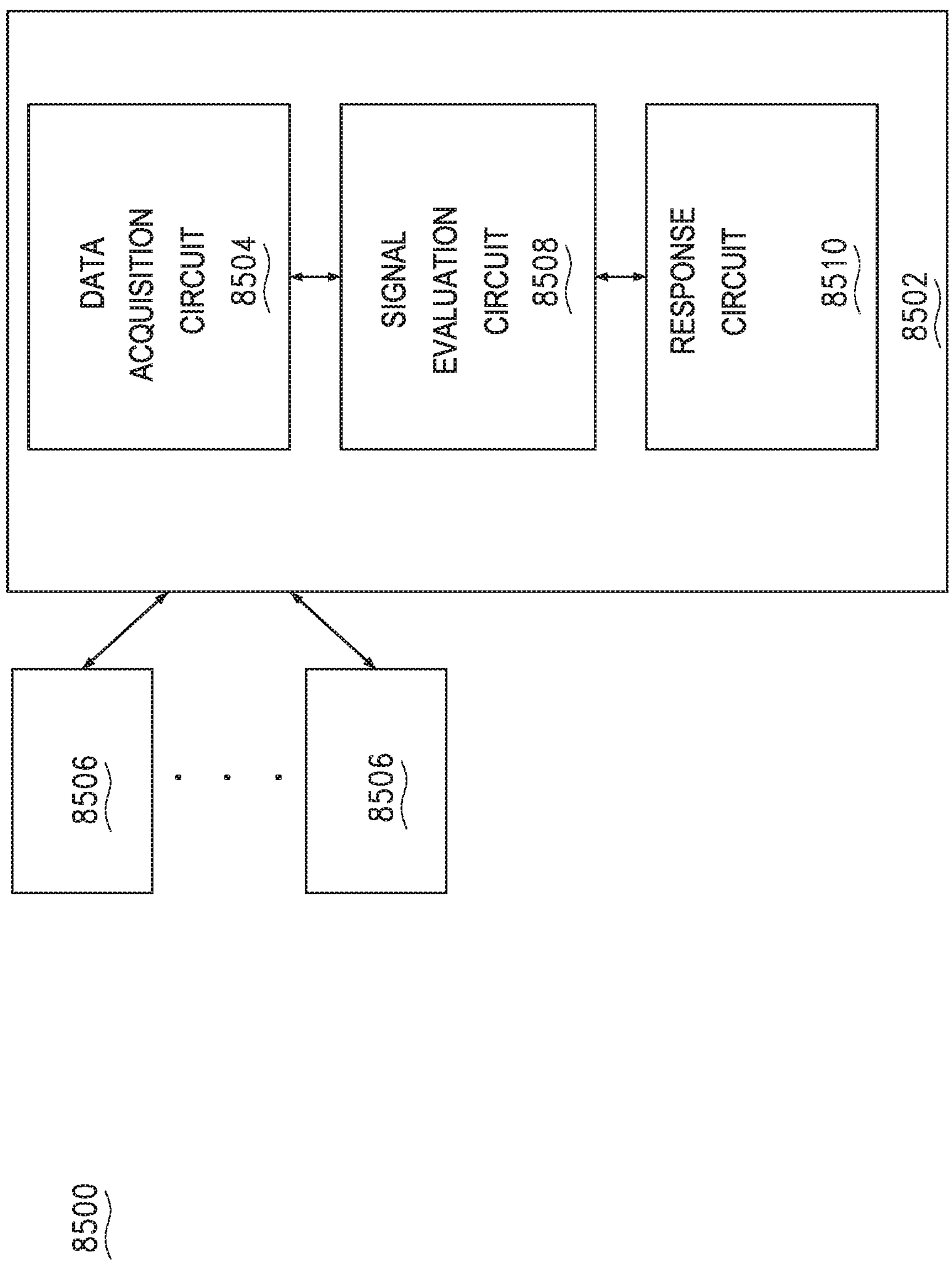
FIG. 58 depicts an embodiment of a data monitoring device incorporating sensors in accordance with the present disclosure.

In embodiments, information about the health or other status or state information of or regarding a component or piece of industrial equipment may be obtained by looking at both the amplitude and phase or timing of data signals relative to related data signals, timers, reference signals or data measurements. An embodiment of a data monitoring device 8500 is shown in FIG. 58 and may include a plurality of sensors 8506 communicatively coupled to a controller 8502. The controller 8502 may include a data acquisition circuit 8504, a signal evaluation circuit 8508 and a response circuit 8510. The plurality of sensors 8506 may be wired to ports on the data acquisition circuit 8504 or wirelessly in communication with the data acquisition circuit 8504. The plurality of sensors 8506 may be wirelessly connected to the data acquisition circuit 8504. The data acquisition circuit 8504 may be able to access detection values corresponding to the output of at least one of the plurality of sensors 8506 where the sensors 8506 may be capturing data on different operational aspects of a piece of equipment or an operating component.

The selection of the plurality of sensors 8506 for a data monitoring device 8500 designed for a specific component or piece of equipment may depend on a variety of considerations such as accessibility for installing new sensors, incorporation of sensors in the initial design, anticipated operational and failure conditions, reliability of the sensors, and the like. The impact of failure may drive the extent to which a component or piece of equipment is monitored with more sensors and/or higher capability sensors being dedicated to systems where unexpected or undetected failure would be costly or have severe consequences.

Depending on the type of equipment, the component being measured, the environment in which the equipment is operating and the like, sensors 8506 may comprise one or more of, without limitation, a vibration sensor, a thermometer, a hygrometer, a voltage sensor, a current sensor, an accelerometer, a velocity detector, a light or electromagnetic sensor (e.g., determining temperature, composition and/or spectral analysis, and/or object position or movement), an image sensor, a structured light sensor, a laser-based image sensor, an acoustic wave sensor, a displacement sensor, a turbidity meter, a viscosity meter, a load sensor, a tri-axial sensor, an accelerometer, a tachometer, a fluid pressure meter, an air flow meter, a horsepower meter, a flow rate meter, a fluid particle detector, an acoustical sensor, a pH sensor, and the like, including, without limitation, any of the sensors described throughout this disclosure and the documents incorporated by reference.

The sensors 8506 may provide a stream of data over time that has a phase component, such as relating to acceleration or vibration, allowing for the evaluation of phase or frequency analysis of different operational aspects of a piece of equipment or an operating component. The sensors 8506 may provide a stream of data that is not conventionally phase-based, such as temperature, humidity, load, and the like. The sensors 8506 may provide a continuous or near continuous stream of data over time, periodic readings, event-driven readings, and/or readings according to a selected interval or schedule.

Figure 59:
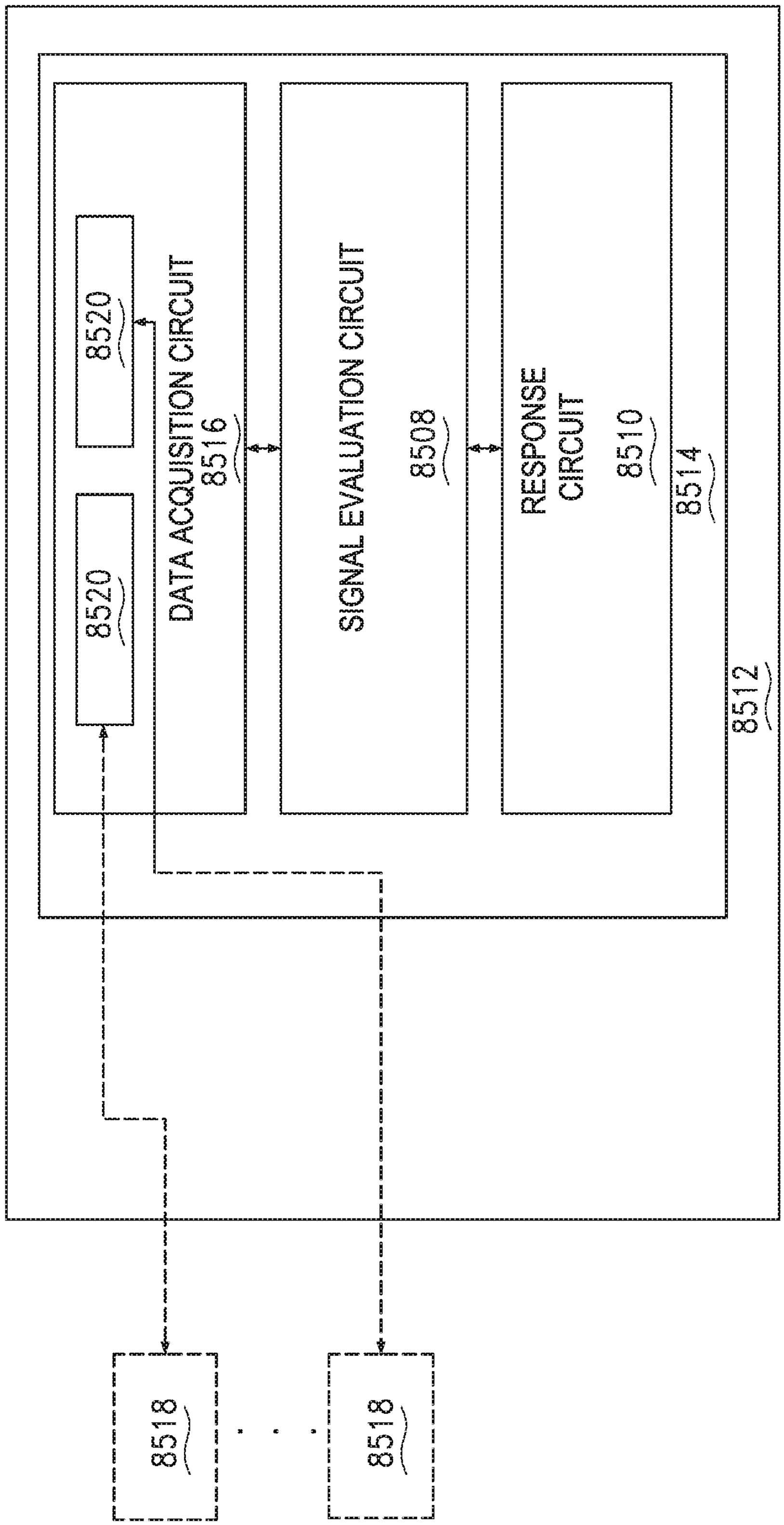
FIGS. 59 and 60 are diagrammatic views that depict embodiments of a data monitoring device in communication with external sensors in accordance with the present disclosure.
Figure 60:
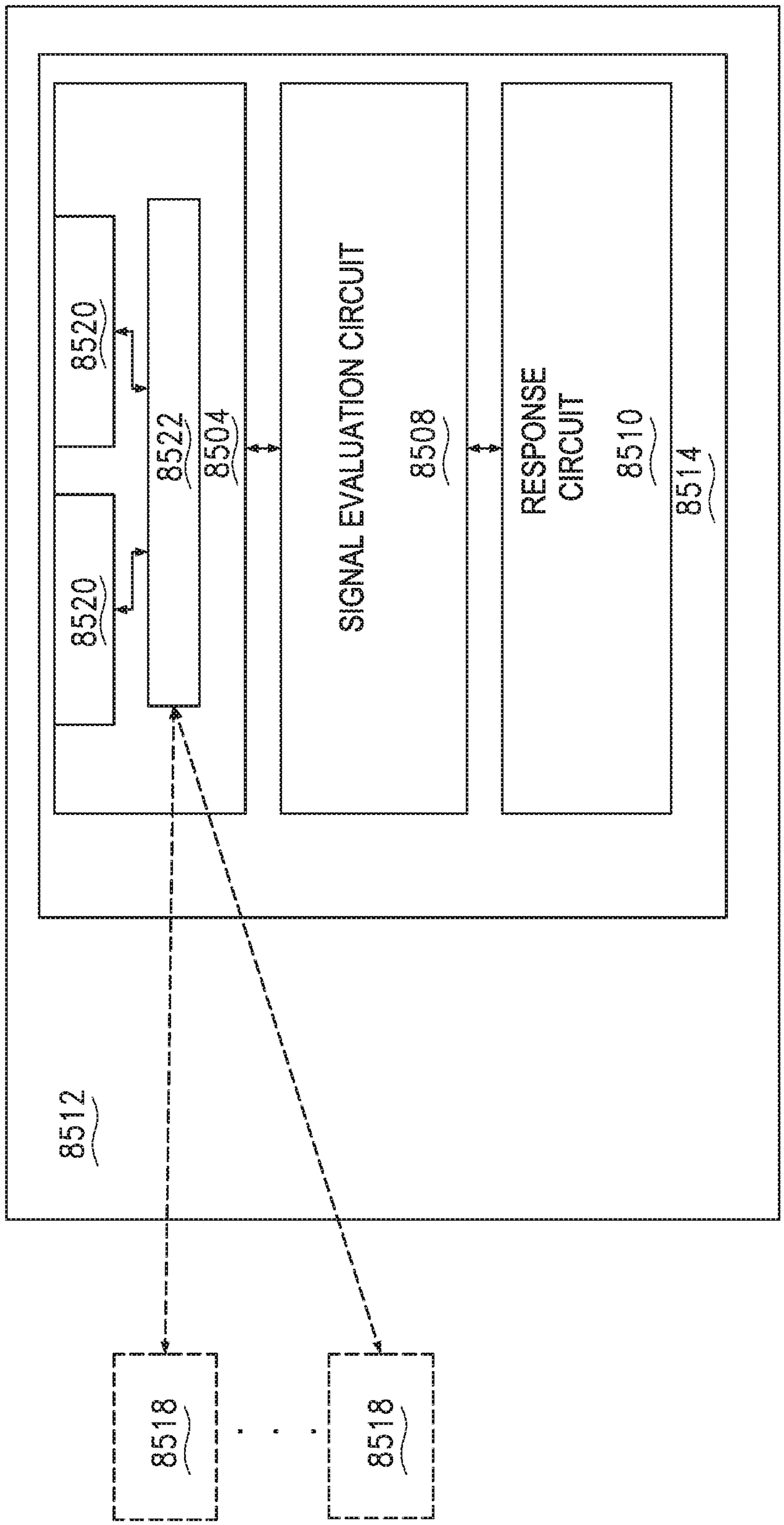

In embodiments, as illustrated in FIG. 58, the sensors 8506 may be part of the data monitoring device 8500, referred to herein in some cases as a data collector, which in some cases may comprise a mobile or portable data collector. In embodiments, as illustrated in FIGS. 59 and 60, sensors 8518, either new or previously attached to or integrated into the equipment or component, may be opportunistically connected to or accessed by a monitoring device 8512. The sensors 8518 may be directly connected to input ports 8520 on the data acquisition circuit 8516 of a controller 8514 or may be accessed by the data acquisition circuit 8516 wirelessly, such as by a reader, interrogator, or other wireless connection, such as over a short-distance wireless protocol. In embodiments, a data acquisition circuit 8516 may access detection values corresponding to the sensors 8518 wirelessly or via a separate source or some combination of these methods. In embodiments, the data acquisition circuit 8504 may include a wireless communications circuit 8522 able to wirelessly receive data opportunistically from sensors 8518 in the vicinity and route the data to the input ports 8520 on the data acquisition circuit 8516.

Figure 61:
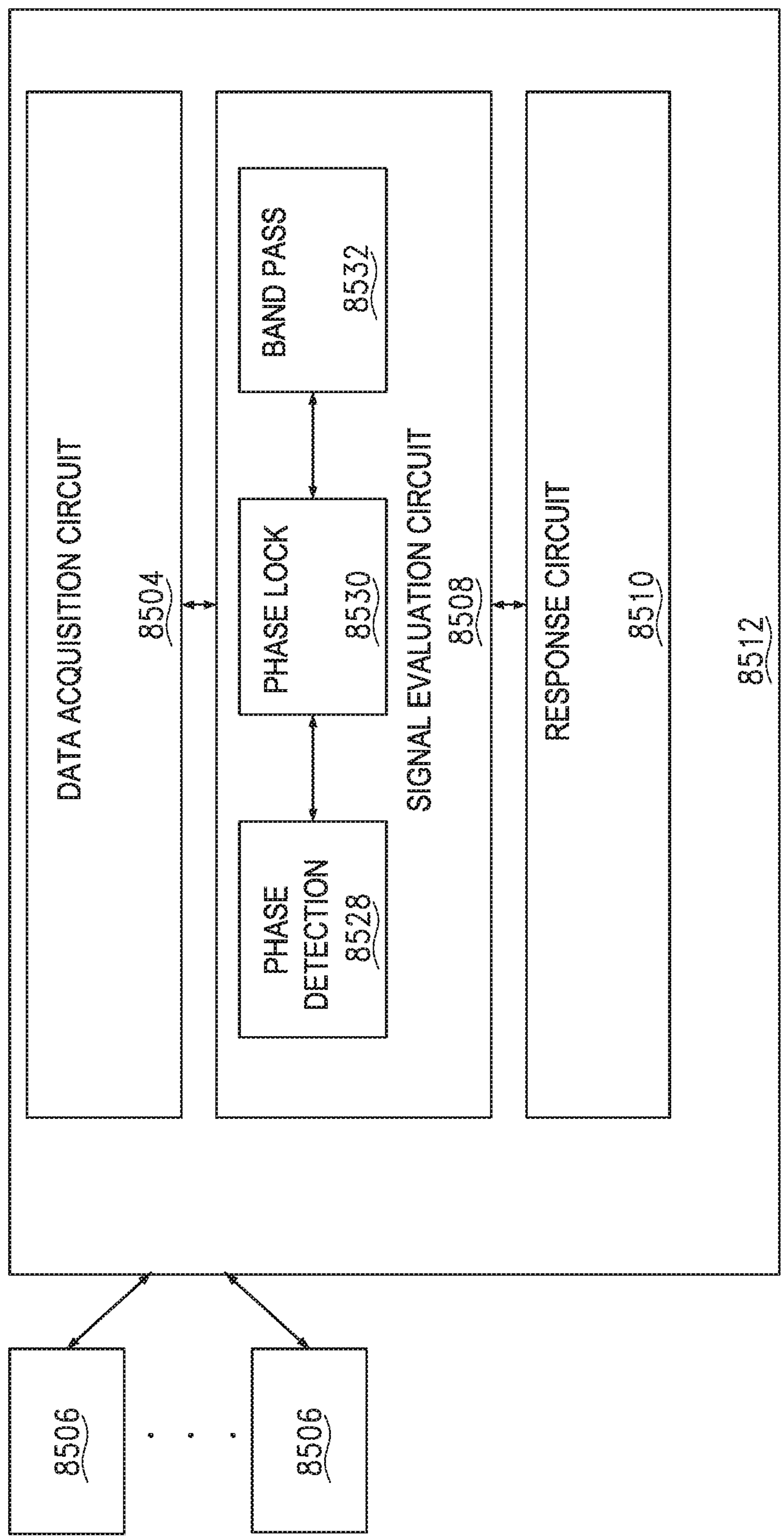
FIG. 61 is a diagrammatic view that depicts embodiments of a data monitoring device with additional detail in the signal evaluation circuit in accordance with the present disclosure.
Figure 62:
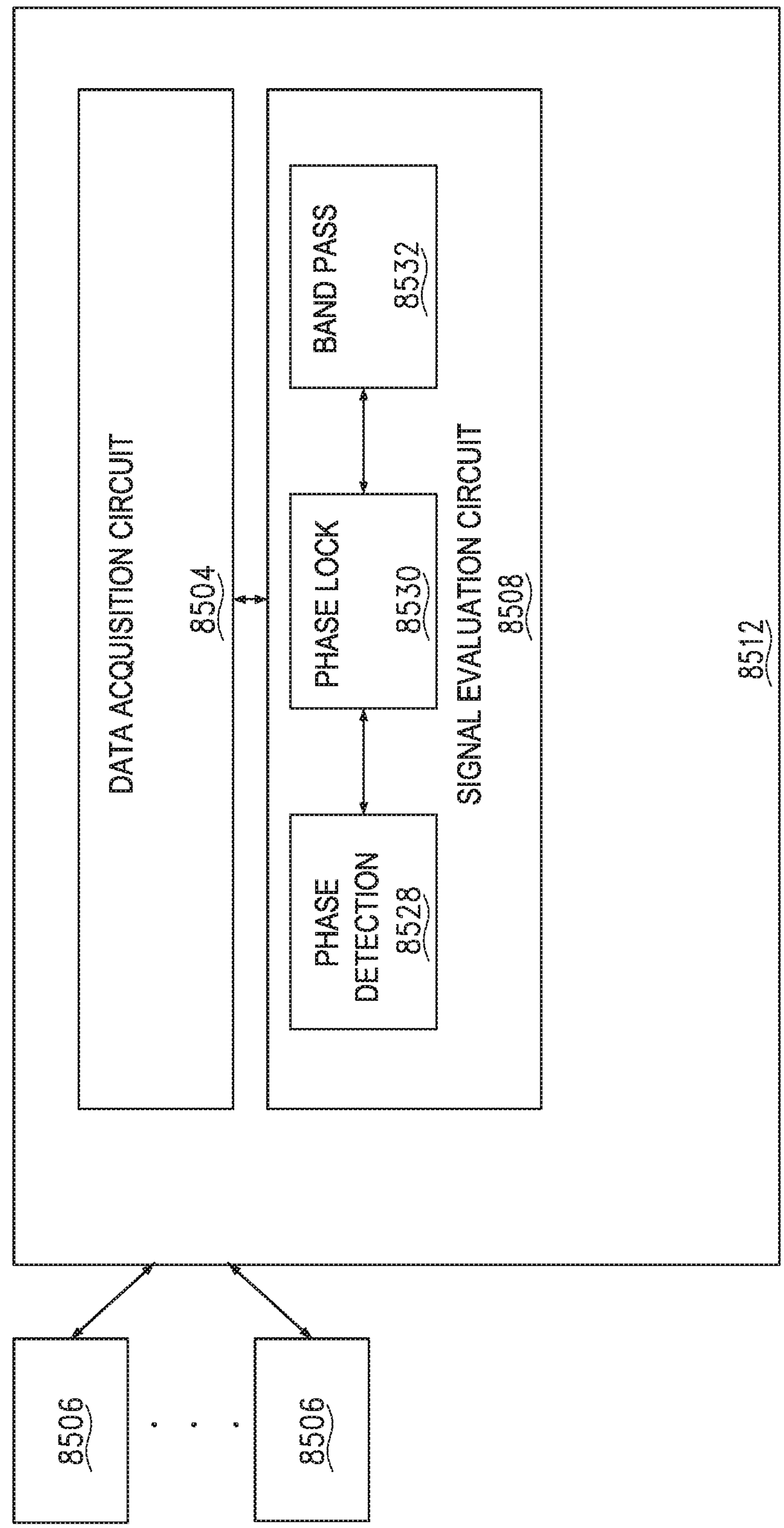
FIG. 62 is a diagrammatic view that depicts embodiments of a data monitoring device with additional detail in the signal evaluation circuit in accordance with the present disclosure.

In an embodiment, as illustrated in FIGS. 61 and 62, the signal evaluation circuit 8508 may then process the detection values to obtain information about the component or piece of equipment being monitored. Information extracted by the signal evaluation circuit 8508 may comprise rotational speed, vibrational data including amplitudes, frequencies, phase, and/or acoustical data, and/or non-phase sensor data such as temperature, humidity, image data, and the like.

The signal evaluation circuit 8508 may include one or more components such as a phase detection circuit 8528 to determine a phase difference between two time-based signals, a phase lock loop circuit 8530 to adjust the relative phase of a signal such that it is aligned with a second signal, timer or reference signal, and/or a band pass filter circuit 8532 which may be used to separate out signals occurring at different frequencies. An example band pass filter circuit 8532 includes any filtering operations understood in the art, including at least a low-pass filter, a high-pass filter, and/or a band pass filter—for example to exclude or reduce frequencies that are not of interest for a particular determination, and/or to enhance the signal for frequencies of interest. Additionally, or alternatively, a band pass filter circuit 8532 includes one or more notch filters or other filtering mechanism to narrow ranges of frequencies (e.g., frequencies from a known source of noise). This may be used to filter out dominant frequency signals such as the overall rotation, and may help enable the evaluation of low amplitude signals at frequencies associated with torsion, bearing failure and the like.

In embodiments, understanding the relative differences may be enabled by a phase detection circuit 8528 to determine a phase difference between two signals. It may be of value to understand a relative phase offset, if any, between signals such as when a periodic vibration occurs relative to a relative rotation of a piece of equipment. In embodiments, there may be value in understanding where in a cycle shaft vibrations occur relative to a motor control input to better balance the control of the motor. This may be particularly true for systems and components that are operating at relative slow RPMs. Understanding of the phase difference between two signals or between those signals and a timer may enable establishing a relationship between a signal value and where it occurs in a process or rotation. Understanding relative phase differences may help in evaluating the relationship between different components of a system such as in the creation of a vibrational model for an Operational Deflection Shape (ODS).

The signal evaluation circuit 8544 may perform frequency analysis using techniques such as a digital Fast Fourier transform (FFT), Laplace transform, Z-transform, wavelet transform, other frequency domain transform, or other digital or analog signal analysis techniques, including, without limitation, complex analysis, including complex phase evolution analysis. An overall rotational speed or tachometer may be derived from data from sensors such as rotational velocity meters, accelerometers, displacement meters and the like. Additional frequencies of interest may also be identified. These may include frequencies near the overall rotational speed as well as frequencies higher than that of the rotational speed. These may include frequencies that are nonsynchronous with an overall rotational speed. Signals observed at frequencies that are multiples of the rotational speed may be due to bearing induced vibrations or other behaviors or situations involving bearings. In some instances, these frequencies may be in the range of one times the rotational speed, two times the rotational speed, three times the rotational speed, and the like, up to 3.15 to 15 times the rotational speed, or higher. In some embodiments, the signal evaluation circuit 8544 may select RC components for a band pass filter circuit 8532 based on overall rotational speed to create a band pass filter circuit 8532 to remove signals at expected frequencies such as the overall rotational speed, to facilitate identification of small amplitude signals at other frequencies. In embodiments, variable components may be selected, such that adjustments may be made in keeping with changes in the rotational speed, so that the band pass filter may be a variable band pass filter. This may occur under control of automatically self-adjusting circuit elements, or under control of a processor, including automated control based on a model of the circuit behavior, where a rotational speed indicator or other data is provided as a basis for control.

In embodiments, rather than performing frequency analysis, the signal evaluation circuit 8544 may utilize the time-based detection values to perform transitory signal analysis. These may include identifying abrupt changes in signal amplitude including changes where the change in amplitude exceeds a predetermined value or exists for a certain duration. In embodiments, the time-based sensor data may be aligned with a timer or reference signal allowing the time-based sensor data to be aligned with, for example, a time or location in a cycle. Additional processing to look at frequency changes over time may include the use of Short-Time Fourier Transforms (STFT) or a wavelet transform.

In embodiments, frequency-based techniques and time-based techniques may be combined, such as using time-based techniques to determine discrete time periods during which given operational modes or states are occurring and using frequency-based techniques to determine behavior within one or more of the discrete time periods.

In embodiments, the signal evaluation circuit may utilize demodulation techniques for signals obtained from equipment running at slow speeds such as paper and pulp machines, mining equipment, and the like. A signal evaluation circuit employing a demodulation technique may comprise a band-pass filter circuit, a rectifier circuit, and/or a low pass circuit prior to transforming the data to the frequency domain The response circuit 8510 8710 may further comprise evaluating the results of the signal evaluation circuit 8508 8544 and, based on certain criteria, initiating an action. Criteria may include a predetermined maximum or minimum value for a detection value from a specific sensor, a value of a sensor's corresponding detection value over time, a change in value, a rate of change in value, and/or an accumulated value (e.g., a time spent above/below a threshold value, a weighted time spent above/below one or more threshold values, and/or an area of the detected value above/below one or more threshold values). The criteria may include a sensor's detection values at certain frequencies or phases where the frequencies or phases may be based on the equipment geometry, equipment control schemes, system input, historical data, current operating conditions, and/or an anticipated response. The criteria may comprise combinations of data from different sensors such as relative values, relative changes in value, relative rates of change in value, relative values over time, and the like. The relative criteria may change with other data or information such as process stage, type of product being processed, type of equipment, ambient temperature and humidity, external vibrations from other equipment, and the like. The relative criteria may include level of synchronicity with an overall rotational speed, such as to differentiate between vibration induced by bearings and vibrations resulting from the equipment design. In embodiments, the criteria may be reflected in one or more calculated statistics or metrics (including ones generated by further calculations on multiple criteria or statistics), which in turn may be used for processing (such as on board a data collector or by an external system), such as to be provided as an input to one or more of the machine learning capabilities described in this disclosure, to a control system (which may be an on-board data collector or remote, such as to control selection of data inputs, multiplexing of sensor data, storage, or the like), or as a data element that is an input to another system, such as a data stream or data package that may be available to a data marketplace, a SCADA system, a remote control system, a maintenance system, an analytic system, or other system.

In an illustrative and non-limiting example, an alert may be issued if the vibrational amplitude and/or frequency exceeds a predetermined maximum value, if there is a change or rate of change that exceeds a predetermined acceptable range, and/or if an accumulated value based on vibrational amplitude and/or frequency exceeds a threshold. Certain embodiments are described herein as detected values exceeding thresholds or predetermined values, but detected values may also fall below thresholds or predetermined values—for example where an amount of change in the detected value is expected to occur, but detected values indicate that the change may not have occurred. For example, and without limitation, vibrational data may indicate system agitation levels, properly operating equipment, or the like, and vibrational data below amplitude and/or frequency thresholds may be an indication of a process that is not operating according to expectations. Except where the context clearly indicates otherwise, any description herein describing a determination of a value above a threshold and/or exceeding a predetermined or expected value is understood to include determination of a value below a threshold and/or falling below a predetermined or expected value.

The predetermined acceptable range may be based on anticipated system response or vibration based on the equipment geometry and control scheme such as number of bearings, relative rotational speed, influx of power to the system at a certain frequency, and the like. The predetermined acceptable range may also be based on long term analysis of detection values across a plurality of similar equipment and components and correlation of data with equipment failure. Based on vibration phase information, a physical location of a problem may be identified. Based on the vibration phase information system design flaws, off-nominal operation, and/or component or process failures may be identified. In some embodiments, an alert may be issued based on changes or rates of change in the data over time such as increasing amplitude or shifts in the frequencies or phases at which a vibration occurs. In some embodiments, an alert may be issued based on accumulated values such as time spent over a threshold, weighted time spent over one or more thresholds, and/or an area of a curve of the detected value over one or more thresholds. In embodiments, an alert may be issued based on a combination of data from different sensors such as relative changes in value, or relative rates of change in amplitude, frequency of phase in addition to values of non-phase sensors such as temperature, humidity and the like. For example, an increase in temperature and energy at certain frequencies may indicate a hot bearing that is starting to fail. In embodiments, the relative criteria for an alarm may change with other data or information such as process stage, type of product being processed on equipment, ambient temperature and humidity, external vibrations from other equipment and the like.

In embodiments, response circuit 8510 may cause the data acquisition circuit 8504 to enable or disable the processing of detection values corresponding to certain sensors based on the some of the criteria discussed above. This may include switching to sensors having different response rates, sensitivity, ranges, and the like; accessing new sensors or types of sensors, and the like. Switching may be undertaken based on a model, a set of rules, or the like. In embodiments, switching may be under control of a machine learning system, such that switching is controlled based on one or more metrics of success, combined with input data, over a set of trials, which may occur under supervision of a human supervisor or under control of an automated system. Switching may involve switching from one input port to another (such as to switch from one sensor to another). Switching may involve altering the multiplexing of data, such as combining different streams under different circumstances. Switching may involve activating a system to obtain additional data, such as moving a mobile system (such as a robotic or drone system), to a location where different or additional data is available (such as positioning an image sensor for a different view or positioning a sonar sensor for a different direction of collection) or to a location where different sensors can be accessed (such as moving a collector to connect up to a sensor that is disposed at a location in an environment by a wired or wireless connection). The response circuit 8510 may make recommendations for the replacement of certain sensors in the future with sensors having different response rates, sensitivity, ranges, and the like. The response circuit 8510 may recommend design alterations for future embodiments of the component, the piece of equipment, the operating conditions, the process, and the like.

In embodiments, the response circuit 8510 may recommend maintenance at an upcoming process stop or initiate a maintenance call. The response circuit 8510 may recommend changes in process or operating parameters to remotely balance the piece of equipment. In embodiments, the response circuit 8510 may implement or recommend process changes—for example to lower the utilization of a component that is near a maintenance interval, operating off-nominally, or failed for purpose but still at least partially operational, to change the operating speed of a component (such as to put it in a lower-demand mode), to initiate amelioration of an issue (such as to signal for additional lubrication of a roller bearing set, or to signal for an alignment process for a system that is out of balance), and the like.

Figure 63:
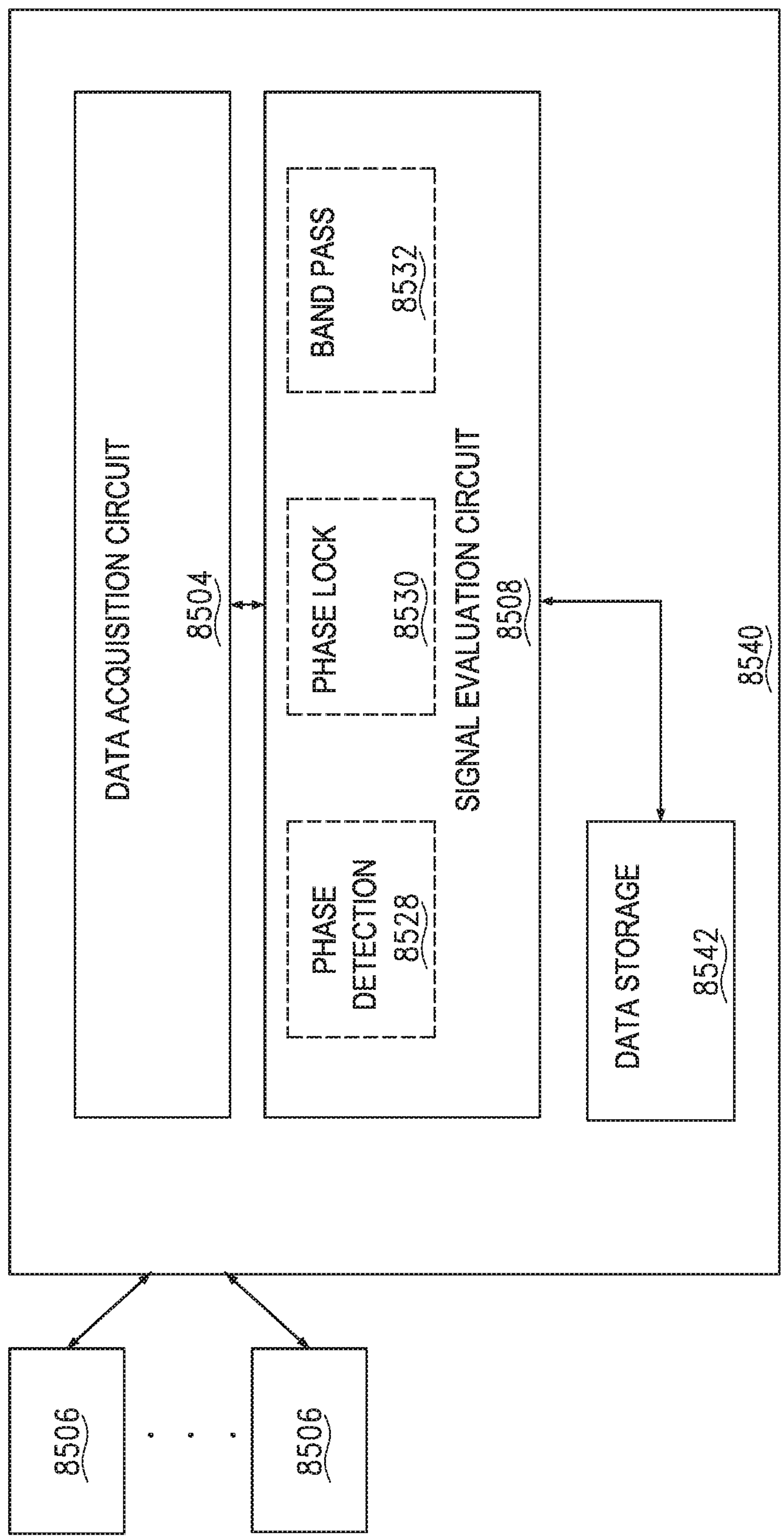
FIG. 63 is a diagrammatic view that depicts embodiments of a data monitoring device with additional detail in the signal evaluation circuit in accordance with the present disclosure.

In embodiments, as shown in FIG. 63, the data monitoring device 8540 may further comprise a data storage circuit 8542, memory, and the like. The signal evaluation circuit 8544 may periodically store certain detection values to enable the tracking of component performance over time.

In embodiments, based on relevant operating conditions and/or failure modes which may occur in as sensor values approach one or more criteria, the signal evaluation circuit 8544 may store data in the data storage circuit 8542 based on the fit of data relative to one or more criteria, such as those described throughout this disclosure. Based on one sensor input meeting or approaching specified criteria or range, the signal evaluation circuit 8544 may store additional data such as RPMs, component loads, temperatures, pressures, vibrations or other sensor data of the types described throughout this disclosure. The signal evaluation circuit 8544 may store data at a higher data rate for greater granularity in future processing, the ability to reprocess at different sampling rates, and/or to enable diagnosing or post-processing of system information where operational data of interest is flagged, and the like.

Figure 64:
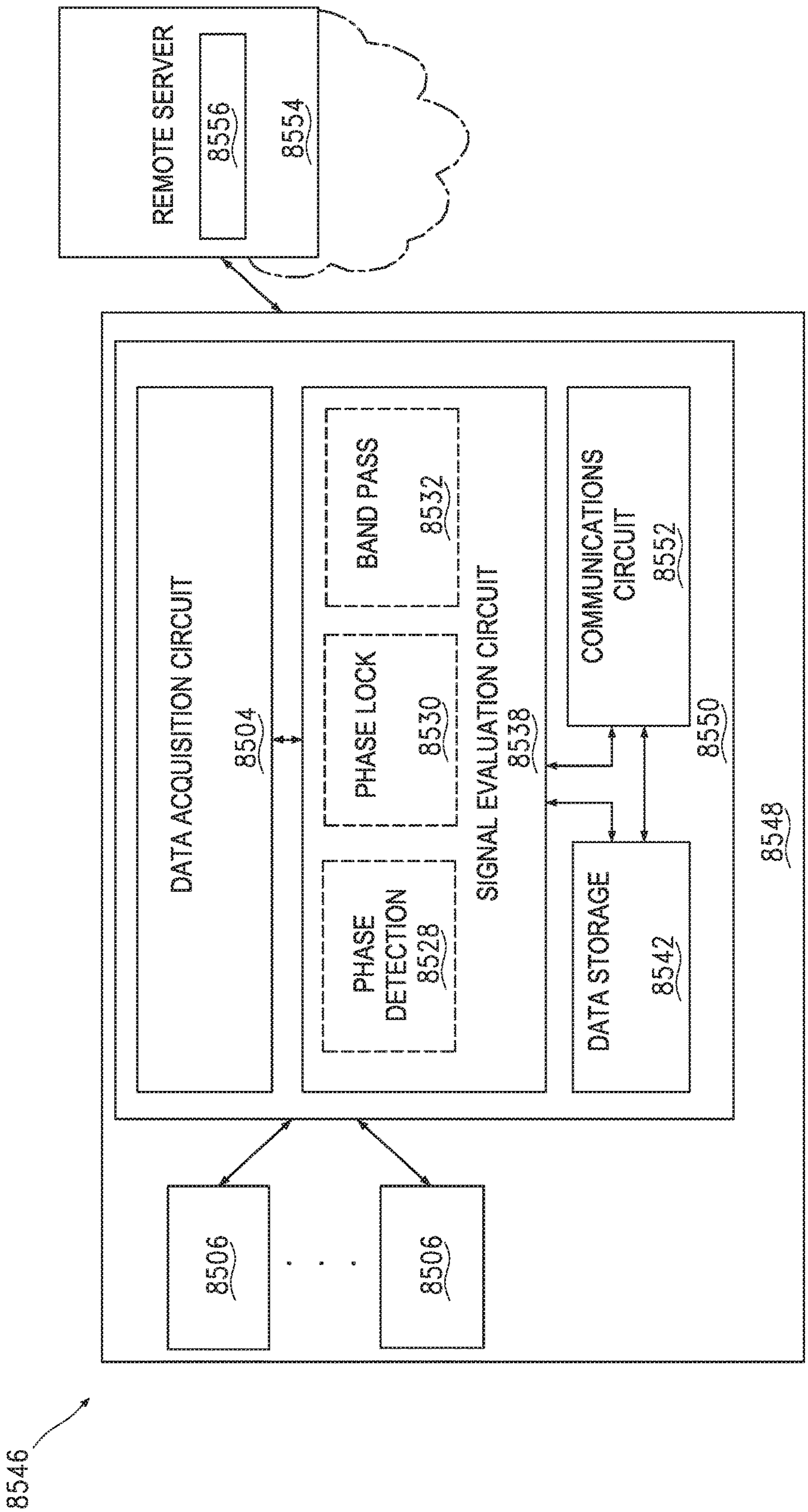
FIG. 64 is a diagrammatic view that depicts embodiments of a system for data collection in accordance with the present disclosure.

In embodiments, as shown in FIG. 64, a data monitoring system 8546 may comprise at least one data monitoring device 8548. The at least one data monitoring device 8548 comprising sensors 8506, a controller 8550 comprising a data acquisition circuit 8504, a signal evaluation circuit 8538, a data storage circuit 8542, and a communications circuit 8552 to allow data and analysis to be transmitted to a monitoring application 8556 on a remote server 8554. The signal evaluation circuit 8538 may comprise at least one of a phase detection circuit 8528, a phase lock loop circuit 8530, and/or a band pass circuit 8532. The signal evaluation circuit 8538 may periodically share data with the communication circuit 8552 for transmittal to the remote server 8554 to enable the tracking of component and equipment performance over time and under varying conditions by a monitoring application 8556. Because relevant operating conditions and/or failure modes may occur as sensor values approach one or more criteria, the signal evaluation circuit 8538 may share data with the communication circuit 8552 for transmittal to the remote server 8554 based on the fit of data relative to one or more criteria. Based on one sensor input meeting or approaching specified criteria or range, the signal evaluation circuit 8538 may share additional data such as RPMs, component loads, temperatures, pressures, vibrations, and the like for transmittal. The signal evaluation circuit 8538 may share data at a higher data rate for transmittal to enable greater granularity in processing on the remote server.

Figure 65:
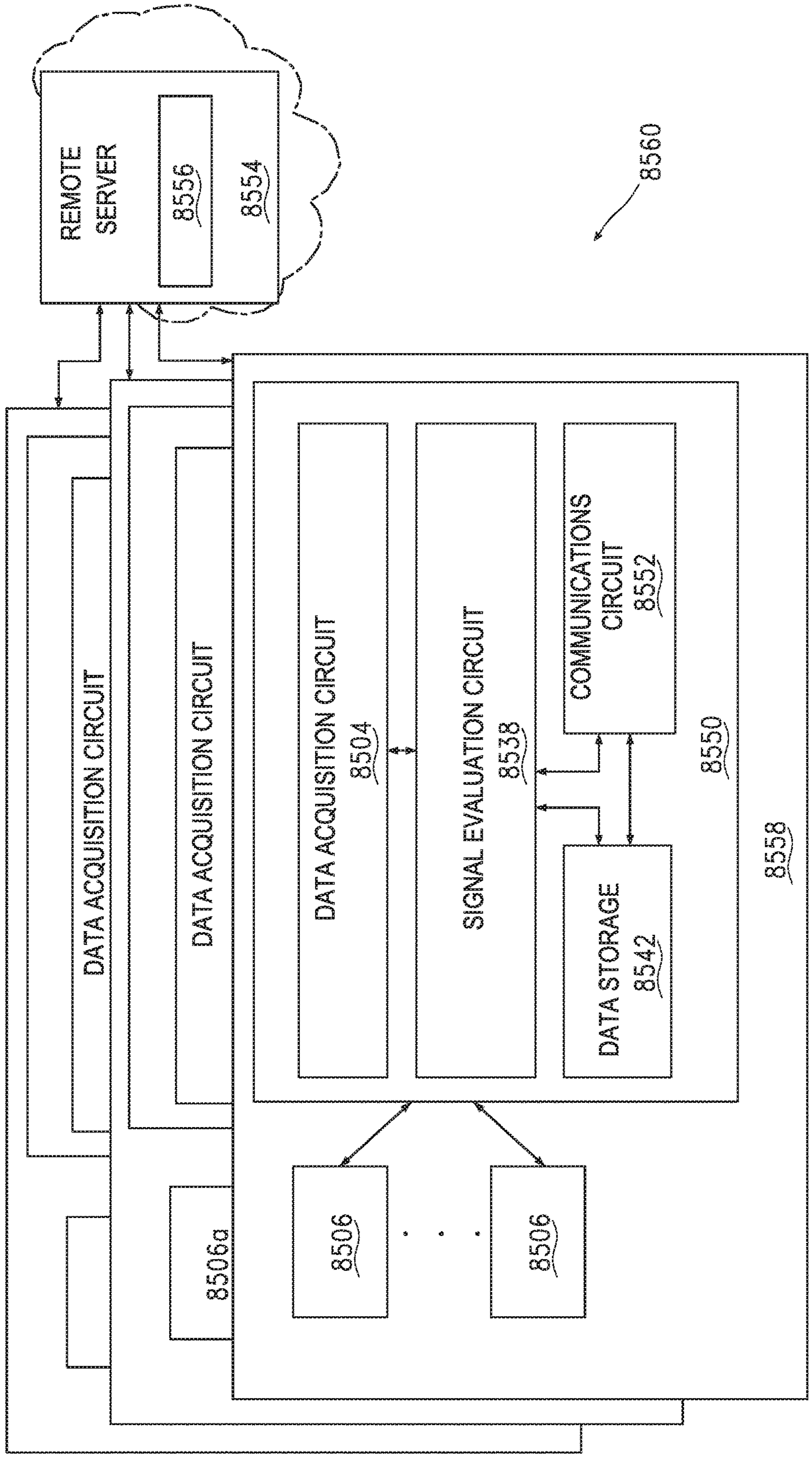
FIG. 65 is a diagrammatic view that depicts embodiments of a system for data collection comprising a plurality of data monitoring devices in accordance with the present disclosure.

In embodiments, as illustrated in FIG. 65, a data collection system 8560 may have a plurality of monitoring devices 8558 collecting data on multiple components in a single piece of equipment, collecting data on the same component across a plurality of pieces of equipment (both the same and different types of equipment) in the same facility, as well as collecting data from monitoring devices in multiple facilities. A monitoring application on a remote server may receive and store the data coming from a plurality of the various monitoring devices. The monitoring application may then select subsets of data which may be jointly analyzed. Subsets of monitoring data may be selected based on data from a single type of component or data from a single type of equipment in which the component is operating. Monitoring data may be selected or grouped based on common operating conditions such as size of load, operational condition (e.g., intermittent, continuous), operating speed or tachometer, common ambient environmental conditions such as humidity, temperature, air or fluid particulate, and the like. Monitoring data may be selected based on the effects of other nearby equipment, such as nearby machines rotating at similar frequencies, nearby equipment producing electromagnetic fields, nearby equipment producing heat, nearby equipment inducing movement or vibration, nearby equipment emitting vapors, chemicals or particulates, or other potentially interfering or intervening effects.

The monitoring application may then analyze the selected data set. For example, data from a single component may be analyzed over different time periods such as one operating cycle, several operating cycles, a month, a year, or the like. Data from multiple components of the same type may also be analyzed over different time periods. Trends in the data such as changes in frequency or amplitude may be correlated with failure and maintenance records associated with the same component or piece of equipment. Trends in the data such as changing rates of change associated with start-up or different points in the process may be identified. Additional data may be introduced into the analysis such as output product quality, output quantity (such as per unit of time), indicated success or failure of a process, and the like. Correlation of trends and values for different types of data may be analyzed to identify those parameters whose short-term analysis might provide the best prediction regarding expected performance. This information may be transmitted back to the monitoring device to update types of data collected and analyzed locally or to influence the design of future monitoring devices.

Figure 66:
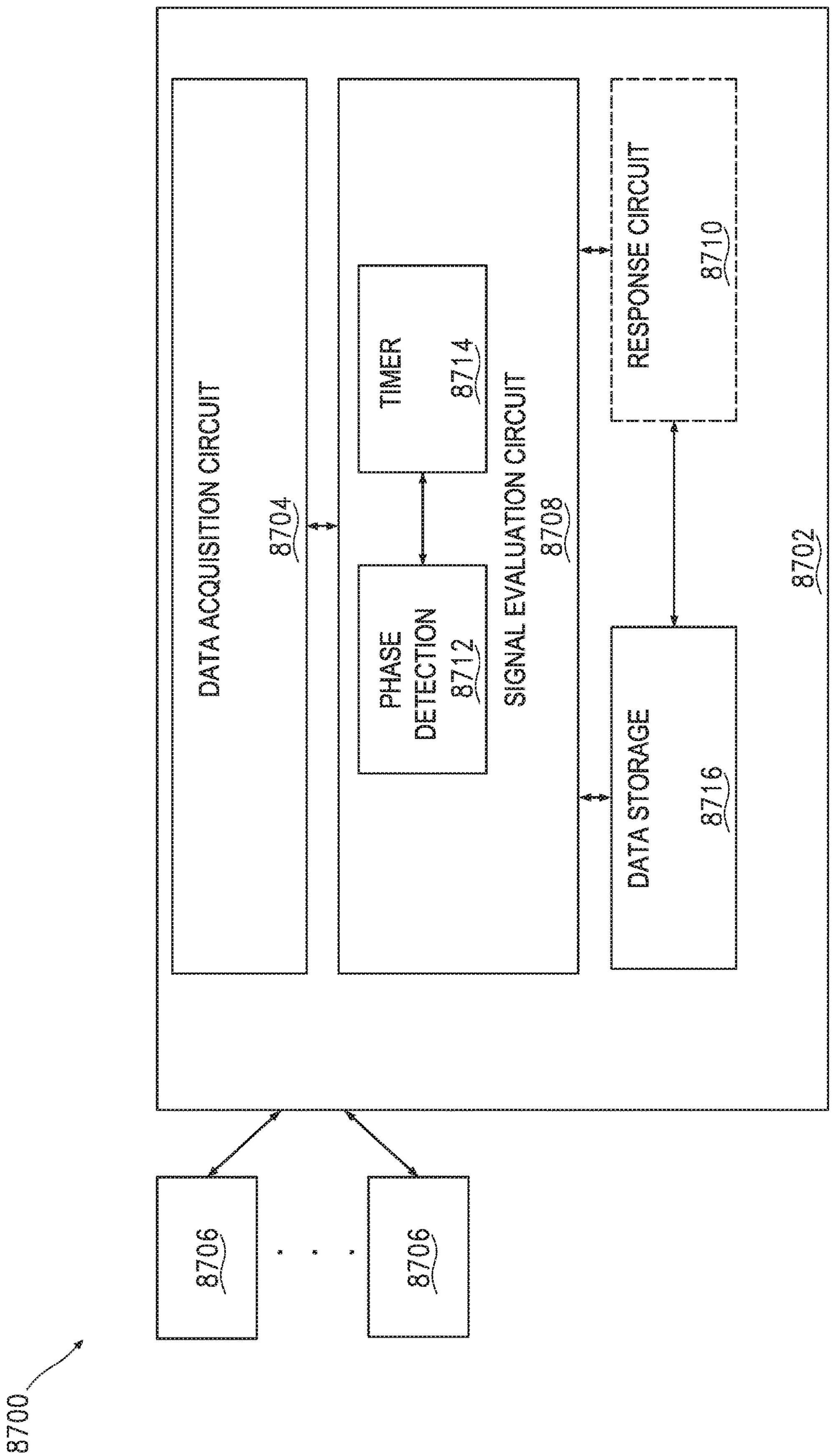
FIG. 66 is a diagrammatic view that depicts embodiments of a data monitoring device in accordance with the present disclosure.
Figure 67:
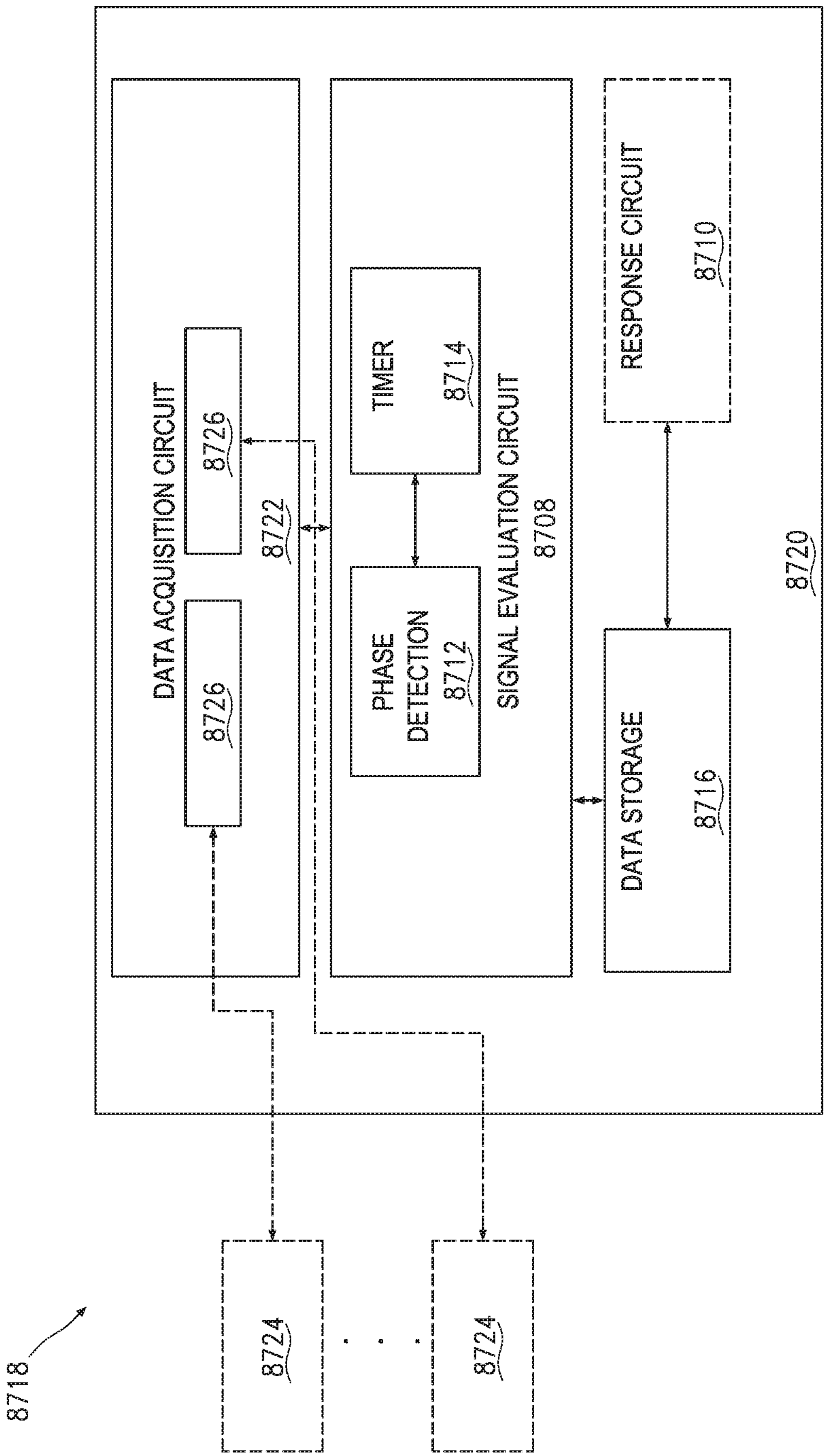
FIGS. 67 and 68 are diagrammatic views that depict embodiments of a data monitoring device in accordance with the present disclosure.
Figure 68:
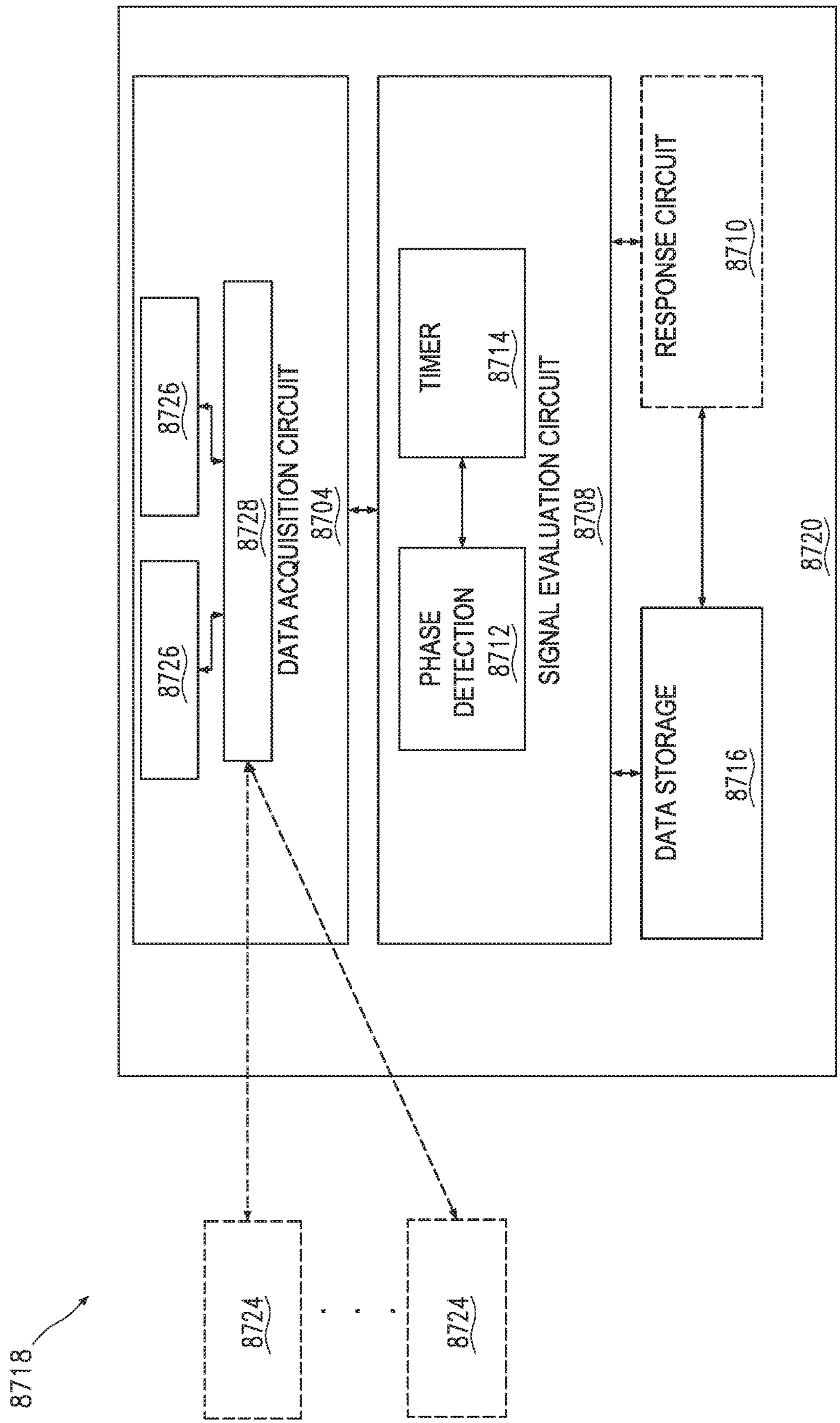

In embodiments, information about the health of a component or piece of industrial equipment may be obtained by comparing the values of multiple signals at the same point in a process. This may be accomplished by aligning a signal relative to other related data signals, timers, or reference signals. An embodiment of a data monitoring device 8700, 8718 is shown in FIGS. 66-68 and may include a controller 8702, 8720. The controller may include a data acquisition circuit 8704, 8722, a signal evaluation circuit 8708, a data storage circuit 8716 and an optional response circuit 8710. The signal evaluation circuit 8708 may comprise a timer circuit 8714 and, optionally, a phase detection circuit 8712.

The data monitoring device may include a plurality of sensors 8706 communicatively coupled to a controller 8702. The plurality of sensors 8706 may be wired to ports on the data acquisition circuit 8704. The plurality of sensors 8706 may be wirelessly connected to the data acquisition circuit 8704 which may be able to access detection values corresponding to the output of at least one of the plurality of sensors 8706 where the sensors 8706 may be capturing data on different operational aspects of a piece of equipment or an operating component. In embodiments, as illustrated in FIGS. 67 and 68, one or more external sensors 8724 which are not explicitly part of a monitoring device 8718 may be opportunistically connected to or accessed by the monitoring device 8718. The data acquisition circuit 8722 may include one or more input ports 8726. The one or more external sensors 8724 may be directly connected to the one or more input ports 8726 on the data acquisition circuit 8722 of the controller 8720. In embodiments, as shown in FIG. 68, a data acquisition circuit 8722 may further comprise a wireless communications circuit 8728 to access detection values corresponding to the one or more external sensors 8724 wirelessly or via a separate source or some combination of these methods.

The selection of the plurality of sensors 8706 8724 for connection to a data monitoring device 8700 8718 designed for a specific component or piece of equipment may depend on a variety of considerations such as accessibility for installing new sensors, incorporation of sensors in the initial design, anticipated operational and failure conditions, resolution desired at various positions in a process or plant, reliability of the sensors, and the like. The impact of a failure, time response of a failure (e.g., warning time and/or off-nominal modes occurring before failure), likelihood of failure, and/or sensitivity required and/or difficulty to detect failed conditions may drive the extent to which a component or piece of equipment is monitored with more sensors and/or higher capability sensors being dedicated to systems where unexpected or undetected failure would be costly or have severe consequences.

The signal evaluation circuit 8708 may process the detection values to obtain information about a component or piece of equipment being monitored. Information extracted by the signal evaluation circuit 8708 may comprise information regarding what point or time in a process corresponds with a detection value where the point in time is based on a timing signal generated by the timer circuit 8714. The start of the timing signal may be generated by detecting an edge of a control signal such as a rising edge, falling edge or both where the control signal may be associated with the start of a process. The start of the timing signal may be triggered by an initial movement of a component or piece of equipment. The start of the timing signal may be triggered by an initial flow through a pipe or opening or by a flow achieving a predetermined rate. The start of the timing signal may be triggered by a state value indicating a process has commenced—for example the state of a switch, button, data value provided to indicate the process has commenced, or the like. Information extracted may comprise information regarding a difference in phase, determined by the phase detection circuit 8712, between a stream of detection value and the time signal generated by the timer circuit 8714. Information extracted may comprise information regarding a difference in phase between one stream of detection values and a second stream of detection values where the first stream of detection values is used as a basis or trigger for a timing signal generated by the timer circuit.

Depending on the type of equipment, the component being measured, the environment in which the equipment is operating and the like, sensors 8706 8724 may comprise one or more of, without limitation, a thermometer, a hygrometer, a voltage sensor, a current sensor, an accelerometer, a velocity detector, a light or electromagnetic sensor (e.g., determining temperature, composition and/or spectral analysis, and/or object position or movement), an image sensor, a displacement sensor, a turbidity meter, a viscosity meter, a load sensor, a tri-axial sensor, a tachometer, a fluid pressure meter, an air flow meter, a horsepower meter, a flow rate meter, a fluid particle detector, an acoustical sensor, a pH sensor, and the like.

The sensors 8706 8724 may provide a stream of data over time that has a phase component, such as acceleration or vibration, allowing for the evaluation of phase or frequency analysis of different operational aspects of a piece of equipment or an operating component. The sensors 8706 8724 may provide a stream of data that is not phase based such as temperature, humidity, load, and the like. The sensors 8706 8724 may provide a continuous or near continuous stream of data over time, periodic readings, event-driven readings, and/or readings according to a selected interval or schedule.

Figure 69:
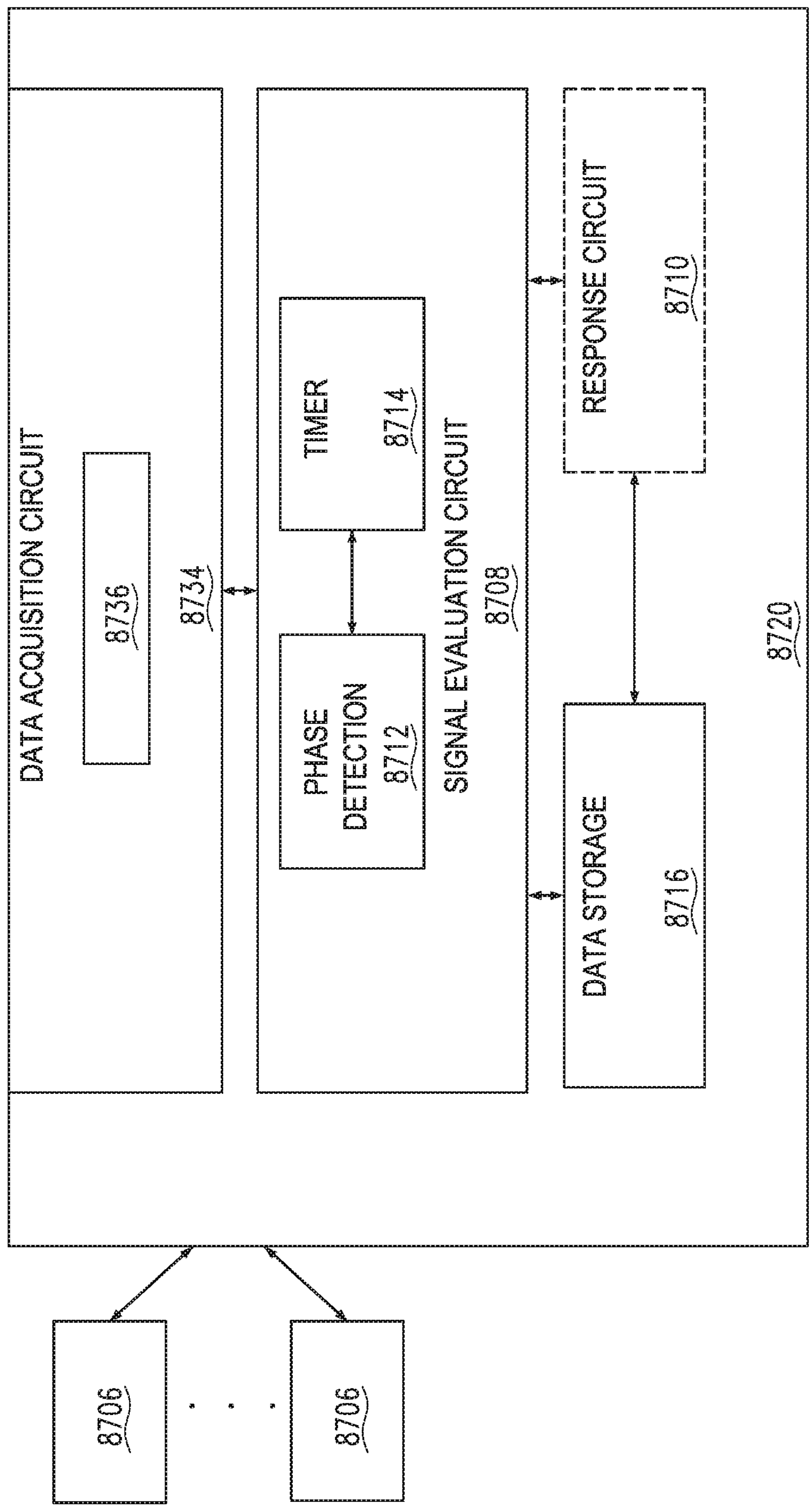
FIGS. 69 and 70 are diagrammatic views that depict embodiments of a data monitoring device in accordance with the present disclosure.
Figure 70:
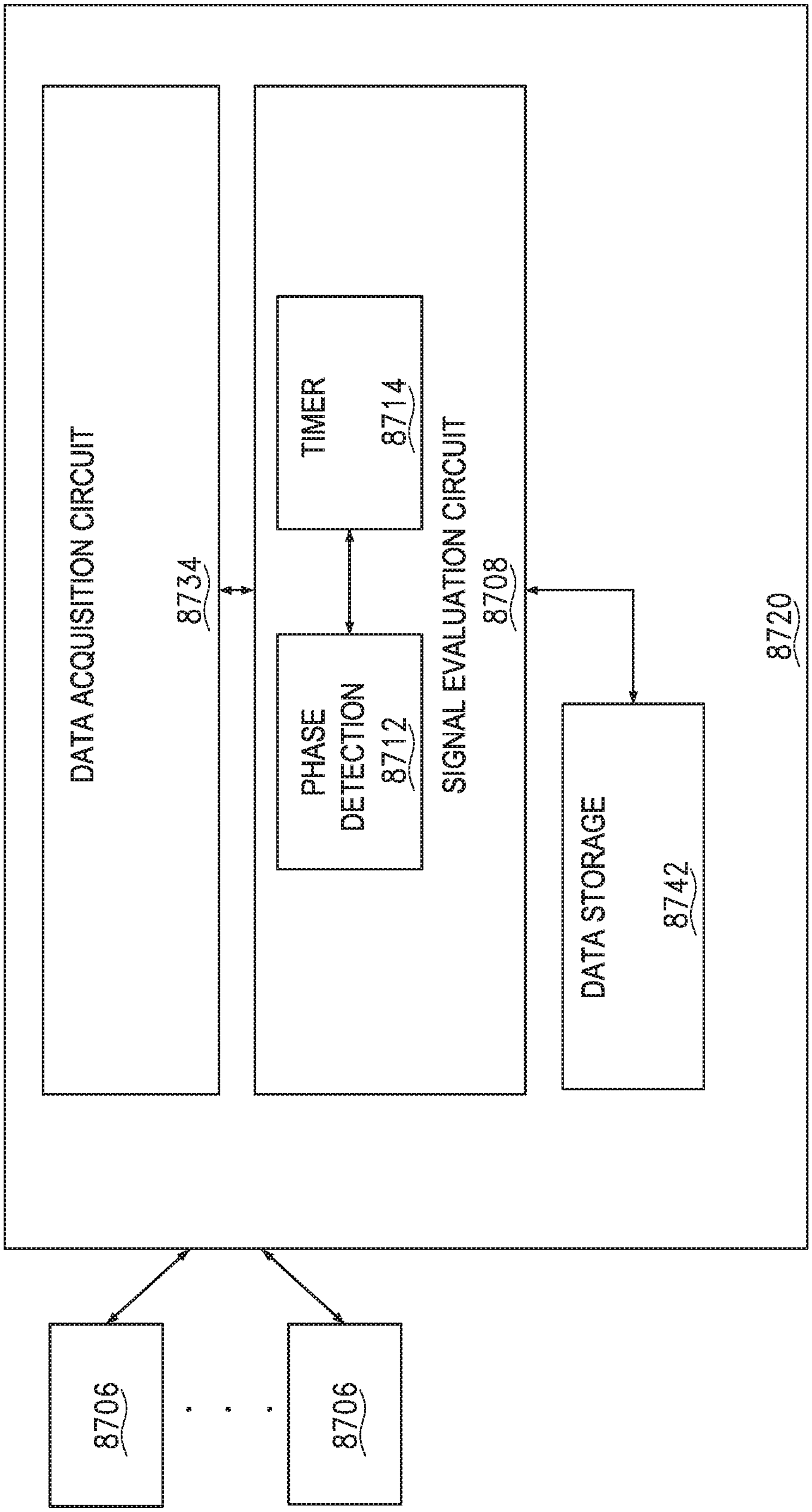

In embodiments, as illustrated in FIGS. 69 and 70, the data acquisition circuit 8734 may further comprise a multiplexer circuit 8736 as described elsewhere herein. Outputs from the multiplexer circuit 8736 may be utilized by the signal evaluation circuit 8708. The response circuit 8710 may have the ability to turn on and off portions of the multiplexer circuit 8736. The response circuit 8710 may have the ability to control the control channels of the multiplexer circuit 8736

The response circuit 8710 may further comprise evaluating the results of the signal evaluation circuit 8708 and, based on certain criteria, initiating an action. The criteria may include a sensor's detection values at certain frequencies or phases relative to the timer signal where the frequencies or phases of interest may be based on the equipment geometry, equipment control schemes, system input, historical data, current operating conditions, and/or an anticipated response. Criteria may include a predetermined maximum or minimum value for a detection value from a specific sensor, a cumulative value of a sensor's corresponding detection value over time, a change in value, a rate of change in value, and/or an accumulated value (e.g., a time spent above/below a threshold value, a weighted time spent above/below one or more threshold values, and/or an area of the detected value above/below one or more threshold values). The criteria may comprise combinations of data from different sensors such as relative values, relative changes in value, relative rates of change in value, relative values over time, and the like. The relative criteria may change with other data or information such as process stage, type of product being processed, type of equipment, ambient temperature and humidity, external vibrations from other equipment, and the like.

Certain embodiments are described herein as detected values exceeding thresholds or predetermined values, but detected values may also fall below thresholds or predetermined values—for example where an amount of change in the detected value is expected to occur, but detected values indicate that the change may not have occurred. For example, and without limitation, vibrational data may indicate system agitation levels, properly operating equipment, or the like, and vibrational data below amplitude and/or frequency thresholds may be an indication of a process that is not operating according to expectations. Except where the context clearly indicates otherwise, any description herein describing a determination of a value above a threshold and/or exceeding a predetermined or expected value is understood to include determination of a value below a threshold and/or falling below a predetermined or expected value.

The predetermined acceptable range may be based on anticipated system response or vibration based on the equipment geometry and control scheme such as number of bearings, relative rotational speed, influx of power to the system at a certain frequency, and the like. The predetermined acceptable range may also be based on long term analysis of detection values across a plurality of similar equipment and components and correlation of data with equipment failure.

In some embodiments, an alert may be issued based on the some of the criteria discussed above. In an illustrative example, an increase in temperature and energy at certain frequencies may indicate a hot bearing that is starting to fail. In embodiments, the relative criteria for an alarm may change with other data or information such as process stage, type of product being processed on equipment, ambient temperature and humidity, external vibrations from other equipment and the like. In an illustrative and non-limiting example, the response circuit 8710 may initiate an alert if a vibrational amplitude and/or frequency exceeds a predetermined maximum value, if there is a change or rate of change that exceeds a predetermined acceptable range, and/or if an accumulated value based on vibrational amplitude and/or frequency exceeds a threshold.

In embodiments, response circuit 8710 may cause the data acquisition circuit 8704 to enable or disable the processing of detection values corresponding to certain sensors based on the some of the criteria discussed above. This may include switching to sensors having different response rates, sensitivity, ranges, and the like; accessing new sensors or types of sensors, and the like. This switching may be implemented by changing the control signals for a multiplexer circuit 8736 and/or by turning on or off certain input sections of the multiplexer circuit 8736. The response circuit 8710 may make recommendations for the replacement of certain sensors in the future with sensors having different response rates, sensitivity, ranges, and the like. The response circuit 8710 may recommend design alterations for future embodiments of the component, the piece of equipment, the operating conditions, the process, and the like.

In embodiments, the response circuit 8710 may recommend maintenance at an upcoming process stop or initiate a maintenance call. The response circuit 8710 may recommend changes in process or operating parameters to remotely balance the piece of equipment. In embodiments, the response circuit 8710 may implement or recommend process changes—for example to lower the utilization of a component that is near a maintenance interval, operating off-nominally, or failed for purpose but still at least partially operational. In an illustrative example, vibration phase information, derived by the phase detection circuit 8712 relative to a timer signal from the timer circuit 8714, may be indicative of a physical location of a problem. Based on the vibration phase information, system design flaws, off-nominal operation, and/or component or process failures may be identified.

In embodiments, based on relevant operating conditions and/or failure modes which may occur in as sensor values approach one or more criteria, the signal evaluation circuit 8708 may store data in the data storage circuit 8716 based on the fit of data relative to one or more criteria. Based on one sensor input meeting or approaching specified criteria or range, the signal evaluation circuit 8708 may store additional data such as RPMs, component loads, temperatures, pressures, vibrations in the data storage circuit 8716. The signal evaluation circuit 8708 may store data at a higher data rate for greater granularity in future processing, the ability to reprocess at different sampling rates, and/or to enable diagnosing or post-processing of system information where operational data of interest is flagged, and the like.

An example monitoring system for data collection, includes a data acquisition circuit structured to interpret a plurality of detection values, each of the plurality of detection values corresponding to at least one of a plurality of input sensors communicatively coupled to the data acquisition circuit; a signal evaluation circuit comprising: a timer circuit structured to generate at least one timing signal; and a phase detection circuit structured to determine a relative phase difference between at least one of the plurality of detection values and at least one of the timing signals from the timer circuit; and a response circuit structured to perform at least one operation in response to the relative phase difference. In certain further embodiments, an example system includes:

wherein the at least one operation is further in response to at least one of: a change in amplitude of at least one of the plurality of detection values; a change in frequency or relative phase of at least one of the plurality of detection values; a rate of change in both amplitude and relative phase of at least one the plurality of detection values; and a relative rate of change in amplitude and relative phase of at least one the plurality of detection values; wherein the at least one operation comprises issuing an alert; wherein the alert may be one of haptic, audible and visual; a data storage circuit, wherein the relative phase difference and at least one of the detection values and the timing signal are stored; wherein the at least one operation further comprises storing additional data in the data storage circuit; wherein the storing additional data in the data storage circuit is further in response to at least one of: a change in the relative phase difference and a relative rate of change in the relative phase difference; wherein the data acquisition circuit further comprises at least one multiplexer circuit (MUX) whereby alternative combinations of detection values may be selected based on at least one of user input and a selected operating parameter for a machine, wherein each of the plurality of detection values corresponds to at least one of the input sensors; wherein the at least one operation comprises enabling or disabling one or more portions of the multiplexer circuit, or altering the multiplexer control lines; wherein the data acquisition circuit comprises at least two multiplexer circuits and the at least one operation comprises changing connections between the at least two multiplexer circuits; and/or the system further comprising a MUX control circuit structured to interpret a subset of the plurality of detection values and provide the logical control of the MUX and the correspondence of MUX input and detected values as a result, wherein the logic control of the MUX comprises adaptive scheduling of the select lines.

An example system for data collection, includes: a data acquisition circuit structured to interpret a plurality of detection values, each of the plurality of detection values corresponding to at least one of a plurality of input sensors communicatively coupled to the data acquisition circuit; a signal evaluation circuit comprising: a timer circuit structured to generate a timing signal based on a first detected value of the plurality of detection values; and a phase detection circuit structured to determine a relative phase difference between a second detection value of the plurality of detection values and the timing signal; and a phase response circuit structured to perform at least one operation in response to the phase difference. In certain further embodiments, an example system includes wherein the at least one operation is further in response to at least one of: a change in amplitude of at least one of the plurality of detection values; a change in frequency or relative phase of at least one of the plurality of detection values; a rate of change in both amplitude and relative phase of at least one the plurality of detection values and a relative rate of change in amplitude and relative phase of at least one the plurality of detection values; wherein the at least one operation comprises issuing an alert; wherein the alert may be one of haptic, audible and visual; where the system, further includes a data storage circuit; wherein the relative phase difference and at least one of the detection values and the timing signal are stored; wherein the at least one operation further includes storing additional data in the data storage circuit; wherein the storing additional data in the data storage circuit is further in response to at least one of: a change in the relative phase difference and a relative rate of change in the relative phase difference; wherein the data acquisition circuit further includes at least one multiplexer (MUX) circuit whereby alternative combinations of detection values may be selected based on at least one of user input and a selected operating parameter for a machine; wherein each of the plurality of detection values corresponds to at least one of the input sensors; wherein the at least one operation comprises enabling or disabling one or more portions of the multiplexer circuit, or altering the multiplexer control lines; wherein the data acquisition circuit comprises at least two multiplexer circuits and the at least one operation comprises changing connections between the at least two multiplexer circuits; where the system further comprising a MUX control circuit structured to interpret a subset of the plurality of detection values and provide the logical control of the MUX and the correspondence of MUX input and detected values as a result; and/or wherein the logic control of the MUX comprises adaptive scheduling of the select lines.

An example system for data collection, processing, and utilization of signals in an industrial environment includes a data acquisition circuit structured to interpret a plurality of detection values, each of the plurality of detection values corresponding to at least one of a plurality of input sensors communicatively coupled to the data acquisition circuit; a signal evaluation circuit comprising: a timer circuit structured to generate a timing signal based on a first detected value of the plurality of detection values; and a phase detection circuit structured to determine a relative phase difference between a second detection value of the plurality of detection values and the timing signal; a data storage facility for storing a subset of the plurality of detection values and the timing signal; a communication circuit structured to communicate at least one selected detection value and the timing signal to a remote server; and a monitoring application on the remote server structured to receive the at least one selected detection value and the timing signal; jointly analyze a subset of the detection values received from the plurality of monitoring devices; and recommend an action. In certain embodiments, the example system further includes wherein joint analysis comprises using the timing signal from each of the plurality of monitoring devices to align the detection values from the plurality of monitoring devices and/or wherein the subset of detection values is selected based on data associated with a detection value comprising at least one: common type of component, common type of equipment, and common operating conditions.

An example system for data collection in an industrial environment, includes: a data acquisition circuit structured to interpret a plurality of detection values, each of the plurality of detection values corresponding to at least one of a plurality of input sensors communicatively coupled to the data acquisition circuit, the data acquisition circuit comprising a multiplexer circuit whereby alternative combinations of the detection values may be selected based on at least one of user input, a detected state and a selected operating parameter for a machine, each of the plurality of detection values corresponding to at least one of the input sensors; a signal evaluation circuit comprising: a timer circuit structured to generate a timing signal; and a phase detection circuit structured to determine a relative phase difference between at least one of the plurality of detection values and a signal from the timer circuit; and a response circuit structured to perform at least one operation in response to the phase difference.

An example monitoring system for data collection in a piece of equipment, includes a data acquisition circuit structured to interpret a plurality of detection values, each of the plurality of detection values corresponding to at least one of a plurality of input sensors communicatively coupled to the data acquisition circuit; a timer circuit structured to generate a timing signal based on a first detected value of the plurality of detection values; a signal evaluation circuit structured to obtain at least one of vibration amplitude, vibration frequency and vibration phase location corresponding to a second detected value comprising: a phase detection circuit structured to determine a relative phase difference between a second detection value of the plurality of detection values and the timing signal; and a response circuit structured to perform at least one operation in response to at the at least one of the vibration amplitude, vibration frequency and vibration phase location.

A monitoring system for bearing analysis in an industrial environment, the monitoring device includes: a data acquisition circuit structured to interpret a plurality of detection values, each of the plurality of detection values corresponding to at least one of a plurality of input sensors communicatively coupled to the data acquisition circuit; a timer circuit structured to generate a timing signal a data storage for storing specifications and anticipated state information for a plurality of bearing types and buffering the plurality of detection values for a predetermined length of time; a timer circuit structured to generate a timing signal based on a first detected value of the plurality of detection values; a bearing analysis circuit structured to analyze buffered detection values relative to specifications and anticipated state information resulting in a life prediction comprising: a phase detection circuit structured to determine a relative phase difference between a second detection value of the plurality of detection values and the timing signal; a signal evaluation circuit structured to obtain at least one of vibration amplitude, vibration frequency and vibration phase location corresponding to a second detected value: and a response circuit structured to perform at least one operation in response to at the at least one of the vibration amplitude, vibration frequency and vibration phase location.

Figure 230:
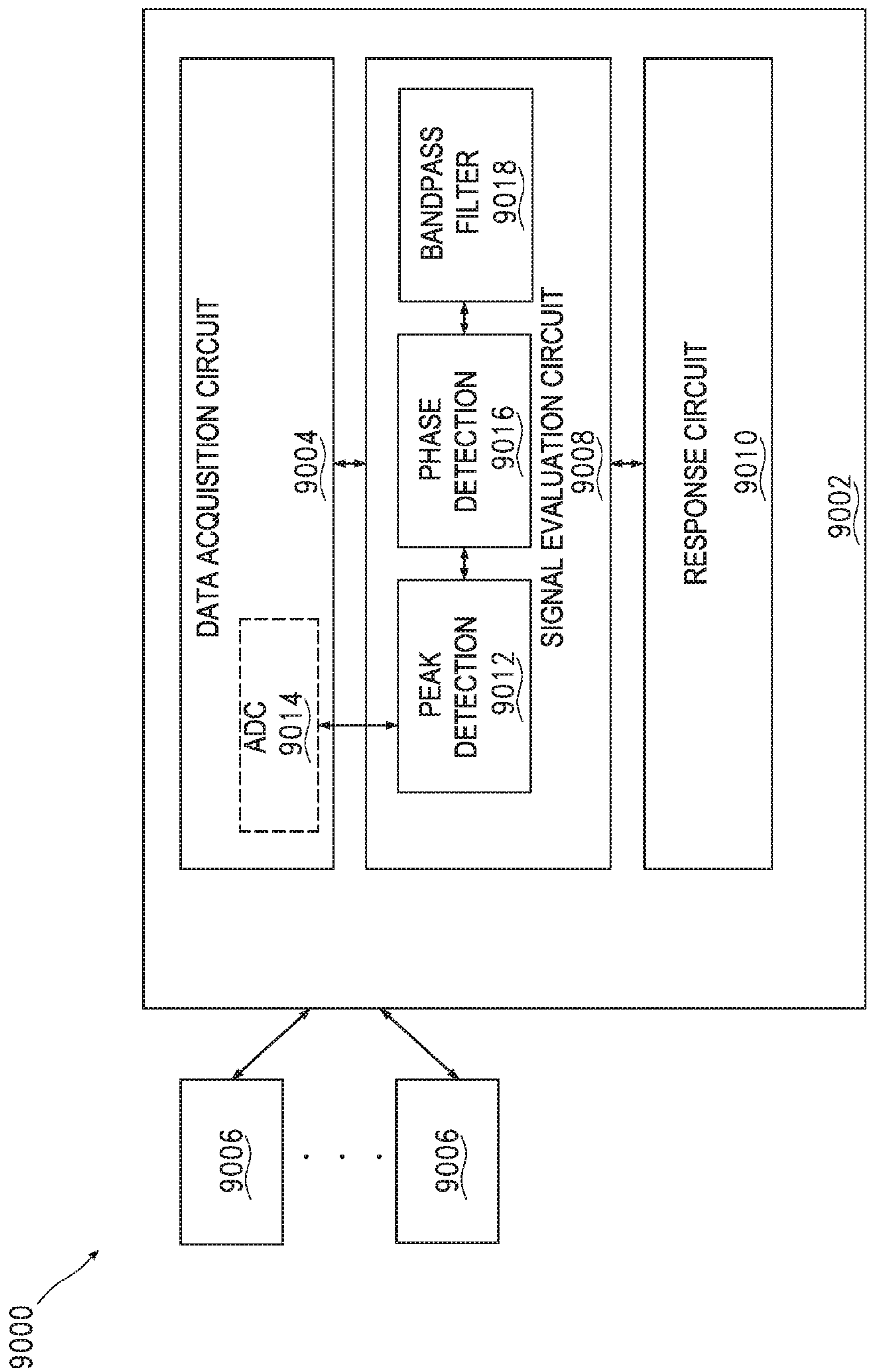

In embodiments, information about the health or other status or state information of or regarding a component or piece of industrial equipment may be obtained by monitoring the condition of various components throughout a process. Monitoring may include monitoring the amplitude of a sensor signal measuring attributes such as temperature, humidity, acceleration, displacement and the like. As in FIG. 230, an embodiment of a data monitoring device 9000 may include a plurality of sensors 9006 communicatively coupled to a controller 9002. The controller 9002, which may be part of a data collection device, such as a mobile data collector, or part of a system, such as a network-deployed or cloud-deployed system, may include a data acquisition circuit 9004, a signal evaluation circuit 9008 and a response circuit 9010. The signal evaluation circuit 9008 may comprise a peak detection circuit 9012. Additionally, the signal evaluation circuit 9008 may optionally comprise one or more of a phase detection circuit 9016, a bandpass filter circuit 9018, a phase lock loop circuit, a torsional analysis circuit, a bearing analysis circuit, and the like. The bandpass filter 9018 may be used to filter a stream of detection values such that values, such as peaks and valleys, are detected only at or within bands of interest, such as frequencies of interest. The data acquisition circuit 9004 may include one or more analog-to-digital converter circuits 9014. A peak amplitude detected by the peak detection circuit 9012 may be input into one or more analog-to-digital converter circuits 9014 to provide a reference value for scaling output of the analog-to-digital converter circuits 9014 appropriately.

The plurality of sensors 9006 may be wired to ports on the data acquisition circuit 9004. The plurality of sensors 9006 may be wirelessly connected to the data acquisition circuit 9004. The data acquisition circuit 9004 may be able to access detection values corresponding to the output of at least one of the plurality of sensors 9006 where the sensors 9006 may be capturing data on different operational aspects of a piece of equipment or an operating component.

The selection of the plurality of sensors 9006 for a data monitoring device 9000 designed for a specific component or piece of equipment may depend on a variety of considerations such as accessibility for installing new sensors, incorporation of sensors in the initial design, anticipated operational and failure conditions, resolution desired at various positions in a process or plant, reliability of the sensors, power availability, power utilization, storage utilization, and the like. The impact of a failure, time response of a failure (e.g., warning time and/or off-optimal modes occurring before failure), likelihood of failure, extent of impact of failure, and/or sensitivity required and/or difficulty to detection failure conditions may drive the extent to which a component or piece of equipment is monitored with more sensors and/or higher capability sensors being dedicated to systems where unexpected or undetected failure would be costly or have severe consequences.

The signal evaluation circuit 9008 may process the detection values to obtain information about a component or piece of equipment being monitored. Information extracted by the signal evaluation circuit 9008 may comprise information regarding a peak value of a signal such as a peak temperature, peak acceleration, peak velocity, peak pressure, peak weight bearing, peak strain, peak bending, or peak displacement. The peak detection may be done using analog or digital circuits. In embodiments, the peak detection circuit 9012 may be able to distinguish between "local" or short term peaks in a stream of detection values and a "global" or longer term peak. In embodiments, the peak detection circuit 9012 may be able to identify peak shapes (not just a single peak value) such as flat tops, asymptotic approaches, discrete jumps in the peak value or rapid/steep climbs in peak value, sinusoidal behavior within ranges and the like. Flat topped peaks may indicate saturation at of a sensor. Asymptotic approaches to a peak may indicate linear system behavior. Discrete jumps in value or steep changes in peak value may indicate quantized or nonlinear behavior of either the sensor doing the measurement or the behavior of the component. In embodiments, the system may be able to identify sinusoidal variations in the peak value within an envelope, such as an envelope established by line or curve connecting a series of peak values. It should be noted that references to "peaks" should be understood to encompass one or more "valleys," representing a series of low points in measurement, except where context indicates otherwise.

In embodiments, a peak value may be used as a reference for an analog-to-digital conversion circuit 9014.

In an illustrative and non-limiting example, a temperature probe may measure the temperature of a gear as it rotates in a machine. The peak temperature may be detected by a peak detection circuit 9012. The peak temperature may be fed into an analog-to-digital converter circuit 9014 to appropriately scale a stream of detection values corresponding to temperature readings of the gear as it rotates in a machine. The phase of the stream of detection values corresponding to temperature relative to an orientation of the gear may be determined by the phase detection circuit 9016. Knowing where in the rotation of the gear a peak temperature is occurring may allow the identification of a bad gear tooth.

In some embodiments, two or more sets of detection values may be fused to create detection values for a virtual sensor. A peak detection circuit may be used to verify consistency in timing of peak values between at least one of the two or more sets of detection values and the detection values for the virtual sensor.

In embodiments, the signal evaluation circuit 9008 may be able to reset the peak detection circuit 9012 upon start-up of the monitoring device 9000, upon edge detection of a control signal of the system being monitored, based on a user input, after a system error and the like. In embodiments, the signal evaluation circuit 9008 may discard an initial portion of the output of the peak detection circuit 9012 prior to using the peak value as a reference value for an analog-to-digital conversion circuit to allow the system to fully come on line.

Depending on the type of equipment, the component being measured, the environment in which the equipment is operating and the like, sensors 9006 may comprise one or more of, without limitation, a vibration sensor, a thermometer, a hygrometer, a voltage sensor, a current sensor, an accelerometer, a velocity detector, a light or electromagnetic sensor (e.g., determining temperature, composition and/or spectral analysis, and/or object position or movement), an image sensor, a structured light sensor, a laser-based image sensor, an acoustic wave sensor, a displacement sensor, a turbidity meter, a viscosity meter, a load sensor, a tri-axial sensor, an accelerometer, a tachometer, a fluid pressure meter, an air flow meter, a horsepower meter, a flow rate meter, a fluid particle detector, an acoustical sensor, a pH sensor, and the like, including, without limitation, any of the sensors described throughout this disclosure and the documents incorporated by reference.

The sensors 9006 may provide a stream of data over time that has a phase component, such as relating to acceleration or vibration, allowing for the evaluation of phase or frequency analysis of different operational aspects of a piece of equipment or an operating component. The sensors 9006 may provide a stream of data that is not conventionally phase-based, such as temperature, humidity, load, and the like. The sensors 9006 may provide a continuous or near continuous stream of data over time, periodic readings, event-driven readings, and/or readings according to a selected interval or schedule.

Figure 71:
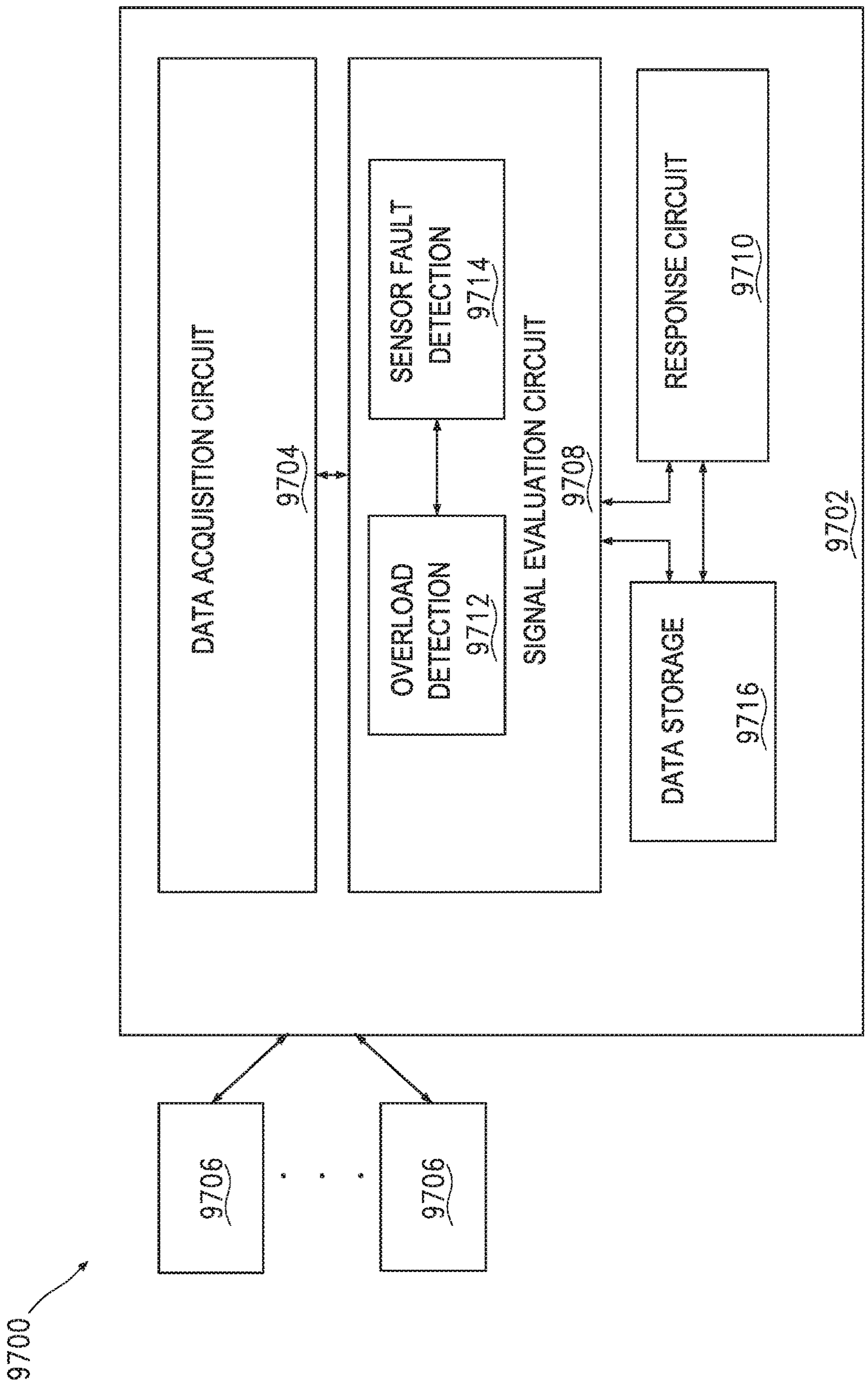
FIG. 71 is a diagrammatic view that depicts embodiments of a data monitoring device in accordance with the present disclosure.
Figure 72:
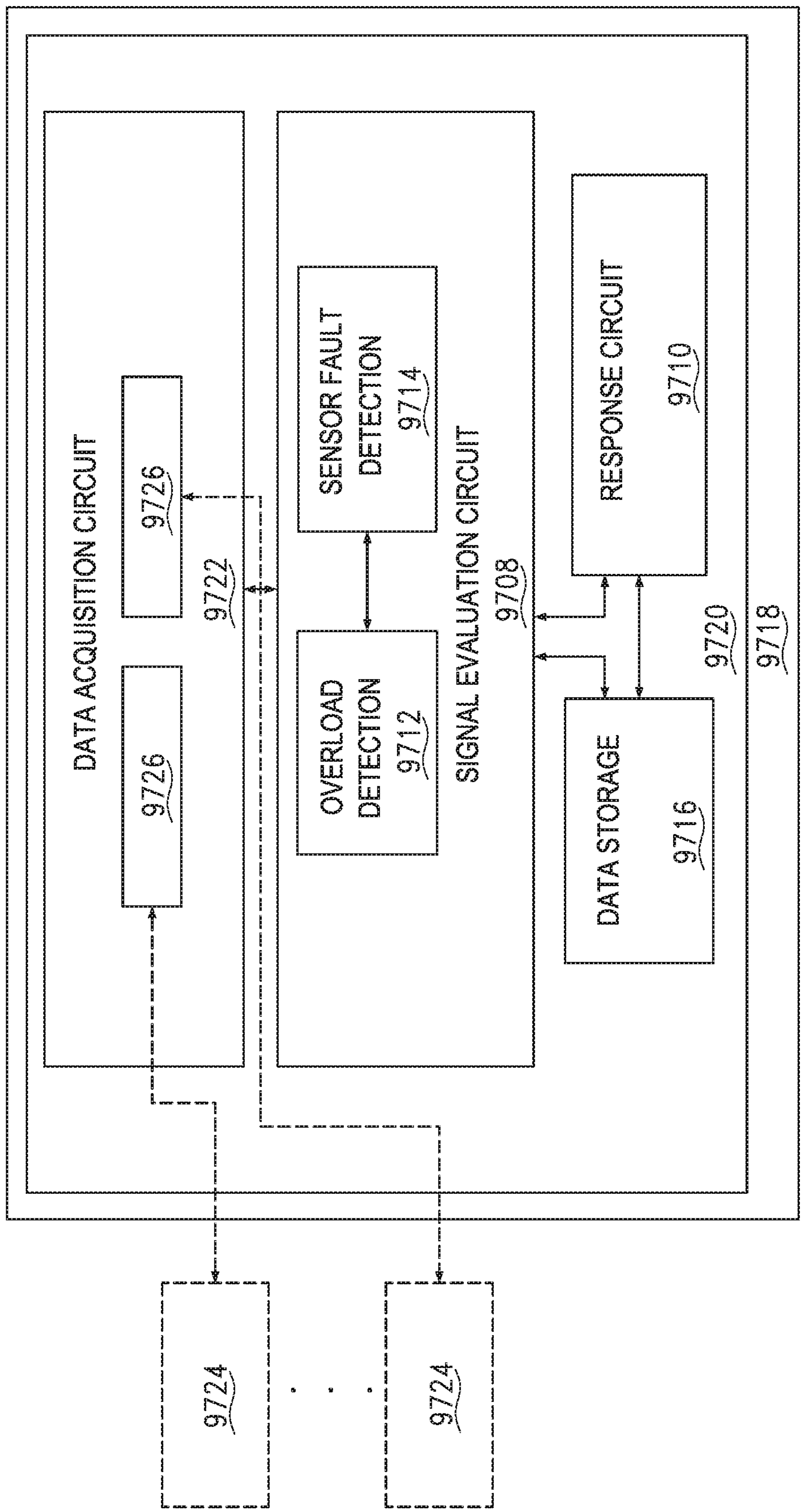
FIGS. 72 and 73 are diagrammatic views that depict embodiments of a data monitoring device in accordance with the present disclosure.
Figure 73:
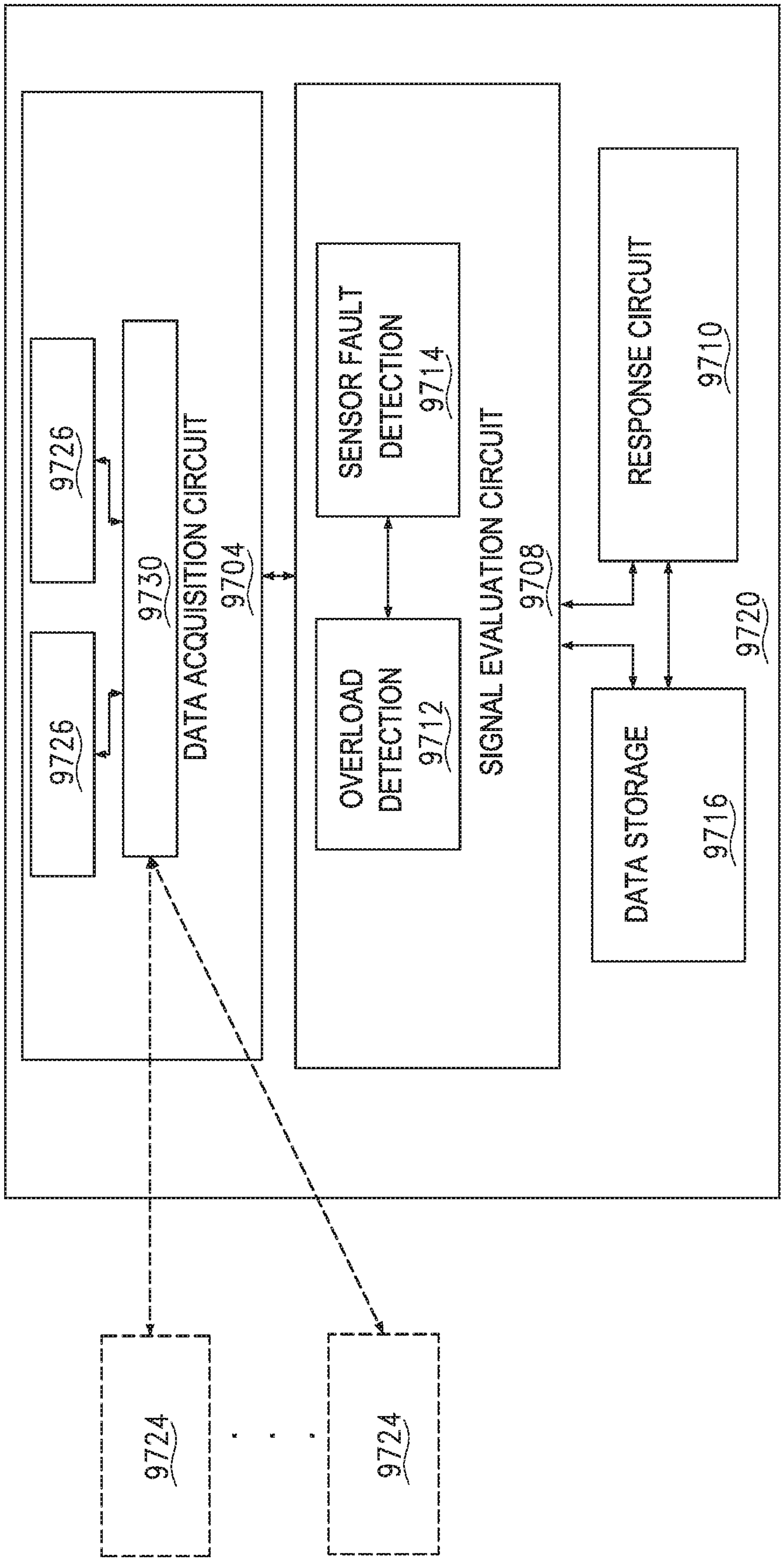

In embodiments, as illustrated in FIG. 71, the sensors 9706 may be part of the data monitoring device 9700, referred to herein in some cases as a data collector, which in some cases may comprise a mobile or portable data collector. In embodiments, as illustrated in FIGS. 72 and 73, one or more external sensors 9724, which are not explicitly part of a monitoring device 9718 but rather are new, previously attached to or integrated into the equipment or component, may be opportunistically connected to or accessed by the monitoring device 9718. The monitoring device may include a data acquisition circuit 9722, a signal evaluation circuit 9708, a data storage circuit 9716 and a response circuit 9710. The signal evaluation circuit 9708 may comprise an overload detection circuit 9712, a sensor fault detection circuit 9714, or both. Additionally, the signal evaluation circuit 9708 may optionally comprise one or more of a peak detection circuit, a phase detection circuit, a bandpass filter circuit, a frequency transformation circuit, a frequency analysis circuit, a phase lock loop circuit, a torsional analysis circuit, a bearing analysis circuit, and the like. The data acquisition circuit 9722 may include one or more input ports 9726.

The one or more external sensors 9724 may be directly connected to the one or more input ports 9726 on the data acquisition circuit 9722 of the controller 9720 or may be accessed by the data acquisition circuit 9722 wirelessly, such as by a reader, interrogator, or other wireless connection, such as over a short-distance wireless protocol. In embodiments, as shown in FIG. 73, a data acquisition circuit 9722 may further comprise a wireless communication circuit 9730. The data acquisition circuit 9722 may use the wireless communication circuit 9730 to access detection values corresponding to the one or more external sensors 9724 wirelessly or via a separate source or some combination of these methods.

In embodiments, the data storage circuit 9716 may be structured to store sensor specifications, anticipated state information and detected values. The data storage circuit 9716 may provide specifications and anticipated state information to the signal evaluation circuit 9708.

In embodiments, an overload detection circuit 9712 may detect sensor overload by comparing the detected value associated with the sensor with a detected value associated with a sensor having a greater range/lower resolution monitoring the same component/attribute. Inconsistencies in measured value may indicate that the higher resolution sensor may be overloaded. In embodiments, an overload detection circuit 9712 may detect sensor overload by evaluating consistency of sensor reading with readings from other sensor data (monitoring the same or different aspects of the component/piece of equipment. In embodiments, an overload detection circuit 9712 may detect sensor overload by evaluating data collected by other sensors to identify conditions likely to result in sensor overload (e.g., heat flux sensor data indicative of the likelihood of overloading a sensor in a given location, accelerometer data indicating a likelihood of overloading a velocity sensor, and the like). In embodiments, an overload detection circuit 9712 may detect sensor overload by identifying flat line output following a rising trend. In embodiments, an overload detection circuit 9712 may detect sensor overload by transforming the sensor data to frequency data, using for example a Fast Fourier Transform (FFT), and then looking for a "ski-jump" in the frequency data which may result from the data being clipped due to an overloaded sensor. A sensor fault detection circuit 9714 may identify failure of the sensor itself, sensor health, or potential concerns regarding validity of sensor data. Rate of value change may be used to identify failure of the sensor itself. For example, a sudden jump to a maximum output may indicate a failure in the sensor rather than an overload of the sensor. In embodiments, an overload detection circuit 9712 and/or a sensor fault detection circuit 9712 may utilize sensor specifications, anticipated state information, sensor models and the like in the identification of sensor overload, failure, error, invalid data, and the like. In embodiments, the overload detection circuit 9712 or the sensor fault detection circuit 9714 may use detection values from other sensors and output from additional components such as a peak detection circuit and/or a phase detection circuit and/or a bandpass filter circuit and/or a frequency transformation circuit and/or a frequency analysis circuit and/or a phase lock loop circuit and the like to identify potential sources for the identified sensor overload, sensor faults, sensor failure, or the like. Sources or factors involved in sensor overload may include limitations on sensor range, sensor resolution, and sensor sampling frequency. Sources of apparent sensor overload may be due to a range, resolution or sampling frequency of a multiplexor suppling detection values associated with the sensor. Sources of factors involved in apparent sensor faults or failures may include environmental conditions; for example, excessive heat or cold may be associated with damage to semiconductor-based sensors, which may result in erratic sensor data, failure of a sensor to produce data, data that appears out of the range of normal behavior (e.g., large, discrete jumps in temperature for a system that does not normally experience such changes). Surges in current and/or voltage may be associated with damage to electrically connected sensors with sensitive components. Excessive vibration may result in physical damage to sensitive components of a sensor such as wires and/or connectors. An impact, which may be indicated by sudden acceleration or acoustical data may result in physical damage to a sensor with sensitive components such as wires and/or connectors. A rapid increase in humidity in the environment surrounding a sensor or an absence of oxygen may indicate water damage to a sensor. A sudden absence of signal from a sensor may be indicative of sensor disconnection which may due to vibration, impact and the like. A sensor that requires power may run out of battery power or be disconnected from a power source. In embodiments, the overload detection circuit 9712 or the sensor fault detection circuit 9714 may output a sensor status where the sensor status may be one of sensor overload, sensor failure, sensor fault, sensor healthy, and the like. The sensor fault detection circuit 9714 may determine one of a sensor fault status and a sensor validity status.

Figure 74:
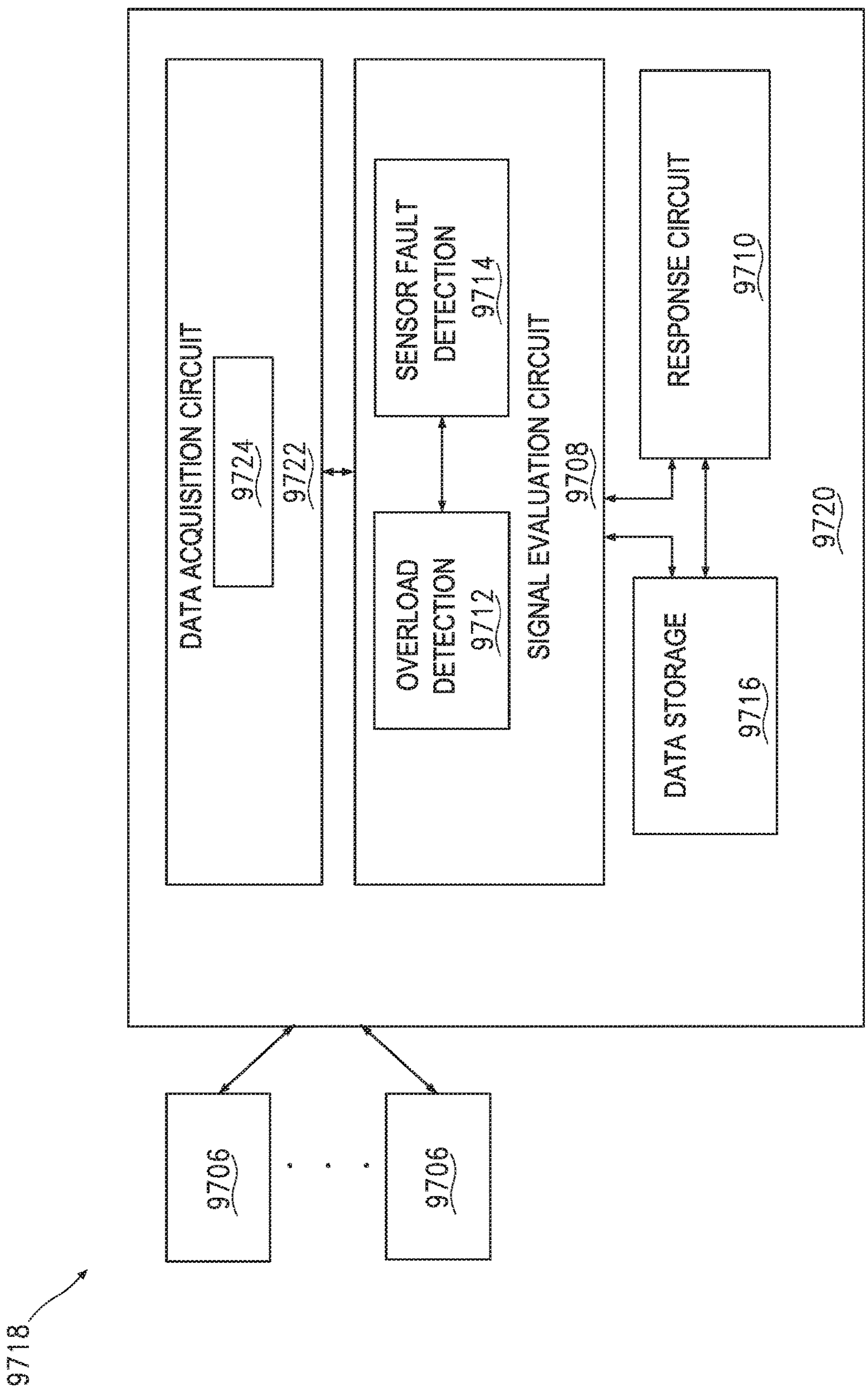
FIG. 74 is a diagrammatic view that depicts embodiments of a data monitoring device in accordance with the present disclosure.

In embodiments, as illustrated in FIG. 74, the data acquisition circuit 9722 may further comprise a multiplexer circuit 9731 as described elsewhere herein. Outputs from the multiplexer circuit 9731 may be utilized by the signal evaluation circuit 9708. The response circuit 9710 may have the ability to turn on or off portions of the multiplexor circuit 9731. The response circuit 9710 may have the ability to control the control channels of the multiplexor circuit 9731.

In embodiments, the response circuit 9710 may initiate a variety of actions based on the sensor status provided by the overload detection circuit 9712. The response circuit 9710 may continue using the sensor if the sensor status is "sensor healthy." The response circuit 9710 may adjust a sensor scaling value (e.g., from 100 mV/gram to 10 mV/gram). The response circuit 9710 may increase an acquisition range for an alternate sensor. The response circuit 9710 may back sensor data out of previous calculations and evaluations such as bearing analysis, torsional analysis and the like. The response circuit 9710 may use projected or anticipated data (based on data acquired prior to overload/failure) in place of the actual sensor data for calculations and evaluations such as bearing analysis, torsional analysis and the like. The response circuit 9710 may issue an alarm. The response circuit 9710 may issue an alert that may comprise notification that the sensor is out of range together with information regarding the extent of the overload such as "overload range-data response may not be reliable and/or linear", "destructive range–sensor may be damaged," and the like. The response circuit 9710 may issue an alert where the alert may comprise information regarding the effect of sensor load such as "unable to monitor machine health" due to sensor overload/failure," and the like.

In embodiments, the response circuit 9710 may cause the data acquisition circuit 9704 to enable or disable the processing of detection values corresponding to certain sensors based on the sensor statues described above. This may include switching to sensors having different response rates, sensitivity, ranges, and the like; accessing new sensors or types of sensors, accessing data from multiple sensors, recruiting additional data collectors (such as routing the collectors to a point of work, using routing methods and systems disclosed throughout this disclosure and the documents incorporated by reference) and the like. Switching may be undertaken based on a model, a set of rules, or the like. In embodiments, switching may be under control of a machine learning system, such that switching is controlled based on one or more metrics of success, combined with input data, over a set of trials, which may occur under supervision of a human supervisor or under control of an automated system. Switching may involve switching from one input port to another (such as to switch from one sensor to another). Switching may involve altering the multiplexing of data, such as combining different streams under different circumstances. Switching may involve activating a system to obtain additional data, such as moving a mobile system (such as a robotic or drone system), to a location where different or additional data is available (such as positioning an image sensor for a different view or positioning a sonar sensor for a different direction of collection) or to a location where different sensors can be accessed (such as moving a collector to connect up to a sensor that is disposed at a location in an environment by a wired or wireless connection). This switching may be implemented by changing the control signals for a multiplexor circuit 9731 and/or by turning on or off certain input sections of the multiplexor circuit 9731.

In embodiments, the response circuit 9710 may make recommendations for the replacement of certain sensors in the future with sensors having different response rates, sensitivity, ranges, and the like. The response circuit 9710 may recommend design alterations for future embodiments of the component, the piece of equipment, the operating conditions, the process, and the like.

In embodiments, the response circuit 9710 may recommend maintenance at an upcoming process stop or initiate a maintenance call where the maintenance may include the replacement of the sensor with the same or an alternate type of sensor having a different response rate, sensitivity, range and the like. In embodiments, the response circuit 9710 may implement or recommend process changes—for example to lower the utilization of a component that is near a maintenance interval, operating off-nominally, or failed for purpose but still at least partially operational, to change the operating speed of a component (such as to put it in a lower-demand mode), to initiate amelioration of an issue (such as to signal for additional lubrication of a roller bearing set, or to signal for an alignment process for a system that is out of balance), and the like.

In embodiments, the signal evaluation circuit 9708 and/or the response circuit 9710 may periodically store certain detection values in the data storage circuit 9716 to enable the tracking of component performance over time. In embodiments, based on sensor status, as described elsewhere herein recently measured sensor data and related operating conditions such as RPMs, component loads, temperatures, pressures, vibrations or other sensor data of the types described throughout this disclosure in the data storage circuit 9716 to enable the backing out of overloaded/failed sensor data. The signal evaluation circuit 9708 may store data at a higher data rate for greater granularity in future processing, the ability to reprocess at different sampling rates, and/or to enable diagnosing or post-processing of system information where operational data of interest is flagged, and the like.

In embodiments as shown in FIGS. 75, 76, 77, and 78, a data monitoring system 9726 may include at least one data monitoring device 9728. At least one data monitoring device 9728 may include sensors 9706 and a controller 9730 comprising a data acquisition circuit 9704, a signal evaluation circuit 9708, a data storage circuit 9716, and a communication circuit 9754 to allow data and analysis to be transmitted to a monitoring application 9736 on a remote server 9734. The signal evaluation circuit 9708 may include at least an overload detection circuit 9712. The signal evaluation circuit 9708 may periodically share data with the communication circuit 9732 for transmittal to the remote server 9734 to enable the tracking of component and equipment performance over time and under varying conditions by a monitoring application 9736. Based on the sensor status, the signal evaluation circuit 9708 and/or response circuit 9710 may share data with the communication circuit 9732 for transmittal to the remote server 9734 based on the fit of data relative to one or more criteria. Data may include recent sensor data and additional data such as RPMs, component loads, temperatures, pressures, vibrations, and the like for transmittal. The signal evaluation circuit 9708 may share data at a higher data rate for transmittal to enable greater granularity in processing on the remote server.

Figure 75:
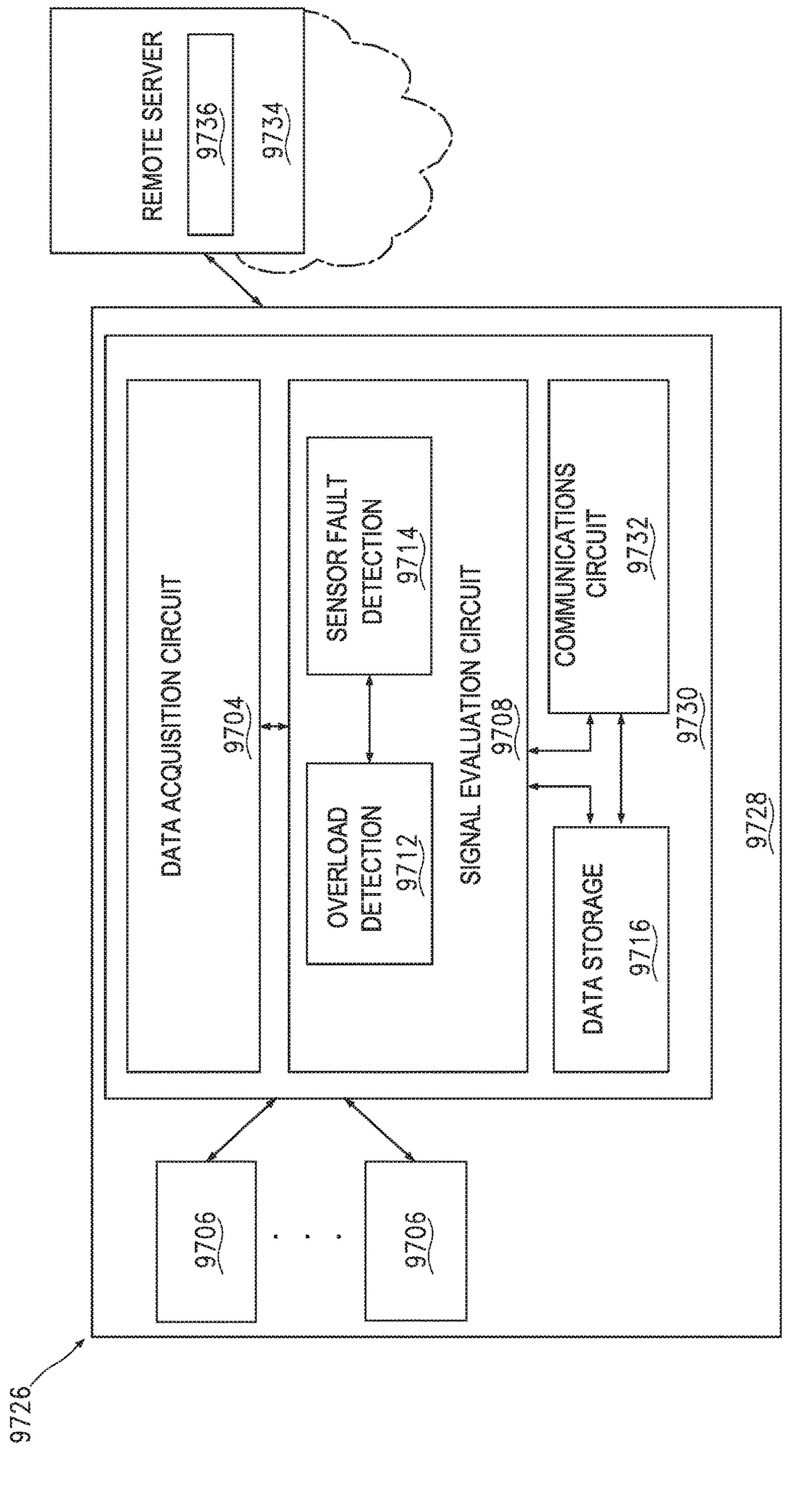
FIGS. 75 and 76 are diagrammatic views that depict embodiments of a system for data collection in accordance with the present disclosure.
Figure 76:
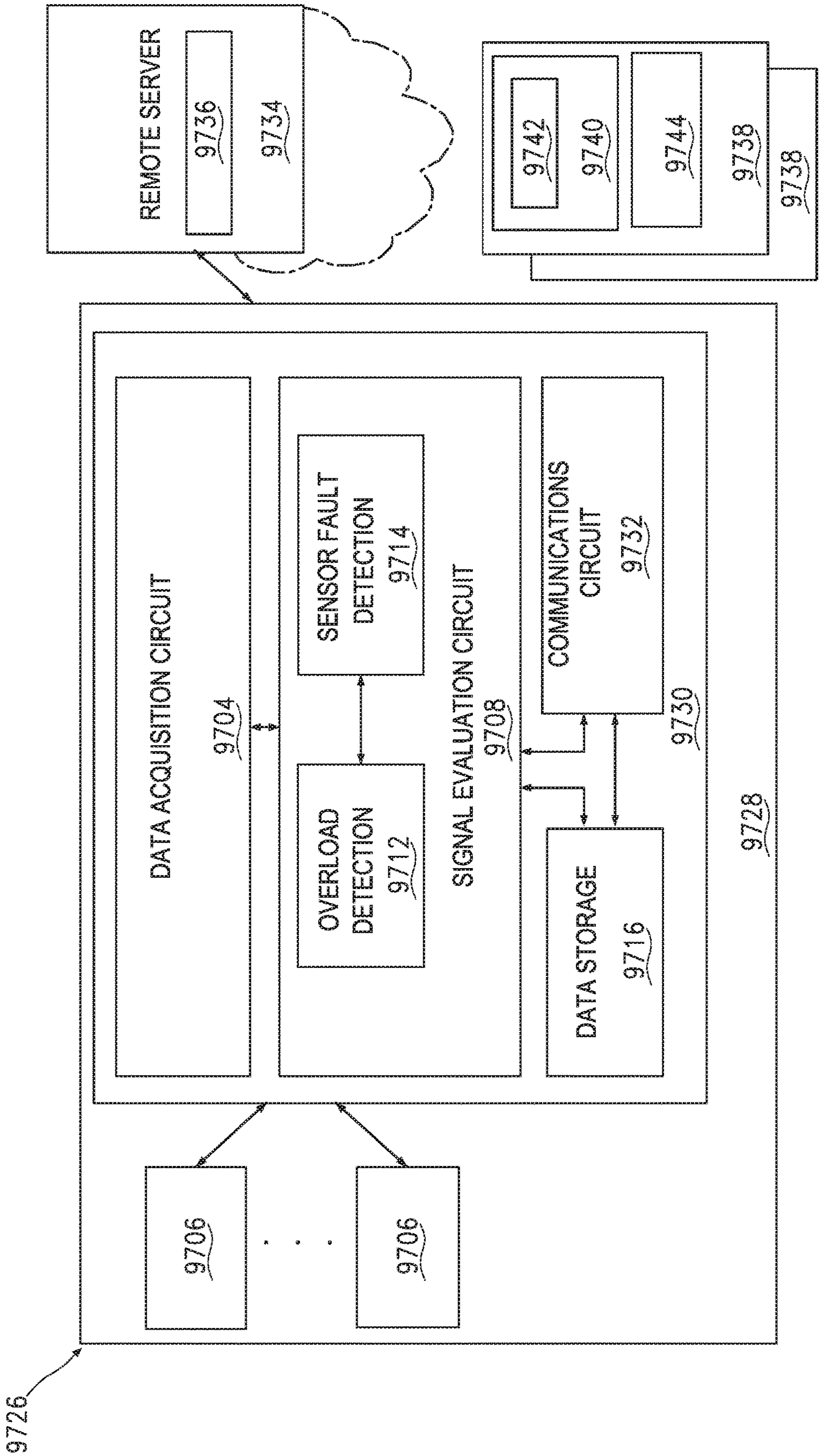

In embodiments, as shown in FIG. 75, the communication circuit 9732 may communicate data directly to a remote server 9734. In embodiments as shown in FIG. 76, the communication circuit 9732 may communicate data to an intermediate computer 9738 which may include a processor 9740 running an operating system 9742 and a data storage circuit 9744.

Figure 77:
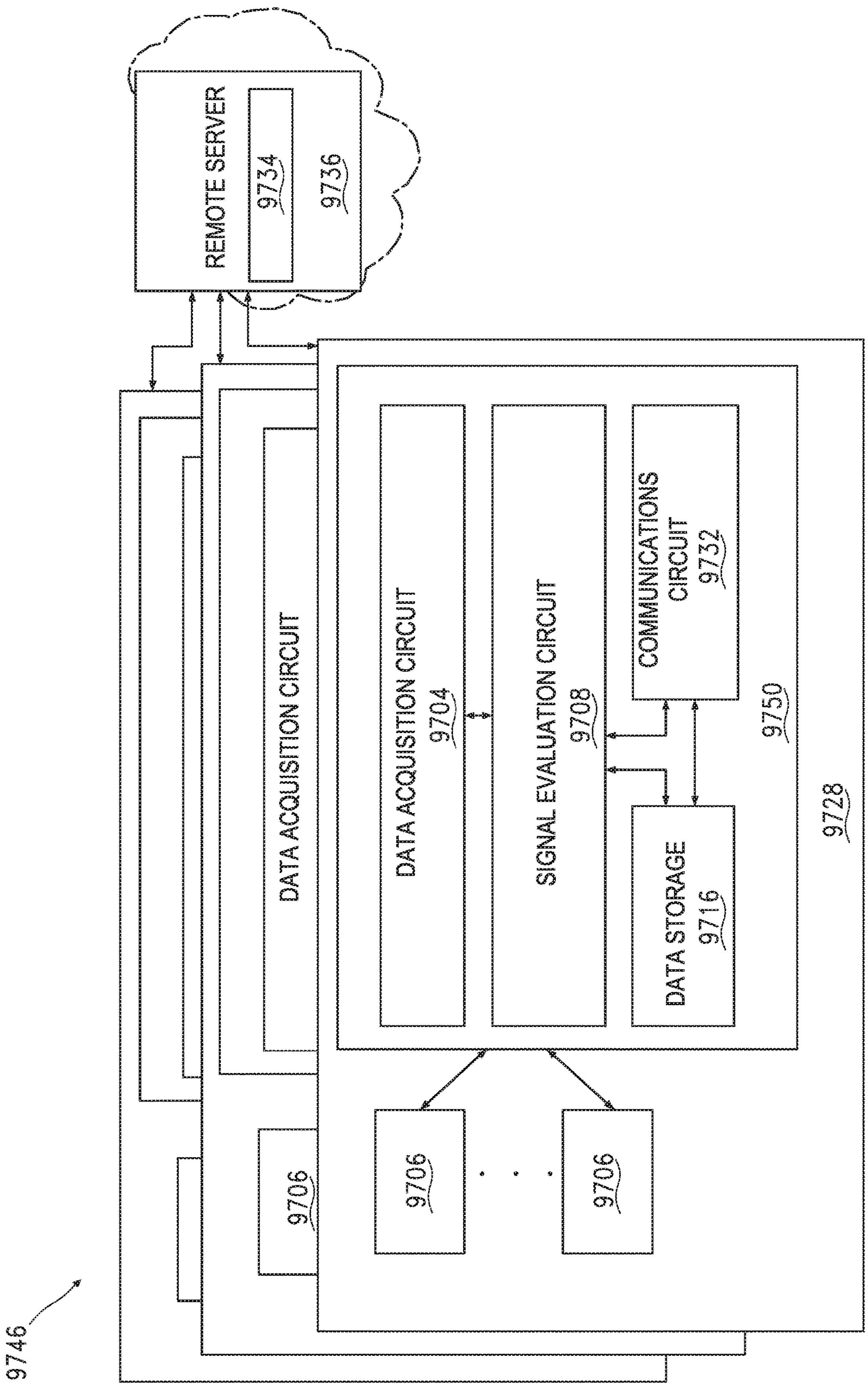
FIGS. 77 and 78 are diagrammatic views that depict embodiments of a system for data collection comprising a plurality of data monitoring devices in accordance with the present disclosure.
Figure 78:
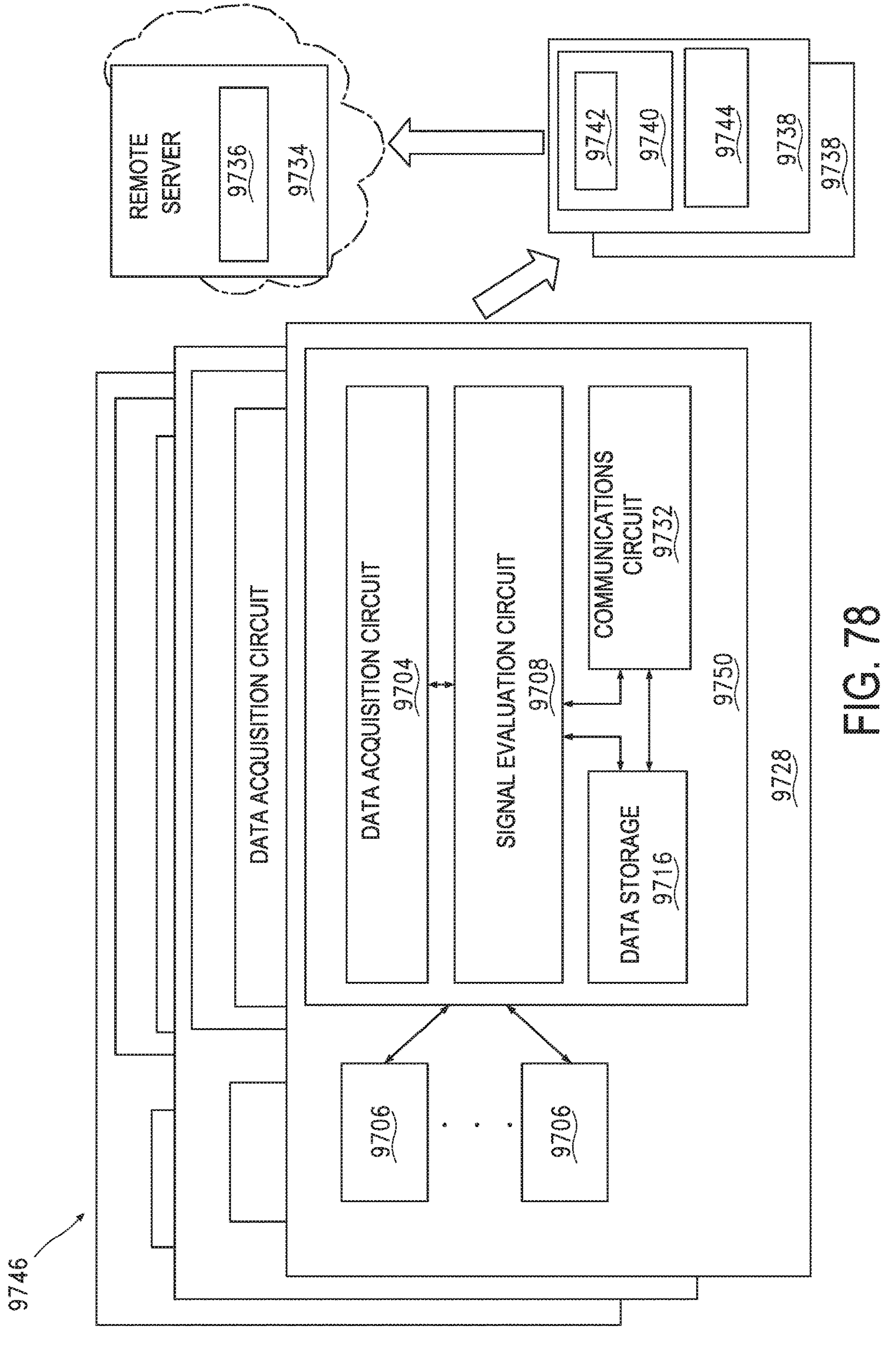

In embodiments, as illustrated in FIGS. 77 and 78, a data collection system 9746 may have a plurality of monitoring devices 9728 collecting data on multiple components in a single piece of equipment, collecting data on the same component across a plurality of pieces of equipment, (both the same and different types of equipment) in the same facility as well as collecting data from monitoring devices in multiple facilities. A monitoring application 9736 on a remote server 9734 may receive and store one or more of detection values, timing signals and data coming from a plurality of the various monitoring devices 9728.

In embodiments, as shown in FIG. 77, the communication circuit 9732 may communicated data directly to a remote server 9734. In embodiments, as shown in FIG. 78, the communication circuit 9732 may communicate data to an intermediate computer 9738 which may include a processor 9740 running an operating system 9742 and a data storage circuit 9744. There may be an individual intermediate computer 9738 associated with each monitoring device 9728 or an individual intermediate computer 9738 may be associated with a plurality of monitoring devices 9728 where the intermediate computer 9738 may collect data from a plurality of data monitoring devices and send the cumulative data to the remote server 9734. Communication to the remote server 9734 may be streaming, batch (e.g., when a connection is available) or opportunistic.

The monitoring application 9736 may select subsets of the detection values to be jointly analyzed. Subsets for analysis may be selected based on a single type of sensor, component or a single type of equipment in which a component is operating. Subsets for analysis may be selected or grouped based on common operating conditions such as size of load, operational condition (e.g., intermittent, continuous), operating speed or tachometer, common ambient environmental conditions such as humidity, temperature, air or fluid particulate, and the like. Subsets for analysis may be selected based on the effects of other nearby equipment such as nearby machines rotating at similar frequencies, nearby equipment producing electromagnetic fields, nearby equipment producing heat, nearby equipment inducing movement or vibration, nearby equipment emitting vapors, chemicals or particulates, or other potentially interfering or intervening effects.

In embodiments, the monitoring application 9736 may analyze the selected subset. In an illustrative example, data from a single sensor may be analyzed over different time periods such as one operating cycle, several operating cycles, a month, a year, the life of the component or the like. Data from multiple sensors of a common type measuring a common component type may also be analyzed over different time periods. Trends in the data such as changing rates of change associated with start-up or different points in the process may be identified. Correlation of trends and values for different sensors may be analyzed to identify those parameters whose short-term analysis might provide the best prediction regarding expected sensor performance. This information may be transmitted back to the monitoring device to update sensor models, sensor selection, sensor range, sensor scaling, sensor sampling frequency, types of data collected and analyzed locally or to influence the design of future monitoring devices.

In embodiments, the monitoring application 9736 may have access to equipment specifications, equipment geometry, component specifications, component materials, anticipated state information for a plurality of sensors, operational history, historical detection values, sensor life models and the like for use analyzing the selected subset using rule-based or model-based analysis. The monitoring application 9736 may provide recommendations regarding sensor selection, additional data to collect, or data to store with sensor data. The monitoring application 9736 may provide recommendations regarding scheduling repairs and/or maintenance. The monitoring application 9736 may provide recommendations regarding replacing a sensor. The replacement sensor may match the sensor being replaced or the replacement sensor may have a different range, sensitivity, sampling frequency and the like.

In embodiments, the monitoring application 9736 may include a remote learning circuit structured to analyze sensor status data (e.g., sensor overload, sensor faults, sensor failure) together with data from other sensors, failure data on components being monitored, equipment being monitored, product being produced, and the like. The remote learning system may identify correlations between sensor overload and data from other sensors.

Clause 1: In embodiments, a monitoring system for data collection in an industrial environment, the monitoring system comprising: a data acquisition circuit structured to interpret a plurality of detection values, each of the plurality of detection values corresponding to at least one of a plurality of input sensors; a data storage circuit structured to store sensor specifications, anticipated state information and detected values; a signal evaluation circuit comprising: an overload identification circuit structured to determine a sensor overload status of at least one sensor in response to the plurality of detection values and at least one of anticipated state information and sensor specification; a sensor fault detection circuit structured to determine one of a sensor fault status and a sensor validity status of at least one sensor in response to the plurality of detection values and at least one of anticipated state information and sensor specification; and a response circuit structured to perform at least one operation in response to one of a sensor overload status, a sensor health status, and a sensor validity status. A monitoring system of clause 1, the system further comprising a mobile data collector for collecting data from the plurality of input sensors. 3. The monitoring system of clause 1, wherein the at least one operation comprises issuing an alert or an alarm. 4. The monitoring system of clause 1, wherein the at least one operation further comprises storing additional data in the data storage circuit. 5. The monitoring system of clause 1, the system further comprising a multiplexor (MUX) circuit. 6. The monitoring system of clause 5, wherein the at least one operation comprises at least one of enabling or disabling one or more portions of the multiplexer circuit and altering the multiplexer control lines. 7. The monitoring system of clause 5, the system further comprising at least two multiplexer (MUX) circuits and the at least one operation comprises changing connections between the at least two multiplexer circuits. 8. The monitoring system of clause 7, the system further comprising a MUX control circuit structured to interpret a subset of the plurality of detection values and provide the logical control of the MUX and the correspondence of MUX input and detected values as a result, wherein the logic control of the MUX comprises adaptive scheduling of the multiplexer control lines. 9. A system for data collection, processing, and component analysis in an industrial environment comprising: a plurality of monitoring devices, each monitoring device comprising: a data acquisition circuit structured to interpret a plurality of detection values, each of the plurality of detection values corresponding to at least one of a plurality of input sensors; a data storage for storing specifications and anticipated state information for a plurality of sensor types and buffering the plurality of detection values for a predetermined length of time; a signal evaluation circuit comprising: an overload identification circuit structured to determine a sensor overload status of at least one sensor in response to the plurality of detection values and at least one of anticipated state information and sensor specification; a sensor fault detection circuit structured to determine one of a sensor fault status and a sensor validity status of at least one sensor in response to the plurality of detection values and at least one of anticipated state information and sensor specification; and a response circuit structured to perform at least one operation in response to one of a sensor overload status, a sensor health status, and a sensor validity status; a communication circuit structured to communicate with a remote server providing one of the sensor overload status, the sensor health status, and the sensor validity status and a portion of the buffered detection values to the remote server; and a monitoring application on the remote server structured to: receive the at least one selected detection value and one of the sensor overload status, the sensor health status, and the sensor validity status; jointly analyze a subset of the detection values received from the plurality of monitoring devices; and recommend an action. 10. The system of clause 9, with at least one of the monitoring devices further comprising a mobile data collector for collecting data from the plurality of input sensors. 11. The system of clause 9, wherein the at least one operation comprises issuing an alert or an alarm. 12. The monitoring system of clause 9, wherein the at least one operation further comprises storing additional data in the data storage circuit. 13. The system of clause 9, with at least one of the monitoring devices further comprising further comprising a multiplexor (MUX) circuit. 14. The system of clause 13, wherein the at least one operation comprises at least one of enabling or disabling one or more portions of the multiplexer circuit and altering the multiplexer control lines. 15. The system of clause 9, at least one of the monitoring devices further comprising at least two multiplexer (MUX) circuits and the at least one operation comprises changing connections between the at least two multiplexer circuits. 16. The monitoring system of clause 15, the system further comprising a MUX control circuit structured to interpret a subset of the plurality of detection values and provide the logical control of the MUX and the correspondence of MUX input and detected values as a result, wherein the logic control of the MUX comprises adaptive scheduling of the multiplexer control lines. 17. The system of clause 9, wherein the monitoring application comprises a remote learning circuit structured to analyze sensor status data together sensor data and identify correlations between sensor overload and data from other systems. 18. The system of clause 9, the monitoring application structured to subset detection values based on one of the sensor overload status, the sensor health status, the sensor validity status, the anticipated life of a sensor associated with detection values, the anticipated type of the equipment associated with detection values, and operational conditions under which detection values were measured. 19. The system of clause 9, wherein the supplemental information comprises one of sensor specification, sensor historic performance, maintenance records, repair records and an anticipated state model. 20. The system of clause 19, wherein the analysis of the subset of detection values comprises feeding a neural net with the subset of detection values and supplemental information to learn to recognize various sensor operating states, health states, life expectancies and fault states utilizing deep learning techniques.

Referring to FIGS. 79 through 106, embodiments of the present disclosure, including those involving expert systems, self-organization, machine learning, artificial intelligence, and the like, may benefit from the use of a neural net, such as a neural net trained for pattern recognition, for classification of one or more parameters, characteristics, or phenomena, for support of autonomous control, and other purposes. References to a neural net throughout this disclosure should be understood to encompass a wide range of different types of neural networks, machine learning systems, artificial intelligence systems, and the like, such as feed forward neural networks, radial basis function neural networks, self-organizing neural networks (e.g., Kohonen self-organizing neural networks), recurrent neural networks, modular neural networks, artificial neural networks, physical neural networks, multi-layered neural networks, convolutional neural networks, hybrids of neural networks with other expert systems (e.g., hybrid fuzzy logic—neural network systems), autoencoder neural networks, probabilistic neural networks, time delay neural networks, convolutional neural networks, regulatory feedback neural networks, radial basis function neural networks, recurrent neural networks, Hopfield neural networks, Boltzmann machine neural networks, self-organizing map (SOM) neural networks, learning vector quantization (LVQ) neural networks, fully recurrent neural networks, simple recurrent neural networks, echo state neural networks, long short-term memory neural networks, bi-directional neural networks, hierarchical neural networks, stochastic neural networks, genetic scale RNN neural networks, committee of machines neural networks, associative neural networks, physical neural networks, instantaneously trained neural networks, spiking neural networks, neocognitron neural networks, dynamic neural networks, cascading neural networks, neuro-fuzzy neural networks, compositional pattern-producing neural networks, memory neural networks, hierarchical temporal memory neural networks, deep feed forward neural networks, gated recurrent unit (GCU) neural networks, auto encoder neural networks, variational auto encoder neural networks, denoising auto encoder neural networks, sparse auto-encoder neural networks, Markov chain neural networks, restricted Boltzmann machine neural networks, deep belief neural networks, deep convolutional neural networks, deconvolutional neural networks, deep convolutional inverse graphics neural networks, generative adversarial neural networks, liquid state machine neural networks, extreme learning machine neural networks, echo state neural networks, deep residual neural networks, support vector machine neural networks, neural Turing machine neural networks, and/or holographic associative memory neural networks, or hybrids or combinations of the foregoing, or combinations with other expert systems, such as rule-based systems, model-based systems (including ones based on physical models, statistical models, flow-based models, biological models, biomimetic models, and the like).

Figure 79:
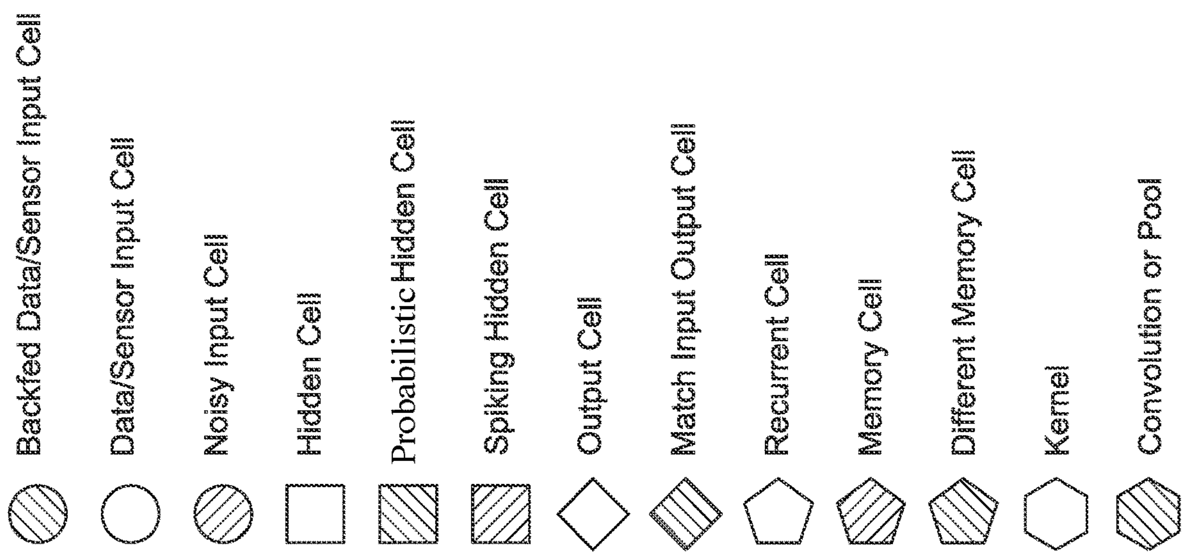
FIG. 79 to FIG. 106 are diagrammatic views of components and interactions of a data collection architecture involving various neural network embodiments interacting with a streaming data acquisition instrument receiving analog sensor signals and an expert analysis module in accordance with the present disclosure.

In embodiments, the foregoing neural network may be configured to connect with a DAQ instrument and other data collectors that may receive analog signals from one or more sensors. The foregoing neural networks may also be configured to interface with, connect to, or integrate with expert systems that can be local and/or available through one or more cloud networks. In embodiments, FIGS. 80 through 106 depict exemplary neural networks and FIG. 79 depicts a legend showing the various components of the neural networks depicted throughout FIGS. 80 to 106. FIG. 79 depicts the various neural net components 10000, as depicted in cells 10002 for which there are assigned functions and requirements. In embodiments, the various neural net examples may include back fed data/sensor cells 10010, data/sensor cells 10012, noisy input cells, 10014, and hidden cells, 10018. The neural net components 10000 also include the other following cells 10002: probabilistic hidden cells 10020, spiking hidden cells 10022, output cells 10024, match input/output cell 10028, recurrent cell 10030, memory cell, 10032, different memory cell 10034, kernels 10038 and convolution or pool cells 10040.

Figure 80:
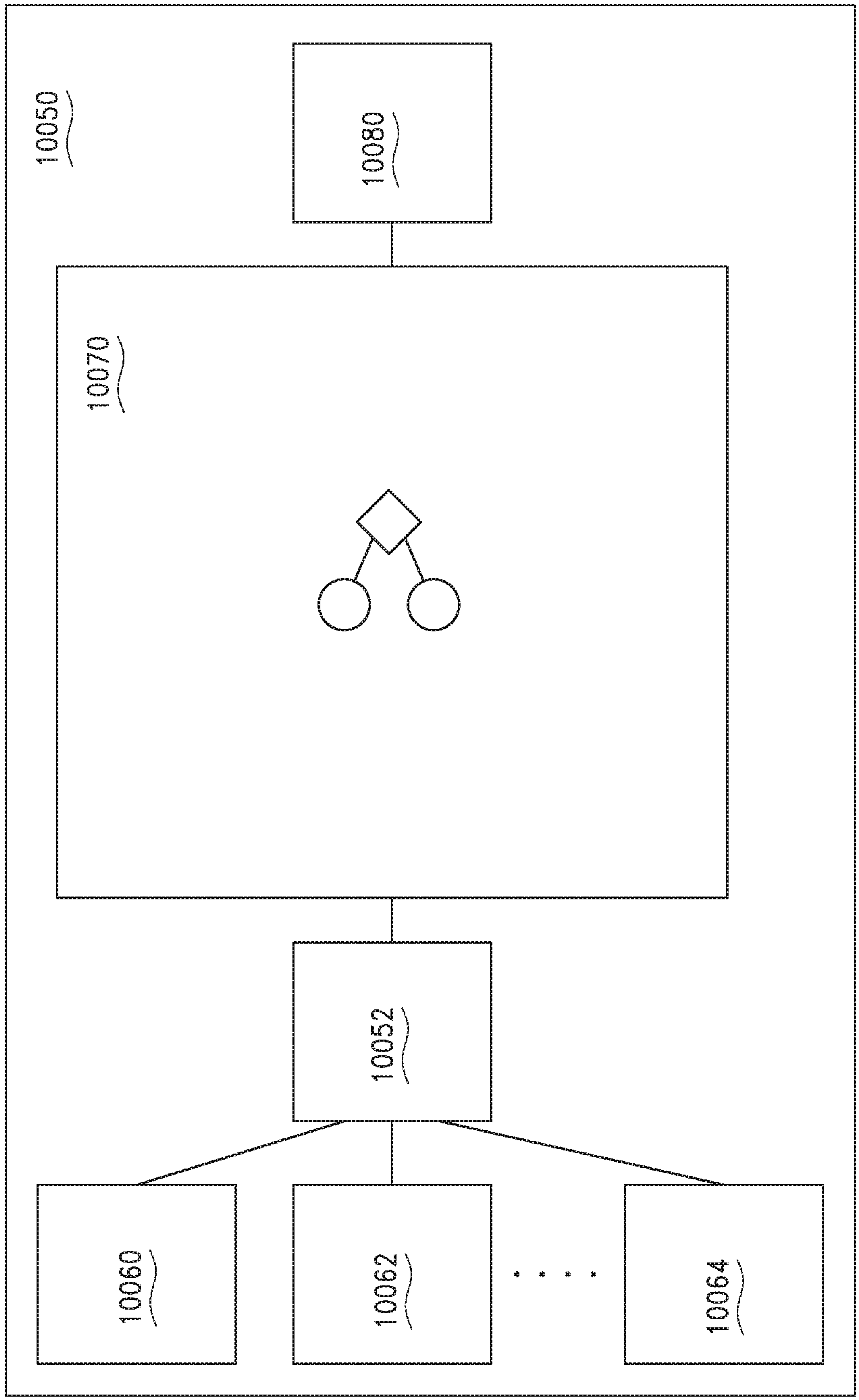
Figure 81:
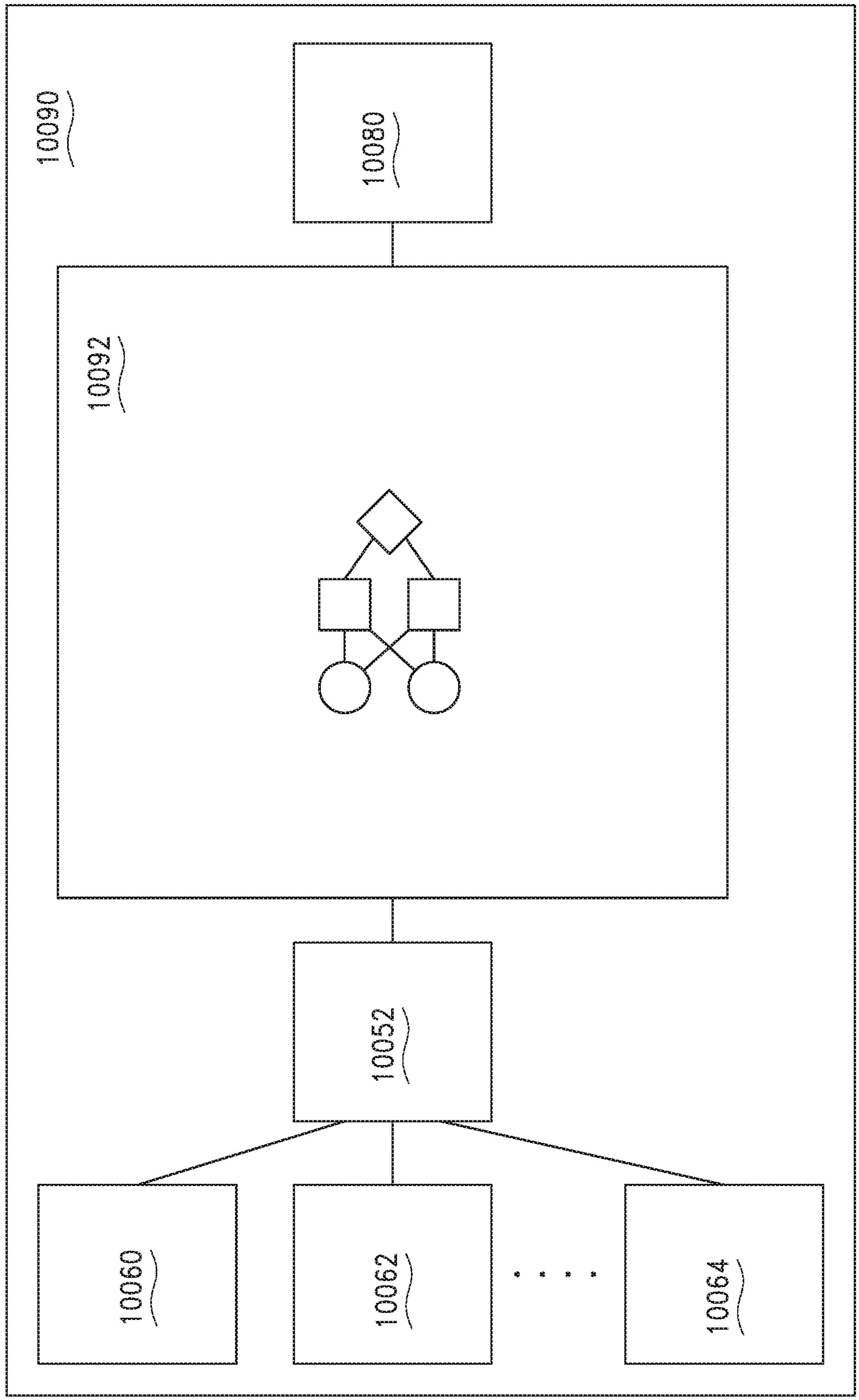
Figure 82:
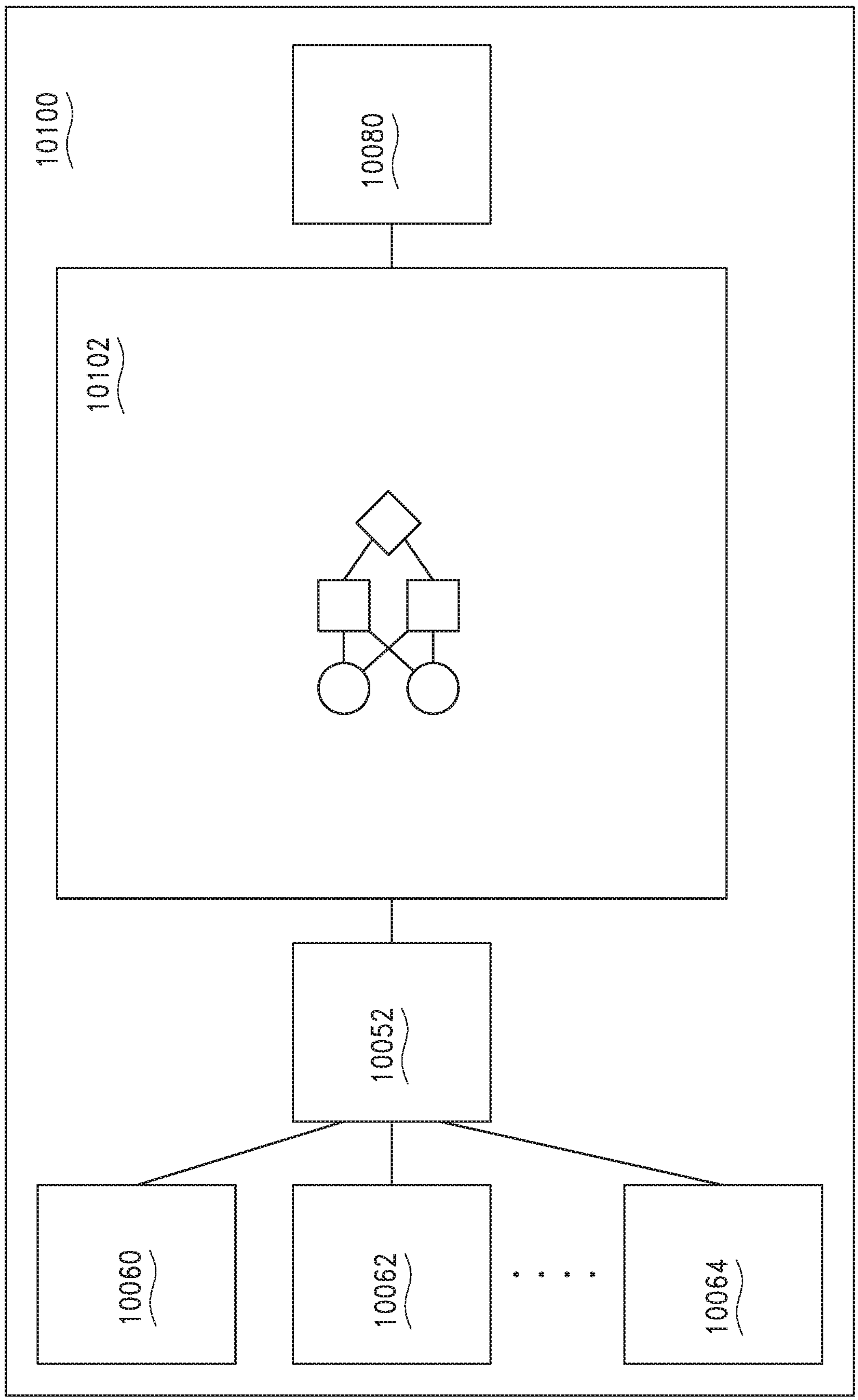
Figure 83:
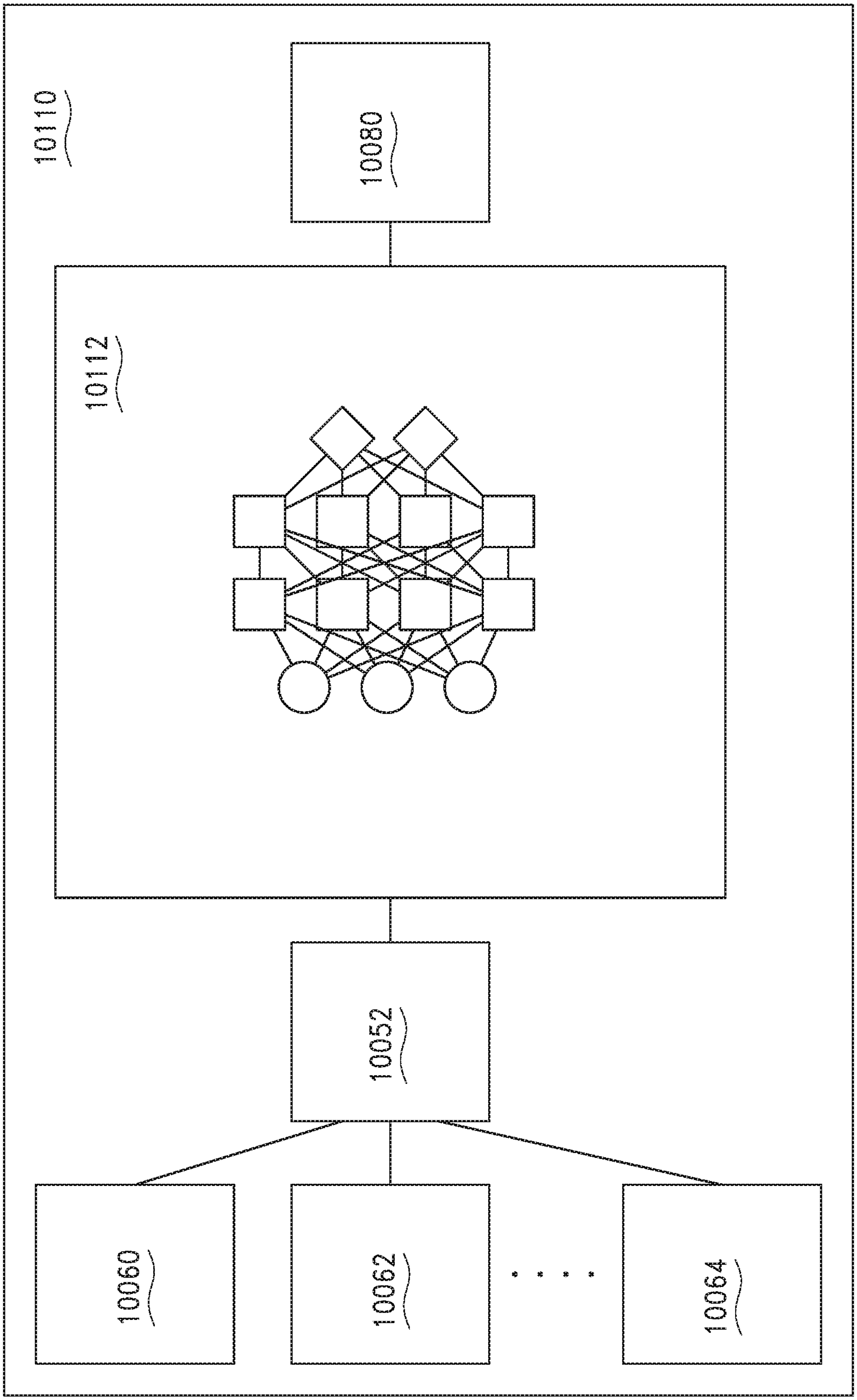
Figure 84:
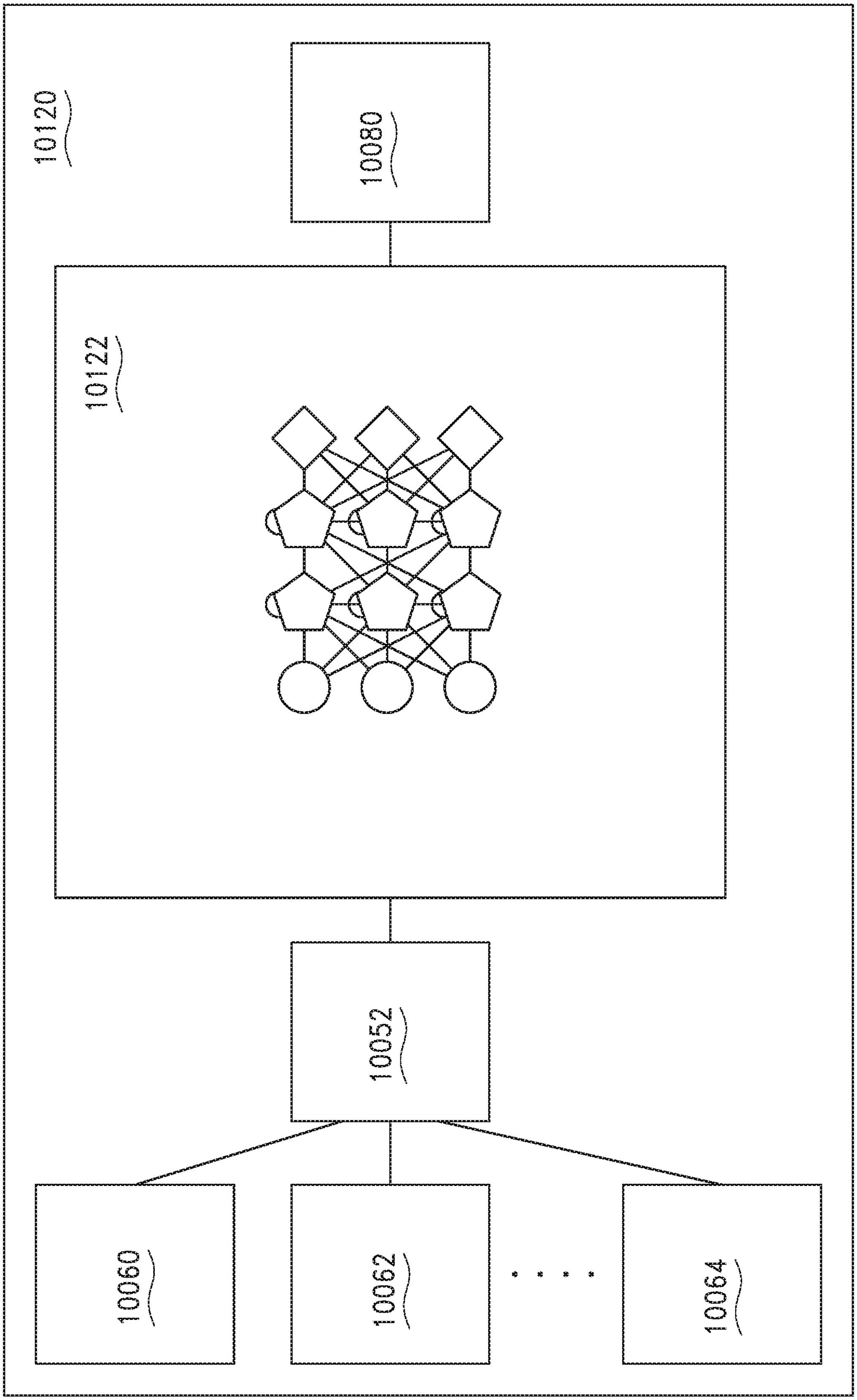

In FIG. 80, a streaming data collection system 10050 may include a DAQ instrument 10052 or other data collectors that may gather analog signals from sensors including sensor 10060, sensor 10062 and sensor 10064. The streaming data collection system 10050 may include a perceptron neural network 10070 that may connect to, integrate with, or interface with an expert system 10080. In FIG. 81, a streaming data collection system 10090 may include the DAQ instrument 10052 or other data collectors that may gather analog signals from sensors including the sensors 10060, 10062, 10064. The streaming data collection system 10090 may include a feed forward neural network 10092 that may connect to, integrate with, or interface with the expert system 10080. In FIG. 82, a streaming data collection system 10100 may include the DAQ instrument 10052 or other data collectors that may gather analog signals from sensors including the sensors 10060, 10062, 10064. The streaming data collection system 10100 may include a radial basis neural network 10102 that may connect to, integrate with, or interface with the expert system 10080. In FIG. 83, a streaming data collection system 10110 may include the DAQ instrument 10052 or other data collectors that may gather analog signals from sensors including the sensors 10060, 10062, 10064. The streaming data collection system 10110 may include a deep feed forward neural network 10112 that may connect to, integrate with, or interface with the expert system 10080. In FIG. 84, a streaming data collection system 10120 may include the DAQ instrument 10052 or other data collectors that may gather analog signals from sensors including the sensors 10060, 10062, 10064. The streaming data collection system 10120 may include a recurrent neural network 10122 that may connect to, integrate with, or interface with the expert system 10080.

Figure 85:
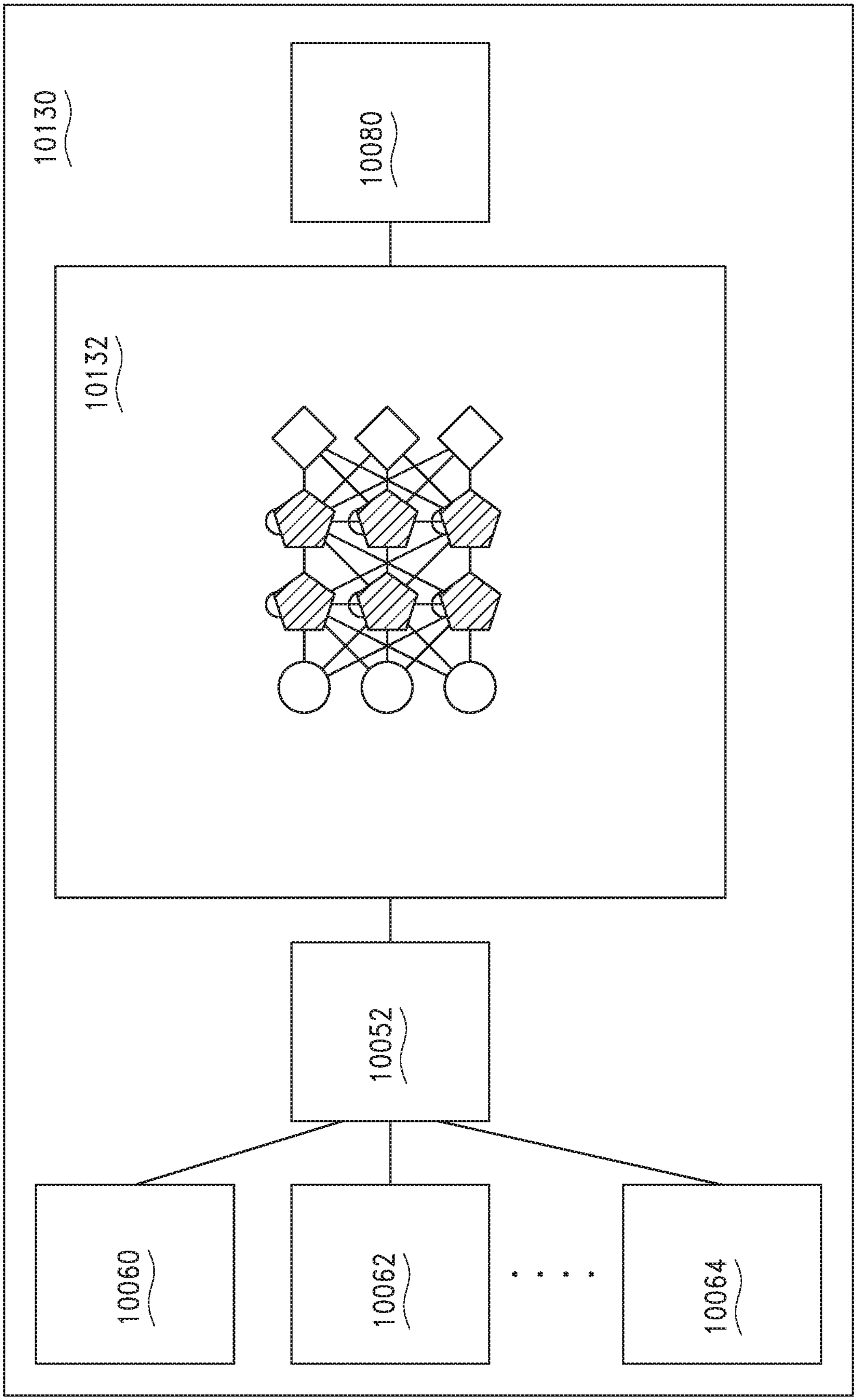
Figure 86:
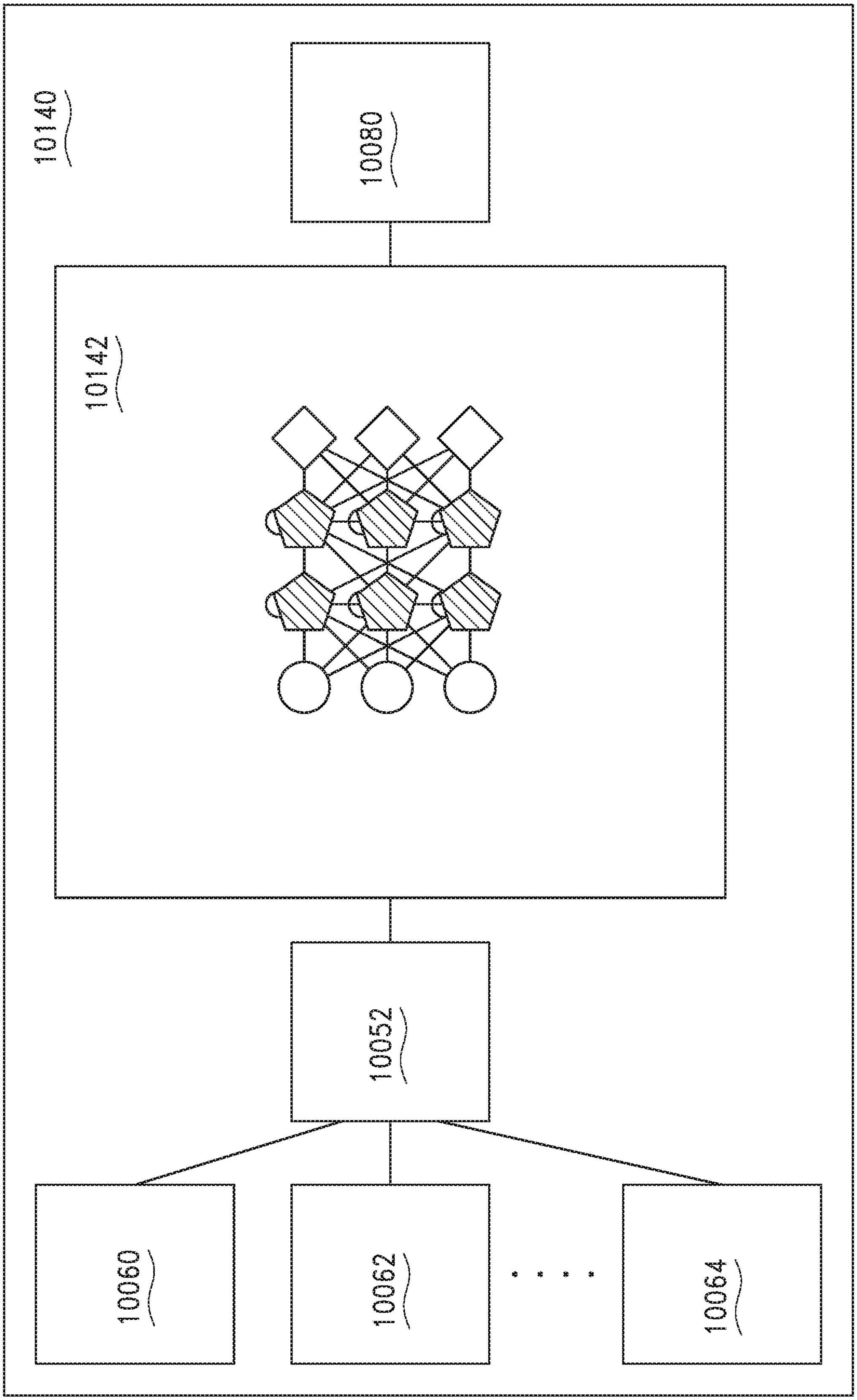
Figure 87:
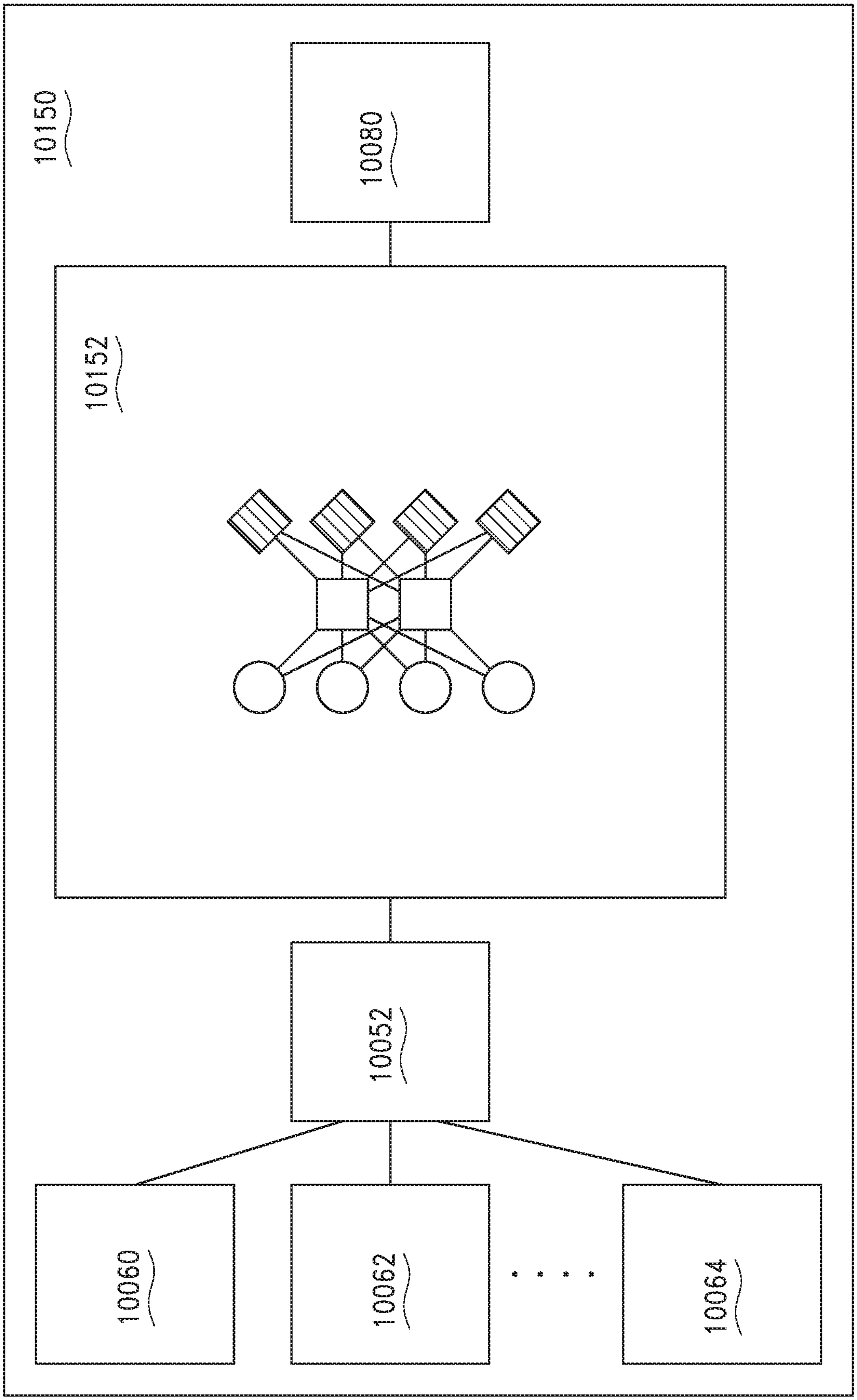
Figure 88:
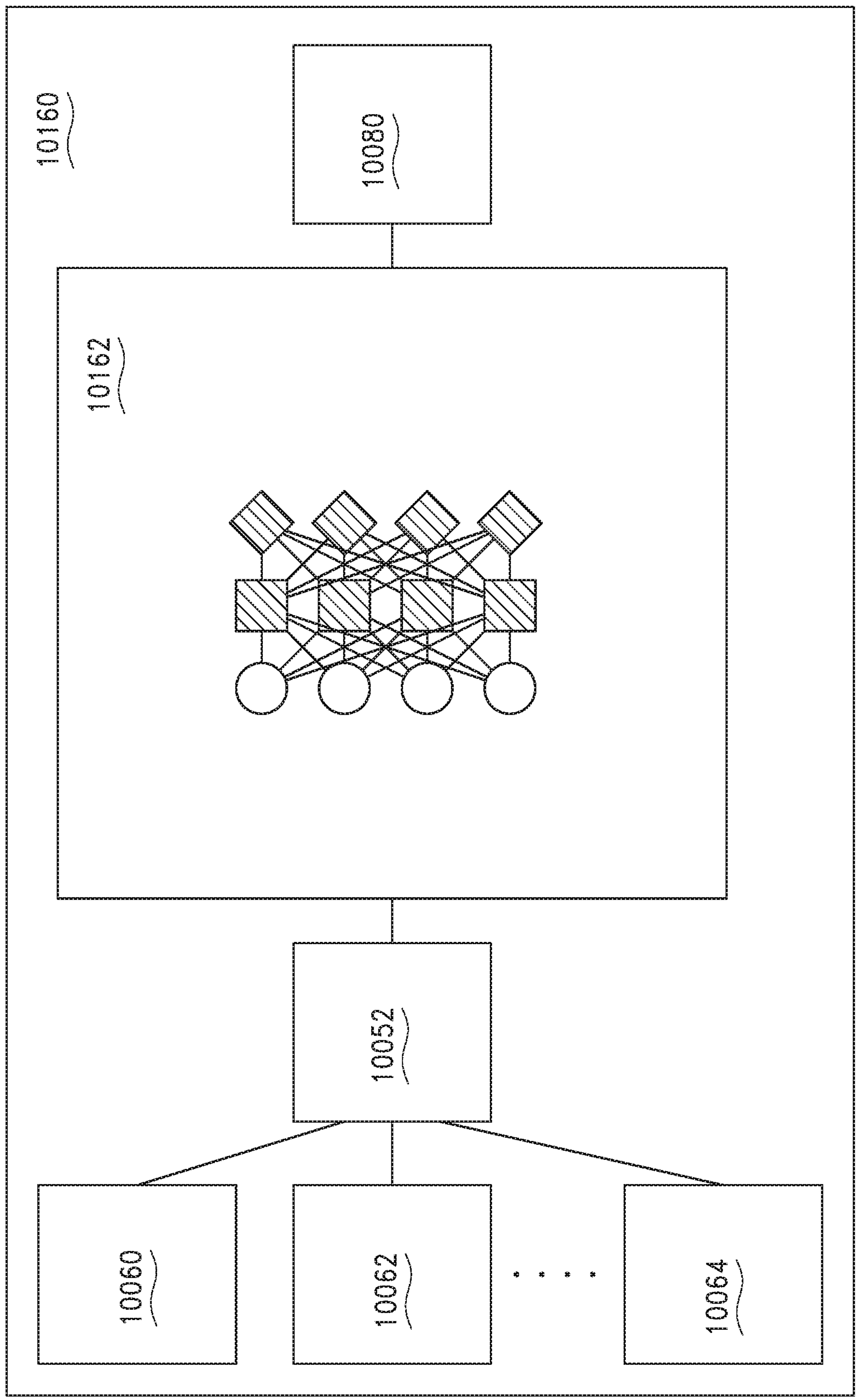
Figure 89:
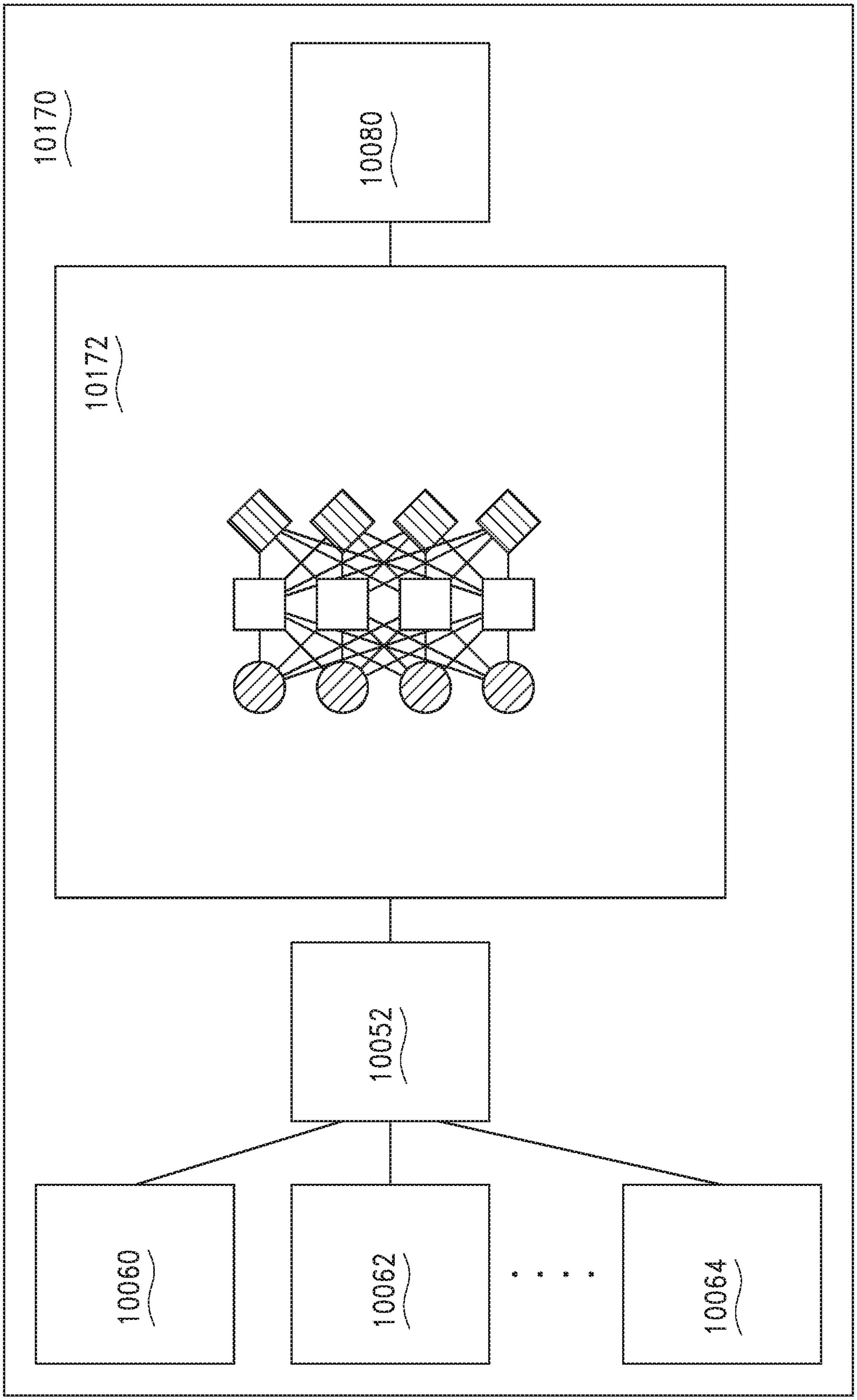
Figure 90:
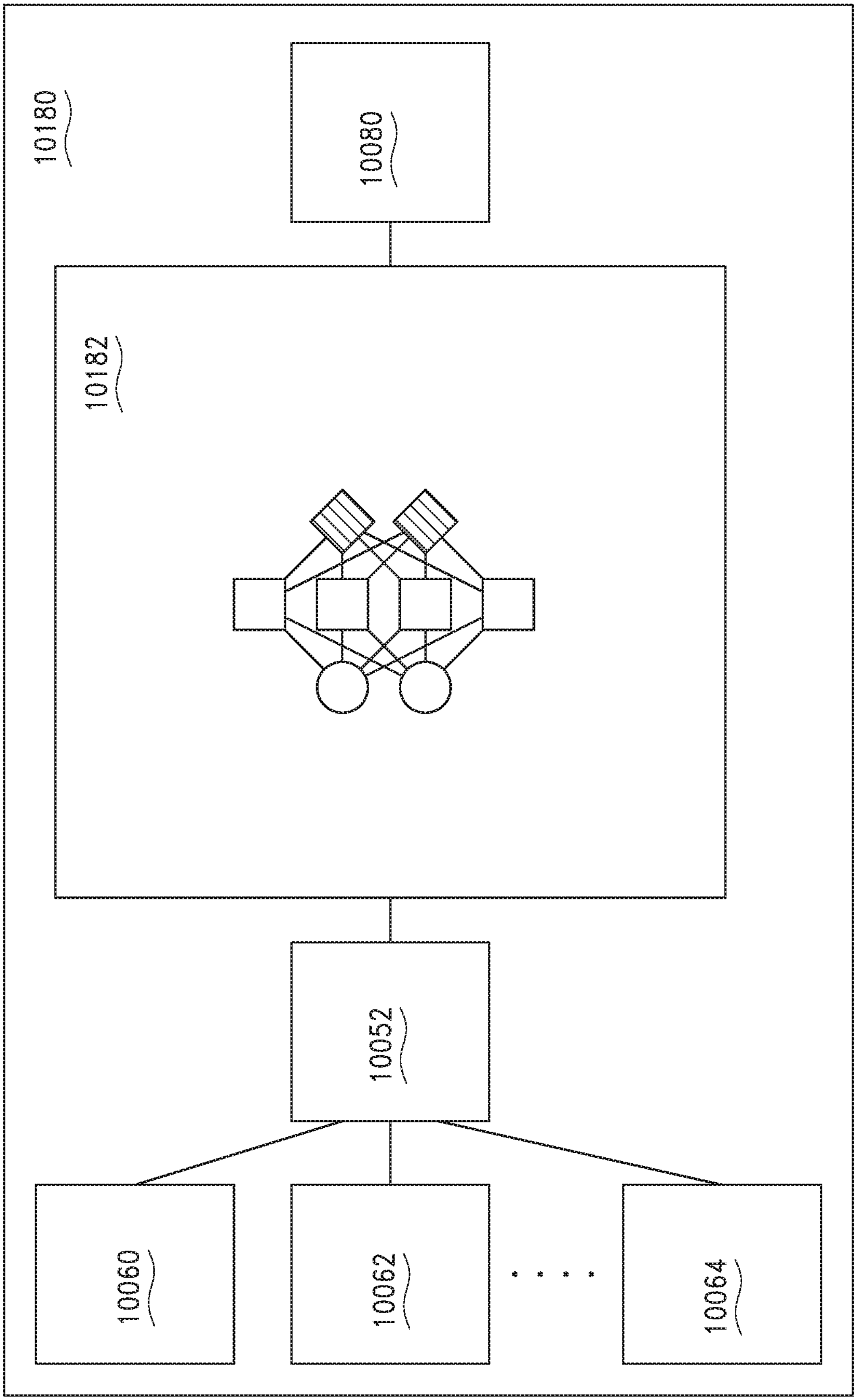
Figure 91:
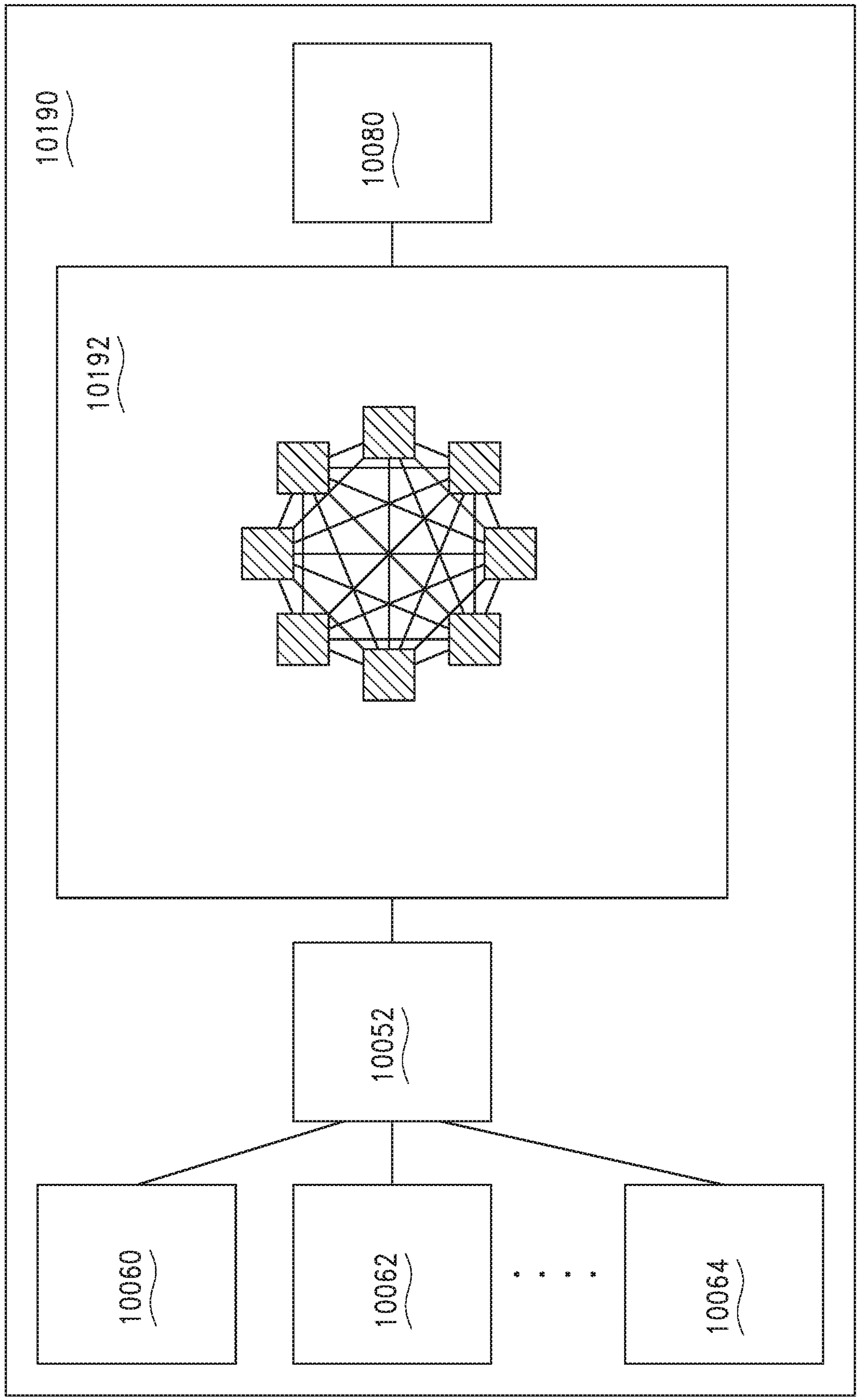

In FIG. 85, a streaming data collection system 10130 may include the DAQ instrument 10052 or other data collectors that may gather analog signals from sensors including the sensors 10060, 10062, 10064. The streaming data collection system 10130 may include a long/short term neural network 10132 that may connect to, integrate with, or interface with the expert system 10080. In FIG. 86, a streaming data collection system 10140 may include the DAQ instrument 10052 or other data collectors that may gather analog signals from sensors including the sensors 10060, 10062, 10064. The streaming data collection system 10140 may include a gated recurrent neural network 10142 that may connect to, integrate with, or interface with the expert system 10080. In FIG. 87, a streaming data collection system 10150 may include the DAQ instrument 10052 or other data collectors that may gather analog signals from sensors including the sensors 10060, 10062, 10064. The streaming data collection system 10150 may include an auto encoder neural network 10152 that may connect to, integrate with, or interface with the expert system 10080. In FIG. 88, a streaming data collection system 10160 may include the DAQ instrument 10052 or other data collectors that may gather analog signals from sensors including the sensors 10060, 10062, 10064. The streaming data collection system 10160 may include a variational neural network 10162 that may connect to, integrate with, or interface with the expert system 10080. In FIG. 89, a streaming data collection system 10170 may include the DAQ instrument 10052 or other data collectors that may gather analog signals from sensors including the sensors 10060, 10062, 10064. The streaming data collection system 10170 may include a denoising neural network 10172 that may connect to, integrate with, or interface with the expert system 10080. In FIG. 90, a streaming data collection system 10180 may include the DAQ instrument 10052 or other data collectors that may gather analog signals from sensors including the sensors 10060, 10062, 10064. The streaming data collection system 10180 may include a sparse neural network 10182 that may connect to, integrate with, or interface with the expert system 10080. In FIG. 91, a streaming data collection system 10190 may include the DAQ instrument 10052 or other data collectors that may gather analog signals from sensors including the sensors 10060, 10062, 10064. The streaming data collection system 10190 may include a Markov chain neural network 10182 that may connect to, integrate with, or interface with the expert system 10080.

Figure 92:
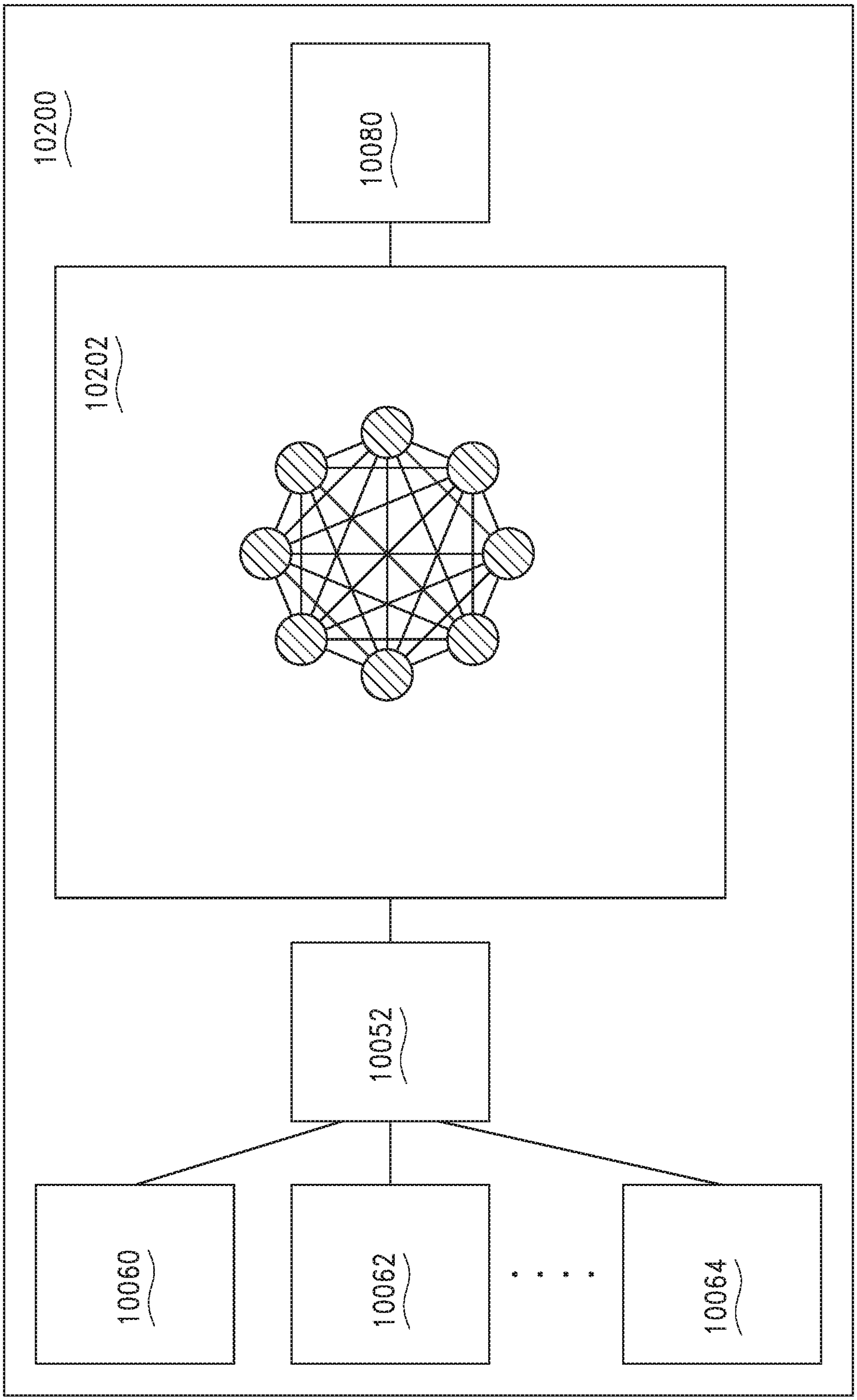
Figure 93:
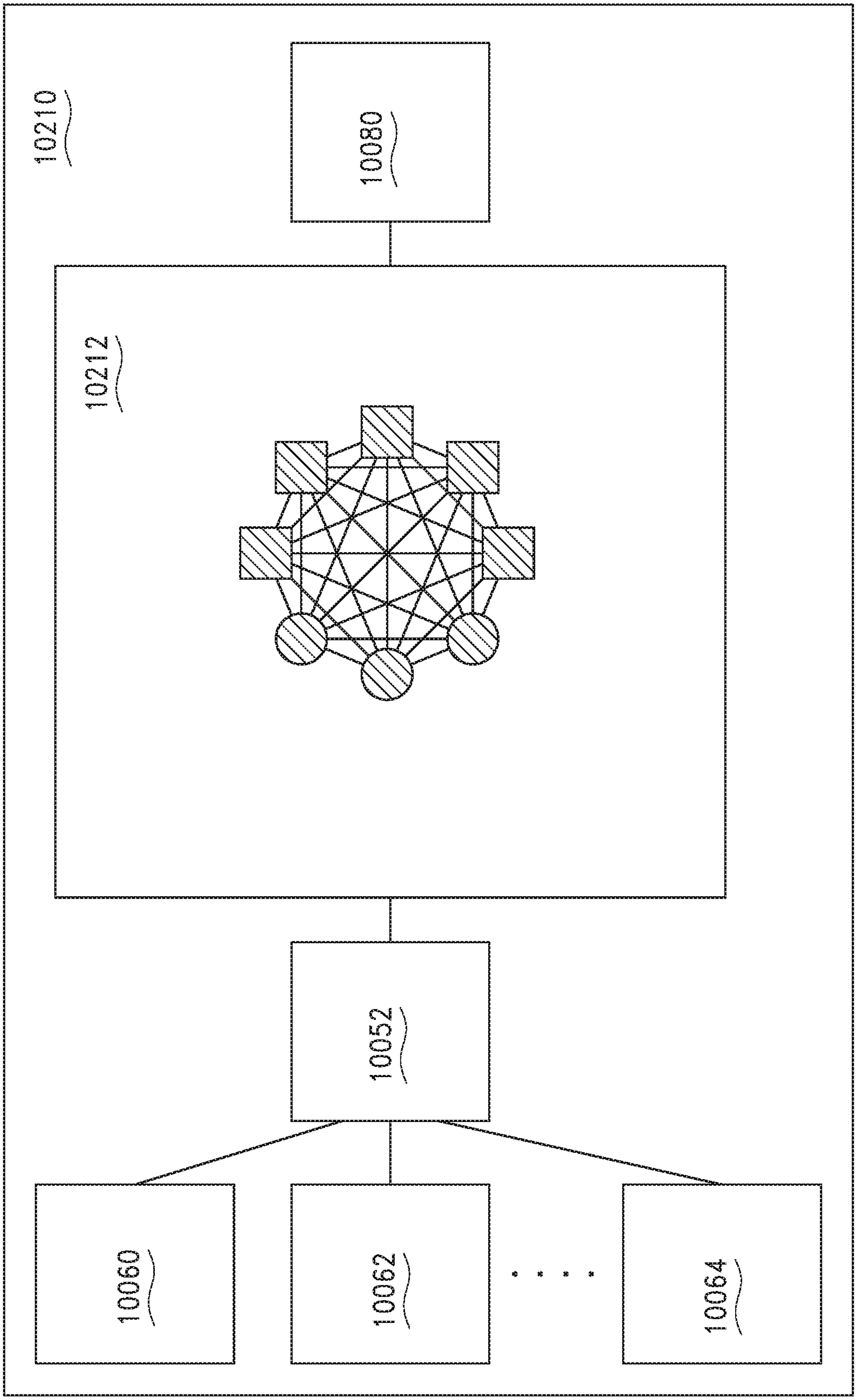
Figure 94:
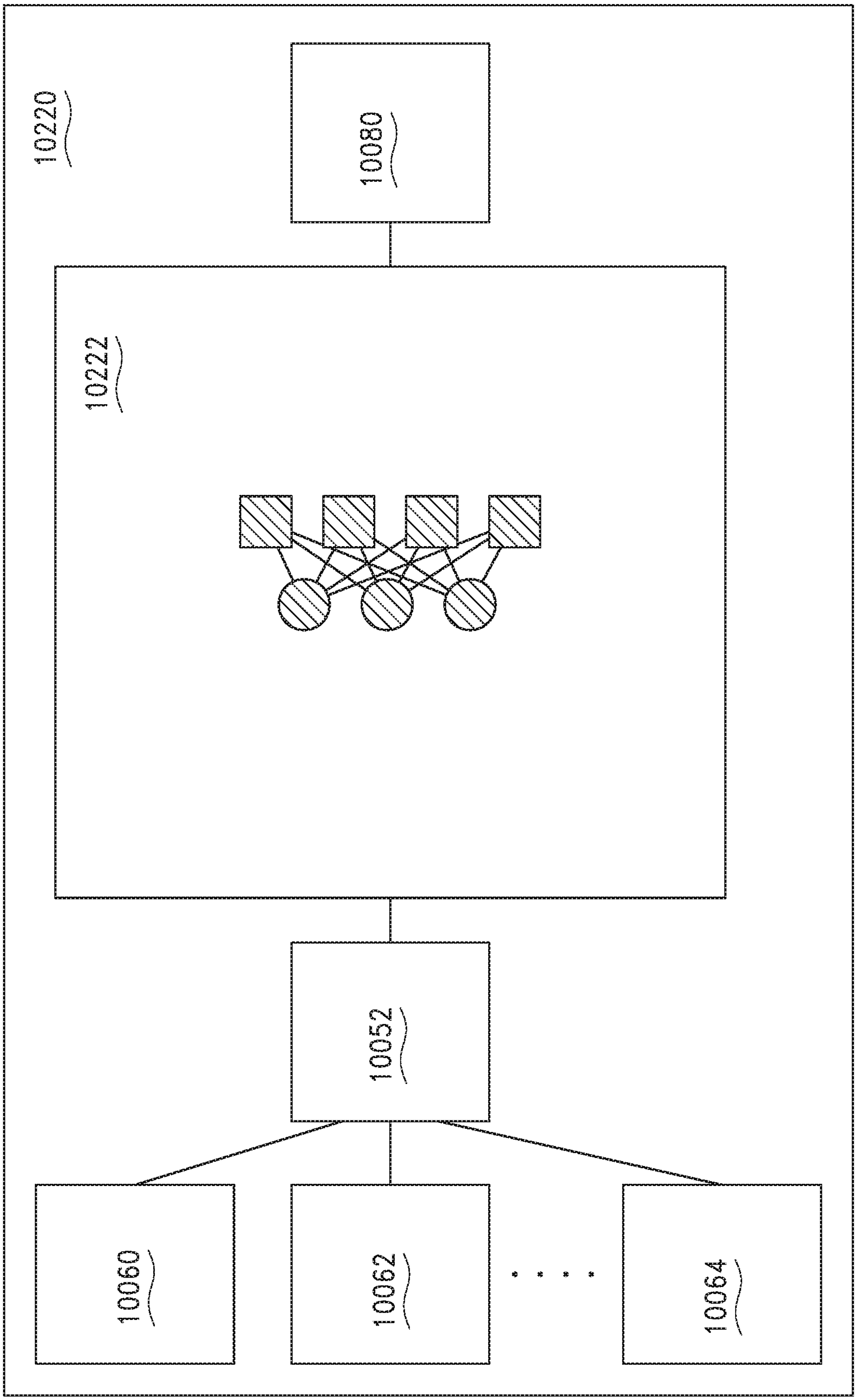
Figure 95:
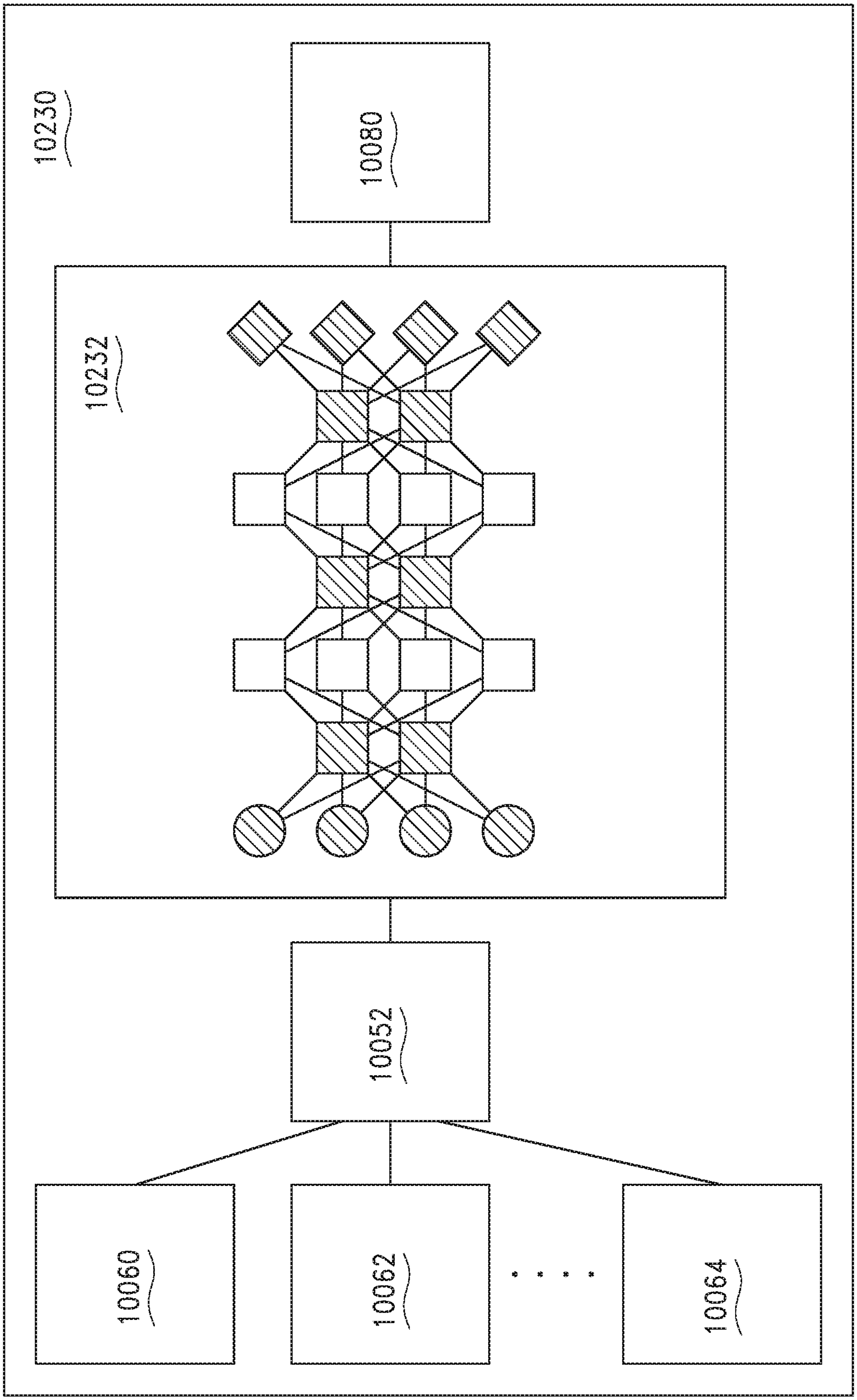
Figure 96:
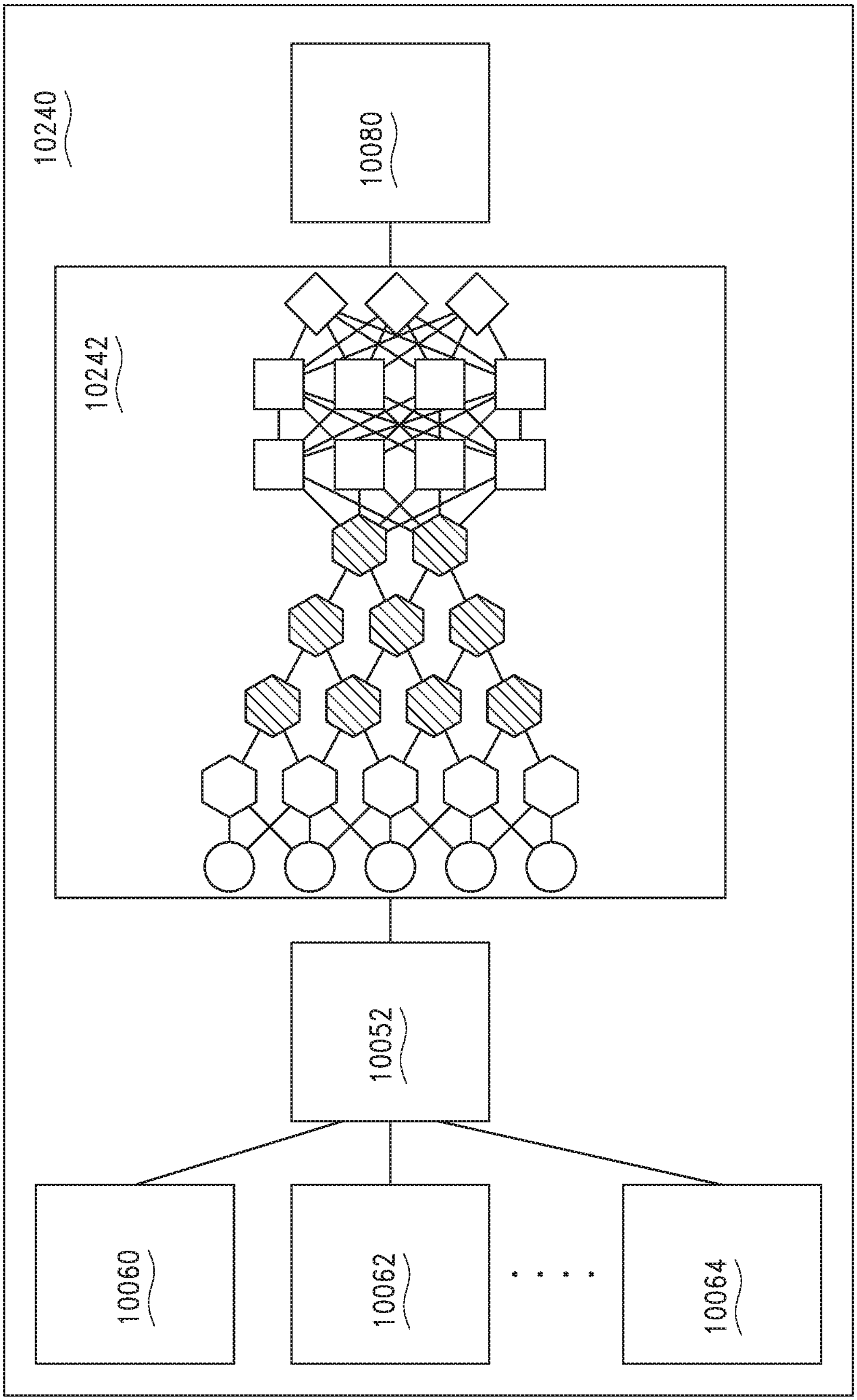
Figure 97:
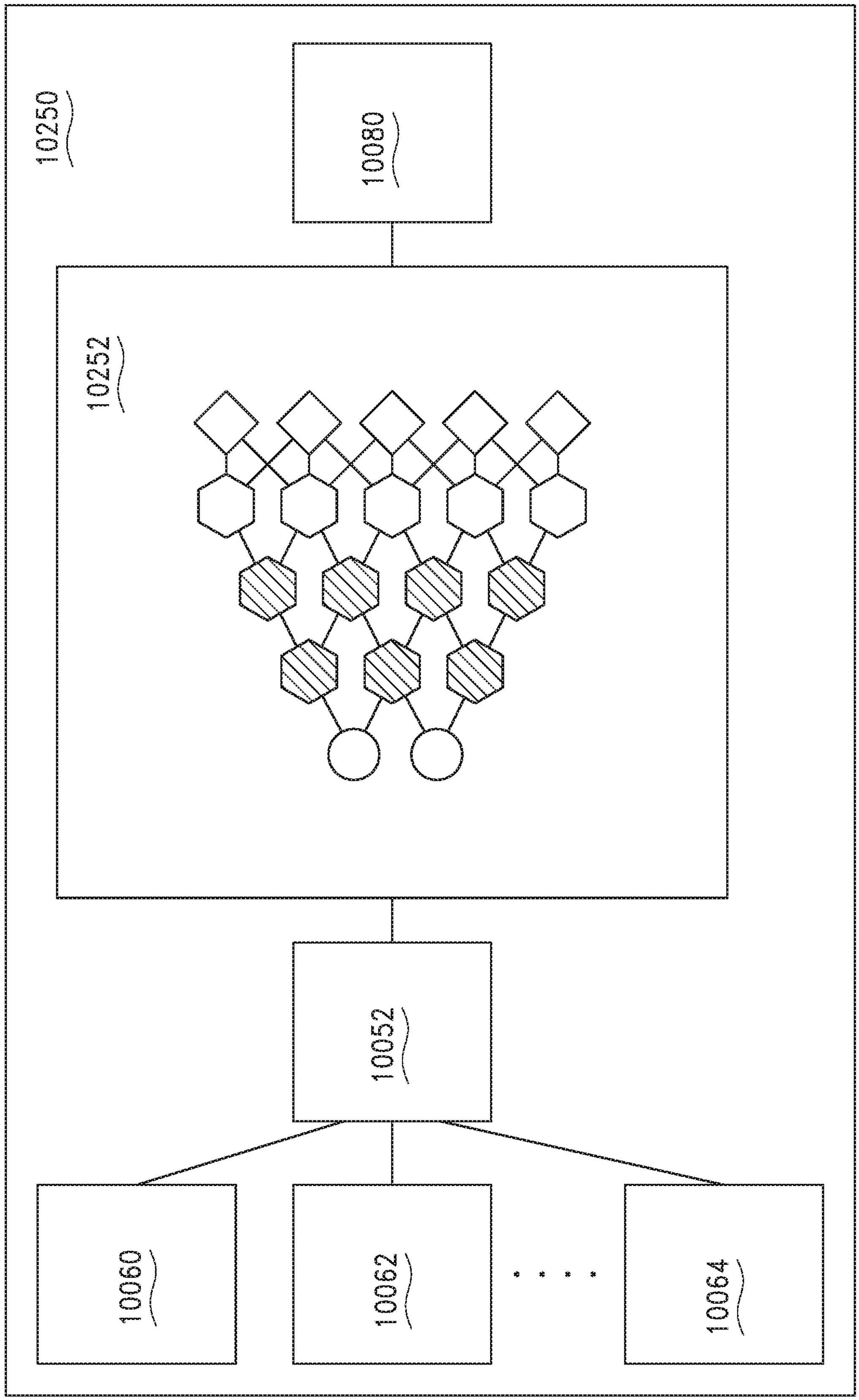
Figure 98:
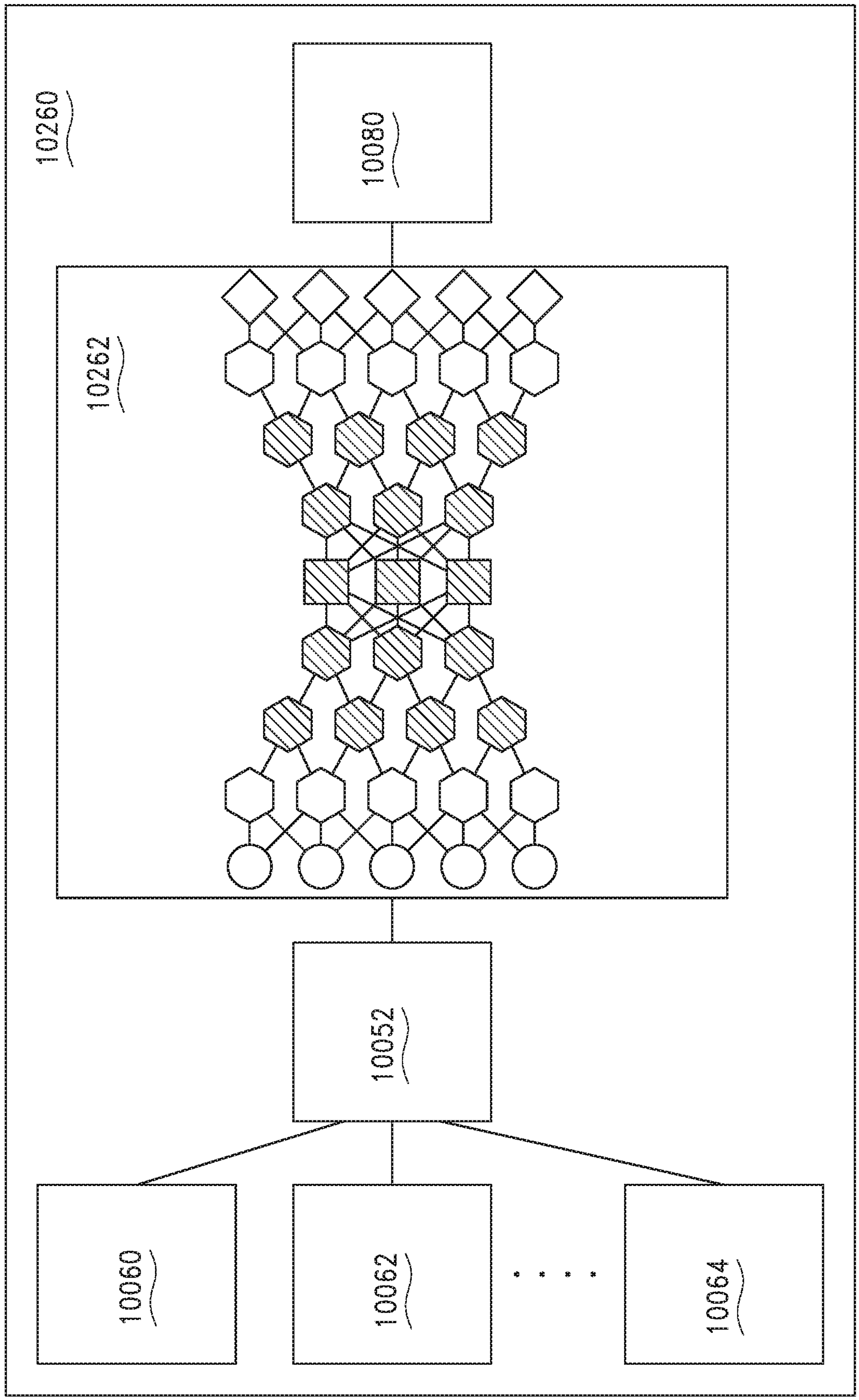
Figure 99:
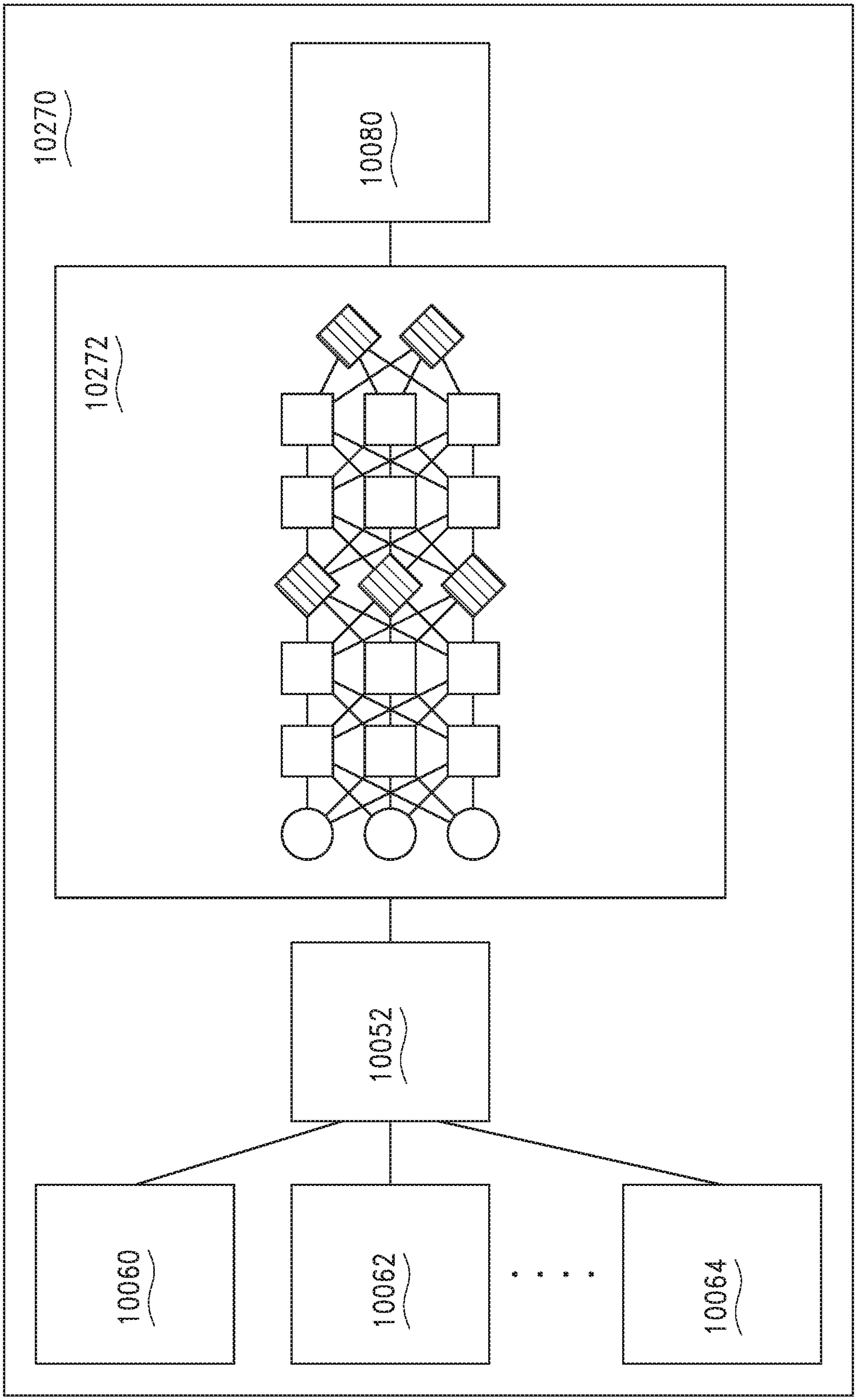
Figure 101:
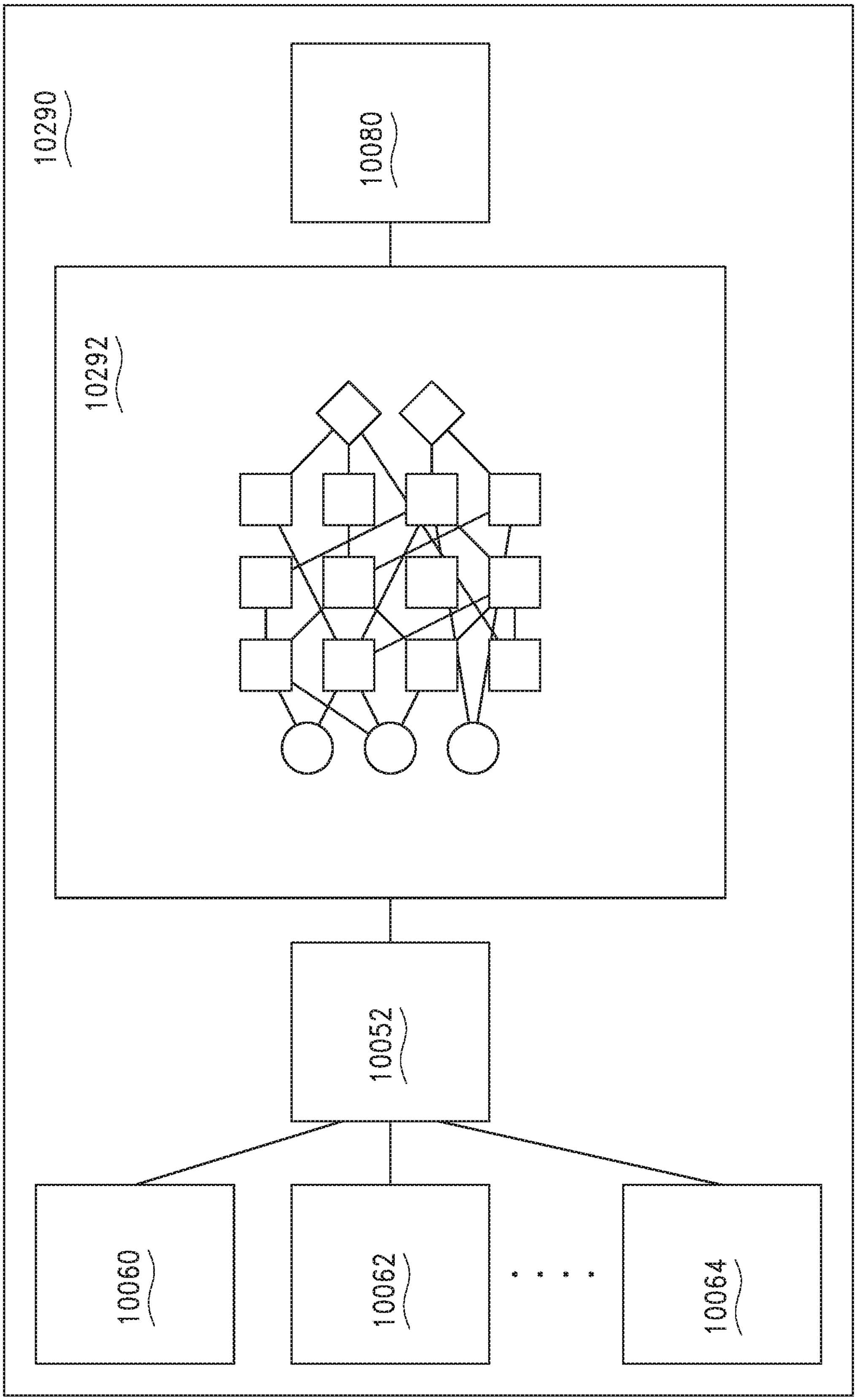
Figure 102:
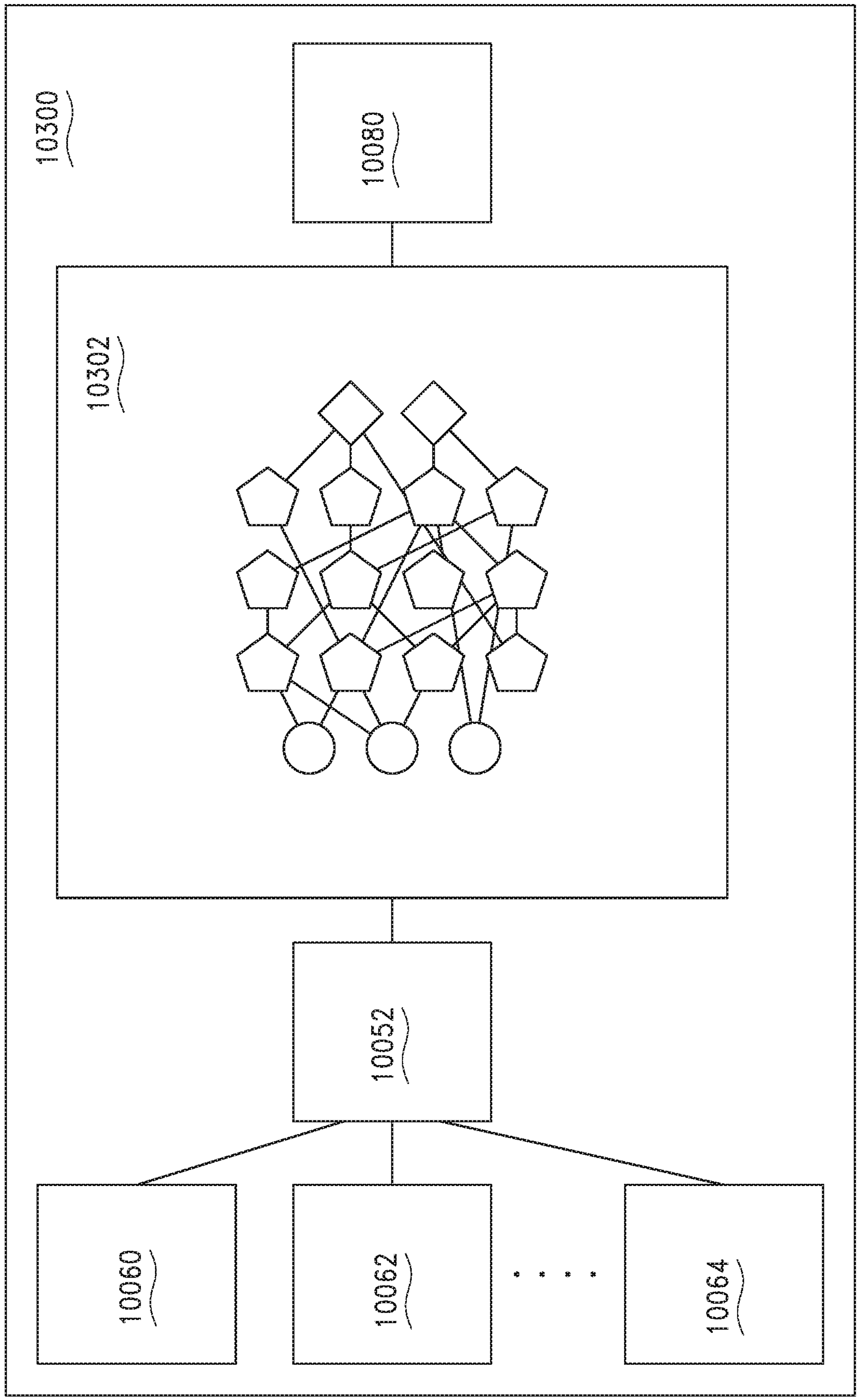
Figure 103:
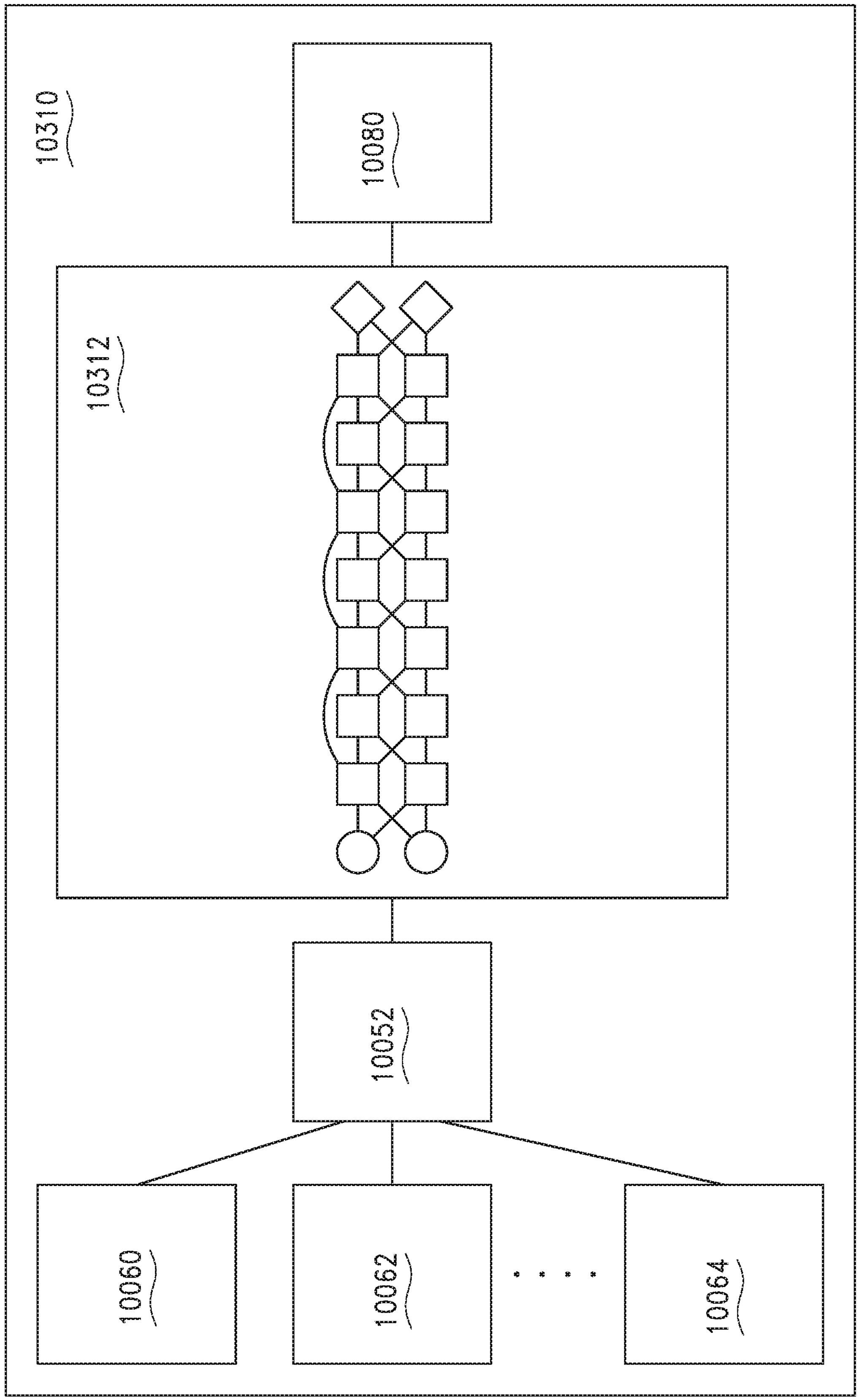
Figure 104:
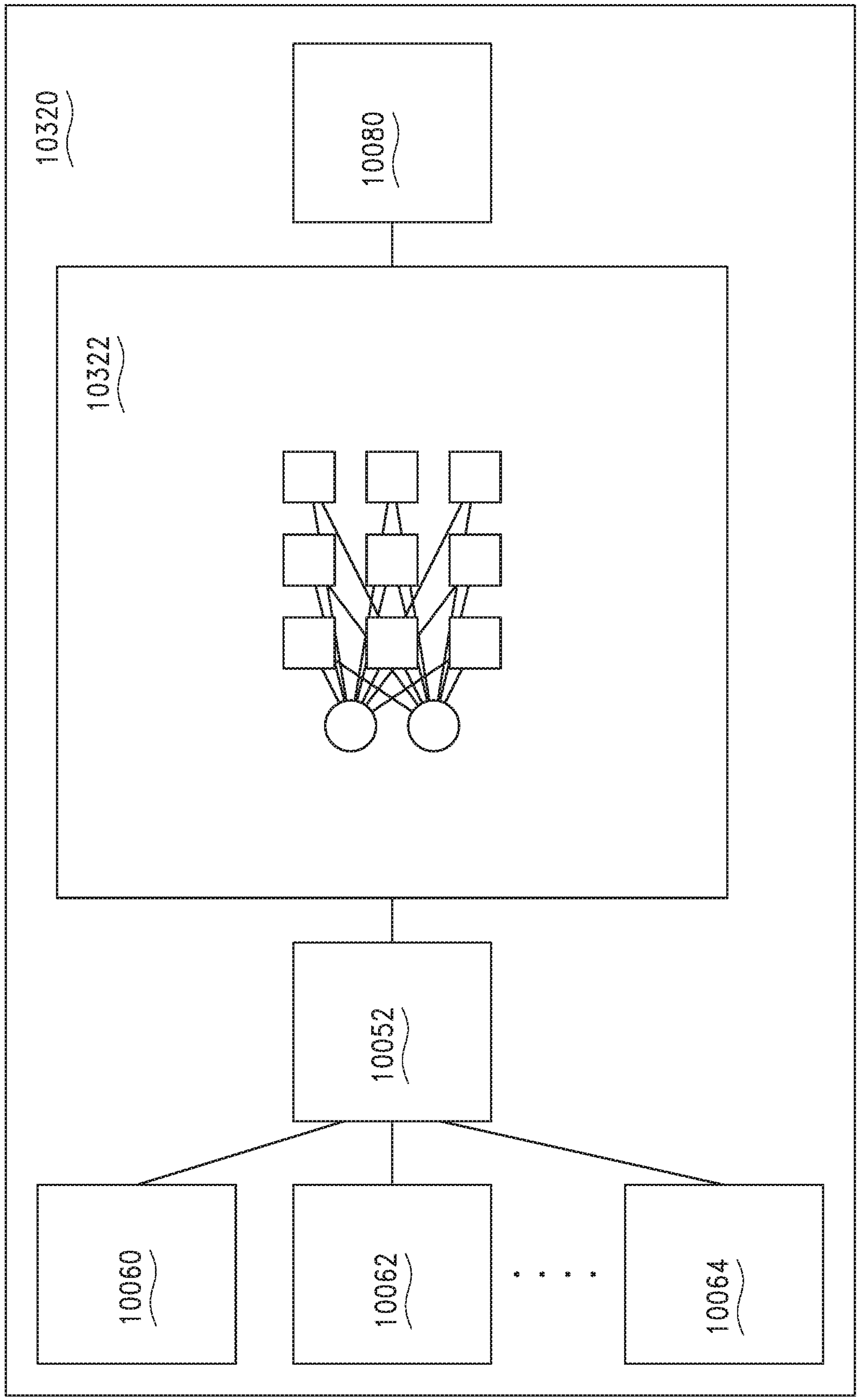
Figure 105:
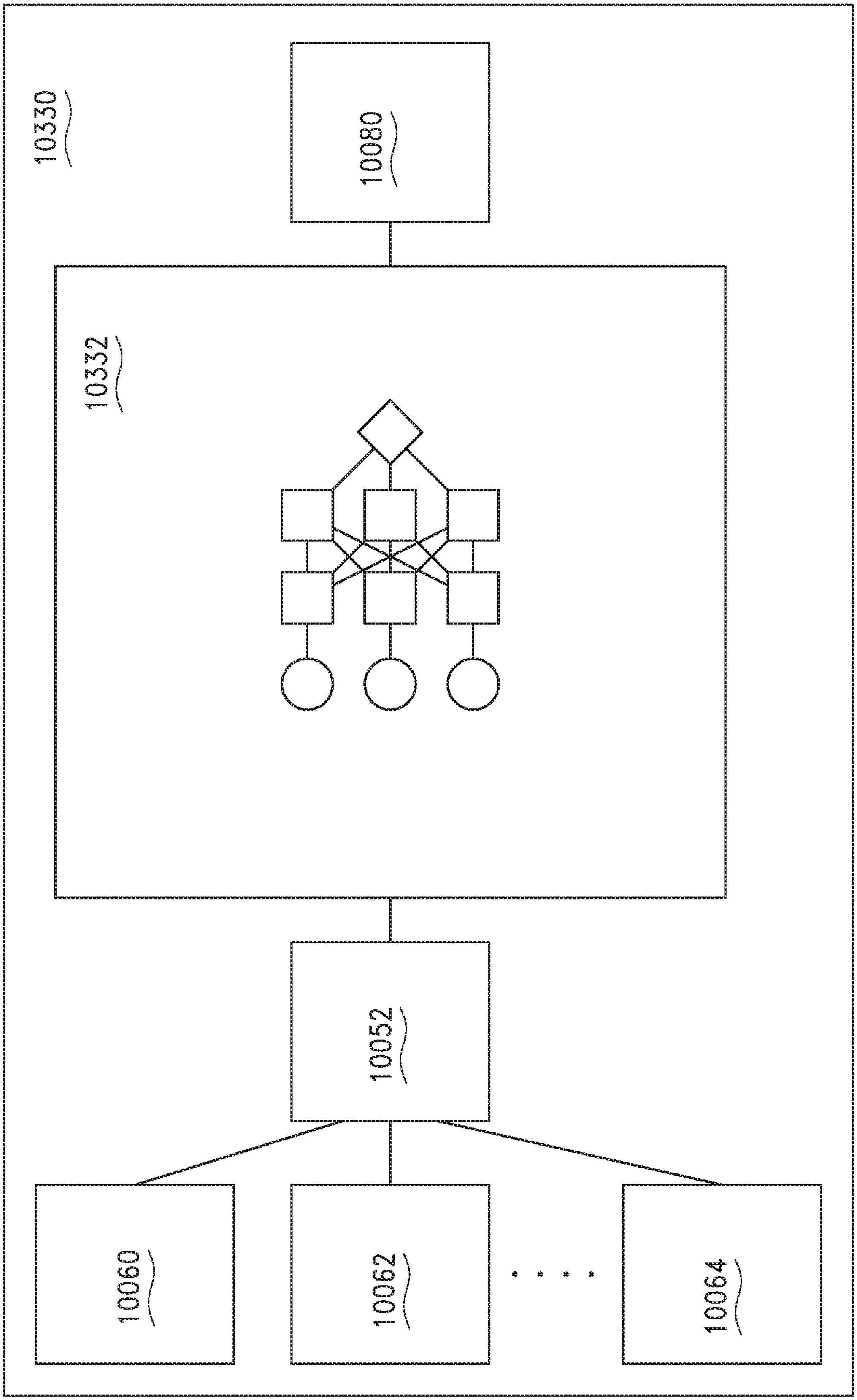
Figure 106:
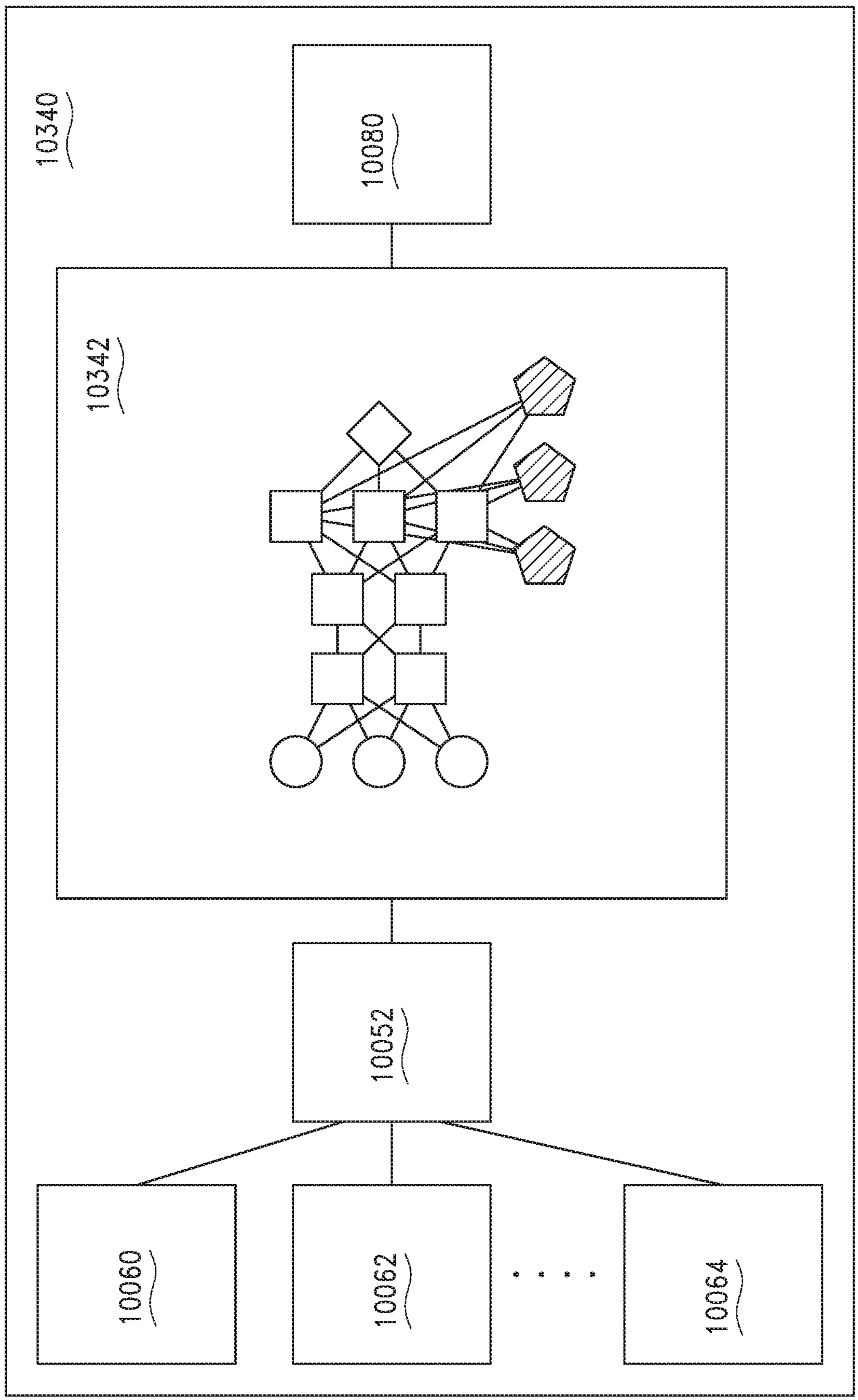

In FIG. 92, a streaming data collection system 10200 may include the DAQ instrument 10052 or other data collectors that may gather analog signals from sensors including the sensors 10060, 10062, 10064. The streaming data collection system 10200 may include a Hopfield network neural network 10202 that may connect to, integrate with, or interface with the expert system 10080. In FIG. 93, a streaming data collection system 10210 may include the DAQ instrument 10052 or other data collectors that may gather analog signals from sensors including the sensors 10060, 10062, 10064. The streaming data collection system 10210 may include a Boltzmann machine neural network 10212 that may connect to, integrate with, or interface with the expert system 10080. In FIG. 94, a streaming data collection system 10220 may include the DAQ instrument 10052 or other data collectors that may gather analog signals from sensors including the sensors 10060, 10062, 10064. The streaming data collection system 10220 may include a restricted BM neural network 10222 that may connect to, integrate with, or interface with the expert system 10080. In FIG. 95, a streaming data collection system 10230 may include the DAQ instrument 10052 or other data collectors that may gather analog signals from sensors including the sensors 10060, 10062, 10064. The streaming data collection system 10230 may include a deep belief neural network 10232 that may connect to, integrate with, or interface with the expert system 10080. In FIG. 96, a streaming data collection system 10240 may include the DAQ instrument 10052 or other data collectors that may gather analog signals from sensors including the sensors 10060, 10062, 10064. The streaming data collection system 10240 may include a deep convolutional neural network 10242 that may connect to, integrate with, or interface with the expert system 10080. In FIG. 97, a streaming data collection system 10250 may include the DAQ instrument 10052 or other data collectors that may gather analog signals from sensors including the sensors 10060, 10062, 10064. The streaming data collection system 10250 may include a deconvolutional neural network 10242 that may connect to, integrate with, or interface with the expert system 10080. In FIG. 98, a streaming data collection system 10260 may include the DAQ instrument 10052 or other data collectors that may gather analog signals from sensors including the sensors 10060, 10062, 10064. The streaming data collection system 10260 may include a deep convolutional inverse graphics neural network 10262 that may connect to, integrate with, or interface with the expert system 10080. In FIG. 99, a streaming data collection system 10270 may include the DAQ instrument 10052 or other data collectors that may gather analog signals from sensors including the sensors 10060, 10062, 10064. The streaming data collection system 10270 may include a generative adversarial neural network 10272 that may connect to, integrate with, or interface with the expert system 10080. In FIG. 90, a streaming data collection system 10280 may include the DAQ instrument 10052 or other data collectors that may gather analog signals from sensors including the sensors 10060, 10062, 10064. The streaming data collection system 10280 may include a liquid state machine neural network 10282 that may connect to, integrate with, or interface with the expert system 10080. In FIG. 101, a streaming data collection system 10290 may include the DAQ instrument 10052 or other data collectors that may gather analog signals from sensors including the sensors 10060, 10062, 10064. The streaming data collection system 10290 may include an extreme learning machine neural network 10292 that may connect to, integrate with, or interface with the expert system 10080. In FIG. 102, a streaming data collection system 10300 may include the DAQ instrument 10052 or other data collectors that may gather analog signals from sensors including the sensors 10060, 10062, 10064. The streaming data collection system 10300 may include an echo state neural network 10302 that may connect to, integrate with, or interface with the expert system 10080. In FIG. 103, a streaming data collection system 10310 may include the DAQ instrument 10052 or other data collectors that may gather analog signals from sensors including the sensors 10060, 10062, 10064. The streaming data collection system 10310 may include a deep residual neural network 10312 that may connect to, integrate with, or interface with the expert system 10080. In FIG. 104, a streaming data collection system 10320 may include the DAQ instrument 10052 or other data collectors that may gather analog signals from sensors including the sensors 10060, 10062, 10064. The streaming data collection system 10320 may include a Kohonen neural network 10322 that may connect to, integrate with, or interface with the expert system 10080. In FIG. 105, a streaming data collection system 10330 may include the DAQ instrument 10052 or other data collectors that may gather analog signals from sensors including the sensors 10060, 10062, 10064. The streaming data collection system 10330 may include a support vector machine neural network 10332 that may connect to, integrate with, or interface with the expert system 10080. In FIG. 106, a streaming data collection system 10340 may include the DAQ instrument 10052 or other data collectors that may gather analog signals from sensors including the sensors 10060, 10062, 10064. The streaming data collection system 10340 may include a neural Turing machine neural network 10342 that may connect to, integrate with, or interface with the expert system 10080.

The foregoing neural networks may have a variety of nodes or neurons, which may perform a variety of functions on inputs, such as inputs received from sensors or other data sources, including other nodes. Functions may involve weights, features, feature vectors, and the like. Neurons may include perceptrons, neurons that mimic biological functions (such as of the human senses of touch, vision, taste, hearing, and smell), and the like. Continuous neurons, such as with sigmoidal activation, may be used in the context of various forms of neural net, such as where back propagation is involved.

In many embodiments, an expert system or neural network may be trained, such as by a human operator or supervisor, or based on a data set, model, or the like. Training may include presenting the neural network with one or more training data sets that represent values, such as sensor data, event data, parameter data, and other types of data (including the many types described throughout this disclosure), as well as one or more indicators of an outcome, such as an outcome of a process, an outcome of a calculation, an outcome of an event, an outcome of an activity, or the like. Training may include training in optimization, such as training a neural network to optimize one or more systems based on one or more optimization approaches, such as Bayesian approaches, parametric Bayes classifier approaches, k-nearest-neighbor classifier approaches, iterative approaches, interpolation approaches, Pareto optimization approaches, algorithmic approaches, and the like. Feedback may be provided in a process of variation and selection, such as with a genetic algorithm that evolves one or more solutions based on feedback through a series of rounds.

In embodiments, a plurality of neural networks may be deployed in a cloud platform that receives data streams and other inputs collected (such as by mobile data collectors) in one or more industrial environments and transmitted to the cloud platform over one or more networks, including using network coding to provide efficient transmission. In the cloud platform, optionally using massively parallel computational capability, a plurality of different neural networks of several types (including modular forms, structure-adaptive forms, hybrids, and the like) may be used to undertake prediction, classification, control functions, and provide other outputs as described in connection with expert systems disclosed throughout this disclosure. The different neural networks may be structured to compete with each other (optionally including the use of evolutionary algorithms, genetic algorithms, or the like), such that an appropriate type of neural network, with appropriate input sets, weights, node types and functions, and the like, may be selected, such as by an expert system, for a specific task involved in a given context, workflow, environment process, system, or the like.

In embodiments, methods and systems described herein that involve an expert system or self-organization capability may use a feed forward neural network, which moves information in one direction, such as from a data input, like an analog sensor located on or proximal to an industrial machine, through a series of neurons or nodes, to an output. Data may move from the input nodes to the output nodes, optionally passing through one or more hidden nodes, without loops. In embodiments, feedforward neural networks may be constructed with various types of units, such as binary McCulloch-Pitts neurons, the simplest of which is a perceptron.

In embodiments, methods and systems described herein that involve an expert system or self-organization capability may use a radial basis function (RBF) neural network, which may be preferred in some situations involving interpolation in a multi-dimensional space (such as where interpolation is helpful in optimizing a multi-dimensional function, such as for optimizing a data marketplace as described here, optimizing the efficiency or output of a power generation system, a factory system, or the like, or other situation involving multiple dimensions). In embodiments, each neuron in the RBF neural network stores an example from a training set as a “prototype.” Linearity involved in the functioning of this neural network offers RBF the advantage of not typically suffering from problems with local minima or maxima In embodiments, methods and systems described herein that involve an expert system or self-organization capability may use a radial basis function (RBF) neural network, such as one that employs a distance criterion with respect to a center (e.g., a Gaussian function). A radial basis function may be applied as a replacement for a hidden layer (such as a sigmoidal hidden layer transfer) in a multi-layer perceptron. An RBF network may have two layers, such as the case where an input is mapped onto each RBF in a hidden layer. In embodiments, an output layer may comprise a linear combination of hidden layer values representing, for example, a mean predicted output. The output layer value may provide an output that is the same as or similar to that of a regression model in statistics. In classification problems, the output layer may be a sigmoid function of a linear combination of hidden layer values, representing a posterior probability. Performance in both cases is often improved by shrinkage techniques, such as ridge regression in classical statistics. This corresponds to a prior belief in small parameter values (and therefore smooth output functions) in a Bayesian framework. RBF networks may avoid local minima, because the only parameters that are adjusted in the learning process are the linear mapping from hidden layer to output layer. Linearity ensures that the error surface is quadratic and therefore has a single minimum. In regression problems, this can be found in one matrix operation. In classification problems, the fixed non-linearity introduced by the sigmoid output function may be handled using an iteratively re-weighted least squares function or the like.

RBF networks may use kernel methods such as support vector machines (SVM) and Gaussian processes (where the RBF is the kernel function). A non-linear kernel function may be used to project the input data into a space where the learning problem can be solved using a linear model.

In embodiments, an RBF neural network may include an input layer, a hidden layer, and a summation layer. In the input layer, one neuron appears in the input layer for each predictor variable. In the case of categorical variables, N-1 neurons are used, where N is the number of categories. The input neurons may, in embodiments, standardize the value ranges by subtracting the median and dividing by the interquartile range. The input neurons may then feed the values to each of the neurons in the hidden layer. In the hidden layer, a variable number of neurons may be used (determined by the training process). Each neuron may consist of a radial basis function that is centered on a point with as many dimensions as a number of predictor variables. The spread (e.g., radius) of the RBF function may be different for each dimension. The centers and spreads may be determined by training. When presented with a vector of input values from the input layer, a hidden neuron may compute a Euclidean distance of the test case from the neuron's center point and then apply the RBF kernel function to this distance, such as using the spread values. The resulting value may then be passed to the summation layer. In the summation layer, the value coming out of a neuron in the hidden layer may be multiplied by a weight associated with the neuron and may add to the weighted values of other neurons. This sum becomes the output. For classification problems, one output is produced (with a separate set of weights and summation units) for each target category. The value output for a category is the probability that the case being evaluated has that category. In training of an RBF, various parameters may be determined, such as the number of neurons in a hidden layer, the coordinates of the center of each hidden-layer function, the spread of each function in each dimension, and the weights applied to outputs as they pass to the summation layer. Training may be used by clustering algorithms (such as k-means clustering), by evolutionary approaches, and the like.

In embodiments, a recurrent neural network may have a time-varying, real-valued (more than just zero or one) activation (output). Each connection may have a modifiable real-valued weight. Some of the nodes are called labeled nodes, some output nodes, and others hidden nodes. For supervised learning in discrete time settings, training sequences of real-valued input vectors may become sequences of activations of the input nodes, one input vector at a time. At each time step, each non-input unit may compute its current activation as a nonlinear function of the weighted sum of the activations of all units from which it receives connections. The system can explicitly activate (independent of incoming signals) some output units at certain time steps.

In embodiments, methods and systems described herein that involve an expert system or self-organization capability may use a self-organizing neural network, such as a Kohonen self-organizing neural network, such as for visualization of views of data, such as low-dimensional views of high-dimensional data. The self-organizing neural network may apply competitive learning to a set of input data, such as from one or more sensors or other data inputs from or associated with an industrial machine. In embodiments, the self-organizing neural network may be used to identify structures in data, such as unlabeled data, such as in data sensed from a range of vibration, acoustic, or other analog sensors in an industrial environment, where sources of the data are unknown (such as where vibrations may be coming from any of a range of unknown sources). The self-organizing neural network may organize structures or patterns in the data, such that they can be recognized, analyzed, and labeled, such as identifying structures as corresponding to vibrations induced by the movement of a floor, or acoustic signals created by high frequency rotation of a shaft of a somewhat distant machine.

In embodiments, methods and systems described herein that involve an expert system or self-organization capability may use a recurrent neural network, which may allow for a bi-directional flow of data, such as where connected units (e.g., neurons or nodes) form a directed cycle. Such a network may be used to model or exhibit dynamic temporal behavior, such as those involved in dynamic systems including a wide variety of the industrial machines and devices described throughout this disclosure, such as a power generation machine operating at variable speeds or frequencies in variable conditions with variable inputs, a robotic manufacturing system, a refining system, or the like, where dynamic system behavior involves complex interactions that an operator may desire to understand, predict, control and/or optimize. For example, the recurrent neural network may be used to anticipate the state (such as a maintenance state, a fault state, an operational state, or the like), of an industrial machine, such as one performing a dynamic process or action. In embodiments, the recurrent neural network may use internal memory to process a sequence of inputs, such as from other nodes and/or from sensors and other data inputs from the industrial environment, of the various types described herein. In embodiments, the recurrent neural network may also be used for pattern recognition, such as for recognizing an industrial machine based on a sound signature, a heat signature, a set of feature vectors in an image, a chemical signature, or the like. In a non-limiting example, a recurrent neural network may recognize a shift in an operational mode of a turbine, a generator, a motor, a compressor, or the like (such as a gear shift) by learning to classify the shift from a training data set consisting of a stream of data from tri-axial vibration sensors and/or acoustic sensors applied to one or more of such machines.

In embodiments, methods and systems described herein that involve an expert system or self-organization capability may use a modular neural network, which may comprise a series of independent neural networks (such as ones of various types described herein) that are moderated by an intermediary. Each of the independent neural networks in the modular neural network may work with separate inputs, accomplishing subtasks that make up the task the modular network as whole is intended to perform. For example, a modular neural network may comprise a recurrent neural network for pattern recognition, such as to recognize what type of industrial machine is being sensed by one or more sensors that are provided as input channels to the modular network and an RBF neural network for optimizing the behavior of the machine once understood. The intermediary may accept inputs of each of the individual neural networks, process them, and create output for the modular neural network, such an appropriate control parameter, a prediction of state, or the like.

Combinations among any of the pairs, triplets, or larger combinations, of the various neural network types described herein, are encompassed by the present disclosure. This may include combinations where an expert system uses one neural network for recognizing a pattern (e.g., a pattern indicating a problem or fault condition) and a different neural network for self-organizing an activity or work flow based on the recognized pattern (such as providing an output governing autonomous control of a system in response to the recognized condition or pattern). This may also include combinations where an expert system uses one neural network for classifying an item (e.g., identifying a machine, a component, or an operational mode) and a different neural network for predicting a state of the item (e.g., a fault state, an operational state, an anticipated state, a maintenance state, or the like). Modular neural networks may also include situations where an expert system uses one neural network for determining a state or context (such as a state of a machine, a process, a work flow, a marketplace, a storage system, a network, a data collector, or the like) and a different neural network for self-organizing a process involving the state or context (e.g., a data storage process, a network coding process, a network selection process, a data marketplace process, a power generation process, a manufacturing process, a refining process, a digging process, a boring process, or other process described herein).

In embodiments, methods and systems described herein that involve an expert system or self-organization capability may use a physical neural network where one or more hardware elements is used to perform or simulate neural behavior. In embodiments, one or more hardware neurons may be configured to stream voltage values that represent analog vibration sensor data voltage values, to calculate velocity information from analog sensor inputs representing acoustic, vibration or other data, to calculation acceleration information from sensor inputs representing acoustic, vibration, or other data, or the like. One or more hardware nodes may be configured to stream output data resulting from the activity of the neural net. Hardware nodes, which may comprise one or more chips, microprocessors, integrated circuits, programmable logic controllers, application-specific integrated circuits, field-programmable gate arrays, or the like, may be provided to optimize the speed, input/output efficiency, energy efficiency, signal to noise ratio, or other parameter of some part of a neural net of any of the types described herein. Hardware nodes may include hardware for acceleration of calculations (such as dedicated processors for performing basic or more sophisticated calculations on input data to provide outputs, dedicated processors for filtering or compressing data, dedicated processors for decompressing data, dedicated processors for compression of specific file or data types (e.g., for handling image data, video streams, acoustic signals, vibration data, thermal images, heat maps, or the like), and the like. A physical neural network may be embodied in a data collector, such as a mobile data collector described herein, including one that may be reconfigured by switching or routing inputs in varying configurations, such as to provide different neural net configurations within the data collector for handling different types of inputs (with the switching and configuration optionally under control of an expert system, which may include a software-based neural net located on the data collector or remotely). A physical, or at least partially physical, neural network may include physical hardware nodes located in a storage system, such as for storing data within an industrial machine or in an industrial environment, such as for accelerating input/output functions to one or more storage elements that supply data to or take data from the neural net. A physical, or at least partially physical, neural network may include physical hardware nodes located in a network, such as for transmitting data within, to or from an industrial environment, such as for accelerating input/output functions to one or more network nodes in the net, accelerating relay functions, or the like. In embodiments of a physical neural network, an electrically adjustable resistance material may be used for emulating the function of a neural synapse. In embodiments, the physical hardware emulates the neurons, and software emulates the neural network between the neurons. In embodiments, neural networks complement conventional algorithmic computers. They are versatile and can be trained to perform appropriate functions without the need for any instructions, such as classification functions, optimization functions, pattern recognition functions, control functions, selection functions, evolution functions, and others.

In embodiments, methods and systems described herein that involve an expert system or self-organization capability may use a multilayered feed forward neural network, such as for complex pattern classification of one or more items, phenomena, modes, states, or the like. In embodiments, a multilayered feedforward neural network may be trained by an optimization technical, such as a genetic algorithm, such as to explore a large and complex space of options to find an optimum, or near-optimum, global solution. For example, one or more genetic algorithms may be used to train a multilayered feedforward neural network to classify complex phenomena, such as to recognize complex operational modes of industrial machines, such as modes involving complex interactions among machines (including interference effects, resonance effects, and the like), modes involving non-linear phenomena, such as impacts of variable speed shafts, which may make analysis of vibration and other signals difficult, modes involving critical faults, such as where multiple, simultaneous faults occur, making root cause analysis difficult, and others. In embodiments, a multilayered feed forward neural network may be used to classify results from ultrasonic monitoring or acoustic monitoring of an industrial machine, such as monitoring an interior set of components within a housing, such as motor components, pumps, valves, fluid handling components, and many others, such as in refrigeration systems, refining systems, reactor systems, catalytic systems, and others.

In embodiments, methods and systems described herein that involve an expert system or self-organization capability may use a feedforward, back-propagation multi-layer perceptron (MLP) neural network, such as for handling one or more remote sensing applications, such as for taking inputs from sensors distributed throughout various industrial environments. In embodiments, the MLP neural network may be used for classification of physical environments, such as mining environments, exploration environments, drilling environments, and the like, including classification of geological structures (including underground features and above ground features), classification of materials (including fluids, minerals, metals, and the like), and other problems. This may include fuzzy classification.

In embodiments, methods and systems described herein that involve an expert system or self-organization capability may use a structure-adaptive neural network, where the structure of a neural network is adapted, such as based on a rule, a sensed condition, a contextual parameter, or the like. For example, if a neural network does not converge on a solution, such as classifying an item or arriving at a prediction, when acting on a set of inputs after some amount of training, the neural network may be modified, such as from a feedforward neural network to a recurrent neural network, such as by switching data paths between some subset of nodes from unidirectional to bi-directional data paths. The structure adaptation may occur under control of an expert system, such as to trigger adaptation upon occurrence of a trigger, rule or event, such as recognizing occurrence of a threshold (such as an absence of a convergence to a solution within a given amount of time) or recognizing a phenomenon as requiring different or additional structure (such as recognizing that a system is varying dynamically or in a non-linear fashion). In one non-limiting example, an expert system may switch from a simple neural network structure like a feedforward neural network to a more complex neural network structure like a recurrent neural network, a convolutional neural network, or the like upon receiving an indication that a continuously variable transmission is being used to drive a generator, turbine, or the like in a system being analyzed.

In embodiments, methods and systems described herein that involve an expert system or self-organization capability may use an autoencoder, autoassociator or Diabolo neural network, which may be similar to a multilayer perceptron ("MLP") neural network, such as where there may be an input layer, an output layer and one or more hidden layers connecting them. However, the output layer in the auto-encoder may have the same number of units as the input layer, where the purpose of the MLP neural network is to reconstruct its own inputs (rather than just emitting a target value). Therefore, the auto encoders may operate as an unsupervised learning model. An auto encoder may be used, for example, for unsupervised learning of efficient codings, such as for dimensionality reduction, for learning generative models of data, and the like. In embodiments, an auto-encoding neural network may be used to self-learn an efficient network coding for transmission of analog sensor data from an industrial machine over one or more networks. In embodiments, an auto-encoding neural network may be used to self-learn an efficient storage approach for storage of streams of analog sensor data from an industrial environment.

In embodiments, methods and systems described herein that involve an expert system or self-organization capability may use a probabilistic neural network ("PNN"), which in embodiments may comprise a multi-layer (e.g., four-layer) feedforward neural network, where layers may include input layers, hidden layers, pattern/summation layers and an output layer. In an embodiment of a PNN algorithm, a parent probability distribution function (PDF) of each class may be approximated, such as by a Parzen window and/or a non-parametric function. Then, using the PDF of each class, the class probability of a new input is estimated, and Bayes' rule may be employed, such as to allocate it to the class with the highest posterior probability. A PNN may embody a Bayesian network and may use a statistical algorithm or analytic technique, such as Kernel Fisher discriminant analysis technique. The PNN may be used for classification and pattern recognition in any of a wide range of embodiments disclosed herein. In one non-limiting example, a probabilistic neural network may be used to predict a fault condition of an engine based on collection of data inputs from sensors and instruments for the engine.

In embodiments, methods and systems described herein that involve an expert system or self-organization capability may use a time delay neural network (TDNN), which may comprise a feedforward architecture for sequential data that recognizes features independent of sequence position. In embodiments, to account for time shifts in data, delays are added to one or more inputs, or between one or more nodes, so that multiple data points (from distinct points in time) are analyzed together. A time delay neural network may form part of a larger pattern recognition system, such as using a perceptron network. In embodiments, a TDNN may be trained with supervised learning, such as where connection weights are trained with back propagation or under feedback. In embodiments, a TDNN may be used to process sensor data from distinct streams, such as a stream of velocity data, a stream of acceleration data, a stream of temperature data, a stream of pressure data, and the like, where time delays are used to align the data streams in time, such as to help understand patterns that involve understanding of the various streams (e.g., where increases in pressure and acceleration occur as an industrial machine overheats).

In embodiments, methods and systems described herein that involve an expert system or self-organization capability may use a convolutional neural network (referred to in some cases as a CNN, a ConvNet, a shift invariant neural network, or a space invariant neural network), wherein the units are connected in a pattern similar to the visual cortex of the human brain. Neurons may respond to stimuli in a restricted region of space, referred to as a receptive field. Receptive fields may partially overlap, such that they collectively cover the entire (e.g., visual) field. Node responses can be calculated mathematically, such as by a convolution operation, such as using multilayer perceptron that use minimal preprocessing. A convolutional neural network may be used for recognition within images and video streams, such as for recognizing a type of machine in a large environment using a camera system disposed on a mobile data collector, such as on a drone or mobile robot. In embodiments, a convolutional neural network may be used to provide a recommendation based on data inputs, including sensor inputs and other contextual information, such as recommending a route for a mobile data collector. In embodiments, a convolutional neural network may be used for processing inputs, such as for natural language processing of instructions provided by one or more parties involved in a workflow in an environment. In embodiments, a convolutional neural network may be deployed with a large number of neurons (e.g., 100,000, 500,000 or more), with multiple (e.g., 4, 5, 6 or more) layers, and with many (e.g., millions) parameters. A convolutional neural net may use one or more convolutional nets.

In embodiments, methods and systems described herein that involve an expert system or self-organization capability may use a regulatory feedback network, such as for recognizing emergent phenomena (such as new types of faults not previously understood in an industrial environment).

In embodiments, methods and systems described herein that involve an expert system or self-organization capability may use a self-organizing map ("SOM"), involving unsupervised learning. A set of neurons may learn to map points in an input space to coordinates in an output space. The input space can have different dimensions and topology from the output space, and the SOM may preserve these while mapping phenomena into groups.

In embodiments, methods and systems described herein that involve an expert system or self-organization capability may use a learning vector quantization neural net ("LVQ"). Prototypical representatives of the classes may parameterize, together with an appropriate distance measure, in a distance-based classification scheme.

In embodiments, methods and systems described herein that involve an expert system or self-organization capability may use an echo state network ("ESN"), which may comprise a recurrent neural network with a sparsely connected, random hidden layer. The weights of output neurons may be changed (e.g., the weights may be trained based on feedback). In embodiments, an ESN may be used to handle time series patterns, such as, in an example, recognizing a pattern of events associated with a gear shift in an industrial turbine, generator, or the like.

In embodiments, methods and systems described herein that involve an expert system or self-organization capability may use a bi-directional, recurrent neural network ("BRNN"), such as using a finite sequence of values (e.g., voltage values from a sensor) to predict or label each element of the sequence based on both the past and the future context of the element. This may be done by adding the outputs of two RNNs, such as one processing the sequence from left to right, the other one from right to left. The combined outputs are the predictions of target signals, such as those provided by a teacher or supervisor. A bi-directional RNN may be combined with a long short-term memory RNN.

In embodiments, methods and systems described herein that involve an expert system or self-organization capability may use a hierarchical RNN that connects elements in various ways to decompose hierarchical behavior, such as into useful subprograms. In embodiments, a hierarchical RNN may be used to manage one or more hierarchical templates for data collection in an industrial environment.

In embodiments, methods and systems described herein that involve an expert system or self-organization capability may use a stochastic neural network, which may introduce random variations into the network. Such random variations can be viewed as a form of statistical sampling, such as Monte Carlo sampling.

In embodiments, methods and systems described herein that involve an expert system or self-organization capability may use a genetic scale recurrent neural network. In such embodiments, a RNN (often a LS™) is used where a series is decomposed into a number of scales where every scale informs the primary length between two consecutive points. A first order scale consists of a normal RNN, a second order consists of all points separated by two indices and so on. The Nth order RNN connects the first and last node. The outputs from all the various scales may be treated as a committee of members, and the associated scores may be used genetically for the next iteration.

In embodiments, methods and systems described herein that involve an expert system or self-organization capability may use a committee of machines ("CoM"), comprising a collection of different neural networks that together "vote" on a given example. Because neural networks may suffer from local minima, starting with the same architecture and training, but using randomly different initial weights often gives different results. A CoM tends to stabilize the result.

In embodiments, methods and systems described herein that involve an expert system or self-organization capability may use an associative neural network ("ASNN"), such as involving an extension of committee of machines that combines multiple feed forward neural networks and a k-nearest neighbor technique. It may use the correlation between ensemble responses as a measure of distance amid the analyzed cases for the kNN. This corrects the bias of the neural network ensemble. An associative neural network may have a memory that can coincide with a training set. If new data become available, the network instantly improves its predictive ability and provides data approximation (self-learns) without retraining. Another important feature of ASNN is the possibility to interpret neural network results by analysis of correlations between data cases in the space of models.

In embodiments, methods and systems described herein that involve an expert system or self-organization capability may use an instantaneously trained neural network ("ITNN"), where the weights of the hidden and the output layers are mapped directly from training vector data.

In embodiments, methods and systems described herein that involve an expert system or self-organization capability may use a spiking neural network, which may explicitly consider the timing of inputs. The network input and output may be represented as a series of spikes (such as a delta function or more complex shapes). SNNs can process information in the time domain (e.g., signals that vary over time, such as signals involving dynamic behavior of industrial machines). They are often implemented as recurrent networks.

In embodiments, methods and systems described herein that involve an expert system or self-organization capability may use a dynamic neural network that addresses nonlinear multivariate behavior and includes learning of time-dependent behavior, such as transient phenomena and delay effects. Transients may include behavior of shifting industrial components, such as variable speeds of rotating shafts or other rotating components.

In embodiments, cascade correlation may be used as an architecture and supervised learning algorithm, supplementing adjustment of the weights in a network of fixed topology. Cascade-correlation may begin with a minimal network, then automatically trains and adds new hidden units one by one, creating a multi-layer structure. Once a new hidden unit has been added to the network, its input-side weights may be frozen. This unit then becomes a permanent feature-detector in the network, available for producing outputs or for creating other, more complex feature detectors. The cascade-correlation architecture may learn quickly, determine its own size and topology, and retain the structures it has built even if the training set changes and requires no back-propagation.

In embodiments, methods and systems described herein that involve an expert system or self-organization capability may use a neuro-fuzzy network, such as involving a fuzzy inference system in the body of an artificial neural network. Depending on the type, several layers may simulate the processes involved in a fuzzy inference, such as fuzzification, inference, aggregation and defuzzification. Embedding a fuzzy system in a general structure of a neural net as the benefit of using available training methods to find the parameters of a fuzzy system.

In embodiments, methods and systems described herein that involve an expert system or self-organization capability may use a compositional pattern-producing network ("CPPN"), such as a variation of an associative neural network ("ANN") that differs the set of activation functions and how they are applied. While typical ANNs often contain only sigmoid functions (and sometimes Gaussian functions), CPPNs can include both types of functions and many others. Furthermore, CPPNs may be applied across the entire space of possible inputs, so that they can represent a complete image. Since they are compositions of functions, CPPNs in effect encode images at infinite resolution and can be sampled for a particular display at whatever resolution is optimal This type of network can add new patterns without re-training. In embodiments, methods and systems described herein that involve an expert system or self-organization capability may use a one-shot associative memory network, such as by creating a specific memory structure, which assigns each new pattern to an orthogonal plane using adjacently connected hierarchical arrays.

In embodiments, methods and systems described herein that involve an expert system or self-organization capability may use a hierarchical temporal memory ("HTM") neural network, such as involving the structural and algorithmic properties of the neocortex. HTM may use a biomimetic model based on memory-prediction theory. HTM may be used to discover and infer the high-level causes of observed input patterns and sequences.

In embodiments, methods and systems described herein that involve an expert system or self-organization capability may use a holographic associative memory ("HAM") neural network, which may comprise an analog, correlation-based, associative, stimulus-response system. Information may be mapped onto the phase orientation of complex numbers. The memory is effective for associative memory tasks, generalization and pattern recognition with changeable attention.

In embodiments, various embodiments involving network coding may be used to code transmission data among network nodes in neural net, such as where nodes are located in one or more data collectors or machines in an industrial environment.

Clause 1. In embodiments, an expert system for processing a plurality of inputs collected from sensors in an industrial environment, comprising: A modular neural network, where the expert system uses one type of neural network for recognizing a pattern and a different neural network for self-organizing an activity in the industrial environment. 2. A system of clause 1, wherein the pattern indicates a fault condition of a machine. 3. A system of clause 1, wherein the self-organized activity governs autonomous control of a system in the environment. 4. A system of clause 3, wherein the expert system organizes the activity based at least in part on the recognized pattern. 5. An expert system for processing a plurality of inputs collected from sensors in an industrial environment, comprising:

a modular neural network, where the expert system uses one neural network for classifying an item and a different neural network for predicting a state of the item. 6. A system of clause 5, wherein classifying an item includes at least one of identifying a machine, a component, and an operational mode of a machine in the environment. 7. A system of clause 5, wherein predicting a state includes predicting at least one of a fault state, an operational state, an anticipated state, and a maintenance state. 8. An expert system for processing a plurality of inputs collected from sensors in an industrial environment, comprising: a modular neural network, where the expert system uses one neural network for determining at least one of a state and a context and a different neural network for self-organizing a process involving the at least one state or context. 9. A system of clause 8, wherein the stat or context includes at least one state of a machine, a process, a work flow, a marketplace, a storage system, a network, and a data collector. 10. A system of clause 8, wherein the self-organized process includes at least one of a data storage process, a network coding process, a network selection process, a data marketplace process, a power generation process, a manufacturing process, a refining process, a digging process, and a boring process. 11. An expert system for processing a plurality of inputs collected from sensors in an industrial environment, comprising: a modular neural network, comprising at least two neural networks selected from the group consisting of feed forward neural networks, radial basis function neural networks, self-organizing neural networks, Kohonen self-organizing neural networks, recurrent neural networks, modular neural networks, artificial neural networks, physical neural networks, multi-layered neural networks, convolutional neural networks, a hybrids of a neural networks with another expert system, auto-encoder neural networks, probabilistic neural networks, time delay neural networks, convolutional neural networks, regulatory feedback neural networks, radial basis function neural networks, recurrent neural networks, Hopfield neural networks, Boltzmann machine neural networks, self-organizing map ("SOM") neural networks, learning vector quantization ("LVQ") neural networks, fully recurrent neural networks, simple recurrent neural networks, echo state neural networks, long short-term memory neural networks, bi-directional neural networks, hierarchical neural networks, stochastic neural networks, genetic scale RNN neural networks, committee of machines neural networks, associative neural networks, physical neural networks, instantaneously trained neural networks, spiking neural networks, neocognitron neural networks, dynamic neural networks, cascading neural networks, neuro-fuzzy neural networks, compositional pattern-producing neural networks, memory neural networks, hierarchical temporal memory neural networks, deep feed forward neural networks, gated recurrent unit ("GCU") neural networks, auto encoder neural networks, variational auto encoder neural networks, de-noising auto encoder neural networks, sparse auto-encoder neural networks, Markov chain neural networks, restricted Boltzmann machine neural networks, deep belief neural networks, deep convolutional neural networks, deconvolutional neural networks, deep convolutional inverse graphics neural networks, generative adversarial neural networks, liquid state machine neural networks, extreme learning machine neural networks, echo state neural networks, deep residual neural networks, support vector machine neural networks, neural Turing machine neural networks, and holographic associative memory neural networks. 12. A system for collecting data in an industrial environment, comprising A physical neural network embodied in a mobile data collector, wherein the mobile data collector is adapted to be reconfigured by routing inputs in varying configurations, such that different neural net configurations are enabled within the data collector for handling different types of inputs. 13. A system of clause 12, wherein reconfiguration occurs under control of an expert system. 14. A system of clause 13, wherein the expert system includes a software-based neural net. 15. A system of clause 14, wherein the software-based system is located on the data collector. 16. A system of clause 14, wherein the software-based system is located remotely from the data collector. 17. A system for processing data collected from an industrial environment, the system comprising: a plurality of neural networks deployed in a cloud platform that receives data streams and other inputs collected from one or more industrial environments and transmitted to the cloud platform over one or more networks, wherein the neural networks are of different types. 18. A system of clause 17, wherein the plurality of neural networks includes at least one modular neural network. 19. A system of clause 17, wherein the plurality of neural networks includes at least one structure-adaptive neural network. 20. A system of clause 17, wherein the neural networks are structured to compete with each other under control of an expert system, such as by processing input data sets from the same industrial environment to provide outputs and comparing the outputs to at least one measure of success. 21. A system of clause 20, wherein a genetic algorithm is used to facilitate variation and selection for the competing neural networks. 22. A system of clause 20, wherein the measure of success includes at least one of the following measures: a measure of predictive accuracy, a measure of classification accuracy, an efficiency measure, a profit measure, a maintenance measure, a safety measure, and a yield measure. 23. A system, comprising: a network coding system for coding transmission of data among network nodes in neural network, wherein the nodes comprise hardware devices located in at least one of one or more data collectors, one or more storage systems, and one or more network devices located in an industrial environment.

Within the data collection, monitoring, and control environment of the industrial IoT are large and various sensor sets, which make efficient setup and timely changes to sensor data collection a challenge. Continuous collection from all sensors may be impossible given the large number of sensors and limited resources, such as limited availability of power and limited data collection and management facilities, including various limitations in availability and performance of sensor data collection devices, input/output interfaces, data transfer facilities, data storage, data analysis facilities, and the like. The number of sensors collected from at any given time must therefore be limited in an intelligent but timely manner, both at the time of setting up initial collection and during the process of collection, including handling rapid changes to a present collection scheme based on a change in state of a system, operational conditions (e.g., an alert condition, change in operational mode, etc.), or the like. Embodiments of the methods and systems disclosed herein may therefore include rapid route creation and modification for routing collectors, such as by taking advantage of hierarchical templates, execution of smart route changes, monitoring and responding to changes in operational conditions, and the like.

In embodiments, rapid route creation and modification for data collection in an industrial environment may take advantage of hierarchical templates. Templates may be used to take advantage of 'like' machinery that can utilize the same hierarchical sensor routing scheme. For example, among many possible types of machines about which data may be collected, the members of a certain class of motor, such as a stepper motor class, may have very similar sensor routing needs, such as for routine operations, routine maintenance, and failure mode detection, that may be described in a common hierarchy of sensor collection routines. The user installing a new stepper motor may then use the 'stepper motor hierarchical routing template' for the new motor. After installation, the stepper motor hierarchical routing template may then be used to change the routing schemes for changing conditions. The user may optionally make adjustments to the template as needed per unique motor functions, applications, environments, modes, and the like. The use of a template for deploying a routing scheme greatly reduces the time a user requires to configure the routing scheme for a new motor, or to deploy new routing technologies on an existing system that utilizes traditional sensor collection methods. Once the hierarchical routing template is in place, the sensor collection routine may be changed quickly based on the template, thus allowing for rapid route modification under changing conditions, such as: a change in the operating mode of the stepper motor that requires a different subset of sensors for monitoring, a limit alert or failure indication that requires a more focused subset of sensors for use in diagnosing the problem, and the like. Hierarchical routing templates thus allow for rapid deployment of sensor routing configurations, as well as allowing the sensed industrial environment to be altered dynamically as conditions change.

A functional hierarchy of routing templates may include different hierarchical configurations for a component, machine, system, industrial environment, and the like, including all sensors and a plurality of configurations formed from a subset of all sensors. At a system level, an 'all-sensor' configuration may include: a connection map to all sensors in a system, mapping to all onboard instrumentation sensors (e.g., monitoring points reporting within a machine or set of machines), mapping to an environment's sensors (e.g., monitoring points around the machines/equipment, but not necessarily onboard), mapping to available sensors on data collectors (e.g., data collectors that can be flexibly provisioned for particular data among different kinds), a unified map combining different individual mappings, and the like. A routing configuration may be provided, such as to indicate how to implement an operational routing scheme, a scheduled maintenance routing scheme (e.g., collecting from a greater set of overall sensors than in operational mode, but distributed across the system, or a focused sensor set for specific components, functions, and modes), one or more failure mode routing schemes for multiple focused sensor collection groups targeting different failure mode analyses (e.g., for a motor, one failure mode may be for bearings, another for startup speed-torque, where a different subset of sensor data is needed based on the failure mode, such as detected in anomalous readings taken during operations or maintenance), power savings (e.g., weather conditions necessitating reduced plant power), and the like.

As noted, hierarchical templates may also be conditional (e.g., rule-based), such as templates with conditional routing based on parameters, such as sensed data during a first collection period, where a subsequent routing configuration is varied. Within the hierarchy, nodes in a graph or tree may indicate forks by which conditional logic may be used, such as to select a given subset of sensors for a given operational mode. Thus, the hierarchical template may be associated with a rule-based or model-based expert system, which may facilitate automated routing based on the hierarchical template and based on observed conditions, such as based on a type of machine and its operational state, environmental context, or the like. In a non-limiting example, a hierarchical template may have an initial collection configuration and a conditional hierarchy in place to switch from the initial collection configuration to a second collection configuration based on the sensed conditions of an initial sensor collection. Continuing this example, among various possible machines, a conveyor system may have a plurality of sensors for collection in an initial collection, but once the first data is collected and analyzed, if the conveyor is determined to be in an idle state (such as due to the absence of a signal above a minimum threshold on a motion sensor), then the system may switch to a sensor data collection regime that is appropriate for the idles state of the conveyor (e.g., using a very small subset of the plurality of sensors, such as just using the motion sensor to detect departure from the idle state, at which point the original regime may be renewed and the rest of a sensor set may be re-engaged). Thus, when the collection of sensor data detects a changed condition to a state, an operational mode, an environmental condition, or the like, the sensor data collection may be switched to an appropriate configuration.

Hierarchical templates for one collector may be based on coordination of routing with that of other collectors. For instance, a collector might be set up to perform vibration analysis while another collector is set up to perform pressure or temperature on each machine in a set of similar machines, rather than having each machine collect all of the data on each machine, where otherwise setup for different sensor types may be required for each collector for each machine. Factors such as the duration of sampling required, the time required to set up a given sensor, the amount of power consumed, the time available for collection as a whole, the data rate of input/output of a sensor and/or the collector, the bandwidth of a channel (wired or wireless) available for transmission of collected data, and the like can be considered in arranging the coordination of the routing of two or more collectors, such that various parallel and serial configurations may be undertaken to achieve an overall effectiveness. This may include optimizing the coordination using an expert system, such as a rule-based optimization, a model-based optimization, or optimization using machine learning.

A machine learning system may create a hierarchical template structure for improved routing, such as for teaching the system the default operating conditions (e.g., normal operations mode, systems online and average production), peak operations mode (max capability), slack production, and the like. The machine learning system may create a new hierarchical template based on monitored conditions, such as a template based on a production level profile, a rate of production profile, a detected failure mode pattern analysis, and the like. The application of a new machine learning created template may be based on a mode matching between current production conditions and a machine learning template condition (e.g., the machine learning system creates a new template for a new production profile, and applies that new template whenever that new profile is detected).

Rapid route creation may be enabled using one or more hierarchical routing templates, such as when a routing template pre-establishes a routing scheme for different conditions, and when a trigger event executes a change in the sensor routing scheme to accommodate the condition. In embodiments, the trigger event may be an automatic change in routing based on a trigger that indicates a possible failure mode that forces a change in routing scheme from operational to failure mode analysis; a human-executed change in routing scheme based on received sensor data; a learned routing change based on machine learning of when to trigger a change (e.g., as based on a machine being fed with a set of human-executed or human-supervised changes); a manual routing change (e.g., optional to automatic/rapid automatic change); a human executed change based on observed device performance; and the like. Routing changes may include: changing from an operational mode to an accelerated maintenance, a failure mode analysis, a power saving mode a high-performance/high-output mode (e.g., for peak power in a generation plant), and the like.

Switching hierarchical template configurations may be executed based on connectivity with end-device sensors. In a highly automated collection routing environment (e.g., an indoor networked assembly plant) different routing collection configurations may be employed for fixed and flexible industrial layouts. In a fixed industrial layout, such as a layout with a high degree of wired connectivity between end-device sensors, automated collectors, and networks, there may be different routing configurations for a network routing hierarchy portion, a collector sensor-collection hierarchy portion, a storage portion, and the like. For a more flexible industrial layout with various wired and wireless connections between end-device sensors, automated collectors, and networks, there may be different schemes. For instance, a moderately automated collection routing environment may include: automatic collection and periodic network connection; a robot-carried collector for periodic collection (e.g., a ground-based robot, a drone, an underwater device, a robot with network connection, a robot with intermittent network connection, a robot that periodically uploads collection); a routing scheme with periodic collection and automated routing; a scheme only collecting periodically but routed directly upon collection; a routing scheme with periodic collection and periodic automated routing to collect periodically; and, over longer periods of time, periodically routing multiple collections; and the like. For a lower degree of automated collection routing, there may be a combination of: automatic collection and human-aided collectors (e.g., humans collecting alone, humans aided by robots), scheduled collection and human-aided collectors (e.g., humans initiating collection, humans aided by robots for collection initiation, human launching a drone to collect data at a remote site), and the like.

Figure 107:
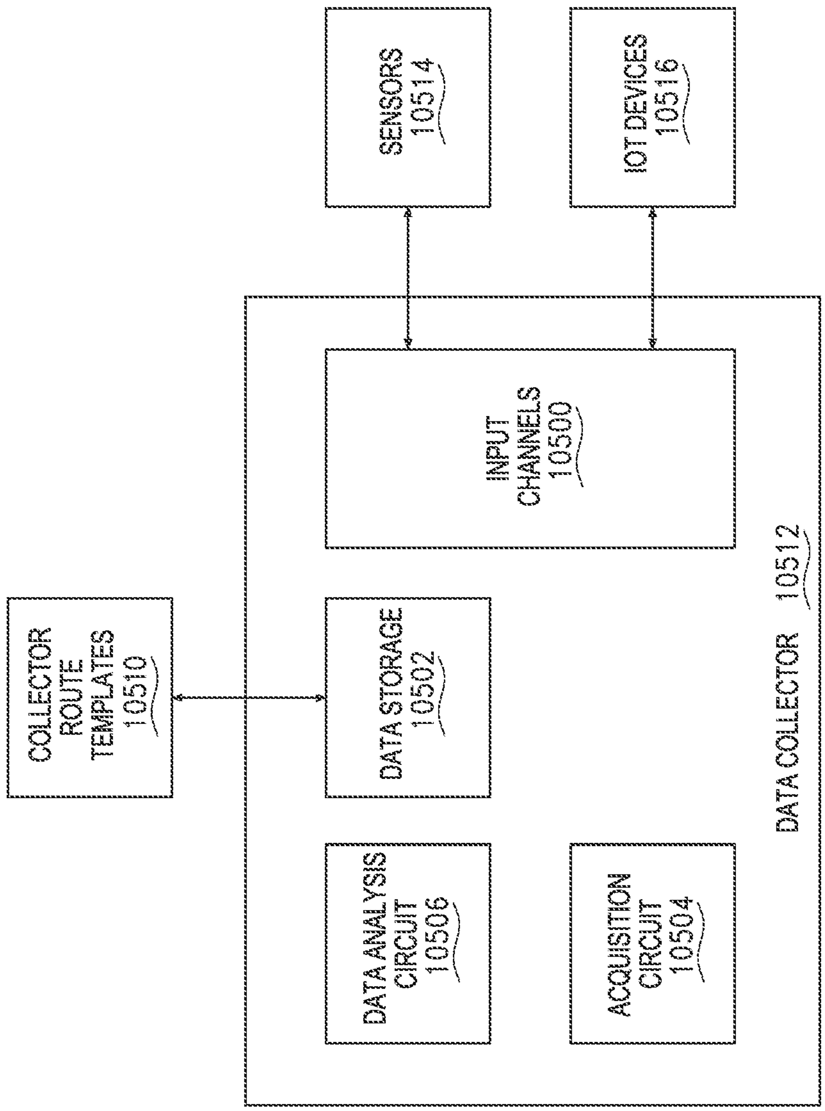
FIG. 107 through FIG. 109 are diagrammatic views of components and interactions of a data collection architecture involving a collector of route templates and the routing of data collectors in an industrial environment in accordance with the present disclosure.

In embodiments, and referring to FIG. 107, hierarchical templates may be utilized by a local data collection system 10500 for collection and monitoring of data collected through a plurality of input channels 10500, such as data from sensors 10514, IoT devices 10516, and the like. The local collection system 10512, also referred to herein as a data collector 10512, may comprise a data storage 10502; a data acquisition circuit 10504; a data analysis circuit 10506; and the like, wherein the monitoring facilities may be deployed: locally on the data collector 10512; in part locally on the data collector and in part on a remote information technology infrastructure component apart from the data collector; and the like. A monitoring system may comprise a plurality of input channels communicatively coupled to the data collector 10512. The data storage 10502 may be structured to store a plurality of collector route templates 10510 and sensor specifications for sensors 10514 that correspond to the input channels 10500, wherein the plurality of collector route templates 10510 each comprise a different sensor collection routine. A data acquisition circuit 10504 may be structured to interpret a plurality of detection values, each of the plurality of detection values corresponding to at least one of the input channels 10500, and a data analysis circuit 10506 structured to receive output data from the plurality of input channels 10500 and evaluate a current routing template collection routine based on the received output data, wherein the data collector 10512 is configured to switch from the current routing template collection routine to an alternative routing template collection routine based on the content of the output data. The monitoring system may further utilize a machine learning system (e.g., a neural network expert system), rule-based templates (e.g., based on an operational state of a machine with respect to which the input channels provide information, the input channels provide information, the input channels provide information), smart route changes, alarm states, network connectivity, self-organization amongst a plurality of data collectors, coordination of sensor groups, and the like.

In embodiments, evaluation of the current routing templates may be based on operational mode routing collection schemes, such as a normal operational mode, a peak operational mode, an idle operational mode, a maintenance operational mode, a power saving operational mode, and the like. As a result of monitoring, the data collector may switch from a current routing template collection routine because the data analysis circuit determines a change in operating modes, such as the operating mode changing from an operational mode to an accelerated maintenance mode, the operating mode changing from an operational mode to a failure mode analysis mode, the operating mode changing from an operational mode to a power-saving mode, the operating mode changing from an operational mode to a high-performance mode, and the like. The data collector may switch from a current routing template collection routine based on a sensed change in a mode of operation, such as a failure condition, a performance condition, a power condition, a temperature condition, a vibration condition, and the like. The evaluation of the current routing template collection routine may be based on a collection routine with respect to a collection parameter, such as network availability, sensor availability, a time-based collection routine (e.g., on a schedule, over time), and the like.

In embodiments, a monitoring system for data collection in an industrial environment may comprise: a data collector communicatively coupled to a plurality of input channels; a data storage structured to store a plurality of collector route templates and sensor specifications for sensors that correspond to the input channels, wherein the plurality of collector route templates each comprise a different sensor collection routine; a data acquisition circuit structured to interpret a plurality of detection values, each of the plurality of detection values corresponding to at least one of the input channels; and a data analysis circuit structured to receive output data from the plurality of input channels and evaluate a current routing template collection routine based on the received output data, wherein the data collector is configured to switch from the current routing template collection routine to an alternative routing template collection routine based on the content of the output data. In embodiments, the system is deployed locally on the data collector, in part locally on the data collector and in part on a remote information technology infrastructure component apart from the collector, and the like. Each of the input channels may correspond to a sensor located in the environment. The evaluation of the current routing template may be based on operational mode routing collection schemes. The operational mode is at least one of a normal operational mode, a peak operational mode, an idle operational mode, a maintenance operational mode, and a power saving operational mode. The data collector may switch from the current routing template collection routine because the data analysis circuit determines a change in operating modes, such as where the operating mode changes from an operational mode to an accelerated maintenance mode, from an operational mode to a failure mode analysis mode, from an operational mode to a power saving mode, from an operational mode to high-performance mode, and the like. The data collector may switch from the current routing template collection routine based on a sensed change in a mode of operation, such as where the sensed change is a failure condition, a performance condition, a power condition, a temperature condition, a vibration condition, and the like. The evaluation of the current routing template collection routine may be based on a collection routine with respect to a collection parameter, such as where the parameter is network availability, sensor availability, a time-based collection routine (e.g., where a routine collects sensor data on a schedule, evaluates sensor data over time).

In embodiments, a computer-implemented method for implementing a monitoring system for data collection in an industrial environment may comprise: providing a data collector communicatively coupled to a plurality of input channels; providing a data storage structured to store a plurality of collector route templates and sensor specifications for sensors that correspond to the input channels, wherein the plurality of collector route templates each comprise a different sensor collection routine; providing a data acquisition circuit structured to interpret a plurality of detection values, each of the plurality of detection values corresponding to at least one of the input channels; and providing a data analysis circuit structured to receive output data from the plurality of input channels and evaluate a current routing template collection routine based on the received output data, wherein the data collector is configured to switch from the current routing template collection routine to an alternative routing template collection routine based on the content of the output data. In embodiments, the computer-implemented method is deployed locally on the data collector, such as deployed in part locally on the data collector and in part on a remote information technology infrastructure component apart from the collector, where each of the input channels correspond to a sensor located in the environment.

In embodiments, one or more non-transitory computer-readable media comprising computer executable instructions that, when executed, may cause at least one processor to perform actions comprising: providing a data collector communicatively coupled to a plurality of input channels; providing a data storage structured to store a plurality of collector route templates and sensor specifications for sensors that correspond to the input channels, wherein the plurality of collector route templates each comprise a different sensor collection routine; providing a data acquisition circuit structured to interpret a plurality of detection values, each of the plurality of detection values corresponding to at least one of the input channels; and providing a data analysis circuit structured to receive output data from the plurality of input channels and evaluate a current routing template collection routine based on the received output data, wherein the data collector is configured to switch from the current routing template collection routine to an alternative routing template collection routine based on the content of the output data. In embodiments, the instructions may be deployed locally on the data collector, such as deployed in part locally on the data collector and in part on a remote information technology infrastructure component apart from the collector, where each of the input channels correspond to a sensor located in the environment.

In embodiments, a monitoring system for data collection in an industrial environment may comprise a data collector communicatively coupled to a plurality of input channels; a data storage structured to store a plurality of collector route templates, sensor specifications for sensors that correspond to the input channels, wherein the plurality of collector route templates each comprise a different sensor collection routine; a data acquisition circuit structured to interpret a plurality of detection values, each of the plurality of detection values corresponding to at least one of the input channels; and a machine learning data analysis circuit structured to receive output data from the plurality of input channels and evaluate a current routing template collection routine based on the received output data received over time, wherein the machine learning data analysis circuit learns received output data patterns, wherein the data collector is configured to switch from the current routing template collection routine to an alternative routing template collection routine based on the learned received output data patterns. In embodiments, the monitoring system may be deployed locally on the data collector, such as deployed in part locally on the data collector and in part on a remote information technology infrastructure component apart from the collector, where each of the input channels correspond to a sensor located in the environment. The machine learning data analysis circuit may include a neural network expert system. The evaluation of the current routing template may be based on operational mode routing collection schemes. The operational mode may be at least one of a normal operational mode, a peak operational mode, an idle operational mode, a maintenance operational mode, and a power saving operational mode. The data collector may switch from the current routing template collection routine because the data analysis circuit determines a change in operating modes, such as where the operating mode changes from an operational mode to an accelerated maintenance mode, from an operational mode to a failure mode analysis mode, from an operational mode to a power saving mode, from an operational mode to high-performance mode, and the like. The data collector may switch from the current routing template collection routine based on a sensed change in a mode of operation, such as where the sensed change is a failure condition, a performance condition, a power condition, a temperature condition, a vibration condition, and the like. The evaluation of the current routing template collection routine may be based on a collection routine with respect to a collection parameter, such as where the parameter is network availability, a sensor availability, a time-based collection routine (collects sensor data on a schedule, evaluates sensor data over time).

In embodiments, a computer-implemented method for implementing a monitoring system for data collection in an industrial environment may comprise: providing a data collector communicatively coupled to a plurality of input channels; providing a data storage structured to store a plurality of collector route templates, sensor specifications for sensors that correspond to the input channels, wherein the plurality of collector route templates each comprise a different sensor collection routine; providing a data acquisition circuit structured to interpret a plurality of detection values, each of the plurality of detection values corresponding to at least one of the input channels; and providing a machine learning data analysis circuit structured to receive output data from the plurality of input channels and evaluate a current routing template collection routine based on the received output data received over time, wherein the machine learning data analysis circuit learns received output data patterns, wherein the data collector is configured to switch from the current routing template collection routine to an alternative routing template collection routine based on the learned received output data patterns. In embodiments, the method may be deployed locally on the data collector, such as deployed in part locally on the data collector and in part on a remote information technology infrastructure component apart from the collector, where each of the input channels correspond to a sensor located in the environment.

In embodiments, one or more non-transitory computer-readable media comprising computer executable instructions that, when executed, may cause at least one processor to perform actions comprising: providing a data collector communicatively coupled to a plurality of input channels; providing a data storage structured to store a plurality of collector route templates, sensor specifications for sensors that correspond to the input channels, wherein the plurality of collector route templates each comprise a different sensor collection routine; providing a data acquisition circuit structured to interpret a plurality of detection values, each of the plurality of detection values corresponding to at least one of the input channels; and providing a machine learning data analysis circuit structured to receive output data from the plurality of input channels and evaluate a current routing template collection routine based on the received output data received over time, wherein the machine learning data analysis circuit learns received output data patterns, wherein the data collector is configured to switch from the current routing template collection routine to an alternative routing template collection routine based on the learned received output data patterns. In embodiments, the instructions may be deployed locally on the data collector, such as deployed in part locally on the data collector and in part on a remote information technology infrastructure component apart from the collector, where each of the input channels correspond to a sensor located in the environment.

In embodiments, a monitoring system for data collection in an industrial environment may comprise: a data collector communicatively coupled to a plurality of input channels; a data storage structured to store a collector route template, sensor specifications for sensors that correspond to the input channels, wherein the collector route template comprises a sensor collection routine; a data acquisition circuit structured to interpret a plurality of detection values, each of the plurality of detection values corresponding to at least one of the input channels; and a data analysis circuit structured to receive output data from the plurality of input channels and evaluate the received output data with respect to a rule, wherein the data collector is configured to modify the sensor collection routine based on the application of the rule to the received output data. In embodiments, the system may be deployed locally on the data collector, such as deployed in part locally on the data collector and in part on a remote information technology infrastructure component apart from the collector, where each of the input channels correspond to a sensor located in the environment. The rule may be based on an operational state of a machine with respect to which the input channels provide information, on an anticipated state of a machine with respect to which the input channels provide information, on a detected fault condition of a machine with respect to which the input channels provide information, and the like. The evaluation of the received output data may be based on operational mode routing collection schemes, where the operational mode is at least one of a normal operational mode, a peak operational mode, an idle operational mode, a maintenance operational mode, and a power saving operational mode. The data collector may modify the sensor collection routine because the data analysis circuit determines a change in operating modes, such as where the operating mode changes from an operational mode to an accelerated maintenance mode, from an operational mode to a failure mode analysis mode, from an operational mode to a power saving mode, from an operational mode to high-performance mode, and the like. The data collector may modify the sensor collection routine based on a sensed change in a mode of operation, such as where the sensed change is a failure condition, a performance condition, a power condition, a temperature condition, a vibration condition, and the like. The evaluation of the received output data may be based on a collection routine with respect to a collection parameter, wherein the parameter is a network availability, a sensor availability, a time-based collection routine (e.g., collects sensor data on a schedule or over time), and the like.

In embodiments, a computer-implemented method for implementing a monitoring system for data collection in an industrial environment may comprise: providing a data collector communicatively coupled to a plurality of input channels; providing a data storage structured to store a collector route template, sensor specifications for sensors that correspond to the input channels, wherein the collector route template comprises a sensor collection routine; providing a data acquisition circuit structured to interpret a plurality of detection values, each of the plurality of detection values corresponding to at least one of the input channels; and providing a data analysis circuit structured to receive output data from the plurality of input channels and evaluate the received output data with respect to a rule, wherein the data collector is configured to modify the sensor collection routine based on the application of the rule to the received output data. In embodiments, the method may be deployed locally on the data collector, such as deployed in part locally on the data collector and in part on a remote information technology infrastructure component apart from the collector, where each of the input channels correspond to a sensor located in the environment.

In embodiments, one or more non-transitory computer-readable media comprising computer executable instructions that, when executed, may cause at least one processor to perform actions comprising: providing a data collector communicatively coupled to a plurality of input channels; providing a data storage structured to store a collector route template, sensor specifications for sensors that correspond to the input channels, wherein the collector route template comprises a sensor collection routine; providing a data acquisition circuit structured to interpret a plurality of detection values, each of the plurality of detection values corresponding to at least one of the input channels; and providing a data analysis circuit structured to receive output data from the plurality of input channels and evaluate the received output data with respect to a rule, wherein the data collector is configured to modify the sensor collection routine based on the application of the rule to the received output data. In embodiments, the instructions may be deployed locally on the data collector, such as deployed in part locally on the data collector and in part on a remote information technology infrastructure component apart from the collector, where each of the input channels correspond to a sensor located in the environment.

Rapid route creation and modification in an industrial environment may employ smart route changes based on incoming data or alarms, such as changes enabling dynamic selection of data collection for analysis or correlation. Smart route changes may enable the system to alter current routing of sensor data based on incoming data or alarms. For instance, a user may set up a routing configuration that establishes a schedule of sensor collection for analysis, but when the analysis (or an alarm) indicates a special need, the system may change the sensor routing to address that need. For example, in the case where a change in a motor vibration profile (as one example among any of the machines described throughout this disclosure), such as rapidly increasing the peak amplitude of shaking on at least one axis of a vibration sensor set, that indicates a potential early failure of the motor, the system may change the routing to collect more focused data collection for analysis, such as initiating collection on more axes of the motor, initiating collection on additional bearings of the motor, and/or initiating collection using other sensors (such as temperature or heat flux sensors), that may confirm an initial hypothesis that the failure mode is occurring or otherwise assist in analysis of the state or operational condition of the machine.

Detected operational mode changes may trigger a rapid route change. For instance, an operational mode may be detected as the result of a single-point sensor out-of-range detection, an analysis determination, and the like, and generate a routing change. An analysis determination may be detected from a sensor end-point, such as through a single-point sensor analysis, a multiple-point sensor analysis, an analysis domain analysis (e.g., through a time profile, frequency profile, correlated multi-point determination), and the like. In another instance, a maintenance mode may be detected during routine maintenance, where a routing change increases data collection to capture data at a higher rate under an anomalous condition. A failure mode may be detected, such as through an alarm that indicates near-term potential for a failure of a machine that triggers increased data capture rate for analysis. Performance-based modes may be detected, such as detecting a level of output rate (e.g., peak, slack, idle), which may then initiate changes in routing to accommodate the analysis needs for the different performance monitoring and metrics associated with the state. For example, if a high peak speed is detected for a motor, a conveyor, an assembly line, a generator, a turbine, or the like, relative to historical measurements over some time period, additional sensors may be engaged to watch for failures that are typically associated with peak speeds, such as overheating (as measured by engaging a temperature or heat flux sensor), excessive noise (as measured by an acoustic or noise sensor), excessive shaking (as measured by one or more vibration sensors), or the like.

Alarm detections may trigger a rapid route change. Alarm sources may include a front-end collector, local intelligence resource, back-end data analysis process, ambient environment detector, network quality detector, power quality detector, heat, smoke, noise, flooding, and the like. Alarm types may include a single-instance anomaly detection, multiple-instance anomaly detection, simultaneous multi-sensor detection, time-clustered sensor detection (e.g., a single sensor or multiple sensors), frequency-profile detection (e.g., increasing rate of anomaly detection such as an alarm increasing in its occurrence over time, a change in a frequency component of a sensor output such as a motor's physical vibration profile changing over time), and the like.

A machine learning system may change routing based on learned alarm pattern analysis. The machine learning system may learn system alarm condition patterns, such as alarm conditions expected under normal operating conditions, under peak operating conditions, expected over time based on age of components (e.g., new, during operational life, during extended life, during a warrantee period), and the like. The machine learning system may change routing based on a change in an alarm pattern, such as a system operating normally but experiencing a peak operating alarm pattern (e.g., a system running when it should not be), a system is new but experiencing an older profile (e.g., detection of infant mortality), and the like. The machine learning system may change routing based on a current alarm profile vs. an expected change in production condition. For example, a plant, system, or component is experiencing above average alarm conditions just before a ramp-up of production (e.g., could be foretelling of above average failures during increased production), just before going slack (e.g., could be an opportunity to ramp up maintenance procedures based on increased data taking routing scheme), after an unplanned event (e.g., weather, power outage, restart), and the like.

A rapid route change action may include: an increased rate of sampling (e.g., to a single sensor, to multiple sensors), an increase in the number of sensors being sampled (e.g., simultaneous sampling of other sensors on a device, coordinated sampling of similar sensors on near-by devices), generating a burst of sampling (e.g., sampling at a high rate for a period of time), and the like. Actions may be executed on a schedule, coordinated with a trigger, based on an operational mode, and the like. Triggered actions may include: anomalous data, an exceeded threshold level, an operational event trigger (e.g., at startup condition such as for startup motor torque), and the like.

A rapid route change may switch between routing schemes, such as an operational routing scheme (e.g., a subset of sensor collection for normal operations), a scheduled maintenance routing scheme (e.g., an increased and focused set of sensor collection than for normal operations), and the like. The distribution of sensor data may be changed, such as to distribute sensor collection across the system, such as for a sensor collection set for specific components, functions, and modes. A failure mode routing scheme may entail multiple focused sensor collection groups targeting different failure mode analyses (e.g., for a motor, one failure mode may be for bearings, another for startup speed-torque) where a different subset of sensor data may be needed based on the failure mode (e.g., as detected in anomalous readings taken during operations or maintenance). Power saving mode routing may be executed when weather conditions necessitate reduced plant power.

Dynamic adjustment of route changes may be executed based on connectivity factors, such as the factors associated with the collector or network availability and bandwidth. For example, routing may be changed for a device associated with an alarm detection, where changing routing for targeted devices on the network frees up bandwidth. Changes to routing may have a duration, such as only for a pre-determined period of time and then switching back, maintaining a change until user-directed, changing duration based on network availability, and the like.

Figure 109:
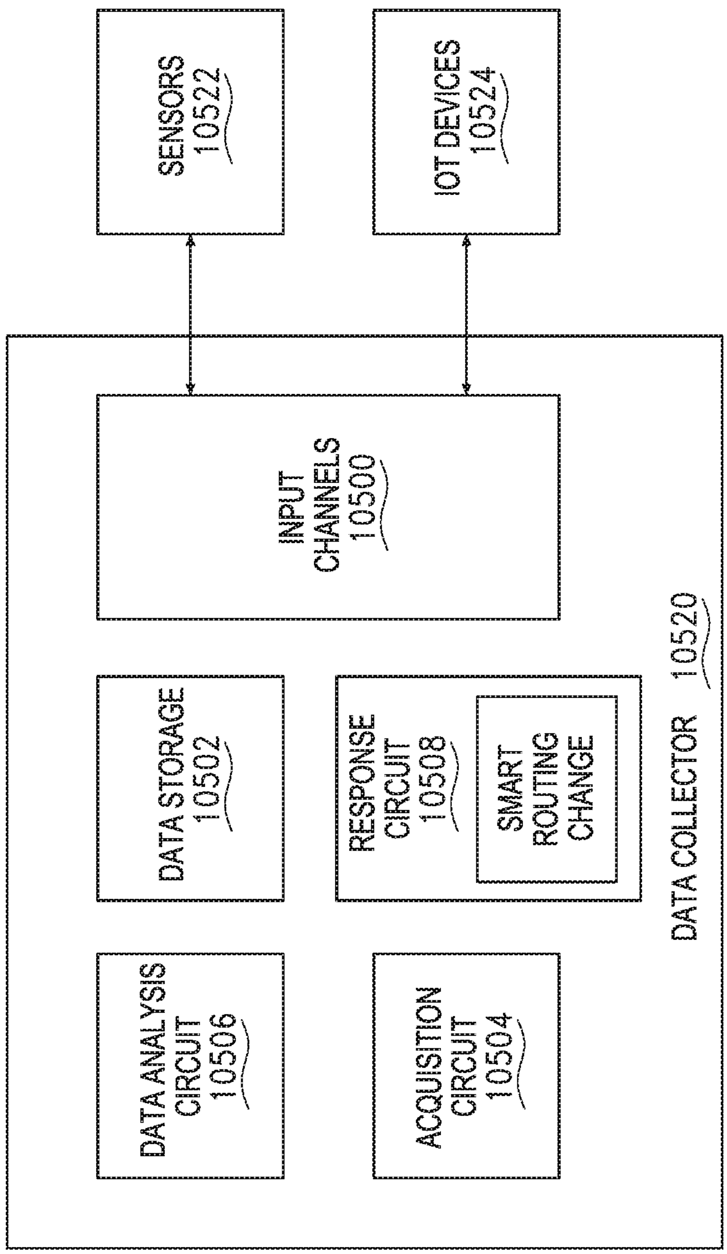
Figure 110:
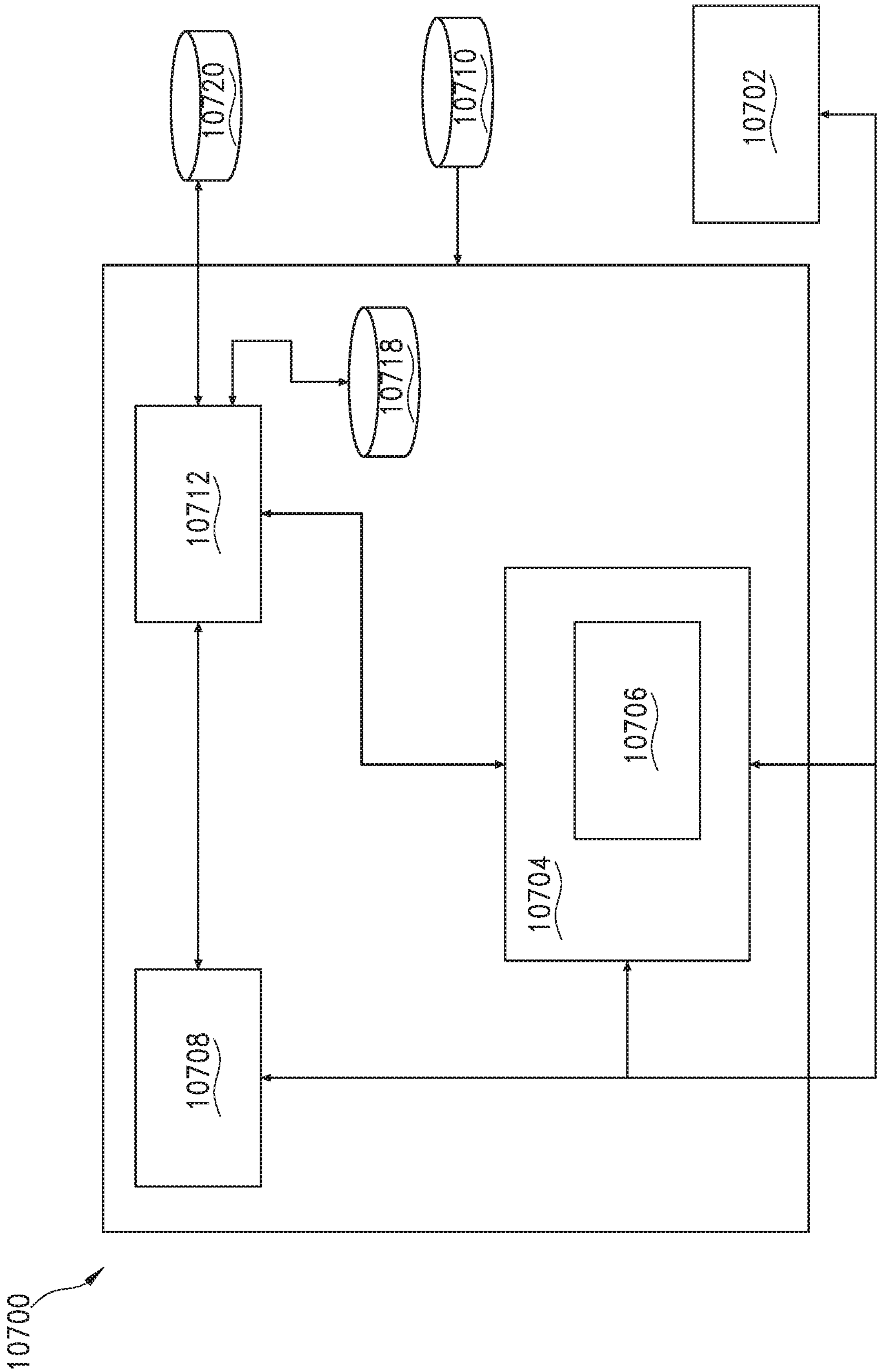
FIG. 110 is a diagrammatic view that depicts a monitoring system that employs data collection bands in accordance with the present disclosure.
Figure 111:
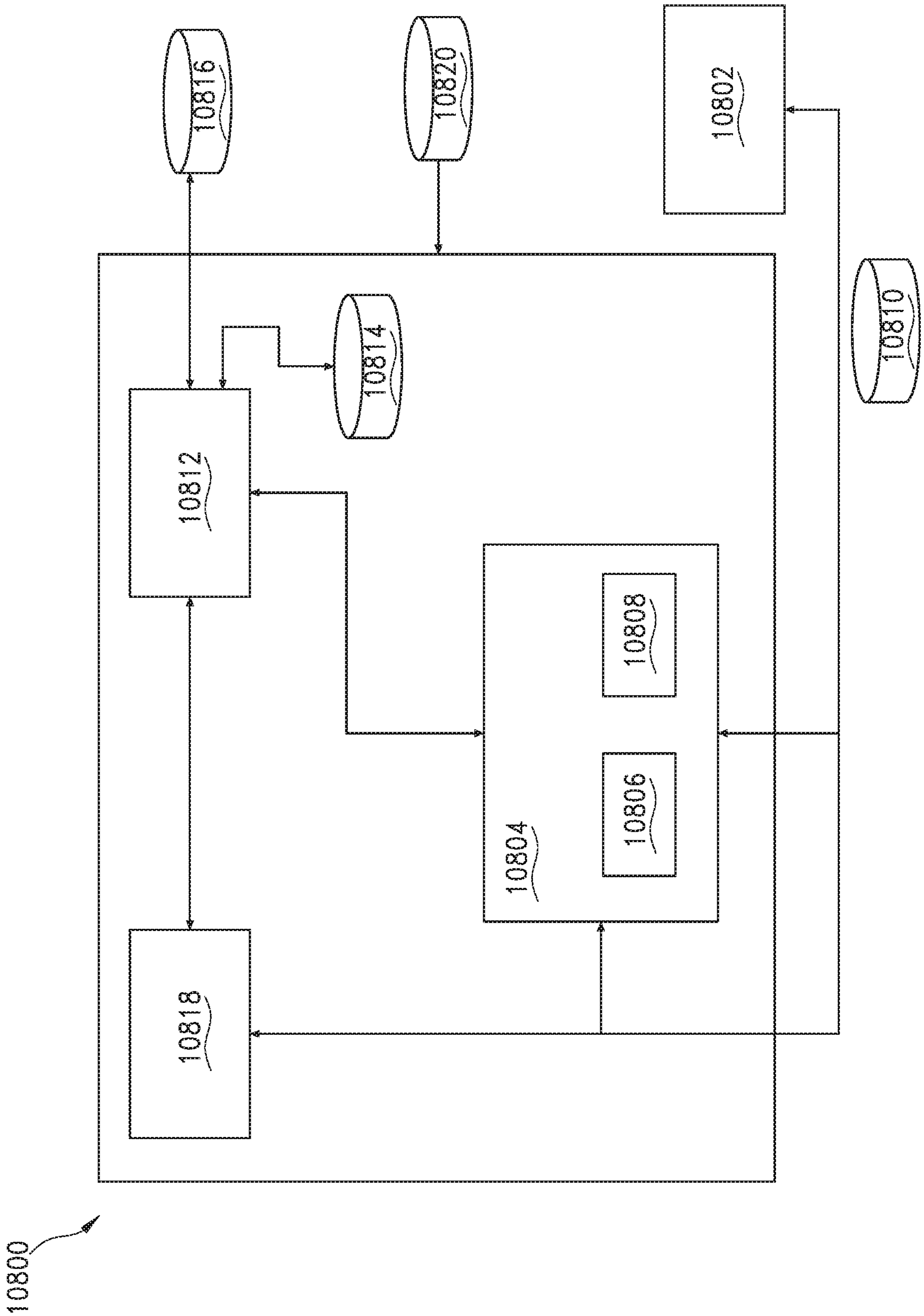
FIG. 111 is a diagrammatic view that depicts a system that employs vibration and other noise in predicting states and outcomes in accordance with the present disclosure.

In embodiments, and referring to FIG. 109, smart route changes may be implemented by a local data collection system 10520 for collection and monitoring of data collected through a plurality of input channels 10500, such as data from sensors 10522, IoT devices 10524, and the like. The local collection system 102, also referred to herein as a data collector 10520, may comprise a data storage 10502, a data acquisition circuit 10504, a data analysis circuit 10506, a response circuit 10508, and the like, wherein the monitoring facilities may be deployed locally on the data collector 10520, in part locally on the data collector and in part on a remote information technology infrastructure component apart from the data collector, and the like. Smart route changes may be implemented between data collectors, such as where a state message is transmitted between the data collectors (e.g., from an input channel that is mounted in proximity to a second input channel, from a related group of input sensors, and the like). A monitoring system may comprise a plurality of input channels 10500 communicatively coupled to the data collector 10520. The data acquisition circuit 10504 may be structured to interpret a plurality of detection values, each of the plurality of detection values corresponding to at least one of the input channels 10500, wherein the data acquisition circuit 10504 acquires sensor data from a first route of input channels for the plurality of input channels. The data storage 10502 may be structured to store sensor data, sensor specifications, and the like, for sensors 10524 that correspond to the input channels 10500. The data analysis circuit 10506 may be structured to evaluate the sensor data with respect to stored anticipated state information, wherein the anticipated state information may include an alarm threshold level, and wherein the data analysis circuit 10506 sets an alarm state when the alarm threshold level is exceeded for a first input channel in the first group of input channels. Further, the data analysis circuit 10506 may transmit the alarm state across a network to a routing control facility. The response circuit 10508 may be structured to change the routing of the input channels for data collection from the first routing of input channels to an alternate routing of input channels upon reception of a routing change indication from the routing control facility. In the case of a network transmission, the alternate routing of input channels may include the first input channel and a group of input channels related to the first input channel, where the data collector executes the change in routing of the input channels if a communication parameter of the network between the data collector and the routing control facility is not met (e.g., a time-period parameter, a network connection and/or bandwidth availability parameter).

In embodiments, an alarm state may indicate a detection mode, such as an operational mode detection comprising an out-of-range detection, a maintenance mode detection comprising an alarm detected during maintenance, a failure mode detection (e.g., where the controller communicates a failure mode detection facility), a power mode detection wherein the alarm state is indicative of a power related limitation data of the anticipated state information, a performance mode detection wherein the alarm state is indicative of a high-performance limitation data of the anticipated state information, and the like. The monitoring system may further include the analysis circuit setting the alarm state when the alarm threshold level is exceeded for an alternate input channel in the first group of input channels, such as where the setting of the alarm state for the first input channel and the alternate input channel are determined to be a multiple-instance anomaly detection, wherein the second routing of input channels comprises the first input channel and a second input channel, wherein the sensor data from the first input channel and the second input channel contribute to simultaneous data analysis. The second routing of input channels may include a change in a routing collection parameter, such as where the routing collection parameter is an increase in sampling rate, an increase in the number of channels being sampled, a burst sampling of at least one of the plurality of input channels, and the like.

Figure 108:
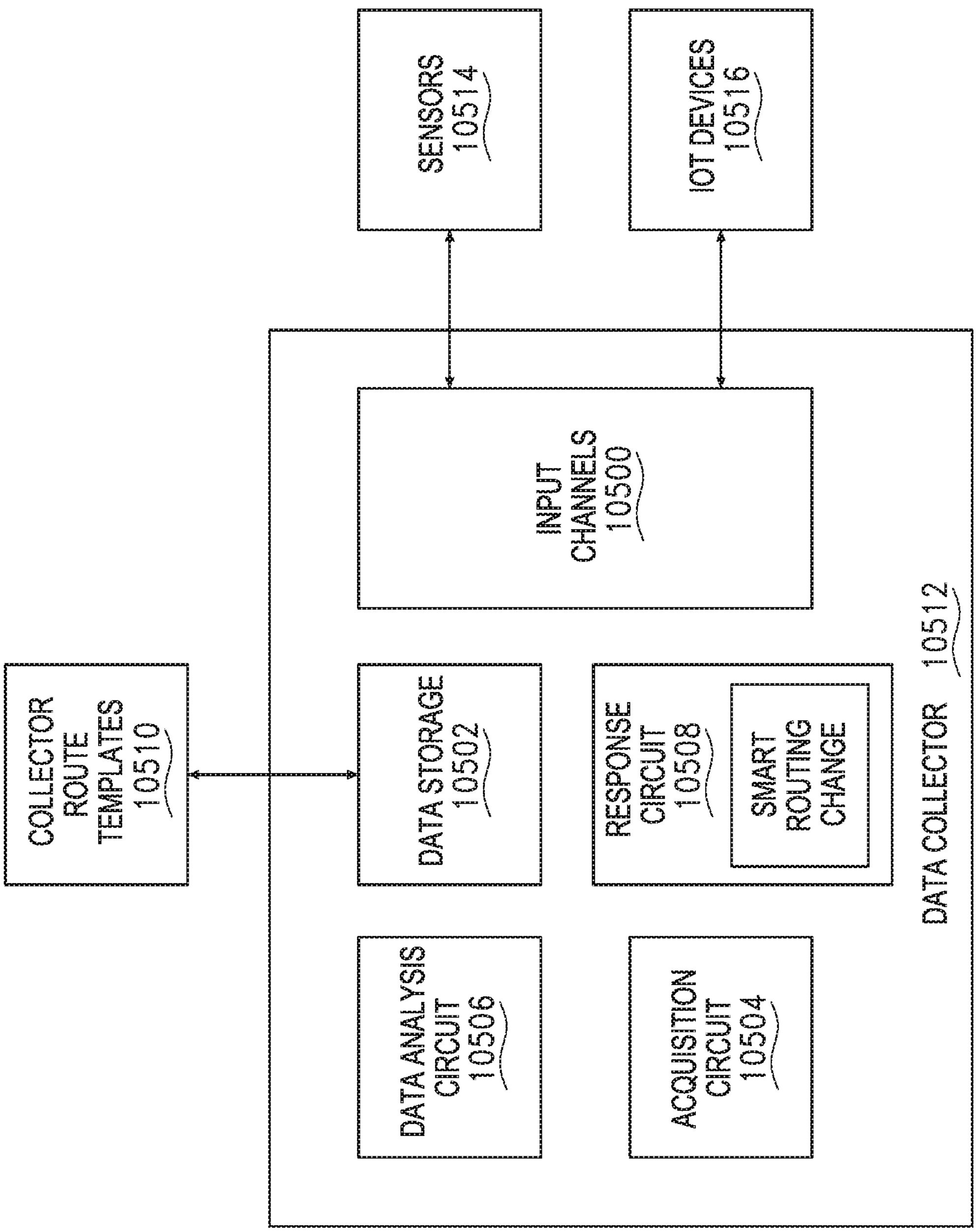

In embodiments, and referring to FIG. 108, collector route templates 10510 may be utilized for smart route changes and may be implemented by a local data collection system 10512 for collection and monitoring of data collected through a plurality of input channels 10500, such as data from sensors 10514, IoT devices 10516, and the like. The local collection system 10512, also referred to herein as a data collector 10512, may comprise a data storage 10502, a data acquisition circuit 10504, a data analysis circuit 10506, a response circuit 10508, and the like, wherein the monitoring facilities may be deployed locally on the data collector 10512, in part locally on the data collector and in part on a remote information technology infrastructure component apart from the data collector, and the like.

In embodiments, a monitoring system for data collection in an industrial environment may comprise: a data collector communicatively coupled to a plurality of input channels; a data acquisition circuit structured to interpret a plurality of detection values, each of the plurality of detection values corresponding to at least one of the input channels, wherein the data acquisition circuit acquires sensor data from a first route of input channels for the plurality of input channels; a data storage structured to store sensor specifications for sensors that correspond to the input channels; a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels; and a response circuit structured to change the routing of the input channels for data collection from the first routing of input channels to an alternate routing of input channels, wherein the alternate routing of input channels comprise the first input channel and a group of input channels related to the first input channel. In embodiments, the system may be deployed locally on the data collector, deployed in part locally on the data collector and in part on a remote information technology infrastructure component apart from the collector, wherein each of the input channels correspond to a sensor located in the environment. The group of input channels may be related to the first input channel are at least in part taken from the plurality of input channels not included in the first routing of input channels. An alarm state may indicate a detection mode, such as where the detection mode is an operational mode detection comprising an out-of-range detection, the detection mode is a maintenance mode detection comprising an alarm detected during maintenance, the detection mode is a failure mode detection. The controller may communicate the failure mode detection facility, such as where the detection mode is a power mode detection and the alarm state is indicative of a power related limitation data of the anticipated state information, the detection mode is a performance mode detection and the alarm state is indicative of a high-performance limitation data of the anticipated state information, and the like. The analysis circuit may set the alarm state when the alarm threshold level is exceeded for an alternate input channel in the first group of input channels, such as where the setting of the alarm state for the first input channel and the alternate input channel are determined to be a multiple-instance anomaly detection, wherein the alternate routing of input channels comprises the first input channel and a second input channel, wherein the sensor data from the first input channel and the second input channel contribute to simultaneous data analysis. The alternate routing of input channels may include a change in a routing collection parameter, such as for an increase in sampling rate, an increase in the number of channels being sampled, a burst sampling of at least one of the plurality of input channels, and the like.

In embodiments, a computer-implemented method for implementing a monitoring system for data collection in an industrial environment may comprise: providing a data collector communicatively coupled to a plurality of input channels; providing a data acquisition circuit structured to interpret a plurality of detection values, each of the plurality of detection values corresponding to at least one of the input channels, wherein the data acquisition circuit acquires sensor data from a first route of input channels for the plurality of input channels; providing a data storage structured to store sensor specifications for sensors that correspond to the input channels; providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels; and providing a response circuit structured to change the routing of the input channels for data collection from the first routing of input channels to an alternate routing of input channels, wherein the alternate routing of input channels comprise the first input channel and a group of input channels related to the first input channel. In embodiments, the system may be deployed locally on the data collector, deployed in part locally on the data collector and in part on a remote information technology infrastructure component apart from the collector, wherein each of the input channels correspond to a sensor located in the environment.

In embodiments, one or more non-transitory computer-readable media comprising computer executable instructions that, when executed, may cause at least one processor to perform actions may comprise: providing a data collector communicatively coupled to a plurality of input channels; providing a data acquisition circuit structured to interpret a plurality of detection values, each of the plurality of detection values corresponding to at least one of the input channels, wherein the data acquisition circuit acquires sensor data from a first route of input channels for the plurality of input channels; providing a data storage structured to store sensor specifications for sensors that correspond to the input channels; providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels; and providing a response circuit structured to change the routing of the input channels for data collection from the first routing of input channels to an alternate routing of input channels, wherein the alternate routing of input channels comprise the first input channel and a group of input channels related to the first input channel. In embodiments, the instructions may be deployed locally on the data collector, deployed in part locally on the data collector and in part on a remote information technology infrastructure component apart from the collector, wherein each of the input channels correspond to a sensor located in the environment.

In embodiments, a monitoring system for data collection in an industrial environment may comprise: a data collector communicatively coupled to a plurality of input channels; a data acquisition circuit structured to interpret a plurality of detection values, each of the plurality of detection values corresponding to at least one of the input channels, wherein the data acquisition circuit acquires sensor data from a first route of input channels for the plurality of input channels; a data storage structured to store sensor specifications for sensors that correspond to the input channels; a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels and transmits the alarm state across a network to a routing control facility; and a response circuit structured to change the routing of the input channels for data collection from the first routing of input channels to an alternate routing of input channels upon reception of a routing change indication from the routing control facility, wherein the alternate routing of input channels comprise the first input channel and a group of input channels related to the first input channel, wherein the data collector automatically executes the change in routing of the input channels if a communication parameter of the network between the data collector and the routing control facility is not met. In embodiments, the instructions may be deployed locally on the data collector, deployed in part locally on the data collector and in part on a remote information technology infrastructure component apart from the collector, wherein each of the input channels correspond to a sensor located in the environment. The communication parameter may be a time-period parameter within which the routing control facility must respond. The communication parameter may be a network availability parameter, such as a network connection parameter or bandwidth requirement. The group of input channels related to the first input channel may be at least in part taken from the plurality of input channels not included in the first routing of input channels. The alarm state may indicate a detection mode, such as an operational mode detection comprising an out-of-range detection, a maintenance mode detection comprising an alarm detected during maintenance, and the like. The detection mode may be a failure mode detection, such as when the controller communicates the failure mode detection facility, the alarm state is indicative of a power related limitation data of the anticipated state information, the detection mode is a performance mode detection where the alarm state is indicative of a high-performance limitation data of the anticipated state information, and the like. The analysis circuit may set the alarm state when the alarm threshold level is exceeded for an alternate input channel in the first group of input channels, such as where the setting of the alarm state for the first input channel and the alternate input channel are determined to be a multiple-instance anomaly detection, wherein the alternate routing of input channels comprises the first input channel and a second input channel, wherein the sensor data from the first input channel and the second input channel contribute to simultaneous data analysis. The alternate routing of input channels may be a change in a routing collection parameter, such as an increase in sampling rate, is an increase in the number of channels being sampled, a burst sampling of at least one of the plurality of input channels, and the like.

In embodiments, a computer-implemented method for implementing a monitoring system for data collection in an industrial environment may comprise: providing a data collector communicatively coupled to a plurality of input channels; providing a data acquisition circuit structured to interpret a plurality of detection values, each of the plurality of detection values corresponding to at least one of the input channels, wherein the data acquisition circuit acquires sensor data from a first route of input channels for the plurality of input channels; providing a data storage structured to store sensor specifications for sensors that correspond to the input channels; providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels and transmits the alarm state across a network to a routing control facility; and providing a response circuit structured to change the routing of the input channels for data collection from the first routing of input channels to an alternate routing of input channels upon reception of a routing change indication from the routing control facility, wherein the alternate routing of input channels comprise the first input channel and a group of input channels related to the first input channel, wherein the data collector automatically executes the change in routing of the input channels if a communication parameter of the network between the data collector and the routing control facility is not met. In embodiments, the instructions may be deployed locally on the data collector, deployed in part locally on the data collector and in part on a remote information technology infrastructure component apart from the collector, wherein each of the input channels correspond to a sensor located in the environment.

In embodiments, one or more non-transitory computer-readable media comprising computer executable instructions that, when executed, may cause at least one processor to perform actions comprising: providing a data collector communicatively coupled to a plurality of input channels; providing a data acquisition circuit structured to interpret a plurality of detection values, each of the plurality of detection values corresponding to at least one of the input channels, wherein the data acquisition circuit acquires sensor data from a first route of input channels for the plurality of input channels; providing a data storage structured to store sensor specifications for sensors that correspond to the input channels; providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels and transmits the alarm state across a network to a routing control facility; and providing a response circuit structured to change the routing of the input channels for data collection from the first routing of input channels to an alternate routing of input channels upon reception of a routing change indication from the routing control facility, wherein the alternate routing of input channels comprise the first input channel and a group of input channels related to the first input channel, wherein the data collector automatically executes the change in routing of the input channels if a communication parameter of the network between the data collector and the routing control facility is not met. In embodiments, the instructions may be deployed locally on the data collector, deployed in part locally on the data collector and in part on a remote information technology infrastructure component apart from the collector, wherein each of the input channels correspond to a sensor located in the environment.

In embodiments, a monitoring system for data collection in an industrial environment may comprise: a first and second data collector communicatively coupled to a plurality of input channels; a data acquisition circuit structured to interpret a plurality of detection values, each of the plurality of detection values corresponding to at least one of the input channels, wherein the data acquisition circuit acquires sensor data from a first route of input channels for the plurality of input channels; a data storage structured to store sensor specifications for sensors that correspond to the input channels; a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels; a communication circuit structured to communicate with a second data collector, wherein the second data collector transmits a state message related to a first input channel from the first route of input channels; and a response circuit structured to change the routing of the input channels for data collection from the first routing of input channels to an alternate routing of input channels based on the state message from the second data collector, wherein the alternate routing of input channel comprise the first input channel and a group of input channels related to the first input sensor. In embodiments, the system may be deployed locally on the data collector, deployed in part locally on the data collector and in part on a remote information technology infrastructure component apart from the collector, wherein each of the input channels correspond to a sensor located in the environment. The set state message transmitted from the second data collector may be from a second input channel that is mounted in proximity to the first input channel. The set alarm transmitted from the second controller may be from a second input sensor that is part of a related group of input sensors comprising the first input sensor. The group of input channels related to the first input channel may be at least in part taken from the plurality of input channels not included in the first routing of input channels. The alarm state may indicate a detection mode, such as where the detection mode is an operational mode detection comprising an out-of-range detection, a maintenance mode detection comprising an alarm detected during maintenance, is a failure mode detection, and the like. The controller may communicate the failure mode detection facility, such as where the detection mode is a power mode detection and the alarm state is indicative of a power related limitation data of the anticipated state information, the detection mode is a performance mode detection where the alarm state is indicative of a high-performance limitation data of the anticipated state information, and the like. The analysis circuit may set the alarm state when the alarm threshold level is exceeded for an alternate input channel in the first group of input channels, such as where the setting of the alarm state for the first input channel and the alternate input channel are determined to be a multiple-instance anomaly detection, wherein the alternate routing of input channels comprises the first input channel and a second input channel, wherein the sensor data from the first input channel and the second input channel contribute to simultaneous data analysis. The alternate routing of input channels may be a change in a routing collection parameter, such as an increase in sampling rate, an increase in the number of channels being sampled, a burst sampling of at least one of the plurality of input channels, and the like.

In embodiments, a computer-implemented method for implementing a monitoring system for data collection in an industrial environment may comprise: providing a first and second data collector communicatively coupled to a plurality of input channels; providing a data acquisition circuit structured to interpret a plurality of detection values, each of the plurality of detection values corresponding to at least one of the input channels, wherein the data acquisition circuit acquires sensor data from a first route of input channels for the plurality of input channels; providing a data storage structured to store sensor specifications for sensors that correspond to the input channels; providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels; providing a communication circuit structured to communicate with a second data collector, wherein the second data collector transmits a state message related to a first input channel from the first route of input channels, and providing a response circuit structured to change the routing of the input channels for data collection from the first routing of input channels to an alternate routing of input channels based on the state message from the second data collector, wherein the alternate routing of input channel comprise the first input channel and a group of input channels related to the first input sensor. In embodiments, the method may be deployed locally on the data collector, deployed in part locally on the data collector and in part on a remote information technology infrastructure component apart from the collector, wherein each of the input channels correspond to a sensor located in the environment.

In embodiments, one or more non-transitory computer-readable media comprising computer executable instructions that, when executed, may cause at least one processor to perform actions comprising: providing a first and second data collector communicatively coupled to a plurality of input channels; providing a data acquisition circuit structured to interpret a plurality of detection values, each of the plurality of detection values corresponding to at least one of the input channels, wherein the data acquisition circuit acquires sensor data from a first route of input channels for the plurality of input channels; providing a data storage structured to store sensor specifications for sensors that correspond to the input channels; providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels; providing a communication circuit structured to communicate with a second data collector, wherein the second data collector transmits a state message related to a first input channel from the first route of input channels, and providing a response circuit structured to change the routing of the input channels for data collection from the first routing of input channels to an alternate routing of input channels based on the state message from the second data collector, wherein the alternate routing of input channel comprise the first input channel and a group of input channels related to the first input sensor. In embodiments, the instructions may be deployed locally on the data collector, deployed in part locally on the data collector and in part on a remote information technology infrastructure component apart from the collector, wherein each of the input channels correspond to a sensor located in the environment.

In embodiments, a monitoring system for data collection in an industrial environment may comprise: a data collector communicatively coupled to a plurality of input channels; a data acquisition circuit structured to interpret a plurality of detection values, each of the plurality of detection values corresponding to at least one of the input channel, wherein the data acquisition circuit acquires sensor data from a first group of input channels from the plurality of input channels; a data storage structured to store sensor specifications for sensors that correspond to the input channels; a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channel; and a response circuit structured to change the input channels being collected from the first group of input channels to an alternative group of input channels, wherein the alternate group of input channels comprise the first input channel and a group of input channels related to the first input sensor. In embodiments, the system may be deployed locally on the data collector, deployed in part locally on the data collector and in part on a remote information technology infrastructure component apart from the collector, wherein each of the input channels correspond to a sensor located in the environment. The group of input sensors related to the first input sensor may be at least in part taken from the plurality of input sensors not included in the first group of input sensors. The first group of input channels related to the first input channel may be at least in part taken from the plurality of input channels not included in the first routing of input channels. The alarm state may indicate a detection mode, such as where the detection mode is an operational mode detection comprising an out-of-range detection, a maintenance mode detection comprising an alarm detected during maintenance. The detection mode may be a failure mode detection, such as where the controller communicates the failure mode detection facility. The detection mode may be a power mode detection where the alarm state is indicative of a power related limitation data of the anticipated state information. The detection mode may be a performance mode detection, where the alarm state is indicative of a high-performance limitation data of the anticipated state information. The analysis circuit may set the alarm state when the alarm threshold level is exceeded for an alternate input channel in the first group of input channels, such as when the setting of the alarm state for the first input channel and the alternate input channel are determined to be a multiple-instance anomaly detection, wherein the alternate routing of input channels comprises the first input channel and a second input channel, wherein the sensor data from the first input channel and the second input channel contribute to simultaneous data analysis. An alternative group of input channels may include a change in a routing collection parameter, such as where the routing collection parameter is an increase in sampling rate, an increase in the number of channels being sampled, a burst sampling of at least one of the plurality of input channels, and the like.

In embodiments, a computer-implemented method for implementing a monitoring system for data collection in an industrial environment may comprise: providing a data collector communicatively coupled to a plurality of input channels; providing a data acquisition circuit structured to interpret a plurality of detection values, each of the plurality of detection values corresponding to at least one of the input channel, wherein the data acquisition circuit acquires sensor data from a first group of input channels from the plurality of input channels; providing a data storage structured to store sensor specifications for sensors that correspond to the input channels; providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channel; and providing a response circuit structured to change the input channels being collected from the first group of input channels to an alternative group of input channels, wherein the alternate group of input channels comprise the first input channel and a group of input channels related to the first input sensor. In embodiments, the method may be deployed locally on the data collector, deployed in part locally on the data collector and in part on a remote information technology infrastructure component apart from the collector, wherein each of the input channels correspond to a sensor located in the environment.

In embodiments, one or more non-transitory computer-readable media comprising computer executable instructions that, when executed, may cause at least one processor to perform actions comprising: providing a data collector communicatively coupled to a plurality of input channels; providing a data acquisition circuit structured to interpret a plurality of detection values, each of the plurality of detection values corresponding to at least one of the input channel, wherein the data acquisition circuit acquires sensor data from a first group of input channels from the plurality of input channels; providing a data storage structured to store sensor specifications for sensors that correspond to the input channels; providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channel; and providing a response circuit structured to change the input channels being collected from the first group of input channels to an alternative group of input channels, wherein the alternate group of input channels comprise the first input channel and a group of input channels related to the first input sensor. In embodiments, the instructions may be deployed locally on the data collector, deployed in part locally on the data collector and in part on a remote information technology infrastructure component apart from the collector, wherein each of the input channels correspond to a sensor located in the environment.

In embodiments, a monitoring system for data collection in an industrial environment may comprise: a data collector communicatively coupled to a plurality of input channels; a data storage structured to store a plurality of collector route templates, sensor specifications for sensors that correspond to the input channels, wherein the plurality of collector route templates each comprise a different sensor collection routine; a data acquisition circuit structured to interpret a plurality of detection values, each of the plurality of detection values corresponding to at least one of the input channels, wherein the data acquisition circuit acquires sensor data from a first route of input channels; and a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels, wherein the data collector is configured to switch from a current routing template collection routine to an alternate routing template collection routine based on a setting of an alarm state. In embodiments, the system may be deployed locally on the data collector, deployed in part locally on the data collector and in part on a remote information technology infrastructure component apart from the collector, wherein each of the input channels correspond to a sensor located in the environment. The setting of the alarm state may be based on operational mode routing collection schemes, such as where the operational mode is at least one of a normal operational mode, a peak operational mode, an idle operational mode, a maintenance operational mode, and a power saving operational mode. The alarm threshold level may be associated with a sensed change to one of the plurality of input channels, such as where the sensed change is a failure condition, is a performance condition, a power condition, a temperature condition, a vibration condition, and the like. The alarm state may indicate a detection mode, such as where the detection mode is an operational mode detection comprising an out-of-range detection, a maintenance mode detection comprising an alarm detected during maintenance, and the like. The detection mode may be a power mode detection, where the alarm state is indicative of a power related limitation data of the anticipated state information. The detection mode may be a performance mode detection, where the alarm state is indicative of a high-performance limitation data of the anticipated state information. The analysis circuit may set the alarm state when the alarm threshold level is exceeded for an alternate input channel, such as wherein the setting of the alarm state is determined to be a multiple-instance anomaly detection. The alternate routing template may be a change to an input channel routing collection parameter. The routing collection parameter may be an increase in sampling rate, such as an increase in the number of channels being sampled, a burst sampling of at least one of the plurality of input channels, and the like.

In embodiments, a computer-implemented method for implementing a monitoring system for data collection in an industrial environment may comprise: providing a data collector communicatively coupled to a plurality of input channels; providing a data storage structured to store a plurality of collector route templates, sensor specifications for sensors that correspond to the input channels, wherein the plurality of collector route templates each comprise a different sensor collection routine; providing a data acquisition circuit structured to interpret a plurality of detection values, each of the plurality of detection values corresponding to at least one of the input channels, wherein the data acquisition circuit acquires sensor data from a first route of input channels; and providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels, wherein the data collector is configured to switch from a current routing template collection routine to an alternate routing template collection routine based on a setting of an alarm state. In embodiments, the system may be deployed locally on the data collector, deployed in part locally on the data collector and in part on a remote information technology infrastructure component apart from the collector, wherein each of the input channels correspond to a sensor located in the environment.

In embodiments, one or more non-transitory computer-readable media comprising computer executable instructions that, when executed, may cause at least one processor to perform actions comprising: providing a data collector communicatively coupled to a plurality of input channels; providing a data storage structured to store a plurality of collector route templates, sensor specifications for sensors that correspond to the input channels, wherein the plurality of collector route templates each comprise a different sensor collection routine; providing a data acquisition circuit structured to interpret a plurality of detection values, each of the plurality of detection values corresponding to at least one of the input channels, wherein the data acquisition circuit acquires sensor data from a first route of input channels; and providing a data analysis circuit structured to evaluate the sensor data with respect to stored anticipated state information, wherein the anticipated state information comprises an alarm threshold level, and wherein the data analysis circuit sets an alarm state when the alarm threshold level is exceeded for a first input channel in the first group of input channels, wherein the data collector is configured to switch from a current routing template collection routine to an alternate routing template collection routine based on a setting of an alarm state. In embodiments, the instructions may be deployed locally on the data collector, deployed in part locally on the data collector and in part on a remote information technology infrastructure component apart from the collector, wherein each of the input channels correspond to a sensor located in the environment.

Methods and systems are disclosed herein for a system for data collection in an industrial environment using intelligent management of data collection bands, referred to herein in some cases as smart bands. Smart bands may facilitate intelligent, situational, context-aware collection of data, such as by a data collector (such as any of the wide range of data collector embodiments described throughout this disclosure). Intelligent management of data collection via smart bands may improve various parameters of data collection, as well as parameters of the processes, applications, and products that depend on data collection, such as data quality parameters, consistency parameters, efficiency parameters, comprehensiveness parameters, reliability parameters, effectiveness parameters, storage utilization parameters, yield parameters (including financial yield, output yield, and reduction of adverse events), energy consumption parameters, bandwidth utilization parameters, input/output speed parameters, redundancy parameters, security parameters, safety parameters, interference parameters, signal-to-noise parameters, statistical relevancy parameters, and others. Intelligent management of smart bands may optimize across one or more such parameters, such as based on a weighting of the value of the parameters; for example, a smart band may be managed to provide a given level of redundancy for critical data, while not exceeding a specified level of energy usage. This may include using a variety of optimization techniques described throughout this disclosure and the documents incorporated herein by reference.

In embodiments, such methods and systems for intelligent management of smart bands include an expert system and supporting technology components, services, processes, modules, applications and interfaces, for managing the smart bands (collectively referred to in some cases as a smart band platform 10722), which may include a model-based expert system, a rule-based expert system, an expert system using artificial intelligence (such as a machine learning system, which may include a neural net expert system, a self-organizing map system, a human-supervised machine learning system, a state determination system, a classification system, or other artificial intelligence system), or various hybrids or combinations of any of the above. References to an expert system should be understood to encompass utilization of any one of the foregoing or suitable combinations, except where context indicates otherwise. Intelligent management may be of data collection of various types of data (e.g., vibration data, noise data and other sensor data of the types described throughout this disclosure) for event detection, state detection, and the like. Intelligent management may include managing a plurality of smart bands each directed at supporting an identified application, process or workflow, such as confirming progress toward or alignment with one or more objectives, goals, rules, policies, or guidelines. Intelligent management may also involve managing data collection bands targeted to backing out an unknown variable based on collection of other data (such as based on a model of the behavior of a system that involves the variable), selecting preferred inputs among available inputs (including specifying combinations, fusions, or multiplexing of inputs), and/or specifying an input band among available input bands.

Data collection bands, or smart bands, may include any number of items such as sensors, input channels, data locations, data streams, data protocols, data extraction techniques, data transformation techniques, data loading techniques, data types, frequency of sampling, placement of sensors, static data points, metadata, fusion of data, multiplexing of data, and the like as described herein. Smart band settings, which may be used interchangeably with smart band and data collection band, may describe the configuration and makeup of the smart band, such as by specifying the parameters that define the smart band. For example, data collection bands, or smart bands, may include one or more frequencies to measure. Frequency data may further include at least one of a group of spectral peaks, a true-peak level, a crest factor derived from a time waveform, and an overall waveform derived from a vibration envelope, as well as other signal characteristics described throughout this disclosure. Smart bands may include sensors measuring or data regarding one or more wavelengths, one or more spectra, and/or one or more types of data from various sensors and metadata. Smart bands may include one or more sensors or types of sensors of a wide range of types, such as described throughout this disclosure and the documents incorporated by reference herein. Indeed, the sensors described herein may be used in any of the methods or systems described throughout this disclosure. For example, one sensor may be an accelerometer, such as one that measures voltage per G ("V/G") of acceleration (e.g., 100 mV/G, 500 mV/G, 1 V/G, 5 V/G, 10 V/G, and the like). In embodiments, the data collection band circuit may alter the makeup of the subset of the plurality of sensors used in a smart band based on optimizing the responsiveness of the sensor, such as for example choosing an accelerometer better suited for measuring acceleration of a low speed mixer versus one better suited for measuring acceleration of a high speed industrial centrifuge. Choosing may be done intelligently, such as for example with a proximity probe and multiple accelerometers disposed on a centrifuge where while at low speed, one accelerometer is used for measuring in the smart band and another is used at high speeds. Accelerometers come in various types, such as piezo-electric crystal, low frequency (e.g., 10 V/G), high speed compressors (10 MV/G), MEMS, and the like. In another example, one sensor may be a proximity probe which can be used for sleeve or tilt-pad bearings (e.g., oil bath), or a velocity probe. In yet another example, one sensor may be a solid-state relay (SSR) that is structured to automatically interface with a routed data collector (such as a mobile or portable data collector) to obtain or deliver data. In another example, a mobile or portable data collector may be routed to alter the makeup of the plurality of available sensors, such as by bringing an appropriate accelerometer to a point of sensing, such as on or near a component of a machine. In still another example, one sensor may be a triax probe (e.g., a 100 MV/G triax probe), that in embodiments is used for portable data collection. In some embodiments, of a triax probe, a vertical element on one axis of the probe may have a high frequency response while the ones mounted horizontally may influence the frequency response of the whole triax. In another example, one sensor may be a temperature sensor and may include a probe with a temperature sensor built inside, such as to obtain a bearing temperature. In still additional examples, sensors may be ultrasonic, microphone, touch, capacitive, vibration, acoustic, pressure, strain gauges, thermographic (e.g., camera), imaging (e.g., camera, laser, IR, structured light), a field detector, an EMF meter to measure an AC electromagnetic field, a gaussmeter, a motion detector, a chemical detector, a gas detector, a CBRNE detector, a vibration transducer, a magnetometer, positional, location-based, a velocity sensor, a displacement sensor, a tachometer, a flow sensor, a level sensor, a proximity sensor, a pH sensor, a hygrometer/moisture sensor, a densitometric sensor, an anemometer, a viscometer, or any analog industrial sensor and/or digital industrial sensor. In a further example, sensors may be directed at detecting or measuring ambient noise, such as a sound sensor or microphone, an ultrasound sensor, an acoustic wave sensor, and an optical vibration sensor (e.g., using a camera to see oscillations that produce noise). In still another example, one sensor may be a motion detector.

Data collection bands, or smart bands, may be of or may be configured to encompass one or more frequencies, wavelengths, or spectra for particular sensors, for particular groups of sensors, or for combined signals from multiple sensors (such as involving multiplexing or sensor fusion).

Data collection bands, or smart bands, may be of or may be configured to encompass one or more sensors or sensor data (including groups of sensors and combined signals) from one or more pieces of equipment/components, areas of an installation, disparate but interconnected areas of an installation (e.g., a machine assembly line and a boiler room used to power the line), or locations (e.g., a building in Cambridge and a building in Boston). Smart band settings, configurations, instructions, or specifications (collectively referred to herein using any one of those terms) may include where to place a sensor, how frequently to sample a data point or points, the granularity at which a sample is taken (e.g., a number of sampling points per fraction of a second), which sensor of a set of redundant sensors to sample, an average sampling protocol for redundant sensors, and any other aspect that would affect data acquisition.

Within the smart band platform 10722, an expert system, which may comprise a neural net, a model-based system, a rule-based system, a machine learning data analysis circuit, and/or a hybrid of any of those, may begin iteration towards convergence on a smart band that is optimized for a particular goal or outcome, such as predicting and managing performance, health, or other characteristics of a piece of equipment, a component, or a system of equipment or components. Based on continuous or periodic analysis of sensor data, as patterns/trends are identified, or outliers appear, or a group of sensor readings begin to change, etc., the expert system may modify its data collection bands intelligently. This may occur by triggering a rule that reflects a model or understanding of system behavior (e.g., recognizing a shift in operating mode that calls for different sensors as velocity of a shaft increases) or it may occur under control of a neural net (either in combination with a rule-based approach or on its own), where inputs are provided such that the neural net over time learns to select appropriate collection modes based on feedback as to successful outcomes (e.g., successful classification of the state of a system, successful prediction, successful operation relative to a metric, or the like). For example, when a new pressure reactor is installed in a chemical processing facility, data from the current data collection band may not accurately predict the state or metric of operation of the system, thus, the machine learning data analysis circuit may begin to iterate to determine if a new data collection band is better at predicting a state. Based on offset system data, such as from a library or other data structure, certain sensors, frequency bands or other smart band members may be used in the smart band initially and data may be collected to assess performance. As the neural net iterates, other sensors/frequency bands may be accessed to determine their relative weight in identifying performance metrics. Over time, a new frequency band may be identified (or a new collection of sensors, a new set of configurations for sensors, or the like) as a better gauge of performance in the system and the expert system may modify its data collection band based on this iteration. For example, perhaps a slightly different or older associated turbine agitator in a chemical reaction facility dampens one or more vibration frequencies while a different frequency is of higher amplitude and present during optimal performance than what was seen in the offset system. In this example, the smart band may be altered from what was suggested by the corresponding offset system to capture the higher amplitude frequency that is present in the current system.

The expert system, in embodiments involving a neural net or other machine learning system, may be seeded and may iterate, such as towards convergence on a smart band, based on feedback and operation parameters, such as described herein. Certain feedback may include utilization measures, efficiency measures (e.g., power or energy utilization, use of storage, use of bandwidth, use of input/output use of perishable materials, use of fuel, and/or financial efficiency), measures of success in prediction or anticipation of states (e.g., avoidance and mitigation of faults), productivity measures (e.g., workflow), yield measures, and profit measures. Certain parameters may include: storage parameters (e.g., data storage, fuel storage, storage of inventory and the like); network parameters (e.g., network bandwidth, input/output speeds, network utilization, network cost, network speed, network availability and the like); transmission parameters (e.g., quality of transmission of data, speed of transmission of data, error rates in transmission, cost of transmission and the like); security parameters (e.g., number and/or type of exposure events; vulnerability to attack, data loss, data breach, access parameters, and the like); location and positioning parameters (e.g., location of data collectors, location of workers, location of machines and equipment, location of inventory units, location of parts and materials, location of network access points, location of ingress and egress points, location of landing positions, location of sensor sets, location of network infrastructure, location of power sources and the like); input selection parameters, data combination parameters (e.g., for multiplexing, extraction, transformation, loading, and the like); power parameters; states (e.g., operating modes, availability states, environmental states, fault modes, maintenance modes, anticipated states); events; and equipment specifications. With respect to states, operating modes may include mobility modes (direction, speed, acceleration, and the like), type of mobility modes (e.g., rolling, flying, sliding, levitation, hovering, floating, and the like), performance modes (e.g., gears, rotational speeds, heat levels, assembly line speeds, voltage levels, frequency levels, and the like), output modes, fuel conversion modes, resource consumption modes, and financial performance modes (e.g., yield, profitability, and the like). Availability states may refer to anticipating conditions that could cause machine to go offline or require backup. Environmental states may refer to ambient temperature, ambient humidity/moisture, ambient pressure, ambient wind/fluid flow, presence of pollution or contaminants, presence of interfering elements (e.g., electrical noise, vibration), power availability, and power quality. Anticipated states may include: achieving or not achieving a desired goal, such as a specified/threshold output production rate, a specified/threshold generation rate, an operational efficiency/failure rate, a financial efficiency/profit goal, a power efficiency/resource utilization; an avoidance of a fault condition (e.g., overheating, slow performance, excessive speed, excessive motion, excessive vibration/oscillation, excessive acceleration, expansion/contraction, electrical failure, running out of stored power/fuel, overpressure, excessive radiation/melt down, fire, freezing, failure of fluid flow (e.g., stuck valves, frozen fluids); mechanical failures (e.g., broken component, worn component, faulty coupling, misalignment, asymmetries/deflection, damaged component (e.g., deflection, strain, stress, cracking], imbalances, collisions, jammed elements, and lost or slipping chain or belt); avoidance of a dangerous condition or catastrophic failure; and availability (online status).

The expert system may comprise or be seeded with a model that predicts an outcome or state given a set of data (which may comprise inputs from sensors, such as via a data collector, as well as other data, such as from system components, from external systems and from external data sources). For example, the model may be an operating model for an industrial environment, machine, or workflow. In another example, the model may be for anticipating states, for predicting fault and optimizing maintenance, for self-organizing storage (e.g., on devices, in data pools and/or in the cloud), for optimizing data transport (such as for optimizing network coding, network-condition-sensitive routing, and the like), for optimizing data marketplaces, and the like.

The iteration of the expert system may result in any number of downstream actions based on analysis of data from the smart band. In an embodiment, the expert system may determine that the system should either keep or modify operational parameters, equipment or a weighting of a neural net model given a desired goal, such as a specified/threshold output production rate, specified/threshold generation rate, an operational efficiency/failure rate, a financial efficiency/profit goal, a power efficiency/resource utilization, an avoidance of a fault condition, an avoidance of a dangerous condition or catastrophic failure, and the like. In embodiments, the adjustments may be based on determining context of an industrial system, such as understanding a type of equipment, its purpose, its typical operating modes, the functional specifications for the equipment, the relationship of the equipment to other features of the environment (including any other systems that provide input to or take input from the equipment), the presence and role of operators (including humans and automated control systems), and ambient or environmental conditions. For example, in order to achieve a profit goal, a pipeline in a refinery may need to operate for a certain amount of time a day and/or at a certain flow rate. The expert system may be seeded with a model for operation of the pipeline in a manner that results in a specified profit goal, such as indicating a given flow rate of material through the pipeline based on the current market sale price for the material and the cost of getting the material into the pipeline. As it acquires data and iterates, the model will predict whether the profit goal will be achieved given the current data. Based on the results of the iteration of the expert system, a recommendation may be made (or a control instruction may be automatically provided) to operate the pipeline at a higher flow rate, to keep it operational for longer or the like. Further, as the system iterates, one or more additional sensors may be sampled in the model to determine if their addition to the smart band would improve predicting a state. In another embodiment, the expert system may determine that the system should either keep or modify operational parameters, equipment or a weighting of a neural net or other model given a constraint of operation (e.g., meeting a required endpoint (e.g., delivery date, amount, cost, coordination with another system), operating with a limited resource (e.g., power, fuel, battery), storage (e.g., data storage), bandwidth (e.g., local network, p2p, WAN, internet bandwidth, availability, or input/output capacity), authorization (e.g., role-based)), a warranty limitation, a manufacturer's guideline, a maintenance guideline). For example, a constraint of operating a boiler in a refinery is that the aeration of the boiler feedwater needs to be reduced in the cycle; therefore, the boiler must coordinate with the deaerator. In this example, the expert system is seeded with a model for operation of the boiler in coordination with the de-aerator that results in a specified overall performance. As sensor data from the system is acquired, the expert system may determine that an aspect of one or both of the boiler and aerator must be changed to continue to achieve the specific overall performance. In a further embodiment, the expert system may determine that the system should either keep or modify operational parameters, equipment or a weighting of a neural net model given an identified choke point. In still another embodiment, the expert system may determine that the system should either keep or modify operational parameters, equipment or a weighting of a neural net model given an off-nominal operation. For example, a reciprocating compressor in a refinery that delivers gases at high pressure may be measured as having an off-nominal operation by sensors that feed their data into an expert system (optionally including a neural net or other machine learning system). As the expert system iterates and receives the off-nominal data, it may predict that the refinery will not achieve a specified goal and will recommend an action, such as taking the reciprocating compressor offline for maintenance. In another embodiment, the expert system may determine that the system should collect more/fewer data points from one or more sensors. For example, an anchor agitator in a pharmaceutical processing plant may be programmed to agitate the contents of a tank until a certain level of viscosity (e.g., as measured in centipoise) is obtained. As the expert system collects data throughout the run indicating an increase in viscosity, the expert system may recommend collecting additional data points to confirm a predicted state in the face of the increased strain on the plant systems from the viscosity. In yet another embodiment, the expert system may determine that the system should change a data storage technique. In still another example, the expert system may determine that the system should change a data presentation mode or manner. In a further embodiment, the expert system may determine that the system should apply one or more filters (low pass, high pass, band pass, etc.) to collected data. In yet a further embodiment, the expert system may determine that the system should collect data from a new smart band/new set of sensors and/or begin measuring a new aspect that the neural net identified itself. For example, various measurements may be made of paddle-type agitator mixers operating in a pharmaceutical plant, such as mixing times, temperature, homogeneous substrate distribution, heat exchange with internal structures and the tank wall or oxygen transfer rate, mechanical stress, forces and torques on agitator vessels and internal structures, and the like. Various sensor data streams may be included in a smart band monitoring these various aspects of the paddle-type agitator mixer, such as a flow meter, a thermometer, and others. As the expert system iterates, perhaps having been seeded with minimal data from during the agitator's run, a new aspect of the operation may become apparent, such as the impact of pH on the state of the run. Thus, a new smart band will be identified by the expert system that includes sensor data from a pH meter. In yet still a further embodiment, the expert system may determine that the system should discontinue collection of data from a smart band, one or more sensors, or the like. In another embodiment, the expert system may determine that the system should initiate data collection from a new smart band, such as a new smart band identified by the neural net itself. In yet another embodiment, the expert system may determine that the system should adjust the weights/biases of a model used by the expert system. In still another embodiment, the expert system may determine that the system should remove/re-task under-utilized equipment. For example, a plurality of agitators working with a pump blasting liquid in a pharmaceutical processing plant may be monitored during operation of the plant by the expert system. Through iteration of the expert system seeded with data from a run of the plant with the agitators, the expert system may predict that a state will be achieved even if one or more agitators are taken out of service.

In embodiments, the expert system may continue iterating in a deep-learning fashion to arrive at a single smart band, after being seeded with more than one smart band, that optimizes meeting more than one goal. For example, there may be multiple goals tracked for a thermic heating system in a chemical processing or a food processing plant, such as thermal efficiency and economic efficiency. Thermal efficiency for the thermic heating system may be expressed by comparing BTUs put in to the system, which can be obtained by knowing the amount of and quality of the fuel being used, and the BTUs out of the system, which is calculated using the flow out of the system and the temperature differential of materials in and out of the system. Economic efficiency of the thermic heating system may be expressed as the ratio between costs to run the system (including fuel, labor, materials, and services) and energy output from the system for a period of time. Data used to track thermal efficiency may include data from a flow meter, quality data point(s), and a thermometer, and data used to track economic efficiency may be an energy output from the system (e.g., kWh) and costs data. These data may be used in smart bands by the expert system to predict states, however, the expert system may iterate toward a smart band that is optimized to predict states related to both thermal and economic efficiency. The new smart band may include data used previously in the individual smart bands but may also use new data from different sensors or data sources. In embodiments, the expert system may be seeded with a plurality of smart bands and iterate to predict various states, but may also iterate towards reducing the number of smart bands needed to predict the same set of states.

Iteration of the expert system may be governed by rules, in some embodiments. For example, the expert system may be structured to collect data for seeding at a pre-determined frequency. The expert system may be structured to iterate at least a number of times, such as when a new component/equipment/fuel source is added, when a sensor goes off-line, or as standard practice. For example, when a sensor measuring the rotation of a stirrer in a food processing line goes off-line and the expert system begins acquiring data from a new sensor measuring the same data points, the expert system may be structured to iterate for a number of times before the state is utilized in or allowed to affect any downstream actions. The expert system may be structured to train off-line or train in situ/online. The expert system may be structured to include static and/or manually input data in its smart bands. For example, an expert system managing smart bands associated with a mixer in a food processing plant may be structured to iterate towards predicting a duration of mixing before the food being processed achieves a particular viscosity, wherein the smart band includes data regarding the speed of the mixer, temperature of its contents, viscometric measurements and the required endpoint for viscosity and temperature of the food. The expert system may be structured to include a minimum/maximum number of variables.

In embodiments, the expert system may be overruled. In embodiments, the expert system may revert to prior band settings, such as in the event the expert system fails, such as if a neural network fails in a neural net expert system, if uncertainty is too high in a model-based system, if the system is unable to resolve conflicting rules in rule-based system, or the system cannot converge on a solution in any of the foregoing. For example, sensor data on an irrigation system used by the expert system in a smart band may indicate a massive leak in the field, but visual inspection, such as by a drone, indicates no such leak. In this event, the expert system will revert to an original smart band for seeding the expert system. In another example, one or more point sensors on an industrial pressure cooker indicates imminent failure in a seal, but the data collection band that the expert system converged to with a weighting towards a performance metric did not identify the failure. In this event, the smart band will revert to an original setting or a version of the smart band that would have also identified the imminent failure of the pressure cooker seal. In embodiments, the expert system may change smart band settings in the event that a new component is added that makes the system closer to a different offset system. For example, a vacuum distillation unit is added to an oil & gas refinery to distill naphthalene, but the current smart band settings for the expert system are derived from a refinery that distills kerosene. In this example, a data structure with smart band settings for various offset systems may be searched for a system that is more closely matched to the current system. When a new offset system is identified as more closely matched, such as one that also distill naphthalene, the new smart band settings (e.g., which sensors to use, where to place them, how frequently to sample, what static data points are needed, etc. as described herein) are used to seed the expert system to iterate towards predicting a state for the system. In embodiments, the expert system may change smart band settings in the event that a new set of offset data is available from a third-party library. For example, a pharmaceutical processing plant may have optimized a catalytic reactor to operate in a highly efficient way and deposited the smart band settings in a data structure. The data structure may be continuously scanned for new smart bands that better aid in monitoring catalytic reactions and thus, result in optimizing the operation of the reactor.

In embodiments, the expert system may be used to uncover unknown variables. For example, the expert system may iterate to identify a missing variable to be used for further iterations, such as further neural net iterations. For example, an under-utilized tank in a legacy condensate/make-up water system of a power station may have an unknown capacity because it is inaccessible and no documentation exists on the tank. Various aspects of the tank may be measured by a swarm of sensors to arrive at an estimated volume (e.g., flow into a downstream space, duration of a dye traced solution to work through the system), then that volume can be fed into the neural net as a new variable in the smart band.

As described elsewhere herein, an expert system in an industrial environment may use sensor data to make predictions about outcomes or states of the environment or items in the environment. Data collection may be of various types of data (e.g., vibration data, noise data and other sensor data of the types described throughout this disclosure) for event detection, state detection, and the like. For example, the expert system may utilize ambient noise, or the overall sound environment of the area and/or overall vibration of the device of interest, optionally in conjunction with other sensor data, in detecting or predicting events or states. For example, a reciprocating compressor in a refinery, which may generate its own vibration, may also have an ambient vibration through contact with other aspects of the system.

In embodiments, all three types of noise (ambient noise, local noise and vibration noise) including various subsets thereof and combinations with other types of data, may be organized into large data sets, along with measured results, that are processed by a "deep learning" machine/expert system that learns to predict one or more states (e.g., maintenance, failure, or operational) or overall outcomes, such as by learning from human supervision or from other feedback, such as feedback from one or more of the systems described throughout this disclosure and the documents incorporated by reference herein.

Throughout this disclosure, various examples will involve machines, components, equipment, assemblies, and the like, and it should be understood that the disclosure could apply to any of the aforementioned. Elements of these machines operating in an industrial environment (e.g., rotating elements, reciprocating elements, swinging elements, flexing elements, flowing elements, suspending elements, floating elements, bouncing elements, bearing elements, etc.) may generate vibrations that may be of a specific frequency and/or amplitude typical of the element when the element is in a given operating condition or state (e.g., a normal mode of operation of a machine at a given speed, in a given gear, or the like). Changes in a parameter of the vibration may be indicative or predictive of a state or outcome of the machine. Various sensors may be useful in measuring vibration, such as accelerometers, velocity transducers, imaging sensors, acoustic sensors, and displacement probes, which may collectively be known as vibration sensors. Vibration sensors may be mounted to the machine, such as permanently or temporarily (e.g., adhesive, hook-and-loop, or magnetic attachment), or may be disposed on a mobile or portable data collector. Sensed conditions may be compared to historical data to identify or predict a state, condition or outcome. Typical faults that can be identified using vibration analysis include: machine out of balance, machine out of alignment, resonance, bent shafts, gear mesh disturbances, blade pass disturbances, vane pass disturbances, recirculation & cavitation, motor faults (rotor & stator), bearing failures, mechanical looseness, critical machine speeds, and the like, as well as excessive friction, clutch slipping, belt problems, suspension and shock absorption problems, valve and other fluid leaks, under-pressure states in lubrication and other fluid systems, overheating (such as due to many of the above), blockage or freezing of engagement of mechanical systems, interference effects, and other faults described throughout this disclosure and in the documents incorporated by reference.

Given that machines are frequently found adjacent to or working in concert with other machinery, measuring the vibration of the machine may be complicated by the presence of various noise components in the environment or associated vibrations that the machine may be subjected to. Indeed, the ambient and/or local environment may have its own vibration and/or noise pattern that may be known. In embodiments, the combination of vibration data with ambient and/or local noise or other ambient sensed conditions may form its own pattern, as will be further described herein.

In embodiments, measuring vibration noise may involve one or more vibration sensors on or in a machine to measure vibration noise of the machine that occurs continuously or periodically. Analysis of the vibration noise may be performed, such as filtering, signal conditioning, spectral analysis, trend analysis, and the like. Analysis may be performed on aggregate or individual sensor measurements to isolate vibration noise of equipment to obtain a characteristic vibration, vibration pattern or "vibration fingerprint" of the machine. The vibration fingerprints may be stored in a data structure, or library, of vibration fingerprints. The vibration fingerprints may include frequencies, spectra (i.e., frequency vs. amplitude), velocities, peak locations, wave peak shapes, waveform shapes, wave envelope shapes, accelerations, phase information, phase shifts (including complex phase measurements) and the like. Vibration fingerprints may be stored in the library in association with a parameter by which it may be searched or sorted. The parameters may include a brand or type of machine/component/equipment, location of sensor(s) attachment or placement, duty cycle of the equipment/machine, load sharing of the equipment/machine, dynamic interactions with other devices, RPM, flow rate, pressure, other vibration driving characteristic, voltage of line power, age of equipment, time of operation, known neighboring equipment, associated auxiliary equipment/components, size of space equipment is in, material of platform for equipment, heat flux, magnetic fields, electrical fields, currents, voltage, capacitance, inductance, aspect of a product, and combinations (e.g., simple ratios) of the same. Vibration fingerprints may be obtained for machines under normal operation or for other periods of operation (e.g., off-nominal operation, malfunction, maintenance needed, faulty component, incorrect parameters of operation, other conditions, etc.) and can be stored in the library for comparison to current data. The library of vibration fingerprints may be stored as indicators with associated predictions, states, outcomes and/or events. Trend analysis data of measured vibration fingerprints can indicate time between maintenance events/failure events.

In embodiments, vibration noise may be used by the expert system to confirm the status of a machine, such as a favorable operation, a production rate, a generation rate, an operational efficiency, a financial efficiency (e.g., output per cost), a power efficiency, and the like. In embodiments, the expert system may make a comparison of the vibration noise with a stored vibration fingerprint. In other embodiments, the expert system may be seeded with vibration noise and initial feedback on states and outcomes in order to learn to predict other states and outcomes. For example, a center pivot irrigation system may be remotely monitored by attached vibration sensors to provide a measured vibration noise that can be compared to a library of vibration fingerprints to confirm that the system is operating normally. If the system is not operating normally, the expert system may automatically dispatch a field crew or drone to investigate. In another example of a vacuum distillation unit in a refinery, the vibration noise may be compared, such as by the expert system, to stored vibration fingerprints in a library to confirm a production rate of diesel. In a further example, the expert system may be seeded with vibration noise for a pipeline under conditions of a normal production rate and as the expert system iterates with current data (e.g., altered vibration noise, and possibly other altered parameters), it may predict that the production rate has increased as caused by the alterations. Measurements may be continually analyzed in this way to remotely monitor operation.

In embodiments, vibration noise may be compared, such as by the expert system, to stored vibration fingerprints and associated states and outcomes in the library, or alternatively, may be used to seed an expert system to predict when maintenance is required (e.g., off-nominal measurement, artifacts in signal, etc.), such as when vibration noise is matched to a condition when the equipment/component required maintenance, vibration noise exceeds a threshold/limit, vibration noise exceeds a threshold/limit or matches a library vibration fingerprint together with one or more additional parameters, as described herein. For example, when the vibration fingerprint from a turbine agitator in a pharmaceutical processing plant matches a vibration fingerprint for a turbine agitator when it required a replacement bearing, the expert system may cause an action to occur, such as immediately shutting down the agitator or scheduling its shutdown and maintenance.

In embodiments, vibration noise may be compared, such as by the expert system, to stored vibration fingerprints and associated states and outcomes in the library, or alternatively, may be used to seed an expert system to predict a failure or an imminent failure. For example, vibration noise from a gas agitator in a pharmaceutical processing plant may be matched to a condition when the agitator previously failed or was about to fail. In this example, the expert system may immediately shut down the agitator, schedule its shutdown, or cause a backup agitator to come online. In another example, vibration noise from a pump blasting liquid agitator in a chemical processing plant may exceed a threshold or limit and the expert system may cause an investigation into the cause of the excess vibration noise, shut down the agitator, or the like. In another example, vibration noise from an anchor agitator in a pharmaceutical processing plant may exceed a threshold/limit or match a library vibration fingerprint together with one or more additional parameters (see parameters herein), such as a decreased flow rate, increased temperature, or the like. Using vibration noise taken together with the parameters, the expert system may more reliably predict the failure or imminent failure.

In embodiments, vibration noise may be compared, such as by the expert system, to stored vibration fingerprints and associated states and outcomes in the library, or alternatively, may be used to seed an expert system to predict or diagnose a problem (e.g., unbalanced, misaligned, worn, or damaged) with the equipment or an external source contributing vibration noise to the equipment. For example, when the vibration noise from a paddle-type agitator mixer matches a vibration fingerprint from a prior imbalance, the expert system may immediately shut down the mixer.

In embodiments, when the expert system makes a prediction of an outcome or state using vibration noise, the expert system may perform a downstream action, or cause it to be performed. Downstream actions may include: triggering an alert of a failure, imminent failure, or maintenance event; shutting down equipment/component; initiating maintenance/lubrication/alignment; deploying a field technician; recommending a vibration absorption/dampening device; modifying a process to utilize backup equipment/component; modifying a process to preserve products/reactants, etc.; generating/modifying a maintenance schedule;

coupling the vibration fingerprint with duty cycle of the equipment, RPM, flow rate, pressure, temperature or other vibration-driving characteristic to obtain equipment/component status and generate a report, and the like. For example, vibration noise for a catalytic reactor in a chemical processing plant may be matched to a condition when the catalytic reactor required maintenance. Based on this predicted state of required maintenance, the expert system may deploy a field technician to perform the maintenance.

In embodiments, the library may be updated if a changed parameter resulted in a new vibration fingerprint, or if a predicted outcome or state did not occur in the absence of mitigation. In embodiments, the library may be updated if a vibration fingerprint was associated with an alternative state than what was predicted by the library. The update may occur after just one time that the state that actually occurred did not match the predicted state from the library. In other embodiments, it may occur after a threshold number of times. In embodiments, the library may be updated to apply one or more rules for comparison, such as rules that govern how many parameters to match along with the vibration fingerprint, or the standard deviation for the match in order to accept the predicted outcome.

In embodiments, vibration noise may be compared, such as by the expert system, to stored vibration fingerprints and associated states and outcomes in the library, or alternatively, may be used to seed an expert system to determine if a change in a system parameter external or internal to the machine has an effect on its intrinsic operation. In embodiments, a change in one or more of a temperature, flow rate, materials in use, duration of use, power source, installation, or other parameter (see parameters above) may alter the vibration fingerprint of a machine. For example, in a pressure reactor in a chemical processing plant, the flow rate and a reactant may be changed. The changes may alter the vibration fingerprint of the machine such that the vibration fingerprint stored in the library for normal operation is no longer correct.

Ambient noise, or the overall sound environment of the area and/or overall vibration of the device of interest, optionally in conjunction with other ambient sensed conditions, may be used in detecting or predicting events, outcomes, or states. Ambient noise may be measured by a microphone, ultrasound sensors, acoustic wave sensors, optical vibration sensors (e.g., using a camera to see oscillations that produce noise), or "deep learning" neural networks involving various sensor arrays that learn, using large data sets, to identify patterns, sounds types, noise types, etc. In an embodiment, the ambient sensed condition may relate to motion detection. For example, the motion may be a platform motion (e.g., vehicle, oil platform, suspended platform on land, etc.) or an object motion (e.g., moving equipment, people, robots, parts (e.g., fan blades or turbine blades), etc.). In an embodiment, the ambient sensed condition may be sensed by imaging, such as to detect a location and nature of various machines, equipment, and other objects, such as ones that might impact local vibration. In an embodiment, the ambient sensed condition may be sensed by thermal detection and imaging (e.g., for presence of people; presence of heat sources that may affect performance parameters, etc.). In an embodiment, the ambient sensed condition may be sensed by field detection (e.g., electrical, magnetic, etc.). In an embodiment, the ambient sensed condition may be sensed by chemical detection (e.g., smoke, other conditions). Any sensor data may be used by the expert system to provide an ambient sensed condition for analysis along with the vibration fingerprint to predict an outcome, event, or state. For example, an ambient sensed condition near a stirrer or mixer in a food processing plant may be the operation of a space heater during winter months, wherein the ambient sensed condition may include an ambient noise and an ambient temperature.

In an aspect, local noise may be the noise or vibration environment which is ambient, but known to be locally generated. The expert system may filter out ambient noise, employ common mode noise removal, and/or physically isolate the sensing environment.

In embodiments, a system for data collection in an industrial environment may use ambient, local and vibration noise for prediction of outcomes, events, and states. A library may be populated with each of the three noise types for various conditions (e.g., start up, shut down, normal operation, other periods of operation as described elsewhere herein). In other embodiments, the library may be populated with noise patterns representing the aggregate ambient, local, and/or vibration noise. Analysis (e.g., filtering, signal conditioning, spectral analysis, trend analysis) may be performed on the aggregate noise to obtain a characteristic noise pattern and identify changes in noise pattern as possible indicators of a changed condition. A library of noise patterns may be generated with established vibration fingerprints and local and ambient noise that can be sorted by a parameter (see parameters herein), or other parameters/features of the local and ambient environment (e.g., company type, industry type, products, robotic handling unit present/not present, operating environment, flow rates, production rates, brand or type of auxiliary equipment (e.g., filters, seals, coupled machinery)). The library of noise patterns may be used by an expert system, such as one with machine learning capacity, to confirm a status of a machine, predict when maintenance is required (e.g., off-nominal measurement, artifacts in signal), predict a failure or an imminent failure, predict/diagnose a problem, and the like.

Based on a current noise pattern, the library may be consulted or used to seed an expert system to predict an outcome, event, or state based on the noise pattern. Based on the prediction, the expert system may one or more of trigger an alert of a failure, imminent failure, or maintenance event, shut down equipment/component/line, initiate maintenance/lubrication/alignment, deploy a field technician, recommend a vibration absorption/dampening device, modify a process to utilize backup equipment/component, modify a process to preserve products/reactants, etc., generate/modify a maintenance schedule, or the like.

For example, a noise pattern for a thermic heating system in a pharmaceutical plant or cooking system may include local, ambient, and vibration noise. The ambient noise may be a result of, for example, various pumps to pump fuel into the system. Local noise may be a result of a local security camera chirping with every detection of motion. Vibration noise may result from the combustion machinery used to heat the thermal fluid. These noise sources may form a noise pattern which may be associated with a state of the thermic system. The noise pattern and associated state may be stored in a library. An expert system used to monitor the state of the thermic heating system may be seeded with noise patterns and associated states from the library. As current data are received into the expert system, it may predict a state based on having learned noise patterns and associated states.

In another example, a noise pattern for boiler feed water in a refinery may include local and ambient noise. The local noise may be attributed to the operation of, for example, a feed pump feeding the feed water into a steam drum. The ambient noise may be attributed to nearby fans. These noise sources may form a noise pattern which may be associated with a state of the boiler feed water. The noise pattern and associated state may be stored in a library. An expert system used to monitor the state of the boiler may be seeded with noise patterns and associated states from the library. As current data are received into the expert system, it may predict a state based on having learned noise patterns and associated states.

In yet another example, a noise pattern for a storage tank in a refinery may include local, ambient, and vibration noise. The ambient noise may be a result of, for example, a pump that pumps a product into the tank. Local noise may be a result of a fan ventilating the tank room. Vibration noise may result from line noise of a power supply into the storage tank. These noise sources may form a noise pattern which may be associated with a state of the storage tank. The noise pattern and associated state may be stored in a library. An expert system used to monitor the state of the storage tank may be seeded with noise patterns and associated states from the library. As current data are received into the expert system, it may predict a state based on having learned noise patterns and associated states.

In another example, a noise pattern for condensate/make-up water system in a power station may include vibration and ambient noise. The ambient noise may be attributed to nearby fans. The vibration noise may be attributed to the operation of the condenser. These noise sources may form a noise pattern which may be associated with a state of the condensate/make-up water system. The noise pattern and associated state may be stored in a library. An expert system used to monitor the state of the condensate/make-up water system may be seeded with noise patterns and associated states from the library. As current data are received into the expert system, it may predict a state based on having learned noise patterns and associated states.

A library of noise patterns may be updated if a changed parameter resulted in a new noise pattern or if a predicted outcome or state did not occur in the absence of mitigation of a diagnosed problem. A library of noise patterns may be updated if a noise pattern resulted in an alternative state than what was predicted by the library. The update may occur after just one time that the state that actually occurred did not match the predicted state from the library. In other embodiments, it may occur after a threshold number of times. In embodiments, the library may be updated to apply one or more rules for comparison, such as rules that govern how many parameters to match along with the noise pattern, or the standard deviation for the match in order to accept the predicted outcome. For example, a baffle may be replaced in a static agitator in a pharmaceutical processing plant which may result in a changed noise pattern. In another example, as the seal on a pressure cooker in a food processing plant ages, the noise pattern associated with the pressure cooker may change.

In embodiments, the library of vibration fingerprints, noise sources and/or noise patterns may be available for subscription. The libraries may be used in offset systems to improve operation of the local system. Subscribers may subscribe at any level (e.g., component, machinery, installation, etc.) in order to access data that would normally not be available to them, such as because it is from a competitor, or is from an installation of the machinery in a different industry not typically considered. Subscribers may search on indicators/predictors based on or filtered by system conditions, or update an indicator/predictor with proprietary data to customize the library. The library may further include parameters and metadata auto-generated by deployed sensors throughout an installation, onboard diagnostic systems and instrumentation and sensors, ambient sensors in the environment, sensors (e.g., inflexible sets) that can be put into place temporarily, such as in one or more mobile data collectors, sensors that can be put into place for longer term use, such as being attached to points of interest on devices or systems, and the like.

In embodiments, a third party (e.g., RMOs, manufacturers) can aggregate data at the component level, equipment level, factory/installation level and provide a statistically valid data set against which to optimize their own systems. For example, when a new installation of a machine is contemplated, it may be beneficial to review a library for best data points to acquire in making state predictions. For example, a particular sensor package may be recommended to reliably determine if there will be a failure. For example, if vibration noise of equipment coupled with particular levels of local noise or other ambient sensed conditions reliably is an indicator of imminent failure, a given vibration transducer/temp/microphone package observing those elements may be recommended for the installation Knowing such information may inform the choice to rent or buy a piece of machinery or associated warranties and service plans, such as based on knowing the quantity and depth of information that may be needed to reliably maintain the machinery.

In embodiments, manufacturers may utilize the library to rapidly collect in-service information for machines to draft engineering specifications for new customers.

In embodiments, noise and vibration data may be used to remotely monitor installs and automatically dispatch a field crew.

In embodiments, noise and vibration data may be used to audit a system. For example, equipment running outside the range of a licensed duty cycle may be detected by a suite of vibration sensors and/or ambient/local noise sensors. In embodiments, alerts may be triggered of potential out-of-warranty violations based on data from vibration sensors and/or ambient/local noise sensors.

In embodiments, noise and vibration data may be used in maintenance. This may be particularly useful where multiple machines are deployed that may vibrationally interact with the environment, such as two large generating machines on the same floor or platform with each other, such as in power generation plants.

In embodiments, a monitoring system 10800 for data collection in an industrial environment, may include a plurality of sensors 10802 selected among vibration sensors, ambient environment condition sensors and local sensors for collecting non-vibration data proximal to a machine in the environment, the plurality of sensors 10802 communicatively coupled to a data collector 10804, a data collection circuit 10808 structured to collect output data 10810 from the plurality of sensors 10802, and a machine learning data analysis circuit 10812 structured to receive the output data 10810 and learn received output data patterns 10814 predictive of at least one of an outcome and a state. The state may correspond to an outcome relating to a machine in the environment, an anticipated outcome relating to a machine in the environment, an outcome relating to a process in the environment, or an anticipated outcome relating to a process in the environment. The system may be deployed on the data collector 10804 or distributed between the data collector 10804 and a remote infrastructure. The data collector 10804 may include the data collection circuit 10808. The ambient environment condition or local sensors include one or more of a noise sensor, a temperature sensor, a flow sensor, a pressure sensor, a chemical sensor, a vibration sensor, an acceleration sensor, an accelerometer, a Pressure sensor, a force sensor, a position sensor, a location sensor, a velocity sensor, a displacement sensor, a temperature sensor, a thermographic sensor, a heat flux sensor, a tachometer sensor, a motion sensor, a magnetic field sensor, an electrical field sensor, a galvanic sensor, a current sensor, a flow sensor, a gaseous flow sensor, a non-gaseous fluid flow sensor, a heat flow sensor, a particulate flow sensor, a level sensor, a proximity sensor, a toxic gas sensor, a chemical sensor, a CBRNE sensor, a pH sensor, a hygrometer, a moisture sensor, a densitometer, an imaging sensor, a camera, an SSR, a triax probe, an ultrasonic sensor, a touch sensor, a microphone, a capacitive sensor, a strain gauge, an EMI' meter, and the like.

In embodiments, a monitoring system 10800 for data collection in an industrial environment may include a data collection circuit 10808 structured to collect output data 10810 from a plurality of sensors 10802 selected among vibration sensors, ambient environment condition sensors and local sensors for collecting non-vibration data proximal to a machine in the environment, the plurality of sensors 10802 communicatively coupled to a data collection circuit 10808, and a machine learning data analysis circuit 10812 structured to receive the output data 10810 and learn received output data patterns 10814 predictive of at least one of an outcome and a state, wherein the monitoring system 10800 is structured to determine if the output data matches a learned received output data pattern. The machine learning data analysis circuit 10812 may be structured to learn received output data patterns 10814 by being seeded with a model 10816. The model 10816 may be a physical model, an operational model, or a system model. The machine learning data analysis circuit 10812 may be structured to learn received output data patterns 10814 based on the outcome or the state. The monitoring system 10700 keeps or modifies operational parameters or equipment based on the predicted outcome or the state. The data collection circuit 10808 collects more or fewer data points from one or more of the plurality of sensors 10802 based on the learned received output data patterns 10814, the outcome or the state. The data collection circuit 10808 changes a data storage technique for the output data based on the learned received output data patterns 10814, the outcome, or the state. The data collector 10804 changes a data presentation mode or manner based on the learned received output data patterns 10814, the outcome, or the state. The data collection circuit 10808 applies one or more filters (low pass, high pass, band pass, etc.) to the output data. The data collection circuit 10808 adjusts the weights/biases of the machine learning data analysis circuit 10812, such as in response to the learned received output data patterns 10814. The monitoring system 10800 removes/re-tasks under-utilized equipment based on one or more of the learned received output data patterns 10814, the outcome, or the state. The machine learning data analysis circuit 10812 may include a neural network expert system. The machine learning data analysis circuit 10812 may be structured to learn received output data patterns 10814 indicative of progress/alignment with one or more goals/guidelines, wherein progress/alignment of each goal/guideline is determined by a different subset of the plurality of sensors 10802. The machine learning data analysis circuit 10812 may be structured to learn received output data patterns 10814 indicative of an unknown variable. The machine learning data analysis circuit 10812 may be structured to learn received output data patterns 10814 indicative of a preferred input sensor among available input sensors. The machine learning data analysis circuit 10812 may be disposed in part on a machine, on one or more data collection circuits 10808, in network infrastructure, in the cloud, or any combination thereof. The output data 10810 from the vibration sensors forms a vibration fingerprint, which may include one or more of a frequency, a spectrum, a velocity, a peak location, a wave peak shape, a waveform shape, a wave envelope shape, an acceleration, a phase information, and a phase shift. The data collection circuit 10808 may apply a rule regarding how many parameters of the vibration fingerprint to match or the standard deviation for the match in order to identify a match between the output data 10810 and the learned received output data pattern. The state may be one of a normal operation, a maintenance required, a failure, or an imminent failure. The monitoring system 10800 may trigger an alert, shut down equipment/component/line, initiate maintenance/lubrication/alignment based on the predicted outcome or state, deploy a field technician based on the predicted outcome or state, recommend a vibration absorption/dampening device based on the predicted outcome or state, modify a process to utilize backup equipment/component based on the predicted outcome or state, and the like. The monitoring system 10800 may modify a process to preserve products/reactants, etc. based on the predicted outcome or state. The monitoring system 10800 may generate or modify a maintenance schedule based on the predicted outcome or state. The data collection circuit 10808 may include the data collection circuit 10808. The system may be deployed on the data collection circuit 10808 or distributed between the data collection circuit 10808 and a remote infrastructure.

In embodiments, a monitoring system 10800 for data collection in an industrial environment may include a data collection circuit 10808 structured to collect output data 10810 from a plurality of sensors 10802 selected among vibration sensors, ambient environment condition sensors and local sensors for collecting non-vibration data proximal to a machine in the environment, the plurality of sensors 10802 communicatively coupled to the data collection circuit 10808, and a machine learning data analysis circuit 10812 structured to receive the output data 10810 and learn received output data patterns 10814 predictive of at least one of an outcome and a state, wherein the monitoring system 10800 is structured to determine if the output data matches a learned received output data pattern and keep or modify operational parameters or equipment based on the determination.

In embodiments, a monitoring system 10800 for data collection in an industrial environment may include a data collection circuit 10808 structured to collect output data 10810 from the plurality of sensors 10802 selected among vibration sensors, ambient environment condition sensors and local sensors for collecting non-vibration data proximal to a machine in the environment, the plurality of sensors 10802 communicatively coupled to the data collection circuit 10808, and a machine learning data analysis circuit 10812 structured to receive the output data 10810 and learn received output data patterns 10814 predictive of at least one of an outcome and a state, wherein the output data 10810 from the vibration sensors forms a vibration fingerprint. The vibration fingerprint may include one or more of a frequency, a spectrum, a velocity, a peak location, a wave peak shape, a waveform shape, a wave envelope shape, an acceleration, a phase information, and a phase shift. The data collection circuit 10808 may apply a rule regarding how many parameters of the vibration fingerprint to match or the standard deviation for the match in order to identify a match between the output data 10810 and the learned received output data pattern. The monitoring system 10800 may be structured to determine if the output data matches a learned received output data pattern and keep or modify operational parameters or equipment based on the determination In embodiments, a monitoring system 10800 for data collection in an industrial environment may include a data collection band circuit 10818 that identifies a subset of the plurality of sensors 10802 from which to process output data, the sensors selected among vibration sensors, ambient environment condition sensors and local sensors for collecting non-vibration data proximal to a machine in the environment, the plurality of sensors 10802 communicatively coupled to a data collection band circuit 10818, a data collection circuit 10808 structured to collect the output data 10810 from the subset of plurality of sensors 10802, and a machine learning data analysis circuit 10812 structured to receive the output data 10810 and learn received output data patterns 10814 predictive of at least one of an outcome and a state, wherein when the learned received output data patterns 10814 do not reliably predict the outcome or the state, the data collection band circuit 10818 alters at least one parameter of at least one of the plurality of sensors 10802. A controller 10806 identifies a new data collection band circuit 10818 based on one or more of the learned received output data patterns 10814 and the outcome or state. The machine learning data analysis circuit 10812 may be further structured to learn received output data patterns 10814 indicative of a preferred input data collection band among available input data collection bands. The system may be deployed on the data collection circuit 10808 or distributed between the data collection circuit 10808 and a remote infrastructure.

In embodiments, a monitoring system for data collection in an industrial environment may include a data collection circuit 10808 structured to collect output data 10810 from a plurality of sensors 10802, the sensors selected among vibration sensors, ambient environment condition sensors and local sensors for collecting non-vibration data proximal to a machine in the environment, the plurality of sensors 10802 communicatively coupled to the data collection circuit 10808, wherein the output data 10810 from the vibration sensors is in the form of a vibration fingerprint, a data structure 10820 comprising a plurality of vibration fingerprints and associated outcomes, and a machine learning data analysis circuit 10812 structured to receive the output data 10810 and learn received output data patterns 10814 predictive of an outcome or a state based on processing of the vibration fingerprints. The machine learning data analysis circuit 10812 may be seeded with one of the plurality of vibration fingerprints from the data structure 10820. The data structure 10820 may be updated if a changed parameter resulted in a new vibration fingerprint or if a predicted outcome did not occur in the absence of mitigation. The data structure 10820 may be updated when the learned received output data patterns 10814 do not reliably predict the outcome or the state. The system may be deployed on the data collection circuit or distributed between the data collection circuit and a remote infrastructure.

In embodiments, a monitoring system 10800 for data collection in an industrial environment may include a data collection circuit 10808 structured to collect output data 10810 from a plurality of sensors 10802 selected among vibration sensors, ambient environment condition sensors and local sensors for collecting non-vibration data proximal to a machine in the environment, the plurality of sensors 10802 communicatively coupled to a data collection circuit 10808, wherein the output data 10810 from the plurality of sensors 10802 is in the form of a noise pattern, a data structure 10820 comprising a plurality of noise patterns and associated outcomes, and a machine learning data analysis circuit 10812 structured to receive the output data 10810 and learn received output data patterns 10814 predictive of an outcome or a state based on processing of the noise patterns.

In embodiments, a monitoring system for data collection in an industrial environment may comprise: a plurality of sensors selected among vibration sensors, ambient environment condition sensors and local sensors for collecting non-vibration data proximal to a machine in the environment, the plurality of sensors communicatively coupled to a data collector; a data collection circuit structured to collect output data from the plurality of sensors; and a machine learning data analysis circuit structured to receive the output data and learn received output data patterns predictive of at least one of an outcome and a state. The state may correspond to an outcome, anticipated outcome, outcome relating to a process, as relating to a machine in the environment. The system may be deployed on the data collector. The system may be distributed between the data collector and a remote infrastructure. The ambient environment condition sensors may include a noise sensor, a temperature sensor, a flow sensor, a pressure sensor, include a chemical sensor, a noise sensor, a temperature sensor, a flow sensor, a pressure sensor, a chemical sensor, a vibration sensor, an acceleration sensor, an accelerometer, a pressure sensor, a force sensor, a position sensor, a location sensor, a velocity sensor, a displacement sensor, a temperature sensor, a thermographic sensor, a heat flux sensor, a tachometer sensor, a motion sensor, a magnetic field sensor, an electrical field sensor, a galvanic sensor, a current sensor, a flow sensor, a gaseous flow sensor, a non-gaseous fluid flow sensor, a heat flow sensor, a particulate flow sensor, a level sensor, a proximity sensor, a toxic gas sensor, a chemical sensor, a CBRNE sensor, a pH sensor, a hygrometer, a moisture sensor, a densitometer, an imaging sensor, a camera, an SSR, a triax probe, an ultrasonic sensor, a touch sensor, a microphone, a capacitive sensor, a strain gauge, and an EMI' meter. The local sensors may comprise one or more of a vibration sensor, an acceleration sensor, an accelerometer, a pressure sensor, a force sensor, a position sensor, a location sensor, a velocity sensor, a displacement sensor, a temperature sensor, a thermographic sensor, a heat flux sensor, a tachometer sensor, a motion sensor, a magnetic field sensor, an electrical field sensor, a galvanic sensor, a current sensor, a flow sensor, a gaseous flow sensor, a non-gaseous fluid flow sensor, a heat flow sensor, a particulate flow sensor, a level sensor, a proximity sensor, a toxic gas sensor, a chemical sensor, a CBRNE sensor, a pH sensor, a hygrometer, a moisture sensor, a densitometer, an imaging sensor, a camera, an SSR, a triax probe, an ultrasonic sensor, a touch sensor, a microphone, a capacitive sensor, a strain gauge, and an EMF meter.

In embodiments, a monitoring system for data collection in an industrial environment may comprise: a data collection circuit structured to collect output data from a plurality of sensors selected among vibration sensors, ambient environment condition sensors and local sensors for collecting non-vibration data proximal to a machine in the environment, the plurality of sensors communicatively coupled to the data collection circuit; and a machine learning data analysis circuit structured to receive the output data and learn received output data patterns predictive of at least one of an outcome and a state, wherein the monitoring system is structured to determine if the output data matches a learned received output data pattern. In embodiments, the machine learning data analysis circuit may be structured to learn received output data patterns by being seeded with a model, such as where the model is a physical model, an operational model, or a system model. The machine learning data analysis circuit may be structured to learn received output data patterns based on the outcome or the state. The monitoring system may keep or modify operational parameters or equipment based on the predicted outcome or the state. The data collection circuit collects data points from one or more of the plurality of sensors based on the learned received output data patterns, the outcome, or the state. The data collection circuit may change a data storage technique for the output data based on the learned received output data patterns, the outcome, or the state. The data collection circuit may change a data presentation mode or manner based on the learned received output data patterns, the outcome, or the state. The data collection circuit may apply one or more filters (low pass, high pass, band pass, etc.) to the output data. The data collection circuit may adjust the weights/biases of the machine learning data analysis circuit, such as where the adjustment is in response to the learned received output data patterns. The monitoring system may remove, or re-task under-utilized equipment based on one or more of the learned received output data patterns, the outcome, or the state. The machine learning data analysis circuit may include a neural network expert system. The machine learning data analysis circuit may be structured to learn received output data patterns indicative of progress/alignment with one or more goals or guidelines, such as where progress or alignment of each goal or guideline is determined by a different subset of the plurality of sensors. The machine learning data analysis circuit may be structured to learn received output data patterns indicative of an unknown variable. The machine learning data analysis circuit may be structured to learn received output data patterns indicative of a preferred input sensor among available input sensors. The machine learning data analysis circuit may be disposed in part on a machine, on one or more data collectors, in network infrastructure, in the cloud, or any combination thereof. The output data from the vibration sensors may form a vibration fingerprint, such as where the vibration fingerprint includes one or more of a frequency, a spectrum, a velocity, a peak location, a wave peak shape, a waveform shape, a wave envelope shape, an acceleration, a phase information, and a phase shift. The data collection circuit may apply a rule regarding how many parameters of the vibration fingerprint to match or the standard deviation for the match in order to identify a match between the output data and the learned received output data pattern. The state may be one of a normal operation, a maintenance required, a failure, or an imminent failure. The monitoring system may trigger an alert based on the predicted outcome or state. The monitoring system may shut down equipment, component, or line based on the predicted outcome or state. The monitoring system may initiate maintenance, lubrication, or alignment based on the predicted outcome or state. The monitoring system may deploy a field technician based on the predicted outcome or state. The monitoring system may recommend a vibration absorption or dampening device based on the predicted outcome or state. The monitoring system may modify a process to utilize backup equipment or a component based on the predicted outcome or state. The monitoring system may modify a process to preserve products or reactants based on the predicted outcome or state. The monitoring system may generate or modify a maintenance schedule based on the predicted outcome or state. The system may be distributed between the data collector and a remote infrastructure.

In embodiments, a monitoring system for data collection in an industrial environment may comprise: a data collection circuit structured to collect output data from a plurality of sensors selected among vibration sensors, ambient environment condition sensors and local sensors for collecting non-vibration data proximal to a machine in the environment, the plurality of sensors communicatively coupled to the data collection circuit; and a machine learning data analysis circuit structured to receive the output data and learn received output data patterns predictive of at least one of an outcome and a state, wherein the monitoring system is structured to determine if the output data matches a learned received output data pattern and keep or modify operational parameters or equipment based on the determination.

In embodiments, a monitoring system for data collection in an industrial environment may comprise: a data collection circuit structured to collect output data from a plurality of sensors selected among vibration sensors, ambient environment condition sensors and local sensors for collecting non-vibration data proximal to a machine in the environment, the plurality of sensors communicatively coupled to the data collection circuit; and a machine learning data analysis circuit structured to receive the output data and learn received output data patterns predictive of at least one of an outcome and a state, wherein the output data from the vibration sensors forms a vibration fingerprint. In embodiments, the vibration fingerprint may comprise one or more of a frequency, a spectrum, a velocity, a peak location, a wave peak shape, a waveform shape, a wave envelope shape, an acceleration, a phase information, and a phase shift. The data collection circuit may apply a rule regarding how many parameters of the vibration fingerprint to match or the standard deviation for the match in order to identify a match between the output data and the learned received output data pattern. The monitoring system may be structured to determine if the output data matches a learned received output data pattern and keep or modify operational parameters or equipment based on the determination In embodiments, a monitoring system for data collection in an industrial environment may comprise: a data collection band circuit that identifies a subset of a plurality of sensors from which to process output data, the sensors selected among vibration sensors, ambient environment condition sensors and local sensors for collecting non-vibration data proximal to a machine in the environment, the plurality of sensors communicatively coupled to the data collection band circuit; a data collection circuit structured to collect the output data from the subset of plurality of sensors; and a machine learning data analysis circuit structured to receive the output data and learn received output data patterns predictive of at least one of an outcome and a state wherein when the learned received output data patterns do not reliably predict the outcome or the state, the data collection band circuit alters at least one parameter of at least one of the plurality of sensors. In embodiments, the controller may identify a new data collection band circuit based on one or more of the learned received output data patterns and the outcome or state. The machine learning data analysis circuit may be further structured to learn received output data patterns indicative of a preferred input data collection band among available input data collection bands. The system may be distributed between the data collection circuit and a remote infrastructure.

In embodiments, a monitoring system for data collection in an industrial environment may comprise a data collection circuit structured to collect output data from the plurality of sensors, the sensors selected among vibration sensors, ambient environment condition sensors and local sensors for collecting non-vibration data proximal to a machine in the environment and being communicatively coupled to the data collection circuit, wherein the output data from the vibration sensors is in the form of a vibration fingerprint; a data structure comprising a plurality of vibration fingerprints and associated outcomes; and a machine learning data analysis circuit structured to receive the output data and learn received output data patterns predictive of an outcome or a state based on processing of the vibration fingerprints. The machine learning data analysis circuit may be seeded with one of the plurality of vibration fingerprints from the data structure. The data structure maybe updated if a changed parameter resulted in a new vibration fingerprint or if a predicted outcome did not occur in the absence of mitigation. The data structure may be updated when the learned received output data patterns do not reliably predict the outcome or the state. The system may be distributed between the data collection circuit and a remote infrastructure.

In embodiments, a monitoring system for data collection in an industrial environment may comprise a data collection circuit structured to collect output data from the plurality of sensors selected among vibration sensors, ambient environment condition sensors and local sensors for collecting non-vibration data proximal to a machine in the environment, the plurality of sensors communicatively coupled to the data collection circuit, wherein the output data from the plurality of sensors is in the form of a noise pattern; a data structure comprising a plurality of noise patterns and associated outcomes; and a machine learning data analysis circuit structured to receive the output data and learn received output data patterns predictive of an outcome or a state based on processing of the noise patterns.

The term industrial system (and similar terms) as utilized herein should be understood broadly. Without limitation to any other aspect or description of the present disclosure, an industrial system includes any large scale process system, mechanical system, chemical system, assembly line, oil and gas system (including, without limitation, production, transportation, exploration, remote operations, offshore operations, and/or refining), mining system (including, without limitation, production, exploration, transportation, remote operations, and/or underground operations), rail system (yards, trains, shipments, etc.), construction, power generation, aerospace, agriculture, food processing, and/or energy generation. Certain components may not be considered industrial individually, but may be considered industrially in an aggregated system—for example a single fan, motor, and/or engine may be not an industrial system, but may be a part of a larger system and/or be accumulated with a number of other similar components to be considered an industrial system and/or a part of an industrial system. In certain embodiments, a system may be considered an industrial system for some purposes but not for other purposes—for example a large data server farm may be considered an industrial system for certain sensing operations, such as temperature detection, vibration, or the like, but not an industrial system for other sensing operations such as gas composition. Additionally, in certain embodiments, otherwise similar looking systems may be differentiated in determining whether such system are industrial systems, and/or which type of industrial system. For example, one data server farm may not, at a given time, have process stream flow rates that are critical to operation, while another data server farm may have process stream flow rates that are critical to operation (e.g., a coolant flow stream), and accordingly one data farm server may be an industrial system for a data collection and/or sensing improvement process or system, while the other is not. Accordingly, the benefits of the present disclosure may be applied in a wide variety of systems, and any such systems may be considered an industrial system herein, while in certain embodiments a given system may not be considered an industrial system herein. One of skill in the art, having the benefit of the disclosure herein and knowledge about a contemplated system ordinarily available to that person, can readily determine which aspects of the present disclosure will benefit a particular system, how to combine processes and systems from the present disclosure to enhance operations of the contemplated system. Certain considerations for the person of skill in the art, in determining whether a contemplated system is an industrial system and/or whether aspects of the present disclosure can benefit or enhance the contemplated system include, without limitation: the accessibility of portions of the system to positioning sensing devices; the sensitivity of the system to capital costs (e.g., initial installation) and operating costs (e.g., optimization of processes, reduction of power usage); the transmission environment of the system (e.g., availability of broadband internet; satellite coverage; wireless cellular access; the electro-magnetic ("EM") environment of the system; the weather, temperature, and environmental conditions of the system; the availability of suitable locations to run wires, network lines, and the like; the presence and/or availability of suitable locations for network infrastructure, router positioning, and/or wireless repeaters); the availability of trained personnel to interact with computing devices; the desired spatial, time, and/or frequency resolution of sensed parameters in the system; the degree to which a system or process is well understood or modeled; the turndown ratio in system operations (e.g., high load differential to low load; high flow differential to low flow; high temperature operation differential to low temperature operation); the turndown ratio in operating costs (e.g., effects of personnel costs based on time (day, season, etc.); effects of power consumption cost variance with time, throughput, etc.); the sensitivity of the system to failure, down-time, or the like; the remoteness of the contemplated system (e.g., transport costs, time delays, etc.); and/or qualitative scope of change in the system over the operating cycle (e.g., the system runs several distinct processes requiring a variable sensing environment with time; time cycle and nature of changes such as periodic, event driven, lead times generally available, etc.). While specific examples of industrial systems and considerations are described herein for purposes of illustration, any system benefitting from the disclosures herein, and any considerations understood to one of skill in the art having the benefit of the disclosures herein, are specifically contemplated within the scope of the present disclosure.

The term sensor (and similar terms) as utilized herein should be understood broadly. Without limitation to any other aspect or description of the present disclosure, sensor includes any device configured to provide a sensed value representative of a physical value (e.g., temperature, force, pressure) in a system, or representative of a conceptual value in a system at least having an ancillary relationship to a physical value (e.g., work, state of charge, frequency, phase, etc.).

Example and non-limiting sensors include vibration, acceleration, noise, pressure, force, position, location, velocity, displacement, temperature, heat flux, speed, rotational speed (e.g., a tachometer), motion, accelerometers, magnetic field, electrical field, galvanic, current, flow (gas, fluid, heat, particulates, particles, etc.), level, proximity, gas composition, fluid composition, toxicity, corrosiveness, acidity, pH, humidity, hygrometer measures, moisture, density (bulk or specific), ultrasound, imaging, analog, and/or digital sensors. The list of sensed values is a non-limiting example, and the benefits of the present disclosure in many applications can be realized independent of the sensor type, while in other applications the benefits of the present disclosure may be dependent upon the sensor type.

The sensor type and mechanism for detection may be any type of sensor understood in the art. Without limitation, an accelerometer may be any type and scaling, for example 500 mV per g (1 g=9.8 m/s$^2$), 100 mV, 1 V per g, 5 V per g, 10 V per g, 10 MV per g, as well as any frequency capability. It will be understood for accelerometers, and for all sensor types, that the scaling and range may be competing (e.g., in a fixed-bit or low bit A/D system), and/or selection of high resolution scaling with a large range may drive up sensor and/or computing costs, which may be acceptable in certain embodiments, and may be prohibitive in other embodiments. Example and non-limiting accelerometers include piezo-electric devices, high resolution and sampling speed position detection devices (e.g., laser based devices), and/or detection of other parameters (strain, force, noise, etc.) that can be correlated to acceleration and/or vibration. Example and non-limiting proximity probes include electro-magnetic devices (e.g., Hall effect, Variable Reluctance, etc.), a sleeve/oil film device, and/or determination of other parameters than can be correlated to proximity. An example vibration sensor includes a tri-axial probe, which may have high frequency response (e.g., scaling of 100 MV/g). Example and non-limiting temperature sensors include thermistors, thermocouples, and/or optical temperature determination.

A sensor may, additionally or alternatively, provide a processed value (e.g., a de-bounced, filtered, and/or compensated value) and/or a raw value, with processing downstream (e.g., in a data collector, controller, plant computer, and/or on a cloud-based data receiver). In certain embodiments, a sensor provides a voltage, current, data file (e.g., for images), or other raw data output, and/or a sensor provides a value representative of the intended sensed measurement (e.g., a temperature sensor may communicate a voltage or a temperature value). Additionally or alternatively, a sensor may communicate wirelessly, through a wired connection, through an optical connection, or by any other mechanism. The described examples of sensor types and/or communication parameters are non-limiting examples for purposes of illustration.

Additionally or alternatively, in certain embodiments, a sensor is a distributed physical device—for example where two separate sensing elements coordinate to provide a sensed value (e.g., a position sensing element and a mass sensing element may coordinate to provide an acceleration value). In certain embodiments, a single physical device may form two or more sensors, and/or parts of more than one sensor. For example, a position sensing element may form a position sensor and a velocity sensor, where the same physical hardware provides the sensed data for both determinations.

The term smart sensor, smart device (and similar terms) as utilized herein should be understood broadly. Without limitation to any other aspect or description of the present disclosure, a smart sensor includes any sensor and aspect thereof as described throughout the present disclosure. A smart sensor includes an increment of processing reflected in the sensed value communicated by the sensor, including at least basic sensor processing (e.g., de-bouncing, filtering, compensation, normalization, and/or output limiting), more complex compensations (e.g., correcting a temperature value based on known effects of current environmental conditions on the sensed temperature value, common mode or other noise removal, etc.), a sensing device that provides the sensed value as a network communication, and/or a sensing device that aggregates a number of sensed values for communication (e.g., multiple sensors on a device communicated out in a parseable or deconvolutable manner or as separate messages; multiple sensors providing a value to a single smart sensor, which relays sensed values on to a data collector, controller, plant computer, and/or cloud-based data receiver). The use of the term smart sensor is for purposes of illustration, and whether a sensor is a smart sensor can depend upon the context and the contemplated system, and can be a relative description compared to other sensors in the contemplated system. Thus, a given sensor having identical functionality may be a smart sensor for the purposes of one contemplated system, and just a sensor for the purposes of another contemplated system, and/or may be a smart sensor in a contemplated system during certain operating conditions, and just a sensor for the purposes of the same contemplated system during other operating conditions.

The terms sensor fusion, fused sensors, and similar terms, as utilized herein, should be understood broadly, except where context indicates otherwise, without limitation to any other aspect or description of the present disclosure. A sensor fusion includes a determination of second order data from sensor data, and further includes a determination of second order data from sensor data of multiple sensors, including involving multiplexing of streams of data, combinations of batches of data, and the like from the multiple sensors. Second order data includes a determination about a system or operating condition beyond that which is sensed directly. For example, temperature, pressure, mixing rate, and other data may be analyzed to determine which parameters are result-effective on a desired outcome (e.g., a reaction rate). The sensor fusion may include sensor data from multiple sources, and/or longitudinal data (e.g., taken over a period of time, over the course of a process, and/or over an extent of components in a plant— for example tracking a number of assembled parts, a virtual slug of fluid passing through a pipeline, or the like). The sensor fusion may be performed in real-time (e.g., populating a number of sensor fusion determinations with sensor data as a process progresses), off-line (e.g., performed on a controller, plant computer, and/or cloud-based computing device), and/or as a post-processing operation (e.g., utilizing historical data, data from multiple plants or processes, etc.). In certain embodiments, a sensor fusion includes a machine pattern recognition operation—for example where an outcome of a process is given to the machine and/or determined by the machine, and the machine pattern recognition operation determines result-effective parameters from the detected sensor value space to determine which operating conditions were likely to be the cause of the outcome and/or the off-nominal result of the outcome (e.g., process was less effective or more effective than nominal, failed, etc.). In certain embodiments, the outcome may be a quantitative outcome (e.g., 20% more product was produced than a nominal run) or a qualitative outcome (e.g., product quality was unacceptable, component X of the contemplated system failed during the process, component X of the contemplated system required a maintenance or service event, etc.).

In certain embodiments, a sensor fusion operation is iterative or recursive—for example an estimated set of result effective parameters is updated after the sensor fusion operation, and a subsequent sensor fusion operation is performed on the same data or another data set with an updated set of the result effective parameters. In certain embodiments, subsequent sensor fusion operations include adjustments to the sensing scheme—for example higher resolution detections (e.g., in time, space, and/or frequency domains), larger data sets (and consequent commitment of computing and/or networking resources), changes in sensor capability and/or settings (e.g., changing an A/D scaling, range, resolution, etc.; changing to a more capable sensor and/or more capable data collector, etc.) are performed for subsequent sensor fusion operations. In certain embodiments, the sensor fusion operation demonstrates improvements to the contemplated system (e.g., production quantity, quality, and/or purity, etc.) such that expenditure of additional resources to improve the sensing scheme are justified. In certain embodiments, the sensor fusion operation provides for improvement in the sensing scheme without incremental cost—for example by narrowing the number of result effective parameters and thereby freeing up system resources to provide greater resolution, sampling rates, etc., from hardware already present in the contemplated system. In certain embodiments, iterative and/or recursive sensor fusion is performed on the same data set, a subsequent data set, and/or a historical data set. For example, high resolution data may already be present in the system, and a first sensor fusion operation is performed with low resolution data (e.g., sampled from the high resolution data set), such as to allow for completion of sensor fusion processing operations within a desired time frame, within a desired processor, memory, and/or network utilization, and/or to allow for checking a large number of variables as potential result effective parameters. In a further example, a greater number of samples from the high resolution data set may be utilized in a subsequent sensor fusion operation in response to confidence that improvements are present, narrowing of the potential result effective variables, and/or a determination that higher resolution data is required to determine the result effective parameters and/or effective values for such parameters.

The described operations and aspects for sensor fusion are non-limiting examples, and one of skill in the art, having the benefit of the disclosures herein and information ordinarily available about a contemplated system, can readily design a system to utilize and/or benefit from a sensor fusion operation. Certain considerations for a system to utilize and/or benefit from a sensor fusion operation include, without limitation: the number of components in the system; the cost of components in the system; the cost of maintenance and/or down-time for the system; the value of improvements in the system (production quantity, quality, yield, etc.); the presence, possibility, and/or consequences of undesirable system outcomes (e.g., side products, thermal and/or luminary events, environmental benefits or consequences, hazards present in the system); the expense of providing a multiplicity of sensors for the system; the complexity between system inputs and system outputs; the availability and cost of computing resources (e.g., processing, memory, and/or communication throughput); the size/scale of the contemplated system and/or the ability of such a system to generate statistically significant data; whether offset systems exist, including whether data from offset systems is available and whether combining data from offset systems will generate a statistically improved data set relative to the system considered alone; and/or the cost of upgrading, improving, or changing a sensing scheme for the contemplated system. The described considerations for a contemplated system that may benefit from or utilize a sensor fusion operation are non-limiting illustrations.

Certain systems, processes, operations, and/or components are described in the present disclosure as "offset systems" or the like. An offset system is a system distinct from a contemplated system, but having relevance to the contemplated system. For example, a contemplated refinery may have an "offset refinery," which may be a refinery operated by a competitor, by a same entity operating the contemplated refinery, and/or a historically operated refinery that no longer exists. The offset refinery bears some relevant relationship to the contemplated refinery, such as utilizing similar reactions, process flows, production volumes, feed stock, effluent materials, or the like. A system which is an offset system for one purpose may not be an offset system for another purpose. For example, a manufacturing process utilizing conveyor belts and similar motors may be an offset process for a contemplated manufacturing process for the purpose of tracking product movement, understanding motor operations and failure modes, or the like, but may not be an offset process for product quality if the products being produced have distinct quality outcome parameters. Any industrial system contemplated herein may have an offset system for certain purposes. One of skill in the art, having the benefit of the present disclosure and information ordinarily available for a contemplated system, can readily determine what is disclosed by an offset system or offset aspect of a system.

Any one or more of the terms computer, computing device, processor, circuit, and/or server include a computer of any type, capable to access instructions stored in communication thereto such as upon a non-transient computer readable medium, whereupon the computer performs operations of systems or methods described herein upon executing the instructions. In certain embodiments, such instructions themselves comprise a computer, computing device, processor, circuit, and/or server. Additionally or alternatively, a computer, computing device, processor, circuit, and/or server may be a separate hardware device, one or more computing resources distributed across hardware devices, and/or may include such aspects as logical circuits, embedded circuits, sensors, actuators, input and/or output devices, network and/or communication resources, memory resources of any type, processing resources of any type, and/or hardware devices configured to be responsive to determined conditions to functionally execute one or more operations of systems and methods herein.

Certain operations described herein include interpreting, receiving, and/or determining one or more values, parameters, inputs, data, or other information. Operations including interpreting, receiving, and/or determining any value parameter, input, data, and/or other information include, without limitation: receiving data via a user input; receiving data over a network of any type; reading a data value from a memory location in communication with the receiving device; utilizing a default value as a received data value; estimating, calculating, or deriving a data value based on other information available to the receiving device; and/or updating any of these in response to a later received data value. In certain embodiments, a data value may be received by a first operation, and later updated by a second operation, as part of the receiving a data value. For example, when communications are down, intermittent, or interrupted, a first operation to interpret, receive, and/or determine a data value may be performed, and when communications are restored an updated operation to interpret, receive, and/or determine the data value may be performed.

Certain logical groupings of operations herein, for example methods or procedures of the current disclosure, are provided to illustrate aspects of the present disclosure. Operations described herein are schematically described and/or depicted, and operations may be combined, divided, re-ordered, added, or removed in a manner consistent with the disclosure herein. It is understood that the context of an operational description may require an ordering for one or more operations, and/or an order for one or more operations may be explicitly disclosed, but the order of operations should be understood broadly, where any equivalent grouping of operations to provide an equivalent outcome of operations is specifically contemplated herein. For example, if a value is used in one operational step, the determining of the value may be required before that operational step in certain contexts (e.g., where the time delay of data for an operation to achieve a certain effect is important), but may not be required before that operation step in other contexts (e.g., where usage of the value from a previous execution cycle of the operations would be sufficient for those purposes). Accordingly, in certain embodiments an order of operations and grouping of operations as described is explicitly contemplated herein, and in certain embodiments re-ordering, subdivision, and/or different grouping of operations is explicitly contemplated herein.

Figure 112:
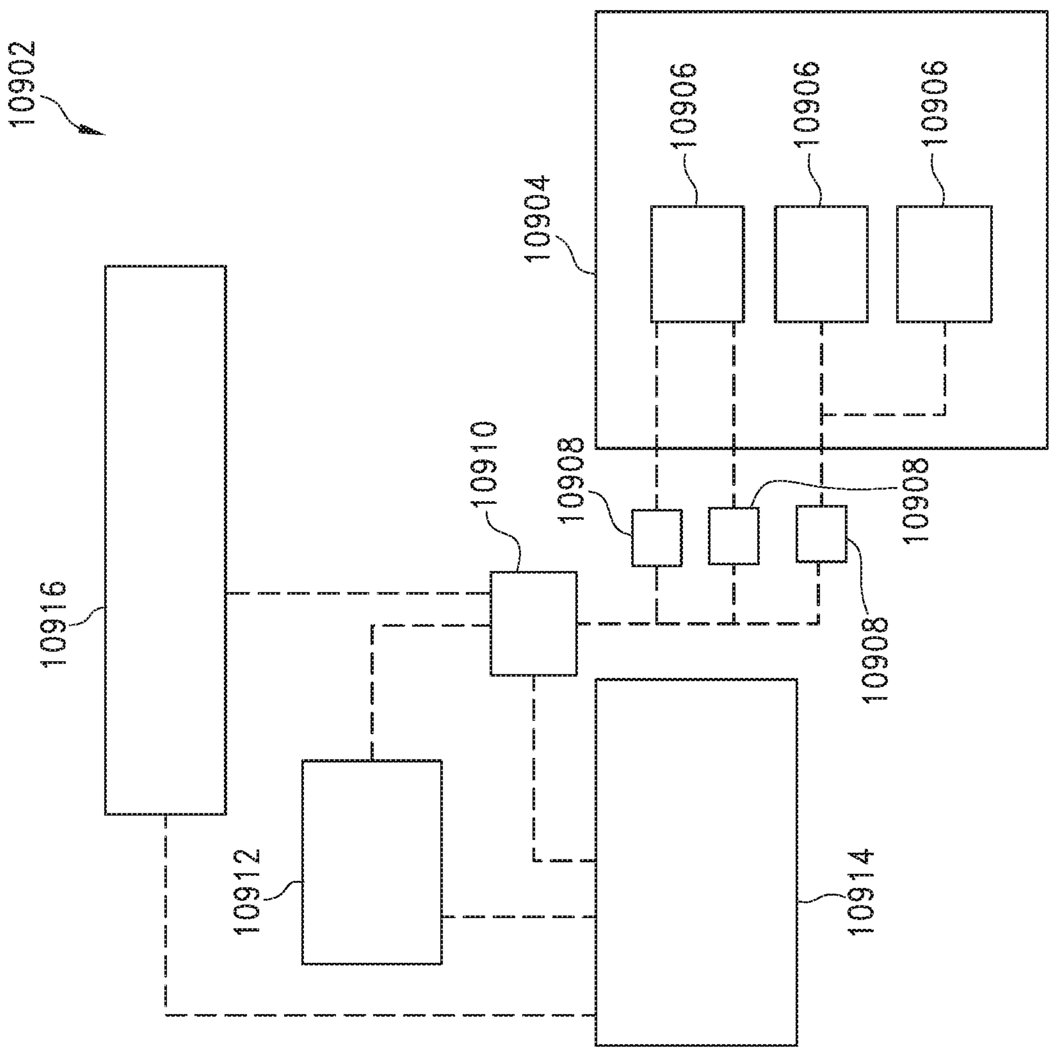
FIG. 112 is a diagrammatic view that depicts a system for data collection in an industrial environment in accordance with the present disclosure.

Referencing FIG. 112, an example system 10902 for data collection in an industrial environment includes an industrial system 10904 having a number of components 10906, and a number of sensors 10908, wherein each of the sensors 10908 is operatively coupled to at least one of the components 10906. The selection, distribution, type, and communicative setup of sensors depends upon the application of the system 10902 and/or the context.

Figure 113:
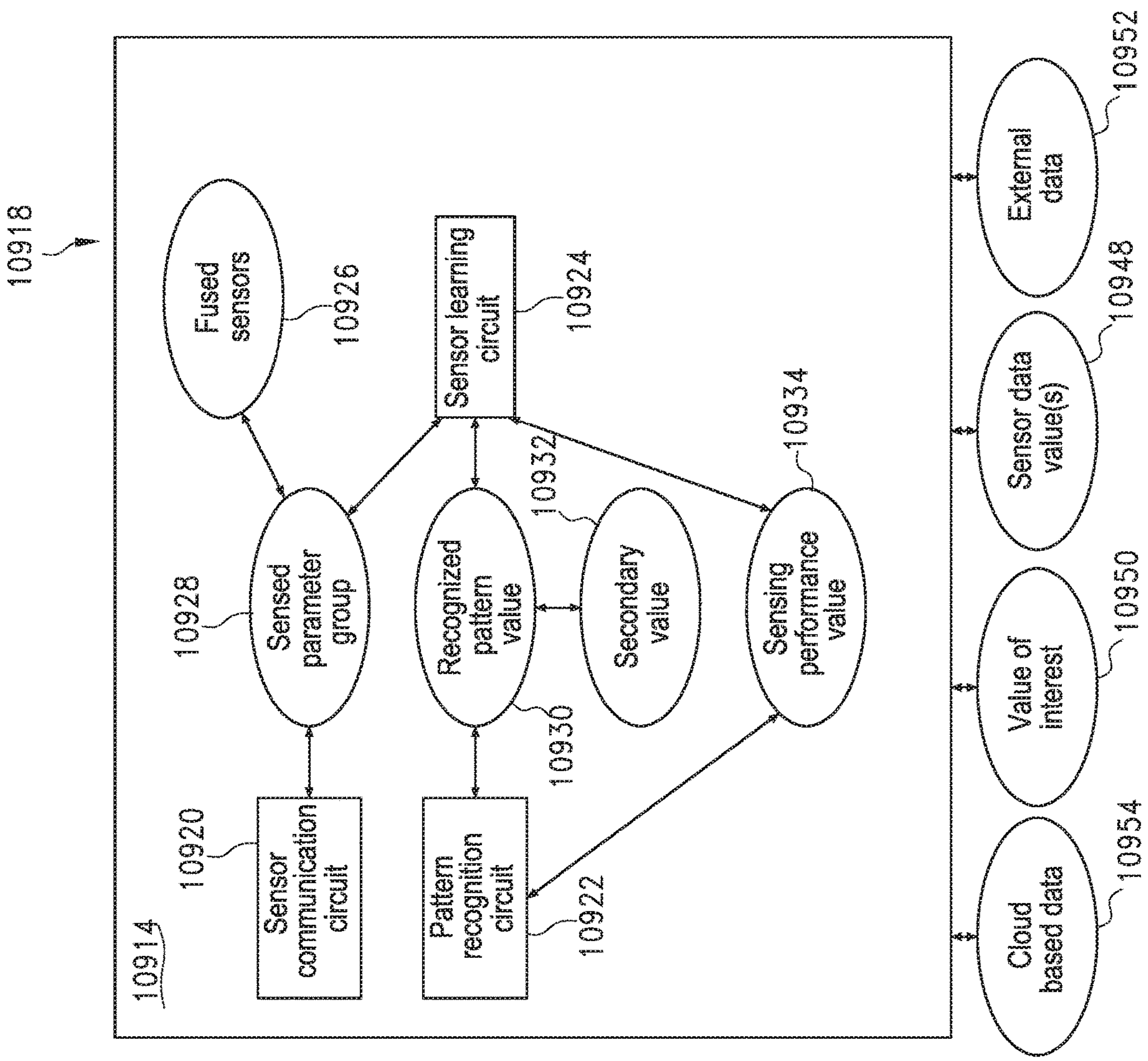
FIG. 113 is a diagrammatic view that depicts an apparatus for data collection in an industrial environment in accordance with the present disclosure.

The example system 10902 further includes a sensor communication circuit 10920 (reference FIG. 113) that interprets a number of sensor data values 10948 in response to a sensed parameter group 10928. The sensed parameter group 10928 includes a description of which sensors 10908 are sampled at which times, including at least the selected sampling frequency, a process stage wherein a particular sensor may be providing a value of interest, and the like. An example system includes the sensed parameter group 10928 being a fused number of sensors 10926, for example a set of sensors believed to encompass detection of operating conditions of the system that affect a desired output, such as production output, quality, efficiency, profitability, purity, maintenance or service predictions of components in the system, failure mode predictions, and the like. In a further embodiment, the recognized pattern value 10930 further includes a secondary value 10932 including a value determined in response to the fused number of sensors 10926.

In certain embodiments, sensor data values 10948 are provided to a data collector 10910, which may be in communication with multiple sensors 10908 and/or with a controller 10914. In certain embodiments, a plant computer 10912 is additionally or alternatively present. In the example system, the controller 10914 is structured to functionally execute operations of the sensor communication circuit 10920, pattern recognition circuit 10922, and/or the sensor learning circuit 10924, and is depicted as a separate device for clarity of description. Aspects of the controller 10914 may be present on the sensors 10908, the data controller 10910, the plant computer 10912, and/or on a cloud computing device 10916. In certain embodiments, all aspects of the controller 10914 may be present in another device depicted on the system 10902. The plant computer 10912 represents local computing resources, for example processing, memory, and/or network resources, that may be present and/or in communication with the industrial system 10904. In certain embodiments, the cloud computing device 10916 represents computing resources externally available to the industrial system 10904, for example over a private network, intra-net, through cellular communications, satellite communications, and/or over the internet. In certain embodiments, the data controller 10910 may be a computing device, a smart sensor, a MUX box, or other data collection device capable to receive data from multiple sensors and to pass-through the data and/or store data for later transmission. An example data controller 10910 has no storage and/or limited storage, and selectively passes sensor data therethrough, with a subset of the sensor data being communicated at a given time due to bandwidth considerations of the data controller 10910, a related network, and/or imposed by environmental constraints. In certain embodiments, one or more sensors and/or computing devices in the system 10902 are portable devices—for example a plant operator walking through the industrial system may have a smart phone, which the system 10902 may selectively utilize as a data controller 10910, sensor 10908—for example to enhance communication throughput, sensor resolution, and/or as a primary method for communicating sensor data values 10948 to the controller 10914.

The example system 10902 further includes a pattern recognition circuit 10922 that determines a recognized pattern value 10930 in response to a least a portion of the sensor data values 10948.

The example system 10902 further includes a sensor learning circuit 10924 that updates the sensed parameter group 10928 in response to the recognized pattern value 10930. The example sensor communication circuit 10920 further adjusts the interpreting the sensor data values 10948 in response to the updated sensed parameter group 10928.

An example system 10902 further includes the pattern recognition circuit 10922 and the sensor learning circuit 10924 iteratively performing the determining the recognized pattern value 10930 and the updating the sensed parameter group 10928 to improve a sensing performance value 10934. For example, the pattern recognition circuit 10922 may add sensors, remove sensors, and/or change sensor setting to modify the sensed parameter group 10928 based upon sensors which appear to be effective or ineffective predictors of the recognized pattern value 10930, and the sensor learning circuit 10924 may instruct a continued change (e.g., while improvement is still occurring), an increased or decreased rate of change (e.g., to converge more quickly on an improved sensed parameter group 10928), and/or instruct a randomized change to the sensed parameter group 10928 (e.g., to ensure that all potentially result effective sensors are being checked, and/or to avoid converging into a local optimal value).

Example and non-limiting options for the sensing performance value 10934 include: a signal-to-noise performance for detecting a value of interest in the industrial system (e.g., a determination that the prediction signal for the value is high relative to noise factors for one or more sensors of the sensed parameter group 10928, and/or for the sensed parameter group 10928 as a whole); a network utilization of the sensors in the industrial system (e.g., the sensor learning circuit 10924 may score a sensed parameter group 10928 relatively high where it is as effective or almost as effective as another sensed parameter group 10928, but results in lower network utilization); an effective sensing resolution for a value of interest in the industrial system (e.g., the sensor learning circuit 10924 may score a sensed parameter group 10928 relatively high where it provides a responsive prediction of the output value to smaller changes in input values); a power consumption value for a sensing system in the industrial system, the sensing system including the sensors (e.g., the sensor learning circuit 10924 may score a sensed parameter group 10928 relatively high where it is as effective or almost as effective as another sensed parameter group 10928, but results in lower power consumption); a calculation efficiency for determining the secondary value (e.g., the sensor learning circuit 10924 may score a sensed parameter group 10928 relatively high where it is as effective or almost as effective as another sensed parameter group 10928 in determining the secondary value 10932, but results in fewer processor cycles, lower network utilization, and/or lower memory utilization including stored memory requirements as well as intermediate memory utilization such as buffers); an accuracy and/or a precision of the secondary value (e.g., the sensor learning circuit 10924 may score a sensed parameter group 10928 relatively high where it provides a highly accurate and/or highly precise determination of the secondary value 10932); a redundancy capacity for determining the secondary value (e.g., the sensor learning circuit 10924 may score a sensed parameter group 10928 relatively high where it provides similar capability and/or resource utilization, but provides for additional sensing redundancy, such as being more robust to gaps in data from one or more of the sensors in the sensed parameter group 10928); and/or a lead time value for determining the secondary value 10932 (e.g., the sensor learning circuit 10924 may score a sensed parameter group 10928 relatively high where it provides an improved or sufficient lead time in the secondary value 10932 determination—for example to assist in avoiding over-temperature operation, spoiling an entire production run, determining whether a component has sufficient service life to complete a production run, etc.) Example and non-limiting calculation efficiency values include one or more determinations such as: processor operations to determine the secondary value 10932; memory utilization for determining the secondary value 10932; a number of sensor inputs from the number of sensors for determining the secondary value 10932; and/or supporting memory, such as long-term storage or buffers for supporting the secondary value 10932.

Example systems include one or more, or all, of the sensors 10908 as analog sensors and/or as remote sensors. An example system includes the secondary value 10932 being a value such as: a virtual sensor output value;

a process prediction value (e.g., a success value for a production run, an overtemperature value, an overpressure value, a product quality value, etc.); a process state value (e.g., a stage of the process, a temperature at a time and location in the process); a component prediction value (e.g., a component failure prediction, a component maintenance or service prediction, a component response to an operating change prediction); a component state value (a remaining service life or maintenance interval for a component); and/or a model output value having the sensor data values 10948 from the fused number of sensors 10926 as an input. An example system includes the fused number of sensors 10926 being one or more of the combinations of sensors such as: a vibration sensor and a temperature sensor; a vibration sensor and a pressure sensor; a vibration sensor and an electric field sensor; a vibration sensor and a heat flux sensor; a vibration sensor and a galvanic sensor; and/or a vibration sensor and a magnetic sensor.

An example sensor learning circuit 10924 further updates the sensed parameter group 10928 by performing an operation such as: updating a sensor selection of the sensed parameter group 10928 (e.g., which sensors are sampled); updating a sensor sampling rate of at least one sensor from the sensed parameter group (e.g., how fast the sensors provide information, and/or how fast information is passed through the network); updating a sensor resolution of at least one sensor from the sensed parameter group (e.g., changing or requesting a change in a sensor resolution, utilizing additional sensors to provide greater effective resolution); updating a storage value corresponding to at least one sensor from the sensed parameter group (e.g., storing data from the sensor at a higher or lower resolution, and/or over a longer or shorter time period); updating a priority corresponding to at least one sensor from the sensed parameter group (e.g., moving a sensor up to a higher priority—for example, if environmental conditions prevent data receipt from all planned sensors, and/or reducing a time lag between creation of the sensed data and receipt at the sensor learning circuit 10924); and/or updating at least one of a sampling rate, sampling order, sampling phase, and/or a network path configuration corresponding to at least one sensor from the sensed parameter group.

An example pattern recognition circuit 10922 further determines the recognized pattern value 10930 by performing an operation such as: determining a signal effectiveness of at least one sensor of the sensed parameter group and the updated sensed parameter group relative to a value of interest 10950 (e.g., determining that a sensor value is a good predictor of the value of interest 10950); determining a sensitivity of at least one sensor of the sensed parameter group 10928 and the updated sensed parameter group 10928 relative to the value of interest 10950 (e.g., determining the relative sensitivity of the determined value of interest to small changes in operating conditions based on the selected sensed parameter group 10928); determining a predictive confidence of at least one sensor of the sensed parameter group 10928 and the updated sensed parameter group 10928 relative to the value of interest 10950; determining a predictive delay time of at least one sensor of the sensed parameter group 10928 and the updated sensed parameter group 10928 relative to the value of interest 10950; determining a predictive accuracy of at least one sensor of the sensed parameter group 10928 and the updated sensed parameter group 10928 relative to the value of interest 10950; determining a classification precision of at least one sensor of the sensed parameter group 10928 (e.g., determining the accuracy of classification of a pattern by a machine classifier based on use of the at least one sensor); determining a predictive precision of at least one sensor of the sensed parameter group 10928 and the updated sensed parameter group 10928 relative to the value of interest 10950; and/or updating the recognized pattern value 10930 in response to external feedback, which may be received as external data 10952 (e.g., where an outcome is known, such as a maintenance event, product quality determination, production outcome determination, etc., the detection of the recognized pattern value 10930 is thereby improved according to the conditions of the system before the known outcome occurred). Example and non-limiting values of interest 10950 include: a virtual sensor output value; a process prediction value; a process state value; a component prediction value; a component state value; and/or a model output value having the sensor data values from the fused plurality of sensors as an input.

An example pattern recognition circuit 10922 further accesses cloud-based data 10954 including a second number of sensor data values, the second number of sensor data values corresponding to at least one offset industrial system. An example sensor learning circuit 10924 further accesses the cloud-based data 10954 including a second updated sensor parameter group corresponding to the at least one offset industrial system. Accordingly, the pattern recognition circuit 10922 can improve pattern recognition in the system based on increased statistical data available from an offset system. Additionally, or alternatively, the sensor learning circuit 10924 can improve more rapidly and with greater confidence based upon the data from the offset system—including determining which sensors in the offset system found to be effective in predicting system outcomes.

Figure 114:
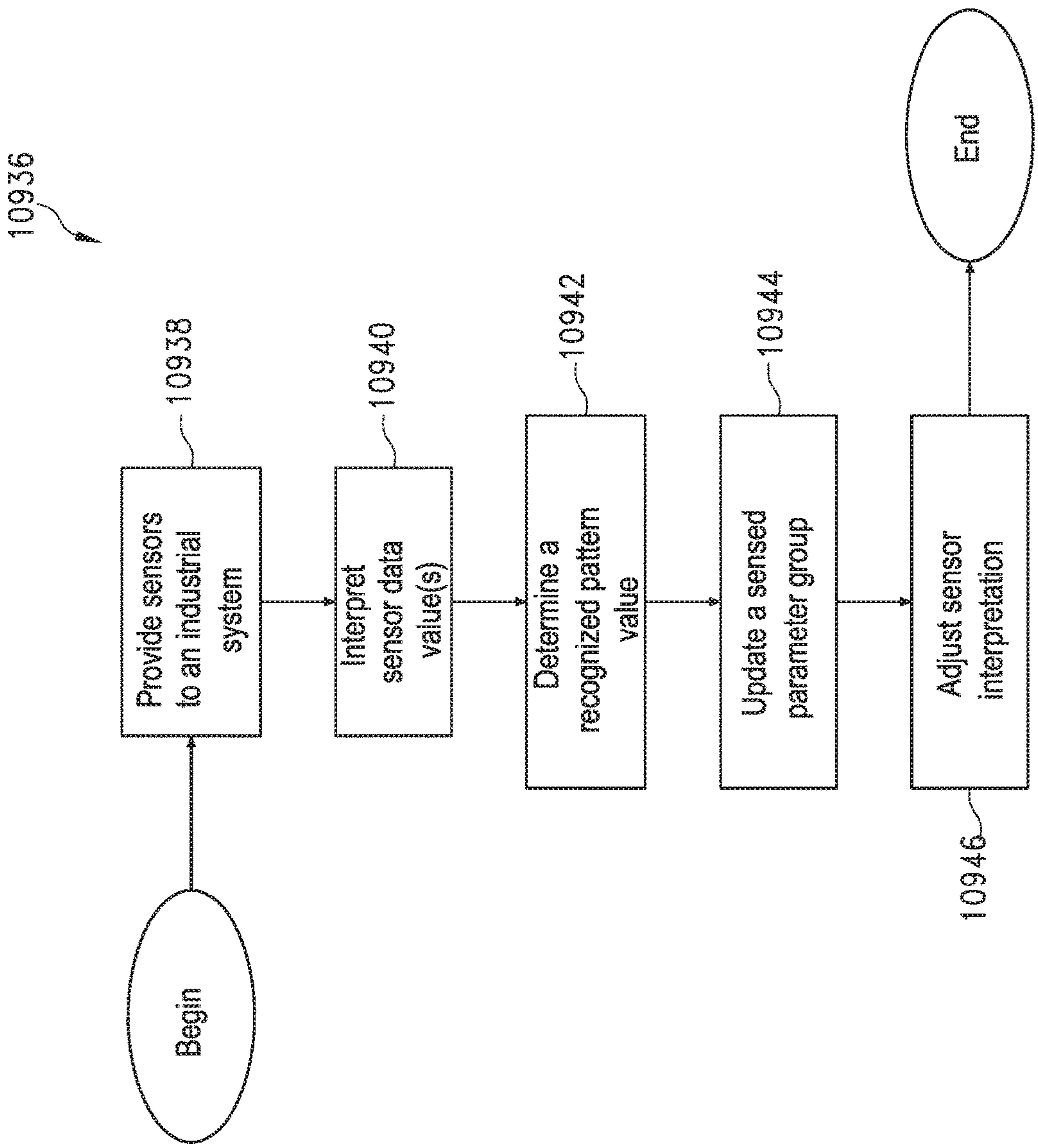
FIG. 114 is a schematic flow diagram of a procedure for data collection in an industrial environment in accordance with the present disclosure.

Referencing FIG. 114, an example procedure 10936 for data collection in an industrial environment includes an operation 10938 to provide a number of sensors to an industrial system including a number of components, each of the number of sensors operatively coupled to at least one of the number of components. The procedure 10936 further includes an operation 10940 to interpret a number of sensor data values in response to a sensed parameter group, the sensed parameter group including a fused number of sensors from the number of sensors, an operation 10942 to determine a recognized pattern value including a secondary value determined in response to the number of sensor data values, an operation 10944 to update the sensed parameter group in response to the recognized pattern value, and an operation 10946 to adjust the interpreting the number of sensor data values in response to the updated sensed parameter group.

An example procedure 10936 includes an operation to iteratively perform the determining the recognized pattern value and the updating the sensed parameter group to improve a sensing performance value (e.g., by repeating operations 10940 to 10944 periodically, at selected intervals, and/or in response to a system change). An example procedure 10936 includes determining the sensing performance value by determining: a signal-to-noise performance for detecting a value of interest in the industrial system; a network utilization of the plurality of sensors in the industrial system; an effective sensing resolution for a value of interest in the industrial system; a power consumption value for a sensing system in the industrial system, the sensing system including the plurality of sensors; a calculation efficiency for determining the secondary value; an accuracy and/or a precision of the secondary value; a redundancy capacity for determining the secondary value; and/or a lead time value for determining the secondary value.

An example procedure 10936 includes the operation 10944 to update the sensed parameter group by performing at least one operation such as: updating a sensor selection of the sensed parameter group; updating a sensor sampling rate of at least one sensor from the sensed parameter group; updating a sensor resolution of at least one sensor from the sensed parameter group; updating a storage value corresponding to at least one sensor from the sensed parameter group; updating a priority corresponding to at least one sensor from the sensed parameter group; and/or updating at least one of a sampling rate, sampling order, sampling phase, and a network path configuration corresponding to at least one sensor from the sensed parameter group. An example procedure 10936 includes the operation 10942 to determine the recognized pattern value by performing at least one operation such as: determining a signal effectiveness of at least one sensor of the sensed parameter group and the updated sensed parameter group relative to a value of interest; determining a sensitivity of at least one sensor of the sensed parameter group and the updated sensed parameter group relative to the value of interest; determining a predictive confidence of at least one sensor of the sensed parameter group and the updated sensed parameter group relative to the value of interest; determining a predictive delay time of at least one sensor of the sensed parameter group and the updated sensed parameter group relative to the value of interest; determining a predictive accuracy of at least one sensor of the sensed parameter group and the updated sensed parameter group relative to the value of interest; determining a predictive precision of at least one sensor of the sensed parameter group and the updated sensed parameter group relative to the value of interest; and/or updating the recognized pattern value in response to external feedback.

Clause 1. In embodiments, a system for data collection in an industrial environment, the system comprising: an industrial system comprising a plurality of components, and a plurality of sensors each operatively coupled to at least one of the plurality of components; a sensor communication circuit structured to interpret a plurality of sensor data values in response to a sensed parameter group; a pattern recognition circuit structured to determine a recognized pattern value in response to a least a portion of the plurality of sensor data values; and a sensor learning circuit structured to update the sensed parameter group in response to the recognized pattern value; wherein the sensor communication circuit is further structured to adjust the interpreting of the plurality of sensor data values in response to the updated sensed parameter group. 2. The system of clause 1, wherein the sensed parameter group comprises a fused plurality of sensors, and wherein the recognized pattern value further includes a secondary value comprising a value determined in response to the fused plurality of sensors. 3. The system of clause 2, wherein the pattern recognition circuit and sensor learning circuit are further structured to iteratively perform the determining the recognized pattern value and the updating the sensed parameter group to improve a sensing performance value. 4. The system of clause 3, wherein the sensing performance value comprises at least one performance determination selected from the performance determinations consisting of: a signal-to-noise performance for detecting a value of interest in the industrial system; a network utilization of the plurality of sensors in the industrial system; an effective sensing resolution for a value of interest in the industrial system; and a power consumption value for a sensing system in the industrial system, the sensing system including the plurality of sensors. 5. The system of clause 3, wherein the sensing performance value comprises a signal-to-noise performance for detecting a value of interest in the industrial system. 6. The system of clause 3, wherein the sensing performance value comprises a network utilization of the plurality of sensors in the industrial system. 7. The system of clause 3, wherein the sensing performance value comprises an effective sensing resolution for a value of interest in the industrial system. 8. The system of clause 3, wherein the sensing performance value comprises a power consumption value for a sensing system in the industrial system, the sensing system including the plurality of sensors. 9. The system of clause 3, wherein the sensing performance value comprises a calculation efficiency for determining the secondary value. 10 The system of clause 9, wherein the calculation efficiency comprises at least one of: processor operations to determine the secondary value, memory utilization for determining the secondary value, a number of sensor inputs from the plurality of sensors for determining the secondary value, and supporting data long-term storage for supporting the secondary value. 11. The system of clause 3, wherein the sensing performance value comprises one of an accuracy and a precision of the secondary value. 12. The system of clause 3, wherein the sensing performance value comprises a redundancy capacity for determining the secondary value. 13. The system of clause 3, wherein the sensing performance value comprises a lead time value for determining the secondary value. 14. The system of clause 13, wherein the secondary value comprises a component overtemperature value. 15. The system of clause 13, wherein the secondary value comprises one of a component maintenance time, a component failure time, and a component service life. 16. The system of clause 13, wherein the secondary value comprises an off nominal operating condition affecting a product quality produced by an operation of the industrial system. 17. The system of clause 1, wherein the plurality of sensors comprises at least one analog sensor. 18. The system of clause 1, wherein at least one of the sensors comprises a remote sensor. 19. The system of clause 2, wherein the secondary value comprises at least one value selected from the values consisting of: a virtual sensor output value; a process prediction value; a process state value; a component prediction value; a component state value; and a model output value having the sensor data values from the fused plurality of sensors as an input. 20. The system of clause 2, wherein the fused plurality of sensors further comprises at least one pairing of sensor types selected from the pairings consisting of: a vibration sensor and a temperature sensor; a vibration sensor and a pressure sensor; a vibration sensor and an electric field sensor; a vibration sensor and a heat flux sensor; a vibration sensor and a galvanic sensor; and a vibration sensor and a magnetic sensor. 21. The system of clause 1, wherein the sensor learning circuit is further structured to update the sensed parameter group by performing at least one operation selected from the operations consisting of: updating a sensor selection of the sensed parameter group; updating a sensor sampling rate of at least one sensor from the sensed parameter group; updating a sensor resolution of at least one sensor from the sensed parameter group; updating a storage value corresponding to at least one sensor from the sensed parameter group; updating a priority corresponding to at least one sensor from the sensed parameter group; and updating at least one of a sampling rate, sampling order, sampling phase, and a network path configuration corresponding to at least one sensor from the sensed parameter group. 22. The system of clause 21, wherein the pattern recognition circuit is further structured to determine the recognized pattern value by performing at least one operation selected from the operations consisting of: determining a signal effectiveness of at least one sensor of the sensed parameter group and the updated sensed parameter group relative to a value of interest; determining a sensitivity of at least one sensor of the sensed parameter group and the updated sensed parameter group relative to the value of interest; determining a predictive confidence of at least one sensor of the sensed parameter group and the updated sensed parameter group relative to the value of interest; determining a predictive delay time of at least one sensor of the sensed parameter group and the updated sensed parameter group relative to the value of interest; determining a predictive accuracy of at least one sensor of the sensed parameter group and the updated sensed parameter group relative to the value of interest; determining a predictive precision of at least one sensor of the sensed parameter group and the updated sensed parameter group relative to the value of interest; and updating the recognized pattern value in response to external feedback. 23. The system of clause 22, wherein the value of interest comprises at least one value selected from the values consisting of: a virtual sensor output value; a process prediction value; a process state value; a component prediction value; a component state value; and a model output value having the sensor data values from the fused plurality of sensors as an input. 24. The system of clause 2, wherein the pattern recognition circuit is further structured to access cloud-based data comprising a second plurality of sensor data values, the second plurality of sensor data values corresponding to at least one offset industrial system. 25. The system of clause 24, wherein the sensor learning circuit is further structured to access the cloud-based data comprising a second updated sensor parameter group corresponding to the at least one offset industrial system. 26. A method, comprising: providing a plurality of sensors to an industrial system comprising a plurality of components, each of the plurality of sensors operatively coupled to at least one of the plurality of components; interpreting a plurality of sensor data values in response to a sensed parameter group, the sensed parameter group comprising a fused plurality of sensors from the plurality of sensors; determining a recognized pattern value comprising a secondary value determined in response to the plurality of sensor data values; updating the sensed parameter group in response to the recognized pattern value; and adjusting the interpreting the plurality of sensor data values in response to the updated sensed parameter group. 27. The method of clause 26, further comprising iteratively performing the determining the recognized pattern value and the updating the sensed parameter group to improve a sensing performance value. 28. The method of clause 27, further comprising determining the sensing performance value in response to determining at least one of: a signal-to-noise performance for detecting a value of interest in the industrial system; a network utilization of the plurality of sensors in the industrial system;

an effective sensing resolution for a value of interest in the industrial system; a power consumption value for a sensing system in the industrial system, the sensing system including the plurality of sensors; a calculation efficiency for determining the secondary value, wherein the calculation efficiency comprises at least one of: processor operations to determine the secondary value, memory utilization for determining the secondary value, a number of sensor inputs from the plurality of sensors for determining the secondary value, and supporting data long-term storage for supporting the secondary value; one of an accuracy and a precision of the secondary value; a redundancy capacity for determining the secondary value; and a lead time value for determining the secondary value. 29. The method of clause 27, wherein updating the sensed parameter group comprises performing at least one operation selected from the operations consisting of: updating a sensor selection of the sensed parameter group; updating a sensor sampling rate of at least one sensor from the sensed parameter group; updating a sensor resolution of at least one sensor from the sensed parameter group; updating a storage value corresponding to at least one sensor from the sensed parameter group; updating a priority corresponding to at least one sensor from the sensed parameter group; and updating at least one of a sampling rate, sampling order, sampling phase, and a network path configuration corresponding to at least one sensor from the sensed parameter group. 30. The method of clause 27, wherein determining the recognized pattern value comprises performing at least one operation selected from the operations consisting of: determining a signal effectiveness of at least one sensor of the sensed parameter group and the updated sensed parameter group relative to a value of interest; determining a sensitivity of at least one sensor of the sensed parameter group and the updated sensed parameter group relative to the value of interest; determining a predictive confidence of at least one sensor of the sensed parameter group and the updated sensed parameter group relative to the value of interest; determining a predictive delay time of at least one sensor of the sensed parameter group and the updated sensed parameter group relative to the value of interest; determining a predictive accuracy of at least one sensor of the sensed parameter group and the updated sensed parameter group relative to the value of interest; determining a predictive precision of at least one sensor of the sensed parameter group and the updated sensed parameter group relative to the value of interest; and updating the recognized pattern value in response to external feedback. 31. A system for data collection in an industrial environment, the system comprising: an industrial system comprising a plurality of components, and a plurality of sensors each operatively coupled to at least one of the plurality of components; a sensor communication circuit structured to interpret a plurality of sensor data values in response to a sensed parameter group, wherein the sensed parameter group comprises a fused plurality of sensors; a means for recognizing a pattern value in response to the sensed parameter group; and a means for updating the sensed parameter group in response to the recognized pattern value. 32. The system of clause 31, further comprising a means for iteratively updating the sensed parameter group. 33. The system of clause 32, further comprising a means for accessing at least one of external data and a second plurality of sensor data values corresponding to an offset industrial system, and wherein the means for iteratively updating the sensed parameter group is further responsive to the at least one of external data and the second plurality of sensor data values. 34. The system of clause 33, further comprising a means for accessing a second sensed parameter group corresponding to the offset industrial system, and wherein the means for iteratively updating is further responsive to the second sensed parameter group. 35. A system for data collection in an industrial environment, the system comprising: an industrial system comprising a plurality of components, and a plurality of sensors each operatively coupled to at least one of the plurality of components; a sensor communication circuit structured to interpret a plurality of sensor data values in response to a sensed parameter group; a pattern recognition circuit structured to determine a recognized pattern value in response to a least a portion of the plurality of sensor data values, wherein the recognized pattern value includes a secondary value comprising a value determined in response to the at least a portion of the plurality of sensors; a sensor learning circuit structured to update the sensed parameter group in response to the recognized pattern value; wherein the sensor communication circuit is further structured to adjust the interpreting the plurality of sensor data values in response to the updated sensed parameter group; and wherein the pattern recognition circuit and the sensor learning circuit are further structured to iteratively perform the determining the recognized pattern value and the updating the sensed parameter group to improve a sensing performance value, wherein the sensing performance value comprises a signal-to-noise performance for detecting a value of interest in the industrial system. 36. The system of clause 35, wherein the sensed parameter group comprises a fused plurality of sensors, and wherein the secondary value comprises a value determined in response to the fused plurality of sensors. 37. The system of clause 36, wherein the secondary value comprises at least one value selected from the values consisting of: a virtual sensor output value; a process prediction value; a process state value; a component prediction value; a component state value; and a model output value having the sensor data values from the fused plurality of sensors as an input. 38. A system for data collection in an industrial environment, the system comprising: an industrial system comprising a plurality of components, and a plurality of sensors each operatively coupled to at least one of the plurality of components; a sensor communication circuit structured to interpret a plurality of sensor data values in response to a sensed parameter group; a pattern recognition circuit structured to determine a recognized pattern value in response to a least a portion of the plurality of sensor data values, wherein the recognized pattern value includes a secondary value comprising a value determined in response to the at least a portion of the plurality of sensors; a sensor learning circuit structured to update the sensed parameter group in response to the recognized pattern value; wherein the sensor communication circuit is further structured to adjust the interpreting the plurality of sensor data values in response to the updated sensed parameter group; and wherein the pattern recognition circuit and the sensor learning circuit are further structured to iteratively perform the determining the recognized pattern value and the updating the sensed parameter group to improve a sensing performance value, wherein the sensing performance value comprises a network utilization of the plurality of sensors in the industrial system. 39. The system of clause 37, wherein the sensed parameter group comprises a fused plurality of sensors, and wherein the secondary value comprises a value determined in response to the fused plurality of sensors. 40. The system of clause 39, wherein the secondary value comprises at least one value selected from the values consisting of: a virtual sensor output value; a process prediction value; a process state value; a component prediction value; a component state value; and a model output value having the sensor data values from the fused plurality of sensors as an input. 41. A system for data collection in an industrial environment, the system comprising: an industrial system comprising a plurality of components, and a plurality of sensors each operatively coupled to at least one of the plurality of components; a sensor communication circuit structured to interpret a plurality of sensor data values in response to a sensed parameter group; a pattern recognition circuit structured to determine a recognized pattern value in response to a least a portion of the plurality of sensor data values, wherein the recognized pattern value includes a secondary value comprising a value determined in response to the at least a portion of the plurality of sensors; a sensor learning circuit structured to update the sensed parameter group in response to the recognized pattern value; wherein the sensor communication circuit is further structured to adjust the interpreting the plurality of sensor data values in response to the updated sensed parameter group; and wherein the pattern recognition circuit and the sensor learning circuit are further structured to iteratively perform the determining the recognized pattern value and the updating the sensed parameter group to improve a sensing performance value, wherein the sensing performance value comprises an effective sensing resolution for a value of interest in the industrial system. 42. The system of clause 41, wherein the sensed parameter group comprises a fused plurality of sensors, and wherein the secondary value comprises a value determined in response to the fused plurality of sensors. 43. The system of clause 42, wherein the secondary value comprises at least one value selected from the values consisting of: a virtual sensor output value; a process prediction value; a process state value; a component prediction value; a component state value; and a model output value having the sensor data values from the fused plurality of sensors as an input. 44. A system for data collection in an industrial environment, the system comprising: an industrial system comprising a plurality of components, and a plurality of sensors each operatively coupled to at least one of the plurality of components; a sensor communication circuit structured to interpret a plurality of sensor data values in response to a sensed parameter group; a pattern recognition circuit structured to determine a recognized pattern value in response to a least a portion of the plurality of sensor data values, wherein the recognized pattern value includes a secondary value comprising a value determined in response to the at least a portion of the plurality of sensors; a sensor learning circuit structured to update the sensed parameter group in response to the recognized pattern value; wherein the sensor communication circuit is further structured to adjust the interpreting the plurality of sensor data values in response to the updated sensed parameter group; and wherein the pattern recognition circuit and the sensor learning circuit are further structured to iteratively perform the determining the recognized pattern value and the updating the sensed parameter group to improve a sensing performance value, wherein the sensing performance value comprises a power consumption value for a sensing system in the industrial system, the sensing system including the plurality of sensors. 45. The system of clause 44, wherein the sensed parameter group comprises a fused plurality of sensors, and wherein the secondary value comprises a value determined in response to the fused plurality of sensors. 46. The system of clause 45, wherein the secondary value comprises at least one value selected from the values consisting of: a virtual sensor output value; a process prediction value; a process state value; a component prediction value; a component state value; and a model output value having the sensor data values from the fused plurality of sensors as an input.

Figure 115:
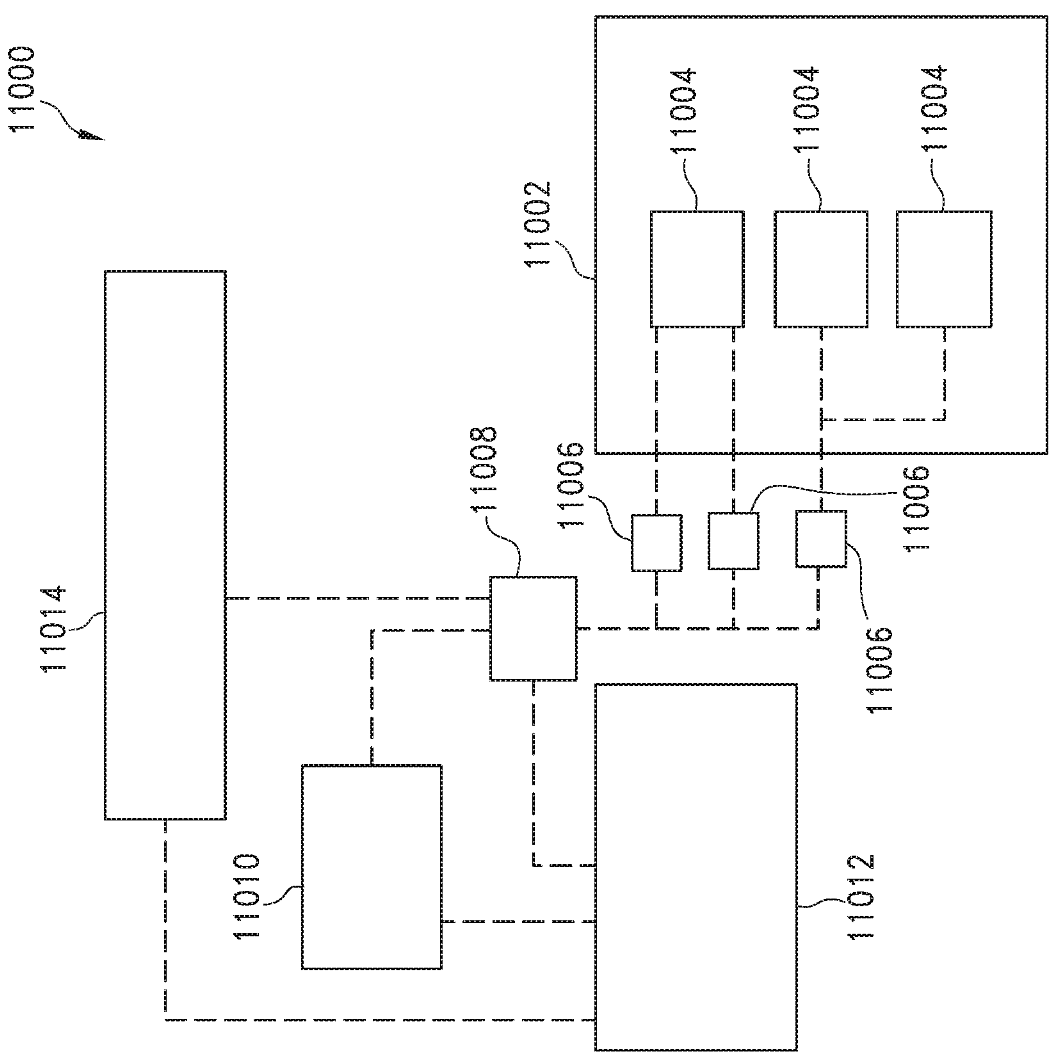
FIG. 115 is a diagrammatic view that depicts a system for data collection in an industrial environment in accordance with the present disclosure.

Referencing FIG. 115, an example system 11000 for data collection in an industrial environment includes an industrial system 11002 having a number of components 11004, and a number of sensors 11006 each operatively coupled to at least one of the number of components 11004. The selection, distribution, type, and communicative setup of sensors depends upon the application of the system 11000 and/or the context.

Figure 116:
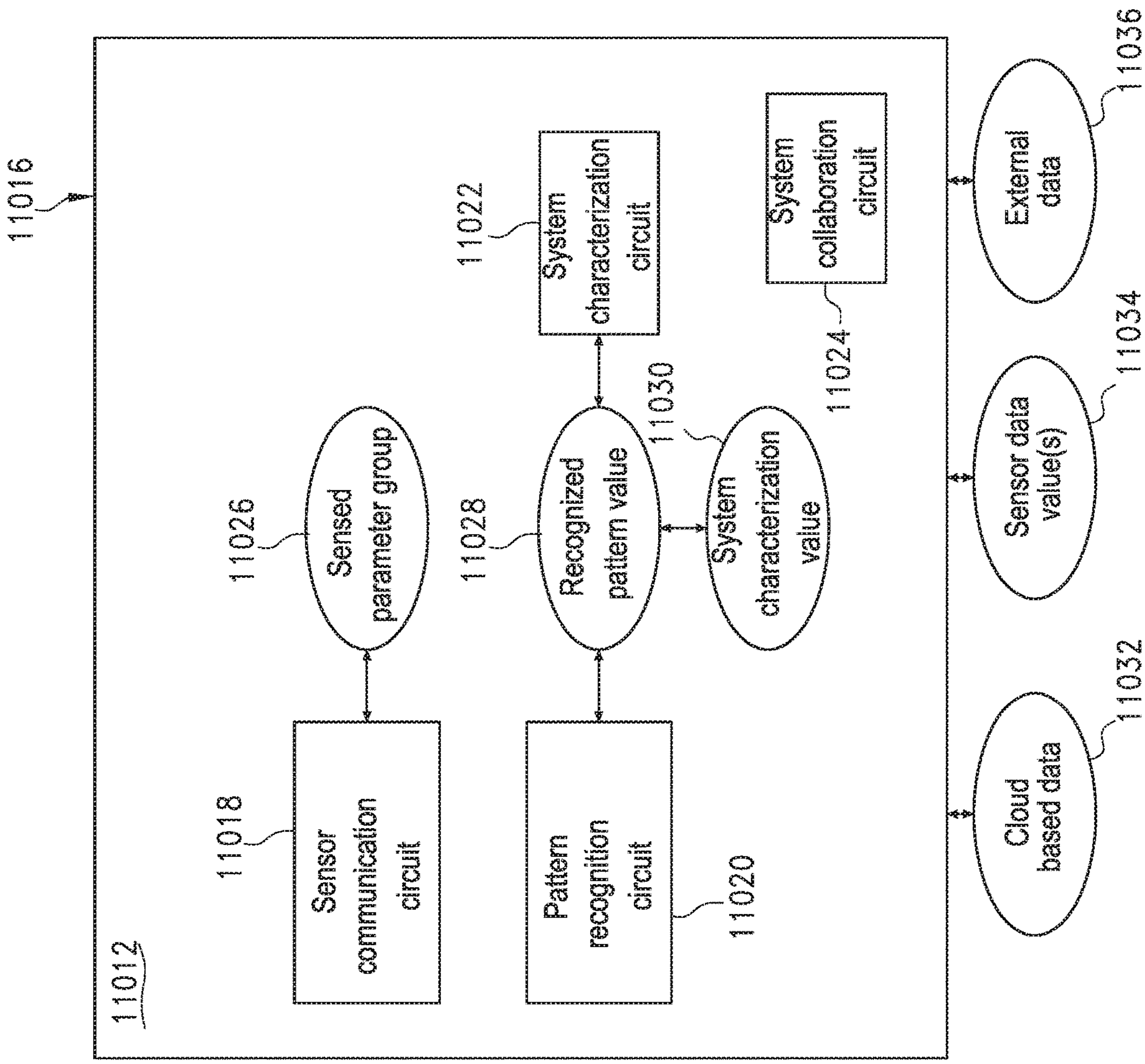
FIG. 116 is a diagrammatic view that depicts an apparatus for data collection in an industrial environment in accordance with the present disclosure.

The example system 11000 further includes a sensor communication circuit 11018 (reference FIG. 116) that interprets a number of sensor data values 11034 in response to a sensed parameter group 11026. The sensed parameter group 11026 includes a description of which sensors 11006 are sampled at which times, including at least the selected sampling frequency, a process stage wherein a particular sensor may be providing a value of interest, and the like. An example system includes the sensed parameter group 11026 being a number of sensors provided for a sensor fusion operation. In certain embodiments, the sensed parameter group 11026 includes a set of sensors that encompass detection of operating conditions of the system that predict outcomes, off-nominal operations, maintenance intervals, maintenance health states, and/or future state values for any of these, for a process, a component, a sensor, and/or any aspect of interest for the system 11000.

In certain embodiments, sensor data values 11034 are provided to a data collector 11008, which may be in communication with multiple sensors 11006 and/or with a controller 11012. In certain embodiments, a plant computer 11010 is additionally or alternatively present. In the example system, the controller 11012 is structured to functionally execute operations of the sensor communication circuit 11018, pattern recognition circuit 11020, and/or the system characterization circuit 11022, and is depicted as a separate device for clarity of description. Aspects of the controller 11012 may be present on the sensors 11006, the data collector 11008, the plant computer 11010, and/or on a cloud computing device 11014. In certain embodiments, all aspects of the controller 11012 may be present in another device depicted on the system 11000. The plant computer 11010 represents local computing resources, for example processing, memory, and/or network resources, that may be present and/or in communication with the industrial system 11000. In certain embodiments, the cloud computing device 11014 represents computing resources externally available to the industrial system 11000, for example over a private network, intra-net, through cellular communications, satellite communications, and/or over the internet. In certain embodiments, the data collector 11008 may be a computing device, a smart sensor, a MUX box, or other data collection device capable to receive data from multiple sensors and to pass-through the data and/or store data for later transmission. An example data collector 11008 has no storage and/or limited storage, and selectively passes sensor data therethrough, with a subset of the sensor data being communicated at a given time due to bandwidth considerations of the data collector 11008, a related network, and/or imposed by environmental constraints. In certain embodiments, one or more sensors and/or computing devices in the system 11000 are portable devices—for example a plant operator walking through the industrial system may have a smart phone, which the system 11000 may selectively utilize as a data collector 11008, sensor 11006—for example to enhance communication throughput, sensor resolution, and/or as a primary method for communicating sensor data values 11034 to the controller 11012.

The example system 11000 further includes a pattern recognition circuit 11020 that determines a recognized pattern value 11028 in response to a least a portion of the sensor data values 11034, and a system characterization circuit 11022 that provides a system characterization value 11030 for the industrial system in response to the recognized pattern value 11028. The system characterization value 11030 includes any value determined from the pattern recognition operations of the pattern recognition circuit 11020, including determining that a system condition of interest is present, a component condition of interest is present, an abstracted condition of the system or a component is present (e.g., a product quality value; an operation cost value; a component health, wear, or maintenance value; a component capacity value; and/or a sensor saturation value) and/or is predicted to occur within a time frame (e.g., calendar time, operational time, and/or a process stage) of interest. Pattern recognition operations include determining that operations compatible with a previously known pattern, operations similar to a previously known pattern and/or extrapolated from previously known pattern information (e.g., a previously known pattern includes a temperature response for a first component, and a known or estimated relationship between components allows for a determination that a temperature for a second component will exceed a threshold based upon the pattern recognition for the first component combined with the known or estimated relationship).

Non-limiting descriptions of a number of examples of a system characterization value 11030 are described following. An example system characterization value 11030 includes a predicted outcome for a process associated with the industrial system—for example a product quality description, a product quantity description, a product variability description (e.g., the expected variability of a product parameter predicted according to the operating conditions of the system), a product yield description, a net present value (NPV) for a process, a process completion time, a process chance of completion success, and/or a product purity result. The predicted outcome may be a batch prediction (e.g., a single run, or an integer number of runs, of the process, and the associated predicted outcome), a time based prediction (e.g., the projected outcome of the process over the next day, the next three weeks, until a scheduled shutdown, etc.), a production defined prediction (e.g., the projected outcome over the next 1,000 units, over the next 47 orders, etc.), and/or a rate of change based outcome (e.g., projected for 3 component failures per month, an emissions output per year, etc.). An example system characterization value 11030 includes a predicted future state for a process associated with the industrial system—for example an operating temperature at a given future time, an energy consumption value, a volume in a tank, an emitted noise value at a school adjacent to the industrial system, and/or a rotational speed of a pump. The predicted future state may be time based (e.g., at 4 PM on Thursday), based on a state of the process (e.g., during the third stage, during system shutdown, etc.), and/or based on a future state of particular interest (e.g., peak energy consumption, highest temperature value, maximum noise value, time or process stage when a maximum number of personnel will be within 50 feet of a sensitive area, time or process stage when an aspect of the system redundancy is at a lowest point—e.g., for determining high risk points in a process, etc.). An example system characterization value 11030 includes a predicted off-nominal operation for the process associated with the industrial system—for example when a component capacity of the system will exceed nominal parameters (although, possibly, not experience a failure), when any parameter in the system will be three standard deviations away from normal operations, when a capacity of a component will be under-utilized, etc. An example system characterization value 11030 includes a prediction value for one of the number of components—for example an operating condition at a point in time and/or process stage. An example system characterization value 11030 includes a future state value for one of the number of components. The predicted future state of a component may be time based, based on a state of the process, and/or based on a future state of particular interest (e.g., a highest or lowest value predicted for the component). An example system characterization value 11030 includes an anticipated maintenance health state information for one of the number of components, including at a particular time, a process stage, a lowest value predicted until a next maintenance event, etc. An example system characterization value 11030 includes a predicted maintenance interval for at least one of the number of components (e.g., based on current usage, anticipated usage, planned process operations, etc.). An example system characterization value 11030 includes a predicted off-nominal operation for one of the number of components—for example at a selected time, a process stage, and/or a future state of particular interest. An example system characterization value 11030 includes a predicted fault operation for one of the plurality of components—for example at a selected time, a process stage, any fault occurrence predicted based on current usage, anticipated usage, planned process operations, and/or a future state of particular interest. An example system characterization value 11030 includes a predicted exceedance value for one of the number of components, where the exceedance value includes exceedance of a design specification, and/or exceedance of a selected threshold. An example system characterization value 11030 includes a predicted saturation value for one of the plurality of sensors for example at a selected time, a process stage, any saturation occurrence predicted based on current usage, anticipated usage, planned process operations, and/or a future state of particular interest.

Any values for the prediction value 11030 may be raw values (e.g., a temperature value), derivative values (e.g., a rate of change of a temperature value), accumulated values (e.g., a time spent above one or more temperature thresholds) including weighted accumulated values, and/or integrated values (e.g., an area over a temperature-time curve at a temperature value or temperature trajectory of interest). The provided examples list temperature, but any prediction value 11030 may be utilized, including at least vibration, system throughput, pressure, etc. In certain embodiments, combinations of one or more prediction values 11030 may be utilized It will be appreciated in light of the disclosure that combining prediction values 11030 can create particularly powerful combinations for system analysis, control, and risk management, which are specifically contemplated herein. For example, a first prediction value may indicate a time or process stage for a maximum flow rate through the system, and a second prediction value may determine the predicted state of one or more components of the system that is present at that particular time or process stage. In another example, a first prediction value indicates a lowest margin of the system in terms of capacity to deliver (e.g., by determining a point in the process wherein at least one component has a lowest operating margin, and/or where a group of components have a statistically lower operating margin due to the risk induced by a number of simultaneous low operating margins), and a second prediction value testing a system risk (e.g., loss of inlet water, loss of power, increase in temperature, change in environmental conditions that reduce or increase heat transfer, or that preclude the emission of certain effluents), and the combined risk of separate events can be assessed on the total system risk. Additionally, the prediction values may be operated with a sensitivity check (e.g., varying system conditions within margins to determine if some failure may occur), wherein the use of the prediction value allows for the sensitivity check to be performed with higher resolution at high risk points in the process.

An example system 11000 further includes a system collaboration circuit 11024 that interprets external data 11036, and where the pattern recognition circuit 11020 further determines the recognized pattern value 11028 further in response to the external data 11036. External data 11036 includes, without limitation, data provided from outside the system 11000 and/or outside the controller 11012. Non-limiting example external data 11036 include entries from an operator (e.g., indicating a failure, a fault, and/or a service event). An example pattern recognition circuit 11020 further iteratively improves pattern recognition operations in response to the external data 11036 (e.g., where an outcome is known, such as a maintenance event, product quality determination, production outcome determination, etc., the detection of the recognized pattern value 11028 is thereby improved according to the conditions of the system before the known outcome occurred). Example and non-limiting external data 11036 includes data such as: an indicated process success value; an indicated process failure value; an indicated component maintenance event; an indicated component failure event; an indicated process outcome value; an indicated component wear value; an indicated process operational exceedance value; an indicated component operational exceedance value; an indicated fault value; and/or an indicated sensor saturation value.

An example system 11000 further includes a system collaboration circuit 11024 that interprets cloud-based data 11032 including a second number of sensor data values, the second number of sensor data values corresponding to at least one offset industrial system, and where the pattern recognition circuit 11020 further determines the recognized pattern value 11028 further in response to the cloud-based data 11032. An example pattern recognition circuit 11020 further iteratively improves pattern recognition operations in response to the cloud-based data 11032. An example sensed parameter group 11026 includes a triaxial vibration sensor, a vibration sensor and a second sensor that is not a vibration sensor, the second sensor being a digital sensor, and/or a number of analog sensors.

Figure 117:
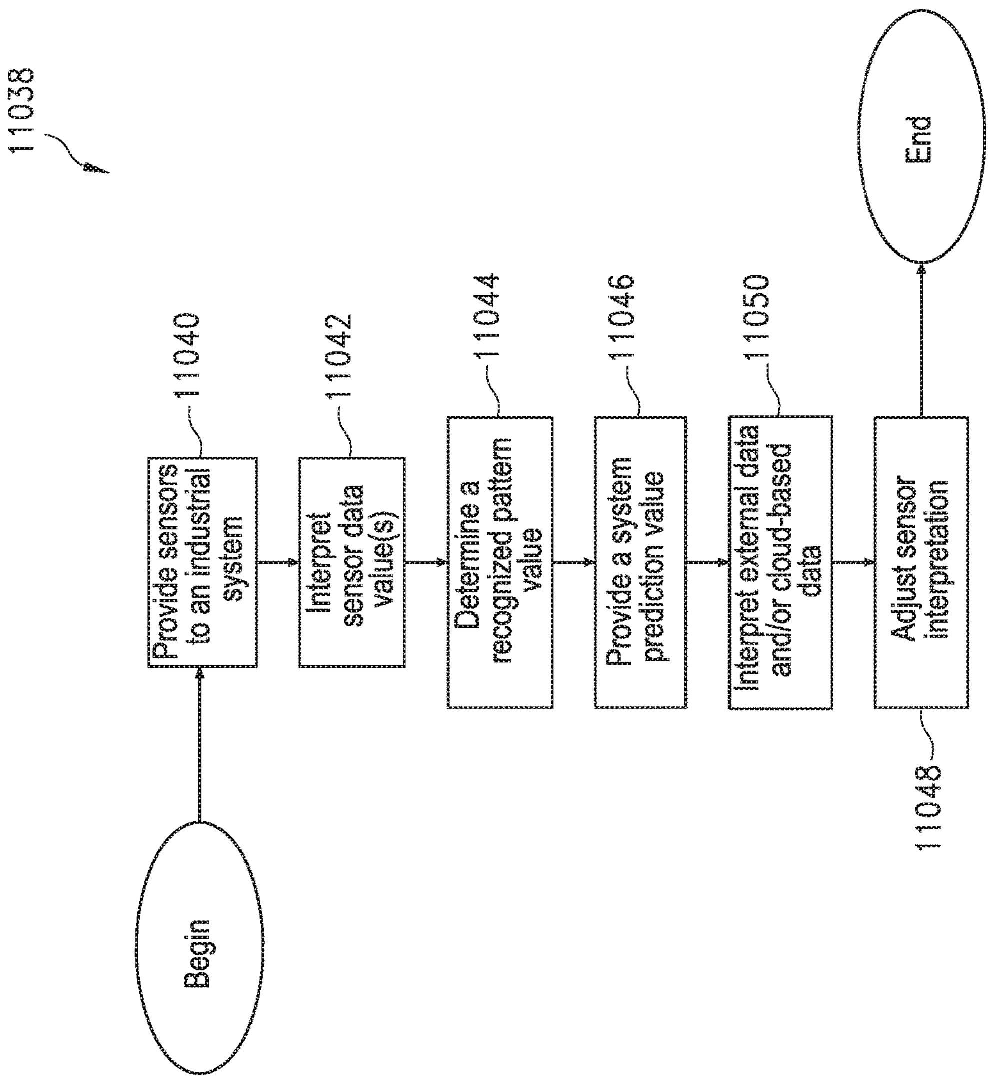
FIG. 117 is a schematic flow diagram of a procedure for data collection in an industrial environment in accordance with the present disclosure.
Figure 118:
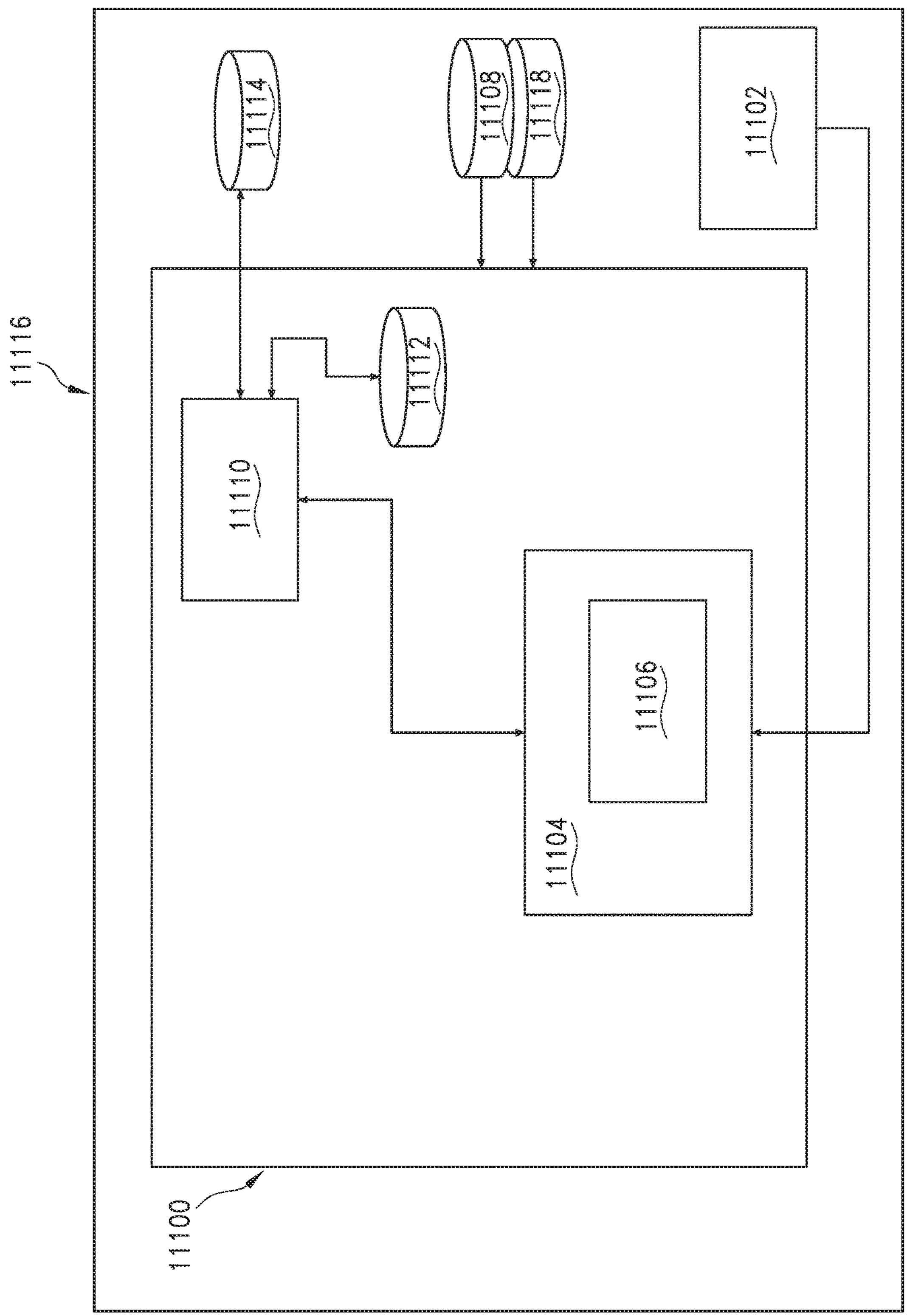
FIG. 118 is a diagrammatic view that depicts industry-specific feedback in an industrial environment in accordance with the present disclosure.

Referencing FIG. 117, an example procedure 11038 includes an operation 11040 to provide a number of sensors to an industrial system including a number of components, each of the number of sensors operatively coupled to at least one of the number of components, an operation 11042 to interpret a number of sensor data values in response to a sensed parameter group, the sensed parameter group including at least one sensor of the number of sensors, an operation 11044 to determine a recognized pattern value in response to a least a portion of the number of sensor data values, and an operation 11046 to provide a system characterization value for the industrial system in response to the recognized pattern value.

An example procedure 11038 further includes the operation 11046 to provide the system characterization value by performing an operation such as: determining a predicted outcome for a process associated with the industrial system; determining a predicted future state for a process associated with the industrial system; determining a predicted off-nominal operation for the process associated with the industrial system; determining a prediction value for one of the plurality of components; determining a future state value for one of the plurality of components; determining an anticipated maintenance health state information for one of the plurality of components; determining a predicted maintenance interval for at least one of the plurality of components; determining a predicted off-nominal operation for one of the plurality of components; determining a predicted fault operation for one of the plurality of components; determining a predicted exceedance value for one of the plurality of components; and/or determining a predicted saturation value for one of the plurality of sensors.

An example procedure 11038 includes an operation 11050 to interpret external data and/or cloud-based data, and where the operation 11044 to determine the recognized pattern value is further in response to the external data and/or the cloud-based data. An example procedure 11038 includes an operation to iteratively improve pattern recognition operations in response to the external data and/or the cloud-based data, for example by operation 11048 to adjust the operation 11042 interpreting sensor values, such as by updating the sensed parameter group. The operation to iteratively improve pattern recognition may further include repeating operations 11042 through 11048, periodically, at selected intervals, in response to a system change, and/or in response to a prediction value of a component, process, or the system.

In embodiments, a system for data collection in an industrial environment may comprise: an industrial system comprising a plurality of components, and a plurality of sensors each operatively coupled to at least one of the plurality of components; a sensor communication circuit structured to interpret a plurality of sensor data values in response to a sensed parameter group, the sensed parameter group comprising at least one sensor of the plurality of sensors; a pattern recognition circuit structured to determine a recognized pattern value in response to a least a portion of the plurality of sensor data values; and a system characterization circuit structured to provide a system characterization value for the industrial system in response to the recognized pattern value. In embodiments, a characterization value may include at least one characterization value selected from the characterization values consisting of: a predicted outcome for a process associated with the industrial system; a predicted future state for a process associated with the industrial system; and a predicted off-nominal operation for the process associated with the industrial system. The system characterization value may include at least one characterization value selected from the characterization values consisting of: a prediction value for one of the plurality of components; a future state value for one of the plurality of components; an anticipated maintenance health state information for one of the plurality of components; and a predicted maintenance interval for at least one of the plurality of components. The system characterization value may include at least one characterization value selected from the characterization values consisting of: a predicted off-nominal operation for one of the plurality of components; a predicted fault operation for one of the plurality of components; and a predicted exceedance value for one of the plurality of components. The system characterization value may include a predicted saturation value for one of the plurality of sensors. A system collaboration circuit may be included that is structured to interpret external data, and wherein the pattern recognition circuit is further structured to determine the recognized pattern value further in response to the external data. The pattern recognition circuit may be further structured to iteratively improve pattern recognition operations in response to the external data. The external data may include at least one of: an indicated component maintenance event; an indicated component failure event; an indicated component wear value; an indicated component operational exceedance value; and an indicated fault value. The external data may include at least one of: an indicated process failure value; an indicated process success value; an indicated process outcome value; and an indicated process operational exceedance value. The external data may include an indicated sensor saturation value. A system collaboration circuit may be included that is structured to interpret cloud-based data comprising a second plurality of sensor data values, the second plurality of sensor data values corresponding to at least one offset industrial system, and wherein the pattern recognition circuit is further structured to determine the recognized pattern value further in response to the cloud-based data. The pattern recognition circuit may be further structured to iteratively improve pattern recognition operations in response to the cloud-based data. The sensed parameter group may include a triaxial vibration sensor. The sensed parameter group may include a vibration sensor and a second sensor that is not a vibration sensor, such as where the second sensor comprises a digital sensor. The sensed parameter group may include a plurality of analog sensors.

In embodiments, a method may comprise: providing a plurality of sensors to an industrial system comprising a plurality of components, each of the plurality of sensors operatively coupled to at least one of the plurality of components; interpreting a plurality of sensor data values in response to a sensed parameter group, the sensed parameter group comprising at least one sensor of the plurality of sensors; determining a recognized pattern value in response to a least a portion of the plurality of sensor data values; and providing a system characterization value for the industrial system in response to the recognized pattern value. The system characterization value may be provided by performing at least one operation selected from the operations consisting of: determining a prediction value for one of the plurality of components; determining a future state value for one of the plurality of components; determining an anticipated maintenance health state information for one of the plurality of components; and determining a predicted maintenance interval for at least one of the plurality of components. The system characterization value may be provided by performing at least one operation selected from the operations consisting of: determining a predicted outcome for a process associated with the industrial system; determining a predicted future state for a process associated with the industrial system; and determining a predicted off-nominal operation for the process associated with the industrial system. The system characterization value may be provided by performing at least one operation selected from the operations consisting of: determining a predicted off-nominal operation for one of the plurality of components; determining a predicted fault operation for one of the plurality of components; and determining a predicted exceedance value for one of the plurality of components. The system characterization value may be provided by determining a predicted saturation value for one of the plurality of sensors. Determining the recognized pattern value may be further in response to the external data. Iteratively improving pattern recognition operations may be provided in response to the external data. Interpreting the external data may include at least one operation selected from the operations consisting of: interpreting an indicated component maintenance event; interpreting an indicated component failure event; interpreting an indicated component wear value; interpreting an indicated component operational exceedance value; and interpreting an indicated fault value. Interpreting the external data may include at least one operation selected from the operations consisting of: interpreting an indicated process success value; interpreting an indicated process failure value; interpreting an indicated process outcome value; and interpreting an indicated process operational exceedance value. Interpreting the external data may include interpreting an indicated sensor saturation value. Interpreting cloud-based data may include a second plurality of sensor data values, the second plurality of sensor data values corresponding to at least one offset industrial system, and wherein determining the recognized pattern value is further in response to the cloud-based data. Iteratively improving pattern recognition operations may be provided in response to the cloud-based data.

In embodiments, a system for data collection in an industrial environment may comprise: an industrial system comprising a plurality of components, and a plurality of sensors each operatively coupled to at least one of the plurality of components; a sensor communication circuit structured to interpret a plurality of sensor data values in response to a sensed parameter group, the sensed parameter group comprising at least one sensor of the plurality of sensors; a means for determining a recognized pattern value in response to at least a portion of the plurality of sensor data values; and a means for providing a system characterization value for the industrial system in response to the recognized pattern value. The means for providing the system characterization value may comprise a means for performing at least one operation selected from the operations consisting of: determining a predicted outcome for a process associated with the industrial system; determining a predicted future state for a process associated with the industrial system; and determining a predicted off-nominal operation for the process associated with the industrial system. The means for providing the system characterization value may include a means for performing at least one operation selected from the operations consisting of: determining a prediction value for one of the plurality of components; determining a future state value for one of the plurality of components; determining an anticipated maintenance health state information for one of the plurality of components; and determining a predicted maintenance interval for at least one of the plurality of components. The means for providing the system characterization value may include a means for performing at least one operation selected from the operations consisting of: determining a predicted off-nominal operation for one of the plurality of components; determining a predicted fault operation for one of the plurality of components; and determining a predicted exceedance value for one of the plurality of components. The means for providing the system characterization value may include a means for determining a predicted saturation value for one of the plurality of sensors. A system collaboration circuit may be provided that is structured to interpret external data, and wherein the means for determining the recognized pattern value determines the recognized pattern value further in response to the external data. A means for iteratively improving pattern recognition operations may be provided in response to the external data. The external data may include at least one of: an indicated process success value; an indicated process failure value; and an indicated process outcome value. The external data may include at least one of: an indicated component maintenance event; an indicated component failure event; and an indicated component wear value. The external data may include at least one of: an indicated process operational exceedance value; an indicated component operational exceedance value; and an indicated fault value. The external data may include an indicated sensor saturation value. A system collaboration circuit may be provided that is structured to interpret cloud-based data comprising a second plurality of sensor data values, the second plurality of sensor data values corresponding to at least one offset industrial system, and wherein the means for determining the recognized pattern value determines the recognized pattern value further in response to the cloud-based data. A means for iteratively improving pattern recognition operations may be provided in response to the cloud-based data.

In embodiments, a system for data collection in an industrial environment may comprise: a distillation column comprising a plurality of components, and a plurality of sensors each operatively coupled to at least one of the plurality of components; a sensor communication circuit structured to interpret a plurality of sensor data values in response to a sensed parameter group, the sensed parameter group comprising at least one sensor of the plurality of sensors; a pattern recognition circuit structured to determine a recognized pattern value in response to a least a portion of the plurality of sensor data values; and a system characterization circuit structured to provide a system characterization value for the distillation column in response to the recognized pattern value. The plurality of components may include a thermodynamic treatment component, and wherein the system characterization value comprises at least one value selected from the values consisting of: determining a prediction value for the thermodynamic treatment component; determining a future state value for the thermodynamic treatment component; determining an anticipated maintenance health state information for the thermodynamic treatment component; and determining a process rate limitation according to a capacity of the thermodynamic treatment component. The thermodynamic treatment component may include at least one of a compressor or a boiler.

In embodiments, a system for data collection in an industrial environment may comprise: a chemical process system comprising a plurality of components, and a plurality of sensors each operatively coupled to at least one of the plurality of components; a sensor communication circuit structured to interpret a plurality of sensor data values in response to a sensed parameter group, the sensed parameter group comprising at least one sensor of the plurality of sensors; a pattern recognition circuit structured to determine a recognized pattern value in response to a least a portion of the plurality of sensor data values; and a system characterization circuit structured to provide a system characterization value for the chemical process system in response to the recognized pattern value. The chemical process system may include one of a chemical plant, a pharmaceutical plant, or an oil refinery. The system characterization value may include at least one value selected from the values consisting of: a separation process value comprising at least one of a capacity value or a purity value; a side reaction process value comprising a side reaction rate value; and a thermodynamic treatment value comprising one of a capability, a capacity, and an anticipated maintenance health for a thermodynamic treatment component.

A system for data collection in an industrial environment, the system comprising:

an irrigation system comprising a plurality of components including a pump, and a plurality of sensors each operatively coupled to at least one of the plurality of components; a sensor communication circuit structured to interpret a plurality of sensor data values in response to a sensed parameter group, the sensed parameter group comprising at least one sensor of the plurality of sensors; a pattern recognition circuit structured to determine a recognized pattern value in response to a least a portion of the plurality of sensor data values; and a system characterization circuit structured to provide a system characterization value for the irrigation system in response to the recognized pattern value. The system characterization value may include at least one of an anticipated maintenance health value for the pump and a future state value for the pump. The pattern recognition circuit may determine an off-nominal process condition in response to the at least a portion of the plurality of sensor data values, and wherein the sensor communication circuit is further structured to change the sensed parameter group in response to the off-nominal process condition. The off-nominal process condition may include an indication of below normal water feed availability, and wherein the updated sensed parameter group comprises at least one sensor selected from the sensors consisting of: a water level sensor, a humidity sensor, and an auxiliary water level sensor.

As described elsewhere herein, feedback to various intelligent and/or expert systems, control systems (including remote and local systems, autonomous systems, and the like), and the like, which may comprise rule-based systems, model-based systems, artificial intelligence (AI) systems (including neural nets, self-organizing systems, and others described throughout this disclosure), and various combinations and hybrids of those (collectively referred to herein as the "expert system" except where context indicates otherwise), may include a wide range of information, including measures such as utilization measures, efficiency measures (e.g., power, financial such as reduction of costs), measures of success in prediction or anticipation of states (e.g., avoidance and mitigation of faults), productivity measures (e.g., workflow), yield measures, profit measures, and the like, as described herein. In embodiments feedback to the expert system may be industry-specific, domain-specific, factory-specific, machine-specific and the like.

Industry-specific feedback for the expert system may be offered by a third party, such as a repair and maintenance organization, manufacturer, one or more consortia, and the like, or may be generated by one or more elements of the subject system itself. Industry-specific feedback may be aggregated, such as into one or more data structures, wherein the data are aggregated at the component level, equipment level, factory/installation level, and/or industry level. Users of the data structure(s) may access data at any level (e.g., component, equipment, factory, industry, etc.) Users may search the data structure(s) for indicators/predictors based on or filtered by system conditions specific to their need, or update an indicator/predictor with proprietary data to customize the data structure to their industry. In embodiments, the expert system may be seeded with industry-specific feedback, such as in a deep learning fashion, to provide an anticipated outcome or state and/or to perform actions to optimize specific machines, devices, components, processes, and the like.

In embodiments, feedback provided to the expert system may be used in one or more smart bands to predict progress towards one or more goals. The expert system may use the feedback to determine a modification, alteration, addition, change, or the like to one or more components of the system that provided the feedback, as described elsewhere herein. Based on the industry-specific feedback, the expert system may alter an input, a way of treating or storing an input or output, a sensor or sensors used to provide feedback, an operating parameter, a piece of equipment used in the system, or any other aspect of the participants in the industrial system that gave rise to the feedback. As described elsewhere herein, the expert system may track multiple goals, such as with one or more smart bands. Industry-specific feedback may be used in or by the smart bands in predicting an outcome or state relating to the one or more goals, and to recommend or instruct a change that is directed in increasing a likelihood of achieving the outcome or state.

In an embodiment, a system 11100 for data collection in an industrial environment 11116 may include a plurality of input sensors 11102 communicatively coupled to a controller 11106, a data collection circuit 11104 structured to collect output data 11108 from the input sensors 11102, and a machine learning data analysis circuit 11110 structured to receive the output data 11108 and learn received output data patterns 11112 indicative of an outcome, wherein the machine learning data analysis circuit 11110 is structured to learn received output data patterns 11112 by being seeded with a model 11114 based on industry-specific feedback 11118. The model 11114 may be a physical model, an operational model, or a system model. The industry-specific feedback 11118 may be one or more of a utilization measure, an efficiency measure (e.g., power and/or financial), a measure of success in prediction or anticipation of states (e.g., an avoidance and mitigation of faults), a productivity measure (e.g., a workflow), a yield measure, and a profit measure. The industry-specific feedback 11118 includes an amount of power generated by a machine about which the input sensors provide information during operation of the machine. The industry-specific feedback 11118 includes a measure of the output of an assembly line about which the input sensors provide information. The industry-specific feedback 11118 includes a failure rate of units of product produced by a machine about which the input sensors provide information. The industry-specific feedback 11118 includes a fault rate of a machine about which the input sensors provide information. The industry-specific feedback 11118 includes the power utilization efficiency of a machine about which the input sensors provide information, wherein the machine is one of a turbine, a transformer, a generator, a compressor, one that stores energy, and one that includes power train components (e.g., the rate of extraction of a material by a machine about which the input sensors provide information, the rate of production of a gas by a machine about which the input sensors provide information, the rate of production of a hydrocarbon product by a machine about which the input sensors provide information), and the rate of production of a chemical product by a machine about which the input sensors provide information. The machine learning data analysis circuit 11110 may be further structured to learn received output data patterns 11112 based on the outcome. The system 11100 may keep or modify operational parameters or equipment. The controller 11106 may adjust the weighting of the machine learning data analysis circuit 11110 based on the learned received output data patterns 11112 or the outcome, collect more/fewer data points from the input sensors based on the learned received output data patterns 11112 or the outcome, change a data storage technique for the output data 11108 based on the learned received output data patterns 11112 or the outcome, change a data presentation mode or manner based on the learned received output data patterns 11112 or the outcome, and apply one or more filters (low pass, high pass, band pass, etc.) to the output data 11108. In embodiments, the system 11100 may remove/re-task under-utilized equipment based on one or more of the learned received output data patterns 11112 and the outcome. The machine learning data analysis circuit 11110 may include a neural network expert system. The input sensors may measure vibration and noise data. The machine learning data analysis circuit 11110 may be structured to learn received output data patterns 11112 indicative of progress/alignment with one or more goals/guidelines (e.g., which may be determined by a different subset of the input sensors). The machine learning data analysis circuit 11110 may be structured to learn received output data patterns 11112 indicative of an unknown variable. The machine learning data analysis circuit 11110 may be structured to learn received output data patterns 11112 indicative of a preferred input among available inputs. The machine learning data analysis circuit 11110 may be structured to learn received output data patterns 11112 indicative of a preferred input data collection band among available input data collection bands. The machine learning data analysis circuit 11110 may be disposed in part on a machine, on one or more data collectors, in network infrastructure, in the cloud, or any combination thereof. The system 11100 may be deployed on the data collection circuit 11104. The system 11100 may be distributed between the data collection circuit 11104 and a remote infrastructure. The data collection circuit 11104 may include a data collector.

In embodiments, a system 11100 for data collection in an industrial environment may include a plurality of input sensors 11102 communicatively coupled to a controller 11106, a data collection circuit 11104 structured to collect output data 11108 from the input sensors, and a machine learning data analysis circuit 11110 structured to receive the output data 11108 and learn received output data patterns 11112 indicative of an outcome, wherein the machine learning data analysis circuit 11110 is structured to learn received output data patterns 11112 by being seeded with a model 11114 based on a utilization measure.

In embodiments, a system 11100 for data collection in an industrial environment may include a plurality of input sensors 11102 communicatively coupled to a controller 11106, a data collection circuit 11104 structured to collect output data 11108 from the input sensors, and a machine learning data analysis circuit 11110 structured to receive the output data 11108 and learn received output data patterns 11112 indicative of an outcome, wherein the machine learning data analysis circuit 11110 is structured to learn received output data patterns 11112 by being seeded with a model 11114 based on an efficiency measure.

In embodiments, a system 11100 for data collection in an industrial environment may include a plurality of input sensors 11102 communicatively coupled to a controller 11106, a data collection circuit 11104 structured to collect output data 11108 from the input sensors, and a machine learning data analysis circuit 11110 structured to receive the output data 11108 and learn received output data patterns 11112 indicative of an outcome, wherein the machine learning data analysis circuit 11110 is structured to learn received output data patterns 11112 by being seeded with a model 11114 based on a measure of success in prediction or anticipation of states.

In embodiments, a system 11100 for data collection in an industrial environment may include a plurality of input sensors 11102 communicatively coupled to a controller 11106, a data collection circuit 11104 structured to collect output data 11108 from the input sensors, and a machine learning data analysis circuit 11110 structured to receive the output data 11108 and learn received output data patterns 11112 indicative of an outcome, wherein the machine learning data analysis circuit 11110 is structured to learn received output data patterns 11112 by being seeded with a model 11114 based on a productivity measure.

Clause 1. In embodiments, a system for data collection in an industrial environment, comprising: a plurality of input sensors communicatively coupled to a controller; a data collection circuit structured to collect output data from the input sensors; and a machine learning data analysis circuit structured to receive the output data and learn received output data patterns indicative of an outcome, wherein the machine learning data analysis circuit is structured to learn received output data patterns by being seeded with a model based on industry-specific feedback. 2. The system of clause 1, wherein the model is a physical model, an operational model, or a system model. 3. The system of clause 1, wherein the industry-specific feedback is a utilization measure. 4. The system of clause 1, wherein the industry-specific feedback is an efficiency measure. 5. The system of clause 4, wherein the efficiency measure is one of power and financial. 6. The system of clause 1, wherein the industry-specific feedback is a measure of success in prediction or anticipation of states. 7. The system of clause 6, wherein the measure of success is an avoidance and mitigation of faults. 8. The system of clause 1, wherein the industry-specific feedback is a productivity measure. 9. The system of clause 8, wherein the productivity measure is a workflow. 10. The system of clause 1, wherein the industry-specific feedback is a yield measure. 11. The system of clause 1, wherein the industry-specific feedback is a profit measure. 12. The system of clause 1, wherein the machine learning data analysis circuit is further structured to learn received output data patterns based on the outcome. 13. The system of clause 1, wherein the system keeps or modifies operational parameters or equipment. 14. The system of clause 1, wherein the controller adjusts the weighting of the machine learning data analysis circuit based on the learned received output data patterns or the outcome. 15. The system of clause 1, wherein the controller collects more/fewer data points from the input sensors based on the learned received output data patterns or the outcome. 16. The system of clause 1, wherein the controller changes a data storage technique for the output data based on the learned received output data patterns or the outcome. 17. The system of clause 1, wherein the controller changes a data presentation mode or manner based on the learned received output data patterns or the outcome. 18. The system of clause 1, wherein the controller applies one or more filters (low pass, high pass, band pass, etc.) to the output data. 19. The system of clause 1, wherein the system removes/re-tasks under-utilized equipment based on one or more of the learned received output data patterns and the outcome. 20. The system of clause 1, wherein the machine learning data analysis circuit comprises a neural network expert system. 21. The system of clause 1, wherein the input sensors measure vibration and noise data. 22. The system of clause 1, wherein the machine learning data analysis circuit is structured to learn received output data patterns indicative of progress/alignment with one or more goals/guidelines. 23. The system of clause 22, wherein progress/alignment of each goal/guideline is determined by a different subset of the input sensors. 24. The system of clause 1, wherein the machine learning data analysis circuit is structured to learn received output data patterns indicative of an unknown variable. 25. The system of clause 1, wherein the machine learning data analysis circuit is structured to learn received output data patterns indicative of a preferred input among available inputs. 26. The system of clause 1, wherein the machine learning data analysis circuit is structured to learn received output data patterns indicative of a preferred input data collection band among available input data collection bands. 27. The system of clause 1, wherein the machine learning data analysis circuit is disposed in part on a machine, on one or more data collectors, in network infrastructure, in the cloud, or any combination thereof. 28. The system of clause 1, wherein the system is deployed on the data collection circuit. 29. The system of clause 1, wherein the system is distributed between the data collection circuit and a remote infrastructure. 30. The system of clause 1, wherein the industry-specific feedback includes an amount of power generated by a machine about which the input sensors provide information during operation of the machine. 31. The system of clause 1, wherein the industry-specific feedback includes a measure of the output of an assembly line about which the input sensors provide information. 32. The system of clause 1, wherein the industry-specific feedback includes a failure rate of units of product produced by a machine about which the input sensors provide information. 33. The system of clause 1, wherein the industry-specific feedback includes a fault rate of a machine about which the input sensors provide information. 34. The system of clause 1, wherein the industry-specific feedback includes the power utilization efficiency of a machine about which the input sensors provide information. 35. The system of clause 34, wherein the machine is a turbine. 36. The system of clause 34, wherein the machine is a transformer. 37. The system of clause 34, wherein the machine is a generator. 38. The system of clause 34, wherein the machine is a compressor. 39. The system of clause 34, wherein the machine stores energy. 40. The system of clause 1, wherein the machine includes power train components. 41. The system of clause 34, wherein the industry-specific feedback includes the rate of extraction of a material by a machine about which the input sensors provide information. 42. The system of clause 34, wherein the industry-specific feedback includes the rate of production of a gas by a machine about which the input sensors provide information. 43. The system of clause 34, wherein the industry-specific feedback includes the rate of production of a hydrocarbon product by a machine about which the input sensors provide information. 44. The system of clause 34, wherein the industry-specific feedback includes the rate of production of a chemical product by a machine about which the input sensors provide information. 45. The system of clause 1, wherein the data collection circuit comprises a data collector. 46. A system for data collection in an industrial environment, comprising: a plurality of input sensors communicatively coupled to a controller; a data collection circuit structured to collect output data from the input sensors; and a machine learning data analysis circuit structured to receive the output data and learn received output data patterns indicative of an outcome, wherein the machine learning data analysis circuit is structured to learn received output data patterns by being seeded with a model based on a utilization measure. 47. A system for data collection in an industrial environment, comprising: a plurality of input sensors communicatively coupled to a controller; a data collection circuit structured to collect output data from the input sensors; and a machine learning data analysis circuit structured to receive the output data and learn received output data patterns indicative of an outcome, wherein the machine learning data analysis circuit is structured to learn received output data patterns by being seeded with a model based on an efficiency measure. 48. A system for data collection in an industrial environment, comprising: a plurality of input sensors communicatively coupled to a controller; a data collection circuit structured to collect output data from the input sensors; and a machine learning data analysis circuit structured to receive the output data and learn received output data patterns indicative of an outcome, wherein the machine learning data analysis circuit is structured to learn received output data patterns by being seeded with a model based on a measure of success in prediction or anticipation of states. 49. A system for data collection in an industrial environment, comprising: a plurality of input sensors communicatively coupled to a controller; a data collection circuit structured to collect output data from the input sensors; and a machine learning data analysis circuit structured to receive the output data and learn received output data patterns indicative of an outcome, wherein the machine learning data analysis circuit is structured to learn received output data patterns by being seeded with a model based on a productivity measure.

In embodiments, a system for data collection in an industrial environment may include an expert system graphical user interface in which a user may, by interacting with a graphical user interface element, set a parameter of a data collection band for collection by a data collector. The parameter may relate to at least one of setting a frequency range for collection and setting an extent of granularity for collection.

In embodiments, a system for data collection in an industrial environment may include an expert system graphical user interface in which a user may, by interacting with a graphical user interface element, identify a set of sensors among a larger set of available sensors for collection by a data collector. The user interface may include views of available data collectors, their capabilities, one or more corresponding smart bands, and the like.

In embodiments, a system for data collection in an industrial environment may include an expert system graphical user interface in which a user may, by interacting with a graphical user interface element, select a set of inputs to be multiplexed among a set of available inputs.

In embodiments, a system for data collection in an industrial environment may include an expert system graphical user interface in which a user may, by interacting with a graphical user interface element, select a component of an industrial machine displayed in the graphical user interface for data collection, view a set of sensors that are available to provide data about the industrial machine, and select a subset of sensors for data collection.

In embodiments, a system for data collection in an industrial environment may include an expert system graphical user interface in which a user may, by interacting with a graphical user interface element, view a set of indicators of fault conditions of one or more industrial machines, where the fault conditions are identified by application of an expert system to data collected from a set of data collectors. In embodiments, the fault conditions may be identified by manufacturers of portions of the one or more industrial machines. The fault conditions may be identified by analysis of industry trade data, third-party testing agency data, industry standards, and the like. In embodiments, a set of indicators of fault conditions of one or more industrial machines may include indicators of stress, vibration, heat, wear, ultrasonic signature, operational deflection shape, and the like, optionally including any of the widely varying conditions that can be sensed by the types of sensors described throughout this disclosure and the documents incorporated herein by reference.

In embodiments, a system for data collection in an industrial environment may include an expert graphical user interface that enables a user to select from a list of component parts of an industrial machine for establishing smart-band monitoring and in response thereto presents the user with at least one smart-band definition of an acceptable range of values for at least one sensor of the industrial machine and a list of correlated sensors from which data will be gathered and analyzed when an out of acceptable range condition is detected from the at least one sensor.

In embodiments, a system for data collection in an industrial environment may include an expert graphical user interface that enables a user to select from a list of conditions of an industrial machine for establishing smart-band monitoring and, in response thereto, presents the user with at least one smart-band definition of an acceptable range of values for at least one sensor of the industrial machine and a list of correlated sensors from which data will be gathered and analyzed when an out of acceptable range condition is detected from the at least one sensor.

In embodiments, a system for data collection in an industrial environment may include an expert graphical user interface that enables a user to select from a list of reliability measures of an industrial machine for establishing smart-band monitoring and, in response thereto, presents the user with at least one smart-band definition of an acceptable range of values for at least one sensor of the industrial machine and a list of correlated sensors from which data will be gathered and analyzed when an out of acceptable range condition is detected from the at least one sensor. In the system, the reliability measures may include one or more of industry average data, manufacturer's specifications, material specifications, recommendations, and the like. In embodiments, reliability measures may include measures that correlate to failures, such as stress, vibration, heat, wear, ultrasonic signature, operational deflection shape effect, and the like. In embodiments, manufacturer's specifications may include cycle count, working time, maintenance recommendations, maintenance schedules, operational limits, material limits, warranty terms, and the like. In embodiments, the sensors in the industrial environment may be correlated to manufacturer's specifications by associating a condition being sensed by the sensor to a specification type. In embodiments, a non-limiting example of correlating a sensor to a manufacturer's specification may include a duty cycle specification being correlated to a sensor that detects revolutions of a moving part. In embodiments, a temperature specification may correlate to a thermal sensor disposed to sense an ambient temperature proximal to the industrial machine.

In embodiments, a system for data collection in an industrial environment may include an expert graphical user interface that automatically creates a smart-band group of sensors disposed in the industrial environment in response to receiving a condition of the industrial environment for monitoring and an acceptable range of values for the condition.

In embodiments, a system for data collection in an industrial environment may include an expert graphical user interface that presents a representation of components of an industrial machine deployable in the industrial environment on an electronic display, and in response to a user selecting one or more of the components, searches a database of industrial machine failure modes for modes involving the selected component(s) and conditions associated with the failure mode(s) to be monitored, and further identifies a plurality of sensors in, on, or available to be disposed on the presented machine representation from which data will automatically be captured when the condition(s) to be monitored are detected to be outside of an acceptable range. In embodiments, the identified plurality of sensors includes at least one sensor through which the condition(s) will be monitored.

In embodiments, a system for data collection in an industrial environment may include a user interface for working with smart bands that may facilitate a user identifying sensors to include in a smart band group of sensors by selecting sensors presented on a map of a machine in the environment. A user may be guided to select among a subset of all possible sensors based on smart band criteria, such as types of sensor data required for the smart band. A smart band may be focused on detecting trending conditions in a portion of the industrial environment; therefore, the user interface may direct the user choose among an identified subset of sensors, such as by only allowing sensors proximal to the smart band directed portion of the environment to be selectable in the user interface.

In embodiments, a smart band data collection configuration and deployment user interface may include views of components in an industrial environment and related available sensors. In embodiments, in response to selection of a component part of an industrial machine depicted in the user interface, sensors associated with smart band data collection for the component part may be highlighted so that the user may select one or more of the sensors. User selection in this context may comprise a verification of an automatic selection of sensors, or manually identifying sensors to include in the smart band sensor group.

In embodiments, in response to selection of a smart band condition, such as trending of bearing temperature, a user interface for smart band configuration and use may automatically identify and present sensors that contribute to smart band analysis for the condition. A user may responsive to this presentation of sensors, confirm or otherwise acknowledge one or more sensors individually or as a set to be included in the smart band data collection group.

In embodiments, a smart band user interface may present locations of industrial machines in an industrial environment on a map. The locations may be annotated with indicators of smart band data collection templates that are configured for collecting smart band data for the machines at the annotated locations. The locations may be color coded to reflect a degree of smart band coverage for a machine at the location. In embodiments, a location of a machine with a high degree of smart band coverage may be colored green, whereas a location of a machine with low smart band coverage may be colored red or some other contrasting color. Other annotations, such as visual annotations may be used. A user may select a machine at a location and by dragging the selected machine to a location of a second machine, effectively configure smart bands for the second machine that correspond to smart bands for the first machine. In this way, a user may configure several smart band data collection templates for a newly added machine or a new industrial environment and the like.

In embodiments, various configurations and selections of smart bands may be stored for use throughout a data collection platform, such as for selecting templates for sensing, templates for routing, provisioning of devices and the like, as well as for direct the placement of sensors, such as by personnel or by machines, such as autonomous or remote-control drones.

In embodiments, a smart band user interface may present a map of an industrial environment that may include industrial machines, machine-specific data collectors, mobile data collectors (robotic and human), and the like. A user may view a list of smart band data collection actions to be performed and may select a data collection resource set to undertake the collection. In an example, a guided mobile robot may be equipped with data collection systems for collecting data for a plurality of smart band data sets. A user may view an industrial environment with which the robot is associated and assign the robot to perform a smart band data collection activity by selecting the robot, a smart band data collection template, and a location in the industrial environment, such as a machine or a part of a machine. The user interface may provide a status of the collection undertaking so that the user can be informed when the data collection is complete.

In embodiments, a smart band operation management user interface may include presentation of smart band data collection activity, analysis of results, actions taken based on results, suggestions for changes to smart band data collection (e.g., addition of sensors to a smart band collection template, increasing duration of data collection for a template-specific collection activity), and the like. The user interface may facilitate "what if" type analysis by presenting potential impacts on reliability, costs, resource utilization, data collection tradeoffs, maintenance schedule impacts, risk of failure (increase/decrease), and the like in response to a user's attempt to make a change to a smart band data collection template, such as a user relaxing a threshold for performing smart band data collection and the like. In embodiments, a user may select or enter a target budget for preventive maintenance per unit time (e.g., per month, quarter, and the like) into the user interface and an expert system of the user interface may recommend a smart band data collection template and thresholds for complying with the budget.

In embodiments, a smart band user interface may facilitate a user configuring a system for data collection in an industrial environment for smart band data gathering. The user interface may include display of industrial machine components, such as motors, linkages, bearings, and the like that a user may select. In response to such a selection, an expert system may work with the user interface to present a list of potential failure conditions related to the part to monitor. The user may select one or more conditions to monitor. The user interface may present the conditions to monitor as a set that the user may be asked to approve. The user may indicate acceptance of the set or of select conditions in the set monitor. As a follow-on to a user selection/approval of one or more conditions to monitor, the user interface may display a map of relevant sensors available in the industrial environment for collecting data as a smart band group of sensors. The relevant sensors may be associated with one or more parts (e.g., the part(s) originally selected by the user), one or more failure conditions, and the like.

In embodiments, the expert system may compare the relevant sensors in the environment to a preferred set of sensors for smart band monitoring of the failure condition(s) and provide feedback to the user, such as a confidence factor for performing smart band monitoring based on the available sensors for the failure condition(s). The user may evaluate the failure condition and smart band analysis information presented and may take an action in the user interface, such as approving the relevant sensors. In response, a smart band data collection template for configuring the data collection system may be created. In embodiments, a smart band data collection template may be created independently of a user approval. In such embodiments, the user may indicate explicitly or implicitly via approval of the smart band analysis information an approval of the created template.

In embodiments, a smart band user interface may work with an expert system to present candidate portions of an industrial machine in an industrial environment for smart band condition monitoring based on information such as manufacturer's specifications, statistical information derived from real-world experience with similar industrial machines, and the like. In embodiments, the user interface may permit a user to select certain aspects of the smart band data collection and analysis process including—for example, a degree of reliability/failure risk to monitor (e.g., near failure, best performance, industry average, and the like). In response thereto, the expert system may adjust an aspect of the smart band analysis, such as a range of acceptable value to monitor, a monitor frequency, a data collection frequency, a data collection amount, a priority for the data collection activity (e.g., effectively a priority of a template for data collection for the smart band), weightings of data from sensors (e.g., specific sensors in the group, types of sensors, and the like).

In embodiments, a smart bands user interface may be structured to allow a user to let an expert system recommend one or more smart bands to implement based on a range of comparative data that the user might prioritize, such as industry average data, industry best data, near-by comparable machines, most similarly configured machines, and the like. Based on the comparative data weighting, the expert system may use the user interface to recommend one or more smart band templates that align with the weighting to the user, who may take an action in the user interface, such as approving one or more of the recommended templates for use.

In embodiments, a user interface for configuring arrangement of sensors in an industrial environment may include recommendations by industrial environment equipment suppliers (e.g., manufacturers, wholesalers, distributors, dealers, third-party consultants, and the like) of group(s) of sensors to include for performing smart band analysis of components of the industrial equipment. The information may be presented to a user as data collection template(s) that the user may indicate as being accepted/approved, such as by positioning a graphic representing a template(s) over a portion of the industrial equipment.

In embodiments, a smart band discovery portal may facilitate sharing of smart band related information, such as recommendations, actual use cases, results of smart band data collection and processing, and the like. The discovery portal may be embodied as a panel in a smart band user interface.

In embodiments, a smart band assessment portal may facilitate assessment of smart band-based data collection and analysis. Content that may be presented in such a portal may include depictions of uses of existing smart band templates for one or more industrial machines, industrial environments, industries, and the like. A value of a smart band may be ascribed to each smart band in the portal based, for example, on historical use and outcomes. A smart band assessment portal may also include visualization of candidate sensors to include in a smart band data collection template based on a range of factors including ascribed value, preventive maintenance costs, failure condition being monitored, and the like.

In embodiments, a smart bands graphical user interface associated with a system for data collection in an industrial environment may be deployed for industrial components, such as of factory-based air conditioning units. A user interface of a system for data collection for smart band analysis of air conditioning units may facilitate graphical configuration of smart band data collection templates and the like for specific air conditioning system installations. In embodiments, major components of an air conditioning system, such as a compressor, condenser, heat exchanger, ducting, coolant regulators, filters, fans, and the like along with corresponding sensors for a particular installation of the air conditioning system may be depicted in a user interface. A user may select one or more of these components in the user interface for configuring a system for smart band data collection. In response to the user selecting, for example, a coolant compressor, sensors associated with the compressor may be automatically identified in the user interface. The user may be presented with a recommended data collection template to perform smart band data collection for the selected compressor. Alternatively, the user may request a candidate collection template from a community of smart band users, such as through a smart band template sharing panel of the user interface. Once a template is selected, the user interface may offer the user customization options, such as frequency of collection, degree of reliability to monitor, and the like. Upon final acceptance of the template, the user interface may interact with a data collection system of the installed air conditioning system (if such a system is available) to implement the data collection template and provide an indication to the user of the result of implementing the template. In response thereto, the user may make a final approval of the template for use with the air conditioning unit.

Figure 119:
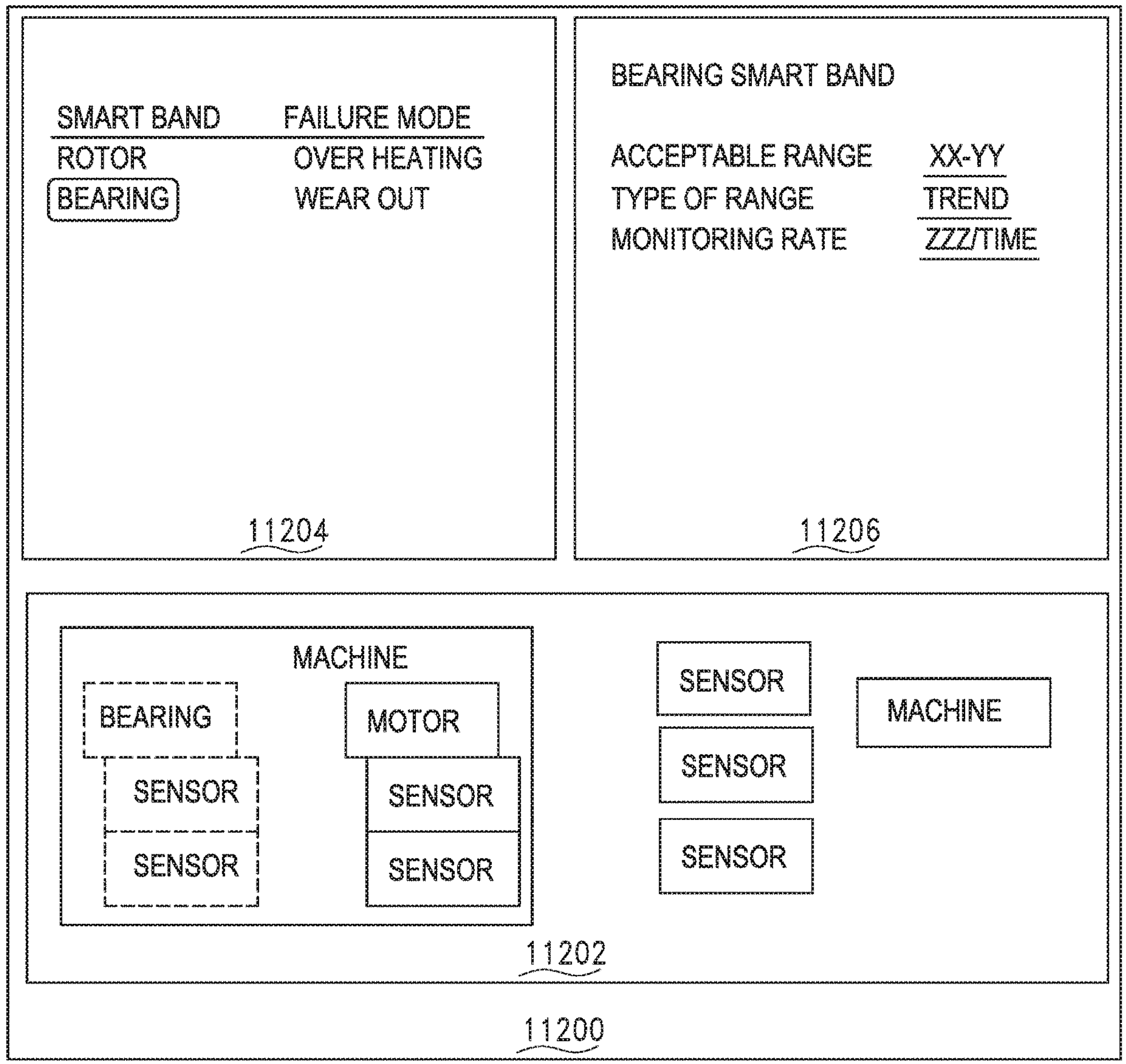
FIG. 119 is a diagrammatic view that depicts an exemplary user interface for smart band configuration of a system for data collection in an industrial environment is depicted in accordance with the present disclosure.

Referring to FIG. 119, an exemplary user interface for smart band configuration of a system for data collection in an industrial environment is depicted. The user interface 11200 may include an industrial environment visualization portion 11202 in which may be depicted one or more sensors, machines, and the like. Each sensor, machine, or portion thereof (e.g., motor, compressor, and the like) may be selectable as part of a smart-band configuration process. Likewise, each sensor, machine or portion thereof may be visually highlighted during the smart-band configuration process, such as in response to user selection, or automated identification as being part of a group of smart band sensors. The user interface may also include a smart band selection portion 11204 or panel in which smart band indicators, failure modes, and the like may be depicted in selectable elements. User selection of a symptom, failure mode and the like may cause corresponding components, sensors, machines, and the like in the industrial visualization portion to be highlighted. The user interface may also include a customization panel 11206 in which attributes of a selected smart band, such as acceptable ranges, frequency of monitoring and the like may be made available for a user to adjust.

Clause 1. In embodiments, a system comprising: a user interface comprising: a selectable graphical element that facilitates selection of a representation of a component of an industrial machine from an industrial environment in which a plurality of sensors is deployed from which a data collection system collects data for the system for which the user interface enables interaction; and selectable graphical elements representing a portion of the plurality of sensors that facilitate selection of a sensors to form a data collection subset of sensors in the industrial environment. 2. The system of clause 1, wherein selection of sensors to form a data collection subset results in a data collection template adapted to facilitate configuring the data routing and collection system for collecting data from the data collection subset of sensors. 3. The system of clause 1, wherein the user interface comprises an expert system that analyzes a user selection of a graphical element that facilitates selection of a component and adjusts the selectable graphical elements representing a portion of the plurality of sensors to activate only sensors associated with a component associated with the selected graphical element. 4. The system of clause 1, wherein the selectable graphical element that facilitates selection of a component of an industrial machine further facilitates presentation of a plurality of data collection templates associated with the component. 5. The system of clause 1, wherein the portion of the plurality of sensors comprises a smart band group of sensors. 6. The system of clause 5, wherein the smart band group of sensors comprises sensors for a component of the industrial machine selected by the selectable graphical element. 7. A system comprising: an expert graphical user interface comprising representations of a plurality of components of an industrial machine from an industrial environment in which a plurality of sensors is deployed from which a data collection system collects data for the system for which the user interface enables interaction, wherein at least one representation of the plurality of components is selectable by a user in the user interface; a database of industrial machine failure modes; and a database searching facility that searches the database of failure modes for modes that correspond to a user selection of a component of the plurality of components. 8. The system of clause 7, comprising a database of conditions associated with the failure modes. 9. The system of clause 8, wherein the database of conditions includes a list of sensors in the industrial environment associated with the condition. 10. The system of clause 9, wherein the database searching facility further searches the database of conditions for sensors that correspond to at least one condition and indicates the sensors in the graphical user interface. 11. The system of clause 7, wherein the user selection of a component of the plurality of components causes a data collection template for configuring the data routing and collection system to automatically collect data from sensors associated with the selected component. 12. A method comprising: presenting in an expert graphical user interface a list of reliability measures of an industrial machine; facilitating user selection of one reliability measure from the list; presenting a representation of a smart band data collection template associated with the selected reliability measure; and in response to a user indication of acceptance of the smart band data collection template, configuring a data routing and collection system to collect data from a plurality of sensors in an industrial environment in response to a data value from one of the plurality of sensors being detected outside of an acceptable range of data values. 13. The method of clause 12, wherein the reliability measures include one or more of industry average data, manufacturer's specifications, manufacturer's material specifications, and manufacturer's recommendations. 14. The method of clause 13, wherein include the manufacturer's specifications include at least one of cycle count, working time, maintenance recommendations, maintenance schedules, operational limits, material limits, and warranty terms. 15. The method of clause 12, wherein the reliability measures correlate to failures selected from the list consisting of stress, vibration, heat, wear, ultrasonic signature, and operational deflection shape effect. 16. The method of clause 12, further comprising correlating sensors in the industrial environment to manufacturer's specifications. 17. The method of clause 16, wherein correlating comprises matching a duty cycle specification to a sensor that detects revolutions of a moving part. 18. The method of clause 16, wherein correlating comprises matching a temperature specification with a thermal sensor disposed to sense an ambient temperature proximal to the industrial machine. 19. The method of clause 16, further comprising dynamically setting the acceptable range of data values based on a result of the correlating. 20. The method of clause 16, further comprising automatically determining the one of the plurality of sensors for detecting the data value outside of the acceptable range based on a result of the correlating.

In embodiments, a system for data collection in an industrial environment may route data from a plurality of sensors in the industrial environment to wearable haptic stimulators that present the data from the sensors as human detectable stimuli including at least one of tactile, vibration, heat, sound, and force. In embodiments, the haptic stimulus represents an effect on the machine resulting from the sensed data. In embodiments, a bending effect may be presented as bending a finger of a haptic glove. In embodiments, a vibrating effect may be presented as vibrating a haptic arm band. In embodiments, a heating effect may be presented as an increase in temperature of a haptic wrist band. In embodiments, an electrical effect (e.g., over voltage, current, and others) may be presented as a change in sound of a phatic audio system.

In embodiments, an industrial machine operator haptic user interface may be adapted to provide haptic stimuli to the operator that is responsive to the operator's control of the machine, wherein the stimuli indicate an impact on the machine as a result of the operator's control and interaction with objects in the environment as a result thereof. In embodiments, sensed conditions of the machine that exceed an acceptable range may be presented to the operator through the haptic user interface. In embodiments, the sensed conditions of the machine that are within an acceptable range may not be presented to the operator through the haptic user interface. In embodiments, the sensed conditions of the machine that are within an acceptable range may presented as natural language representations of confirmation of the operator control. In embodiments, at least a portion of the haptic user interface is worn by the operator. In embodiments, a wearable haptic user interface device may include force exerting devices along the outer legs of a device operator's uniform. When a vehicle that the operator is controlling approaches an obstacle along a lateral side of the vehicle, an inflatable bellows may be inflated, exerting pressure against the leg of the operator closest to the side of the vehicle approaching the obstacle. The bellows may continue to be inflated, thereby exerting additional pressure on the operator's leg that is consistent with the proximity of the obstacle. The pressure may be pulsed when contact with the obstacle is imminent. In another example, an arm band of an operator may vibrate in coordination with vibration being experienced by a portion of the vehicle that the operator is controlling. These are merely examples and not intended to be limiting or restrictive of the ways in which a wearable haptic feedback user device may be controlled to indicate conditions that are sensed by a system for data collection in an industrial environment.

In embodiments, a haptic user interface safety system worn by a user in an industrial environment may be adapted to indicate proximity to the user of equipment in the environment by stimulating a portion of the user with at least one of pressure, heat, impact, electrical stimuli and the like, the portion of the user being stimulated may be closest to the equipment. In embodiments, at least one of the type, strength, duration, and frequency of the stimuli is indicative of a risk of injury to the user.

In embodiments, a wearable haptic user interface device, that may be worn by a user in an industrial environment, may broadcast its location and related information upon detection of an alert condition in the industrial environment. The alert condition may be proximal to the user wearing the device, or not proximal but related to the user wearing the device. A user may be an emergency responder, so the detection of a situation requiring an emergency responded, the user's haptic device may broadcast the user's location to facilitate rapid access to the user or by the user to the emergency location. In embodiments, an alert condition may be determined from monitoring industrial machine sensors may be presented to the user as haptic stimuli, with the severity of the alert corresponding to a degree of stimuli. In embodiments, the degree of stimuli may be based on the severity of the alert, the corresponding stimuli may continue, be repeated, or escalate, optionally including activating multiple stimuli concurrently, send alerts to additional haptic users, and the like until an acceptable response is detected, e.g., through the haptic UI. The wearable haptic user device may be adapted to communicate with other haptic user devices to facilitate detecting the acceptable response.

In embodiments, a wearable haptic user interface for use in an industrial environment may include gloves, rings, wrist bands, watches, arm bands, head gear, belts, necklaces, shirts (e.g., uniform shirt), foot wear, pants, ear protectors, safety glasses, vests, overalls, coveralls, and any other article of clothing or accessory that can be adapted to provide haptic stimuli.

In embodiments, wearable haptic device stimuli may be correlated to a sensor in an industrial environment. Non-limiting examples include a vibration of a wearable haptic device in response to vibration detected in an industrial environment; increasing or decreasing the temperature of a wearable haptic device in response to a detected temperature in an industrial environment; producing sound that changes in pitch responsively to changes in a sensed electrical signal, and the like. In embodiments, a severity of wearable haptic device stimuli may correlate to an aspect of a sensed condition in the industrial environment. Non-limiting examples include moderate or short-term vibration for a low degree of sensed vibration; strong or long-term vibration stimulation for an increase in sensed vibration; aggressive, pulsed, and/or multi-mode stimulation for a high amount of sensed vibration. Wearable haptic device stimuli may also include lighting (e.g., flashing, color changes, and the like), sound, odor, tactile output, motion of the haptic device (e.g., inflating/deflating a balloon, extension/retraction of an articulated segment, and the like), force/impact, and the like.

In embodiments, a system for data collection in an industrial environment may interface with wearable haptic feedback user devices to relay data collected from fuel handling systems in a power generation application to the user via haptic stimulation Fuel handling for power generation may include solid fuels, such as woodchips, stumps, forest residue, sticks, energy willow, peat, pellets, bark, straw, agro biomass, coal, and solid recovery fuel. Handling systems may include receiving stations that may also sample the fuel, preparation stations that may crush or chip wood-based fuel or shred waste-based fuel. Fuel handling systems may include storage and conveying systems, feed and ash removal systems and the like. Wearable haptic user interface devices may be used with fuel handling systems by providing an operator feedback on conditions in the handling environment that the user is otherwise isolated from. Sensors may detect operational aspects of a solid fuel feed screw system. Conditions like screw rotational rate, weight of the fuel, type of fuel, and the like may be converted into haptic stimuli to a user while allowing the user to use his hands and provide his attention to operate the fuel feed system.

In embodiments, a system for data collection in an industrial environment may interface with wearable haptic feedback user devices to relay data collected from suspension systems of a truck and/or vehicle application to the user via haptic stimulation. Haptic simulation may be correlated with conditions being sensed by the vehicle suspension system. In embodiments, road roughness may be detected and converted into vibration-like stimuli of a wearable haptic arm band. In embodiments, suspension forces (contraction and rebound) may be converted into stimuli that present a scaled down version of the forces to the user through a wearable haptic vest.

In embodiments, a system for data collection in an industrial environment may interface with wearable haptic feedback user devices to relay data collected from hydroponic systems in an agriculture application to the user via haptic stimulation. In embodiments, sensors in hydroponic systems, such as temperature, humidity, water level, plant size, carbon dioxide/oxygen levels, and the like may be converted to wearable device haptic stimuli. As an operator wearing haptic feedback clothing walks through a hydroponic agriculture facility, sensors proximal to the operator may signal to the haptic feedback clothing relevant information, such as temperature or a measure of actual temperature versus desired temperature that the haptic clothing may convert into haptic stimuli. In an example, a wrist band may include a thermal stimulator that can change temperature quickly to track temperature data or a derivative thereof from sensors in the agriculture environment. As a user walks through the facility, the haptic feedback wristband may change temperature to indicate a degree to which proximal temperatures are complying with expected temperatures.

In embodiments, a system for data collection in an industrial environment may interface with wearable haptic feedback user devices to relay data collected from robotic positioning systems in an automated production line application to the user via haptic stimulation Haptic feedback may include receiving a positioning system indicator of accuracy and converting it to an audible signal when the accuracy is acceptable, and another type of stimuli when the accuracy is not acceptable.

Figure 120:
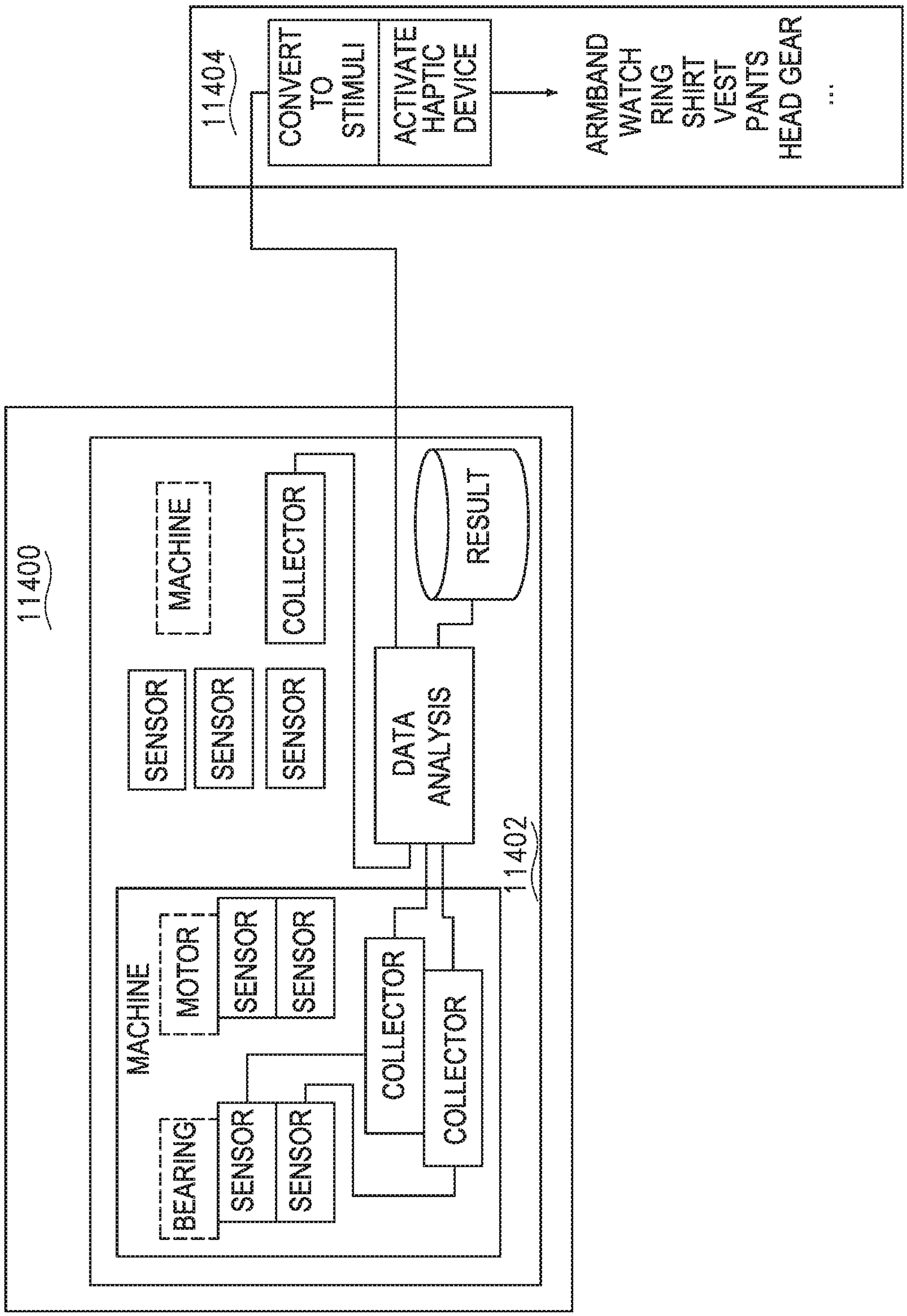
FIG. 120 is a diagrammatic view that depicts a wearable haptic user interface device for providing haptic stimuli to a user that is responsive to data collected in an industrial environment by a system adapted to collect data in the industrial environment in accordance with the present disclosure.

Referring to FIG. 120, a wearable haptic user interface device for providing haptic stimuli to a user that is responsive to data collected in an industrial environment by a system adapted to collect data in the industrial environment is depicted. A system for data collection 11402 in an industrial environment 11400 may include a plurality of sensors. Data from those sensors may be collected and analyzed by a computing system. A result of the analysis may be communicated wirelessly to one or more wearable haptic feedback stimulators 11404 worn by a user associated with the industrial environment. The wearable haptic feedback stimulators may interpret the result, convert it into a form of stimuli based on a haptic stimuli-to-sensed condition mapping, and produce the stimuli.

Clause 1. In embodiments, a system for data collection in an industrial environment, comprising: a plurality of wearable haptic stimulators that produce stimuli selected from the list of stimuli consisting of tactile, vibration, heat, sound, force, odor, and motion; a plurality of sensors deployed in the industrial environment to sense conditions in the environment; a processor logically disposed between the plurality of sensors and the wearable haptic stimulators, the processor receiving data from the sensors representative of the sensed condition, determining at least one haptic stimulation that corresponds to the received data, and sending at least one signal for instructing the wearable haptic stimulators to produce the at least one stimulation 2 The system of clause 1, wherein the haptic stimulation represents an effect on a machine in the industrial environment resulting from the condition. 3. The system of clause 2, wherein a bending effect is presented as bending a haptic device. 4. The system of clause 2, wherein a vibrating effect is presented as vibrating a haptic device. 5. The system of clause 2, wherein a heating effect is presented as an increase in temperature of a haptic device. 6. The system of clause 2, wherein an electrical effect is presented as a change in sound produced by a haptic device. 7. The system of clause 2, wherein at least one of the plurality of wearable haptic stimulators are selected from the list consisting of a glove, ring, wrist band, wrist watch, arm band, head gear, belt, necklace, shirt, foot wear, pants, overalls, coveralls, and safety goggles. 8. The system of clause 2, wherein the at least one signal comprises an alert of a condition of interest in the industrial environment. 9. The system of clause 8, wherein the at least one stimulation produced in response to the alert signal is repeated by at least one of the plurality of wearable haptic stimulators until an acceptable response is detected. 10. An industrial machine operator haptic user interface that is adapted to provide the operator haptic stimuli responsive to the operator's control of the machine based on at least one sensed condition of the machine that indicates an impact on the machine as a result of the operator's control and interaction with objects in the environment as a result thereof. 11. The user interface of clause 10, wherein a sensed condition of the machine that exceeds an acceptable range of data values for the condition is presented to the operator through the haptic user interface. 12. The user interface of clause 10, wherein a sensed condition of the machine that is within an acceptable range of data values for the condition is presented as natural language representations of confirmation of the operator control via an audio haptic stimulator. 13. The user interface of clause 10, wherein at least a portion of the haptic user interface is worn by the operator. 14. The system of clause 10, wherein a vibrating sensed condition is presented as vibrating stimulation by the haptic user interface. 15. The system of clause 10, wherein a temperature-based sensed condition is presented as heat stimulation by the haptic user interface. 16. A haptic user interface safety system worn by a user in an industrial environment, wherein the interface is adapted to indicate proximity to the user of equipment in the environment by haptic stimulation via a portion of the haptic user interface that is closest to the equipment, wherein at least one of the type, strength, duration, and frequency of the stimulation is indicative of a risk of injury to the user. 17. The haptic user interface of clause 16, wherein the haptic stimulation is selected from a list consisting of pressure, heat, impact, and electrical stimulation. 18. The haptic user interface of clause 16 wherein the haptic user interface further comprises a wireless transmitter that broadcasts a location of the user. 19. The haptic user interface of clause 18, wherein the wireless transmitter broadcasts a location of the user in response to indicating proximity of the user to the equipment. 20. The haptic user interface of clause 16, wherein the proximity to the user of equipment in the environment is based on sensor data provided to the haptic user interface from a system adapted to collect data in an industrial environment, wherein the system is adapted based on a data collection template associated with a user safety condition in the industrial environment.

In embodiments, a system for data collection in an industrial environment may facilitate presenting a graphical element indicative of industrial machine sensed data on an augmented reality (AR) display. The graphical element may be adapted to represent a position of the sensed data on a scale of acceptable values of the sensed data. The graphical element may be positioned proximal to a sensor detected in the field of view being augmented that captured the sensed data in the AR display. The graphical element may be a color and the scale may be a color scale ranging from cool colors (e.g., greens, blues) to hot colors (e.g., yellow, red) and the like. Cool colors may represent data values closer to the midpoint of the acceptable range and the hot colors representing data values close to or outside of a maximum or minimum value of the range.

In embodiments, a system for data collection in an industrial environment may present, in an AR display, data being collected from a plurality of sensors in the industrial environment as one of a plurality graphical effects (e.g., colors in a range of colors) that correlate the data being collected from each sensor to a scale of values within an acceptable range compared to values outside of the acceptable range. In embodiments, the plurality of graphical effects may overlay a view of the industrial environment and placement of the plurality of graphical effects may correspond to locations in the view of the environment at which a sensor is located that is producing the corresponding sensor data. In embodiments, a first set of graphical effects (e.g., hot colors) represent components for which multiple sensors indicate values outside acceptable ranges.

In embodiments, a system for data collection in an industrial environment may facilitate presenting, in an AR display information being collected by sensors in the industrial environment as a heat map overlaying a visualization of the environment so that regions of the environment with sensor data suggestive of a greater potential of failure are overlaid with a graphic effect that is different than regions of the environment with sensor data suggestive of a lesser potential of failure. In embodiments, the heat map is based on data currently being sensed. In embodiments, the heat map is based on data from prior failures. In embodiments, the heat map is based on changes in data from an earlier period, such as data that suggest an increased likelihood of machine failure. In embodiments, the heat map is based on a preventive maintenance plan and a record of preventive maintenance in the industrial environment.

In embodiments, a system for data collection in an industrial environment may facilitate presenting information being collected by sensors in the industrial environment as a heat map overlaying a view of the environment, such as a live view as may be presented in an AR display. Such a system may include presenting an overlay that facilitates a call to action, wherein the overlay is associated with a region of the heat map. The overlay may comprise a visual effect of a part or subsystem of the environment on which the action is to be performed. In embodiments, the action to be performed is maintenance related and may be part-specific.

In embodiments, a system for data collection in an industrial environment may facilitate updating, in an AR view of a portion of the environment, a heat map of aspects of the industrial environment based on a change to operating instructions for at least one aspect of a machine in the industrial environment. The heat map may represent compliance with operational limits for portions of machines in the industrial environment. In embodiments, the heat map may represent a likelihood of component failure as a result of the change to operation instructions.

In embodiments, a system for data collection in an industrial environment may facilitate presenting, as a heat map in an AR view of a portion of the environment, a degree or measure of coverage of sensors in the industrial environment for a data collection template that identifies select sensors in the industrial environment for a data collection activity.

In embodiments, a system for data collection in an industrial environment may facilitate displaying a heat map overlaying a view, such as a live view, of an industrial environment of failure-related data for various portions of the environment. The failure-related data may comprise a difference between an actual failure rate of the various portions and another failure rate. Another failure rate may be a rate of failure of comparable portions elsewhere in the environment, and/or average failure rate of comparable portions across a plurality of environments, such as an industry average, manufacturer failure rate estimate, and the like.

In embodiments, a system for data collection in an industrial environment may facilitate displaying a heat map related to data collected from robotic arms and hands for production line robotic handling in an augmented reality view of a portion of the environment. A heat map related to data collected from robotic arms and hands may represent data from sensors disposed in—for example, the fingers of a robotic hand Sensor may collect data, such as applied pressure when pinching an object, resistance (e.g., responsive to a robotic touch) of an object, multi-axis forces presented to the finger as it performs an operation, such as holding a tool and the like, temperature of the object, total movement of the finger from initial point of contact until a resistance threshold is met, and other hand position/use conditions. Heat maps of this data may be presented in an augmented reality view of a robotic production environment so that a user may make a visual assessment of, for example, how the relative positioning of the robotic fingers impacts the object being handled In embodiments, a system for data collection in an industrial environment may facilitate displaying a heat map related to data collected from linear bearings for production line robotic handling in an augmented reality view of a portion of the environment. Linear bearings, as with most bearings, may not be visible while in use. However, assessing their operation may benefit from representing data from sensors that capture information about the bearings while in use in an augmented reality display. In embodiments, sensors may be placed to detect forces being placed on portions of the bearings by the rotating member or elements that the bearings support. These forces may be presented as heat maps that correspond to relative forces, on a visualization of the bearings in an augmented reality view of a robot handling machine that uses linear bearings.

In embodiments, a system for data collection in an industrial environment may facilitate displaying a heat map related to data collected from boring machinery for mining in an augmented reality view of a portion of the environment. Boring machinery, and in particular multi-tip circular boring heads may experience a range of rock formations at the same time. Sensors may be placed proximal to each boring tip that may detect forces experienced by the tips. The data may be collected by a system adapted to collect data in an industrial environment and provided to an augmented reality system that may display the data as heat maps or the like in a view of the boring machine.

Figure 121:
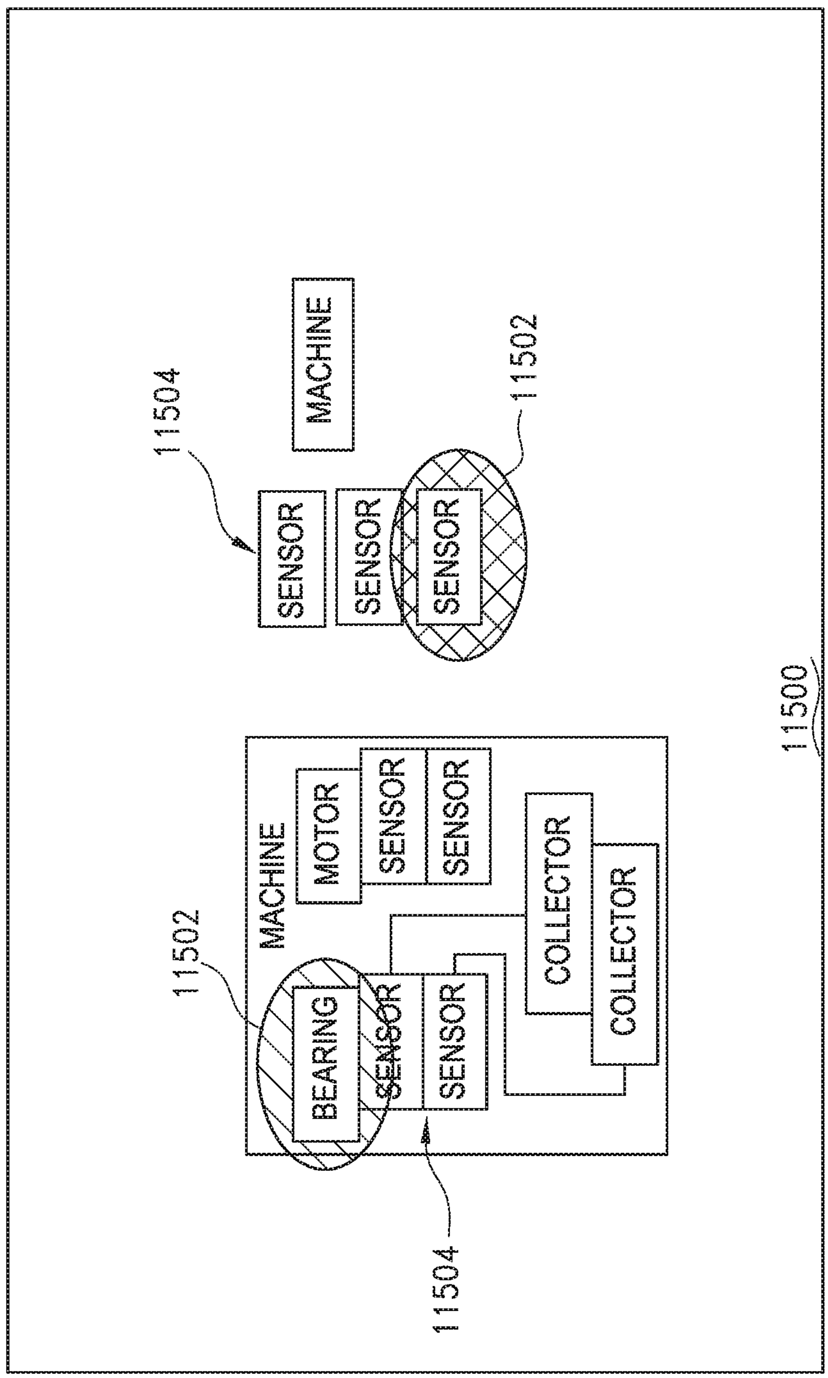
FIG. 121 is a diagrammatic view that depicts an augmented reality display of heat maps based on data collected in an industrial environment by a system adapted to collect data in the environment in accordance with the present disclosure.

Referring to FIG. 121, an augmented reality display of heat maps based on data collected in an industrial environment by a system adapted to collect data in the environment is depicted. An augmented reality view of an industrial environment 11500 may include heat maps 11502 that depict data received from or derived from data received from sensors 11504 in the industrial environment. Sensor data may be captured and processed by a system adapted for data collection and analysis in an industrial environment. The data may be converted into a form that is suitable for use in an augmented reality system for displaying heat maps. The heat maps 11502 may be aligned in the augmented reality view with a sensor from which the underlying data was sourced.

Clause 1. In embodiments, an augmented reality (AR) system in which industrial machine sensed data is presented in a view of the industrial machine as heat maps of data collected from sensors in the view, wherein the heat maps are positioned proximal to a sensor capturing the sensed data that is visible in the AR display. 2. The system of clause 1, wherein the heat maps are based on a comparison of real time data collected from sensors with an acceptable range of values for the data. 3. The system of clause 1, wherein the heat maps are based on trends of sensed data. 4. The system of clause 1, wherein the heat maps represent a measure of coverage of sensors in the industrial environment in response to a condition of interest that is calculated from data collected by sensors in the industrial environment. 5. The system of clause 1, wherein the heat maps of data collected from sensors in the view is based on data collected by a system adapted to collect data in the industrial environment by routing data from a plurality of sensors to a plurality of data collectors via at least one of an analog crosspoint switch, a multiplexer, and a hierarchical multiplexer. 6. The system of clause 1, wherein the heat maps present different collected data values as different colors. 7. The system of clause 1, wherein data collected from a plurality of sensors is combined to produce a heat map. 8. A system for data collection in an industrial environment, comprising: an augmented reality display that presents data being collected from a plurality of sensors in the industrial environment as one of a plurality of colors, wherein the colors correlate the data being collected from each sensor to a color scale with cool colors mapping to values of the data within an acceptable range and hot colors mapping to values of the data outside of the acceptable range, wherein the plurality of colors overlay a view of the industrial environment and placement of the plurality of colors corresponds to locations in the view of the environment at which a sensor is located that is producing the corresponding sensor data. 9. The system of clause 8, wherein hot colors represent components for which multiple sensors indicate values outside typical ranges. 10. The system of clause 8, wherein the plurality of colors is based on a comparison of real time data collected from sensors with an acceptable range of values for the data. 11. The system of clause 8, wherein the plurality of colors is based on trends of sensed data. 12. The system of clause 8, wherein the plurality of colors represents a measure of coverage of sensors in the industrial environment in response to a condition of interest that is calculated from data collected by sensors in the industrial environment. 13. A method comprising, presenting information being collected by sensors in an industrial environment as a heat map overlaying a view of the environment so that regions of the environment with sensor data suggestive of a greater potential of failure are overlaid with a heat map that is different than regions of the environment with sensor data suggestive of a lesser potential of failure. 14. The method of clause 13, wherein the heat map is based on data currently being sensed. 15. The method of clause 13, wherein the heat map is based on data from prior failure data. 16. The method of clause 13, wherein the heat map is based on changes in data from an earlier period that suggest an increased likelihood of machine failure. 17. The method of clause 13, wherein the heat map is based on a preventive maintenance plan and a record of preventive maintenance in the industrial environment. 18. The method of clause 13, wherein the heat map represents an actual failure rate versus a reference failure rate. 19. The method of clause 18, wherein the reference failure rate is an industry average failure rate. 20. The method of clause 18, wherein the reference failure rate is a manufacturer's failure rate estimate.

In embodiments, a system for data collection and visualization thereof in an industrial environment may include an augmented reality and/or virtual reality (AR/VR) display in which data values output by sensors disposed in a field of view in the AR/VR display are displayed with visual attributes that indicate a degree of compliance of the data to an acceptable range or values for the sensed data. In embodiments, the visual attributes may provide near real-time portrayal of trends of the sensed data and/or of derivatives thereof. In embodiments, the visual attributes may be the actual data being captured, or the derived data, such as a trend of the data and the like.

In embodiments, a system for data collection and visualization thereof in an industrial environment may include an AR/VR display in which trends of data values output by sensors disposed in a field of view in the AR/VR are displayed with visual attributes that indicate a degree of severity of the trend. In embodiments, other data or analysis that could be displayed may include: data from sensors that exceed an acceptable range, data from sensors that are part of a smart band selected by the user, data from sensors that are monitored for triggering a smart band collection action, data from sensors that sense an aspect of the environment that meets preventive maintenance criteria, such as a PM action is upcoming soon, a PM action was recently performed or is overdue for PM. Other data for such AR/VR visualization may include data from sensors for which an acceptable range has recently been changed, expanded, narrowed and the like. Other data for such AR/VR visualization that may be particularly useful for an operator of an industrial machine (digging, drilling, and the like) may include analysis of data from sensors, such as for example impact on an operating element (torque, force, strain, and the like).

In embodiments, a system for data collection and visualization thereof in an industrial environment that may include presentation of visual attributes that represent collected data in an AR/VR environment may do so for pumps in a mining application. Mining application pumps may provide water and remove liquefied waste from a mining site. Pump performance may be monitored by sensors detecting pump motors, regulators, flow meters, and the like. Pump performance monitoring data may be collected and presented as a set of visual attributes in an augmented reality display. In an example, pump motor power consumption, efficiency, and the like may be displayed proximal to a pump viewed through an augmented reality display.

In embodiments, a system for data collection and visualization thereof in an industrial environment that may include presentation of visual attributes that represent collected data in an AR/VR environment may do so for energy storage in a power generation application. Power generation energy storage may be monitored with sensors that capture data related to storage and use of stored energy. Information such as utilization of individual energy storage cells, energy storage rate (e.g., battery charging and the like), stored energy consumption rate (e.g., KWH being supplied by an energy storage system), storage cell status, and the like may be captured and converted into augmented reality viewable attributes that may be presented in an augmented reality view of an energy storage system.

In embodiments, a system for data collection and visualization thereof in an industrial environment that may include presentation of visual attributes that represent collected data in an AR/VR environment may do so for feed water systems in a power generation application. Sensors may be disposed in an industrial environment, such as power generation for collecting data about feed water systems. Data from those sensors may be captured and processed by the system for data collection. Results of this processing may include trends of the data, such as feed water cooling rates, flow rates, pressure and the like. These trends may be presented on an augmented reality view of a feed water system by applying a map of sensors with physical elements visible in the view and then retrieving data from the mapped sensors. The retrieved data (and derivatives thereof) may be presented in the augmented reality view of the feed water system.

Figure 122:
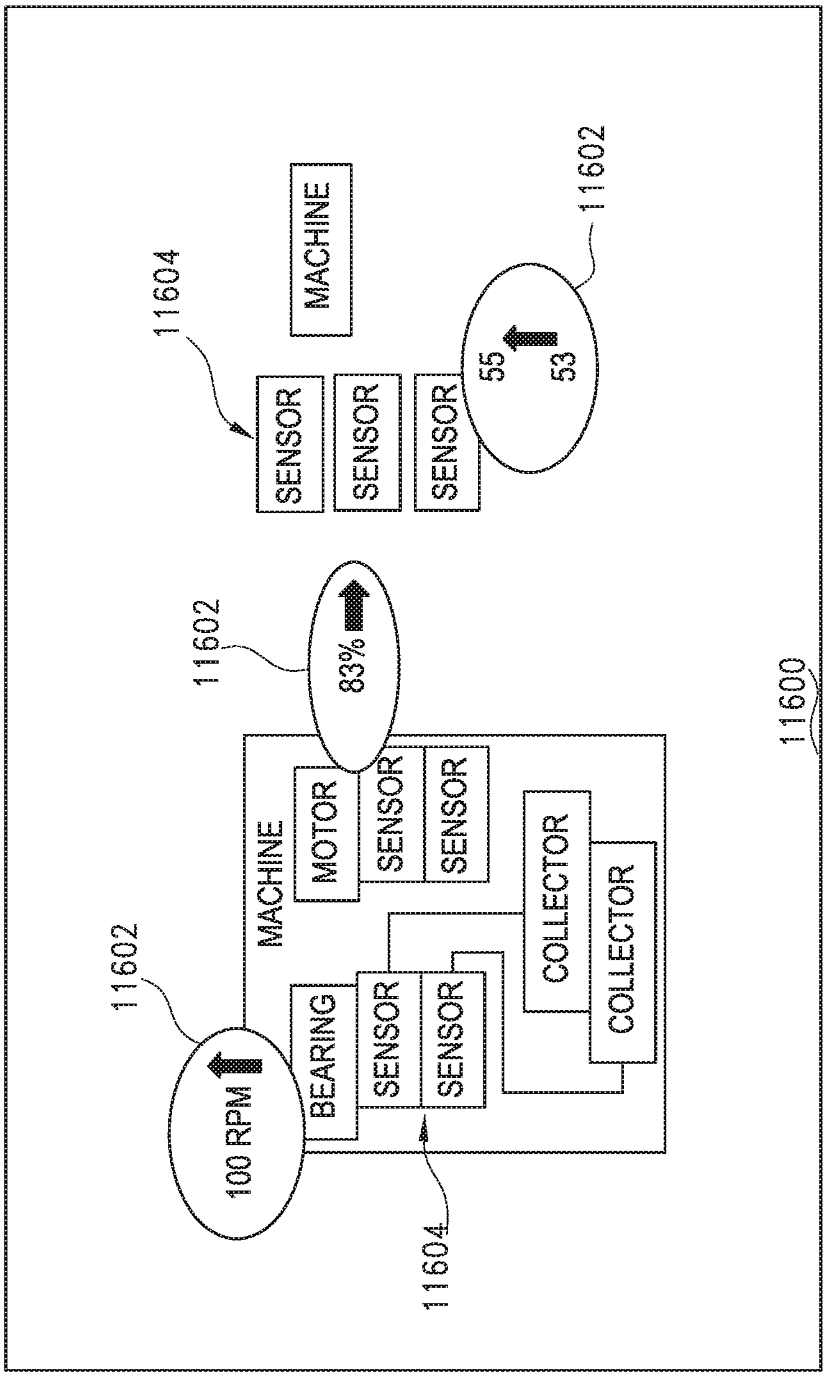
FIG. 122 is a diagrammatic view that depicts an augmented reality display including real time data overlaying a view of an industrial environment in accordance with the present disclosure.
Figure 123:
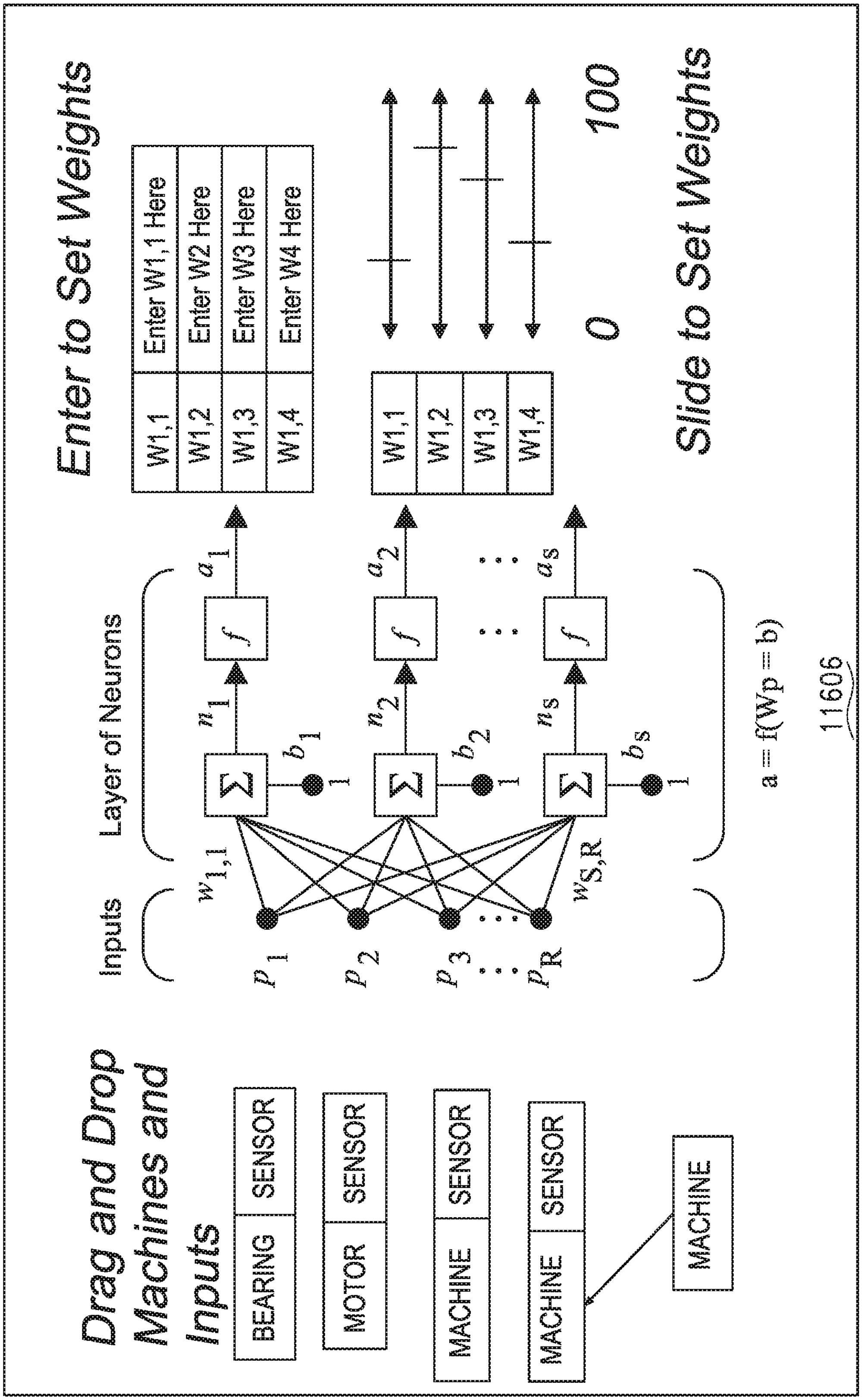
FIG. 123 is a diagrammatic view that depicts a user interface display and components of a neural net in a graphical user interface in accordance with the present disclosure.

Referring to FIG. 122, an augmented reality display 11600 comprising real time data 11602 overlaying a view of an industrial environment is depicted. Sensors 11604 in the environment may be recognized by the augmented reality system, such as by first detecting an industrial machine, system, or part thereof with which the sensors are associated. Data from the sensors 11604 may be retrieved from a data repository, processed into trends, and presented in the augmented reality view 11600 proximal to the sensors from which the data originates Clause 1 In embodiments, a system for data collection and visualization thereof in an industrial environment in which data values output by sensors disposed in a field of view in an electronic display are displayed in the electronic display with visual attributes that indicate a degree of compliance of the data to an acceptable range or values for the sensed data. 2. The system of clause 1, wherein the view in the electronic display is a view in an augmented reality display of the industrial environment. 3. The system of clause 1, wherein the visual attributes are indicative of a trend of the sensed data over time relative to the acceptable range. 4. The system of clause 1, wherein the data values are disposed in the electronic display proximal to the sensors from which the data values are output. 5. The system of clause 1, wherein the visual attributes further comprise an indication of a smart band set of sensors associated with the sensor from which the data values are output. 6. A system for data collection and visualization thereof in an industrial environment in which data values output by select sensors disposed in an augmented reality view of the industrial environment are displayed with visual attributes that indicate a degree of compliance of the data to an acceptable range or values for the sensed data. 7. The system of clause 6, wherein the sensors are selected based on a data collection template that facilitates configuring sensor data routing resources in the system. 8. The system of clause 7, wherein the select sensors are indicated in the template as part of a group of smart band sensors. 9. The system of clause 7, wherein the select sensors are sensors that are monitored for triggering a smart band data collection action. 10. The system of clause 6, wherein the select sensors are sensors that sense an aspect of the environment associated with preventive maintenance criteria. 11. The system of clause 6, wherein the visual attributes further indicate if the acceptable range has been expanded or narrowed within the past 72 hours. 12. A system for data collection and visualization thereof in an industrial environment in which trends of data values output by select sensors disposed in a field of view of the industrial environment depicted in an augmented reality display are displayed with visual attributes that indicate a degree of severity of the trend. 13. The system of clause 12, wherein sensors are selected when data from the sensors exceed an acceptable range of values. 14. The system of clause 14, wherein sensors are selected based on the sensors being part of a smart band group of sensors. 15. The system of clause 12, wherein the visual attributes further indicate a compliance of the trend with an acceptable range of data values. 16. The system of clause 12, wherein the system for data collection is adapted to route data from the select sensors to a controller of the augmented reality display based on a data collection template that facilitates configuring routing resources of the system for data collection. 17. The system of clause 12, wherein the sensors are selected in response to the sensor data being configured in a smart band data collection template as an indication for triggering a smart band data collection action. 18. The system of clause 12, wherein the sensors are selected in response to preventive maintenance criteria. 19. The system of clause 18, wherein the preventive maintenance criteria are selected from the list consisting of a preventive maintenance action is scheduled, a preventive maintenance action has been completed in the last 72 hours, a preventive maintenance action is overdue.

Figure 124:
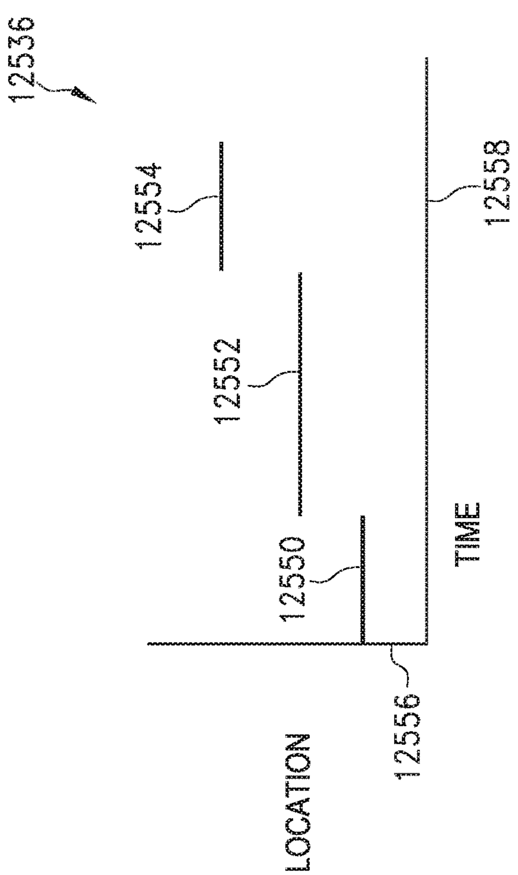
FIG. 124 is a diagrammatic view that depicts embodiments of a storage time definition in accordance with the present disclosure.

Referencing FIG. 124, an example storage time definition 12536 is depicted. The example storage time definition 12536 depicts a number of storage locations 12556 corresponding to a number of time values 12558. It is understood that any values such as storage types, storage media, storage access, storage protocols, storage writing values, storage security, and/or storage backup values, may be included in the storage time definition 12536. Additionally or alternatively, an example storage time definition 12536 may include process operations, events, and/or other values in addition to or as an alternative to time values 12558. The example storage time definition 12536 depicts movement of related sensor data to a first storage location 12550 over a first time interval, to a second storage location 12552 over a second time internal, and to a third storage location 12554 over a third time interval. The storage location values 12550, 12552, 12554 are depicted as an integral selection corresponding to planned storage locations, but additionally or alternatively the values may be continuous or discrete, but not necessarily integral values. For example, a storage location value 12550 of "1" may be associated with a first storage location, and a storage location value 12550 of "2" may be associated with a second storage location, where a value between "1" and "2" has an understood meaning—such as a prioritization to move the data (e.g., a "1.1" indicates that the data should be moved from "2" to "1" with a relatively high priority compared to a "1.4"), a percentage of the data to be moved (e.g., to control network utilization, memory utilization, or the like during a transfer operation), and/or a preference for a storage location with alternative options (e.g., to allow for directing storage location, and inclusion in a cost function such that storage location can be balanced with other constraints in the system). Additionally or alternatively, the storage time definition 12536 can include additional dimensions (e.g., changing protocols, media, security plans, etc.) and/or can include multiple options for the storage plan (e.g., providing a weighted value between 2, 3, 4, or more storage locations, protocols, media, etc. in a triangulated or multiple-dimension definition space).

Figure 125:
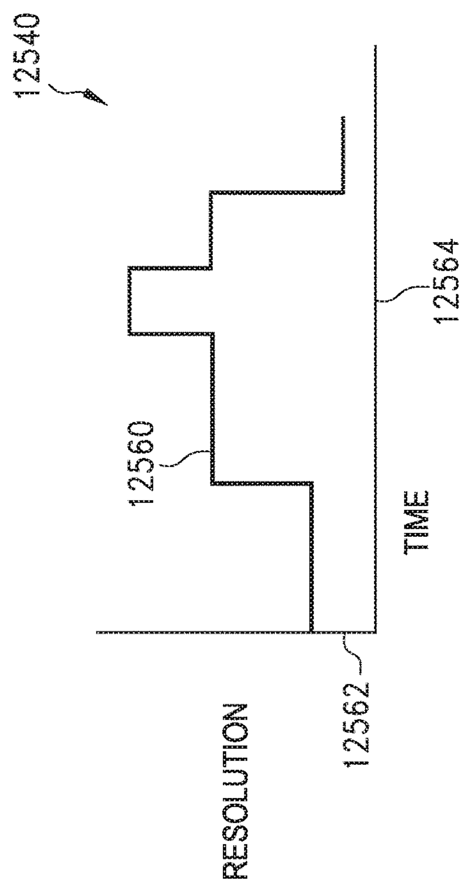
FIG. 125 is a diagrammatic view that depicts embodiments of a data resolution description in accordance with the present disclosure.

Referencing FIG. 125 an example data resolution description 12540 is depicted. The example data resolution description 12540 depicts a number of data resolution values 12562 corresponding to a number of time values 12564. It is understood that any values such as storage types, storage media, storage access, storage protocols, storage writing values, storage security, and/or storage backup values, may be included in the data resolution description 12540. Additionally or alternatively, an example data resolution description 12540 may include process operations, events, and/or other values in addition to or as an alternative to time values 12558. The example data resolution description 12540 depicts changes in the resolution of stored related sensor data resolution values 12560 over time intervals, for example operating at a low resolution initially, stepping up to a higher resolution (e.g., corresponding to a process start time), to a high resolution value (e.g., during a process time where the process is significantly improved by high resolution of the related sensor data), and to a low resolution value (e.g., after a completion of the process). The example depicts a higher resolution before the process starts than after the process ends as an illustrative example, but the data resolution description 12540 may include any data resolution trajectory. The data resolution values 12560 are depicted as integral selections corresponding to planned data resolutions, but additionally or alternatively the values may be continuous or discrete, but not necessarily integral values. For example, data resolution values 12560 of "1" may be associated with a first data resolution (e.g., a specific sampling time, byte resolution, etc.), and a data resolution values 12560 of "2" may be associated with a second data resolution, where a value between "1" and "2" has an understood meaning—such as a prioritization to sample at the defined resolution (e.g., a "1.1" indicates the data should be taken at a sampling rate corresponding to "1" with a relatively high priority compared to a "1.3", and/or at a sampling rate 10% of the way between the rate between "1" and "2"), and/or a preference for a data resolution with alternative options (e.g., to allow for sensor or network limitations, available sensor communication devices such as a data controller, smart sensor, or portable device taking the data from the sensor, and/or inclusion in a cost function such that data resolution can be balanced with other constraints in the system). Additionally or alternatively, the data resolution description 12540 can include additional dimensions (e.g., changing protocols, media, security plans, etc.) and/or can include multiple options for the data resolution plan (e.g., providing a weighted value between 2, 3, 4, or more data resolution values, protocols, media, etc. in a triangulated or multiple-dimension definition space).

As described herein and in Appendix B attached hereto, intelligent industrial equipment and systems may be configured in various networks, including self-forming networks, private networks, Internet-based networks, and the like. One or more of the smart heating systems as described in Appendix B that may incorporate hydrogen production, storage, and use may be configured as nodes in such a network. In embodiments, a smart heating system may be configured with one or more network ports, such as a wireless network port that facilitate connection through Wi-Fi and other wired and/or wireless communication protocols as described. The smart heating system includes a smart hydrogen production system and a smart hydrogen storage system, and the like described in Appendix B and may be configured individually or as an integral system connected as one or more nodes in a network of industrial equipment and systems. By way of this example, a smart heating system may be disposed in an on-site industrial equipment operations center, such as a portable trailer equipped with communication capabilities and the like. Such deployed smart heating system may be configured, manually, automatically, or semi-automatically to join a network of devices, such as industrial data collection, control, and monitoring nodes and participate in network management, communication, data collection, data monitoring, control, and the like.

In another example of a smart heating system participating in a network of industrial equipment monitoring, control, and data collection devices in that a plurality of the smart heating systems may be configured into a smart heating system sub-network. In embodiments, data generated by the sub-network of devices may be communicated over the network of industrial equipment using the methods and systems described herein.

Figure 126:
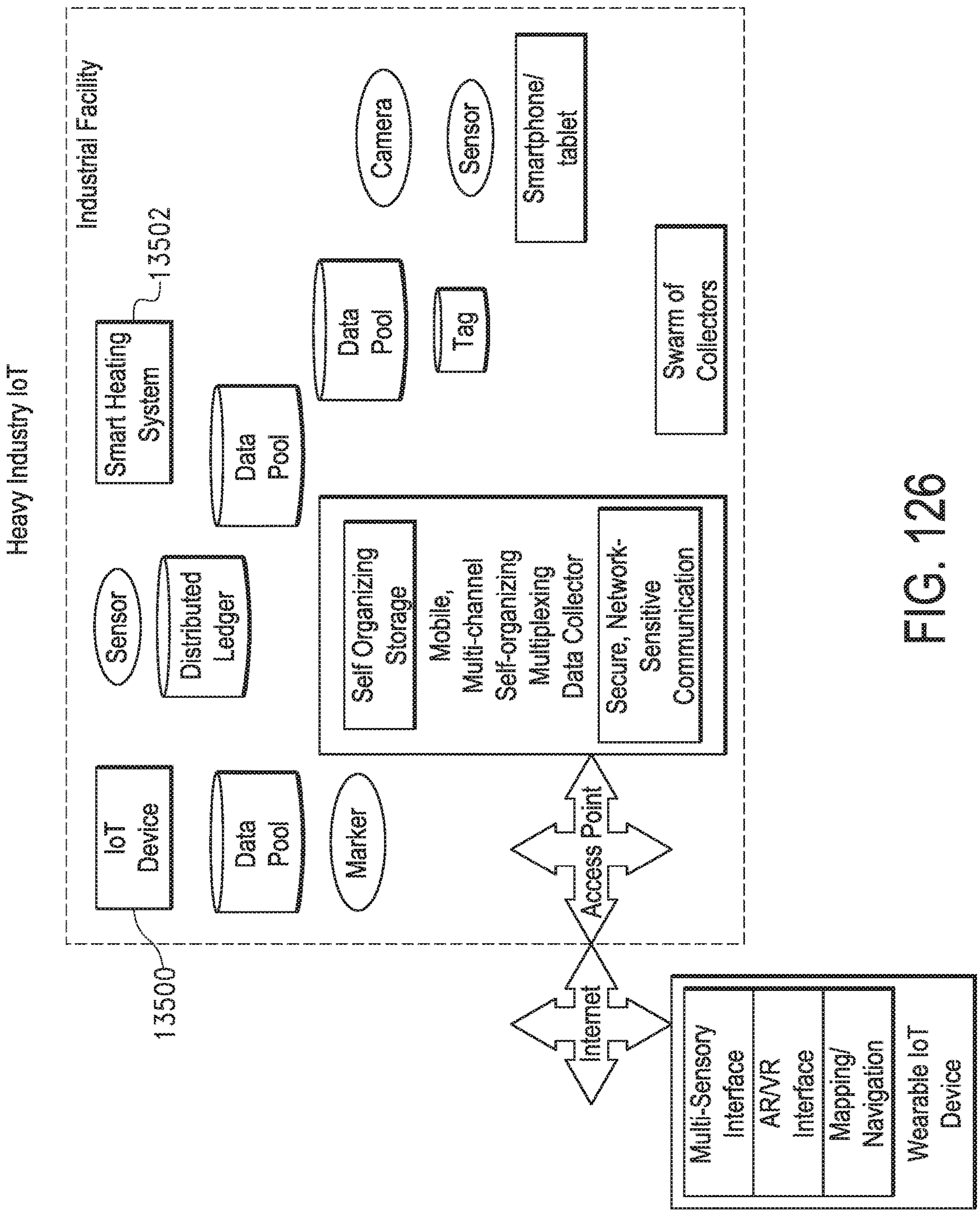
FIG. 126 is a diagrammatic view that depicts a smart heating system as an element in a network for in an industrial Internet of Things ecosystem in accordance with the present disclosure.

In embodiments, the smart heating system may participate in a network of industrial equipment as described herein. By way of this example, one or more of the smart heating systems, as depicted in FIG. 126, may be configured as an IoT device, such as IoT device 13500 and the like described herein. In embodiments, the smart heating system 13502 may communicate through an access point, over a mobile ad hoc network or mechanism for connectivity described herein for devices and systems elements and/or through network elements described herein.

In embodiments, one or more smart heating systems described in Appendix B may incorporate, integrate, use, or connect with facilities, platforms, modules, and the like that may enable the smart heating system to perform functions such as analytics, self-organizing storage, data collection and the like that may improve data collection, deploy increased intelligence, and the like. Various data analysis techniques, such as machine pattern recognition of data, collection, generation, storage, and communication of fusion data from analog industrial sensors, multi-sensor data collection and multiplexing, self-organizing data pools, self-organizing swarm of industrial data collectors, and others described herein may be embodied in, enabled by, used in combination with, and derived from data collected by one or more of the smart heating systems.

In embodiments, a smart heating system may be configured with local data collection capabilities for obtaining long blocks of data (i.e., long duration of data acquisition), such as from a plurality of sensors, at a single relatively high-sampling rate as opposed to multiple sets of data taken at different sampling rates. By way of this example, the local data collection capabilities may include planning data acquisition routes based on historical templates and the like. In embodiments, the local data collection capabilities may include managing data collection bands, such as bands that define a specific frequency band and at least one of a group of spectral peaks, true-peak level, crest factor and the like.

In embodiments, one or more smart heating systems may participate as a self-organizing swarm of IoT devices that may facilitate industrial data collection. The smart heating systems may organize with other smart heating systems, IoT devices, industrial data collectors, and the like to organize among themselves to optimize data collection based on the capabilities and conditions of the smart heating system and needs to sense, record, and acquire information from and around the smart heating systems. In embodiments, one or more smart heating systems may be configured with processing intelligence and capabilities that may facilitate coordinating with other members, devices, or the like of the swarm. In embodiments, a smart heating system member of the swarm may track information about what other smart heating systems in a swarm are handling and collecting to facilitate allocating data collection activities, data storage, data processing and data publishing among the swarm members.

In embodiments, a plurality of smart heating systems may be configured with distinct burners but may share a common hydrogen production system and/or a common hydrogen storage system. In embodiments, the plurality of smart heating systems may coordinate data collection associated with the common hydrogen production and/or storage systems so that data collection is not unnecessarily duplicated by multiple smart heating systems. In embodiments, a smart heating system that may be consuming hydrogen may perform the hydrogen production and/or storage data collection so that as smart heating system may prepare to consume hydrogen, they coordinate with other smart heating systems to ensure that their consumption is tracked, even if another smart heating system performs the data collection, handling, and the like. In embodiments, smart heating systems in a swarm may communicate among each other to determine which smart heating system will perform hydrogen consumption data collection and processing when each smart heating system prepares to stop consumption of hydrogen, such as when heating, cooking, or other use of the heat is nearing completion and the like. By way of this example when a plurality of smart heating systems is actively consuming hydrogen, data collection may be performed by a first smart heating system, data analytics may be performed by a second smart heating system, and data analytics recording or reporting may be performed by a third smart heating system. By allocating certain data collection, processing, storage, and reporting functions to different smart heating systems, certain smart heating systems with sufficient storage, processing bandwidth, communication bandwidth, available energy supply and the like may be allocated an appropriate role. When a smart heating system is nearing an end of its heating time, cooking time, or the like, it may signal to the swarm that it will be going into power conservation mode soon and, therefore, it may not be allocated to perform data analysis or the like that would need to be interrupted by the power conservation mode.

In embodiments, another benefit of using a swarm of smart heating systems as disclosed herein is that data storage capabilities of the swarm may be utilized to store more information than could be stored on a single smart heating system by sharing the role of storing data for the swarm.

In embodiments, the self-organizing swarm of smart heating systems includes one of the systems being designated as a master swarm participant that may facilitate decision making regarding the allocation of resources of the individual smart heating systems in the swarm for data collection, processing, storage, reporting and the like activities.

In embodiments, the methods and systems of self-organizing swarm of industrial data collectors may include a plurality of additional functions, capabilities, features, operating modes, and the like described herein. In embodiments, a smart heating system may be configured to perform any or all of these additional features, capabilities, functions, and the like without limitation.

The terms "a" or "an," as used herein, are defined as one or more than one. The term "another," as used herein, is defined as at least a second or more. The terms "including" and/or "having," as used herein, are defined as comprising (i.e., open transition).

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platform. A processor may be any kind of computational or processing device capable of executing program instructions, codes, binary instructions, and the like. The processor may be or may include a signal processor, digital processor, embedded processor, microprocessor, or any variant such as a co-processor (math co-processor, graphic co-processor, communication co-processor, and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions, and the like described herein may be implemented in one or more thread. The thread may spawn other threads that may have assigned priorities associated with them; the processor may execute these threads based on priority or any other order based on instructions provided in the program code. The processor, or any machine utilizing one, may include non-transitory memory that stores methods, codes, instructions, and programs as described herein and elsewhere. The processor may access a non-transitory storage medium through an interface that may store methods, codes, and instructions as described herein and elsewhere. The storage medium associated with the processor for storing methods, programs, codes, program instructions, or other type of instructions capable of being executed by the computing or processing device may include but may not be limited to one or more of a CD-ROM, DVD, memory, hard disk, flash drive, RAM, ROM, cache, and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server, cloud server, and other variants such as secondary server, host server, distributed server, and the like. The server may include one or more of memories, processors, computer readable transitory and/or non-transitory media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more locations without deviating from the scope of the disclosure. In addition, any of the devices attached to the server through an interface may include at least one storage medium capable of storing methods, programs, code, and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client, and other variants such as secondary client, host client, distributed client, and the like. The client may include one or more of memories, processors, computer readable transitory and/or non-transitory media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers, and the like. Additionally, this coupling and/or connection may facilitate remote execution of a program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code, and/or instructions. A central repository may provide program instructions to be executed on different devices. In this implementation, the remote repository may act as a storage medium for program code, instructions, and programs.

Various embodiments described in this document relate to communication protocols that improve aspects of communication between nodes on a data network. These aspects include, for instance, average, worst case, or variability in communication delay, channel utilization, and/or error rate. These embodiments are primarily described in the context of packet switched networks, and more particularly in the context of Internet Protocol (IP) based packet switched networks. However, it should be understood that at least some of the embodiments are more generally applicable to data communication that does not use packet switching or IP, for instance based on circuit-switched of other forms of data networks.

Furthermore, various embodiments are described in the context of data being sent from a “server” to a “client.” It should be understood that these terms are used very broadly, roughly analogous to “data source” and “data destination”. Furthermore, in at least some applications of the techniques, the nodes are peers, and may alternate roles as “server” and “client” or may have both roles (i.e., as data source and data destination) concurrently. However, for the sake of exposition, examples where there is a predominant direction of data flow from a “server” node to a “client” node are described with the understanding that the techniques described in these examples are applicable to many other situations.

One example for a client-server application involves a server passing multimedia (e.g., video and audio) data, either recorded or live, to a client for presentation to a user. Improved aspects of communication from the client to the server in such an example can reduced communication delay, for instance providing faster startup, reduced instances of interrupted playback, reduced instances of bandwidth reduction, and/or increased quality by more efficient channel utilization (e.g., by avoiding use of link capacity in retransmissions or unnecessary forward error correction). This example is useful for exposition of a number of embodiments. However, it must be recognized that this is merely one of many possible uses of the approached described below.

Figure 127:
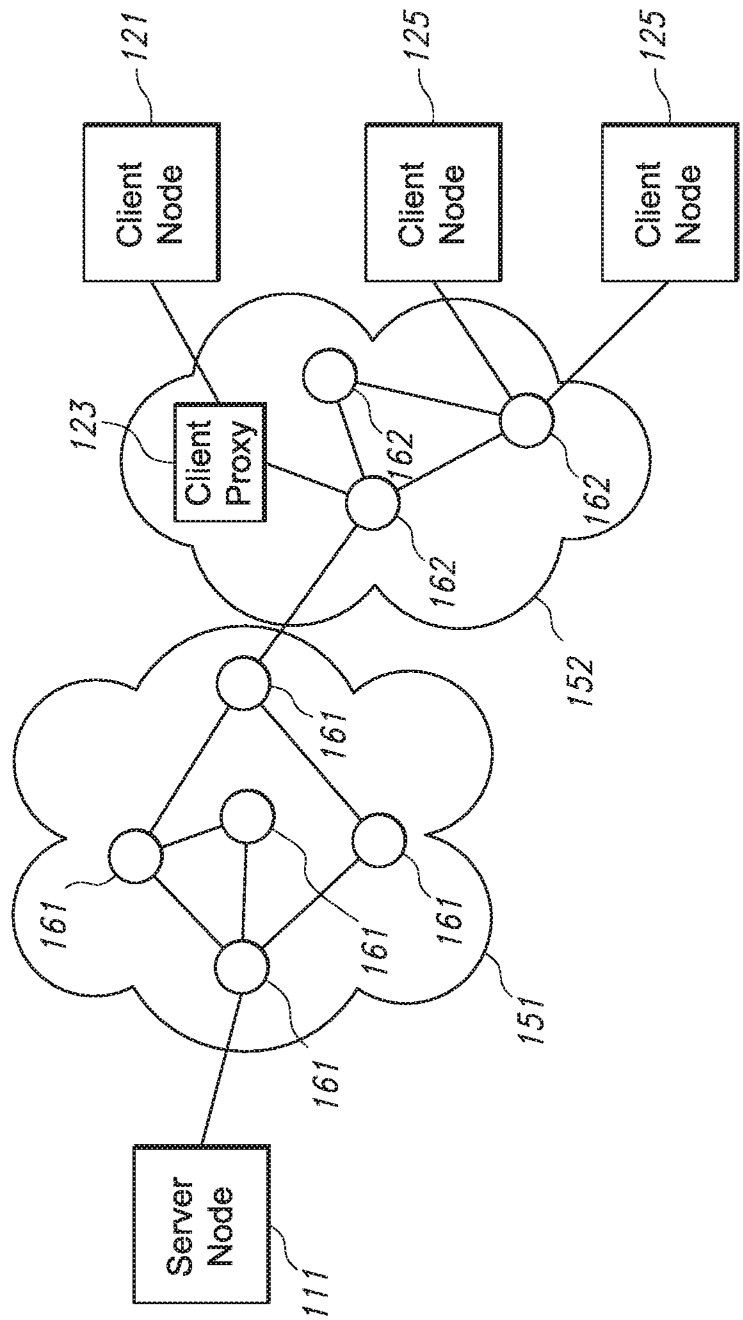
FIG. 127 is a schematic of a data network including server and client nodes coupled by intermediate networks.

FIG. 127 shows a high-level block diagram of some components that may be interconnected on a portion of a data network. A general example of a communication connection or session arranged on today's Internet may be represented as a client node 125 (e.g., a client computer) communicating with a server node 111 (e.g., a server computer) over one network or an interconnection of multiple networks 151-152. For example, the client and server nodes may communicate over the public Internet using the Internet Protocol (IP). FIG. 127 additionally shows a number of nodes 161, 162 positioned on the respective networks 151, 152, and a client proxy 123 on one of the networks 152.

Figure 128:
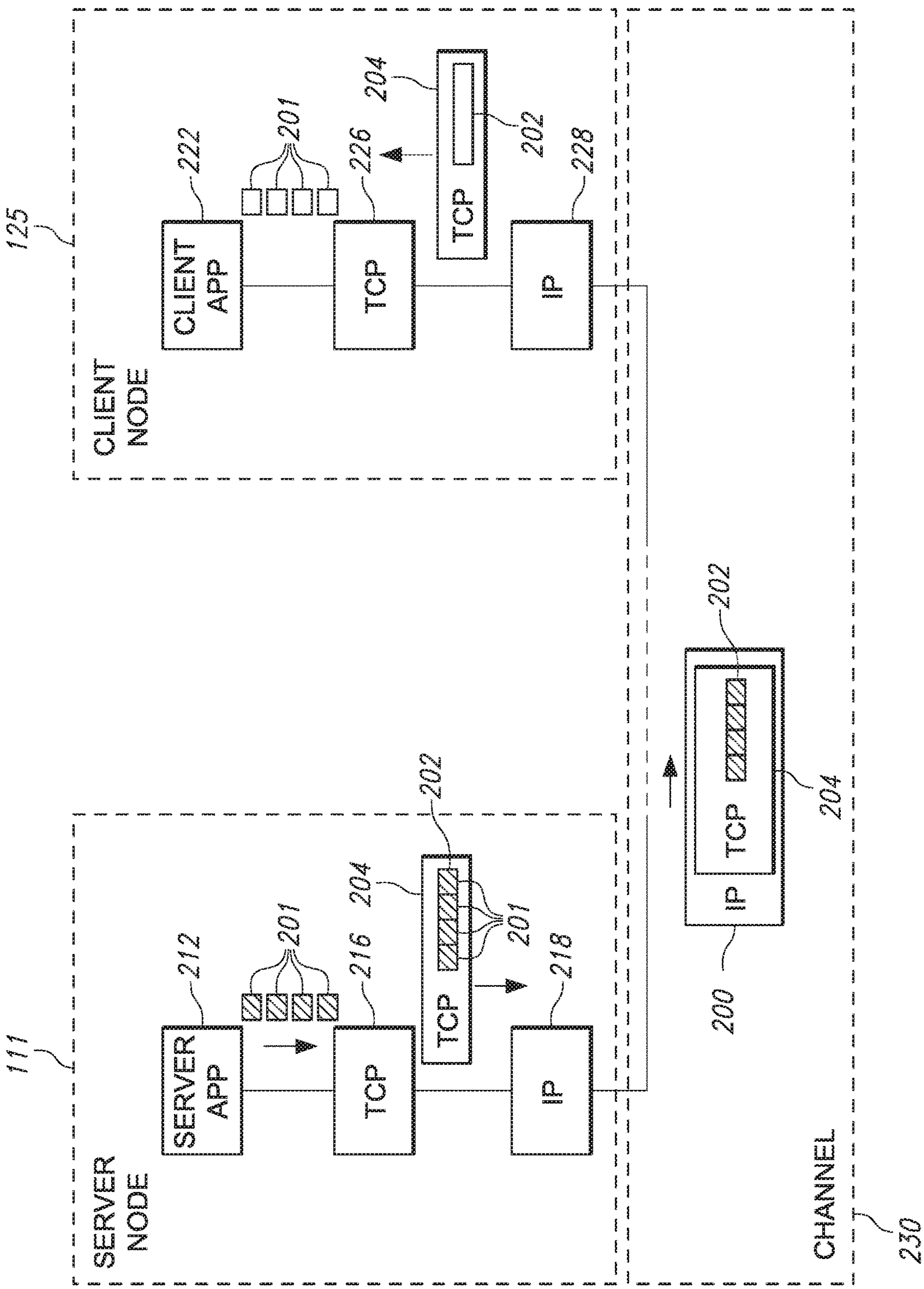
FIG. 128 is a block diagram illustrating the modules that implement TCP-based communication between a client node and a server node.

Referring to FIG. 128, in an example involving conventional communication techniques, a client node 125 hosts a client application 222, which communicates with a TCP module 226 that implements a Transmission Control Protocol (TCP). The TCP module 226 communicates with an IP module 228 that implements an Internet Protocol for communicating between nodes on the interconnection of networks. The communication passes between nodes of the networks over a channel 230 (i.e., an abstraction of the path comprising physical links between equipment interconnecting the nodes of the network). Similarly, the server node 111 hosts a server application 212, a TCP module 216, and an IP module 218. When the server application 111 and the client application 222 communicate, for example, with data being passed from the server application to the client application, TCP module 216 at the server node 111 and the TCP layer 226 at the client node 125 interact to implement the two endpoints for the Transmission Control Protocol (TCP).

Generally, data units 201 (e.g., encoding of multimedia frames or other units of application data) generated by the server application 212 are passed to the TCP module 216. The TCP module assembles data payloads 202, for example, concatenating multiple data units 201 and/or by dividing data units 201 into multiple data payloads 202. In the discussion below, these payloads are referred to in some instances as the "original" or "uncoded" "packets" or original or uncoded "payloads", which are communicated to the client (i.e., destination) node in the network. Therefore, it should be understood that the word "packet" is not used with any connotation other than being a unit of communication. In the TCP embodiment illustrated in FIG. 128, each data payload 202 is "wrapped" in a TCP packet 204, which is passed to the IP module 218, which further wraps the TCP packet 204 in an IP packet 206 for transmission from the server node 111 to the client node 125, over what is considered to be a IP layer channel 230 linking the server node 111 and the client node 125. Note that at lower layers, such as at a data link layer, further wrapping, unwrapping, and/or rewrapping of the IP packet 206 may occur, however, such aspects are not illustrated in FIG. 128. Generally, each payload 202 is sent in at least one TCP packet 204 and a corresponding IP packet 206, and if not successfully received by the TCP module 226 at the client node 125, may be retransmitted again by the TCP module 216 at the server node 111 to result in successful delivery. The data payloads 202 are broken down into the data units 201 originally provided by the server application 212 and are then delivered in the same order to the client application 222 as they were provided by the server application 212.

TCP implements a variety of features, including retransmission of lost packets, maintaining order of packets, and congestion control to avoid congestion at nodes or links along the path through the network and to provide fair allocation of the limited bandwidth between and within the networks at intermediate nodes. For example, TCP implements a "window protocol" in which only a limited number (or range of sequence numbers) of packets are permitted to be transmitted for which end-to-end acknowledgments have not yet been received. Some implementations of TCP adjust the size of the window, for example, starting initially with a small window ("slow start") to avoid causing congestion. Some implementations of TCP also control a rate of transmission of packets, for example, according to the round-trip-time and the size of the window.

The description below details one or more alternatives to conventional TCP-based communication as illustrated in FIG. 128. In general, these alternatives improve one or more performance characteristics, for examples, one or more of overall throughput, delay, and jitter. In some applications, these performance characteristics are directly related to application level performance characteristics, such as image quality in a multimedia presentation application. Referring to FIG. 127, in a number of examples, these alternatives are directed to improving communication between a server node 111 and at least one client node 125. One example of such communication is streaming media from the server node 111 to the client nodes 125, however, it should be recognized that this is only one of many examples where the described alternatives can be used.

It should also be understood that the network configuration illustrated in FIG. 127 is merely representative of a variety of configurations. A number of these configurations may have paths with disparate characteristics. For example, a path from the server node 111 to a client node 125 may pass over links using different types of equipment and with very different capacities, delays, error rates, degrees of congestion etc. In many instances, it is this disparity that presents challenges to achieving end-to-end communication that achieves high rate, low delay and/or low jitter. As one example, the client node 125 may be a personal communication device on a wireless cellular network, the network 152 in FIG. 127 may be a cellular carrier's private wired network, and network 151 may be the public Internet. In another example, the client node 125 may be a "WiFi" node of a private wireless local area network (WLAN), network 152 may be a private local area network (LAN), and network 151 may be the public Internet.

A number of the alternatives to conventional TCP make use of a Packet Coding (PC) approach. Furthermore, a number of these approaches make use of Packet Coding essentially at the Transport Layer. Although different embodiments may have different features, these implementations are generically referred to below as Packet Coding Transmission Control Protocol (PC-TCP). Other embodiments are also described in which the same or similar PC approaches are used at other layers, for instance, at a data link layer (e.g., referred to as PC-DL), and therefore it should be understood that in general features described in the context of embodiments of PC-TCP may also be incorporated in PC-DL embodiments.

Before discussing particular features of PC-TCP in detail, a number of embodiments of overall system architectures are described. The later description of various embodiments of PC-TCP should be understood to be applicable to any of these system architectures, and others.

Architectures and Applications

Transport Layer Architectures

Kernel Implementation

Figure 129:
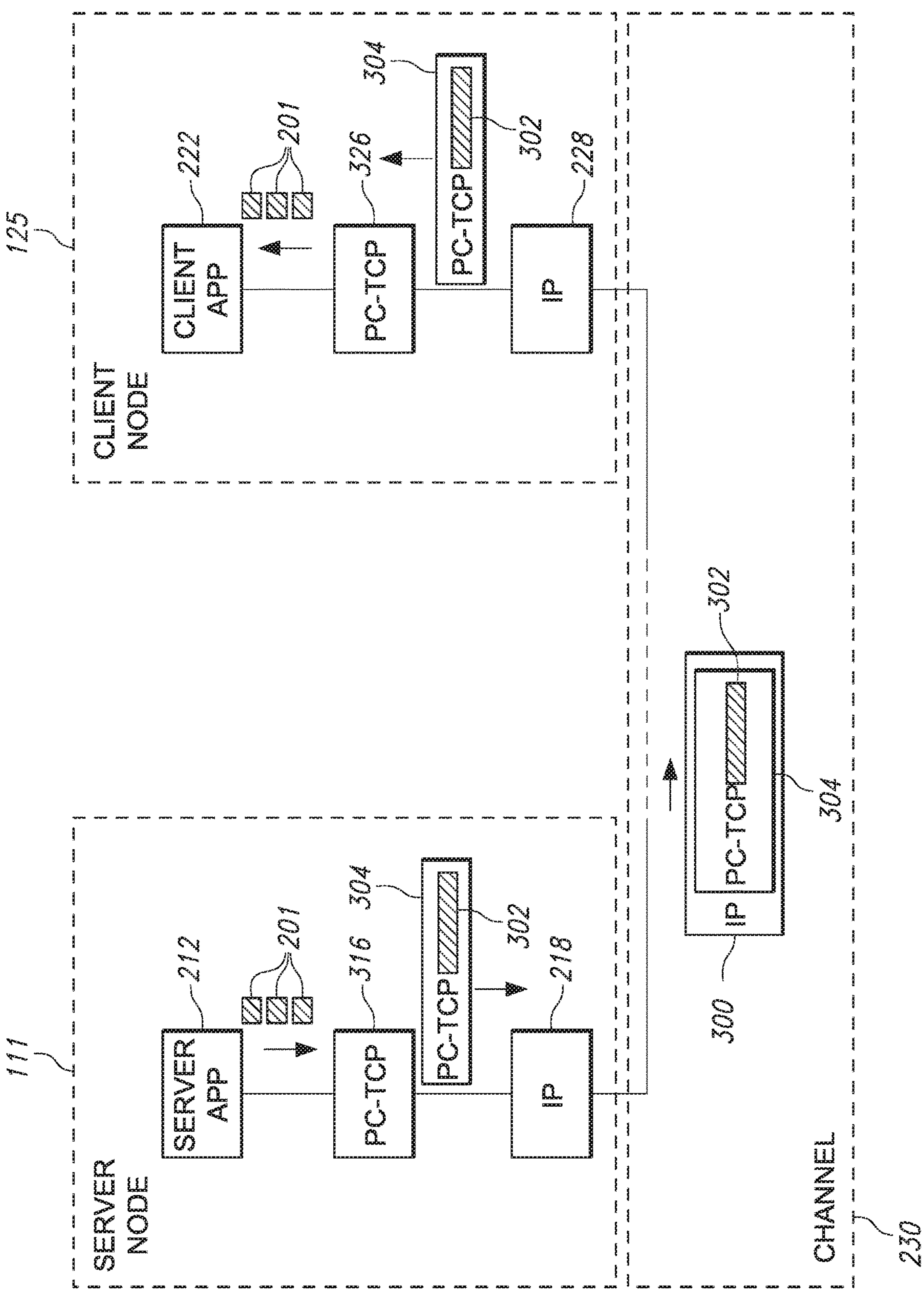
FIG. 129 is a block diagram illustrating the modules that implement Packet Coding Transmission Communication Protocol (PC-TCP) based communication between a client node and a server node.

Referring to FIG. 129, in one architecture, the TCP modules at the server node 111 and the client node 125 are replaced with PC-TCP modules 316 and 326, respectively. Very generally, the PC-TCP module 316 at the server accepts data units 201 from the server application 212 and forms original data payloads 202 (i.e., "uncoded packets", formed internally to the PC-TCP module 316 and not illustrated). Very generally, these data payloads 202 are transported to and/or reconstructed at the PC-TCP module 326 at the client node 125, where the data units 201 are extracted and delivered to the client application 222 in the same order as provided by the server application 212. As described in substantially more detail below, at least some embodiments of the PC-TCP modules make use of Random Linear Coding (RLC) for forming packets 304 for transmission from the source PC-TCP module to the destination PC-TCP module, with each packet 304 carrying a payload 302, which for at least some packets 304 is formed from a combination of multiple original payloads 202. In particular, at least some of the payloads 202 are formed as linear combinations (e.g., with randomly generated coefficients in a finite field) of original payloads 202 to implement Forward Error Correction (FEC), or as part of a retransmission or repair approach in which sufficient information is not provided using FEC to overcome loss of packets 304 on the channel 230. Furthermore, the PC-TCP modules 316 and 326 together implement congestion control and/or rate control to generally coexist in a "fair" manner with other transport protocols, notably conventional TCP.

One software implementation of the PC-TCP modules 316 or 326, is software modules that are integrated into the operating system (e.g., into the "kernel", for instance, of a Unix-based operating system) in much the same manner that a conventional TCP module is integrated into the operating system. Alternative software implementations are discussed below.

Figure 130:
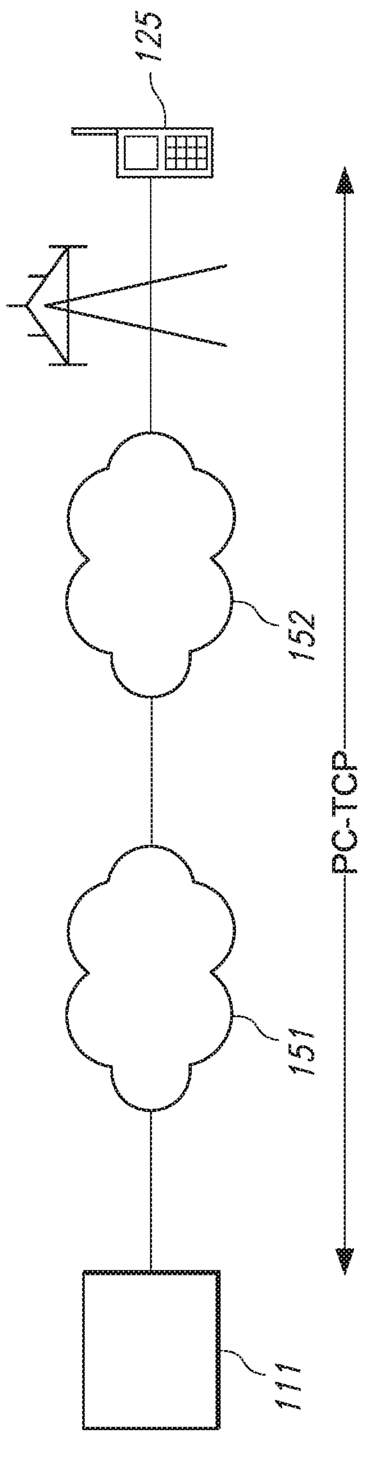
FIG. 130 is a schematic diagram of a use of the PC-TCP based communication between a server and a module device on a cellular network.

Referring to FIG. 130, in an example in which a client node 125 is a smartphone on a cellular network (e.g., on an LTE network) and a server node 111 is accessible using IP from the client node, the approach illustrated in FIG. 129 is used with one end-to-end PC-TCP session linking the client node 125 and the server node 111. The IP packets 300 carrying packets 304 of the PC-TCP session traverse the channel between the nodes using conventional approaches without requiring any non-conventional handling between the nodes at the endpoints of the session.

Alternative Software Implementations

The description above includes modules generically labeled "PC-TCP". In the description below, a number of different implementations of these modules are presented. It should be understood that, in general, any instance of a PC-TCP module may be implemented using any of the described or other approaches.

Figure 131:
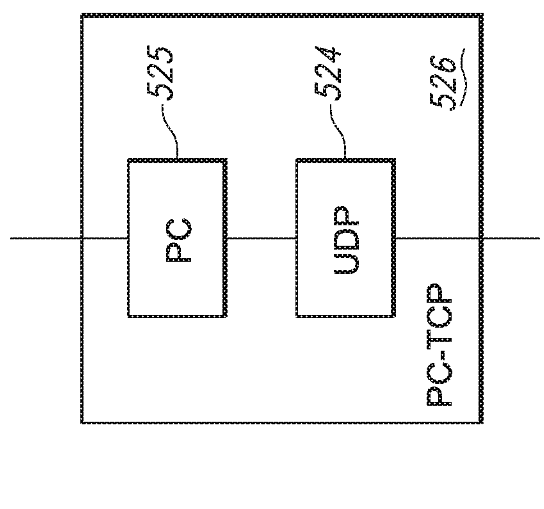
FIG. 131 is a block diagram of 1 PC-TCP module that uses a conventional UDP module.

Referring to FIG. 131, in some embodiments, the PC-TCP module 326 (or any other instance of PC-TCP module discussed in this document) is implemented as a PC-TCP module 526, which includes a Packet Coding (PC) module 525 that is coupled to (i.e., communicates with) a convention User Datagram Protocol (UDP) module 524. Essentially each PC-TCP packet described above consists of a PC packet "wrapped" in a UDP packet. The UDP module 524 then communicates via the IP modules in a conventional manner. In some implementations, the PC module 525 is implemented as a "user space" process, which communicates with a kernel space UDP module, while in other implementations, the PC module 525 is implement in kernel space.

Figure 132:
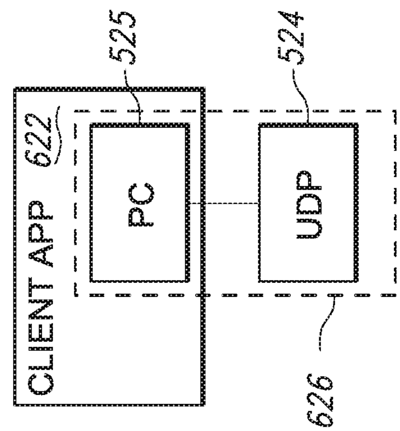
FIG. 132 is a block diagram of a PC-TCP module that is partially integrated into a client application and partially implemented using a conventional UDP module.

Referring to FIG. 132, in some embodiments, the PC module 625, or its function, is integrated into a client application 622, which then communicates directly with the conventional UDP module 524. The PC-TCP module 626 therefore effectively spans the client application 622 and the kernel implementation of the UDP module 524. While use of UDP to link the PC modules at the client and at the server has certain advantages, other protocols may be used. One advantage of UDP is that reliable transmission through use of retransmission is not part of the UDP protocol, and therefore error handling can be carried out by the PC modules.

Figure 133:
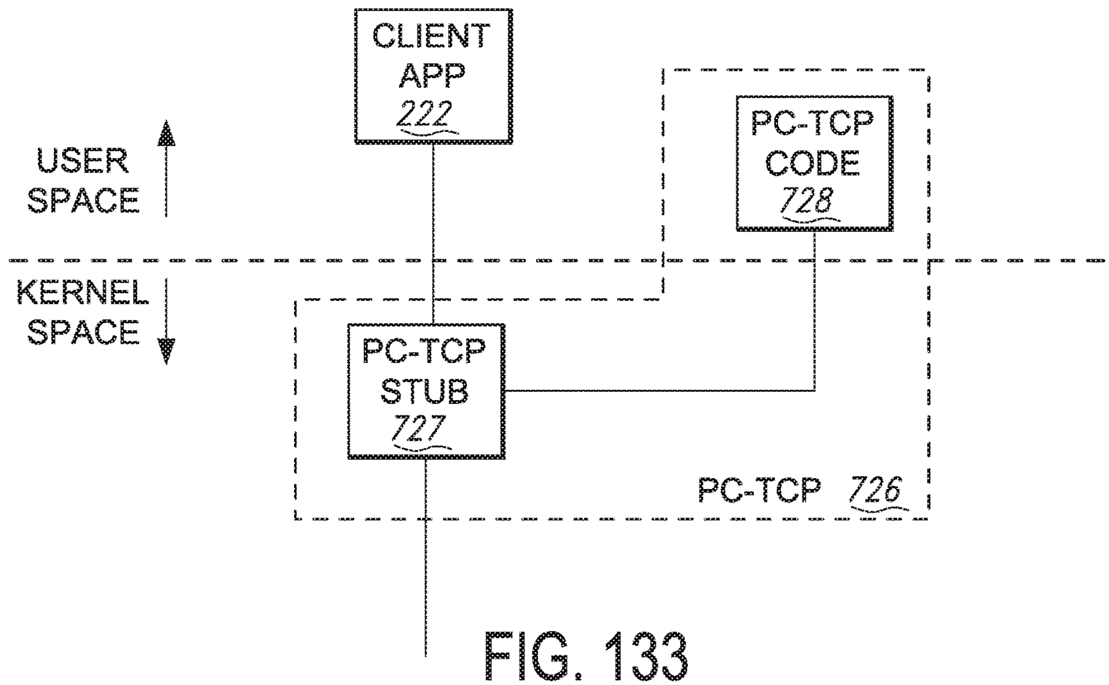
FIG. 133 is a block diagram or a PC-TCP module that is split with user space and kernel space components.

Referring to FIG. 133, in some implementations, a PC-TCP module 726 is divided into one part, referred to as a PC-TCP "stub" 727, which executes in the kernel space, and another part, referred to as the PC-TCP "code" 728, which executes in the user space of the operating system environment. The stub 727 and the code 728 communicate to provide the functionality of the PC-TCP module.

It should be understood that these software implementations are not exhaustive. Furthermore, as discussed further below, in some implementations, a PC-TCP module of any of the architectures or examples described in this document may be split among multiple hosts and/or network nodes, for example, using a proxy architecture.

Proxy Architectures

Conventional Proxy Node

Figure 134:
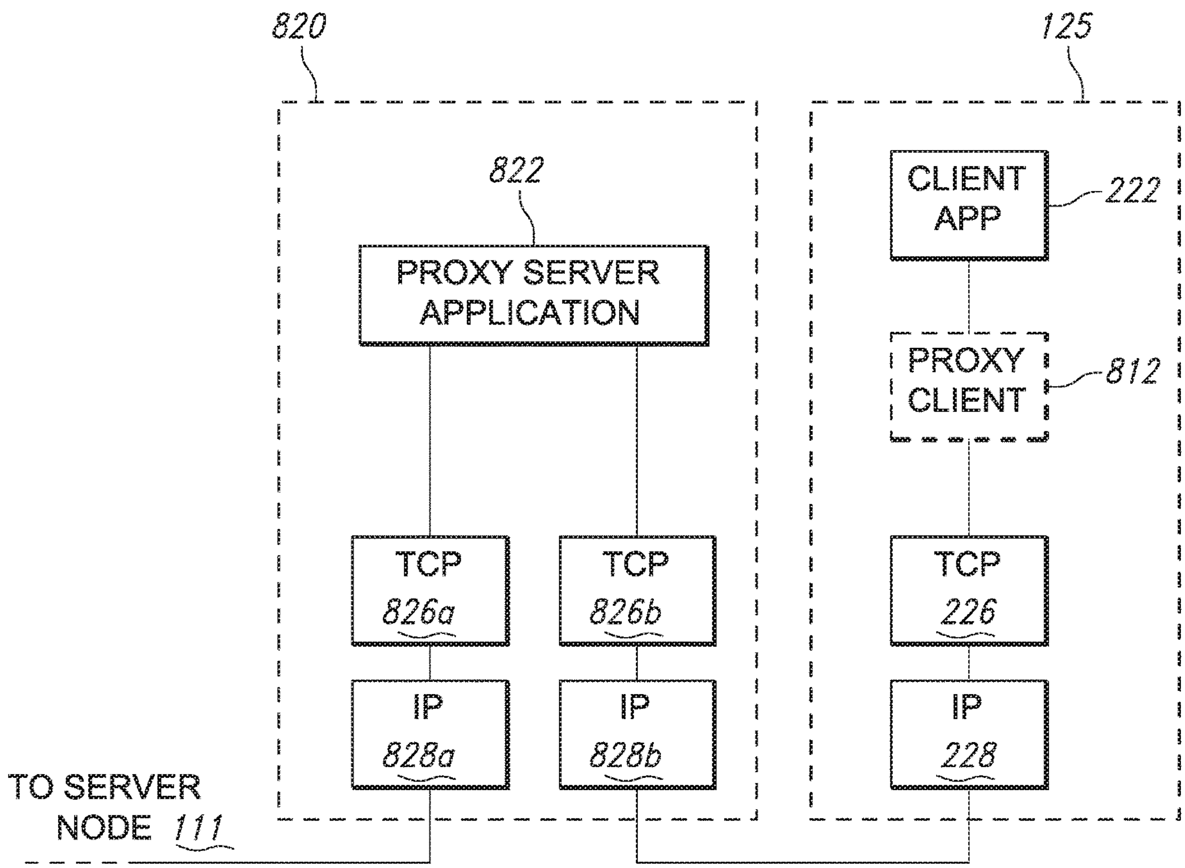
FIG. 134 is a block diagram for a proxy architecture.

Referring to FIG. 134, certain conventional communication architectures make use of proxy servers on the communication path between a client node 125 and a server node 111. For example, a proxy node 820 hosts a proxy server application 822. The client application 222 communicates with the proxy server application 822, which acts as an intermediary in communication with the server application 212 (not shown in FIG. 134). It should be understood that a variety of approaches to implementing such a proxy are known. In some implementations, the proxy application is inserted on the path without the client node necessarily being aware. In some implementations, a proxy client 812 is used at the client node, in some cases forming a software "shim" between the application layer and the transport layer of the software executing at the client node, with the proxy client 812 passing communication to the proxy server application. In a number of proxy approaches, the client application 222 is aware that the proxy is used, and the proxy explicitly acts as an intermediary in the communication with the server application. A particular example of such an approach makes use of the SOCKS protocol, in which the SOCKS proxy client application (i.e., an example of the proxy client 812) communicates with a SOCKS proxy server application (i.e., an example of the proxy server application 822). The client and server may communicate over TCP/IP (e.g., via TCP and IP modules 826*b* and 828*b*, which may be implemented together in one TCP module), and the SOCKS proxy server application fulfills communication requests (i.e., with the server application) on behalf of the client application (e.g., via TCP and IP modules 826*a* and 828*a*). Note that the proxy server application may also perform functions other than forwarding communication, for example, providing a cache of data that can be used to fulfill requests from the client application.

First Alternative Proxy Node

Figure 135:
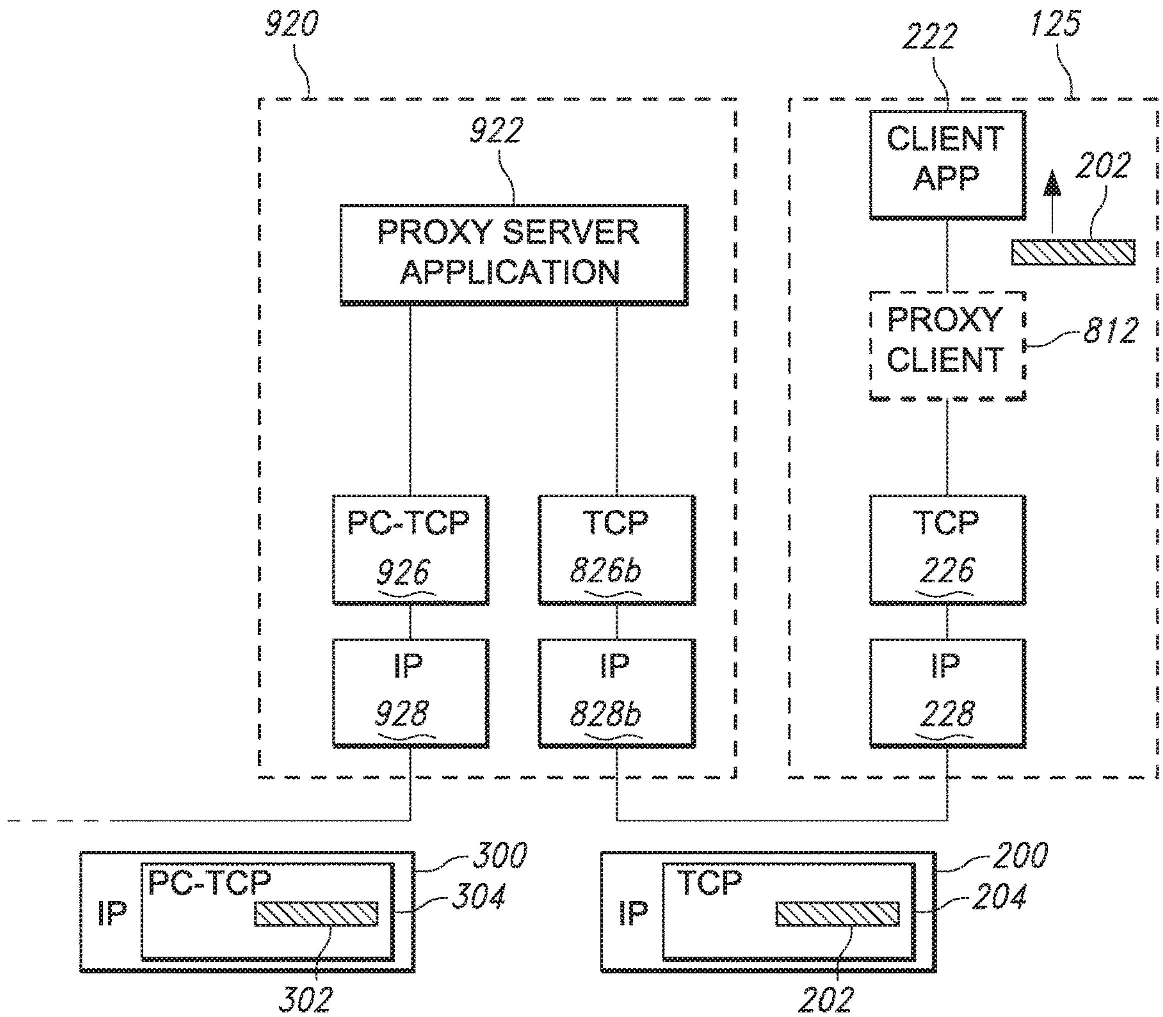
FIG. 135 is a block diagram of a PC-TCP based proxy architecture in which a proxy node communicates using both PC-TCP and conventional TCP.

Referring to FIG. 135, in an alternative proxy architecture, a proxy node 920 hosts a proxy server application 922, which is similar to the proxy server application 822 of FIG. 134. The client application 222 communicates with the proxy server application 922, for example as illustrated using conventional TCP/IP, and in some embodiments using a proxy client 812 (e.g., as SOCKS proxy client), executing at the client node 125. As illustrated in FIG. 135, the proxy server application 922 communicates with a server application using a PC-TCP module 926, which is essentially the same as the PC-TCP module 326 shown in FIG. 129 for communicating with the PC-TCP module 316 at the server node 111.

In some embodiments, the communication architecture of FIG. 135 and the conventional communication architecture of FIG. 128 may coexist in the communication between the client application and the server application may use PC-TCP, conventional TCP, or concurrently use both PC-TCP and TCP. The communication approach may be based on a configuration of the client application and/or based on dialog between the client and server applications in establishing communication between them.

Figure 136:
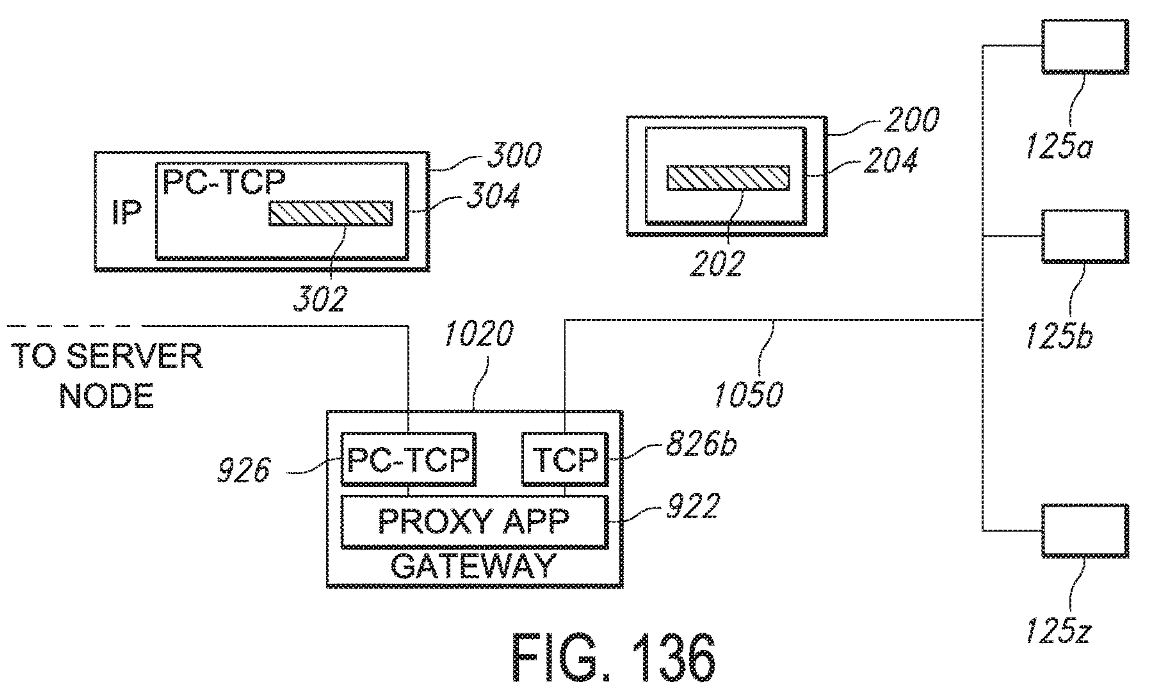
FIG. 136 is a block diagram of a PC-TCP proxy-based architecture embodied using a gateway device.

Referring to FIG. 136, in an example of the architecture shown in FIG. 135, the proxy application 922 is hosted in a gateway 1020 that links a local area network (LAN) 1050 to the Internet. A number of conventional client nodes 125*a-z* are on the LAN, and make use of the proxy server application to communicate with one or more server applications over the Internet. Various forms of gateway 1020 may be used, for instance, a router, firewall, modem (e.g., cable modem, DSL modem etc.). In such examples, the gateway 1020 may be configured to pass conventional TCP/IP communication between the client nodes 125*a-z* and the Internet, and for certain server applications or under certain conditions (e.g., determined by the client, the server, or the gateway) use the proxy to make use of PC-TCP for communication over the Internet.

It should be understood that the proxy architecture shown in FIG. 135 may be equally applied to server nodes 111 that communicate with a proxy node using TCP/IP, with the proxy providing PC-TCP communication with client nodes, either directly or via client side proxies. In such cases, the proxy server application serving the server nodes may be hosted, for instance, in a gateway device, such as a load balancer (e.g., as might be used with a server "farm") that links the servers to the Internet. It should also be understood that in some applications, there is a proxy node associated with the server node as well as another proxy associated with the client node.

Integrated Proxy

Figure 137:
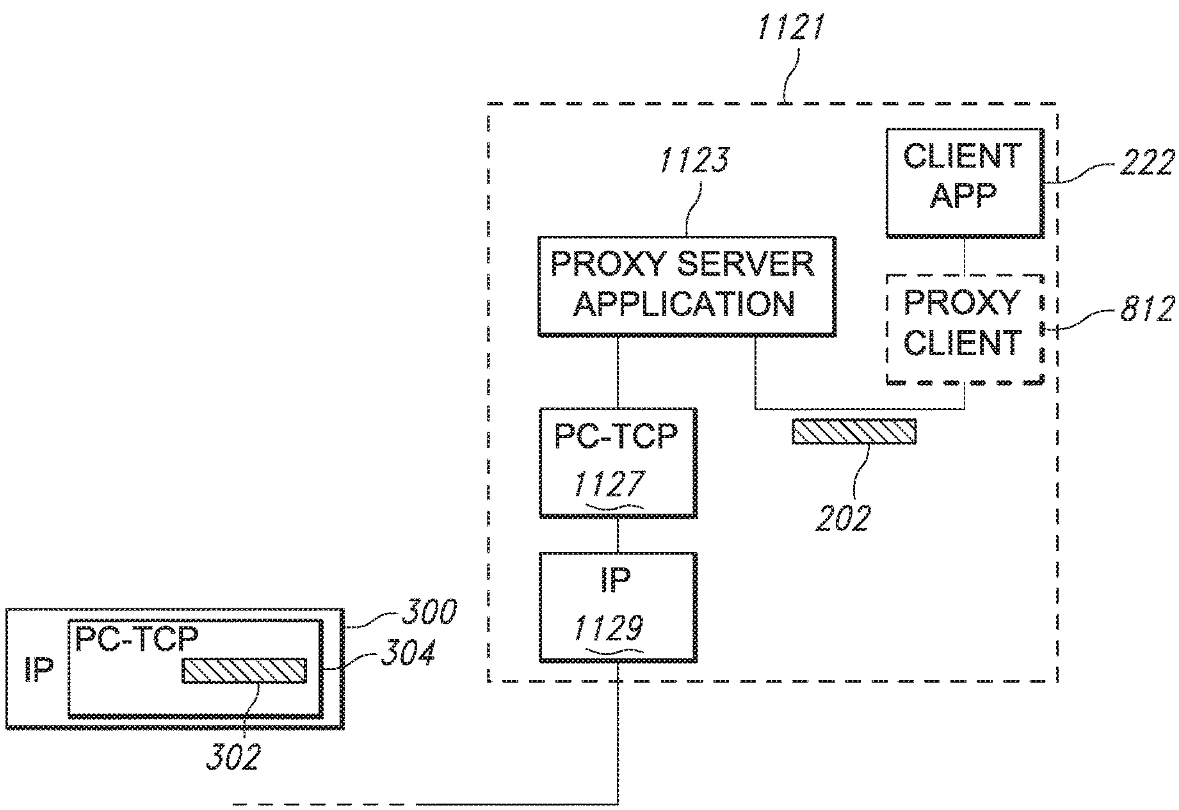
FIG. 137 is a block diagram of an alternative proxy architecture embodied within a client node.

Referring to FIG. 137, in some examples, a proxy server application 1123, which provides essentially the same functionality as the proxy server application 922 of FIG. 135, is resident on the client node 1121 rather than being hosted on a separate network node as illustrated in FIG. 135. In such an example, the connection between the client application 222 and the proxy server application 1123 is local, with the communication between them not passing over a data network (although internally it may be passed via the IP 1129 software "stack"). For example, a proxy client 812 (e.g., a SOCKS client) interacts locally with the proxy server application 1123, or the functions of the proxy client 812 and the proxy server application 1123 are integrated into a single software component.

Second Alternative Proxy Node

In examples of the first alternative proxy node approach introduced above, communication between the client node and the proxy node uses conventional techniques (e.g., TCP/IP), while communication between the proxy node and the server node (or its proxy) uses PC-TCP 1127. Such an approach may mitigate congestion and/or packet error or loss on the link between the server node and the proxy node, however, it would not generally mitigate issues that arise on the link between the proxy node and the client node. For example, the client node and the proxy node may be linked by a wireless channel (e.g., WiFi, cellular, etc.), which may introduce a greater degree of errors than the link between the server and the proxy node over a wired network.

Figure 138:
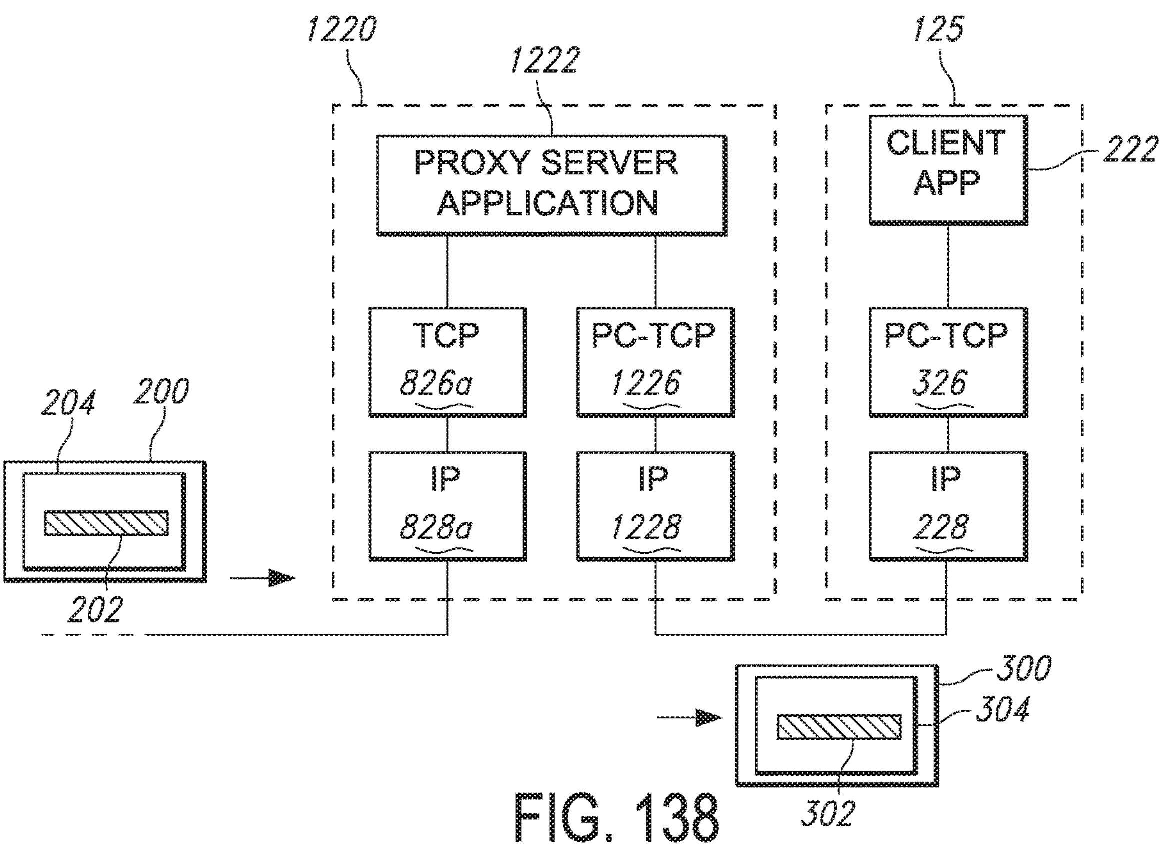
FIG. 138 is a block diagram of a second PC-TCP based proxy architecture in which a proxy node communicates using both PC-TCP and conventional TCP.

Referring to FIG. 138, in a second proxy approach, the client node 125 hosts a PC-TCP module 326, or hosts or uses any of the alternatives of such a module described in this document. The client application 222 makes use of the PC-TCP module 326 at the client node to communication with a proxy node 1220. The proxy node essentially translates between the PC-TCP communication with the client node 125 and conventional (e.g., TCP) communication with the server node. The proxy node 1220 includes a proxy server application 1222, which makes use of a PC-TCP module 1226 to communicate with the client node (i.e., forms transport layer link with the PC-TCP module 326) at the client node, and uses a conventional TCP module 826*a* to communicate with the server.

Figure 139:
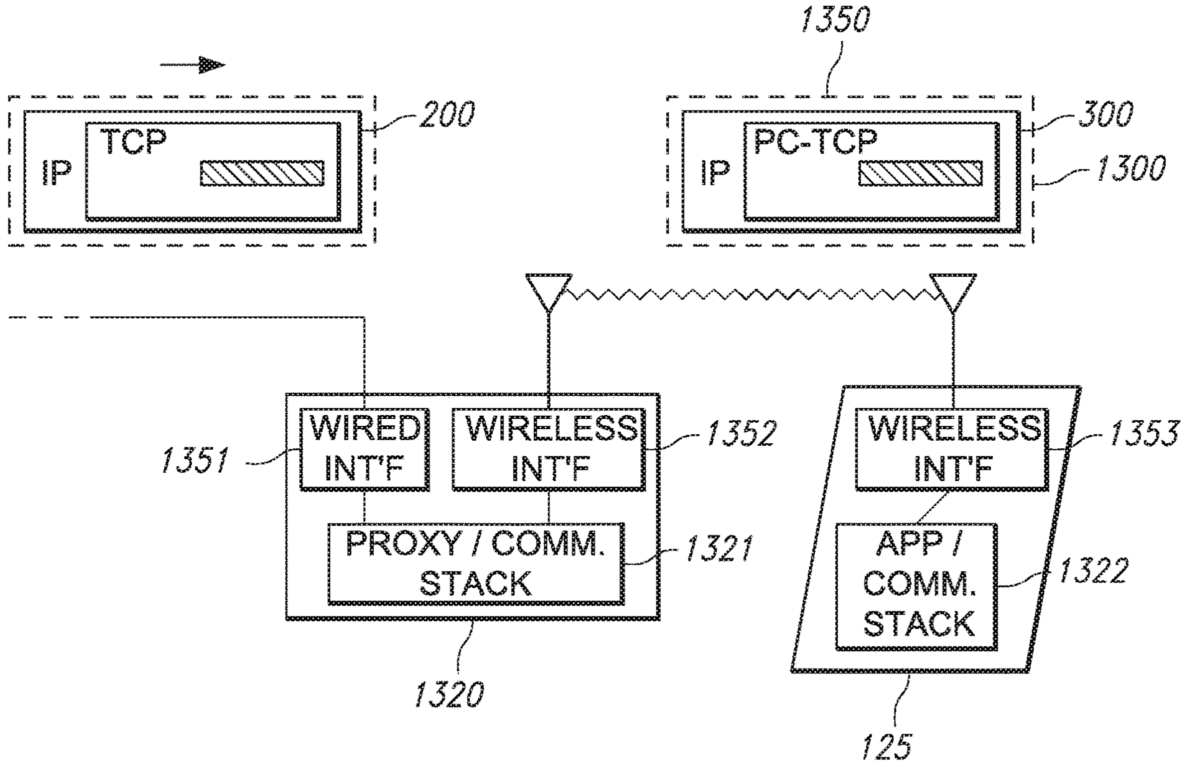
FIG. 139 is a block diagram of a PC-TCP proxy-based architecture embodied using a wireless access device.
Figure 140:
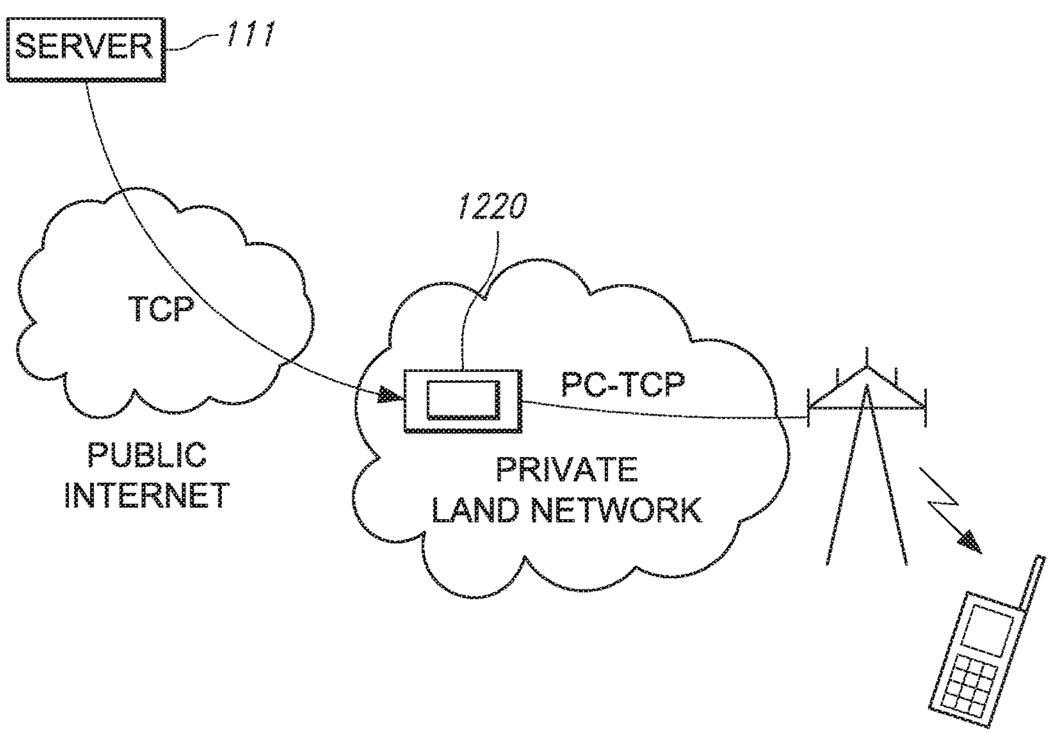
FIG. 140 is a block diagram of a PC-TCP proxy-based architecture embodied cellular network.
Figure 141:
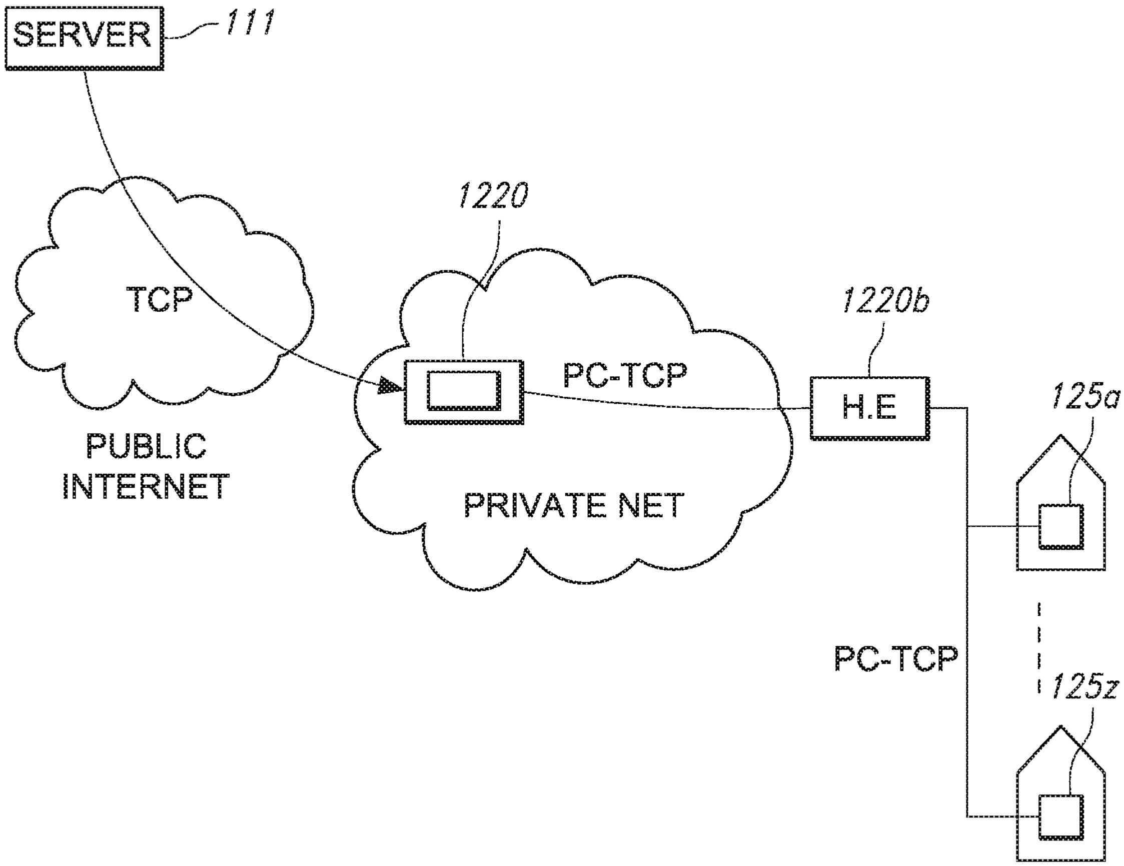
FIG. 141 is a block diagram of a PC-TCP proxy-based architecture embodied cable television-based data network.

Examples of such a proxy approach are illustrated in FIGS. 139-141. Referring to FIG. 139, an example of a proxy node 1220 is integrated in a wireless access device 1320 (e.g., a WiFi access point, router, etc.). The wireless access device 1320 is coupled to the server via a wired interface 1351 and coupled to a wireless client node 125 via a wireless interface 1352 at the access device and a wireless interface 1353 at the client node. The wireless access device 1320 includes a proxy and communication stack implementation 1321, which includes the modules illustrated for the proxy 1220 in FIG. 138, and the wireless client node 125 includes an application and communication stack implementation 1322, which includes the modules illustrated for the client node 125 in FIG. 138. Note that the IP packets 300 passing between the access device 1320 and the client node 125 are generally further "wrapped" using a data layer protocol, for example, in data layer packets 1350. As introduced above, in some implementations, rather than implementing the Packet Coding at the transport layer, in a modification of the approach shown in FIG. 139, the Packet Coding approaches are implemented at the data link layer.

Referring to FIG. 140, a proxy node 1220 is integrated in a node of a private land network of a cellular service provider. In this example, communication between a server 111 and the proxy node 1220 use conventional techniques (e.g., TCP) over the public Internet, while communication between the proxy node and the client node use PC-TCP. It should be understood that the proxy node 1220 can be hosted at various points in the service provider's network, including without limitation at a gateway or edge device that connects the provider's private network to the Internet (e.g. a Packet Data Network Gateway of an LIE network), and/or at an internal node of the network (e.g., a serving gateway, base station controller, etc.). Referring to FIG. 141, a similar approach may be used with a cable television based network. PC-TCP communication may pass between a head end device and a distribution network (e.g., a fiber, coaxial, or hybrid fiber-coaxial network) to individual homes. For example, each home may have devices that include PC-TCP capabilities themselves, or in some example, a proxy node (e.g., a proxy node integrated in a gateway 1010 as shown in FIG. 136) terminates the PC-TCP connections at each home. The proxy node that communicates with the server 111 using conventional approaches, while communicating using PC-TCP over the distribution network is hosted in a node in the service provider's private network, for instance at a "head end" device 1220*b* of the distribution network, or in a gateway device 1220*a* that links the service provider's network with the public Internet.

Intermediate Proxy

Figure 142:
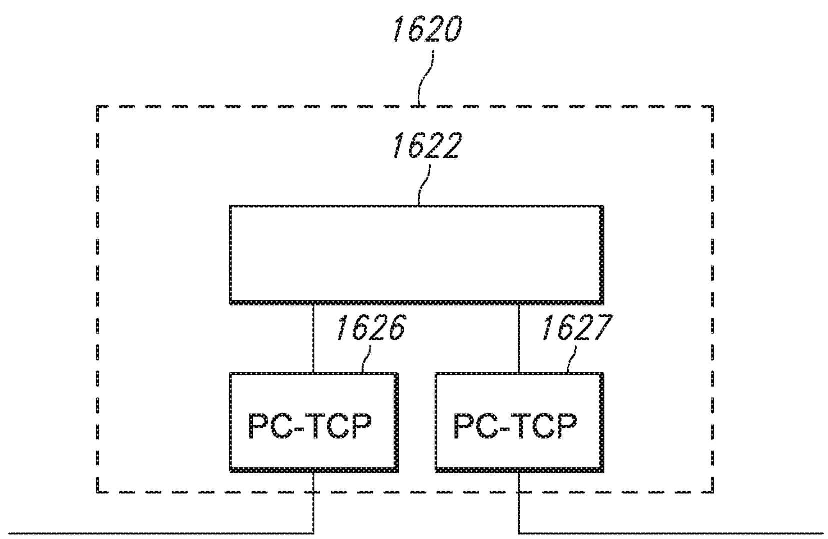
FIG. 142 is a block diagram of an intermediate proxy that communicates with a client node and with a server node using separate PC-TCP connections.

Referring to FIG. 142, in another architecture, the channel between a server node and a client node is broken in to independent tandem PC-TCP links. An intermediate node 1620 has two instances of a PC-TCP module 1626 and 1627. One PC-TCP module 1626 terminates a PC-TCP channel and communicates with a corresponding PC-TCP module at the server (e.g., hosted at the server node or at a proxy associated with the server node). The other PC-TCP module 1627 terminates a PC-TCP channel and communicates with a corresponding PC-TCP module at the client (e.g., hosted at the client node or at a proxy associated with the client node). The two PC-TCP modules 1626 and 1627 are coupled via a routing application 1622, which passes decoded data units provided by one of the PC-TCP modules (e.g., module 1626 from the server node) and to another PC-TCP module for transmission to the client.

Note that parameters of the two PC-TCP channels that are bridged at the intermediate node 1620 do not have to be the same. For example, the bridged channels may differ in their forward error correction code rate, block size, congestion window size, pacing rate, etc. In cases in which a retransmission protocol is used to address packet errors or losses that are not correctable with forward error correction coding, the PC-TCP modules at the intermediate node request or service such retransmission requests.

In FIG. 142, only two PC-TCP modules are shown, but it should be understood that the intermediate node 1620 may concurrently provide a link between different pairs of server and client nodes.

Figure 143:
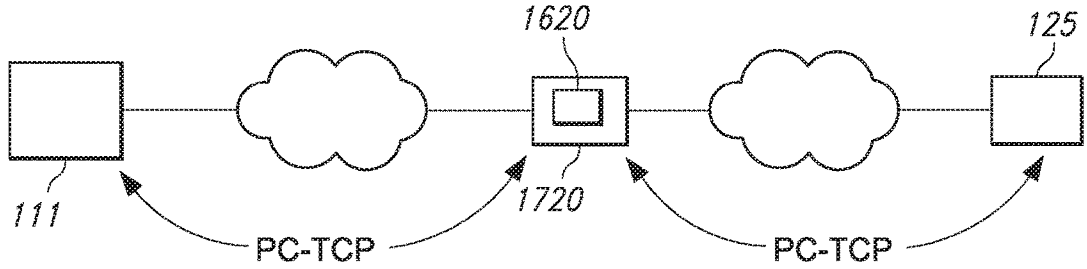
FIG. 143 is a block diagram of a PC-TCP proxy-based architecture embodied in a network device.

Referring to FIG. 143, an example of this architecture may involve a server node 111 communicating with an intermediate node 1620, for example, hosted in a gateway device 1720 of a service provider network with the intermediate node 1620 also communicating with the client node 125 via a second PC-TCP link.

Recoding Node

Figure 144:
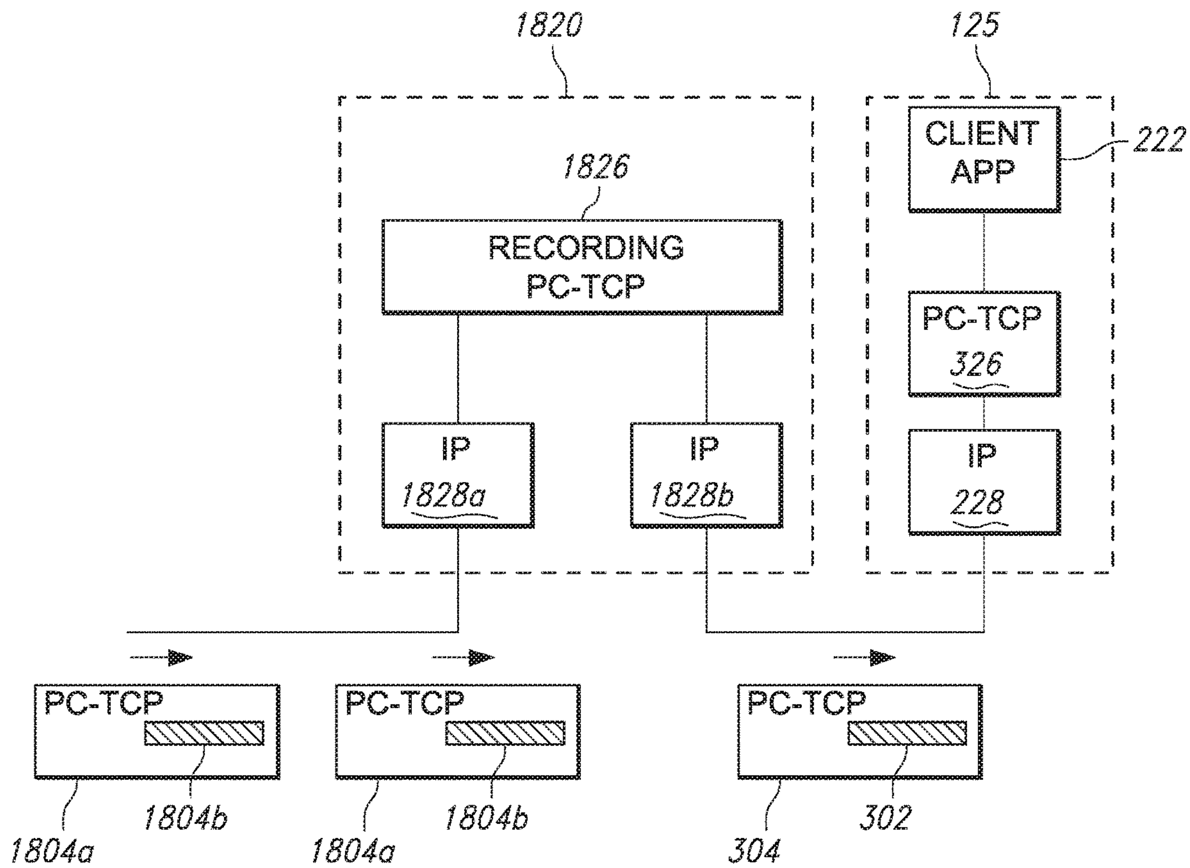
FIG. 144 is a block diagram of an intermediate proxy that recodes communication between a client node and with a server node.

Referring to FIG. 144, another architecture is similar to the one shown in FIG. 142 in that an intermediate node 1820 is on a path between a server node 111 and a client node 125, with PC-TCP communication passing between it and the server node and between it and the client node.

In FIG. 142, the PC-TCP modules 1626, 1627 fully decode and encode the data passing through the node. In the approach illustrated in FIG. 144, such complete decoding is not necessary. Rather, a recoding PC-TCP module 1822 receives payloads 1802*a-b* from PC-TCP packets 1804*a-b*, and without decoding to reproduce the original uncoded payloads 202 (not shown), the module uses the received PC-TCP packets to send PC-TCP packets 304, with coded payloads 302, toward the destination Details of various recoding approaches are described further later in this document. However, in general, the processing by the recoding PC-TCP module includes one or more of the following functions: forwarding PC-TCP packets without modification to the destination; "dropping" received PC-TCP packets without forwarding, for example, if the redundancy provided by the received packets are not needed on the outbound link; generating and transmitting new PC-TCP packets to provide redundancy on the outbound link. Note that the recording PC-TCP module may also provide acknowledgement information on the inbound PC-TCP link (e.g., without requiring acknowledgement from the destination node), for example, to the server, and process received acknowledgements on the outbound link. The processing of the received acknowledgements may include causing transmission of additional redundant information in the case that the originally provided redundancy information was not sufficient for reconstruction of the payload data.

In general, the recoding PC-TCP module maintains separate communication characteristics on the inbound and outbound PC-TCP channels. Therefore, although it does not decode the payload data, it does provide control and, in general, the PC-TCP channels may differ in their forward error correction code rate, block size, congestion window size, pacing rate, etc.

Multipath Transmission

Single Endpoint Pair

In examples described above, a single path links the server node 111 and the client node 125. The possibility of using conventional TCP concurrently with PC-TCP between two nodes was introduced. More generally, communication between a pair of PC-TCP modules (i.e., one at the server node 111 and one at the client node 125) may follow different paths.

Internet protocol itself supports packets passing from one node to another following different paths and possibly being delivered out of order. Multiple data paths or channels can link a pair of PC-TCP modules and be used for a single session. Beyond native multi-path capabilities of IP networks, PC-TCP modules may use multiple explicit paths for a particular session. For example, without intending to be exhaustive, combinations of the following types of paths may be used:

Uncoded TCP and PC Over UDP

PC Over Conventional TCP and UDP

PC-TCP Over Wireless LAN (e.g., WiFi, 802.11) and Cellular Data (e.g., 3G, LTE)

PC-TCP concurrently over multiple wireless base stations (e.g., via multiple wireless LAN access points)

In some examples, Network Coding is used such that the multiple paths from a server node to a client node pass through one or more intermediate nodes at which the data is recoded, thereby causing information for different data units to effectively traverse different paths through the network.

One motivation for multipath connection between a pair of endpoints addresses possible preferential treatment of TCP traffic rather than UDP traffic. Some networks (e.g. certain public Wi-Fi, cable television networks, etc.) may limit the rate of UDP traffic, or drop UDP packets preferentially compared to TCP (e.g., in the case of congestion). It may be desirable to be able to detect such scenarios efficiently without losing performance. In some embodiments, a PC-TCP session initially establishes and divides the transmitted data across both a TCP and a UDP connection. This allows comparison of the throughput achieved by both connections while sending distinct useful data on each connection. An identifier is included in the initial TCP and UDP handshake packets to identify the two connections as belonging to the same coded PC-TCP session, and non-blocking connection establishment can be employed so as to allow both connections to be opened at the outset without additional delay. The transmitted data is divided across the two connections using e.g. round-robin (sending alternating packets or runs of packets on each connection) or load-balancing/back pressure scheduling (sending each packet to the connection with the shorter outgoing data queue). Such alternation or load balancing can be employed in conjunction with techniques for dealing with packet reordering. Pacing rate and congestion window size can be controller separately for the UDP and the TCP connection, or can be controlled together. By controlling the two connections together (e.g., using only a single congestion window to regulate the sum of the number of packets in flight on both the TCP and UDP connections) may provide a greater degree of "fairness" as compared to separate control.

In some examples, the adjustment of the fraction of messages transmitted over each data path/protocol is determined according to the relative performance/throughput of the data paths/protocols. In some examples, the adjustment of allocation of messages occurs only during an initial portion of the transmission. In other examples, the adjustment of allocation of messages occurs on an ongoing basis throughout the transmission. In some examples, the adjustment reverses direction (e.g., when a data path stops preferentially dropping UDP messages, the number of messages transmitted over that data path may increase).

In some embodiments the PC-TCP maintains both the UDP based traffic and the TCP based traffic for the duration of the session. In other embodiments, the PC-TCP module compares the behavior of the UDP and TCP traffic, for example over a period specified in terms of time interval or number of packets, where these quantities specifying the period can be set as configuration parameters and/or modified based on previous coded TCP sessions, e.g. the comparison period can be reduced or eliminated if information on relative TCP/UDP performance is available from recent PC-TCP sessions. If the UDP connection achieves better throughput, the PC-TCP session can shift to using UDP only. If the TCP connection achieves better throughput, the PC-TCP session can shift to using TCP. In some embodiments, different types of traffic are sent over the TCP link rather than the UDP link. In one such example, the UDP connection is used to send some forward error correction for packets where it is beneficial to reduce retransmission delays, e.g. the last block of a file or intermediate blocks of a stream. In this example, the uncoded packets may be sent over a TCP stream with forward error correction packets sent over UDP. If the receiver can use the forward error correction packets to recover from erasures in the TCP stream, a modified implementation of the TCP component of the receiver's PC-TCP module may be able to avoid using a TCP-based error recovery procedure. On the other hand, non-delivery of a forward error correction packet does not cause an erasure of the data that is to be recovered at the receiver, and therefore unless there is an erasure both on the UDP path and on the TCP path, dropping of a UDP packet does not cause delay.

Distributed Source

In some examples, multiple server nodes communicate with a client node. One way this can be implemented is with there being multiple communication sessions each involving one server node and one client node. In such an implementation, there is little or no interaction between a communication session between one server node and the client node and another communication session between another server node and the client node. In some examples, each server node may have different parts of a multimedia file, with each server providing its parts for combination at the client node.

Distributed Content Delivery

In some examples, there is some relationship between the content provided by different servers to the client. One example of such a relationship is use of a distributed RAID approach in which redundancy information (e.g., parity information) for data units at one or more servers is stored at and provided from another server. In this way, should a data unit not reach the client node from one of the server nodes, the redundancy information may be preemptively sent or requested from the other node, and the missing data unit reconstructed.

In some examples, random linear coding is performed on data units before they are distributed to multiple server nodes as an alternative to use of distributed RAID. Then each server node establishes a separate communication session with the client node for delivery of part of the coded information. In some of these examples, the server nodes have content that has already been at least partially encoded and then cached, thereby avoiding the necessity of repeating that partial encoding for different client nodes that will received the same application data units. In some examples, the server nodes may implement some of the functionality of the PC modules for execution during communication sessions with client nodes, for example, having the ability to encode further redundancy information in response to acknowledgment information (i.e., negative acknowledgement information) received from a client node.

In some implementations, the multiple server nodes are content delivery nodes to which content is distributed using any of a variety of known techniques. In other implementations, these multiple server nodes are intermediary nodes at which content from previous content delivery sessions was cached and therefore available without requiring re-delivery of the content from the ultimate server node.

In some examples of distributed content delivery, each server to client connection is substantially independent, for example, with independently determined communication parameters (e.g., error correction parameters, congestion window size, pacing rate, etc.). In other examples, at least some of the parameters are related, for example, with characteristics determined on one server-to-client connection being used to determine how the client node communicates with other server nodes. For example, packet arrival rate, loss rate, and differences in one-way transmission rate, may be measured on one connections and these parameters may be used in optimizing multipath delivery of data involving other server nodes. One manner of optimization may involve load balancing across multiple server nodes or over communication links on the paths from the server nodes to the client nodes.

In some implementations, content delivery from distributed server nodes making use of PC-TCP, either using independent sessions or using coordination between sessions, may achieve the performance of conventional distributed content delivery but requiring a smaller number of server nodes. This advantage may arise due to PC-TCP providing lower latency and/or lower loss rates than achieved with conventional TCP.

Multicast

Figure 145:
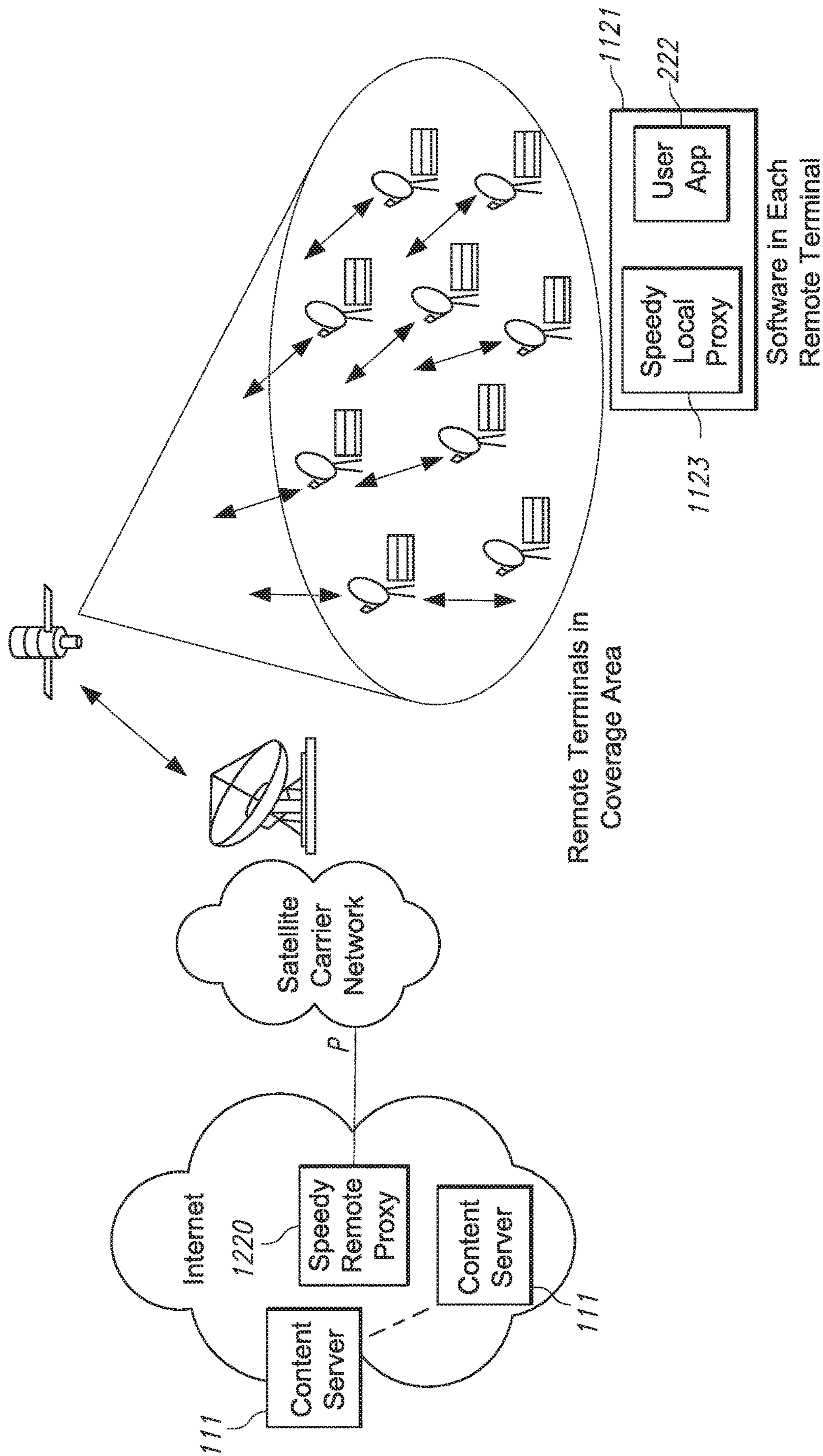
FIGS. 145-146 arc diagrams that illustrates delivery of common content to multiple destinations.
Figure 146:
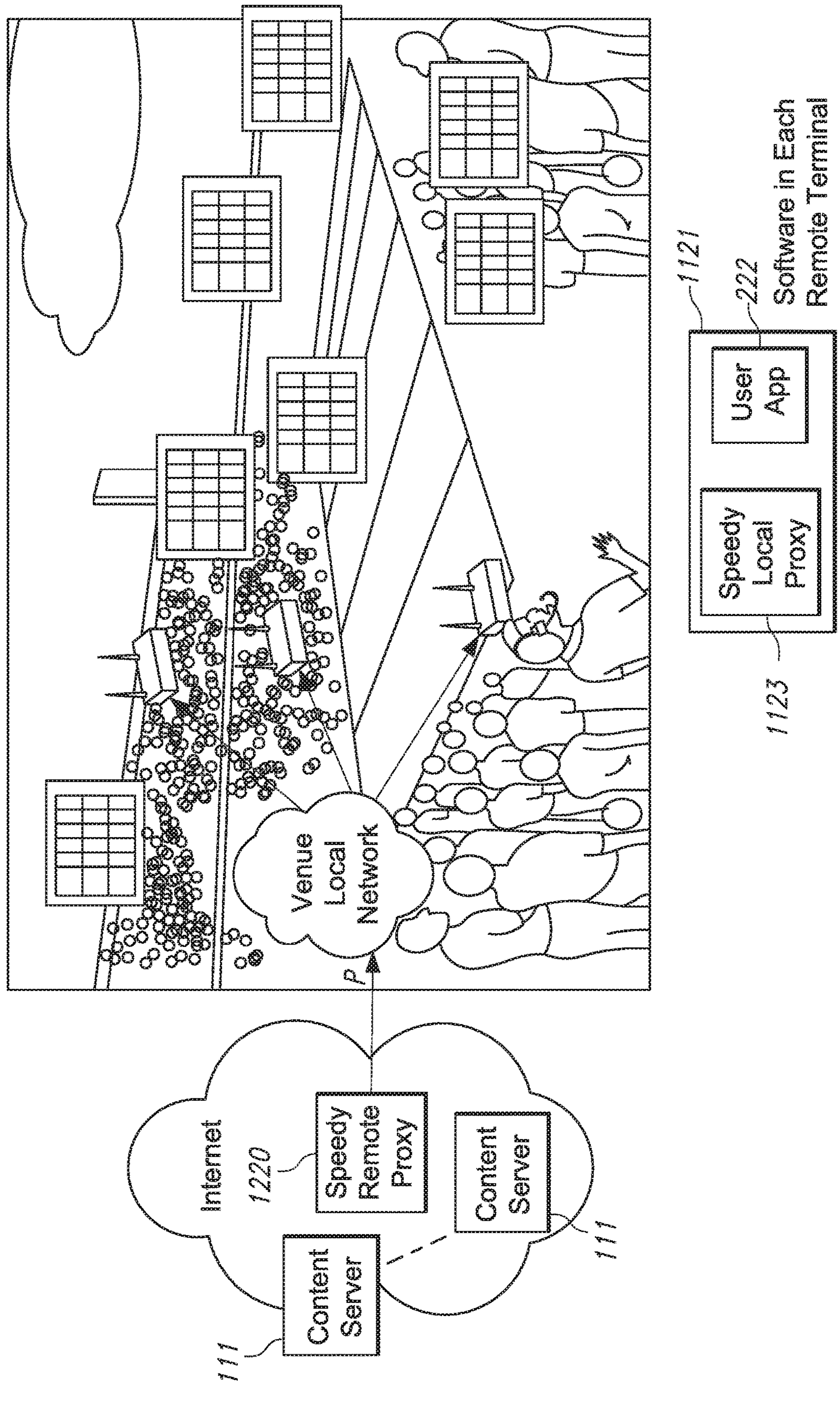

FIGS. 145-146 show two examples of delivery of common content to multiple destination nodes simultaneously via multicast connections. The advantage of multicast is that a single packet or block of N packets has to be sent by the source node into the network and the network will attempt to deliver the packets to all destination nodes in the multicast group. If the content needs to be delivered reliably, then TCP will most likely be used as the transport layer protocol. To achieve reliability, TCP requires destination nodes to respond with acknowledgments and specify the packets that each destination node is missing. If there are 10s of thousands or 100s of thousands of receivers, and each destination node is missing a different packet or set of packets, the number of different retransmissions to the various receivers will undercut the advantages of the simultaneous transmission of the content to all destination nodes at once. With network coding and forward error correction, a block of N packets can be sent to a large number of multicast destination nodes at the same time. The paths to these multiple destination nodes can be similar (all over a large WiFi or Ethernet local area network) or disparate (some over WiFi, some over cellular, some over fiber links, and some over various types of satellite networks). The algorithms described above that embody transmission and congestion control, forward error correction, sender based pacing, receiver based pacing, stream based parameter tuning, detection and correction for missing and out of order packets, use of information across multiple connections, fast connection start and stop, TCP/UDP fallback, cascaded coding, recoding by intermediate nodes, and coding of the ACKs can be employed to improve the throughput and reliability of delivery to each of the multicast destination node. When losses are detected and coding is used, the extra coded packets can be sent to some or all destination nodes. As long as N packets are received at each destination node, the missing packets at each destination node can be reconstructed from the coded packets if the number of extra coded packets match or exceed the number of packets lost at all of the receivers. If fewer than N packets are received at any of the destination nodes, any set of different coded packets from the block of N packets can be retransmitted and used to reconstruct any missing packet in the block at each of the destination nodes. If some destination nodes are missing more than one packet, then the maximum number of coded packets to be retransmitted will be equal to the largest number of packets that are missing by any of the destination nodes. These few different coded packets can be used to reconstruct the missing packets at each of the destination nodes. For example if the most packets missing at any destination node is four, then any four different coded packets can be retransmitted.

Further Illustrative Examples

FIGS. 147-157 show exemplary embodiments of data communication systems and devices and highlight various ways to implement the novel PC-TCP described herein. These configurations identify some of the possible network devices, configurations, and applications that may benefit from using PC-TCP, but there are many more devices, configurations and applications that may also benefit from PC-TCP. The following embodiments are described by way of example, not limitation.

Figure 147:
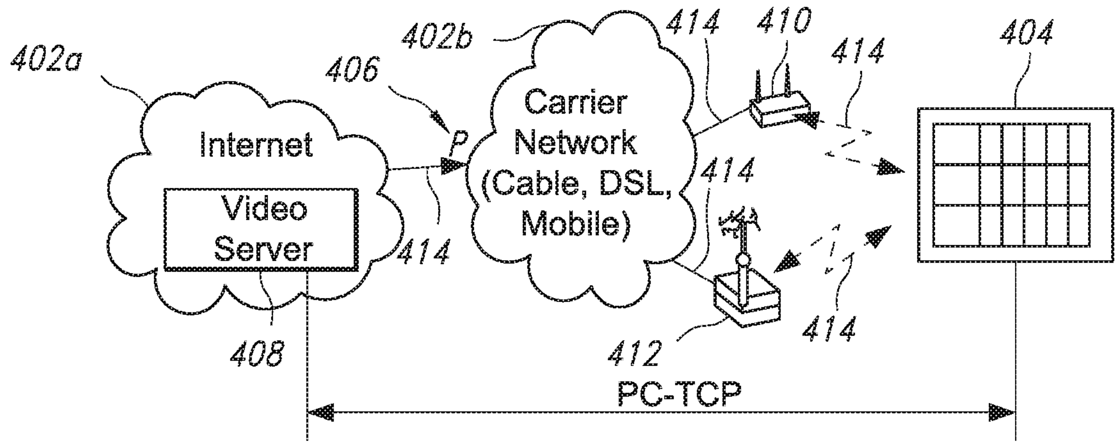
FIGS. 147-157 are schematic diagrams of various embodiments of PC-TCP communication approaches.

In an exemplary embodiment depicted in FIG. 147, a user device 404 such as a smartphone, a tablet, a computer, a television, a display, an appliance, a vehicle, a home server, a gaming console, a streaming media box and the like, may include a PC-TCP proxy that may interface with applications running in the user device 404. The application on the user device 404 may communicate with a resource in the cloud 402*a* such as a server 408. The server 408 may be a file server, a web server, a video server, a content server, an application server, a collaboration server, an FTP server, a list server, a telnet server, a mail server, a proxy server, a database server, a game server, a sound server, a print server, an open source server, a virtual server, an edge server, a storage device and the like, and may include a PC-TCP proxy that may interface with applications and/or processes running on the server 408. In embodiments, the server in the cloud may terminate the PC-TCP connection and interface with an application on the server 408 and/or may forward the data on to another electronic device in the network. In embodiments, the data connection may travel a path that utilizes the resources on a number of networks 402*a*, 402*b*. In embodiments PC-TCP may be configured to support multipath communication such as for example from a video server 408 through a peering point 406, though a carrier network 402*b*, to a wireless router or access point 410 to a user device 404 and from a video server 408 through a peering point 406, though a carrier network 402*b*, to a cellular base station or cell transmitter 412 to a user device 404. In embodiments, the PC-TCP may include adjustable parameters that may be adjusted to improve multipath performance. In some instances, the exemplary embodiment shown in FIG. 147 may be referred to as an over-the-top (OTT) embodiment.

Figure 148:
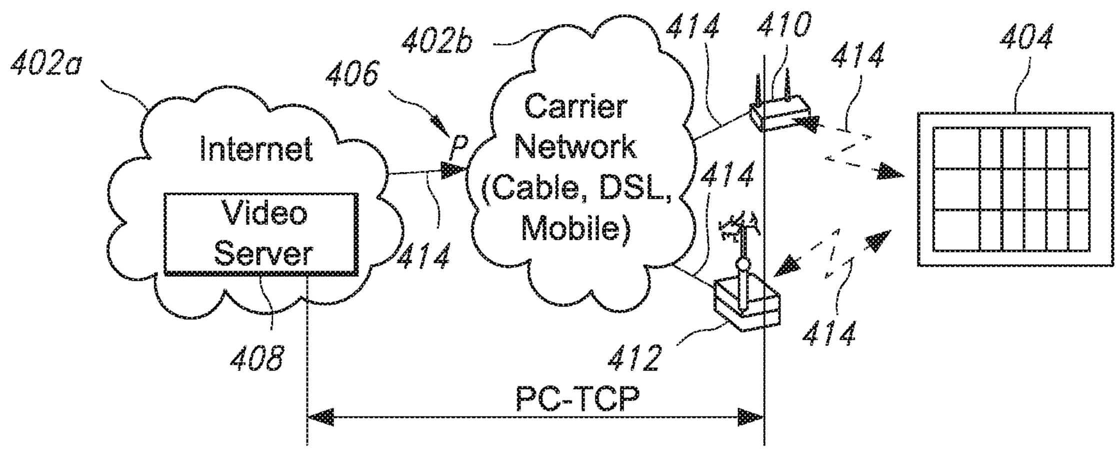
Figure 149:
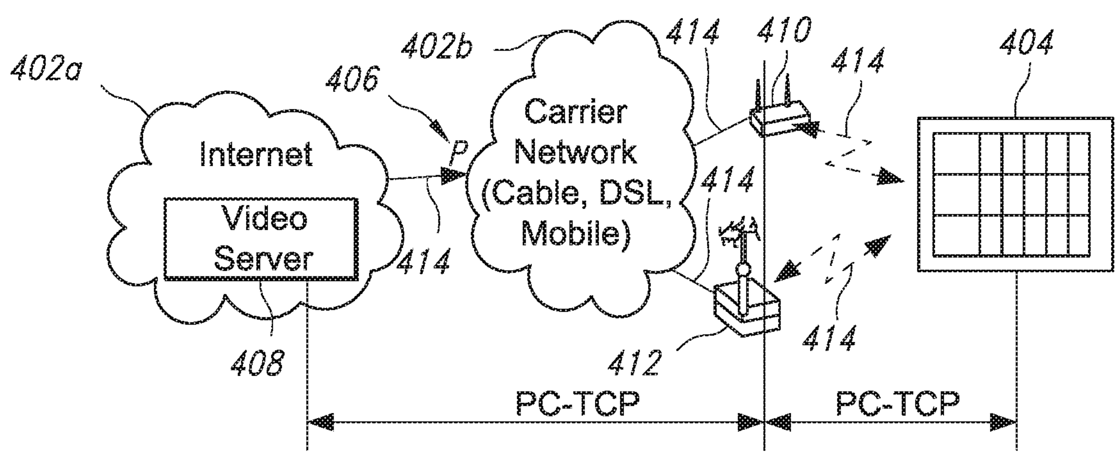

In embodiments, such as the exemplary embodiments shown in FIG. 148 and FIG. 149, other devices in the network may comprise PC-TCP proxies. For example, the wireless access point or router 410 and the base station or cell transmitter 412 may comprise PC-TCP proxies. In embodiments, the user device 404 may also comprise a PC-TCP proxy (FIG. 149) or it may not (FIG. 148). If the user device does not comprise a PC-TCP proxy, it may communicate with the access point 410 and/or base station 412 using a wireless or cellular protocol and/or conventional TCP or UDP protocol. The PC-TCP proxy in either or both the access point 410 and base station 412 may receive data packets using these conventional communications and may convert these communications to the PC-TCP for a connection to video server 408. In embodiments, if conventional TCP provides the highest speed connection between the end user device 404 and/or the access point 410 or the base station 412, then the PC-TCP proxy may utilize only some or all of the features in PC-TCP that may be compliant with and may compliment conventional TCP implementations and transmit the data using the TCP layer.

Figure 150:
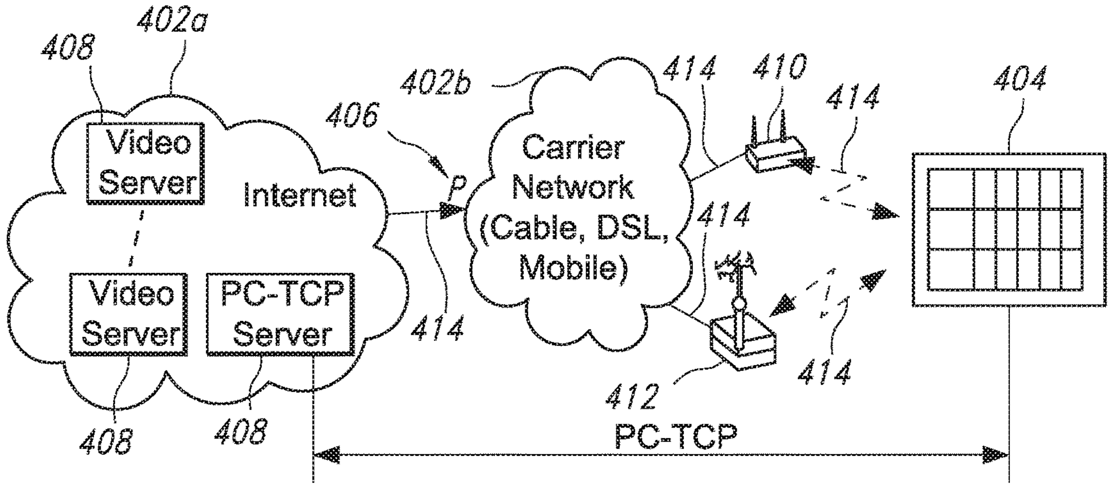

FIG. 150 shows an exemplary embodiment where a user device may comprise a PC-TCP proxy and may communicate with a PC-TCP proxy server 408 on an internet. In this embodiment, an entity may provide support for high speed internet connections by renting, buying services from, or deploying at least one server in the network and allowing other servers or end user devices to communicate with it using PC-TCP. The at least one server in the network running PC-TCP may connect to other resources in the network and/or end users using TCP or UDP.

Figure 151:
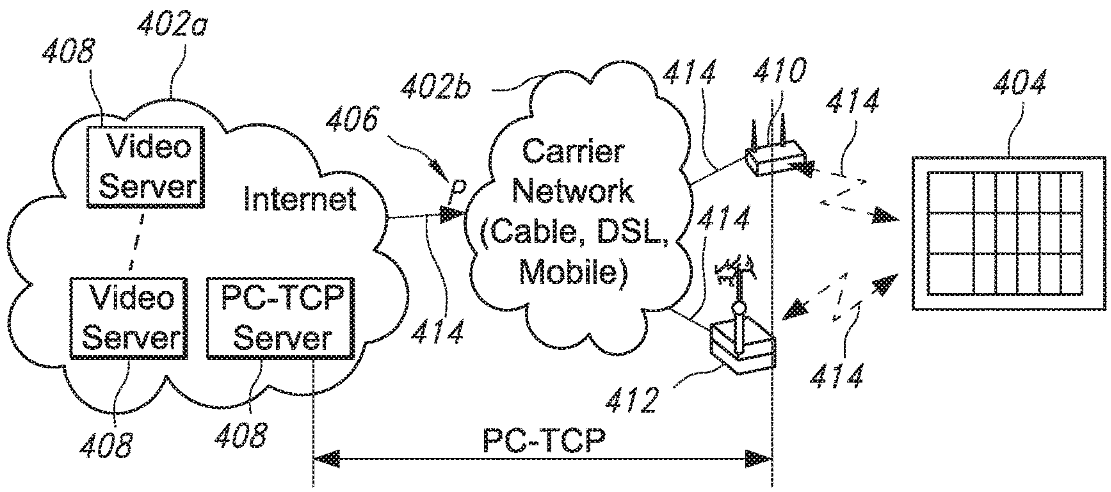
Figure 152:
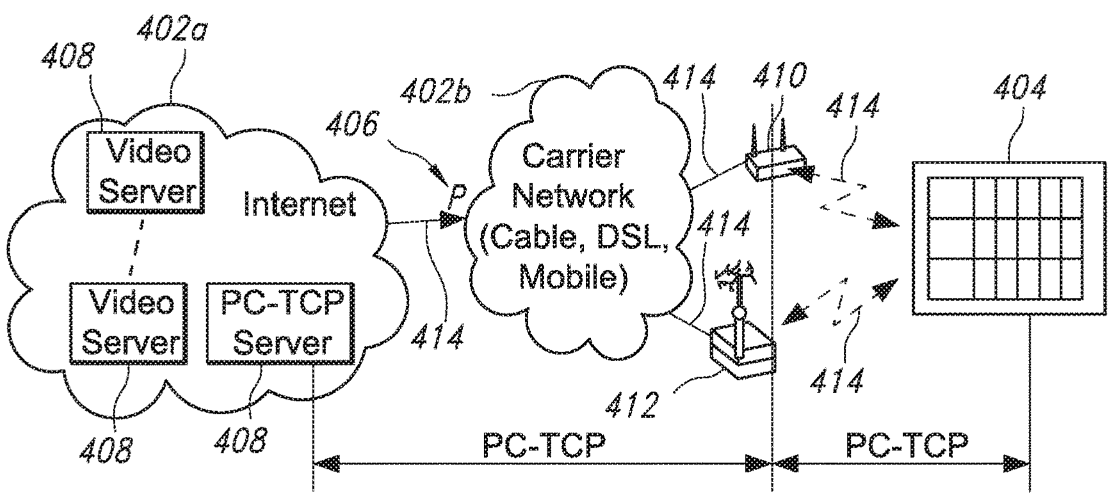

In embodiments, such as the exemplary embodiments shown in FIG. 151 and FIG. 152, other devices in the network may comprise PC-TCP proxies. For example, the wireless access point or router 410 and the base station or cell transmitter 412 may comprise PC-TCP proxies. In embodiments, the user device 404 may also comprise a PC-TCP proxy (FIG. 152) or it may not (FIG. 151). If the user device does not comprise a PC-TCP proxy, it may communicate with the access point 410 and/or base station 412 using a wireless or cellular protocol and/or conventional TCP or UDP protocol. The PC-TCP proxy in either or both the access point 410 and base station 412 may receive data packets using these conventional communications and may convert these communications to the PC-TCP for a connection to PC-TCP server 408. In embodiments, if conventional TCP provides the highest speed connection between the end user device 404 and/or the access point 410 or the base station 412, then the PC-TCP proxy may utilize only some or all of the features in PC-TCP that may be compliant with and may compliment conventional TCP implementations and transmit the data using the TCP layer.

In embodiments, at least some network servers 408 may comprise PC-TCP proxies and may communicate with any PC-TCP servers or devices using PC-TCP. In other embodiments, network servers may communicate with PC-TCP servers or devices using conventional TCP and/or other transport protocols running over UDP.

Figure 153:
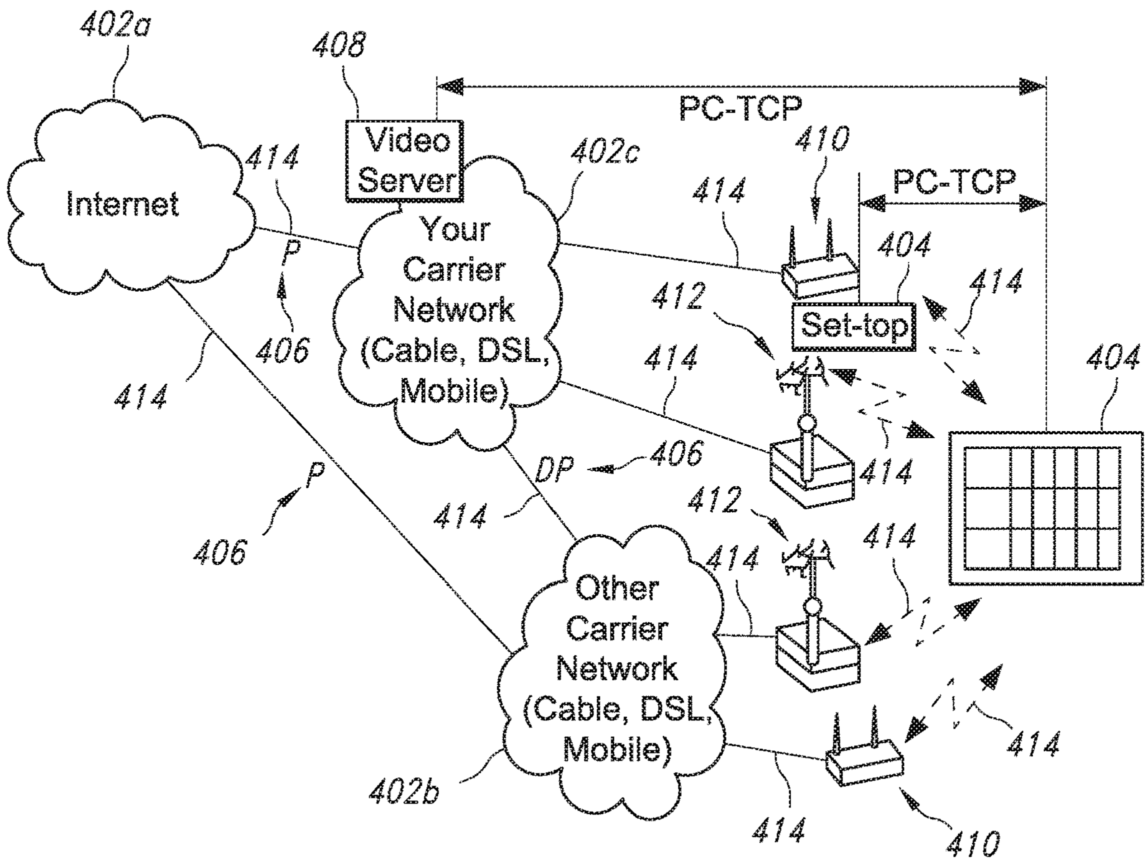
Figure 154:
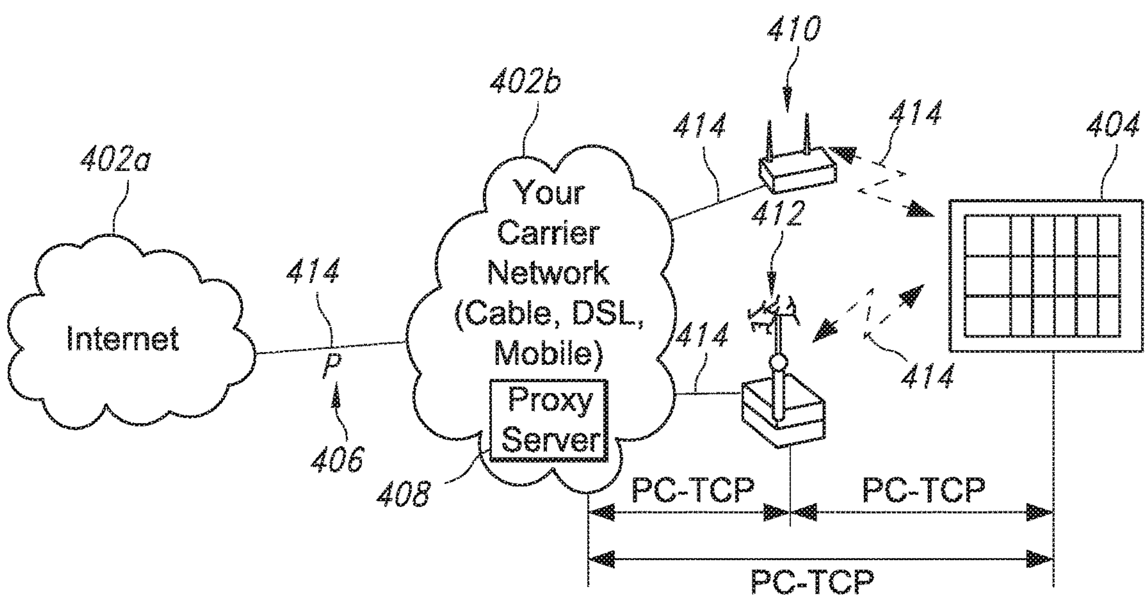
Figure 155:
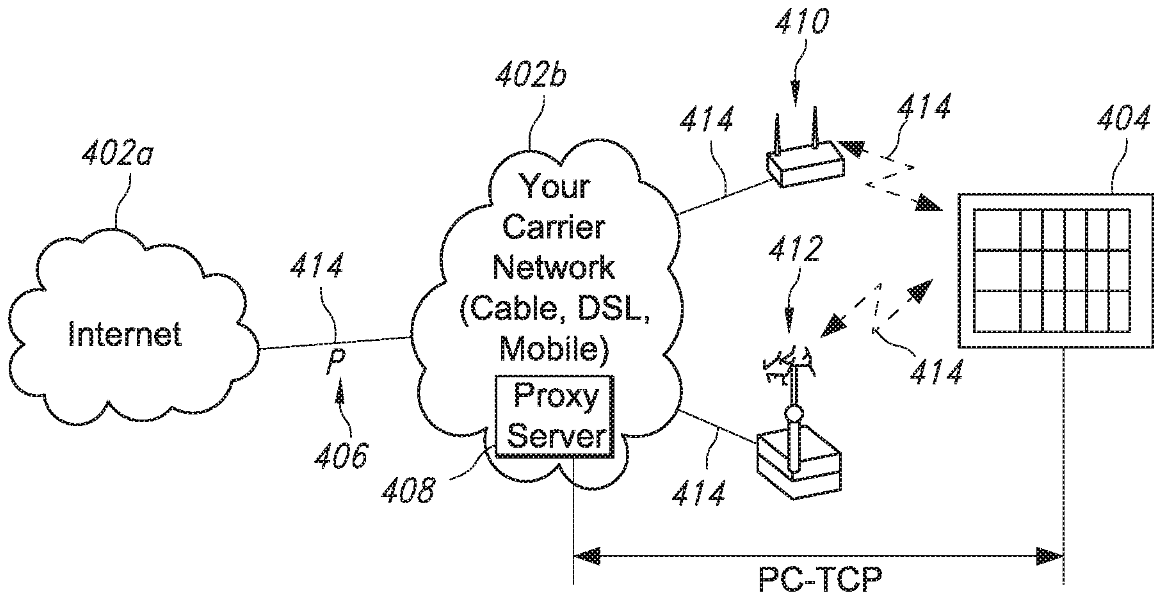
Figure 156:
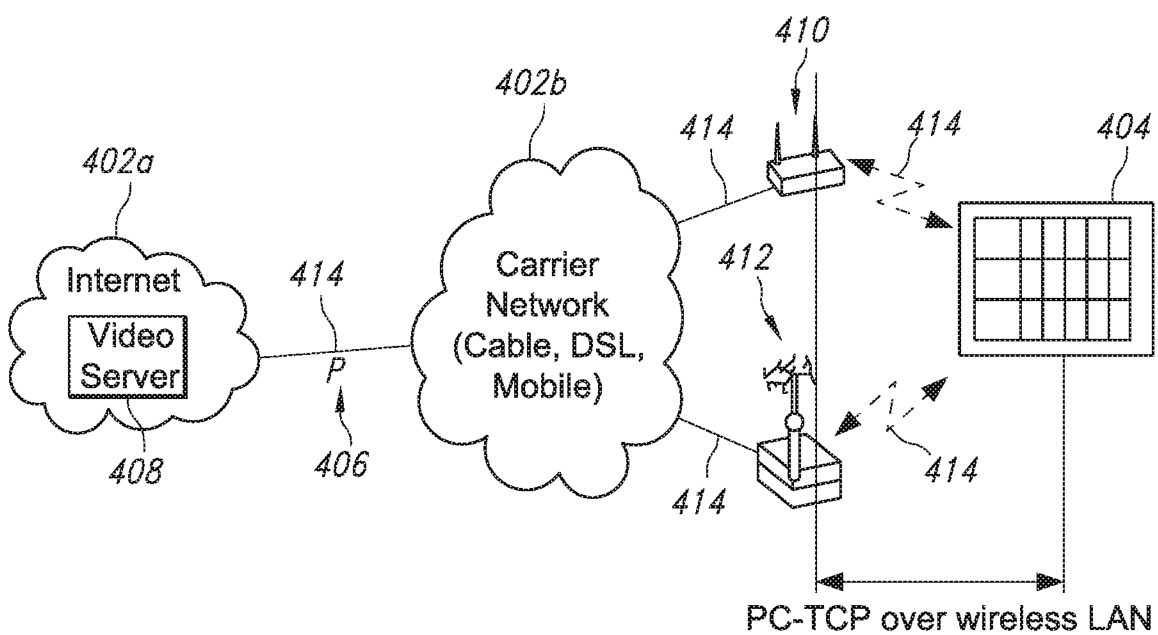
Figure 157:
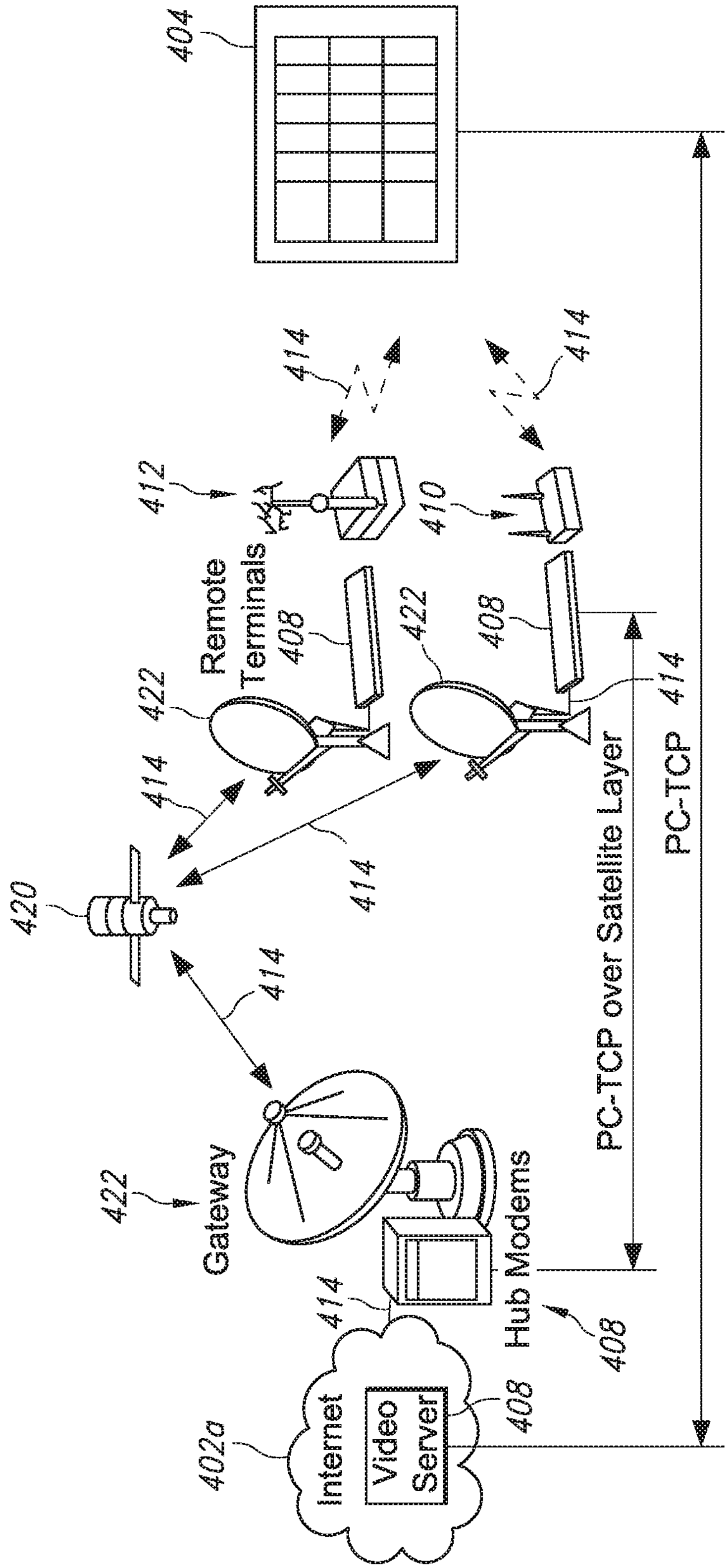

In exemplary embodiments as depicted in FIG. 153, ISPs and/or carriers may host content on one or more servers that comprise PC-TCP proxies. In embodiments, devices such as set-top boxes, cable boxes, digital video recorders (DVRs), modems, televisions, smart televisions, internet televisions, displays, and the like may comprise PC-TCP proxies. A user device 404 such as described above, may include a PC-TCP proxy that may interface with applications running in the user device 404. The application on the user device 404 may communicate with a resource in the cloud 402*c* such as a server 408. The server 408 may be any type of communications server as describe above, and may include a PC-TCP proxy that may interface with applications and/or processes running on the server 408. In embodiments, the server in the cloud may terminate the PC-TCP connection and interface with an application on the server 408 and/or may forward the data on to another electronic device in the network. In embodiments, the data connection may travel a path that utilizes the resources on a number of networks 402*a*, 402*b*, 402*c*. In embodiments PC-TCP may be configured to support multipath communication such as for example from a video server 408 through a direct peering point (DP) 406, to a wireless router or access point 410 or a base station 412 to a user device 404 and from a video server 408 directly to an access point 410 and/or to a cellular base station or cell transmitter 412 to a user device 404. In embodiments, the PC-TCP may include adjustable parameters that may be adjusted to improve multipath performance.

The exemplary placements of networking devices in the communication scenarios described above should not be taken as limitations. It should be recognized that PC-TCP proxies can be placed in any network device and may support any type of data connection. That is, any type of end-user device, switching device, routing device, storage device, processing device and the like, may comprise PC-TCP proxies. Also PC-TCP proxies may reside only in the end-nodes of a communication path and/or only at two nodes along a connection path. However, PC-TCP proxies may also reside in more than two nodes of a communication path and may support multi-cast communications and multipath communications. PC-TCP proxies may be utilized in point-to-point communication networks, multi-hop networks, meshed networks, broadcast networks, storage networks, and the like.

Packet Coding (PC)

The description above focuses on architectures in which a packet coding approach is deployed, and in particular architectures in which a transport layer PC-TCP approach is used. In the description below, a number of features of PC-TCP are described. It should be understood that in general, unless otherwise indicated, these features are compatible with one another and can be combined in various combinations to address particular applications and situations.

Data Characteristics

As introduced above, data units (e.g., audio and/or video frames) are generally used to form data packets, for example, with one data unit per data packet, with multiple data units per data packet, or in some instances separating individual data units into multiple data packets. In some applications, the data units and associated data frames form a stream (e.g., a substantially continuous sequence made available over time without necessarily having groupings or boundaries in the sequence), while in other applications, the data units and associated data frames form one or more batches (e.g., a grouping of data that is required as a whole by the recipient).

In general, stream data is generated over time at a source and consumed at a destination, typically at a substantially steady rate. An example of a stream is a multimedia stream associated with person-to-person communication (e.g., a multimedia conference). Delay (also referred to as latency) and variability in delay (also referred to as jitter) are important characteristics of the communication of data units from a source to a destination.

An extreme example of a batch is delivery of an entire group of data, for example, a multiple gigabyte sized file. In some such examples, reducing the overall time to complete delivery (e.g., by maximizing throughput) of the batch is of primary importance. One example of batch delivery that may have very sensitive time (and real-time update) restraints is database replication.

In some applications, the data forms a series of batches that require delivery from a source to a destination. Although delay in start of delivery and/or completion of delivery of a batch of data units may be important, in many applications overall throughput may be most important. An example of batch delivery includes delivery of portions of multimedia content, for instance, with each batch corresponding to sections of viewing time (e.g., 2 seconds of viewing time or 2 MB per batch), with content being delivered in batches to the destination where the data units in the batches are buffered and used to construct a continuous presentation of the content. As a result, an important consideration is the delivery of the batches in a manner than provides continuity between batches for presentation, without "starving" the destination application because a required batch has not arrived in time. In practice, such starving may cause "freezing" of video presentation in multimedia, which is a phenomenon that is all too familiar to today's users of online multimedia delivery. Another important consideration is reduction in the initial delay in providing the data units of the first batch to the destination application. Such delay is manifested, for example, in a user having to wait for initial startup of video presentation after selecting multimedia for online delivery. Another consideration in some applications is overall throughput. This may arise, for example, if the source application has control over a data rate of the data units, for example, being able to provide a higher fidelity version of the multimedia content if higher throughput can be achieved. Therefore, an important consideration may be providing a sufficiently high throughput in order to enable delivery of a high fidelity version of the content (e.g., as opposed to greatly compressed version or a backed-off rate of the content resulting in lower fidelity).

Various packet coding approaches described below, or selection of configuration parameters of those approaches, address considerations that are particularly relevant to the nature of the characteristics of the data being transported. In some examples, different approaches or parameters are set in a single system based on a runtime determination of the nature of the characteristics of the data being transported.

Channel Characteristics

In general, the communication paths that link PC-TCP source and destination endpoints exhibit both relatively stationary or consistent channel characteristics, as well as transient characteristics. Relatively stationary or consistent channel characteristics can include, for example, capacity (e.g., maximum usable throughput), latency (e.g., transit time of packets from source to destination, variability in transit time), error rate (e.g., average packet erasure or error rate, burst characteristics of erasures/errors). In general, such relatively stationary or consistent characteristics may depend on the nature of the path, and more particularly on one or more of the links on the path. For example, a path with a link passing over a 4G cellular channel may exhibit very different characteristics than a path that passes over a cable television channel and/or a WiFi link in a home. As discussed further below, at least some of the approaches to packet coding attempt to address channel characteristic differences between types of communication paths. Furthermore, at least some of the approaches include aspects that track relatively slow variation in characteristics, for example, adapting to changes in average throughput, latency, etc.

Communication characteristics along a path may also exhibit substantial transient characteristics. Conventional communication techniques include aspects that address transient characteristics resulting from congestion along a communication path. It is well known that as congestion increases, for example at a node along a communication path, it is important that traffic is reduced at that node in order to avoid an unstable situation, for instance, with high packet loss resulting from buffer overruns, which then further increases data rates due to retransmission approaches. One common approach to addressing congestion-based transients uses an adaptive window size of "in flight" packets that have not yet been acknowledged by their destinations. The size of the window is adapted at each of the sources to avoid congestion-based instability, for example, by significantly reducing the size of the window upon detection of increased packet erasure rates.

In addressing communication over a variety of channels, it has been observed that transients in communication characteristics may not be due solely to conventional congestion effects, and that conventional congestion avoidance approaches may not be optimal or even desirable. Some effects that may affect communication characteristics, and that may therefore warrant adaptation of the manner in which data is transmitted can include one or more of the follow:

Effects resulting from cell handoff in cellular systems, including interruptions in delivery of packets or substantial reordering of packets delivered after handoff;

Effects resulting from "half-duplex" characteristics of certain wireless channels, for example, in WiFi channels in which return packets from a destination may be delayed until the wireless channel is acquired for upstream (i.e., portable device to access point) communication;

Effects of explicit data shaping devices, for example, intended to throttle certain classes of communication, for instance, based on a service provider's belief that class of communication is malicious or is consuming more than a fair share of resources.

Although transient effects, which may not be based solely on congestion, may be tolerated using conventional congestion avoidance techniques, one or more of the approaches described below are particularly tailored to such classes of effects with the goal of maintaining efficient use of a channel without undue "over-reaction" upon detection of a transient situation, while still avoiding causing congestion-based packet loss.

Inter-Packet Coding

In general, the coding approaches used in embodiments described in this document make use of inter-packet coding in which redundancy information is sent over the channel such that the redundancy information in one packet is generally dependent on a set of other packets that have been or will be sent over the channel. Typically, for a set of N packets of information, a total of N+K packets are sent in a manner that erasure or any K of the packets allows reconstruction of the original N packets of information. In general, a group of N information packets, or a group of N+K packets including redundancy information (depending on context), is referred to below as a "block" or a "coding block". One example of such a coding includes N information packets without further coding, and then K redundancy packets, each of which depends on the N information packets. However it should be understood more than K of the packets (e.g., each of the N+K packets) may in some embodiments depend on all the N information packets.

Forward Error Correction and Repair Retransmission

Inter-packet coding in various embodiments described in this document use one or both of pre-emptive transmission of redundant packets, generally referred to as forward error correction (FEC), and transmission of redundant packets upon an indication that packets have or have a high probability of having been erased based on feedback, which is referred to below as repair and/or retransmission. The feedback for repair retransmission generally comes from the receiver, but more generally may come from a node or other channel element on the path to the receiver, or some network element having information about the delivery of packets along the path. In the FEC mode, K redundant packets may be transmitted in order to be tolerant of up to K erasures of the N packets, while in the repair mode, in some examples, for each packet that the transmitter believes has been or has high probability of having been erased, a redundant packet it transmitted from the transmitter, such that if in a block of N packets, K packets are believed to have been erased based on feedback, the transmitter sends at least an additional K packets.

As discussed more fully below, use of a forward error correction mode versus a repair mode represents a tradeoff between use of more channel capacity for forward error correction (i.e., reduced throughout of information) versus incurring greater latency in the presence of erasures for repair retransmission. As introduced above, the data characteristics being transmitted may determine the relative importance of throughput versus latency, and the PC-TCP modules may be configured or adapted accordingly.

If on average the packet erasure rate E is less than K/(N+K), then "on average" the N+K packets will experience erasure of K or fewer of the packets and the remaining packets will be sufficient to reconstruct the original N. Of course even if E is not greater than K/(N+K), random variability, non-stationarity of the pattern of erasures etc. results in some fraction of the sets of N+K packets having greater than K erasures, so that there is insufficient information to reconstruct the N packets at the destination. Therefore, even using FEC, at least some groups of N information packets will not be reconstructable. Note, for example, with E=0.2, N=8, and K=2, even though only 2 erasures may be expected on average, the probability of more than 2 erasures is greater than 30%, and even with E=0.1 this probability is greater than 7%, therefore the nature (e.g., timing, triggering conditions etc.) of the retransmission approaches may be significant, as discussed further below. Also as discussed below, the size of the set of packets that are coded together is significant. For example, increasing N by a factor of 10 to K+N=100 reduces the probably of more than the average number of 20 erasures (i.e., too many erasures to reconstruct the N=80 data packets) from over 7% to less than 0.1%.

Also as discussed further below, there is a tradeoff between use of large blocks of packets (i.e., large N) versus smaller blocks. For a particular code rate R=N/(N+K), longer blocks yield a higher probability of being able to fully recover the N information packets in the presence of random errors. Accordingly, depending on the data characteristics, the PC-TCP modules may be configured to adapt to achieve a desired tradeoff.

In general, in embodiments that guarantee delivery of the N packets, whether or not FEC is used, repair retransmission approaches are used to provide further information for reconstructing the N packets. In general, in preferred embodiments, the redundancy information is formed in such a manner that upon an erasure of a packet, the redundancy information that is sent from the transmitter does not depend on the specific packets that were erased, and is nevertheless suitable for repairing the erasure independent of which packet was erased.

Random Linear Coding

In general, a preferred approach to inter-packet coding is based on Random Linear Network Coding (RLNC) techniques. However, it should be understood that although based on this technology, not all features that may be associated with this term are necessarily incorporated. In particular, as described above in the absence of intermediate nodes that perform recoding, there is not necessarily a "network" aspect to the approach. Rather, redundancy information is generally formed by combining the information packets into coded packets using arithmetic combinations, and more specifically, as sums of products of coefficients and representation of the information packets over arithmetic fields, such as finite fields (e.g., Galois Fields of order $p^n$). In general, the code coefficients are chosen from a sufficiently large finite field in a random or pseudo-random manner, or in another way that the combinations of packets have a very low probability or frequency of being linearly dependent. The code coefficients, or a compressed version (e.g., as a reference into a table shared by the transmitter and receiver), are included in each transmitted combination of data units (or otherwise communicated to the receiver) and used for decoding at the receiver. Very generally, the original information packets may be recovered at a receiver by inverting the arithmetic combinations. For example, a version of Gaussian Elimination may be used to reconstruct the original packets from the coded combinations. A key feature of this approach is that for a set of N information packets, as soon at the receiver has at least N linearly independent combinations of those information packets in received packets, it can reconstruct the original data units. The term "degree of freedom" is generally used below to refer to a number of independent linear combinations, such that if N degrees of freedom have been specified for N original packets, then the N original packets can be reconstructed; while if fewer than N degrees of freedom are available, it may not be possible to fully reconstruct any of the N original packets. If N+K linearly independent linear combinations are sent, then any N received combinations (i.e., N received degrees of freedom) are sufficient to reconstruct the original information packets.

In some examples, the N+K linearly independent combinations comprise N selections of the N "uncoded" information packets (essentially N−1 zero coefficients and one unit coefficient for each uncoded packet), and K coded packets comprising the random arithmetic combination with N non-zero coefficients for the N information packets. The N uncoded packets are transmitted first, so that in the absence of erasures they should be completely received as soon as possible. In the case of one erasure of the original N packets, the receiver must wait for the arrival of one redundant packet (in addition to the N−1 original packets), and once that packet has arrived, the erased packet may be reconstructed. In the case of forward error correction, the K redundant packets follow (e.g., immediately after) the information packets, and the delay incurred in reconstructing the erased information packet depends on the transmission time of packets. In the case of repair retransmission, upon detection of an erasure or high probability of an erasure, the receiver provides feedback to the transmitter, which sends the redundancy information upon receiving the feedback. Therefore, the delay in being able to reconstruct the erased packet depends on the round-trip-time from the receiver to the transmitter and back.

As discussed in more detail below, feedback from the receiver to the transmitter may be in the form of acknowledgments sent from the receiver to the transmitter. This feedback in acknowledgements at least informs the transmitter of a number of the N+K packets of a block that have been successfully received (i.e., the number of received degrees of freedom), and may provide further information that depends on the specific packets that have been received at the receiver although such further information is not essential As introduced above, packets that include the combinations of original packets generally also include information needed to determine the coefficients used to combine the original packets, and information needed to identify which original packets were used in the combination (unless this set, such as all the packets of a block, is implicit). In some implementations, the coefficients are explicitly represented in the coded packets. In some embodiments, the coefficients are encoded with reference to shared information at the transmitter and the receiver. For instance, tables of pre-generated (e.g., random, pseudo random, or otherwise selected) coefficients, or sets of coefficients, may be stored and references into those tables are used to determine the values of the coefficients. The size of such a table determines the number of parity packets that can be generated while maintaining the linear independence of the sets of coefficients. It should be understood that yet other ways may be used to determine the coefficients.

Another feature of random linear codes is that packets formed as linear combinations of data units may themselves be additively combined to yield combined linear combinations of data units. This process is referred to in some instances as "recoding", as distinct from decoding and then repeating encoding.

There are alternatives to the use of RLNC, which do not necessarily achieve similar optimal (or provably optimum, or near optimal) throughput as RLNC, but that give excellent performance in some scenarios when implemented as described herein. For example, various forms of parity check codes can be used. Therefore, it should be understood that RLNC, or any particular aspect of RLNC, is not an essential feature of all embodiments described in this document.

Batch Transmission

As introduced above, in at least some applications, data to be transmitted from a transmitter to a receiver forms a batch (i.e., as opposed to a continuous stream), with an example of a batch being a file or a segment (e.g., a two second segment of multimedia) of a file.

In an embodiment of the PC-TCP modules, the batch is transferred from the transmitter to the receiver as a series of blocks, with each block being formed from a series of information packets. In general, each block has the same number of information packets, however use of same size blocks is not essential.

The transmitter PC-TCP module generally receives the data units from the source application and forms the information packets of the successive blocks of the batch. These information packets are queued at the transmitter and transmitted on the channel to the receiver. In general, at the transmitter, the dequeueing and transmission of packets to the receiver makes use of congestion control and/or rate control mechanisms described in more detail below. The transmitter PC-TCP also retains the information packets (or sufficient equivalent information) to construct redundancy information for the blocks. For instance the transmitter PC-TCP buffers the information packets for each block for which there remains the possibility of an unrecovered erasure of a packet during transit from the transmitter to the receiver.

In general, the receiver provides feedback to the transmitter. Various approaches to determining when to provide the feedback and what information to provide with the feedback are described further below. The feedback provides the transmitter with sufficient information to determine that a block has been successfully received and/or reconstructed at the receiver. When such success feedback for a block has been received, the transmitter no longer needs to retain the information packets for the block because there is no longer the possibility that redundancy information for the block will need to be sent to the receiver.

The feedback from the receiver to the transmitter may also indicate that a packet is missing. Although in some cases the indication that a packet is missing is a premature indication of an erasure, in this embodiment the transmitter uses this missing feedback to trigger sending redundant information for a block. In some examples, the packets for a block are numbered in sequence of transmission, and the feedback represents the highest number received and the number of packets (i.e., the number of degrees of freedom) received (or equivalently the number of missing packets or remaining degrees of freedom needed) for the block. The transmitter addresses missing packet feedback for a block through the transmission of redundant repair blocks, which may be used by the receiver to reconstruct the missing packets and/or original packets of the block.

As introduced above, for each block, the transmitter maintains sufficient information to determine the highest index of a packet received at the receiver, the number of missing packets transmitted prior to that packet, and the number of original or redundancy packets after the highest index received that have been transmitted (i.e., are "in flight" unless erased in transit) or queued for transmission at the transmitter.

When the transmitter receives missing packet feedback for a block, if the number of packets for the block that are "in flight" or queue would not be sufficient if received successfully (or are not expected to be in view of the erasure rate), the transmitter computes (or retrieves precomputed) a new redundant packet for the block and queues it for transmission. Such redundancy packets are referred to as repair packets. In order to reduce the delay in reconstructing a block of packets at the receiver, the repair packets are sent preferentially to the information packets for later blocks. For instance, the repair packets are queued in a separate higher-priority queue that is used to ensure transmission of repair packets preferentially to the queue of information packets.

In some situations, feedback from the receiver may have indicated that a packet is missing. However, that packet may later arrive out of order, and therefore a redundant packet for that block that was earlier computed and queued for transmission is no longer required to be delivered to the receiver. If that redundant packet has not yet been transmitted (i.e., it is still queued), that packet may be removed from the queue thereby avoiding wasted use of channel capacity for a packet that will not serve to pass new information to the receiver.

In the approach described above, redundancy packets are sent as repair packets in response to feedback from the receiver. In some examples, some redundancy packets are sent pre-emptively (i.e., as forward error correction) in order to address possible packet erasures. One approach to send such forward error correction packets for each block. However, if feedback has already been received at the transmitter that a sufficient number of original and/or coded packets for a block have been received, then there is no need to send further redundant packets for the block.

In an implementation of this approach, the original packets for all the blocks of the batch are sent first, while repair packets are being preferentially sent based on feedback from the receiver. After all the original packets have been transmitted, and the queue of repair packets is empty, the transmitter computes (or retrieves precomputed) redundancy packets for blocks for which the transmitter has not yet received feedback that the blocks have been successfully received, and queues those blocks as forward error correction packets for transmission in the first queue. In general, because the repair blocks are sent with higher priority that the original packets, the blocks for which success feedback has not yet been received are the later blocks in the batch (e.g., a trailing sequence of blocks of the batch).

In various versions of this approach, the number and order of transmission of the forward error correction packets are determined in various ways. A first way uses the erasure rate to determine how many redundant packets to transmit. One approach is to send at least one redundant packet for each outstanding block. Another approach is to send a number of redundancy packets for each outstanding block so that based on an expectation of the erasure rate of the packets that are queued and in flight for the block will yield a sufficient number of successfully received packets in order to reconstruct the block. For example, if a further n packets are needed to reconstruct a block (e.g., a number $n<N$ packets of the original N packets with $N-n$ packets having been erased), then $n+k$ packets are sent, for instance, with $n+k \geq n/E$, where E is an estimate of the erasure rate on the channel.

Another way of determining the number and order of forward error correction packets addresses the situation in which a block transmission time is substantially less than the round-trip-time for the channel. Therefore, the earliest of the blocks for which the transmitter has not received success feedback may in fact have the success feedback in flight from the receiver to the transmitter, and therefore sending forward error correction packets may be wasteful. Similarly, even if feedback indicating missing packet feedback for a block is received sufficiently early, the transmitter may still send a repair packet without incurring more delay in complete reconstruction of the entire batch than would be achieved by forward error correction.

In an example, the number of forward error correction packets queued for each block is greater for later blocks in the batch than for earlier ones. A motivation for this can be understood by considering the last block of the batch where it should be evident that it is desirable to send a sufficient number of forward error correction packets to ensure high probability of the receiver having sufficient information to reconstruct the block without the need from transmission of a repair packet and the associated increase in latency. On the other hand, it is preferable to send fewer forward error correction packets for the previous (or earlier) block because in the face of missing packet feedback from the receiver, the transmitter may be able to send a repair packet before forward error correction packets for all the later blocks have been sent, thereby not incurring a delay in overall delivery of the batch.

In one implementation, after all the original packets have been sent, and the transmitter is in the forward error correction phase in which it computes and sends the forward error correction packets, if the transmitter receives a missing packet feedback from the receiver, it computes and sends a repair packet for the block in question (if necessary) as described above, and clears the entire queue of forward error correction packets. After the repair packet queue is again empty, the transmitter again computes and queues forward error correction packets for the blocks for which it has not yet received success feedback. In an alternative somewhat equivalent implementation, rather than clearing the forward error correction queue upon receipt of a missing packet feedback, the transmitter removes forward error correction packets from the queue as they are no longer needed based on feedback from the receiver. In some examples, if success feedback is received for a block for which there are queued forward error correction packets, those forward error correction packets are removed from the queue. In some examples, the feedback from the receiver may indicate that some but not all of the forward error correction packets in the queue are no longer needed, for example, because out-of-order packets were received but at least some of the original packets are still missing.

An example of the way the transmitter determines how many forward error correction packets to send is that the transmitter performs a computation:

$$(N+g(i)-a_i)/(1-p)-f_i$$

where p=smoothed loss rate,

N=block size,

=block index defined as number of blocks from last block, $a_i$=number of packets acked from block i, $f_i$=packets in-flight from block i, and g(i)=a decreasing function of i, to determine the number of FEC packets for a block.

In some examples, g(i) is determined as a maximum of a configurable parameter, m and N-i. In some examples, g(i) is determined as N−p(i) where p is a polynomial, with integer rounding as needed It should be understood that in some alternative implementations, at least some forward error correction packets may be interspersed with the original packets. For example, if the erasure rate for the channel is relatively high, then at least some number of redundancy packets may be needed with relatively high probability for each block, and there is an overall advantage to preemptively sending redundant FEC packets as soon as possible, in addition to providing the mechanism for feedback based repair that is described above.

It should be also understood that use of subdivision of a batch into blocks is not necessarily required in order to achieve the goal of minimizing the time to complete reconstruction of the block at the receiver. However, if the forward error correction is applied uniformly to all the packets of the batch, then the preferential protection of later packets would be absent, and therefore, latency caused by erasure of later packets may be greater than using the approach described above. However, alternative approaches to non-uniform forward error protection (i.e., introduction of forward error correction redundancy packets) may be used. For example, in the block based approach described above, packets of the later blocks each contribute to a greater number of forward error correction packets than do earlier ones, and an alternative approach to achieving this characteristic maybe to use a non-block based criterion to construction of the redundancy packets in the forward error correction phase. However, the block based approach described above has advantages of relative simplicity and general robustness, and therefore even if marginally "suboptimal" provides an overall advantageous technical solution to minimizing the time to complete reconstruction within the constraint of throughput and erasure on the channel linking the transmitter and receiver.

Another advantage of using a block-based approach is that, for example, when a block within the batch, say the $m^{th}$ block of M blocks of the batch has an erasure, the repair packet that is sent from the transmitter depends only on the N original packets of the $m^{th}$ block. Therefore, as soon as the repair packet arrives, and the available (i.e., not erased) N−1 packets of the block arrive, the receiver has the information necessary to repair the block. Therefore, by constructing the repair packet without contribution of packets in later blocks of the batch, the latency of the reconstruction of the block is reduced. Furthermore, by having the repair packets depend on only N original packets, the computation required to reconstruct the packets of the block is less than if the repair packets depend on more packets.

It should be understood that even in the block based transmission of a batch of packets, the blocks are not necessarily uniform in size, and are not necessarily disjoint. For example, blocks may overlap (e.g., by 50%, 75%, etc.) thereby maintaining at least some of the advantages of reduced complexity in reconstruction and reduced buffering requirements as compared to treating the batch as one block. An advantage of such overlapping blocks may be a reduced latency in reconstruction because repair packets may be sent that do not require waiting for original packets at the receiver prior to reconstruction. Furthermore, non-uniform blocks may be beneficial, for example, to increase the effectiveness of forward error correction for later block in a batch by using longer blocks near the end of a batch as compared to near the beginning of a batch.

In applications in which the entire batch is needed by the destination application before use, low latency of reconstruction may be desirable to reduce buffering requirements in the PC-TCP module at the receiver (and at the transmitter). For example, all packets that may contribute to a later received repair packet are buffered for their potential future use. In the block based approach, once a block is fully reconstructed, then the PC-TCP module can deliver and discard those packets because they will not affect future packet reconstruction.

Although described as an approach to delivery of a batch of packets, the formation of these batches may be internal to the PC-TCP modules, whether or not such batches are formed at the software application level. For example, the PC-TCP module at the transmitter may receive the original data units that are used to form the original packets via a software interface from the source application. The packets are segmented into blocks of N packets as described above, and the packets queued for transmission. In one embodiment, as long as the source application provides data units sufficiently quickly to keep the queue from emptying (or from emptying for a threshold amount of time), the PC-TCP module stays in the first mode (i.e., prior to sending forward error correction packets) sending repair packets as needed based on feedback information from the receiver. When there is a lull in the source application providing data units, then the PC-TCP module declares that a batch has been completed, and enters the forward error correction phase described above. In some examples, the batch formed by the PC-TCP module may in fact correspond to a batch of data units generated by the source application as a result of a lull in the source application providing data units to the PC-TCP module while it computes data units for a next batch, thereby inherently synchronizing the batch processing by the source application and the PC-TCP modules.

In one such embodiment, the PC-TCP module remains in the forward error correction mode for the declared batch until that entire batch has been successfully reconstructed at the receiver. In another embodiment, if the source application begins providing new data units before the receiver has provided feedback that the previous batch has been successfully reconstructed, the transmitter PC-TCP module begins sending original packets for the next batch at a lower priority than repair or forward error correction packets for the previous batch. Such an embodiment may reduce the time to the beginning of transmission of the next batch, and therefore reduces the time to successful delivery of the next batch.

In the embodiments in which the source application does not necessarily provide the data in explicit batches, the receiver PC-TCP module provides the data units in order to the destination application without necessarily identifying the block or batch boundaries introduced at the transmitter PC-TCP module. That is, in at least some implementations, the transmitter and receiver PC-TCP modules provide a reliable channel for the application data units without exposing the block and batch structure to the applications.

As described above for certain embodiments, the transmitter PC-TCP module reacts to missing packet feedback from the receiver PC-TCP module to send repair packets. Therefore, it should be evident that the mechanism by which the receiver sends such feedback may affect the overall behavior of the protocol. For example, in one example, the receiver PC-TCP module sends a negative acknowledgment as soon as it observes a missing packet. Such an approach may provide the lowest latency for reconstruction of the block. However, as introduced above, missing packets may be the result of out-of-order delivery. Therefore, a less aggressive generation of missing packet feedback, for example, by delay in transmission of a negative acknowledgment, may reduce the transmission of unnecessary repair packets with only a minimal increase in latency in reconstruction of that block. However, such delay in sending negative acknowledgements may have an overall positive impact on the time to successfully reconstruct the entire block because later blocks are not delayed by unnecessary repair packets. Alternative approaches to generation of acknowledgments are described below.

In some embodiments, at least some of the determination of when to send repair packets is performed at the transmitter PC-TCP. For example, the receiver PC-TCP module may not delay the transmission of missing packet feedback, and it is the transmitter PC-TCP module that delays the transmission of a repair packet based on its weighing of the possibility of the missing packet feedback being based on out-of-order delivery as opposed to erasure.

Protocol Parameters

Communication between two PC-TCP endpoints operates according to parameters, some of which are maintained in common by the endpoints, and some of which are local to the sending and/or the receiving endpoint. Some of these parameters relate primarily to forward error correction aspects of the operation. For example, such parameters include the degree of redundancy that is introduced through the coding process. As discussed below, further parameters related to such coding relate to the selection of packets for use in the combinations. A simple example of such selection is segmentation of the sequence of input data units into "frames" that are then independently encoded. In addition to the number of such packets for combination (e.g., frame length), other parameters may relate to overlapping and/or interleaving of such frames of data units and/or linear combinations of such data units.

Further parameters relate generally to transport layer characteristics of the communication approach. For example, some parameters relate to congestion avoidance, for example, representing a size of a window of unacknowledged packets, transmission rate, or other characteristics related to the timing or number of packets sent from the sender to the receiver of the PC-TCP communication.

As discussed further below, communication parameters (e.g., coding parameters, transport parameters) may be set in various ways. For example, parameters may be initialized upon establishing a session between two PC-TCP endpoints. Strategies for setting those parameters may be based on various sources of information, for example, according to knowledge of the communication path linking the sender and receiver (e.g., according to a classification of path type, such as 3G wireless versus cable modem), or experienced communication characteristics in other sessions (e.g., concurrent or prior sessions involving the same sender, receiver, communication links, intermediate nodes, etc.). Communication parameters may be adapted during the course of a communication session, for example, in response to observed communication characteristics (e.g., congestion, packet loss, round-trip time, etc.) Transmission control Some aspects of the PC-TCP approaches relate to control of transmission of packets from a sender to a receiver. These aspects are generally separate from aspects of the approach that determine what is sent in the packets, for example, to accomplish forward error correction, retransmission, or the order in which the packets are sent (e.g., relative priority of forward error correction packets version retransmission packets). Given a queue of packets that are ready for transmission from the sender to the receiver, these transmission aspects generally relate to flow and/or congestion control.

Congestion Control

Current variants of TCP, including binary increase congestion control (BIC) and cubic-TCP, have been proposed to address the inefficiencies of classical TCP in networks with high losses, large bandwidths and long round-trip times. BIC-TCP and CUBIC algorithms have been used because of their stability. After a backoff, BIC increases the congestion window linearly then logarithmically to the window size just before backoff (denoted by $W_{max}$) and subsequently increases the window in an anti-symmetric fashion exponentially then linearly. CUBIC increases the congestion window following backoff according to a cubic function with inflection point at $W_{max}$. These increase functions cause the congestion window to grow slowly when it is close to $W_{max}$, promoting stability. On the other hand, other variants such as HTCP and FAST TCP have the advantage of being able to partially distinguish congestion and non-congestion losses through the use of delay as a congestion signal.

An alternative congestion control approach is used in at least some embodiments. In some such embodiments, we identify a concave portion of the window increase function as $W_{concave}(t)=W_{max}+c_1(t-k)^3$ and a convex portion of the window increase function as $W_{convex}(t)=W_{max}+c_2(t-k)^3$ where $c_1$ and $c_2$ are positive tunable parameters and $$k=\sqrt[3]{((\text{W\_max}-W)/c_1)}$$

and W is the window size just after backoff.

This alternative congestion control approach can be flexibly tuned for different scenarios. For example, a larger value of $c_1$ causes the congestion window to increase more rapidly up to $W_{max}$ and a large value of $c_2$ causes the congestion window to increase more rapidly beyond $W_{max}$.

Optionally, delay is used as an indicator to exit slow start and move to the more conservative congestion avoidance phase, e.g. when a smoothed estimate of RTT exceeds a configured threshold relative to the minimum observed RTT for the connection. We can also optionally combine the increase function of CUBIC or other TCP variants with the delay-based backoff function of HTCP.

In some embodiments, backoff is smoothed by allowing a lower rate of transmission until the number of packets in flight decreases to the new window size. For instance, a threshold, n, is set such that once n packets have been acknowledged following a backoff, then one packet is allowed to be sent for every two acknowledged packets, which is roughly half of the previous sending rate. This is akin to a hybrid window and rate control scheme. Transmission rate control Pacing control by sender In at least some embodiments, pacing is used to regulate and/or spread out packet transmissions, making the transmission rate less bursty. While pacing can help to reduce packet loss from buffer overflows, previous implementations of pacing algorithms have not shown clear advantages when comparing paced TCP implementations to non-paced TCP implementations. However, in embodiments where the data packets are coded packets as described above, the combination of packet coding and pacing may have advantages. For example, since one coded packet may be used to recover multiple possible lost packets, we can use coding to more efficiently recover from any spread out packet losses that may result from pacing. In embodiments, the combination of packet coding and pacing may have advantages compared to uncoded TCP with selective acknowledgements (SACK).

Classical TCP implements end-to-end congestion control based on acknowledgments. Variants of TCP designed for high-bandwidth connections increase the congestion window (and consequently the sending rate) quickly to probe for available bandwidth but this can result in bursts of packet losses when it overshoots, if there is insufficient buffering in the network.

A number of variants of TCP use acknowledgment feedback to determine round-trip time and/or estimate available bandwidth, and they differ in the mechanisms with which this information is used to control the congestion window and/or sending rate. Different variants have scenarios in which they work better or worse than others.

In one general approach used in one or more embodiments, a communication protocol may use smoothed statistics of intervals between acknowledgments of transmitted packets (e.g., a smoothed “ack interval”) to guide a transmission of packets, for example, by controlling intervals (e.g., an average interval or equivalently an average transmission rate) between packet transmissions. Broadly, this guiding of transmission intervals is referred to herein as “pacing”.

In some examples, the pacing approach is used in conjunction with a window-based congestion control algorithm. Generally, the congestion window controls the number of unacknowledged packets that can be sent, in some examples using window control approaches that are the same or similar to those used in known variants of the Transmission Control Protocol (TCP). In embodiments, the window control approach is based on the novel congestion control algorithms described herein.

A general advantage of one or more aspects is to improve functioning of a communication system, for instance, as measured by total throughput, or delay and/or variation in delay. These aspects address a technical problem of congestion, and with it packet loss, in a network by using “pacing” to reduce that congestion.

An advantage of this aspect is that the separate control of pacing can prevent packets in the congestion window from being transmitted too rapidly compared to the rate at which they are getting through to the other side. Without separate pacing control, at least some conventional TCP approaches would permit bursts of overly rapid transmission of packets, which might result in packet loss at an intermediate node on the communication path. These packet losses may be effectively interpreted by the protocol as resulting from congestion, resulting in the protocol reducing the window size. However, the window size may be appropriate, for example, for the available bandwidth and delay of the path, and therefore reducing the window size may not be necessary. On the other hand, reducing the peak transmission rate can have the effect of avoiding packet loss, for example, by avoiding overflow of intermediate buffers on the path Another advantage of at least some implementations is prevention of large bursts of packet losses under convex window increase functions for high-bandwidth scenarios, by providing an additional finer level of control over the transmission process.

At least some implementations of the approach can leverage the advantages of existing high-bandwidth variants of TCP such as H-TCP and CUBIC, while preventing large bursts of packet losses under their convex window increase functions and providing a more precise level of control. For example, pacing control may be implemented to pace the rate of providing packets from the existing TCP procedure to the channel, with the existing TCP procedure typically further or separately limiting the presentation of packets to the communication channel based, for instance, on its window-based congestion control procedure.

In practice, a particular example in which separating pacing from window control has been observed to significantly outperform conventional TCP on 4G LTE.

Figure 158:
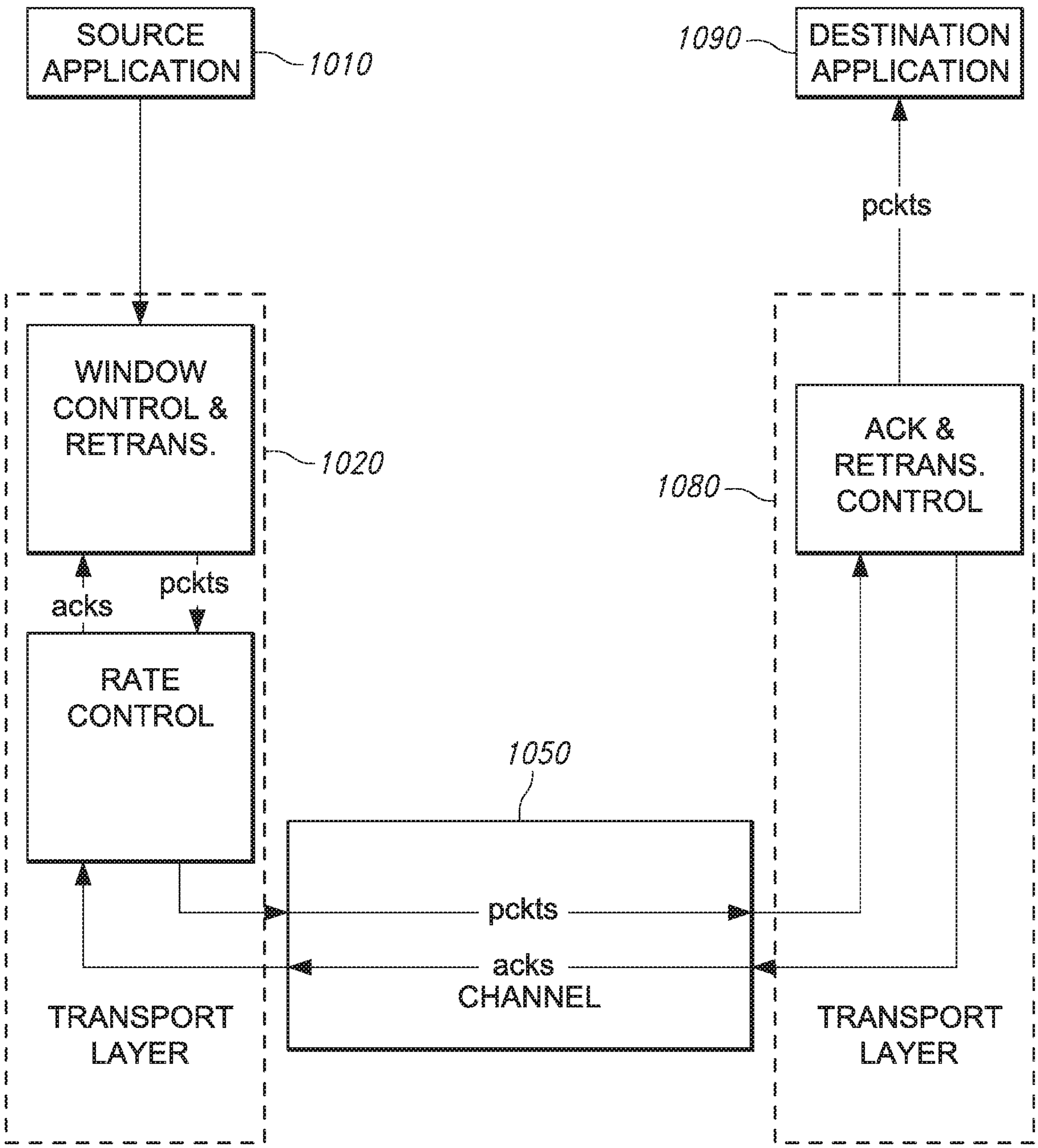
FIG. 158 is a block diagram of PC-TCP communication approach that includes window and rate control modules.

Referring to FIG. 158, in one example, a source application 1010 passes data to a destination application 1090 over a communication channel 1050. Communication from the source application 1010 passes to a transport layer 1020, which maintains a communication session with a corresponding transport layer 1080 linked to the destination application 1090. In general, the transport layers may be implemented as software that executes on the same computer as their corresponding applications, however, it should be recognized that, for instance through the use of proxy approaches, the applications and the transport layer elements that are shown may be split over separate coupled computers. In embodiments, when a proxy is running on a separate machine or device from the application, the application may use the transport layer on its machine to communicate with the proxy layer.

In FIG. 158, the transport layer 1020 at the source application includes a window control and retransmission element 1030. In some implementations, this element implements a conventional Transport Control Protocol (TCP) approach, for instance, implementing H-TCP or CUBIC approaches. In other implementations, this element implements the novel congestion control algorithms described herein. The transport layer 1080 at the destination may implement a corresponding element 1060, which may provide acknowledgements of packets to the window control and retransmission element 1030 at the source. In general, element 1030 may implement a window-based congestion control approach based on acknowledgements that are received at the destination, however it should be understood that no particular approach to window control is essential, and in some implementations, element 1030 can be substituted with another element that implements congestion control using approaches other than window control.

Functionally, one may consider two elements of the protocol as being loss recovery and rate/congestion control. Loss recovery can be implemented either using conventional retransmissions or using coding or as a combination of retransmission and coding. Rate/congestion control may aim to avoid overrunning the receiver and/or the available channel capacity, and may be implemented using window control with or without pacing, or direct rate control.

The channel 1050 coupling the transport layers in general may include lower layer protocol software at the source and destination, and a series of communication links coupling computers and other network nodes on a path from the source to the destination As compared to conventional approaches, as shown in FIG. 136, a rate control element 1040 may be on the path between the window control and retransmission element 1030 and the channel 1050. This rate control element may monitor acknowledgements that are received from the destination, and may pass them on to the window control and retransmission element 1030, generally without delay. The rate control element 1040 receives packets for transmission on the channel 1050 from the window control and retransmission element 1030, and either passes them directly to the channel 1050, or buffers them to limit a rate of transmission onto the channel. For example, the rate control element 1040 may require a minimum interval between successive packets, or may control an average rate over multiple packets.

In embodiments, the acks that are transmitted on a return channel, from the destination to the source, may also be paced, and may also utilize coding to recover from erasures and bursty losses. In embodiments, packet coding and transmission control of the acks may be especially useful if there is congestion on the return channel.

In one implementation, the rate control element 1040 may maintain an average (i.e., smoothed) inter-packet delivery interval, estimated based on the acknowledgement intervals (accounting for the number of packets acknowledged in each ack). In some implementations this averaging may be computed as a decaying average of past sample inter-arrival times. This can be refined by incorporating logic for discarding large sample values based on the determination of whether they are likely to have resulted from a gap in the sending times or losses in the packet stream, and by setting configurable upper and lower limits on the estimated interval commensurate with particular characteristics of different known networks. The rate control element 1040 may then use this smoothed inter-acknowledgement time to set a minimum inter-transmission time, for example, as a fraction of the inter-acknowledgement time. This fraction can be increased with packet loss and with rate of increase of RTT (which may be indicators that the current sending rate may be too high), and decreased with rate of decrease of RTT under low loss, e.g. using a control algorithm such as proportional control whose parameters can be adjusted to trade off between stability and responsiveness to change. Upper and lower limits on this fraction can be made configurable parameters, say 0.2 and 0.95. Transmission packets are then limited to be presented to the channel 1050 with inter-transmission times of at least this set minimum. In other implementations inter-transmission intervals are controlled to maintain a smoothed average interval or rate based on a smoothed inter-acknowledgement interval or rate.

In addition to the short timescale adjustments of the pacing interval with estimated delivery interval, packet loss rate and RTT described above, there can also be a longer timescale control loop that modulates the overall aggressiveness of the pacing algorithm based on a smoothed loss rate calculated over a longer timescale, with, a higher loss rate indicating that pacing may be too aggressive. The longer timescale adjustment can be applied across short duration connections by having the client maintain state across successive connections and include initializing information in subsequent connection requests. This longer timescale control may be useful for improving adaptation to diverse network scenarios that change dynamically on different timescales.

Figure 159:
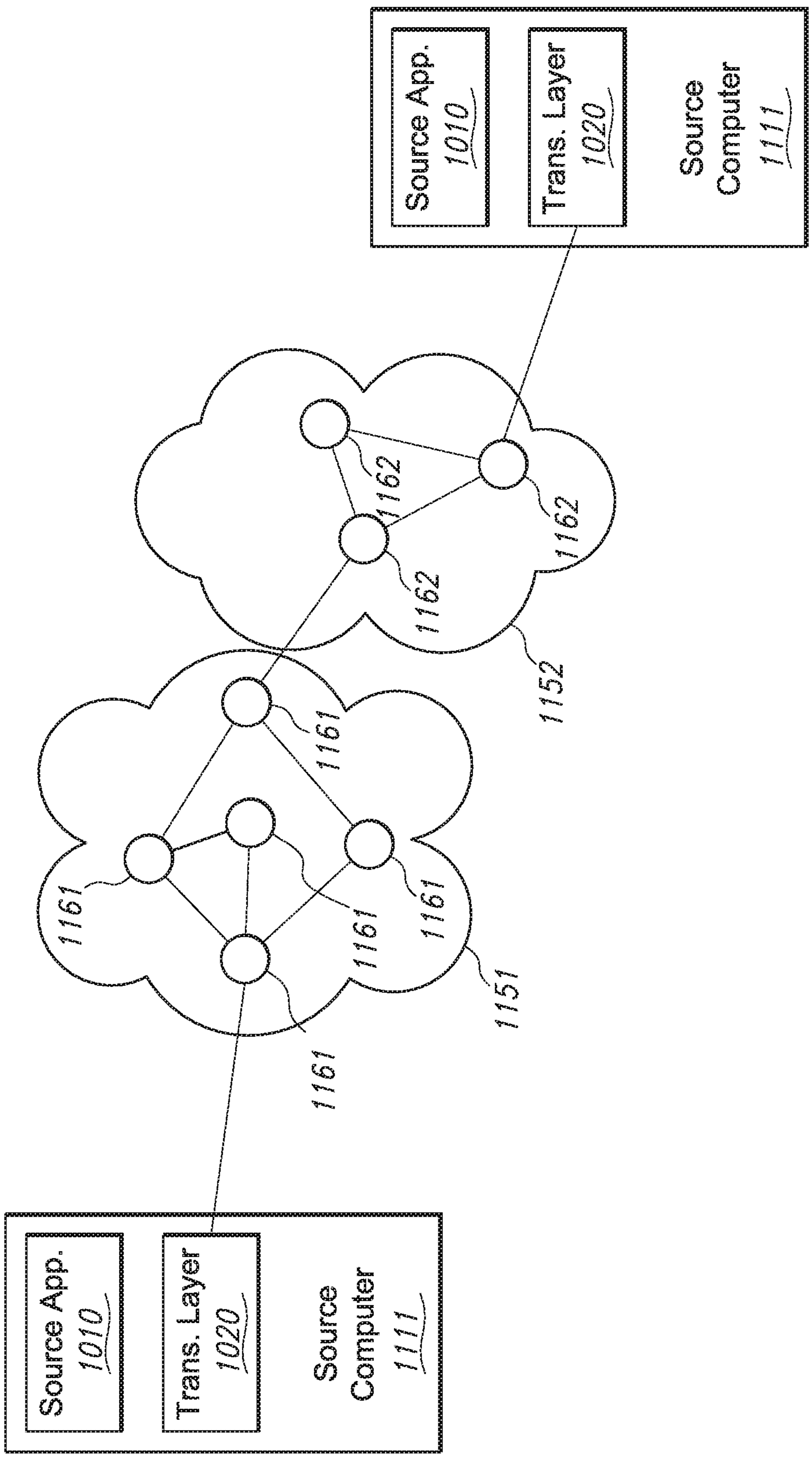
FIG. 159 is a schematic of a data network.

Referring to FIG. 159, in some implementations, the communication channel 1050 spans multiple nodes 1161, 1162 in one or an interconnection of communication networks 1151, 1152. In FIG. 137, the source application 1010 is illustrated as co-resident with the transport layer 1020 on a source computer 1111, and similarly, the transport layer 1080 is illustrated as co-resident on a destination computer 1190 with the destination application 1090.

It should be recognized that although the description above focuses on a single direction of communication, in general, a bidirectional implementation would include a corresponding path from the destination application to the source application. In some implementations, both directions include corresponding rate control elements 1040, while in other applications, only one direction (e.g., from the source to the destination application) may implement the rate control. For example, introduction of the rate control element 1040 at a server, or another device or network node on the path between the source application and the transport layer 1080 at the destination, may not require modification of the software at the destination.

Pacing by Receiver

As described above, the sender can use acks to estimate the rate/interval with which packets are reaching the receiver, the loss rate and the rate of change of RTT, and adjust the pacing interval accordingly. However, this estimated information may be noisy if acks are lost or delayed. On the other hand, such information can be estimated more accurately at the receiver with OWTT in place of RTT. By basing the pacing interval on the rate of change of OWTT rather than its actual value, the need for synchronized clocks on sender and receiver may be obviated. The pacing interval can be fed back to the sender by including it as an additional field in the acks. The choice as to whether the pacing calculations are done at the sender or the receiver, or done every n packets rather than upon every packet reception, may also be affected by considerations of sender/receiver CPU/load.

Error Control

Classical TCP performs poorly on networks with packet losses. Congestion control can be combined with coding such that coded packets are sent both for forward error correction (FEC) to provide protection against an anticipated level of packet loss, as well as for recovering from actual losses indicated by feedback from the receiver.

While the simple combination of packet coding and congestion control has been suggested previously, the prior art does not adequately account for differences between congestion-related losses, bursty and/or random packet losses. Since congestion-related loss may occur as relatively infrequent bursts, it may be inefficient to protect against this type of loss using FEC.

In at least some embodiments, the rates at which loss events occur are estimated. A loss event may be defined as either an isolated packet loss or a burst of consecutive packet losses. In some examples, the source PC-TCP may send FEC packets at the estimated rate of loss events, rather than the estimated rate of packet loss. This embodiment is an efficient way to reduce non-useful FEC packets, since it may not be disproportionately affected by congestion-related loss.

In an exemplary embodiment, the code rate and/or packet transmission rate of FEC can be made tunable in order to trade-off between the useful throughput seen at the application layer (also referred to as goodput) and recovery delay. For instance, the ratio of the FEC rate to the estimated rate of loss events can be made a tunable parameter that is set with a priori knowledge of the underlying communications paths or dynamically adjusted by making certain measurements of the underlying communications paths.

In another exemplary embodiment, the rate at which loss bursts of up to a certain length occur may be estimated, and appropriate burst error correcting codes for FEC, or codes that correct combinations of burst and isolated errors, may be used.

In another exemplary embodiment, the FEC for different blocks can be interleaved to be more effective against bursty loss.

In other exemplary embodiments, data packets can be sent preferentially over FEC packets. For instance, FEC packets can be sent at a configured rate or estimated loss rate when there are no data packets to be sent, and either not sent or sent at a reduced rate when there are data packets to be sent. In one implementation, FEC packets are placed in a separate queue which is cleared when there are data packets to be sent.

In other exemplary embodiments, the code rate/amount of FEC in each block and/or the FEC packet transmission rate can be made a tunable function of the block number and/or the number of packets in flight relative to the number of unacknowledged degrees of freedom of the block, in addition to the estimated loss rate. FEC packets for later blocks can be sent preferentially over FEC for earlier blocks, so as to minimize recovery delay at the end of a connection, e.g., the number of FEC packets sent from each block can be a tunable function of the number of blocks from the latest block that has not been fully acknowledged. The sending interval between FEC packets can be an increasing function of the number of packets in flight relative to the number of unacknowledged degrees of freedom of the corresponding block, so as to trade-off between sending delay and probability of losing FEC packets in scenarios where packet loss probability increases with transmission rate.

In other exemplary embodiments, a variable randomly chosen fraction of the coding coefficients of a coded packet can be set to 1 or 0 in order to reduce encoding complexity without substantially affecting erasure correction performance. In a systematic code, introducing 0 coefficients only after one or more densely coded packets (i.e. no or few 0 coefficients) may be important for erasure correction performance. For instance, an initial FEC packet in a block could have each coefficient set to 1 with probability 0.5 and to a uniformly random value from the coding field with probability 0.5. Subsequent FEC packets in the block could have each coefficient set to 0 with probability 0.5 and to uniformly random value with probability 0.5.

Packet Reordering

As introduced above, packets may be received out of order on some networks, for example, due to packets traversing multiple paths, parallel processing in some networking equipment, reconfiguration of a path (e.g., handoff in cellular networks). Generally, conventional TCP reacts to out of order packets by backing off the size of the congestion window. Such a backoff may unnecessarily hurt performance if there is no congestion necessitating a backoff.

In some embodiments, in an approach to handling packet reordering that does not result from congestions, a receiver observing a gap in the sequence numbers of its received packets may delay sending an acknowledgment for a limited time. When a packet is missing, the receiver does not immediately know if the packet has been lost (erased), or merely reordered. The receiver delays sending an acknowledgement that indicates the gap to see if the gap is filled by subsequent packet arrivals. In some examples, upon observing a gap, the receiver starts a first timer for a configurable "reordering detection" time interval, e.g. 20 ms. If a packet from the gap is subsequently received within this time interval, the receiver starts a second timer for a configurable "gap filling" time interval, e.g. 30 ms. If the first timer or the second timer expire prior to the gap being filled, an acknowledgement that indicates the gap is sent to the source.

Upon receiving the acknowledgment that indicates the gap in received packets the source, in at least some embodiments, the sender determines whether a repair packet should be sent to compensate for the gap in the received packets, for example, if a sufficient number of FEC packets have not already been sent.

In another aspect, a sender may store relevant congestion control state information (including the congestion window) prior to backoff, and a record of recent packet losses. If the sender receives an ack reporting a gap/loss and then subsequently one or more other acks reporting that the gap has been filled by out of order packet receptions, any backoff caused by the earlier ack can be reverted by restoring the stored state from before backoff.

In another aspect, a sender observing a gap in the sequence numbers of its received acks may delay congestion window backoff for a limited time. When an ack is missing, the sender does not immediately know if a packet has been lost or if the ack is merely reordered. The sender delays backing off its congestion window to see if the gap is filled by subsequent ack arrivals. In some examples, upon observing a gap, the sender starts a first timer for a configurable "reordering detection" time interval, e.g. 20 ms. If an ack from the gap is subsequently received within this time interval, the sender starts a second timer for a configurable "gap filling" time interval, e.g. 30 ms. If the first timer or the second timer expires prior to the gap being filled, congestion window backoff occurs.

In some examples, instead of using time intervals, packet sequence numbers are used. For example, sending of an ack can be delayed until a packet which is a specified number of sequence numbers ahead of the reference lost packet is received. Similarly, backing off can be delayed until an acknowledgment of a packet which is a specified number of sequence numbers ahead of the reference lost packet is received. In some examples, these approaches have the advantage of being able to take into account subsequently received/acknowledged reordered packets by shifting the sequence number of the reference lost packet as holes in the packet sequence get filled.

These methods for correcting packet reordering may be especially useful for multipath versions of the protocol, where there may be a large amount of reordering.

Acknowledgements

Delayed Acknowledgements

In at least some implementations, conventional TCP sends one acknowledgment for every two data packets received. Such delayed acking reduces ack traffic compared to sending an acknowledgment for every data packet. This reduction in ack traffic is particularly beneficial when there is contention on the return channel, such as in Wi-Fi networks, where both data and ack transmissions contend for the same channel.

It is possible to reduce ack traffic further by increasing the ack interval to a value n>2, i.e. sending one acknowledgment for every n data packets. However, reducing the frequency with which acks are received by the sender can cause delays in transmission (when the congestion window is full) or backoff (if feedback on losses is delayed), which can hurt performance.

In one aspect, the sender can determine whether, or to what extent, delayed acking should be allowed based in part on its remaining congestion window (i.e. its congestion window minus the number of unacknowledged packets in flight), and/or its remaining data to be sent. For example, delayed acking can be disallowed if there is any packet loss, or if the remaining congestion window is below some (possibly tunable) threshold. Alternatively, the ack interval can be reduced with the remaining congestion window. As another example, delayed acking can be allowed if the amount of remaining data to be sent is smaller than the remaining congestion window, but disallowed for the last remaining data packet so that there is no delay in acknowledging the last data packet. This information can be sent in the data packets as a flag indicating whether delayed acking is allowed, or for example, as an integer indicating the allowed ack interval.

Using relevant state information at the sender to influence delayed acking may allow an increase in the ack interval beyond the conventional value of 2, while mitigating the drawbacks described above that a larger ack interval across the board might have.

To additionally limit the ack delay, each time an ack is sent, a delayed ack timer can be set to expire with a configured delay, say 25 ms. Upon expiration of the timer, any data packets received since the last ack may be acknowledged, even if fewer packets than the ack interval n have arrived. If no packets have been received since the last ack, an ack may be sent upon receipt of the next data packet.

Parameter Control

Initialization

In some embodiments, to establish a session parameters for the PC-TCP modules are set to a predefine set of default parameters. In other embodiments, approaches that attempt to select better initial parameters are used. Approaches include use of parameter values from other concurrent or prior PC-TCP sessions, parameters determined from characteristics of the communication channel, for example, selected from stored parameters associated with different types of channels, or parameters determined by the source or destination application according to the nature of the data to be transported (e.g., batch versus stream).

Tunable Coding

Figure 160:
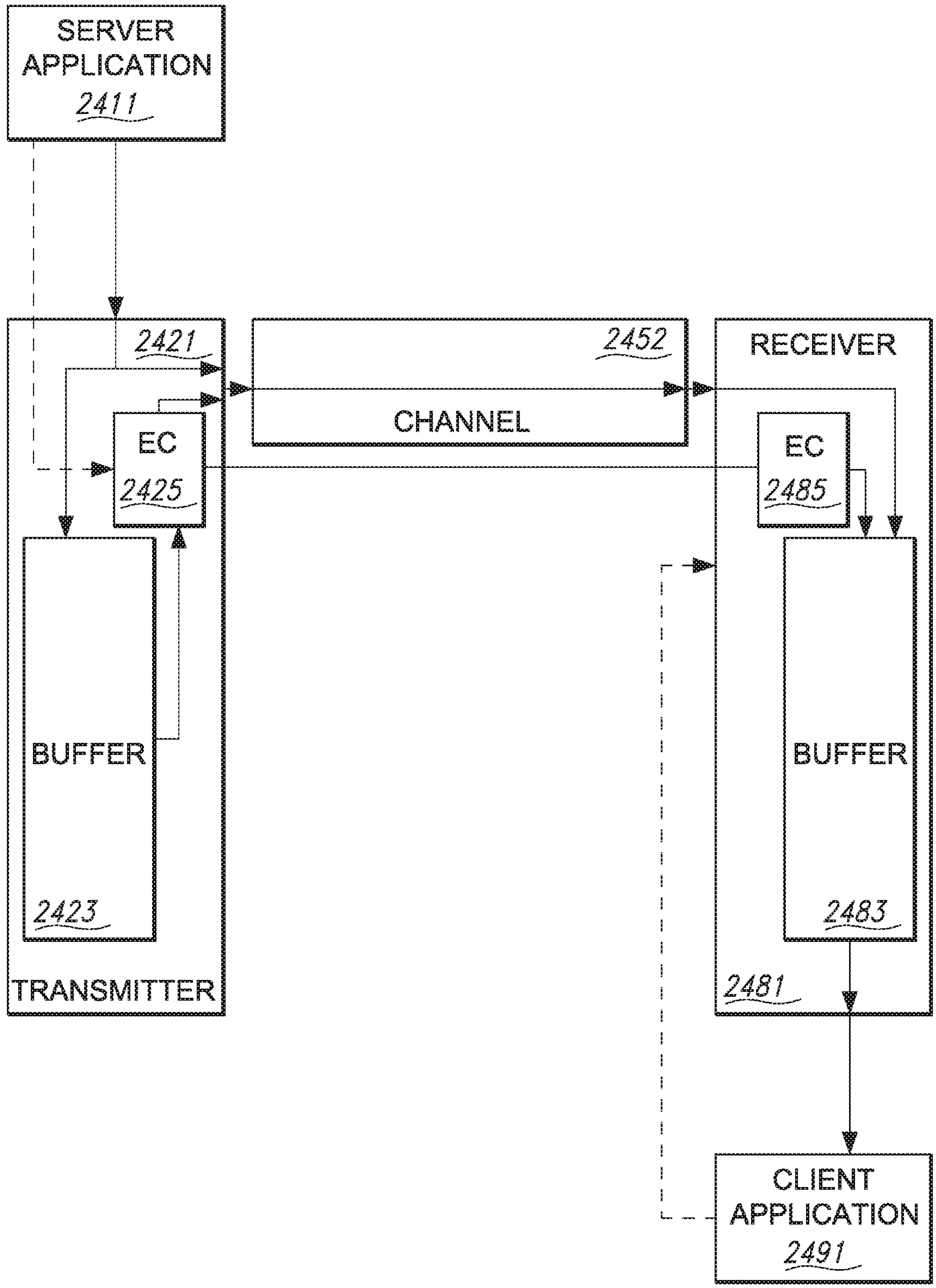
FIGS. 160-163 are block diagrams illustrating an embodiment PC-TCP communication approach that is configured according to a number of tunable parameters.

Referring to FIG. 160, in an embodiment in which parameters are "tuned" (e.g., through feedback from a receiver or on other considerations) a server application 2411 is in communication with a client application 2491 via a communication channel 2452. In one example, the server application 2411 may provide a data stream encoding multimedia content (e.g., a video) that is accepted by the client application 2491, for example, for presentation to a user of the device on which the client application is executing. The channel 2452 may represent what is typically a series of network links, for example including links of one or more types, including:

a link traversing private links on a server local area network, a link traversing the public Internet, a link traversing a fixed (i.e., wireline) portion of a cellular telephone network, and a link traversing a wireless radio channel to the user's device (e.g., a cellular telephone channel or satellite link or wireless LAN).

The channel 2452 may be treated as carrying a series of data units, which may but do not necessarily correspond directly to Internet Protocol (IP) packets. For example, in some implementations multiple data units are concatenated into an IP packet, while in other implementations, each data unit uses a separate IP packet or only part of an IP packet. It should be understood that in yet other implementations, the Internet Protocol is not used—the techniques described below do not depend on the method of passing the data units over the channel 2452.

A transmitter 2421 couples the server application 2411 to the channel 2452, and a receiver 2481 couples the channel 2452 to the client application 2491. Generally, the transmitter 2421 accepts input data units from the server application 2481. In general, these data units are passed over the channel 2452, as well as retained for a period of time in a buffer 2423. From time to time, an error control (EC) component 2425 may compute a redundancy data unit from a subset of the retained input data units in the buffer 2423, and may pass that redundancy data unit over the channel 2452. The receiver 2481 accepts data units from the channel 2452. In general, the channel 2452 may erase and reorder the data units. Erasures may correspond to "dropped" data units that are never received at the receiver, as well as corrupted data units that are received, but are known to have irrecoverable errors, and therefore are treated for the most part as dropped units. The receiver may retain a history of received input data units and redundancy data units in a buffer 2483. An error control component 2485 at the receiver 2481 may use the received redundancy data units to reconstruct erased input data units that may be missing in the sequence received over the channel. The receiver 2481 may pass the received and reconstructed input data units to the client application. In general, the receiver may pass these input data units to the client application in the order they were received at the transmitter.

In general, if the channel has no erasures or reordering, the receiver can provide the input data units to the client application with delay and delay variation that may result from traversal characteristics of the channel. When data units are erased in the channel 2452, the receiver 2481 may make use of the redundancy units in its buffer 2483 to reconstruct the erased units. In order to do so, the receiver may have to wait for the arrival of the redundancy units that may be useful for the reconstruction. The way the transmitter computes and introduces the redundancy data units generally affects the delay that may be introduced to perform the reconstruction.

The way the transmitter computes and introduces the redundancy data units as part of its forward error correction function can also affect the complexity of the reconstruction process at the receiver, and the utilization of the channel. Furthermore, regardless of the nature of the way the transmitter introduces the redundancy data units onto the channel, statistically there may be erased data units for which there is insufficient information in the redundancy data units to reconstruct the erased unit. In such cases, the error control component 2485 may request a retransmission of information from the error control component 2425 of the transmitter 2421. In general, this retransmitted information may take the form of further redundancy information that depends on the erased unit. This retransmission process introduces a delay before the erased unit is available to the receiver. Therefore, the way the transmitter introduces the redundancy information also affects the statistics such as how often retransmission of information needs to be requested, and with it the delay in reconstructing the erased unit that cannot be reconstructed using the normally introduced redundancy information.

In some embodiments, the error control component 2485 may provide information to the error control component 2425 to affect the way the transmitter introduces the redundancy information. In general, this information may be based on one or more of the rate of (or more generally the pattern of) erasures on units on the channel, rate of (or more generally timing pattern of) and the state of the available units in the buffer 2483 and/or the state of unused data in the client application 2491. For example, the client application may provide a "play-out time" (e.g., in milliseconds) of the data units that the receiver has already provided to the client application such that if the receiver were to not send any more units, the client application would be "starved" for input units at that time. Note that in other embodiments, rather than or in addition to receiving information from the receiver, the error control component 2425 at the transmitter may get feedback from other places, for example, from instrumented nodes in the network that pass back congestion information.

Figure 161:
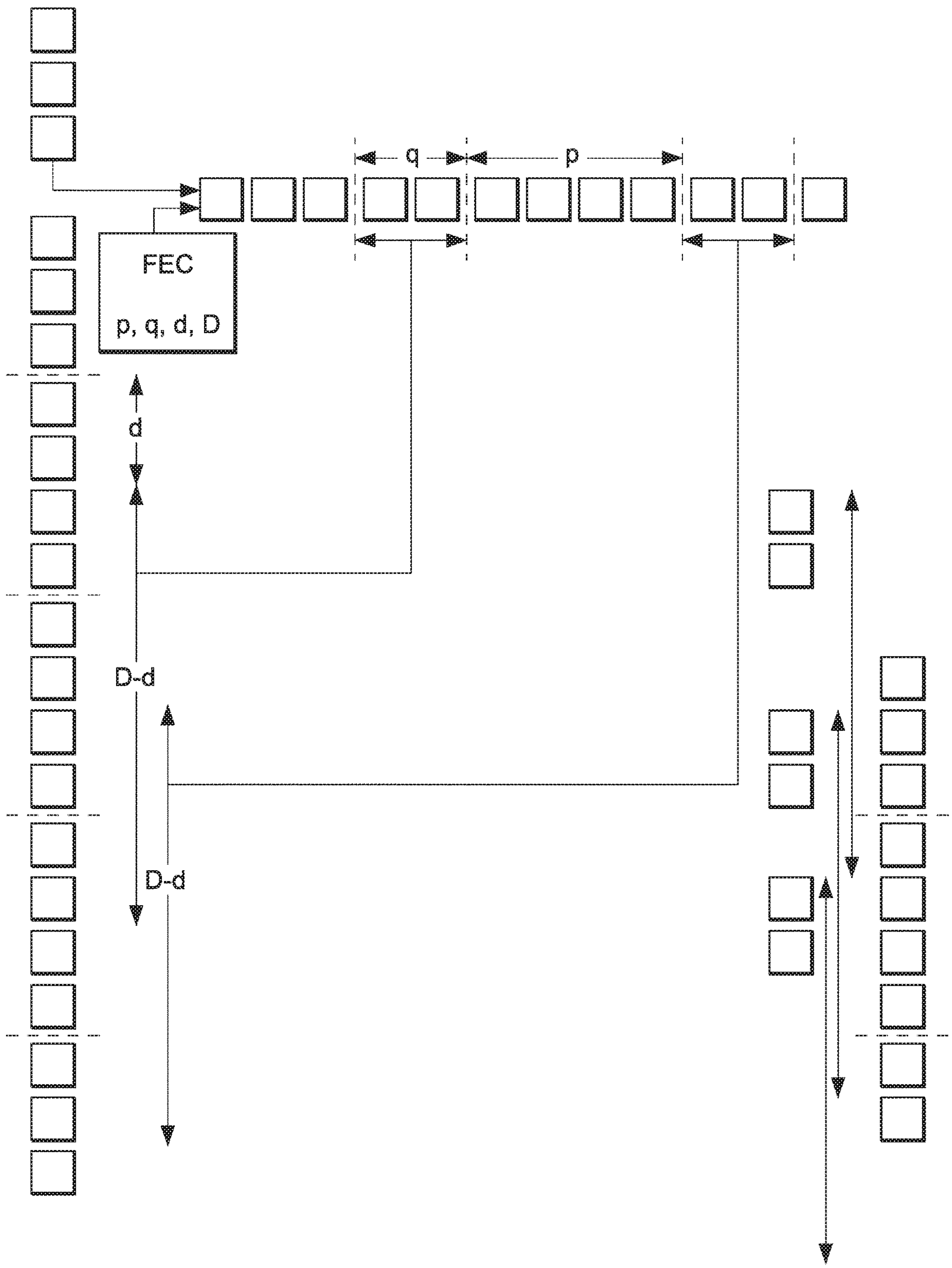

Referring to FIG. 161, a set of exemplary ways that the transmitter introduces the redundancy data units into the stream of units passed over the channel makes use of alternating runs of input data units and redundancy data units. In FIG. 161, the data units that are "in flight" on the channel 2452 are illustrated passing from left to right in the figure. The transmitter introduces the units onto the channel as sequences of p input units alternating with sequences of q redundancy units. Assuming that the data units are the same sizes, this corresponds to a rate R=p/(p+q) code. In an example with p=4 and q=2 and the code has rate R=2/3.

In a number of embodiments the redundancy units are computed as random linear combinations of past input units. Although the description below focuses on such approaches, it should be understood that the overall approach is applicable to other computations of redundancy information, for example, using low density parity check (LDPC) codes and other error correction codes. In the approach shown in FIG. 161, each run of q redundancy units is computed as a function of the previous D input units, where in general but not necessarily D>p. In some cases, the most recent d data units transmitted are not used, and therefore the redundancy data units are computed from a window of D-d input data units. In FIG. 161, d=2, D=10, and D-d=8. Note that because D-d>p, the windows of input data units used for computation of the successive runs of redundancy units overlap, such that any particular input data unit will in general contribute to redundancy data units in more than one of the runs of q units on the channel.

In FIG. 161, as well as in FIGS. 162-163 discussed below, buffered input data units (i.e., in buffer 2423 shown in FIG. 160) are shown on the left with time running from the bottom (past) to the top (future), with each set of D-d units used to compute a run of q redundant units illustrated with arrows. The sequence of transmitted units, consisting of runs of input data units alternating with runs of redundant units, is shown with time running from right to left (i.e., later packets on the left). Data units that have been received and buffered at the receiver are shown on the right (oldest on the bottom), redundant units computed from runs of D-d input units indicated next to arrows representing the ranges of input data units used to compute those data units. Data units and ranges of input data units that have not yet been received are illustrated using dashed lines.

Figure 162:
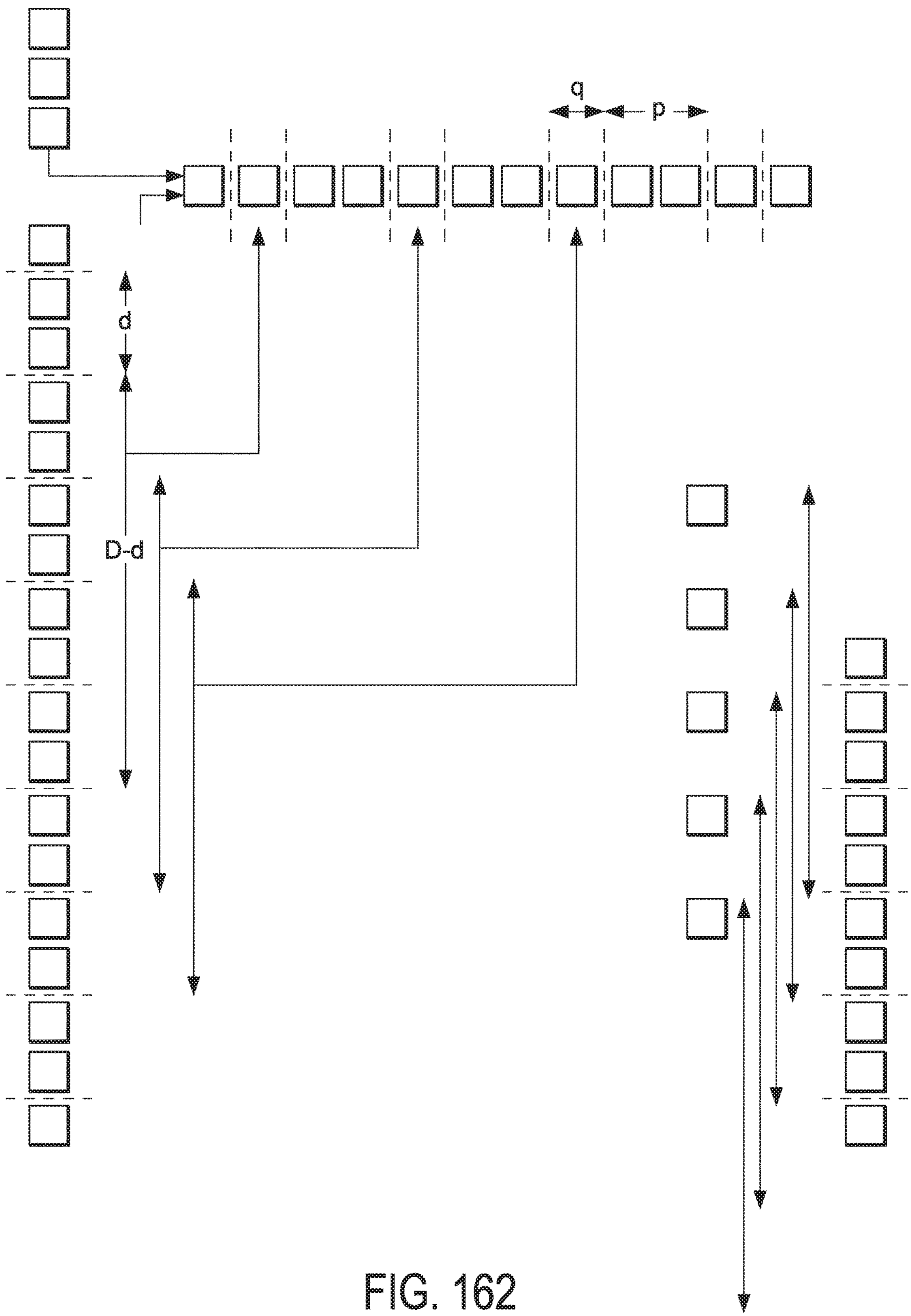
Figure 163:
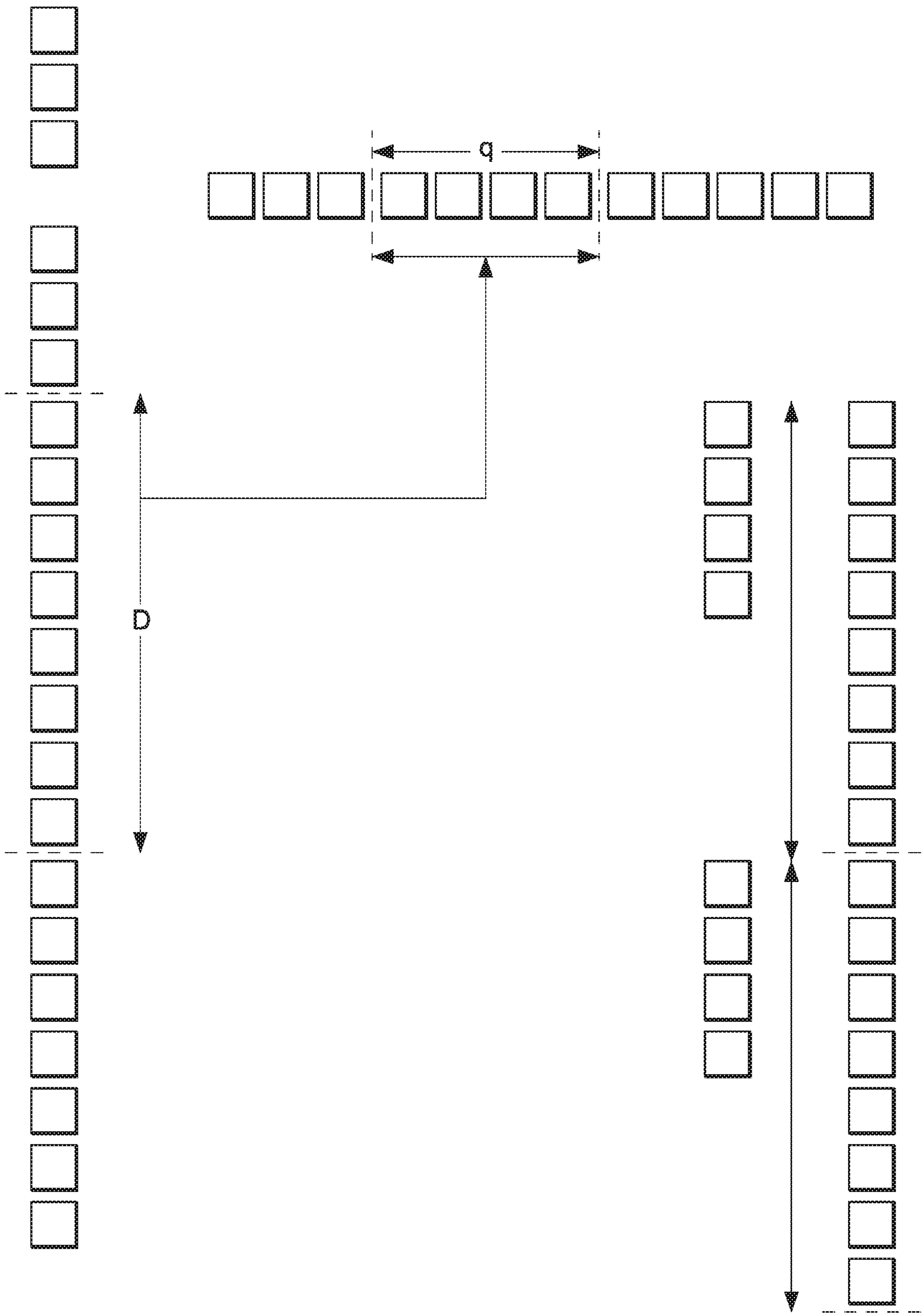

FIGS. 162 and 163 show different selections of parameters. In FIG. 162, p=2 and q=1 and the code has a rate R=2/3, which is the same rate at the selection of parameters in FIG. 161. Also as in the FIG. 161 selection, d=2, D=10, and D-d=8. Therefore, a difference between FIG. 161 and FIG. 162 is not necessarily a degree of forward error protection (although the effect of burst erasures may be somewhat different in the two cases). More importantly, the arrangement in FIG. 162 generally provides a lower delay from the time of an erased data unit to the arrival of redundancy information to reconstruct that unit, as compared to the arrangement in FIG. 161. On the other hand, the complexity of processing at the receiver may be greater in the arrangement of FIG. 162 as compared to the arrangement of FIG. 160, in part because redundancy units information uses multiple different subsets of the input data units, which may require more computation when reconstructing an erased data unit. Turning to FIG. 163, at another extreme, a selection of parameters uses longer blocks with a selection D=8 and q=4. Again, this code has a rate R=2/3. In general, this selection of parameters will incur greater delay in reconstruction of an erased data unit as compared to the selections of parameters shown in FIGS. 161 and 162. On the other hand, reconstruction of up to four erasures per block of D=8 input data units is relatively less complex than would be required by the selections shown in FIGS. 161 and 162.

For a particular rate of code (e.g., rate R=2/3), in an example, feedback received may result in changes of the parameters, for example, between (p,q)=(2,1) or (4,2) or (8,4) depending on of the amount of data buffered at the receiver, and therefore depending on the tolerance of the receiver to reconstruction delay.

Note that it is not required that $q=p(1-R)/R$ is an integer, as it is in the examples shown in FIGS. 161-163. In some embodiments, the length of the run of redundant units varies between $q=\lceil p(1-R)/R \rceil$ and $q=\lfloor p(1-R)/R \rfloor$ so that the average is $ave(q)=p(1-R)/R$.

In a variant of the approach described above, different input data units have different "priorities" or "importances" such that they are protected to different degrees than other input data units. For example, in video coding, data units representing an independently coded video frame may be more important than data units representing a differentially encoded video frame. For example, if the priority levels are indexed i=1, 2, . . . , then a proportion $\rho_i \le 1$, where $\Sigma_i \rho_i = 1$, of the redundancy data units may be computed using data units with priority ≤i. For example, for a rate R code, with blocks of input data units of length p, on average $\rho_i$ $p(1-R)/R$ redundancy data units per block are computed from input data units with priority i.

The value of D should generally be no more than the target playout delay of the streaming application minus an appropriate margin for communication delay variability. The playout delay is the delay between the time a message packet is transmitted and the time it should be available at the receiver to produce the streaming application output. It can be expressed in units of time, or in terms of the number of packets transmitted in that interval. D can be initially set based on the typical or desired playout delay of the streaming application, and adapted with additional information from the receiver/application. Furthermore, choosing a smaller value reduces the memory and complexity at the expense of erasure correction capability.

The parameter d specifies the minimum separation between a message packet and a parity involving that message packet. Since a parity involving a message packet that has not yet been received is not useful for recovering earlier message packets involved in that parity, setting a minimum parity delay can improve decoding delay when packet reordering is expected/observed to occur, depending partly also on the parity interval.

Figure 164:
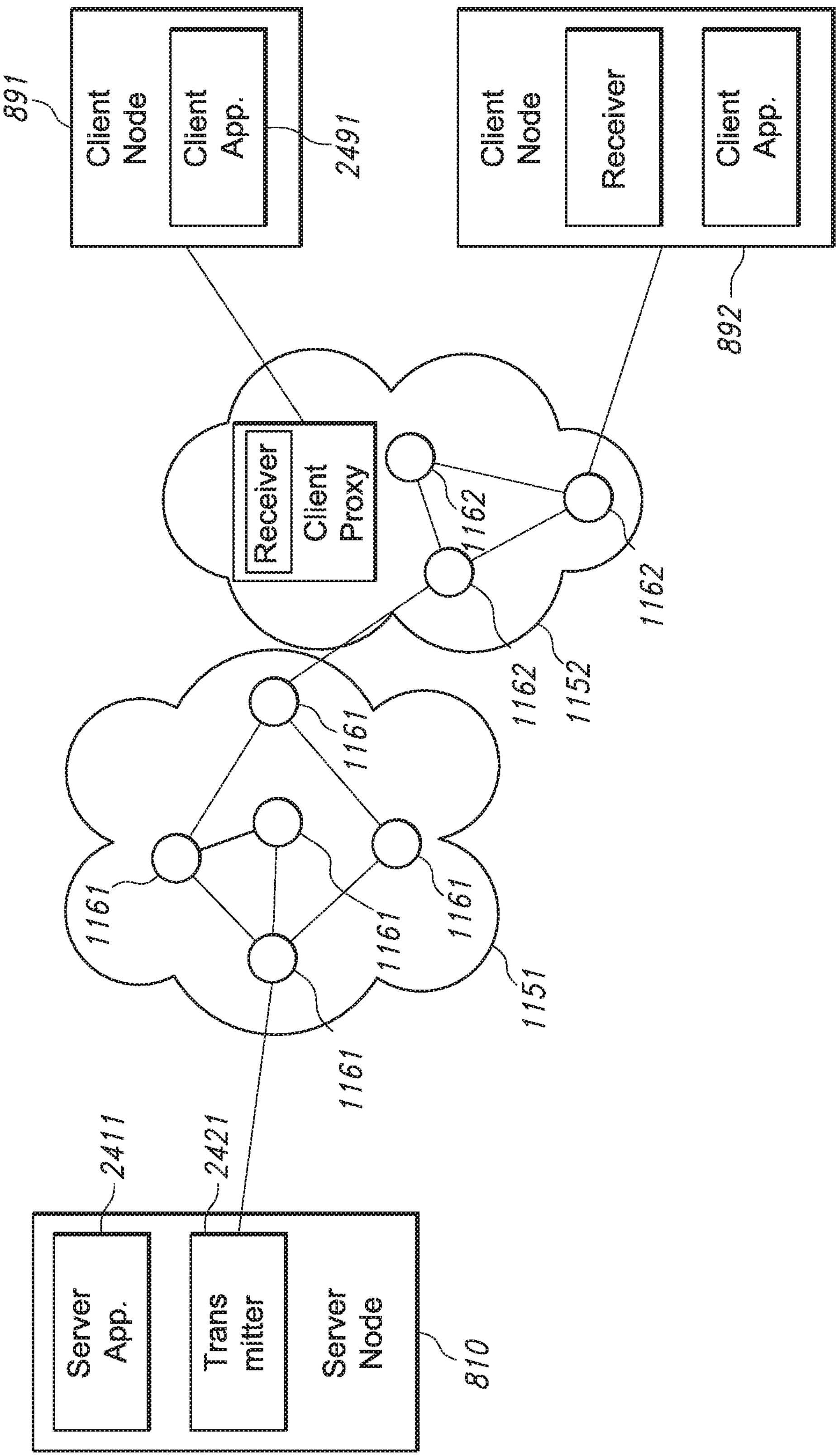
FIG. 164 is a diagram showing a network communication system.

Referring to FIG. 164, in an example implementation making use of the approaches described above, the server application 2411 is hosted with the transmitter 2421 at a server node 810, and the client application 2491 is hosted at one or a number of client nodes 891 and 892. Although a wide variety of types of data may be transported using the approaches described above, one example is streaming of encoded multimedia (e.g., video and audio) data. The communication channel 2452 (see FIG. 160) is made up in this illustration as a path through one or more networks 851-852 via nodes 861-862 in those respective networks. In some implementations, the receiver is hosted at a client node 891 being hosted on the same device as the client application 490.

Cross-Session Parameter Control

In some embodiments, the control of transport layer sessions uses information across connections, for example, across concurrent sessions or across sessions occurring at different times.

Standard TCP implements end-to-end congestion control based on acknowledgments. A new TCP connection that has started up but not yet received any acknowledgments uses initial configurable values for the congestion window and retransmission timeout. These values may be tuned for different types of network settings.

Some applications, for instance web browser applications, may use multiple connections between a client application (e.g., the browser) and a server application (e.g., a particular web server application at a particular server computer). Conventionally, when accessing the information to render a single web "page", the client application may make many separate TCP sessions between the client and server computers, and using conventional TCP control, each session is controlled substantially independently. This independent control includes separate congestion control.

One approach to addressing technical problems that are introduced by having such multiple sessions is the SPDY Protocol (see, e.g., SPDY Protocol—Draft 3.1, accessible at http://www.chromium.org/spdy/spdy-protocol/spdy-protocol-draft3-1). The SPDY protocol is an application layer protocol that manipulates HTTP traffic, with particular goals of reducing web page load latency and improving web security. Generally, SPDY effectively provides a tunnel for the HTTP and HTTPS protocols. When sent over SPDY, HTTP requests are processed, tokenized, simplified and compressed. The resulting traffic is then sent over a single TCP session, thereby avoiding problems and inefficiencies involved in use of multiple concurrent TCP sessions between a particular client and server computer.

In a general aspect, a communication system maintains information related to communication between computers or network nodes. For example, the maintained information can include bandwidth to and/or from the other computer, current or past congestion window sizes, pacing intervals, packet loss rates, round-trip time, timing variability, etc. The information can include information for currently active sessions and/or information about past sessions. One use of the maintained information may be to initialize protocol parameters for a new session between computers for which information has been maintained. For example, the congestion window size or a pacing rate for a new TCP or UDP session may be initialized based on the congestion window size, pacing interval, round-trip time and loss rate of other concurrent or past sessions.

Figure 165:
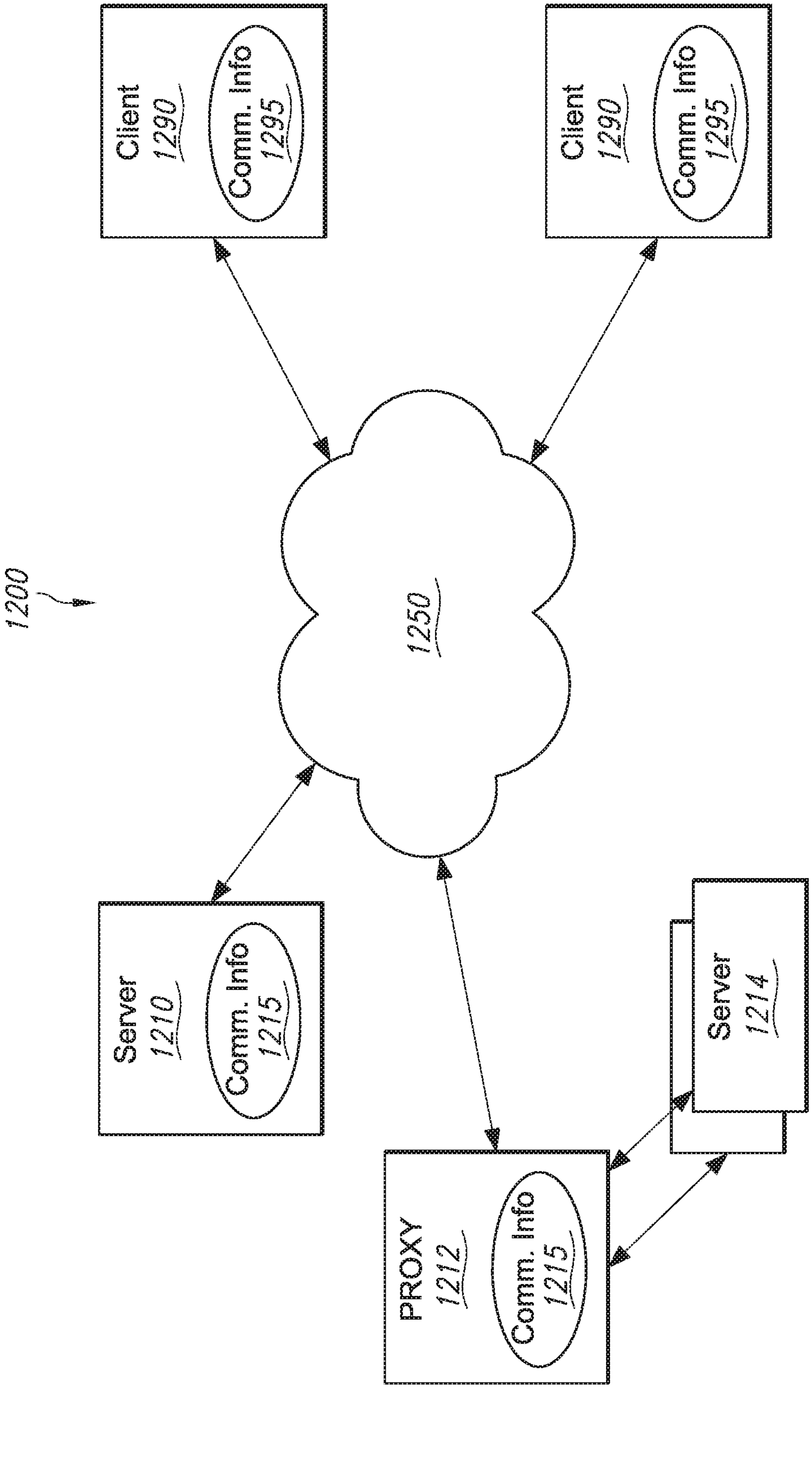
FIG. 165 is a schematic diagram illustrating use of stored communication parameters.

Referring to FIG. 165, communication system 1200 maintains information regarding communication sessions between endpoints. For example, these communication sessions pass via a network 1250, and may pass between a server 1210, or a proxy 1212 serving one or more servers 1214, and a client 1290. In various embodiments, this information may be saved in various locations. In some implementations, a client 1290 maintains information about current or past connections. This information may be specific to a particular server 1210 or proxy 1212. This information may also include aggregated information. For example, in the case of a smartphone on a cellular telephone network, some of the information may be generic to connections from multiple servers and may represent characteristics imposed by the cellular network rather than a particular path to a server 1210. In some implementations, a server 1210 or proxy 1212 may maintain the information based on its past communication with particular clients 1290. In some examples, the clients and servers may exchange the information such that is it distributed throughout the system 1200. In some implementations, the information may be maintained in databases that are not themselves endpoints for the communication sessions. For instance, it may be beneficial for a client without relevant stored information to retrieve information from an external database.

In one use scenario, when a client 1290 seeks to establish a communication session (e.g., a transport layer protocol session), it consults its communication information 1295 to see if it has current information that is relevant to the session it seeks to establish. For example, the client may have other concurrent sessions with a server with which it wants to communicate, or with which it may have recently had such sessions. As another example, the client 1290 may use information about other concurrent or past sessions with other servers. When the client 1290 sends a request to a server 1210 or a proxy 1212 to establish a session, relevant information for that session is also made available to one or both of the endpoints establishing the session. There are various ways in which the information may be made available to the server. For example the information may be included with the request itself. As another example, the server may request the information if it does not already hold the information in its communication information 1215. As another example, the server may request the information from a remote or third party database, which has been populated with information from the client or from servers that have communicated with the client. In any case, the communication session between the client and the server is established using parameters that are determined at least in part by the communication information available at the client and/or server.

In some examples, the communication session may be established using initial values of packet pacing interval, congestion window, retransmission timeout and forward error correction. Initial values suitable for different types of networks (e.g. Wi-Fi, 4G), network operators and signal strength can be prespecified, and/or initial values for successive connections can be derived from measured statistics of earlier connections between the same endpoints in the same direction. For example:

The initial congestion window can be increased from its default value if the packet throughput of the previous connection is sufficiently larger than the ratio of the default initial congestion window to the minimum round-trip time of the previous connection. The congestion window can subsequently be adjusted downwards if the initial received asks from the new connection indicate that the available rate has decreased compared to the previous connection.

The initial pacing interval can be set e.g. as MAX (k1*congestion window/previous round-trip time, k2/previous packet throughput), where k1 and k2 are configurable parameters, or, with receiver pacing, as k* previous pacing interval, where k increases with the loss rate of the previous connection.

Forward error correction parameters such as code rate can be set as k*previous loss rate, where k is a configurable parameter. The initial retransmission timeout can be increased from its default value if the minimum round-trip time of the previous connection is larger.

Multi-Path

Figure 166:
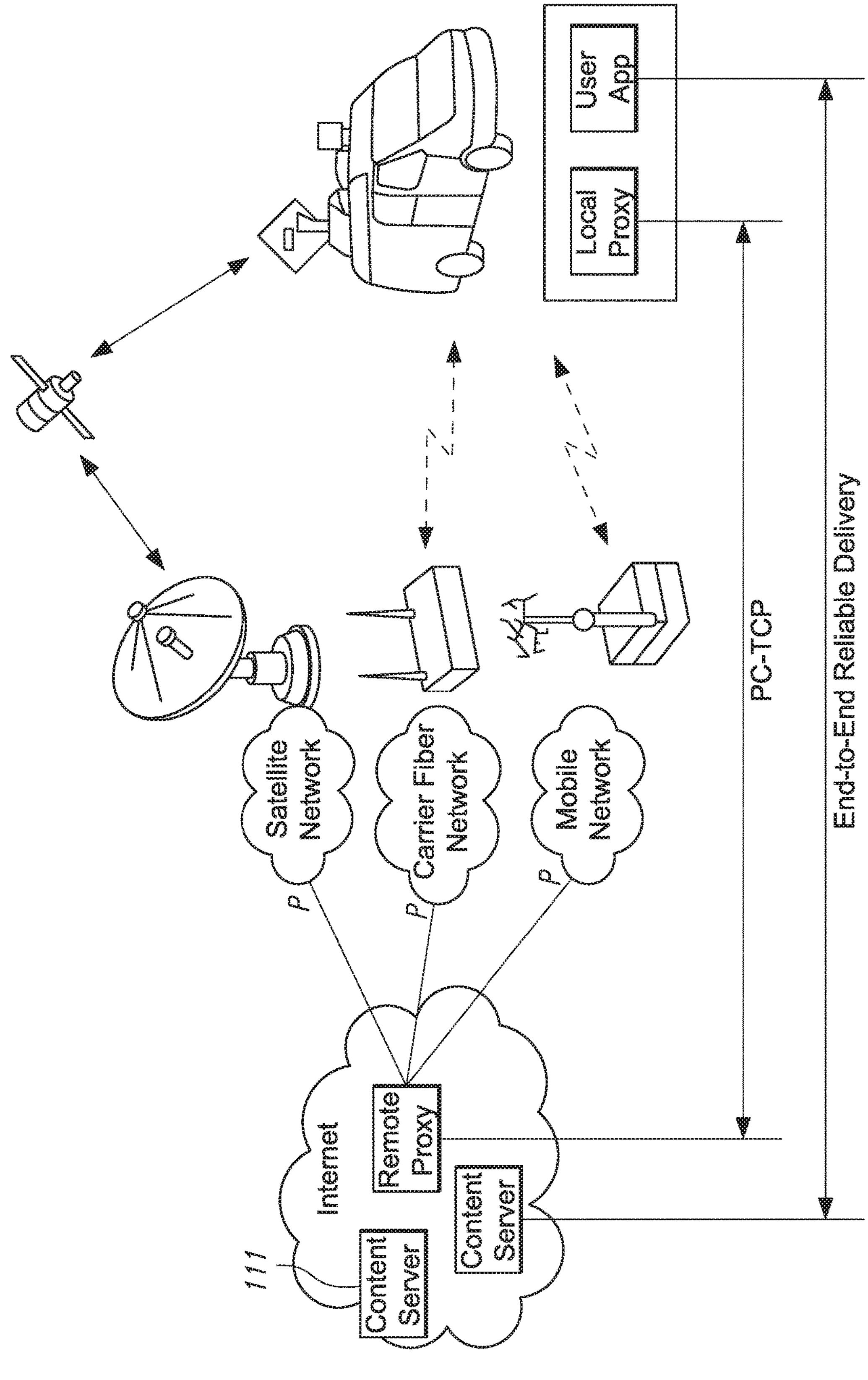
FIG. 166 is a schematic diagram illustrating a first embodiment or multi-path content delivery.

FIG. 166 shows the use of multiple paths between the server and client to deliver the packet information. These multiple paths may be over similar or different network technologies with similar or different average bandwidth, round trip delay, packet jitter rate, packet loss rate and cost. Examples of multiple paths include wired/fiber networks, geostationary, medium and low earth orbit satellites, WiFi, and cellular networks. In this example, the transmission control layer can utilize a single session to distribute the N packets in the block being transmitted over the multiple paths according to a variety of metrics (average bandwidth of each path, round trip delay of each path, packet jitter rate, packet loss rate of each path, and cost). The N packets to be transmitted in each block can be spread across each path in a manner that optimizes the overall end-to-end throughput and costs between server and client. The number of packets sent on each path can be dynamically controlled such that the average relative proportions of packets sent on each path are in accordance with the average relative available bandwidths of the paths, e.g. using back pressure-type control whereby packets are scheduled so as to approximately equalize queue lengths associated with the different paths.

For each path, the algorithms described above that embody transmission and congestion control, forward error correction, sender based pacing, receiver based pacing, stream based parameter tuning, detection and correction for missing and out of order packets, use of information across multiple TCP connections, fast connection start and stop, TCP/UDP fallback, cascaded coding, recoding by intermediate nodes, and coding of the ACKs can be employed to improve the overall end-to-end throughput over the multiple paths between the source node and destination node. When losses are detected and FEC is used, the extra coded packets can be sent over any or all of the paths. For instance, coded packets sent to repair losses can be sent preferentially over lower latency paths to reduce recovery delay. The destination node will decode any N of packets that are received over all of the paths and assemble them into a block of N original packets by recreating any missing packets from the ones received. If less than N different coded packets are received across all paths, then the destination node will request the number of missing packets x where x=N−number of packets received be retransmitted. Any set of x different coded packet can be retransmitted over any path and then used to reconstruct the missing packets in the block of N.

When there are networks with large differences in round trip time (RTT) latencies, the packets received over the lower RTT latencies will need to be buffered at the receiver in order to be combined with the higher RTT latency packets. The choice of packets sent on each path can be controlled so as to reduce the extent of reordering and associated buffering on the receiver side, e.g. among the packets available to be sent, earlier packets can be sent preferentially on higher latency paths and later packets can be sent preferentially on lower latency paths.

Individual congestion control loops may be employed on each path to adapt to the available bandwidth and congestion on the path. An additional overall congestion control loop may be employed to control the total sending window or rate across all the paths of a multi-path connection, for fairness with single-path connections.

Figure 167:
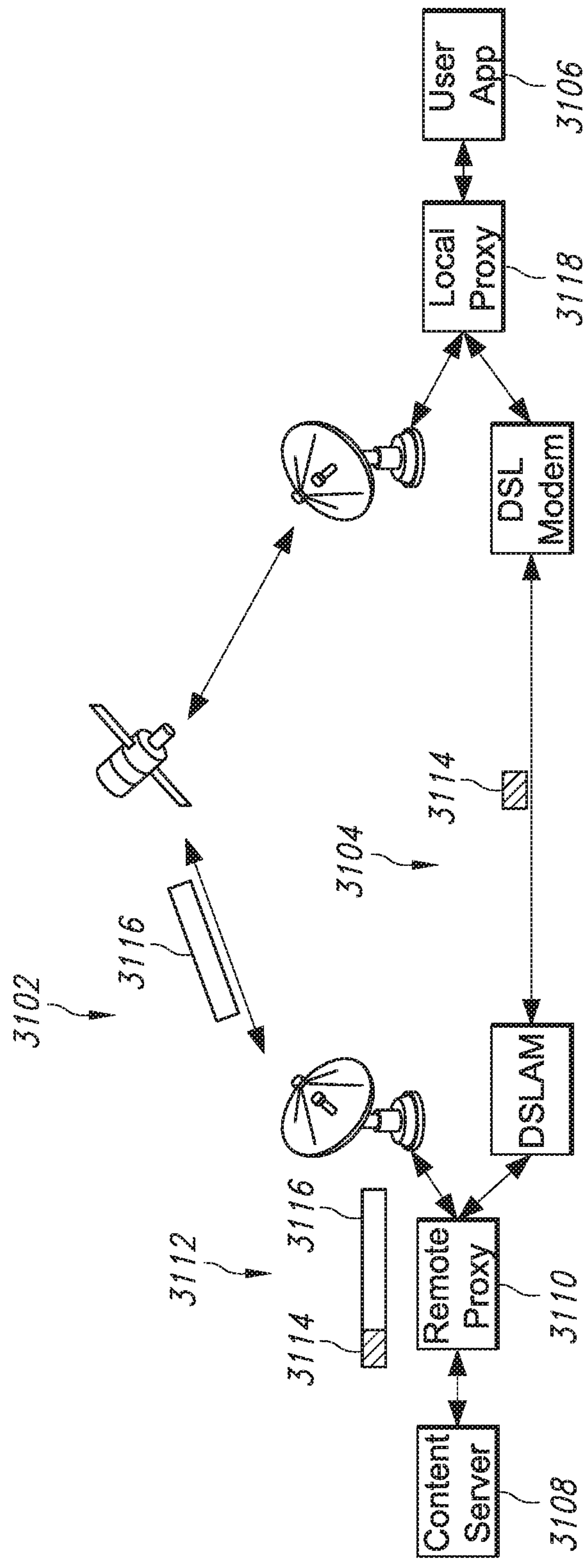
FIGS. 167-169 are schematic diagrams illustrating a second embodiment of multi-path content delivery.

Referring to FIG. 167, a communication system utilizes a first, satellite data path 3102 having a relatively high round trip time latency and a second, DSL data path 3104 having a relatively low round trip time latency. When a user application 3106 sends a request to stream video content, a content server 3108 (e.g., video streaming service) provides some or all of the requested video content to a remote proxy 3110 which generates encoded video content 3112 for transmission to the user application 3106. Based on the RTT latencies of the first data path 3102 and the second data path 3104, the remote proxy 3110 splits the encoded video content 3112 into an initial portion 3114 (e.g., the first 5 seconds of video content) and a subsequent portion 3116 (e.g., the remaining video content). The remote proxy 3110 then causes transmission of the initial portion 3114 over the second, low latency data path 3104 and transmission of the subsequent portion 3116 over the first, high latency data path 3102.

Figure 168:
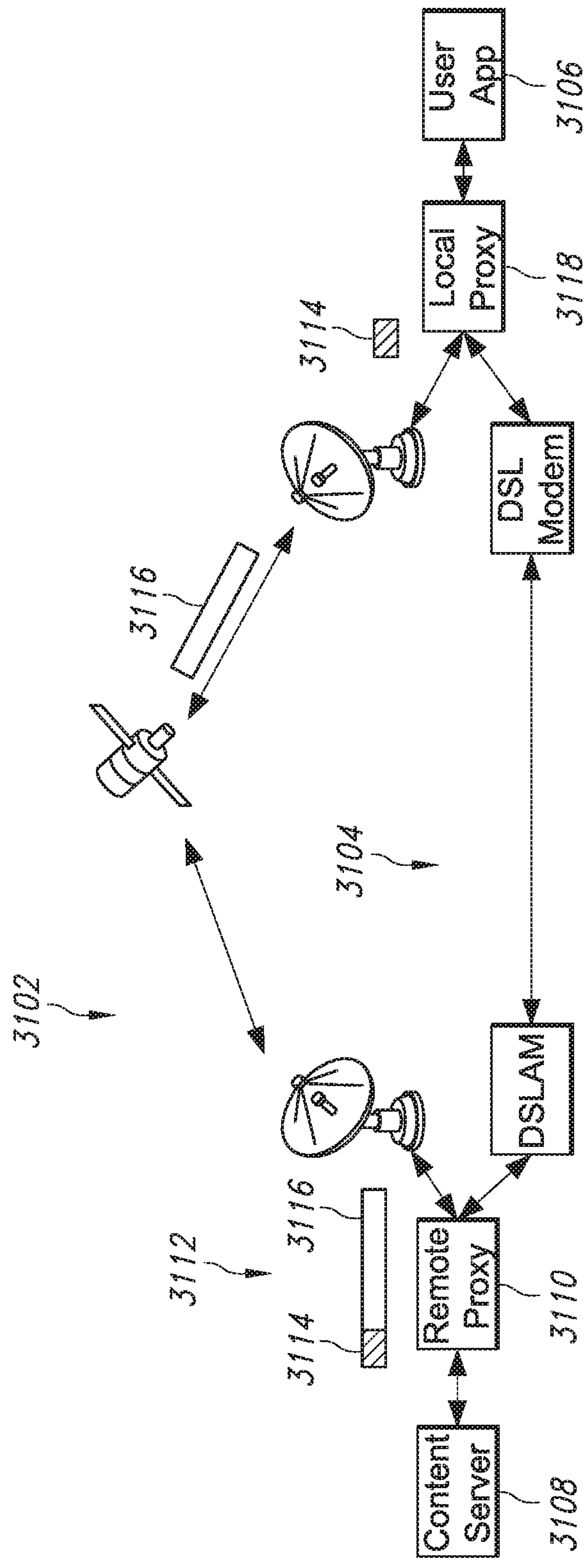

Referring to FIG. 168, due to the lower latency of the second data path 3104, the initial portion 3114 of the video content arrives at the local proxy 3118 quickly, where it is decoded and sent to the user application 3106 for presentation to a viewer. The subsequent portion 3116 of the video content is still traversing the first, high latency data path 3102 at the time that presentation of the initial portion 3114 of the video content to the viewer commences.

Figure 169:
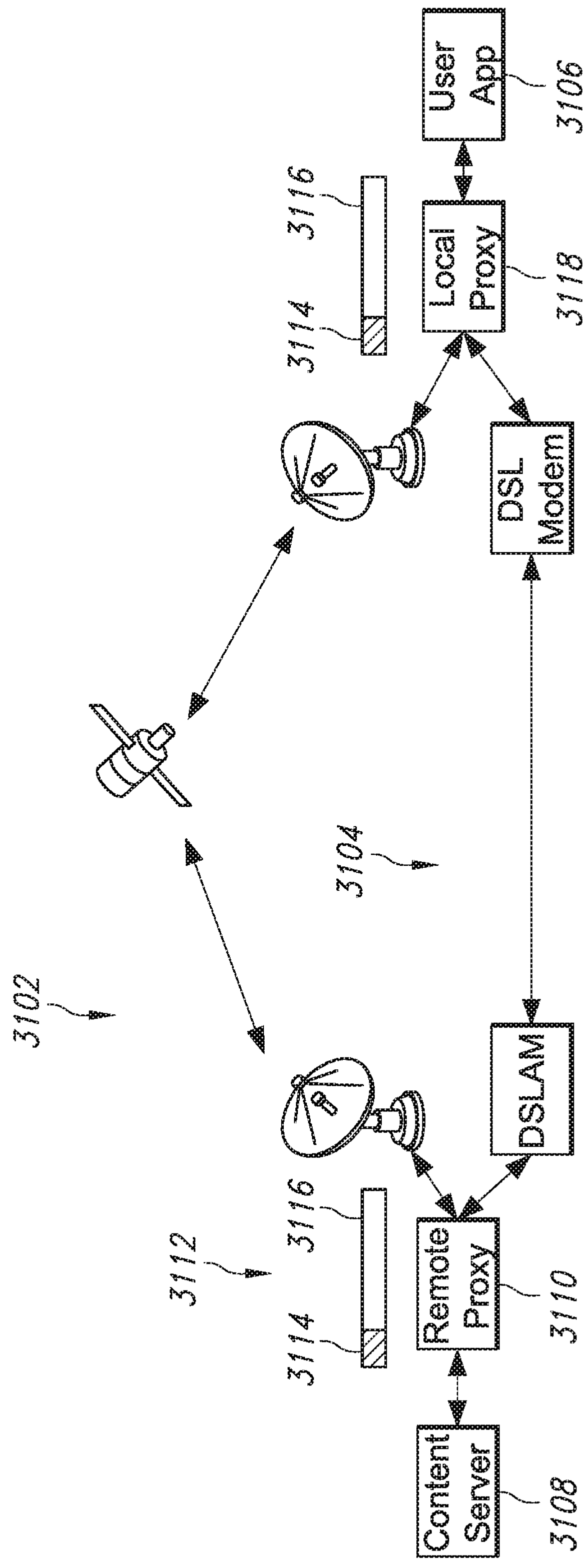

Referring to FIG. 169, during presentation of the decoded initial portion 3114 of video content to the viewer, the subsequent portion 3116 of the video content arrives at the local proxy 3118 where it is decoded and sent to the user application 3106 before presentation of the initial portion 3114 of the video content to the viewer is complete. In some examples, sending the initial portion 3114 of the video content over the low latency data path 3104 and sending a subsequent portion 3116 of the video content over the high latency data path 3102 avoids lengthy wait times between when a user requests a video and when the user sees the video (as would be the case if using satellite only communication) while minimizing data usage over the low latency data path (which may be more costly to use).

In some examples, other types of messages may be preferentially sent over the low latency data path. For example, acknowledgement messages, retransmission messages, and/or other time critical messages may be transmitted over the low latency data path while other data messages are transmitted over the higher latency data path.

In some examples, additional data paths with different characteristics (e.g., latencies) can also be included in the communication system, with messages being balanced over any of a number of data paths based on characteristics of the messages (e.g., message type) and characteristics of the data paths.

In some examples, other types of messages may be preferentially sent over the low latency data path. For example, acknowledgement messages, retransmission messages, and/or other time critical messages may be transmitted over the low latency data path while other data messages are transmitted over the higher latency data path.

In some examples, additional data paths with different characteristics (e.g., latencies) can also be included in the communication system, with messages being balanced over any of a number of data paths based on characteristics of the messages (e.g., message type) and characteristics of the data paths.

Alternatives and Implementations

In the document above, certain features of the packet coding and transmission control protocols are described individually, or in isolation, but it should be understood that there are certain advantages that may be gained by combining multiple features together. Preferred embodiments for the packet coding and transmission control protocols described may depend on whether the transmission links and network nodes traversed between communication session end-points belong to certain fiber or cellular carriers (e.g. AT&T, T-Mobile, Sprint, Verizon, Level 3) and/or end-user Internet Service Providers (ISPs) (e.g. AT&T, Verizon, Comcast, Time Warner, Century Link, Charter, Cox) or are over certain wired (e.g. DSL, cable, fiber-to-the-curb/home (FTTx)) or wireless (e.g. WiFi, cellular, satellite) links. In embodiments, probe transmissions may be used to characterize the types of network nodes and transmission links communication signals are traversing and the packet coding and transmission control protocol may be adjusted to achieve certain performance. In some embodiments, data transmissions may be monitored to characterize the types of network nodes and transmission links communication signals are traversing and the packet coding and transmission control protocol may be adjusted to achieve certain performance. In at least some embodiments, quantities such as round-trip-time (RTT), one-way transmission times (OWTT), congestion window, pacing rate, packet loss rate, number of overhead packets, and the like may be monitored continuously, intermittently, in response to a trigger signal or event, and the like. In at least some embodiments, combinations of probe transmissions and data transmissions may be used to characterize network and communication session performance in real time.

In at least some embodiments, network and communication parameters may be stored in the end-devices of communication sessions and/or they may be stored in network resources such as servers, switches, nodes, computers, databases and the like. These network and communication parameters may be used by the packet coding and transmission control protocol to determine initial parameter settings for the protocol to reduce the time it may take to adjust protocol parameters to achieve adequate performance. In embodiments, the network and communication parameters may be tagged and/or associated with certain geographical locations, network nodes, network paths, equipment types, carrier networks, service providers, types of transmission paths and the like. In embodiments, the end-devices may be configured to automatically record and/or report protocol parameter settings and to associate those settings with certain locations determined using GPS-type location identification capabilities resident in those devices. In embodiments, the end-devices may be configured to automatically record and/or report protocol parameters settings and to associate those settings with certain carrier networks, ISP equipment traversed, types of wired and/or wireless links and the like.

In at least some embodiments, a packet coding and transmission control protocol as described above may adjust more than one parameter to achieve adequate or improved network performance. Improved network performance may be characterized by less delay in delivering data packets, less delay in completing file transfers, higher quality audio and video signal delivery, more efficient use of network resources, less power consumed by the end-users, more end-users supported by existing hardware resources and the like.

In at least some embodiments, certain modules or features of the packet coding and transmission control protocol may be turned on or off depending on the data's path through a network. In some embodiments, the order in which certain features are implemented or controlled may be adjusted depending on the data's path through a network. In some embodiments, the probe transmissions and/or data transmissions may be used in open-loop or closed-loop control algorithms to adjust the adjustable parameters and/or the sequence of feature implementation in the packet coding and transmission control protocol.

It should be understood that examples which involve monitoring to control the protocol can in general involve aspects that are implemented at the source, the destination, or at a combination of the source and the destination Therefore, it should be evident that although embodiments are described above in which features are described as being implemented at particular endpoints, alternative embodiments involve implementation of those features at different endpoints. Also, as described above, monitoring to control the protocol can in general involve aspects that are implemented intermediate nodes or points in the network. Therefore, it should be evident that although embodiments are described above in which features are described as being implemented at particular endpoints, alternative embodiments involve implementation of those features at different nodes, including intermediate nodes, throughout the network.

In addition to the use of monitored parameters for control of the protocols, the data may be used for other purposes. For example, the data may support network analytics that are used, for example, to control or provision the network as a whole.

The PC-TCP approaches may be adapted to enhance existing protocols and procedures, and in particular protocols and procedures used in content delivery, for example, as used in coordinated content delivery networks. For instance, monitored parameters may be used to direct a client to the server or servers that can deliver an entire unit of content as soon as possible rather than merely direct the client to a least loaded server or to server accessible over a least congested path. A difference in such an new approach is that getting an entire file as fast as possible may require packets to be sent from multiple servers and/or servers that are not geographically the closest, over multiple links, and using new acknowledgement protocols that coordinate the incoming data while requiring a minimum of retransmissions or FEC overhead. Coordinating may include waiting for gaps in strings of packets (out-of-order packets) to be filled in by later arriving packets and/or by coded packets. In addition, the PC-TCP approaches may improve the performance of wireless, cellular, and satellite links, significantly improving the end-to-end network performance.

Some current systems use "adaptive bit rates" to try to preserve video transmission through dynamic and/or poorly performing links. In some instances, the PC-TCP approaches described above replace adaptive bit rate schemes and may be able to present a very high data rate to a user for a long period of time. In other instances, the PC-TCP approaches are used in conjunction with currently-available adaptive bit rate schemes to support higher data rates on average than could be supported by adaptive bit rate schemes alone. In some instances, the PC-TCP approaches may include integrated bit rate adjustments as part of its feature set and may use any and/or all of the previously identified adjustable parameters and/or monitored parameters to improve the performance of a combined PC-TCP and bit-rate adaptive solution.

Certain embodiments described following relate to heating, and more particularly to cooking and recipes, including by use of intelligent devices, and in a context of the IoT.

With the emergence of the IoT, opportunities exist for unlocking value surrounding a wide range of devices. To date, such opportunities have been limited for many users, particularly in rural areas of developing countries, by the absence of robust energy and communications infrastructure. The same problems with infrastructure also limit the ability of users to access more basic features of certain devices; for example, rather than using modern cooking systems, such as with gas burners, many rural users still cook over fires, using wood or other biofuel. A need exists for devices that meet basic needs, such as for modem cooking capability, without reliance on infrastructure, and an opportunity exists to expand the capabilities of basic cooking devices to provide a much wider range of capabilities that will serve other needs and provide other benefits to users of cooking devices.

Many industrial environments are similarly isolated from conventional energy and communications infrastructure. For example, offshore drilling platforms, industrial mining environments, pipeline operations, large-scale agricultural environments, marine exploration environments (e.g., deep ocean exploration), marine and other large-scale transportation environments (such as ships, boats, submarines, aircraft and spacecraft) are often entirely isolated from the traditional power grid, or require very expensive power transmission cables to receive power from traditional sources. Other industrial environments are isolated for other reasons, such as to maintain "clean room" isolation during semi-conductor manufacturing, pharmaceutical preparation, or handling of hazardous materials, where interfaces like outlets and switches for delivering conventional power potentially provide points of penetration or escape for contaminants or biologically active materials. For these environments, a need exists for cooking systems that provide improved independence from conventional power sources. Also, in many of these environments fire is a significant hazard, among other things because of the presence of fire hazards and significant restrictions on egress for personnel. In those cases, storage of fuel for cooking in an environment presents a risk, because the fuel can exacerbate the extent of a fire, potentially resulting in disastrous consequences. Accordingly, such platforms and environments, such as oil drilling platforms, may use diesel generators to power cooking and other systems, because diesel is perceived as presenting lower risk than propane, gasoline, or other fuel sources; however, diesel fuel also burns and remains a significant hazard A need exists for safer mechanisms for providing cooking capability in isolated industrial environments.

Intelligent cooking systems are disclosed herein, including an intelligent cooking system that is provided with processing, communications, and other information technology components, for remote monitoring and control and various value-added features and services, embodiments of which use an electrolyzer, optionally a solar-powered electrolyzer, to produce hydrogen as an on-demand fuel stream for a heating element, such as a burner, of the cooking system.

Embodiments of cooking systems disclosed herein include ones for consumer and commercial use, such as for cooking meals in homes and in restaurants, which may include various embodiments of cooktops, stoves, toasters, ovens, grills and the like. Embodiments of cooking systems also include industrial cooking systems, such as for heating, drying, curing, and cooking not only food products and ingredients, but also a wide variety of other products and components that are manufactured in and/or used in the industrial environments. These may include systems and components used in assembly lines (such as for heating, drying, curing, or otherwise treating parts or materials at one stage of production, such as to treat coatings, polymers, or the like that are coated, dispersed, painted, or otherwise disposed on components), in semi-conductor manufacturing and preparation (such as for heating or curing layers of a semi-conductor process, including in robotic assembly processes), in tooling processes (such as for curing injection molds and other molds, tools, dies, or the like), in extrusion processes (such as for curing, heating or otherwise treating results of extrusion), and many others. These may also include systems and components used in various industrial environments for servicing personnel, such as on ships, submarines, offshore drilling platforms, and other marine platforms, on large equipment, such as on mining or drilling equipment, cranes, or agricultural equipment, in energy production environments, such as oil, gas, hydro-power, wind power, solar power, and other environments. Accordingly, while certain embodiments are disclosed for specific environments, references to cooking systems should be understood to encompass any of these consumer, commercial and industrial systems for cooking, heating, curing, and treating, except where context indicates otherwise.

Provided herein is an intelligent cooking system leveraging hydrogen technology plus cloud-based value-added-services derived from profiling, analytics, and the like. The smart hydrogen technology cooking system provides a standardized framework enabling other intelligent devices, such as smart-home devices and IoT devices to connect to the platform to further enrich the overall intelligence of contextual knowledge that enables providing highly relevant value-added-services. The intelligent cooking system device (referred to herein in some cases as the "cooktop"), may be enabled with processing, communications, and other information technology components and interfaces for enabling a variety of features, benefits, and value added services including ones based on user profiling, analytics, remote monitoring, remote processing and control, and autonomous control. Interfaces that allow machine-to-machine or user-to-machine communication with other devices and the cloud (such as through application programming interfaces) enables the cooking system to contribute data that is valuable for analytics (e.g., on users of the cooking system and on various consumer, commercial and industrial processes that involve the cooking system), as well as for monitoring, control and operation of other devices and systems. Through similar interfaces, the monitoring, control and/or operation of the cooking system, and its various capabilities, can benefit from or be based on data received from other devices (e.g., IoT devices) and from other data sources, such as from the cloud. For example, the cooking system may track its usage, such as to determine when to send a signal for refueling the cooking system itself, to send a signal for re-supplying one or more ingredients, components or materials (such as based on detected patterns of usage of the same over time periods), to determine and provide guidance on usage of the cooking system (such as to suggest training or improvements in usage to improve efficiency or efficacy), and the like. These may include results based on applying machine learning to the use of the fuel, the use of the cooking system, or the like.

In embodiments, the intelligent cooking system may be fueled by a hydrogen generator, referred to herein in some cases as the electrolyzer, an independent fuel source that does not require traditional connections to the electrical power grid, to sources of gas (e.g., natural gas lines), or to periodic sources of supply of conventional fuels (such as refueling oil, propane, diesel, or other fuel tanks) The electrolyzer may operate on a water source to separate hydrogen and oxygen components and subsequently provide the hydrogen component as a source of fuel, such as an on-demand source of fuel, for the intelligent cooking system. In embodiments, the electrolyzer may be powered by a renewable energy source, such as a solar power source, a wind power source, a hydropower source, or the like, thereby providing complete independence from the need for traditional power infrastructure. Methods and systems describing the design, manufacturing, assembly, deployment, and use of an electrolyzer are included herein. Among other benefits, the electrolyzer allows storage of water, rather than flammable materials like oil, propane, and diesel, as a source of energy for powering cooking systems in various isolated or sensitive industrial environments, such as on or in ships, submarines, drilling platforms, mining environments, pipeline environments, exploration environments, agricultural environments, clean room environments, air- and space-craft environments, and others. Intelligent features of the cooking system can include control of the electrolyzer, such as remote and/or autonomous control, such as to provide a precise amount of hydrogen fuel (converted from water) at the exact point and time it is required. In embodiments, mechanisms may be provided for capturing and returning products of the electrolyzer, such as to return any unused hydrogen and oxygen into water form (or directing them for other use, such as using them as a source of oxygen for breathing).

Methods and systems describing the design, manufacturing, assembly, deployment, and use of a smart hydrogen-based cooking system are included herein. Processing hardware and software modules for operating various capabilities of the cooking system may be distributed, such as having modules or components that are located in subsystems of the cooking system (e.g., the burners or other heating elements, temperature controls, or the like), having modules or components located in proximity to a user interface for the cooking system (e.g., associated with a control panel), having modules or components located in proximity to a communications port for the cooking system (e.g., an integrated wireless access point, cellular communications chip, or the like, or a docking port for a communications devices, such as a smart phone), having modules or components located in nearby devices, such as other smart devices (e.g., a NEST® thermostat), gateways, access points, beacons, or the like, and/or having modules or components located on servers, such as in the cloud or in a hosted remote control facility.

In embodiments, the cooking system may have a mobile docking facility, such as for docking a smart phone or other control device (such as a specialized device used in an industrial process, such as a processor-enabled tool or piece of equipment), which may include power for charging the smart phone or other device, as well as data communications between the cooking system and the smart phone, such as to allow the smart phone to be used (such as via an app, browser feature, or control feature of the phone) as a controller for the cooking system.

In embodiments, the cooking system may include various hardware components, which may include associated sensors for monitoring operation, processing and data storage capabilities, and communication capabilities. The hardware components may include one or more burners or heating elements, (e.g., gas burners, electric burners, induction burners, convection elements, grilling elements, radiative elements, and the like), one or more fuel conduits, one or more level indicators for indicating fuel level, one or more safety detectors (such as gas leak detectors, temperature sensors, smoke detectors, or the like). In embodiments, a gas burner may include an on-demand gas-LPG hybrid burner, which can burn conventional fuel like liquid propane, but which can also burn fuel generated on demand, such as hydrogen produced by the electrolyzer. In embodiments, the burner may be a consumer cooktop burner having an appropriate power capability, such as being able to produce 20,000 British Thermal Unit ("BTU").

In embodiments, the cooking system may include a user interface that facilitates intuitive, contextual, intelligence-driven, and personalized experience, embodied in a dashboard, wizard, application interface (optionally including or integrating with one more associated smartphone tablet or browser-based applications or interfaces for one or more IoT devices), control panel, touch screen display, or the like. The user interface may include distributed components as described above for other software and hardware components. The application interface may include interface elements appropriate for cooking foods (such are recipes) or for using the cooking system for various consumer, commercial or industrial processes (such as recipes for making semiconductor elements, for curing a coating or injection mold, and many others).

Methods and systems describing the design, manufacturing, assembly, deployment and use of a solar-powered hydrogen production facility in conjunction with a hydrogen-based cooking system are included herein.

Methods and systems describing the design, manufacturing, assembly, deployment and use of a commercial hydrogen-based cooking system that is suitable for use in a range of restaurants, cafeterias, mobile kitchens, and the like are included herein.

Methods and systems describing the design, manufacturing, assembly, deployment and use of an industrial hydrogen-based cooking system that is suitable for use as a food cooking system in various isolated industrial environments are included herein.

Methods and systems describing the design, manufacturing, assembly, deployment and use of an industrial hydrogen-based cooking system that is suitable for use as a heating, drying, curing, treating or other cooking system in various industrial environments are included herein, such as for manufacturing and treating components and materials in industrial production processes, including automated, robotic processes that may include system elements that connect and coordinate with the intelligent cooking system, including in machine-to-machine configurations that enable application of machine learning to the system.

Methods and systems describing the design, manufacturing, assembly, deployment and use of a low-pressure hydrogen storage system are described herein. The low-pressure hydrogen storage system may be combined with solar-powered hydrogen generation. In embodiments, the cooking system may receive fuel from the low-pressure hydrogen storage tank, which may safely store hydrogen produced by the electrolyzer. In embodiments, the hydrogen may be used immediately upon completion of electrolyzing, such that no or almost no hydrogen fuel needs to be stored.

Methods and systems describing the architecture, design, and implementation of a cloud-based platform for providing value-added-services derived from profiling, analytics, and the like in conjunction with a smart hydrogen-based cooking system are included herein. The cloud-based platform may further provide communications, synchronization among smart-home devices and third parties, security of electronic transactions and data, and the like. In embodiments, the cooking system may comprise a connection to a smart home, including to one or more gateways, hubs, or the like, or to one or more IoT devices. The cooking system may itself comprise a hub or gateway for other IoT devices, for home automation functions, commercial automation functions, industrial automation functions, or the like.

Methods and systems describing an intelligent user interface for a cloud-based platform for providing value-added services ("VAS") in conjunction with a smart hydrogen-based cooking system are included herein. The intelligent user interface may comprise an electronic wizard that may provide a contextual and intelligence driven personalized experience dashboard for computing devices that connect to a smart-home network or a commercial or industrial network based around the smart hydrogen-based cooking system. The architecture, design and implementation of the platform may be described herein.

Methods and systems for configuring, deploying, and providing value added services via a cloud-based platform that operates in conjunction with a smart hydrogen-based cooking system and a plurality of interconnected devices (e.g., mobile devices, Internet servers, and the like) to prepare profiling, analytics, intelligence, and the like for the VAS are described herein. In embodiments, the cooking system may include various VAS, such as ones delivered by a cloud-based platform and/or other IoT devices. For example, among many possibilities, the cooking system may provide recipes, allow ordering of ingredients, components or materials, track usage of ingredients to prompt re-orders, allow feedback on recipes, provide recommendations for recipes (including based on other users, such as using collaborative filtering), provide guidance on operation, or the like. The architecture, design, and implementation of these methods and systems and of the value-added-services themselves may further be described herein.

In embodiments, through a user interface, such as a wizard, various benefits, features, and services may be enabled, such as various cooking system utilities (e.g., a liquid propane gas gauge utility, a cooking assistance utility, a detector utility (such as for leakage, overheating, or smoke, or the like), a remote control utility, or the like). Services for shopping (e.g., a shopping cart or food ordering service), for health (such as providing health indices for foods, and personalized suggestions and recommendations), for infotainment (such as playing music, videos or podcasts while cooking), for nutrition (such as providing personalized nutrition information, nutritional search capabilities, or the like) and shadow cooking (such as providing remote materials on how to cook, as well as enabling broadcasting of the user, such as in a personalized cooking channel that is broadcast from the cooking system, or the like).

Methods and systems for profiling, analytics, and intelligence related to deployment, use, and service of a plurality of hydrogen-based cooking systems that are deployed in a range of environments including urban, rural, commercial, and industrial settings are described herein. Urban settings may include rural villages, low cost housing arrangements, apartments, housing projects, and the like where several end users (e.g., individual households, common kitchens, and the like) may be physically proximal (e.g., apartments in a building, and the like). The physical proximity can facilitate shared access to platform components, such as a hydrolyser or low pressure stored hydrogen, and the like. To the extent that individual cooktop deployments may communicate through local or Internet-based network access, additional benefits arise around topics such as, planning for demand loading, and the like. An example may include generating and storing more hydrogen during the week when people tend to cook a home than on the weekend, or using shared information about recipes to facilitate bulk delivery of fresh items to an apartment building, multiple proximal restaurants, and the like. In embodiments, the cooking system may enable and benefit from analytics, such as for profiling, recording or analyzing users, usage of the device, maintenance and repair histories, patterns relating to problems or faults, energy usage patterns, cooking patterns, and the like.

These methods and systems may further perform profiling, analytics, and intelligence related to deployment, use and service of solar-powered electrolyzers that generate hydrogen that is stored in a low-pressure hydrogen storage system.

Methods and systems related to extending the capabilities and access to content and/or VAS of a smart hydrogen-based cooking system through intelligent networking and development of transaction channels are described herein.

Methods and systems of an ecosystem based around the methods and systems of generating hydrogen via solar-powered electrolyzers, storing the generated hydrogen in low pressure storage systems, distribution and use of the stored hydrogen by one or more individuals, and the like, are described herein. In embodiments, the cooking system, or a collection of cooking systems, may provide information to a broader business ecosystem, such as informing suppliers of foods or other materials or components of aggregate information about usage, informing advertisers, managers and manufacturers about consumption patterns, and the like. Accordingly, the cooking system may comprise a component of a business ecosystem that includes various parties that provide various commodities, information, and devices.

Another embodiment of smart cooking technology described herein may include an intelligent, computerized knob or dial suitable for direct use with any of the cooking systems, probes, single burner and other heating elements, and the like described herein. Such a smart knob or dial may include all electronics and power necessary for independent operation and control of the smart systems described herein.

In embodiments, the cooking system is an industrial cooking system used to provide heat in a manufacturing process. In embodiments, the industrial cooking system is used in at least one of a semi-conductor manufacturing process, a coating process, a molding process, a tooling process, an extrusion process, a pharmaceutical manufacturing process and an industrial food manufacturing process.

In embodiments, a smart knob is adapted to store instructions for a plurality of different cooking systems. In embodiments, a smart knob is configured to initiate a handshake with a cooking system based on which the knob automatically determines which instructions should be used to control the cooking system. In embodiments, a smart knob is configured with a machine learning facility that is configured to improve the control of the cooking system by the smart knob over a period of use based on feedback from at least one user of the cooking system.

In embodiments, a smart knob is configured to initiate a handshake with a cooking system to access at least one value-added service based on a profile of a user.

DETAILED DESCRIPTION

Figure 170:
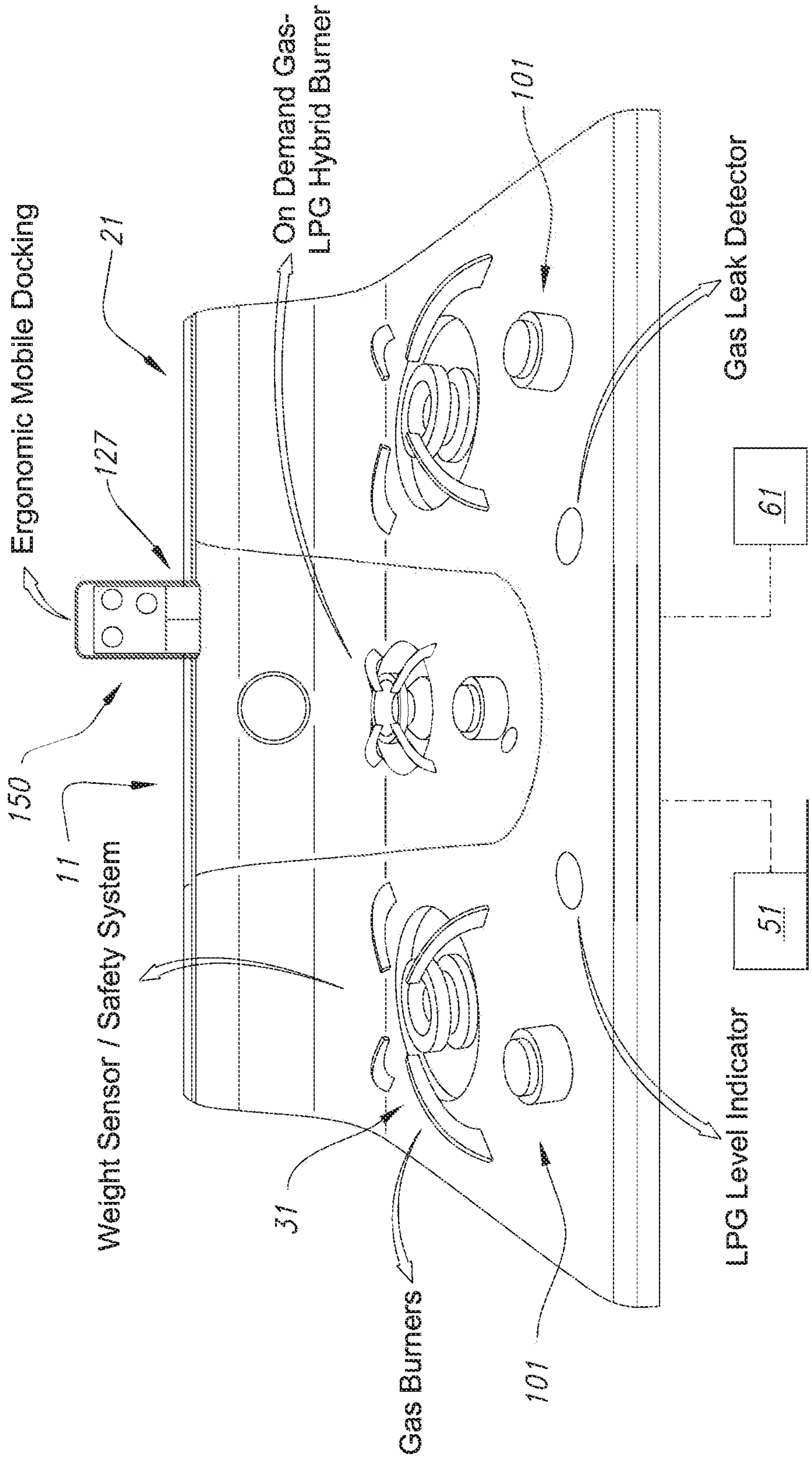
FIG. 170 is a diagrammatic view depicting an integrated cooktop of intelligent cooking system methods and systems in accordance with the present teachings.

Referring to FIG. 170, an integrated cooktop embodiment 11 of the intelligent cooking system methods and systems 21 described herein is depicted. The cooktop embodiment 11 of FIG. 170, may include one or more burners 31 that may burn one or more types of fuel, such as Liquid Propane Gas (LPG), hydrogen, a combination thereof, and the like. Gas burners may, for example, be rated to provide variable heat, including up to a maximum heat, thereby consuming a corresponding amount of fuel. One or more of the burners 31 may operate with an LPG source 51 and a source of hydrogen gas 61 such that the hydrogen source 61 may be utilized based on a demand for fuel indicated by the burner 31, a measure of available LPG fuel, an amount of LPG fuel used over time, and any combination of use, demand, historical usage, anticipated usage, availability of supply, weather conditions, calendar date/time (e.g., time of day, week, month, year, and the like), proximity to an event (e.g., an intense cooking time, such as just before a holiday), and the like. The hydrogen source 61 may be utilized so that the amount of other fuel used, such as LPG, is kept below a usage threshold. Such a usage threshold may be based on costs of LPG gas, uses of LPG gas by other burners 31 in the cooking system 21, other cooking systems 21 in the vicinity (e.g., other cooking systems 21 in a restaurant, other cooking systems 21 in nearby residences), and the like. Each cooking system 21 and/or burner 31 within the cooking system 21 may therefore provide on-demand fuel sourcing dynamically without need for user input or monitoring of the cooking system 21. By automating fuel sourcing, the burner may extend the life of available LPG by automatically introducing the hydrogen fuel, such as by switching from one source to the other or by reducing one source (e.g., LPG) while increasing the other (e.g., hydrogen). The degree to which each fuel source is utilized may be based on a set of operational rules that target efficiency, LPG fuel consumption, availability of hydrogen, and the like. Rating of the one or more burners 31 may be under the control of a processor, including to provide different levels of rating for different fuel sources, such as LPG alone, hydrogen alone, or a mixture of LPG and hydrogen with a given ratio of constituent parts.

Each of the burners 31, cooking systems 21, or collection of cooking systems 21 may be configured with fuel controls, such as fuel mixing devices (e.g., valves, shunts, mixing chambers, pressure compensation baffles, check valves, and the like) that may be controlled automatically based, at least in part on some measure of historical, current, planned, and/or anticipated consumption, availability, and the like. In an example, one or more burners 31 may be set to produce 1000 W of heat and a burner gas source control facility may activate one or more gas mixing devices while monitoring burner output to ensure that the burner output does not deviate from the output setting by more than a predefined tolerance, such as 100 W or ten percent (10%). Alternatively, a model of gas consumption and burner output, embodied in a software module that may have access to data sources regarding types of gas, burning characteristics, types of burners, rating characteristics, and the like, may be used by the control facility to regulate the flow of one or more of gasses being mixed to deliver a consistent burner heat output. Any combination of burner output sensing, modeling, and preset mixing control may be used by the control facility when operating fuel sourcing and/or mixing devices.

The one or more burners 31 may include intelligence for enhancing operation, efficiency, fuel conservation, and the like. Each of the burners 31 may have its own control facility 101. A centralized cooking system control facility may be configured to manage operation of the burners 31 of the cooking system 21 or other heating elements noted throughout this disclosure. Alternatively, the individual burner control facilities 101 may communicate over a wired and/or wireless interface to facilitate combined cooking system burner control. One or more sensors to detect presence of an object in the targeted heating zone (e.g., disposed on the burner grate) may provide feedback to the control facility. Object presence sensors may also provide an indication of the type, size, density, material, and other aspect of the detected object in the targeted heating zone. Detection of a material such as metal, versus cloth (e.g., a person's sleeve), versus human flesh may facilitate efficiency and safety. When cloth or human flesh is detected, the control facility may inhibit heat production so as to avoid burning the person's skin or causing their clothing to catch fire. Such a control facility safety feature may be over ridden through user input to the control facility to give the user an opportunity to determine if the inhibited operation is proper. Other detectors, such as spill over (e.g., moisture) detectors in proximity to the burner may help in managing safety and operation. A large amount of spillage from a pot may cause the flame being produced by the burner to be extinguished. Based on operational rules, the source of gas may be disabled and/or an igniter may be activated to resume proper operation of the burner. Other actions may also be configured into the control facility, such as signaling the condition to a user (e.g., through an indicator on the cooking system 21, via connection to a personal mobile device, to a central fire control facility, and the like).

Burner control facilities 101 may control burner heat output (and thereby control fuel consumption) based on one or more models of operation, such as to heat a pan, pot, component, material, or other item placed in proximity to the burner 21 or other heating element. As an example, if a user wants to boil water in a heavy metal pot quickly, a control facility may cause a burner to produce maximum heat. Based on user preferences and/or other factors as noted above related to demand, supply, and the like, the control facility may adjust the burner output while notifying the user of a target time for completion of a heating activity (e.g., time until the water in the pot boils). In this way an intelligent burner 21 (e.g., on with a burner control facility) may achieve some user preferences (e.g., heating temperature) while compromising on others (e.g., amount of time to boiling, and the like). The parameters (e.g., operational rules) for such tradeoff may be configured into the cooking system 21/burner 31 during production, may be adjustable by the user directly or remotely, may be responsive to changing conditions, and the like. In embodiments, machine learning, either embodied at the cooking system 21, in the cloud, or in a combination, may be used to optimize the parameters for given objectives sought by users, such as cooking time, quality of the result (e.g., based on feedback measures about the output product, such as taste in the case of foods or other quality metrics in the case of other products of materials). For example, the cooking system 21 may be configured under control of machine learning to try different heating patterns for a food and to solicit user input as to the quality of the resulting item, so that over time an optimal heating pattern is developed.

The intelligent cooking system 21 as described herein and depicted in FIG. 170 may include an interface port 127 with supporting structural elements to securely hold a personal mobile device 150 (e.g., a mobile phone) in a safe and readily viewable position so that the user may have both visual and at least auditory access to the device. The cooking system 21 may include features that further ensure that the mounted mobile device 150 is not subject to excessive heat, such as heat shields, deflectors, air flow baffles, heat sinks, and the like. A source of airflow may be incorporated to facilitate moving at least a portion of heated air from one or more of the burners 31 away from a mounted personal mobile device 150.

Figure 171:
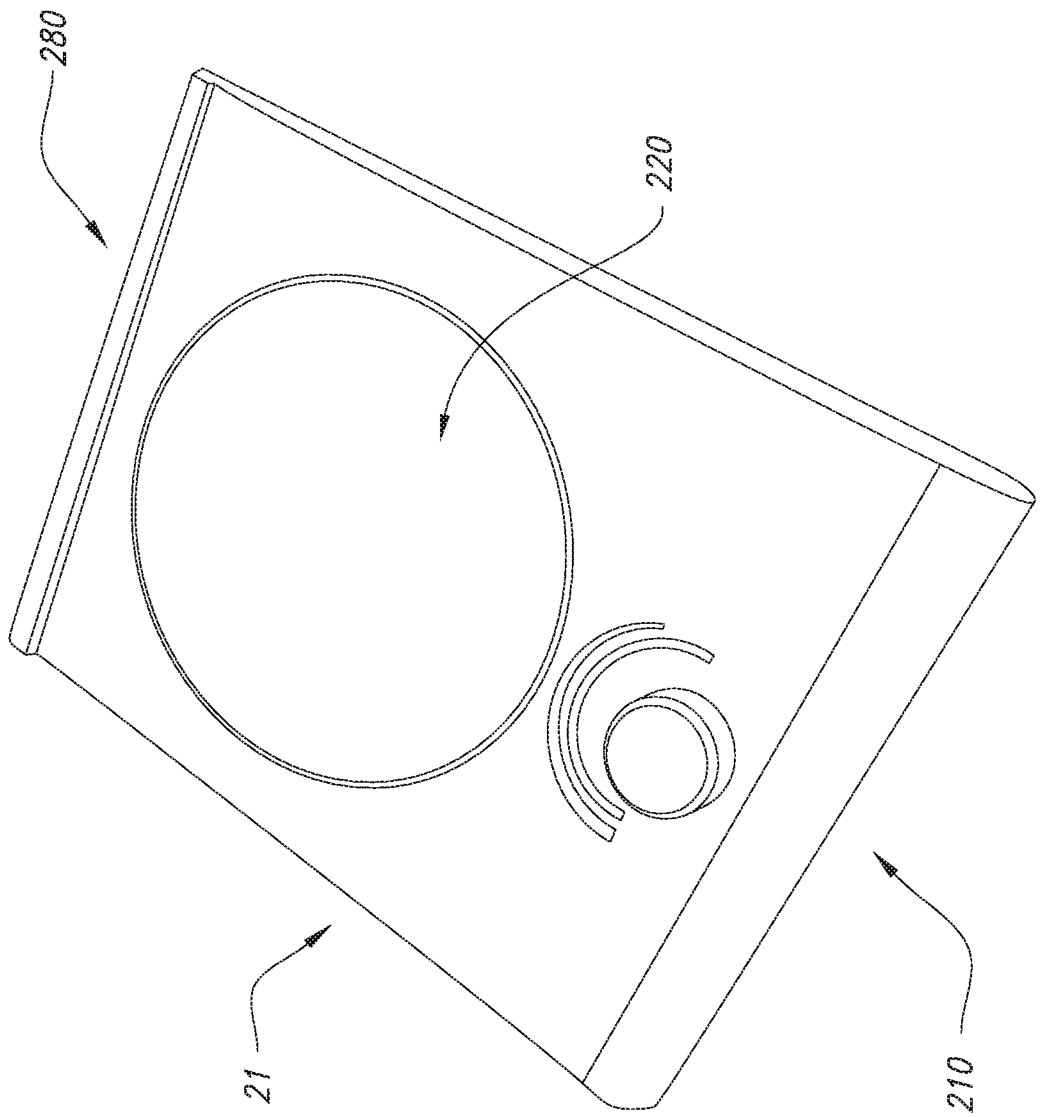
FIG. 171 is a diagrammatic view depicting a single intelligent burner of the intelligent cooking system in accordance with the present teachings.

The intelligent burner embodiment 280 depicted in FIG. 171 represents a single burner embodiment 210 of the intelligent cooking system 21 described herein. Any, none, or all features of a multi-burner intelligent cooking system 21 may be configured with the single burner version depicted in FIG. 171. Further depicted in FIG. 171 is a version of the intelligent burner 280 that may have an enclosed burner chamber 220 that provides heat in a target heat-zone as a plane of heat rather than as a volume of heat. This may be generated by induction, electricity, or the like that may be produced by converting a source of fuel, such as LPG and/or hydrogen with a device that may produce electricity from a combustible gas.

Figure 172:
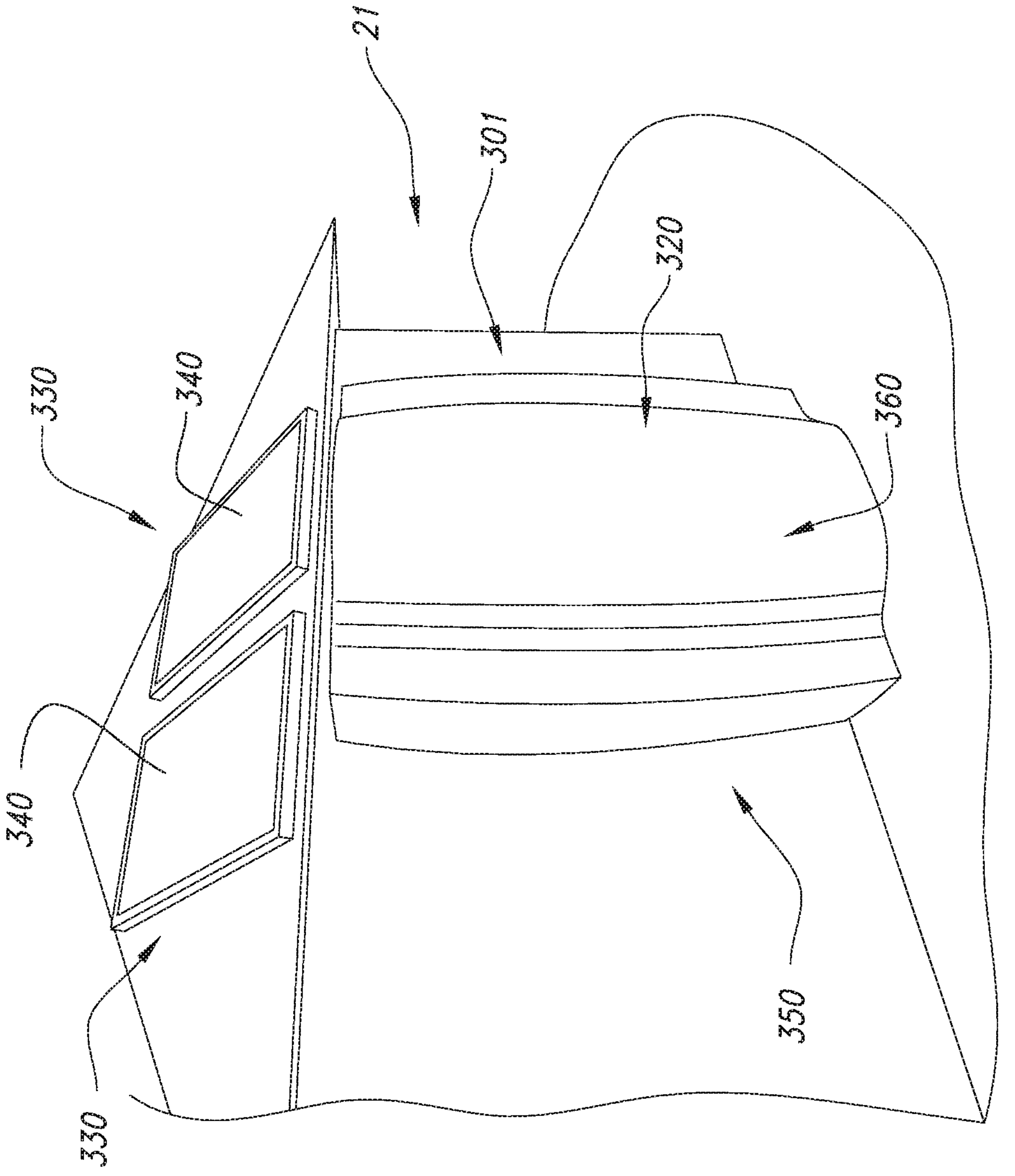
FIG. 172 is a partial exterior view depicting a solar-powered hydrogen production and storage station in accordance with the present teachings.
Figure 176:
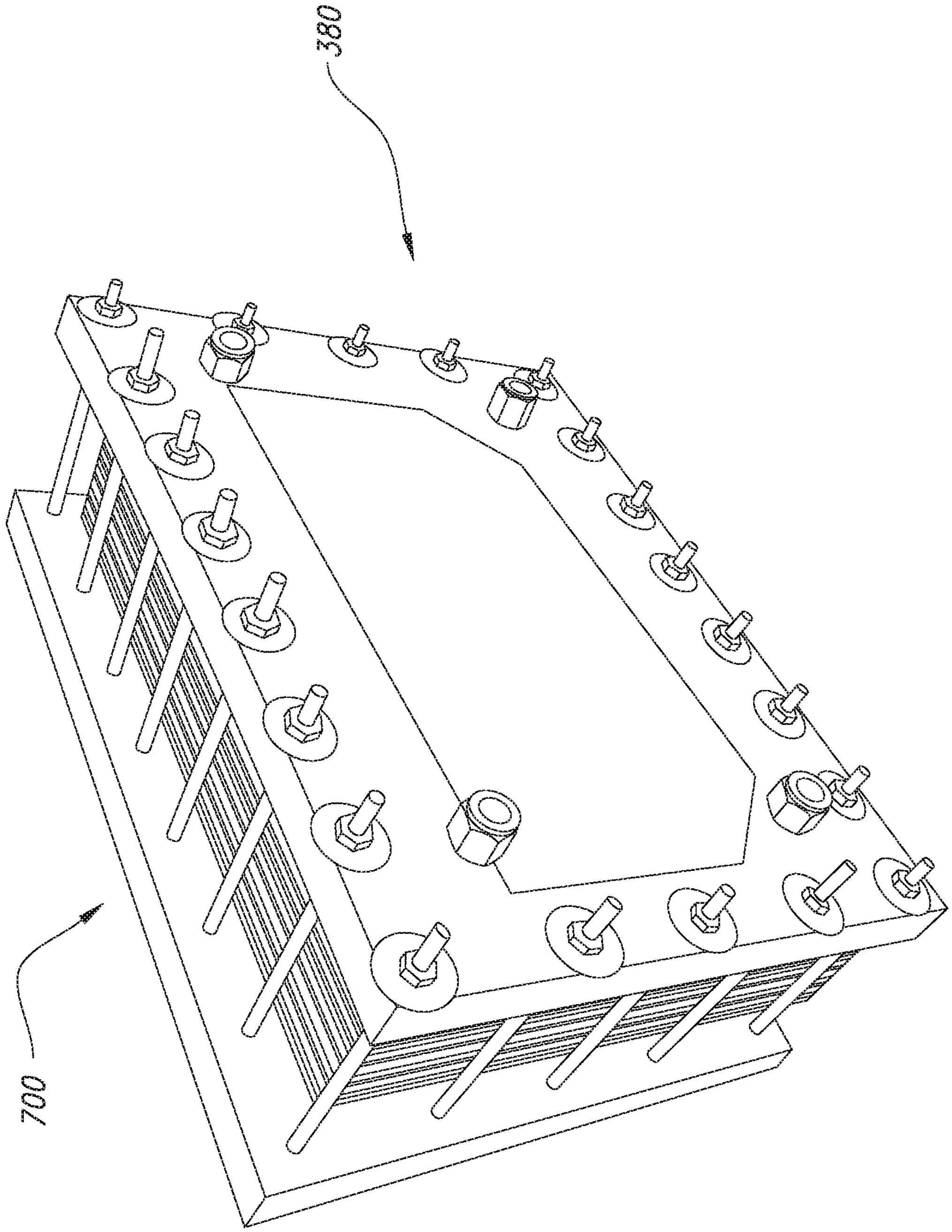
FIG. 176 is a diagrammatic view depicting an electrolyzer in accordance with the present teachings.

The intelligent cooking system 21 may be combined with a hydrogen generator 300 to provide a source of hydrogen for use with the burners 31 as described herein. FIG. 172 depicts a solar-powered hydrogen production and storage station 320. The hydrogen production station 320 may be configured with one or more solar collectors 330, such as sunlight-to-electricity conversion panels 340 that may produce energy for operating an electrolyzer 350 that converts a hydrogen source, such as water vapor, to at least hydrogen and oxygen for storage. Energy from the solar collectors 330 may power one or more electrolyzers 350, such as one depicted in the embodiment 700 of FIG. 176. The one or more electrolyzers 350 may process water vapor, such as may be available in ambient air, for storage in a storage system 360, such as a low-pressure storage system 370 depicted in FIG. 172. Alternatively, and/or in addition to processing air-born water vapor, a source of water, such as collected rainfall, public water supply, or other source may be processed by the electrolyzer 350 to produce hydrogen fuel.

As hydrogen fuel is produced, it may be stored in a suitable storage container, such as the low-pressure storage system 370 that may be configured with the solar-powered electrolyzer system 350. The hydrogen produced by the solar-powered electrolyzer 350 may be routed to one or more intelligent cooking systems 21 in addition to or in place of being routed to a storage system 360. A hydrogen production and storage system 320 may produce hydrogen based on a variety of conditions including, without limitation, availability of a source of water vapor, availability of power to the electrolyzer, an amount of sunlight being collected, a forecast of sunlight, a demand for hydrogen energy, a prediction of demand, based on availability of LPG, usage of LPG, and the like.

Figure 174:
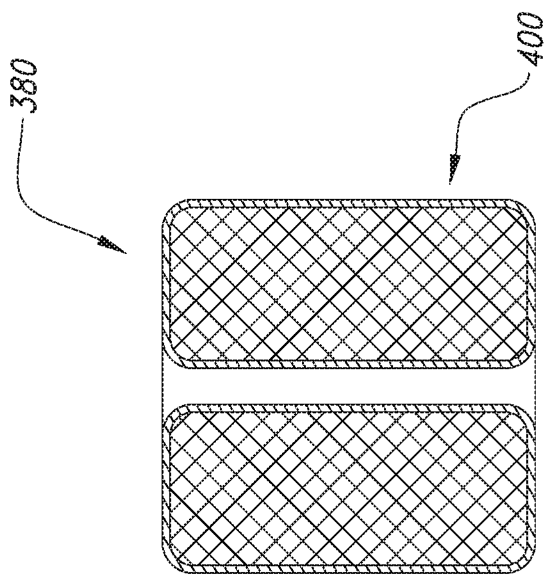
FIG. 174 and FIG. 175 are cross-sectional views of a low-pressure storage system.
Figure 175:
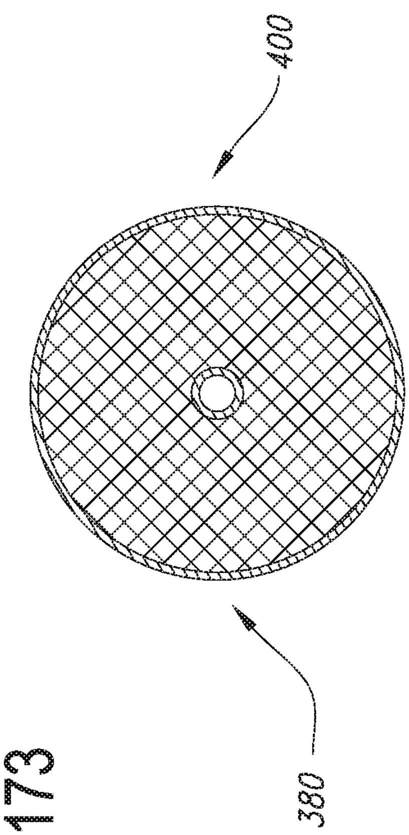
Figure 173:
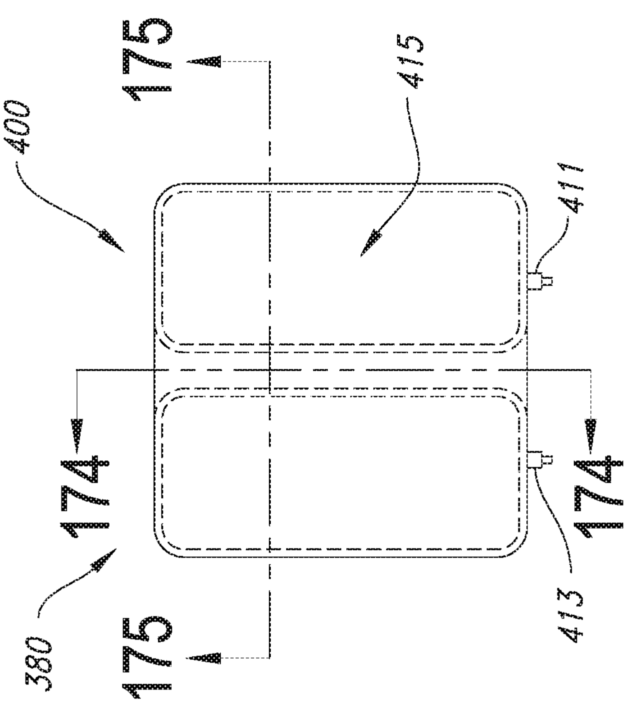
FIG. 173 is a diagrammatic view depicting a low-pressure storage system in accordance with the present teachings.

The low-pressure gas storage system 370 may store the hydrogen and oxygen in ultraviolet ("UV") coated plastic bags or through water immersion technology (e.g., biogas). The maximum pressure inside the system may be less than 1.1 bar, which promotes safety, as the pressure is very low. Also, as no compressors are used, the cost for storage is much lower than for active storage systems that store compressed gas. FIG. 173, FIG. 174, and FIG. 175 depict an embodiment 400 of such a low-pressure storage system 370, with an inlet valve 411 and outlet valve 413 providing ports into an interior storage area 415 with the internal volume separated into two parts.

The low pressure set up may directly work from renewable energy, such as solar energy collected by solar cells, wind energy, hydro-power, or the like, improving the efficiency. The selected source of renewable energy may be based on characteristics of the environment; for example, marine industrial environments may have available wind and hydro-power, agricultural environments may have solar power, etc. Also if the renewable energy (e.g. solar energy) collection facility is connected to a power grid, the electricity generated and the energy stored may be provided to the grid, e.g., during high cost periods. Likewise, the grid may be used to restore any used energy during off peak hours at reduced costs.

The designed low-pressure storage may be used to store hydrogen, as a source of energy, that may be converted into electricity. The designed system may store energy at very low cost and may have a lifetime of years, e.g., more than 15 years, which modern batteries don't have. Amounts of storage may be configured to satisfy safety requirements, such as storing little enough to cause a minimal fire hazard as compared to storing larger amounts of other fuels.

In an embodiment, the intelligent cooking system 21 may signal to the electrolyzer system 350 a demand for hydrogen fuel. In response, the electrolyzer system 350 may direct stored hydrogen to the cooking system 21, begin to produce hydrogen, or indicate that hydrogen is not currently available. This response may be based, at least in part on conditions for producing hydrogen. If conditions for producing hydrogen are good, the electrolyzer system may begin to produce hydrogen fuel rather than merely sourcing it from storage. In this way, the contemporaneous demand for hydrogen fuel and an ability to produce it may be combined to determine the operation of the energy production and consumption systems.

The intelligent cooking system 21 and/or hydrogen production and storage systems described herein may be combined with a platform that interacts with electronic devices and participants in a related ecosystem of suppliers, content providers, service providers, regulators, and the like to deliver VAS to users of the intelligent cooking system 21, users of the hydrogen production system, and other participants in the ecosystem. Certain features of such a platform 800 may be depicted in FIG. 177. The platform 800, which may be a cloud-based platform, may handle cooking system utilities, such as leakage sensing, fuel sourcing, usage assistance, remote control, and the like. In an example, a user who is located remotely from the intelligent cooking system 21 may configure the cooking system 21 to operate at a preset time, or based on a preset condition from his/her computing device (e.g., a personal mobile phone, desktop computer, laptop, tablet, and the like). The user may further be notified when the cooking system 21 begins to operate, thereby ensuring the user that the cooking system 21 is operating as expected. A user or third party (e.g., a regulatory agency, landlord, and the like) may configure one or more present conditions. Such conditions may include a variety of triggers including time, location of a user or third party, and the like. In an example, a parent may want to have a cooking system operate to warm up ingredients based on an anticipated arrival of someone to the home. This anticipation may be based on a detected location of a mobile device being carried by a person whose arrival is being anticipated.

The platform 800 may further connect cooking system users with participants in the ecosystem (e.g., vendors and/or service providers) synergistically so that both the user and the participants may benefit from the platform 800. In an example, a user may plan to prepare a meal for an upcoming dinner. The user may provide the meal plan to the platform 800 (e.g., directly through the user's mobile phone, via the user's intelligent cooking system 21, and the like). The platform 800 may determine that fresh produce for the meal is preferred by the user and may signal to retailers and/or wholesalers to have the produce available for the user to pick up on his/her return to the home to prepare the meal. In this way, vendors and service providers who participate in the ecosystem may gain insight into their customer's needs. Likewise, users may indicate a preference for a type of meal that may be prepared with a variety of proteins. Participants in the ecosystem may make offers to the user to have one or more of the types of protein available for the user on the day and at the time preferred by the user. A butcher that is located in proximity to the user's return path may offer conveniences, such as preparation of cuts of meat for the user. Butchers who may not be conveniently located in proximity to the user's return path may offer delivery services on a day and time that best complies with the user's meal plans.

A user of such a platform-connected intelligent cooking system may leverage the platform 800 to gain both access to and analysis of information that is available across the Internet to address particular user interests, such as health, nutrition, and the like. As an example, a user may receive guidance from a health professional to reduce red meat intake and increase his seafood intake. The platform 800 may interact with the user, the cooking system, and ecosystem participants to facilitate preparing variations of a family's favorite meals with fish instead of red meat. Changes in spices, amounts, cooking times, recipes, and the like may be provided to the user and to the cooking system 21 through the platform 800 to make meal preparation more enjoyable. The platform 800 may help with nutritional assistance, such as by providing access to quality nutritional professionals who may work personally with a user in meal selection and preparation.

The platform 800 may also help a user of the platform 800, even one who does not have access to the intelligent cooking system 21, to benefit from the knowledge gathering and analysis possible from a platform 800 interconnected with a plurality of cooking systems, users, and ecosystem participants. In an example, the platform 800 may provide guidance to a user in the selection and purchase of an intelligent burner and/or integrated cooking system and related appliances (e.g., refrigeration), utensils, cookware, and the like.

The platform 800 may further facilitate integration with VAS, such as financial services (e.g., for financing infrastructure and operating costs), healthcare services (e.g., facilitating connecting healthcare providers with patients at home), smart home solutions (e.g., those described herein), rural solutions (e.g., access to products and services by users in rural jurisdictions), and the like. Information (e.g., profiles, analytics, and the like) gathered and/or generated by the platform 800 may be used for other business services either directly with or through other partners (e.g., credit rating agencies for developing markets).

The platform 800 may facilitate a range of user benefits, including shopping, infotainment, business development, and the like. In a business development example, a user may utilize her intelligent integrated cooking system 21 to produce her own cooking show by setting up her personal phone with camera on the cooking system 21 so that the user activity on the cooking system 21 may be captured and/or distributed to other users via the platform 800. Further in the example, a user may schedule a cooking demonstration and may allow other users to cook along with him in an autonomous and/or interactive way. A user may opt into viewing and cooking along with the cooking show producer without directly interacting with the producer. Whereas, another user may configure his cooking system 21 with a personal mobile device and allow others to provide feedback based on the user's activities on the cooking system 21 via the camera and user interface of the mobile device.

Figure 225:
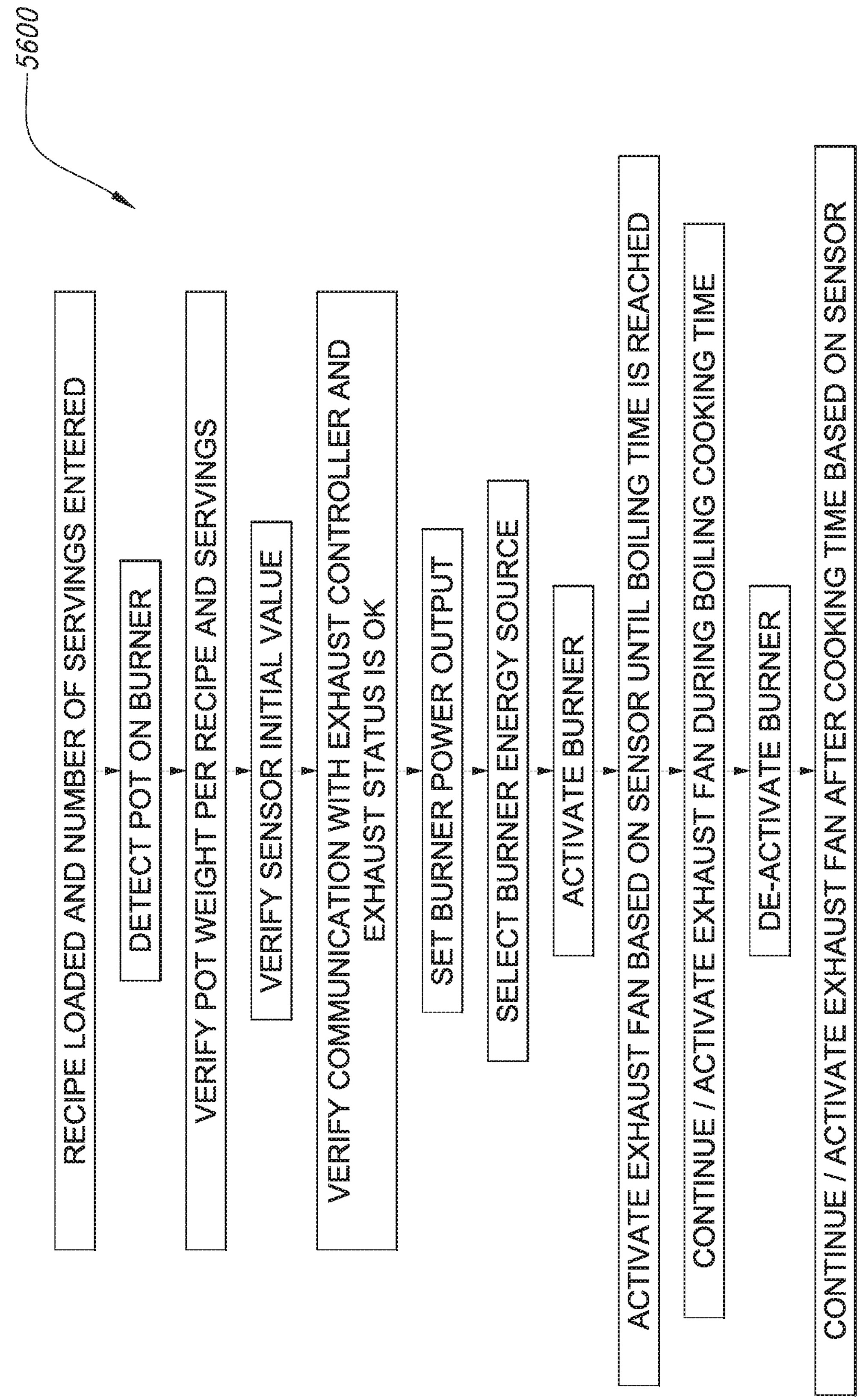

The platform 800 may facilitate establishing an IoT ecosystem of smart home devices, such as, in embodiments, a smart kitchen that enables and empowers the homemaker. The smart kitchen may include a smart cooking system 21, IoT middleware and a smart kitchen application. The smart cooking system 21 may provide a hardware layer of the platform 800 that may provide plug and play support for IoT devices, with each new device acting as a node providing more information, such as from additional sensors, to the entire system. IoT cloud support, which may be considered as a middleware layer of the platform 800, may enable the communication (such as by streaming) and storage of data on the cloud, along with enabling optional remote management of various capabilities the platform 800. A smart kitchen application may include a user interface layer that may provide a single point of access and control for the entire range of smart devices for the ease of the homemaker or other user. As an example of a smart kitchen enabled by the smart cooktop methods and systems described herein, an exhaust fan may be turned on as the water in a pot begins to boil, thereby directing the steam output of the pot away from the kitchen. This may be done through a combination of sensors (e.g., a humidity sensor), automated cooking system control that determines when the pot will begin to boil based on the weight of the pot on the burner, and the energy level of the burner, and the like Similar embodiments may be used in industrial environments, such as coordination with ventilation systems to maintain appropriate temperature, pressure, and humidity conditions by coordination of heating activities via the cooking system 21 and routing and circulation of air and other fluids by the ventilation system. The cooking system controller may, for example, communicate with an exhaust fan controller to turn on the fan based on these inputs and/or calculations; thereby improving the operation of the smart kitchen appliances while conserving energy through timely application of the exhaust fan. A flow chart representative of operational steps 5600 for this example is depicted in FIG. 225.

The value created by such a platform 800 may be broadly classified into (i) VAS; (ii) profiling, learning and analytics; and (iii) a smart home solution or IoT solution for a commercial or industrial environment. The VAS of the system, may include without limitation: (a) personalized nutrition; (b) information and entertainment (also referred to as "infotainment"); (c) family health; (d) finance and commerce services (including online ordering and shopping); (e) hardware control services; and many other types of services.

Profiling, learning and analytics may provide a number of benefits to various entities. For example, a homemaker may get access to personalized nutrition and fitness recommendations to improve the health of the entire family, including healthy recipe and diet recommendations, nutritional supplement recommendations, workout and fitness recommendations, energy usage optimization advice for cooking and use of other home appliances, and the like. Device manufacturers and other enterprises may also benefit, as the platform 800 may solve the problems faced by home appliance device manufacturers in integrating their devices to the cloud and leveraging the conveniences provided by the same. Device manufacturers and other enterprises may be provided with an interface to the platform 800 (such as by one or more application programming interfaces, graphical user interfaces, or other interfaces) that may enable them to leverage capabilities of the platform 800, including, one or more machine learning algorithms or other analytic capabilities that may learn and develop insights from data generated by the device. These capabilities may include an analytics dashboard for devices; a machine learning plug and play interface for developing data insights; a health status check for connected appliances (e.g., to know when a device turns faulty, such as to facilitate quick and easy replacement/servicing); and user profiling capabilities, such as to facilitate providing recommendations to users, such as based on collaborative filtering to group users with other similar users in order to provide targeted advice, offers, advertisements, and the like.

A smart home solution or IoT solution for a commercial or industrial environment may provide benefits to device manufacturers who find it difficult to embed complex electronics in their devices to make them intelligent due to development and cost constraints. The platform 800 simplifies this by providing a communication layer that may be used by partners to send their device data, after which the platform 800 may take over and provide meaningful data and insights by analyzing the data and performs specific actions on behalf of an integrated smart home for the user. Additional value of each partner interacting through the platform 800 is the access to various sensory data built into the system for effectively making any connected device more intelligent. For example, among many possibilities, the ambient temperature sensor inside the smart cooking system 21 may be leveraged by a controllable exhaust facility to accordingly increase the airflow for the comfort of the homemaker.

Figure 177:
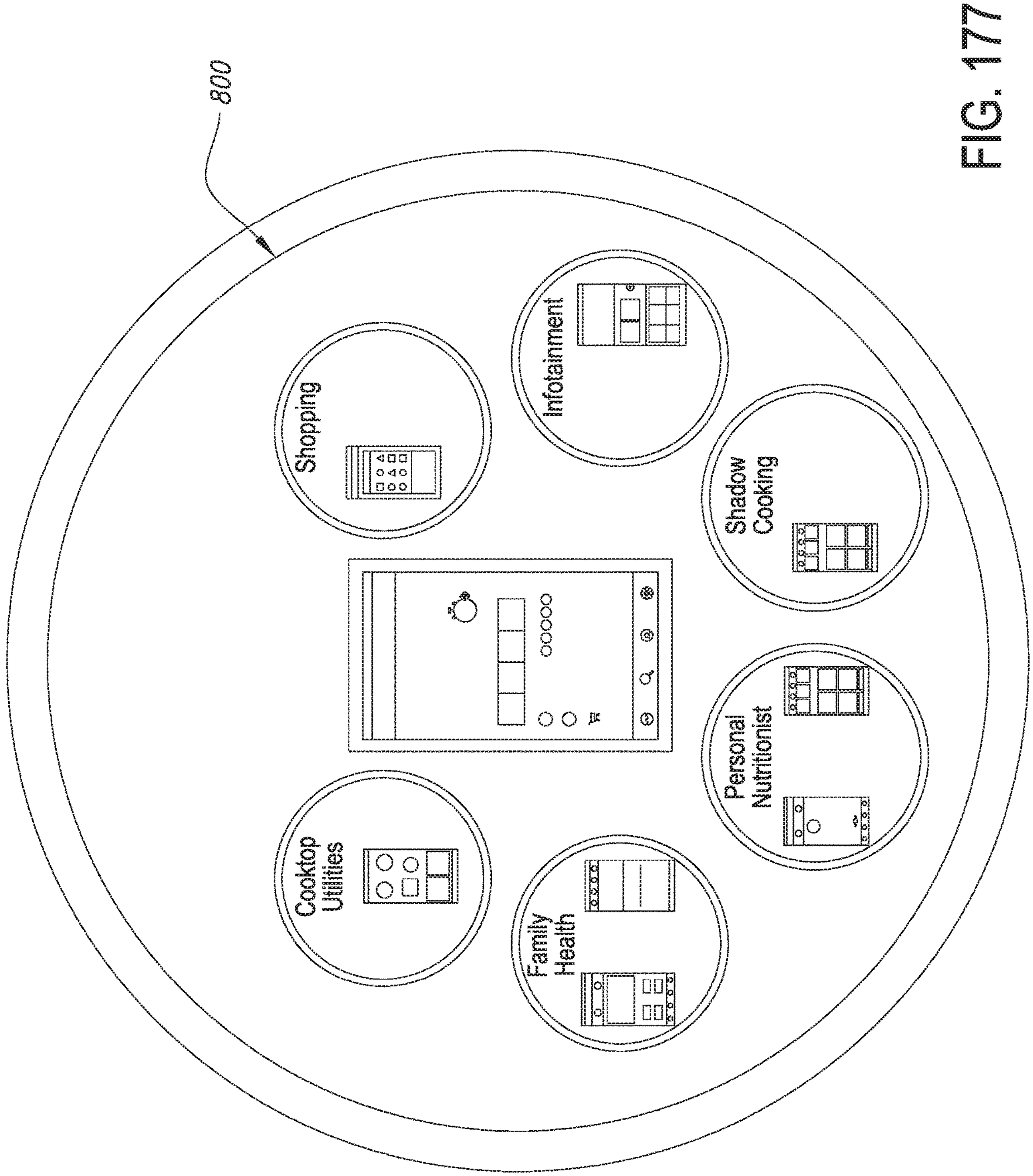
FIG. 177 is a diagrammatic view depicting features of a platform that interact with electronic devices and participants in a related ecosystem of suppliers, content providers, service providers, and regulators in accordance with the present teachings.
Figure 178:
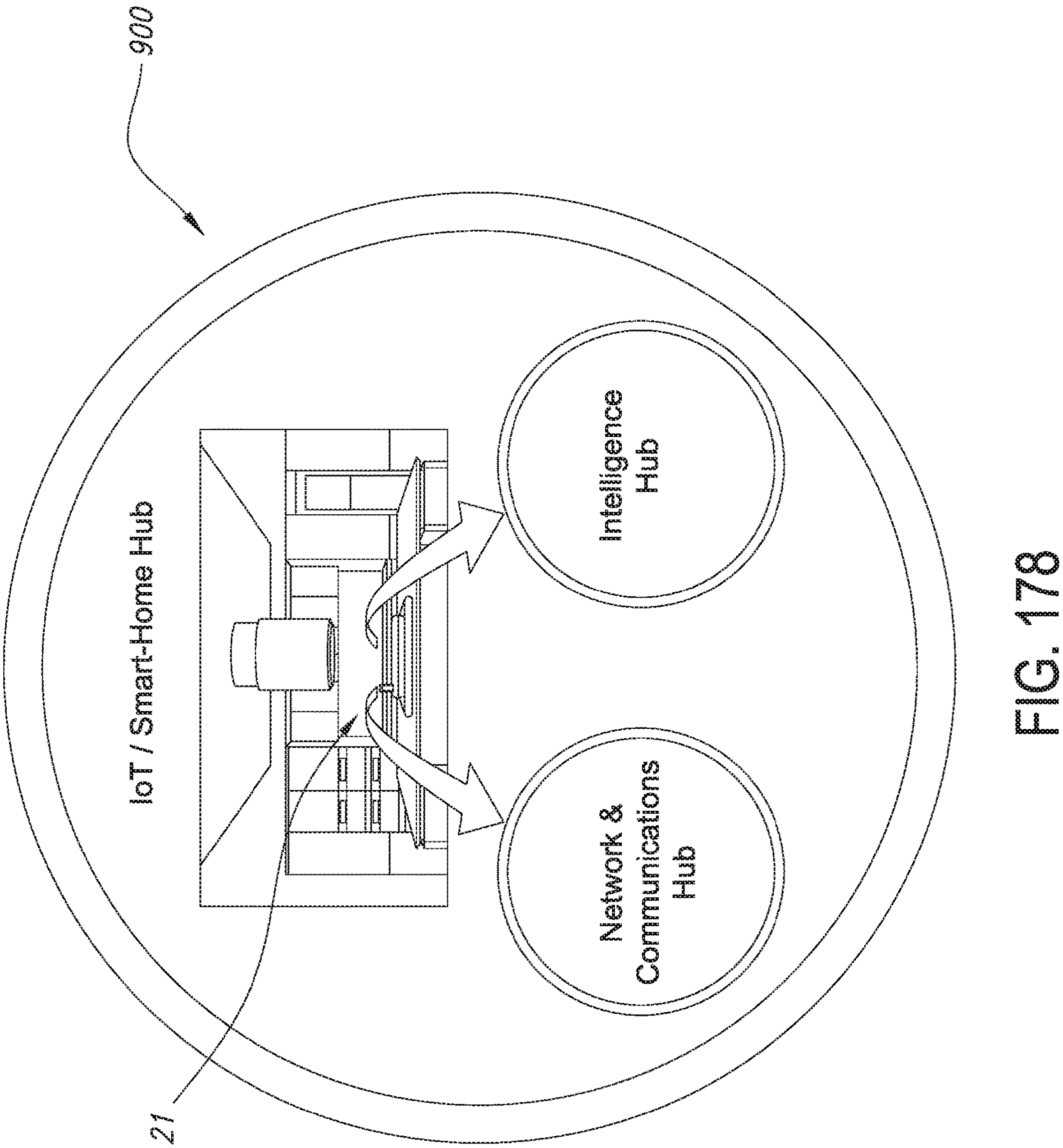
FIG. 178 is a diagrammatic view depicting a smart home embodiment of the intelligent cooking system in accordance with the present teachings.

Referring to the smart home embodiment of FIG. 178, an intelligent cooking system 900 may be a participant in or may be a gateway to a home appliance network that may include other kitchen appliances, sensors, monitors, user interface devices, processing devices, and the like. The home appliance network, and/or the devices configured in the home network, may be connected to each other and to other participants of the ecosystem through the platform 800 (FIG. 177). Data collected from these appliances, participants in the ecosystem, users of the platform, third parties, and the like may provide an interactive environment to explore, visualize, and study patterns, such as fuel usage patterns. Data collected may further be synthesized through deep machine learning, pattern recognition, modeling, and prediction analysis to provide valuable insights related to all aspects of the platform participants, devices, suppliers, and the larger ecosystem.

Further embodiments of the hydrogen generation and consumption capabilities are now described.

The system may use water and electricity as fuel to generate the gas-on-demand that may be used, for example, for cooking. The hydrogen and oxygen generated in the cell may be separated out within the cell and kept separate until reaching the combustion port in a burner. A specially designed burner module may comprise different chambers to allow passage of hydrogen, oxygen, and cooking gas. The ports for hydrogen and cooking gas may be designed in such a way as to avoid flame flashbacks and flame lift-offs, and the like. The oxygen ports may be designed to ensure optimum supply of oxygen with respect to the hydrogen supply. The hydrogen and oxygen ports may be on mutually perpendicular planes ensuring proper intermixing of the burning mixture. The hydrogen and cooking gas connections may be mutually independent and may be operated separately or together to generate a mixed flame.

Figure 179:
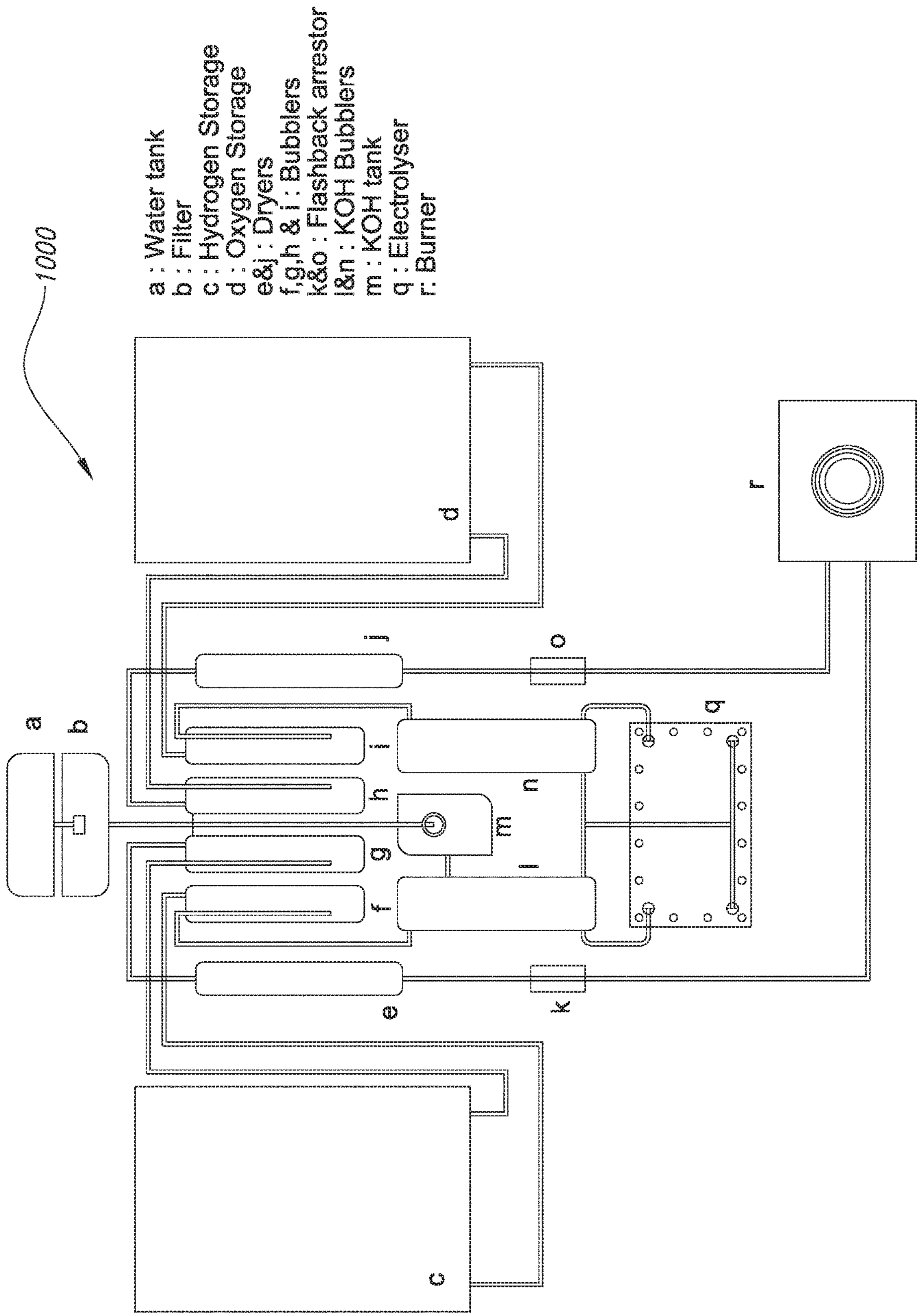
FIG. 179 is a diagrammatic view depicting a hydrogen production and use system in accordance with the present teachings.
Figure 180:
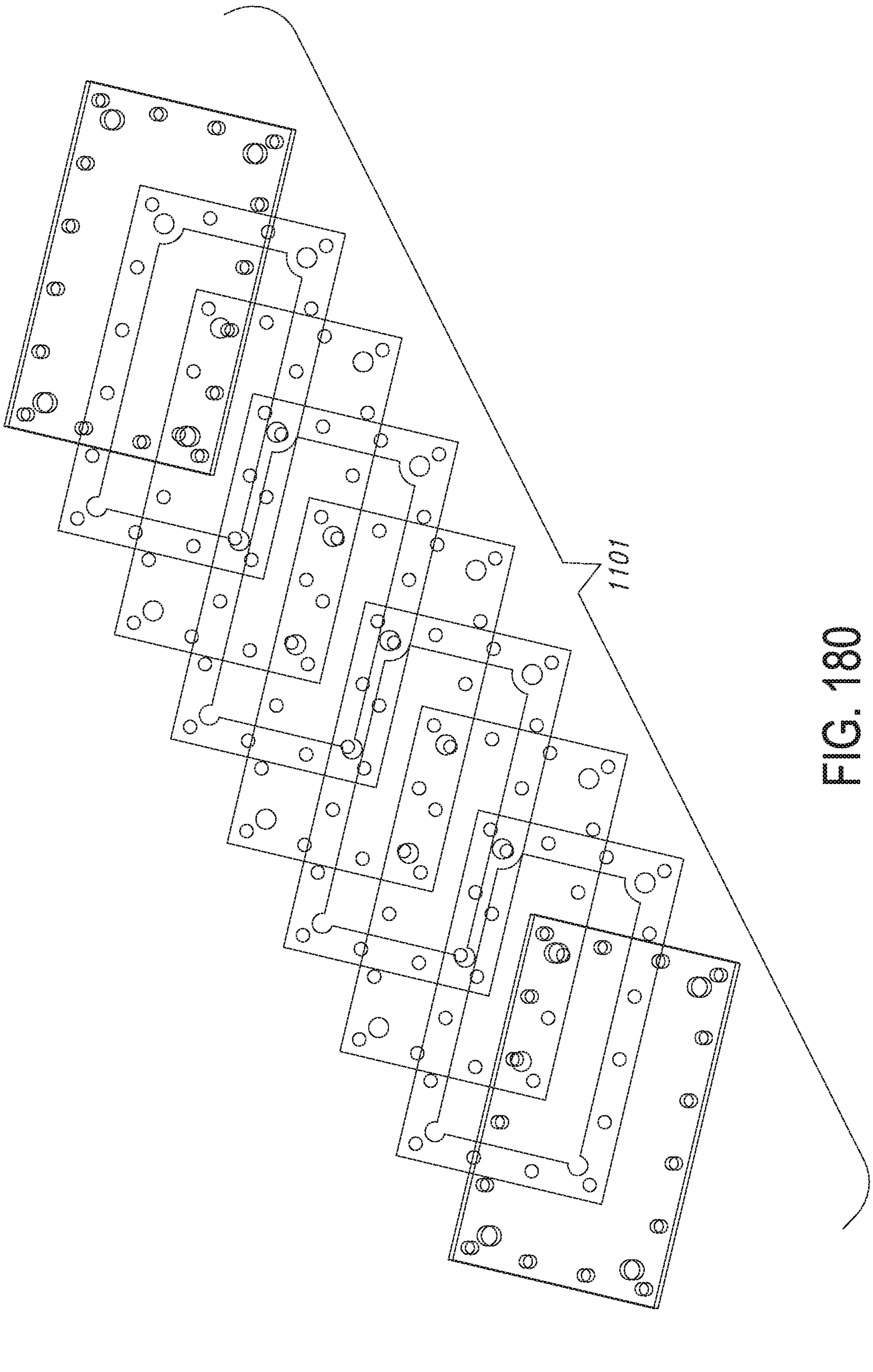
FIG. 180 is a diagrammatic view depicting an electrolytic cell in accordance with the present teachings.

A hydrogen production and use system 1000 as disclosed herein may comprise one or more of the following elements as depicted in FIGS. 179 and 180. An electrolytic cell 1101 is detailed in FIG. 180, which shows an exploded view of the cell consisting of steel electrodes separated by nylon membranes inside polyvinyl chloride ("PVC") gaskets sandwiched by acrylic sheets. The cell may comprise an alkaline electrolytic cell that separates water into its constituent components of hydrogen and oxygen. A mixture tank, such as a concentrated alkaline mixture tank may serve as the electrolyte source for the electrolytic cell. The alkali mixture may be prepared by mixing a base like potassium hydroxide ("KOH") or sodium hydroxide ("NaOH") with water. In case of KOH, in embodiments the concentration may be around 20%. The membrane for separation of gases within the cell may be made from a variety of materials. One such material is a nylon sheet with catalyst coating that has enough thread count to allow ion transfer and minimal gas transfer. The electrodes used may be, for example, stainless steel or nickel coated stainless steel. Also provided may be gas bubbling tanks. The hydrogen and oxygen generated from the electrolytic cells may be passed through gas bubbling tanks. The tanks may be made with recirculation or non-recirculation modes. In a non-recirculation mode, the gas is bubbled through water and any impurity in the gas gets purified in the process. In recirculation mode, the gas is bubbled through KOH solution, which may be identical in concentration to the alkaline mixture tank. In this methodology, any additional electrolyte that flows out with the gas gets re-circulated into the alkaline mixture tank. The two bubbling tanks may be connected together, such as at the bottom, to ensure pressure maintenance across them. Dehumidifiers may also be included. The gas passed through the bubblers may have excess moisture content that reduces the combustion efficiency. Hence, the gas may be passed through dehumidifiers, which may use a desiccant, water-gas separator membranes, or other dehumidification technologies, or a combination thereof, to reduce the humidity content of the gas. A hydrogen burner arrangement is provided wherein a conventional hydrogen burner, as known in the art, may be connected to the dehumidifier, such as through a flashback arrestor. In embodiments, there are no ports for air intake, as combustion of the hydrogen-air mixture may result in an elevated concentration of mono-nitrogen oxides ("NOx"), which in turn may result in a potential for flame flashback. The burner ports may have a small diameter, such as lower than 0.5 mm, to reduce the chance of any flame flashback. The ports may be aligned in such a way as to cross-ignite, resulting in combustion of the complete gas supply with a single spark. The hydrogen concentration throughout the supply line may be above the maximum combustion limit, and hence there is little safety hazard. The oxygen supply may be through a channel that is completely separate from the hydrogen one. The oxygen ports may be located on a plane perpendicular to the hydrogen ports to ensure proper mixing of the combustion mixture. Above the burner, a catalyst may be placed so as to lower the temperature of combustion, reducing the concentration of NOx generated. An economically feasible high temperature catalyst mesh may be used to lower the temperatures of combustion.

The power supply may supply a desired voltage that may be optimized according to the conditions of the system, such as the water temperature, pressure, etc. The voltage per cell may vary, such as from 1.4 v to 2.3 v, and the current density may be as low as 44 mA/cm$^2$ for maximum efficiency. As the current density is low, the efficiency tends to be high.

An LPG/cooking gas burner arrangement may be provided. The LPG/cooking gas burner arrangement may be added to the hydrogen burner arrangement. In embodiments, the system may be similar to a closed top burner arrangement, where the burner ports are along the sides of the burner and the flame fueled by the LPG surrounds the hydrogen flame. In embodiments, the gas supply channel may be kept separate from the hydrogen supply channel and the oxygen supply channel and would hence pose no safety risk in that regard. In alternative embodiments, the fuels may be mixed, such as under control of a processor.

A renewable energy connection may be provided. In embodiments, the whole system, including the storage system, may be connected to renewable energy sources like solar power, wind power, water power, or the like. The hydrogen storage may act as storage for energy produced by such a renewable energy source.

In yet another embodiment of the system, the actuation of the combustion may be done using a sensor placed along the oxygen supply channel to detect the presence of a cooking utensil on the burner. The sensor may be shielded from the heat and made to work at an optimum temperature.

In yet another embodiment of the system, the hydrogen flame may be used to heat a coil that could hence radiate heat for more spread out cooking. The hydrogen supply to the radiator may be regulated by the temperature within the radiator.

In yet another embodiment of the system, the heat absorbed by the catalyst mesh may be used to generate electric power, increasing the net efficiency of the system.

Figure 181:
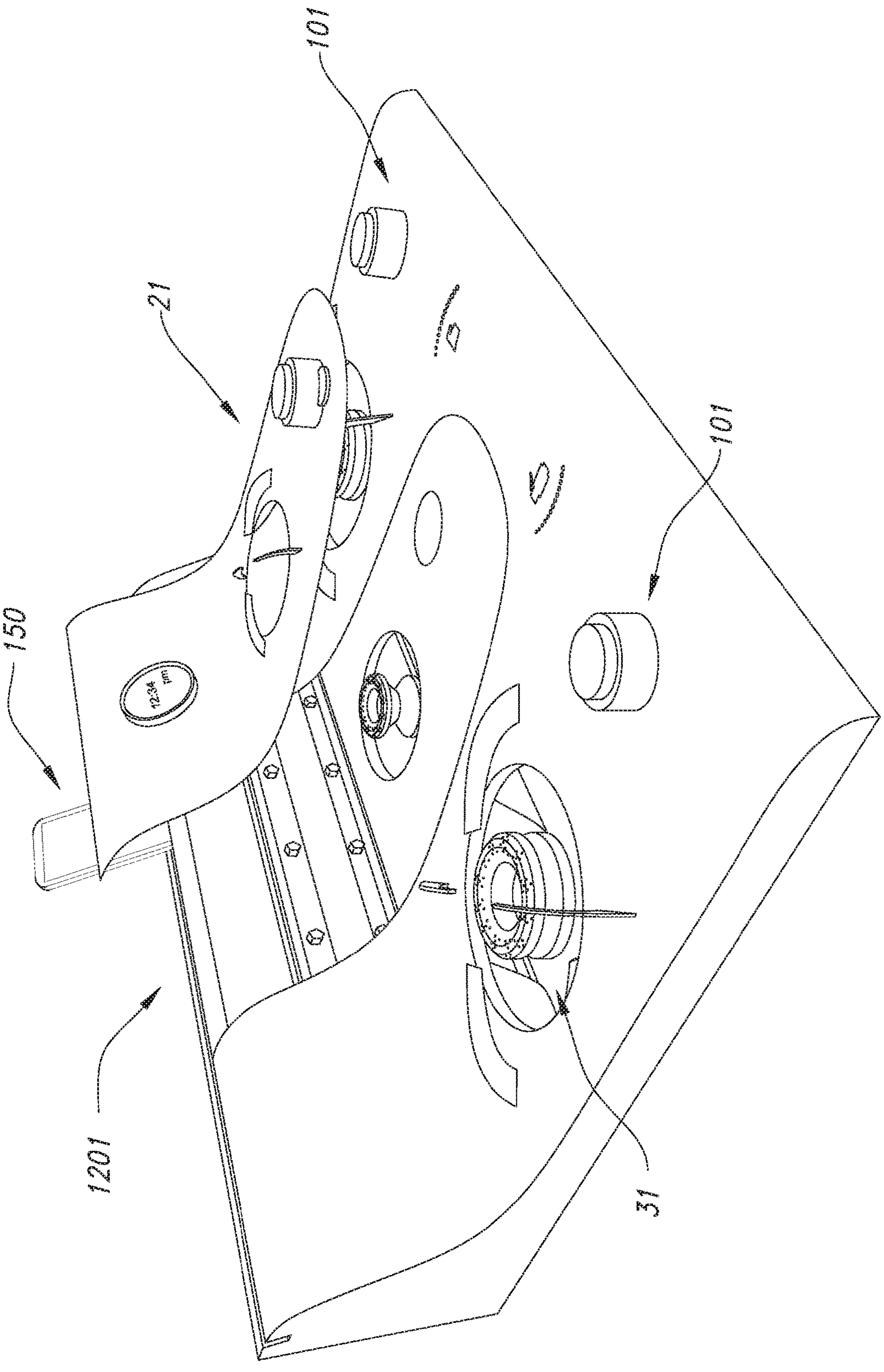
FIG. 181 is a diagrammatic view depicting a hydrogen production system integrated into a cooking system in accordance with the present teachings.

The hydrogen production system may be integrated into a cooking system 1201 as depicted in FIG. 181, which may include smart cooking system comprising a microcontroller with basic sensors, such as gyro, accelerometer, temperature and humidity. Other sensors like weight, additional temperature sensors, pressure sensors, and the like may be mounted on the cooking system and, based upon various inputs from the user and the system (including optional remote control), the actuators may control the cooking temperature, time and other cooking functions.

A speaker may sometimes be used to read out the output or simply play music.

The microcontroller may also be interfaced with a display and touch interface.

The microcontroller may be connected with the cloud, where information regarding recipes, weight and temperature, and the like may be stored and accessed by the controller. The microcontroller may also provide information on the user's cooking patterns.

In an embodiment, smart system configuration, control, and cooking algorithms may be executed by computers (e.g., in the cloud) to process all gathered and sensed information, optionally providing a recommendation related to the operation to the end user. The recommendation may include suggesting suitable recipes, auto turning of the heat in the burner, and the like. The microcontroller may communicate via Bluetooth low energy ("BLE"), Wi-Fi and/or lorawan, or the like, such as to ensure connectivity to the cloud. Lorawan is a wireless network that leverages long-range radio signals for communicating between IoT devices and cloud devices via a central server. The microcontroller may be designed in such a way that it has enough processing power to connect to other IoT devices that may have little or no processing power and also do processing for these IoT devices to give the end user a smart and intelligent, all in one, smart home solution.

Figure 182:
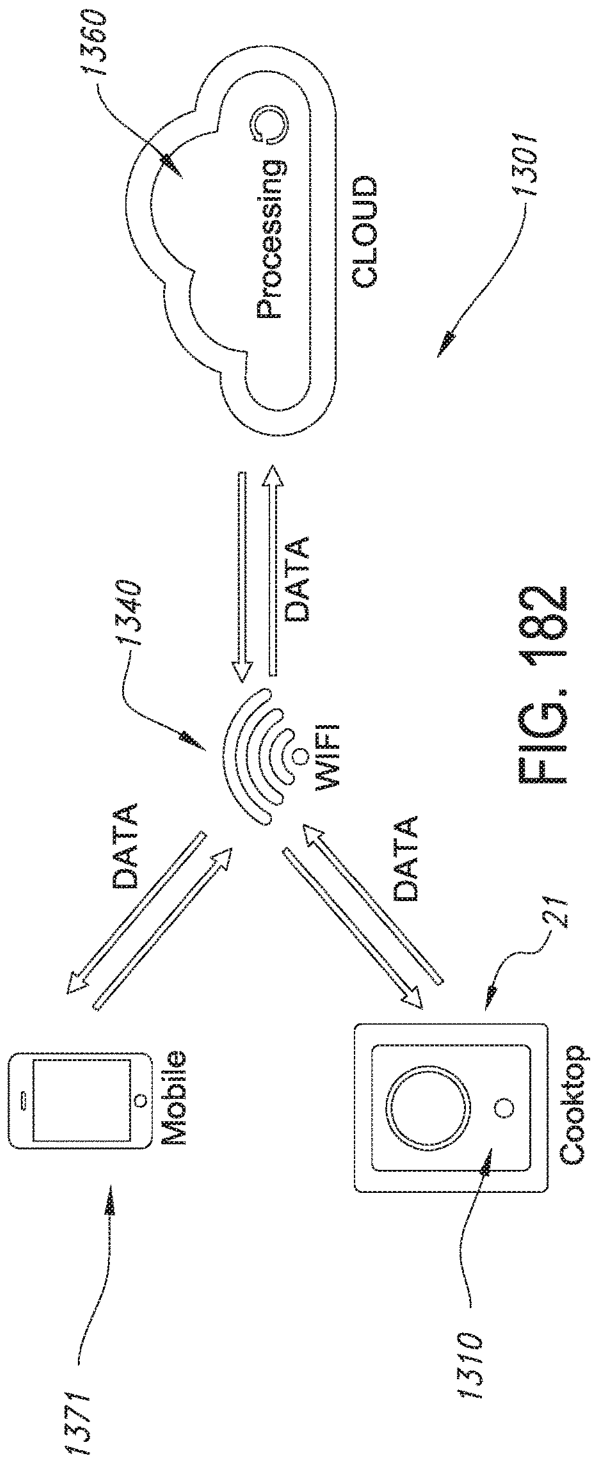
FIG. 182 is a diagrammatic view depicting auto switching connectivity in the form of ad hoc Wi-Fi from the cooktop through nearby mobile devices in a normal connectivity mode when Wi-Fi is available in accordance with the present teachings.
Figure 183:
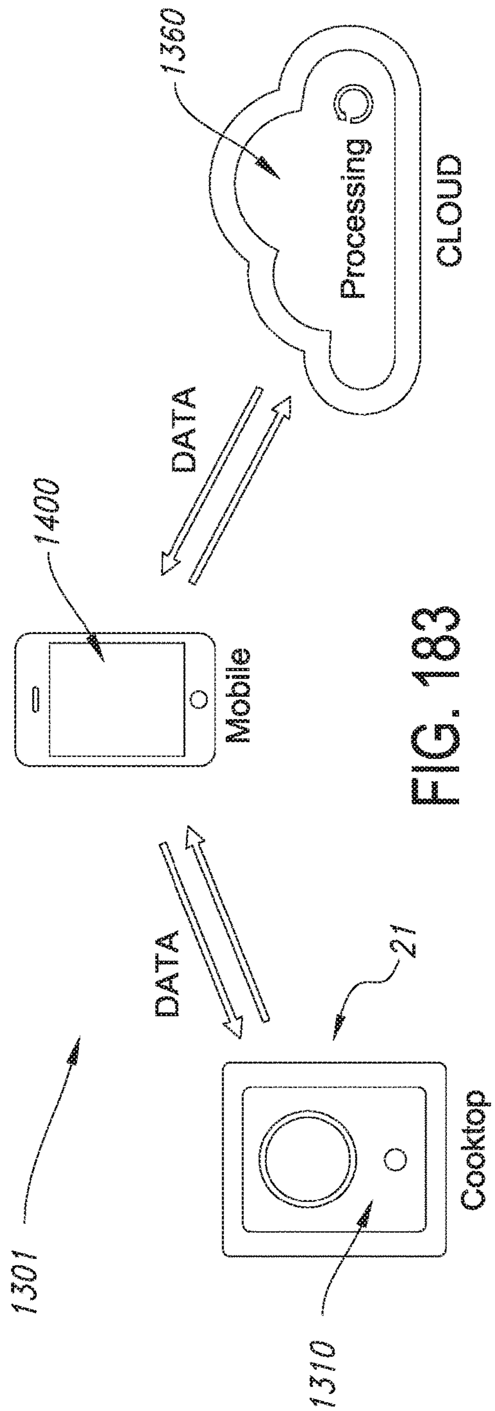
FIG. 183 is a diagrammatic view depicting an auto switching connectivity in the form of ad hoc Wi Fi from the cooktop through nearby mobile devices for ad hoc use of the local mobile devices for connectivity to the cloud in accordance with the present teachings.

FIG. 182 and FIG. 183 depict auto-switching connectivity 1301 in the form of ad hoc Wi-Fi from a cooktop 1310 through nearby mobile devices 1371 may be performed in the event of non-availability of a common home Wi-Fi router 1340 to ensure cloud connectivity 1360 whenever possible. FIG. 182 depicts a normal connectivity mode when Wi-Fi 1340 is available. FIG. 183 depicts ad hoc use of local mobile devices 1400 for connectivity to the cloud 1360.

Figure 184:
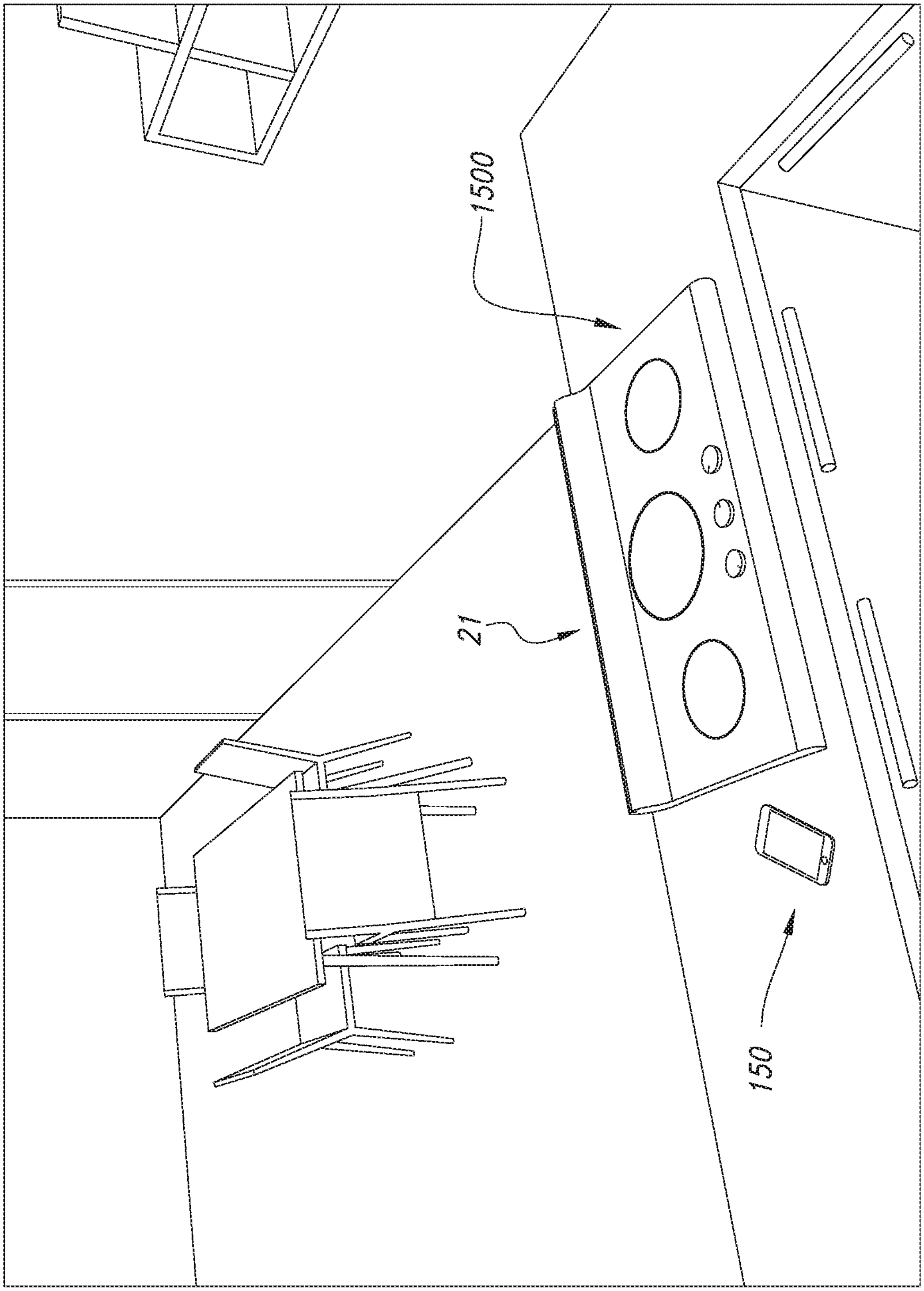
FIG. 184 is a perspective view depicting a three-element induction smart cooking system in accordance with the present teachings.
Figure 185:
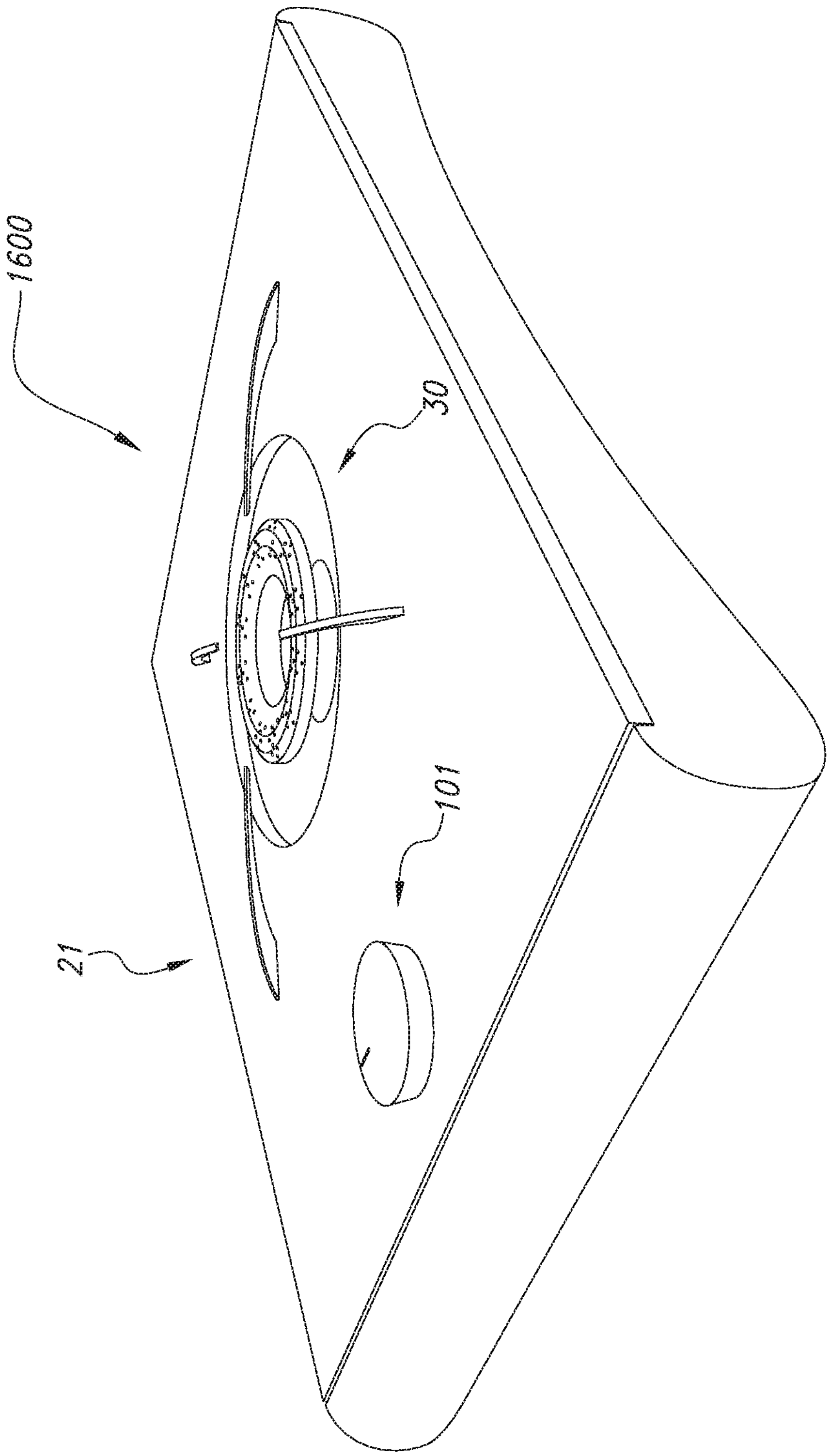
FIG. 185 is a perspective view depicting a single burner gas smart cooking system in accordance with the present teachings.
Figure 186:
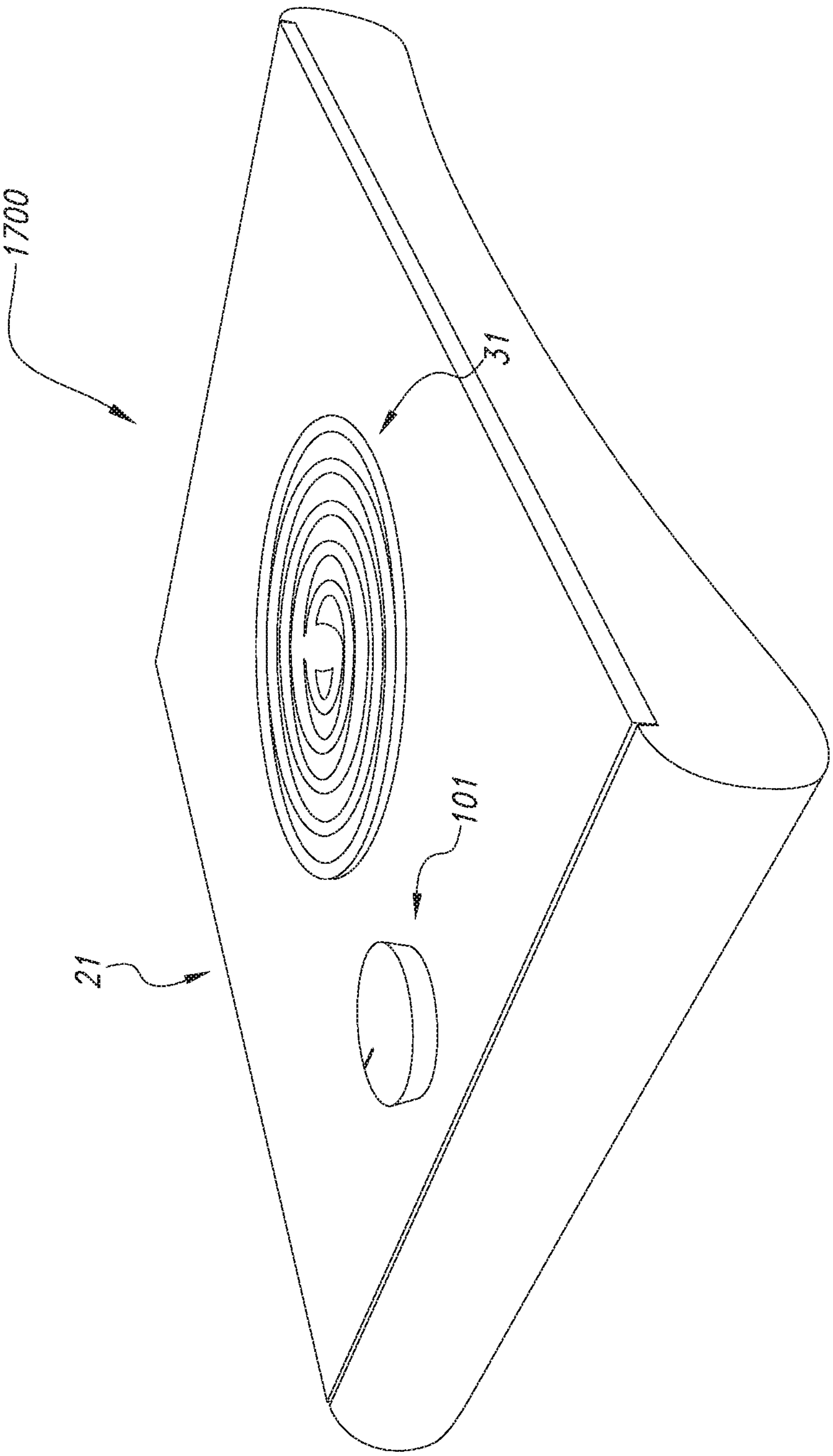
FIG. 186 is a perspective view depicting an electric hot plate smart cooking system in accordance with the present teachings.
Figure 187:
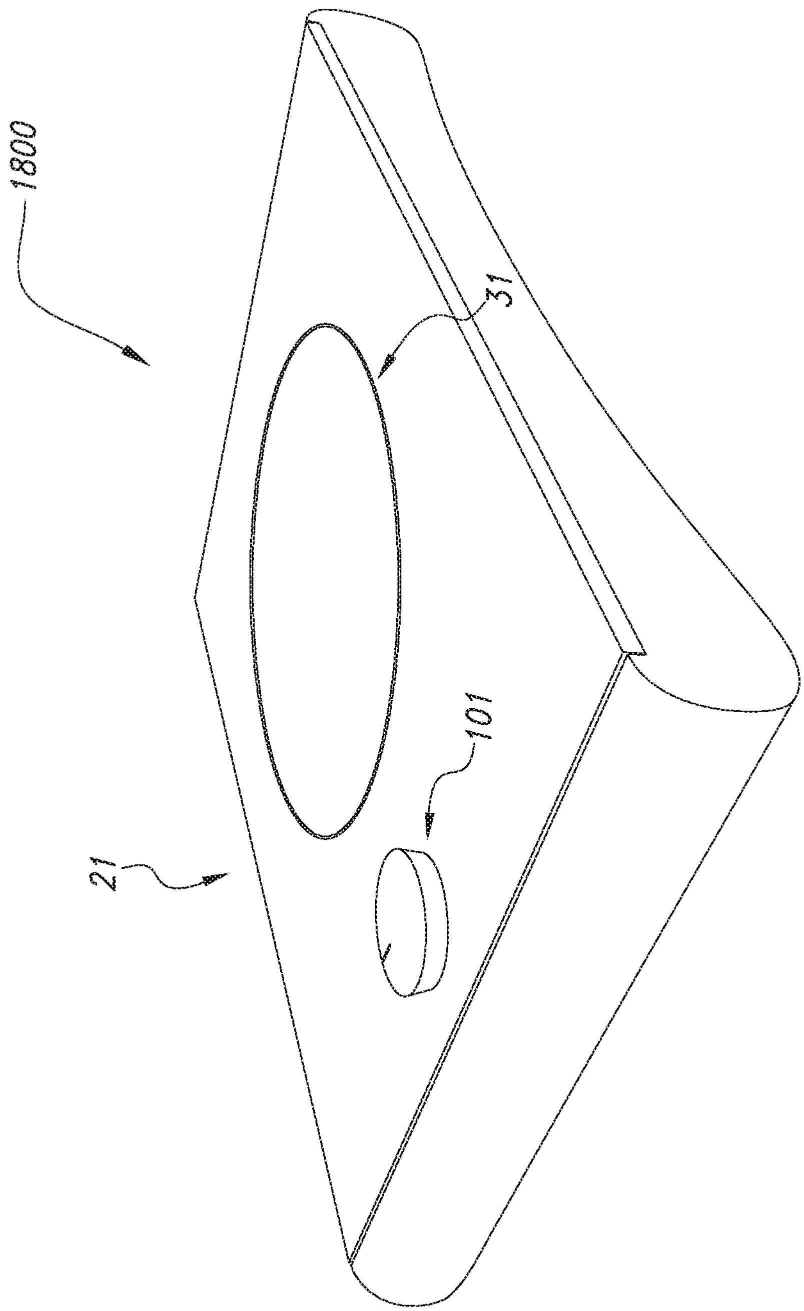
FIG. 187 is a perspective view depicting a single induction heating element smart cooking system in accordance with the present teachings.
Figure 188:
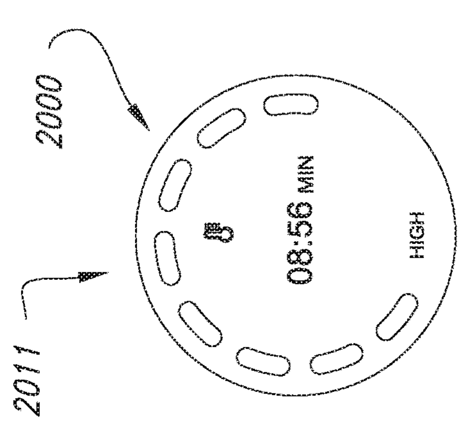
FIGS. 188-195 are views of visual interfaces depicting user interface features of a smart knob in accordance with the present teachings.
Figure 189:
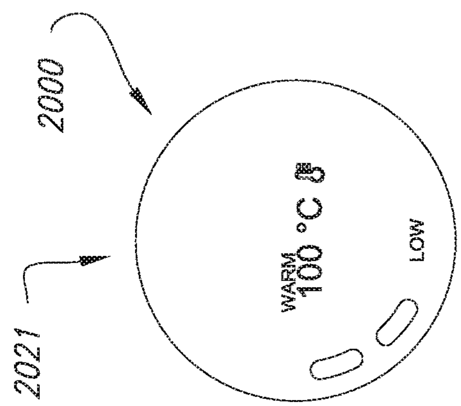
Figure 190:
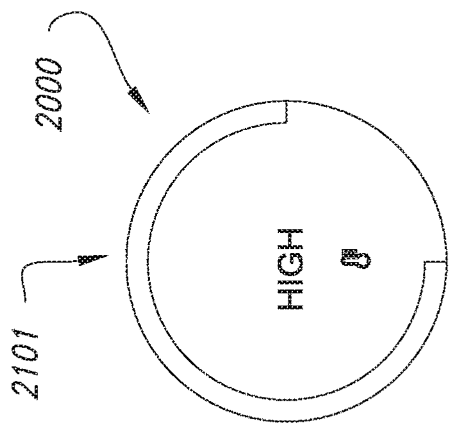
Figure 191:
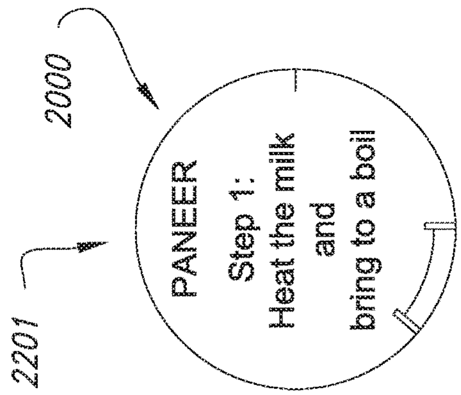
Figure 192:
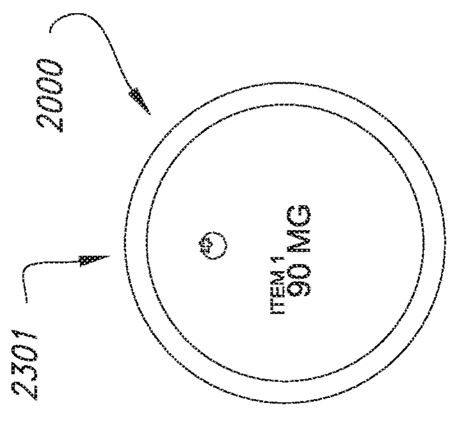
Figure 193:
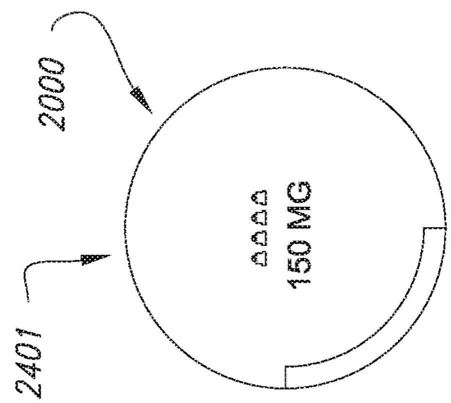
Figure 194:
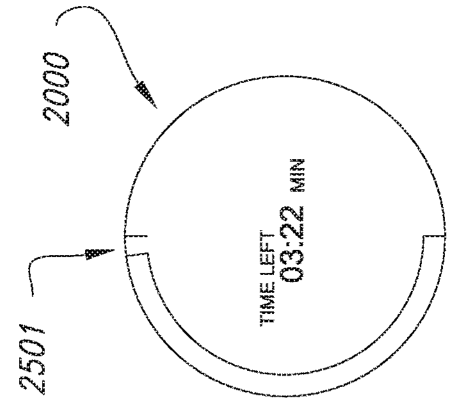
Figure 195:
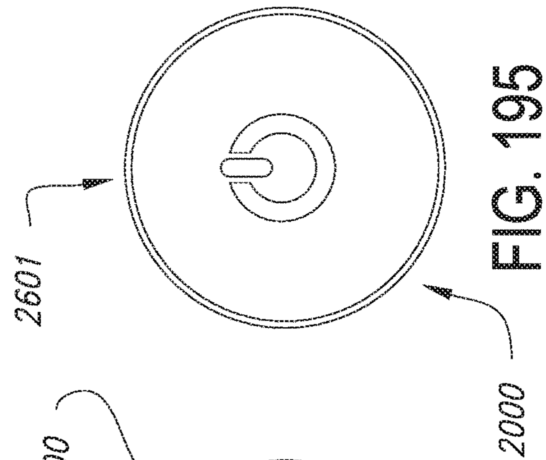

Additional smart cooking system features and capabilities may include weight sensors for each heating element that, when combined with cooking learning algorithms, may control fuel consumption to minimize overcooking and waste of fuel. This may also benefit configurations that employ multiple heating elements, so that unused heating elements do not continue to operate and waste fuel. FIG. 184 depicts a three-element induction smart cooking system 1500. Heating elements may be gas-based or may alternatively include heating with induction, electric hot plate, electric coil, halogen lamp, and the like. FIG. 185 depicts a single burner gas smart cooking system 1600. FIG. 186 depicts an electric hot plate (coil) smart cooking system 1700. FIG. 187 depicts a single induction heating element smart cooking system 1800.

Another embodiment of smart cooking technology described herein may be an intelligent, computerized knob, dial, slider, or the like suitable for direct use with any of the cooktops, probes, single burner elements, and the like described herein. Such a smart knob 2000 may include all electronics and power necessary for independent operation and control of the smart systems described herein. References to a smart knob 2000 should be understood to encompass knobs, dials, sliders, toggles and other physical user interface form factors that are conventionally used to control temperature, timing and other factors involved in heating, cooking, and the like, where any of the foregoing are embodied with a processor and one or more other intelligent features.

The smart knob 2000 may include an embodiment with a digital actuator, such as for electric-based cooking systems and another embodiment with a mechanical actuator, such as for gas models. The smart knob 2000 may be designed with portability and functionality in mind. The knob may include a user interface (e.g., display, audio output, and the like) through which it may provide users step-by-step recipes, and the like. The smart knob 2000 may operate wirelessly, so that it may set alarms and also monitor the operation of a plurality of smart cooking systems 21 even if it is removed from the cooking system actuator. The smart knob 2000 may, in embodiments, store information that allows it to interface with different kinds of cooking systems, such as by including programs and instructions for forming a handshake (e.g., by Bluetooth™ or the like) with a cooking system to determine what control protocol should be used for the cooking system, such as one that may be managed remotely, such as in a cloud or other distributed computing platform. In embodiments, a user may bring the smart knob 2000 in proximity to the cooking system 21, in which case a handshake may be initiated (either under user control or automatically), such that the smart knob 2000 may recognize the cooking system 21 and either initiate control based on stored instructions on the knob 2000 or initiate a download of appropriate programming and control instructions for the cooking system 21 from a remote source, such as a cloud or other distributed computing platform to which the knob 2000 is connected. Thus, the knob 2000 serves as a universal remote controller for a variety of cooking systems, where a user may initiate control using familiar motions, such as turning a dial to set a timer or temperature setting, moving a toggle or slider up or down, setting a timer, or the like. In embodiments, a plurality of knobs 2000 may be provided that coordinate with each other to control a single burner or heating element or a collection of burners or heating elements. For example, one of the knobs 2000 in a pair of knobs might control temperature of a burner or heating element, while a second knob in the pair might control timing for the heating.

In embodiments, the smart knob 2000 may be used to embody complex protocols, such as patterns of temperatures over time, such as suitable for heating an item to different temperatures over time. These may be stored as recipes, or the like, so that a user may simply indicate, via the knob 2000, the desired recipe, and the knob 2000 will automatically initiate control of a burner or heating element to follow the recipe.

A user may use the smart knob 2000 with an induction cooking system for controlling the temperature of a cooking system, such as an induction stove, providing step-by-step instructions, and the like. The user may, for example, switch to cooking with a gas burner-based smart cooking system by simply taking the smart knob 2000 off of the induction cooking system, configuring it to operate the gas burner cooking system (such as by initiating an automated handshake), and mounting the knob 2000 in a convenient place, such as countertop, wall, refrigerator door, and the like. It should be noted that while the knob 2000 may be placed on the cooking system, once a connection has been established, such as by Bluetooth™, near-field communication ("NFC"), Wi-Fi, or by programming, the knob 2000 may be placed at any convenient location, such as on the person of a user (such as where a user is moving from place to place in an industrial environment), on a dashboard or other control system that controls multiple devices, or on another object. The knob 2000 may be provided with alternative interfaces for being disposed, such as clips for attachment to objects, hook-and-loop fasteners, magnetic fasteners, and physical connectors.

The smart knob 2000 may use, include or control the various features of the smart cooking systems 21 described throughout this disclosure. Additionally, the smart knob 2000 may be connected to other IoT devices, such as smart doorbell, remote temperature probe (e.g., in a refrigerator or freezer), and the like. The smart knob 2000 may be used for kitchen tasks other than cooking. By connecting with a temperature probe, the smart knob 2000 may be used to inform a user of the progress of an item placed in the refrigerator or freezer to cool down.

As it requires only very little power and as it is mountable on the smart cooking system 21, the smart knob 2000 may, in embodiments, be recharged through thermoelectric conversion of the heat from a burner on the cooking system 21, so that the use of external power supply is not required.

FIGS. 188-195 depict a variety of user interface features 2010, 2020, 2101, 2201, 2300, 2400, 2500, 2600 of the smart knob 2000.

Figure 196:
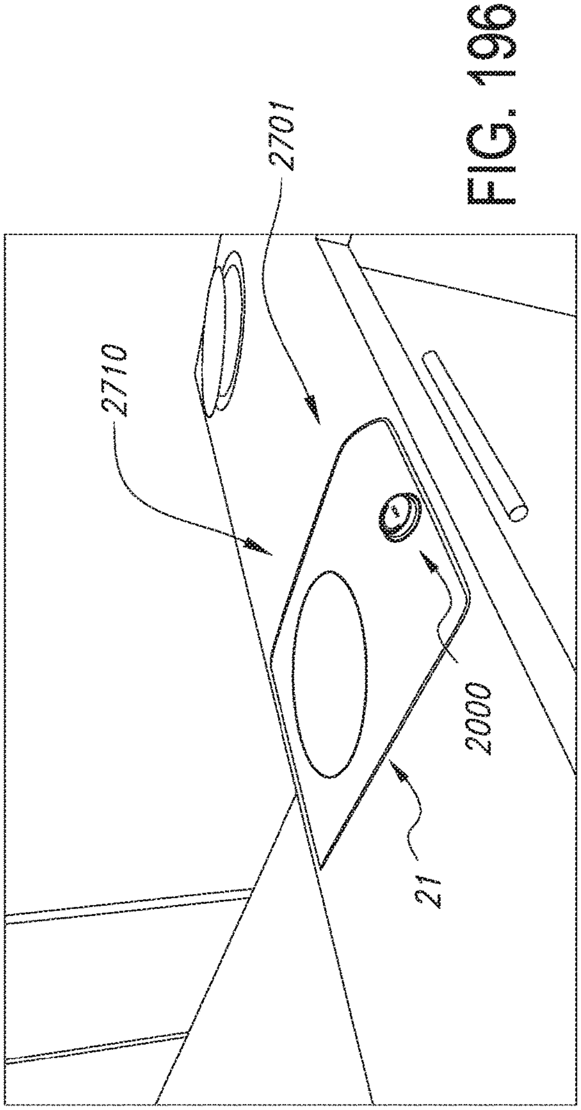
FIG. 196 is a perspective view depicting a smart knob deployed on a single heating element cooking system in accordance with the present teachings.
Figure 197:
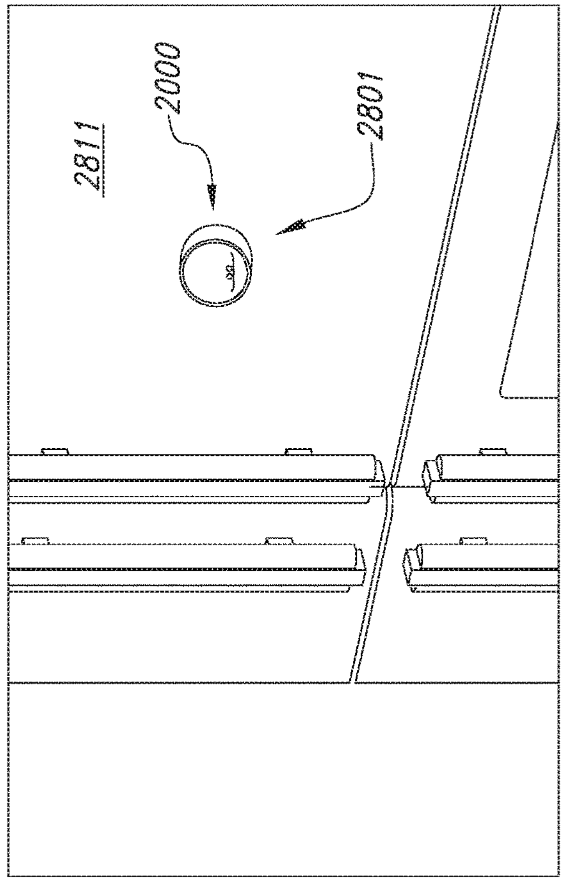
FIG. 197 is a partial perspective view depicting a smart knob deployed on a side of a kitchen appliance for a single heating element cooking system in accordance with the present teachings.
Figure 198:
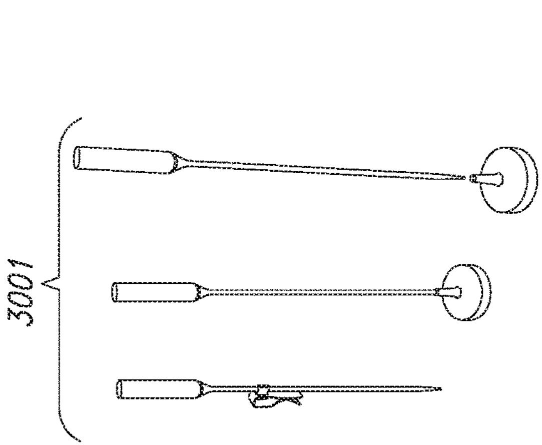
FIGS. 198-201 are perspective views depicting smart temperature probes of the smart cooking system in accordance with the present teachings.
Figure 199:
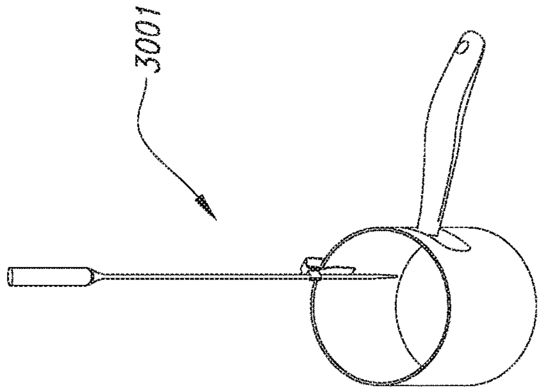
Figure 200:
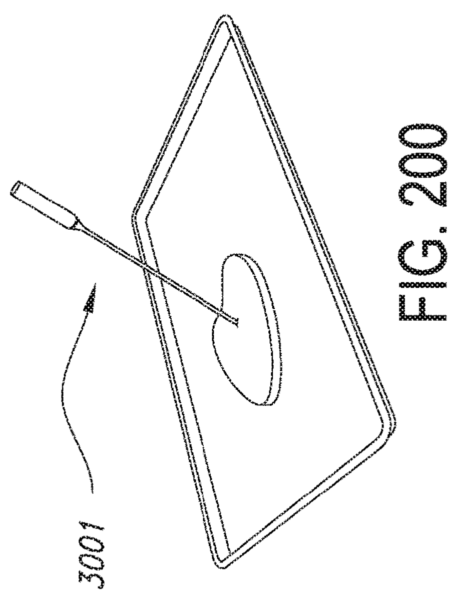
Figure 201:
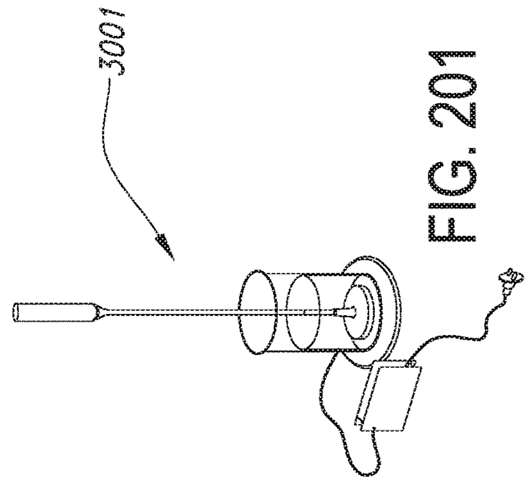
Figure 202:
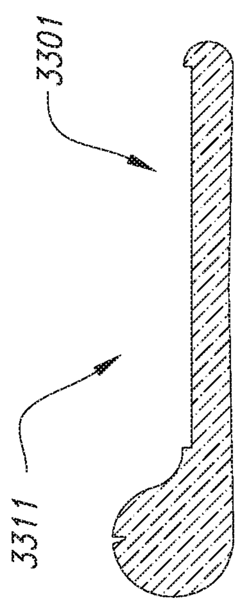
FIGS. 202-207 are diagrammatic views depicting different docks for compatibility with a range of smart phone and tablet devices in accordance with the present teachings.
Figure 203:
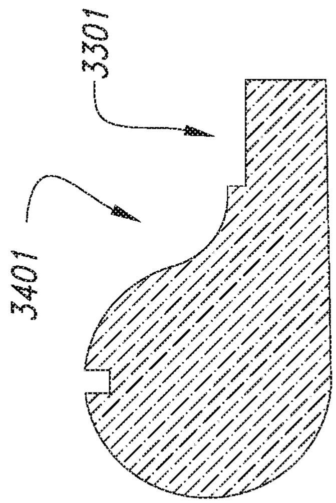
Figure 204:
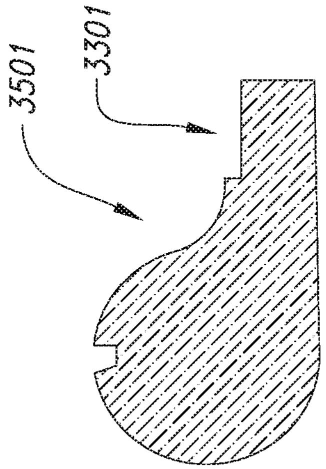
Figure 205:
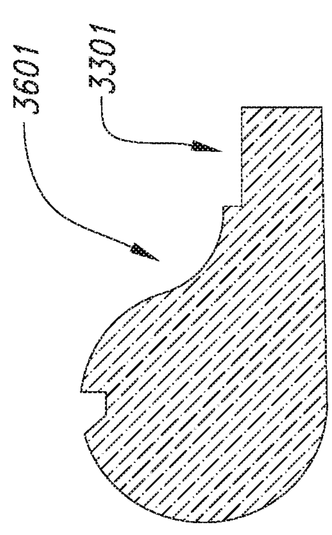
Figure 206:
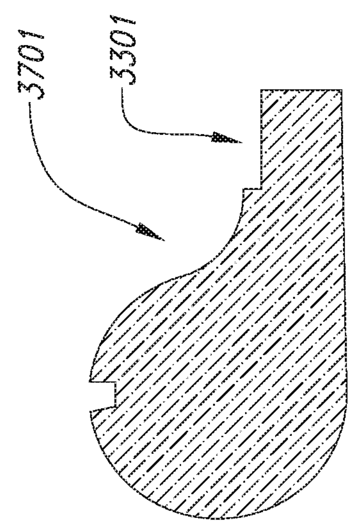
Figure 207:
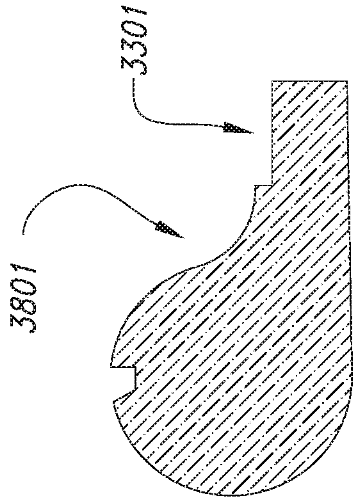
Figure 210:
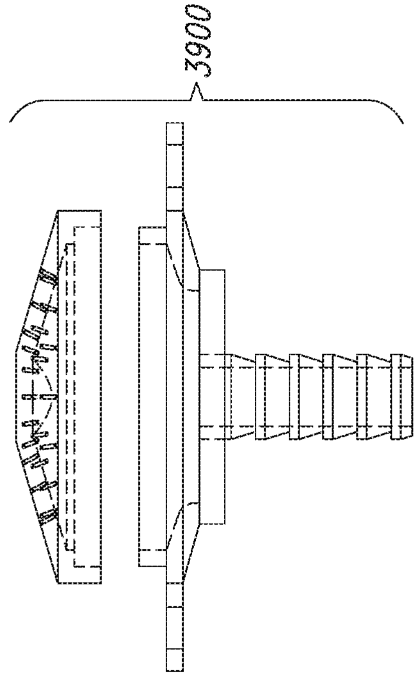
FIG. 210 is a cross sectional view of a burner design contemplated for use with a smart cooking system.
Figure 208:
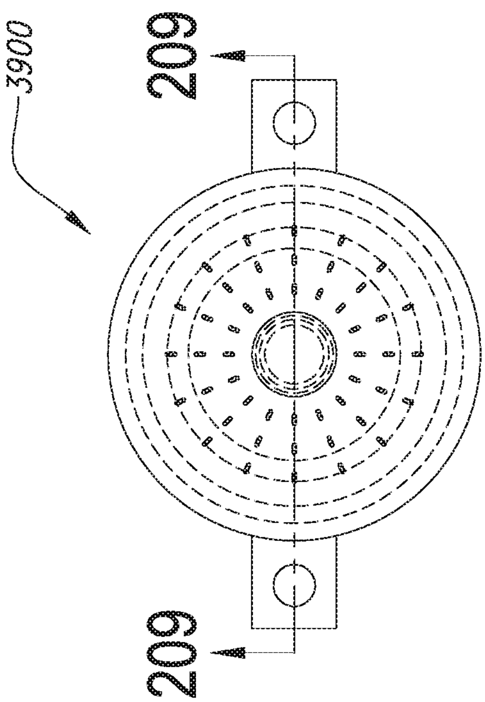
FIG. 208 and FIG. 209 are diagrammatic views depicting a burner design contemplated for use with a smart cooking system in accordance with the present teachings.
Figure 209:
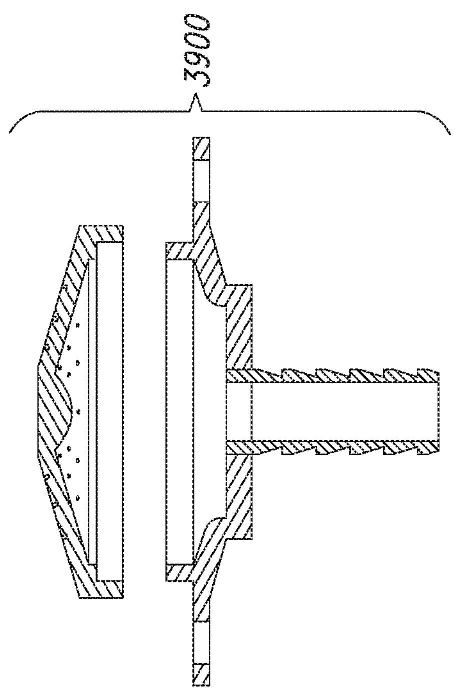
Figure 215:
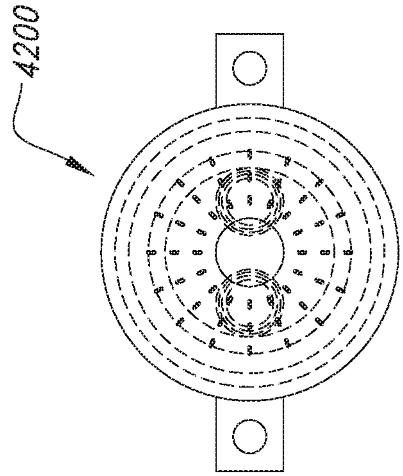
FIG. 211, FIG. 213, and FIG. 215 are diagrammatic views depicting a burner design contemplated for use with a smart cooking system. in accordance with another example of the present teachings.
Figure 212:
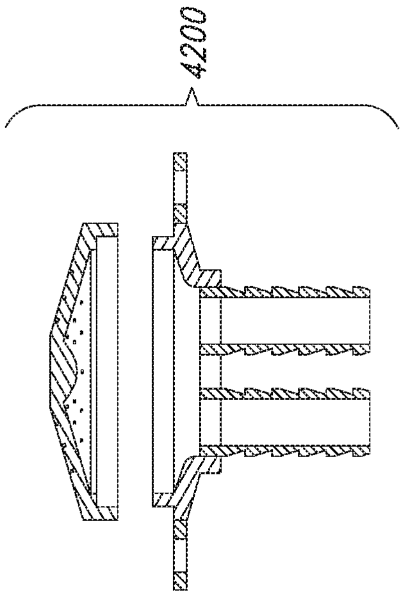
FIG. 212 and FIG. 214 are cross-sectional views of a burner design.
Figure 214:
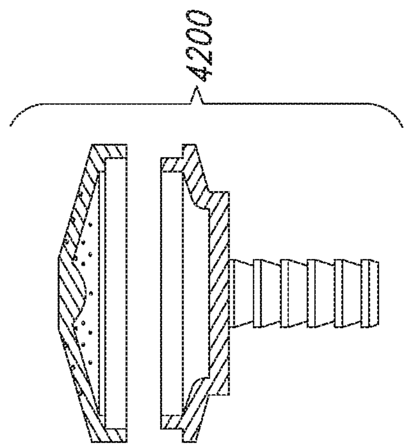
Figure 211:
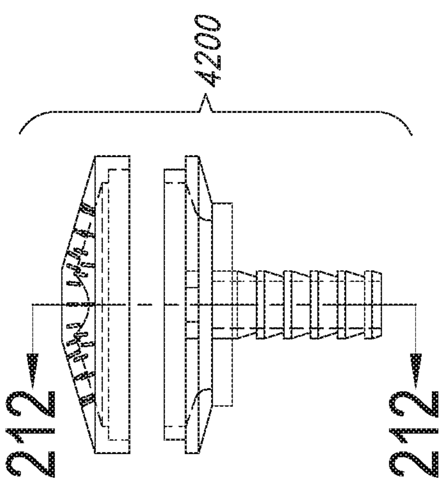
Figure 213:
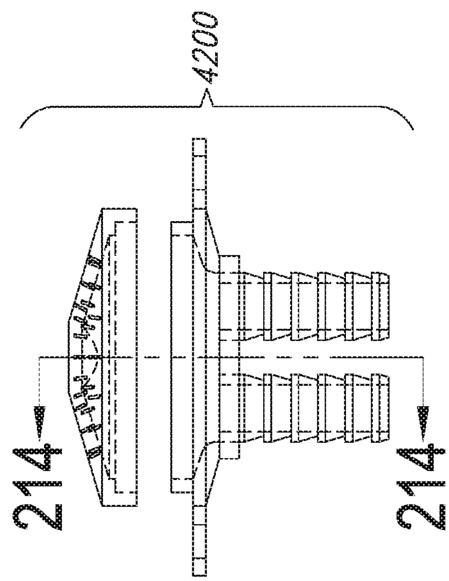
Figure 217:
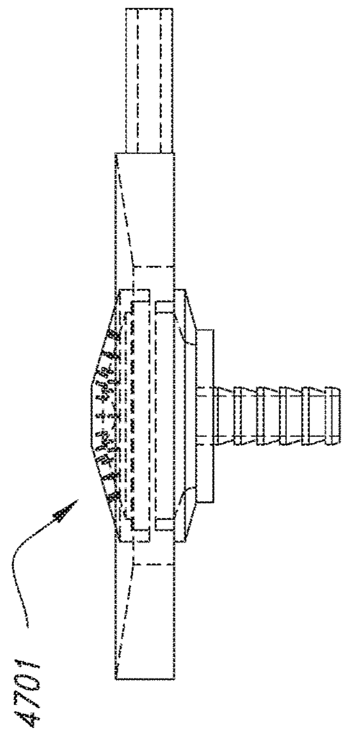
FIGS. 216-218 are diagrammatic views depicting a burner design contemplated for use with a smart cooking system in accordance with a further example of the present teachings.
Figure 216:
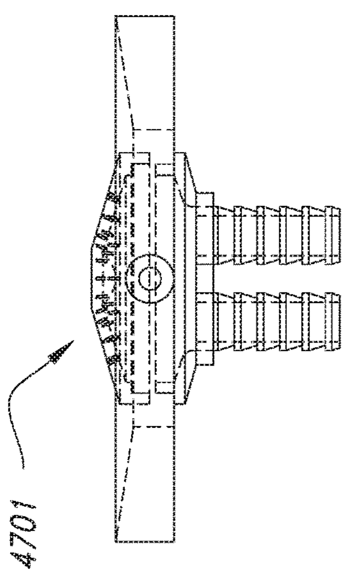
Figure 218:
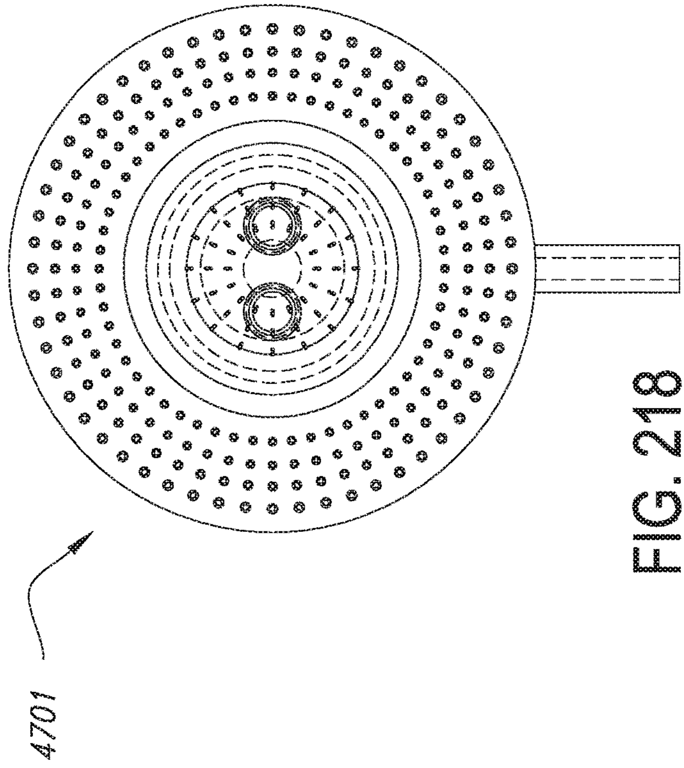
Figure 219:
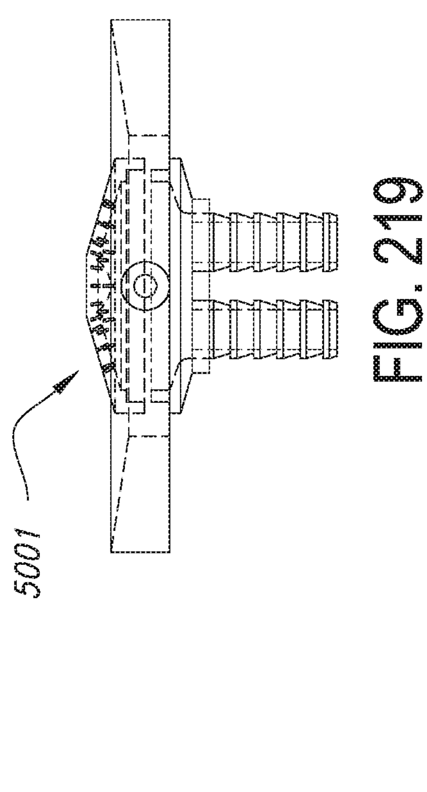
Figure 220:
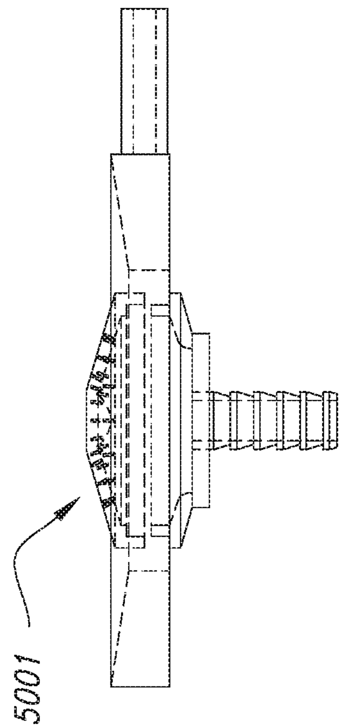
Figure 221:
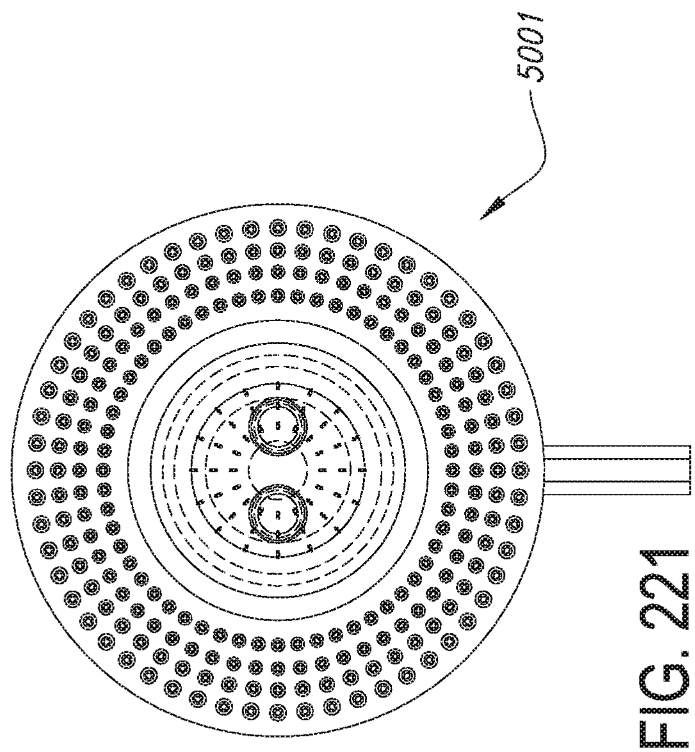
Figure 223:
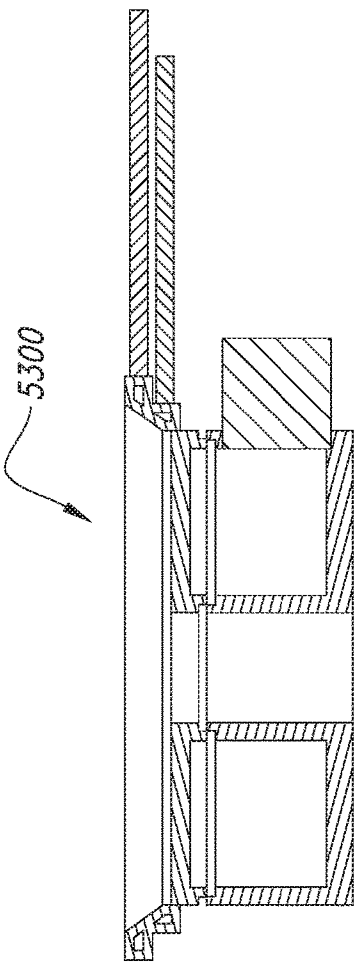
Figure 222:
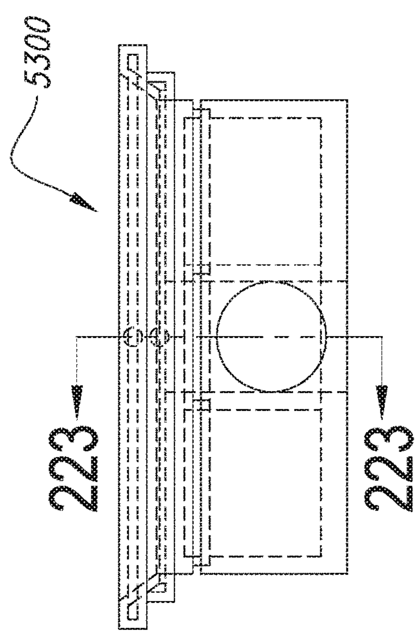
Figure 224:
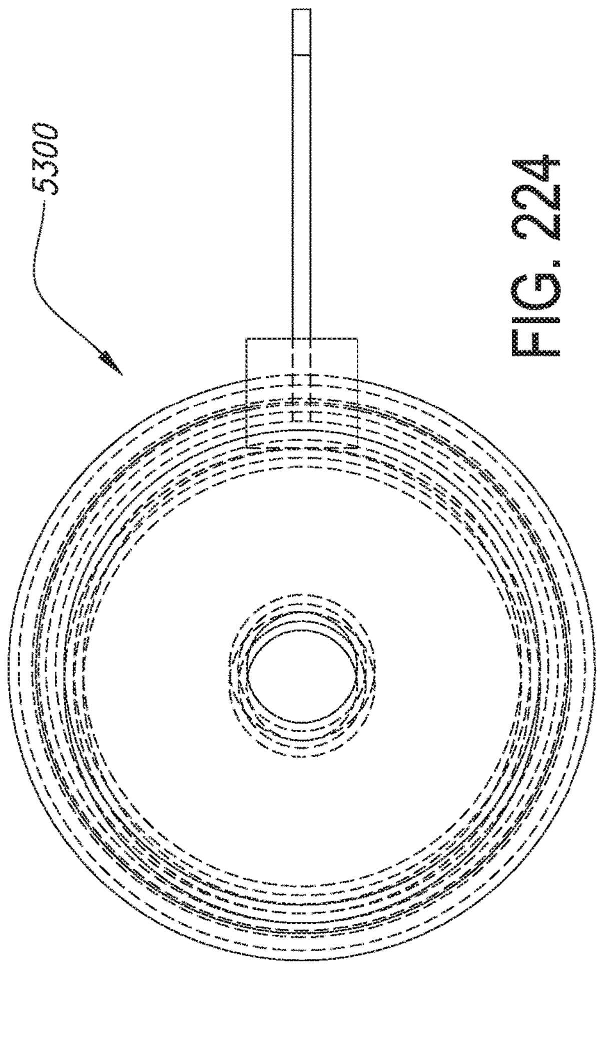

FIG. 196 depicts a smart knob 2700 deployed on a single heating element cooking system 2710, while FIG. 197 depicts a smart knob 2800 placed on a side of a kitchen appliance 2810.

Other features of a smart cooking system 21 may include examples of smart temperature probes 3101 depicted in FIGS. 198-201. The temperature probe 3101 may consist of a wired or wireless temperature sensor that may be interfaced with a smart cooking system 21, smart knob 2000, and/or a mobile phone 150 for cooking. The temperature probe 3101 may, in embodiments, be dipped into a liquid (such as a soup, etc.) or inserted interior of a solid (such as a piece of meat or a cooking baked good), to cook very precisely based on the measured interior temperature of the liquid or solid. Also the smart temperature probe 3101 may facilitate use of an induction base to control the temperature of the base for heating water to a precise temperature (e.g., for tea) with any type of non-magnetic cooking vessel.

The smart cooking system 21 may include a smart phone docking station 3301 that may be configured to prevent cooking heat from directly impacting a device in the station while facilitating easy access to the phone for docking, undocking and viewing. A variety of different docks 3310,

3401, 3501, 3601, 3701, 3801 for compatibility with a range of smart phone and tablet devices are depicted in FIGS. 202-207.

Various burner designs are contemplated for use with a smart cooking system as described herein. FIGS. 208-224 depict exemplary burners 3900, 4200, 4701, 5000, 5300.

The Internet-connected smart cooking system 21 described herein may include tools and features that may help a user, such as a homemaker, a commercial chef, or cook in an industrial environment to prepare healthier meals, learn about food choices of other users, facilitate reduced meal preparation time, and repeatable cooking for improved quality and value. A few applications that may leverage the capabilities of the present Internet-connected smart cooktop may include a fitness application that helps one estimate daily calorie consumption requirements for each member of a user's family or other person for whom the user may prepare meals. This may help a user to control and track the user's family fitness over time. Using data from recipes and weight sensors for pots/pans used to cook the food for the recipes, a fitness application may generate a calorie consumption estimate and suggest one or more healthy alternative recipes. Through combining sensing and control of the cooktop functionality (e.g., burners) with Internet access to food nutrition and weight values for recipe ingredients being cooked, the calorie count of a content of a pan placed on a smart cooktop burner may be estimated. As an example, if a recipe calls for 1/4 cup of lentils per serving combined with a serving-unit of water, a total weight of a pan being used to prepare the lentils may be sensed. By knowing the weight of the pan, a net weight of the ingredients in the pan may be calculated so that a number of servings in the pan may be determined by calculating the total weight and dividing it by a weight per serving. By accessing recipe comparison tools (e.g., as may be available via resources on the Internet) that may include lists of corresponding meals that have lower fat, higher nutritional ingredients, alternate recipes could be suggested to the user that would provide comparable nutrition with lower calories or fat, for example.

A food investigation application may gather information from the smart cooktops and user activity about recipes being used by users of the smart cooktop systems throughout a region (e.g., a country such as India) to calculate various metrics, such as most often cooked recipe, preferred breakfast meal, popular holiday recipes, and the like. This information may be useful in planning purposes by food suppliers, farmers, homeowners, and the like. As an example, on any given day, information about the recipes that people in your region are preparing might be useful in determining which dishes are trending. An Internet-based server that receives recipe and corresponding limited demographic information over time may determine which meals are trending. A count of all uses of all recipes (or comparable recipes) during a period of time (e.g., during evening meal preparation time) may be calculated and the recipes with the greatest use counts could be identified as most popular, currently trending, and the like.

Cooking becomes more repeatable so a cook (e.g., a less experienced cook) may rely on the automation capabilities of an Internet-connected smart cooktop system to avoid mistakes, like overcooking, burning due to excessive heat, and the like. This may be possible due to use of information about the items being cooked and the cooking environment, such as the caloric output value of each burner in any heat output setting, the weight of the food being cooked, target temperature and cooking time (e.g., from a recipe), a selected doneness of the food, and the like. By combining this information with modeled and/or sensed burner operation (e.g., temperature probes may be used to detect the temperature of the food being cooked, the temperature of the cooking environment, and the like) to facilitate automated control of heat, temperature, and cooking time thereby making meal cooking repeatable and predictable. Each type of burner (e.g., induction, electric, LP gas, hydrogen gas, and the like) may each be fully modeled for operational factors so that cooking a recipe with induction heating today and with hydrogen gas heat tomorrow will produce repeatable results. Similar capabilities to combine information from the cooking system and information from sensors or other systems may be used to improve repeatability and improvement of industrial processes, such as manufacturing processes that produce materials and components through heating, drying, curing, and the like.

In embodiments, the methods and systems disclosed herein may include, connect with or be integrated with hydrogen production, storage, and use systems. In embodiments, the hydrogen production, storage, and use systems may use renewable energy as a source of energy for various operations including hydrogen production, hydrogen storage, distribution, monitoring, consumption and the like. In embodiments, hydrogen production, such as with a hydrolyzer system, may be powered by renewable energy such as solar power (including systems using direct solar power and photovoltaic systems (including ones using semiconductors, polymers, and other forms of photovoltaic), hydro power (including wave motion, running water, or stored potential energy), gravity (such as involving stored potential energy), geothermal energy, energy derived from a thermal gradient (such as a temperature gradient in a body of water, such as ocean water, or a temperature gradient between a level of the earth, such as the surface, and another level, such as a subterranean area), wind power and the like and where applicable. References to renewable energy throughout this disclosure should be understood to encompass any of the above except where the context indicates otherwise.

In embodiments, solar collector panels or the like may be configured with a hydrogen production system, such as a system described herein, to provide electricity for powering the production of hydrogen, including from water. A hydrogen production system may be built with integrated solar collector panels and the ability to connect to further solar systems, so that placement of the hydrogen production system in an ambient environment that is exposed to sunlight may facilitate its self-powered operation or partially-self-powered operation via solar power.

In embodiments, solar power harvesting subsystems, such as a single panel or an array of solar panels, may be configured to be deployed separately, and optionally remotely, from the hydrogen production system. Solar power harvesting subsystems may be connected to one or more hydrogen production systems to facilitate deployment in environments with localized limited access to sunlight, such as in a multi-unit dwelling, a building with few windows, a building with interior areas that do not receive direct or sufficient sunlight (such as a warehouse, manufacturing facility, storage facility, laboratory, or the like) and the like. Other operational processes of a system for hydrogen production, storage, and use may be powered via solar power.

Solar energy harvested for the production of hydrogen may be shared and/or diverted to these other operations or sold back into the local grid as needed. Solar energy harvesting may also be used to charge a battery, charge various thermal systems, or other electrical energy storage facility that may directly provide the energy needed for hydrogen production immediately or with a time-shift and on-demand functions and other operational elements as described herein. In this way, while solar power provides a renewable source of energy, the impact of an absence of sunlight and therefore diminished solar power production may be mitigated through the use of an intermediate battery or the like.

In embodiments, a data collection system, involving one or more sensors and instruments, may be used to monitor the solar power system or components thereof, including to enable predictive maintenance, to enable optimal operation (including based on current and anticipated state information), and the like. Monitoring, remote control, and autonomous control may be enabled using machine learning and artificial intelligence, optionally under human training or supervision, as with other embodiments described herein. These capabilities for data collection, monitoring, and control, including using machine learning, may be used in connection with the other renewable energy systems, and components thereof, described throughout this disclosure.

In embodiments, the methods and systems disclosed herein may include, connect with or be integrated with other sources of renewable energy including wind power. Wind power may be harvested through a windmill, turbine, roots-blade configuration, or similar wind power collection facility that may be configured with the hydrogen production, storage and use systems and components similar to a solar collection facility or other electric sources as described herein. In many examples, configuring a turbine or similar wind power collection and conversion device attached to a hydrogen production, storage, and use system may facilitate deployment in a variety of environments where sufficient moving gas (such as blowing wind, air flowing around a moving element (such as part of a vehicle), exhaust from an industrial machine or process, or the like) is available. These and other embodiments are intended to be encompassed by the term "air flow" in this disclosure except where the context indicates otherwise.

In embodiments, a variety of sources of air movement may be utilized as a source of power from the air flow. In various examples, heated air that may result from the use of the hydrogen, such as for cooking and the like, may pass through a wind harvesting facility, such as a turbine that may be disposed in the heated air flow path. In embodiments, other heat harvesting devices may be deployed such as positive displacement device or other heated mediums through which energy may be absorbed and power a suitable heat engine. In embodiments, disposing a turbine or other energy/heat harvesting devices directly above a stove, cooking system, or other heat generating use of the hydrogen produced may produce energy that may be used to power, directly or indirectly, partially or wholly, such as through recharging a battery, operational processes of a hydrogen production, storage and use system.

In yet another use of renewable energy for powering one or more operational processes of a hydrogen production, storage, and/or use system, such as may be described herein, hydropower may be a source of renewable energy. In embodiments, hydropower may be converted into a form that is usable to operate processes of a hydrogen production, storage and use system as described herein including electrical production and possibly harvesting mechanical power. In these examples, electricity from hydropower may be utilized to operate a hydrolyzer to produce hydrogen from a hydrogen source, such as water or ambient air-based water vapor. In embodiments, configuring a hydrogen production, storage, and use system that may directly utilize hydro power may involve building an enclosure that keeps a source of hydropower, such as a moving body of water (e.g., a river, waterfall, water flowing through a dam, and the like) from interfering with the operational processes such as hydrogen production, storage, and use. In embodiments, such an enclosure may facilitate deployment of a hydropower-sourced system directly in a flow of water by making at least portions of such a system submersible. Hydrogen production and storage, for example, may benefit from such an enclosure. In particular, a submersible hydrogen production system may take advantage of the hydrodynamic water in which the system is submerged as a source of hydrogen, as a source of energy to produce the hydrogen, as a source to cool the process, or the like.

Figure 226:
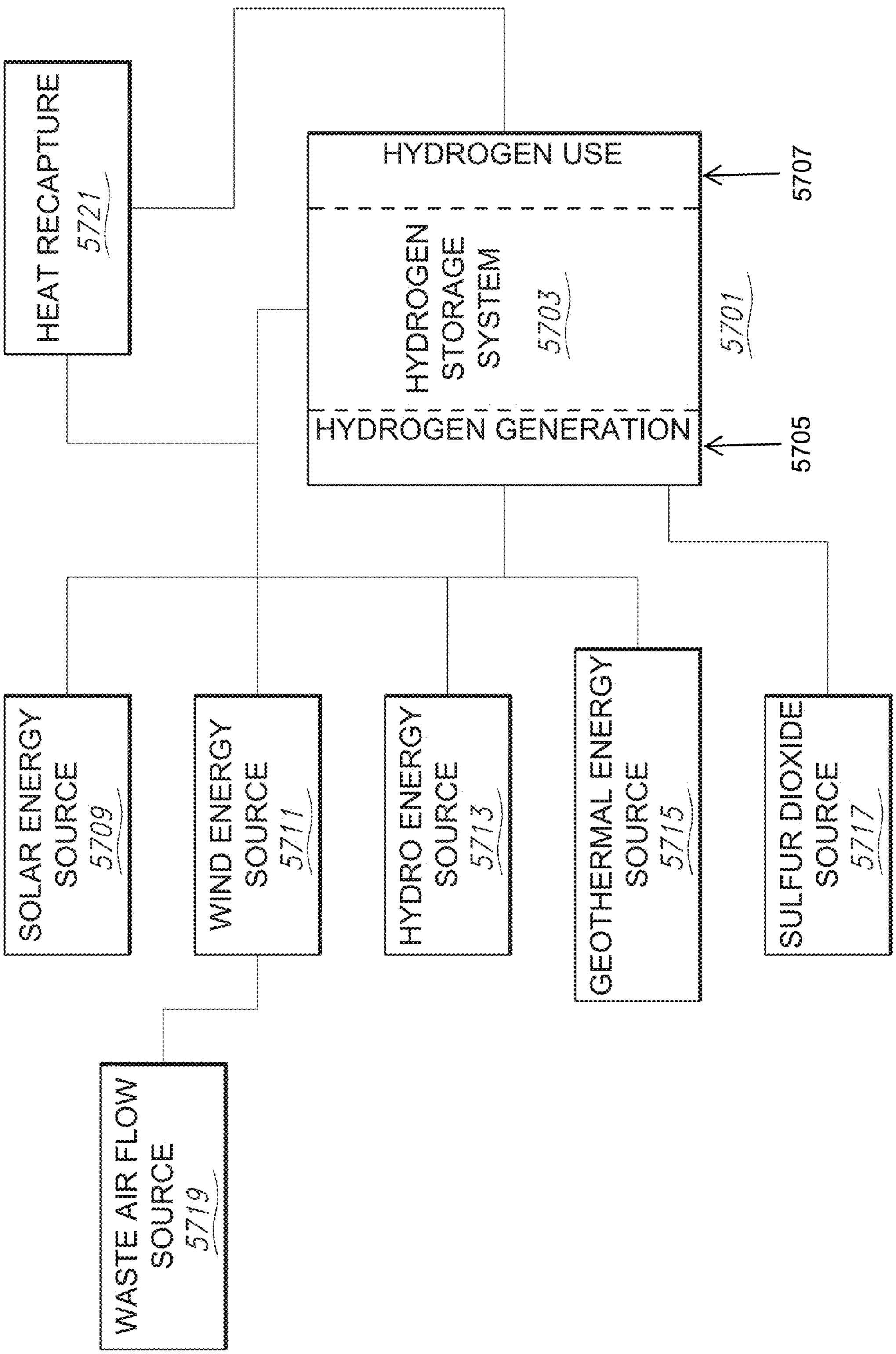

Referring to FIG. 226, embodiments of the methods and systems related to renewable energy sources for hydrogen production, storage, distribution and use are depicted. A system the facilitates use of renewable energy as described herein may include a hydrogen production facility 5074 that may be coupled to a hydrogen storage facility 5703. The hydrogen production facility 5705 and/or the hydrogen storage facility 5703 may be coupled to one or more hydrogen use facilities 5707. One or more of the hydrogen use facilities 5707 may be coupled through a hydrogen distribution network (not shown).

Hydrogen production, storage, distribution, and use may be at least partially powered by one or more renewable energy sources, such as solar energy source 5709, wind energy source 5711, hydro energy source 5713, geothermal energy source 5715, and the like. A wind energy source 5711 may be natural air currents, motor driven air currents, air currents resulting from movement of a vehicle, or waste air flow sources 5719 (such as waste heat from heating operations, such as cooking and the like). Any of these renewable energy sources may be converted into a form of energy that is suitable for an intended use by the hydrogen production, storage, distribution, and use system. As an example, a solar energy source 5709 may be converted to electricity as described herein to provide electrical power to the hydrogen production facility 5705, hydrogen storage facility 5703, use facility 5707 and the like. It will be appreciated in light of the disclosure that the hydrogen storage facility 5703 need not be required to operate with the hydrogen production facility 5705 and the hydrogen use facility 5707 as the produced hydrogen may be consumed upon its production without a need for storage.

Another form of energy that may be sourced by the hydrogen production facility 5705 may include a sulfur dioxide source 5717, such as fossil fuel combustion systems that produce waste sulfur dioxide. As described herein, a sulfur dioxide source 5717 may supply heat energy and raw material from which hydrogen gas may be produced by a hydrogen production facility 5705 adapted to use sulfur dioxide.

Yet another form of energy that may be sourced by the hydrogen production facility 5705 and/or storage facility 5703 may include heat recapture 5721 from one or more of the hydrogen use facilities 5705. The recovered heat may be used directly, converted into another form, such as steam and/or electricity, or provided as input raw material from which hydrogen may be harvested.

Figure 227:
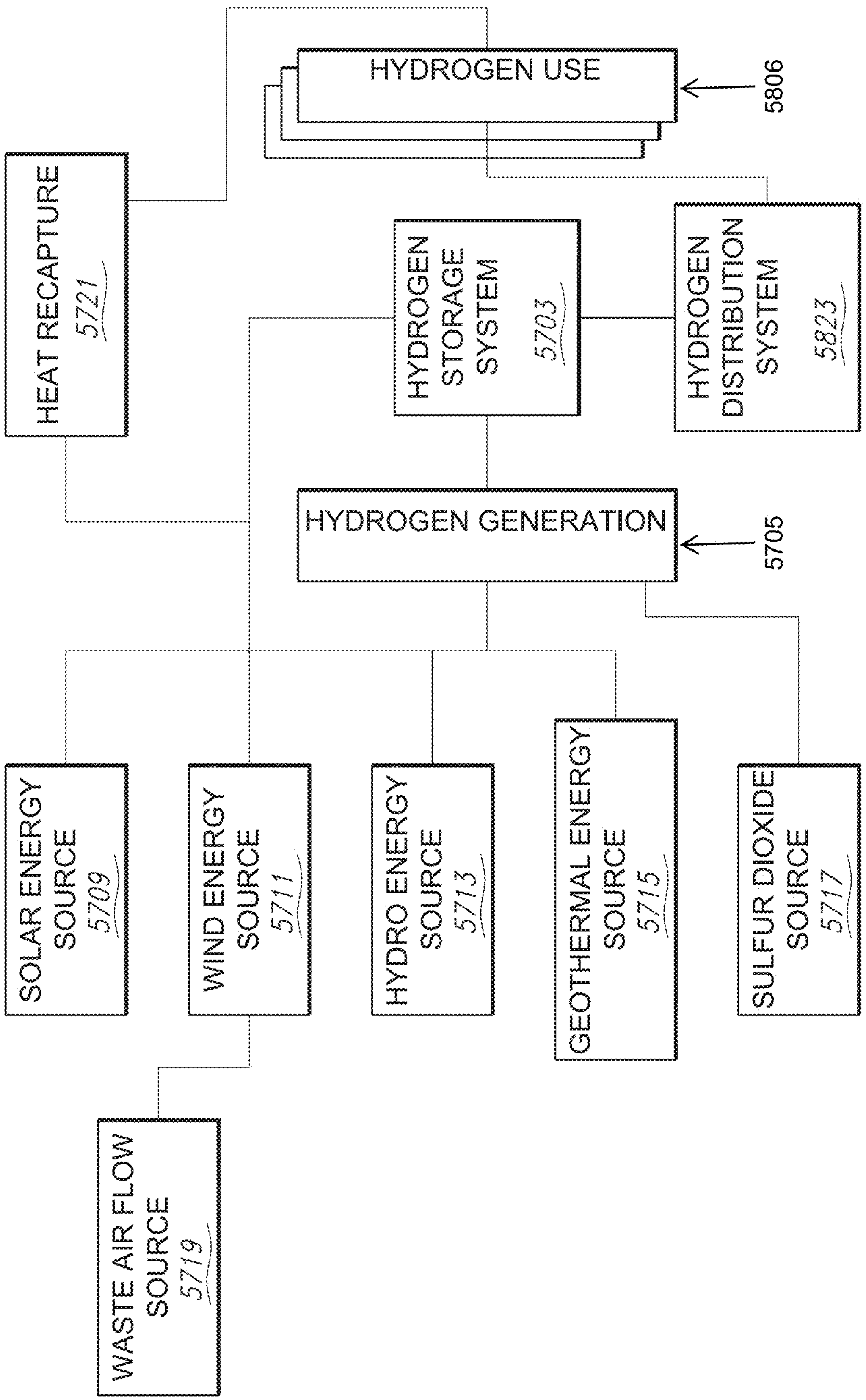
Figure 228:
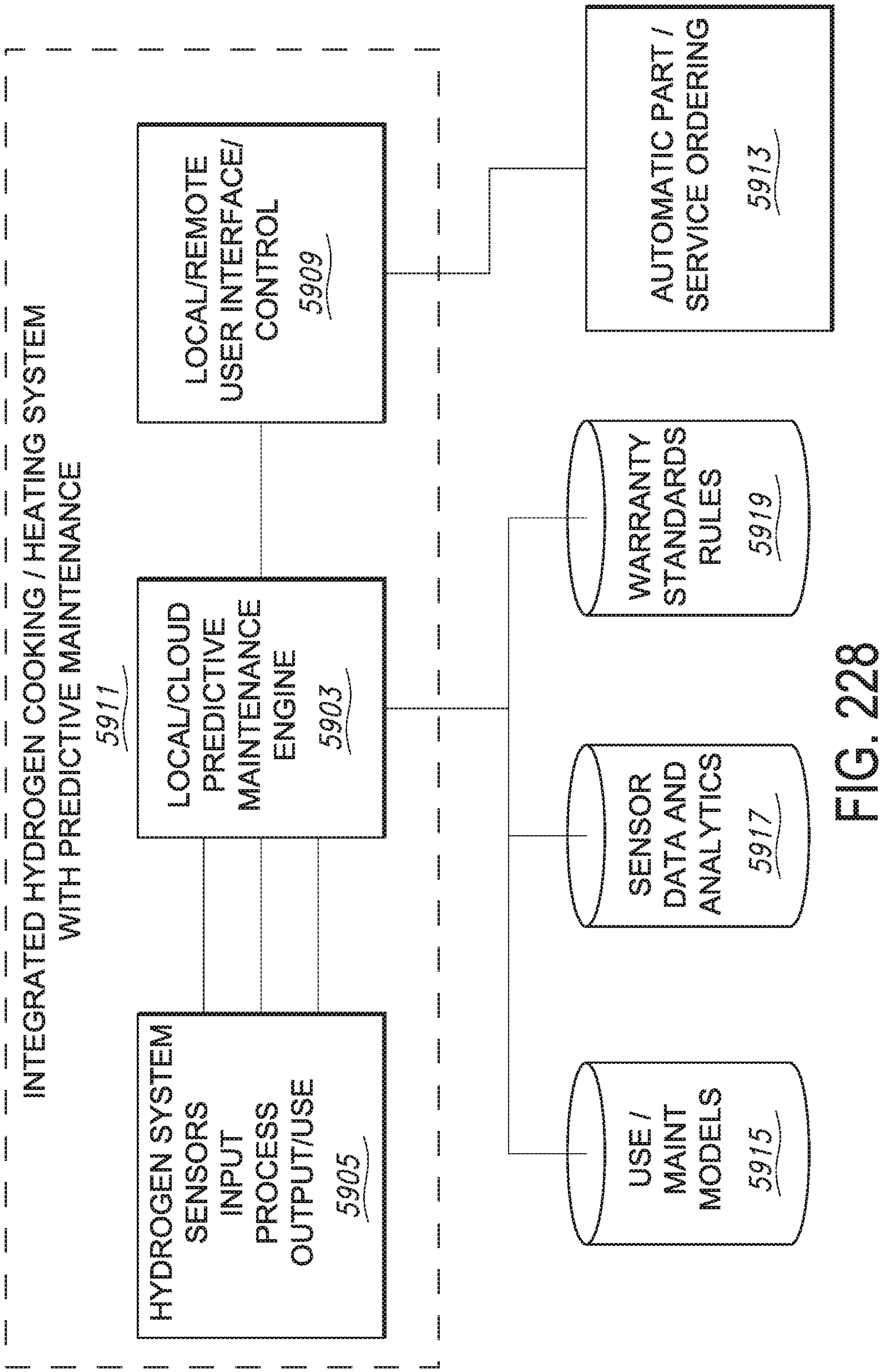

Referring to FIG. 227, an alternate embodiment of renewable energy use with at least one hydrogen production facility 5705, at least one hydrogen storage facility 5703. In the embodiment of FIG. 227, hydrogen production, storage, distribution, and uses may be connected, but may not be integrated, such as into a standalone combined function system. In the embodiment of FIG. 227, renewable energy sources as described for the embodiment of FIG. 226 may be used to provide energy for hydrogen production 5705 and storage 5703. However, hydrogen use may be provided through a hydrogen distribution system 5823 that may be coupled to the hydrogen production facility 5705, storage facility 5703 and to hydrogen use facilities 5707 that may be located at distinct physical locations, such as individual apartments in an apartment building, and the like.

Figure 229:
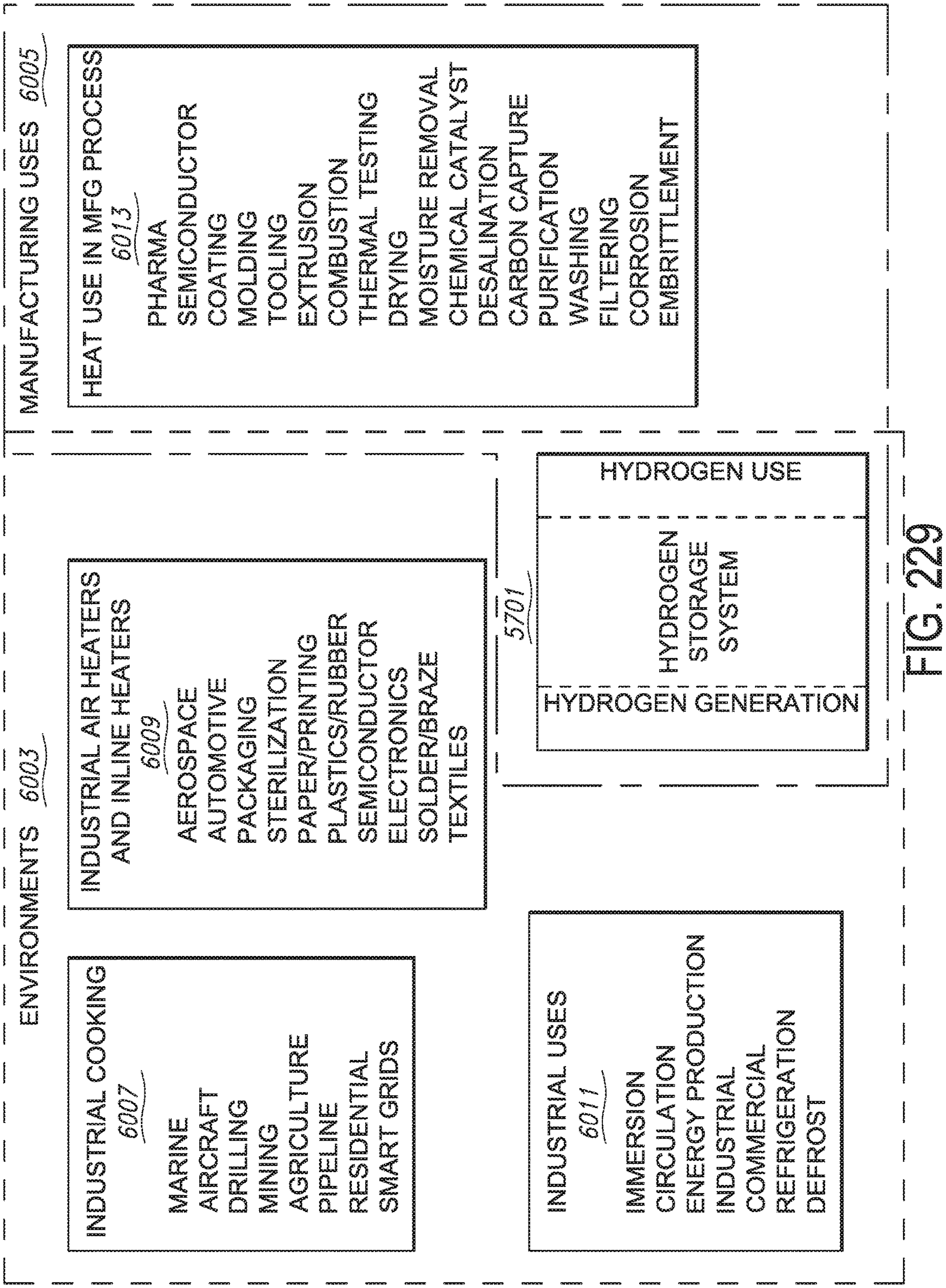

Referring to FIG. 2228, the methods and systems described herein for hydrogen production, storage, distribution, use, and control may be coupled with predictive maintenance methods and systems to facilitate improvements in operation with less unplanned downtime and fewer component failures. In the embodiment of FIG. 229, predictive maintenance facility 5903 may be configured to operate on a processor associated with or more particularly integrated with a hydrogen production, storage, and use facility. Alternatively, predictive maintenance facility may be configured to operate on a processor that is not integrated, such as a cloud computer, a stand alone computer, a networked server, and the like. Predictive maintenance facility 5903 may receive input from various system sensors 5905 along with information from various data sets, such as a use/maintenance model 5915, warranty and standards rules 5919, and an archive of sensor data and analytics derived there from 5917, among other sources.

System sensors 5905 may include hydrogen system sensors, input energy sensors, process sensors (e.g., catalytic sensors and the like), output sensors, use sensors, and a range of other sensors as described herein. Each or any of these sensors may provide data directly or through an intermediate processor a data acquisition unit, a cross-linked data acquisition unit, and the like to the predictive maintenance facility 5903. For a local/integrated predictive maintenance facility 5903, sensor data may be provided through a range of inputs, including direct inputs and the like. For a remote/cloud preventive maintenance facility, sensor data may be provided through a networking interface, such as the Internet, an intranet, a wireless communication channel, and the like.

The predictive maintenance facility 5903 may further be coupled with a local or remote user interface for providing reports, facilitating control, interacting with the predictive maintenance facility 5903 to facilitate user participation in maintenance actions, planning, and analysis. The user interface facility 5909 may be integrated with the predictive maintenance facility 5903, such as being an integrated component of a hydrogen production, storage, and use system. Alternatively, the user interface 5909 may be remotely accessible, such as through a network, a cloud network facility, and the like including without limitation the Internet and the like.

To facilitate at least semi-automated predictive maintenance, replacement parts, service, and the like may be automatically ordered based on a result of the predictive maintenance facility 5903 indicating that some form of preventive activity is required. The automatic part/service ordering facility 5913 may be connected directly or indirectly to the user interface/control facility 5909 to enable users to approve or adjust an automated order.

The embodiments of FIG. 229 include at least two configurations; (i) an integrated hydrogen cooking/heating system with predictive maintenance 5911, and (ii) modular system that may take advantage of shared resources such as cloud computing capabilities, cloud storage facilities and the like.

In embodiments, the methods and systems disclosed herein may include, connect with or be integrated with one or more computing device functions that interface with operational, monitoring, and other electronic aspects of a hydrogen production, storage and optional use system as described herein and that may be accessed through a variety of interfaces. Functions, several of which are described elsewhere herein, may include control and monitoring of hydrogen production, control, and monitoring of hydrogen storage including distribution and the like, control and monitoring of the use of generated and/or stored hydrogen. In embodiments, access to these functions, such as to provide control input and receive monitor output, may be done through an interface, such as an application programming interface (API) or an interface to one or more services, such as in a services oriented architecture, that may expose certain aspects of these functions, services, components, or the like, to facilitate access thereto. The terms "API" or "application programming interface" should be understood to encompass a variety of such interfaces to programs, services, components, computing elements, and the like except where the context indicates otherwise.

In embodiments, API type interfaces may include a library of features, such as algorithms, software routines, and the like through which the exposed aspects may be accessed. In embodiments, API type interfaces may facilitate access to a control function of a hydrogen production subsystem as described herein to enable third-party control and/or monitoring of the subsystem, to facilitate analytics with outside resources, to facilitate interconnection of multiple resources, coordination of fuel and renewables between multiple systems, and the like. In embodiments, a single hydrogen production subsystem may be utilized to provide hydrogen to a plurality of hydrogen storage systems. By way of these examples, one or more of the hydrogen storage systems may use the API or API-type interface to access a flow valve, fuel distribution architecture, or the like that may facilitate distribution of hydrogen produced by the storage systems so that storage systems that are at or near storage capacity may direct a control function of the flow valve to reduce or stop distribution of the hydrogen to the storage system. In embodiments, Application programming interfaces may be utilized across a range of control and monitoring functions, including providing access to hydrogen consumption monitoring elements, renewable energy utilization monitoring systems, hydrogen use systems, smart cooktop systems as described herein, and the like.

In addition to API type interfaces as described herein, a hydrogen production, storage, and use system may be accessed through one or more machine-to-machine interfaces. In embodiments, such interfaces may include directly wired interfaces, such as between a monitoring machine and a sensor disposed to sense the flow of water, the flow of energy used for hydrolysis, the flow of resulting hydrogen, or one or more levels, such as liquid levels, of any of the foregoing. In embodiments, machine-to-machine interfaces may be indirect, such as through a standard communication portal such as network, e.g., an intranet, an extranet, the Internet, and the like. In embodiments, communication protocols such as HTTP and the like may be utilized to exchange control, monitoring, and other information between some portion of the hydrogen production, storage, and use system and another machine. In embodiments, a machine-to-machine interface may facilitate third party control of hydrogen use. This may manifest itself in a variety of modes, examples of which may be a user remotely accessing a cooking function from his mobile device using the Internet as a machine-to-machine interface between the mobile device and the cooking function.

In embodiments, interfacing with a hydrogen production, storage and use system as described herein may also be accomplished through a graphical user interface (GUI). In the many examples, such an interface may facilitate human direct access to control, monitoring, and other features of the system. In embodiments, a GUI may include a variety of screens that may be logically related to facilitating user access to a range of features of the system within a single GUI. In the many examples, there may be a main system GUI screen that may include links to a main production GUI screen that may include, among other things, links to further production GUI screens, e.g., a main screen may link to an energy source control screen, a storage system control, system health, predictive information, and the like. In embodiments, a main GUI screen may also facilitate accessing one or more GUI screens for other aspects of the system, such as hydrogen storage monitoring and control, hydrogen distribution monitoring and control, hydrogen use, cooking functions of a smart cooktop, heating functions for a heater subsystem, and the like.

In embodiments, the methods and systems disclosed herein may include, connect with or be integrated with predictive maintenance functions that may facilitate smart replacement of components thereby avoiding failure and down time. In embodiments, predictive maintenance functions that are described herein may be further enhanced using one or more sensors that may facilitate monitoring and/or control of portions of the system that may require maintenance. In the examples, one or more sensors may be deployed that facilitate monitoring and/or control of an electrolyzer function. By way of the examples, the one or more sensors that may monitor the membrane portion of the electrolyzer may provide data that may be useful for detecting one or more conditions that requires attention immediately or may culminate with other factors and may later require attention, such as a condition that requires the membrane to be replaced. Such sensors may further be configured to generate one or more alerts, such as audio, visual, electronic, logical signals when sensing a condition that may indicate replacement of the membrane or other portion of the hydrolyzer is recommended. Such sensors may further be configured to generate one or more alerts that may trigger one or more recordings of data from the sensors for a long duration to capture signals that may capture events at various intervals, frequencies, and magnitudes that may be indicative of the need to replace the membrane or other portion of the hydrolyzer. Examples of the membrane and the electrolyzer are disclosed in U.S. Pat. No. 8,057,646 to Hioatsu, et al, filed on 7 Dec. 2005, and U.S. Pat. No. 6,554,978 to Vandenborre, filed 1 Jun. 2001, each of which is hereby incorporated by reference as if fully set forth herein.

In embodiments, such alerts may be generated by the sensors and/or by one or more computing facilities that may interface with the sensors and may analyze data from the sensors. In embodiments, sensors, such as a membrane sensor, may be integrated into the system physically (to monitor a physical aspect of the system), and/or logically (such as an algorithm that processes data from one or more sensors). In embodiments, one or more membrane sensors, or the like, may detect one or more conditions that may be indicative that another action or precaution should be taken. In embodiments, one or more alerts from such sensors may indicate the type of condition sensed as well as a degree of the condition sensed. In embodiments, when sensor alert and/or sensor data is combined with other information known about the system, an alert may be generated that indicates one or more actions or precautions that should be taken to counteract the condition causing the alert. In one example, an alert (or set of alerts) may require an action to reduce an amount of hydrogen being produced, such as by turning off or cycling with a greater duty cycle the operation of the hydrolyzer.

In embodiments, the methods and systems disclosed herein may include, connect with or be integrated with sensors that may monitor interconnections for corrosion or other conditions, such as internal buildup that reduces the flow of hydrogen or the like through the interconnections that may be associated with the system. In embodiments, such sensors may provide data indicative of a degree of corrosion, conditions that might speed corrosion, and the like to a computing device that may detect a condition indicative of needing to take action immediately or at such time as the degree of corrosion would demand such as replace an affected portion of the interconnections. In an example, the one or more conditions may be determined by comparing data from the one or more sensors with data values that suggest an unacceptable degree of corrosion.

In embodiments, a monitoring subsystem with one or more sensors may collect, analyze, and/or report the real-time measurement of sensed data. Likewise, such a subsystem may collect, analyze, and/or report real-time failure data, such as to facilitate measuring and/or tracking material failure data, e.g., frequency, degree, time since deployment, and the like.

In embodiments, the methods and systems disclosed herein may include, connect with or be integrated with other sensing modalities to monitor catalytic activities to determine, for example, catalytic performance, efficiencies and the like. Based on these sensed activities, alerts that may indicate a need for catalyst replacement and/or other actions or precautions to be performed may be generated.

In embodiments, the methods and systems disclosed herein may include, connect with or be integrated with various methods and systems to monitor and determine input demand, output production, need for increases therein, and the like.

In embodiments, a facility with multiple hydrogen operations including production and/or storage may be shown to benefit from monitoring to balance storage and production rate capacity, such as for variable demand. In embodiments, monitoring input demand may provide insight into the amount of hydrogen being used, when it is used, with what other gases it is being used, which use subsystems are demanding input, quality of hydrogen produced, amount of energy required to produce the hydrogen, rate of hydrogen production and use over time and under a variety of conditions, and the like. In embodiments, sensors may be deployed and integrated with monitoring and control systems to monitor and coordinate efficient and safe storage or transfer of hydrogen.

In embodiments, the methods and systems disclosed herein may include, connect with or be integrated with one or more sensors to monitor and coordinate efficient and safe storage and/or transfer of hydrogen may be implemented in the Internet of things (IoT) applications. In examples when hydrogen is stored as part of a micro/smart grid solution, monitoring system functions, such as input demand, production, and storage may facilitate determining a need for increasing input/supply. Likewise, sources of energy for operating a hydrolyzer and the like as described herein, such as renewable energy from solar and wind may be managed so that available sunlight and/or the wind may be tied to hydrogen production demand predictions from users such as industrial and others. In embodiments, this may facilitate ensuring allocation of available hydrogen for grid stability and the like. In embodiments, sensors that measure integrated energy use may similarly provide information to further facilitate managing for grid stability, among other things. In examples, predicted demand may be used in determining when and how much hydrogen should be produced and whether it should be stored to facilitate grid stability. In embodiments, this information may be used when portions of a grid are predicted to have high demand, while other portions are predicted to have low demand Supply, from the production of hydrogen and/or from stored hydrogen, may be directed where when it is predicted to be needed or it is predicted to be needed in possibly relatively fewer quantities but may be consumed more quickly.

In embodiments, another form of system sensing may involve fuel quality sensing. In embodiments, sensors that may accurately measure fuel and oxidant compositional characteristics may be used in a control system to direct hydrogen to different storage facilities based on the information. By way of these examples, uses of hydrogen that may tolerate higher oxidant composition may be sourced from storage facilities appropriately, perhaps at a lower cost than for hydrogen with a lower oxidant composition.

In embodiments, the methods and systems disclosed herein may include, connect with or be integrated with sufficiently reliable flame monitoring systems that may sense one or more of flame quality, flame stability, flame temperature, and the like. In embodiments, the methods and systems disclosed herein may include, connect with or be integrated with one or more sensors that may provide for continuous flue gas analysis that may be used to adjust the efficiency and magnitude the flame. In embodiments, further sensors and control systems related to flame or combustion products monitoring may be used including one or more continuous heat flux meters.

In embodiments, the methods and systems disclosed herein may include, connect with or be integrated with one or more particle sensors to determine how clean something is, e.g., exhaust and/or ambient release from a process or liquid including from hydrocarbon combustion. In embodiments, one or more emission detection sensors may be used detect inefficient combustion and may also be used to detect leaks from the system. By way of these examples, the one or more sensors may be configured to measure partial pressure or particle count when sensing internal and/or external emission such as diatomic hydrogen, carbon dioxide, carbon monoxide, and other combustion byproducts. The one or more sensors may be configured to measure combustion wave front, cylinder head temperature, lubrication cleanliness and/or entrainment, various vibration signals that may be indicative improper operation.

In embodiments, methods and systems that may include, connect with, or be integrated with hydrogen production, storage, and use may be deployed in a variety of environments. Systems that may facilitate production of a consumable energy source, such as hydrogen gas may be utilized in environments such as cooking meals or food preparation heating and/or cooking processes, including without limitation industrial cooking.

Preparation of meals or of food items that may be stored long term, such as canned foods and the like may be performed with the methods and systems described herein. Preparation of meals or food items in environments in which direct access to a reliable source of energy, such as electricity, natural gas, or other household combustibles for cooking or otherwise is not readily available, such as in mobile, sea-borne, air-borne, and other environments that are often actively in travel may be shown to benefit from the methods and systems described herein for autonomous production of hydrogen gas for use as a cooking energy source. Use of a cooking system that is described herein may be beneficial for use in mobile environments by reducing a total amount of fuel to be stored for use while in motion. By producing a clean burning energy source, such as hydrogen from renewable energy sources and through harvesting hydrogen from an ambient environment, deploying such systems on long duration travel vehicles, such as cargo ships, military ships, submarines, and the like may reduce the payload required to be carried for purposes such as meal preparation, cooking and the like.

Renewable energy to power processes of hydrogen production, monitoring, storage, distribution, and use may be harvested through the methods and systems described herein including solar power harvesting, wind power harvesting, thermal (e.g., geothermal) when deployed in mobile environments. Solar energy harvesting systems or components thereof that may be included with, connected to, or integrated with the hydrogen production, storage and use systems described herein may be deployed on sun-exposed surfaces, such as a roof of a vehicle, aircraft, ship, and the like. Air movement around and/or through a moving vehicle, as a result of propulsion of the vehicle and the like may be harvested and converted into an energy source suitable for use with hydrogen production, storage, distribution and the like. Heat generated by mobile system propulsion systems may be converted into a form of energy suitable for use in production, storage, distribution, and use of hydrogen. This may be accomplished through the use of inline turbine systems, other heat and energy extraction machines, wind capture systems, exhaust heat recapture systems, and the like. By using these readily available sources of energy, many of which are not otherwise utilized, total external energy requirements that may only be met through onboard storage, may be significantly reduced.

Use of the methods and systems for hydrogen storage and use may include deployment in marine transportation, such as on a submarine where the generation of toxic waste gas is undesirable. Hydrogen gas may be produced from sea water, stored as needed onboard, and safely consumed for cooking and other heating uses in a submarine without risk or costs of dealing with waste gas cleansing or removal. The hydrogen gas may be produced from sea water but not stored any only generated and consumed as needed onboard, and safely consumed for cooking and other heating uses in a submarine.

Other environments of deployment of the hydrogen-based systems described herein may include use on aircraft, such as for preparation of meals to be consumed on the flight. Other aircraft-based uses may include industrial cooking while in-flight to, for example, produce cooked goods for use, storage or distribution after the aircraft returns to earth. Inflight-based cooking with the methods and systems for autonomous hydrogen cooking systems and the like described herein may facilitate cooking food and the like for extended duration flights, such as aircraft that remains aloft rather than just being operated from one location to another. Meals, foods, and other goods could be cooked while in-flight may be transported to/from the in-flight aircraft through shuttle or other aircraft to facilitate longer duration flights.

Earth-bound operations such as drilling and mining that may have very limited access to cooking fuel or other commercially available fuel sources may be shown to benefit from the use of such a system. Equipment that transports materials, supplies, and workers to/from subterranean drill sites and mines may be equipped with such a system to facilitate preparation of food for the workers. Use of a fuel, such as hydrogen that produces no toxic exhaust may be well suited for use in drilling and mining environments.

Agricultural production, including harvesting, planting, and the like may also benefit from the deployment of hydrogen-based cooking and/or heating systems as described herein. Food preparation operations that may include heating or cooking freshly harvested foods may be shown to benefit from an automated or semi-automated hydrogen-based cooking system as described herein. Such a system may be deployed on or connected with a harvesting system, such as a produce harvester and the like so that cooking, preserving, sterilizing, pasteurizing, drying or optional storage operations may occur as the food is harvested. Other deployments, such as industrial cooking deployments, may include job-site deployment, food truck deployment, canteen truck deployment, food production pipelines, and the like. Yet other deployments, such as industrial cooking deployment may include residential environments, such as nursing homes, group homes, soup kitchens, school and business cafeterias, disaster relief food preparation stations, and the like.

The methods and systems of autonomous or semi-autonomous hydrogen production, storage, distribution, and use may be deployed as components in a smart power grid that may operate cooperatively with other components of a smart grid to attempt to deliver reliable energy available throughout the grid. In an example, a renewable energy-based hydrogen production system may utilize its renewable energy harvesting components to deliver electricity to a smart grid based on various factors, such as local demand for hydrogen and the like. When a renewable energy source is available, yet hydrogen production is not called for (e.g., sufficient supply is stored, or an amount that is anticipated to be needed, such as based on machine learning or the like of prior local hydrogen demand over time is expected to be producible before needed), then electricity or the like produced from the renewable energy source could be fed back into the smart grid.

Other types of industrial applications of the methods and systems of hydrogen production, storage, distribution and use may include air and inline heaters, and the like. Exemplary environments may include deployment for aerospace operation and testing, such as component temperature testing, heating, hot air curing, and the like. Production of temperatures that emulate extremes associated with aerospace travel, such as earth atmosphere entry and the like could be replicated with such systems for use in component testing and the like.

Other industrial heating applications may include automotive production (e.g., heat treating components, heat shrinking and the like), automotive assembly (e.g., hot air bonding, etc.), automotive exterior and interior customization (e.g., hot air bonding of vinyl body panel covers, paint curing and the like), and automotive repair (e.g., reshaping dented plastic components, such as a bumper) and the like.

Yet other industrial heating applications may include packaging, sterilization, and the like. Particular packaging uses may include high-speed poly-coated paperboard sealing, high-speed heat shrink installations, material heat forming, curing adhesives, sterilizing bottles and cartons (e.g., through heating water and/or steam therefore), production and packaging of pharmaceuticals, sterilization and packaging of surgical tools and hardware, replacement dental features (e.g., crowns and the like), production and sealing of packaging material, and the like.

Paper and printing heating-related applications of the methods and systems described herein may include the production of coated paper, including speed drawing the coating, adhesive activation, ink drying, paper aging, pulp drying, and the like.

Plastics and rubber production heating applications that may be shown to benefit from the methods and systems described herein may include rubber extrusion salt removal, curing plastics, bending and forming plastic components, de-flashing of molded parts and the like.

The methods and systems described herein may be used to produce heat needed for some semiconductor and electronics production and assembly operations including soldering operations, such as air knife for wave soldering, heating of printed circuit boards, lead frames, components (e.g., capacitors) for soldering/desoldering, centralized source of heat for a multi-station desoldering system, wafer and PC board drying, heat shrink wire insulation, preheating process gases and the like. By way of these examples, soldering and/or brazing may require heating that may be provided by the hydrogen-based heating systems described herein. Heat for soldering and brazing may be generated locally at each brazing station or may be provided from a centralized source for multiple soldering operations, including manual and semi-manual operations.

Other heated air applications that may be suitable for application of a hydrogen-based system as described herein may include textiles industrial uses, such as welding plastic or vinyl fabrics, heat-treating specialty fabrics, heat sealing fabric shipping sleeves, bonding multi-ply fabrics and the like. Industrial hot air applications may include the exemplary embodiments described herein, but may also include other comparable applications, such as home fabric bonding, plastic sheet dispensing and the like in which heat is used to increase the temperature of air or devices to perform various functions.

In embodiments, the methods and systems described herein that relate to hydrogen production, storage, distribution, use, regulation, monitoring, control, energy conversion, and the like may also be used for heating operations including immersion, circulation and customer heating. Example applications include energy production environments where fuel sources for cooking and heating may be used, such as alternative fuels processing, chemical processing, mining and metals, oil, and gas, petrochemical, power generation, fuel storage, fuel distribution, heat exchangers, waste disposal, heated storage, and the like. Industrial applications may include biopharmaceutical processing, industrial equipment (such as temperature test chambers), engine block heaters, preheating industrial burners, furnaces, kilns and the like, medical equipment laboratory and analytic equipment, military and defense including weapons, personnel management, and other military uses, production of rubber and plastics through controlled heating of petrochemicals and the like, transportation (such as passenger compartment temperature regulation, preheat or temperature regulation of vehicle systems in extremely low temperature environments) and the like, water processing, waste water processing and the like. Commercial applications of the methods and systems described herein for use as heating for immersion, circulation and the like may include integration, connection or use with commercial food equipment, building and construction systems, commercial marine and shipping systems and environments, heat-powered cooling, refrigeration, air conditioning, and other cooling applications and the like.

In addition to cooking and air heating applications, the methods and systems of autonomous hydrolyzer operation, generated fuel storage, distribution and use described herein may also be applied to processes that use heat from a heating element that may be powered from the fuel (e.g., hydrogen and the like) produced from the hydrolyzer. Manufacturing operations may include pharmaceutical manufacturing, industrial food manufacturing, semiconductor manufacturing, and the like. Other heating element-like applications may include coating such as vinyl automotive panel wrapping, molding such as injection molding, heat staking, and the like, hard tooling, heating material for extrusion operations, combustion systems (such as flame-based combustion devices, e.g., burners that would improve on existing combustion methods including improving efficiency, cost, reduce or eliminate emissions), enhance heat transfer from combustion products to the material processed for a variety of applications, such as by applying a clean-burning fuel in proximity to the material being processed, other types of combustion systems (e.g., non-burner types) such as catalytic combustion, combustion systems that include heat recovery devices such as self-recuperative burners, and the like.

Other applications for heat-dependent operations that may be powered by the fuel produced from a hydrolyzer may include heat and power uses such as integrated heating systems such as super boilers and other applications that deliver both heat and power to an operation (e.g., super pressurized steam systems, and the like). Other heat utilization applications may include heat production include use for testing materials such as products for mining (e.g., heat treating drilling machine elements), drying and moisture removal (such as clothes dryers, dehumidifiers, and the like). Other applications in which a hydrolyzer-based energy producing system may be used include heat as a catalyst for chemical reactions and processing including, without limitation chemical scrubbing of exhaust from industrial systems including petrochemical-based combustion systems, on-site production of chemicals, such as high-value petroleum products from lower grade, lower cost petroleum supplies, and the like.

Other applications that may benefit from the use of an autonomous hydrogen generation system as described herein may include desalination, such as local desalination systems for pleasure boats, ferries, and the like. Because of the high efficiency and potential for only using renewable energy sources, hydrogen generation-based desalination systems may be fully self-operative, producing hydrogen directly from a source of water being desalinated.

Yet other applications include using heat to power carbon capture, purification of material and systems such as a palladium electrolyzer, and the like. Industrial washing systems, such as laundry, preheating boiler water feeds, sterilizing, sanitation, and cleaning processes for clothing, uniforms, safety gear, hospital and medical care facilities (e.g., floors and the like) may also be target applications for systems that include, connect to, or integrate hydrogen production, storage, and distribution, including systems that are powered by renewable energy sources and the like.

Filtering and purifying materials and equipment used in various processes, such as food service, food manufacturing, pharmaceutical production and handling, livestock handling and processing and the like are also candidate application environments for the methods and systems described herein. In production environments that may rely on highly purified materials, such a system may be applied to provide the necessary heating or energy required. In embodiments, the methods and systems described herein may be applied to corrosion and hydrogen embrittlement activities.

Referring to FIG. 229 environments and manufacturing uses of hydrogen production, storage, distribution, and use systems are depicted. As described above herein, hydrogen system 5701 may be deployed in environments including industrial cooking 6006, industrial air heaters and inline heaters 6009, and industrial environments 6011. A hydrogen system 5701 may also be used in manufacturing use cases 6005, such as heat used in manufacturing processes 6013. Deployment in environments 6003 and manufacturing uses 6005 may overlap, resulting in a hydrogen system 5701 operating in combinations of environment and use that are depicted in FIG. 229 and described herein.

The methods and systems described herein may be used to provide hydrogen directly from a hydrolyzer for certain uses including uses that do not require the introduction of oxygen. In such embodiments that may only require a hydrogen gas, the hydrogen may be produced and sent directly for real-time uses such as a burner for heating, industrial heating processes like welding and brazing, and all other use cases that require direct-use hydrogen. Some other cases may include coating, tooling, extrusion, drying and the like. The methods and systems described herein may produce high-quality hydrogen gas for applications that require it, such as laser cutting. Other uses may include the production of hydrogen gas that may then be combined with other combustible gases for operations such as to generate a flame suitable for welding, for supplying an oxyhydrogen torch, and the like.

In applications where both the separated hydrogen and separated oxygen may be required for different purposes, the generation, storage, distribution and/or heating (e.g., cooking) system may direct independently both gases to their appropriate process uses. An example could be an electrolyzer on a submarine where the hydrogen may be used for a burner, and the oxygen used in the submarines air circulation system, and the like. In yet other embodiments the oxygen and hydrogen that have been separated during the hydrolysis process may need to be recombined under a protocol that produces a desired combination and rate of the combination of oxygen and hydrogen. One such example is Oxy-Hydrogen welding.

In embodiments, other examples of time-shifted uses of electrolyzer products that may benefit from and/or include hydrogen storage may include storing hydrogen in its non-compressed state, in its gaseous state, in its compressed liquid state or combinations thereof in a small tank that is part of a cooking or other industrial system, in a larger tank on or near the cooking system, or transported to very large holding tanks at a facility that is not nearby. Further examples of hydrogen storage technology may include absorbing the hydrogen by a substrate. The substrate may then be stored in a small tank or other substrate storage facility that may be part of the cooking system, in a larger tank on or near the cooking system, transported to very large holding tanks at a facility that is not nearby, or distributed across a plurality of small, medium, and large storage facilities that may facilitate local access to the stored energy.

At the appropriate time, the substrate may be heated and the hydrogen may return to its original gaseous state.

Cooking and other heating systems that may use hydrogen as one of a plurality of sources of fuel may participate in automatically selecting among the sources of fuel. These systems may include processing capabilities that are connected to various information sources that may provide data regarding factors that may be beneficial to consider when determining which energy source to select. Determining which energy source to select may be based, for example on a single factor, such as a current price for one or more of the sources of energy. An energy source that provides sufficient energy at a lowest current price may be selected. In embodiments, a cooking or other heating system may automatically, under computer control, be configured for the selected source of energy. In an example, if hydrogen is selected, connections to a source of hydrogen may be activated, while connections to other sources may be deactivated. Likewise, burners, heater controls, heat and safety profiles, cooking times, and a range of other factors may be automatically adjusted based on the selected energy source. If during a cooking or heating operation, another source of energy is found to be less costly (such as electricity), systems may automatically be reconfigured for use of the other source of energy. Gas-fired heaters may be disabled and electric heating elements may be energized to continue the cooking and/or heating operation with minimal interruption. Such hybrid energy source cooking and/or heating processes may require a distinct protocol for completing a cooking or heating process based on the new source of energy.

Alternatively, automatic selection of a fuel source may be based on a multitude of factors. These factors may be applied to a fuel source selection algorithm that may process individually, in groups, or in combination a portion of the factors. Example factors may include the price of other energy sources, including energy sources that are available to the cooking and heating system as well as those that are not directly available. In this way, selecting an energy source may be driven by other considerations, such as which energy source is better for the environment, and the like. In embodiments, an automatic energy source selection may be based, at least in part on the anticipated availability of an energy source. In embodiments, predictions of energy outage, such as brownouts, may be based on a range of factors, including direct knowledge of scheduled brownouts and the like. Such predictions may also be based on prior experience regarding the availability of the source(s) of energy, which may be applied to machine learning algorithms that may provide predictions of future energy availability. Yet other factors that may be applied to an algorithm for automatically determining a source of energy may include availability of a source of water for producing hydrogen, availability of renewable energy (e.g., based on a forecast for sunlight, winds, and the like), level and/or intensity of need of the energy, anticipate level of need over a future period of time, such as the next 24 hours and the like. If an anticipate need over a future period of time includes large swings in demand over that timeframe, each peak in demand may be individually analyzed. Alternatively, an average or other derivatives of the demand over time may be used to determine a weighting for the various sources of energy.

In addition to energy selection for direct application to cooking and heating, energy selection for operating a hydrolyzer to produce hydrogen may be automated. Energy sources that may be included in such an automated selection process may include solar energy, wind energy, hydrogen energy, sulfur dioxide, electricity (such as from an electricity grid), natural gas, and the like. In embodiments, an algorithm that may facilitate automatic energy selection may receive information about each energy source, such as availability, costs, efficiency, and the like that may be processed by, for example comparing the information to determine which energy source provides the best fit for operating the hydrolyzer in a given time period. By way of this example, the algorithm may favor energy sources that are more reliable, more available, and lower costs than those that are less reliable, less available, and costlier. In embodiments, combinations of these three factors may result in certain sources being selected. If a demand for reliable energy at a particular time is weighted more highly than price, for example, a costlier energy source may be automatically selected due to it being more reliably available. An automatic fuel selection algorithm may also produce recommendations for fuel selection and a human or other automated process may make a selection. In an example, an automated fuel selection algorithm may recommend a fuel that is less costly, but may be somewhat less reliable than another source; however given the weighting or other aspects of the available information about the sources, such a recommendation may meet acceptance criteria of the algorithm.

Methods and systems described herein may be associated with methods and systems for automatic selection of an energy source, such as a method for determining an optimal use of renewable energy (such as solar, wind, geothermal, hydro and the like) or non-renewable fuel. In embodiments, a selection of energy source to power an onsite, stand alone cooking or heating system may be based on a variety of factors including access and distance to a source of renewable energy source as a primary source, directly to the cooking system. As an example, while production cost data available regarding hydro-based renewable energy may support its selection, a delivery network may not be in place or may charge a substantive premium for access to that particular renewable source; therefore hydro-based renewable energy may not be an optimal use.

In embodiments, other factors include pricing and amount of electricity required to use the cooking system and electrolyzer and the; ability of the source to match up availability with demand for generated power is required for both sustained periods of usage as well as short-term requirements. In embodiments, other factors that may impact an automated energy source selection process may include availability and ability to reuse excess heat from the cooking system and/or other nearby industrial facilities. In embodiments, excess heat may include exhaust heat, sulfur dioxide byproduct and the like that may be used to generate heat through a heat exchange process. In embodiments, another set of criteria for determining which energy source may be optimal for use by a cooking system as described herein may include comparing the need for short-term accessibility to power at arbitrary times throughout the day, compared to limiting timing of demand to power given timing and availability of power sources, such as nearby power sources. Sulfur dioxide as a waste heat byproduct may be used in a heat transfer process to recapture heat from the sulfur dioxide gas; however, it may also be applied directly to the hydrolyzer system to produce hydrogen. In embodiments, the sulfur dioxide gas may be applied directly to the hydrolyzer system to produce hydrogen and reduce the sulfur dioxide gas as a tool for environmental abatement by reducing the amount of the sulfur dioxide gas and use the generated hydrogen to burn trash and other items for its removal, for electricity generation, and the like.

In embodiments, external systems, such as information systems may be associated with or connected to hydrogen production, storage, distribution, and use systems as described herein. Information systems may receive information from all aspects and system processes including, energy selection (such as automated energy selection) including actual results as compared to predicted results, energy consumption, hydrogen generation for each type of energy source (solar, hydro-based, wind, exhaust gas, including sulfur dioxide use, and the like), hydrogen refinement processes, hydrogen storage (including compressed, natural state storage, substrate infusion-based, and the like), hydrogen distribution, uses, combinations with other fuel sources (such as hydrogen with another flammable energy medium) and the like, uses of the hydrogen including timing, costs, application environment, and the like.

In embodiments, communication to and from external systems may be through exchange of messages that may facilitate remote monitoring, remote control and the like. By way of this example, messages may include information about a source of the message, a destination, an objective (e.g., control, monitoring, and the like), recommended actions to take, alternate actions to take, actions to avoid, and the like.

In embodiments, methods and systems related to hydrogen production, storage, distribution and use may include, be associated with, or integrate improvement features that may provide ongoing improvements in system performance, quality and the like. In embodiments, improvement features may include process control and heat recovery, flow control and precision control, safety, reliability and greater service availability, process and output quality including output consistency. Other features that may be provided and/or be integrated with the hydrogen-based systems described herein may include data collection, analysis, and modeling for improvement, data security, cyber security, network security to avoid external attacks on control systems and the like, monitoring and analysis to facilitate preventive maintenance and repair.

In embodiments, integration and/or access to data processing systems that also have access to third-party data may be included in the methods and systems described herein. By monitoring data collected from sensors, time of day, weather conditions, and other data sources may be used with specific rule sets to trigger activation and/or stoppage of hydrogen use (e.g., cooking) operations. In embodiments, data may be accumulated in a continuous feedback loop that may capture data for a range of metrics associated with operations, such as cooking operations and the like. In embodiments, analysis and control of activation of such a system may factor in the actual requirements and timing when a cooking system needs to be used (such as when a meal is being prepared, such as breakfast, or when heating is required for an industrial operation, such as at the start of a new work shift and the like.

In embodiments, data collection, monitoring, process improvement, quality improvement, and the like may also be performed during operation of such a system. In an example, once a cooking system is activated, the system may be able to determine the best way to receive the heat required to perform the process at hand at that particular moment in time. Receiving the heat required to perform the process may be selected from a variety of heat sources including in-line hydrogen production, stored hydrogen consumption, combined energy utilization and the like. In embodiments, cooking elements with a mix of hydrogen and non-hydrogen heat burners may be automatically controllable so that the system should be able to automatically, using machine learning for example and continuous monitoring, decide to use one or the other source or a combination thereof.

Further in this example, a smart cooktop may include burners for hydrogen and for liquid propane. In embodiments, methods and systems for cooking operation may automatically activate the appropriate burner based on fuel selection (e.g., hydrogen burner or the liquid propane burner). Operating such a cooking or heating system may be done by a computer enabled controller that may process factors including time of day, spot-pricing energy costs for each alternative, length of process involved, meeting 100% green requirements, potential hazardous use of flame depending on location of cooking system, other security features, and the like. To facilitate continuous improvement during operational control, data analysis may be performed on any or all aspects of the system. In an example, if the electrolyzer is not activated, sensors may capture information about the liquid propane burner that is being used. In embodiments, this single data capture example indicates that while it is desirable to collect information about all operational aspects to avoid missing information, practical considerations enable more focused data collection and analysis. In embodiments, every activity and action by the cooking system and heating element may be captured, recorded, measured, and used to inform actions such as quality improvement and the like.

In embodiments, information may be provided for one or more deployments of this cooking system to facilitate self-improvement and real-time decision making. In embodiments, information captured may also be stored and used in time-series analysis and the like to determine patterns that may indicate opportunities for improvement. In embodiments, data captured for a plurality of deployments may be used for creating and updating models that may be used for computer-generated simulations and the like. These models may be applied to design processes and the like. In embodiments, continuous improvement modifications may be activated by machine-to-machine learning programs, human improvement efforts, instructional improvement and/or modifications, and the like.

While the foregoing written description enables one skilled in the art to make and use what is considered presently to be the best mode thereof, those skilled in the art will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platform. A processor may be any kind of computational or processing device capable of executing program instructions, codes, binary instructions, and the like. The processor may be or may include a signal processor, digital processor, embedded processor, microprocessor, or any variant such as a co-processor (math co-processor, graphic co-processor, communication co-processor, and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions, and the like described herein may be implemented in one or more thread. The thread may spawn other threads that may have assigned priorities associated with them; the processor may execute these threads based on priority or any other order based on instructions provided in the program code. The processor, or any machine utilizing one, may include non-transitory memory that stores methods, codes, instructions, and programs as described herein and elsewhere. The processor may access a non-transitory storage medium through an interface that may store methods, codes, and instructions as described herein and elsewhere. The storage medium associated with the processor for storing methods, programs, codes, program instructions, or other type of instructions capable of being executed by the computing or processing device may include but may not be limited to one or more of a CD-ROM, DVD, memory, hard disk, flash drive, RAM, ROM, cache, and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server, cloud server, and other variants such as secondary server, host server, distributed server, and the like. The server may include one or more of memories, processors, computer readable transitory and/or non-transitory media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more locations without deviating from the scope of the disclosure. In addition, any of the devices attached to the server through an interface may include at least one storage medium capable of storing methods, programs, code, and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client, and other variants such as secondary client, host client, distributed client, and the like. The client may include one or more of memories, processors, computer readable transitory and/or non-transitory media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers, and the like. Additionally, this coupling and/or connection may facilitate remote execution of a program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code, and/or instructions. A central repository may provide program instructions to be executed on different devices. In this implementation, the remote repository may act as a storage medium for program code, instructions, and programs.

In embodiments, one or more of the controllers, circuits, systems, data collectors, storage systems, network elements, components, or the like as described throughout this disclosure may be embodied in or on an integrated circuit, such as an analog, digital, or mixed signal circuit, such as a microprocessor, a programmable logic controller, an application-specific integrated circuit, a field programmable gate array, or other circuit, such as embodied on one or more chips disposed on one or more circuit boards, such as to provide in hardware (with potentially accelerated speed, energy performance, input-output performance, or the like) one or more of the functions described herein. This may include setting up circuits with up to billions of logic gates, flip-flops, multiplexers, and other circuits in a small space, facilitating high speed processing, low power dissipation, and reduced manufacturing cost compared with board-level integration. In embodiments, a digital IC, typically a microprocessor, digital signal processor, microcontroller, or the like may use Boolean algebra to process digital signals to embody complex logic, such as involved in the circuits, controllers, and other systems described herein. In embodiments, a data collector, an expert system, a storage system, or the like may be embodied as a digital integrated circuit ("IC"), such as a logic IC, memory chip, interface IC (e.g., a level shifter, a serializer, a deserializer, and the like), a power management IC and/or a programmable device; an analog integrated circuit, such as a linear IC, RF IC, or the like, or a mixed signal IC, such as a data acquisition IC (including A/D converters, D/A converter, digital potentiometers) and/or a clock/timing IC.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM, and the like. The processes, methods, program codes, instructions described herein and elsewhere may be executed by one or more of the network infrastructural elements. The methods and systems described herein may be configured for use with any kind of private, community, or hybrid cloud computing network or cloud computing environment, including those which involve features of software as a service ("SaaS"), platform as a service ("PaaS"), and/or infrastructure as a service ("IaaS").

The methods, program codes, and instructions described herein and elsewhere may be implemented on a cellular network having multiple cells. The cellular network may either be frequency division multiple access ("FDMA") network or code division multiple access ("CDMA") network. The cellular network may include mobile devices, cell sites, base stations, repeaters, antennas, towers, and the like. The cell network may be a GSM, GPRS, 3G, EVDO, mesh, or other networks types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable transitory and/or non-transitory media that may include: computer components, devices, and recording media that retain digital data used for computing for some interval of time; semiconductor storage known as random access memory ("RAM"); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g., USB sticks or keys), floppy disks, magnetic tape, paper tape, punch cards, standalone RAM disks, zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another.

The elements described and depicted herein, including in flow charts and block diagrams throughout the Figures, imply logical boundaries between the elements. However, according to software or hardware engineering practices, the depicted elements and the functions thereof may be implemented on machines through computer executable transitory and/or non-transitory media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers, and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, methods described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure, and does not pose a limitation on the scope of the disclosure unless otherwise claimed. No language in the specification should be construed as indicating any non-claimed element as essential to the practice of the disclosure.

Implementations of approaches described above may include software implementations, which use software instructions stored on non-transitory machine-readable media. The procedures and protocols as described above in the text and figures are sufficient for one skilled in the art to implement them in such software implementations. In some examples, the software may execute on a client node (e.g., a smartphone) using a general-purpose processor that implements a variety of functions on the client node. Software that executes on end nodes or intermediate network nodes may use processors that are dedicated to processing network traffic, for example, being embedded in network processing devices. In some implementations, certain functions may be implemented in hardware, for example, using Application-Specific Integrated Circuits (ASICs), and/or Field Programmable Gate Arrays (FPGAs), thereby reducing the load on a general purpose processor.

Note that in some diagrams and figures in this disclosure, networks such as the internet, carrier networks, internet service provider networks, local area networks (LANs), metro area networks (MANs), wide area networks (WANs), storage area networks (SANs), backhaul networks, cellular networks, satellite networks and the like, may be depicted as clouds. Also note, that certain processes may be referred to as taking place in the cloud and devices may be described as accessing the cloud. In these types of descriptions, the cloud should be understood to be some type of network comprising networking equipment and wireless and/or wired links The description above may refer to a client device communicating with a server, but it should be understood that the technology and techniques described herein are not limited to those exemplary devices as the end-points of communication connections or sessions. The end-points may also be referred to as, or may be, senders, transmitters, transceivers, receivers, servers, video servers, content servers, proxy servers, cloud storage units, caches, routers, switches, buffers, mobile devices, tablets, smart phones, handsets, computers, set-top boxes, modems, gaming systems, nodes, satellites, base stations, gateways, satellite ground stations, wireless access points, and the like. The devices at any of the end-points or intermediate nodes of communication connections or sessions may be commercial media streaming boxes such as those implementing Apple TV, Roku, Chromecast, Amazon Fire, Slingbox, and the like, or they may be custom media streaming boxes. The devices at the any of the end-points or intermediate nodes of communication connections or sessions may be smart televisions and/or displays, smart appliances such as hubs, refrigerators, security systems, power panels and the like, smart vehicles such as cars, boats, busses, trains, planes, carts, and the like, and may be any device on the Internet of Things (IoT). The devices at any of the end-points or intermediate nodes of communication connections or sessions may be single-board computers and/or purpose built computing engines comprising processors such as ARM processors, video processors, system-on-a-chip (SoC), and/or memory such as random access memory (RAM), read only memory (ROM), or any kind of electronic memory components.

Communication connections or sessions may exist between two routers, two clients, two network nodes, two servers, two mobile devices, and the like, or any combination of potential nodes and/or end-point devices. In many cases, communication sessions are bi-directional so that both end-point devices may have the ability to send and receive data. While these variations may not be stated explicitly in every description and exemplary embodiment in this disclosure, it should be understood that the technology and techniques we describe herein are intended to be applied to all types of known end-devices, network nodes and equipment and transmission links, as well as to future end-devices, network nodes and equipment and transmission links with similar or improved performance.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platforms. A processor may be any kind of computational or processing device capable of executing program instructions, codes, binary instructions, and the like. The processor may be or may include a signal processor, digital processor, embedded processor, microprocessor, or any variant such as a co-processor (math co-processor, graphic co-processor, communication co-processor, and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor, or any machine utilizing one, may include non-transitory memory that stores methods, codes, instructions, and programs as described herein and elsewhere. The processor may access a non-transitory storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache, and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server, cloud server, and other variants such as secondary server, host server, distributed server, and the like. The server may include one or more of memories, processors, computer readable transitory and/or non-transitory media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client, and the like. The client may include one or more of memories, processors, computer readable transitory and/or non-transitory media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers, and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM, and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service ("SaaS"), platform as a service ("PaaS"), and/or infrastructure as a service ("IaaS").

The methods, program codes, and instructions described herein and elsewhere may be implemented on a cellular network having multiple cells. The cellular network may either be frequency division multiple access ("FDMA") network or code division multiple access ("CDMA") network. The cellular network may include mobile devices, cell sites, base stations, repeaters, antennas, towers, and the like. The cell network may be a GSM, GPRS, 3G, EVDO, mesh, or other networks types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable transitory and/or non-transitory media that may include: computer components, devices, and recording media that retain digital data used for computing for some interval of time; semiconductor storage known as random access memory ("RAM"); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or intangible items from one state to another. The methods and systems described herein may also transform data representing physical and/or intangible items from one state to another.

The elements described and depicted herein, including inflow charts and block diagrams throughout the figures, imply logical boundaries between the elements. However, according to software or hardware engineering practices, the depicted elements and the functions thereof may be implemented on machines through computer executable transitory and/or non-transitory media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers, and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable devices, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, methods described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples but is to be understood in the broadest sense allowable by law.

The use of the terms "a," "an." and "the" and similar referents in the context of describing the disclosure (especially in the context of the following claims) is to be construed to cover both the singular and the plural unless otherwise indicated herein or clearly contradicted by context. The terms "comprising," "having," "including," and "containing" are to be construed as open-ended terms (i.e., meaning "including, but not limited to,") unless otherwise noted. Recitations of ranges of values herein are merely intended to serve as a shorthand method of referring individually to each separate value falling within the range, unless otherwise indicated herein, and each separate value is incorporated into the specification as if it were individually recited herein. All methods described herein may be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Any element in a claim that does not explicitly state "means for" performing a specified function, or "step for" performing a specified function, is not to be interpreted as a "means" or "step" clause as specified in 35 U.S.C. § 112(f). In particular, any use of "step of" in the claims is not intended to invoke the provision of 35 U. S.C. § 112(f).

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

It is to be understood that the foregoing description is intended to illustrate and not to limit the scope of the invention, some aspects of which are defined by the scope of the appended claims. Furthermore, other embodiments are within the scope of the following claims.

What is claimed is:

1. A monitoring system for data collection in an industrial environment, the system comprising:
- a data collector configured to collect data related to machine components, the data collector being communicatively coupled to a plurality of input channels connected to data collection points related to machine components, at least one of the plurality of input channels being connected to a data collection point on a rotating machine component;
- a data acquisition circuit structured to enable or disable processing of a plurality of detection values from the collected data based on a status of the rotating machine component, each of the plurality of detection values corresponding to at least one of the plurality of input channels; and
- an expert system analysis circuit structured to:
  - analyze the collected data; and
  - determine a failure state for the rotating machine component based on analysis of the plurality of detection values; and
  - upon determining the failure state, provide the failure state to a data storage.

2. The system of claim 1, wherein the rotating machine component is a slowly rotating machine component rotating at less than 36,000 RPM.

3. The system of claim 2, wherein the slowly rotating machine component is rotating at less than 1000 RPM.

4. The system of claim 2, wherein the slowly rotating machine component has a slow RPM setting and a high RPM setting.

5. The system of claim 4, wherein the high RPM setting is less than 40 times the slow RPM setting.

6. The system of claim 2, wherein three of the plurality of input channels are connected to a tri-axial sensor for monitoring different positions on the slowly rotating machine component.

7. The system of claim 2, wherein the expert system analysis circuit analyzes a first and a second of the plurality of input channels for a relative phase determination, and wherein the expert system analysis circuit further determines the failure state in response to the relative phase determination.

8. The system of claim 1, wherein three of the plurality of input channels are connected to a tri-axial sensor for monitoring different positions on the rotating machine component.

9. The system of claim 1, wherein the expert system analysis circuit analyzes a first and a second of the plurality of input channels for a relative phase determination from which the data analysis circuit detects an anomalous condition for the rotating machine component.

10. The system of claim 1, wherein the expert system analysis circuit further comprises a pattern recognition circuit structured to analyze the plurality of detection values with at least one of a neural net or an expert system for controlling data collection bands.

11. The system of claim 1, wherein the data acquisition circuit includes at least one delta-sigma analog-to-digital converter that is configured to increase input oversampling rates.

12. The system of claim 1, wherein the enabling or disabling the processing of a plurality of detection values comprises multiplexing the plurality of detection values.

13. The system of claim 1, wherein the status of the rotating machine component comprises the failure state.

14. A computer-implemented method for data collection in an industrial environment, the method comprising:
- collecting data from a plurality of input channels communicatively coupled to a data collector connected to data collection points related to machine components, at least one of the plurality of input channels being connected to a data collection point on a rotating machine component;
- enabling or disabling processing of a plurality of detection values from the collected data based on a status of the rotating machine component, each of the plurality of detection values corresponding to at least one of the plurality of input channels; and
- operating an expert system to:
  - analyze the collected data; and
  - determine a failure state for the rotating machine component based on the plurality of detection values; and
  - provide the failure state to a data storage.

15. The method of claim 14, wherein the rotating machine component is a slowly rotating machine component rotating at less than 36,000 RPM.

16. The method of claim 15, wherein three of the plurality of input channels are connected to a tri-axial sensor for monitoring different positions on the slowly rotating machine component.

17. The method of claim 15, further comprising:
- analyzing a first and a second of the plurality of input channels for a relative phase determination; and
- detecting the failure state for the rotating machine component in response to the relative phase determination.

18. The method of claim 17, further comprising operating the expert system to:

analyze the plurality of detection values; and control data collection bands of the plurality of detection values.

19. An apparatus for monitoring data collection in an industrial environment, the apparatus comprising:

a data collector configured to collect data related to machine components, the data collector being communicatively coupled to a plurality of input channels connected to data collection points related to machine components, at least one of the plurality of input channels being connected to a data collection point on a rotating machine component;

a data acquisition circuit structured to enable or disable processing of a plurality of detection values from the collected data based on a status of the rotating machine component, each of the plurality of detection values corresponding to at least one of the plurality of input channels; and an expert system analysis circuit structured to:

analyze the collected data;

determine one of a failure state or an anomalous condition for the rotating machine component based on the analysis of the collected data and;

communicate the one of the failure state or the anomalous condition to a data storage.

20. The apparatus of claim 19, wherein the rotating machine component is a slowly rotating machine component rotating at less than 36,000 RPM.

21. The apparatus of claim 20, wherein the slowly rotating machine component is rotating at less than 1000 RPM.

22. The apparatus of claim 20, wherein the slowly rotating machine component has a slow RPM setting and a high RPM setting.

* * * * *

UNITED STATES PATENT AND TRADEMARK OFFICE

CERTIFICATE OF CORRECTION

PATENT NO. : 11,728,910 B2
APPLICATION NO. : 16/151177
DATED : August 15, 2023
INVENTOR(S) : Cella et al.

It is certified that error appears in the above-identified patent and that said Letters Patent is hereby corrected as shown below:

In the Drawings

Sheet 13 of 184, Fig. 13, reference numeral for Waveform three 3243, Line 1, delete "3243" and insert --3244-- therefor On sheet 38 of 184, Fig. 38, reference numeral for Reports 4916, delete "4916" and insert --6054-- therefor On sheet 70 of 184, Fig. 70, reference numeral for Data Storage 8742, delete "8742" and insert --8716-- therefor On sheet 77 of 184, Fig. 77, reference numeral 9750, delete "9750" and insert --9730-- therefor On sheet 78 of 184, Fig. 78, reference numeral 9750, delete "9750" and insert --9730-- therefor On sheet 171 of 184, Fig. 196, reference numeral 2000, delete "2000" and insert --2700-- therefor On sheet 171 of 184, Fig. 197, reference numeral 2000, delete "2000" and insert --2800-- therefor On sheet 181 of 184, Fig. 227, reference numeral for Hydrogen Use 5806, delete "5806" and insert --5707-- therefor In the Specification In Column 24, Line 50, delete "114" and insert --1104-- therefor In Column 51, Line 25, delete "3210," and insert --3212,-- therefor In Column 51, Line 25, delete "3212," and insert --3210,-- therefor Signed and Sealed this
Eleventh Day of March, 2025

Coke Morgan Stewart

Coke Morgan Stewart
*Acting Director of the United States Patent and Trademark Office*

In Column 56, Line 58, delete "10" and insert --100-- therefor

In Column 60, Line 16, delete "4114," and insert --4014,-- therefor

In Column 61, Line 1, delete "4114" and insert --4014-- therefor

In Column 61, Line 6, delete "4114" and insert --4014-- therefor

In Column 61, Line 11, delete "4114," and insert --4014,-- therefor

In Column 63, Line 65, delete "4114," and insert --4014,-- therefor

In Column 65, Line 19, delete "4020," and insert --4030,-- therefor

In Column 66, Line 57, delete "115," and insert --116,-- therefor

In Column 67, Line 34, delete "4012" and insert --4110-- therefor

In Column 69, Line 19, delete "4020" and insert --4120-- therefor

In Column 69, Line 20, delete "4020," and insert --4120,-- therefor

In Column 69, Line 22, delete "4020" and insert --4120-- therefor

In Column 69, Line 34, delete "4020" and insert --4120-- therefor

In Column 69, Line 39, delete "4020" and insert --4120-- therefor

In Column 72, Line 66, delete "4020," and insert --4120,-- therefor

In Column 75, Line 60, delete "4202." and insert --4302.-- therefor

In Column 76, Line 26, delete "4204" and insert --4304-- therefor

In Column 76, Line 28, delete "4208." and insert --4308.-- therefor

In Column 77, Line 38, delete "4208" and insert --4308-- therefor

In Column 78, Line 29, delete "4208," and insert --4308,-- therefor

In Column 94, Line 29, delete "4620" and insert --4622-- therefor

In Column 94, Line 29, delete "4622" and insert --4620-- therefor

In Column 95, Line 44, delete "4710" and insert --4740-- therefor

In Column 104, Line 30, delete "5110" and insert --5152-- therefor

In Column 104, Line 33, delete "5110" and insert --5152-- therefor

In Column 104, Line 36, delete "5114" and insert --5154-- therefor

In Column 104, Line 41, delete "5110" and insert --5152-- therefor

In Column 109, Line 60, delete "5720." and insert --5722.-- therefor

In Column 111, Line 11, delete "5870" and insert --5080-- therefor

In Column 111, Line 15, delete "5870" and insert --5080-- therefor

In Column 111, Line 53, delete "5870." and insert --5780.-- therefor

In Column 117, Line 26, delete "7000" and insert --6100-- therefor

In Column 117, Line 26, delete "7002." and insert --6102.-- therefor

In Column 117, Line 28, delete "7004," and insert --6104,-- therefor

In Column 117, Line 29, delete "7008," and insert --6108,-- therefor

In Column 117, Line 30, delete "7010." and insert --6110.-- therefor

In Column 117, Line 30, delete "7004" and insert --6104-- therefor

In Column 117, Line 53, delete "7008" and insert --6108-- therefor

In Column 117, Line 58, delete "7010" and insert --6110-- therefor

In Column 117, Line 61, delete "7010" and insert --6110-- therefor

In Column 117, Line 63, delete "7010" and insert --6110-- therefor

In Column 117, Line 67, delete "5870." and insert --5080.-- therefor

In Column 150, Line 20, delete "8104." and insert --8108.-- therefor

In Column 158, Line 42, delete "8544" and insert --8508-- therefor

In Column 158, Line 63, delete "8544" and insert --8508-- therefor

In Column 159, Line 11, delete "8544" and insert --8508-- therefor

Figure 100:
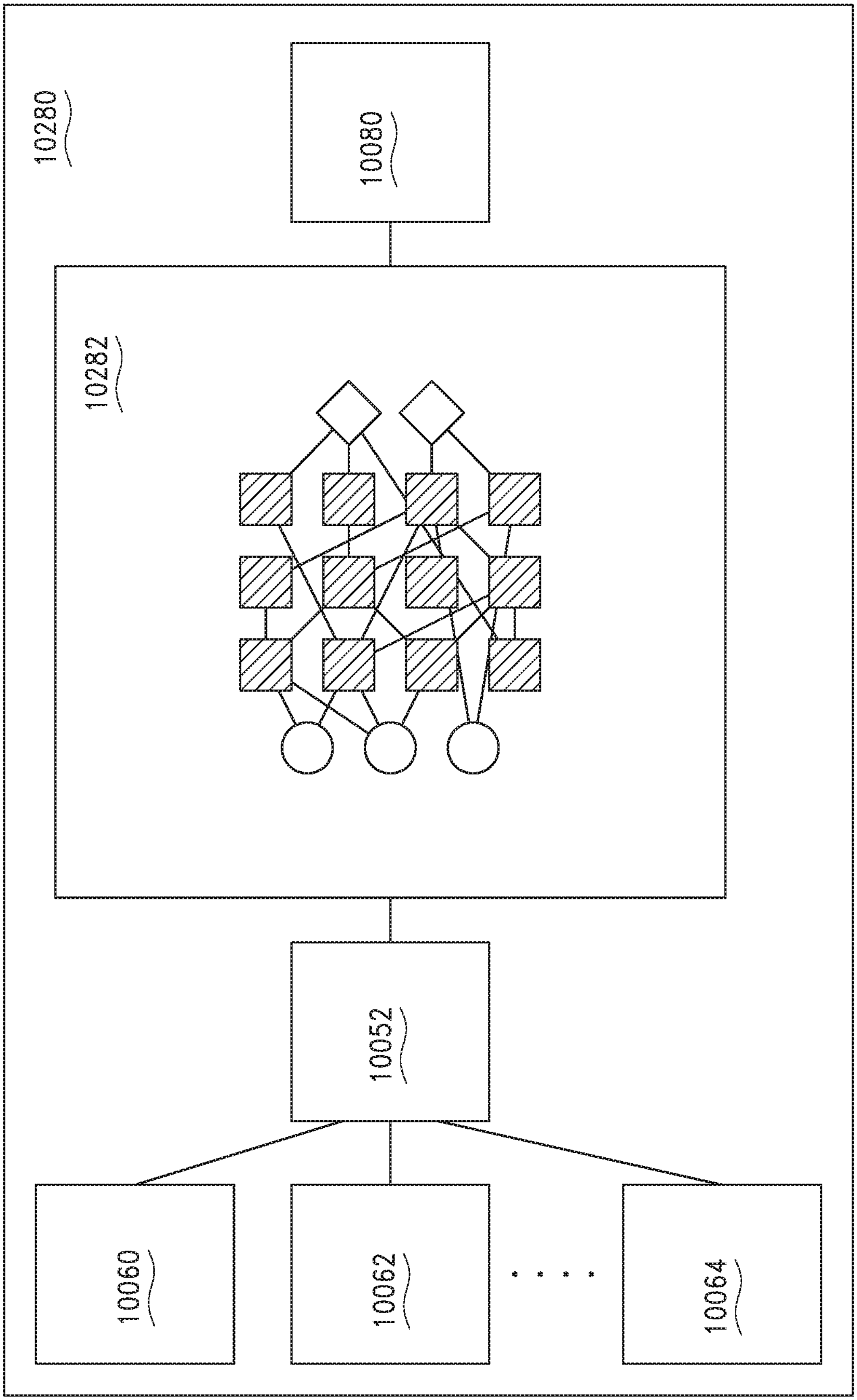

In Column 159, Lines 37-38, delete "8508 8544" and insert --8508, 8708-- therefor In Column 161, Line 47, delete "8544" and insert --8508-- therefor In Column 161, Line 52, delete "8544" and insert --8508-- therefor In Column 161, Line 56, delete "8544" and insert --8508-- therefor In Column 161, Line 60, delete "8544" and insert --8508-- therefor In Column 171, Line 44, delete "9722" and insert --9704-- therefor In Column 171, Line 46, delete "9722" and insert --9704-- therefor In Column 174, Line 40, delete "9754" and insert --9732-- therefor In Column 180, Line 15, delete "10182" and insert --10192-- therefor In Column 180, Line 55, delete "10242" and insert --10252-- therefor In Column 181, Line 4, delete "FIG. 90," and insert --FIG. 100,-- therefor In Column 196, Line 39, delete "10500" and insert --10512-- therefor In Column 203, Line 54, delete "102," and insert --10520,-- therefor In Column 204, Line 9, delete "10524" and insert --10522-- therefor In Column 252, Line 20, delete "11000." and insert --11002.-- therefor In Column 252, Line 22, delete "11000," and insert --11002,-- therefor In Column 287, Line 42, delete "111" and insert --212-- therefor In Column 287, Line 63, delete "206" and insert --200-- therefor In Column 288, Line 1, delete "206" and insert --200-- therefor In Column 288, Line 4, delete "206," and insert --200,-- therefor In Column 290, Line 2, delete "326" and insert --526-- therefor In Column 290, Line 16, delete "625," and insert --525,-- therefor In Column 293, Line 8, delete "1010" and insert --1020-- therefor In Column 318, Line 51, delete "2481." and insert --2411.-- therefor In Column 335, Line 17, delete "21" and insert --31-- therefor In Column 335, Line 25, delete "21" and insert --31-- therefor In Column 344, Line 43, delete "2010, 2020," and insert --2011, 2021,-- therefor In Column 344, Line 43, delete "2300, 2400, 2500, 2600" and insert --2301, 2401, 2501, 2601-- therefor In Column 344, Line 50, delete "3101" and insert --3001-- therefor In Column 344, Line 51, delete "3101" and insert --3001-- therefor In Column 344, Line 55, delete "3101" and insert --3001-- therefor In Column 344, Line 59, delete "3101" and insert --3001-- therefor In Column 344, Line 67, delete "3310," and insert --3311,-- therefor In Column 345, Line 6, delete "5000," and insert --5001,-- therefor In Column 348, Line 20, delete "5074" and insert --5705-- therefor In Column 348, Line 59, delete "5705." and insert --5707.-- therefor In Column 349, Line 11, delete "2228," and insert --228,-- therefor In Column 358, Line 15, delete "6006," and insert --6007,-- therefor